US011950504B2

(12) United States Patent
Kim et al.

(10) Patent No.: US 11,950,504 B2
(45) Date of Patent: Apr. 2, 2024

(54) POLYCYCLIC COMPOUND AND ORGANIC LIGHT EMITTING DIODE COMPRISING SAME

(71) Applicant: LG CHEM, LTD., Seoul (KR)

(72) Inventors: Moung Gon Kim, Daejeon (KR); Wanpyo Hong, Daejeon (KR); Sujeong Geum, Daejeon (KR); Dong Hoon Lee, Daejeon (KR); Dongheon Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 663 days.

(21) Appl. No.: 15/733,956

(22) PCT Filed: Jul. 3, 2019

(86) PCT No.: PCT/KR2019/008121
§ 371 (c)(1),
(2) Date: Dec. 1, 2020

(87) PCT Pub. No.: WO2020/009467
PCT Pub. Date: Jan. 9, 2020

(65) Prior Publication Data

US 2022/0352473 A1 Nov. 3, 2022

(30) Foreign Application Priority Data

Jul. 3, 2018 (KR) ........................ 10-2018-0077111
Jan. 17, 2019 (KR) ........................ 10-2019-0006153

(51) Int. Cl.
*H10K 85/60* (2023.01)
*C07F 5/02* (2006.01)
(Continued)

(52) U.S. Cl.
CPC ......... *H10K 85/6572* (2023.02); *C07F 5/027* (2013.01); *C07F 7/0812* (2013.01);
(Continued)

(58) Field of Classification Search
CPC .............................. C07F 5/027; H10K 85/636
See application file for complete search history.

(56) References Cited

U.S. PATENT DOCUMENTS

2015/0236274 A1 8/2015 Hatakeyama et al.
2018/0069182 A1 3/2018 Hatakeyama et al.
(Continued)

FOREIGN PATENT DOCUMENTS

CN 106467554 3/2017
CN 107417715 12/2017
(Continued)

*Primary Examiner* — Sean M DeGuire
(74) *Attorney, Agent, or Firm* — Bryan Cave Leighton Paisner LLP

(57) ABSTRACT

Provided is a compound of Formula 1:

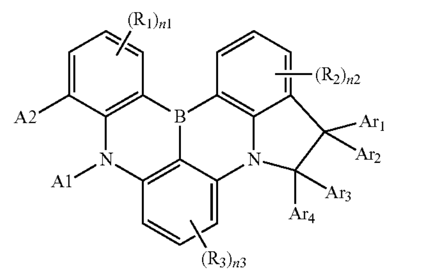

$Ar_1$ to $Ar_4$ are each independently hydrogen, deuterium, a halogen group, a nitrile group, or a substituted or unsubstituted: silyl, boron, alkyl, alkenyl, alkynyl, alkoxy, aryloxy, cycloalkyl, aryl, or heterocyclic group, or adjacent groups are bonded together to form a substituted or unsubstituted aliphatic hydrocarbon ring;
A1 and A2 are each independently hydrogen, deuterium, a halogen group, a nitrile group, or a substituted or
(Continued)

unsubstituted: silyl, boron, alkyl, alkenyl, alkynyl, alkoxy, aryloxy, cycloalkyl, aryl, or heterocyclic group, or are bonded together to form a substituted or unsubstituted ring;

$R_1$ to $R_3$ are each independently hydrogen, deuterium, a halogen group, a nitrile group, or a substituted or unsubstituted; silyl, boron, alkyl, alkenyl, alkynyl, alkoxy, aryloxy, cycloalkyl, aryl, amine, or heterocyclic group; and n1 to n3 are each 0 to 3, and 2 or more, the substituents are the same as or different from each other, and an organic light emitting device including the same.

19 Claims, 1 Drawing Sheet

(51) Int. Cl.

| | |
|---|---|
| ***C07F 7/08*** | (2006.01) |
| ***C09K 11/06*** | (2006.01) |
| *H10K 50/11* | (2023.01) |
| *H10K 50/15* | (2023.01) |
| *H10K 50/16* | (2023.01) |
| *H10K 50/17* | (2023.01) |
| *H10K 101/10* | (2023.01) |
| *H10K 101/30* | (2023.01) |
| *H10K 101/40* | (2023.01) |

(52) U.S. Cl.

CPC ............ *C09K 11/06* (2013.01); *H10K 85/636* (2023.02); *C09K 2211/1018* (2013.01); *H10K 50/11* (2023.02); *H10K 50/15* (2023.02); *H10K 50/16* (2023.02); *H10K 50/17* (2023.02); *H10K 50/171* (2023.02); *H10K 2101/10* (2023.02); *H10K 2101/30* (2023.02); *H10K 2101/40* (2023.02)

(56) References Cited

U.S. PATENT DOCUMENTS

| | | | |
|---|---|---|---|
| 2018/0094000 | A1 | 4/2018 | Hatakeyama et al. |
| 2018/0301629 | A1 | 10/2018 | Hatakeyama et al. |
| 2020/0066997 | A1 | 2/2020 | Huang et al. |
| 2020/0220083 | A1 | 7/2020 | Katakeyama et al. |

FOREIGN PATENT DOCUMENTS

| | | |
|---|---|---|
| CN | 107501311 | 12/2017 |
| JP | 2012-234873 | 11/2012 |
| JP | 2018-043984 | 3/2018 |
| KR | 10-2017-0130434 | 11/2017 |
| KR | 10-2017-0130435 | 11/2017 |
| WO | 2016-152418 | 9/2016 |
| WO | 2018-095397 | 5/2018 |

POLYCYCLIC COMPOUND AND ORGANIC LIGHT EMITTING DIODE COMPRISING SAME

CROSS-REFERENCE TO RELATED APPLICATION(S)

This application is a National Stage Application of International Application No. PCT/KR2019/008121 filed on Jul. 3, 2019, which claims priority to and the benefit of Korean Patent Application No. 10-2019-0006153 filed in the Korean Intellectual Property Office on Jan. 17, 2019, and to Korean Patent Application No. 10-2018-0077111 filed in the Korean Intellectual Property Office on Jul. 3, 2018, the entire contents of which are incorporated herein by reference.

TECHNICAL FIELD

The present specification relates to a polycyclic compound and an organic light emitting device including the same.

BACKGROUND

In the present specification, an organic light emitting device is a light emitting device using an organic semiconductor material, and requires an exchange of holes and/or electrons between electrodes and organic semiconductor materials. The organic light emitting device can be roughly divided into the following two light emitting devices depending on the operation principle. The first organic light emitting device is a light emitting device in which an exciton is formed in an organic material layer by a photon that flows from an external light source to the device, the exciton is separated into electrons and holes, and the electrons and the holes are each transferred to different electrodes and used as a current source (voltage source). The second organic light emitting device is a light emitting device in which holes and/or electrons are injected into organic semiconductor material layers forming an interface with an electrode by applying a voltage or current to two or more electrodes, and the device is operated by the injected electrons and holes.

In general, an organic light emitting phenomenon refers to a phenomenon in which electric energy is converted into light energy by using an organic material. An organic light emitting device using the organic light emitting phenomenon usually has a structure including a positive electrode, a negative electrode, and an organic material layer interposed therebetween. Here, the organic material layer has in many cases a multi-layered structure composed of different materials in order to improve the efficiency and stability of the organic light emitting device, and for example, can be composed of a hole injection layer, a hole transport layer, a light emitting layer, an electron blocking layer, an electron transport layer, an electron injection layer, and the like. In such a structure of the organic light emitting device, if a voltage is applied between the two electrodes, holes are injected from the positive electrode into the organic material layer and electrons are injected from the negative electrode into the organic material layer, and when the injected holes and electrons meet each other, an exciton is formed, and light is emitted when the exciton falls down again to a ground state. Such an organic light emitting device has been known to have characteristics such as self-emission, high brightness, high efficiency, a low driving voltage, a wide viewing angle, and high contrast.

In an organic light emitting device, materials used as an organic material layer can be classified into a light emitting material and a charge transport material, for example, a hole injection material, a hole transport material, an electron blocking material, an electron transport material, an electron injection material, and the like depending on the function. The light emitting materials include blue, green, and red light emitting materials according to the light emitting color, and yellow and orange light emitting materials required for implementing a much better natural color.

Furthermore, a host/dopant system can be used as a light emitting material for the purpose of enhancing color purity and light emitting efficiency through energy transfer. The principle is that when a small amount of dopant which has a smaller energy band and better light emitting efficiency than those of a host mainly constituting a light emitting layer is mixed with the light emitting layer, the excitons generated by the host are transported to the dopant to emit light with high efficiency. In this case, it is possible to obtain light with a desired wavelength according to the type of dopant used because the wavelength of the host moves to the wavelength range of the dopant.

In order to fully exhibit the above-described excellent characteristics of the organic light emitting device, a material constituting an organic material layer in a device, for example, a hole injection material, a hole transport material, a light emitting material, an electron blocking material, an electron transport material, an electron injection material, and the like need to be supported by stable and efficient materials, so that there is a continuous need for developing a new material.

Prior Art Document—Japanese Patent Application Laid-Open No. 2018-043984

BRIEF DESCRIPTION OF THE INVENTION

Technical Problem

The present specification describes a compound and an organic light emitting device including the same.

Technical Solution

An exemplary embodiment of the present specification provides a compound of Formula 1:

Formula 1

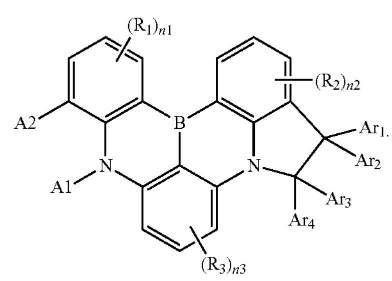

In Formula 1:

$Ar_1$ to $Ar_4$ are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group, or adjacent groups are bonded to each other to form a substituted or unsubstituted aliphatic hydrocarbon ring;

A1 and A2 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group, or are bonded to each other to form a substituted or unsubstituted ring;

$R_1$ to $R_3$ are the same as or different from each other, and are each independently hydrogen, deuterium, a halogen group, a nitrile group, a substituted or unsubstituted silyl group, a substituted or unsubstituted boron group; a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group; and n1 to n3 are each an integer from 0 to 3, and when n1 to n3 are each 2 or more, the substituents in a plurality of parentheses are the same as or different from each other.

Further, an exemplary embodiment of the present specification provides an organic light emitting device including: a first electrode; a second electrode provided to face the first electrode; and an organic material layer having one or more layers provided between the first electrode and the second electrode, in which one or more layers of the organic material layer include the above-described compound.

Advantageous Effects

The compound of the present invention can be used as a material for an organic material layer of an organic light emitting device. The compound of the present invention has high stability of the compound by heat during the deposition process by including a non-aromatic pentagonal ring (cycloalkene ring) including N in the molecule and having a distorted structure instead of a planar structure to lower the sublimation temperature, so that it is possible to obtain an organic light emitting device having high efficiency, low voltage, and long service life characteristics when the compound is applied to the organic light emitting device.

In addition, the compound of the present invention includes an aliphatic hydrocarbon ring, so that it is possible to obtain an organic light emitting device having a narrow full width at half maximum and excellent color purity.

Furthermore, the compound of the present invention has high solubility, and thus can also be used in a solution process.

EXPLANATION OF REFERENCE NUMERALS AND SYMBOLS

Figure 1:
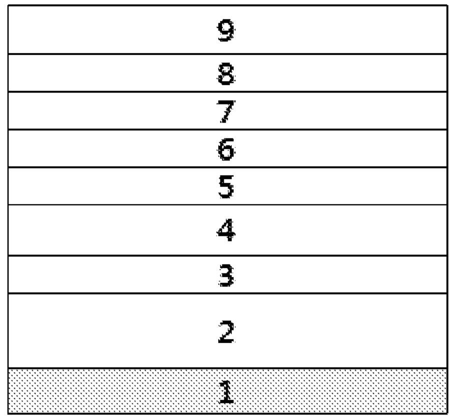
FIG. 1 illustrates an organic light emitting device composed of a substrate 1, a positive electrode 2, a hole injection layer 3, a hole transport layer 4, an electron blocking layer 5, a light emitting layer 6, a first electron transport layer 7, a second electron transport layer 8, and a negative electrode 9.

1: Substrate
2: Positive electrode
3: Hole injection layer
4: Hole transport layer
5: Electron blocking layer
6: Light emitting layer
7: First electron transport layer
8: Second electron transport layer
9: Negative electrode

DETAILED DESCRIPTION

Hereinafter, the present specification will be described in more detail.

The present specification provides a compound of the following Formula 1. The compound of the following Formula 1 has a low sublimation temperature, and thus is stable, and the efficiency and service life characteristics of the organic light emitting device are improved when the compound is applied to an organic material layer of an organic light emitting device:

Formula 1

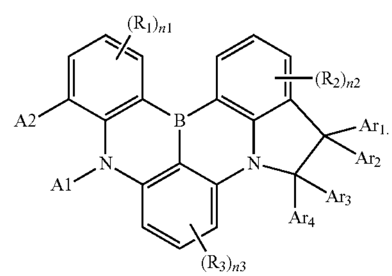

In Formula 1:

$Ar_1$ to $Ar_4$ are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group, or adjacent groups are bonded to each other to form a substituted or unsubstituted aliphatic hydrocarbon ring;

A1 and A2 are the same as or different from each other, and are each independently hydrogen, deuterium, a halogen group, a nitrile group, a substituted or unsubstituted silyl group, a substituted or unsubstituted boron group; a substituted or unsubstituted alkyl group, a substituted or unsubstituted alkenyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group, or are bonded to each other to form a substituted or unsubstituted ring;

$R_1$ to $R_3$ are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group; a substituted or unsubstituted aryl group, a substituted or unsubstituted amine group, or a substituted or unsubstituted heterocyclic group; and n1 to n3 are each an integer from 0 to 3, and when n1 to n3 are each 2 or more, the substituents in a plurality of parentheses are the same as or different from each other.

According to an exemplary embodiment of the present specification, the compound of Formula 1 includes a hexahydrocarbazole ring at a central fused ring core, or includes a hexahydrocarbazole group at a $R_3$ position. A hexahydrocarbazole has reduced conjugation compared to a carbazole, and thus exhibits different properties from the carbazole:

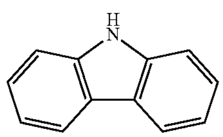 [SMILES: c1ccc2c(c1)[nH]c1ccccc12]

carbazole

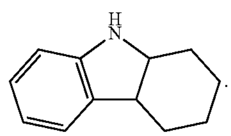

hexahydrocarbazole

In the following table, the HOMO, LUMO, T1, and S1 means the highest occupied energy, lowest unoccupied energy, triplet energy, and singlet energy, respectively. 9H-carbazole is a derivative including an aromatic ring and 4a,9a-dimethyl-2,3,4,4a,9,9a-hexahydro-1-carbazole is a derivative including an aliphatic ring, and can correspond to the derivative of hexahydrocarbazole of Formula 1.

| | HOMO | LUMO | T1 | S1 |
|---|---|---|---|---|
| 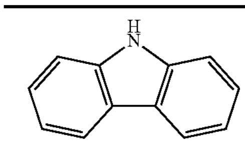 9H-CARBAZOLE | 5.44 | 0.64 | 3.19 | 4.15 |
| 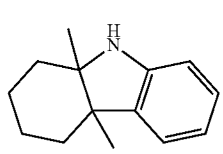 4a,9a-dimethyl-2,3,4,4a,9,9a-hexahydro-1H-carbazole | 5.19 | 0.43 | 3.56 | 4.74 |

When the HOMO and LUMO values are compared to each other in the table, 9H-carbazole has a deeper HOMO value than that of 4a,9a-dimethyl-2,3,4,4a,9,9a-hexahydro-1H-carbazole. This shows that 9H-carbazole has a greater influence on amines having an electron donor characteristic. As the HOMO energy of a compound becomes deeper, the electron donor characteristic of the compound to another compound in a device deteriorates, so that 9H-carbazole has a lower electron donor characteristic in a device than 4a,9a-dimethyl-2,3,4,4a,9,9a-hexahydro-1H-carbazole.

Further, in the table, 9H-carbazole has a lower triplet energy value than 4a,9a-dimethyl-2,3,4,4a,9,9a-hexahydro-1H-carbazole when the triplet energy values (T1) are compared. The more extended the conjugation is, the lower the triplet energy is, so that 9H-carbazole having an extended conjugation has a low triplet energy value. When the triplet energy values are compared, it can be seen that 9H-carbazole and 4a,9a-dimethyl-2,3,4,4a,9,9a-hexahydro-1H-carbazole are different materials having quite different characteristics.

Figure 2:
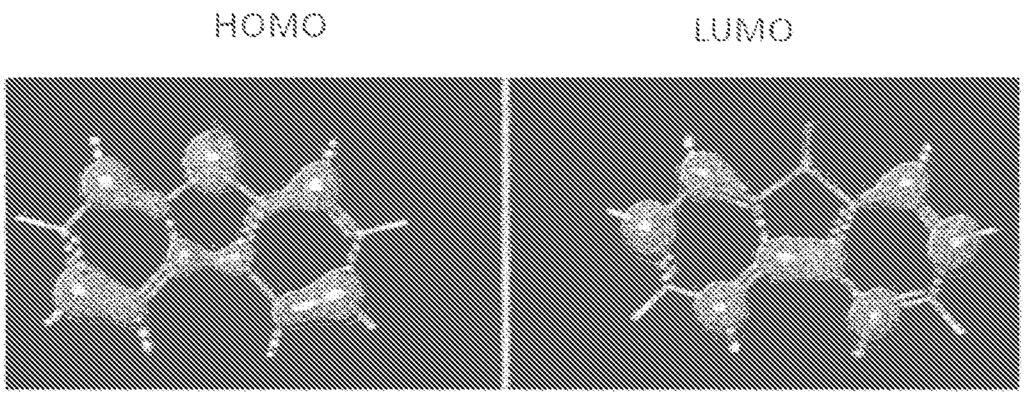
FIG. 2 illustrates the HOMO and LUMO electron distribution diagram of 9H-carbazole.
Figure 3:
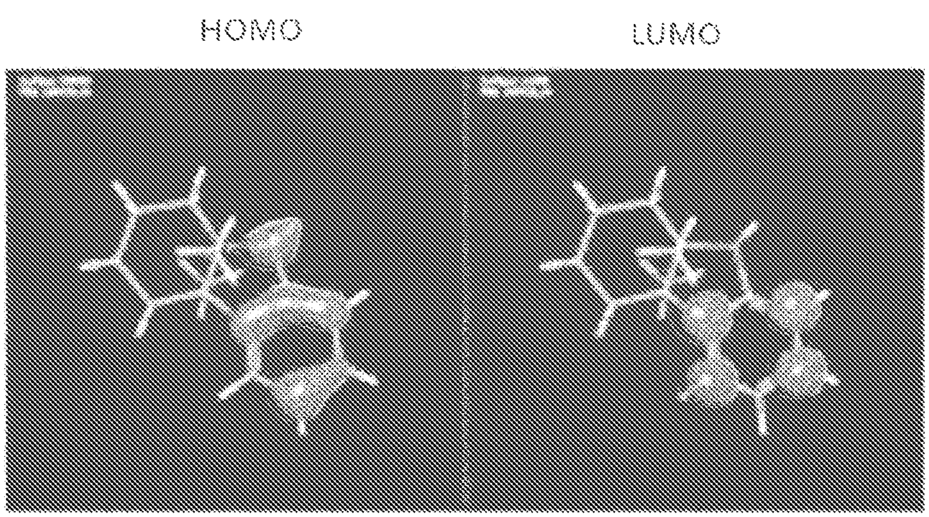
FIG. 3 illustrates the HOMO and LUMO electron distribution diagram of 4a,9a-dimethyl-2,3,4,4a,9,9a-hexahydro-1H-carbazole.

FIG. 2 illustrates the HOMO and LUMO electron distribution diagram of 9H-carbazole, and FIG. 3 illustrates the HOMO and LUMO electron distribution diagram of 4a,9a-dimethyl-2,3,4,4a,9,9a-hexahydro-1H-carbazole. When the HOMO and LUMO electron distribution diagrams in FIGS. 2 and 3 are compared, 9H-carbazole has widely spread HOMO orbital and LUMO orbital unlike 4a,9a-dimethyl-2,3,4,4a,9,9a-hexahydro-1H-carbazole. These widely spread orbitals are caused by the extension of the conjugation, and it can be confirmed that the amine of carbazole affects two benzene rings. Therefore, when 9H-carbazole is used as a dopant of a light emitting layer of an organic light emitting device, 9H-carbazole affects the full width at half maximum and the wavelength, thereby having a wide full width at half maximum.

In contrast, in the case of 4a,9a-dimethyl-2,3,4,4a,9,9a-hexahydro-1H-carbazole, amine affects only one benzene ring, so that when 4a,9a-dimethyl-2,3,4,4a,9,9a-hexahydro-1H-carbazole is used as a dopant material, the color purity is high because a device has the narrow full width at half maximum.

Hereinafter, the substituents and terms will be described.

When one part "includes" one constituent element in the present specification, unless otherwise specifically described, this does not mean that another constituent element is excluded, but means that another constituent element can be further included.

When one member is disposed "on" another member in the present specification, this includes not only a case where the one member is brought into contact with another member, but also a case where still another member is present between the two members.

In the present specification,

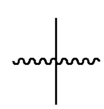

means a moiety bonded to another substituent or a bonding portion.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent can be substituted, and when two or more are substituted, the two or more substituents can be the same as or different from each other.

In the present specification, the term "substituted or unsubstituted" means being substituted with one or two or more substituents selected from the group consisting of deuterium (—D), a halogen group, a nitrile group (—CN), a silyl group, a boron group, an alkyl group, an alkenyl group, an alkynyl group, a cycloalkyl group, an alkoxy group, an aryloxy group, an amine group, an aryl group, and a heterocyclic group, being substituted with a substituent to which two or more substituents among the substituents are linked, or having no substituent. For example, "the substituent to which two or more substituents are linked" can be a biphenyl group. That is, the biphenyl group can also be an aryl group, and can be interpreted as a substituent to which two phenyl groups are linked.

In the present specification, the term "substituted with A or B" includes i) the case of being substituted with only A, ii) the case of being substituted with only B, and iii) the case of being substituted with A and B.

Examples of the substituents will be described below, but are not limited thereto.

In the present specification, examples of a halogen group include fluorine (F), chlorine (Cl), bromine (Br) or iodine (I).

In the present specification, a silyl group can be —Si (Y101) (Y102) (Y103), and Y101, Y102, and Y103 can be each hydrogen, a substituted or unsubstituted alkyl group, or a substituted or unsubstituted aryl group. Examples of the silyl group include a trialkylsilyl group and a triarylsilyl group, and specific examples thereof include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but the examples are not limited thereto.

In the present specification, a boron group can be —B(Y104) (Y105), and Y104 and Y105 can be each hydrogen, a substituted or unsubstituted alkyl group, or a substituted or unsubstituted aryl group. Specific examples of the boron group include a trimethylboron group, a triethylboron group, a t-butyldimethylboron group, a triphenylboron group, a phenylboron group, and the like, but are not limited thereto.

In the present specification, the alkyl group can be straight-chained or branched, and the number of carbon atoms thereof is not particularly limited, but is preferably 1 to 60. According to an exemplary embodiment, the number of carbon atoms of the alkyl group is 1 to 30. According to another exemplary embodiment, the number of carbon atoms of the alkyl group is 1 to 20. According to still another exemplary embodiment, the number of carbon atoms of the alkyl group is 1 to 10. Specific examples of the alkyl group include a methyl group, an ethyl group, a propyl group, an isopropyl group, a butyl group, an isobutyl group, a tert-butyl group, a pentyl group, a hexyl group, a heptyl group, an octyl group, and the like, but are not limited thereto.

In the present specification, a cycloalkyl group is not particularly limited, but has preferably 3 to 60 carbon atoms, and according to an exemplary embodiment, the number of carbon atoms of the cycloalkyl group is 3 to 30. According to another exemplary embodiment, the number of carbon atoms of the cycloalkyl group is 3 to 20. According to still another exemplary embodiment, the number of carbon atoms of the cycloalkyl group is 3 to 6. Specific examples thereof include a cyclopropyl group, a cyclobutyl group, a cyclopentyl group, a cyclohexyl group, a cycloheptyl group, a cyclooctyl group, and the like, but are not limited thereto.

In the present specification, an amine group can be selected from the group consisting of $—NH_2$; an alkylamine group; an arylalkylamine group; an arylamine group; an arylheteroarylamine group; an alkylheteroarylamine group; and a heteroarylamine group, and is not limited thereto. The number of carbon atoms of the amine group is not particularly limited, but is preferably 1 to 60.

In the present specification, the number of carbon atoms of an alkylamine group is not particularly limited, but can be 1 to 40, and can be 1 to 20 according to an exemplary embodiment. Specific examples of the alkylamine group include a methylamine group, a dimethylamine group, an ethylamine group, a diethylamine group, and the like, but are not limited thereto.

In the present specification, examples of the arylamine group include a substituted or unsubstituted monoarylamine group, a substituted or unsubstituted diarylamine group, or a substituted or unsubstituted triarylamine group. The aryl group in the arylamine group can be a monocyclic aryl group or a polycyclic aryl group. The arylamine group including the two or more aryl groups can include a monocyclic aryl group, a polycyclic aryl group, or both a monocyclic aryl group and a polycyclic aryl group.

Specific examples of the arylamine group include a phenylamine group, a naphthylamine group, a biphenylamine group, an anthracenylamine group, a diphenylamine group, a phenylnaphthylamine group, a biphenylphenylamine group, a dibiphenylamine group, a fluorenylphenylamine group, and the like, but are not limited thereto.

In the present specification, examples of the heteroarylamine group include a substituted or unsubstituted monoheteroarylamine group, a substituted or unsubstituted diheteroarylamine group, or a substituted or unsubstituted triheteroarylamine group.

The heteroaryl group in the heteroarylamine group can be a monocyclic heteroaryl group or a polycyclic heteroaryl group. The heteroarylamine group including two or more heteroaryl groups can include a monocyclic heteroaryl group, a polycyclic heteroaryl group, or both a monocyclic heteroaryl group and a polycyclic heteroaryl group.

In the present specification, an arylheteroarylamine group means an amine group substituted with an aryl group and a heteroaryl group.

In the present specification, an arylalkylamine group means an amine group substituted with an aryl group and an alkyl group.

In the present specification, an alkylheteroarylamine group means an amine group substituted with an alkyl group and a heteroaryl group.

In the present specification, an aryl group is not particularly limited, but has preferably 6 to 60 carbon atoms, and can be a monocyclic aryl group or a polycyclic aryl group. According to an exemplary embodiment, the number of carbon atoms of the aryl group is 6 to 30. According to an exemplary embodiment, the number of carbon atoms of the aryl group is 6 to 20. Examples of the monocyclic aryl group include a phenyl group, a biphenyl group, a terphenyl group, and the like, but are not limited thereto. Examples of the polycyclic aryl group include a naphthyl group, an anthracenyl group, a phenanthrenyl group, a pyrenyl group, a perylenyl group, a triphenyl group, a chrysenyl group, a fluorenyl group, and the like, but are not limited thereto.

In the present specification, a fluorenyl group can be substituted, and two substituents can be bonded to each other to form a spiro structure.

When the fluorenyl group is substituted, the fluorenyl group can be a spiro fluorenyl group such as

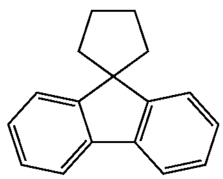

and

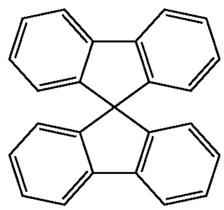

, and a substituted fluorenyl group such as

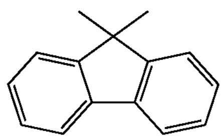

(a 9,9-dimethylfluorenyl group) and

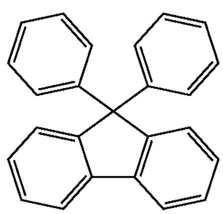 [SMILES: c1ccc(C2(c3ccccc3)c3ccccc3-c3ccccc32)cc1]

(a 9,9-diphenylfluorenyl group). However, the substituent is not limited thereto.

In the present specification, a heterocyclic group is a cyclic group including one or more of N, O, P, S, Si, and Se as a heteroatom, and the number of carbon atoms thereof is not particularly limited, but is preferably 2 to 60. According to an exemplary embodiment, the number of carbon atoms of the heterocyclic group is 2 to 30. Examples of the heterocyclic group include a pyridine group, a pyrrole group, a pyrimidine group, a pyridazinyl group, a furan group, a thiophene group, an imidazole group, a pyrazole group, a dibenzofuran group, a dibenzothiophene group, a carbazole group, and the like, but are not limited thereto.

In the present specification, the alkenyl group can be straight-chained or branched as a substituent including a double bond between a carbon atom and a carbon atom, and the number of carbon atoms thereof is not particularly limited, but is preferably 2 to 40. According to an exemplary embodiment, the number of carbon atoms of the alkenyl group is 2 to 20. According to another exemplary embodiment, the number of carbon atoms of the alkenyl group is 2 to 10. Specific examples thereof include vinyl, 1-propenyl, isopropenyl, 1-butenyl, 2-butenyl, 3-butenyl, 1-pentenyl, and the like, but are not limited thereto.

In the present specification, the alkynyl group can be straight-chained or branched as a substituent including a triple bond between a carbon atom and a carbon atom, and the number of carbon atoms thereof is not particularly limited, but is preferably 2 to 40. According to an exemplary embodiment, the number of carbon atoms of the alkenyl group is 2 to 20. According to another exemplary embodiment, the number of carbon atoms of the alkenyl group is 2 to 10.

In the present specification, the alkoxy group can be straight-chained, branched, or cyclic. The number of carbon atoms of the alkoxy group is not particularly limited, but is preferably 1 to 40. Specific examples thereof include methoxy, ethoxy, n-propoxy, isopropoxy, and the like, but are not limited thereto.

A substituent including an alkyl group, an alkoxy group, and other alkyl group moieties described in the present specification includes both a straight-chained form and a branch-chained form.

In the present specification, the above-described description on the aryl group can be applied to an aryl of an aryloxy group.

In the present specification, in a substituted or unsubstituted ring formed by bonding substituents, the "ring" means a hydrocarbon ring; or a hetero ring.

The hydrocarbon ring can be an aromatic ring, an aliphatic ring, or a fused ring of the aromatic ring and the aliphatic ring, and can be selected from the examples of the cycloalkyl group or the aryl group, except for a divalent hydrocarbon ring.

In the present specification, the description on the aryl group can be applied to an aromatic hydrocarbon ring except for a divalent aromatic hydrocarbon ring.

The description on the heterocyclic group can be applied to the hetero ring except for a divalent hetero ring.

In the present specification, the aromatic hydrocarbon ring means a planar ring in which pi electrons are completely conjugated.

In the present specification, an aliphatic hydrocarbon ring means all hydrocarbon rings except for aromatic hydrocarbon rings. A substituted aliphatic hydrocarbon ring also includes an aliphatic hydrocarbon ring in which aromatic rings are fused.

In the present specification, "substituents are bonded to each other to form an aliphatic hydrocarbon ring" means that one hydrocarbon ring formed by linking the two corresponding substituents is an aliphatic ring. "One hydrocarbon ring formed by linking the two corresponding substituents" refers to a ring including all the two corresponding substituents. Not only an aliphatic hydrocarbon ring, but also an aliphatic hetero ring, an aromatic hydrocarbon ring, or an aromatic hetero ring can be fused to the aliphatic hydrocarbon ring formed by linking the two corresponding substituents. For example, the case where the following $Y_{106}$ and $Y_{107}$ are bonded to each other to form an aliphatic hydrocarbon ring also includes the case of including not only the following 1 (forming a cyclohexane ring) or 2 (forming a cyclohexene ring), but also the following 3 (a cyclohexane ring is fused to a cyclohexane ring) or 4 (a benzene ring is fused to a cyclohexane ring):

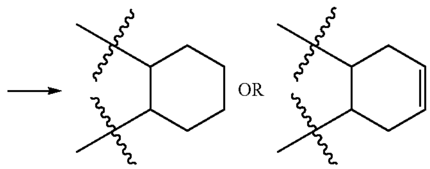

1 2

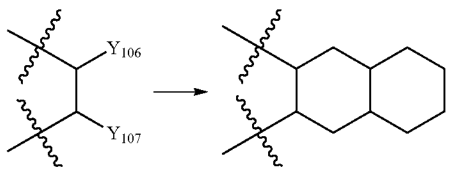

3

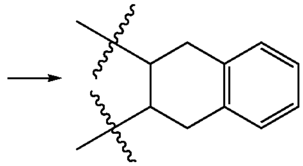

4 .

Hereinafter, the compound of the present invention will be described.

In an exemplary embodiment of the present specification, A1 and A2 are the same as or different from each other, and are each independently hydrogen, deuterium, a halogen group, a nitrile group, a substituted or unsubstituted alkyl group having 1 to 20 carbon atoms, a substituted or unsubstituted alkenyl group having 2 to 20 carbon atoms, a substituted or unsubstituted alkynyl group having 2 to 20 carbon atoms, a substituted or unsubstituted alkoxy group having 1 to 20 carbon atoms, a substituted or unsubstituted aryloxy group having 6 to 30 carbon atoms, a substituted or unsubstituted cycloalkyl group having 3 to 30 carbon atoms, a substituted or unsubstituted aryl group having 6 to 30 carbon atoms, or a substituted or unsubstituted heterocyclic group having 2 to 30 carbon atoms, or are bonded to each other to form a substituted or unsubstituted ring having 3 to 60 carbon atoms.

According to an exemplary embodiment of the present specification, A1 and A2 are the same as or different from each other, and are each independently hydrogen; deuterium; a halogen group; a nitrile group; a substituted or unsubstituted alkyl group having 1 to 20 carbon atoms; a substituted or unsubstituted aryl group having 6 to 30 carbon atoms; or a substituted or unsubstituted heterocyclic group having 2 to 30 carbon atoms, or are bonded to each other to form a substituted or unsubstituted ring having 3 to 60 carbon atoms.

According to another exemplary embodiment, A1 and A2 are the same as or different from each other, and are each independently hydrogen, deuterium, a halogen group, a nitrile group, a substituted or unsubstituted alkyl group having 1 to 20 carbon atoms, or a substituted or unsubstituted aryl group having 6 to 30 carbon atoms, or are bonded to each other to form a substituted or unsubstituted ring having 3 to 60 carbon atoms.

In still another exemplary embodiment, A1 and A2 are the same as or different from each other, and are each independently hydrogen, deuterium, an alkyl group having 1 to 20 carbon atoms, or an aryl group having 3 to 30 carbon atoms, which is unsubstituted or substituted with an alkyl group having 1 to 20 carbon atoms, or are bonded to each other to form a ring having 3 to 60 carbon atoms, which is unsubstituted or substituted with one or more substituents selected from the group consisting of deuterium, a halogen group, a trialkylsilyl group having 1 to 20 carbon atoms, a triarylsilyl group having 6 to 30 carbon atoms, an alkyl group having 1 to 20 carbon atoms, and an aryl group having 6 to 30 carbon atoms.

In yet another exemplary embodiment, A1 and A2 are the same as or different from each other, and are each independently hydrogen, deuterium, an alkyl group having 1 to 4 carbon atoms, or an aryl group having 6 to 12 carbon atoms, which is unsubstituted or substituted with an alkyl group having 1 to 4 carbon atoms or an aryl group having 6 to 12 carbon atoms, or are bonded to each other to form a ring having 3 to 60 carbon atoms, which is unsubstituted or substituted with one or more substituents selected from the group consisting of deuterium, a halogen group, a trimethylsilyl group, a triphenylsilyl group, an alkyl group having 1 to 4 carbon atoms, and an aryl group having 6 to 12 carbon atoms.

According to still yet another exemplary embodiment, A1 and A2 are the same as or different from each other, and are each independently hydrogen; deuterium; a methyl group; a phenyl group which is unsubstituted or substituted with a methyl group, a tert-butyl group, a phenyl group, or a naphthyl group; or a biphenyl group which is unsubstituted or substituted with a tert-butyl group, or are bonded to each other to form a ring having 3 to 60 carbon atoms, which is unsubstituted or substituted with one or more substituents selected from the group consisting of deuterium, a halogen group, a trimethylsilyl group, a triphenylsilyl group, a methyl group, an ethyl group, a tert-butyl group, and a phenyl group.

In a further exemplary embodiment, A1 and A2 are the same as or different from each other, and are each independently hydrogen; deuterium; an alkyl group having 1 to 20 carbon atoms; or an aryl group having 3 to 30 carbon atoms, which is unsubstituted or substituted with an alkyl group having 1 to 20 carbon atoms, or are bonded to each other to form a five-membered ring, which is unsubstituted or substituted with one or more substituents selected from the group consisting of deuterium, a halogen group, a trialkylsilyl group having 1 to 20 carbon atoms, a triarylsilyl group having 6 to 30 carbon atoms, an alkyl group having 1 to 20 carbon atoms, and an aryl group having 6 to 30 carbon atoms and in which an aliphatic hydrocarbon ring or an aromatic hydrocarbon ring is fused or unfused.

According to another further exemplary embodiment, A1 and A2 are the same as or different from each other, and are each independently hydrogen; deuterium; a methyl group; a phenyl group which is unsubstituted or substituted with a methyl group, a tert-butyl group, a phenyl group, or a naphthyl group; or a biphenyl group which is unsubstituted or substituted with a tert-butyl group, or are bonded to each other to form a five-membered ring, which is unsubstituted or substituted with one or more substituents selected from the group consisting of deuterium, a halogen group, a trimethylsilyl group, a triphenylsilyl group, a methyl group, an ethyl group, a tert-butyl group, and a phenyl group and in which a monocyclic to tricyclic aliphatic hydrocarbon ring or a monocyclic to tricyclic aromatic hydrocarbon ring is fused or unfused.

According to an exemplary embodiment of the present specification, Formula 1 is any one of the following Formula 1-1 or 1-2:

Formula 1-1

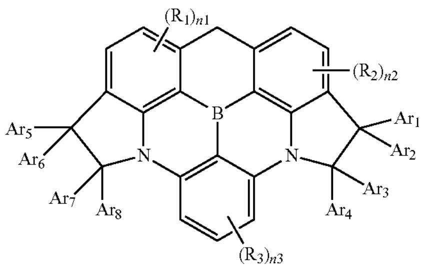

Formula 1-2

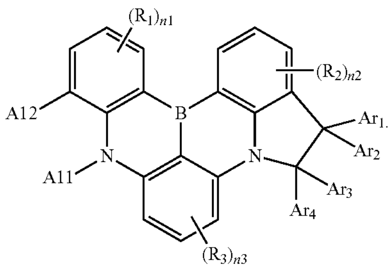

In Formulae 1-1 and 1-2:

the definitions of $R_1$ to $R_3$, $Ar_1$ to $Ar_4$, and n1 to n3 are the same as those defined in Formula 1;

A11 and A12 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group; and $Ar_5$ to $Ar_8$ are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group; a substituted or unsubstituted aryloxy group, a substituted or unsubstituted cycloalkyl group, a substituted or unsubstituted aryl group, or a substituted or unsubstituted heterocyclic group, or adjacent groups are bonded to each other to form a substituted or unsubstituted ring.

In an exemplary embodiment of the present specification, A11 and A12 are the same as or different from each other, and are each independently hydrogen, deuterium, a halogen group, a nitrile group, a substituted or unsubstituted alkyl group having 1 to 20 carbon atoms; a substituted or unsubstituted alkenyl group having 2 to 20 carbon atoms, a substituted or unsubstituted alkynyl group having 2 to 20 carbon atoms, a substituted or unsubstituted alkoxy group having 1 to 20 carbon atoms, a substituted or unsubstituted aryloxy group having 6 to 30 carbon atoms; a substituted or unsubstituted cycloalkyl group having 3 to 30 carbon atoms, a substituted or unsubstituted aryl group having 6 to 30 carbon atoms, or a substituted or unsubstituted heterocyclic group having 2 to 30 carbon atoms.

According to another exemplary embodiment, A11 and A12 are the same as or different from each other, and are each independently hydrogen, deuterium, a halogen group, a nitrile group, a substituted or unsubstituted alkyl group having 1 to 20 carbon atoms, or a substituted or unsubstituted aryl group having 6 to 30 carbon atoms.

According to still another exemplary embodiment, A11 and A12 are the same as or different from each other, and are each independently hydrogen, deuterium, an alkyl group having 1 to 4 carbon atoms; or an aryl group having 6 to 12 carbon atoms, which is unsubstituted or substituted with an alkyl group having 1 to 4 carbon atoms or an aryl group having 6 to 12 carbon atoms.

In yet another exemplary embodiment, A11 and A12 are the same as or different from each other, and are each independently hydrogen, deuterium, a substituted or unsubstituted methyl group, a substituted or unsubstituted phenyl group, or a substituted or unsubstituted biphenyl group.

In still yet another exemplary embodiment, A11 and A12 are the same as or different from each other, and are each independently hydrogen, deuterium, a methyl group, a phenyl group which is unsubstituted or substituted with a methyl group, a tert-butyl group, a phenyl group, or a naphthyl group, or a biphenyl group which is unsubstituted or substituted with a tert-butyl group.

According to an exemplary embodiment of the present specification, A11 is an aryl group having 6 to 12 carbon atoms, which is unsubstituted or substituted with an alkyl group having 1 to 4 carbon atoms or an aryl group having 6 to 12 carbon atoms.

In another exemplary embodiment, A11 is a phenyl group which is unsubstituted or substituted with a methyl group, a tert-butyl group, a phenyl group, or a naphthyl group; or a biphenyl group which is unsubstituted or substituted with a tert-butyl group.

According to an exemplary embodiment of the present specification, A12 is hydrogen, deuterium, or an alkyl group having 1 to 4 carbon atoms.

In another exemplary embodiment, A12 is hydrogen, deuterium, or a methyl group.

According to an exemplary embodiment of the present specification, $Ar_1$ to $Ar_4$ are the same as or different from each other, and are each independently hydrogen, deuterium, a halogen group, a nitrile group, a substituted or unsubstituted alkyl group having 1 to 20 carbon atoms, a substituted or unsubstituted alkenyl group having 2 to 20 carbon atoms, a substituted or unsubstituted alkynyl group having 2 to 20 carbon atoms, a substituted or unsubstituted alkoxy group having 1 to 20 carbon atoms, a substituted or unsubstituted aryloxy group having 6 to 30 carbon atoms, a substituted or unsubstituted cycloalkyl group having 3 to 30 carbon atoms; a substituted or unsubstituted aryl group having 6 to 30 carbon atoms, or a substituted or unsubstituted heterocyclic group having 2 to 30 carbon atoms, or adjacent groups are bonded to each other to form a substituted or unsubstituted aliphatic hydrocarbon ring having 3 to 60 carbon atoms.

According to another exemplary embodiment, $Ar_1$ to $Ar_4$ are the same as or different from each other, and are each independently hydrogen, deuterium, a halogen group, a nitrile group, a substituted or unsubstituted alkyl group having 1 to 20 carbon atoms, or a substituted or unsubstituted aryl group having 6 to 30 carbon atoms, or adjacent groups are bonded to each other to form a substituted or unsubstituted monocyclic to tricyclic aliphatic hydrocarbon ring having 3 to 60 carbon atoms, in which an aliphatic hydrocarbon ring or an aromatic hydrocarbon ring is fused or unfused.

In still another exemplary embodiment, $Ar_1$ to $Ar_4$ are the same as or different from each other, and are each independently hydrogen, deuterium, a halogen group, a nitrile group, a substituted or unsubstituted methyl group, a substituted or unsubstituted ethyl group; or a substituted or unsubstituted phenyl group, or adjacent groups are bonded to each other to form a substituted or unsubstituted monocyclic to tricyclic aliphatic hydrocarbon ring having 3 to 60 carbon atoms, in which an aliphatic hydrocarbon ring or an aromatic hydrocarbon ring is fused or unfused.

In yet another exemplary embodiment, $Ar_1$ to $Ar_4$ are the same as or different from each other, and are each independently hydrogen, deuterium, a halogen group, a substituted or unsubstituted alkyl group having 1 to 20 carbon atoms, a substituted or unsubstituted aryl group having 6 to 30 carbon atoms, or adjacent groups are bonded to each other to form a six-membered aliphatic hydrocarbon ring in which an aliphatic hydrocarbon ring or an aromatic hydrocarbon ring is fused or unfused.

In still yet another exemplary embodiment, $Ar_1$ to $Ar_4$ are the same as or different from each other, and are each independently hydrogen, deuterium, a halogen group, a substituted or unsubstituted alkyl group having 1 to 20 carbon atoms, a substituted or unsubstituted aryl group having 6 to 30 carbon atoms, or adjacent groups are bonded to each other to form a six-membered aliphatic hydrocarbon ring in which monocyclic to bicyclic aliphatic hydrocarbon rings or monocyclic to bicyclic aromatic hydrocarbon rings are fused or unfused.

In a further exemplary embodiment, $Ar_1$ to $Ar_4$ are the same as or different from each other, and are each independently hydrogen, deuterium, a halogen group, a substituted or unsubstituted alkyl group having 1 to 20 carbon atoms, a substituted or unsubstituted aryl group having 6 to 30 carbon atoms, or adjacent groups are bonded to each other to form a six-membered aliphatic hydrocarbon ring in which one or two cyclohexane(s) or benzene(s) is or are fused or unfused.

According to another further exemplary embodiment, $Ar_1$ to $Ar_4$ are the same as or different from each other, and are each independently hydrogen, deuterium, a halogen group, a methyl group, an ethyl group, or a phenyl group, or adjacent groups are bonded to each other to form a substituted or unsubstituted cyclohexane, a substituted or unsubstituted tetradecahydrophenanthrene, a substituted or unsubstituted tetrahydronaphthalene, or a substituted or unsubstituted decahydronaphthalene.

In another further exemplary embodiment, two of $Ar_1$ to $Ar_4$ are the same as or different from each other, and are each independently hydrogen, deuterium, a halogen group, a methyl group, an ethyl group, or a phenyl group, and the other two are bonded to each other to form cyclohexane, tetradecahydrophenanthrene, tetrahydronaphthalene, or decahydronaphthalene.

According to an exemplary embodiment of the present specification, when two of $Ar_1$ to $Ar_4$ are bonded to each other to form an aliphatic hydrocarbon ring, any one ring selected from the following rings is formed:

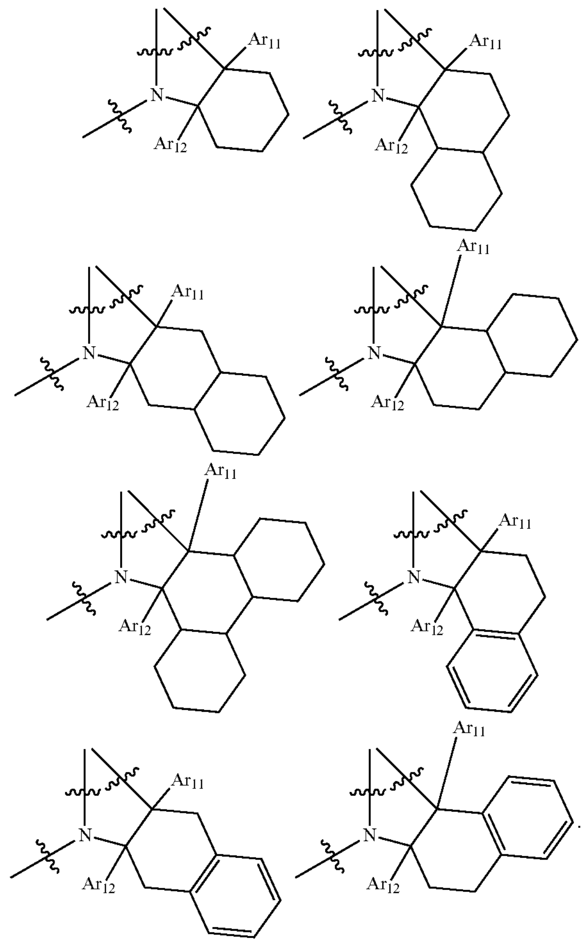

In the ring, $Ar_{11}$ and $Ar_{12}$ are substituents which do not form an aliphatic hydrocarbon ring in $Ar_1$ to $Ar_4$, and are the same as or different from each other; and the ring is unsubstituted or substituted with deuterium, an alkyl group having 1 to 10 carbon atoms, or an aryl group having 6 to 30 carbon atoms.

According to another exemplary embodiment, the ring is unsubstituted or substituted with deuterium.

According to still another exemplary embodiment, the ring is unsubstituted. That is, the ring does not have another substituent except for $Ar_{11}$ and $Ar_{12}$.

According to yet another exemplary embodiment, $Ar_{11}$ and $Ar_{12}$ are each independently a straight-chained or branched alkyl group having 1 to 4 carbon atoms; or an aryl group having 6 to 20 carbon atoms.

In still yet another exemplary embodiment, $Ar_{11}$ and $Ar_{12}$ are the same as or different from each other, and are each independently a methyl group or a phenyl group.

In a further exemplary embodiment, $Ar_{11}$ and $Ar_{12}$ are a methyl group.

According to an exemplary embodiment of the present specification, two of $Ar_1$ to $Ar_4$ are the same as or different from each other, and are each independently a substituted or unsubstituted straight-chained or branched alkyl group having 1 to 20 carbon atoms, or an aryl group having 6 to 30 carbon atoms. In this case, the present invention has an effect in which the efficiency of a device is increased by preventing the phenomenon of an aggregation among compounds to suppress the quenching.

According to another exemplary embodiment, two of $Ar_1$ to $Ar_4$ are the same as or different from each other, and are each independently a straight-chained or branched alkyl group having 1 to 4 carbon atoms, or an aryl group having 6 to 20 carbon atoms.

According to still another exemplary embodiment, two of $Ar_1$ to $Ar_4$ are the same as or different from each other, and are each independently a methyl group or a phenyl group.

In yet another exemplary embodiment, two of $Ar_1$ to $Ar_4$ are a methyl group.

In an exemplary embodiment of the present specification, Formula 1 is any one of the following Formula 2-1 or 2-2:

Formula 2-1

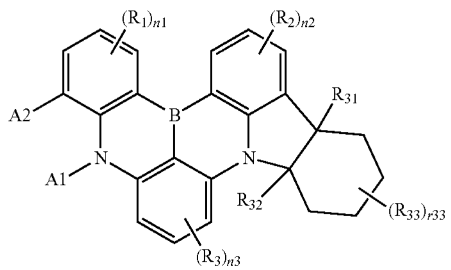

Formula 2-2

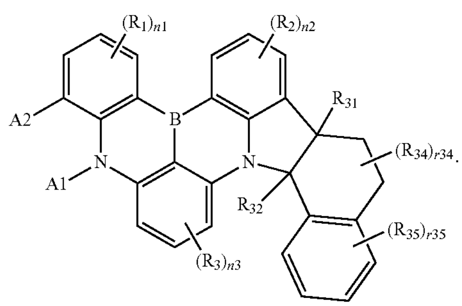

.

In Formulae 2-1 and 2-2:

the definitions of A1, A2, $R_1$ to $R_3$, and n1 to n3 are the same as those defined in Formula 1;

$R_{31}$ to $R_{35}$ are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group;

adjacent $R_{35}$'s can be bonded to each other to form a substituted or unsubstituted aliphatic hydrocarbon ring;

r33 is an integer from 0 to 8;

r34 and r35 are each an integer from 0 to 4; and when r33 to r35 are each 2 or more, the substituents in a plurality of parentheses are the same as or different from each other.

According to an exemplary embodiment of the present specification, $R_{31}$ to $R_{35}$ are the same as or different from each other, and are each independently hydrogen, deuterium, a halogen group, an alkyl group having 1 to 4 carbon atoms, or an aryl group having 6 to 20 carbon atoms.

According to an exemplary embodiment of the present specification, $R_{31}$ and $R_{32}$ are the same as or different from each other, and are each independently hydrogen, deuterium, a halogen group, an alkyl group having 1 to 4 carbon atoms, or an aryl group having 6 to 20 carbon atoms.

In another exemplary embodiment, $R_{31}$ and $R_{32}$ are the same as or different from each other, and are each independently hydrogen, deuterium, a halogen group, a methyl group, an ethyl group, or a phenyl group.

According to an exemplary embodiment of the present specification, $R_{33}$ to $R_{35}$ are the same as or different from each other, and are each independently hydrogen or deuterium.

In another exemplary embodiment, $R_{33}$ to $R_{35}$ are each hydrogen.

According to an exemplary embodiment of the present specification, adjacent $R_{35}$'s are bonded to each other to form a substituted or unsubstituted aliphatic hydrocarbon ring.

In another exemplary embodiment, adjacent $R_{35}$'s are bonded to each other to form a substituted or unsubstituted cyclohexane.

In still another exemplary embodiment, adjacent $R_{35}$'s are bonded to each other to form one or two cyclohexane(s).

In an exemplary embodiment of the present specification, r33 to r35 are each 0.

According to an exemplary embodiment of the present specification, Formula 1-1 is any one of the following Formulae 2 to 7:

Formula 2

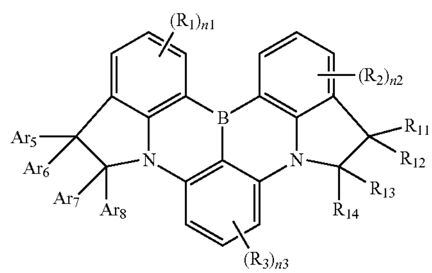

Formula 3

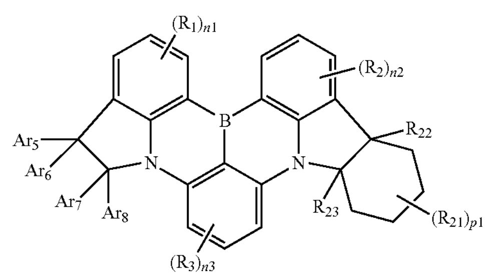

Formula 4

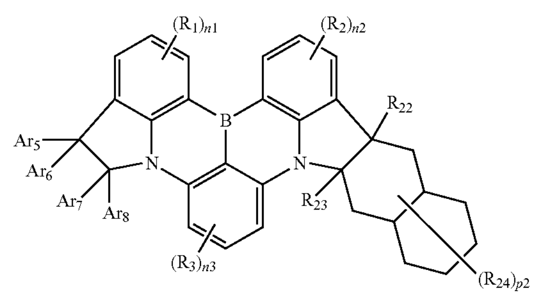

-continued

Formula 5

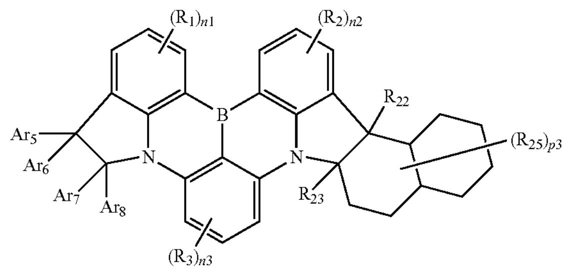

Formula 6

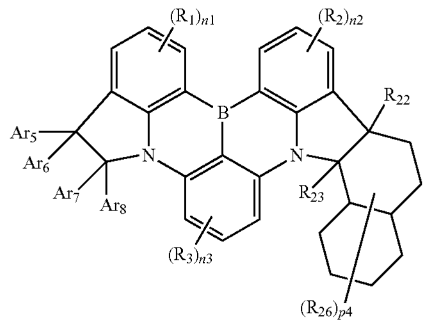

Formula 7

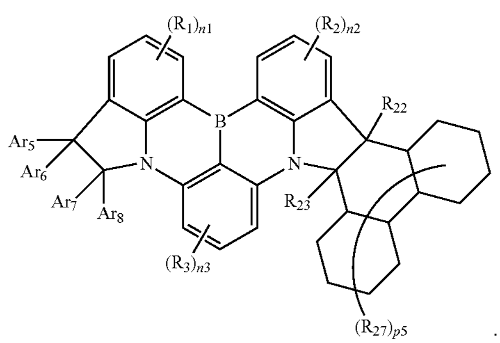

In Formulae 2 to 7:

definitions of $R_1$ to $R_3$, $Ar_5$ to $Ar_8$, and n1 to n3 are the same as those defined in Formula 1-1;

$R_{11}$ to $R_{14}$ and $R_{21}$ to $R_{27}$ are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group;

p1 is an integer from 0 to 8;

p2 to p4 are each an integer from 0 to 14;

p5 is an integer from 0 to 20; and when p1 to p5 are each 2 or more, the substituents in a plurality of parentheses are the same as or different from each other.

According to an exemplary embodiment of the present specification, $R_{11}$ to $R_{14}$ and $R_{21}$ to $R_{27}$ are the same as or different from each other, and are each independently hydrogen, deuterium, a halogen group, a nitrile group, a substituted or unsubstituted alkyl group having 1 to 20 carbon atoms, a substituted or unsubstituted alkenyl group having 2 to 20 carbon atoms, a substituted or unsubstituted alkynyl group having 2 to 20 carbon atoms, a substituted or unsubstituted alkoxy group having 1 to 20 carbon atoms, a substituted or unsubstituted aryloxy group having 6 to 30 carbon atoms, a substituted or unsubstituted cycloalkyl group having 3 to 30 carbon atoms, a substituted or unsubstituted aryl group having 6 to 30 carbon atoms, or a substituted or unsubstituted heterocyclic group having 2 to 30 carbon atoms.

According to another exemplary embodiment, $R_{11}$ to $R_{14}$ and $R_{21}$ to $R_{27}$ are the same as or different from each other, and are each independently hydrogen, deuterium, a halogen group, a nitrile group, a substituted or unsubstituted alkyl group having 1 to 20 carbon atoms, or a substituted or unsubstituted aryl group having 6 to 30 carbon atoms.

In still another exemplary embodiment, $R_{11}$ to $R_{14}$ and $R_{21}$ to $R_{27}$ are the same as or different from each other, and are each independently hydrogen, deuterium, a halogen group, a nitrile group, a substituted or unsubstituted methyl group, a substituted or unsubstituted ethyl group, or a substituted or unsubstituted phenyl group.

In yet another exemplary embodiment, $R_{11}$ to $R_{14}$ and $R_{21}$ to $R_{27}$ are the same as or different from each other, and are each independently hydrogen, deuterium, a halogen group, a methyl group, an ethyl group, or a phenyl group.

According to an exemplary embodiment of the present specification, $R_{11}$ to $R_{14}$, $R_{22}$, and $R_{23}$ are the same as or different from each other, and are each independently hydrogen, deuterium, a halogen group, an alkyl group having 1 to 4 carbon atoms, or an aryl group having 6 to 20 carbon atoms.

In another exemplary embodiment, $R_{11}$ to $R_{14}$, $R_{22}$, and $R_{23}$ are the same as or different from each other, and are each independently hydrogen, deuterium, a halogen group, a methyl group, an ethyl group, or a phenyl group.

According to an exemplary embodiment of the present specification, $R_{21}$ and $R_{24}$ to $R_{27}$ are the same as or different from each other, and are each independently hydrogen or deuterium.

In another exemplary embodiment, $R_{21}$ and $R_{24}$ to $R_{27}$ are each hydrogen.

According to an exemplary embodiment of the present specification, p1 to p5 are each an integer from 0 to 2, and when p1 to p5 are each 2 or more, substituents in a plurality of parentheses are the same as or different from each other.

According to another exemplary embodiment, p1 to p5 are each 0 or 1.

According to an exemplary embodiment of the present specification, $Ar_5$ to $Ar_8$ are the same as or different from each other, and are each independently hydrogen, deuterium, a halogen group, a nitrile group, a substituted or unsubstituted alkyl group having 1 to 20 carbon atoms, a substituted or unsubstituted alkenyl group having 2 to 20 carbon atoms, a substituted or unsubstituted alkynyl group having 2 to 20 carbon atoms, a substituted or unsubstituted alkoxy group having 1 to 20 carbon atoms, a substituted or unsubstituted aryloxy group having 6 to 30 carbon atoms, a substituted or unsubstituted cycloalkyl group having 3 to 30 carbon atoms, a substituted or unsubstituted aryl group having 6 to 60 carbon atoms, or a substituted or unsubstituted heterocyclic group having 2 to 60 carbon atoms, or adjacent groups are bonded to each other to form a substituted or unsubstituted ring having 3 to 60 carbon atoms.

According to an exemplary embodiment of the present specification, $Ar_5$ to $Ar_8$ are the same as or different from each other, and are each independently hydrogen, deuterium, a halogen group, a nitrile group, a substituted or unsubstituted alkyl group having 1 to 20 carbon atoms, or a substituted or unsubstituted aryl group having 6 to 30 carbon atoms, or adjacent groups are bonded to each other to form a substituted or unsubstituted ring having 3 to 60 carbon atoms.

In an exemplary embodiment of the present specification, $Ar_5$ to $Ar_8$ are bonded to each other to form a substituted or unsubstituted aromatic hydrocarbon ring, or any one of $Ar_5$ and $Ar_6$ and any one of $Ar_7$ and $Ar_8$ are bonded to each other to form a substituted or unsubstituted aliphatic hydrocarbon ring, and groups which do not form a ring among $Ar_5$ to $Ar_8$ are the same as or different from each other, and are each independently hydrogen, deuterium, a halogen group, a nitrile group, a substituted or unsubstituted alkyl group having 1 to 20 carbon atoms, or a substituted or unsubstituted aryl group having 6 to 30 carbon atoms.

In another exemplary embodiment, $Ar_5$ to $Ar_8$ are the same as or different from each other, and are each independently hydrogen, deuterium, a halogen group, a nitrile group, a substituted or unsubstituted methyl group, a substituted or unsubstituted ethyl group, or a substituted or unsubstituted phenyl group, or adjacent groups are bonded to each other to form a substituted or unsubstituted ring having 3 to 60 carbon atoms.

In still another exemplary embodiment, $Ar_5$ to $Ar_8$ are the same as or different from each other, and are each independently hydrogen, deuterium, a halogen group, a nitrile group, a substituted or unsubstituted methyl group, a substituted or unsubstituted ethyl group, or a substituted or unsubstituted phenyl group, or adjacent groups are bonded to each other to form a ring having 3 to 60 carbon atoms, which is unsubstituted or substituted with one or more substituents selected from the group consisting of an alkyl group having 1 to 20 carbon atoms, a trialkylsilyl group having 1 to 20 carbon atoms, a triarylsilyl group having 6 to 30 carbon atoms, and an aryl group having 6 to 30 carbon atoms.

According to yet another exemplary embodiment, $Ar_5$ to $Ar_8$ are the same as or different from each other, and are each independently hydrogen, deuterium, a halogen group, a nitrile group, a substituted or unsubstituted methyl group, a substituted or unsubstituted ethyl group, or a substituted or unsubstituted phenyl group, or adjacent groups are bonded to each other to form a substituted or unsubstituted aromatic hydrocarbon ring having 6 to 60 carbon atoms, or an aliphatic hydrocarbon ring having 3 to 60 carbon atoms.

According to still yet another exemplary embodiment, $Ar_5$ to $Ar_8$ are the same as or different from each other, and are each independently hydrogen, deuterium, a halogen group, a nitrile group, a substituted or unsubstituted methyl group, a substituted or unsubstituted ethyl group, or a substituted or unsubstituted phenyl group, or adjacent groups are bonded to each other to form an aromatic hydrocarbon ring having 6 to 60 carbon atoms, which is unsubstituted or substituted with one or more substituents selected from the group consisting of an alkyl group having 1 to 20 carbon atoms, a trialkylsilyl group having 1 to 20 carbon atoms, a triarylsilyl group having 6 to 30 carbon atoms, and an aryl group having 6 to 30 carbon atoms, or an aliphatic hydrocarbon ring having 3 to 60 carbon atoms.

In a further exemplary embodiment, $Ar_5$ to $Ar_8$ are the same as or different from each other, and are each independently hydrogen, deuterium, a halogen group, a nitrile group, a substituted or unsubstituted methyl group, a substituted or unsubstituted ethyl group, or a substituted or unsubstituted phenyl group, or adjacent groups are bonded to each other to form a substituted or unsubstituted cyclohexane, a substituted or unsubstituted tetradecaphenanthrene, a substituted or unsubstituted decahydronaphthalene, a substituted or unsubstituted benzene, or a substituted or unsubstituted naphthalene.

In another further exemplary embodiment, $Ar_5$ to $Ar_8$ are the same as or different from each other, and are each independently hydrogen, deuterium, a halogen group, a methyl group, an ethyl group, or a phenyl group, or adjacent groups are bonded to each other to form cyclohexane, tetradecaphenanthrene, decahydronaphthalene, a benzene which is unsubstituted or substituted with one or more substituents selected from the group consisting of a methyl group, a tert-butyl group, a trimethylsilyl group, a triphenylsilyl group, and a phenyl group, or a naphthalene, which is unsubstituted or substituted with one or more substituents selected from the group consisting of a methyl group, a tert-butyl group, a trimethylsilyl group, a triphenylsilyl group, and a phenyl group.

In the present specification, the case where adjacent groups among $Ar_5$ to $Ar_8$ are bonded to each other to form a ring means that i) two of $Ar_5$ to $Ar_8$ are bonded to each other to form an aliphatic hydrocarbon ring, or ii) all of $Ar_5$ to $Ar_8$ participate in the formation of a ring to form an aromatic hydrocarbon ring.

According to an exemplary embodiment of the present specification, when adjacent groups of $Ar_5$ to $Ar_8$ are bonded to each other to form a ring, any one ring selected from the rings of the following Group A or B is formed:

Group A

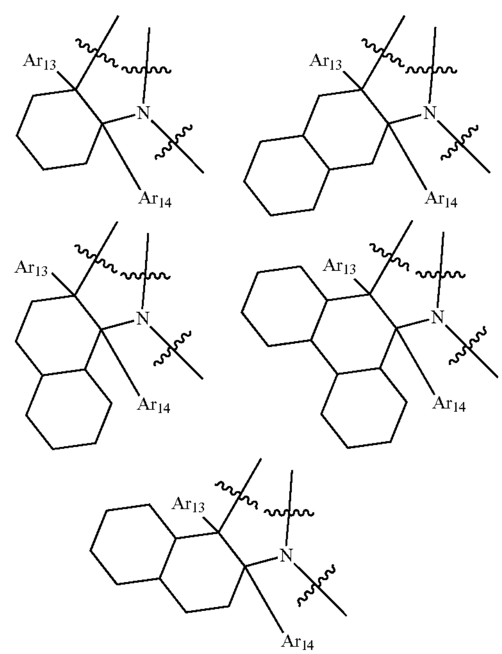

Group B

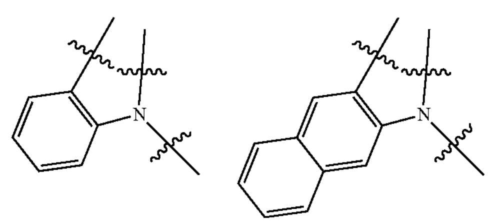

-continued

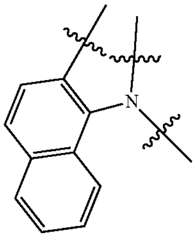

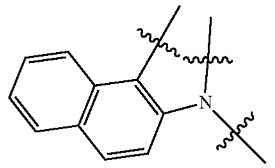

In the rings of Groups A and B, $Ar_{13}$ and $Ar_{14}$ are substituents which do not form a ring among $Ar_5$ to $Ar_8$, and are the same as or different from each other.

The rings of Groups A and B are unsubstituted or substituted with one or more substituents selected from the group consisting of deuterium, an alkyl group having 1 to 20 carbon atoms, a trialkylsilyl group having 1 to 20 carbon atoms, a triarylsilyl group having 6 to 30 carbon atoms, and an aryl group having 6 to 30 carbon atoms.

According to an exemplary embodiment of the present specification, the rings of Group A are unsubstituted. That is, the rings do not have another substituent except for $Ar_{13}$ and $Ar_{14}$.

According to an exemplary embodiment of the present specification, the rings of Group B are unsubstituted or substituted with one or more substituents selected from the group consisting of deuterium, an alkyl group having 1 to 20 carbon atoms, a trialkylsilyl group having 1 to 20 carbon atoms, a triarylsilyl group having 6 to 30 carbon atoms, and an aryl group having 6 to 30 carbon atoms.

In another exemplary embodiment, the rings of Group B are unsubstituted or substituted with one or more substituents selected from the group consisting of a methyl group, a tert-butyl group, a trimethylsilyl group, a triphenylsilyl group, and a phenyl group.

According to still another exemplary embodiment, $Ar_{13}$ and $Ar_{14}$ are each independently a straight-chained or branched alkyl group having 1 to 4 carbon atoms, or an aryl group having 6 to 20 carbon atoms.

In yet another exemplary embodiment, $Ar_{13}$ and $Ar_{14}$ are the same as or different from each other, and are each independently a methyl group, or a phenyl group.

In still yet another exemplary embodiment, $Ar_{13}$ and $Ar_{14}$ are a methyl group.

According to an exemplary embodiment of the present invention, Formula 1-1 is any one of the following Formulae 8 to 10:

Formula 8

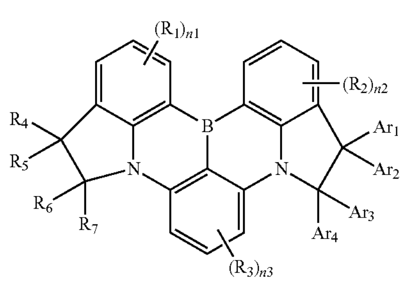

-continued

Formula 9

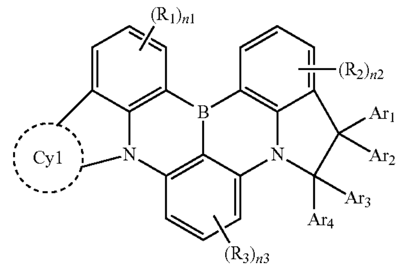

Formula 10

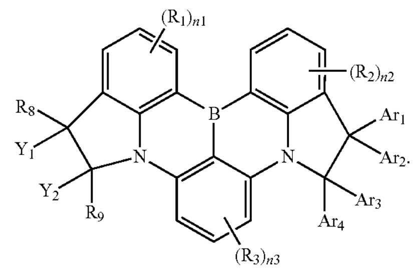

In Formulae 8 to 10:

the definitions of $R_1$ to $R_3$, n1 to n3, and $Ar_1$ to $Ar_4$ are the same as those defined in Formula 1-1;

$R_4$ to $R_9$ are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group;

$Y_1$ and $Y_2$ are bonded to each other to form a substituted or unsubstituted aliphatic hydrocarbon ring; and Cy1 is a substituted or unsubstituted aromatic hydrocarbon ring.

According to an exemplary embodiment of the present specification, $R_4$ to $R_7$ are the same as or different from each other, and are each independently hydrogen, deuterium, a halogen group, a nitrile group, a substituted or unsubstituted alkyl group having 1 to 20 carbon atoms, a substituted or unsubstituted alkenyl group having 2 to 20 carbon atoms, a substituted or unsubstituted alkynyl group having 2 to 20 carbon atoms, a substituted or unsubstituted alkoxy group having 1 to 20 carbon atoms, a substituted or unsubstituted aryloxy group having 6 to 30 carbon atoms, a substituted or unsubstituted cycloalkyl group having 3 to 30 carbon atoms, a substituted or unsubstituted aryl group having 6 to 30 carbon atoms, or a substituted or unsubstituted heterocyclic group having 2 to 30 carbon atoms.

According to another exemplary embodiment, $R_4$ to $R_7$ are the same as or different from each other, and are each independently hydrogen, deuterium, a halogen group, a nitrile group, a substituted or unsubstituted alkyl group having 1 to 20 carbon atoms, or a substituted or unsubstituted aryl group having 6 to 30 carbon atoms.

In still another exemplary embodiment, $R_4$ to $R_7$ are the same as or different from each other, and are each independently hydrogen, deuterium, a halogen group, a nitrile group, a substituted or unsubstituted methyl group, a substituted or unsubstituted ethyl group, or a substituted or unsubstituted phenyl group.

According to yet another exemplary embodiment, $R_4$ to $R_7$ are the same as or different from each other, and are each independently hydrogen, deuterium, a halogen group, a methyl group, an ethyl group, or a phenyl group.

According to an exemplary embodiment, $R_8$ and $R_9$ are the same as or different from each other, and are each independently hydrogen, deuterium, a halogen group, a nitrile group, a substituted or unsubstituted alkyl group having 1 to 20 carbon atoms, or a substituted or unsubstituted aryl group having 6 to 30 carbon atoms.

According to another exemplary embodiment, $R_8$ and $R_9$ are the same as or different from each other, and are each independently hydrogen, deuterium, a halogen group, a nitrile group, a substituted or unsubstituted methyl group, a substituted or unsubstituted ethyl group, or a substituted or unsubstituted phenyl group.

According to still another exemplary embodiment, $R_8$ and $R_9$ are the same as or different from each other, and are each independently hydrogen, deuterium, a halogen group, a methyl group, an ethyl group, or a phenyl group.

According to an exemplary embodiment, $Y_1$ and $Y_2$ are bonded to each other to form a substituted or unsubstituted aliphatic hydrocarbon ring having 3 to 60 carbon atoms.

According to another exemplary embodiment, $Y_1$ and $Y_2$ are bonded to each other to form a substituted or unsubstituted monocyclic to tricyclic aliphatic hydrocarbon ring having 3 to 60 carbon atoms.

In still another exemplary embodiment, $Y_1$ and $Y_2$ are bonded to each other to form a substituted or unsubstituted cyclohexane, a substituted or unsubstituted tetradecahydrophenanthrene, or a substituted or unsubstituted decahydronaphthalene.

In yet another exemplary embodiment, $Y_1$ and $Y_2$ are bonded to each other to form cyclohexane, tetradecahydrophenanthrene, or decahydronaphthalene.

According to an exemplary embodiment of the present specification, Cy1 is a substituted or unsubstituted aromatic hydrocarbon ring having 6 to 60 carbon atoms.

According to another exemplary embodiment, Cy1 is an aromatic hydrocarbon ring having 6 to 30 carbon atoms, which is unsubstituted or substituted with one or more substituents selected from the group consisting of an alkyl group having 1 to 20 carbon atoms, a trialkylsilyl group having 1 to 20 carbon atoms, a triarylsilyl group having 6 to 30 carbon atoms, and an aryl group having 6 to 30 carbon atoms.

In still another exemplary embodiment, Cy1 is a substituted or unsubstituted benzene, or a substituted or unsubstituted naphthalene.

According to yet another exemplary embodiment, Cy1 is a benzene which is unsubstituted or substituted with one or more substituents selected from the group consisting of a methyl group, a tert-butyl group, a trimethylsilyl group, a triphenylsilyl group, and a phenyl group, or a naphthalene which is unsubstituted or substituted with one or more substituents selected from the group consisting of a methyl group, a tert-butyl group, a trimethylsilyl group, a triphenylsilyl group, and a phenyl group.

In an exemplary embodiment of the present specification, $R_1$ to $R_3$ are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group.

In another exemplary embodiment, $R_1$ to $R_3$ are the same as or different from each other, and are each independently hydrogen, deuterium, a halogen group, a nitrile group, a substituted or unsubstituted trialkylsilyl group, a substituted or unsubstituted triarylsilyl group, a substituted or unsubstituted alkyl group, a substituted or unsubstituted aryl group, a substituted or unsubstituted arylamine group, or a substituted or unsubstituted heterocyclic group.

In still another exemplary embodiment, $R_1$ to $R_3$ are the same as or different from each other, and are each independently hydrogen, deuterium, a halogen group, a nitrile group, a trialkylsilyl group having 1 to 20 carbon atoms, a triarylsilyl group having 6 to 30 carbon atoms, an alkyl group having 1 to 10 carbon atoms, an aryl group having 6 to 30 carbon atoms, an arylamine group having 6 to 50 carbon atoms, which is unsubstituted or substituted with an alkyl group having 1 to 10 carbon atoms, a trialkylsilyl group having 1 to 20 carbon atoms, or a triarylsilyl group having 6 to 30 carbon atoms, a dihydroacridine group which is unsubstituted or substituted with an alkyl group having 1 to 10 carbon atoms or an aryl group having 6 to 30 carbon atoms, a dihydrodibenzoazasiline group which is unsubstituted or substituted with an alkyl group having 1 to 10 carbon atoms or an aryl group having 6 to 30 carbon atoms, a spiro(dibenzosilole-dibenzoazasiline) group, a spiro(acridine-fluorene) group, or a hexahydrocarbazole group which is unsubstituted or substituted with an alkyl group having 1 to 10 carbon atoms or an aryl group having 6 to 30 carbon atoms and in which a benzene ring is fused or unfused.

In yet another exemplary embodiment, $R_1$ to $R_3$ are the same as or different from each other, and are each independently hydrogen, deuterium, a halogen group, a nitrile group, a trialkylsilyl group having 1 to 20 carbon atoms, a triarylsilyl group having 6 to 30 carbon atoms, an alkyl group having 1 to 10 carbon atoms, an aryl group having 6 to 30 carbon atoms, an arylamine group having 6 to 50 carbon atoms, which is unsubstituted or substituted with an alkyl group having 1 to 10 carbon atoms, a trialkylsilyl group having 1 to 20 carbon atoms, or a triarylsilyl group having 6 to 30 carbon atoms, a dihydroacridine group (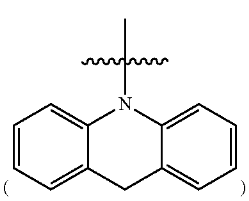 [SMILES: *N1c2ccccc2Cc2ccccc21])

which is unsubstituted or substituted with an alkyl group having 1 to 10 carbon atoms or an aryl group having 6 to 30 carbon atoms, a dihydrodibenzoazasiline group

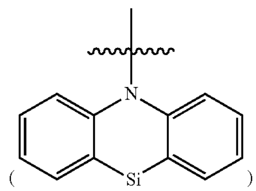

which is unsubstituted or substituted with an alkyl group having 1 to 10 carbon atoms or an aryl group having 6 to 30 carbon atoms, a spiro(dibenzosilole-dibenzoazasiline) group

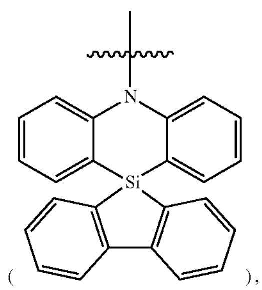 [SMILES: *N1c2ccccc2[Si]2(c3ccccc3-c3ccccc32)c2ccccc21]

a spiro(acridine-fluorene) group

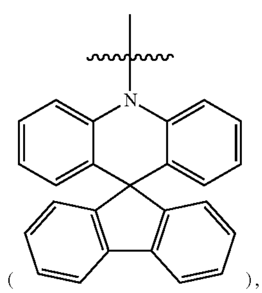 [SMILES: *N1c2ccccc2C2(c3ccccc3-c3ccccc32)c2ccccc21]

a hexahydrocarbazole group

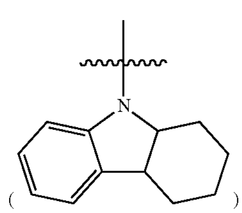 [SMILES: *N1c2ccccc2C2CCCCC21]

which is unsubstituted or substituted with an alkyl group having 1 to 10 carbon atoms or an aryl group having 6 to 30 carbon atoms, or a tetrahydrobenzocarbazole group

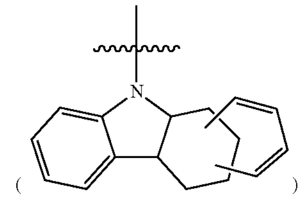

which unsubstituted or substituted with an alkyl group having 1 to 10 carbon atoms or an aryl group having 6 to 30 carbon atoms.

In still yet another exemplary embodiment, $R_1$ to $R_3$ are the same as or different from each other, and are each independently hydrogen, deuterium, a halogen group, a trimethylsilyl group, a trimethylsilyl group, a methyl group, a tert-butyl group, a phenyl group, a biphenyl group, a diphenylamine group which is unsubstituted or substituted with a methyl group, a tert-butyl group, a trimethylsilyl group, or a triphenylsilyl group, a dihydroacridine group

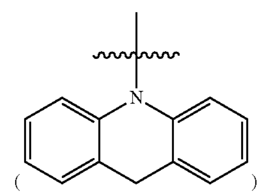

which is unsubstituted or substituted with a methyl group, a tert-butyl group, or a phenyl group, a dihydrodibenzoazasiline group

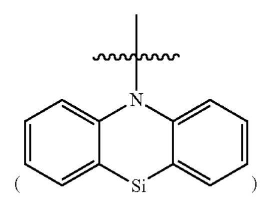

which is unsubstituted or substituted with a methyl group, a tert-butyl group, or a phenyl group, a spiro(dibenzosilole-dibenzoazasiline) group

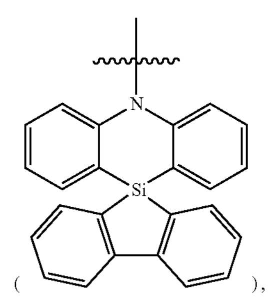 [SMILES: *N1c2ccccc2[Si]2(c3ccccc3-c3ccccc32)c2ccccc21]

a spiro(acridine-fluorene) group

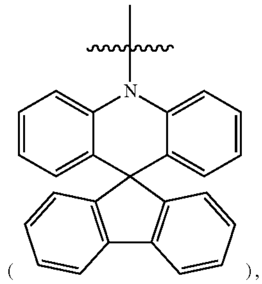 [SMILES: *N1c2ccccc2C2(c3ccccc3-c3ccccc32)c2ccccc21]

a hexahydrocarbazole group

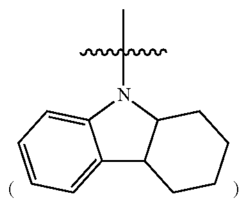 [SMILES: *N1c2ccccc2C2CCCCC21]

which is unsubstituted or substituted with a methyl group, a tert-butyl group, or a phenyl group, or a tetrahydrobenzocarbazole group

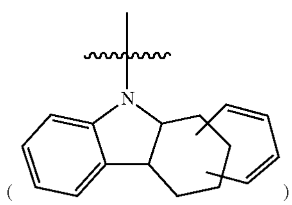

which is unsubstituted or substituted with a methyl group, a tert-butyl group, or a phenyl group.

In an exemplary embodiment of the present invention, $R_1$ and $R_2$ are the same as or different from each other, and are each independently hydrogen, deuterium, a trialkylsilyl group having 1 to 20 carbon atoms, a triarylsilyl group having 6 to 30 carbon atoms, an alkyl group having 1 to 10 carbon atoms, an aryl group having 6 to 30 carbon atoms, or an arylamine group having 6 to 50 carbon atoms, which is unsubstituted or substituted with an alkyl group having 1 to 10 carbon atoms, a trialkylsilyl group having 1 to 20 carbon atoms, or a triarylsilyl group having 6 to 30 carbon atoms.

According to another exemplary embodiment, $R_1$ and $R_2$ are the same as or different from each other, and are each independently hydrogen, deuterium, a trimethylsilyl group, a trimethylsilyl group, a methyl group, a tert-butyl group, a phenyl group, a biphenyl group, a diphenylamine group which is unsubstituted or substituted with a methyl group, a tert-butyl group, a trimethylsilyl group, or a triphenylsilyl group.

According to an exemplary embodiment of the present invention, $R_3$ is hydrogen, deuterium, an alkyl group having 1 to 10 carbon atoms, an arylamine group having 6 to 50 carbon atoms, which is unsubstituted or substituted with an alkyl group having 1 to 10 carbon atoms, a trialkylsilyl group having 1 to 20 carbon atoms, or a triarylsilyl group having 6 to 30 carbon atoms, a dihydroacridine group

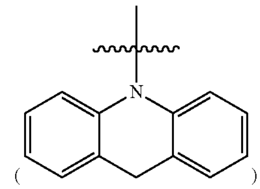 [SMILES: *N1c2ccccc2Cc2ccccc21]

which is unsubstituted or substituted with an alkyl group having 1 to 10 carbon atoms or an aryl group having 6 to 30 carbon atoms, a dihydrodibenzoazasiline group

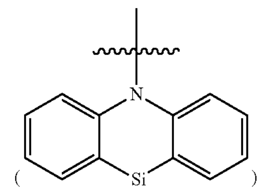

which is unsubstituted or substituted with an alkyl group having 1 to 10 carbon atoms or an aryl group having 6 to 30 carbon atoms, a spiro(dibenzosilole-dibenzoazasiline) group

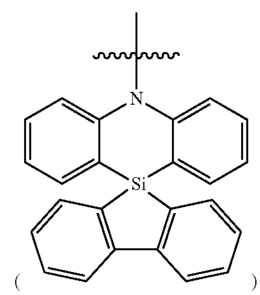 [SMILES: *N1c2ccccc2[Si]2(c3ccccc3-c3ccccc32)c2ccccc21]

a spiro(acridine-fluorene) group

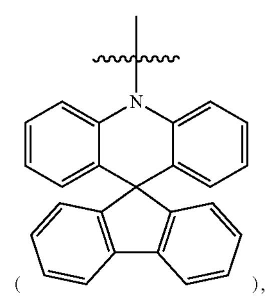 [SMILES: *N1c2ccccc2C2(c3ccccc3-c3ccccc32)c2ccccc21]

a hexahydrocarbazole group

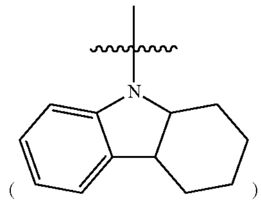 [SMILES: *N1c2ccccc2C2CCCCC21]

which is unsubstituted or substituted with an alkyl group having 1 to 10 carbon atoms or an aryl group having 6 to 30 carbon atoms, or a tetrahydrobenzocarbazole group

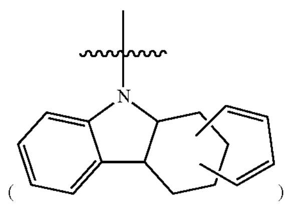

which is unsubstituted or substituted with an alkyl group having 1 to 10 carbon atoms or an aryl group having 6 to 30 carbon atoms.

According to another exemplary embodiment, $R_3$ is hydrogen, deuterium, a methyl group, a tert-butyl group, a diphenylamine group which is unsubstituted or substituted with a methyl group, a tert-butyl group, a trimethylsilyl group, or a triphenylsilyl group, a dihydroacridine group

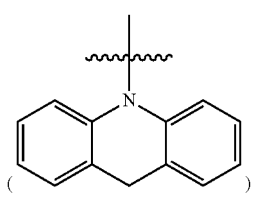 [SMILES: *N1c2ccccc2Cc2ccccc21]

which is unsubstituted or substituted with a methyl group, a tert-butyl group, or a phenyl group, a dihydrobenzoazasiline group

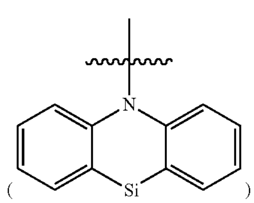

which is unsubstituted or substituted with a methyl group, a tert-butyl group, or a phenyl group, a spiro(dibenzosilole-dibenzoazasiline) group

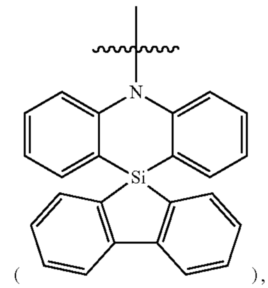 [SMILES: *N1c2ccccc2[Si]2(c3ccccc3-c3ccccc32)c2ccccc21]

a spiro(acridine-fluorene) group

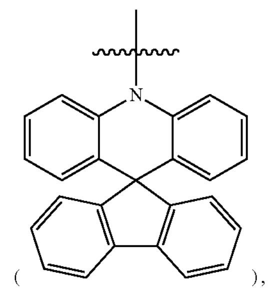 [SMILES: *N1c2ccccc2C2(c3ccccc3-c3ccccc32)c2ccccc21]

a hexahydrocarbazole group

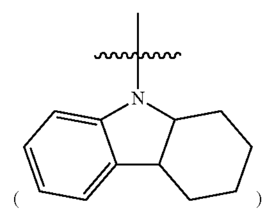 [SMILES: *N1c2ccccc2C2CCCCC21]

which is unsubstituted or substituted with a methyl group, a tert-butyl group, or a phenyl group, or a tetrahydrobenzo-carbazole group

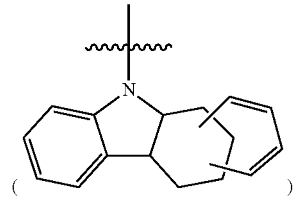

which is unsubstituted or substituted with a methyl group, a tert-butyl group, or a phenyl group.

The tetrahydrobenzocarbazole group of $R_1$ to $R_3$ is preferably
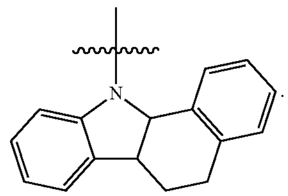 [SMILES: *N1c2ccccc2C2CCc3ccccc3C21]
According to an exemplary embodiment of the present specification, Formula 1 is any one of the following Formulae 101 to 108:
Formula 101
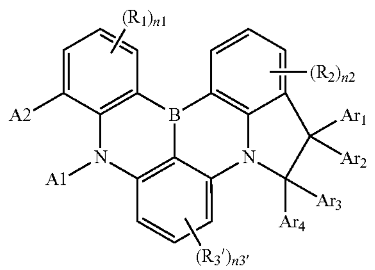
Formula 102
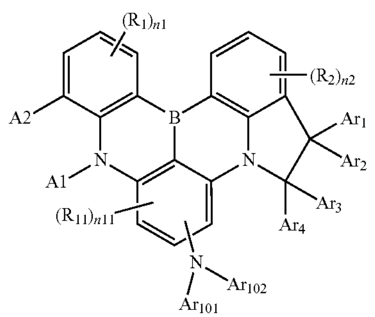
Formula 103
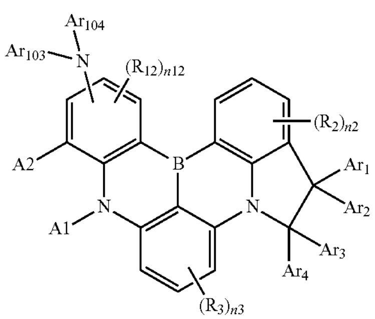
Formula 104
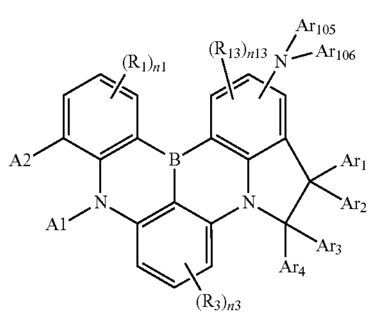
-continued
Formula 105
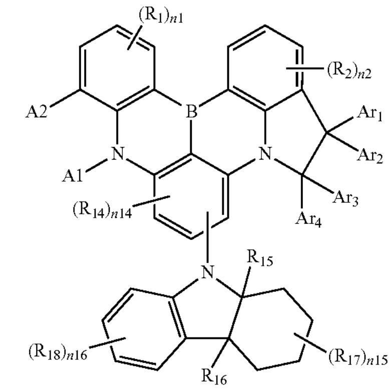
Formula 106
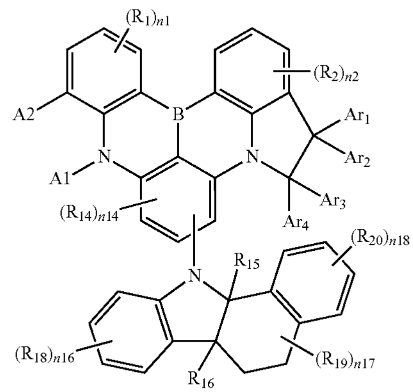
Formula 107
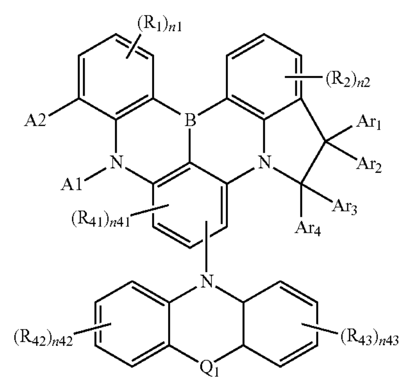
Formula 108
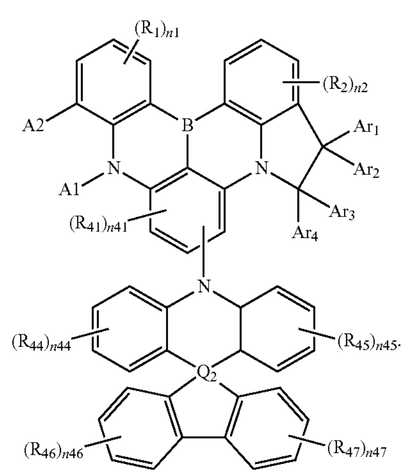

In Formulae 101 to 108:

the definitions of A1, A2, $R_1$ to $R_3$, n1 to n3, and $Ar_1$ to $Ar_4$ are the same as those defined in Formula 1;

$Q_1$ is $C(R_{48})$ $(R_{49})$ or $Si(R_{48})$ $(R_{49})$;

$Q_2$ is C or Si;

$R_3'$, $R_{11}$ to $R_{20}$, and $R_{41}$ to $R_{49}$ are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group;

n3' is an integer from 0 to 3;

n11 to n14 and n41 are each an integer form 0 to 2;

n15 is an integer from 0 to 8;

n16 to n18 and n42 to n47 are each an integer from 0 to 4, when n3', n15 to n18, and n42 to n47 are each 2 or more, substituents in a plurality of parentheses are the same as or different from each other;

when n11 to n14 and n41 are each 2, substituents in a plurality of parentheses are the same as or different from each other; and $Ar_{101}$ to $Ar_{106}$ are the same as or different from each other, and are each independently hydrogen, deuterium, a substituted or unsubstituted alkyl group, a substituted or unsubstituted aryl group, or a substituted or unsubstituted heteroaryl group.

According to an exemplary embodiment of the present invention, $R_{48}$ and $R_{49}$ are the same as or different from each other, and are each independently an alkyl group having 1 to 10 carbon atoms, or an aryl group having 6 to 30 carbon atoms.

According to another exemplary embodiment, $R_{48}$ and $R_{49}$ are the same as or different from each other, and are each independently a methyl group, or a phenyl group.

According to an exemplary embodiment of the present invention, $R_{48}$ and $R_{49}$ are the same as each other.

According to an exemplary embodiment of the present invention, $Ar_{101}$ to $Ar_{106}$ are the same as or different from each other, and are each independently a substituted or unsubstituted aryl group having 6 to 60 carbon atoms.

In another exemplary embodiment, $Ar_{101}$ to $Ar_{106}$ are the same as or different from each other, and are each independently a substituted or unsubstituted phenyl group.

In still another exemplary embodiment, $Ar_{101}$ to $Ar_{106}$ are the same as or different from each other, and are each independently an aryl group having 6 to 60 carbon atoms, which is unsubstituted or substituted with an alkyl group having 1 to 20 carbon atoms, a trialkylsilyl group having 1 to 20 carbon atoms, or a triarylsilyl group having 6 to 30 carbon atoms.

According to yet another exemplary embodiment, $Ar_{101}$ to $Ar_{106}$ are the same as or different from each other, and are each independently a phenyl group which is unsubstituted or substituted with a methyl group, a tert-butyl group, a trimethylsilyl group, or a triphenylsilyl group.

According to an exemplary embodiment of the present invention, $Ar_{101}$ and $Ar_{102}$ are the same as or different from each other, and are each independently an aryl group having 6 to 60 carbon atoms, which is unsubstituted or substituted with an alkyl group having 1 to 4 carbon atoms, a trialkylsilyl group having 1 to 20 carbon atoms, or a triarylsilyl group having 6 to 30 carbon atoms.

In another exemplary embodiment, $Ar_{101}$ and $Ar_{102}$ are the same as or different from each other, and are each independently a phenyl group which is unsubstituted or substituted with a methyl group, a tert-butyl group, a trimethylsilyl group, or a triphenylsilyl group.

According to an exemplary embodiment of the present invention, $Ar_{103}$ to $Ar_{106}$ are the same as or different from each other, and are each independently a phenyl group which is unsubstituted or substituted with an alkyl group having 1 to 4 carbon atoms.

In another exemplary embodiment, $Ar_{103}$ to $Ar_{106}$ are the same as or different from each other, and are each independently a phenyl group which is unsubstituted or substituted with a tert-butyl group.

According to an exemplary embodiment of the present invention, $R_3'$, $R_{11}$ to $R_{20}$, and $R_{41}$ to $R_{49}$ are the same as or different from each other, and are each independently hydrogen, deuterium, a substituted or unsubstituted alkyl group having 1 to 20 carbon atoms, or a substituted or unsubstituted aryl group having 6 to 30 carbon atoms.

According to another exemplary embodiment, $R_3'$, $R_{11}$ to $R_{20}$, and $R_{41}$ to R are the same as or different from each other, and are each independently hydrogen, deuterium, a substituted or unsubstituted methyl group, a substituted or unsubstituted butyl group, or a substituted or unsubstituted phenyl group.

In still another exemplary embodiment, $R_3'$, $R_{11}$ to $R_{20}$, and $R_{41}$ to $R_{49}$ are the same as or different from each other, and are each independently hydrogen, deuterium, a methyl group, a tert-butyl group, or a phenyl group.

According to an exemplary embodiment of the present specification, n1 is an integer from 0 to 3, and when n1 is 2 or more, a plurality of $R_1$'s is the same as or different from each other.

According to another exemplary embodiment, n1 is 0 or 1.

According to an exemplary embodiment of the present invention, n2 is an integer from 0 to 3, and when n2 is 2 or more, a plurality of $R_2$'s is the same as or different from each other.

According to another exemplary embodiment, n2 is 0 or 1.

According to an exemplary embodiment of the present specification, n3 is an integer from 0 to 3, and when n3 is 2 or more, a plurality of $R_3$'s is the same as or different from each other.

According to another exemplary embodiment, n3 is 0 or 1.

According to an exemplary embodiment of the present invention, Formula 1 is any one of the following Formulae 11 to 39:

Formula 11

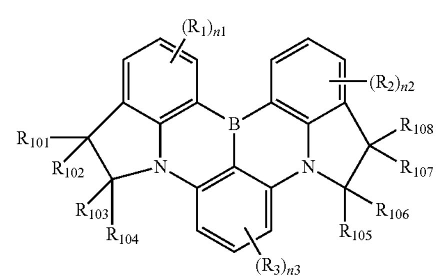

Formula 12
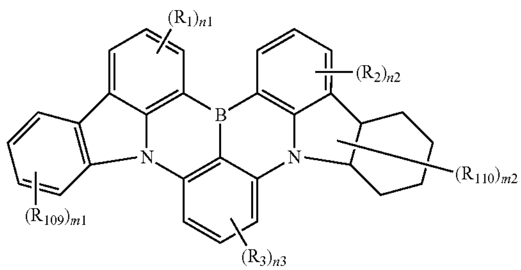
Formula 13
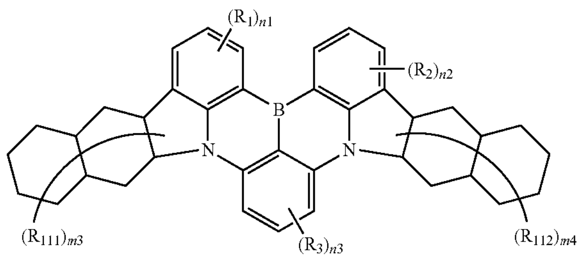
Formula 14
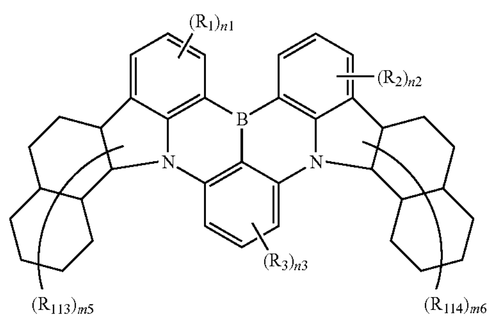
Formula 15
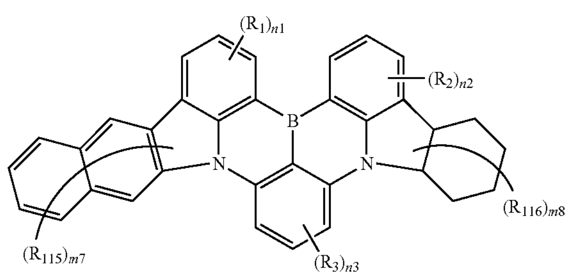
Formula 16
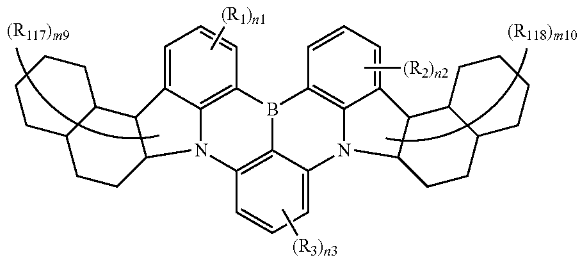
Formula 17
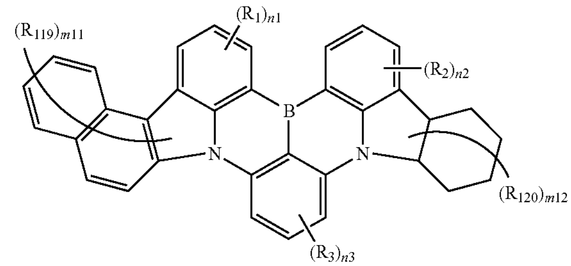
Formula 18
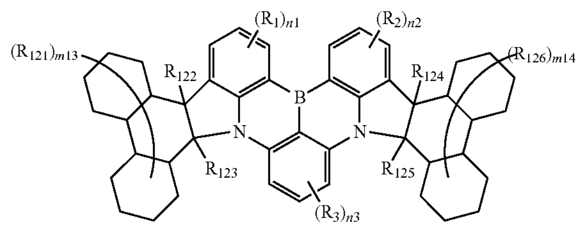
Formula 19
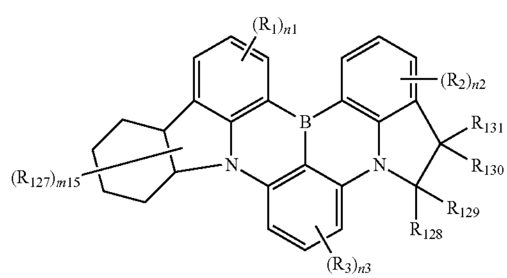
Formula 20
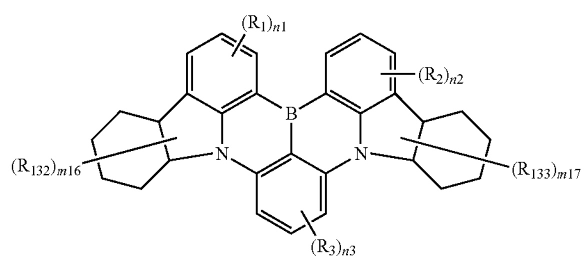
Formula 21
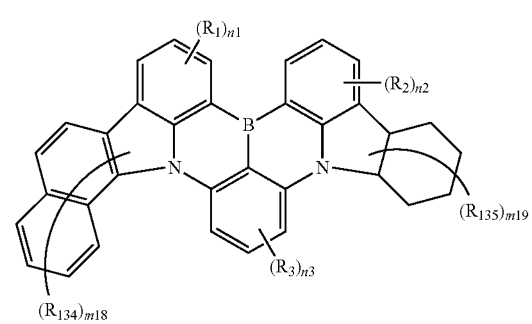

-continued
Formula 22
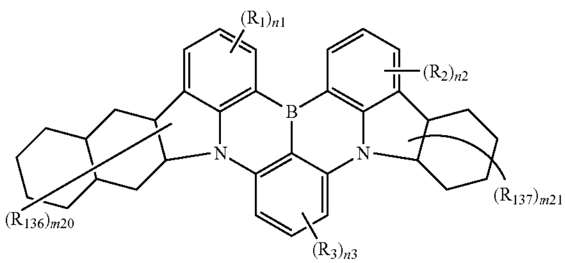
Formula 23
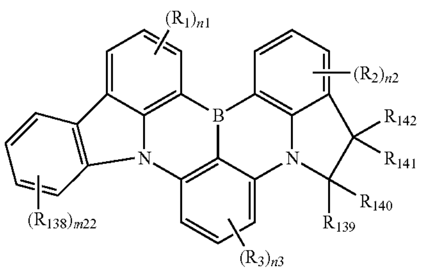
Formula 24
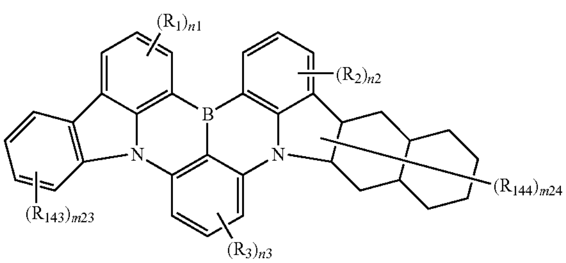
Formula 25
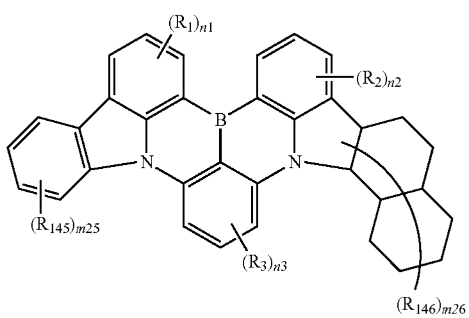
Formula 26
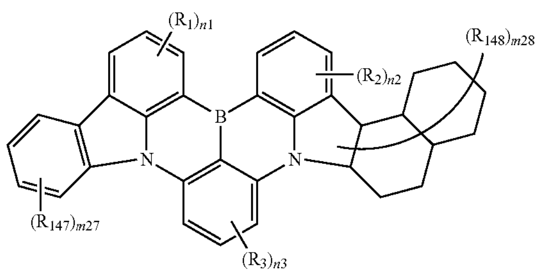
-continued
Formula 27]
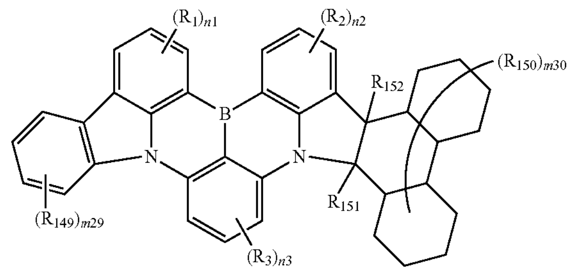
Formula 28
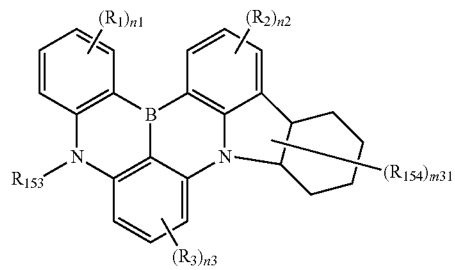
Formula 29
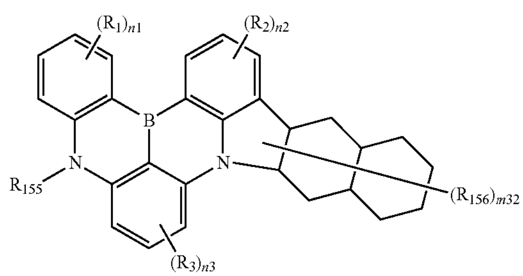
Formula 30
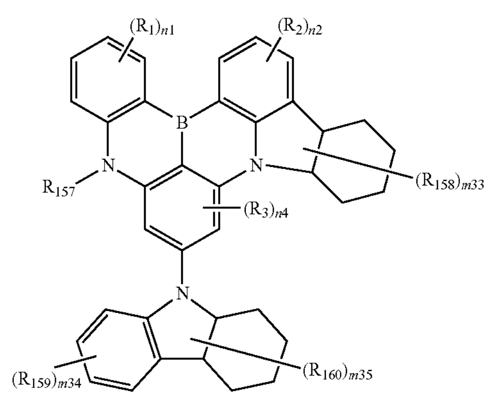

-continued
Formula 31
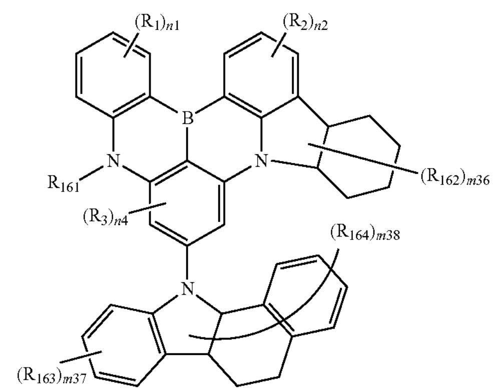
Formula 32
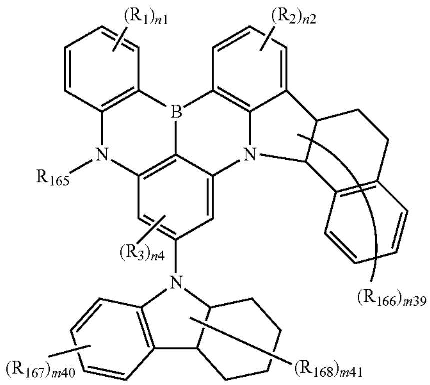
Formula 33
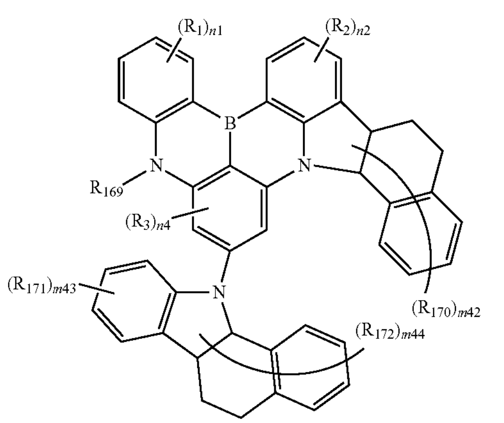
Formula 34
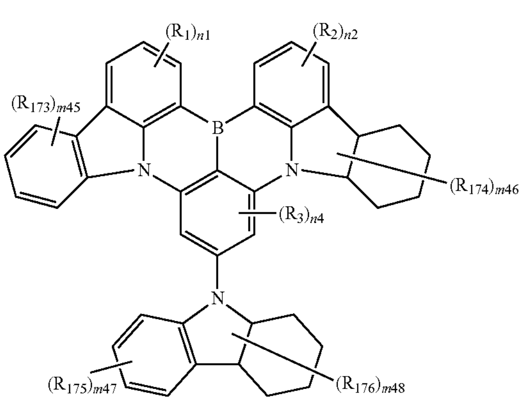
-continued
Formula 35
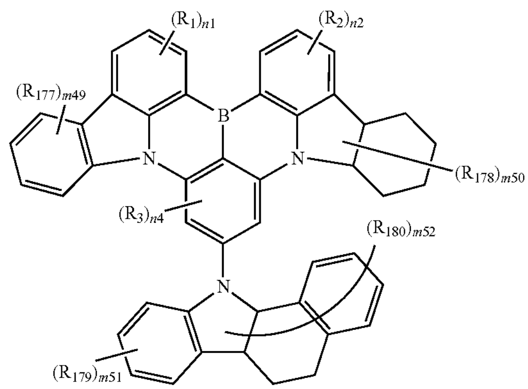
Formula 36
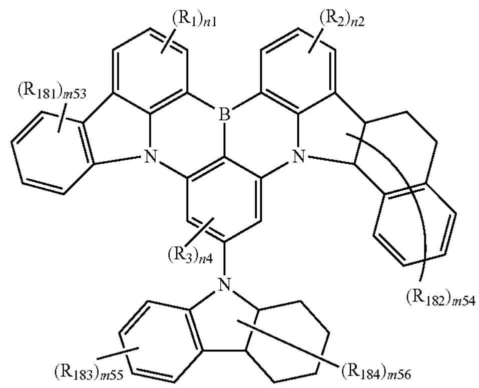
Formula 37
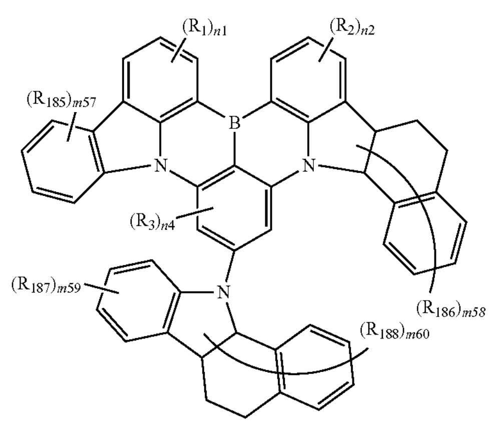
[Formula 38]
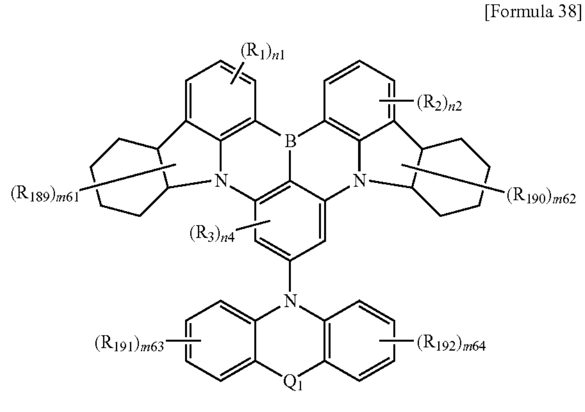

-continued

Formula 39

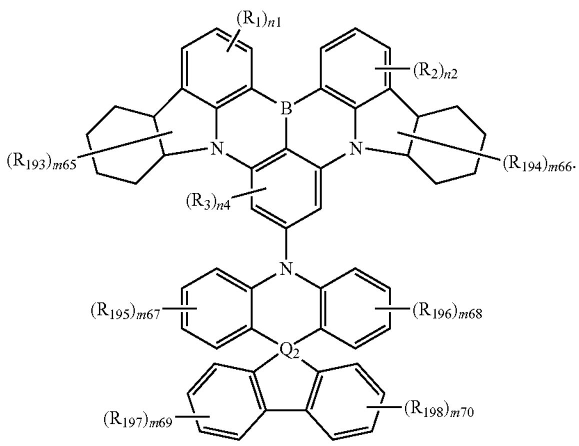

In Formulae 11 to 39:

the definitions of $R_1$ to $R_3$, and n1 to n3 are the same as those defined in Formula 1;

$Q_1$ is $C(R_{199})$ $(R_{200})$ or $Si(R_{199})$ $(R_{200})$;

$Q_2$ is C or Si;

$R_{101}$ to $R_{200}$ are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group;

n4 is an integer from 0 to 2; and m1 to m70 are each an integer from 0 to 3, and when m1 to m70 and n4 are each 2 or more, substituents in two or more parentheses are the same as or different from each other.

According to an exemplary embodiment of the present invention, $R_{101}$ to $R_{200}$ are the same as or different from each other, and are each independently hydrogen, deuterium, a halogen group, a substituted or unsubstituted trialkylsilyl group having 1 to 20 carbon atoms, a substituted or unsubstituted triarylsilyl group having 6 to 30 carbon atoms, an alkyl group having 1 to 20 carbon group, a substituted or unsubstituted aryl group having 6 to 30 carbon atoms, or a substituted or unsubstituted arylamine group having 6 to 50 carbon atoms.

In another exemplary embodiment, $R_{101}$ to $R_{200}$ are the same as or different from each other, and are each independently hydrogen, deuterium, a halogen group, a substituted or unsubstituted trimethylsilyl group, a substituted or unsubstituted a triphenylsilyl group, a substituted or unsubstituted methyl group, a substituted or unsubstituted ethyl group, a substituted or unsubstituted butyl group, a substituted or unsubstituted phenyl group, a substituted or unsubstituted biphenyl group, or a substituted or unsubstituted diphenylamine group.

According to still another exemplary embodiment, $R_{101}$ to $R_{200}$ are the same as or different from each other, and are each independently hydrogen, deuterium, a halogen group, a trimethylsilyl group, a triphenylsilyl group, a methyl group, an ethyl group, a tert-butyl group, a phenyl group which is unsubstituted or substituted with a methyl group, a tert-butyl group, a phenyl group, or a naphthyl group, a biphenyl group which is unsubstituted or substituted with a tert-butyl group, or a diphenylamine group which is unsubstituted or substituted with a methyl group, a tert-butyl group, a trimethylsilyl group, or a triphenylsilyl group.

According to an exemplary embodiment of the present invention, $R_{199}$ and $R_{200}$ are the same as or different from each other, and are each independently an alkyl group having 1 to 10 carbon atoms, or an aryl group having 6 to 30 carbon atoms.

According to another exemplary embodiment, $R_{199}$ and $R_{200}$ are the same as or different from each other, and are each independently a methyl group, or a phenyl group.

According to an exemplary embodiment of the present invention, $R_{199}$ and $R_{200}$ are the same as each other.

In an exemplary embodiment of the present invention, Formula 1 can be any one of the following structures:

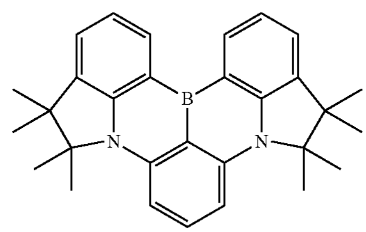

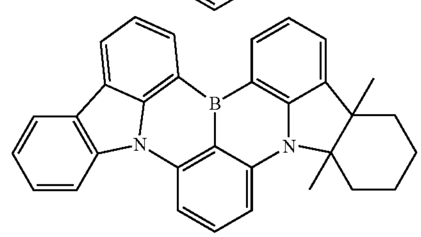

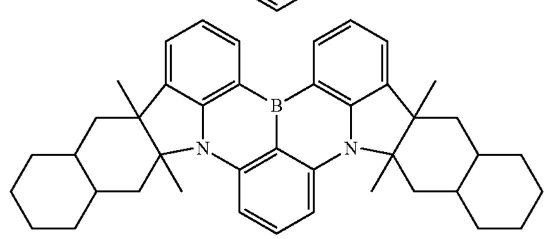

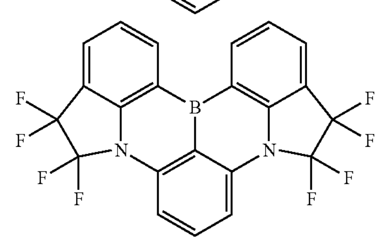

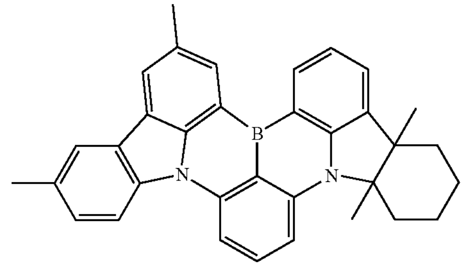

-continued
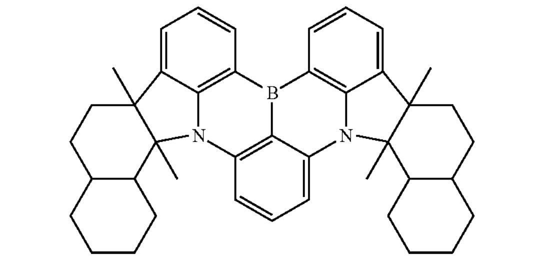
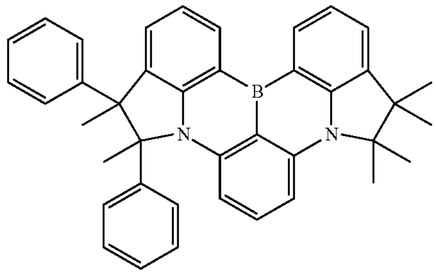
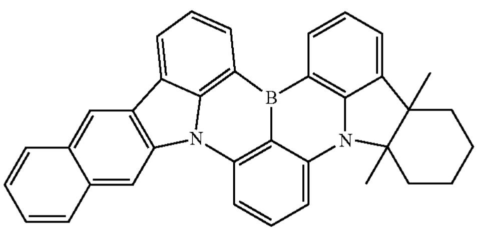
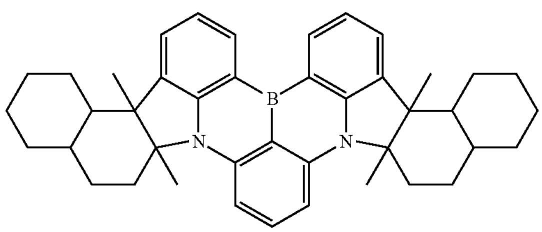
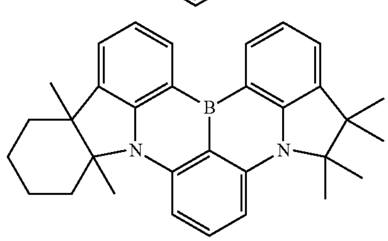
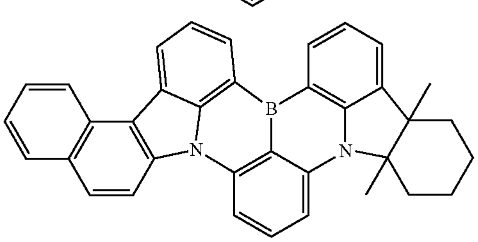
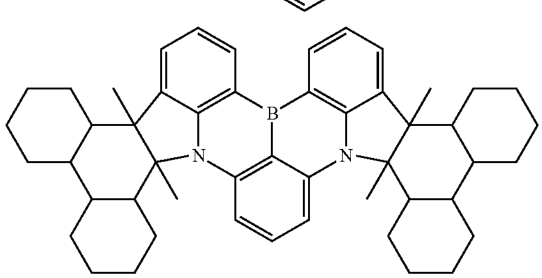
-continued
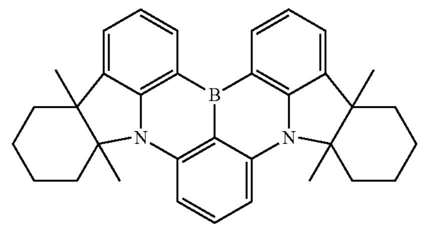
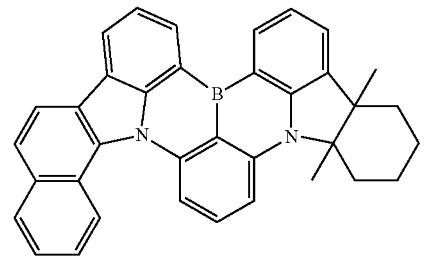
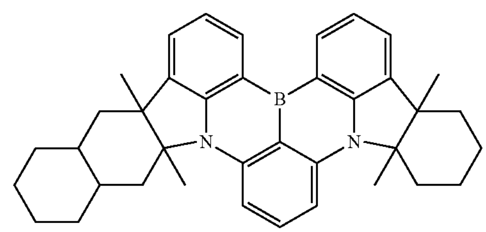
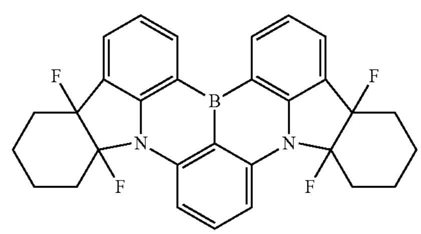
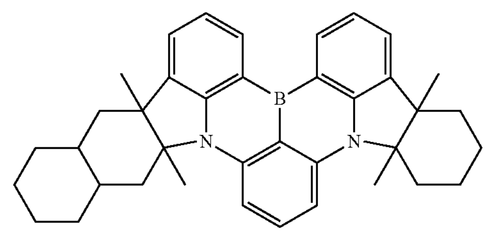
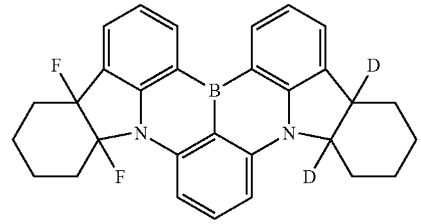
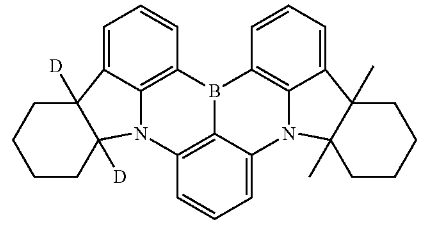

-continued
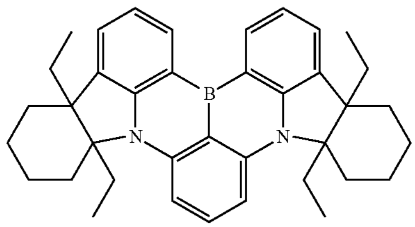
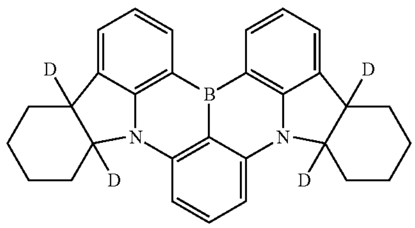
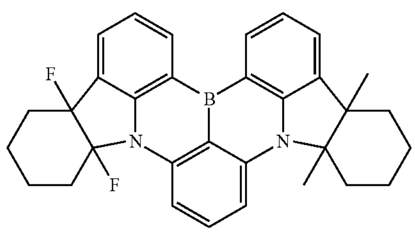
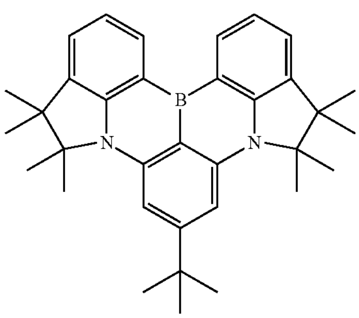
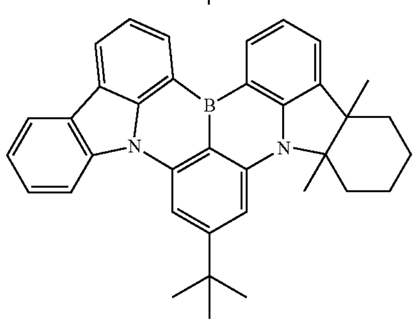
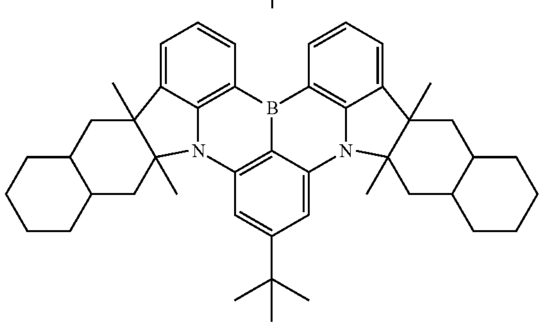
-continued
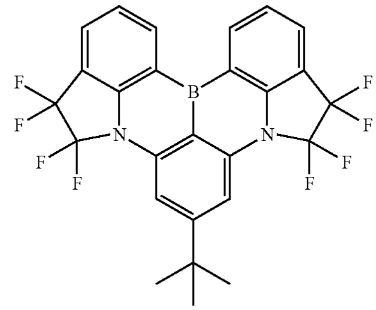
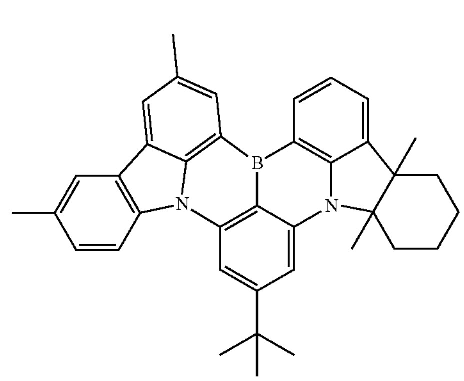
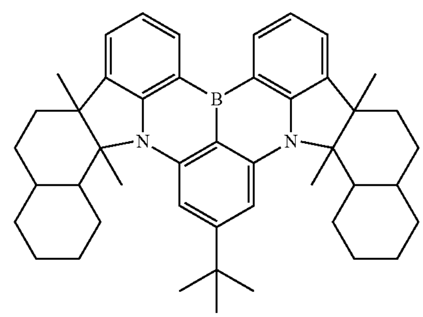
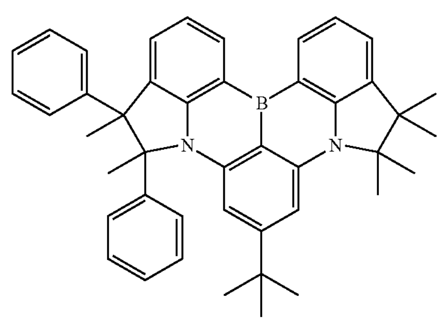
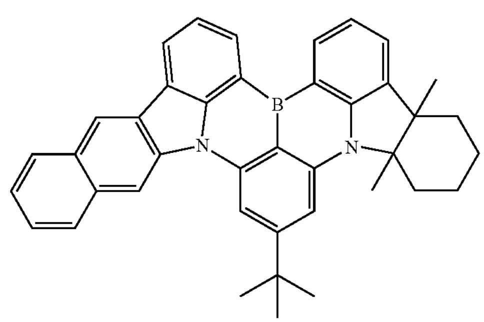

-continued
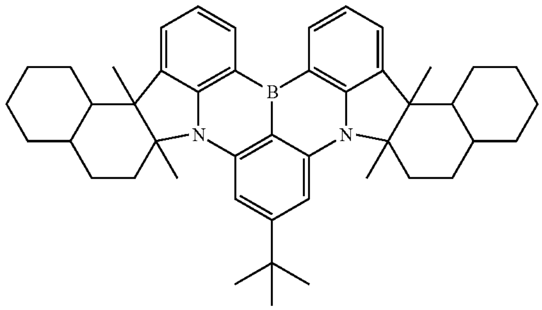
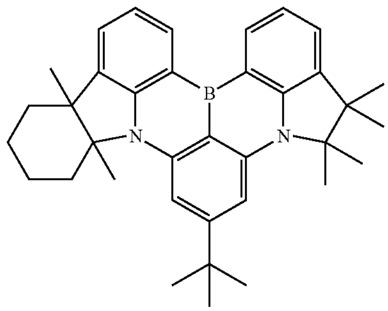
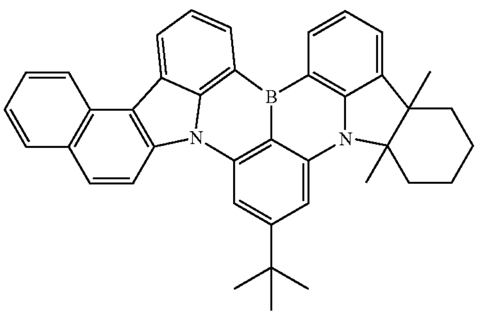
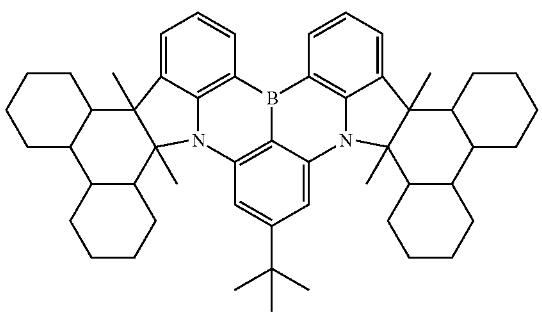
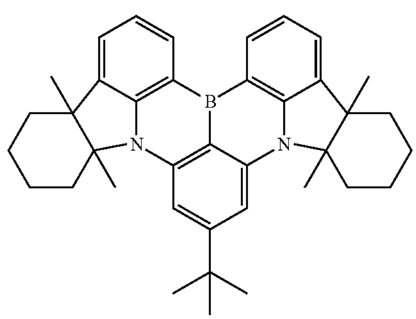
-continued
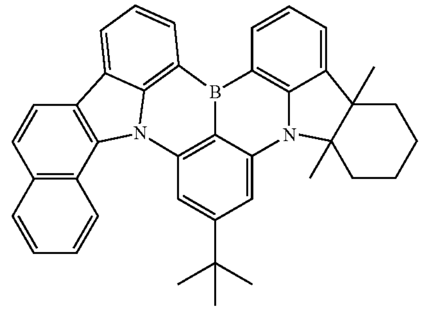
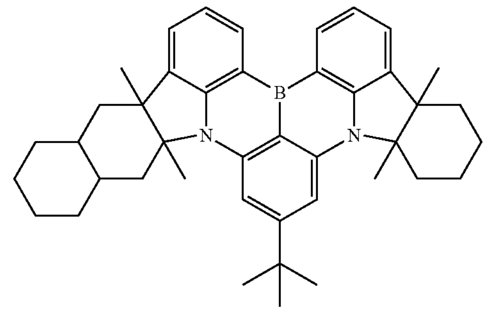
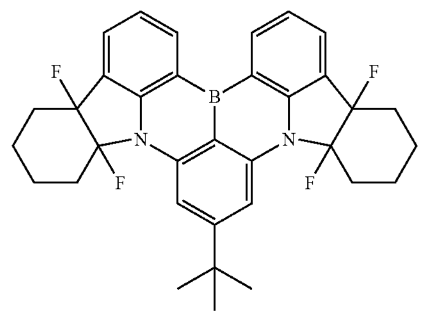
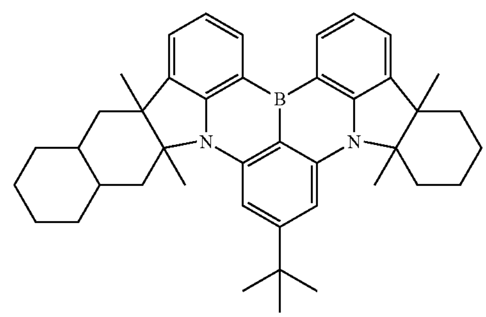
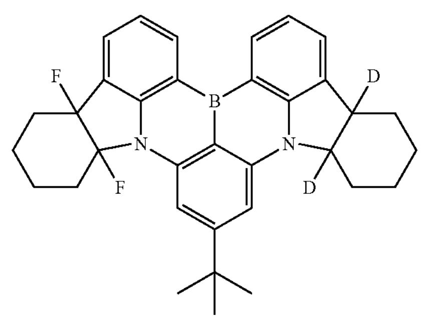

-continued
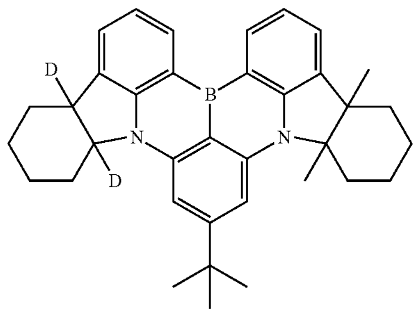
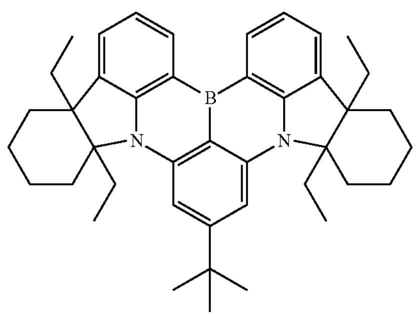
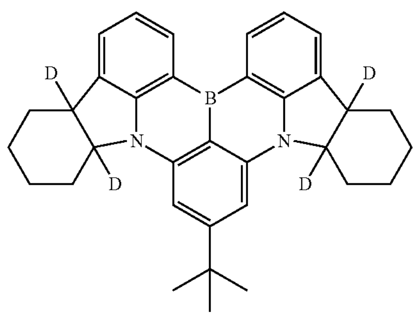
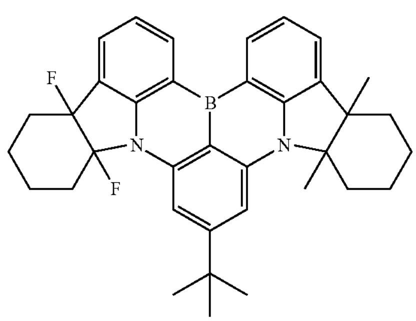
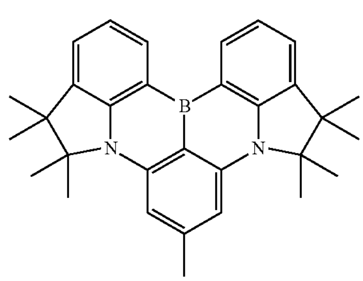
-continued
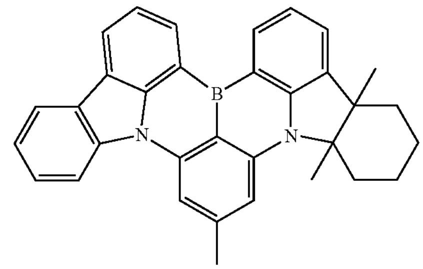
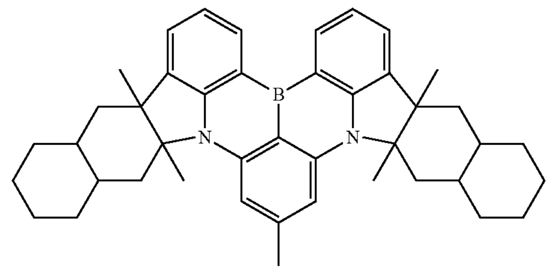
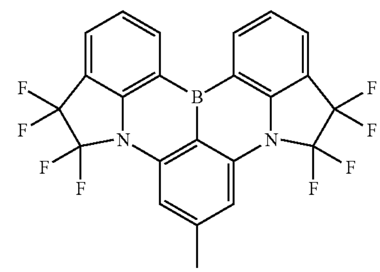
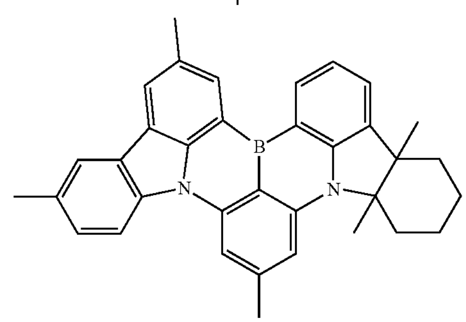
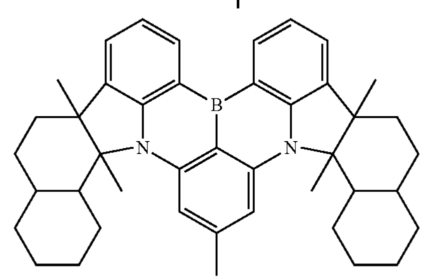
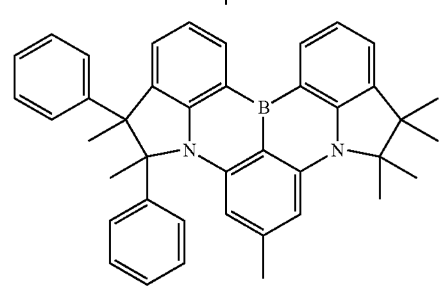

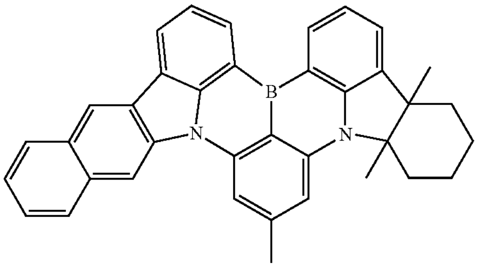
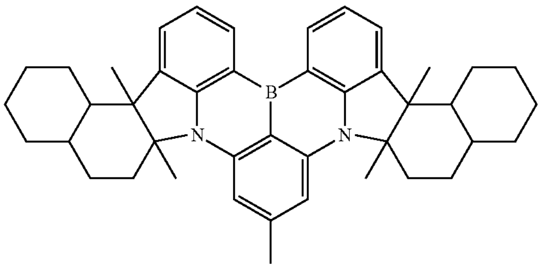
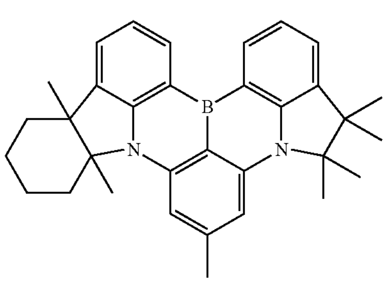
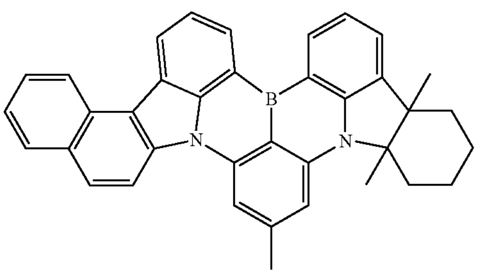
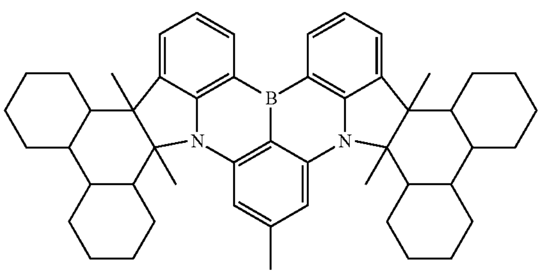
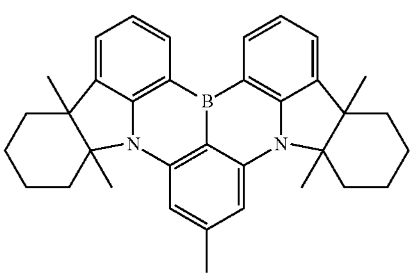
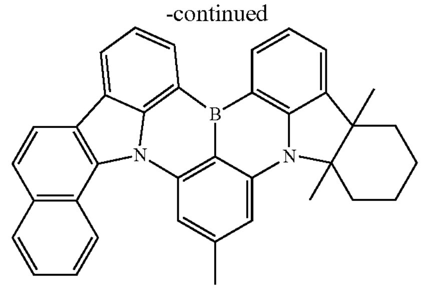
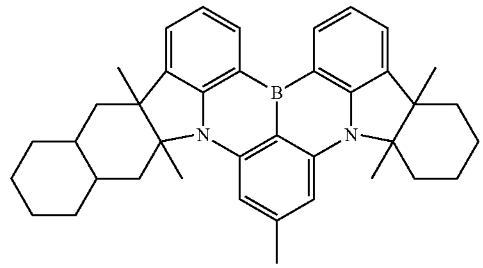
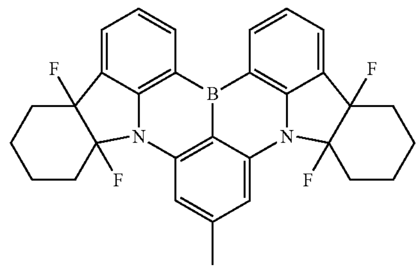
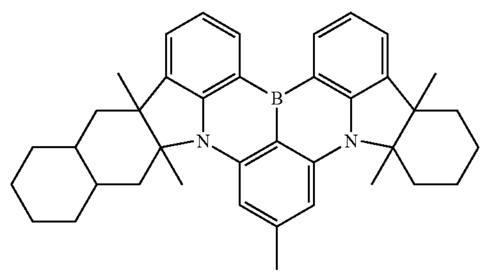
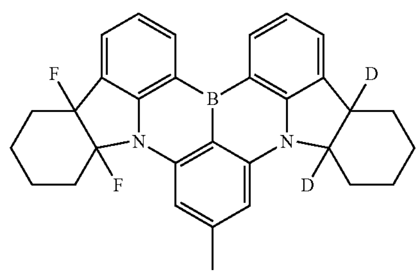
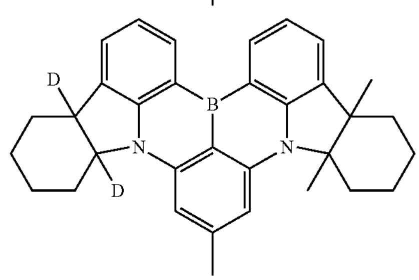

-continued
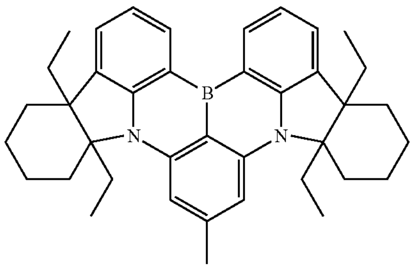
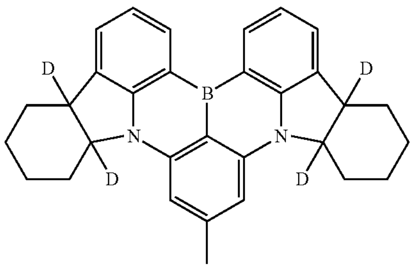
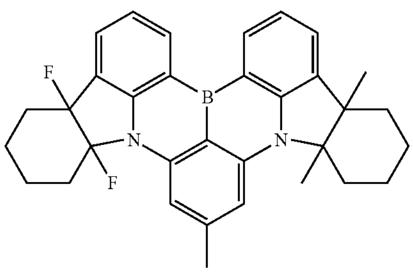
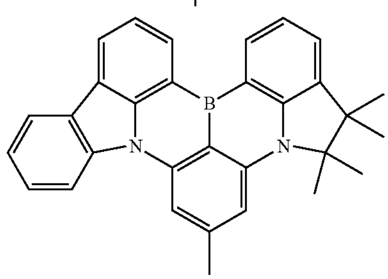
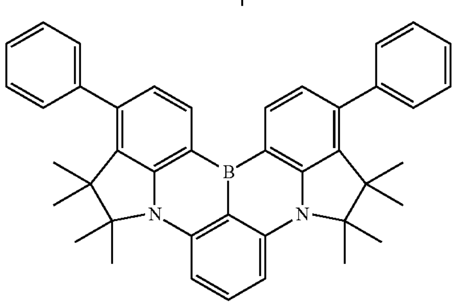
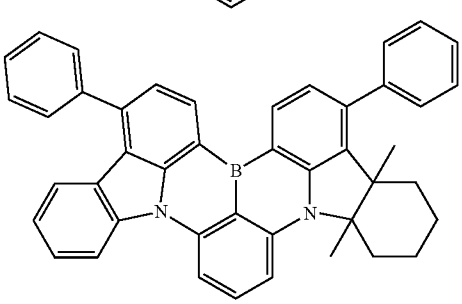
-continued
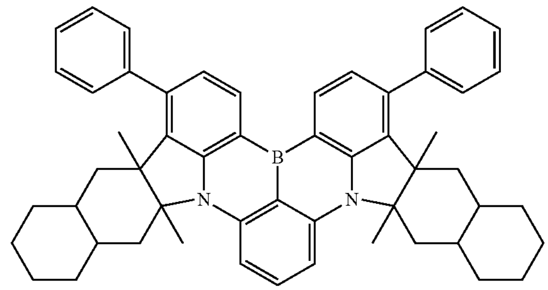
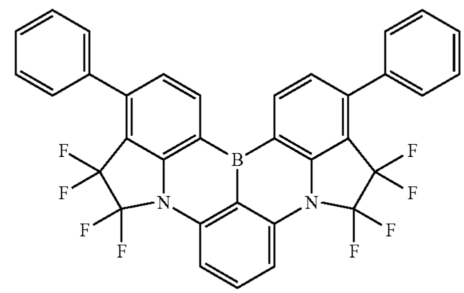
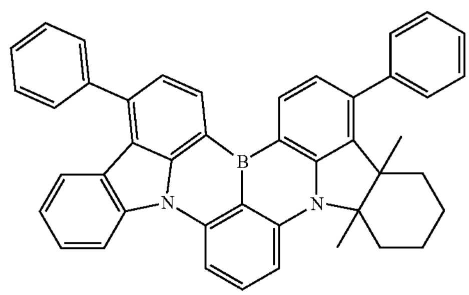
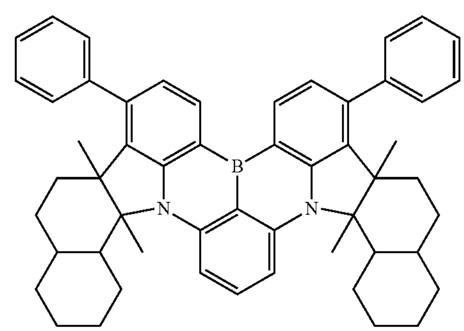
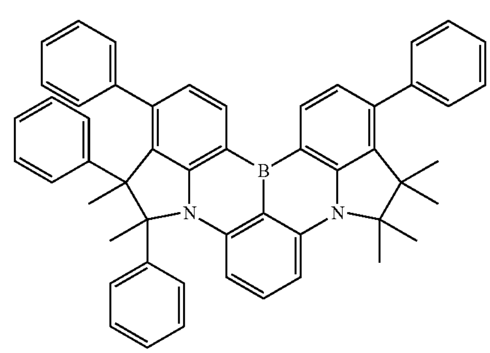

-continued
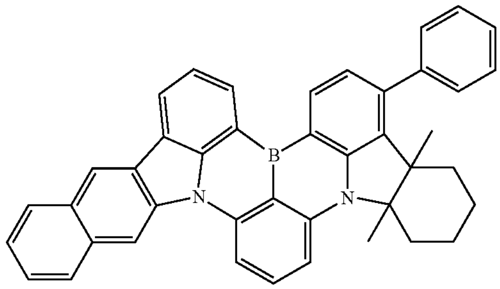
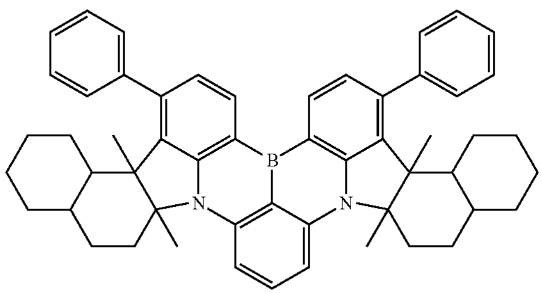
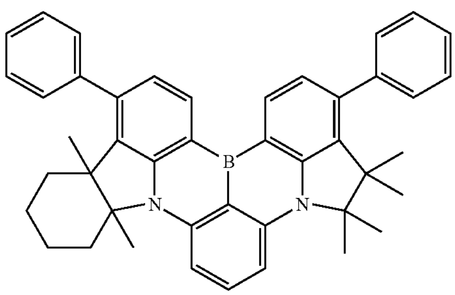
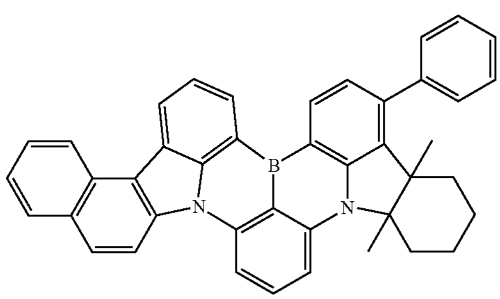
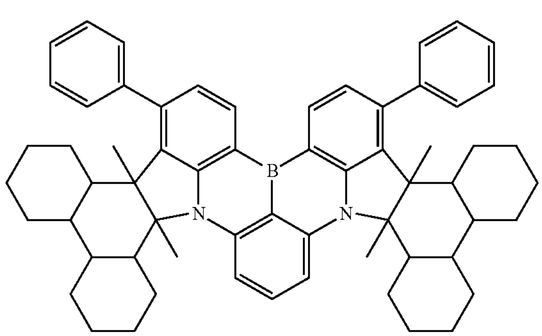
-continued
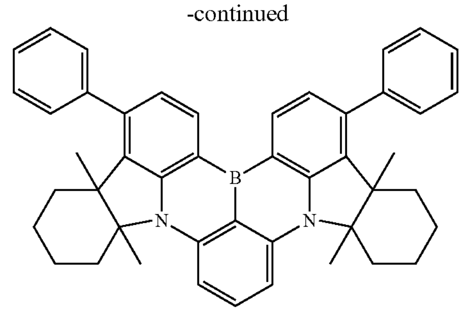
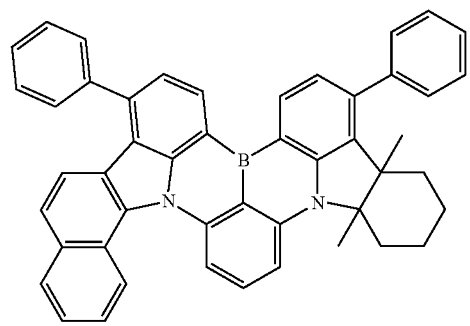
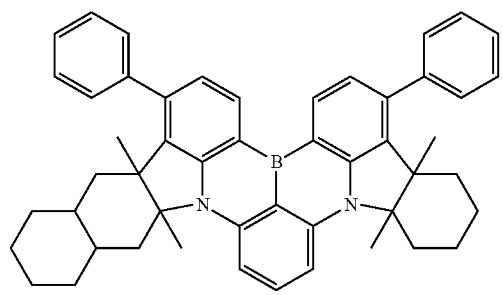
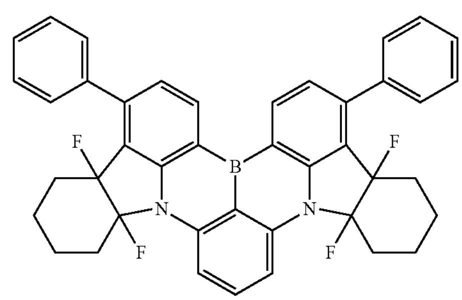
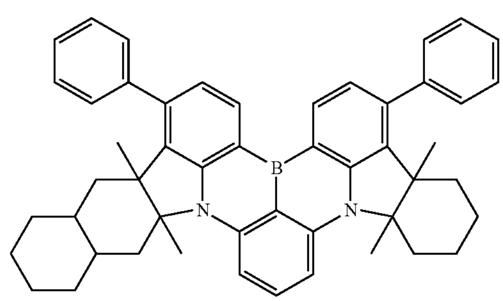

-continued
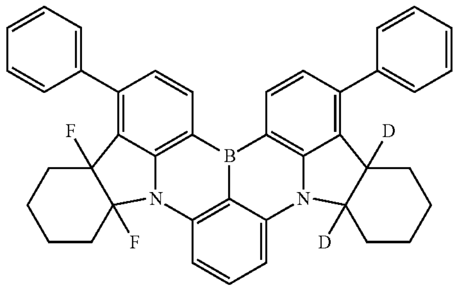
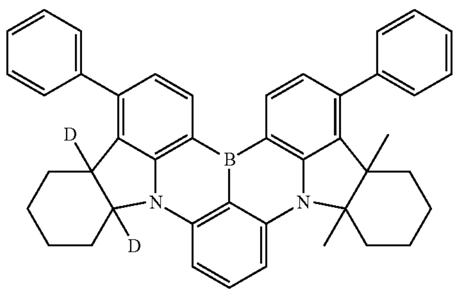
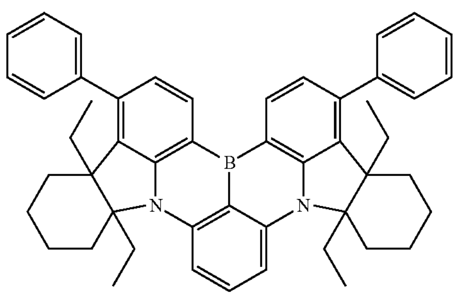
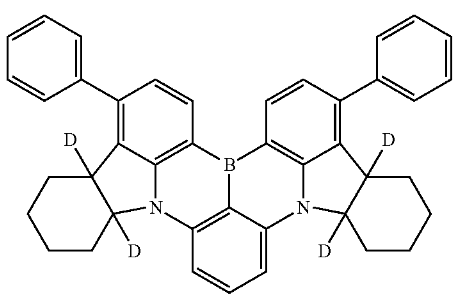
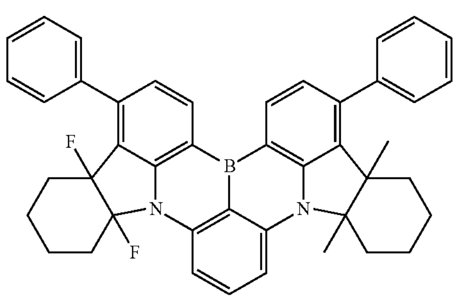
-continued
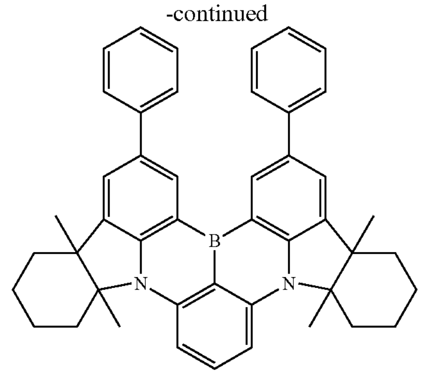
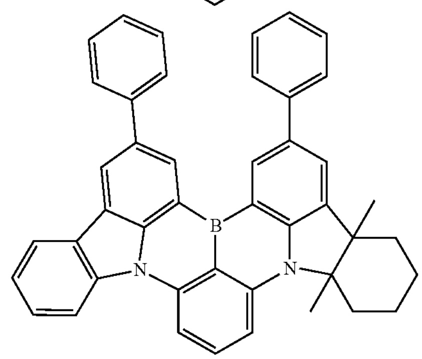
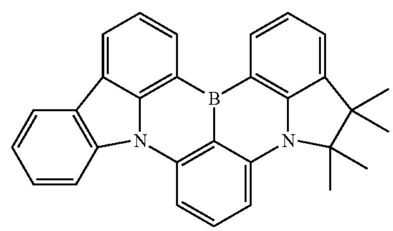
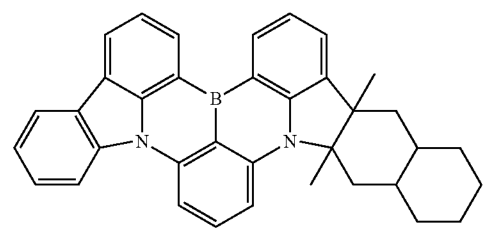
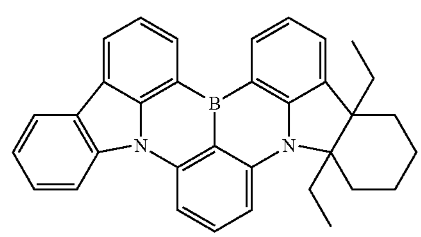
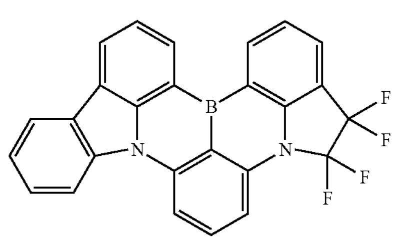

-continued
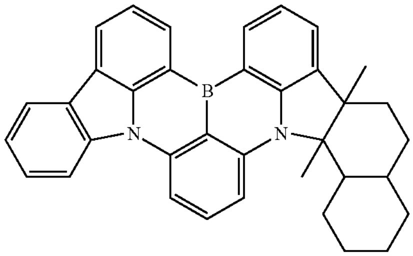
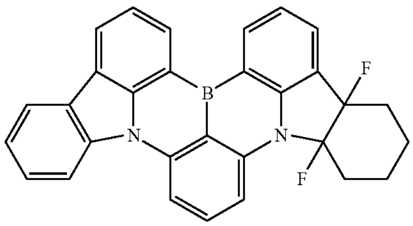
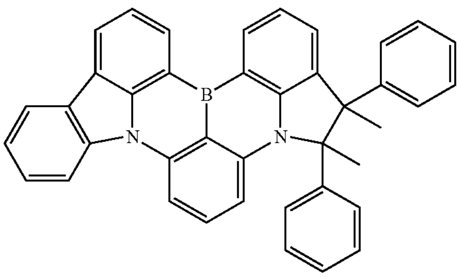
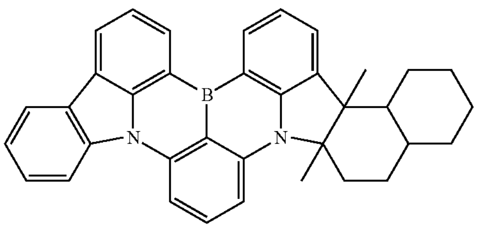
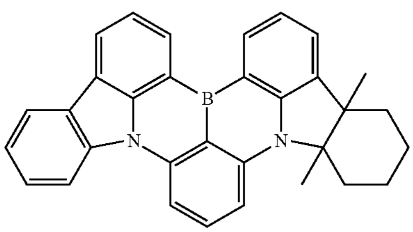
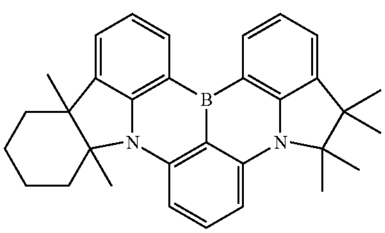
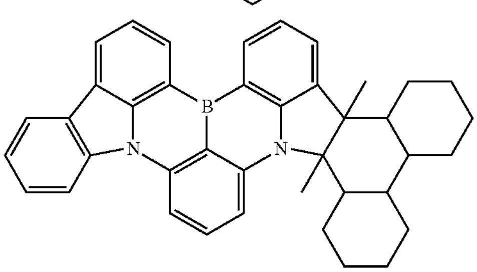
-continued
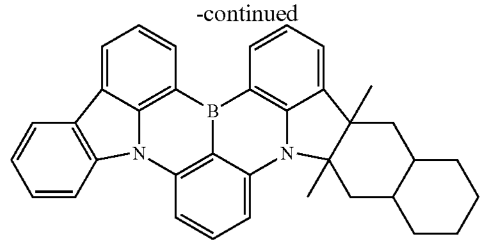
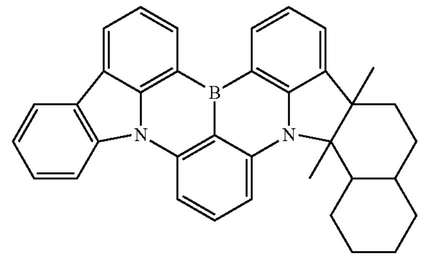
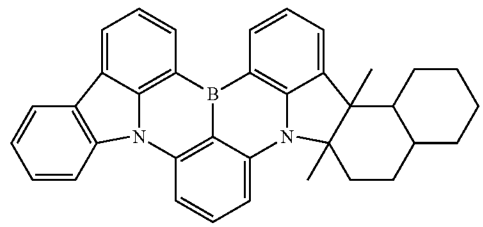
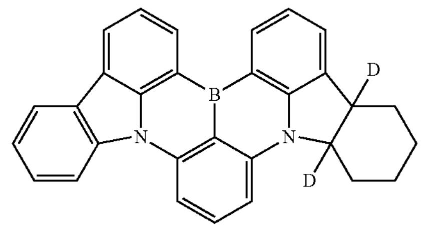
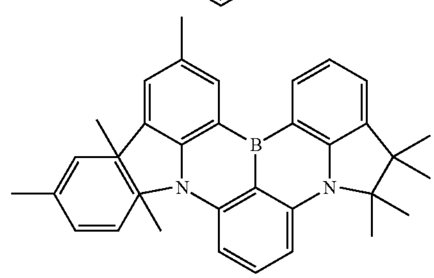
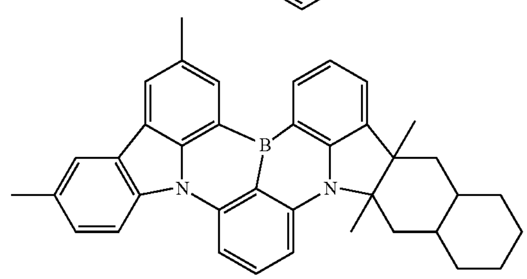
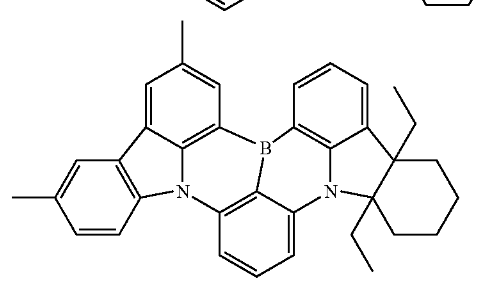

-continued
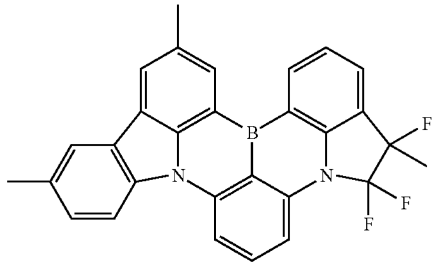
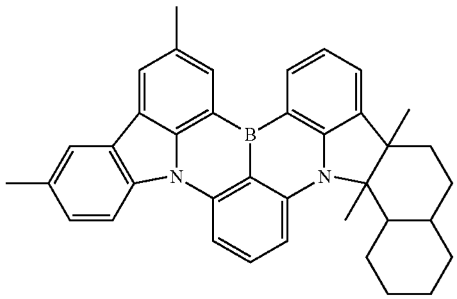
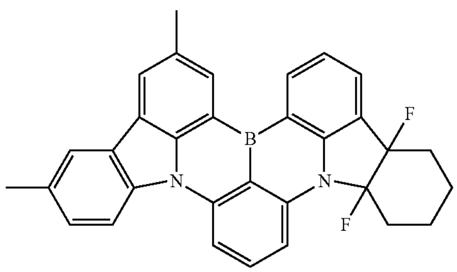
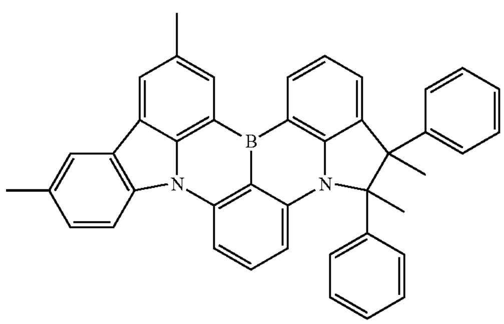
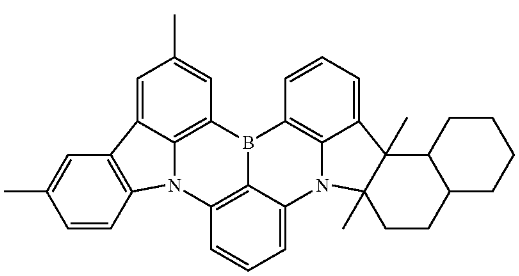
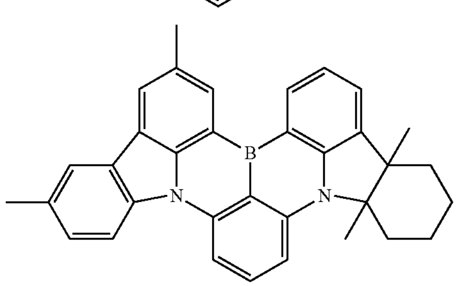
-continued
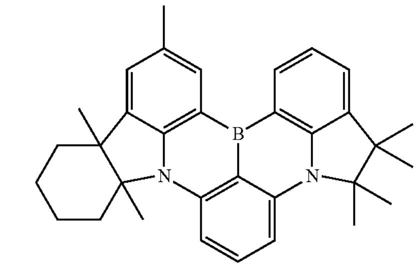
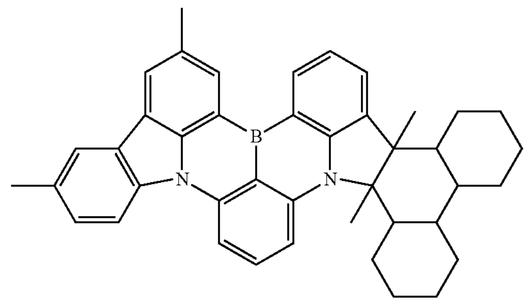
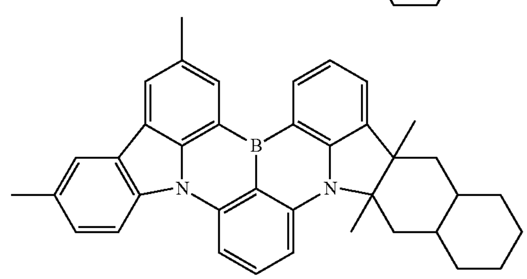
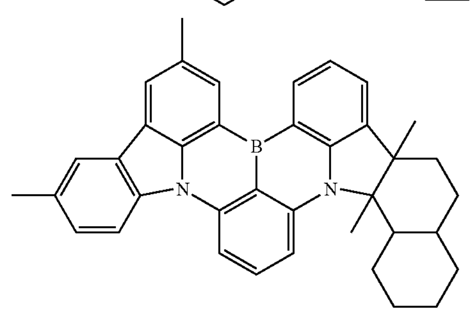
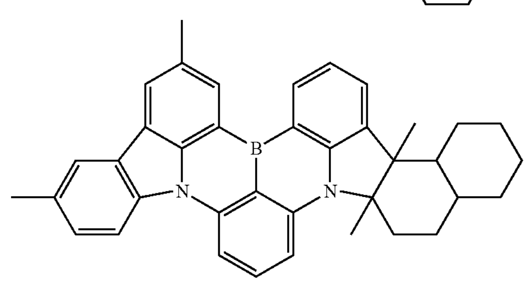
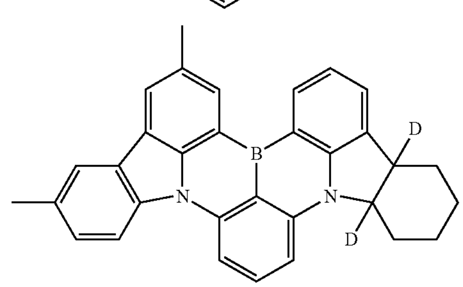

-continued
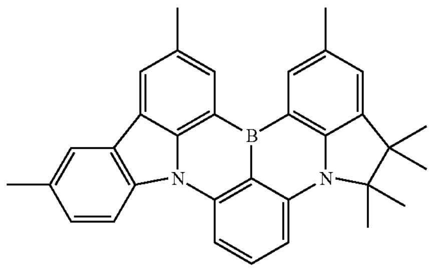
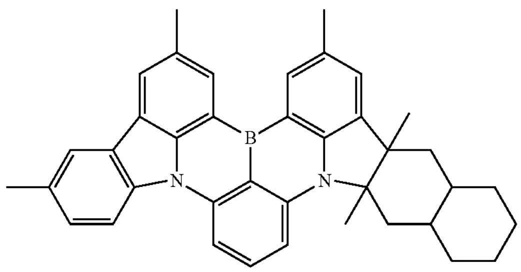
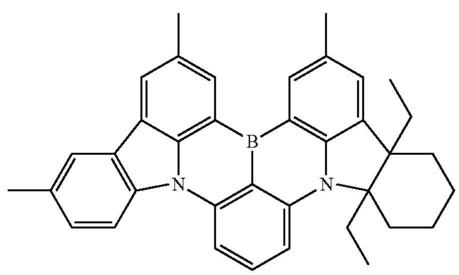
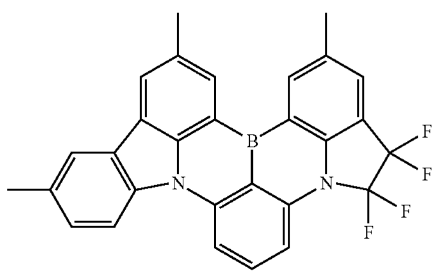
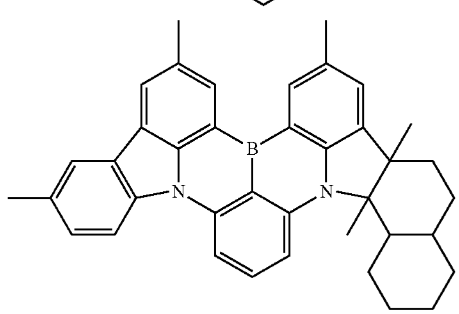
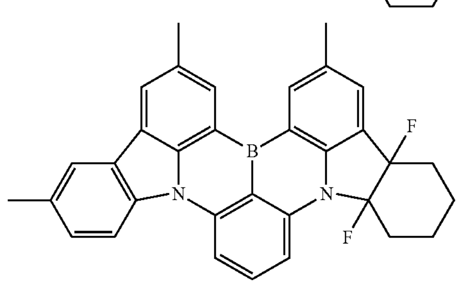
-continued
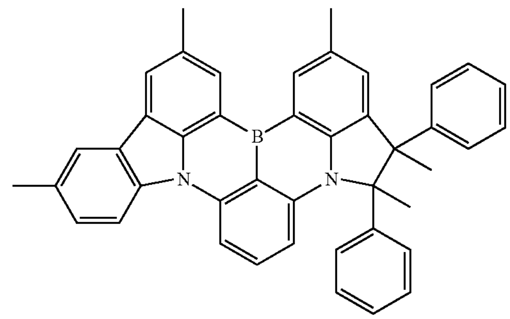
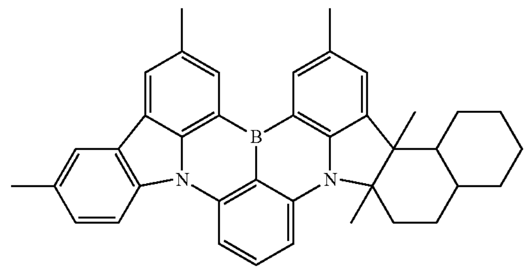
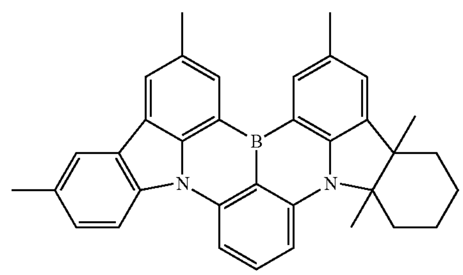
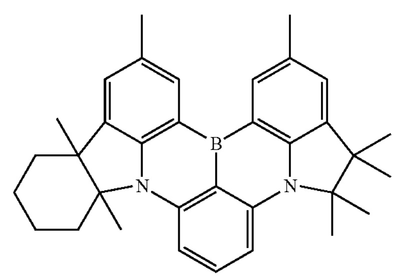
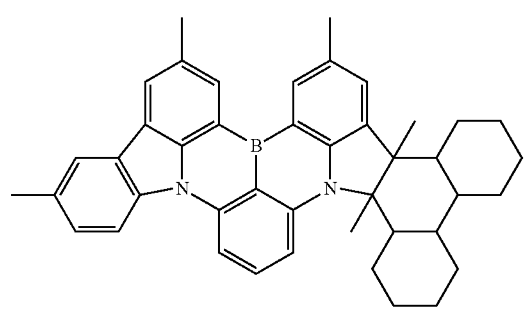
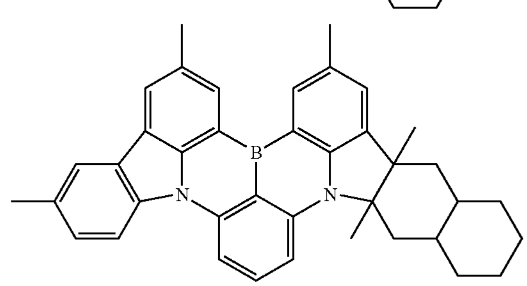

-continued
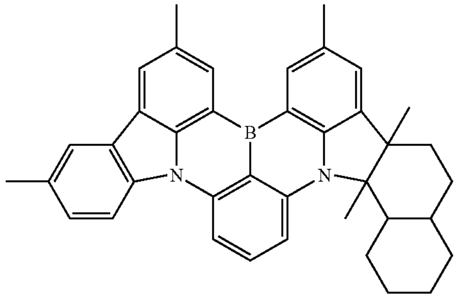
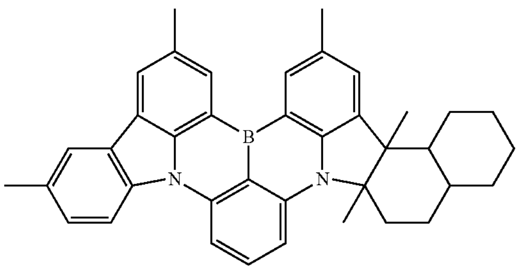
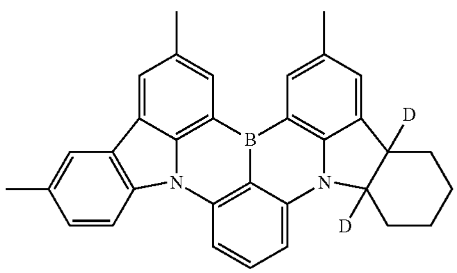
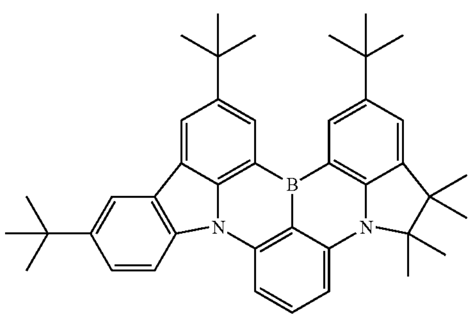
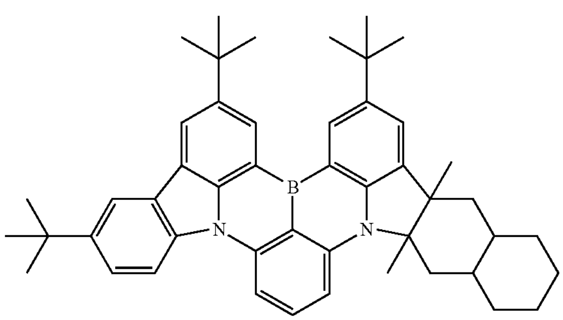
-continued
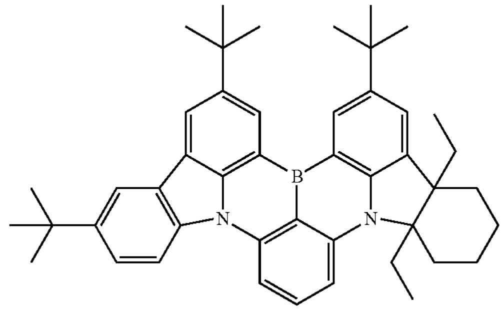
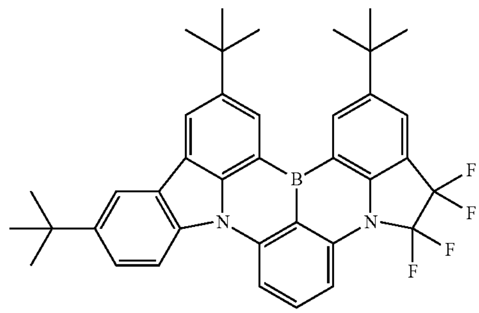
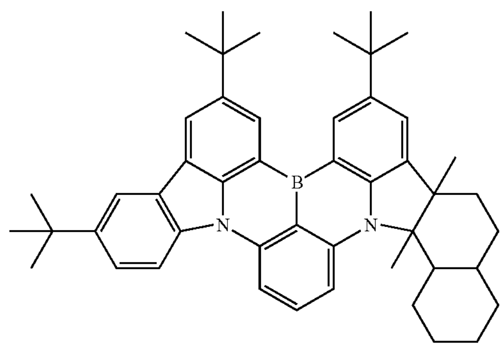
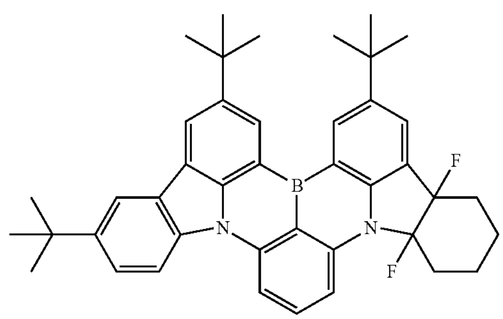
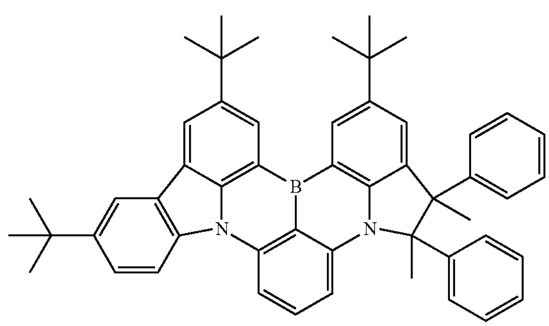

-continued
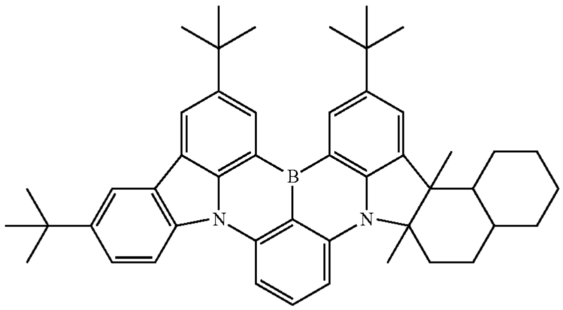
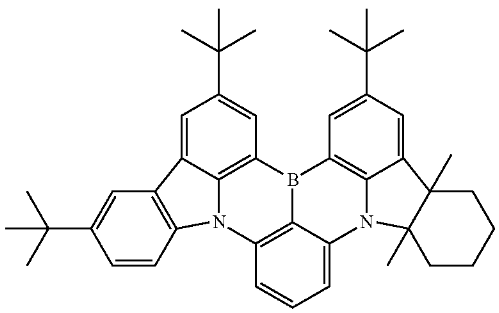
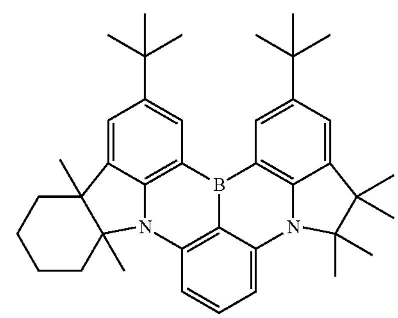
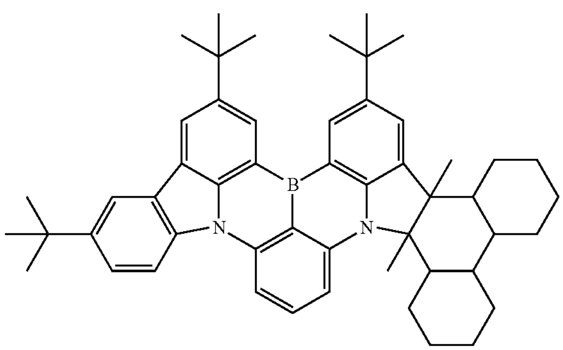
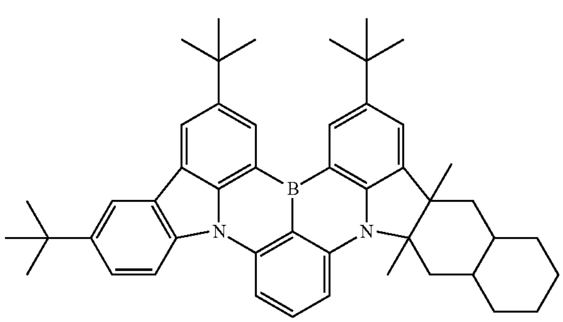
-continued
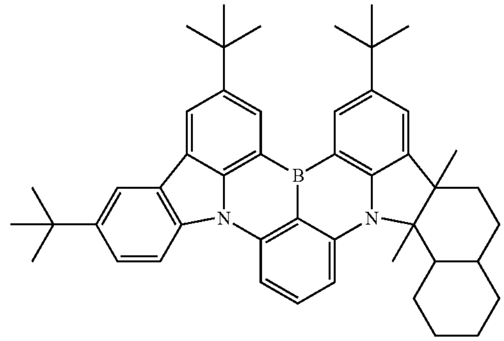
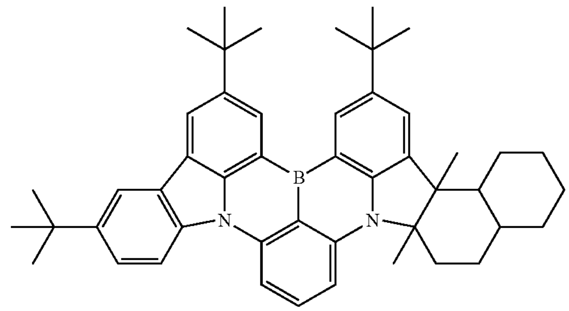
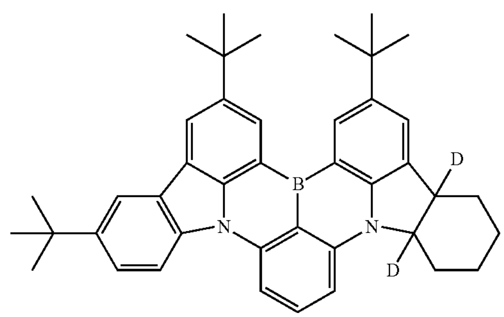
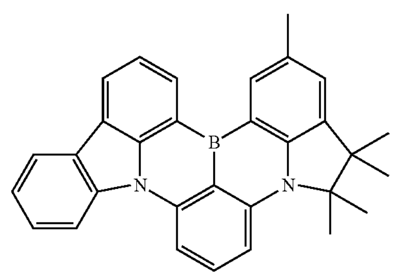
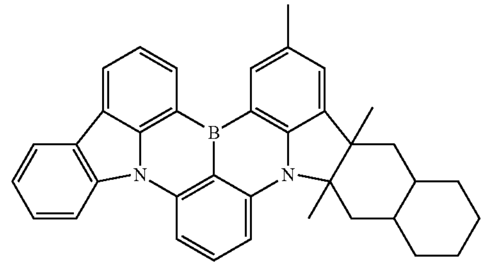

-continued
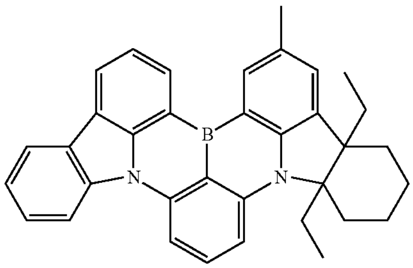
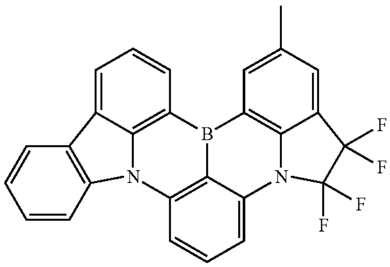
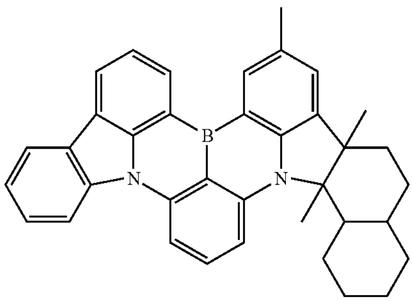
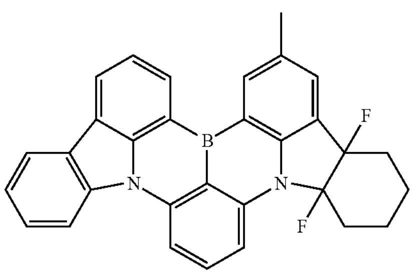
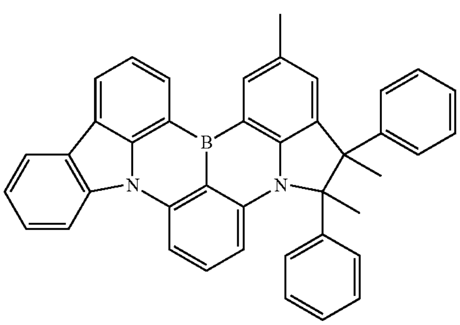
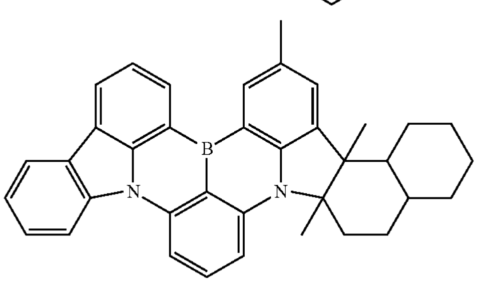
-continued
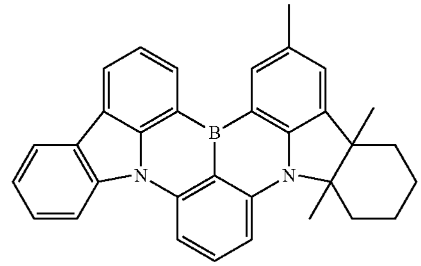
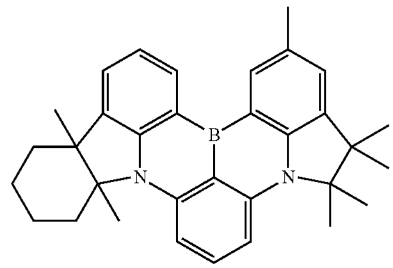
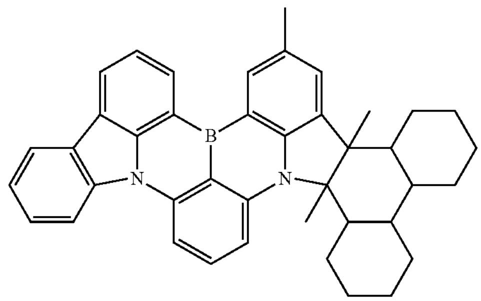
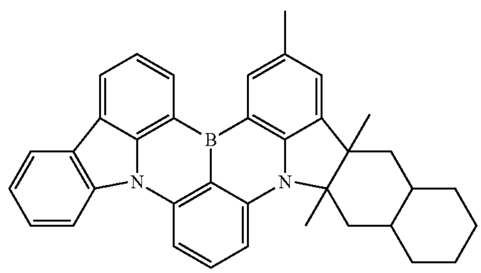
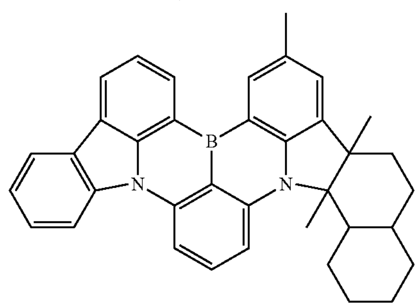
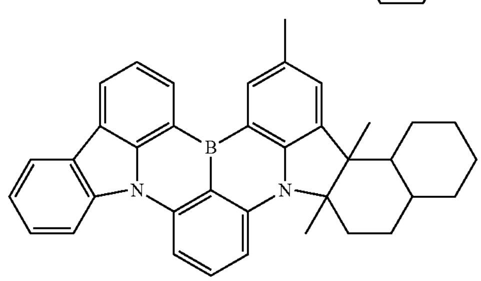

-continued
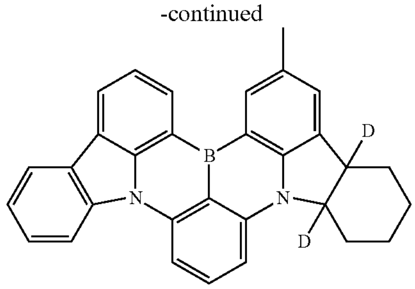
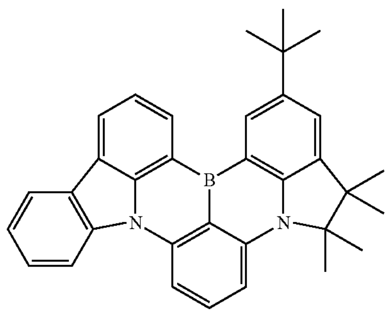
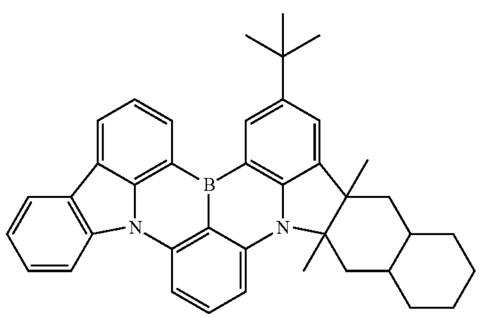
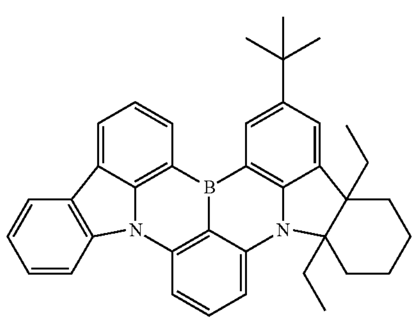
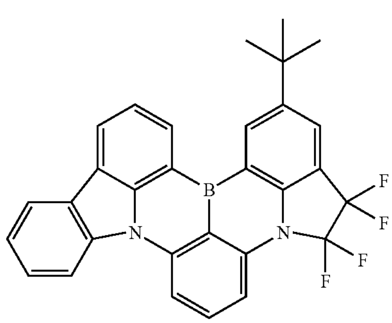
-continued
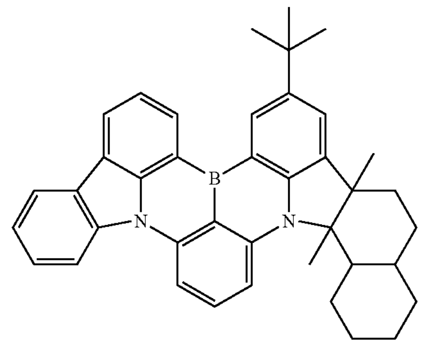
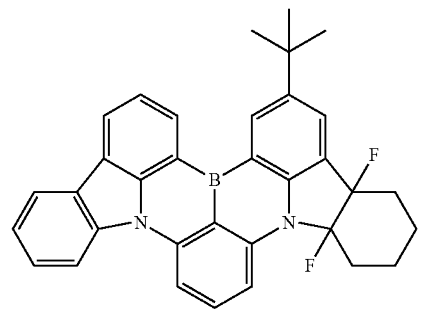
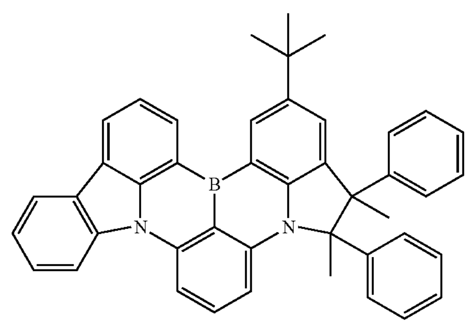
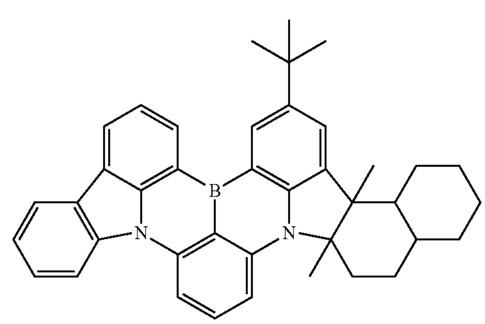
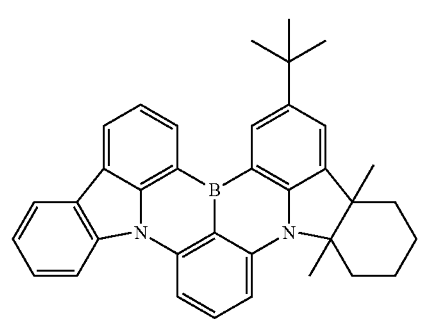

-continued
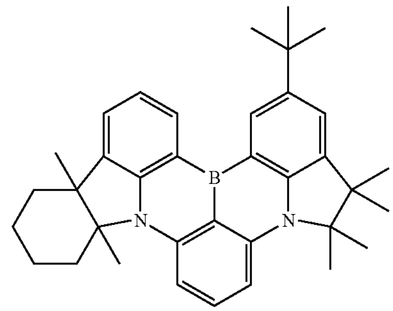
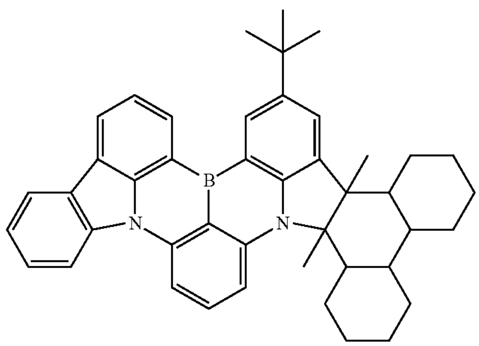
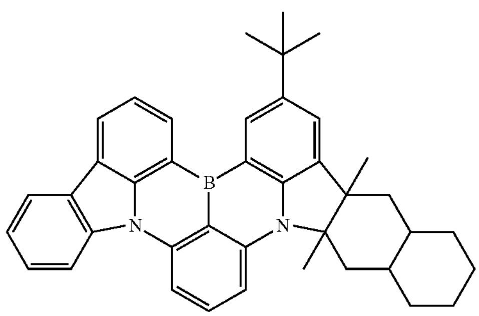
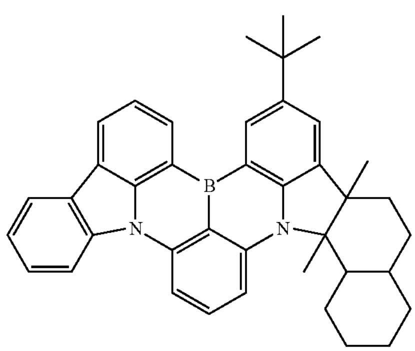
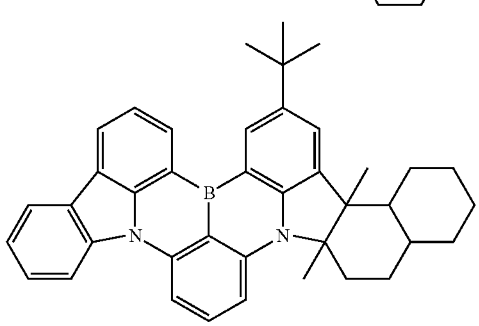
-continued
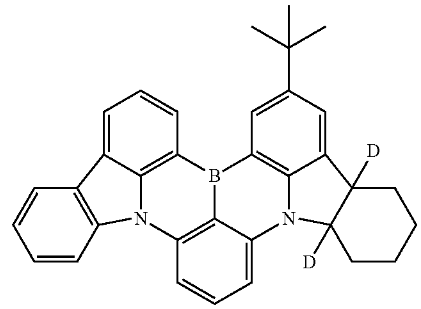
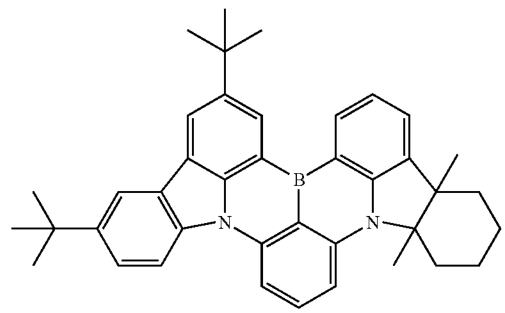
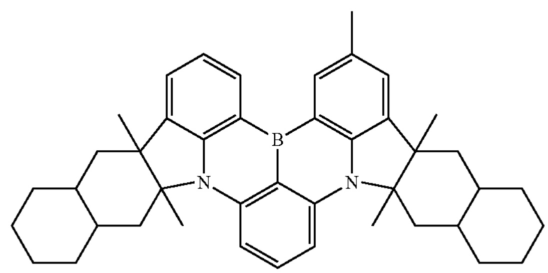
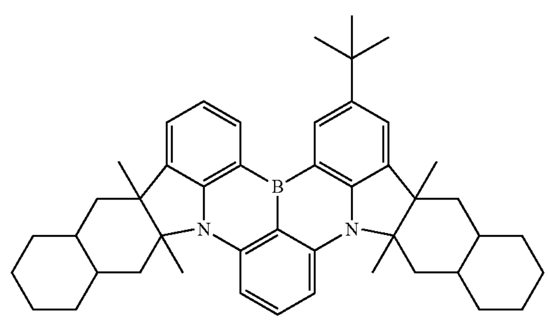
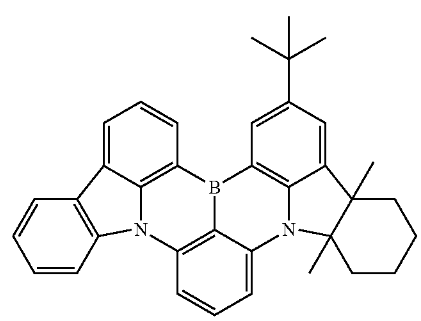

-continued
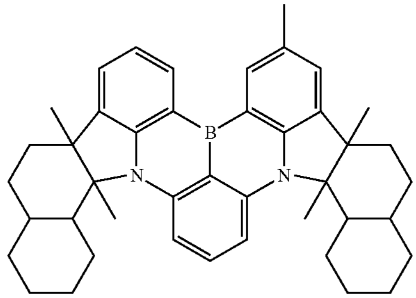
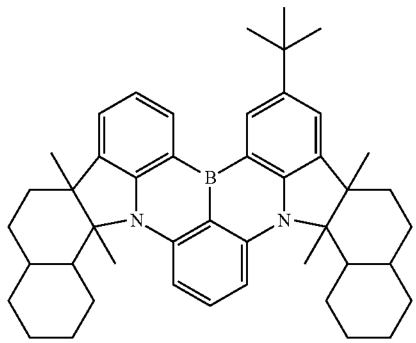
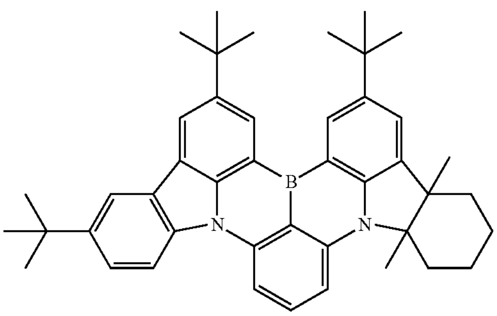
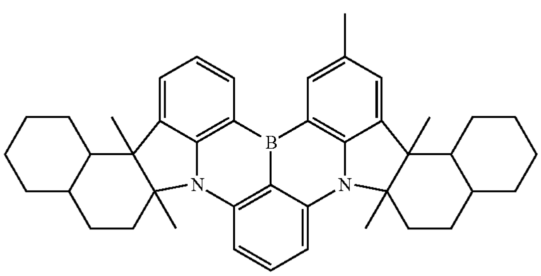
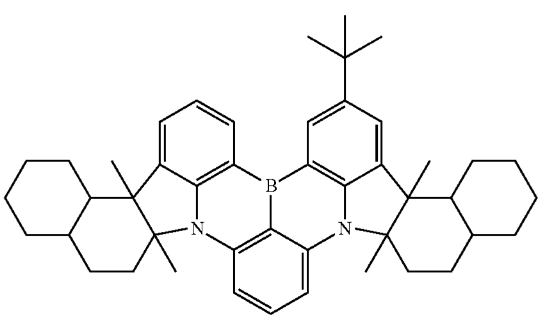
-continued
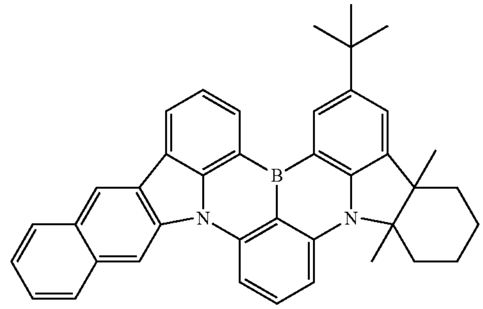
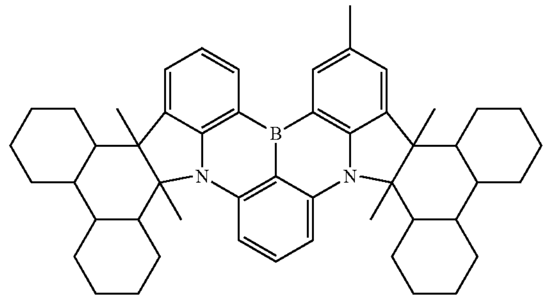
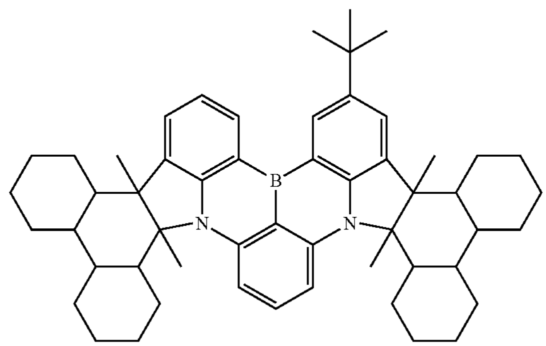
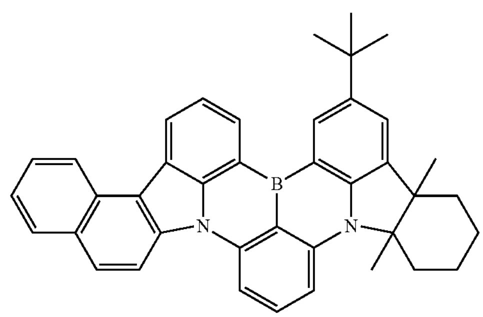
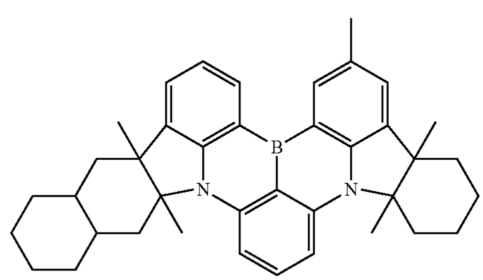

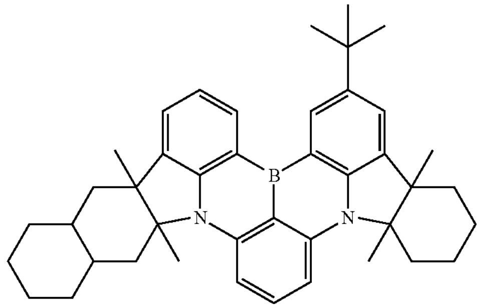
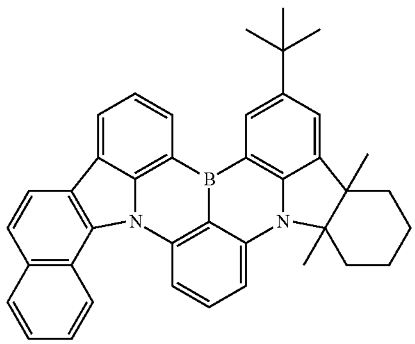
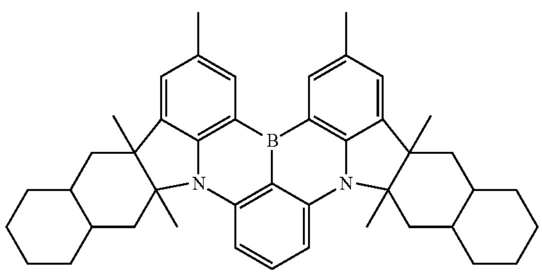
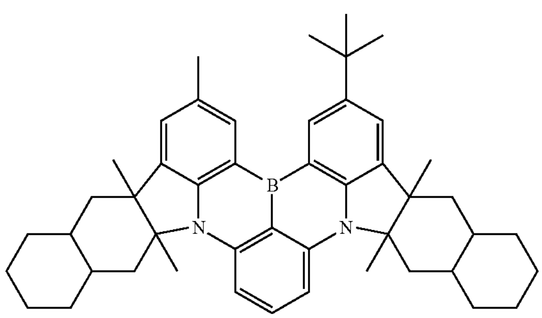
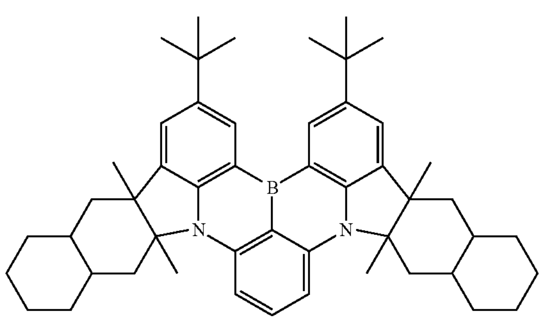
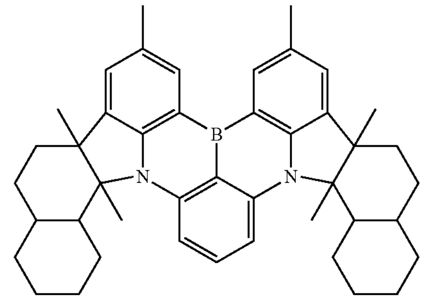
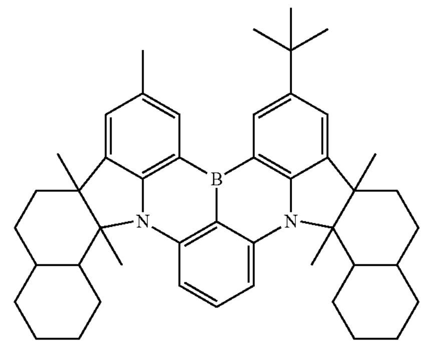
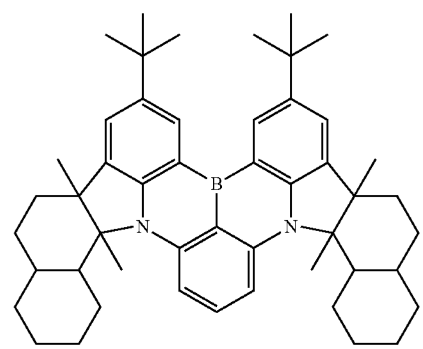
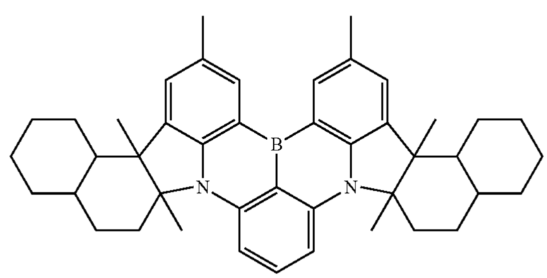
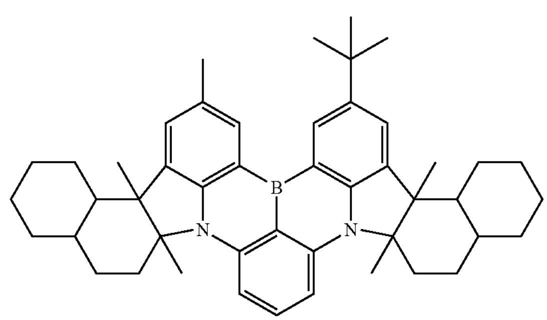

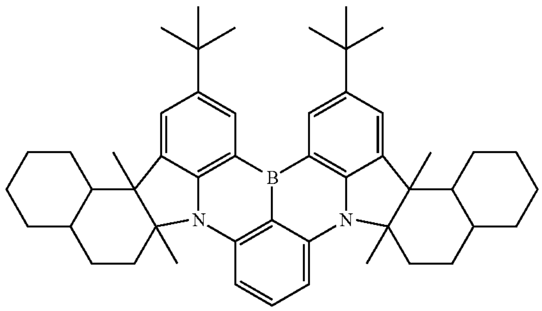
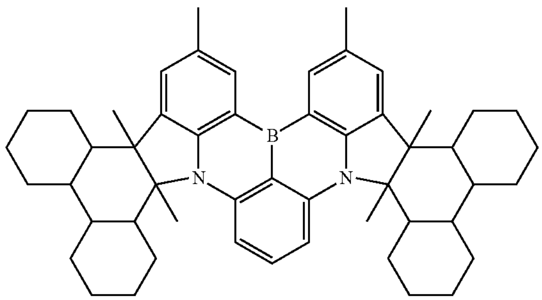
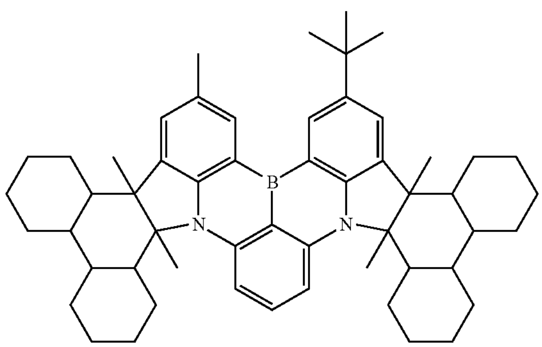
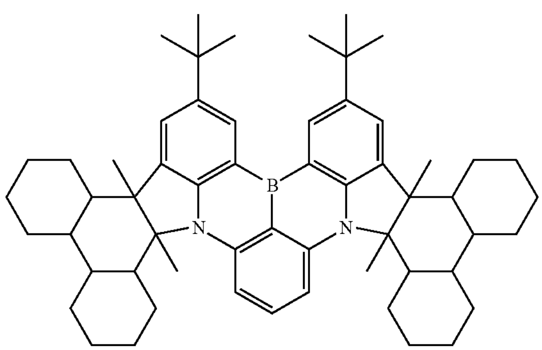
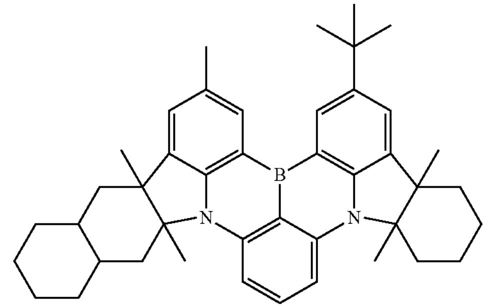
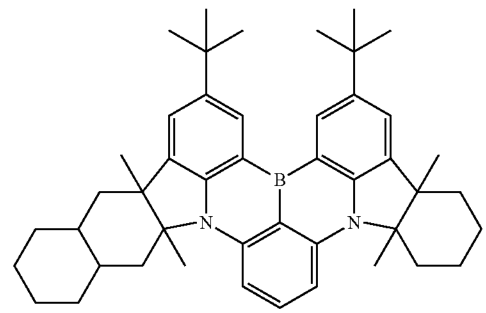
F
F
F
F
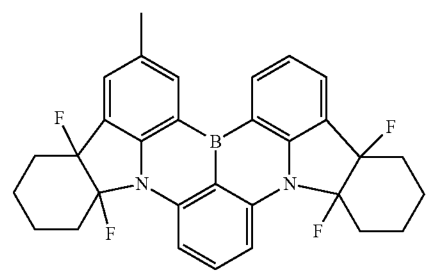
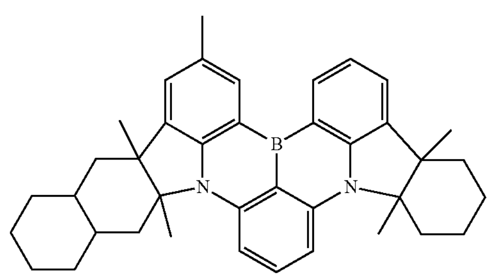
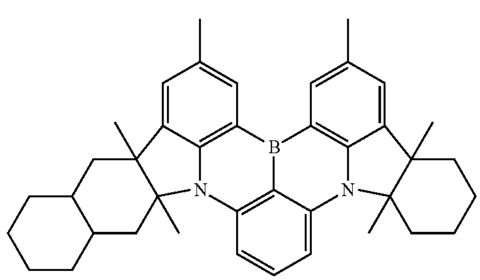
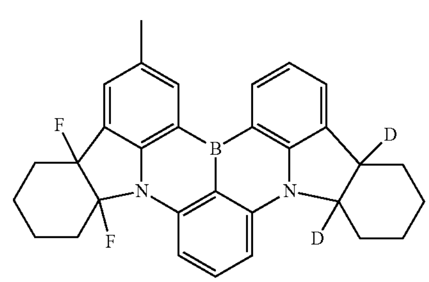
F
F
D
D -continued
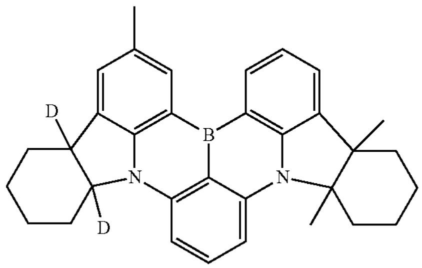
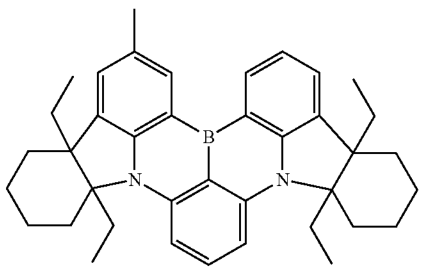
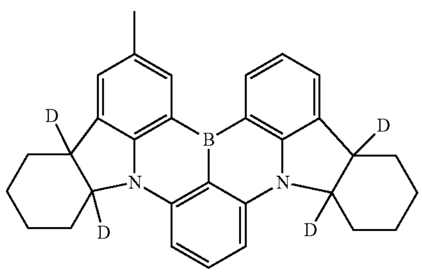
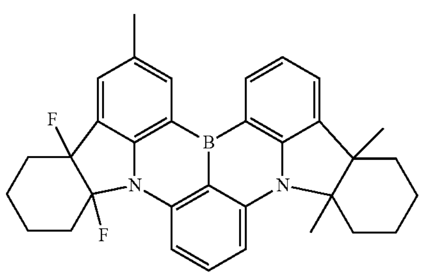
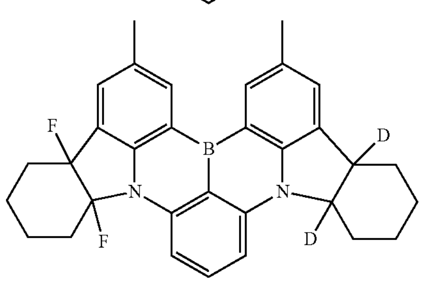
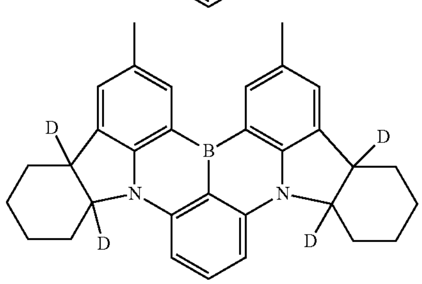
-continued
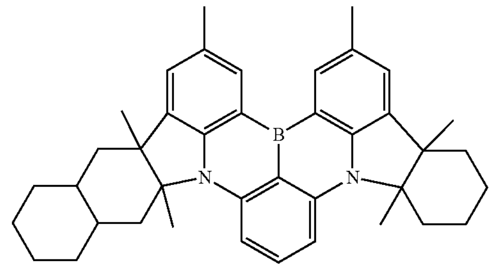
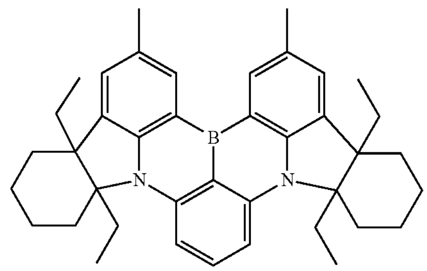
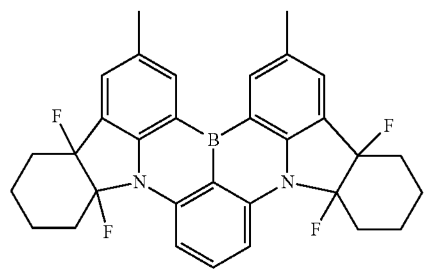
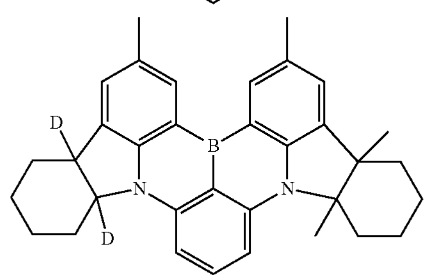
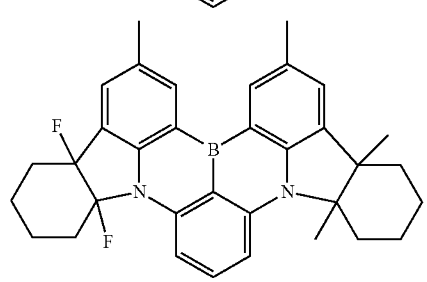
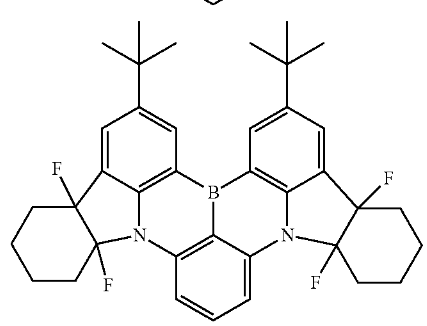

-continued
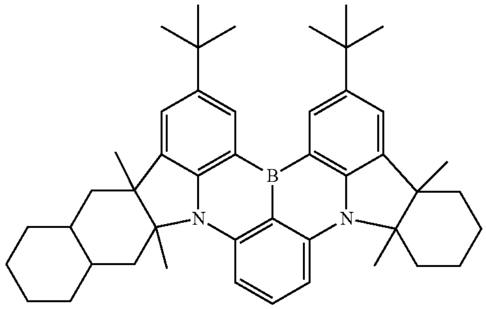
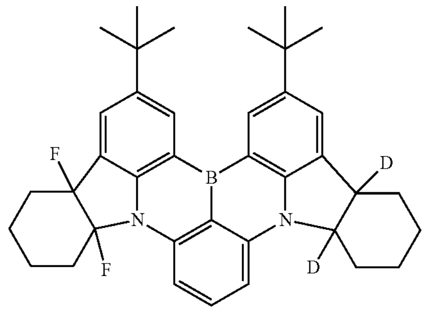
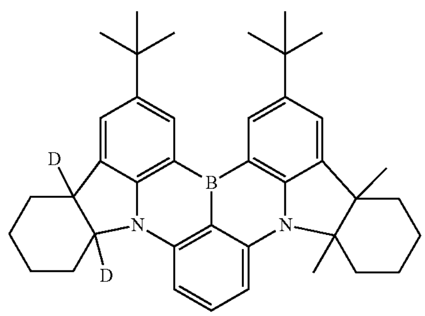
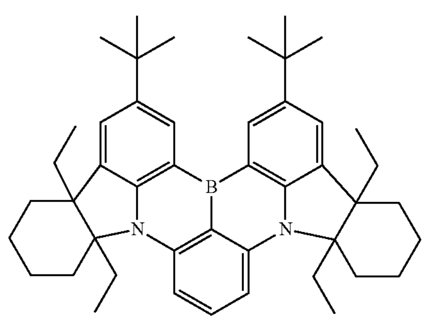
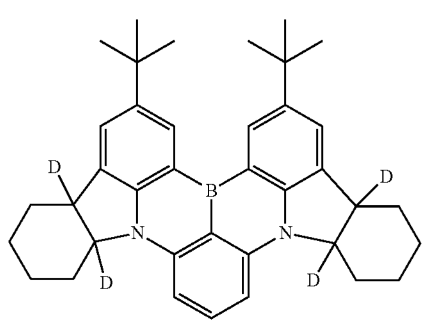
-continued
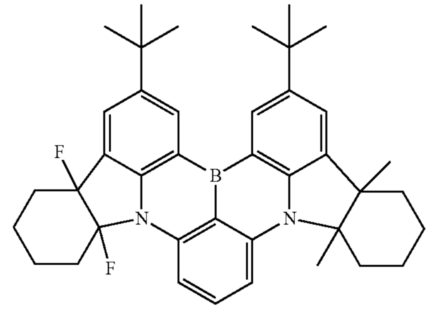
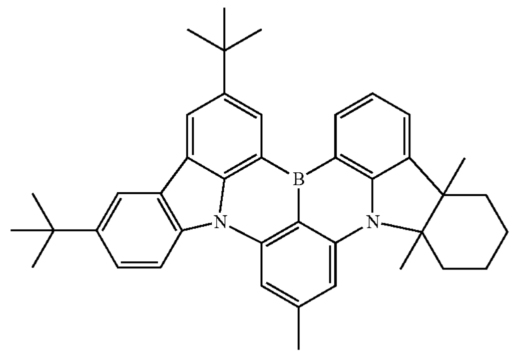
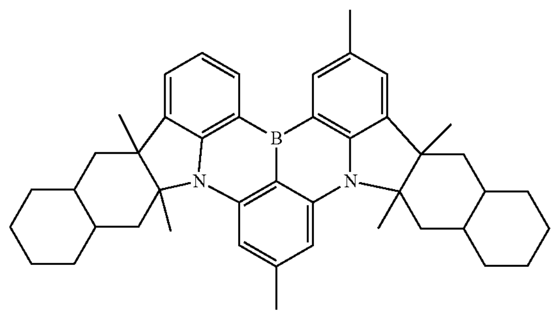
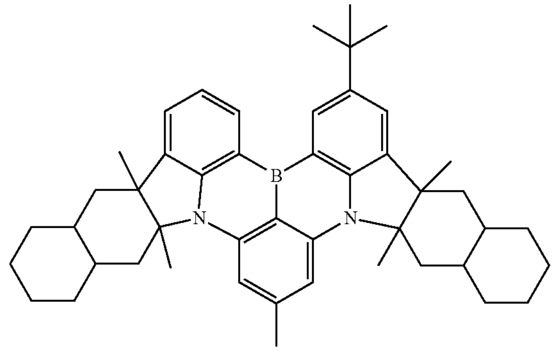
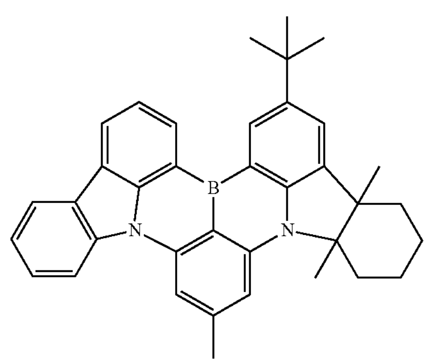

-continued
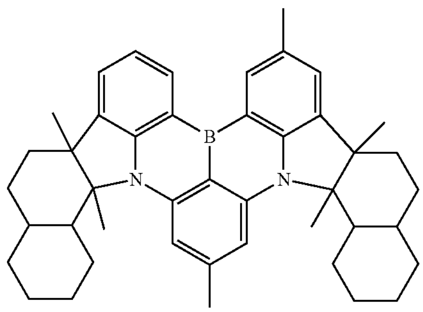
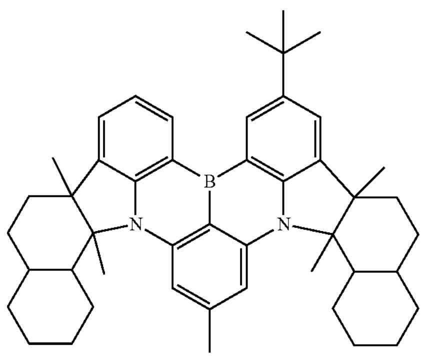
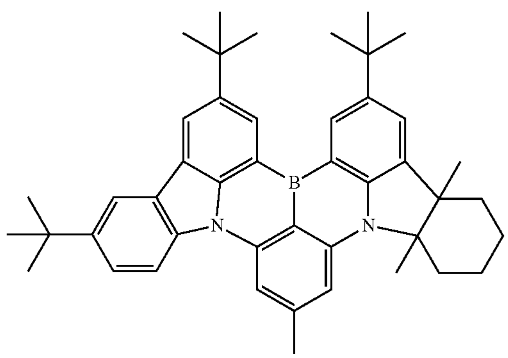
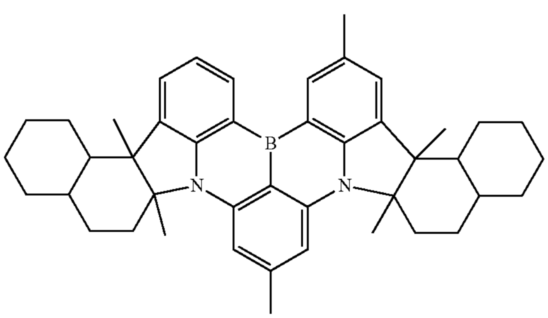
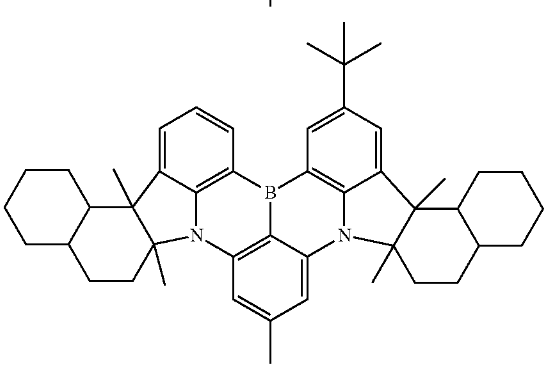
-continued
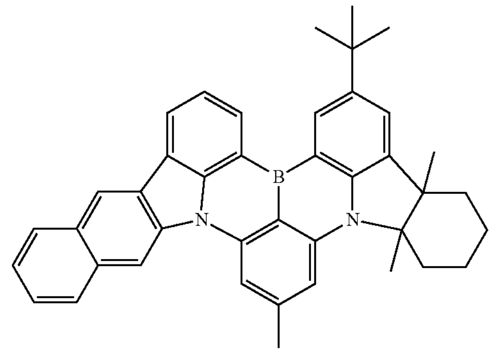
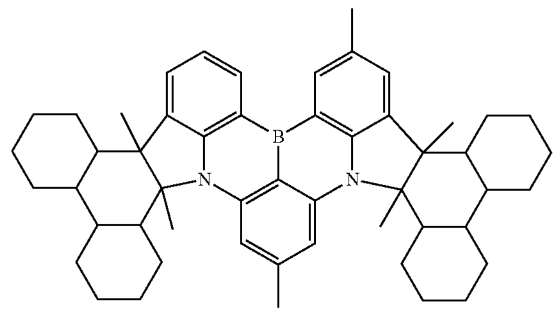
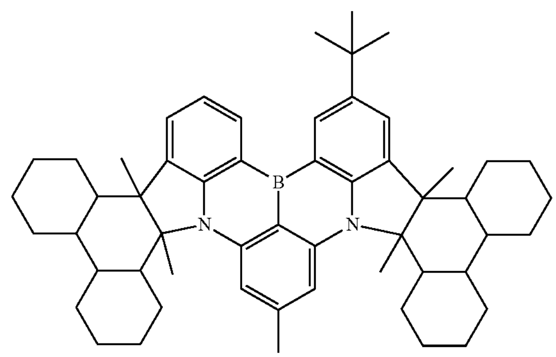
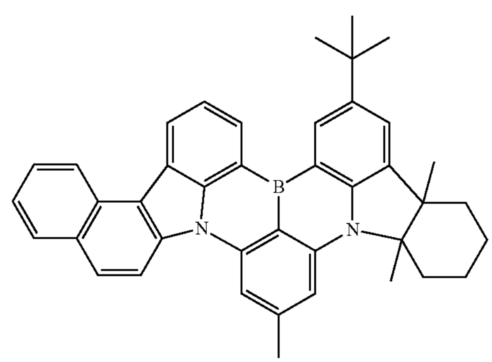
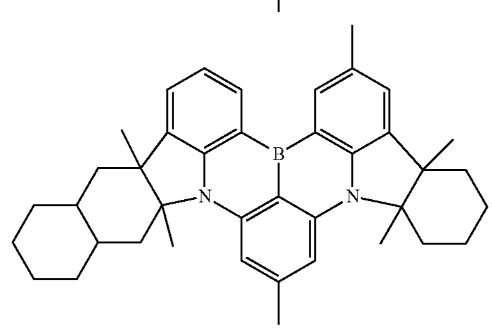

-continued
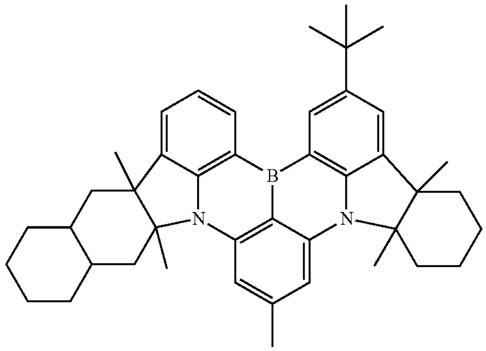
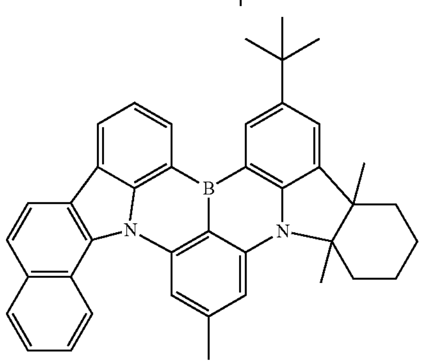
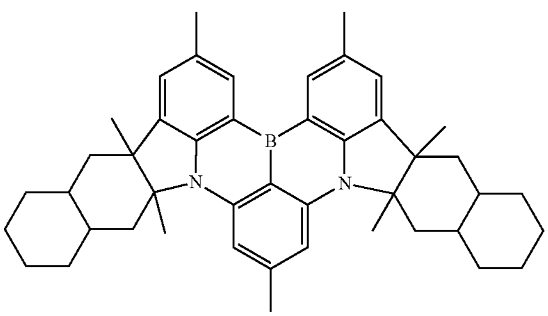
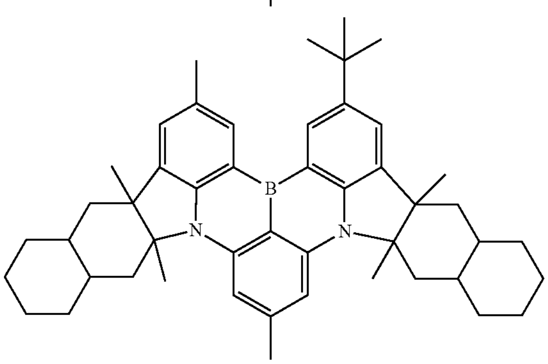
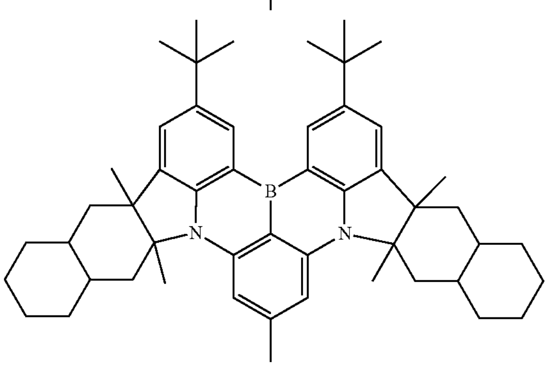
-continued
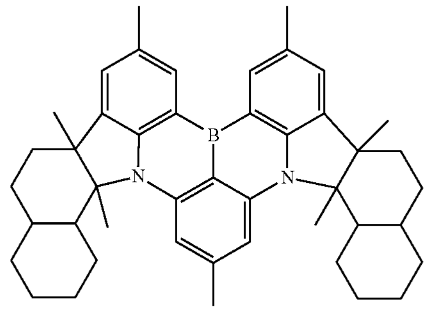
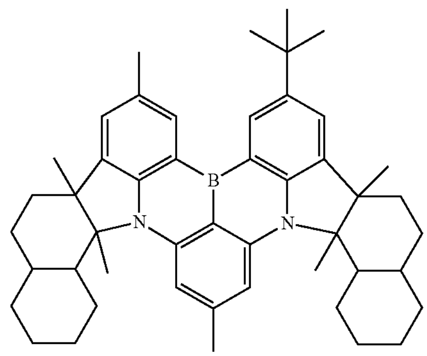
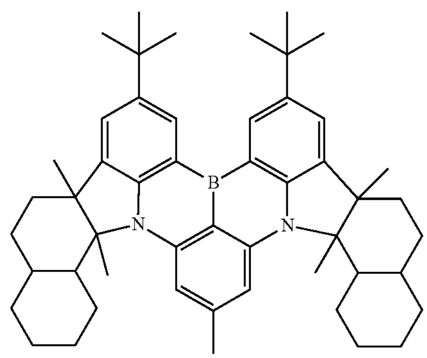
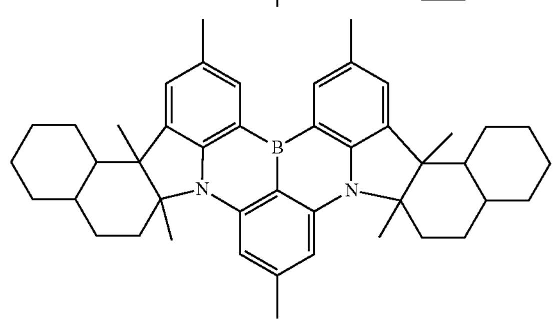
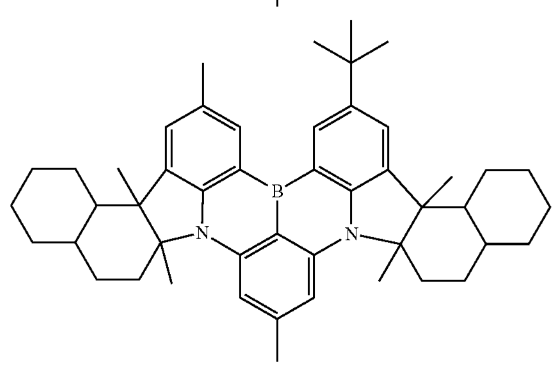

-continued
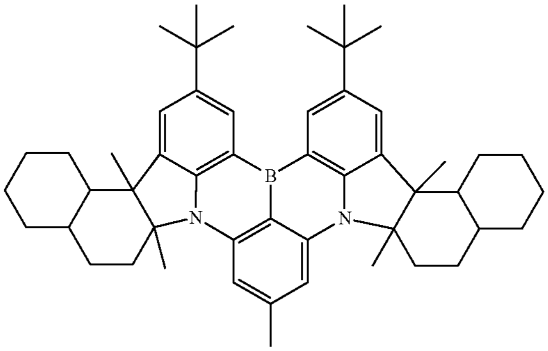
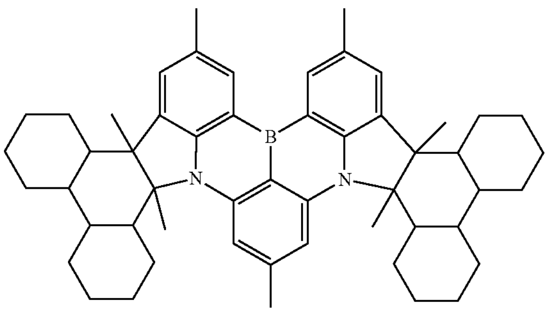
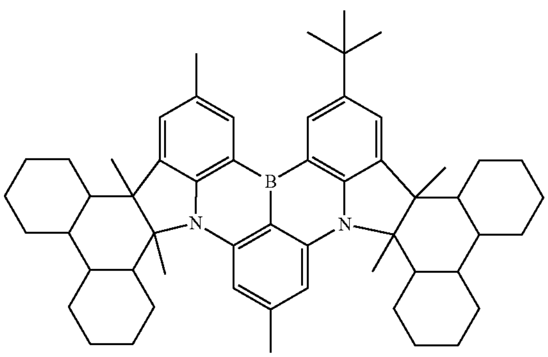
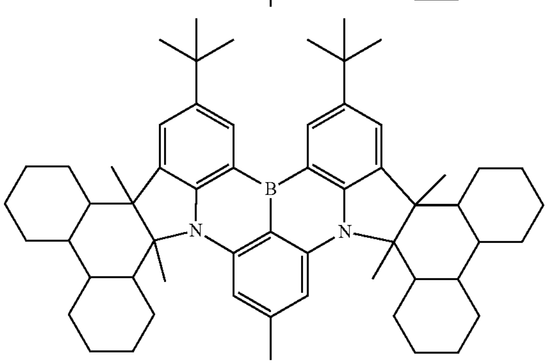
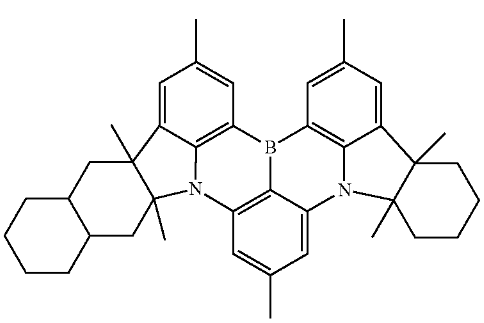
-continued
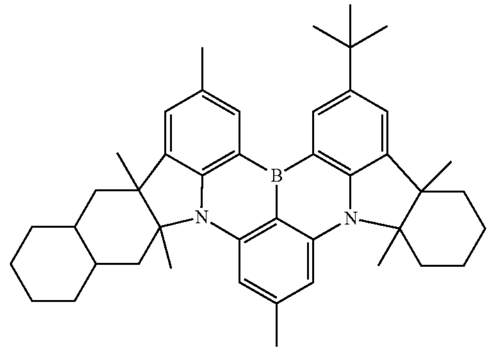
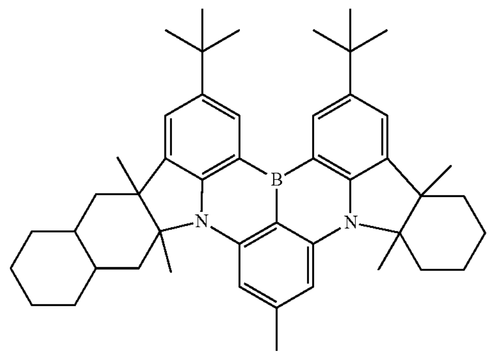
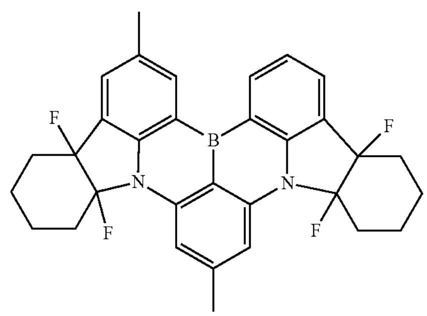
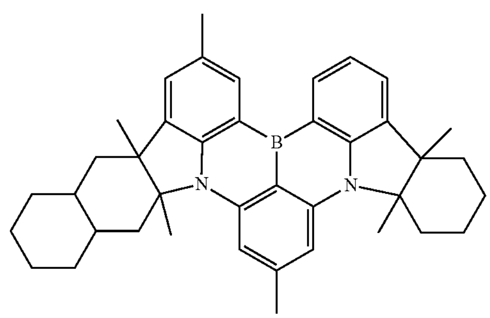
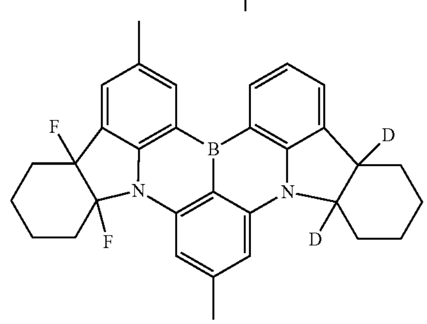

-continued
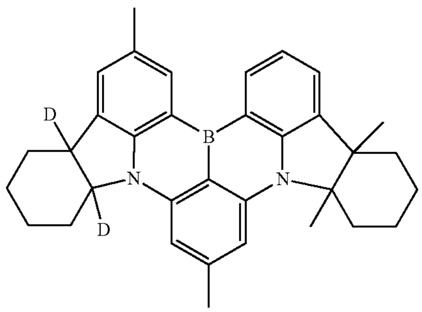
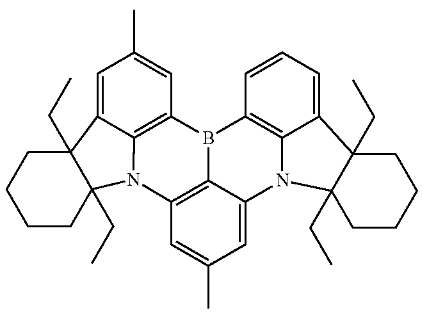
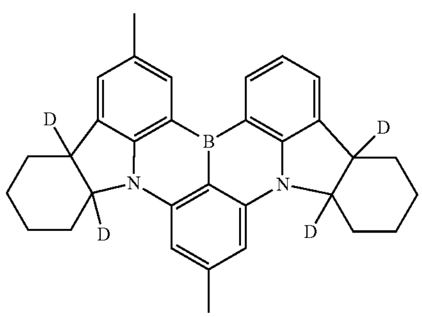
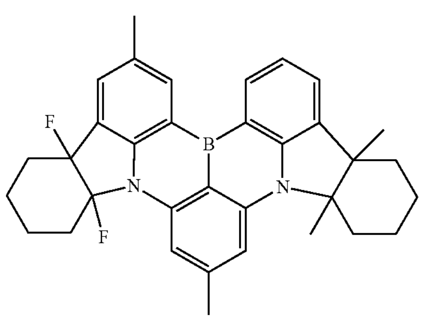
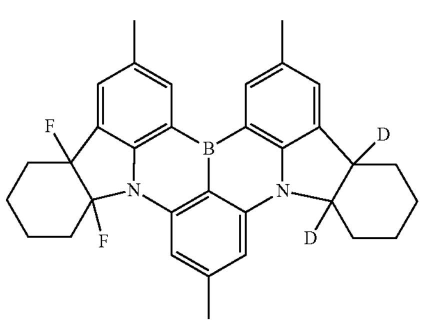
-continued
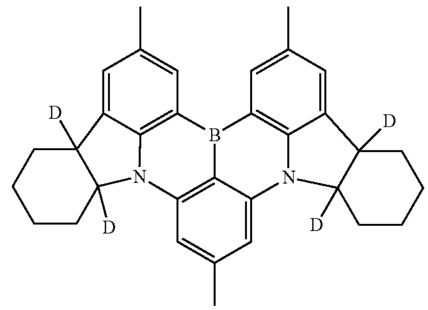
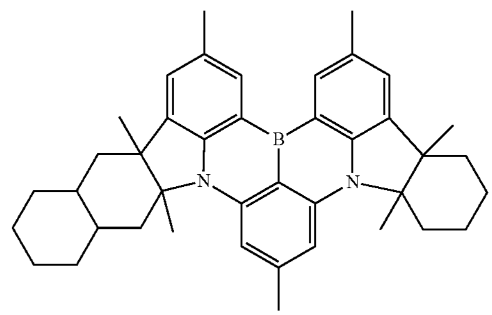
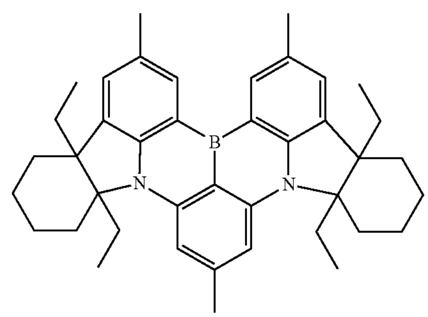
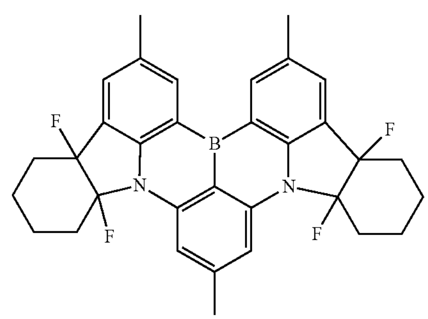
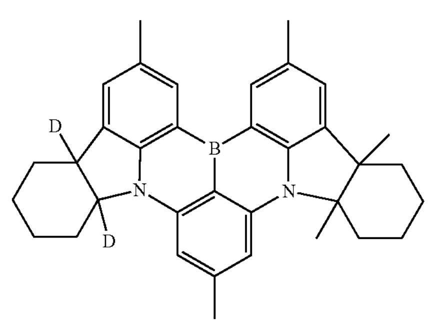

-continued
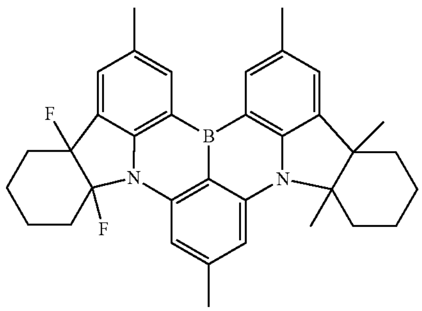
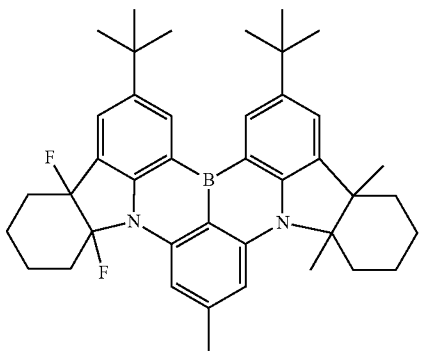
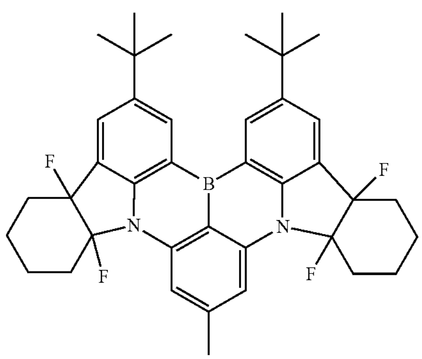
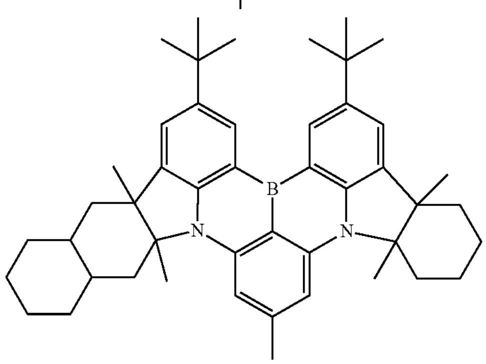
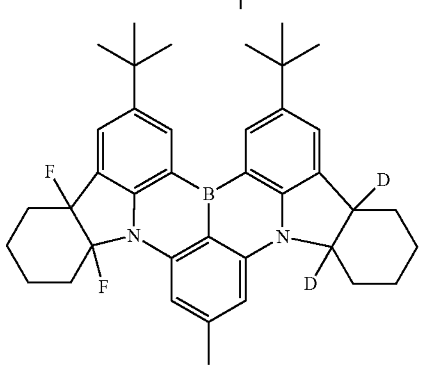
-continued
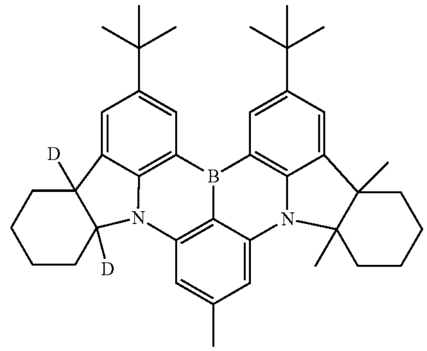
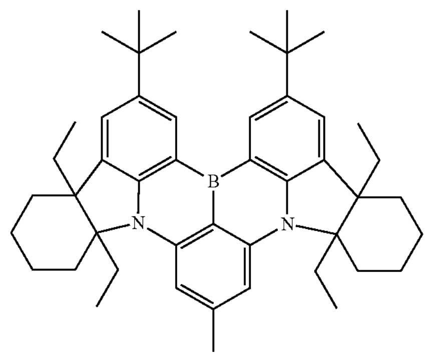
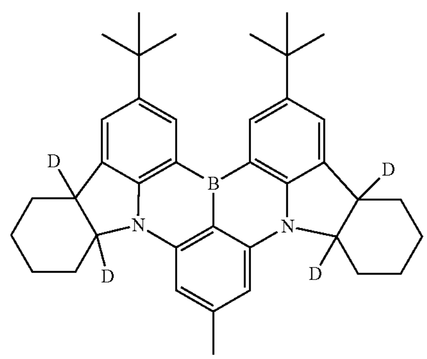
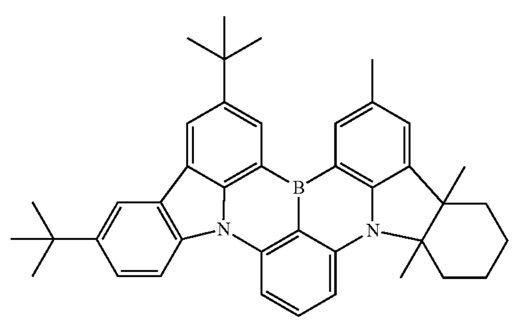
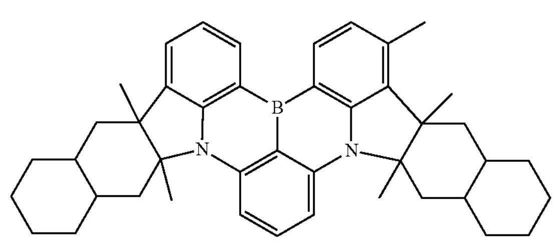

-continued
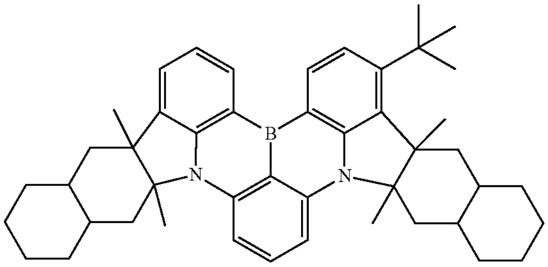
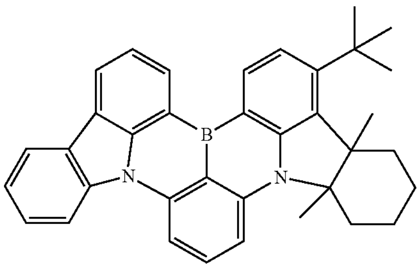
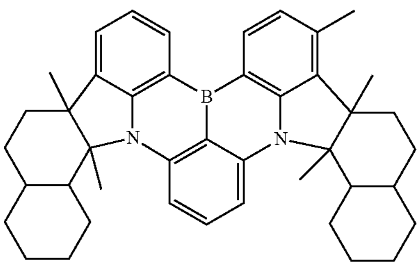
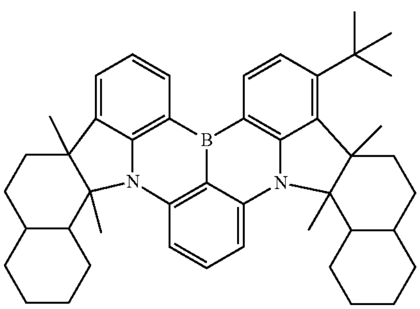
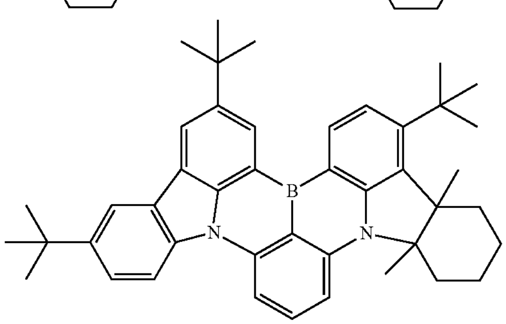
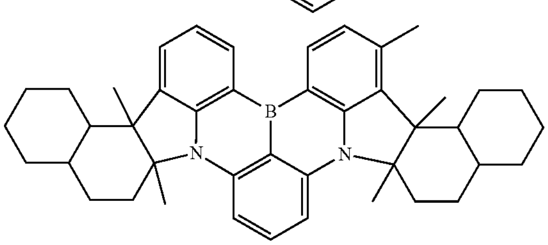
-continued
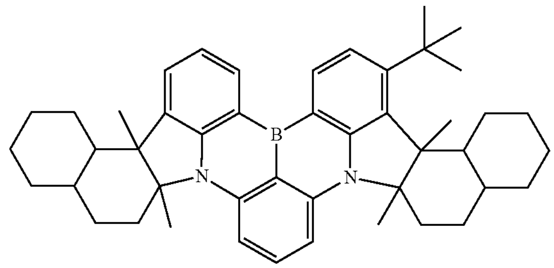
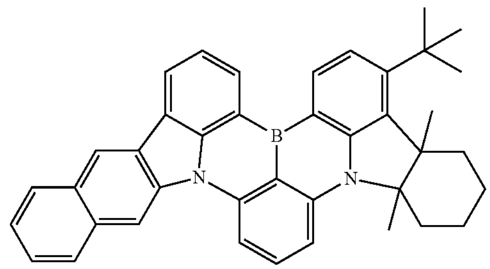
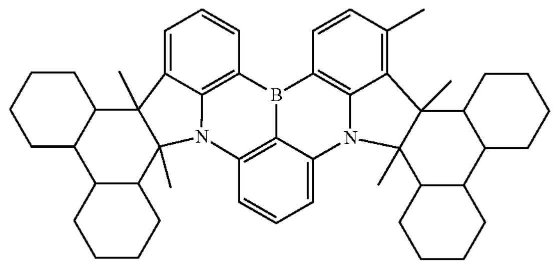
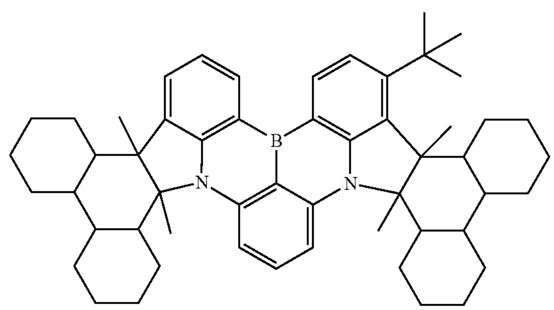
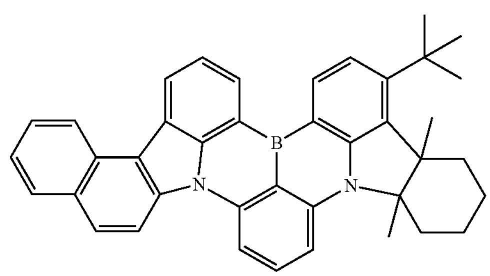
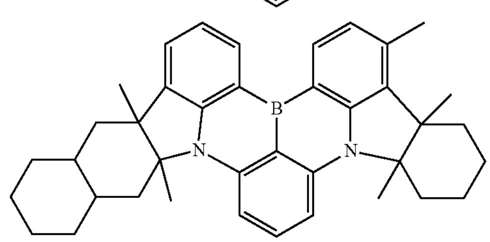

-continued
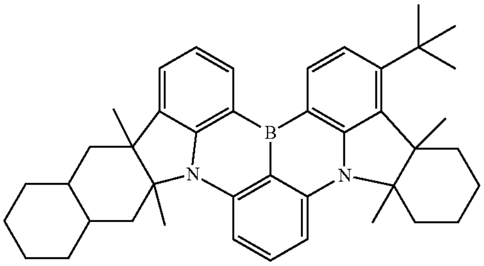
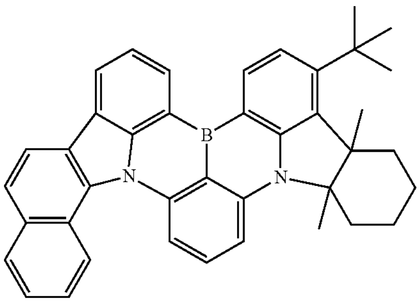
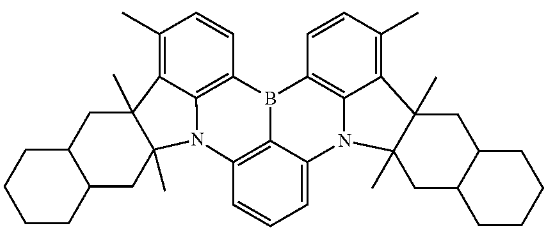
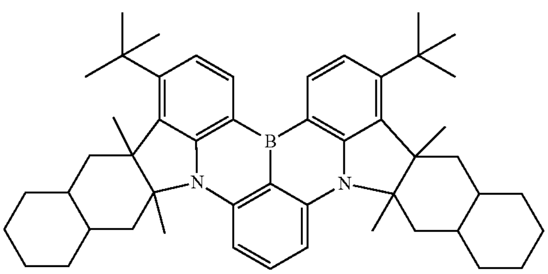
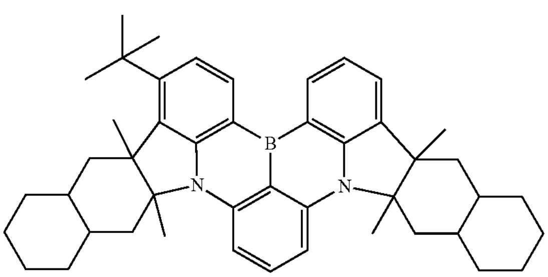
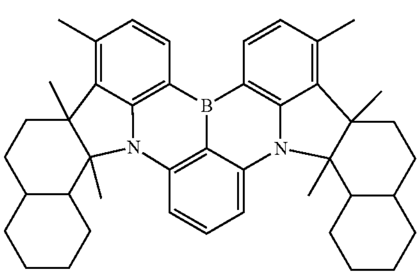
-continued
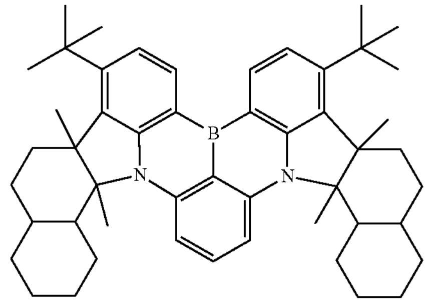
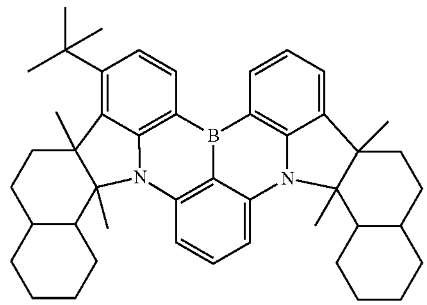
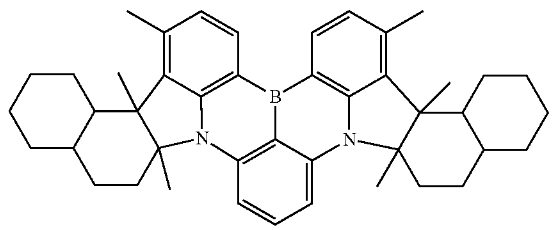
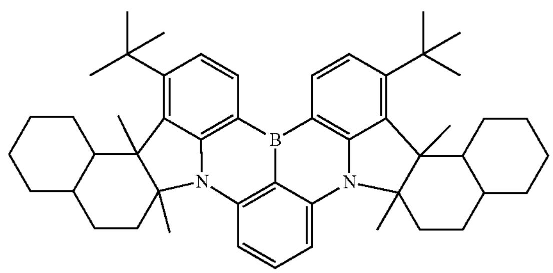
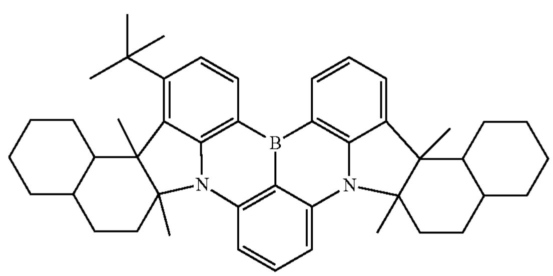
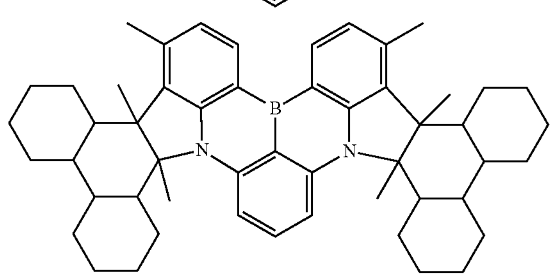

-continued
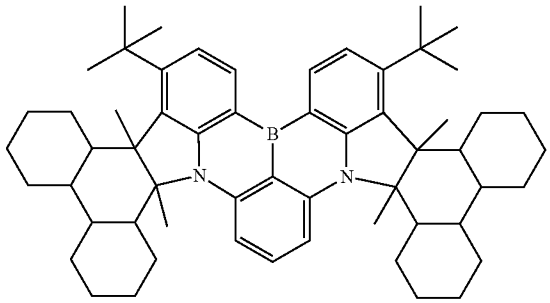
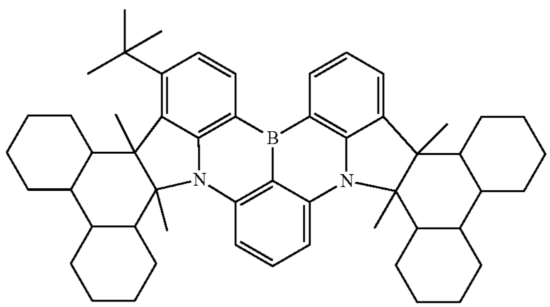
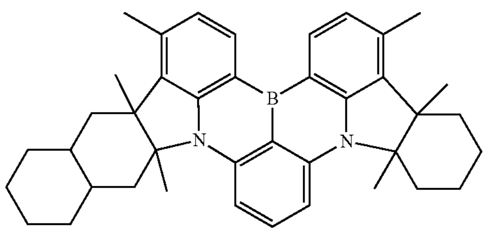
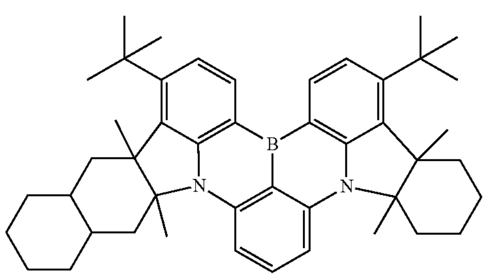
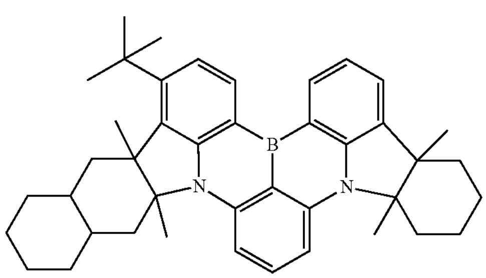
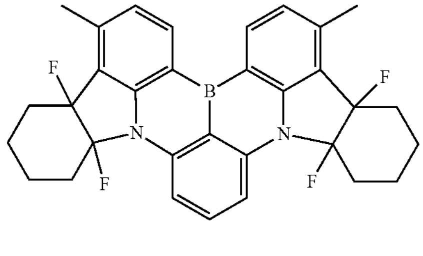
-continued
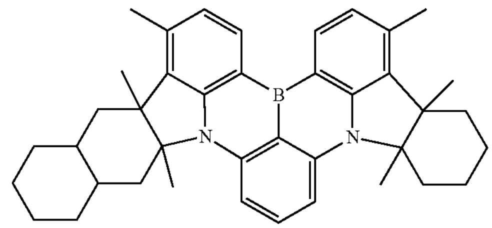
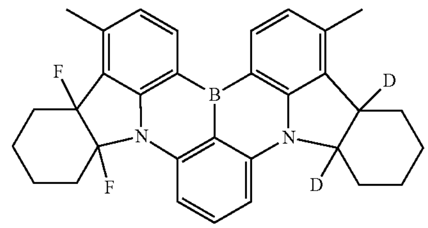
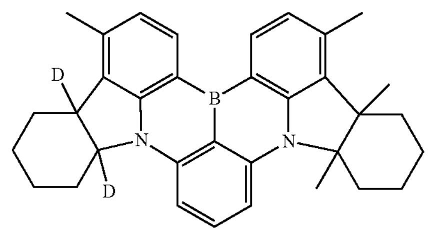
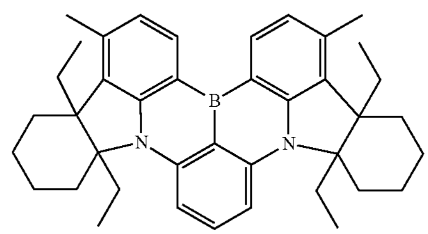
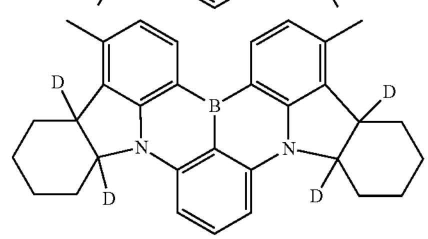
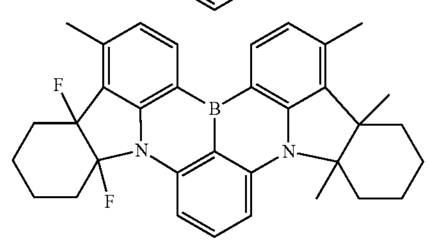
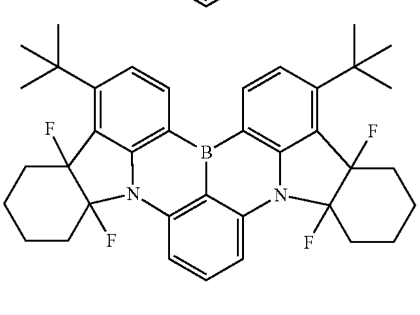

-continued
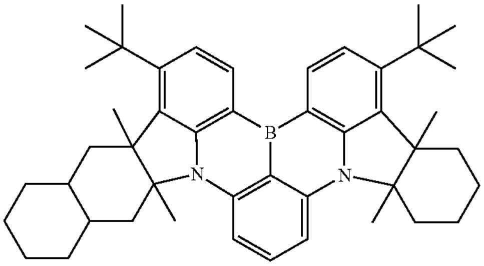
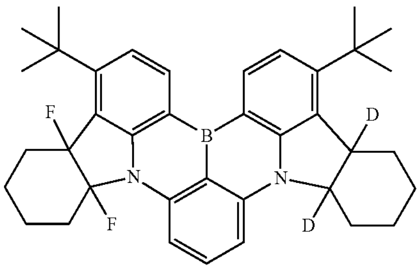
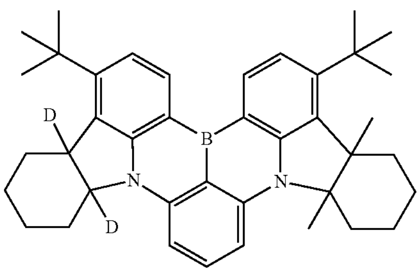
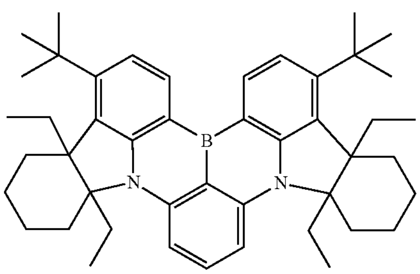
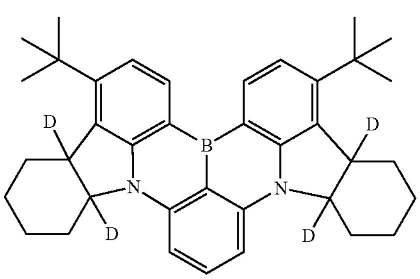
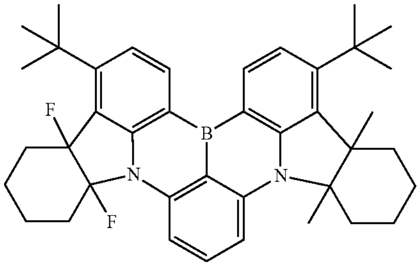
-continued
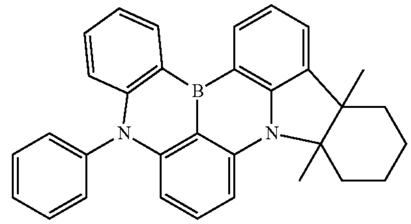
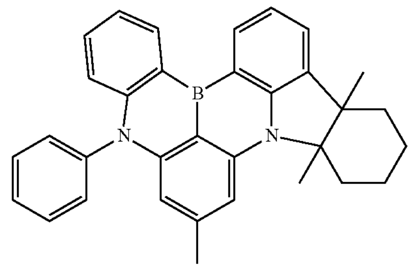
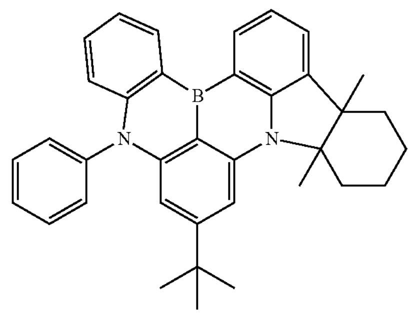
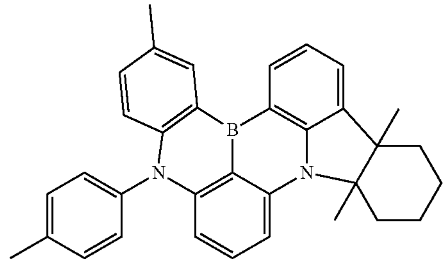
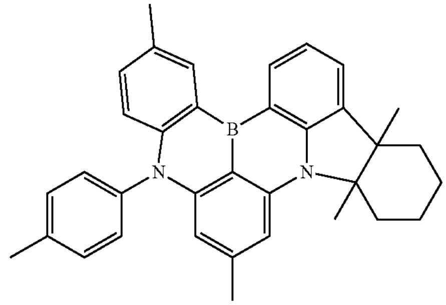
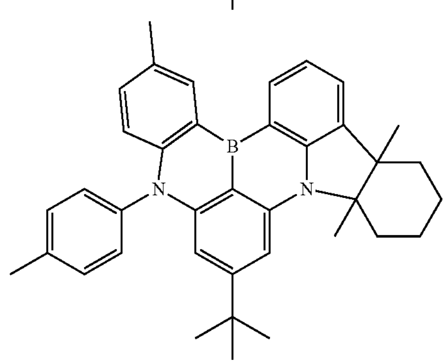

-continued
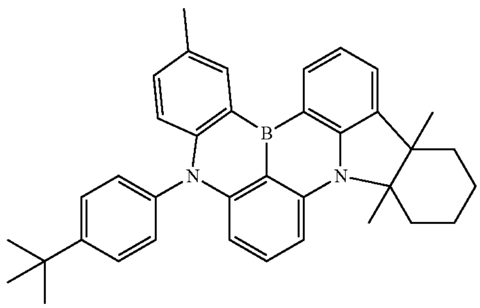
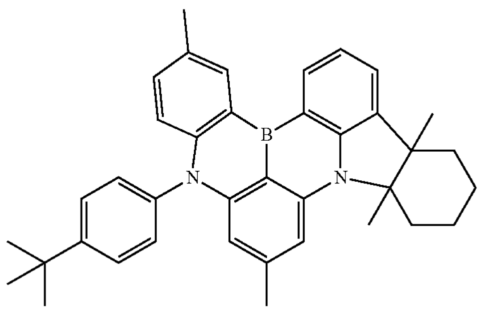
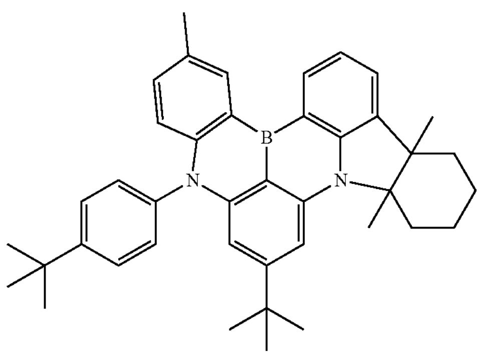
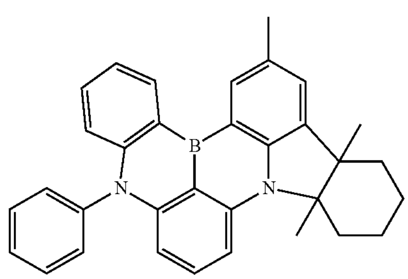
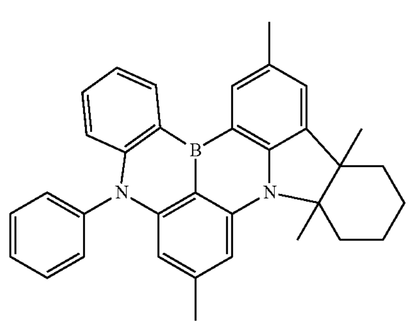
-continued
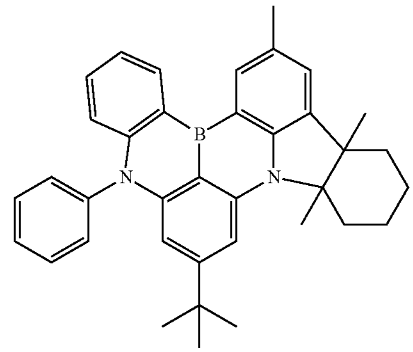
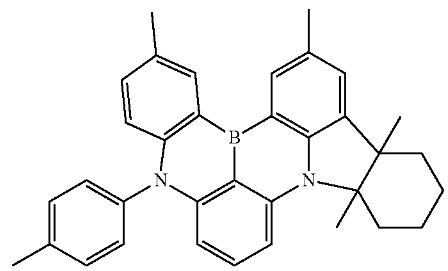
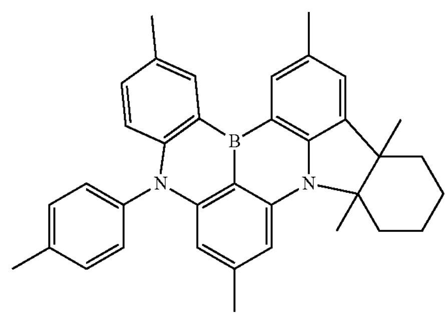
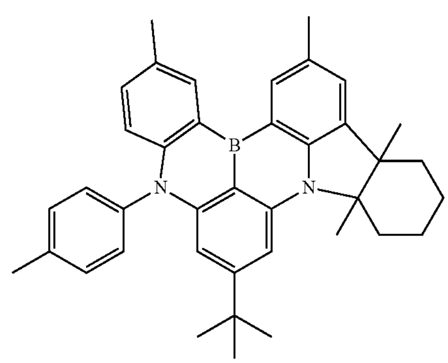
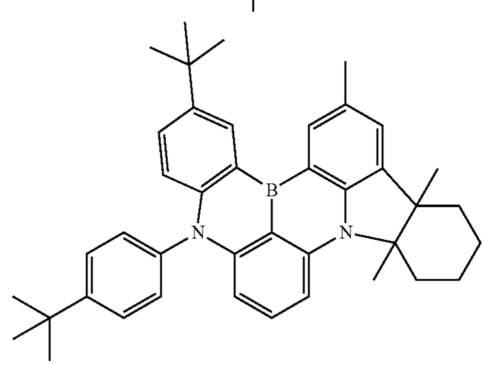

-continued
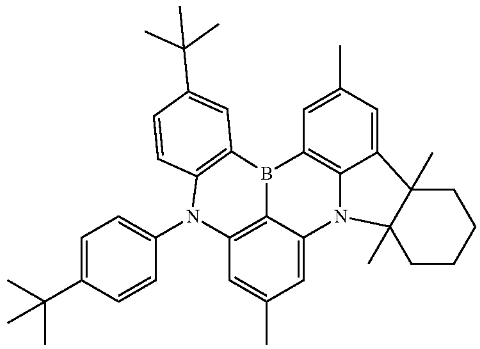
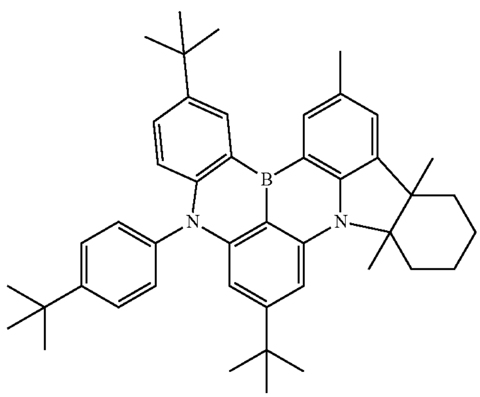
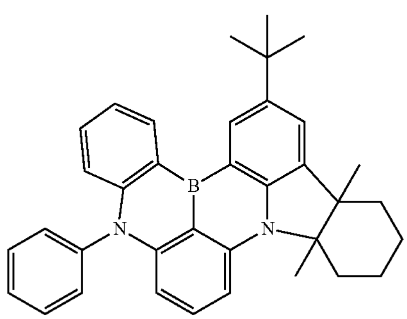
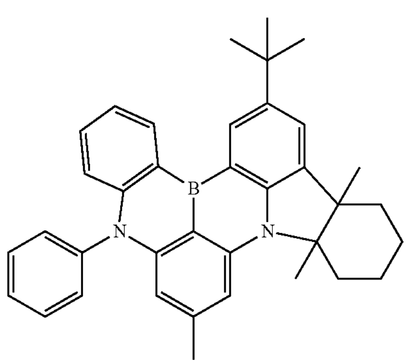
-continued
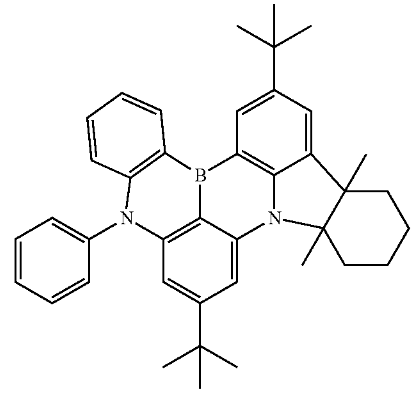
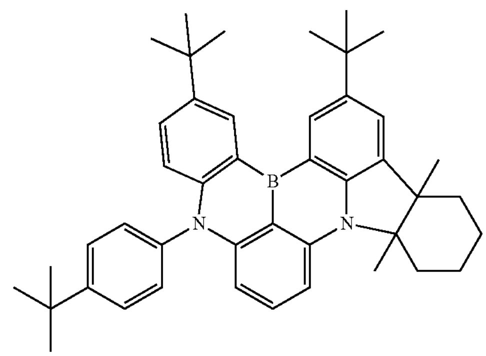
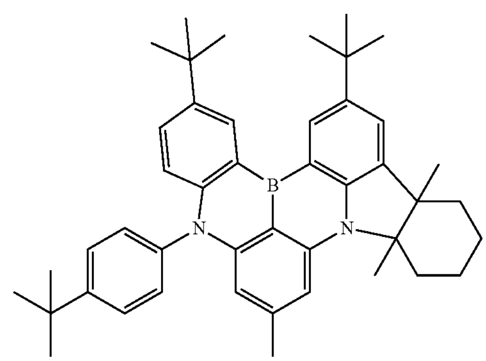
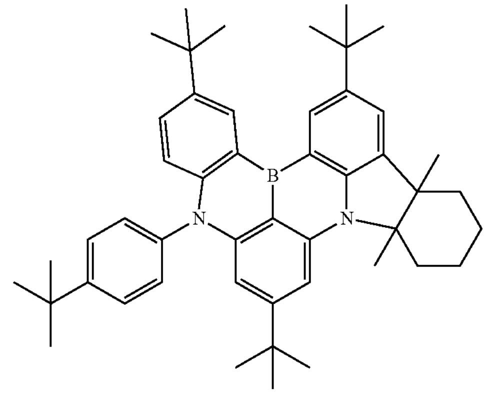

-continued
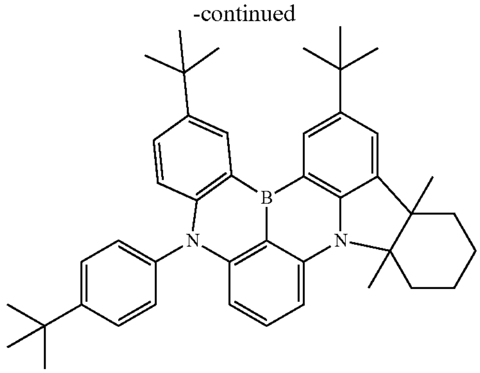
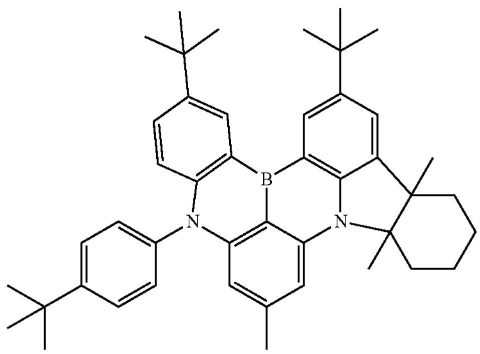
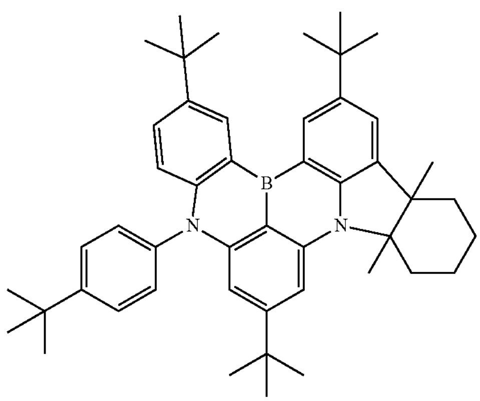
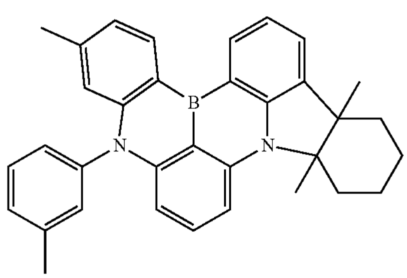
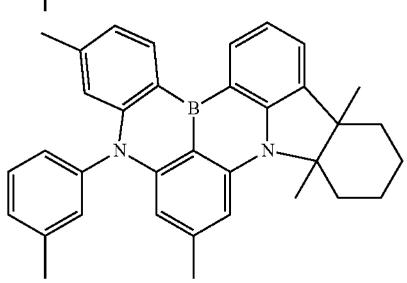
-continued
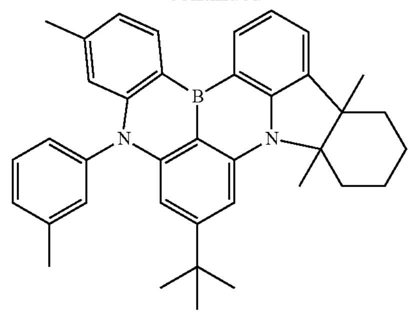
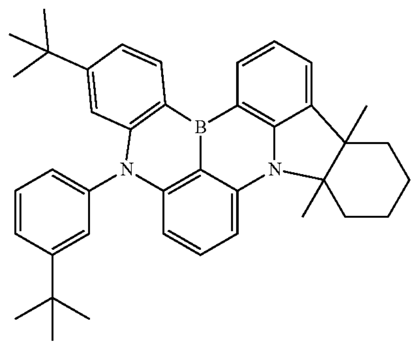
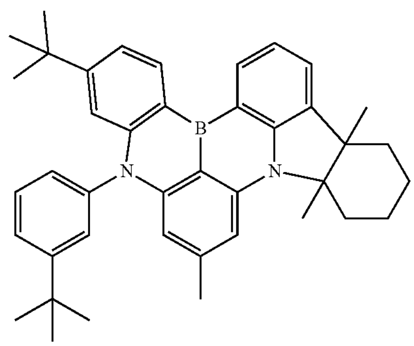
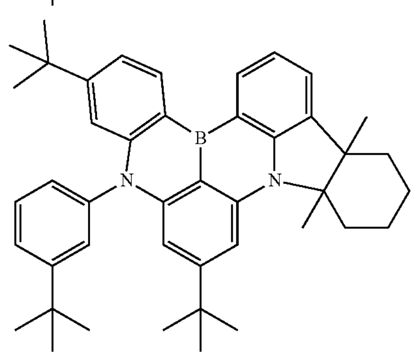
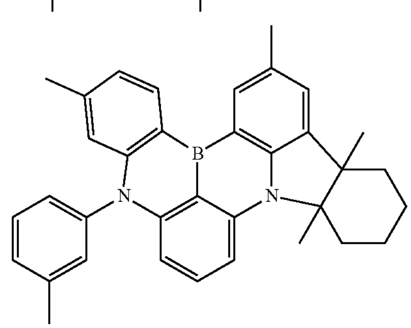

-continued
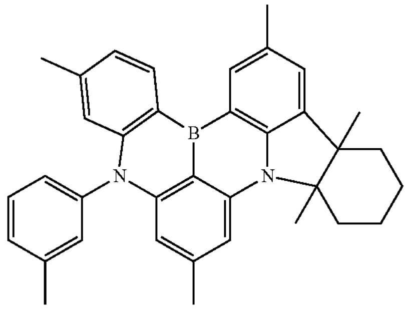
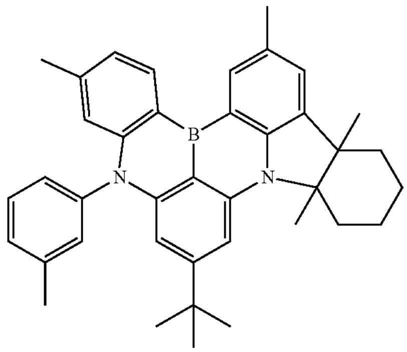
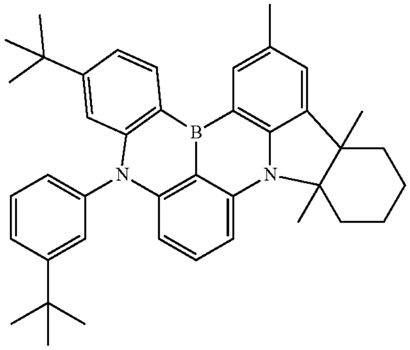
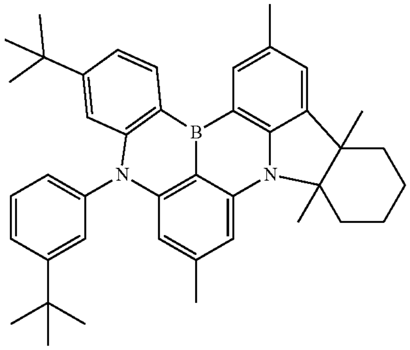
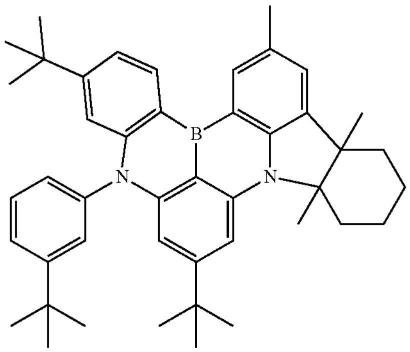
-continued
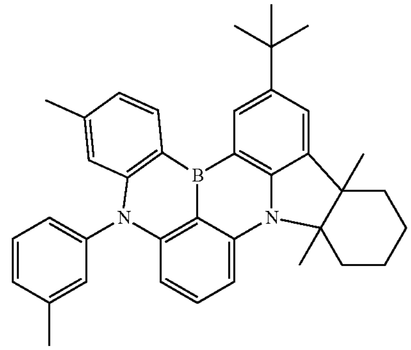
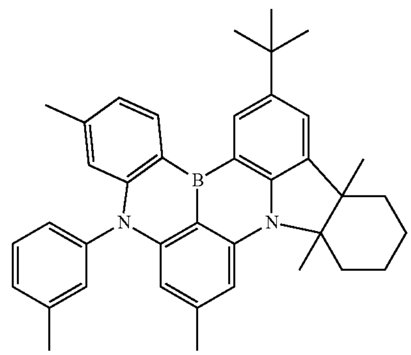
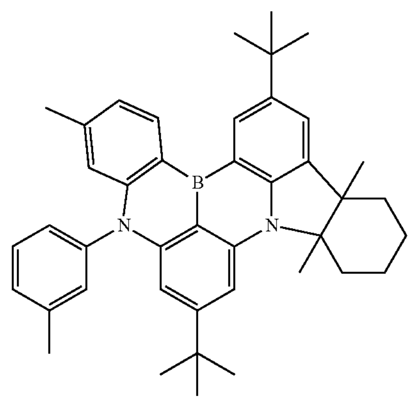
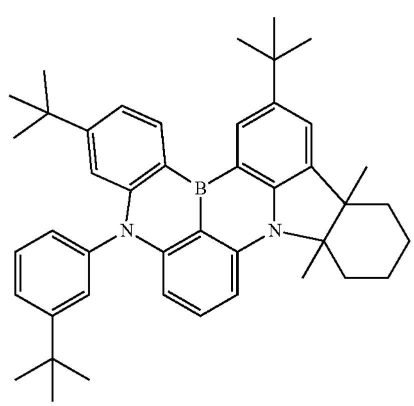

-continued
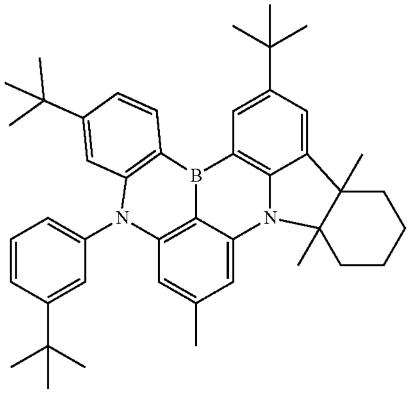
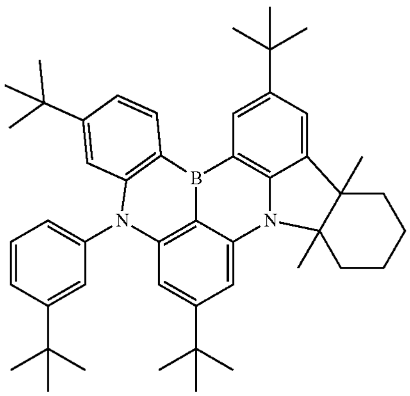
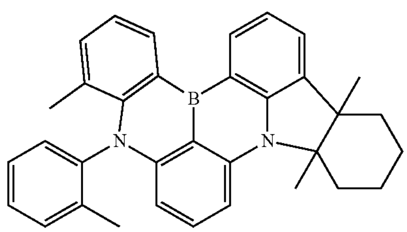
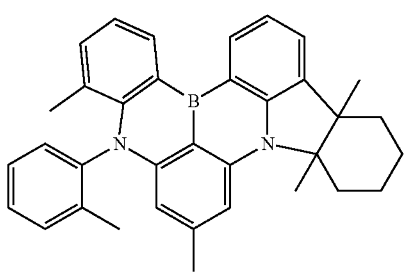
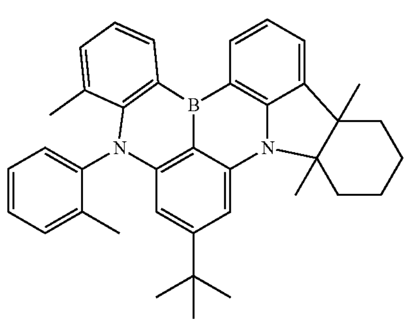
-continued
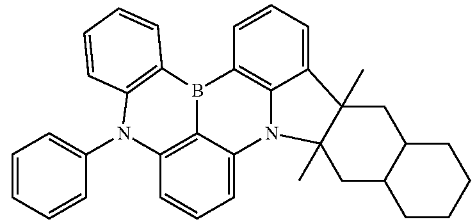
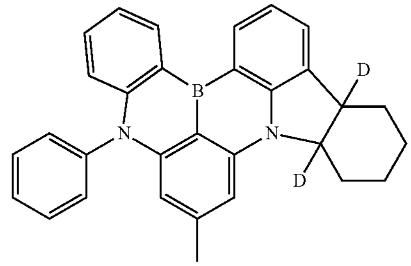
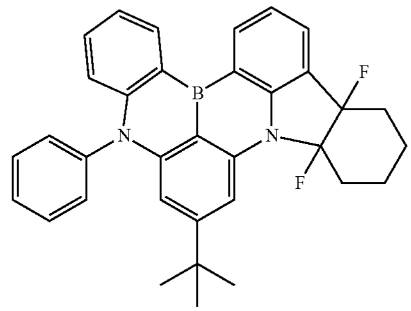
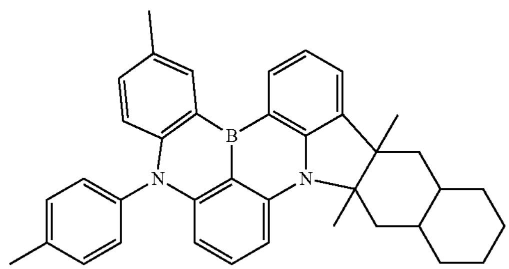
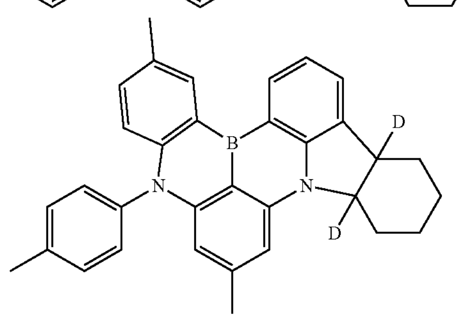
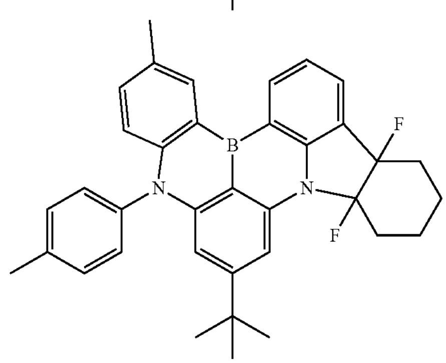

-continued
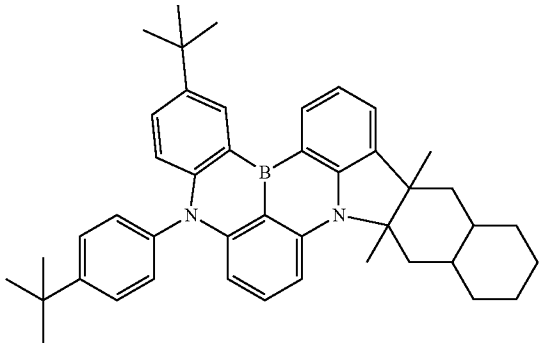
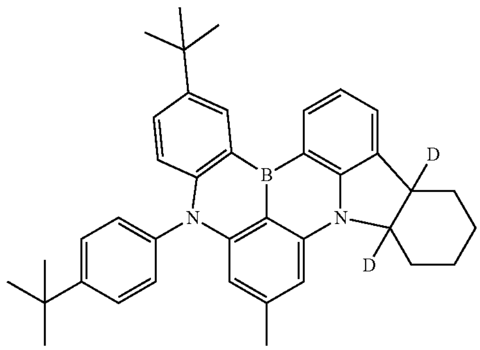
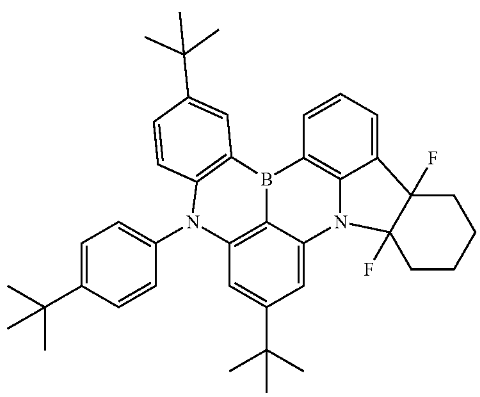
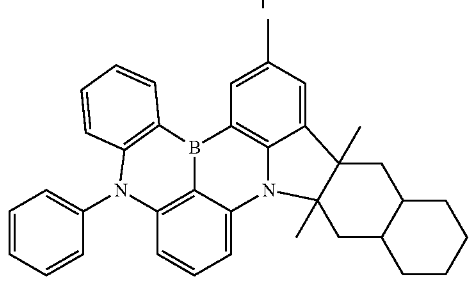
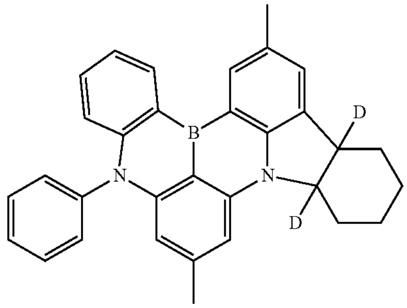
-continued
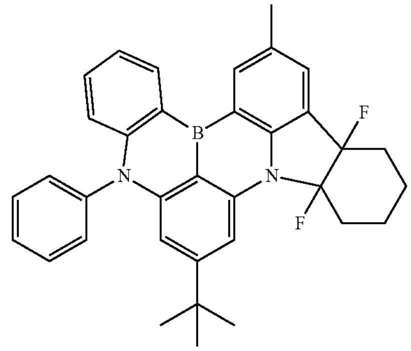
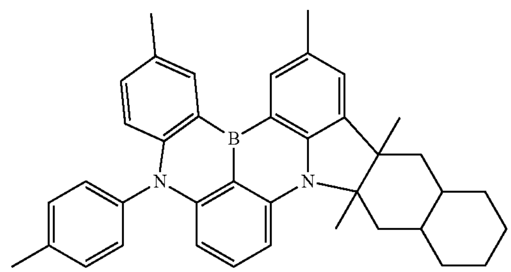
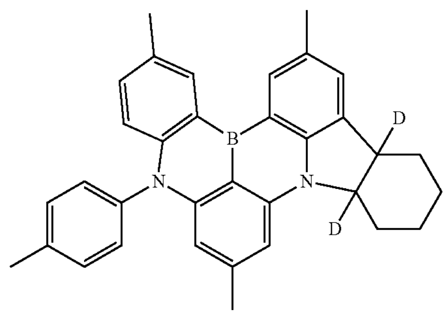
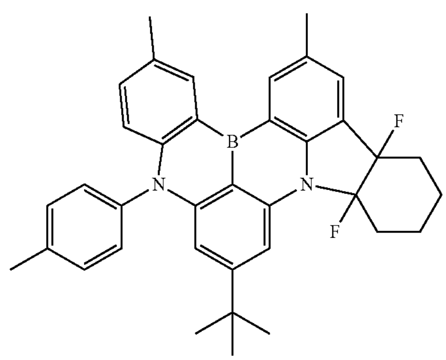
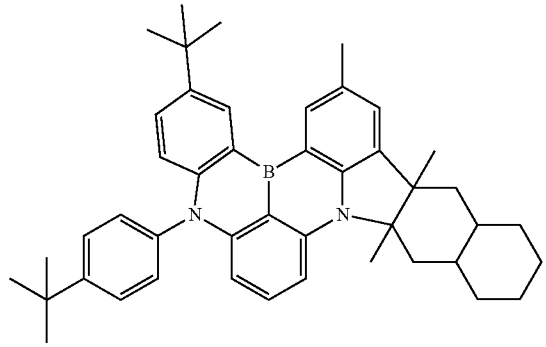

-continued
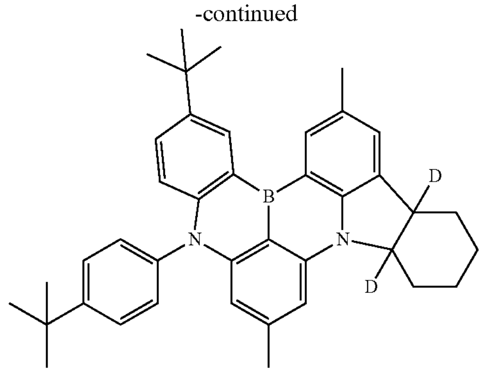
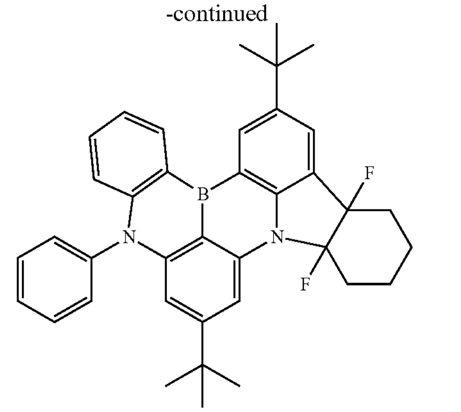
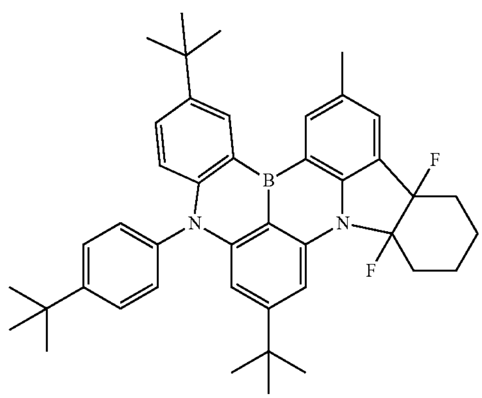
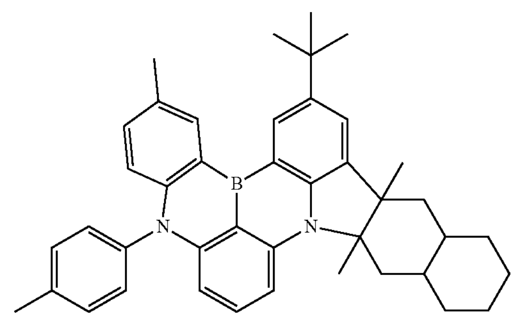
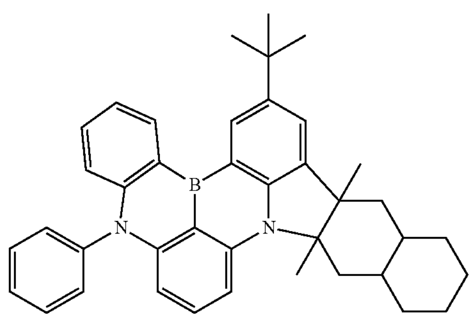
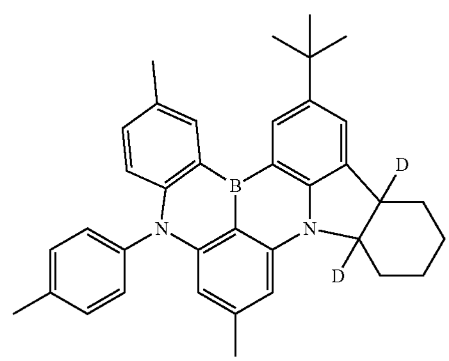
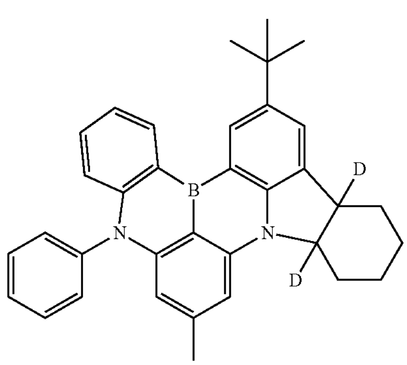
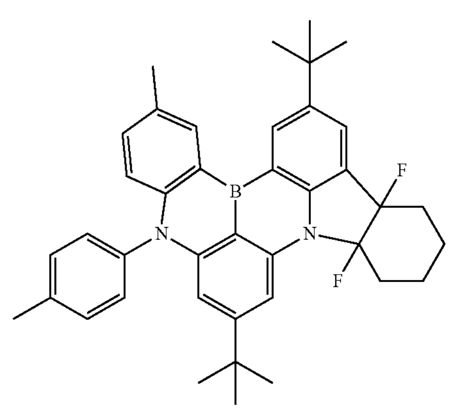
-continued -continued
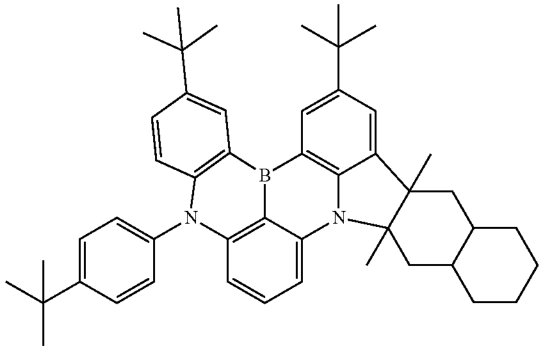
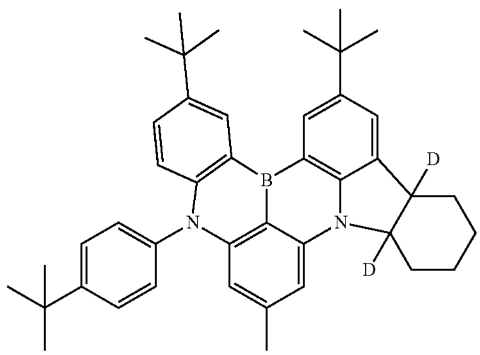
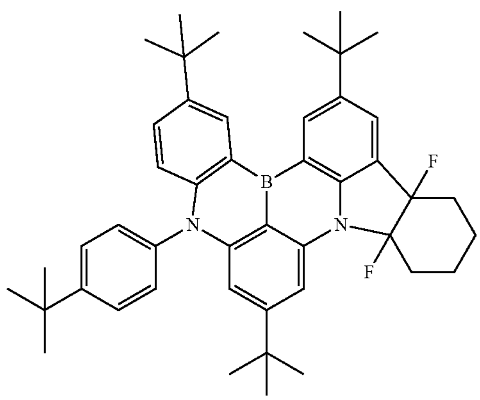
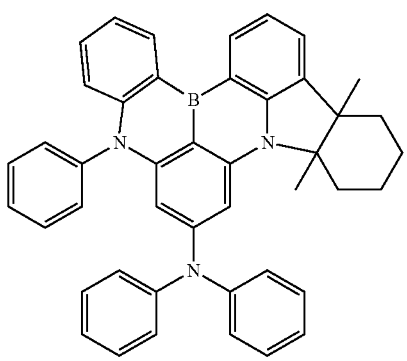
-continued
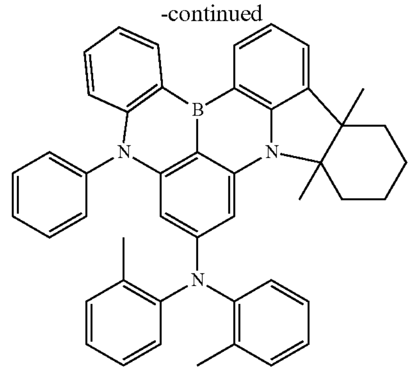
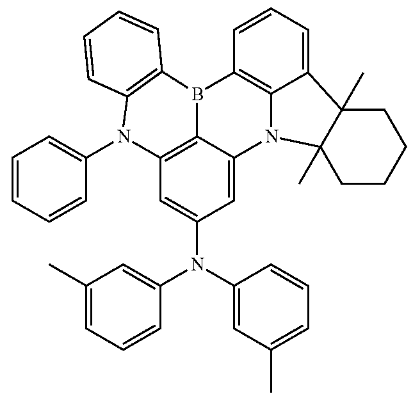
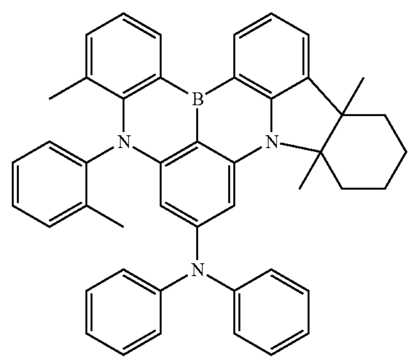
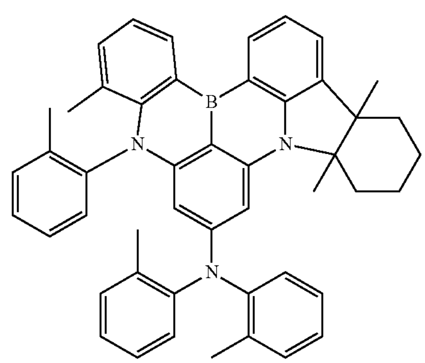

-continued
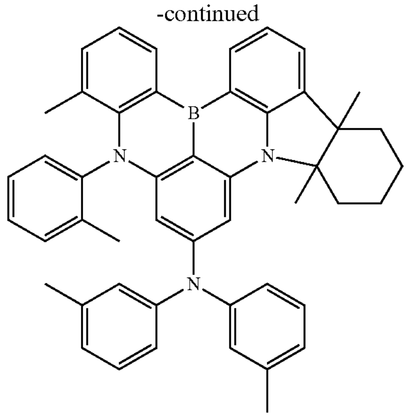
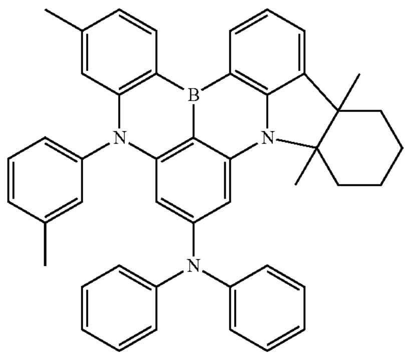
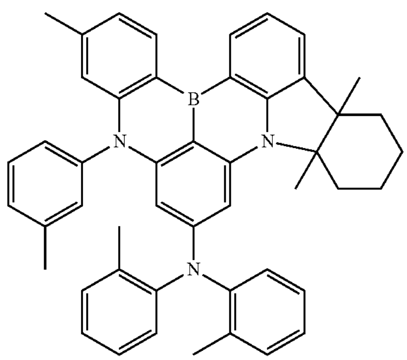
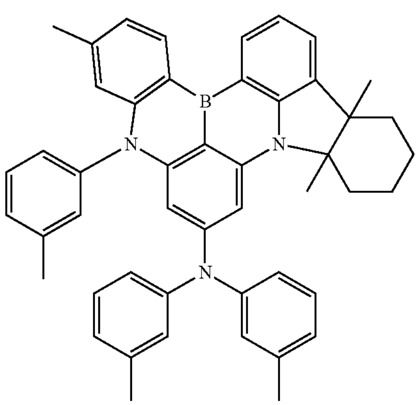
-continued
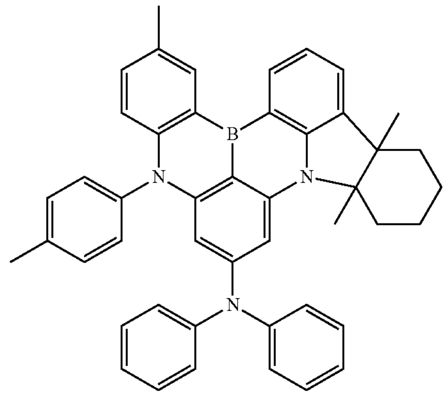
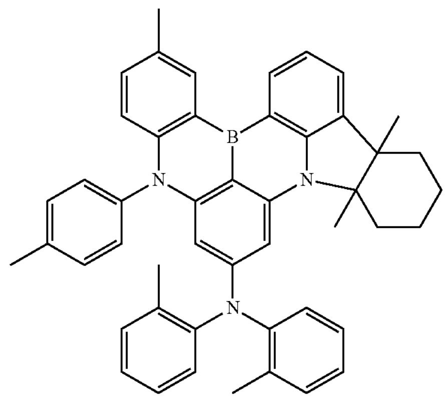
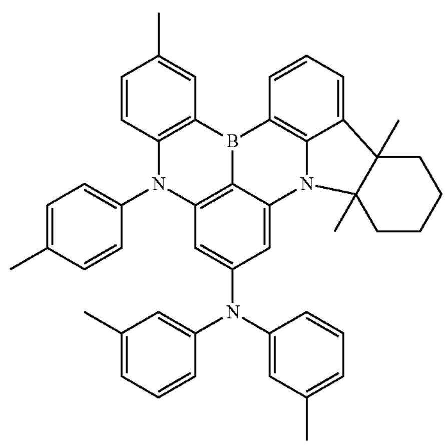
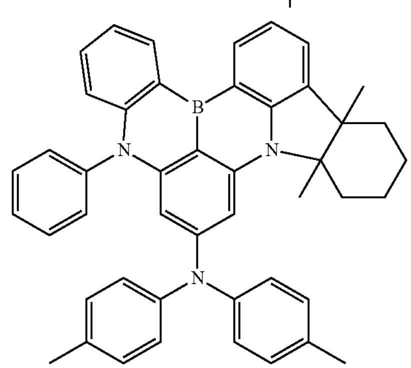

-continued
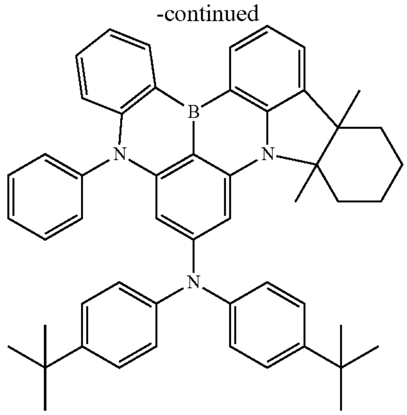
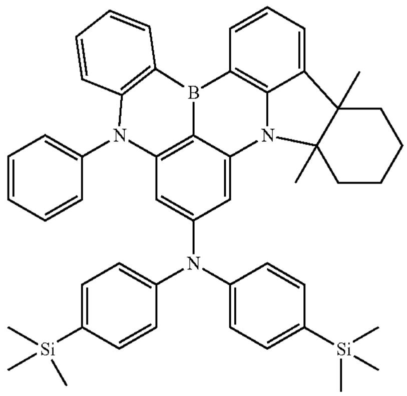
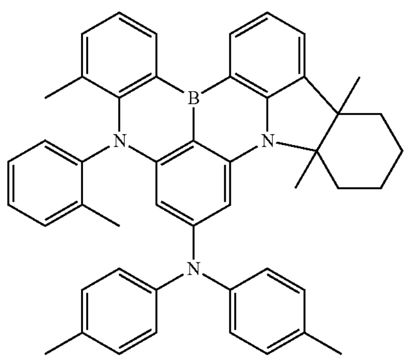
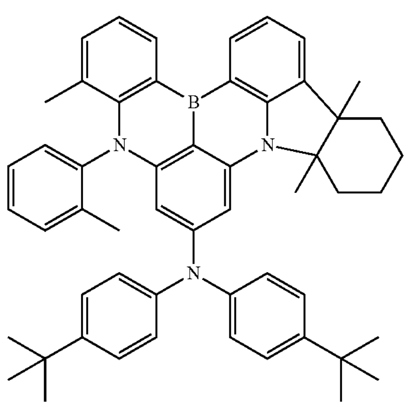
-continued
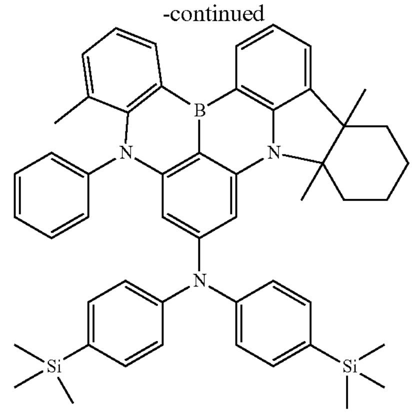
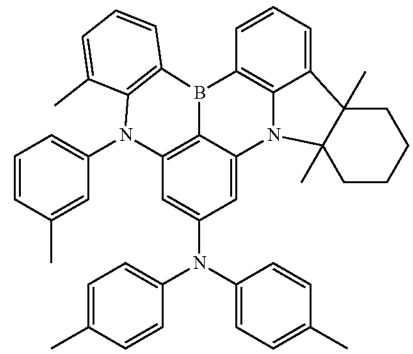
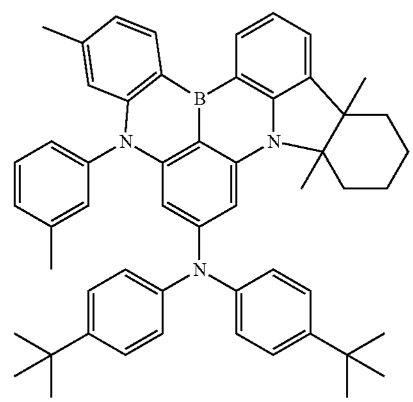
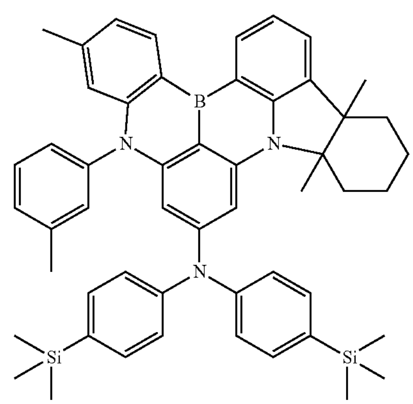

-continued
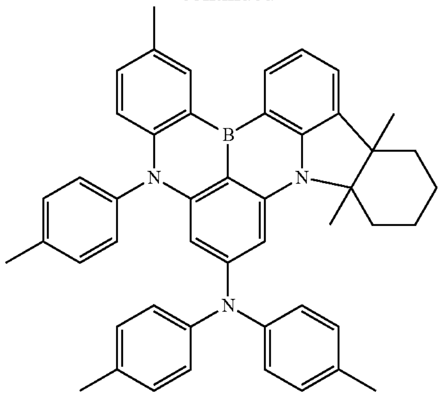
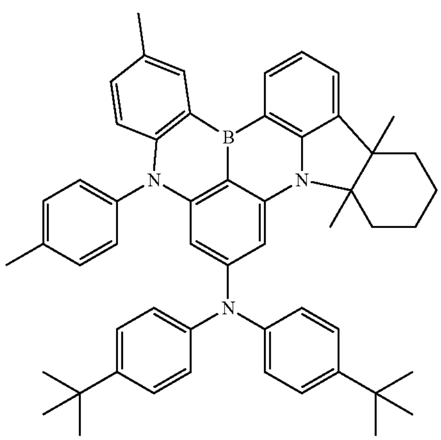
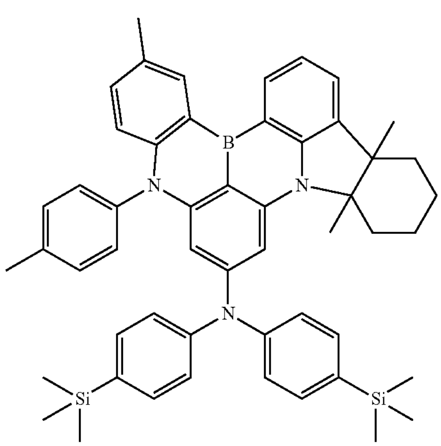
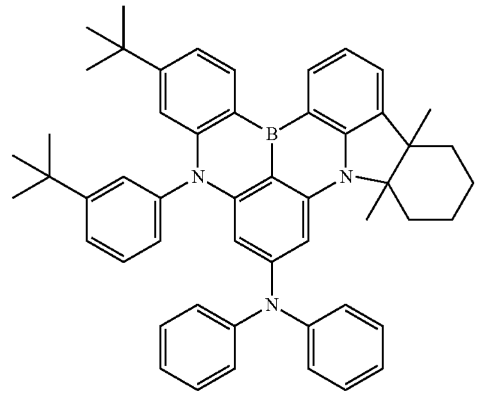
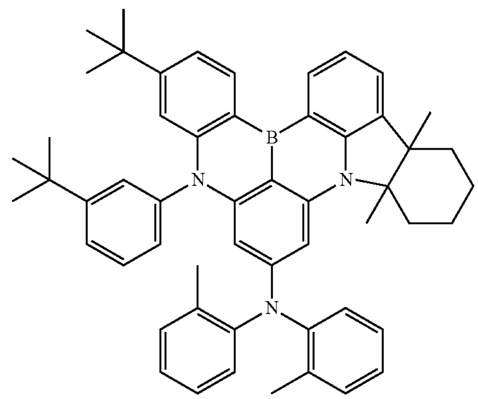
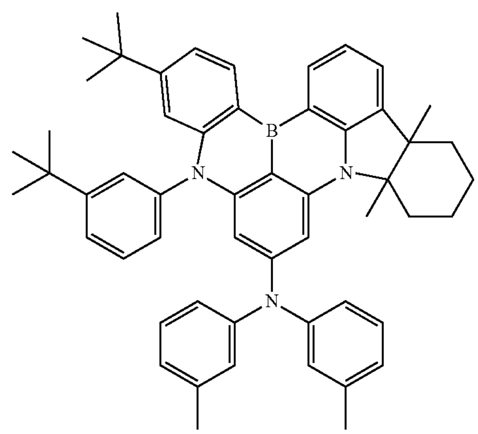
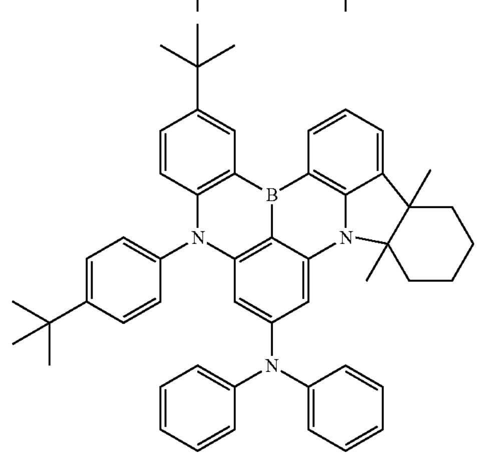

-continued
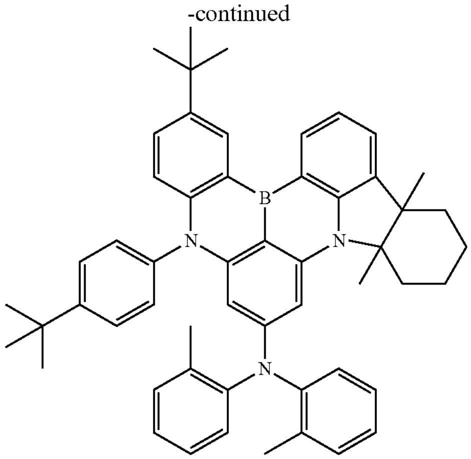
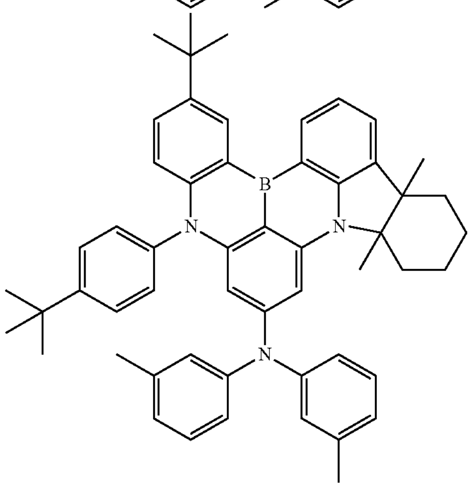
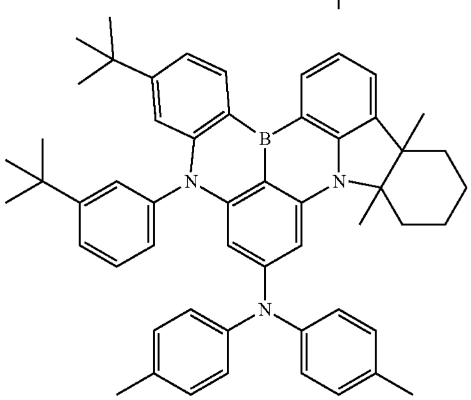
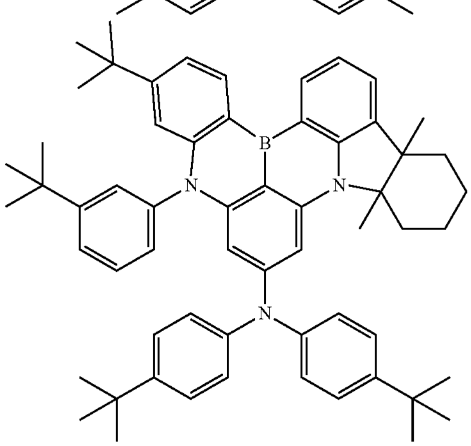
-continued
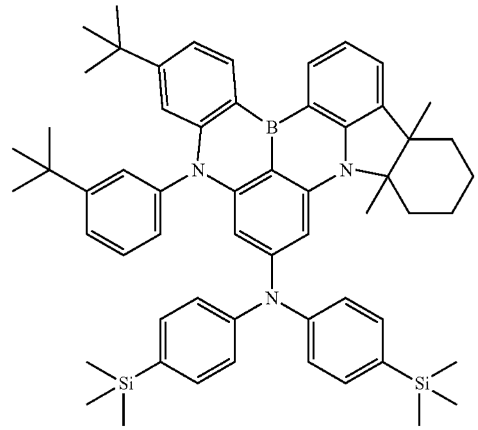
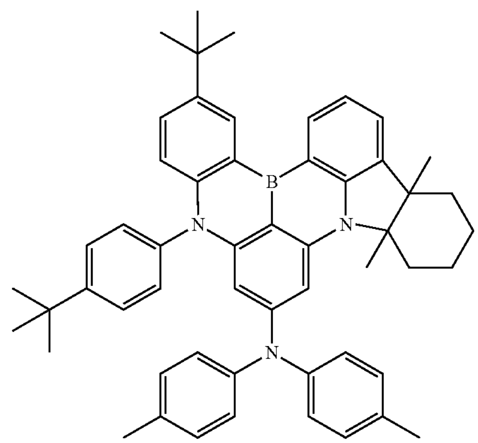
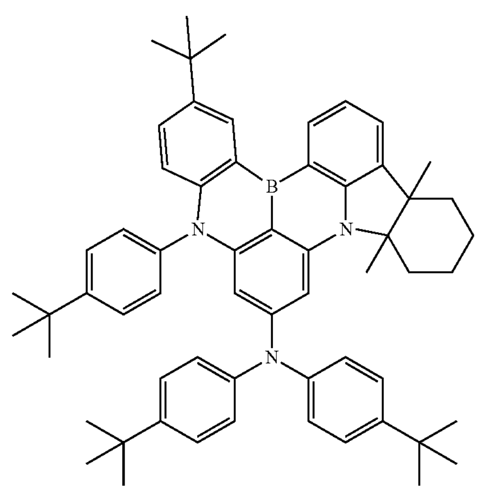

-continued
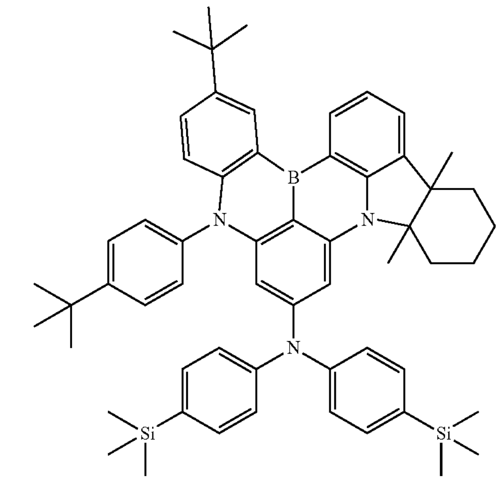
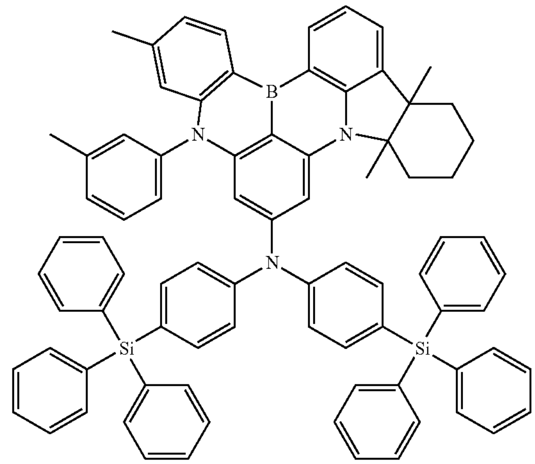
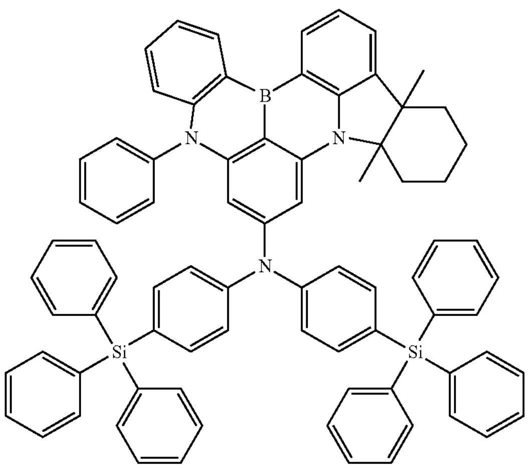
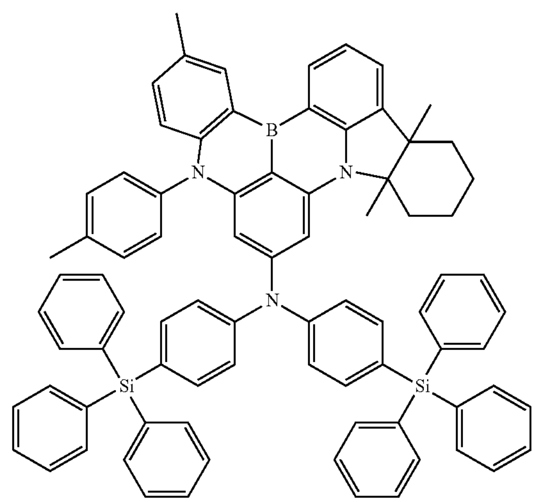
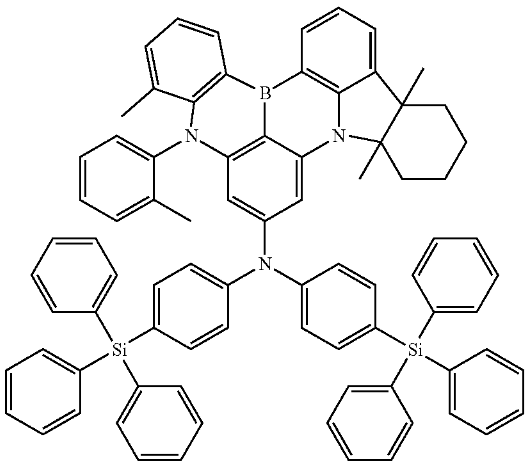
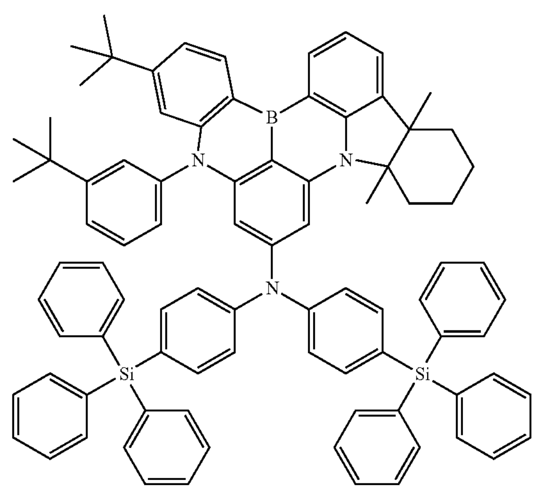
-continued

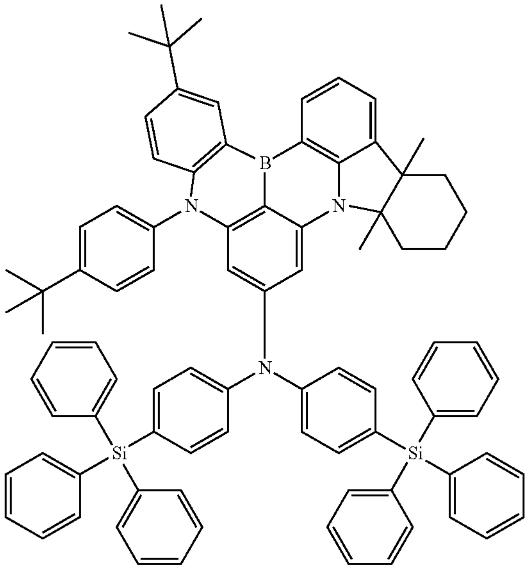
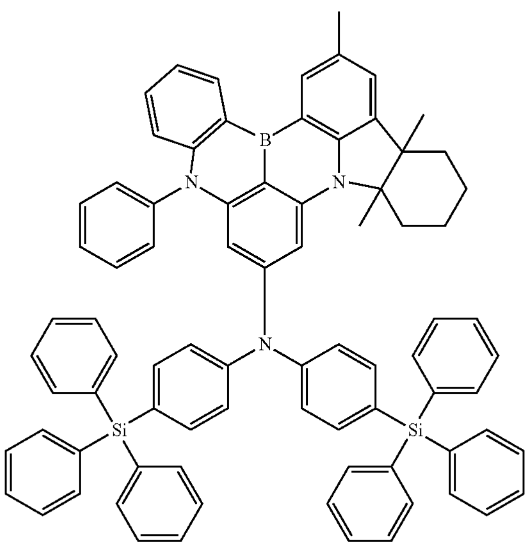
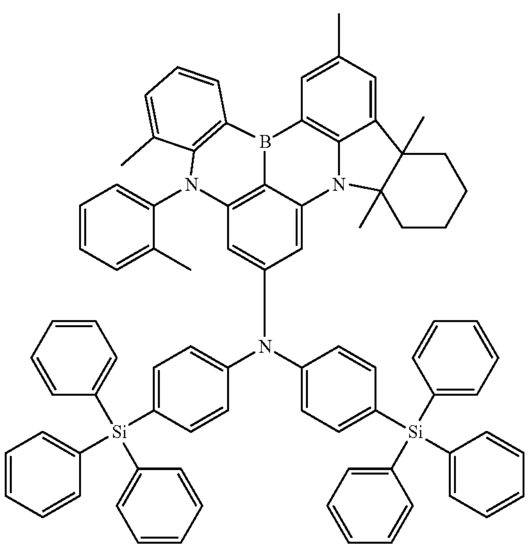
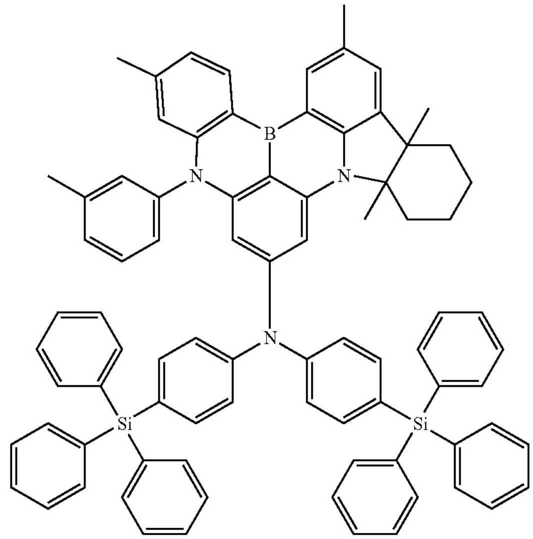
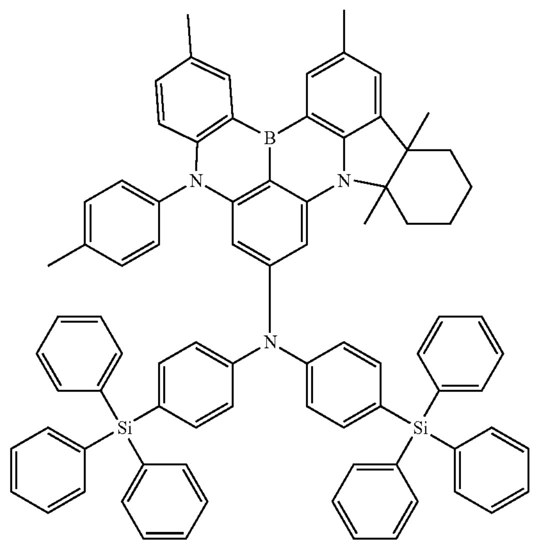
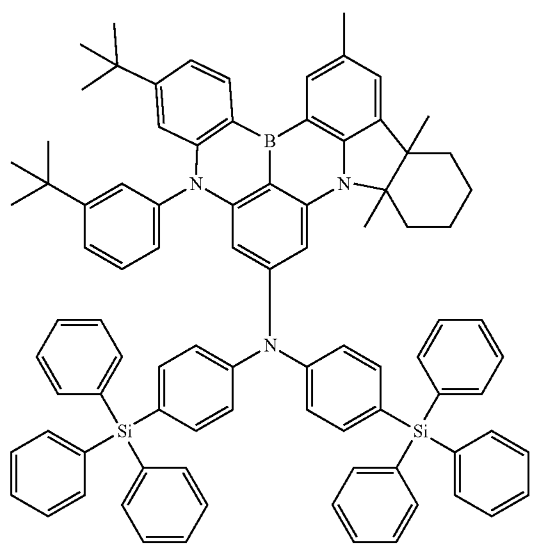

-continued
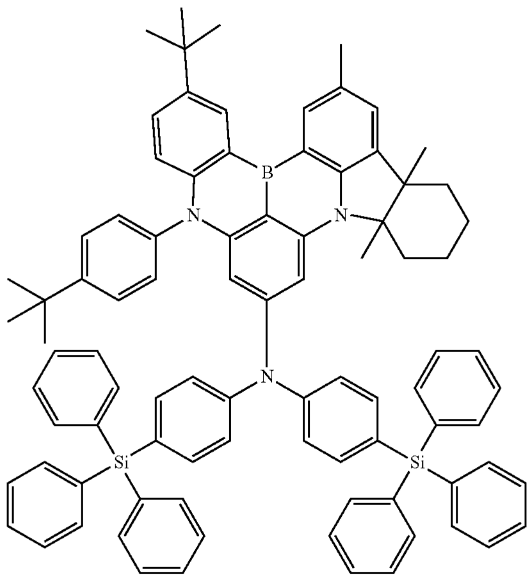
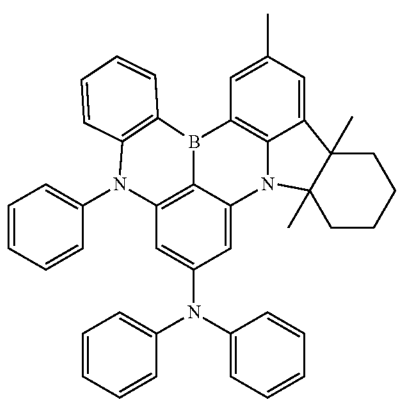
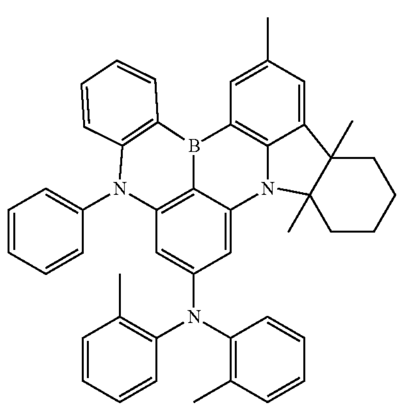
-continued
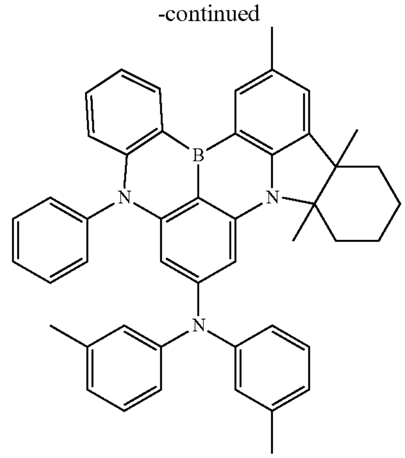
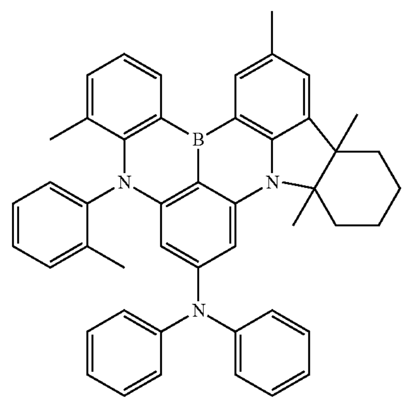
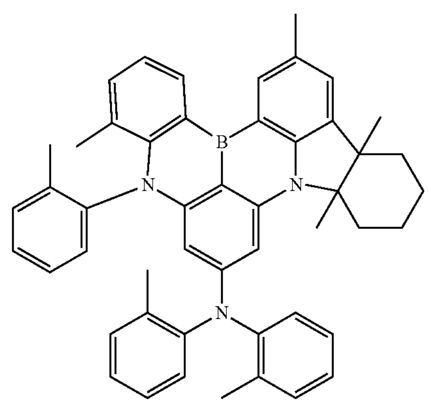
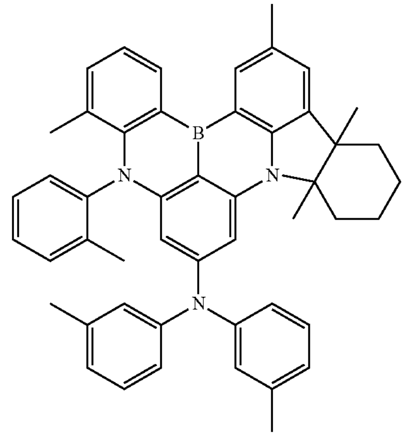

-continued
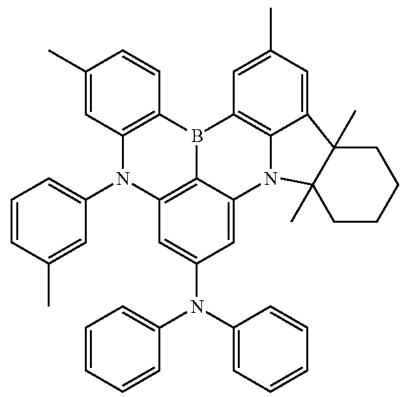
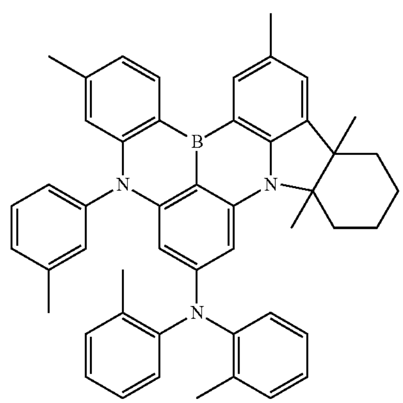
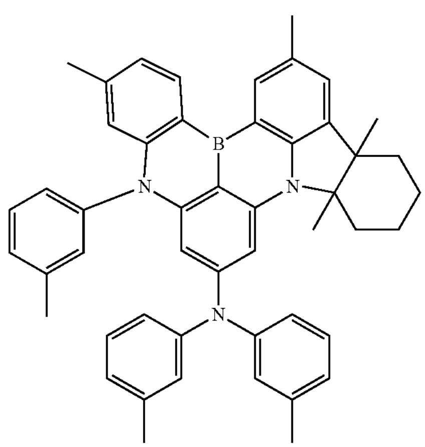
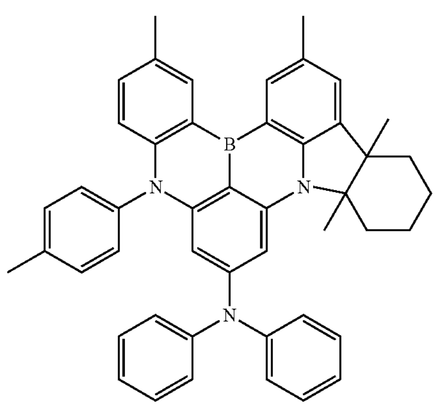
-continued
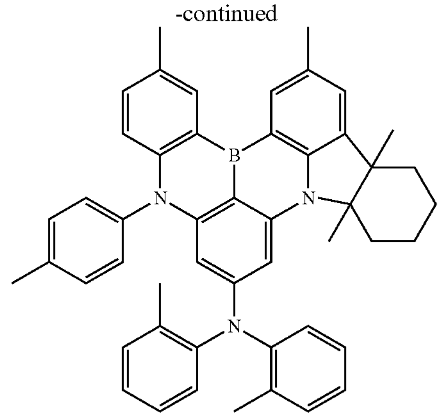
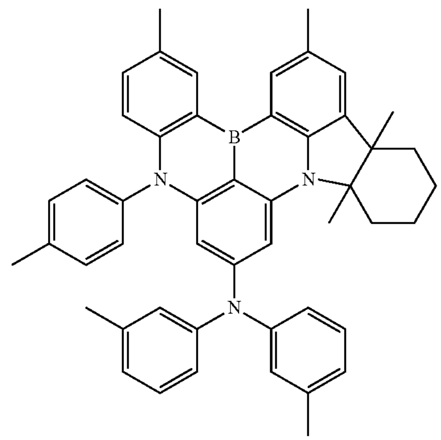
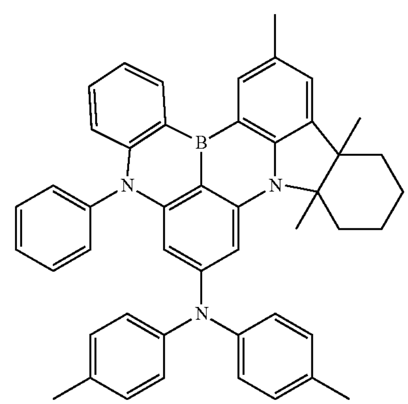
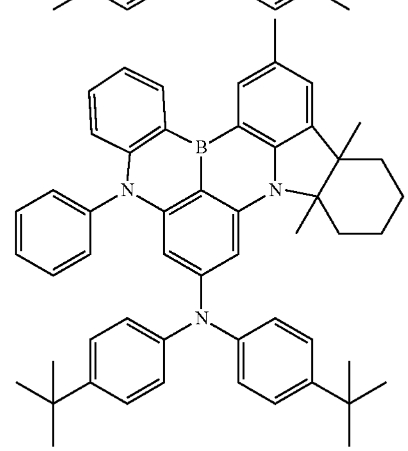

-continued
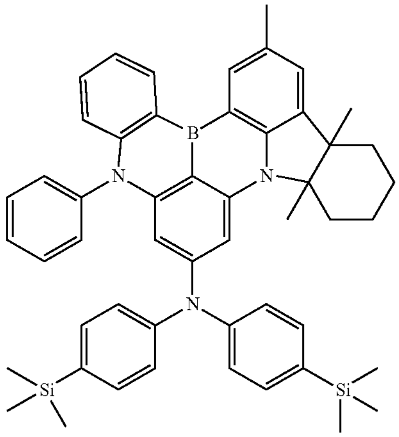
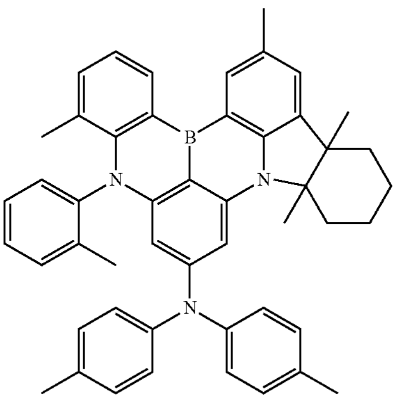
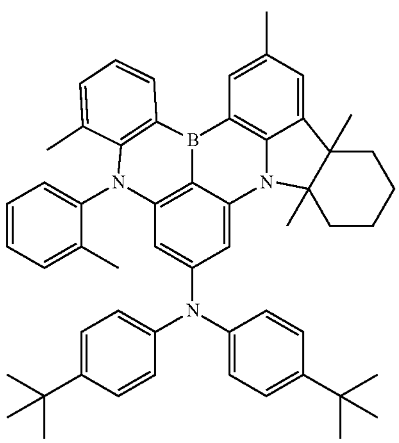
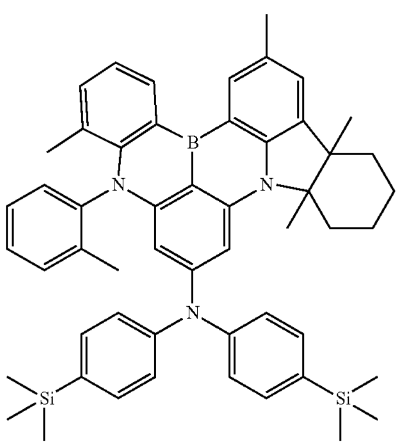
-continued
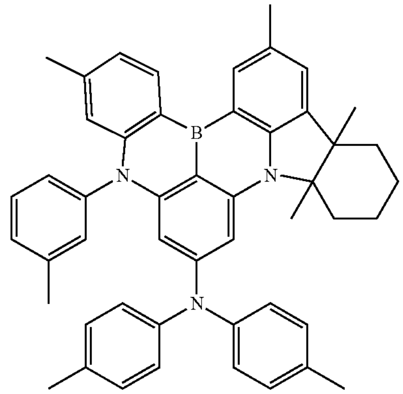
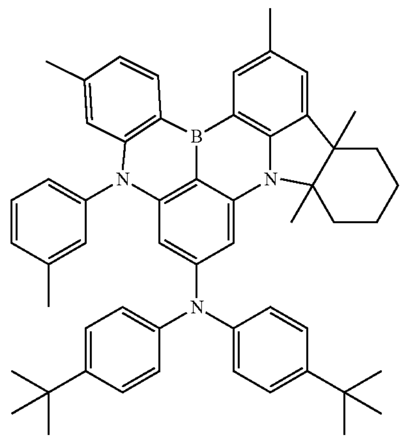
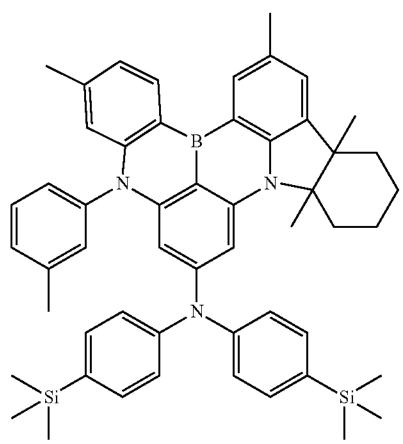
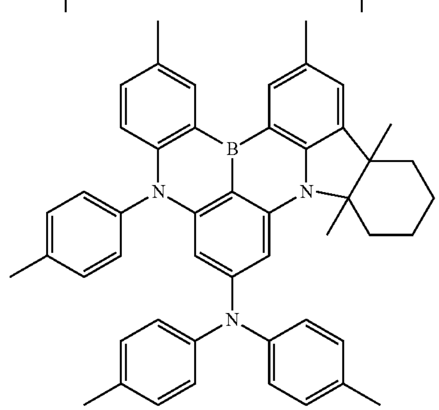

-continued
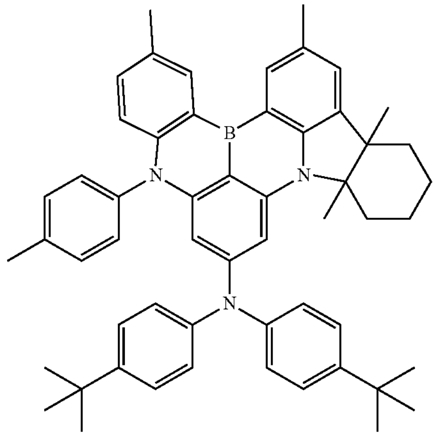
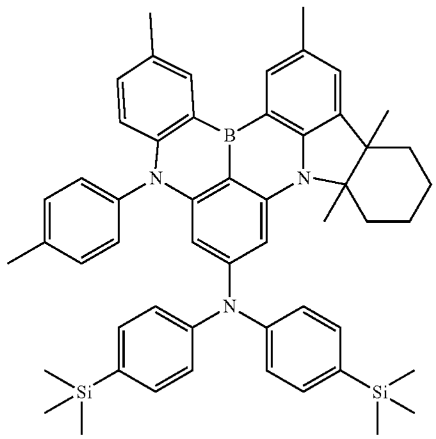
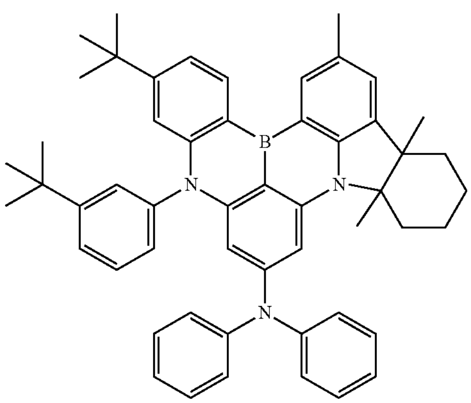
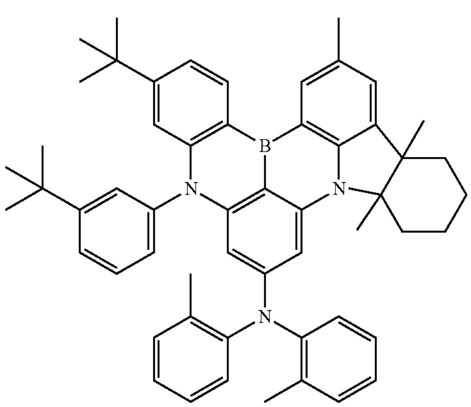
-continued
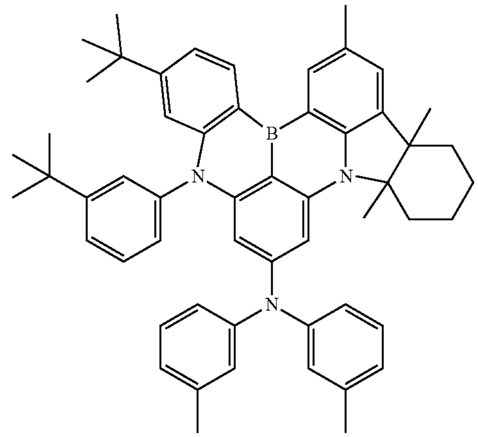
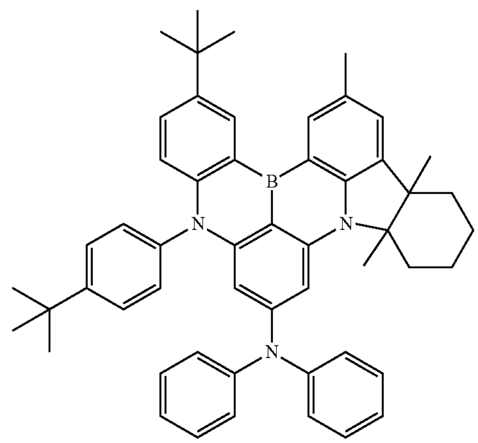
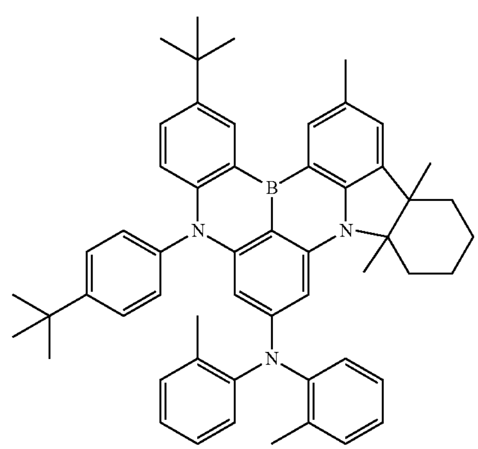

-continued
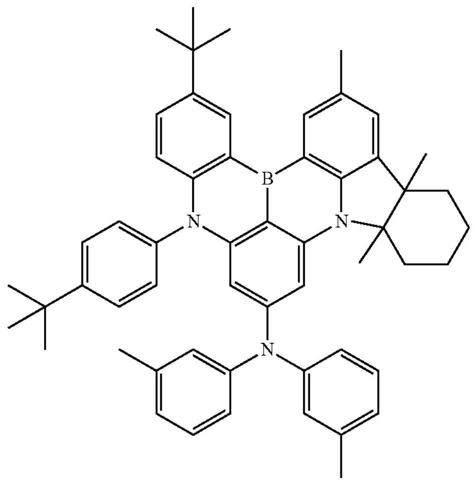
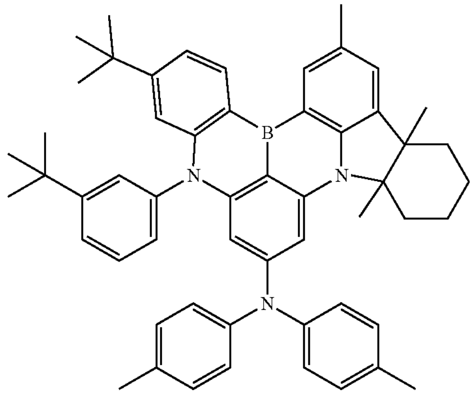
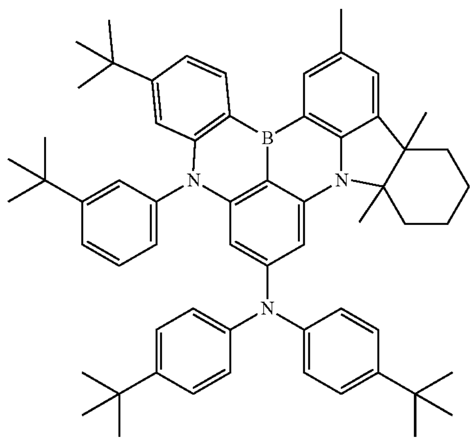
-continued
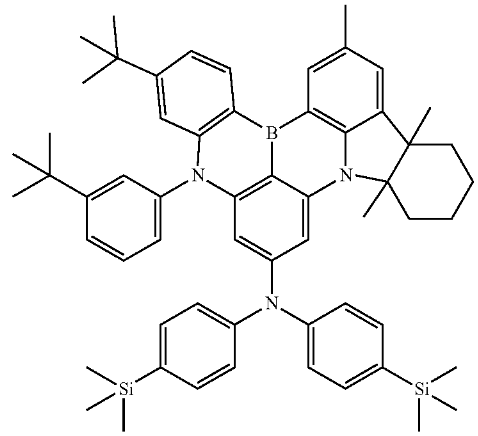
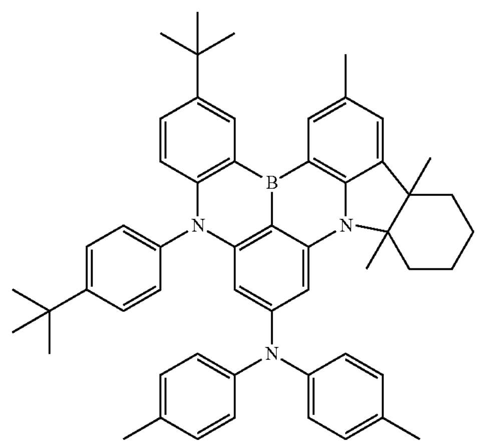
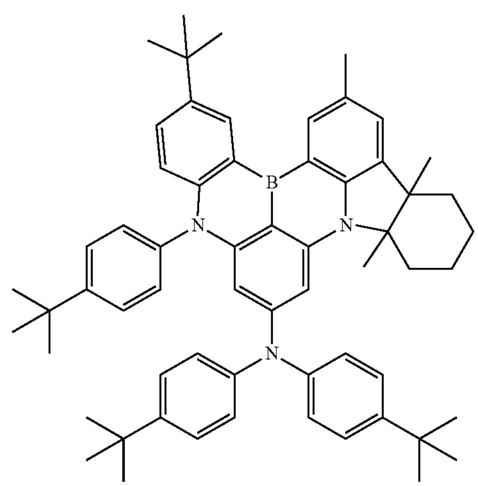

-continued
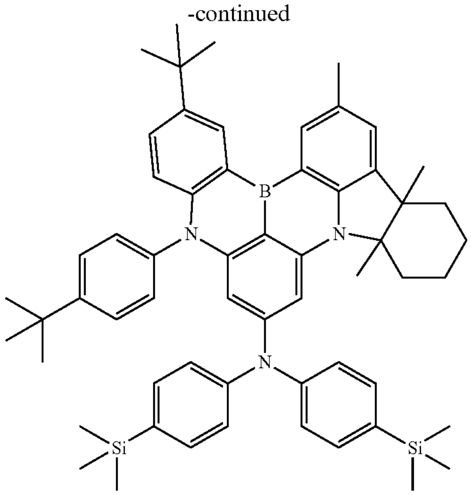
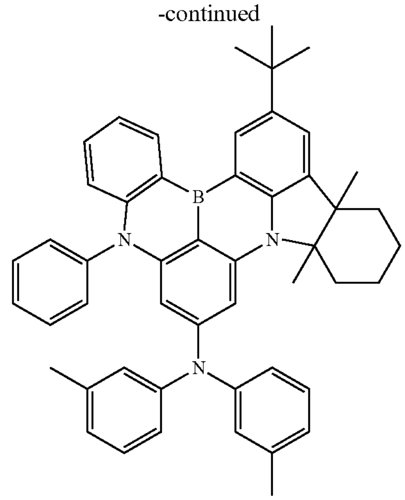
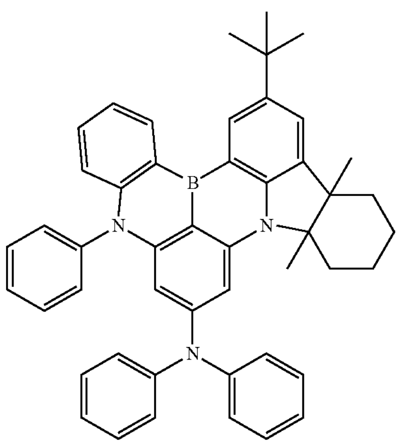
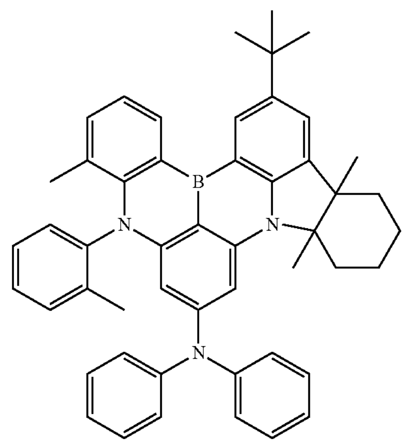
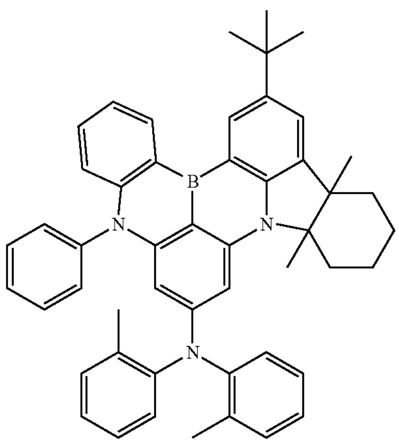
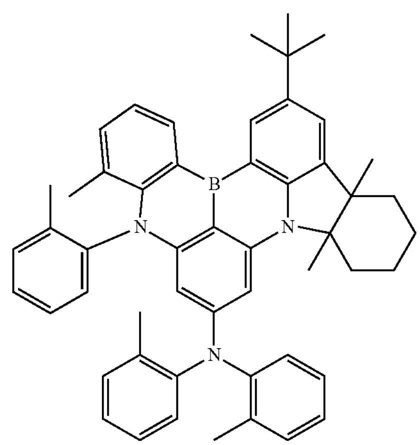

-continued
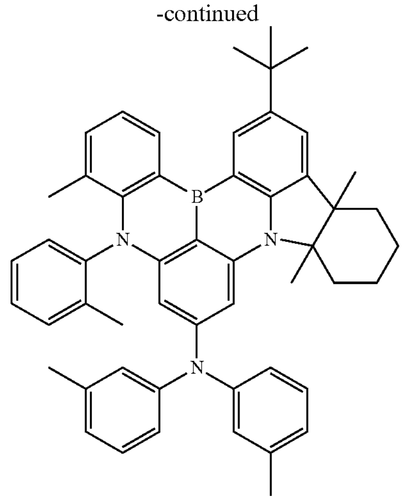
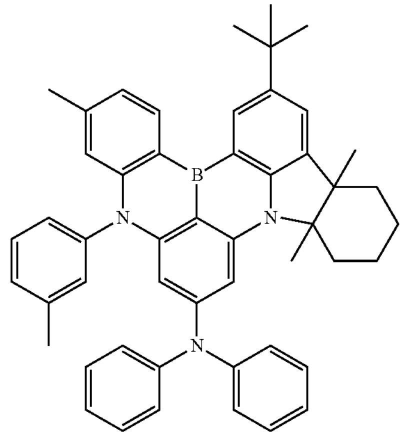
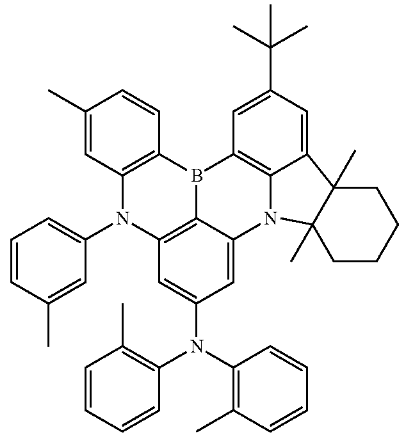
-continued
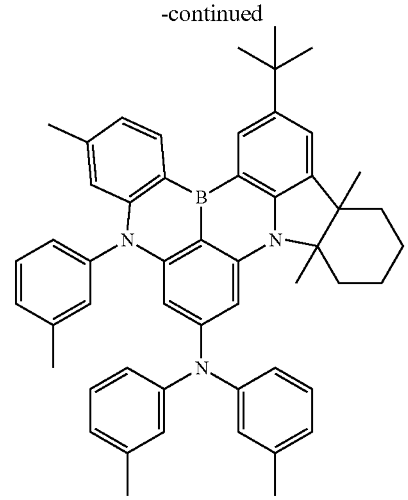
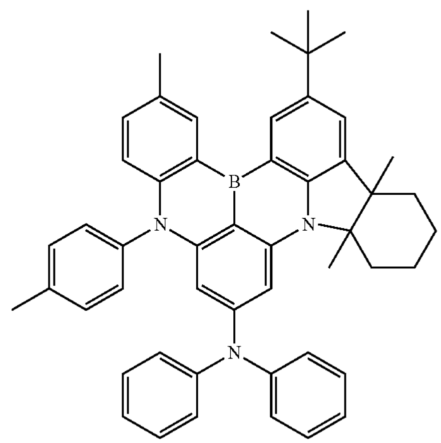
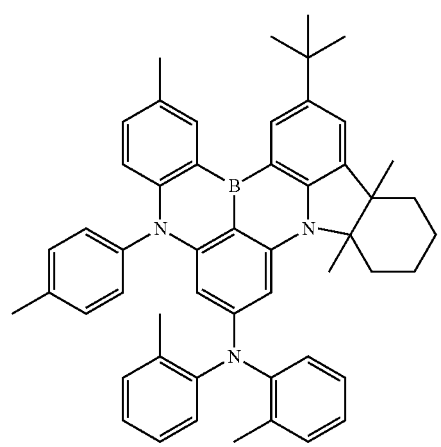

-continued
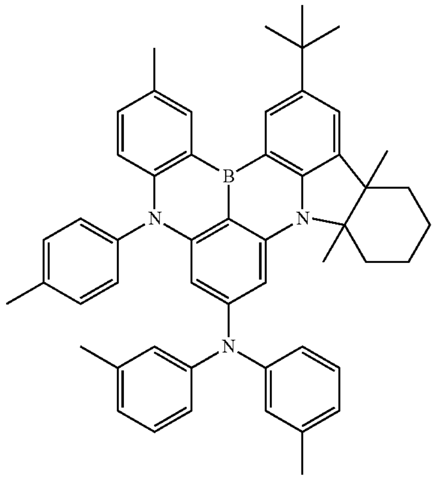
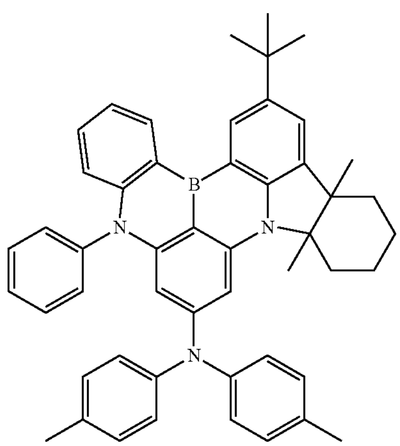
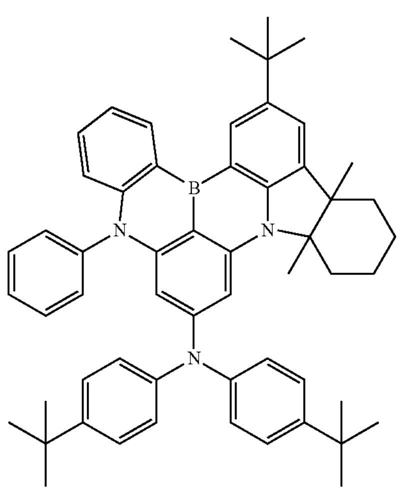
-continued
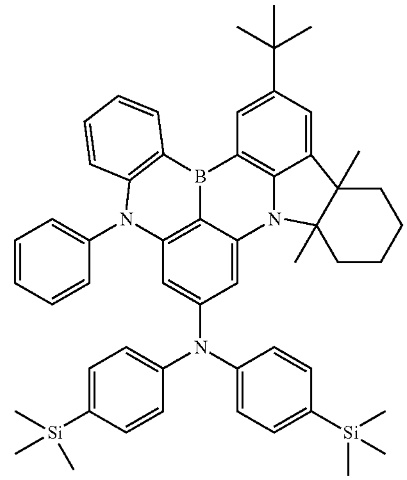
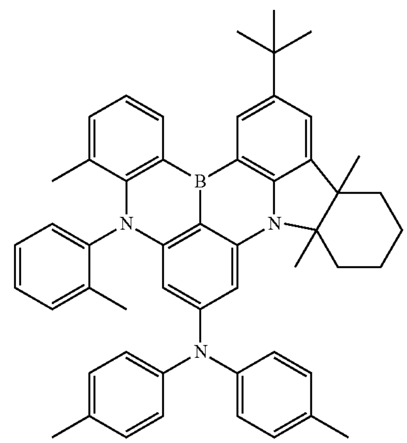
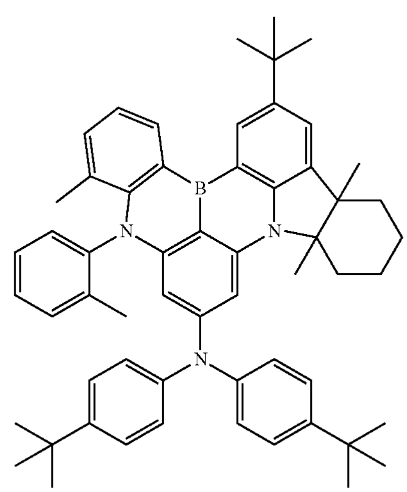

-continued
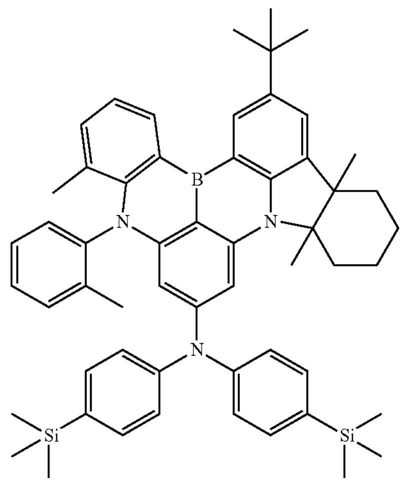
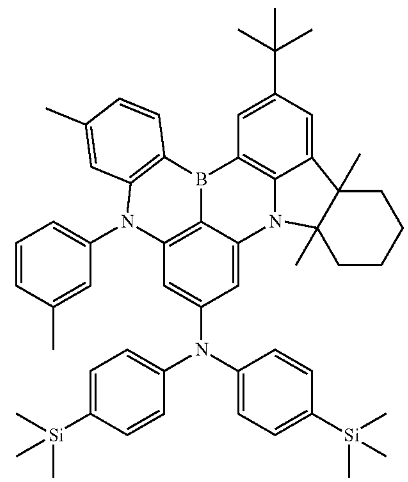
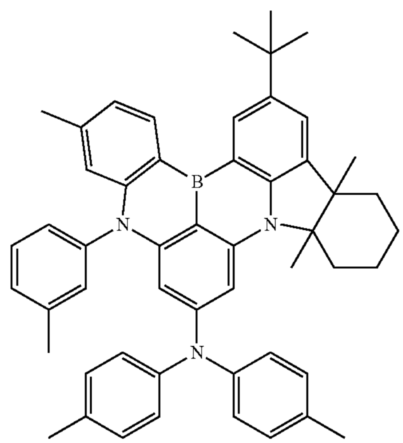
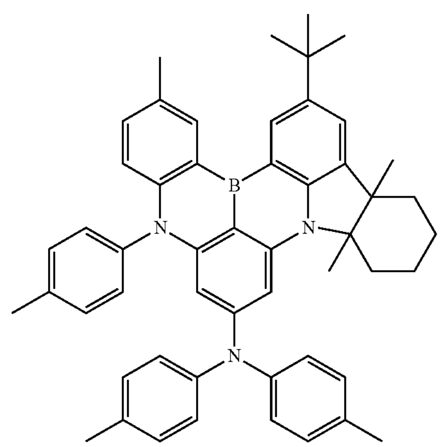
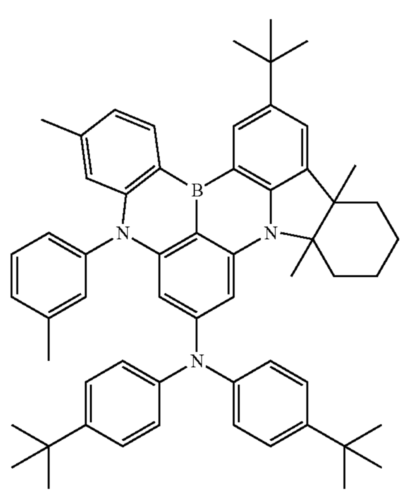
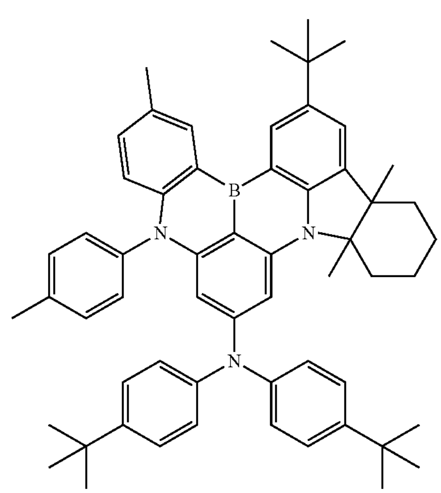

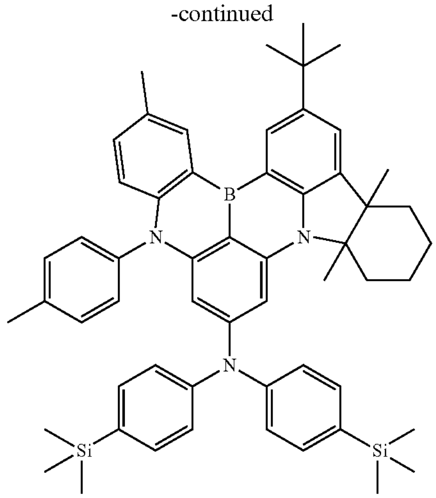
B
N
N
N
Si
Si
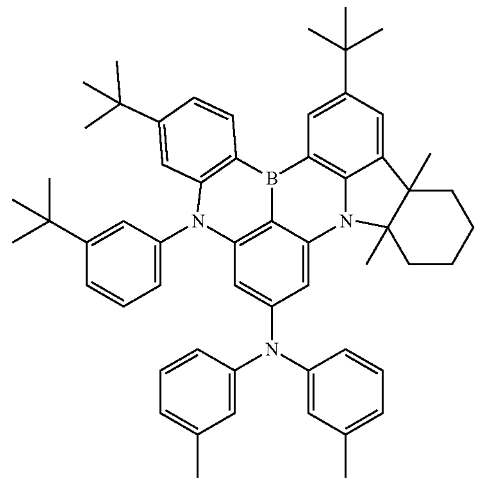
B
N
N
N
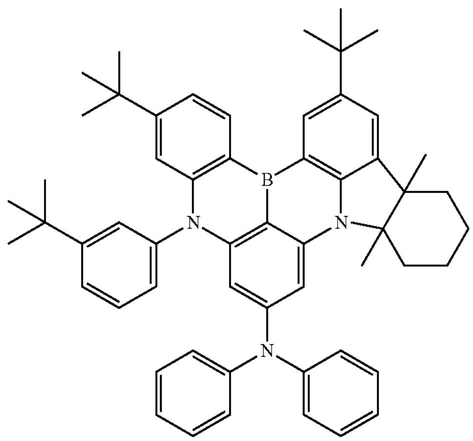
B
N
N
N
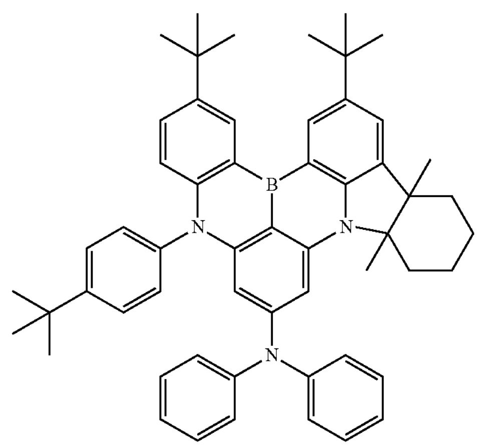
B
N
N
N
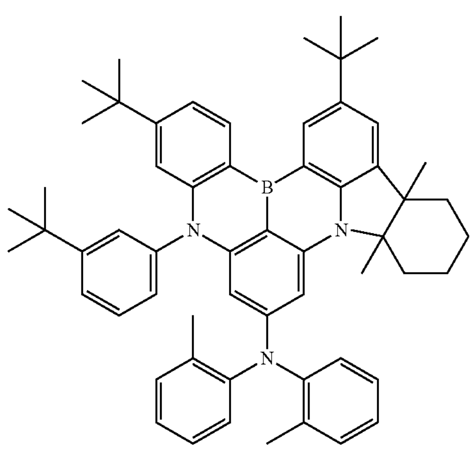
B
N
N
N
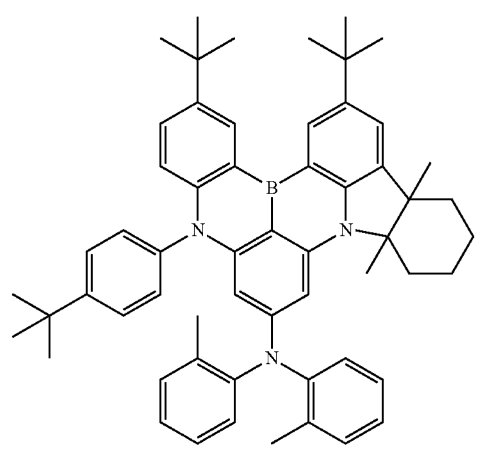
B
N
N
N -continued
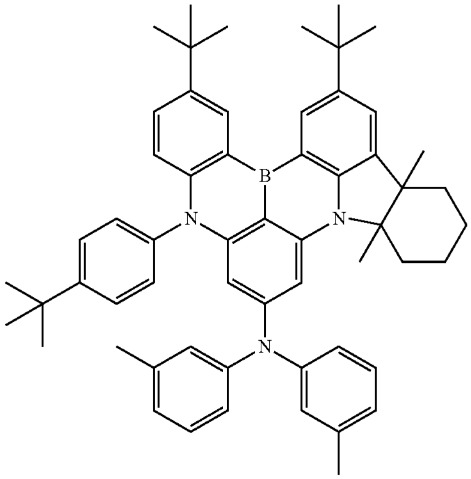
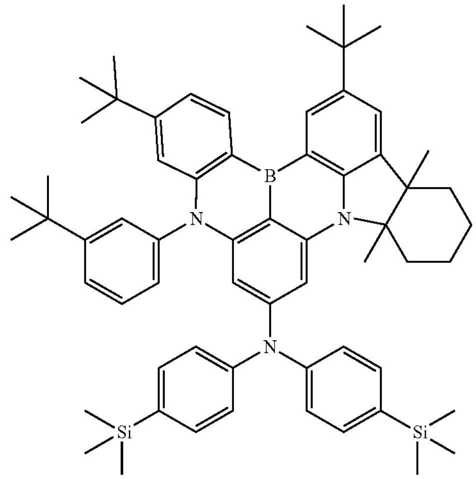
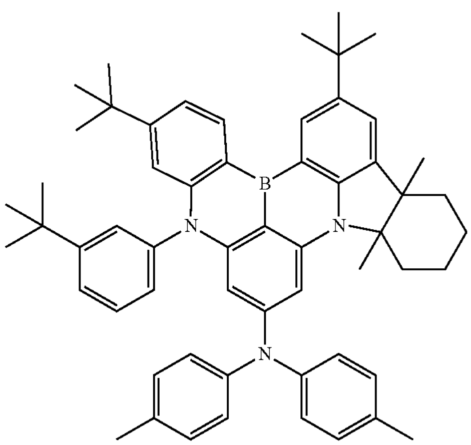
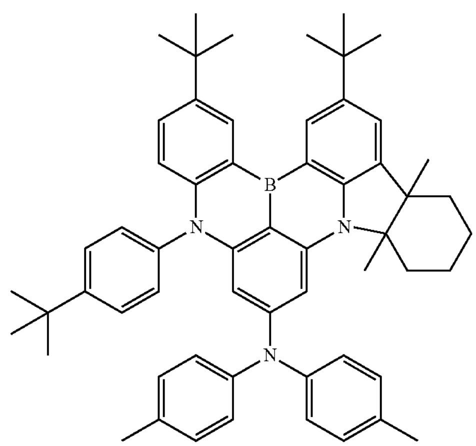
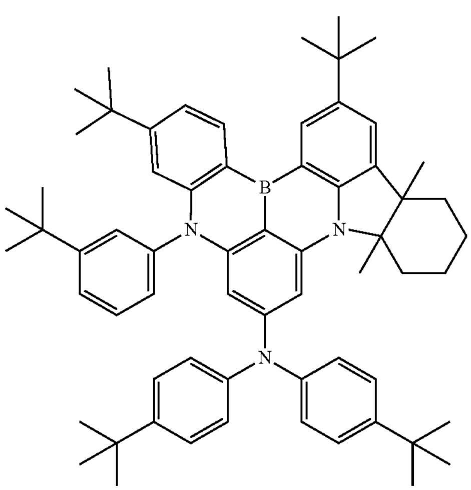
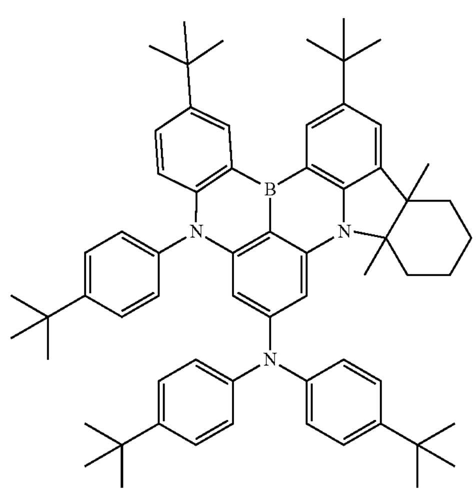

-continued
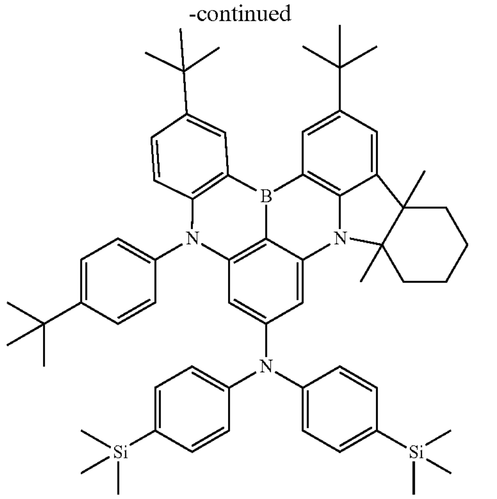
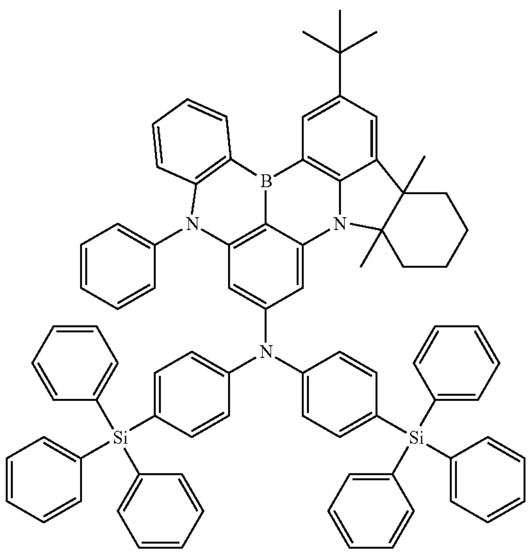
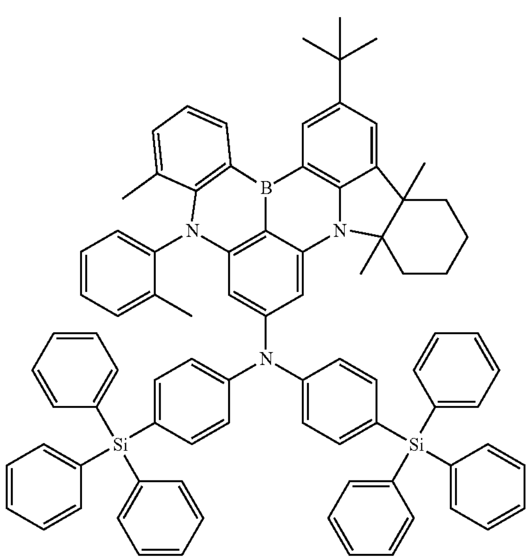
-continued
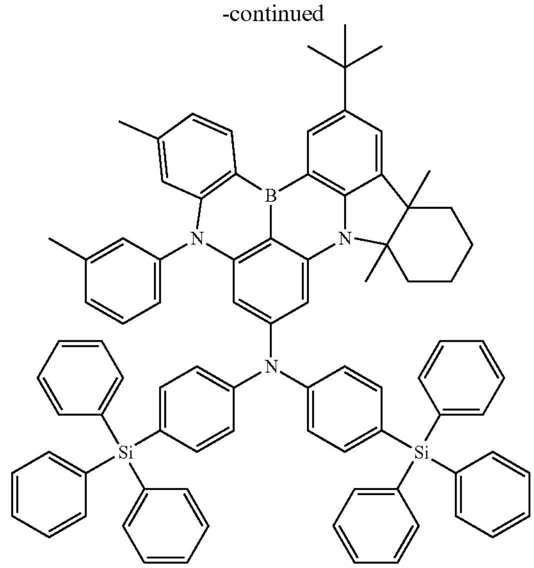
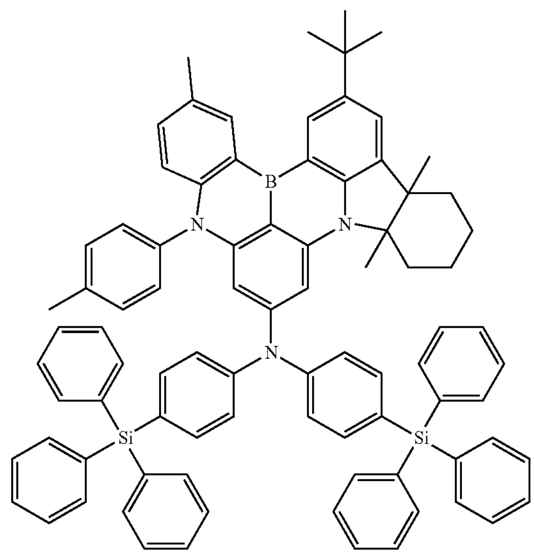
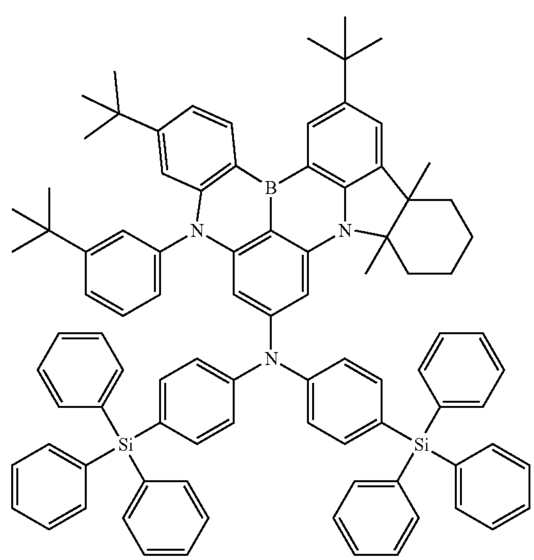

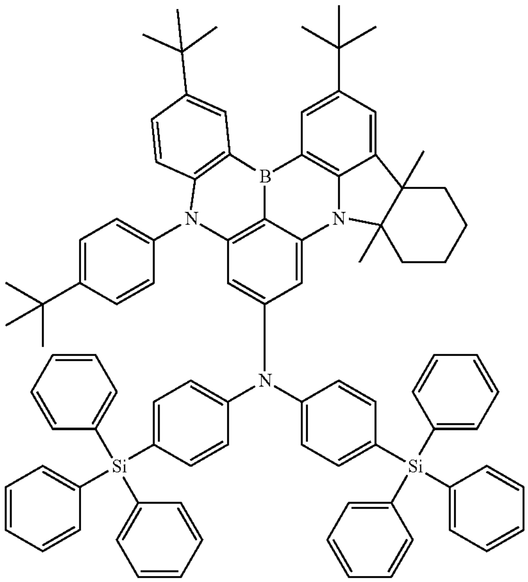
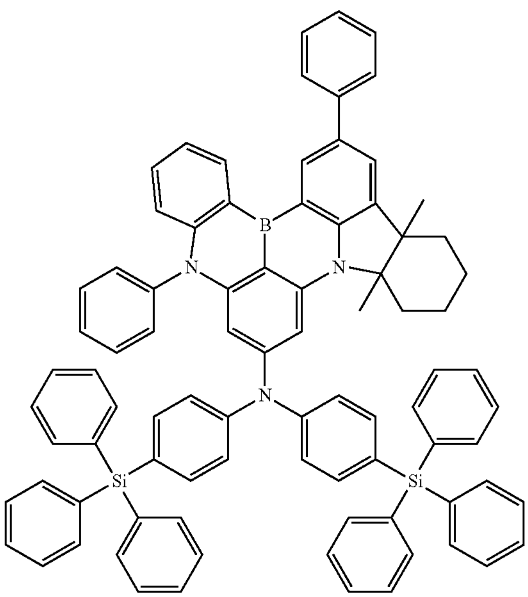
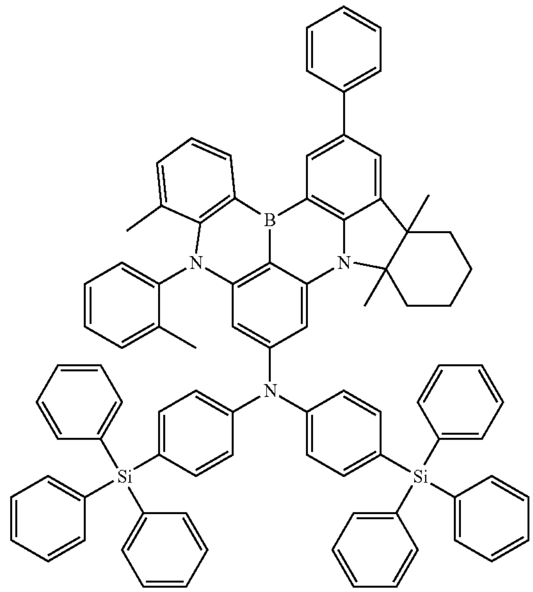
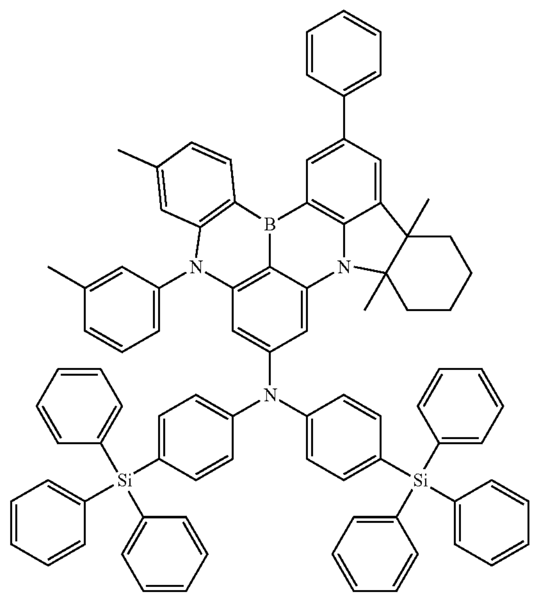

-continued
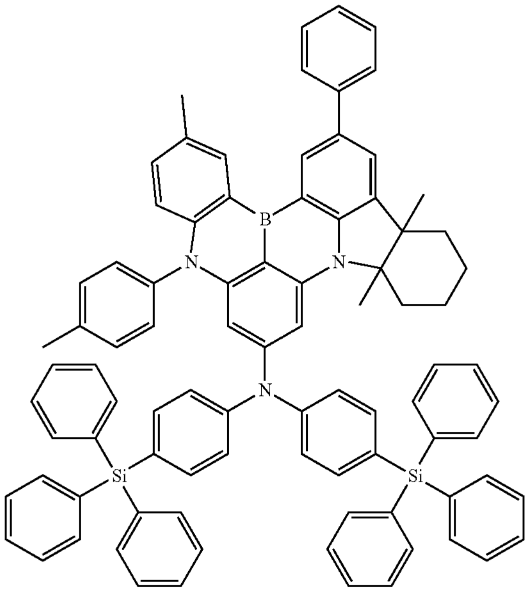
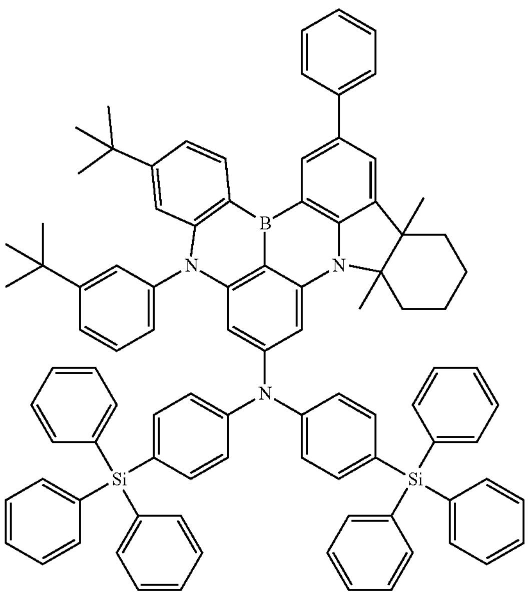
-continued
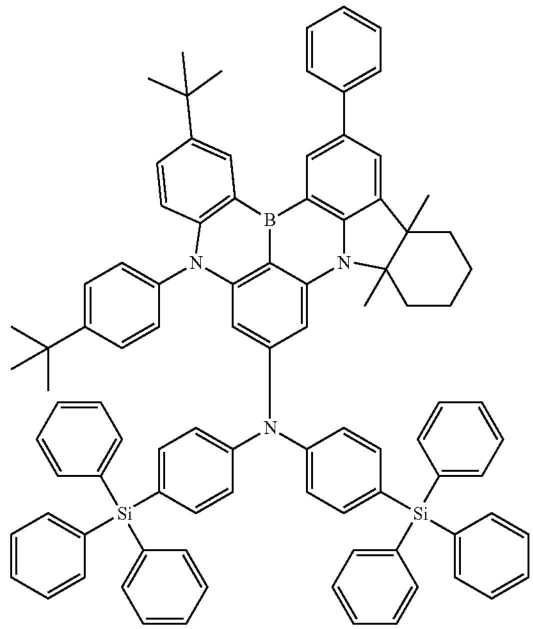
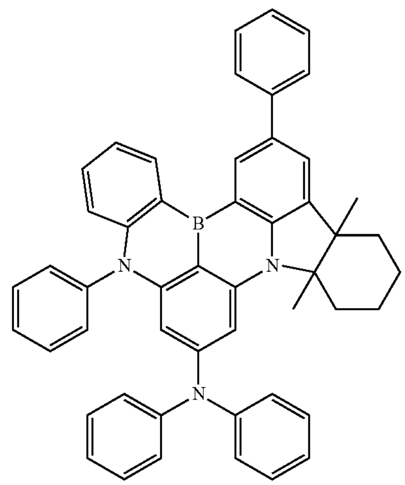
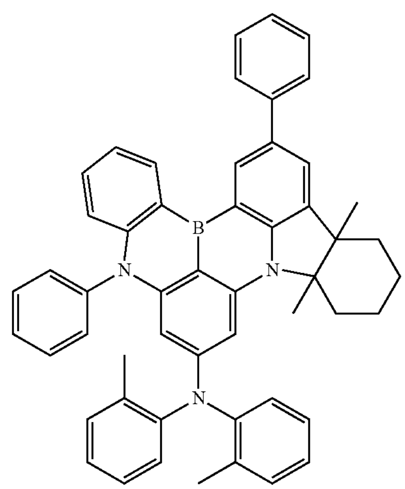

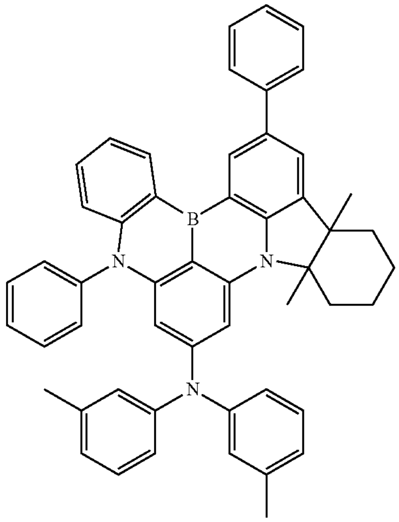
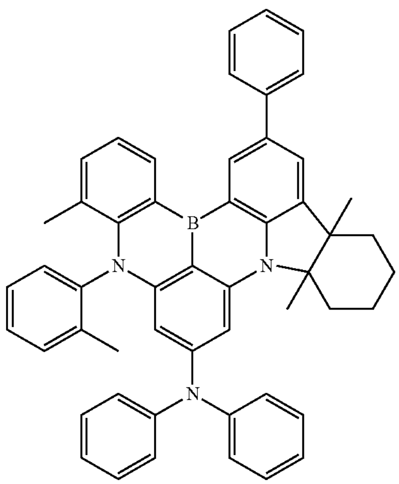
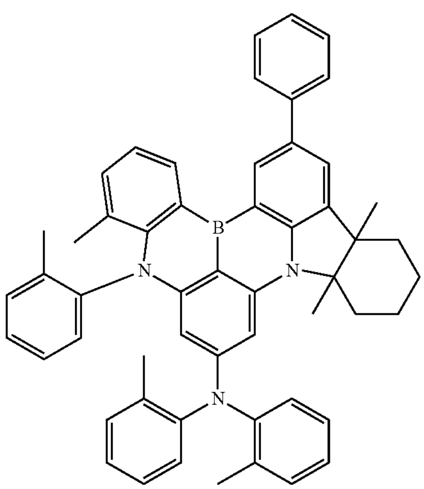
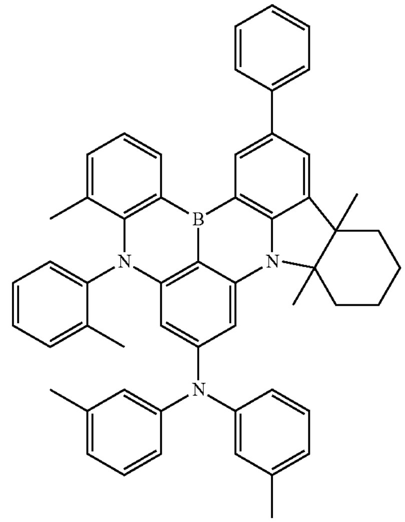
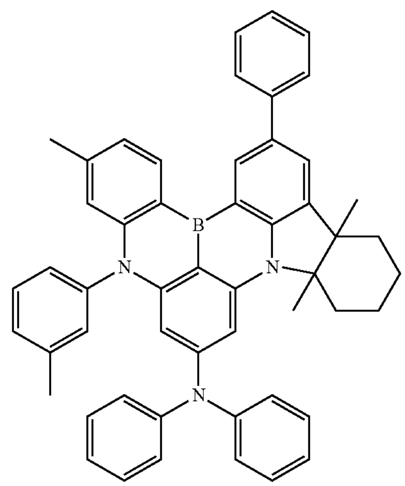
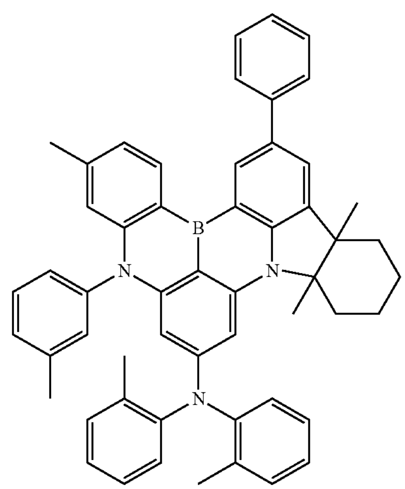

-continued
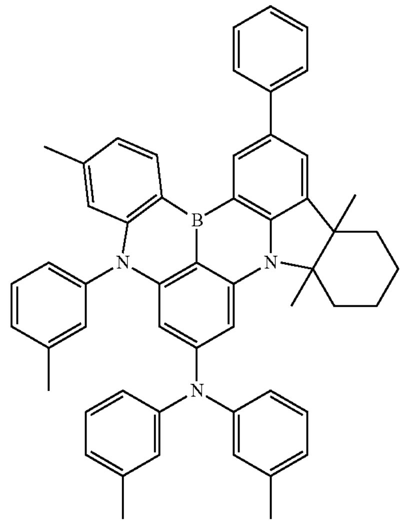
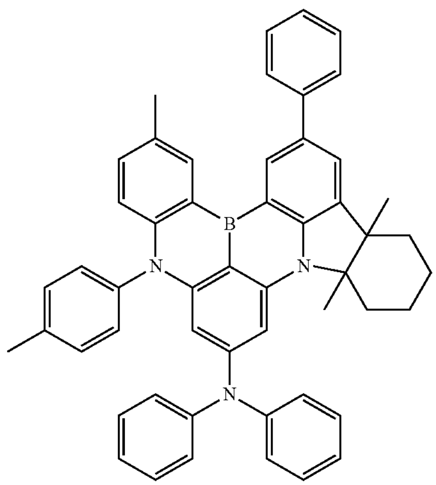
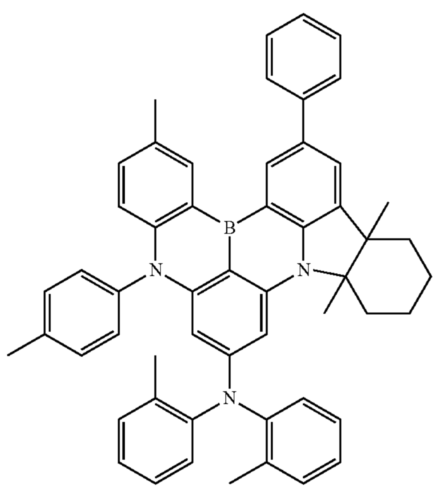
-continued
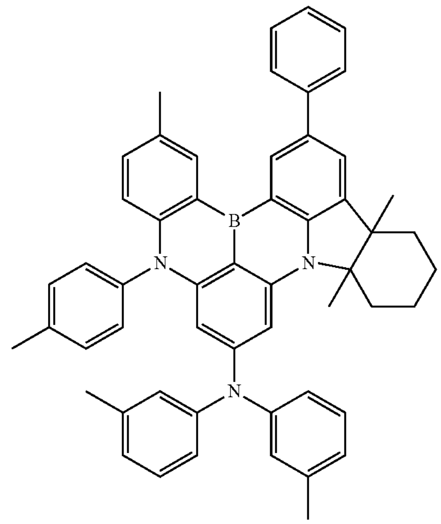
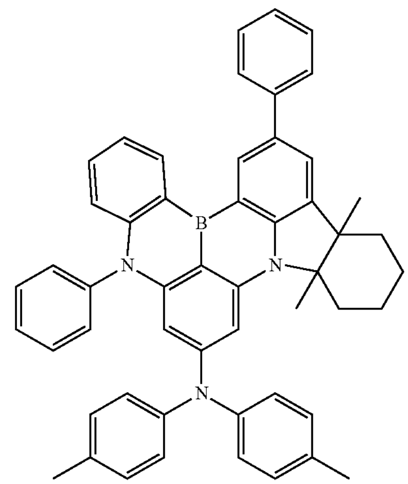
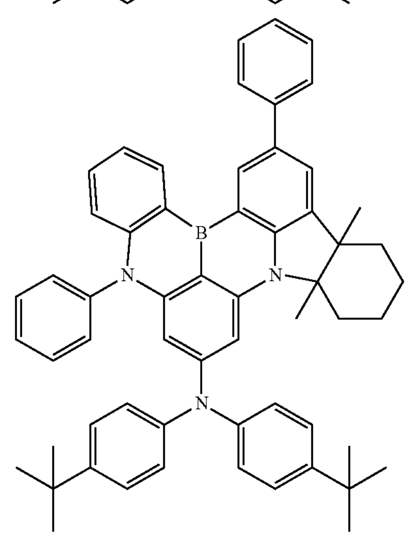

-continued
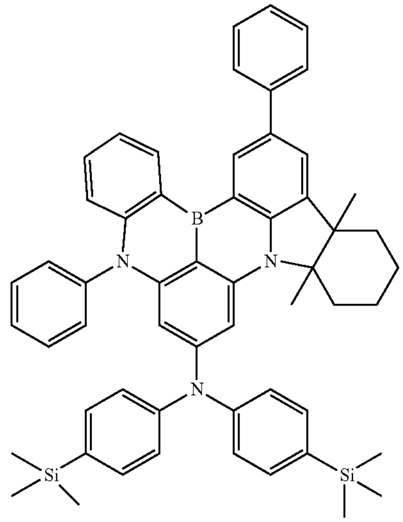
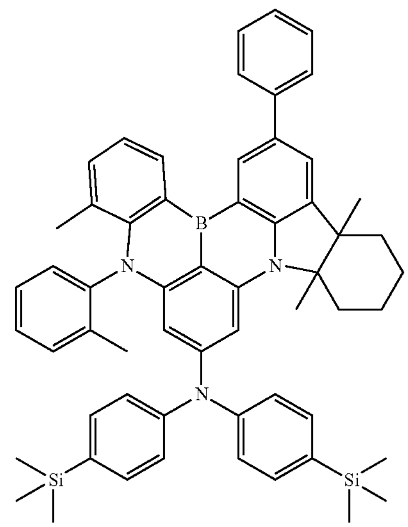
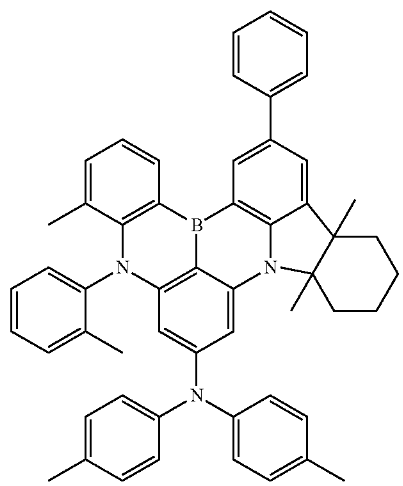
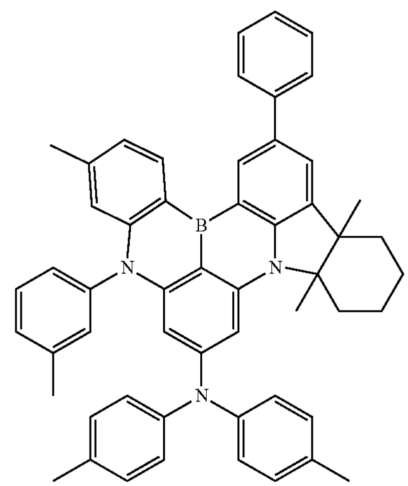
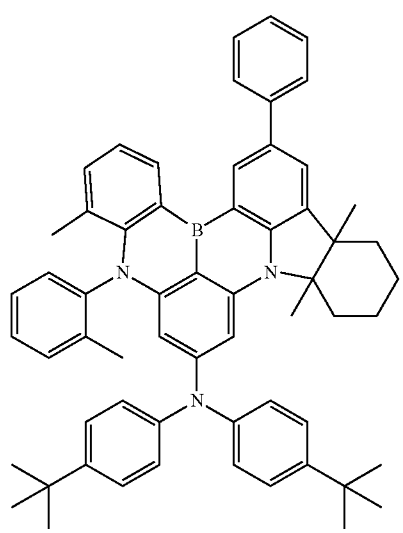
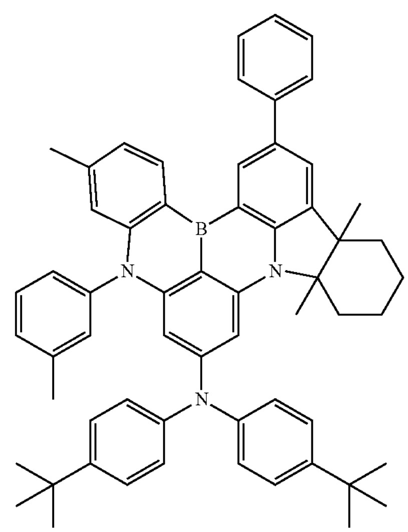

-continued
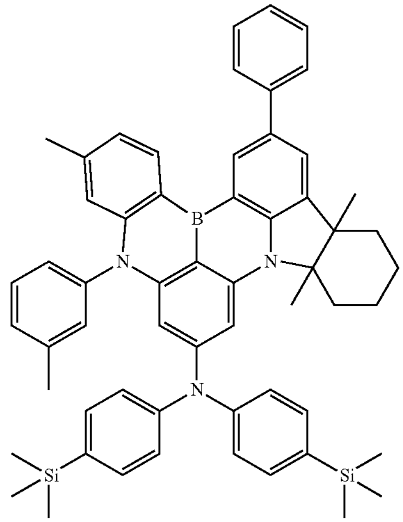
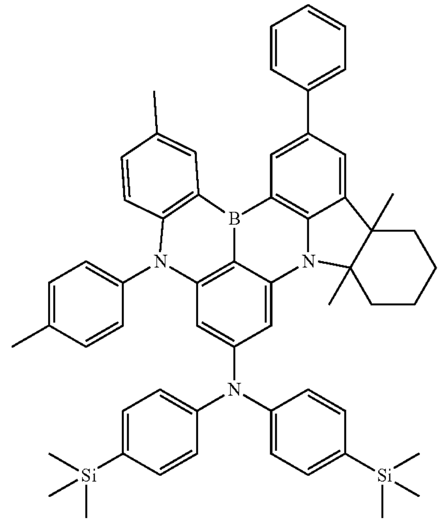
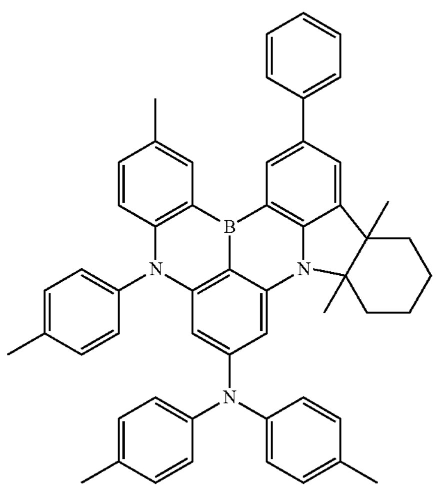
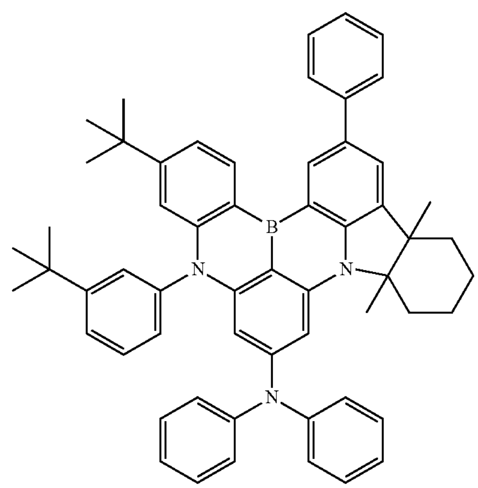
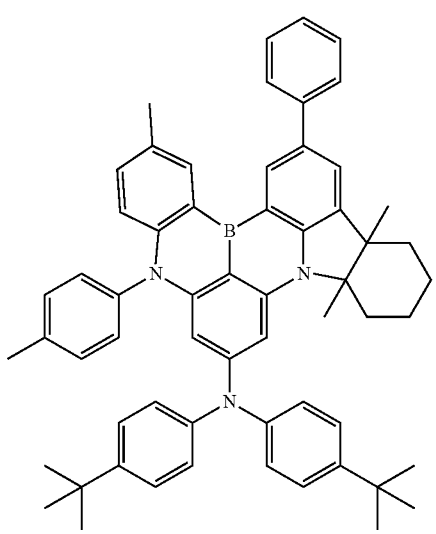
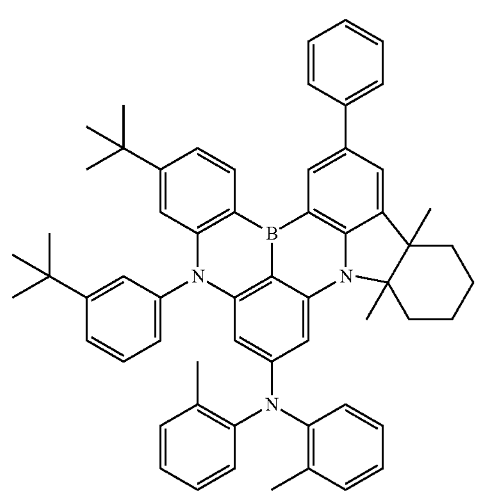

-continued
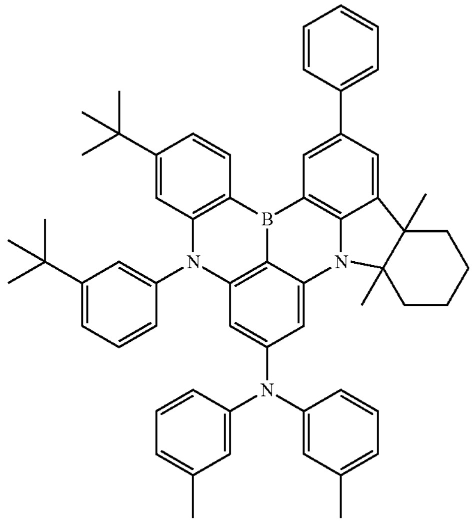
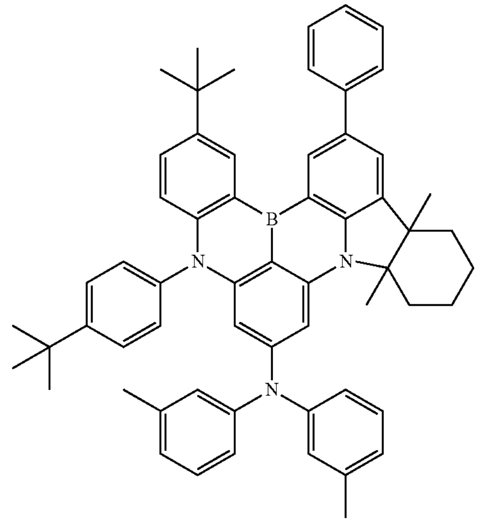
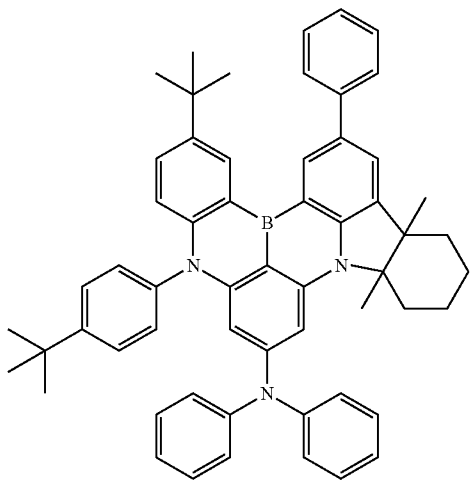
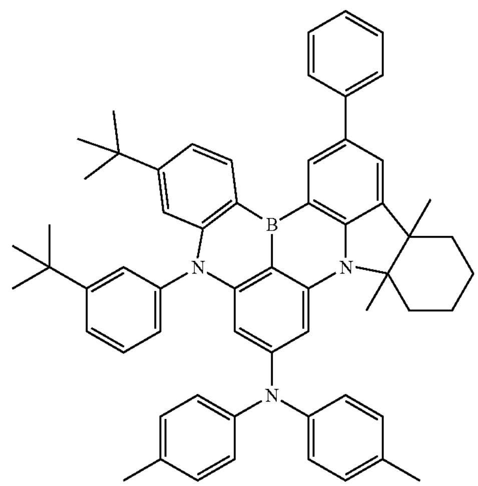
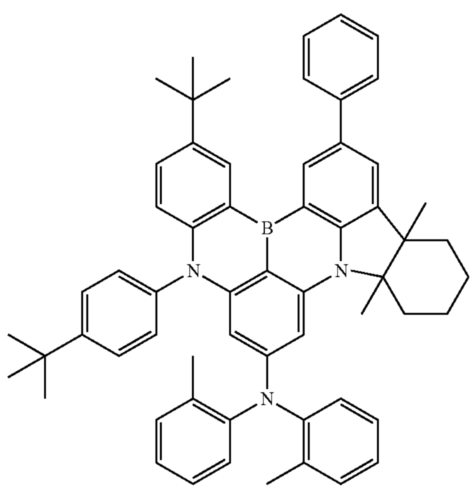
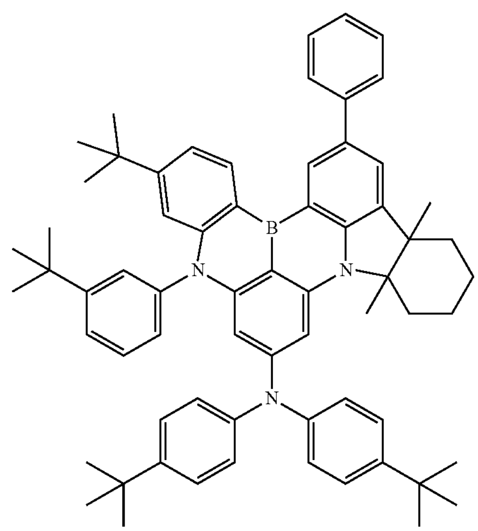

-continued
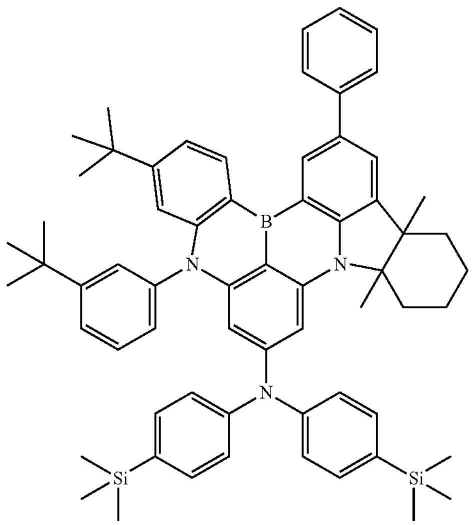
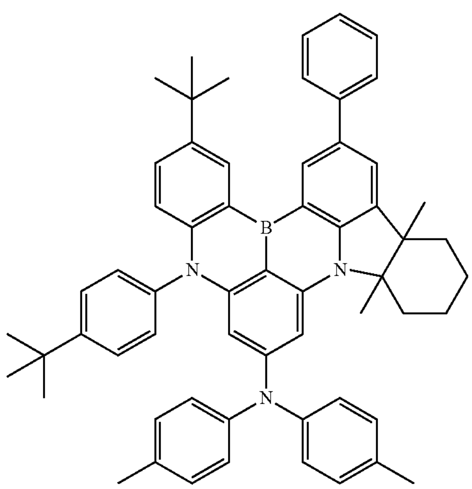
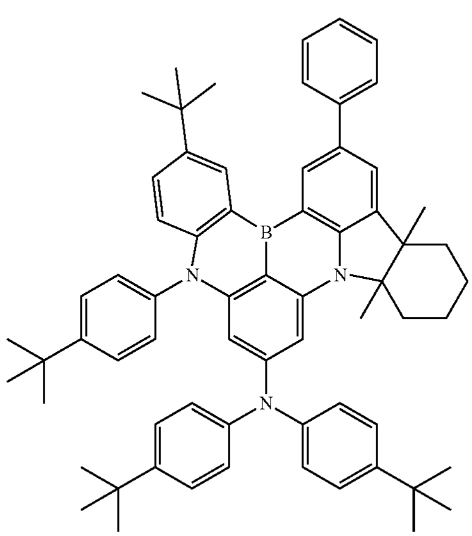
-continued
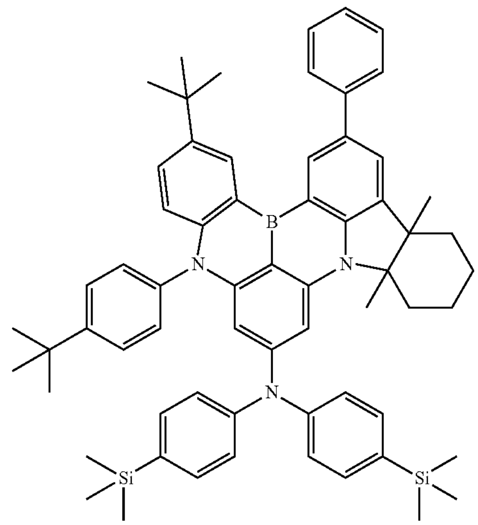
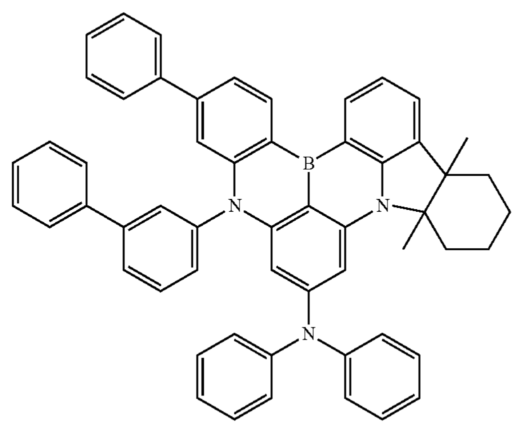
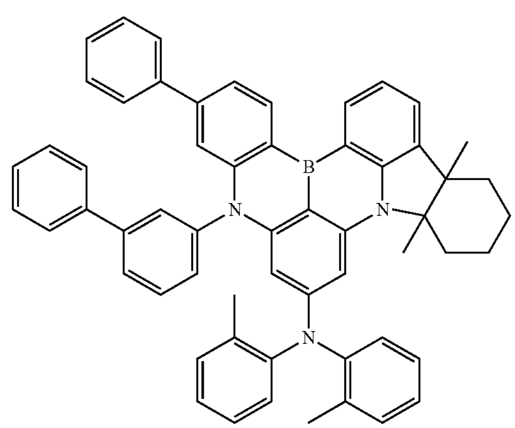

-continued
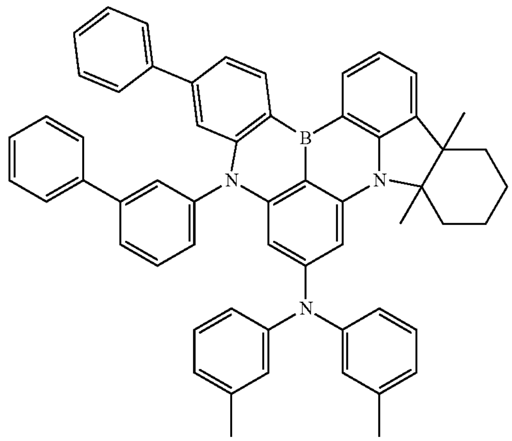
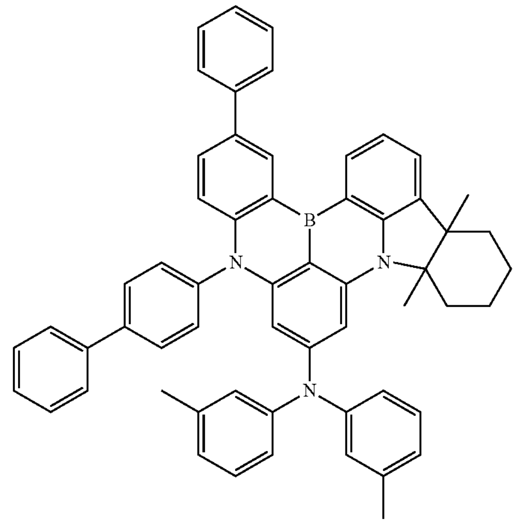
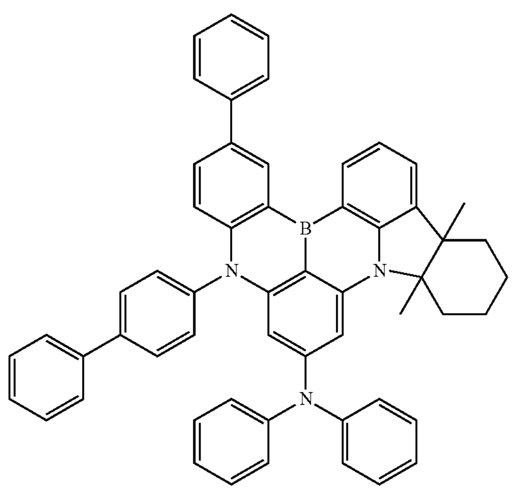
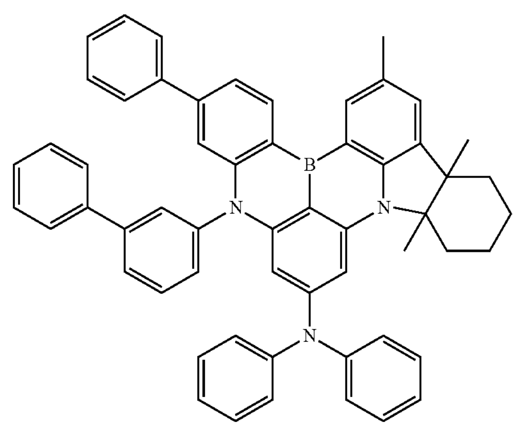
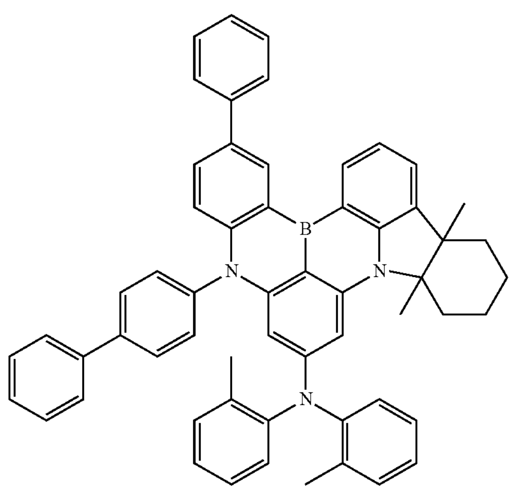
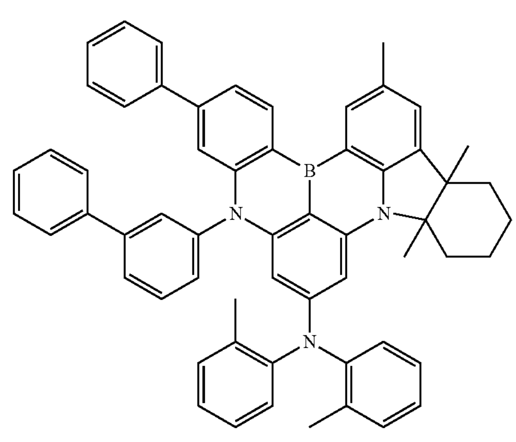
-continued -continued
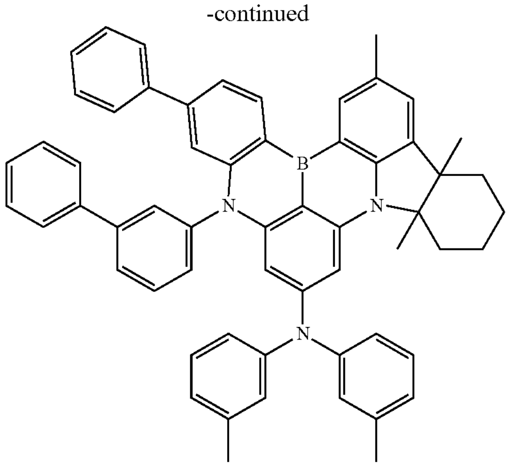
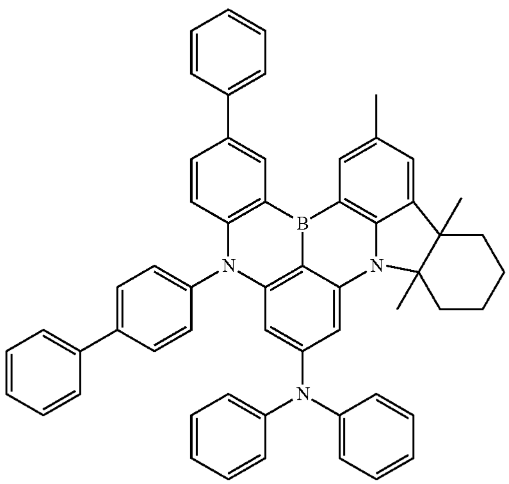
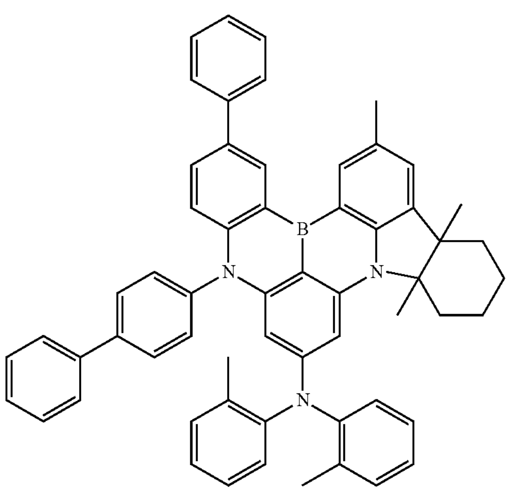
-continued
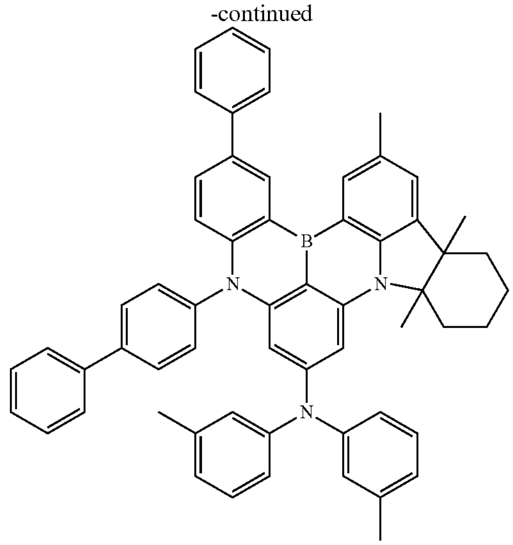
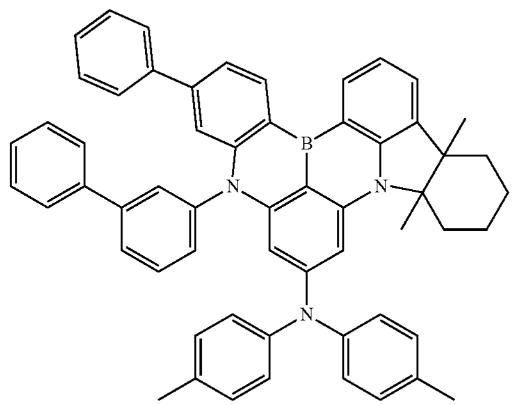
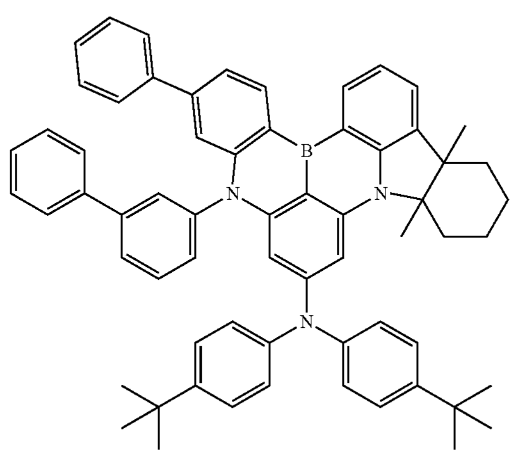

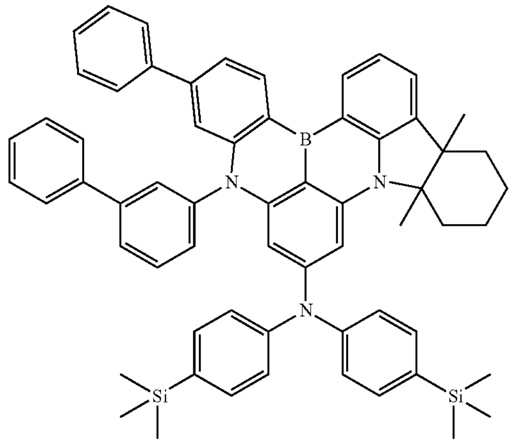
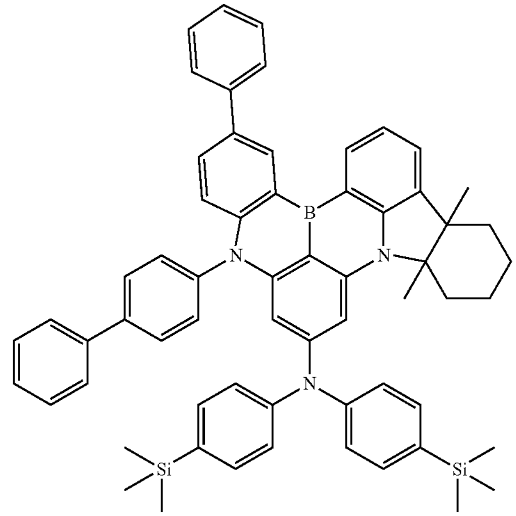
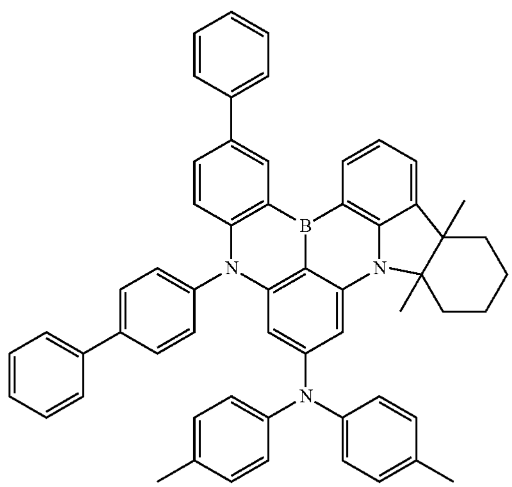
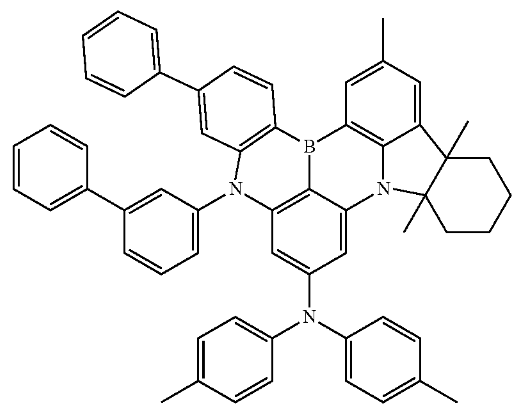
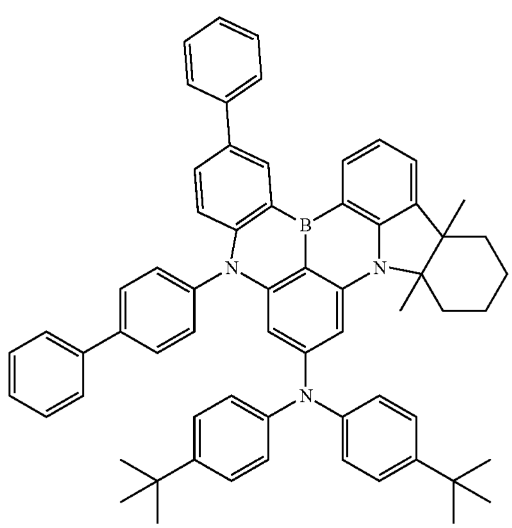
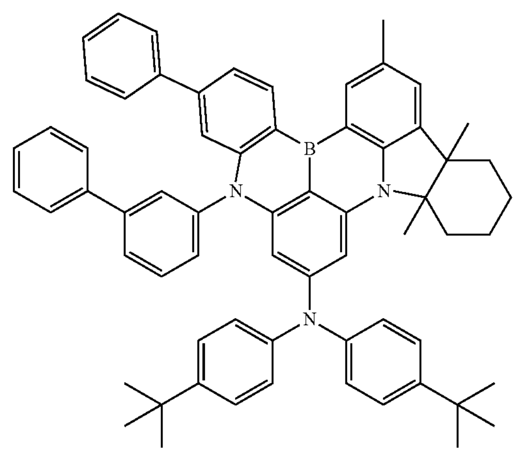

-continued
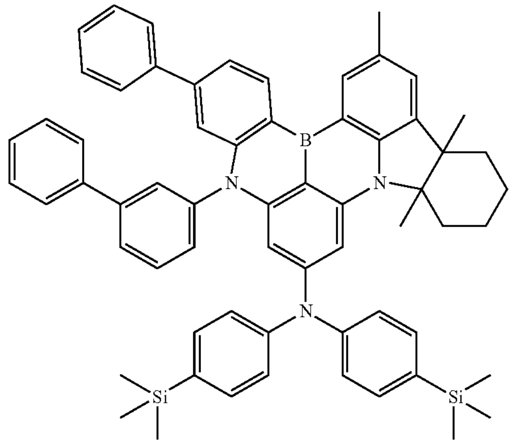
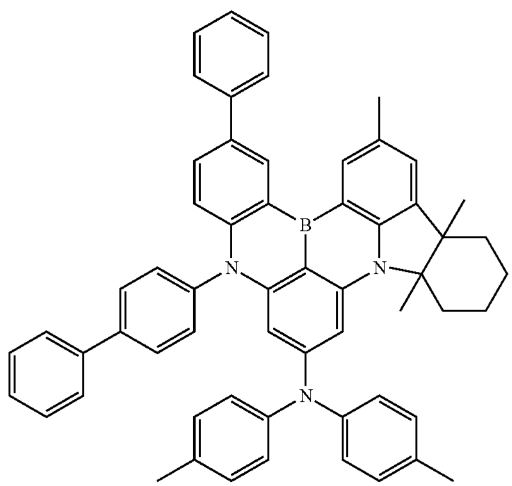
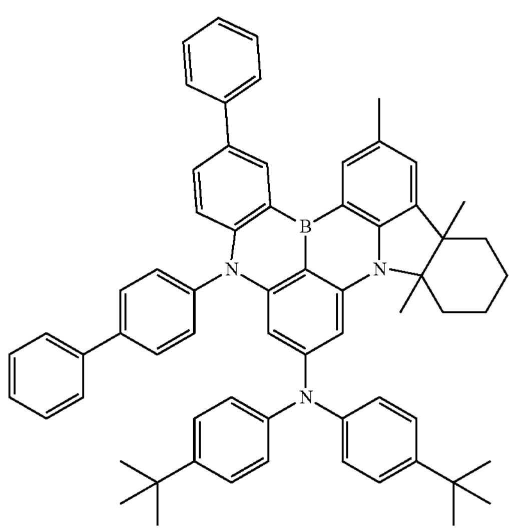
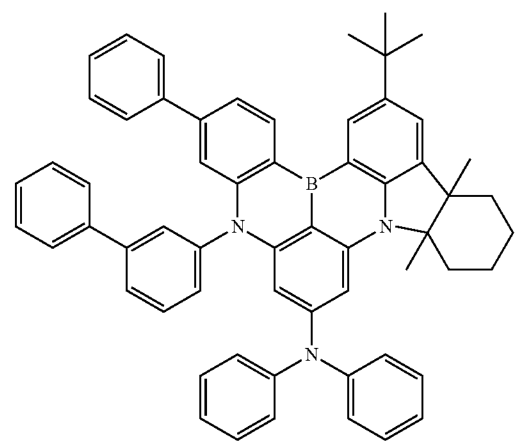
-continued
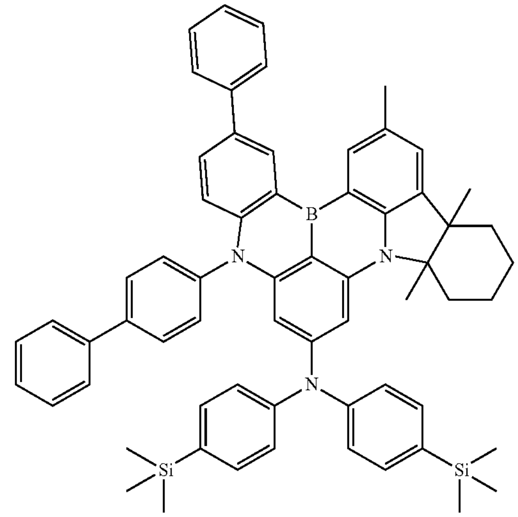
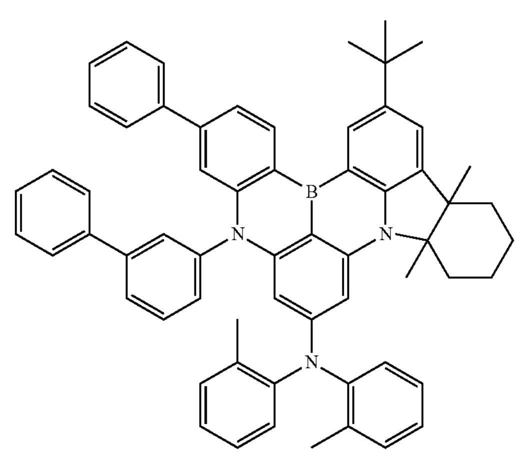

-continued
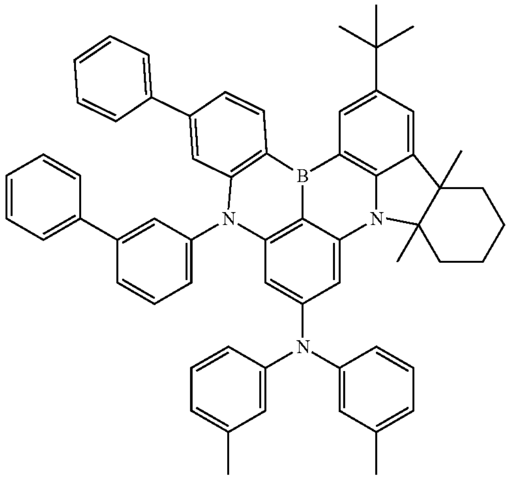
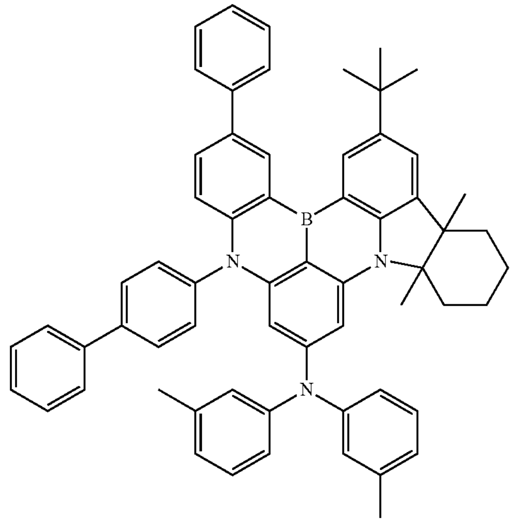
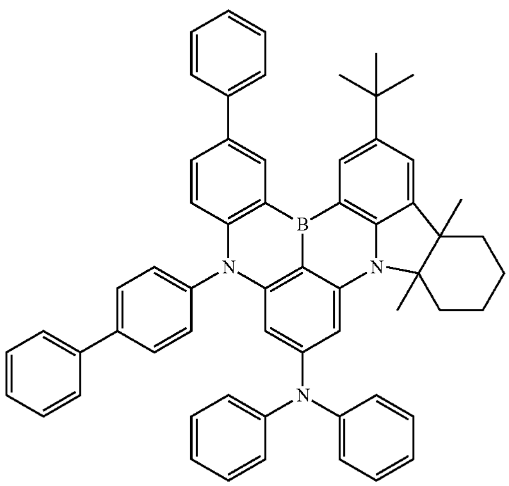
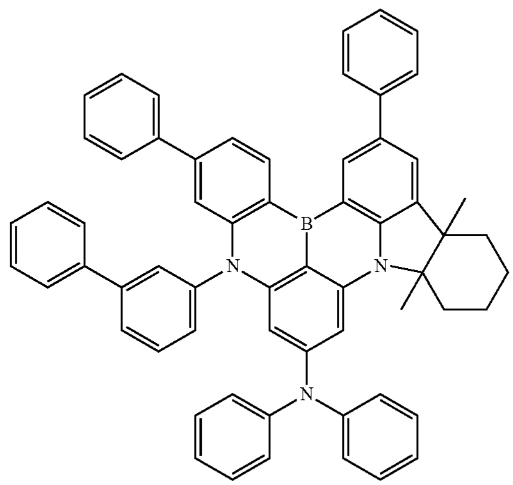
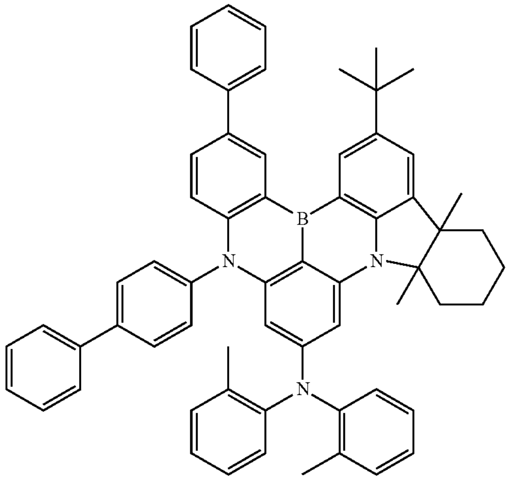
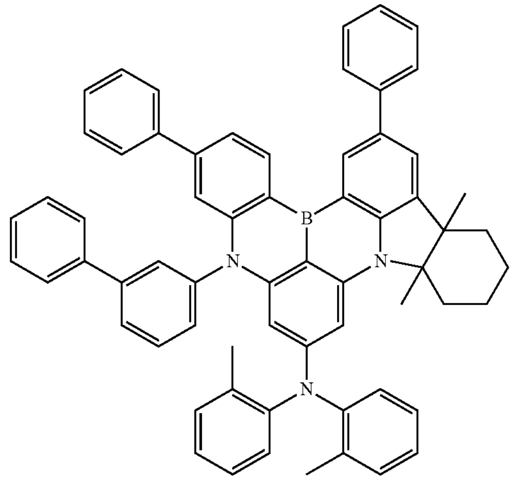
-continued -continued
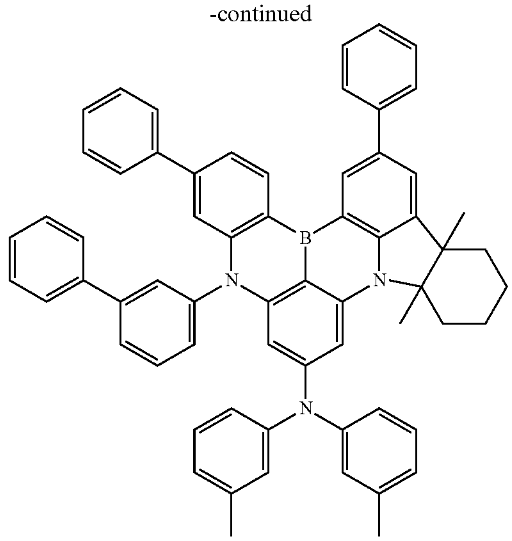
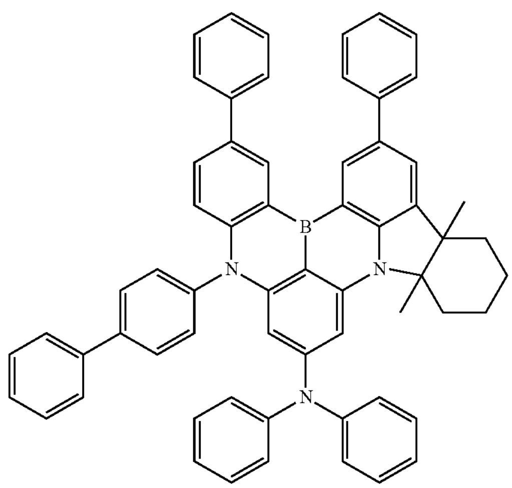
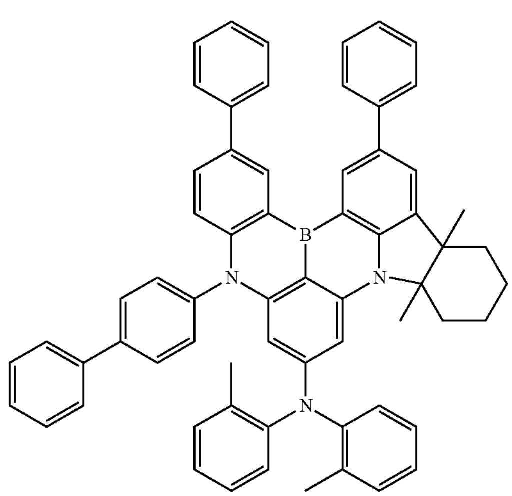
-continued
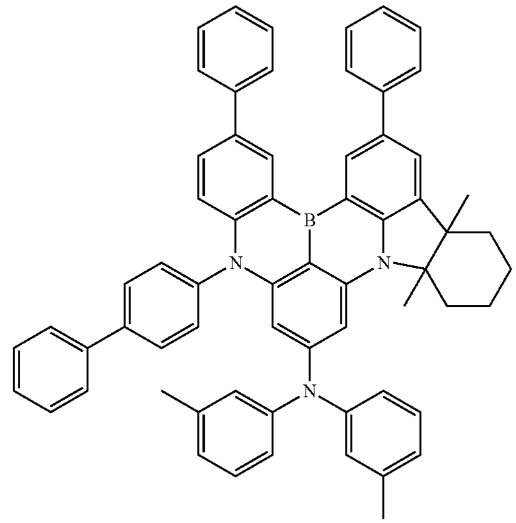
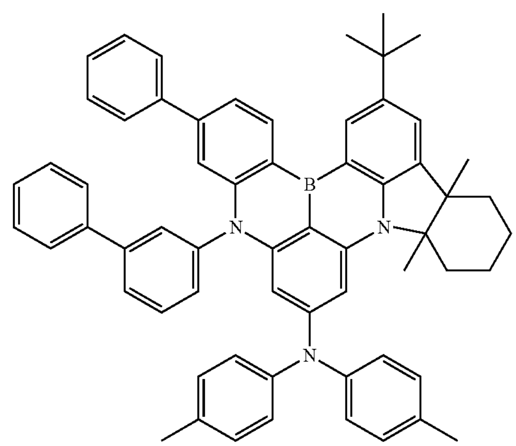
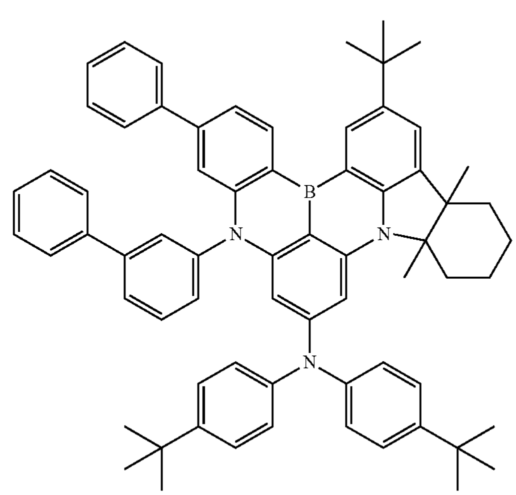

-continued
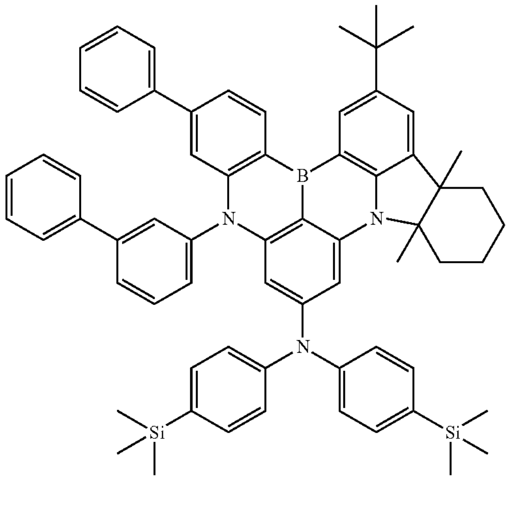
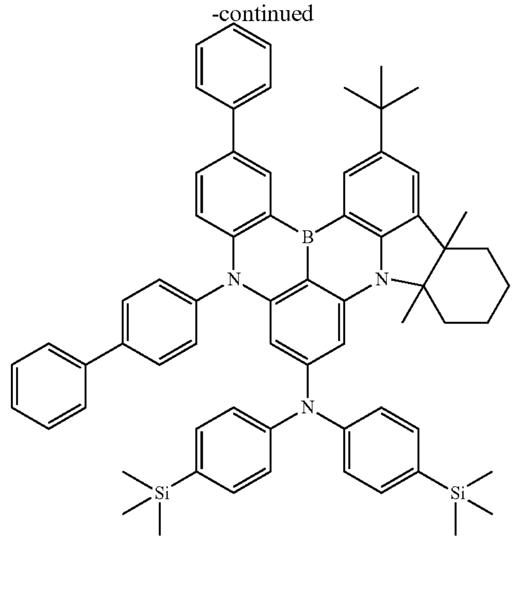
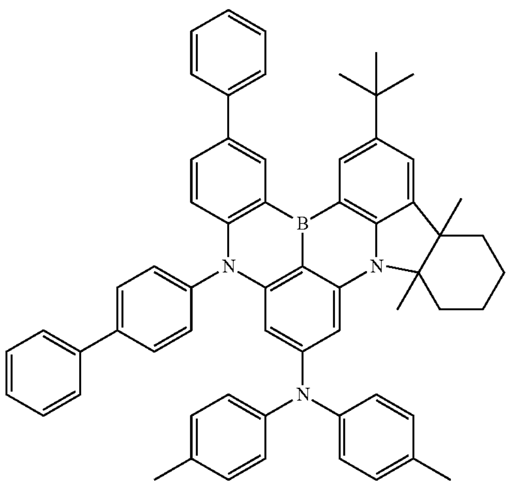
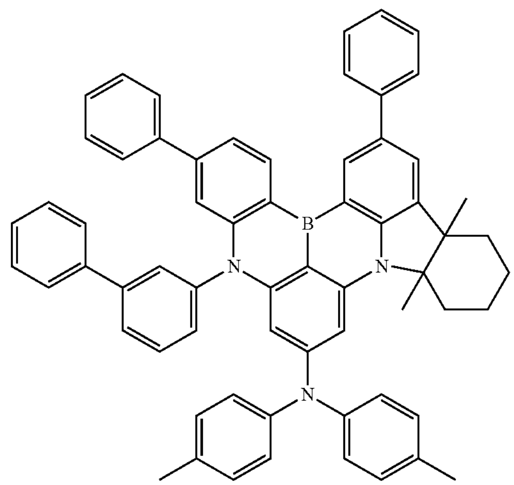
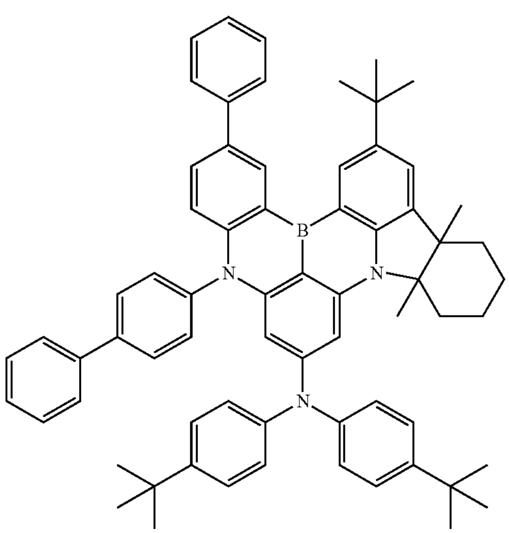
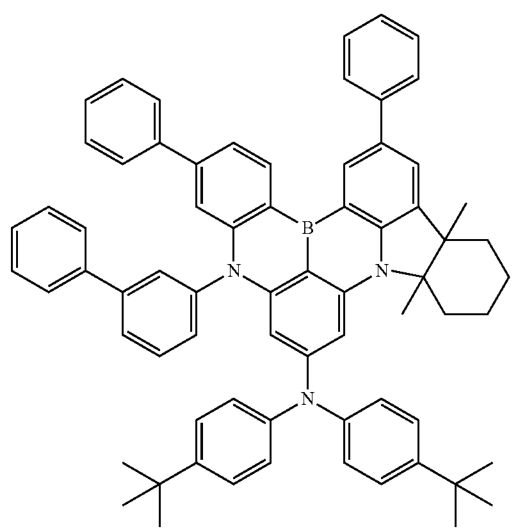
-continued -continued
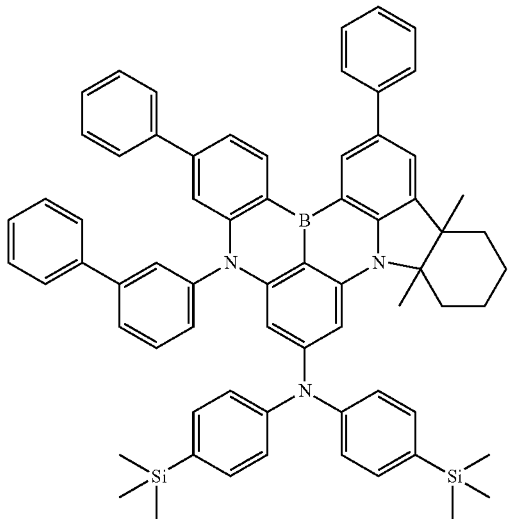
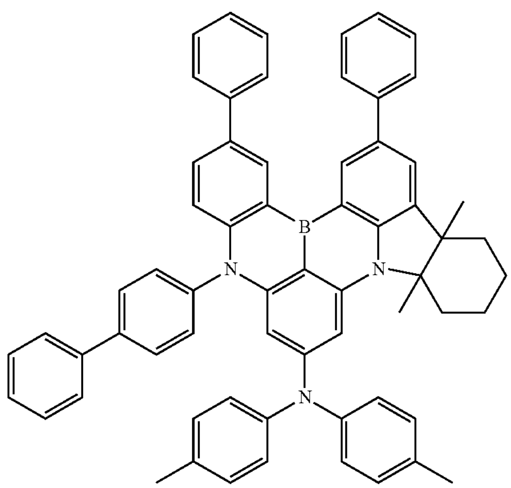
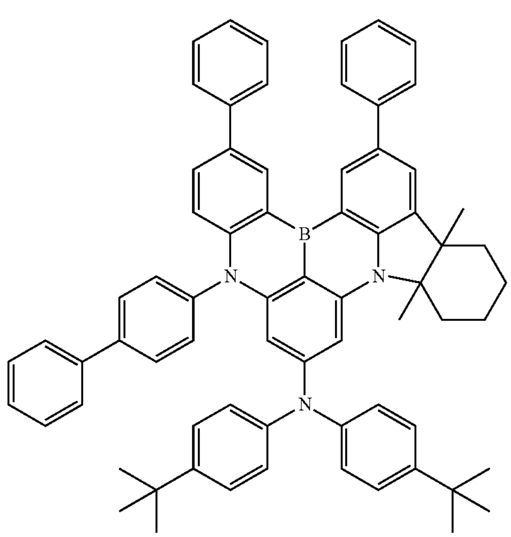
-continued
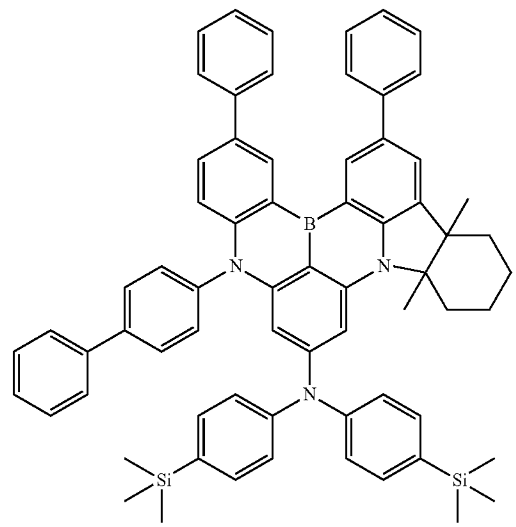
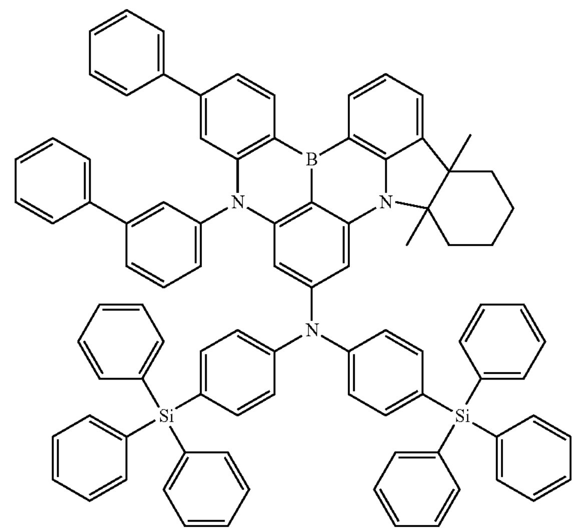
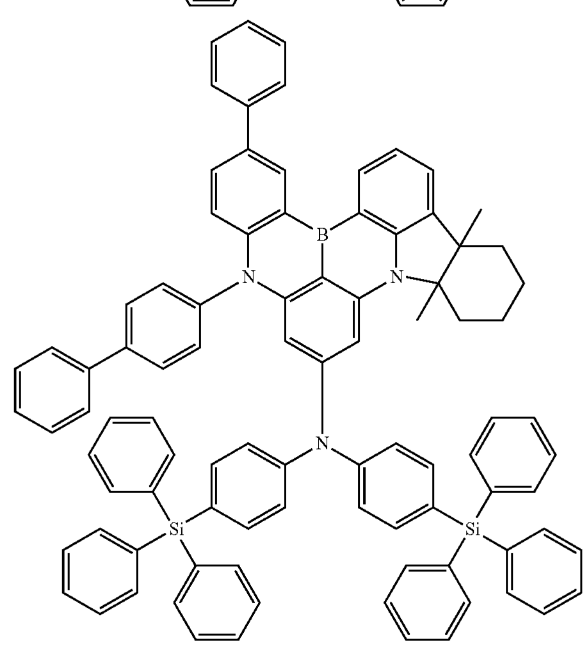

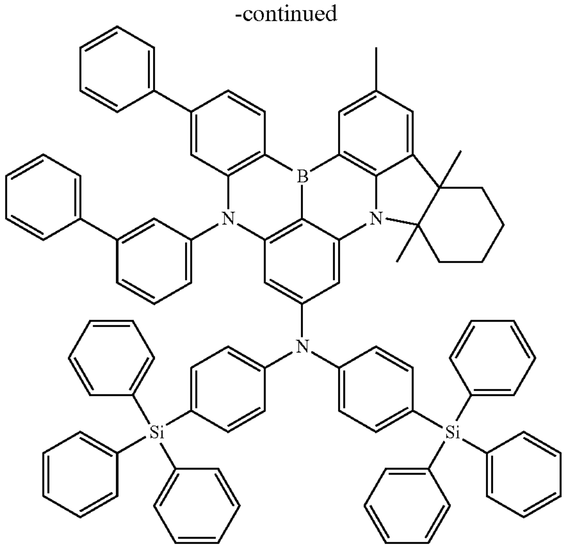
B
N
N
N
Si
Si
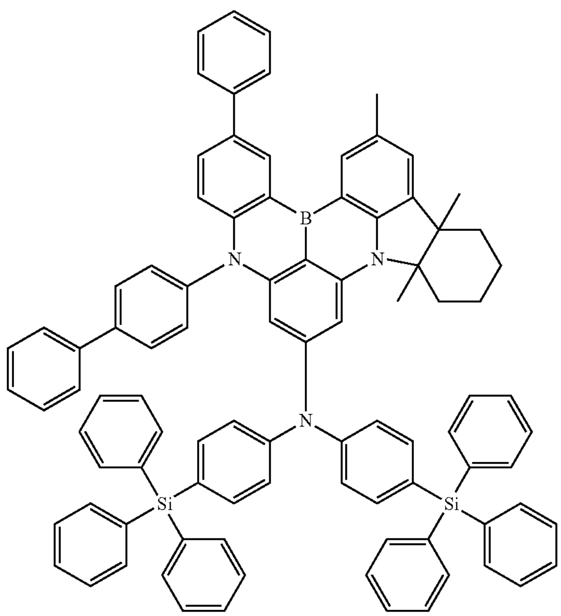
B
N
N
N
Si
Si
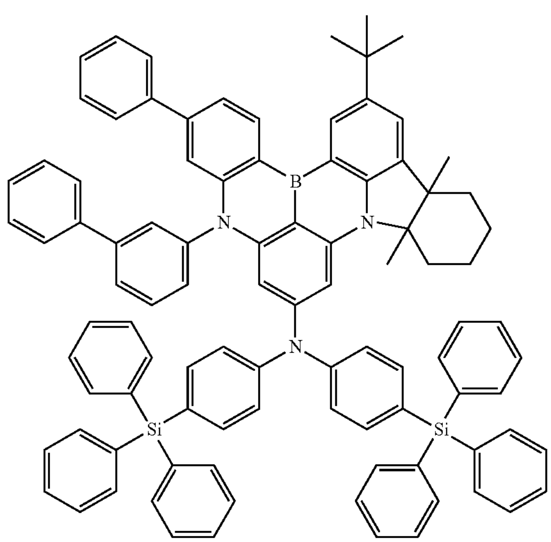
B
N
N
N
Si
Si
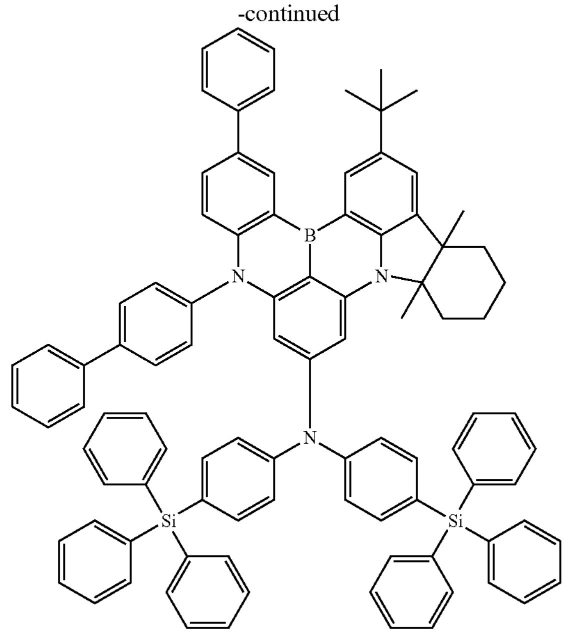
B
N
N
N
Si
Si
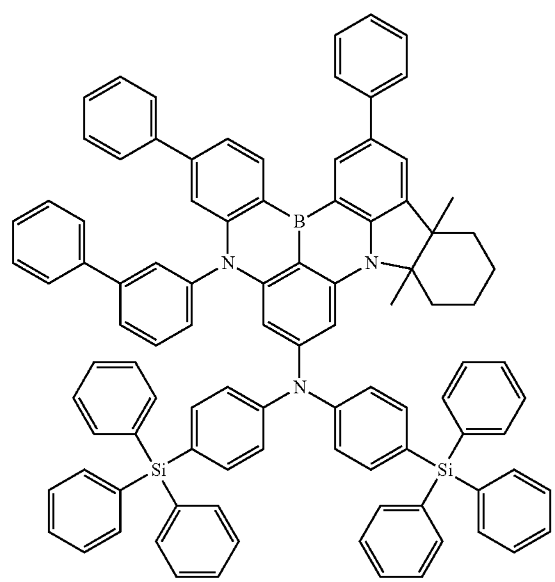
B
N
N
N
Si
Si -continued
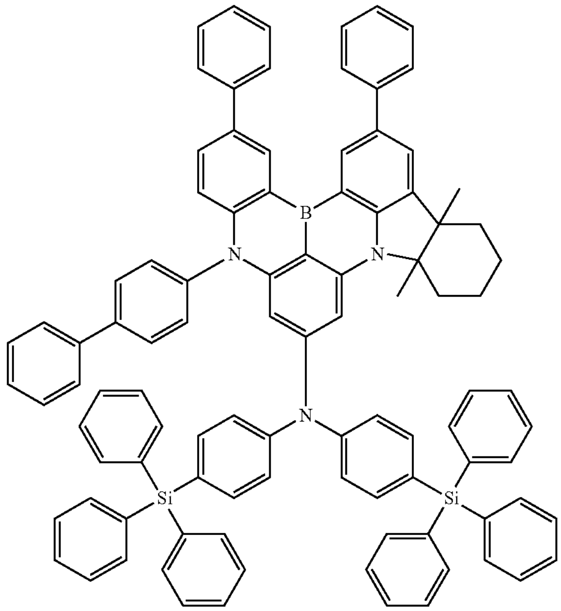
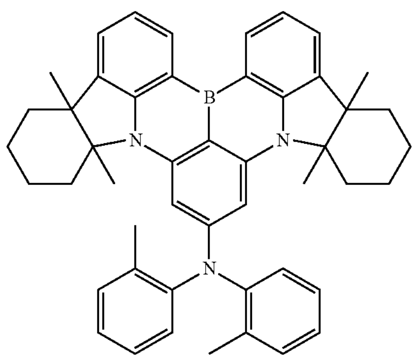
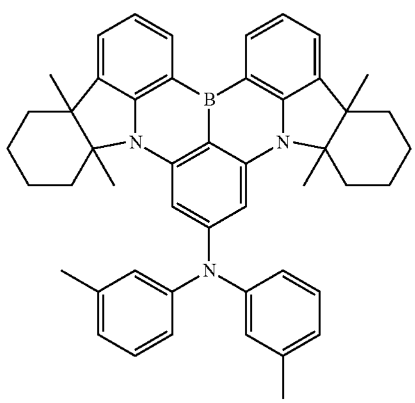
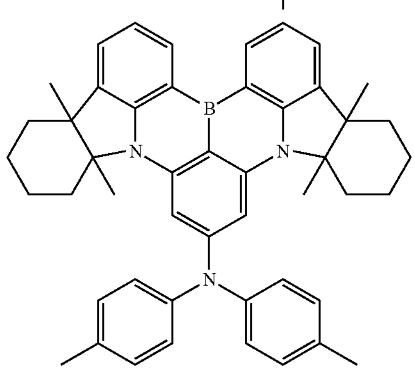
-continued
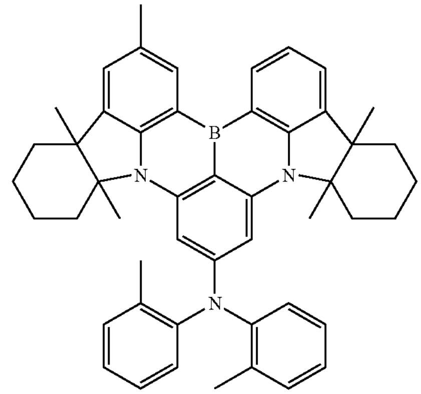
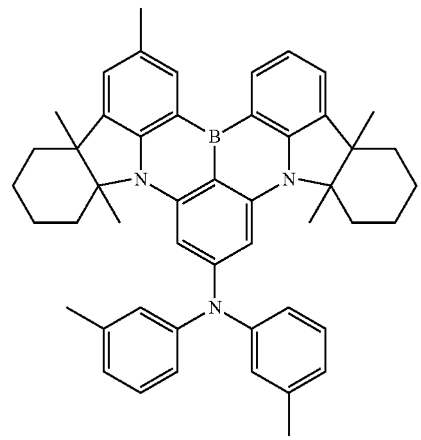
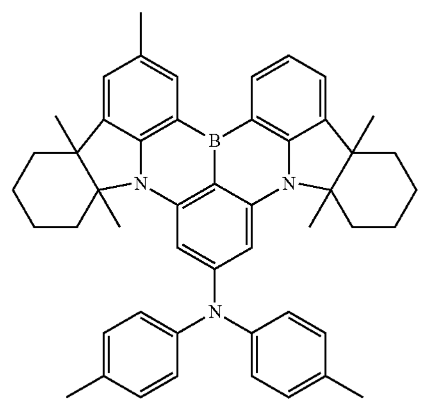
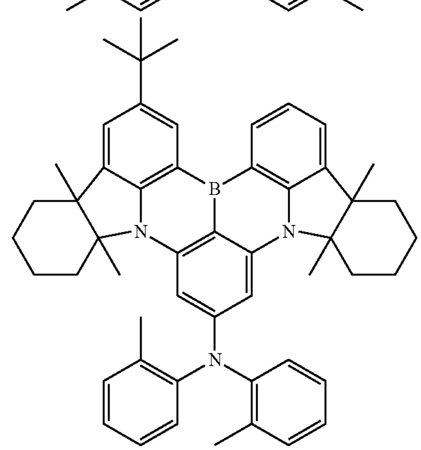

-continued
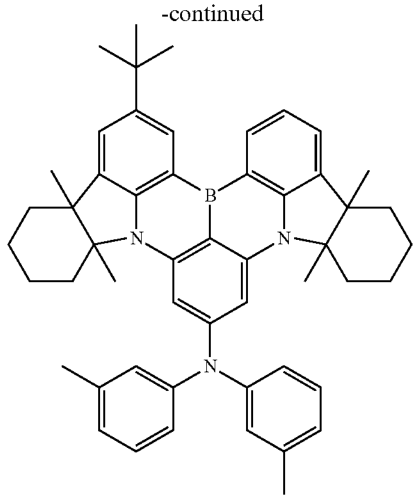
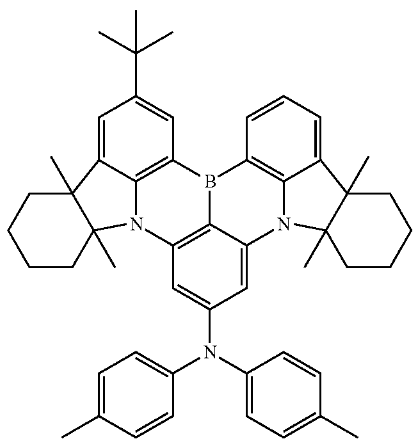
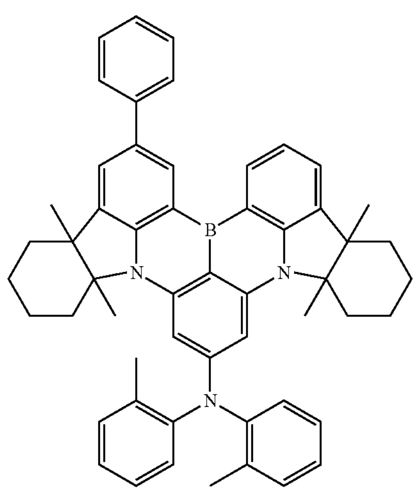
-continued
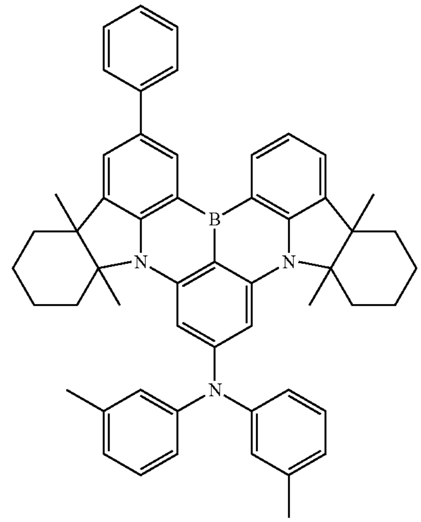
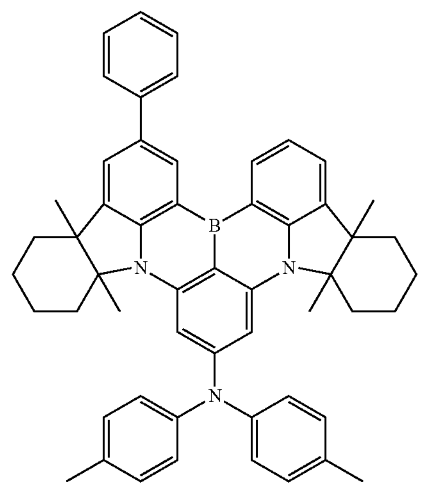
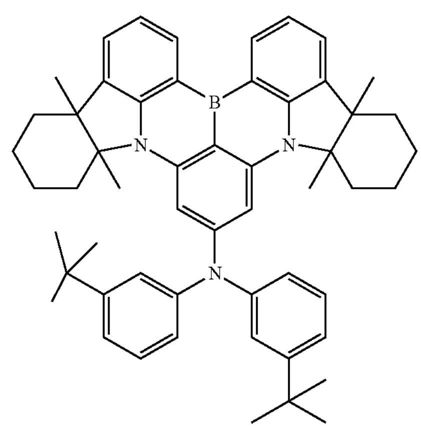

-continued
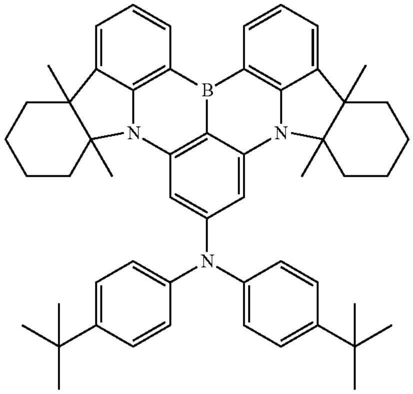
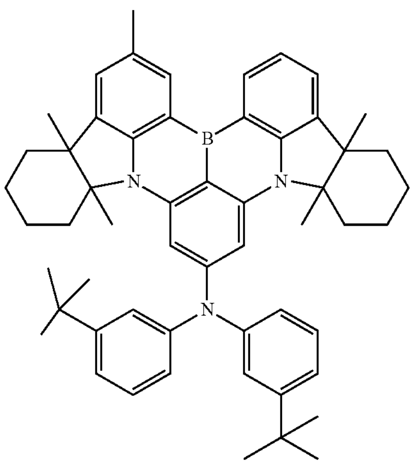
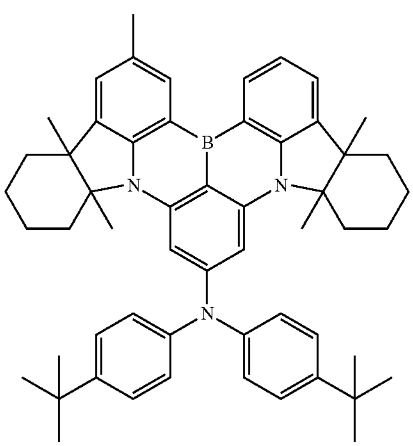
-continued
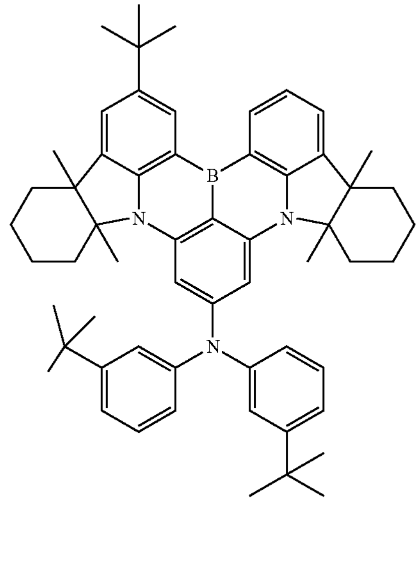
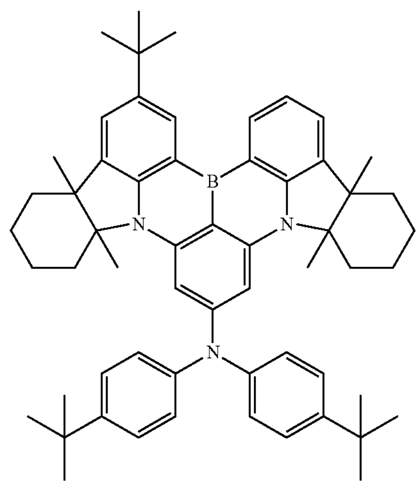
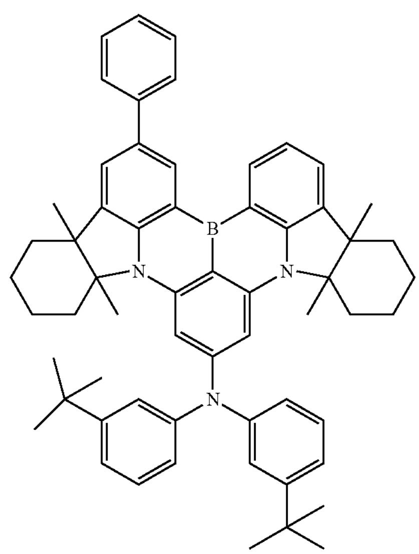

-continued
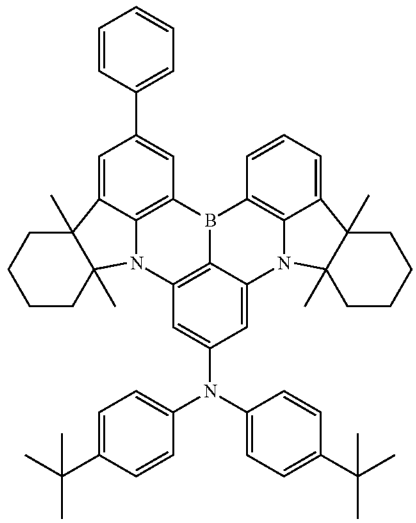
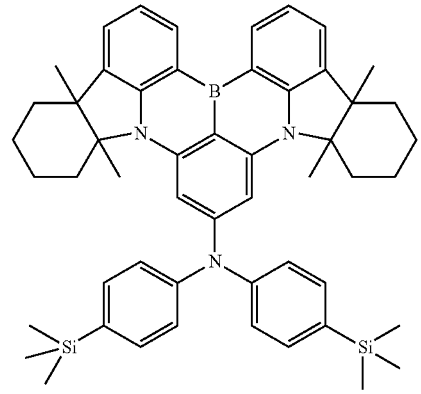
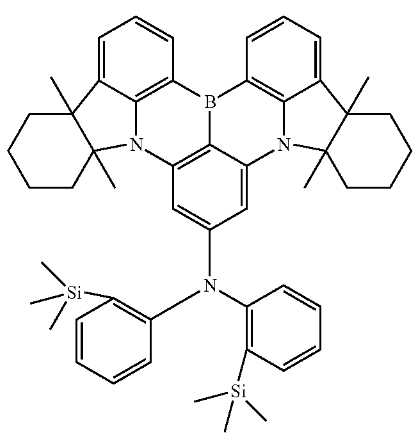
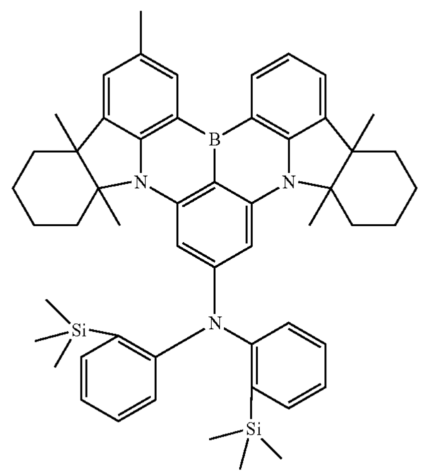
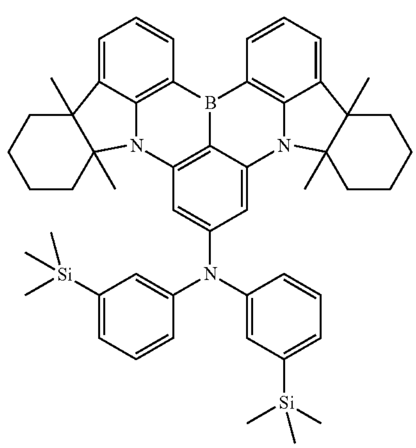
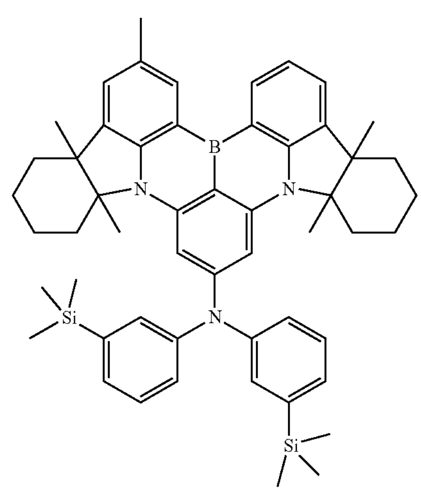
-continued -continued
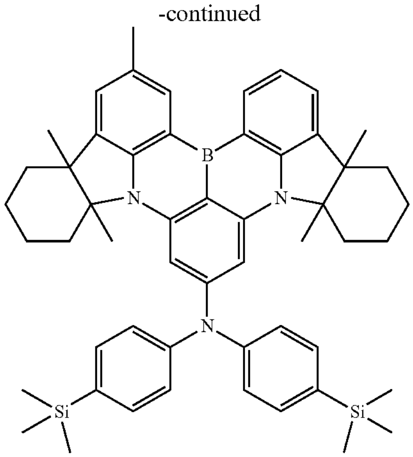
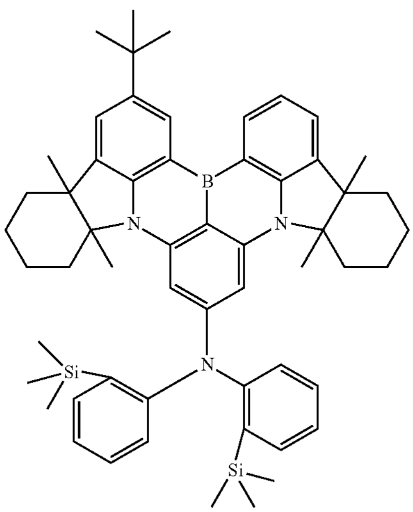
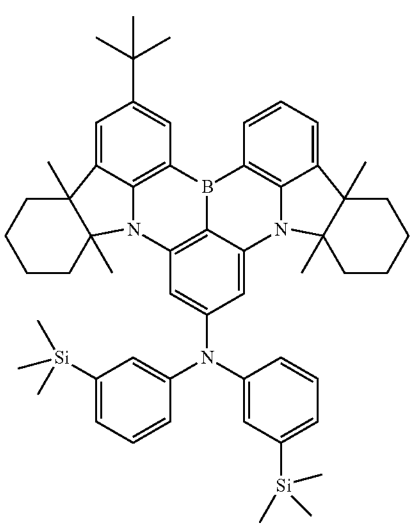
-continued
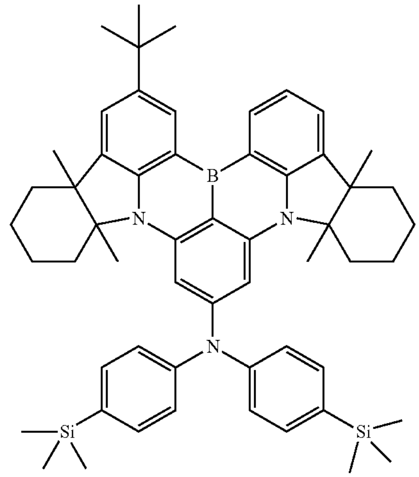
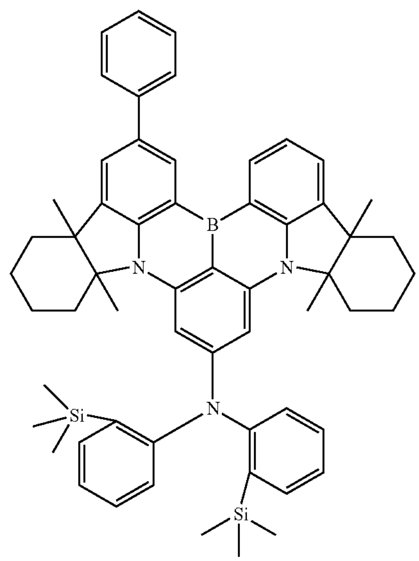
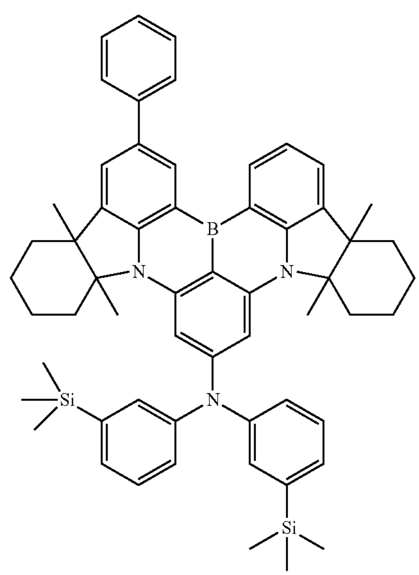

-continued
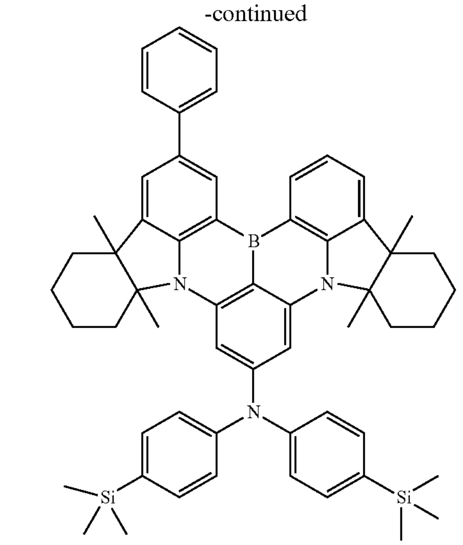
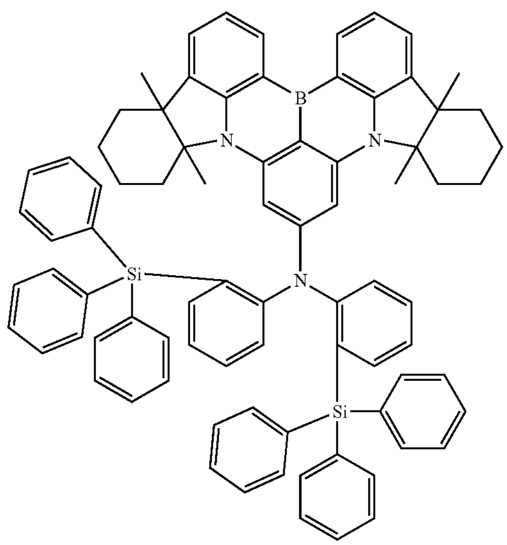
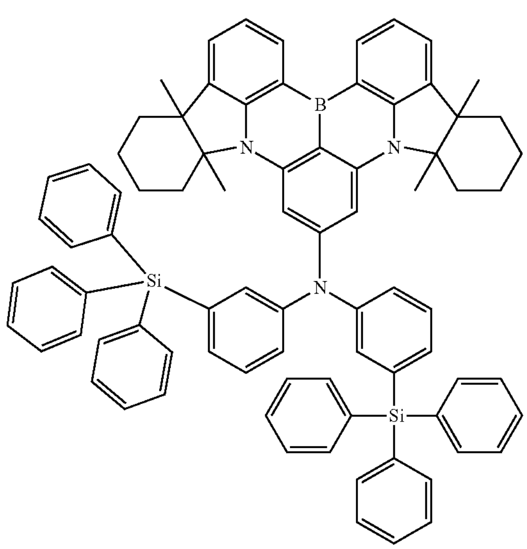
-continued
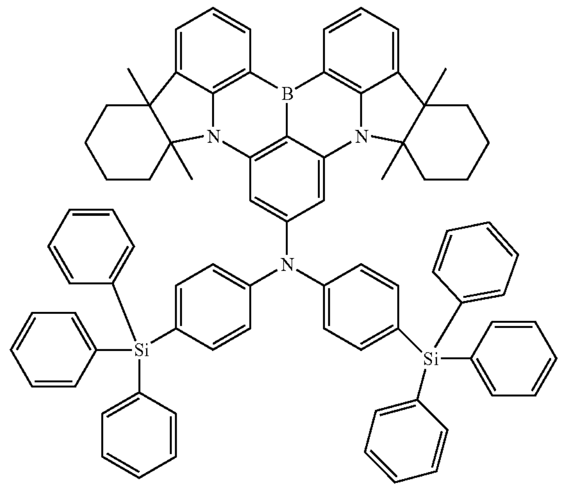
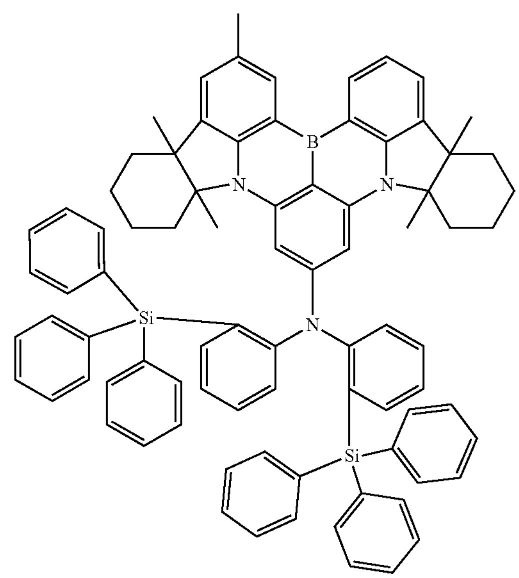
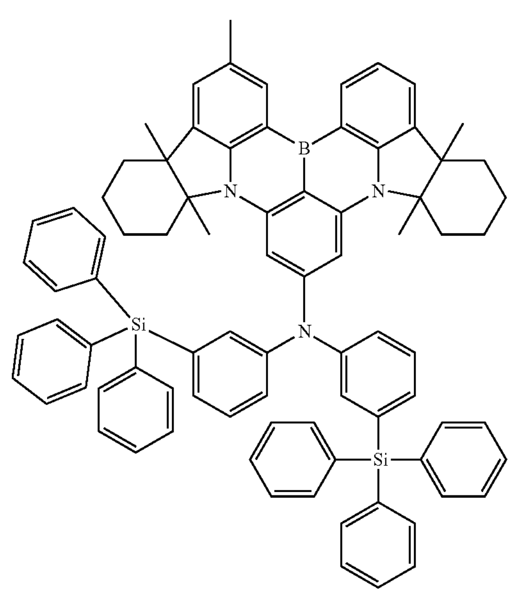

-continued
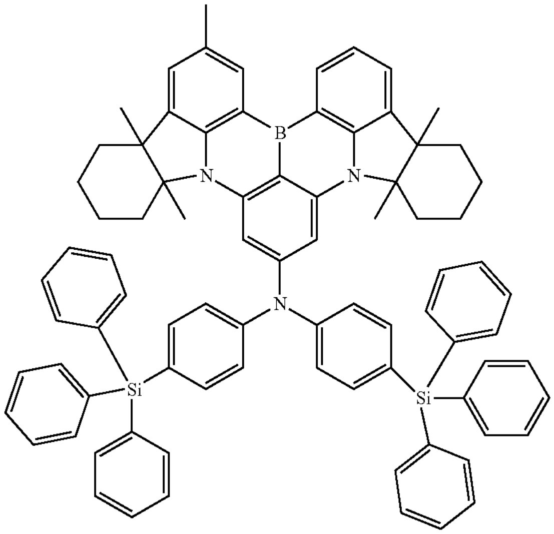
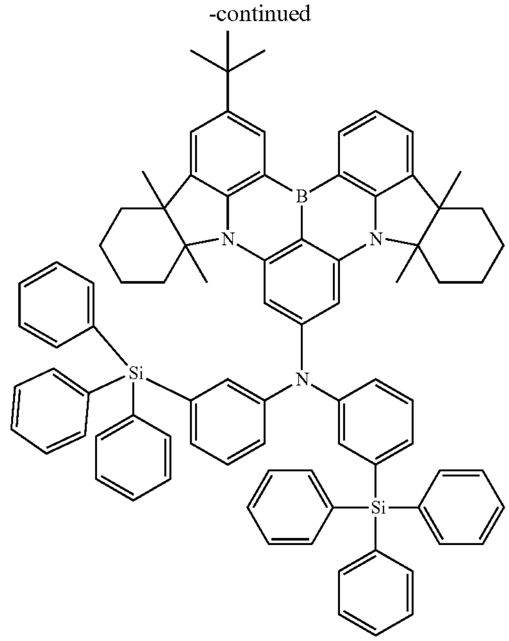
-continued
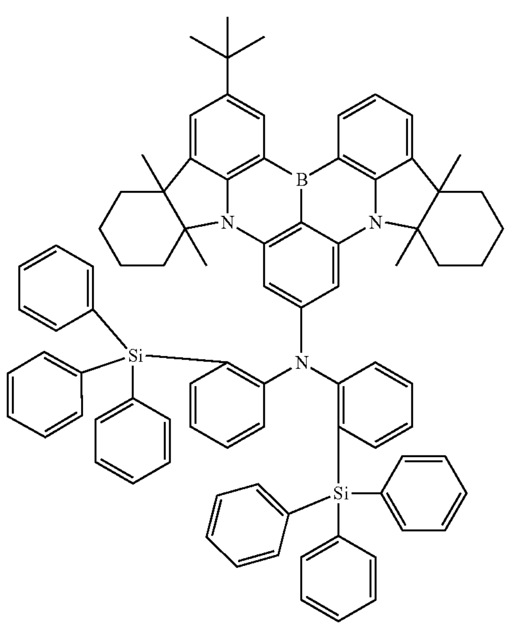
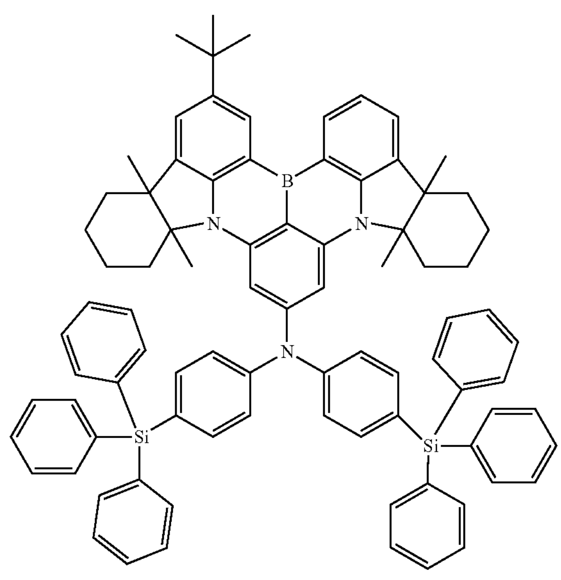

-continued
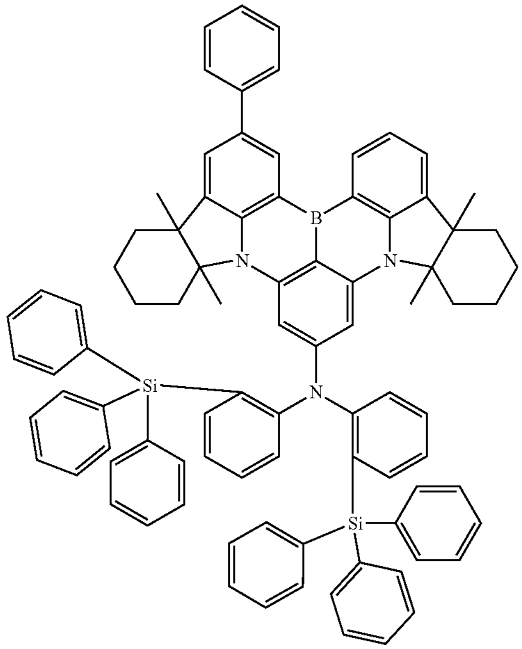
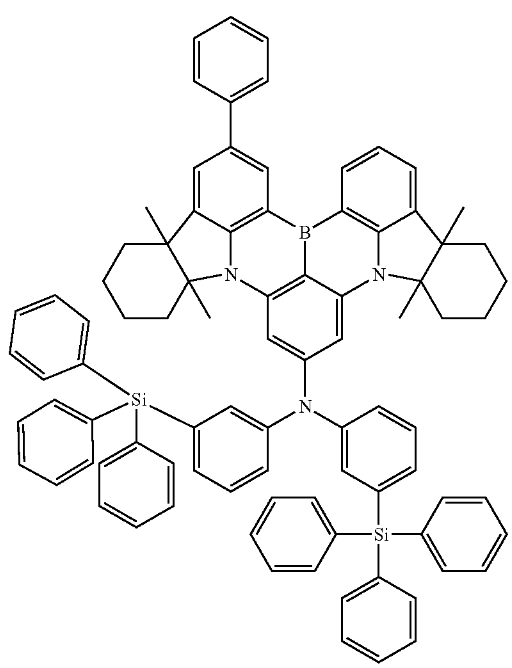
-continued
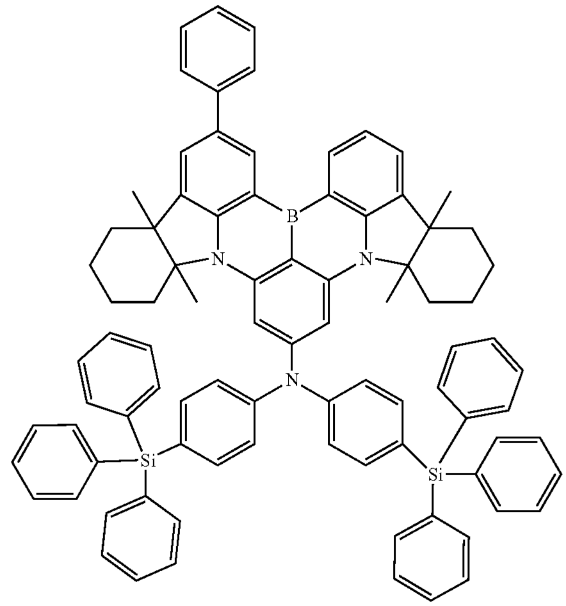 [SMILES: CC12CCCCC1(C)N1c3cc(N(c4ccc([Si](c5ccccc5)(c5ccccc5)c5ccccc5)cc4)c4ccc([Si](c5ccccc5)(c5ccccc5)c5ccccc5)cc4)cc4c3B(c3cccc2c31)c1cc(-c2ccccc2)cc2c1N4C1(C)CCCCC21C]
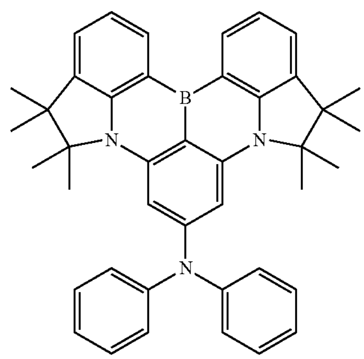
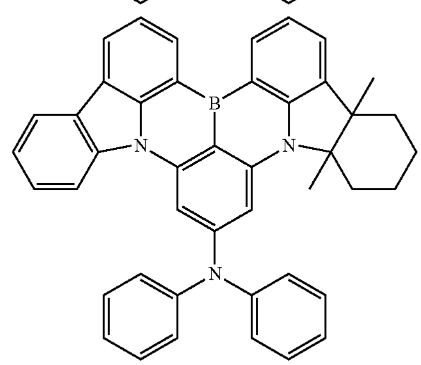
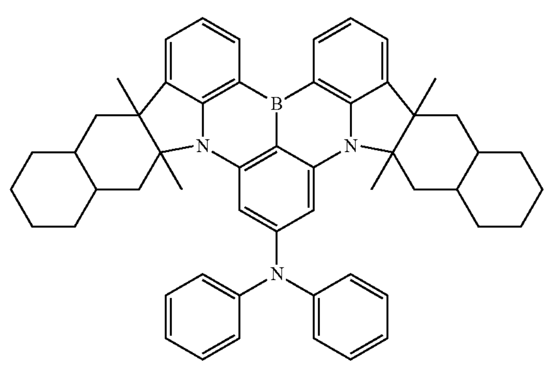

-continued
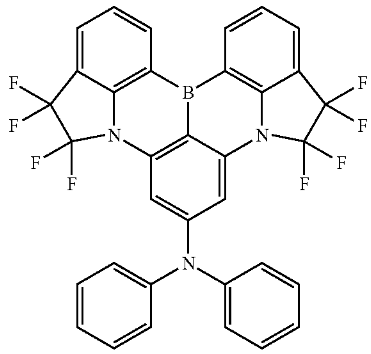
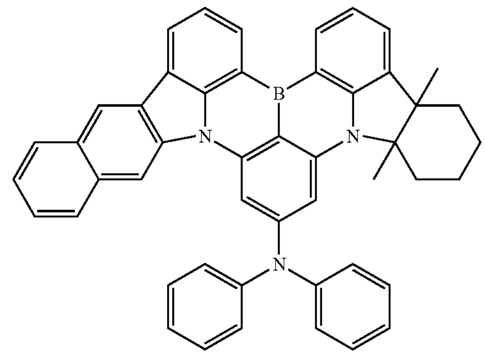
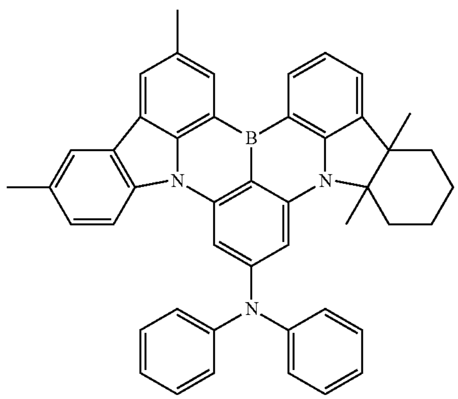
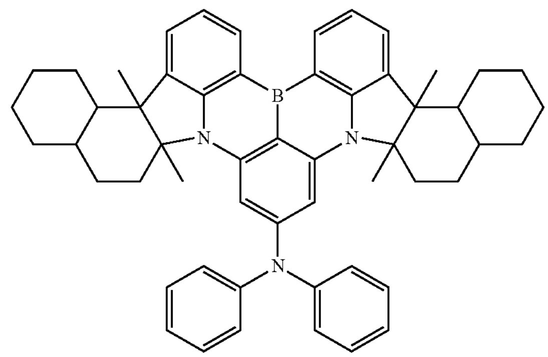
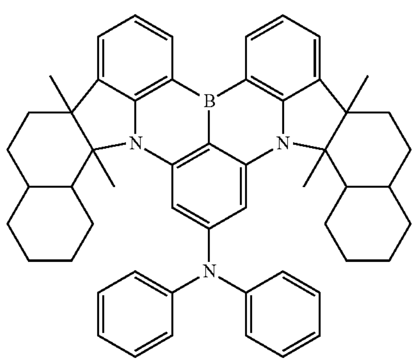
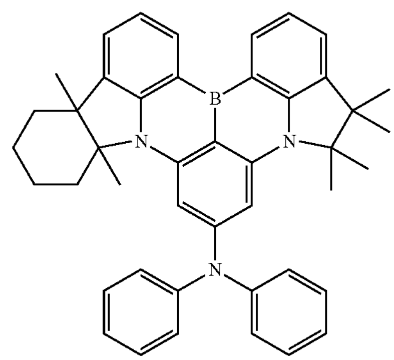
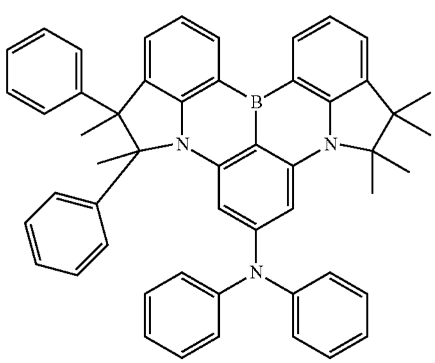
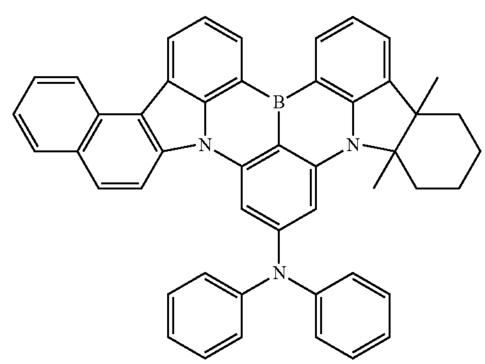

-continued
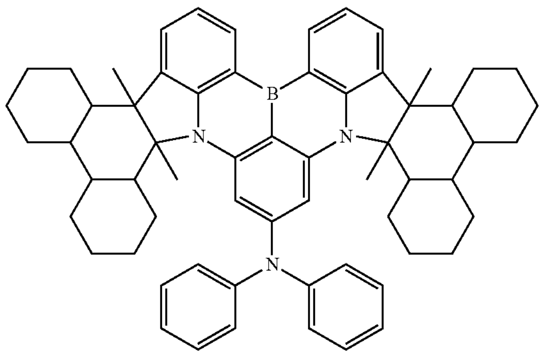
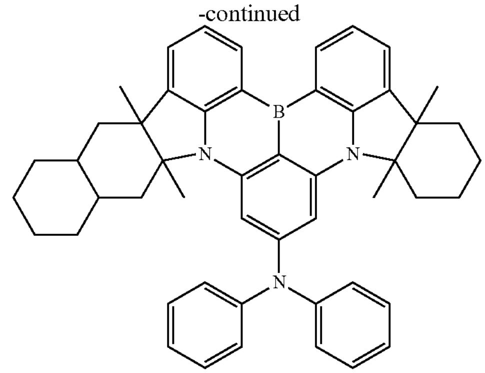
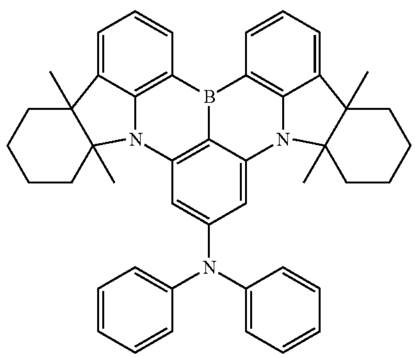
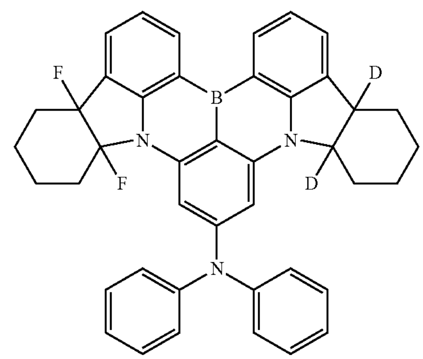
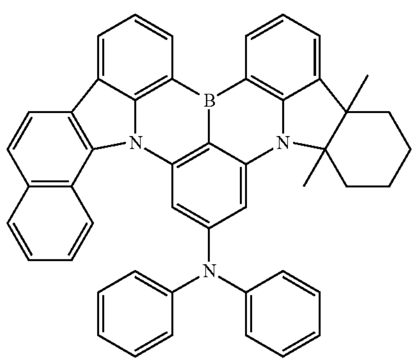
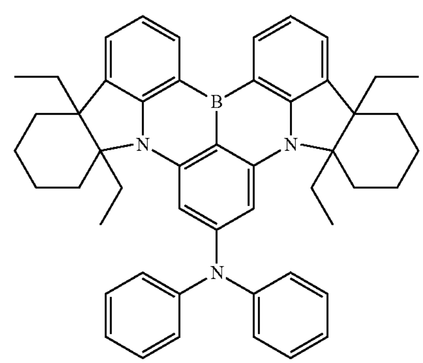
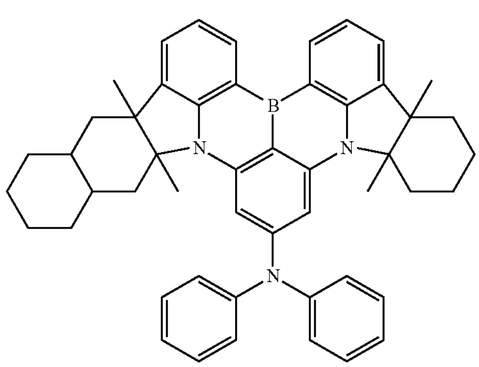
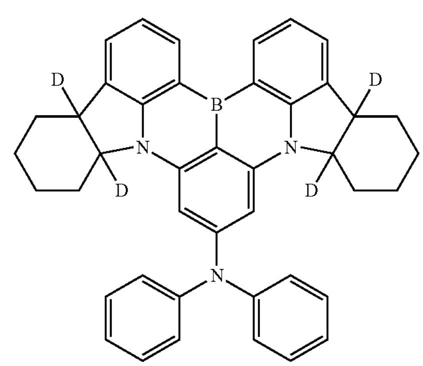

-continued
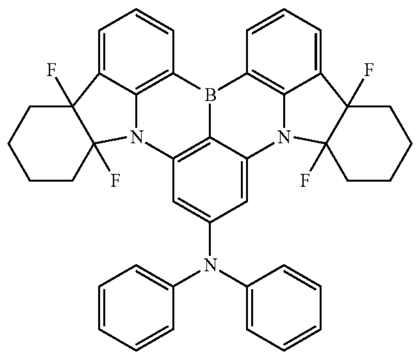
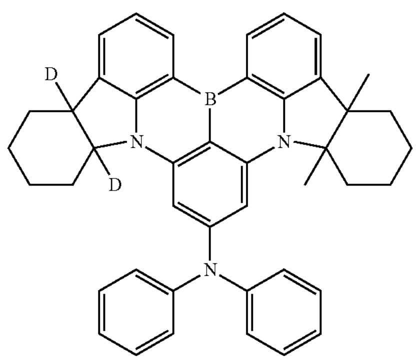
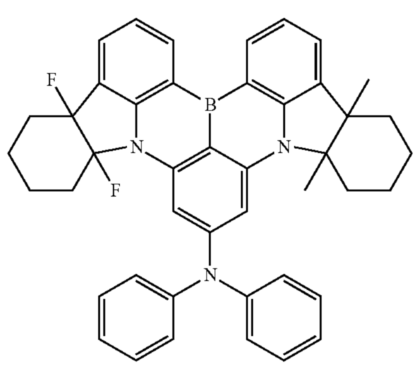
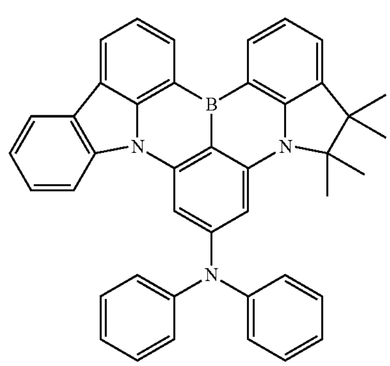
-continued
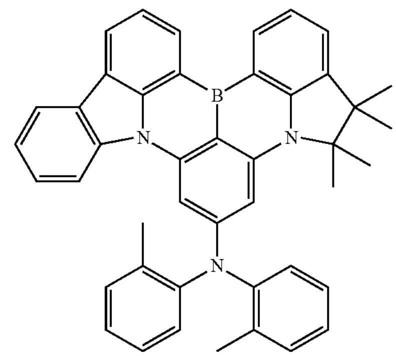
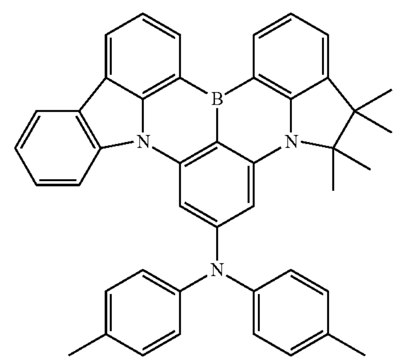
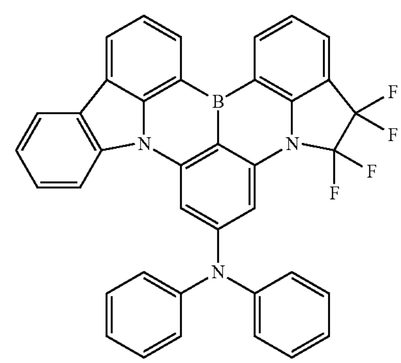
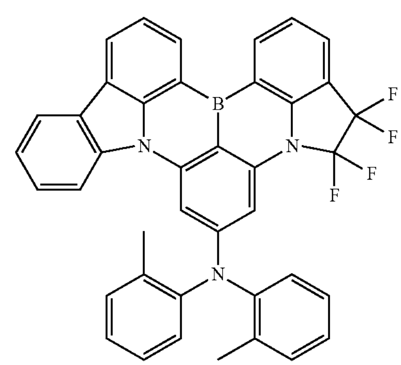

-continued
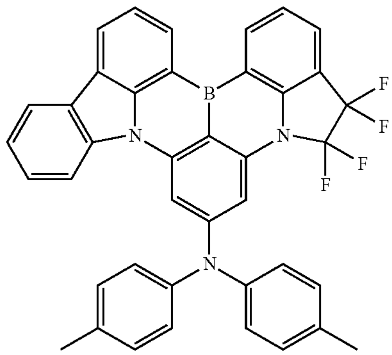
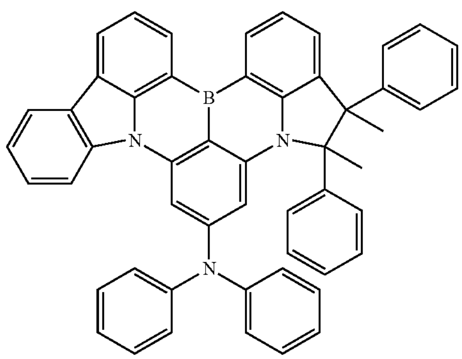
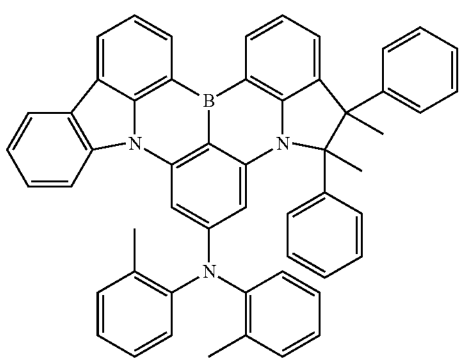
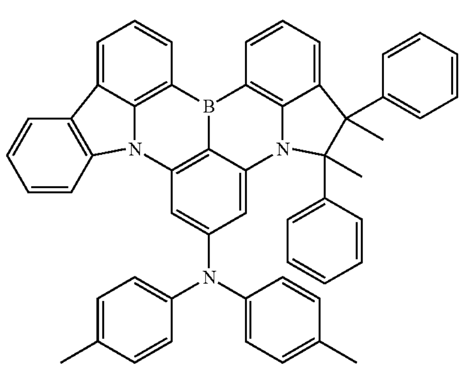
-continued
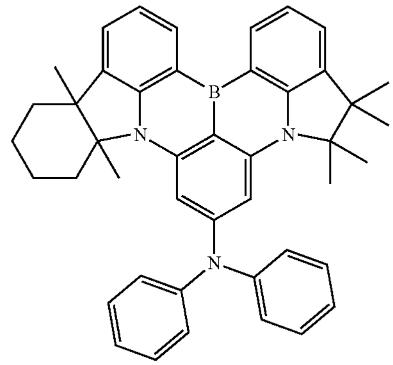
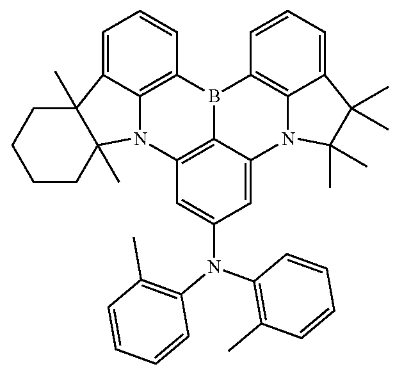
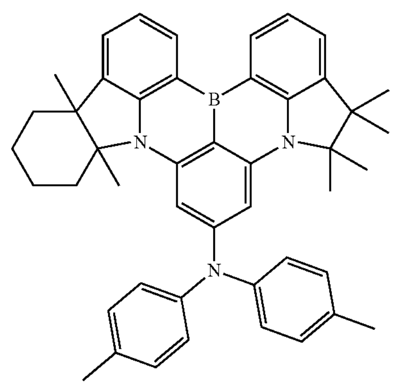
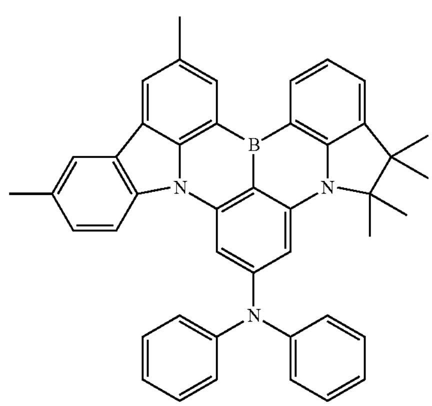

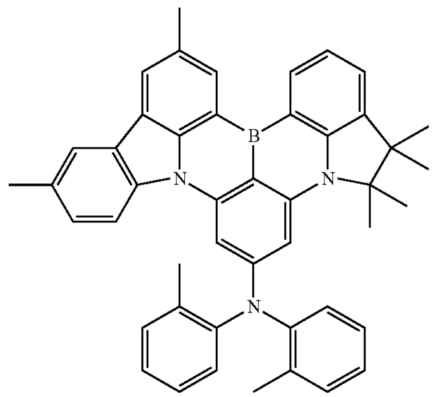
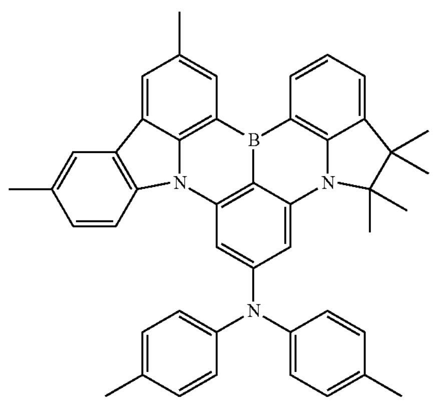
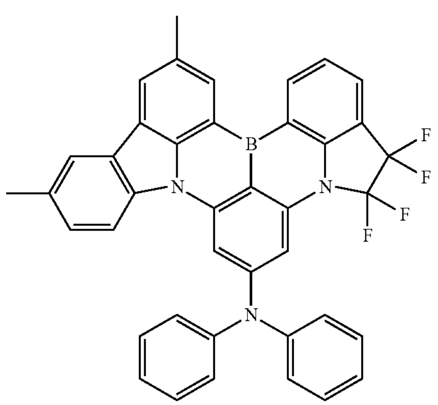
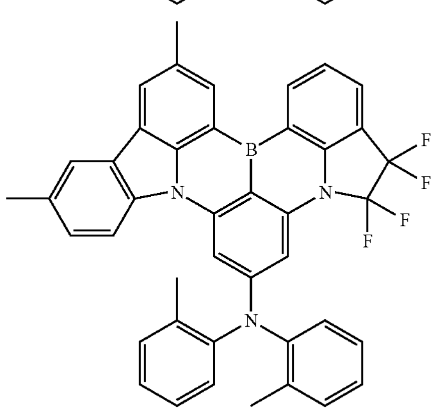
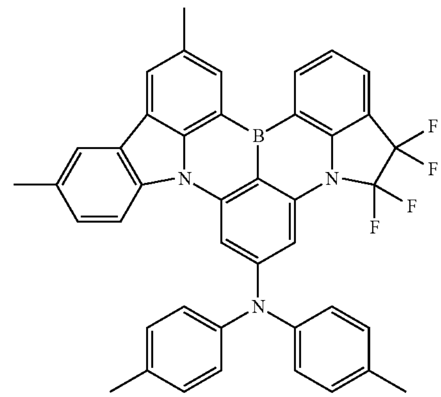
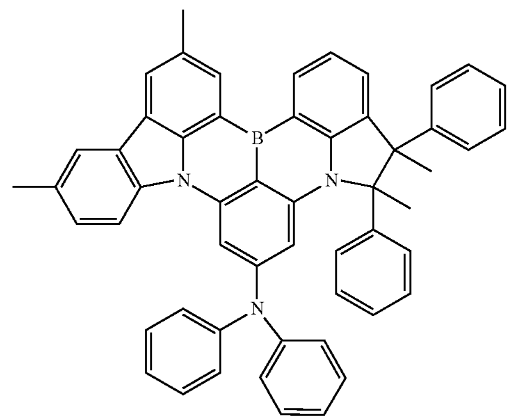
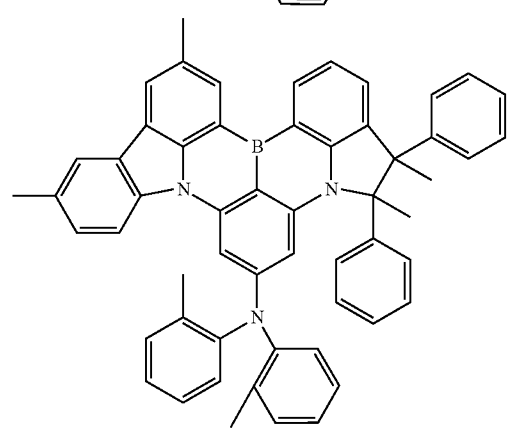
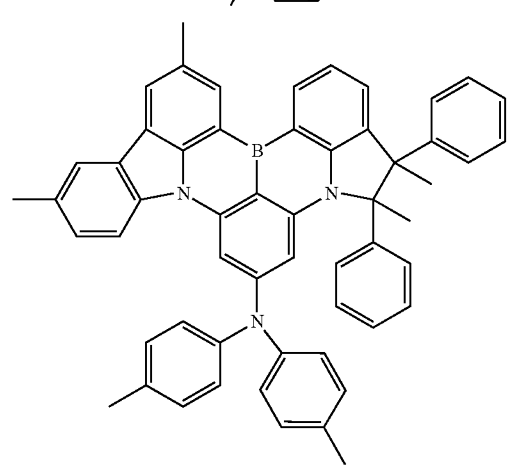

-continued
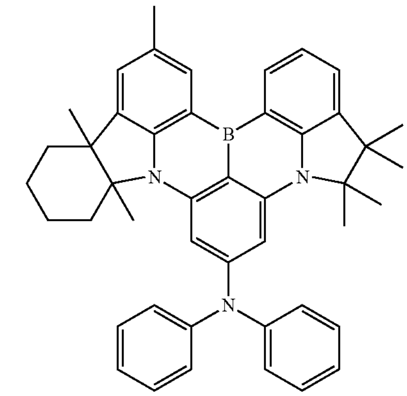
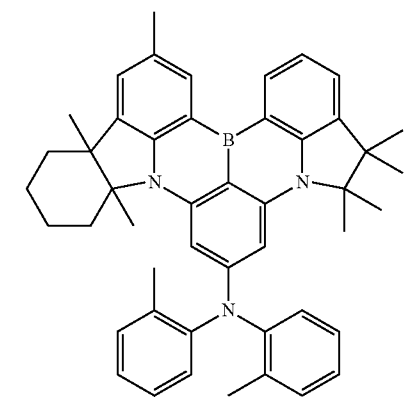
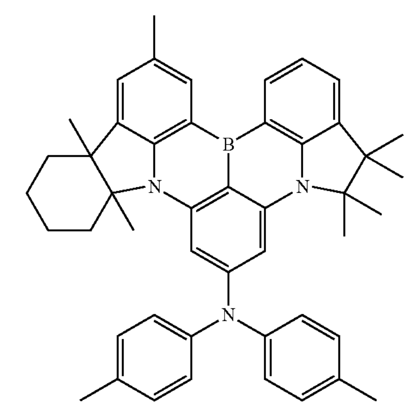
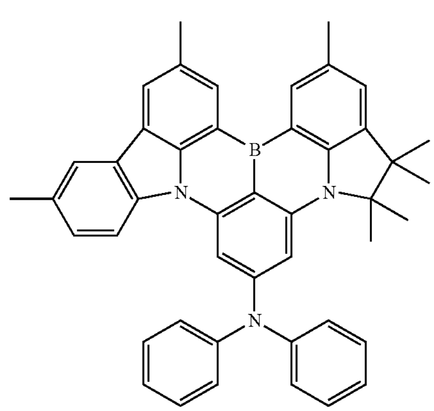
-continued
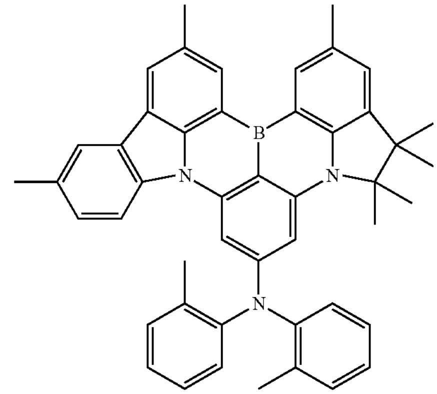
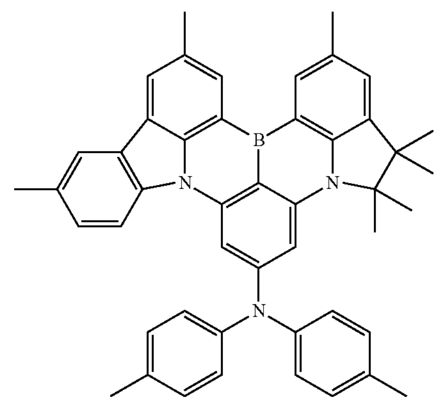
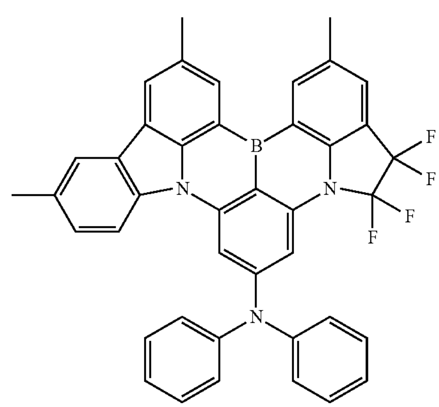
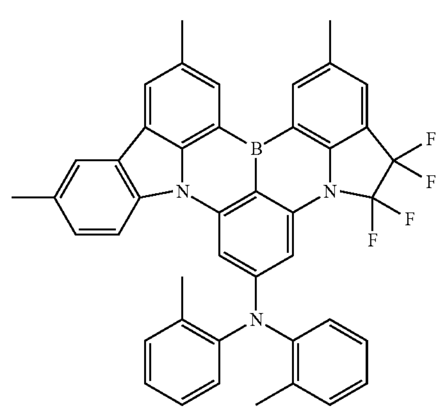

-continued
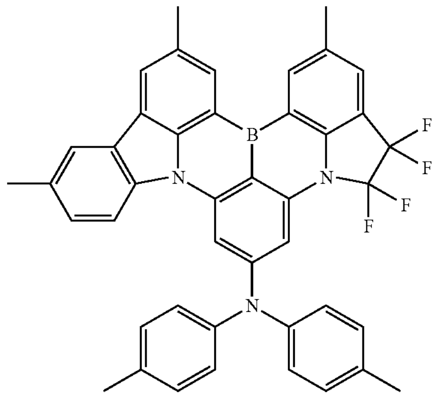
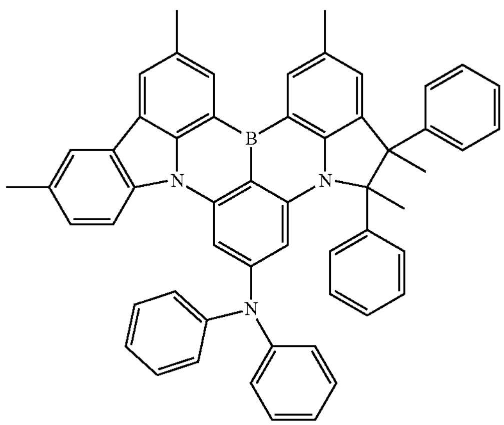
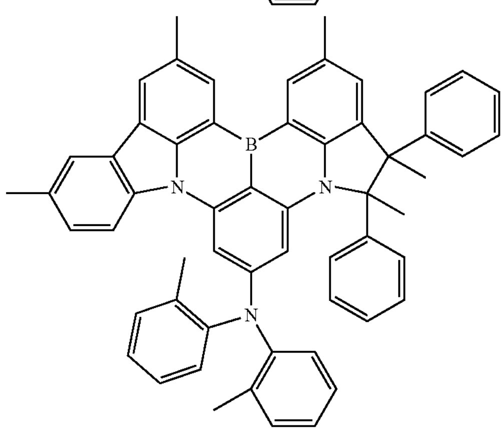
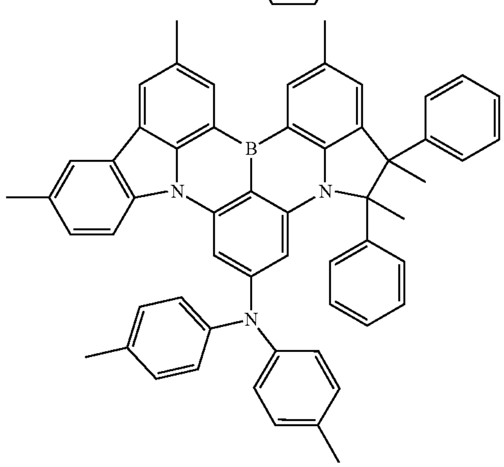
-continued
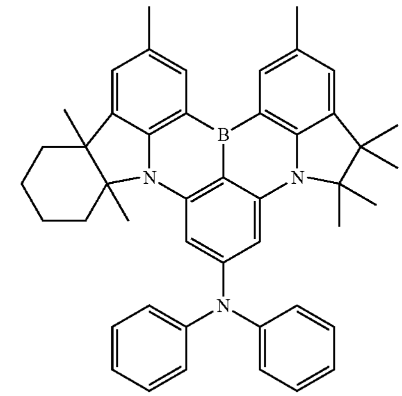
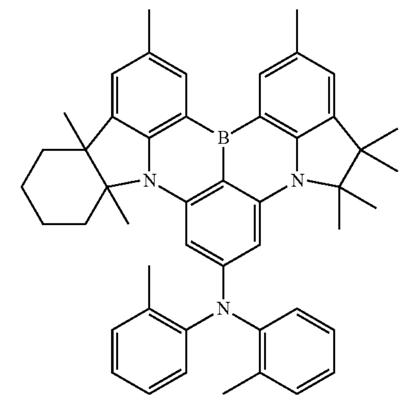
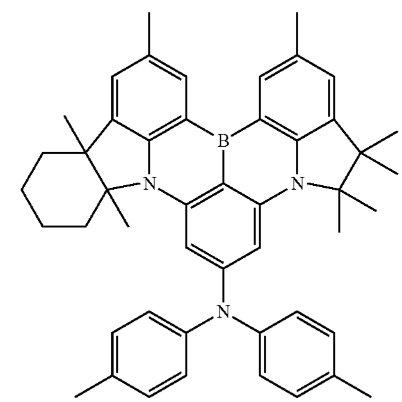
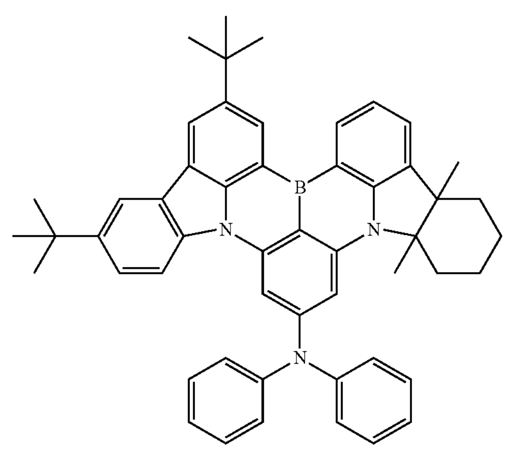

-continued
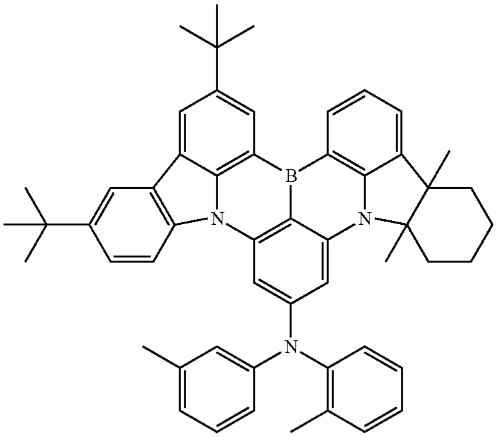
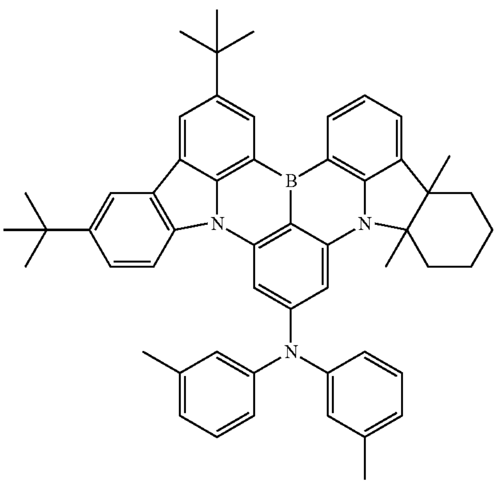
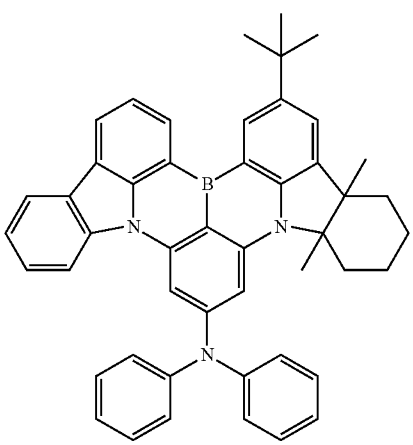
-continued
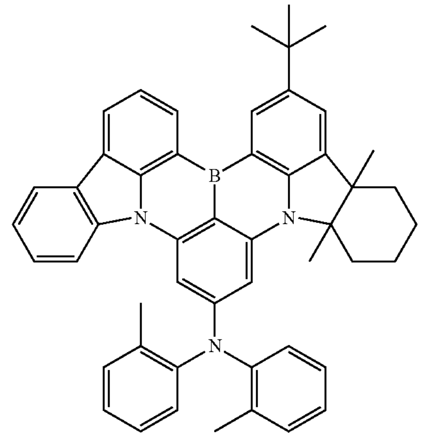
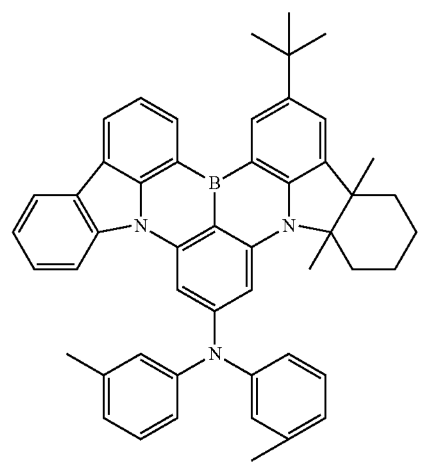
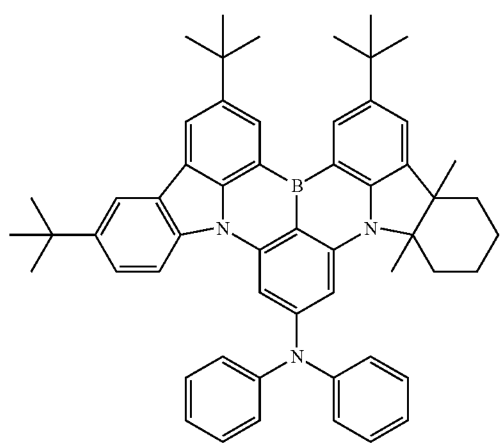

-continued
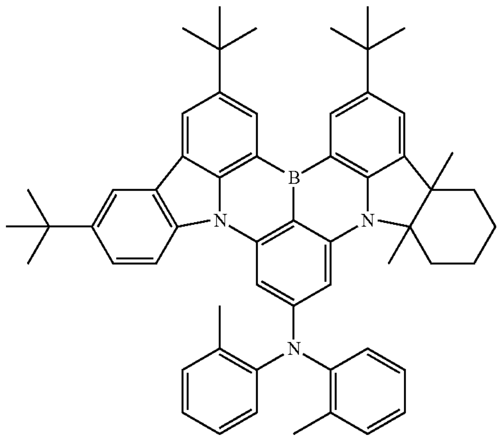
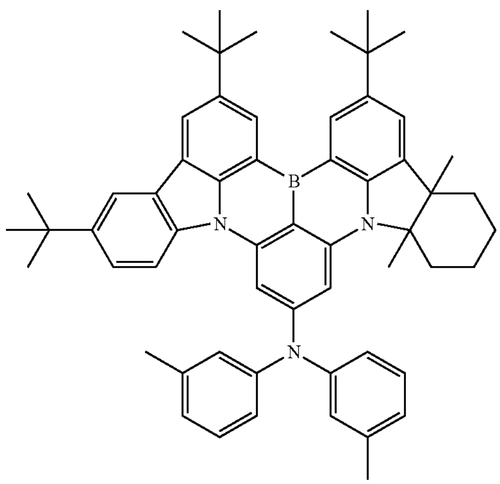
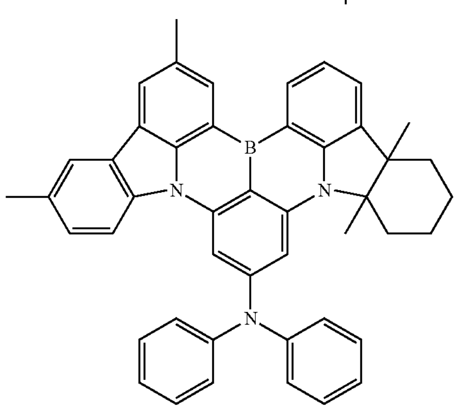
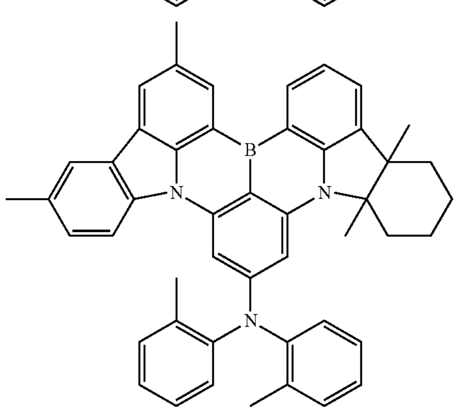
-continued
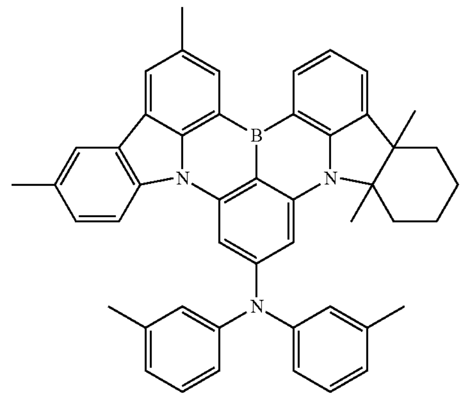
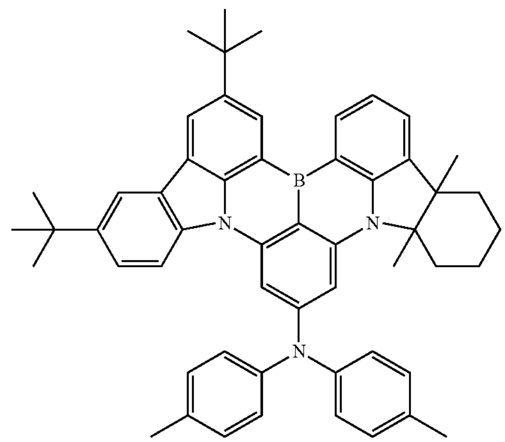
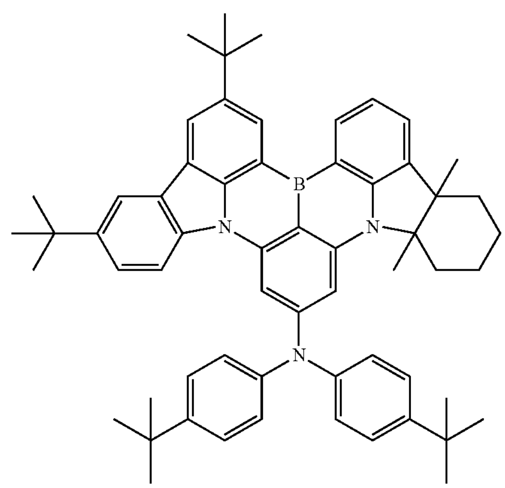
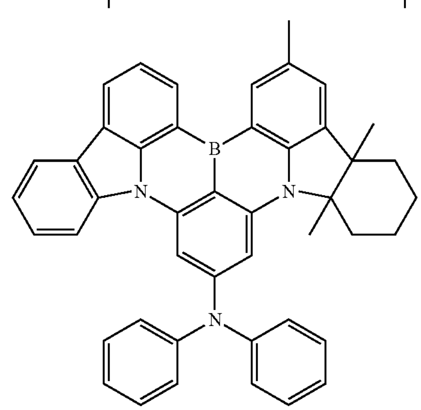

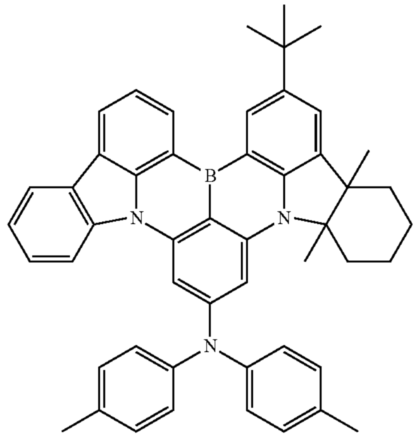
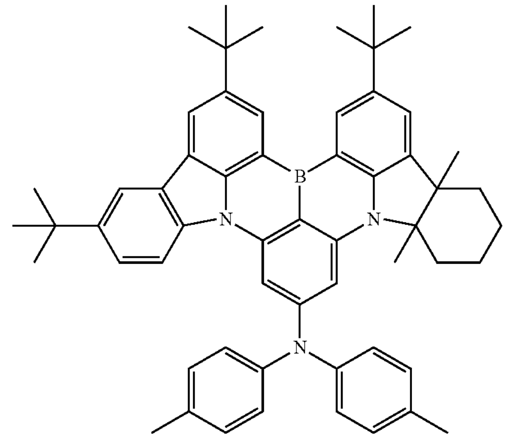
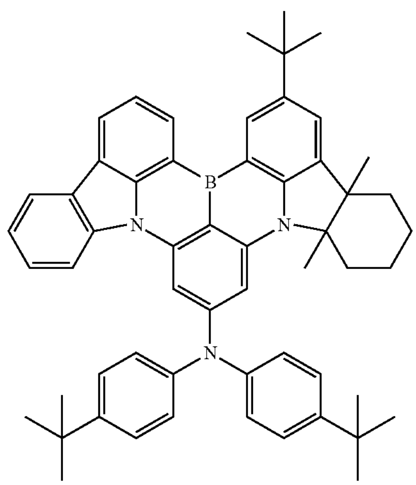
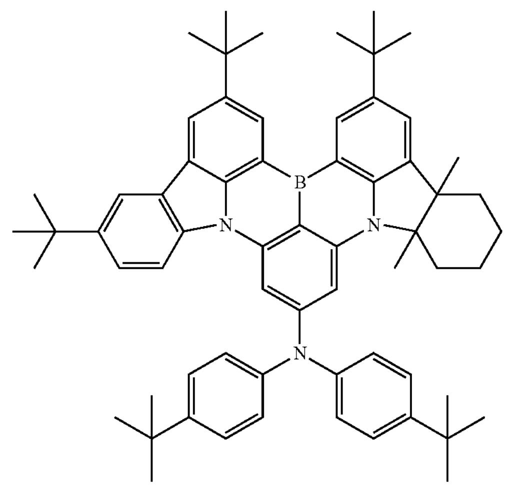
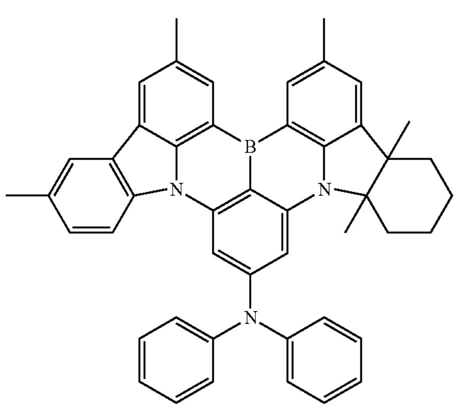
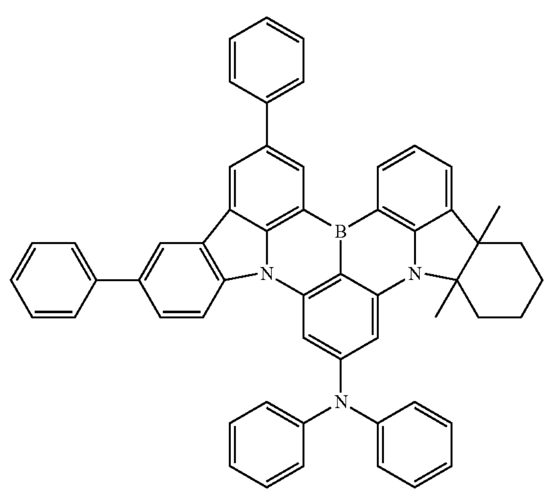

-continued
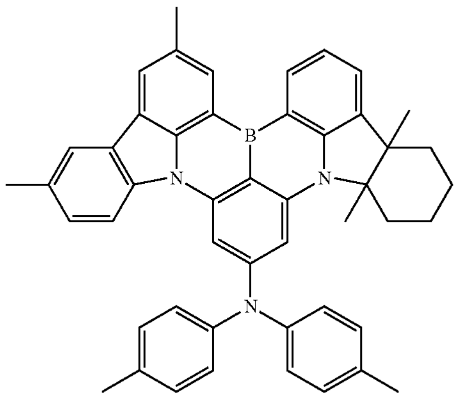
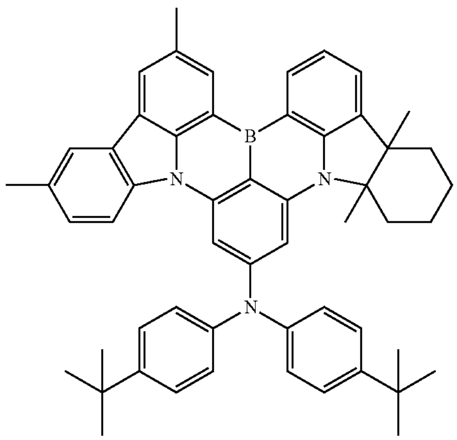
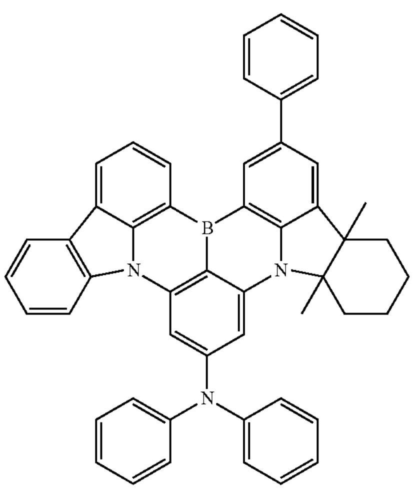
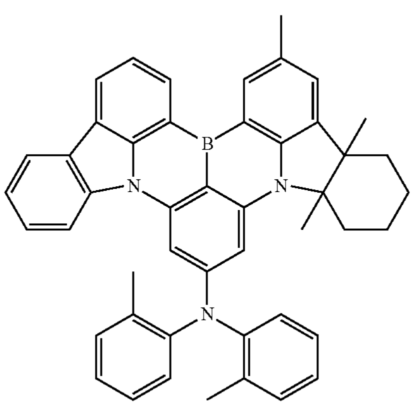
-continued
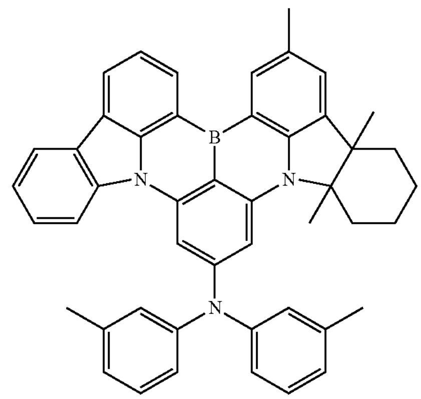
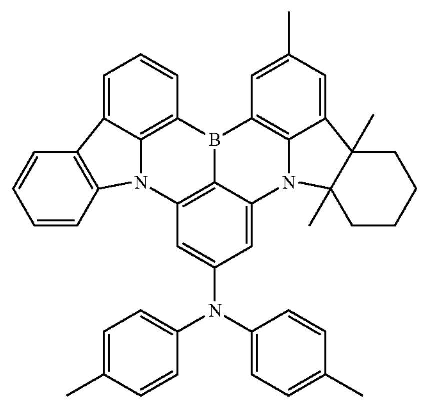
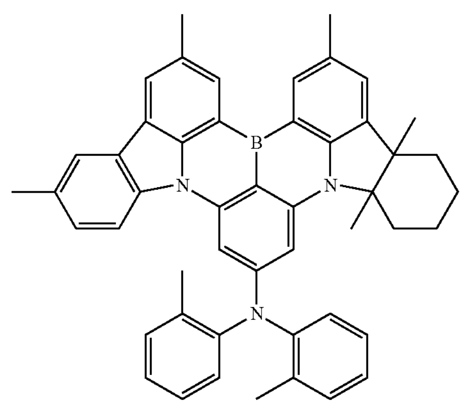
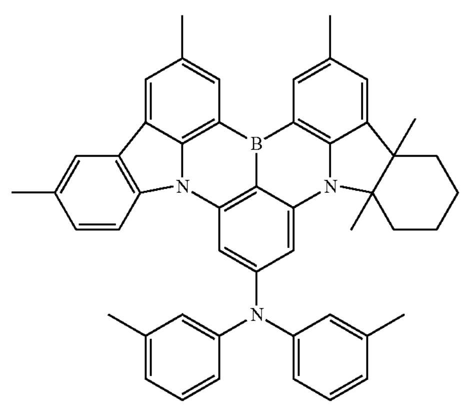

-continued
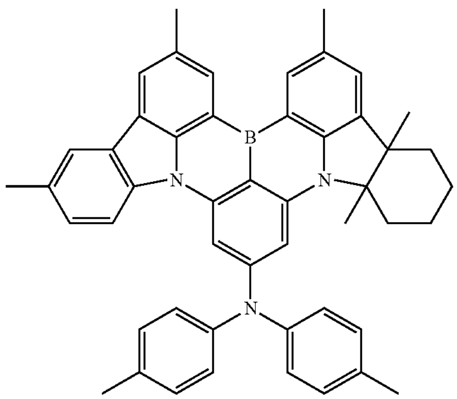
-continued
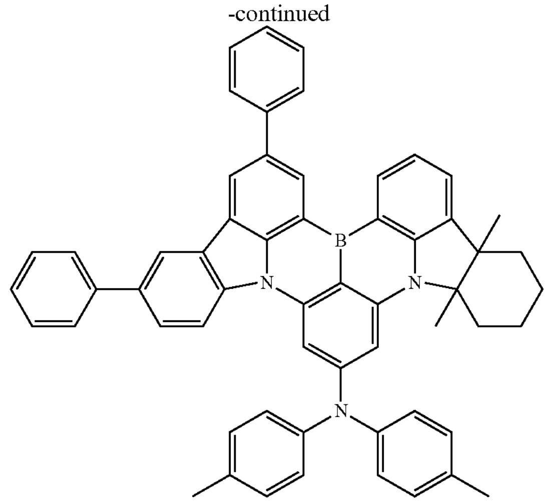
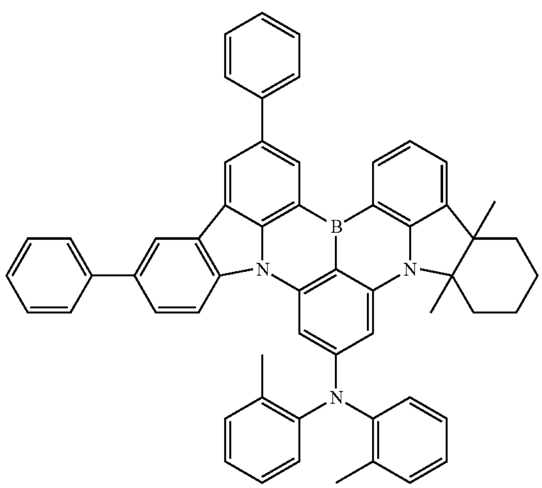
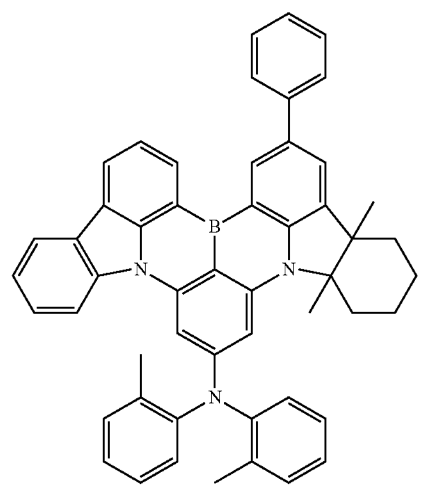
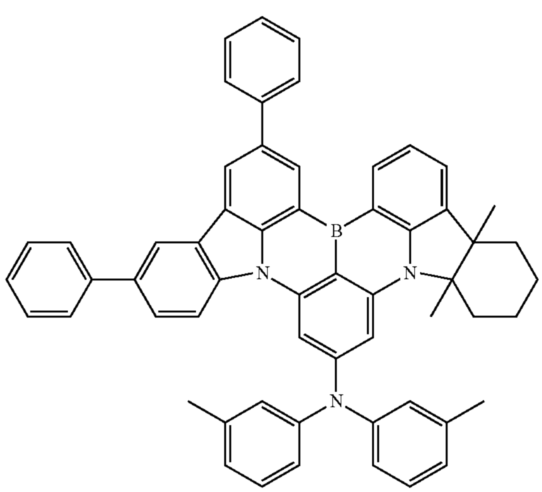
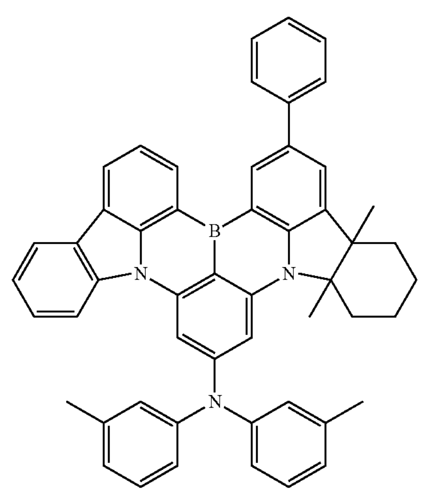

-continued
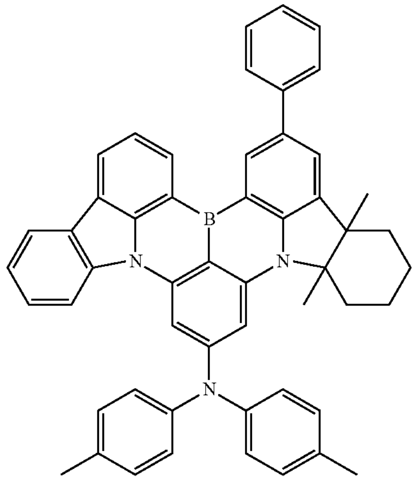
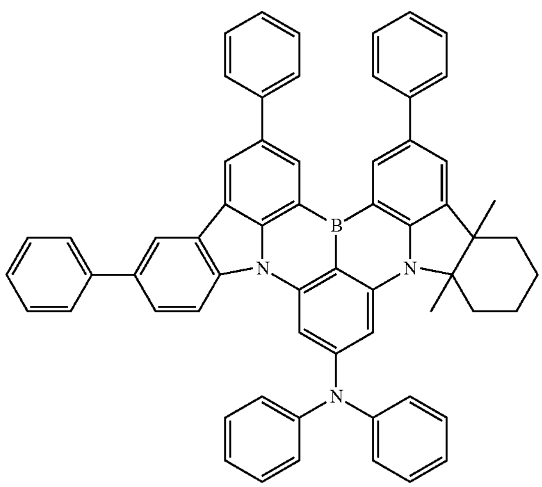
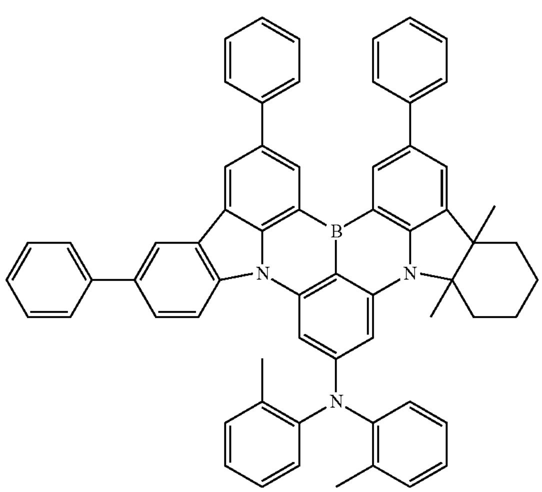
-continued
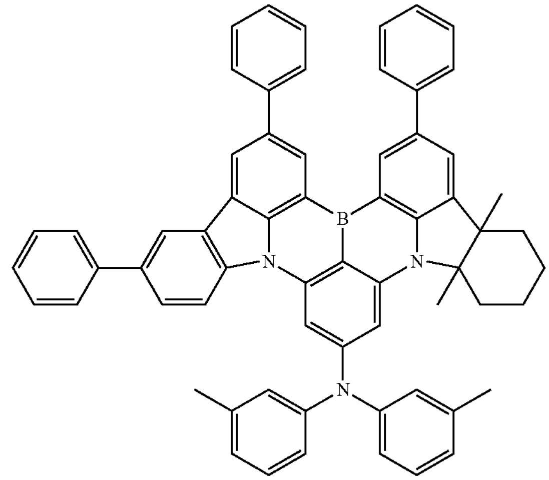
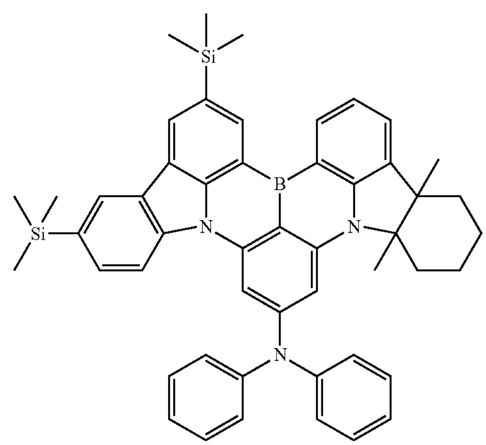
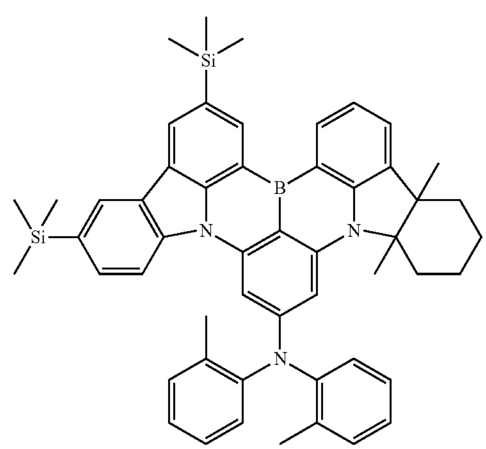

-continued
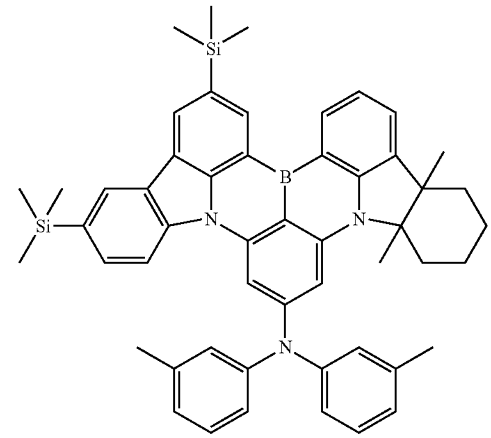
-continued
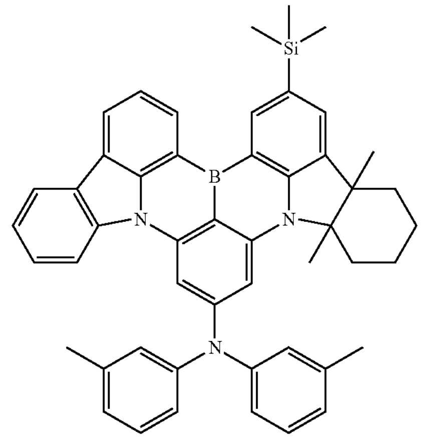
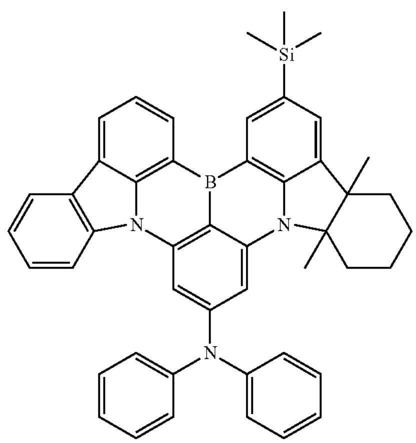
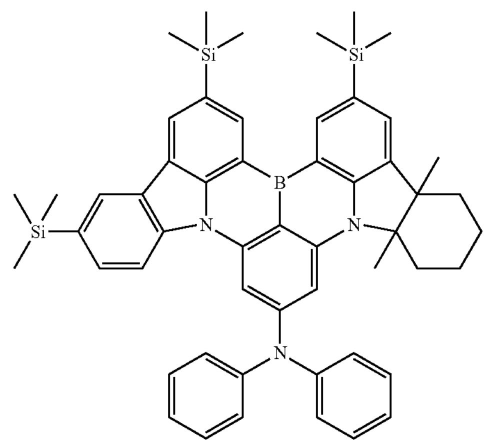
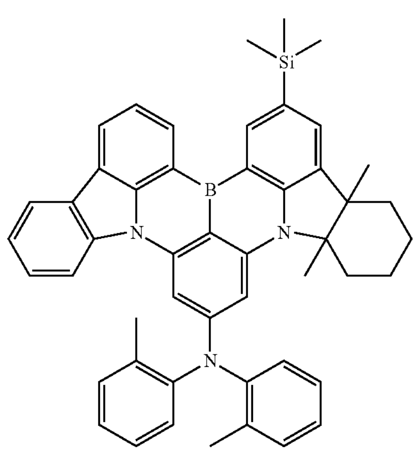
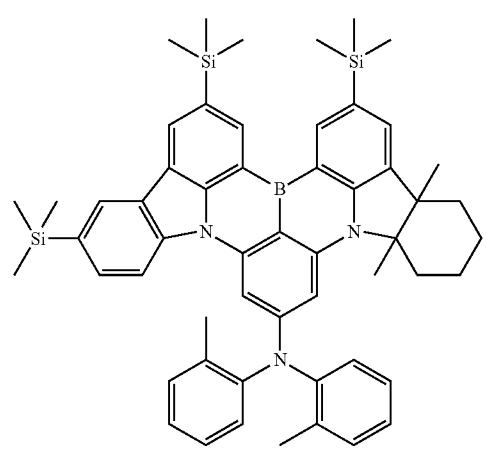

-continued
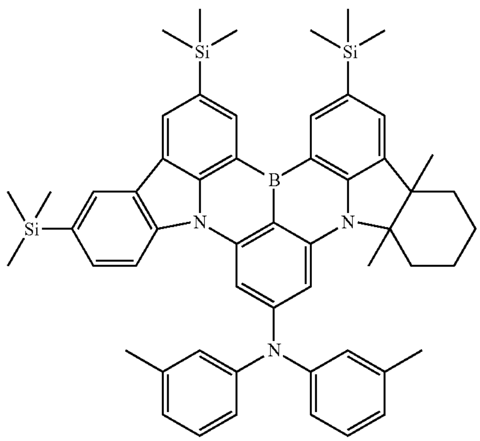
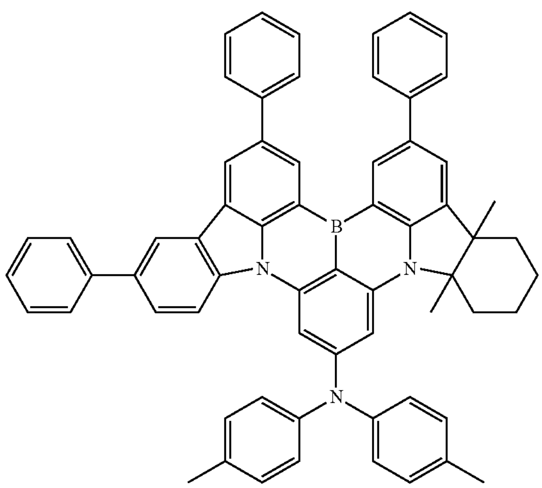
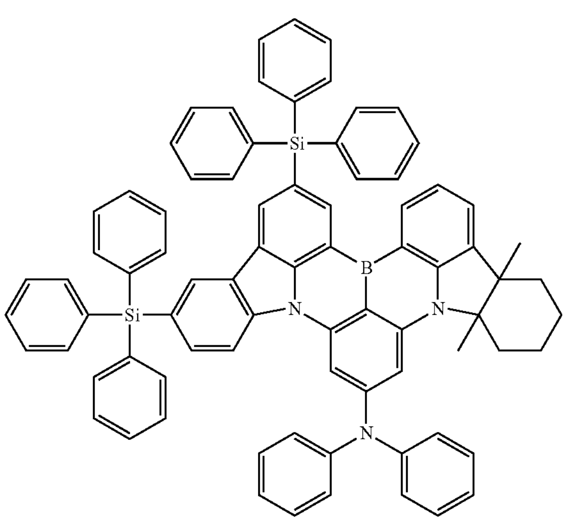
-continued
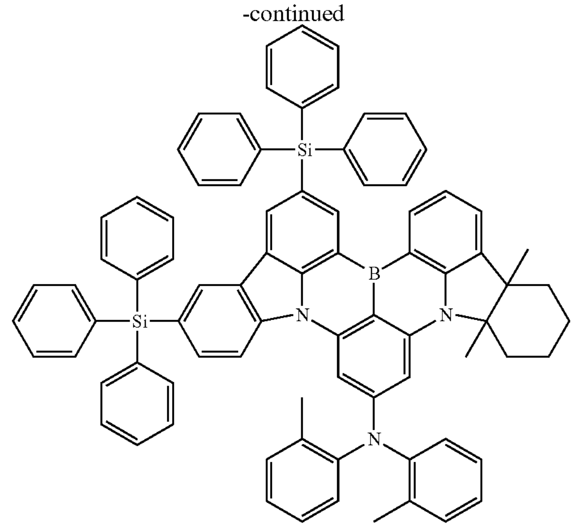
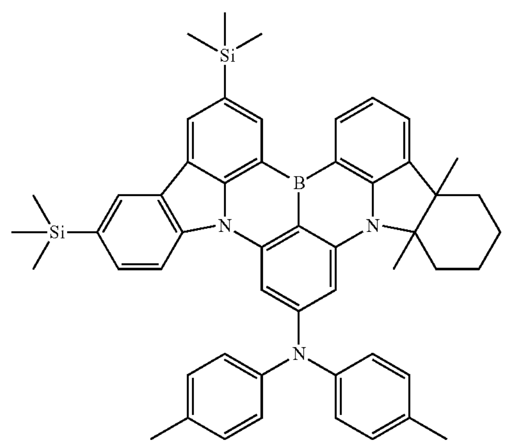
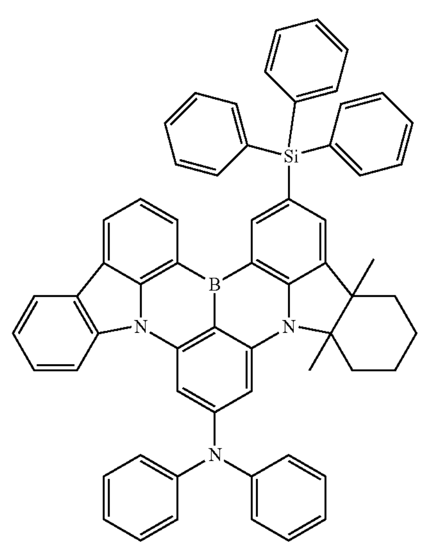

-continued
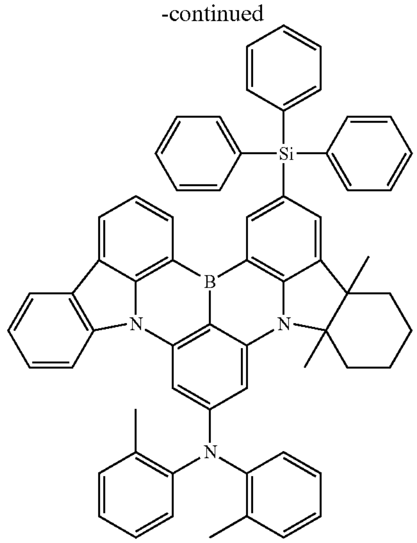
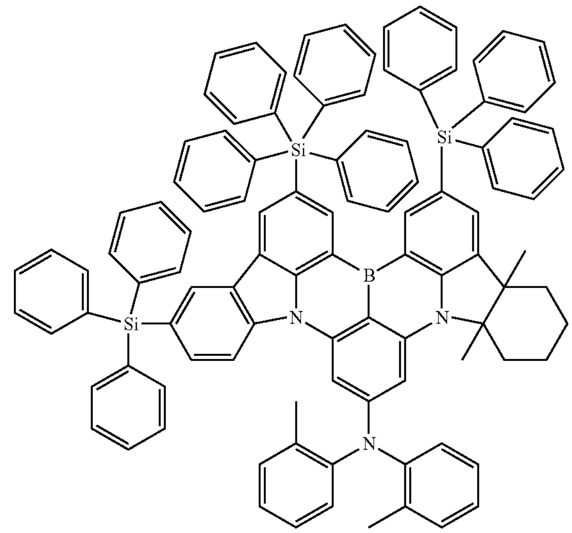
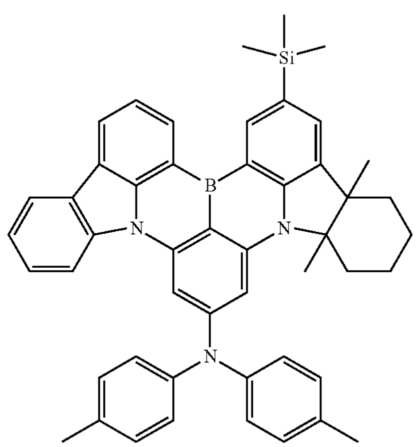
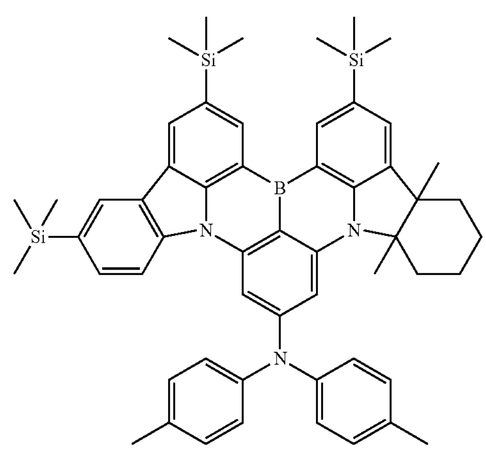
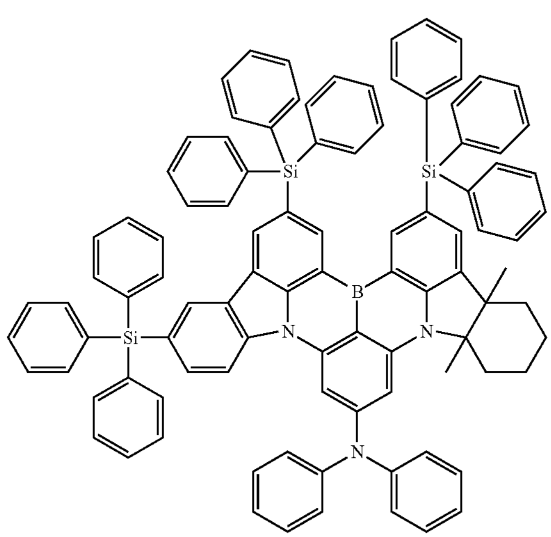
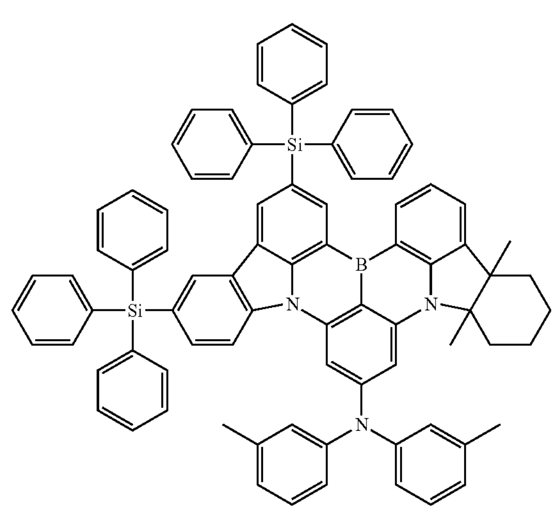

-continued
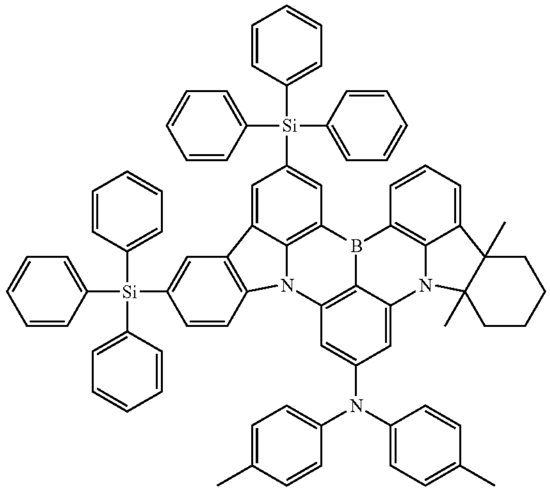
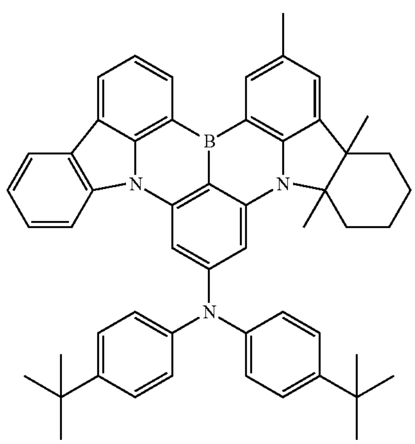
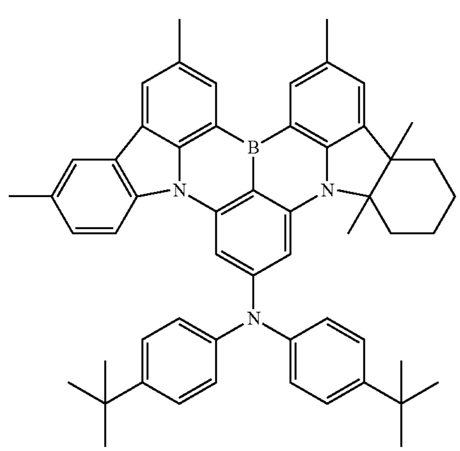
-continued
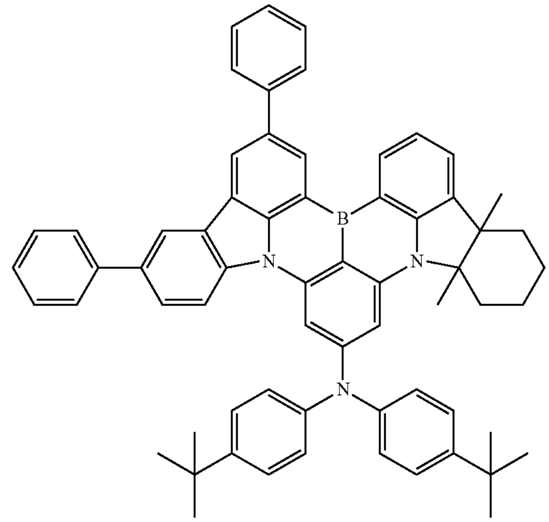
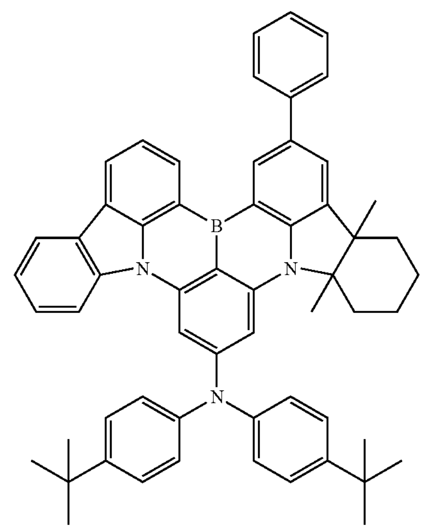
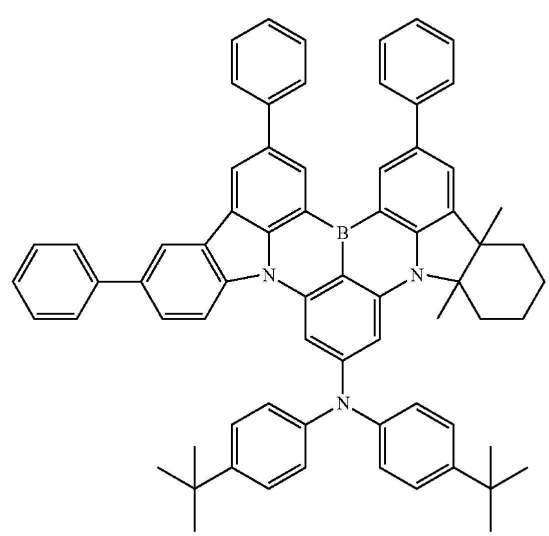

-continued
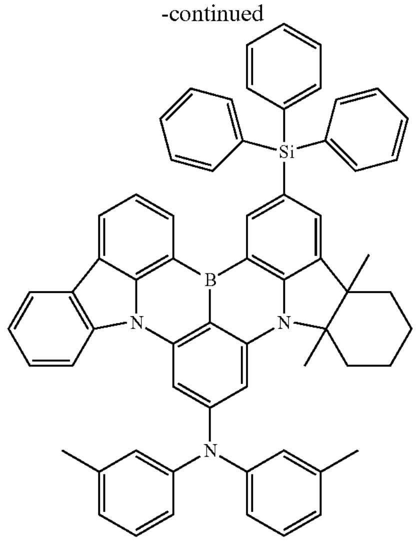
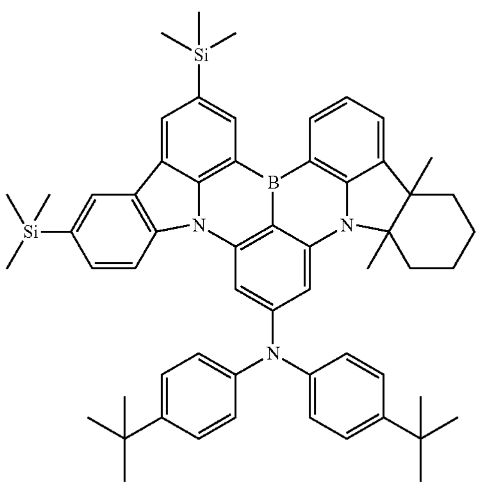
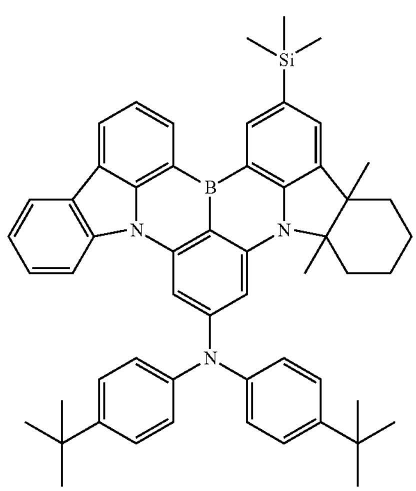
-continued
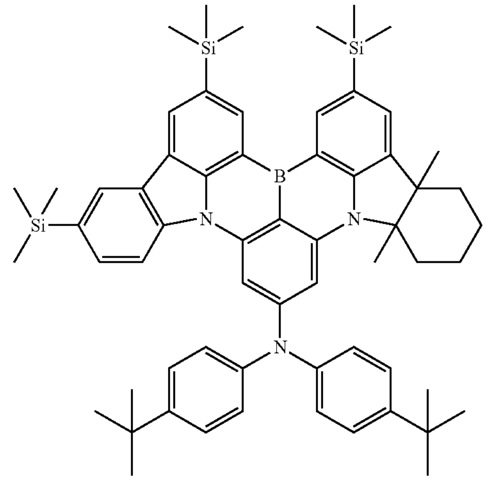
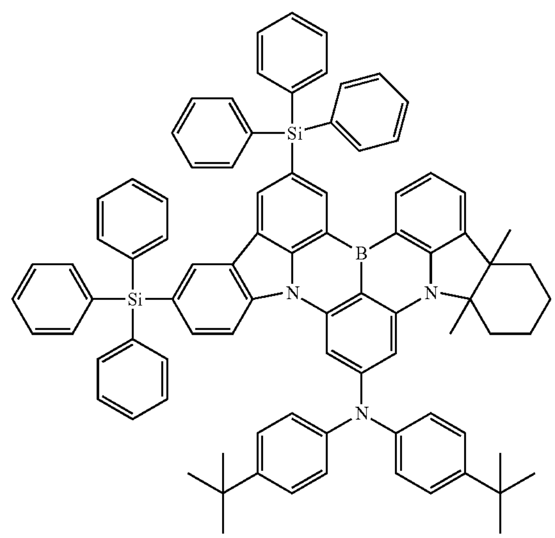
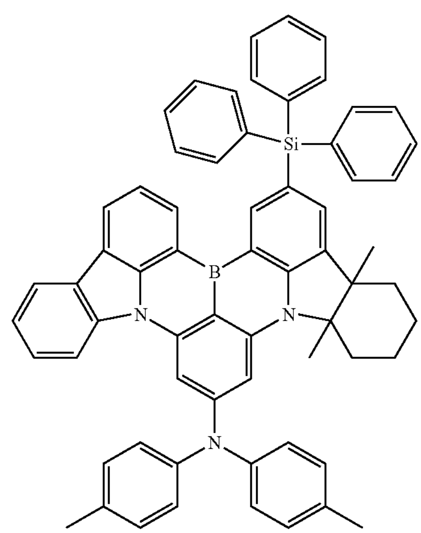

-continued
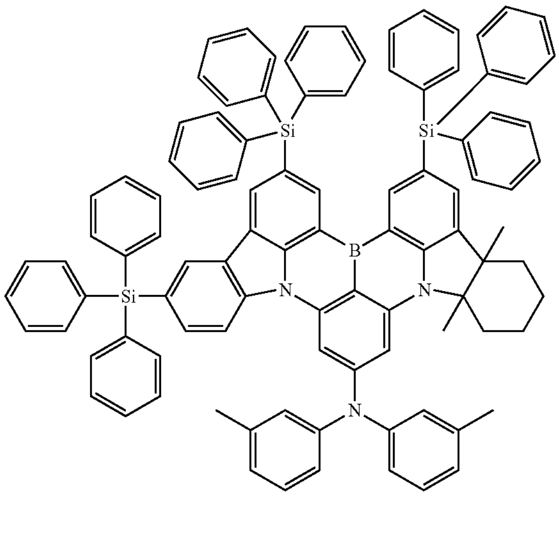
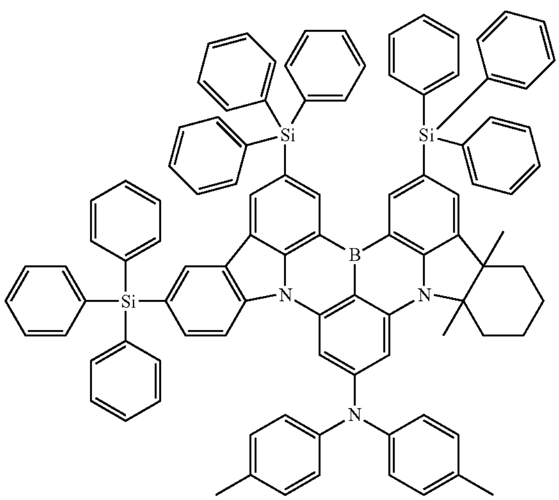
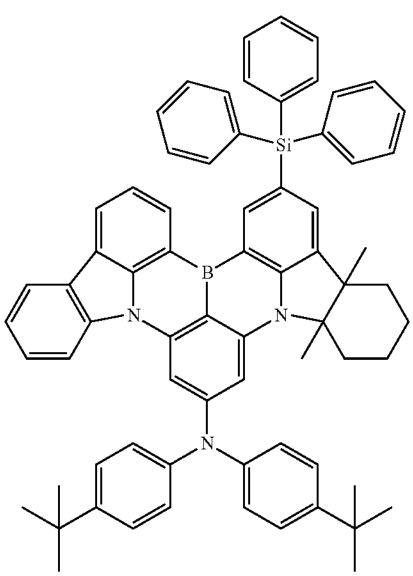
-continued
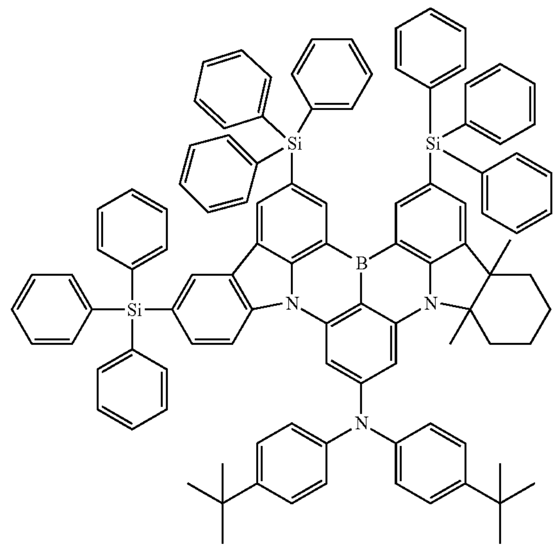
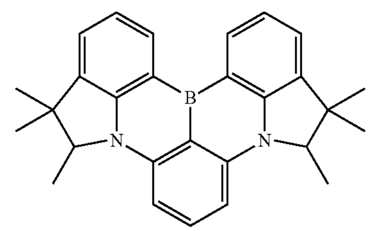
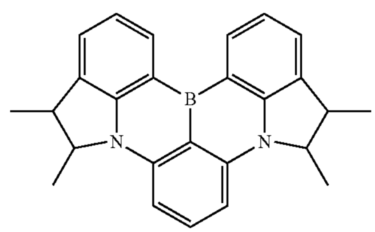
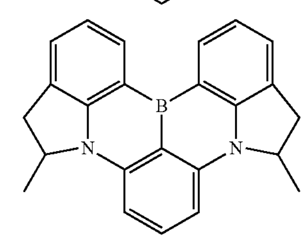
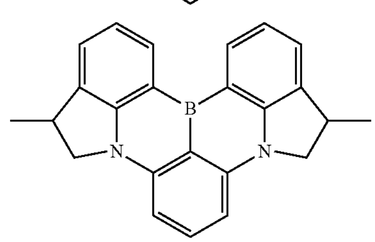
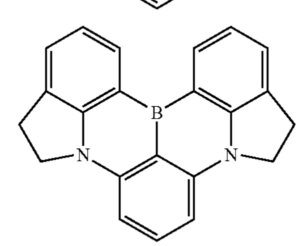

-continued
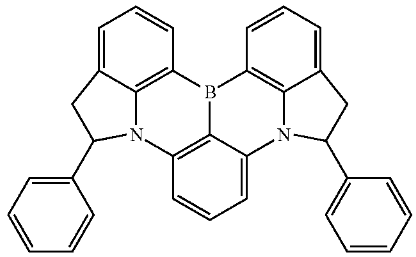
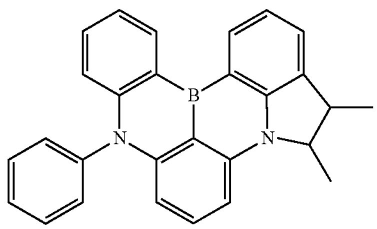
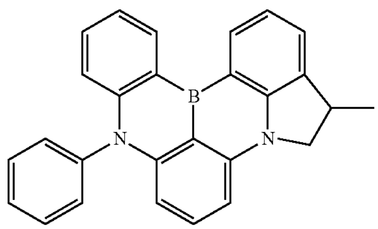
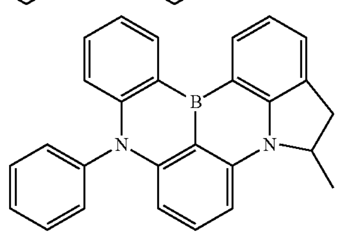
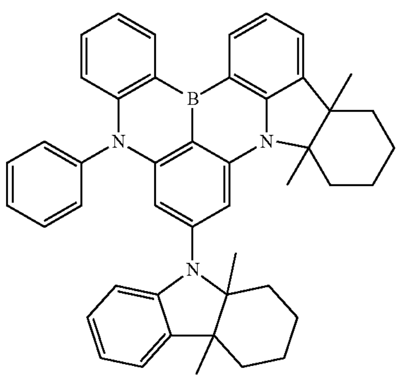
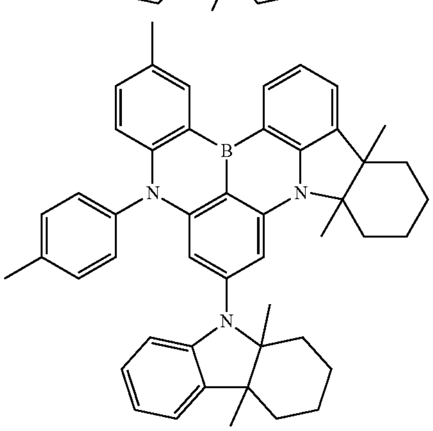
-continued
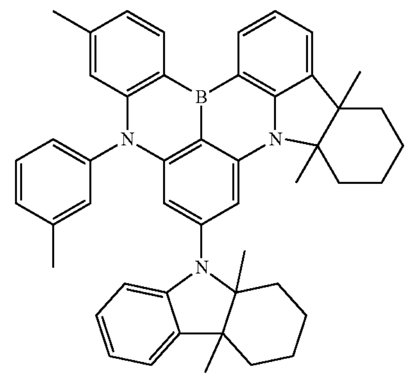
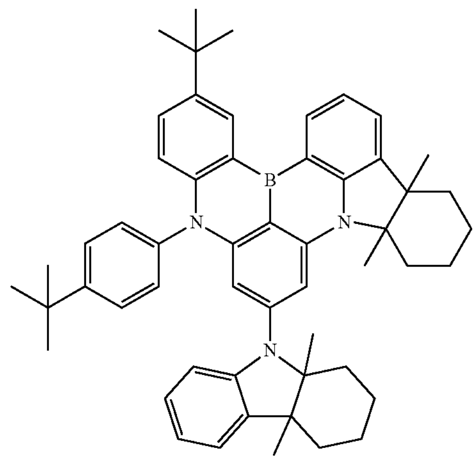
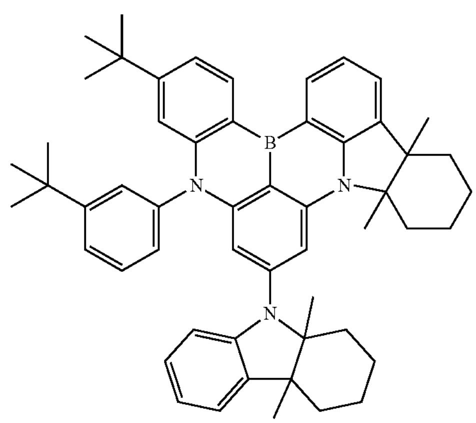
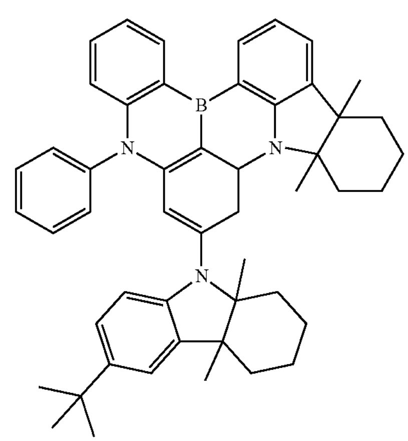

-continued
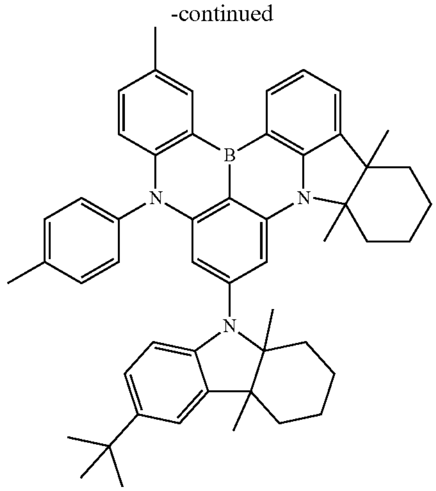
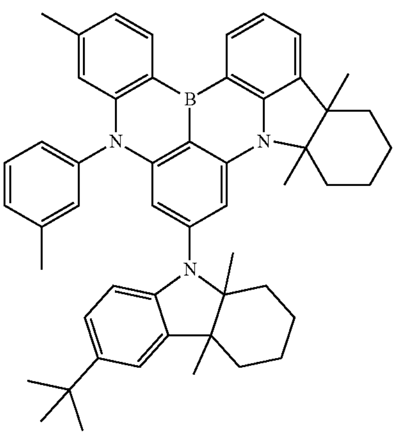
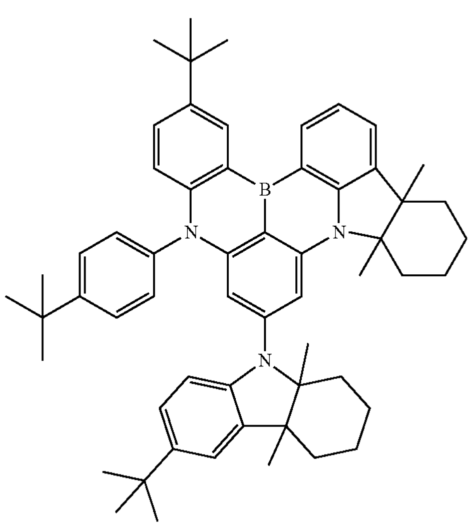
-continued
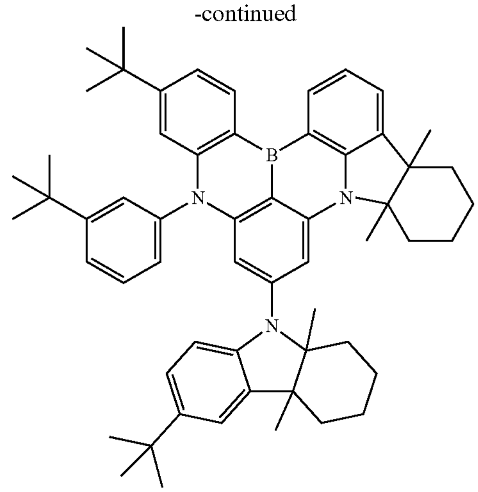
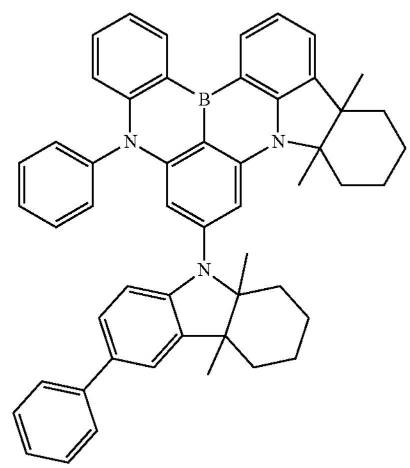
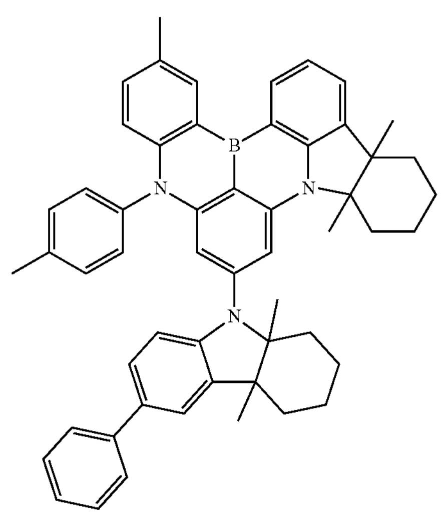

-continued
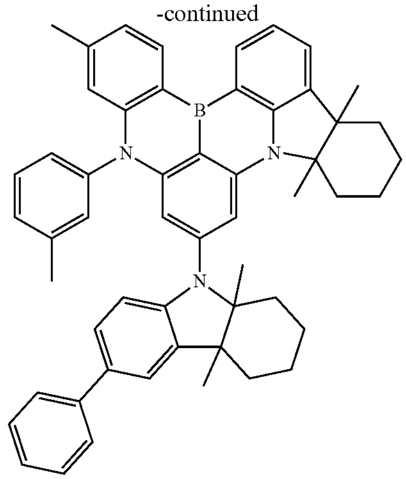
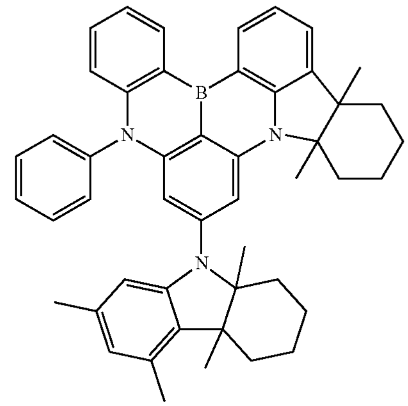
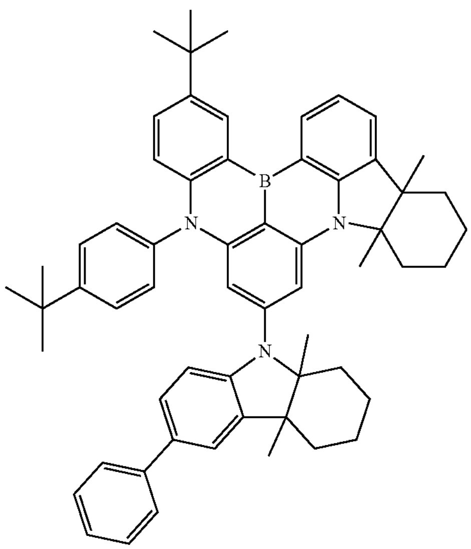
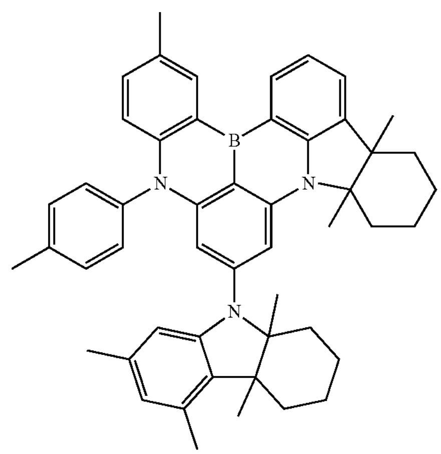
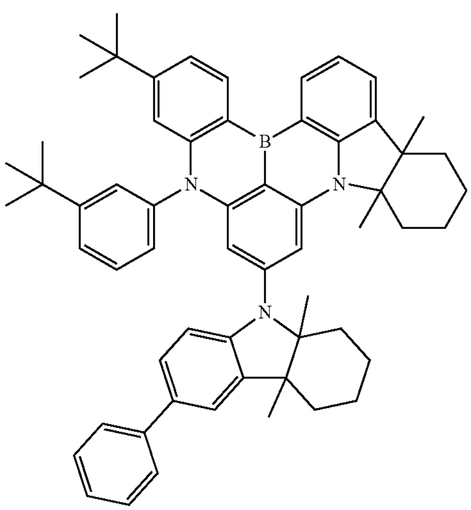
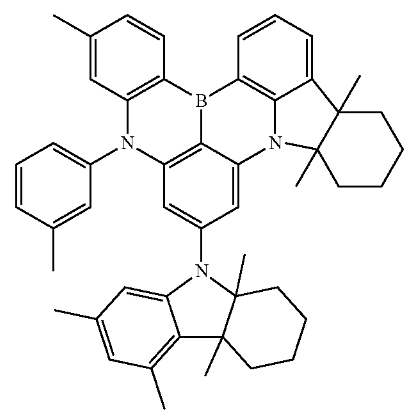
-continued

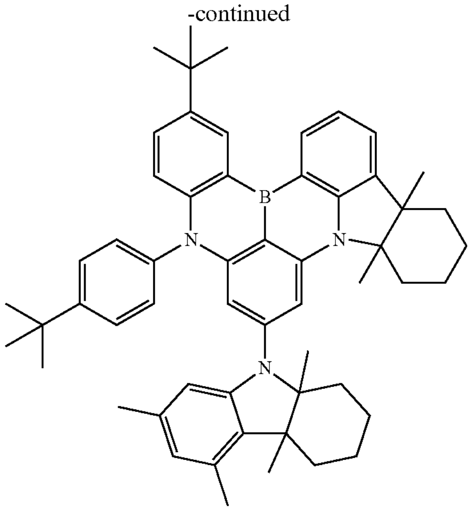
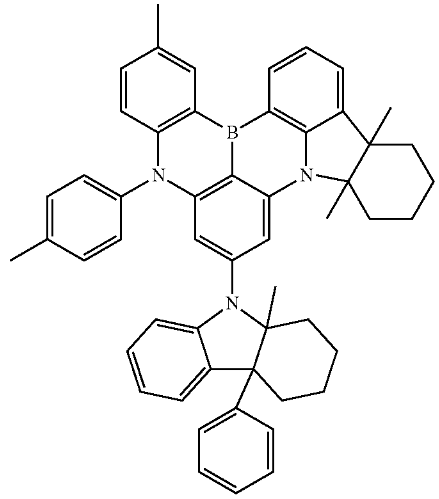
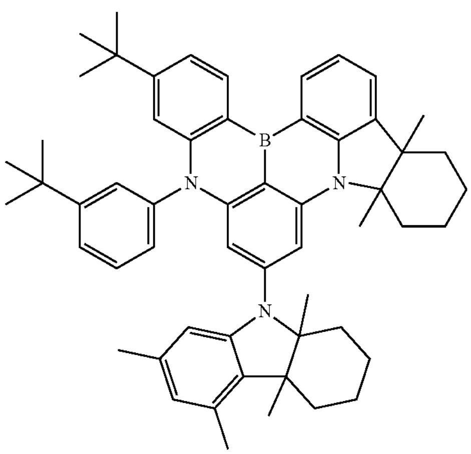
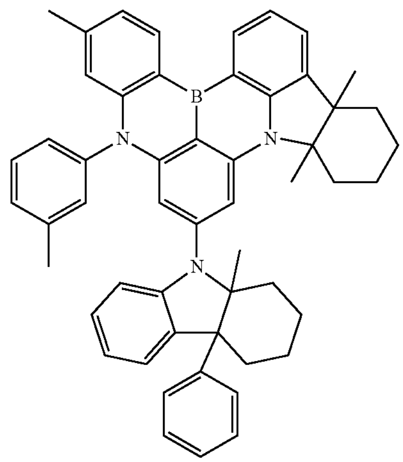
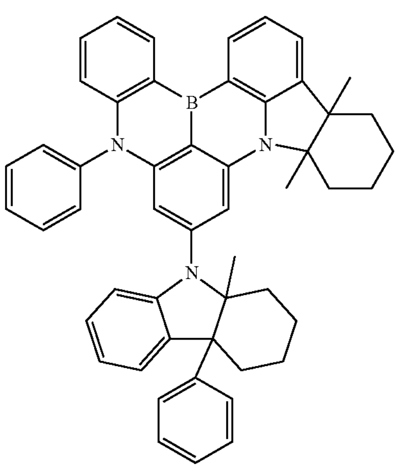
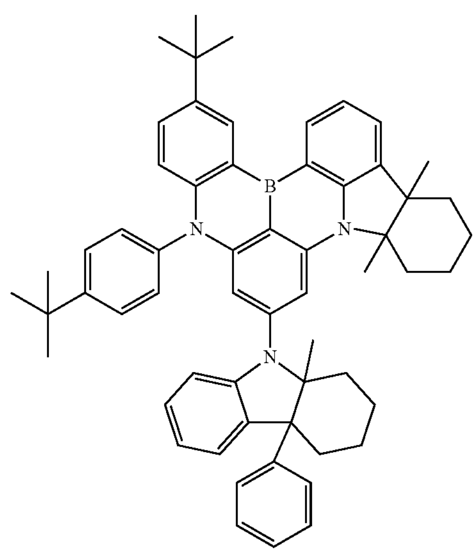

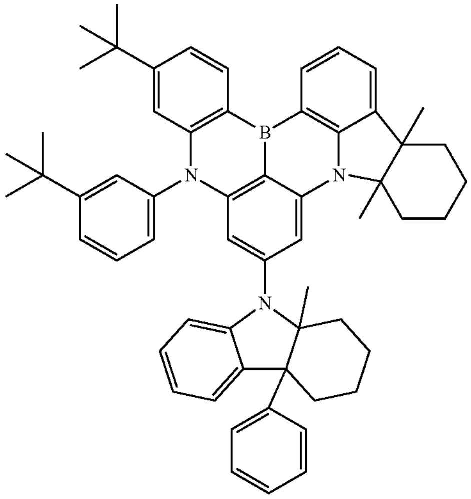
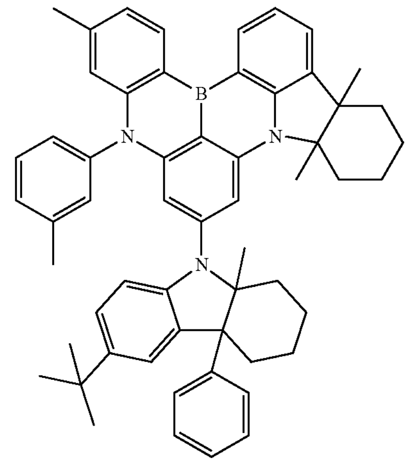
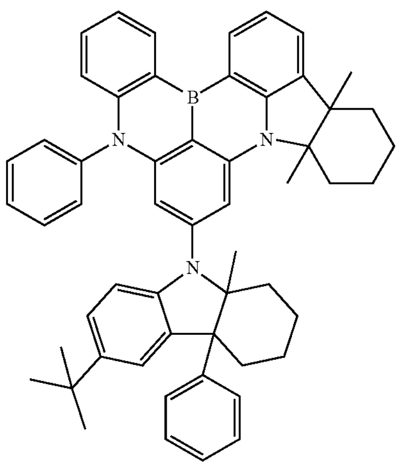
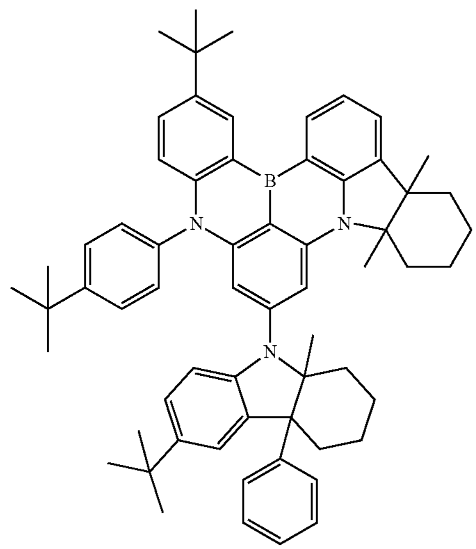
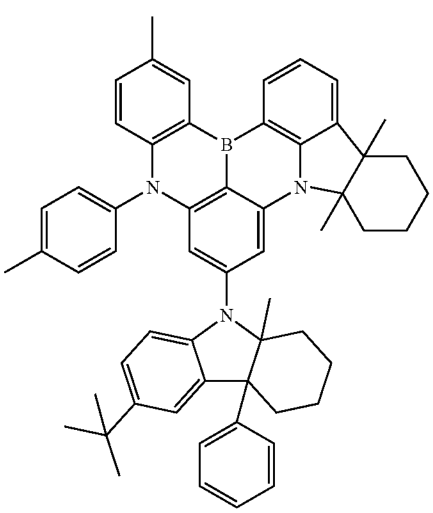
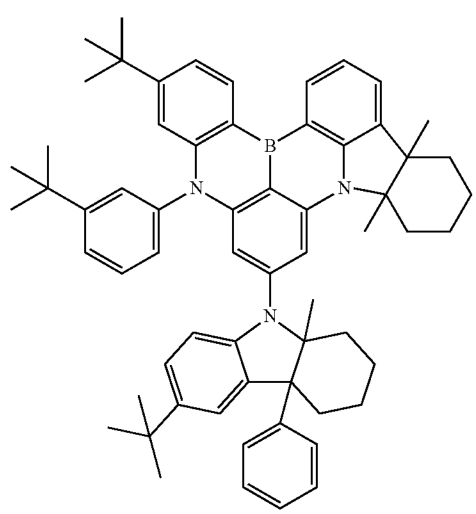

-continued
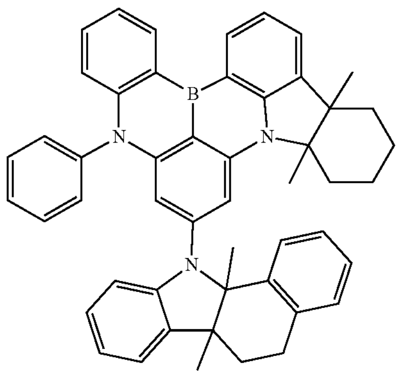
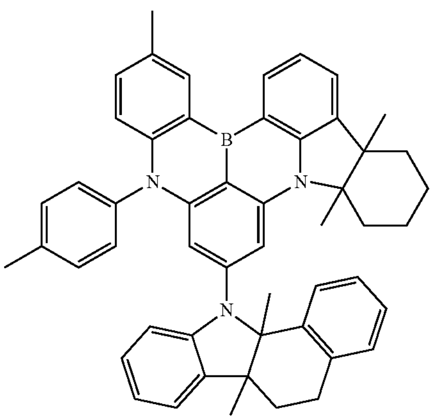
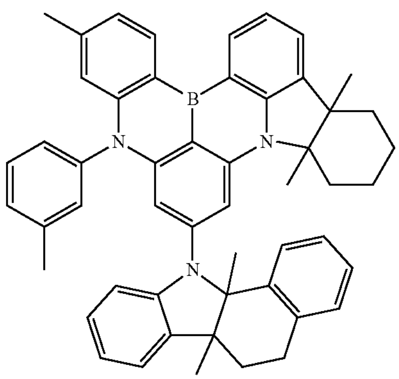
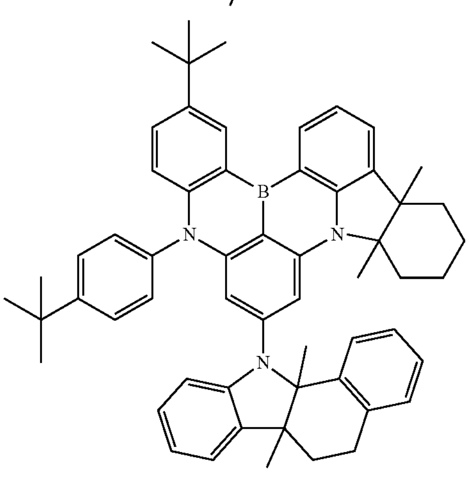
-continued
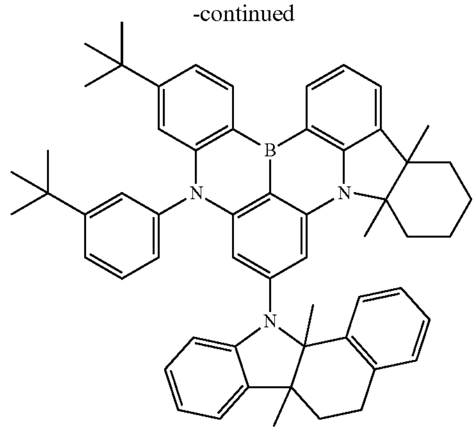
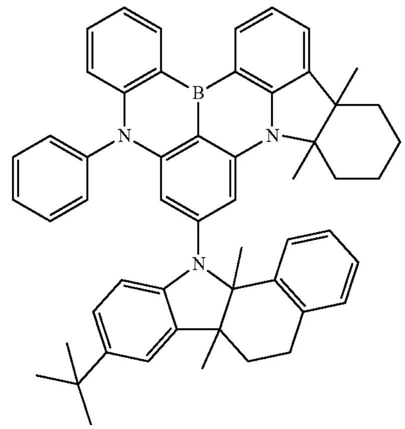
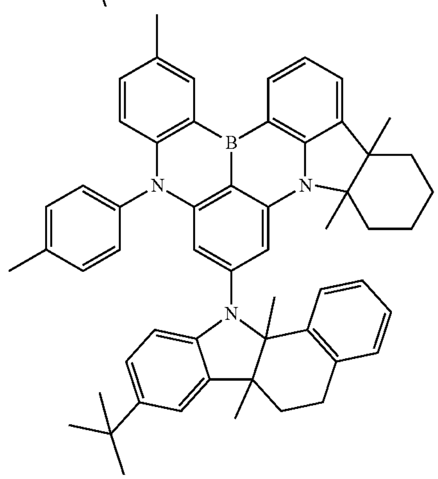
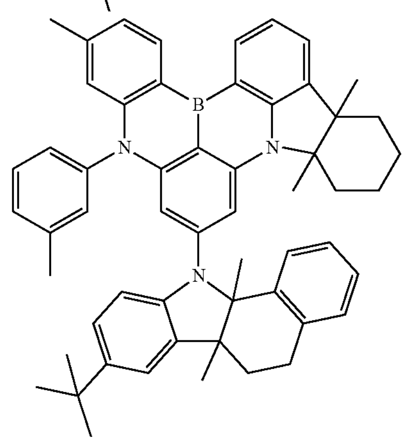

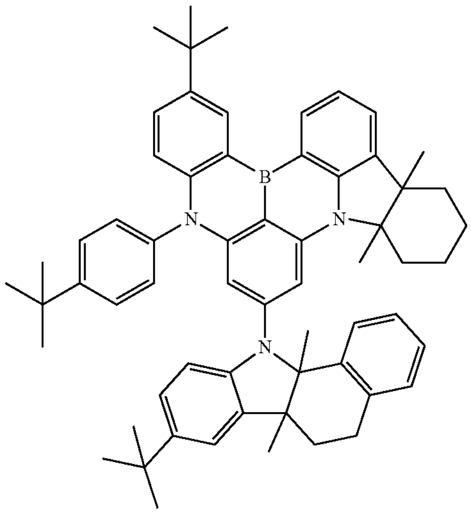
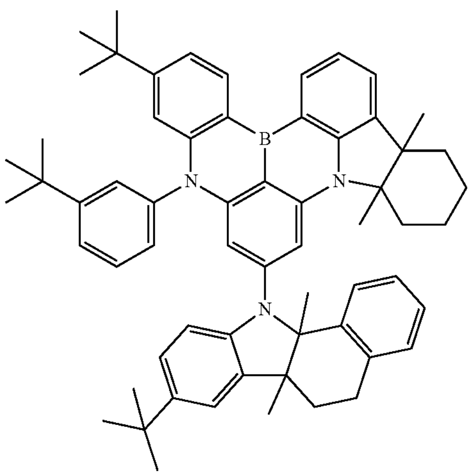
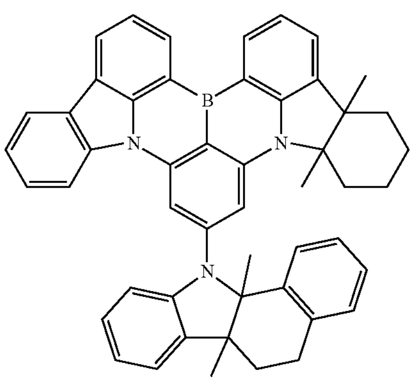
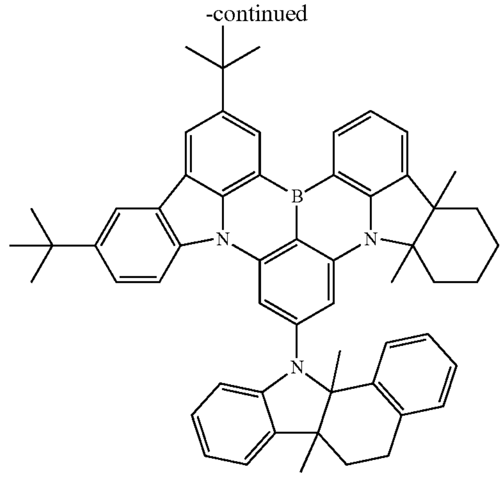
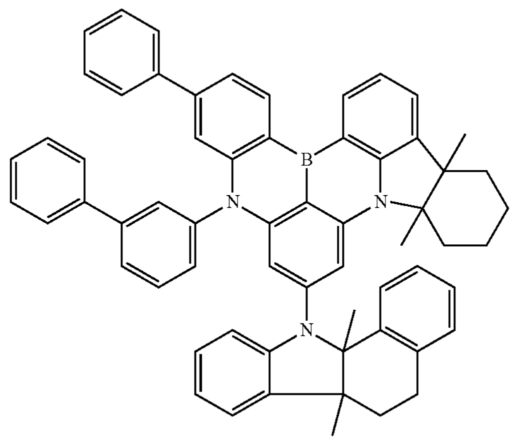
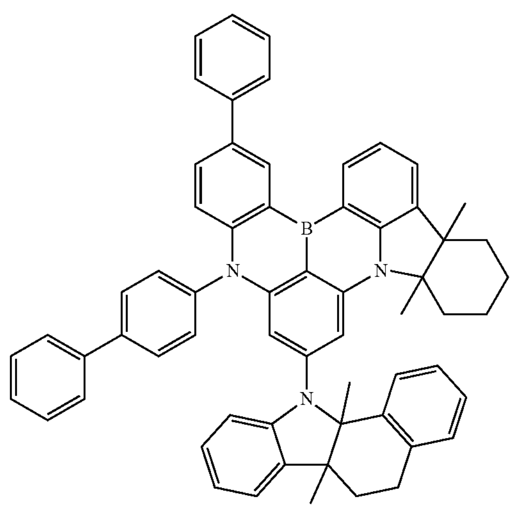

-continued
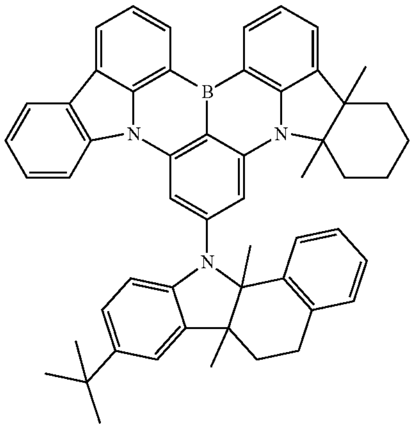
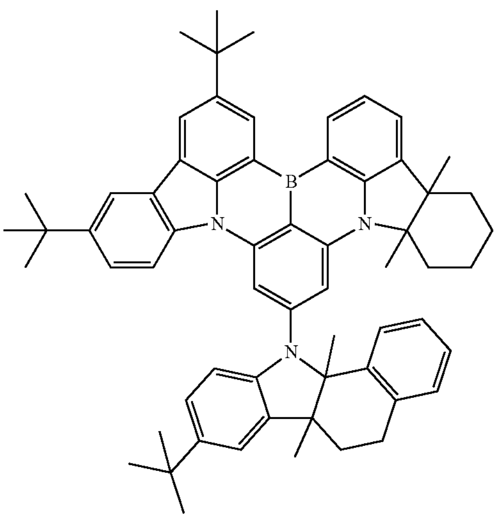
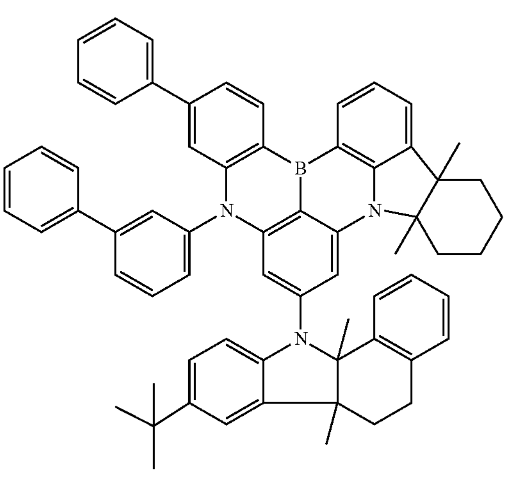
-continued
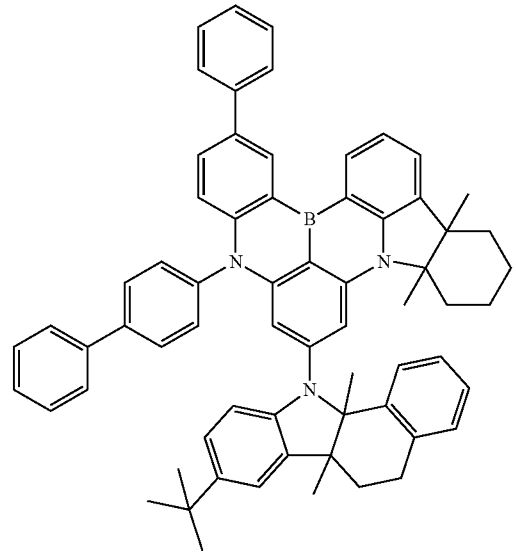
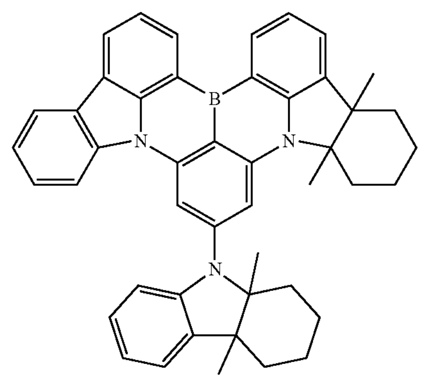
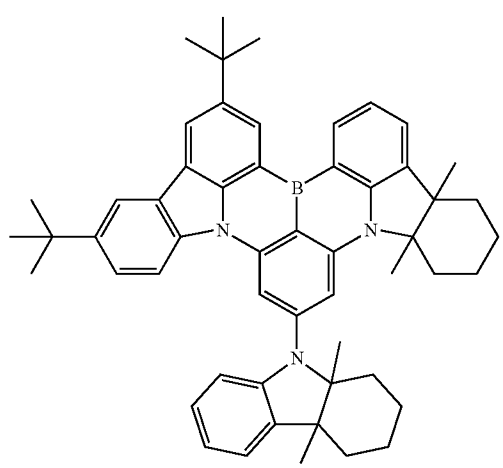

-continued
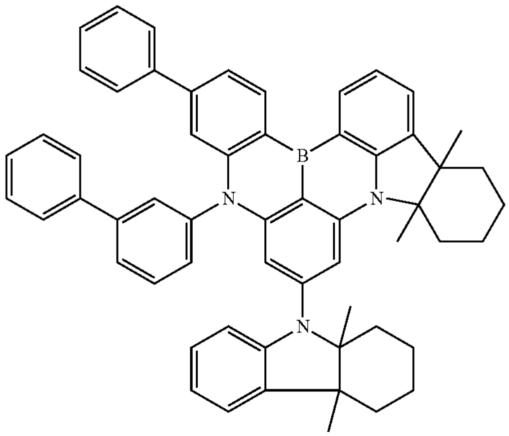
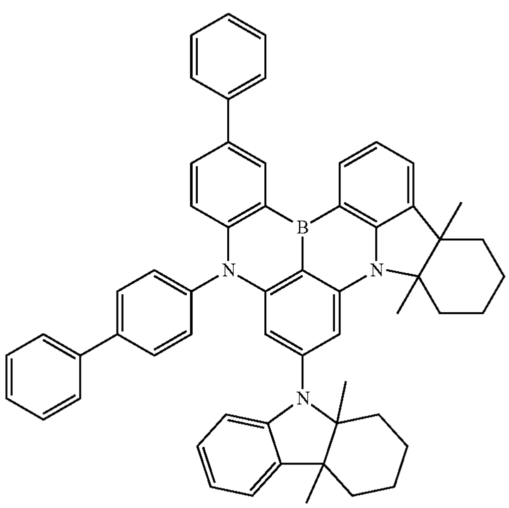
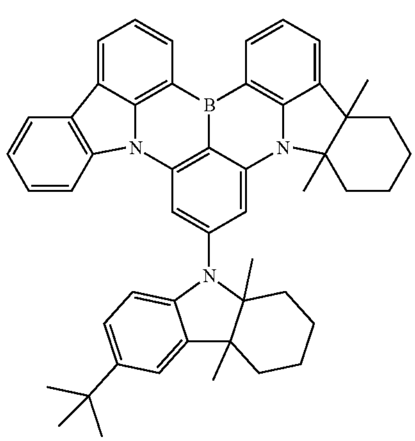
-continued
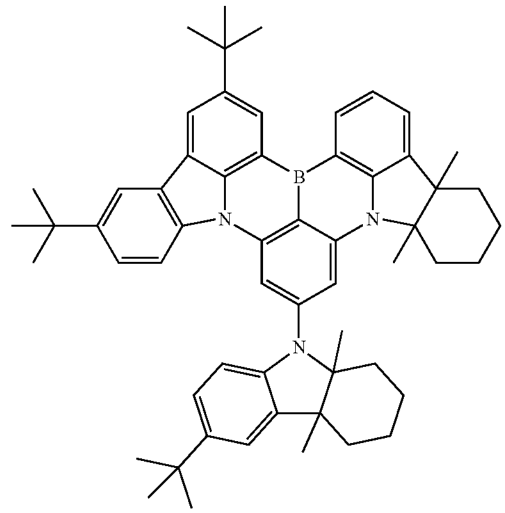
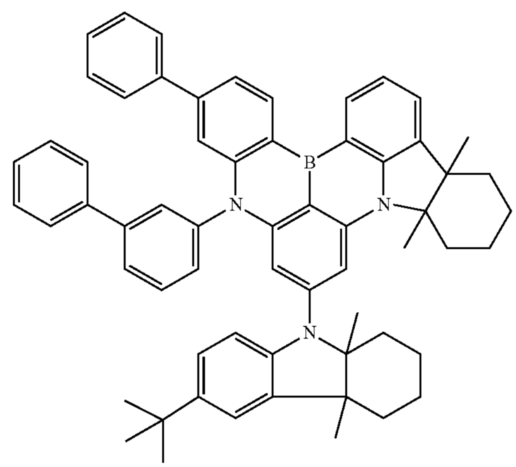
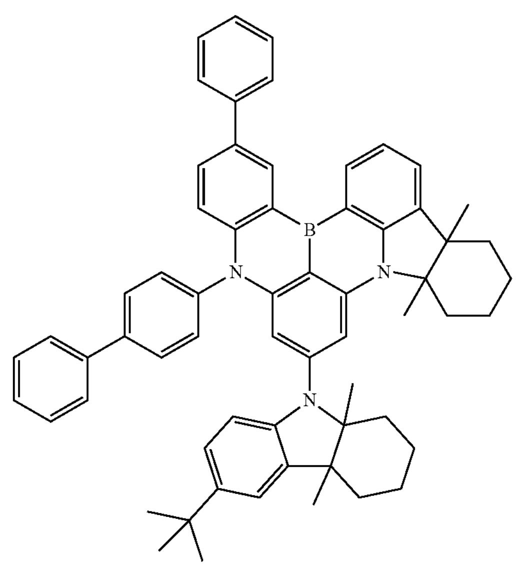

-continued
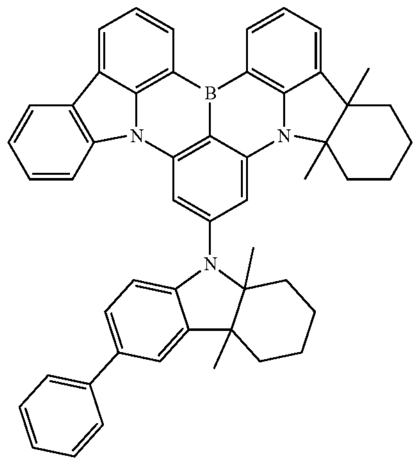
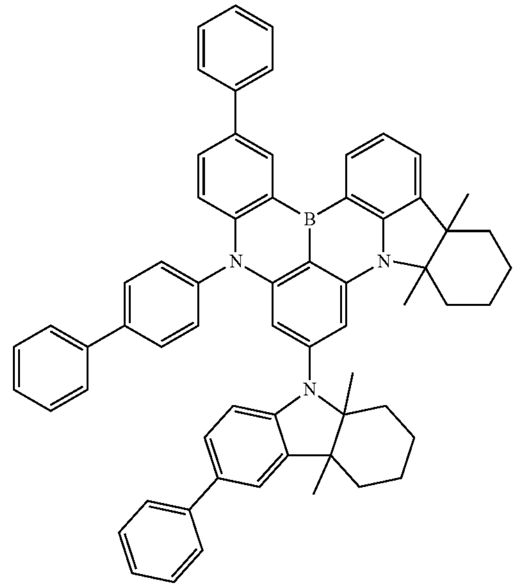
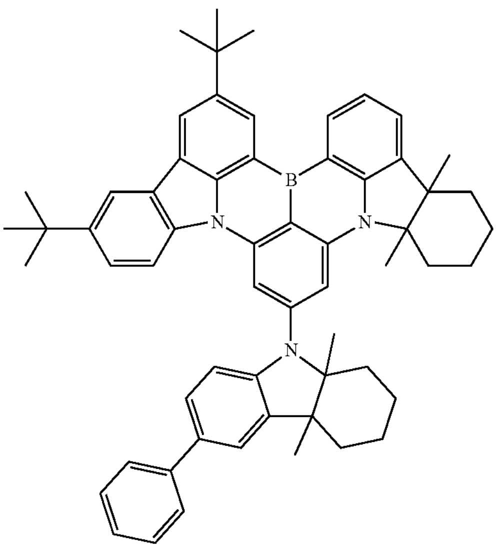
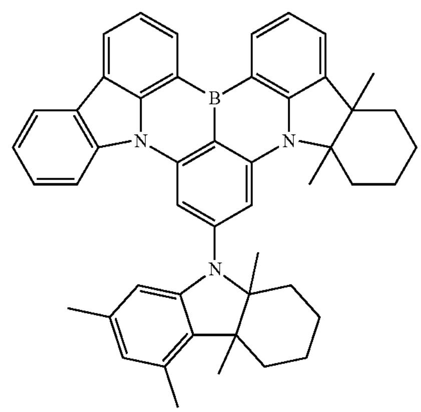
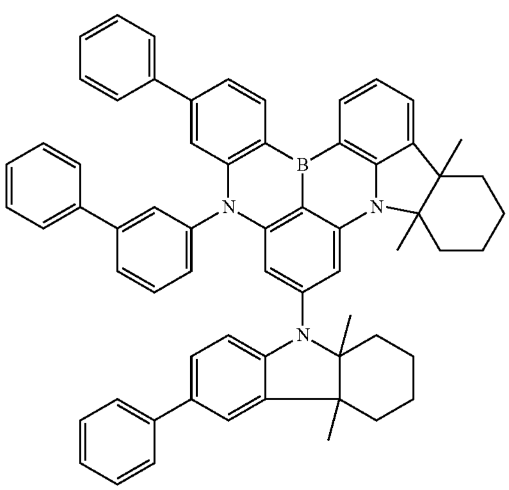
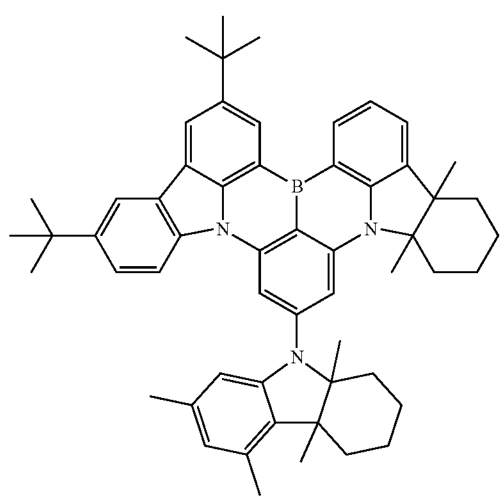
-continued

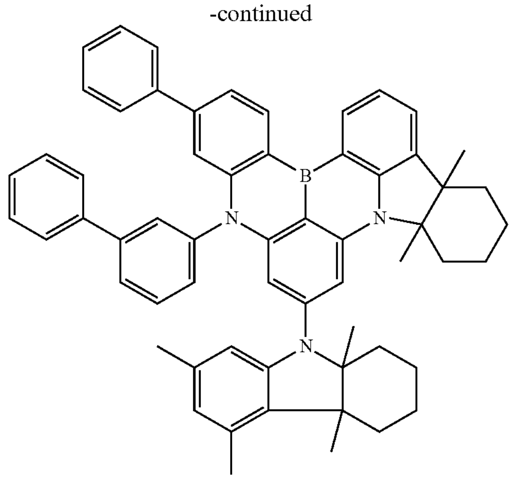
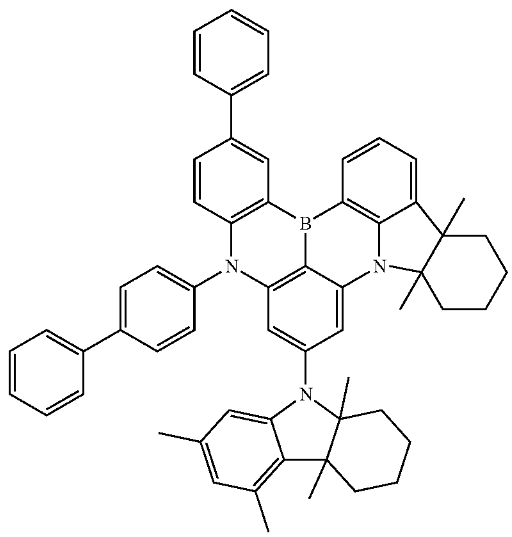
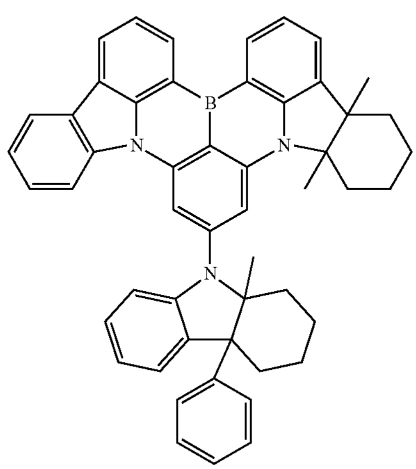
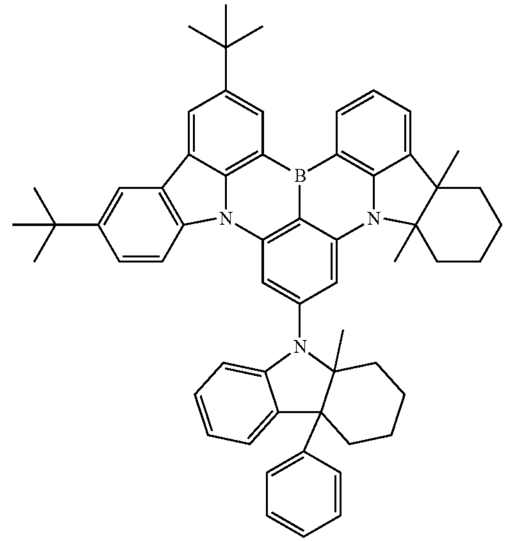
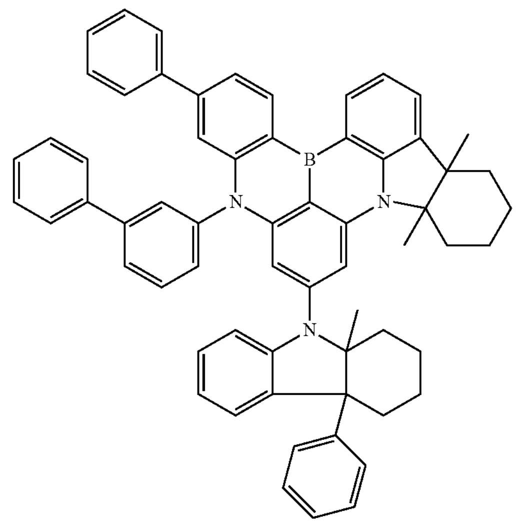
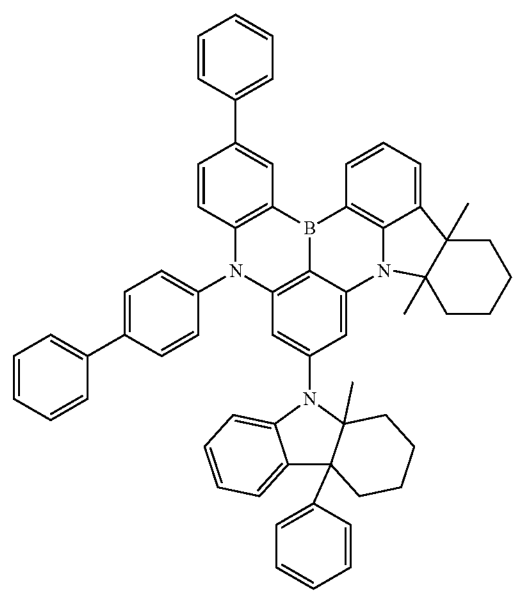

-continued
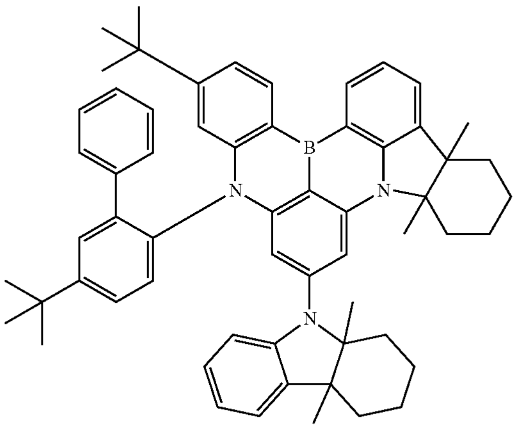
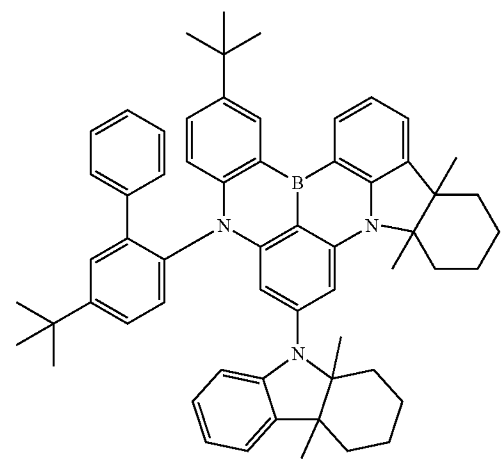
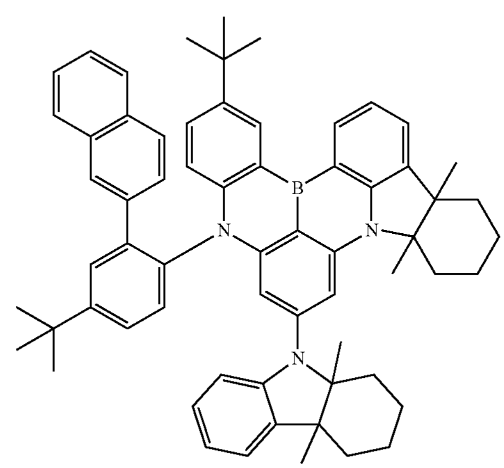
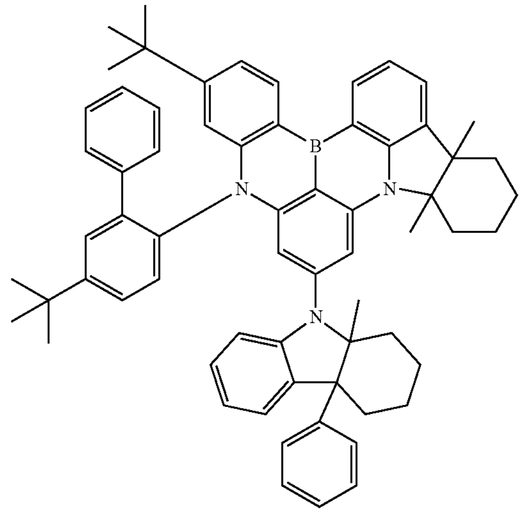
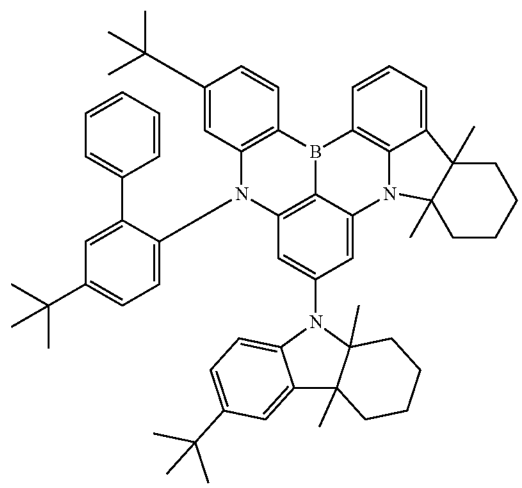
-continued
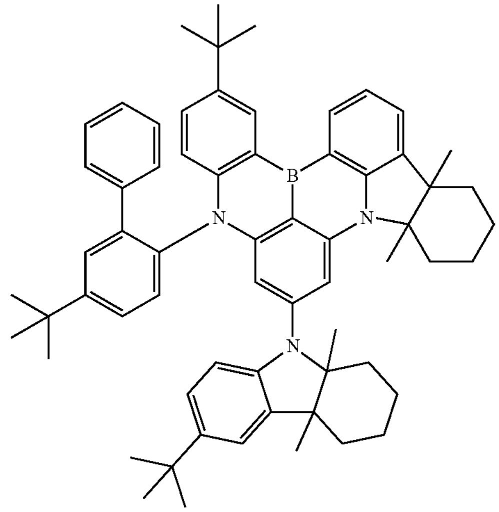

-continued
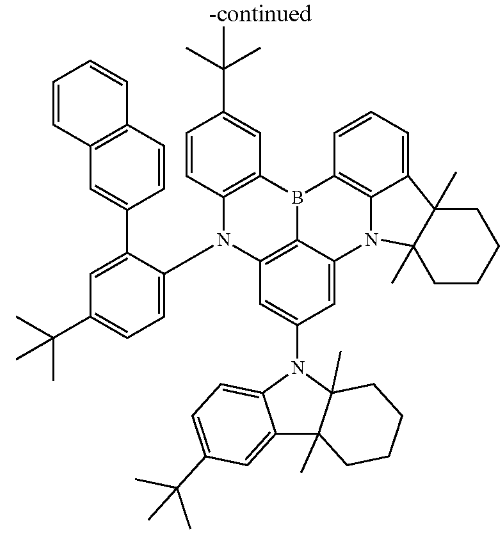
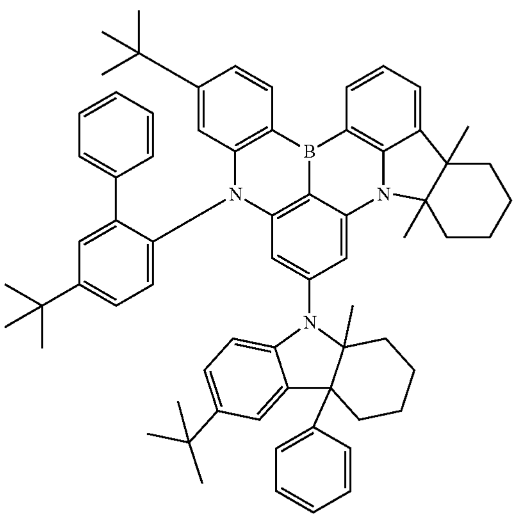
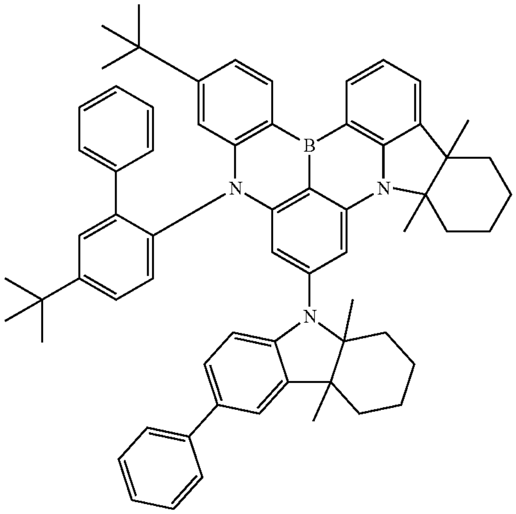
-continued
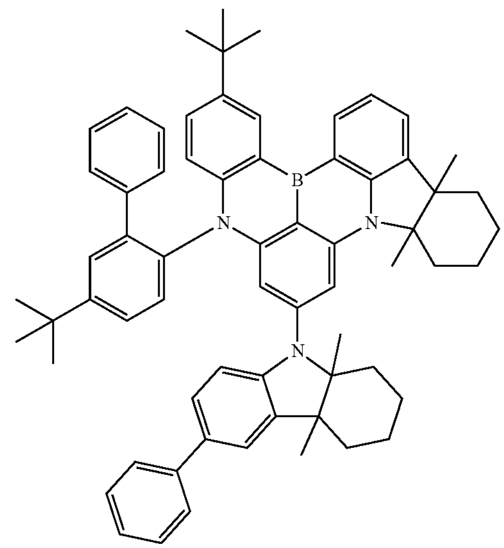
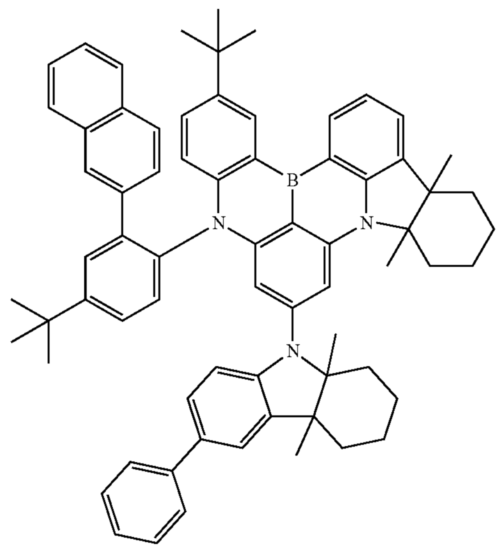
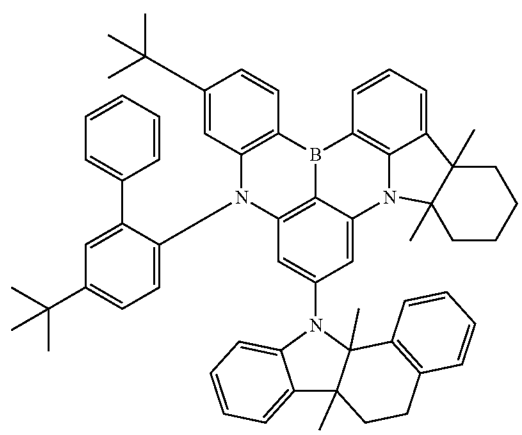

-continued
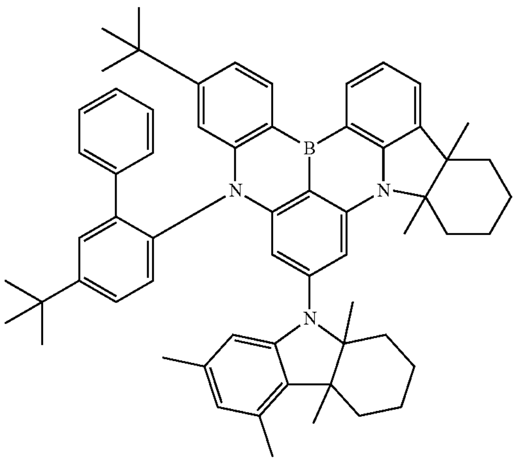
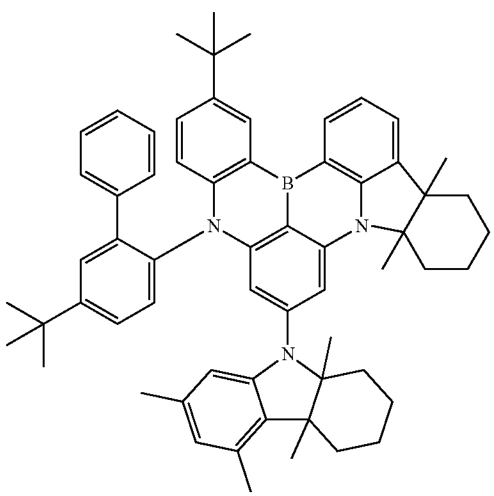
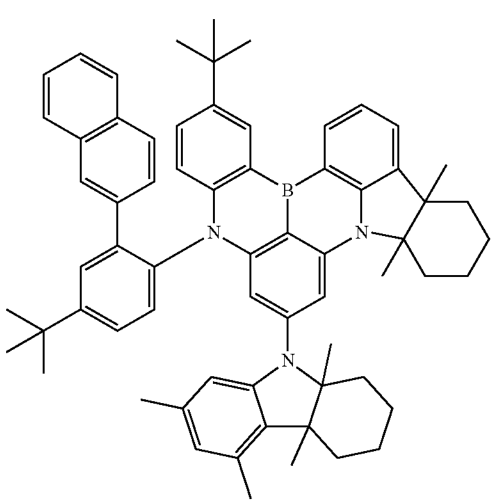
-continued
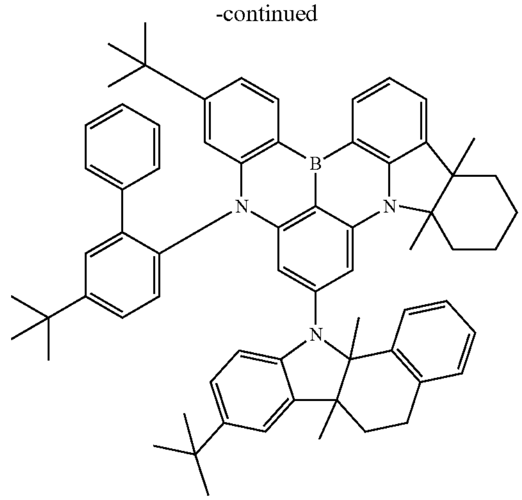
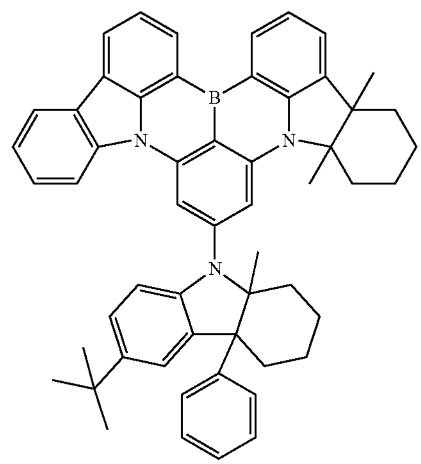
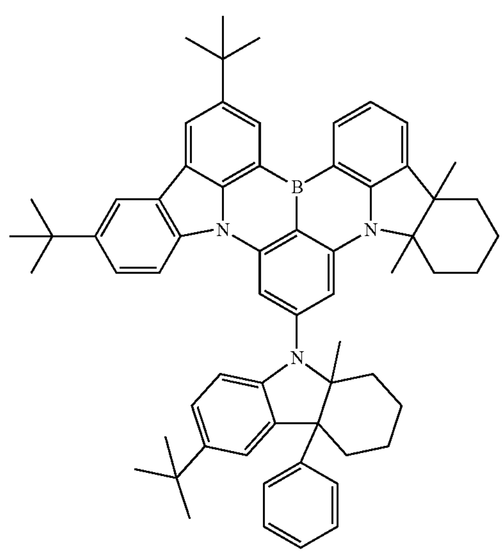

-continued
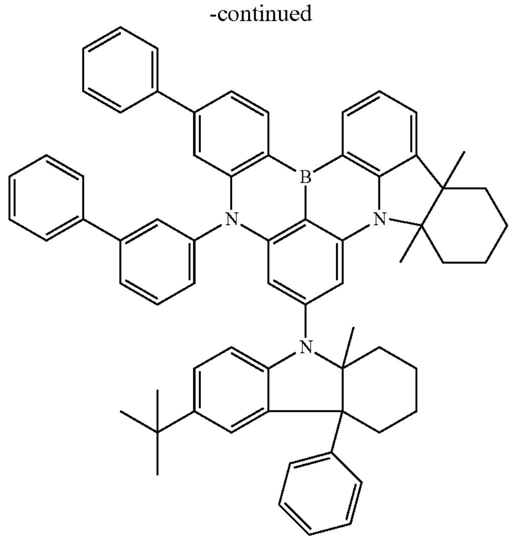
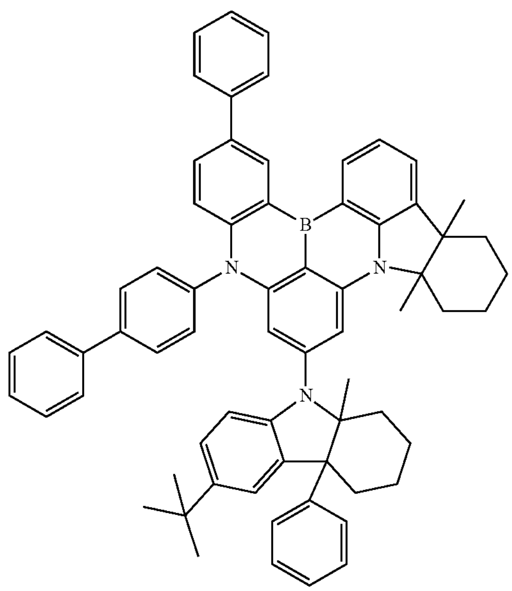
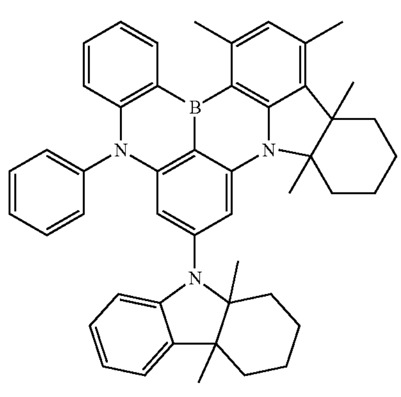
-continued
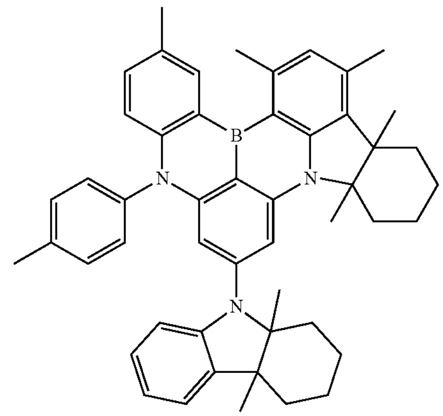
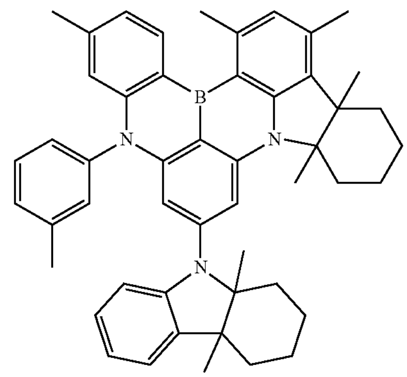
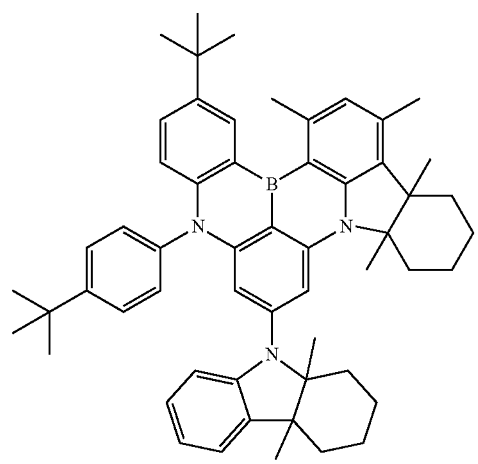
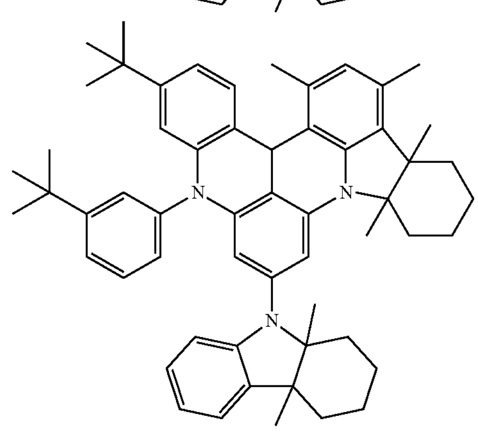

-continued
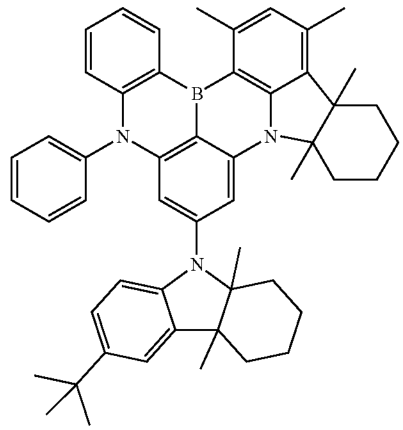
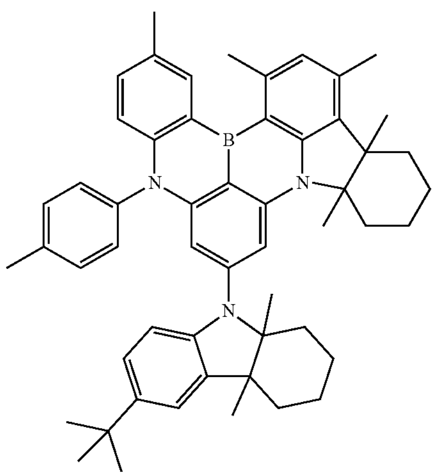
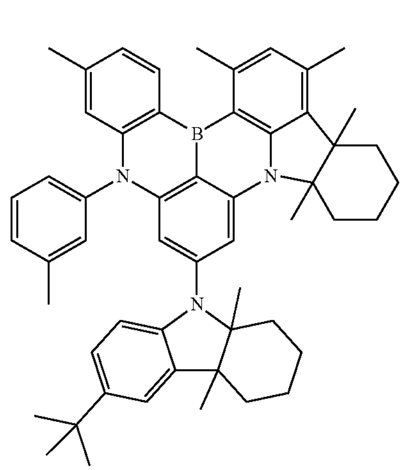
-continued
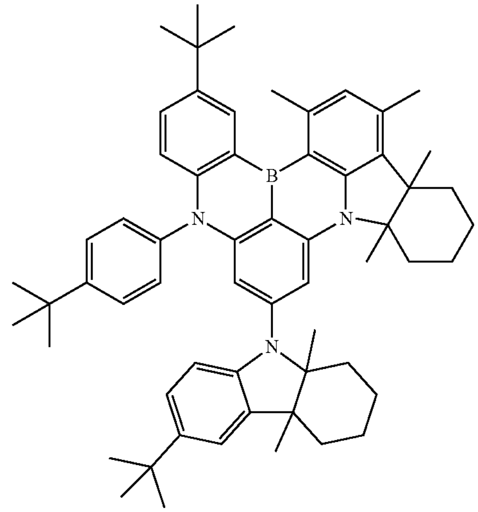
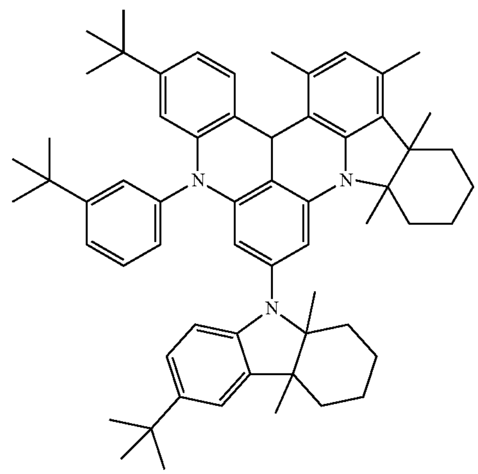
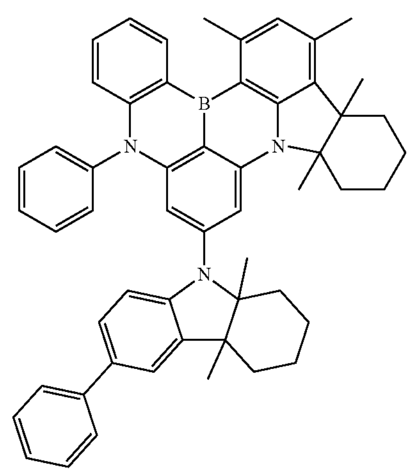

-continued
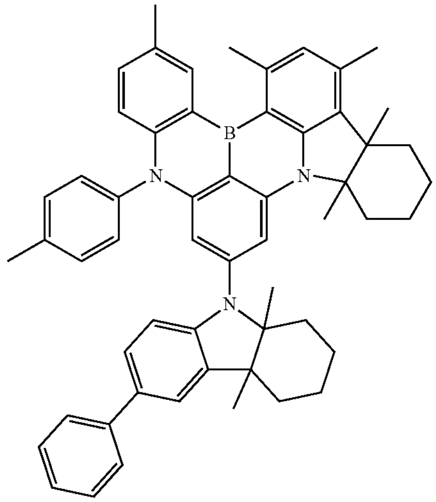
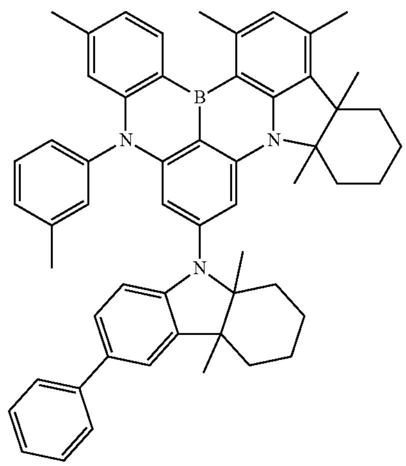
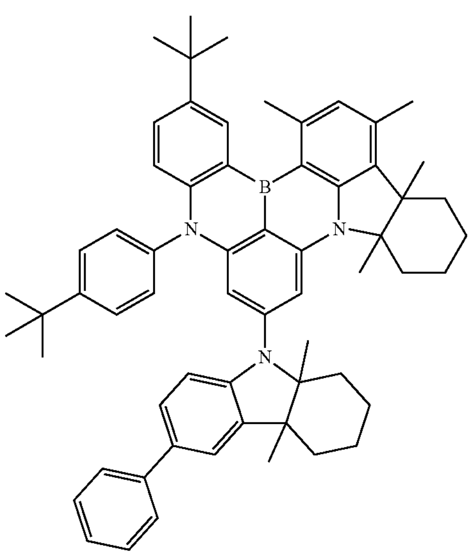
-continued
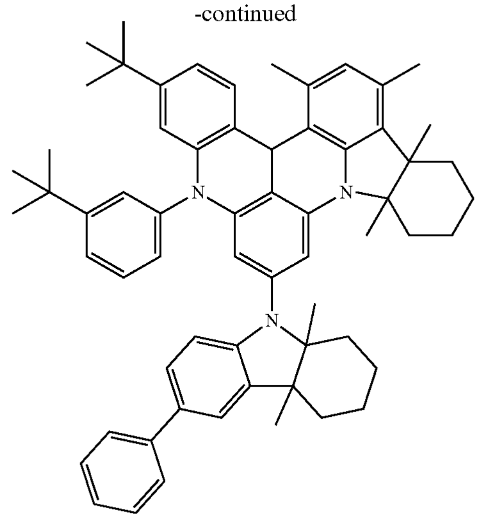
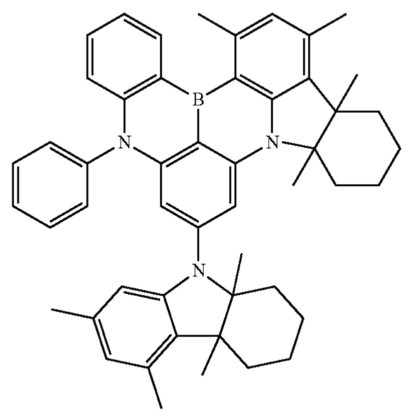
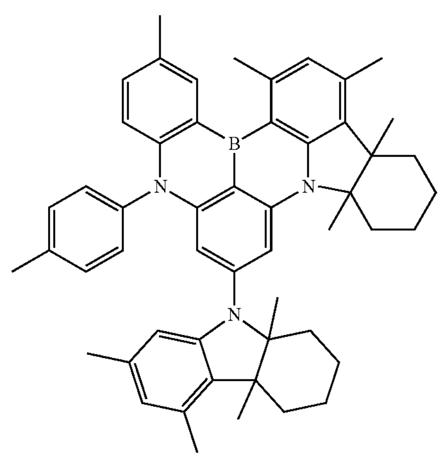

-continued
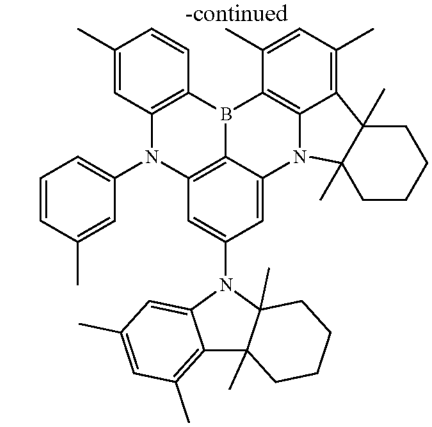
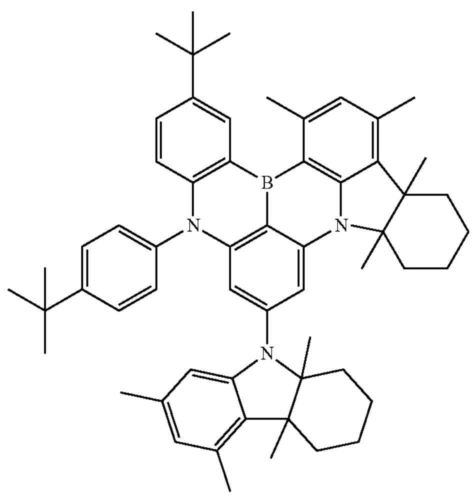
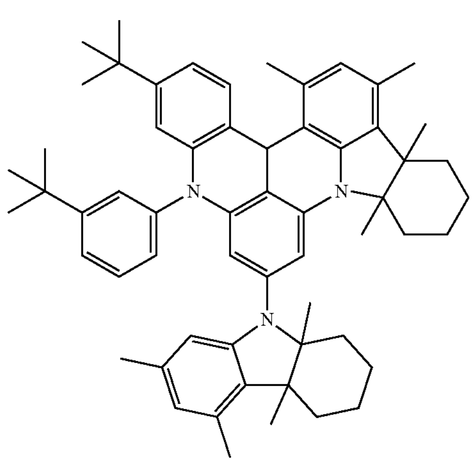
-continued
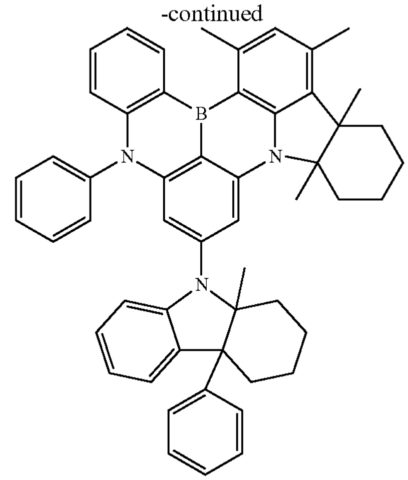
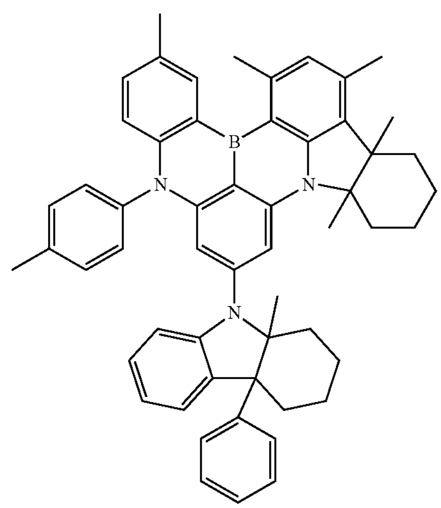
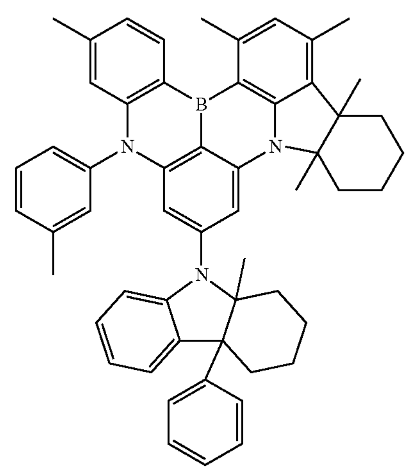

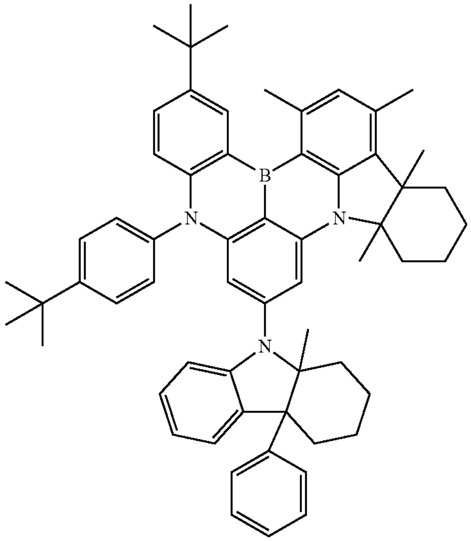
B
N
N
N
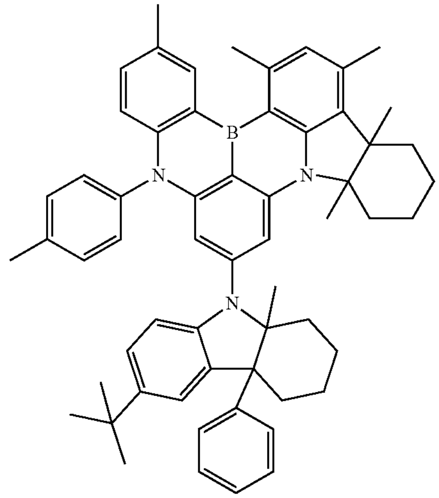
B
N
N
N
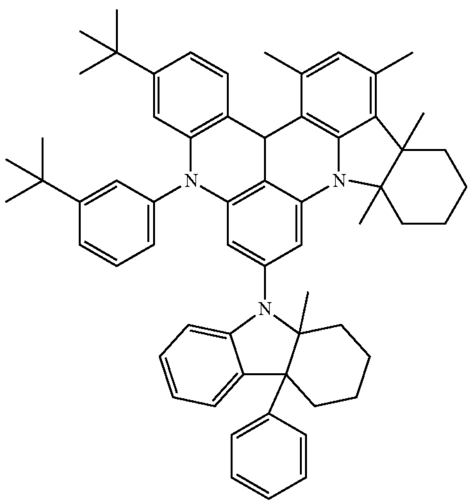
N
N
N
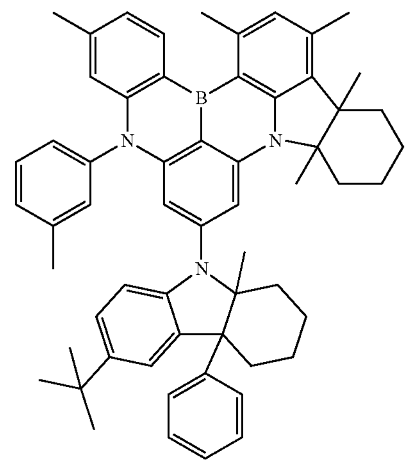
B
N
N
N
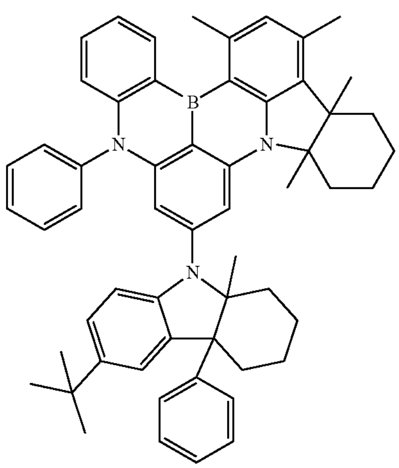
B
N
N
N
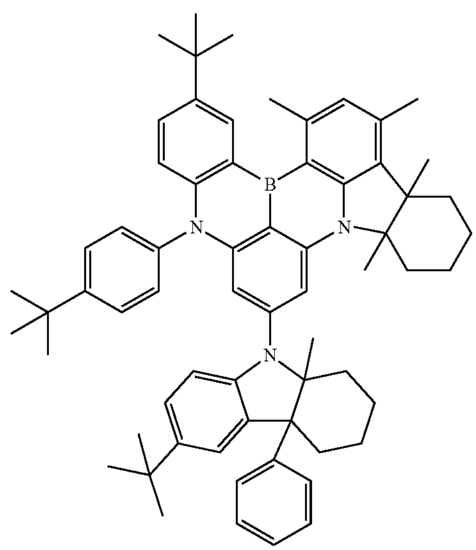
B
N
N
N -continued
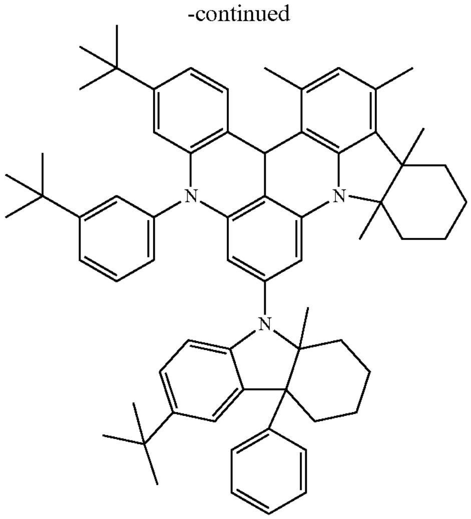
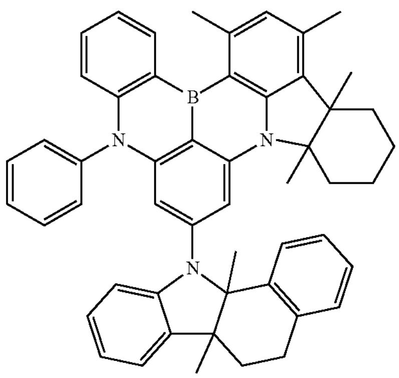
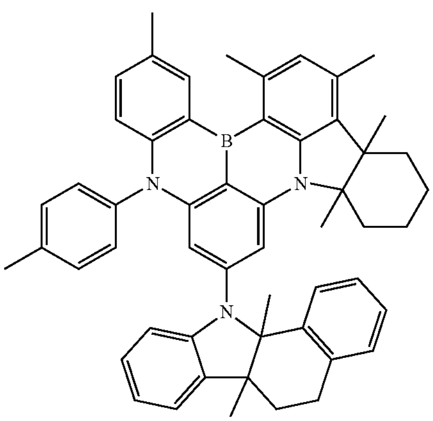
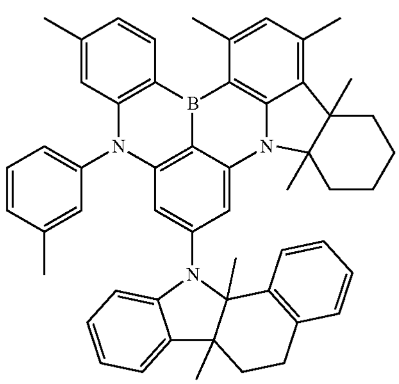
-continued
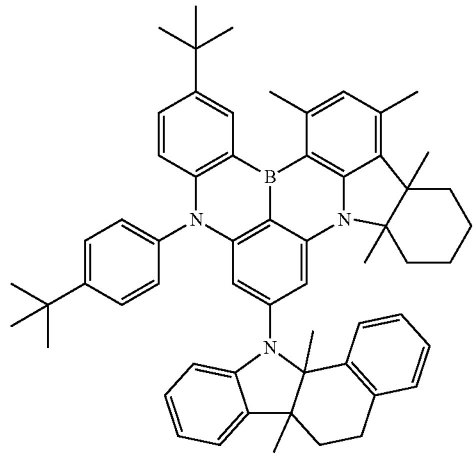
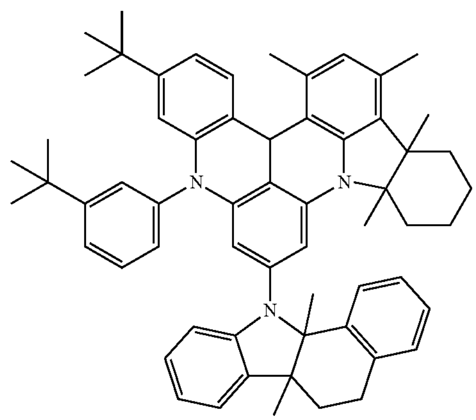
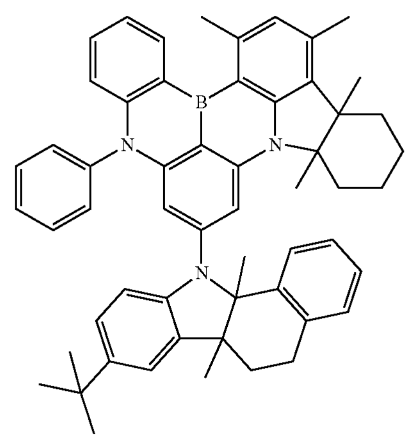

-continued
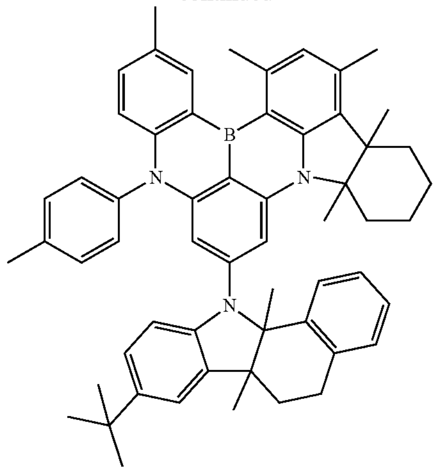
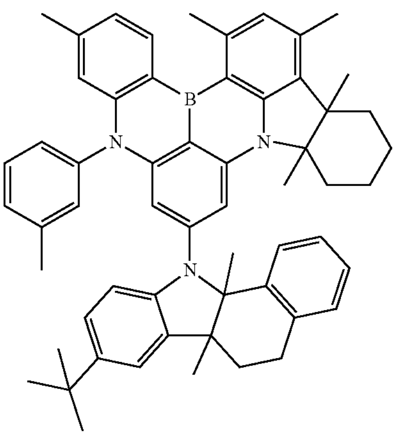
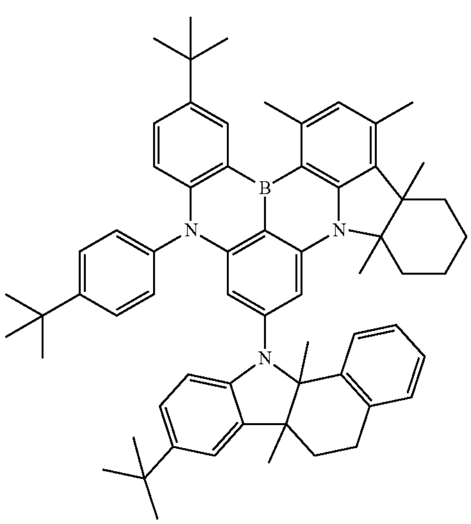
-continued
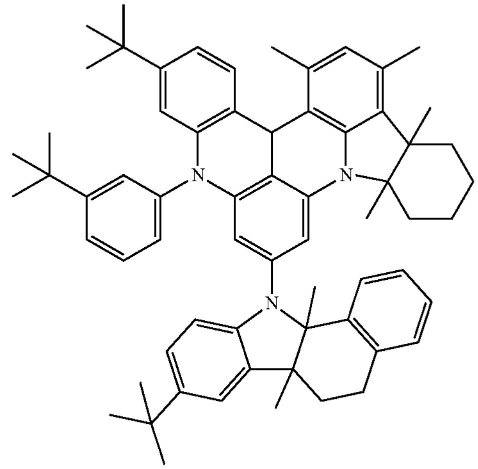
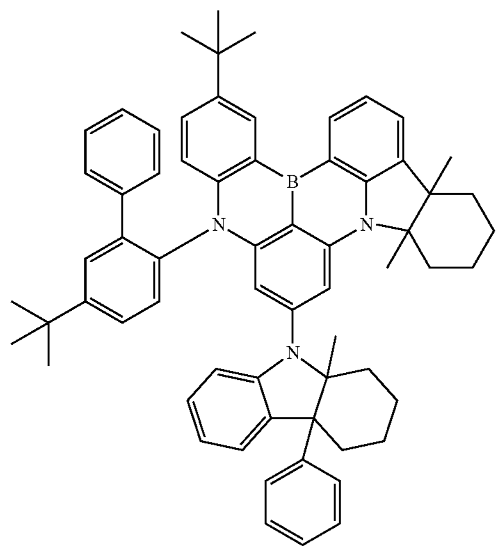
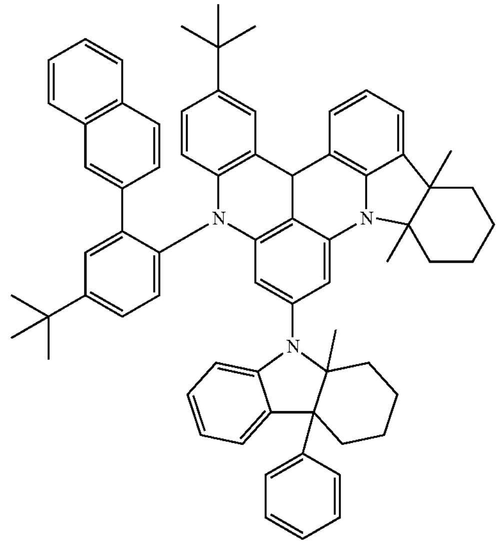

-continued
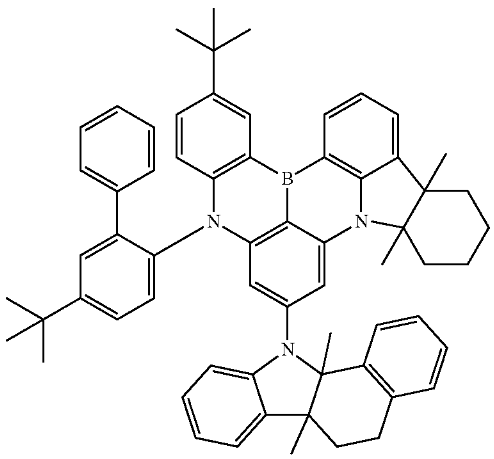
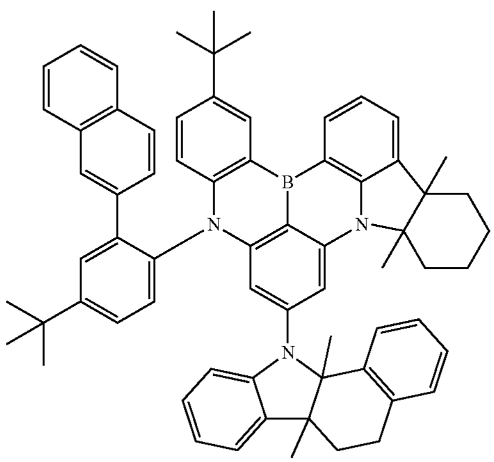
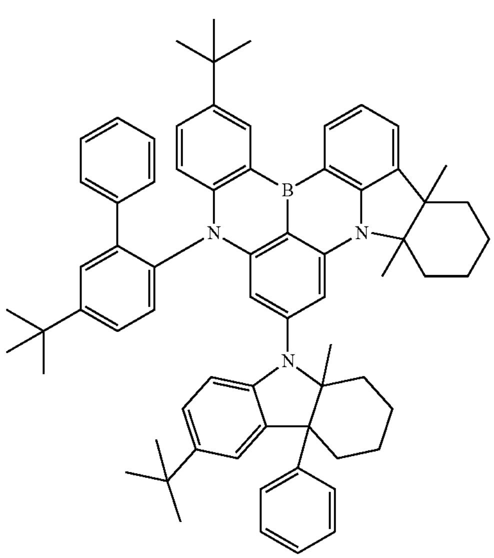
-continued
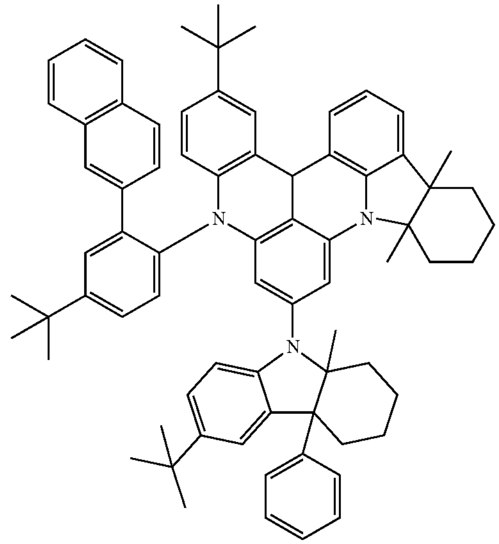
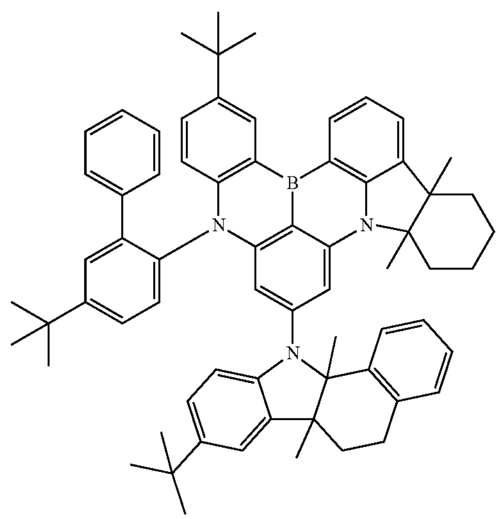
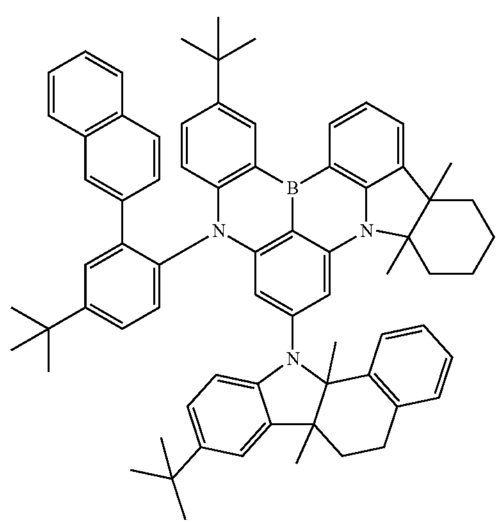

-continued
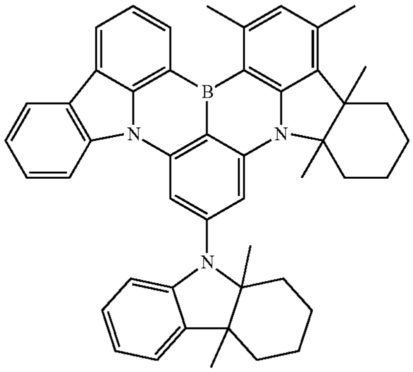
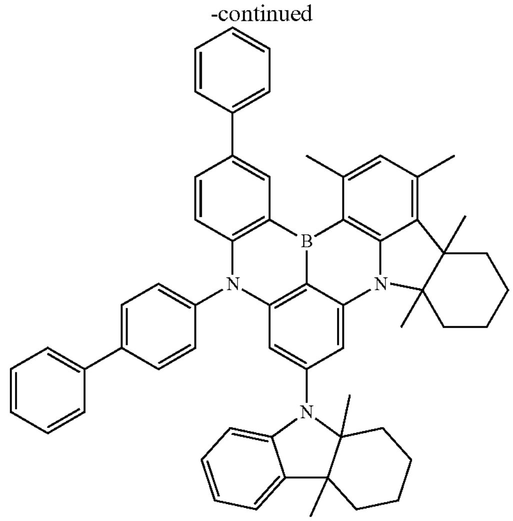
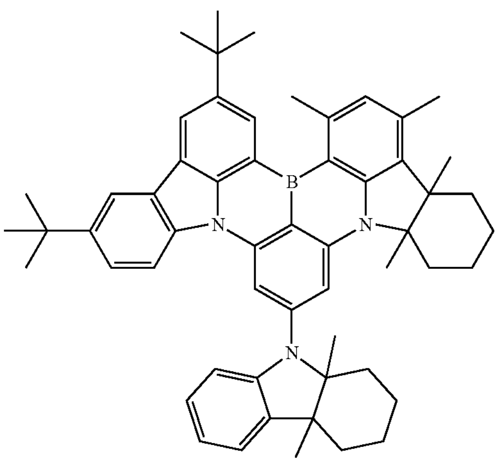
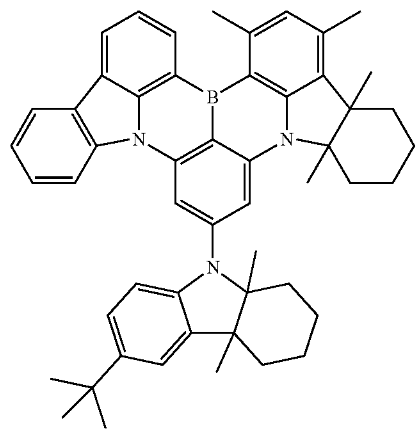
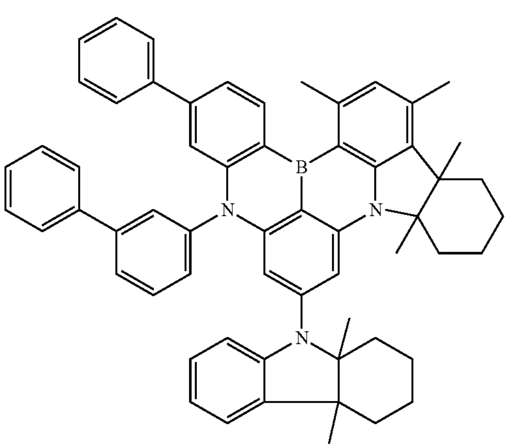
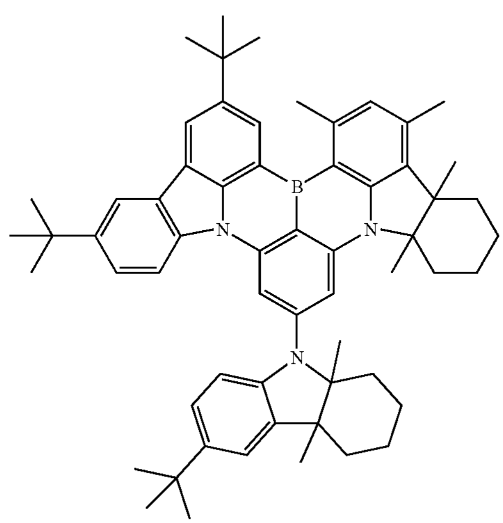
-continued -continued
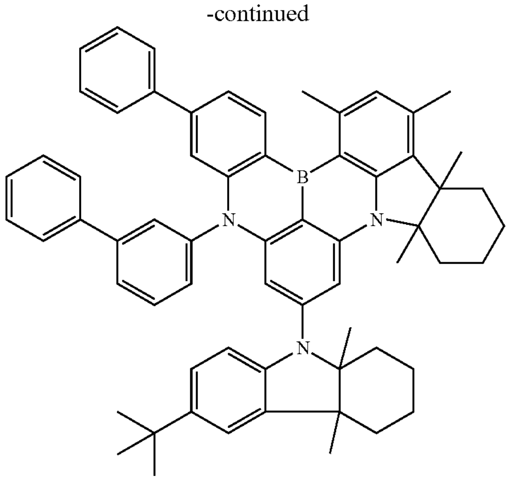
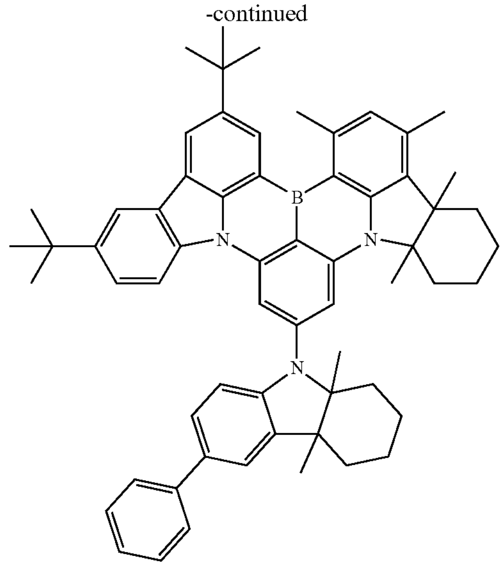
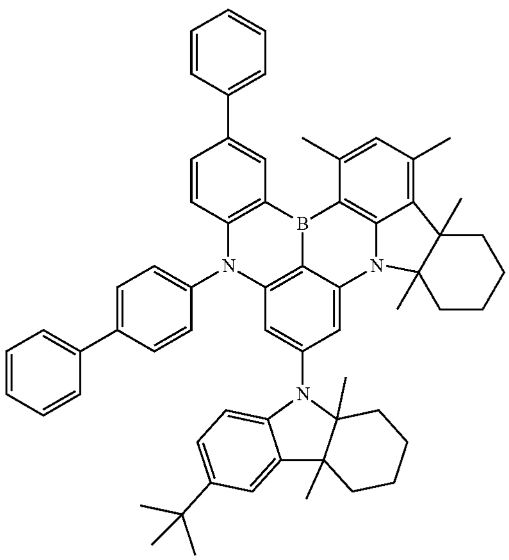
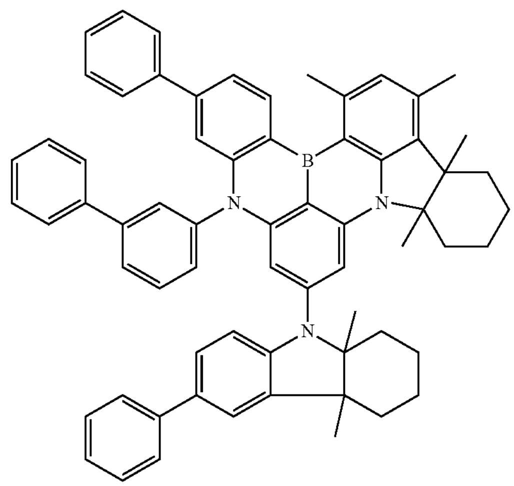
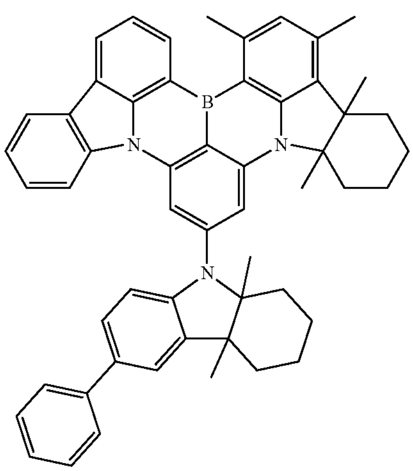
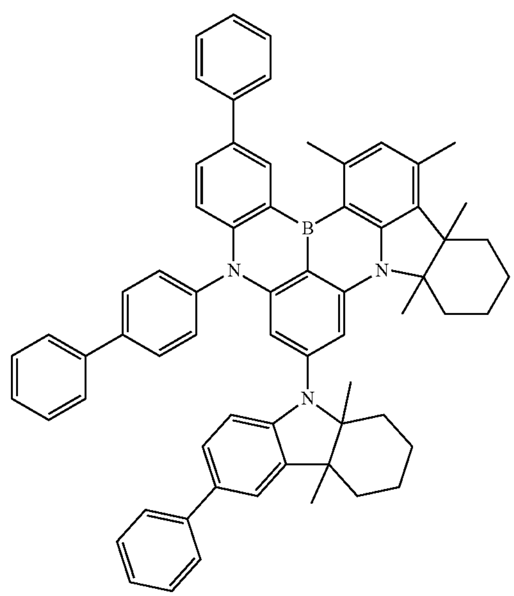

-continued
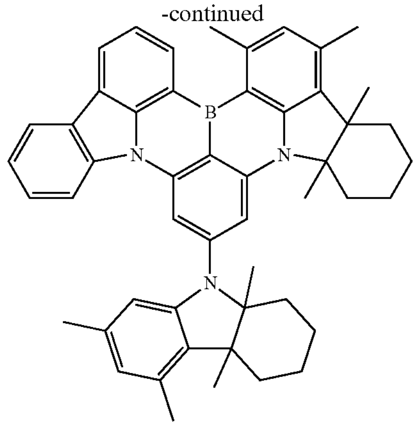
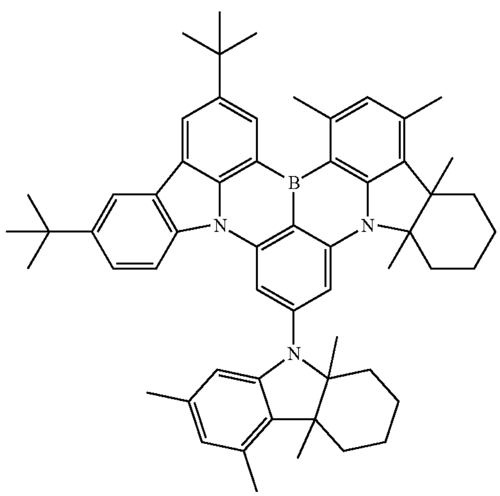
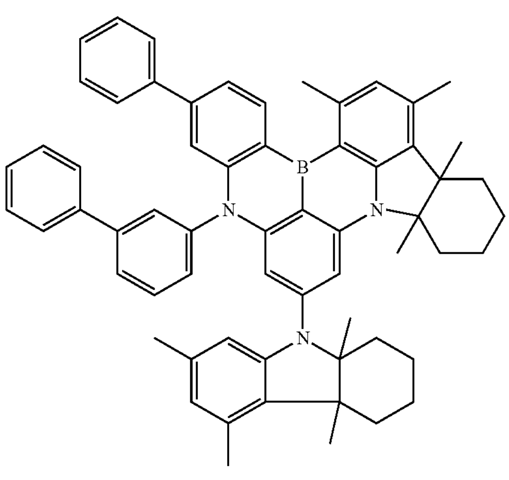
-continued
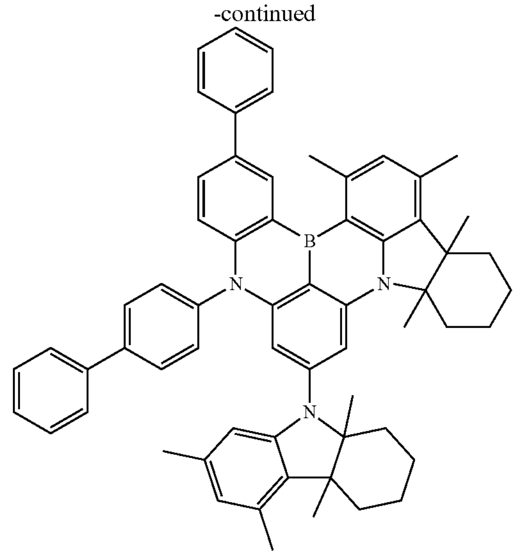
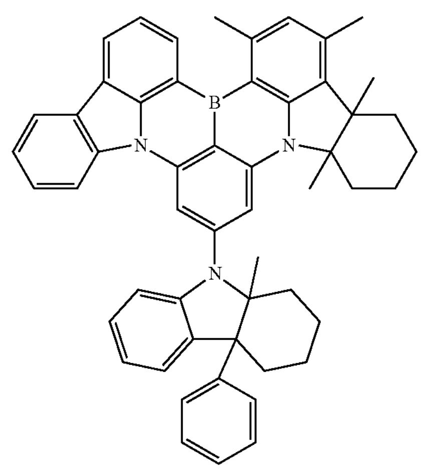
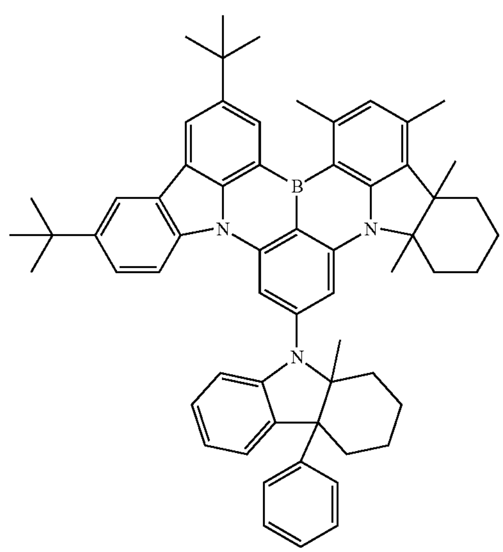

-continued
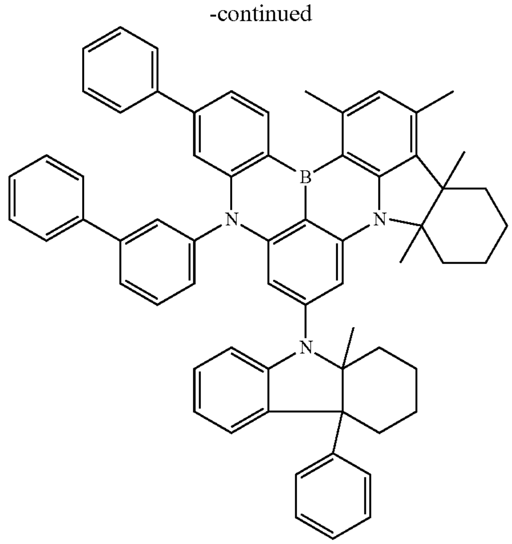
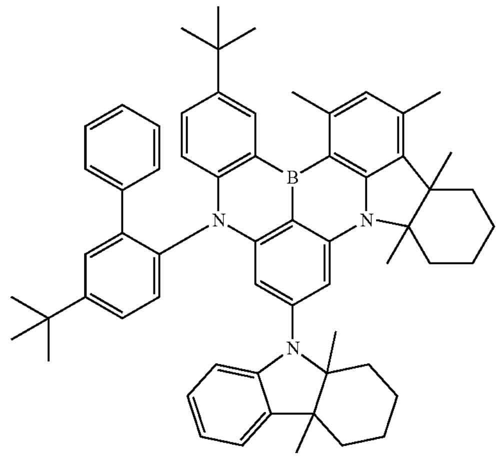
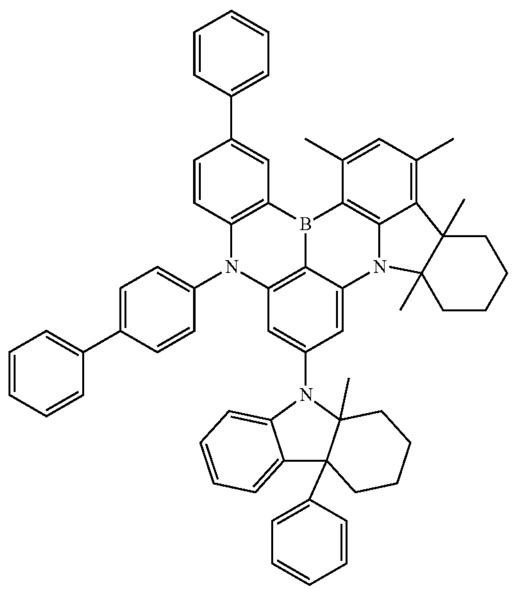
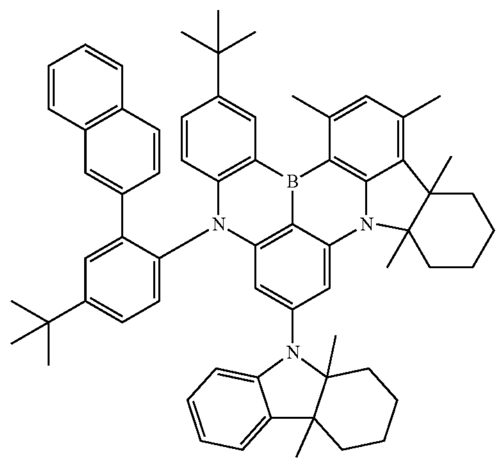
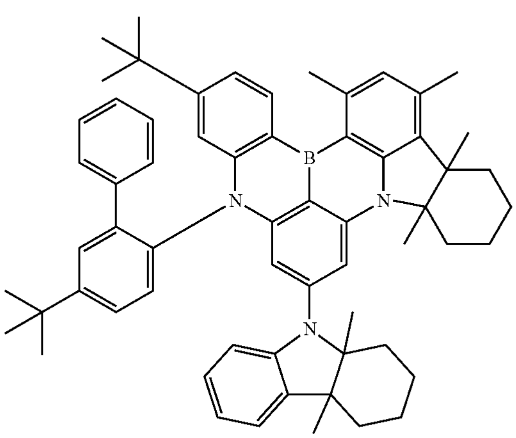
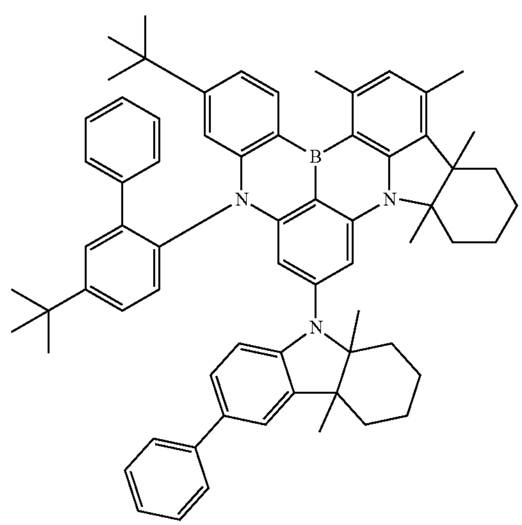
-continued -continued
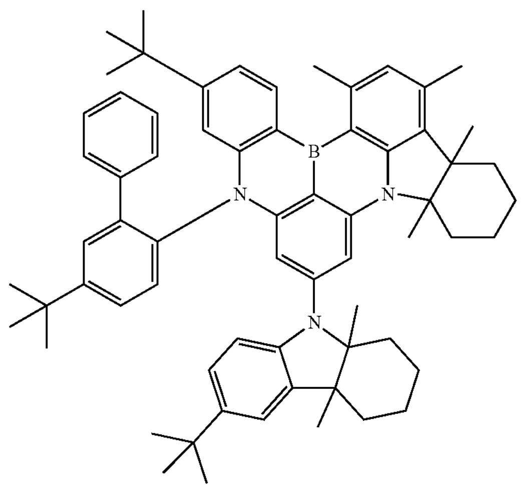
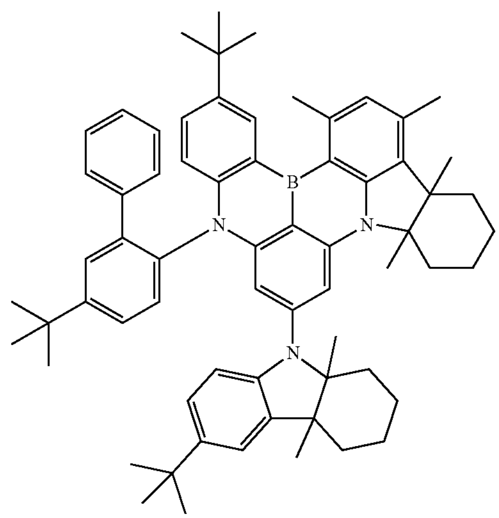
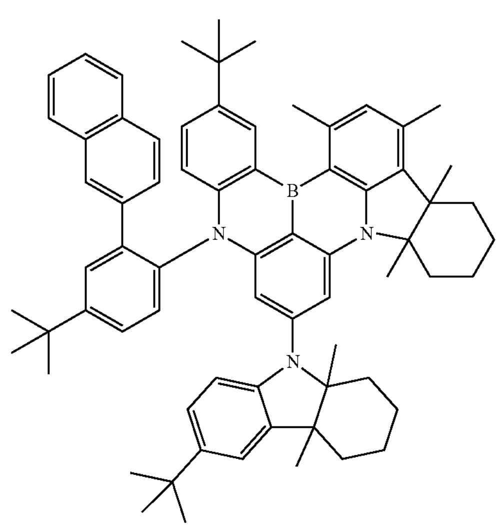
-continued
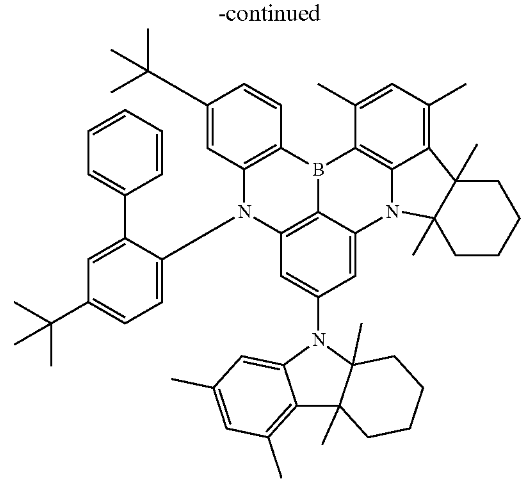
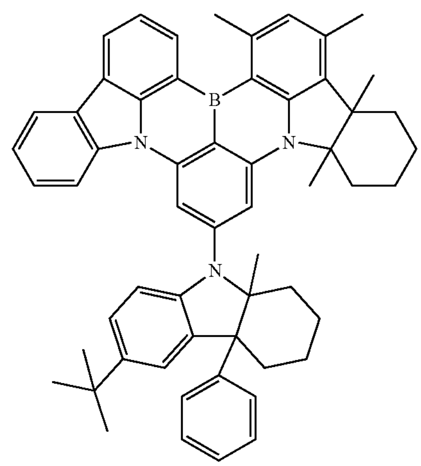
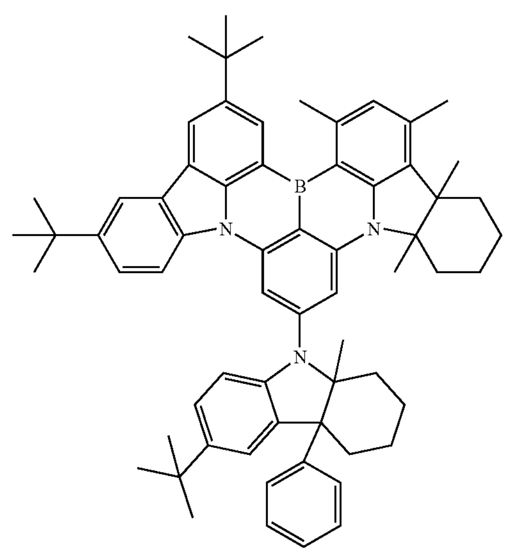

-continued
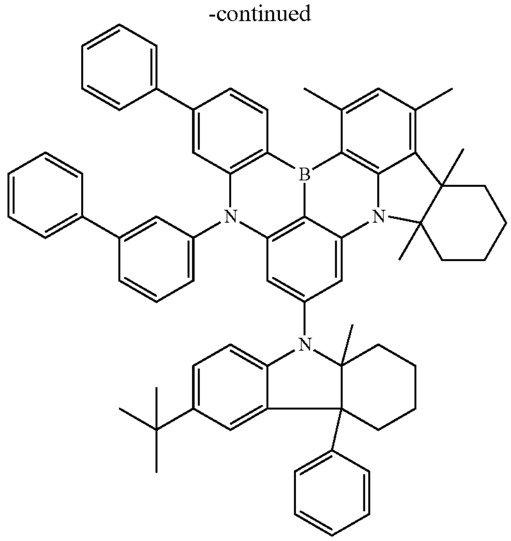
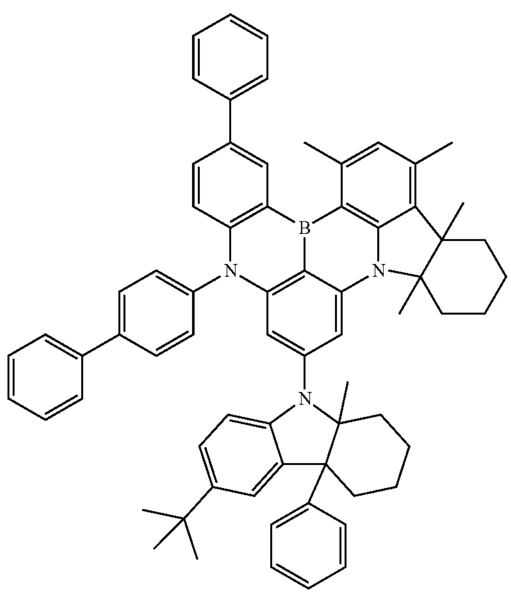
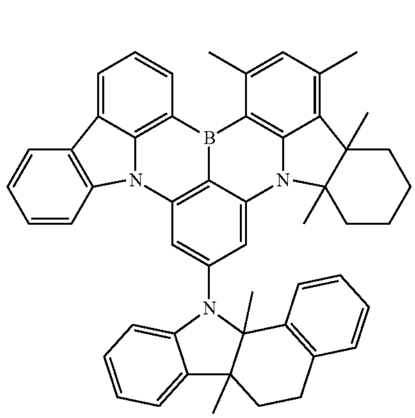
-continued
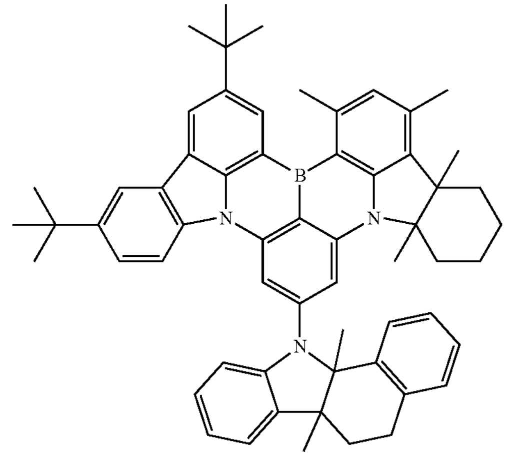
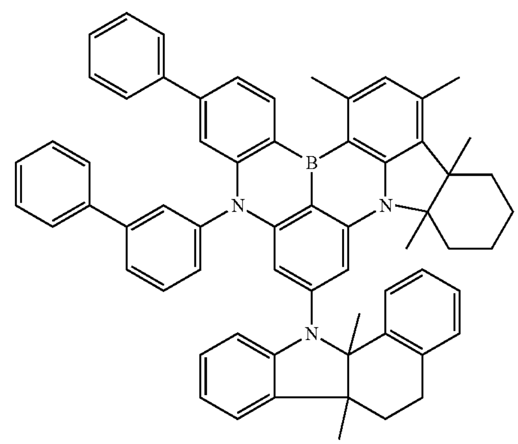
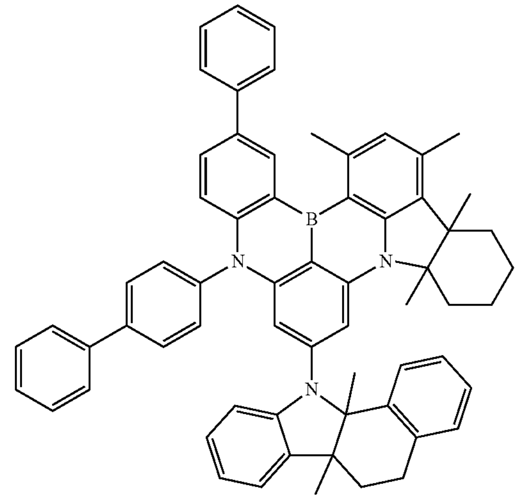

-continued
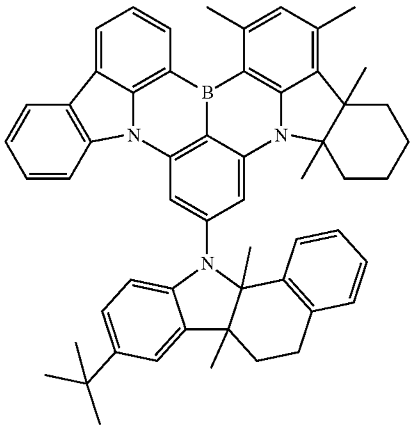
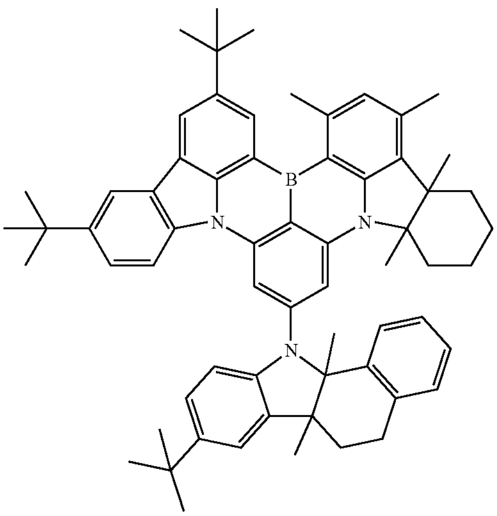
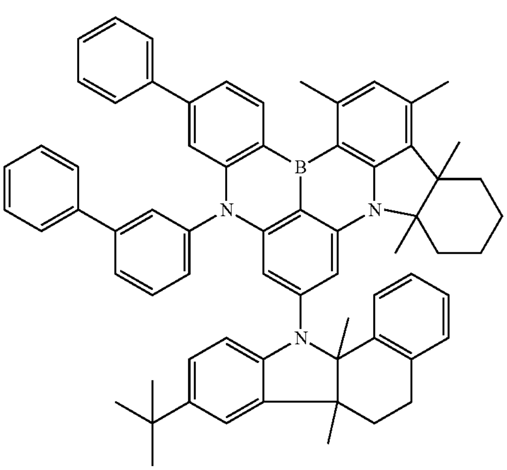
-continued
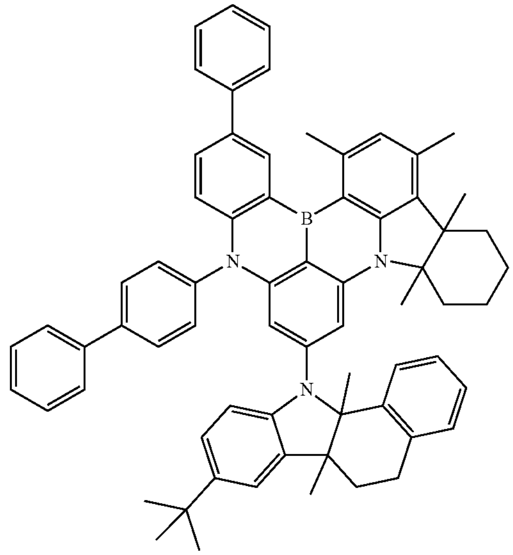
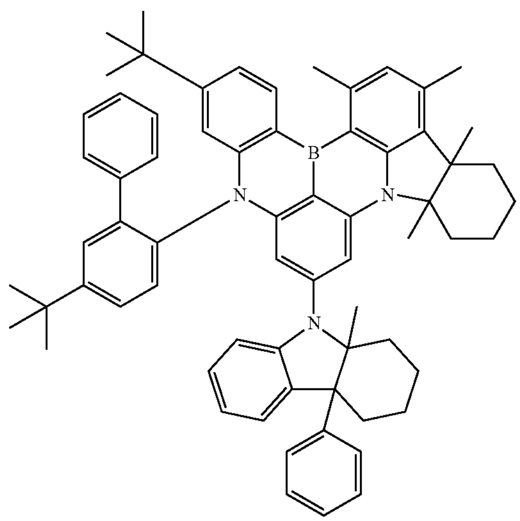
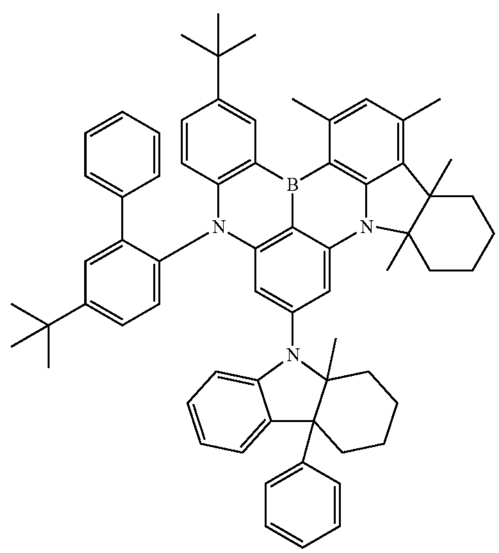

-continued
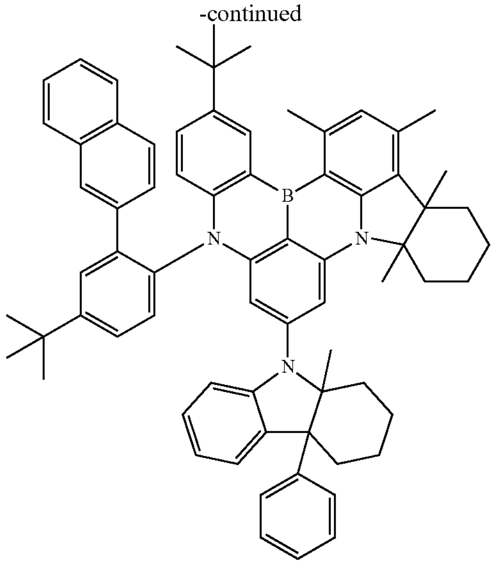
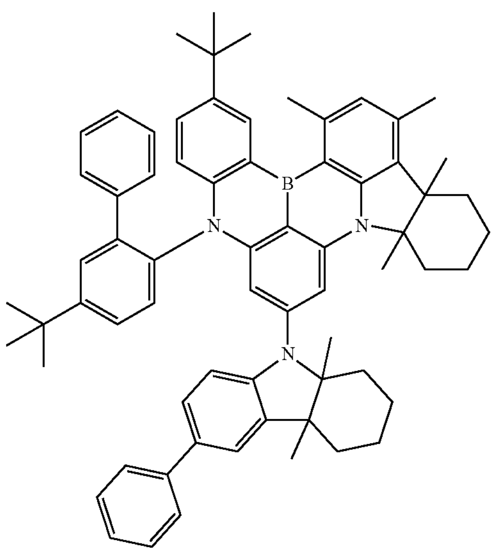
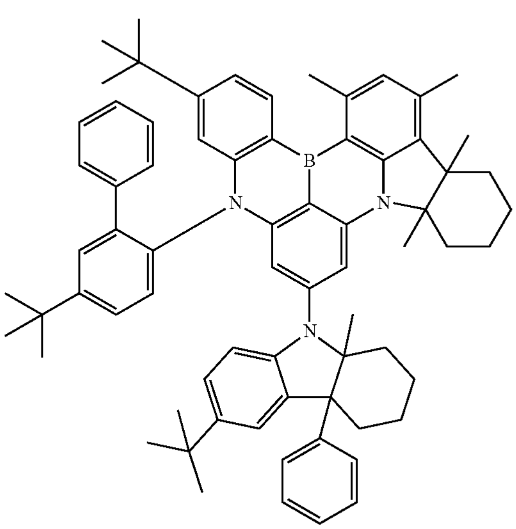
-continued
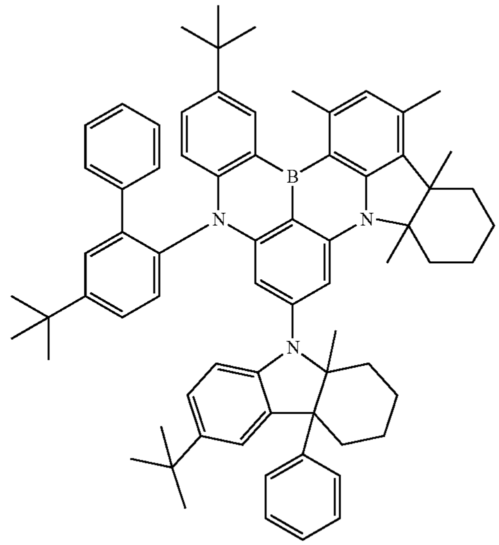
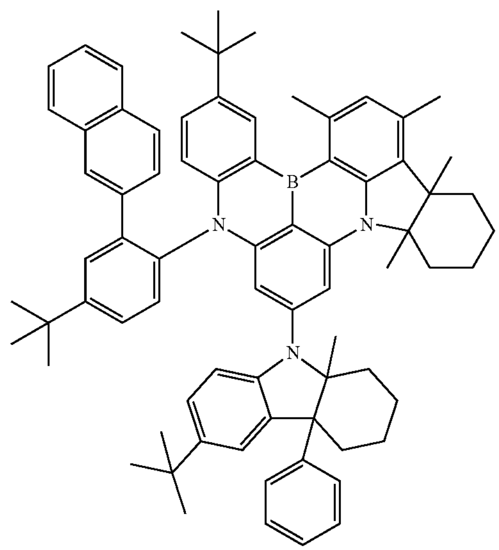
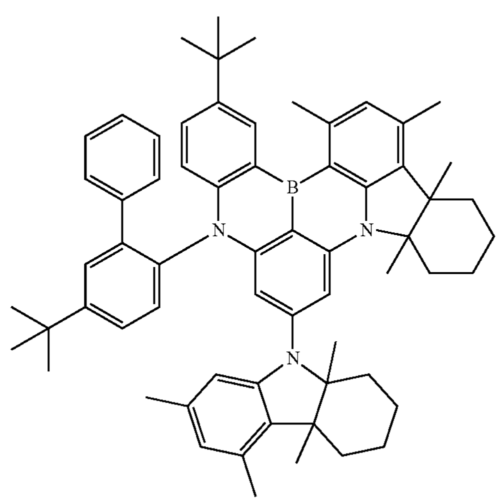

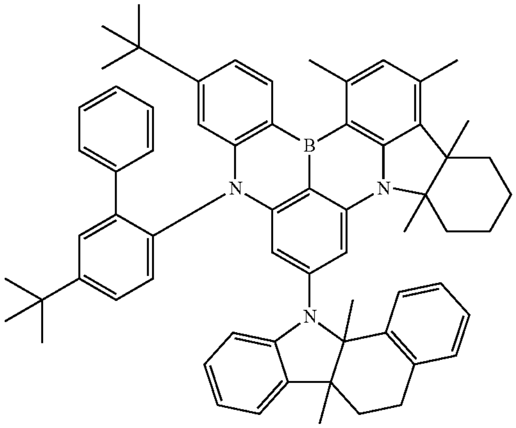
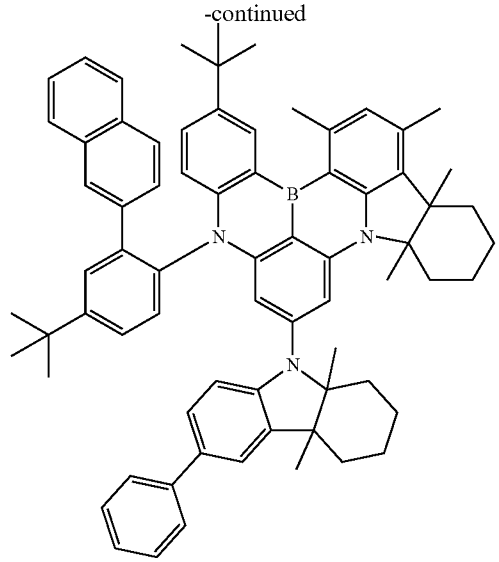
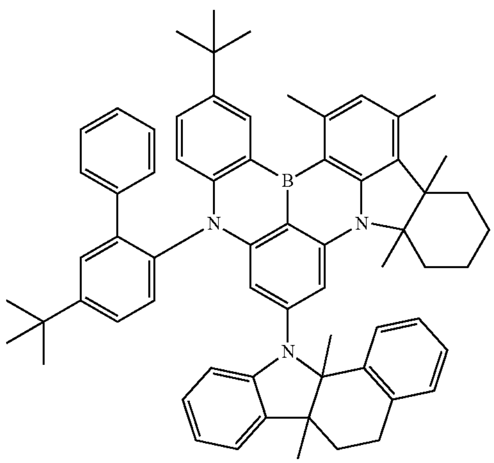
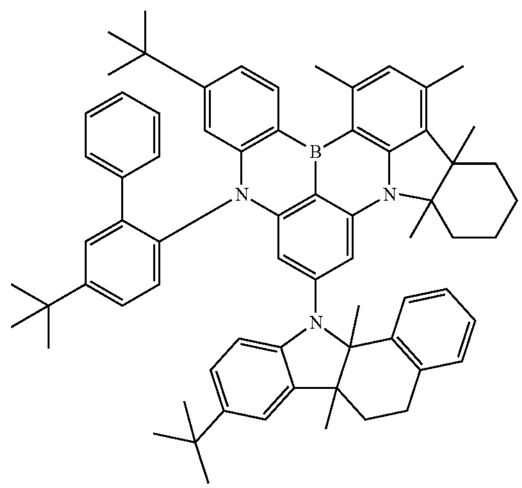
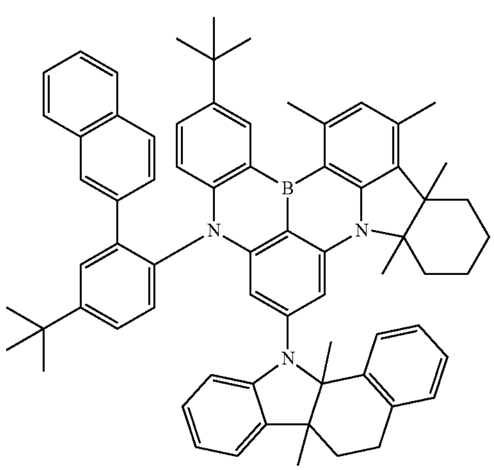
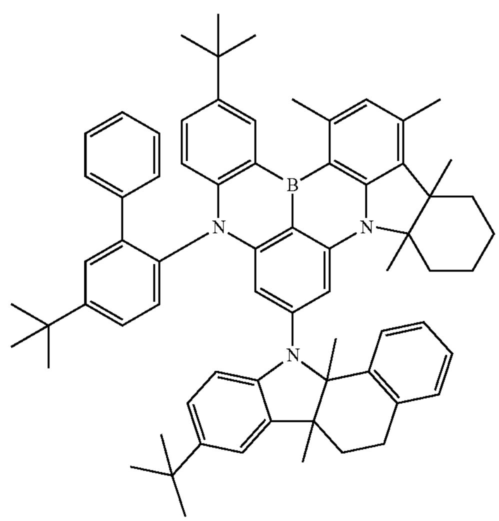

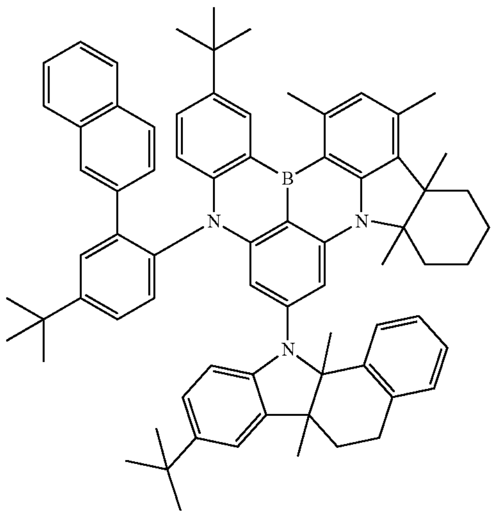
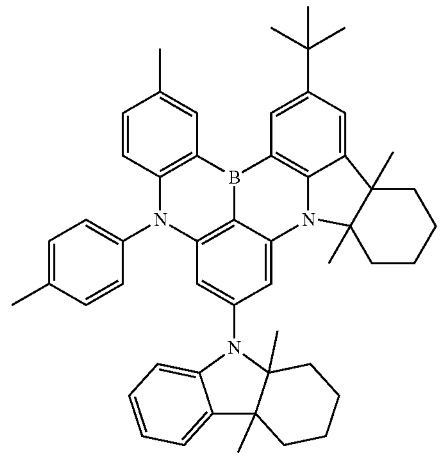
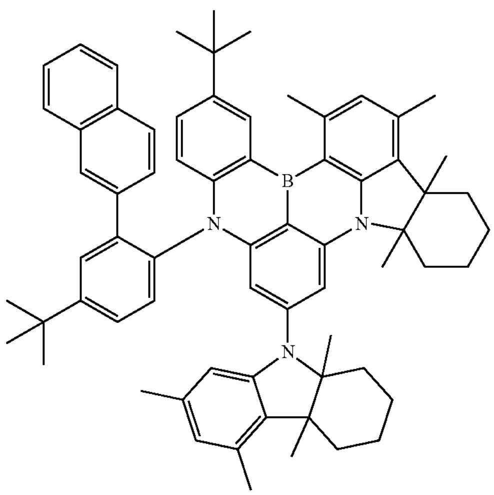
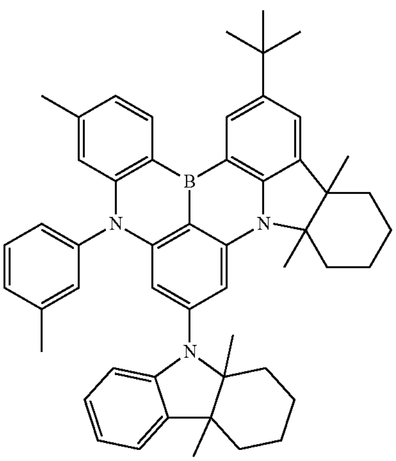
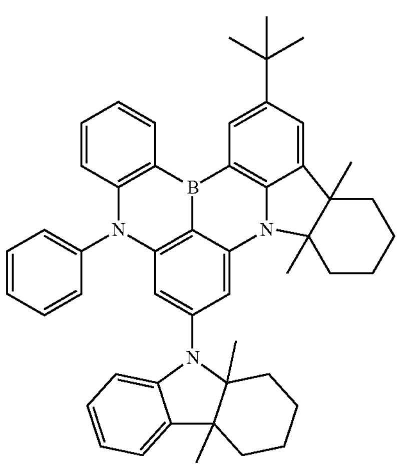
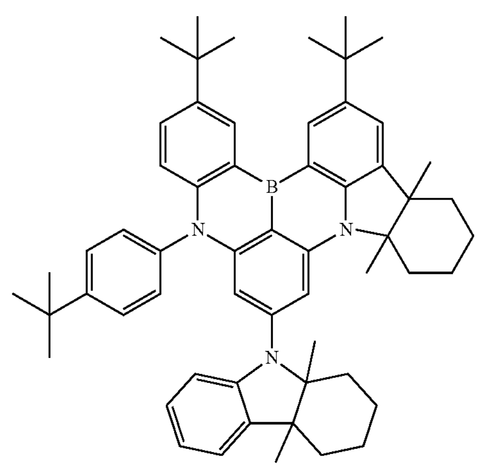

-continued
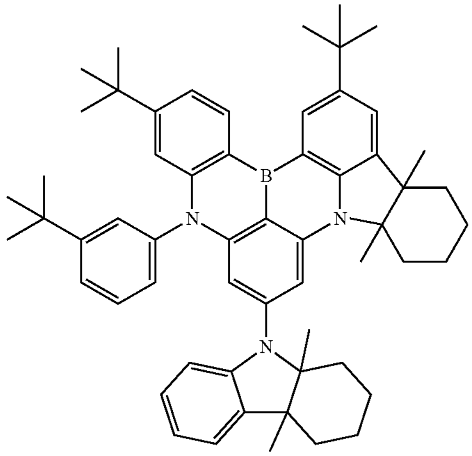
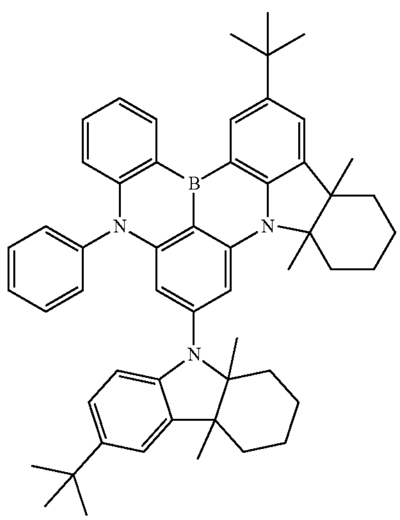
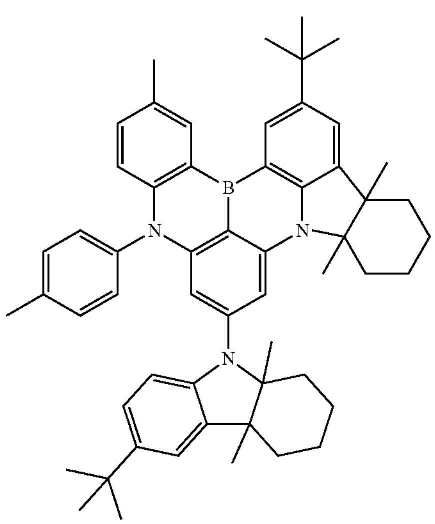
-continued
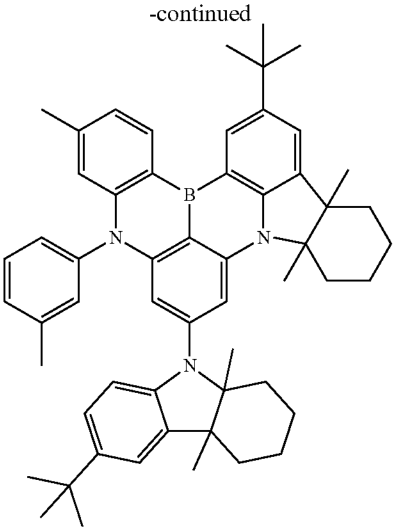
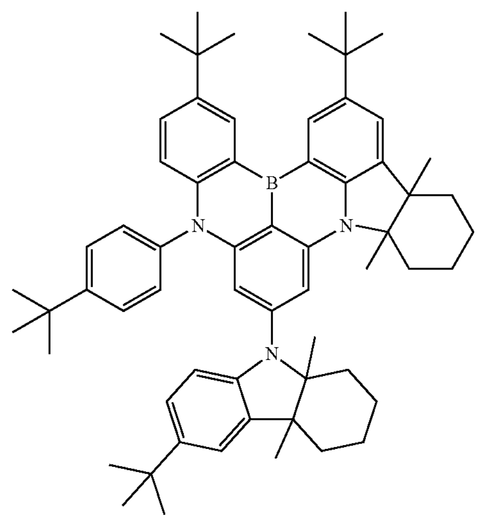
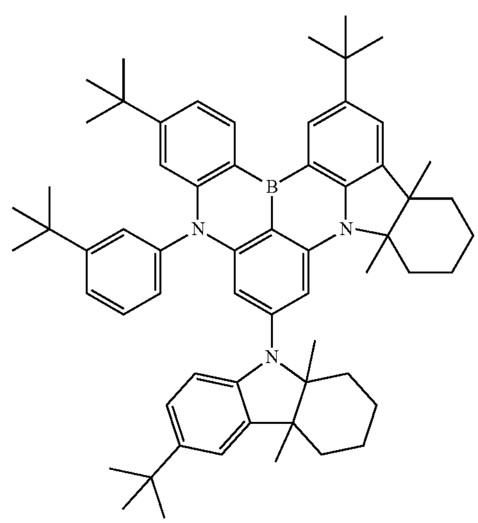

-continued
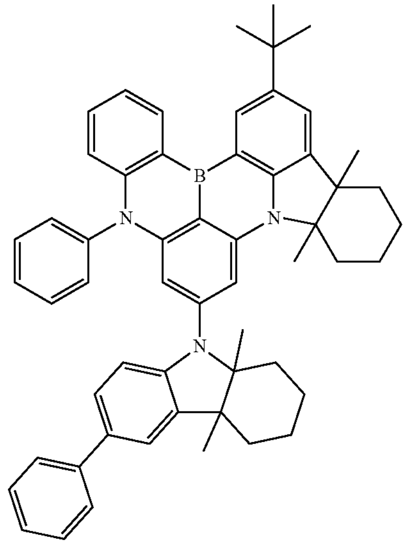
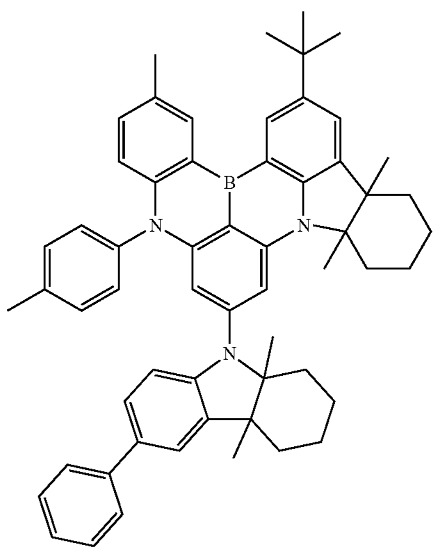
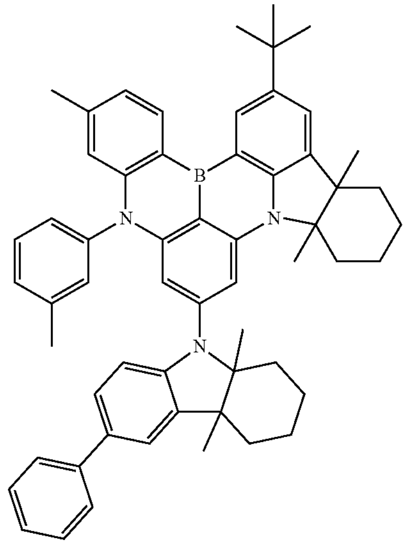
-continued
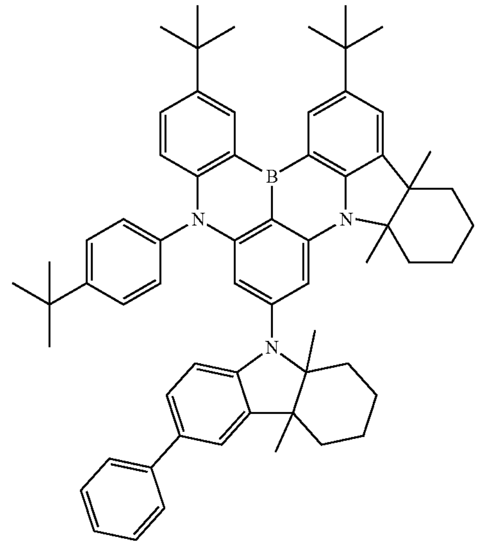
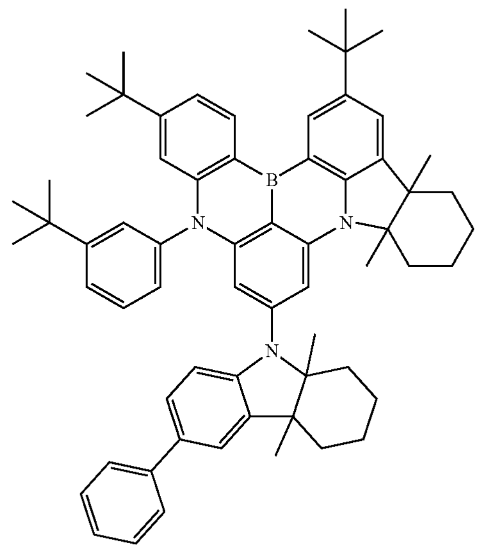
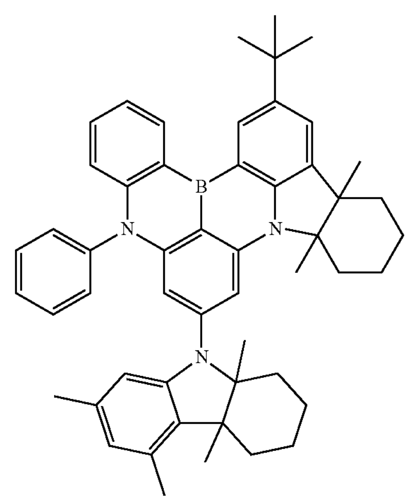

-continued
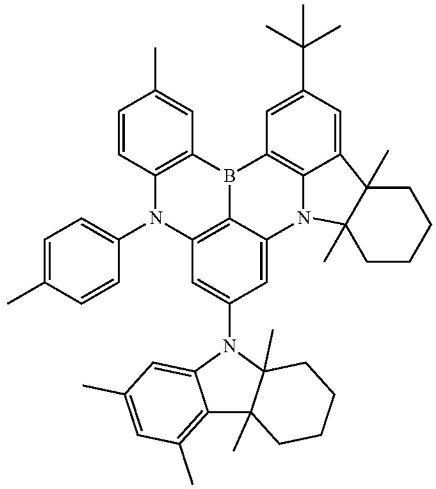
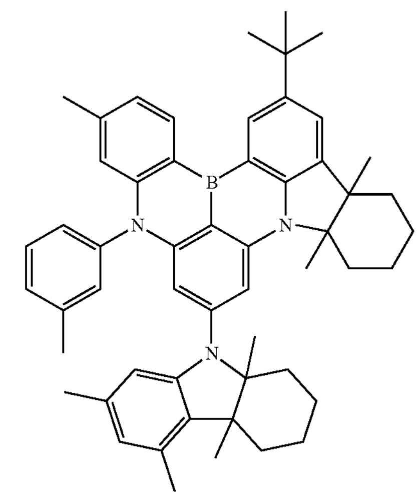
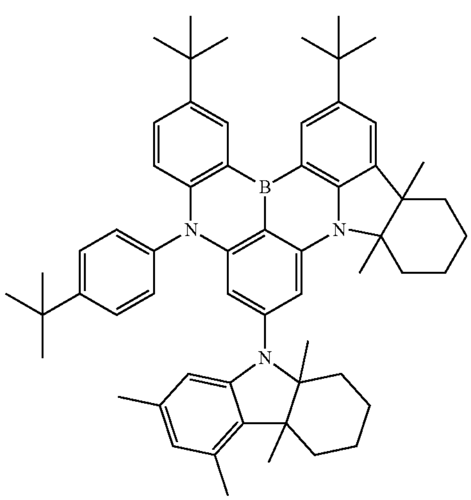
-continued
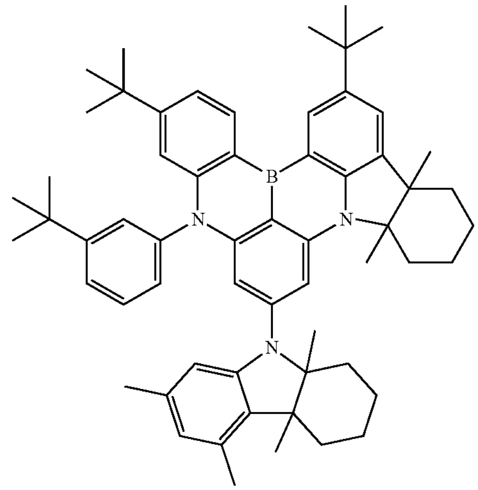
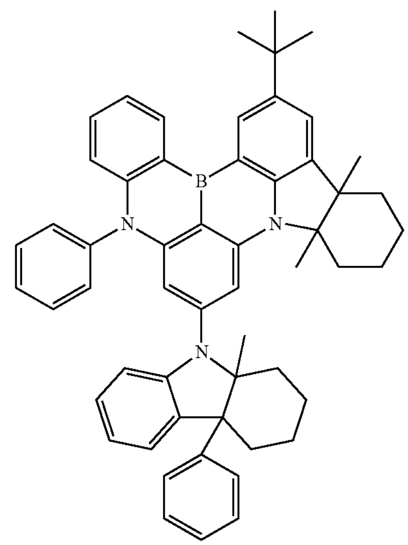
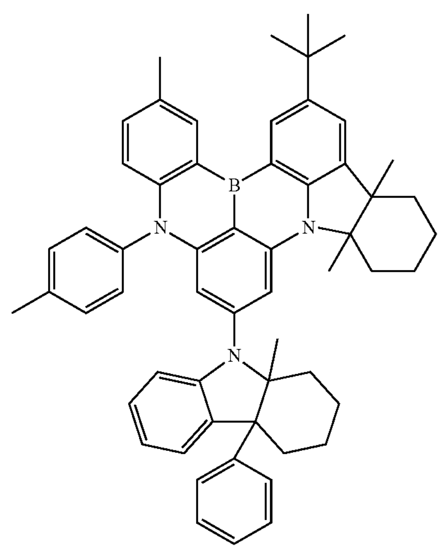

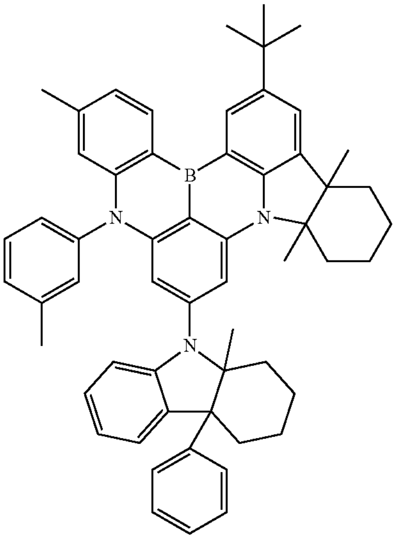
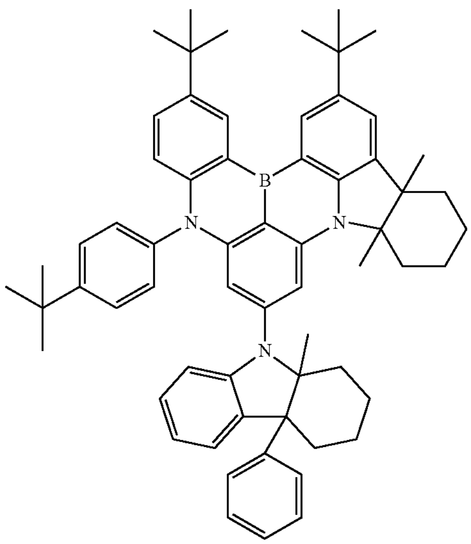
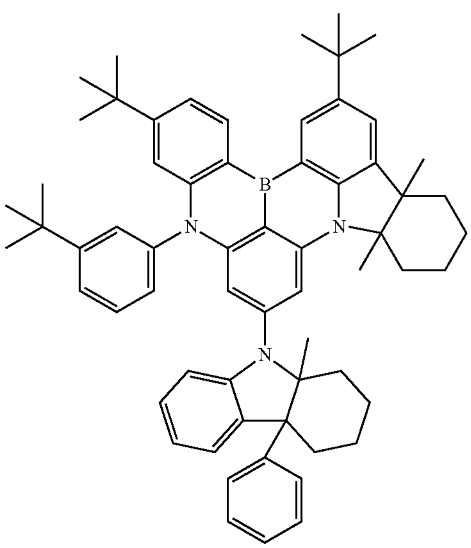
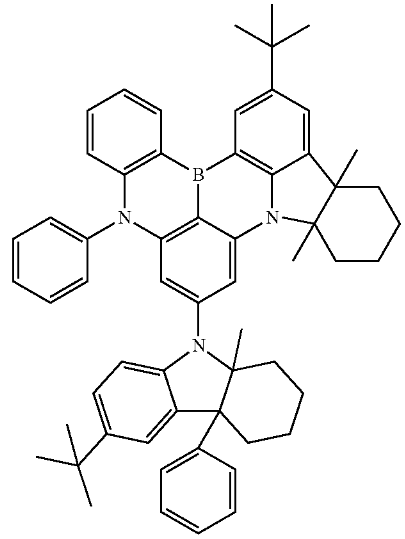
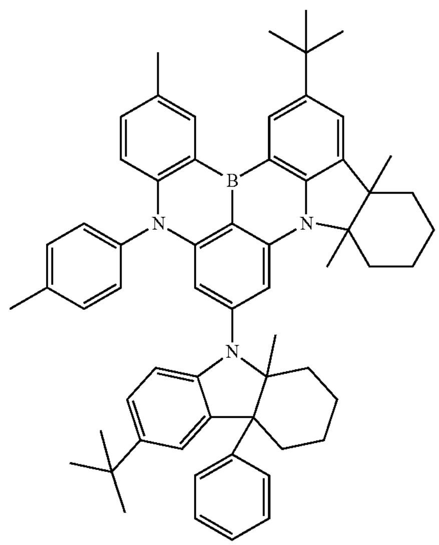
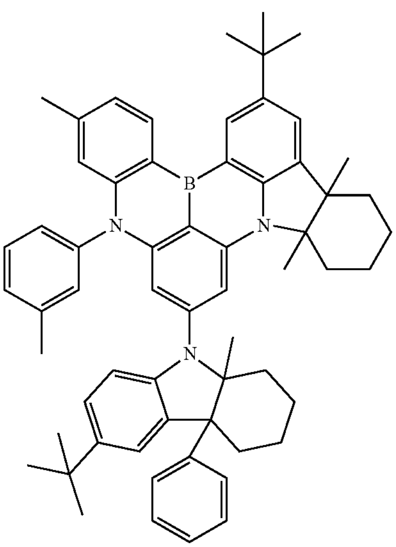

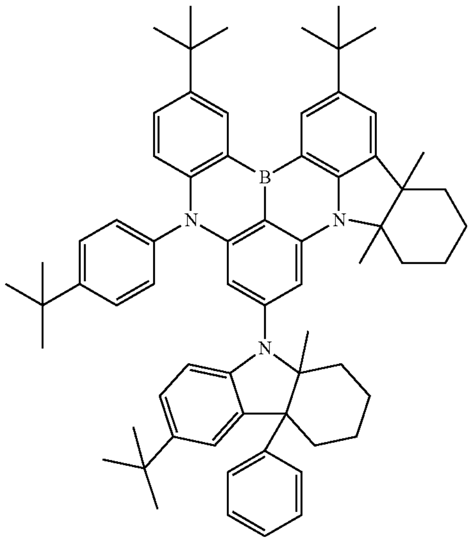
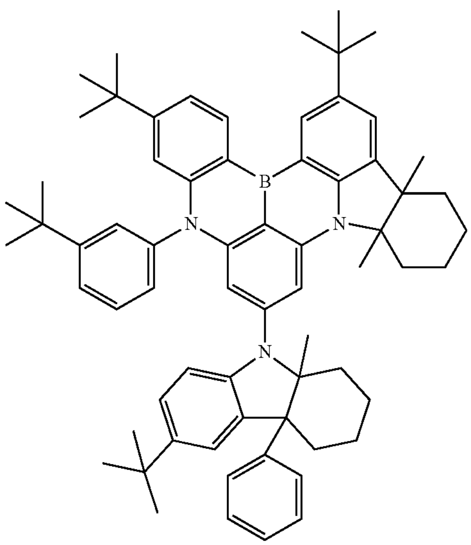
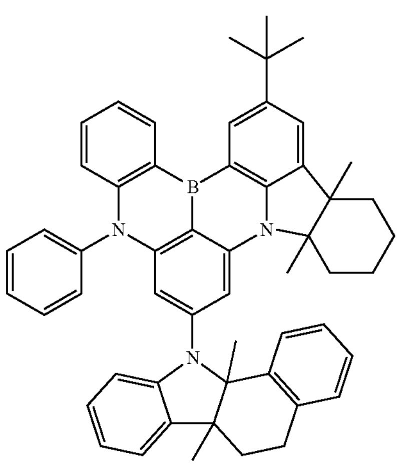
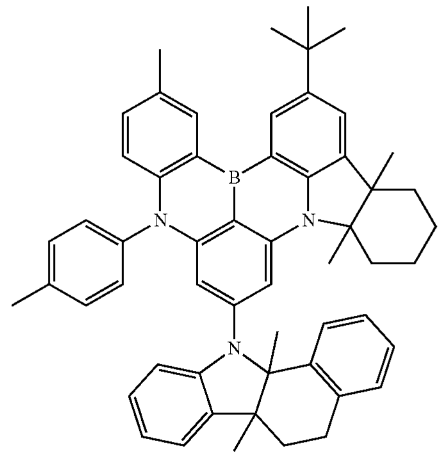
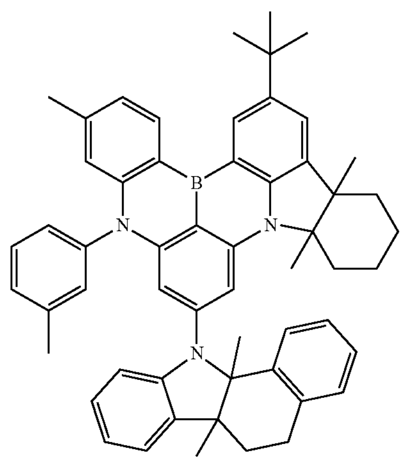
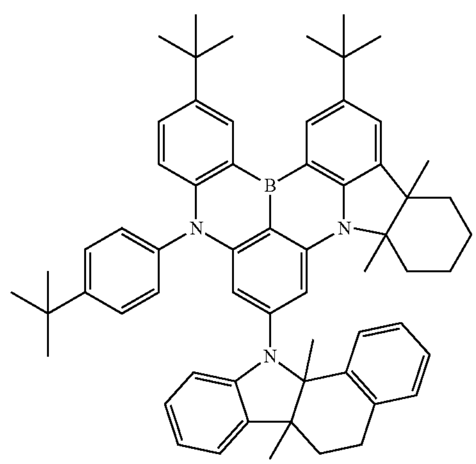

-continued
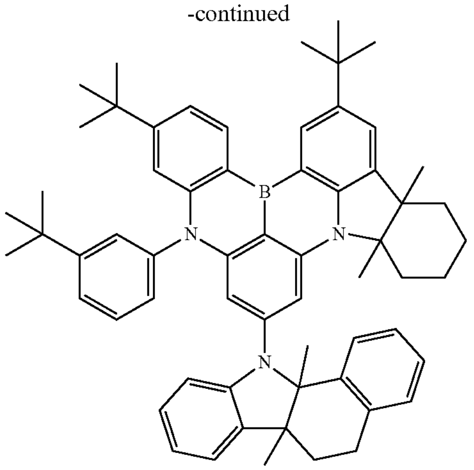
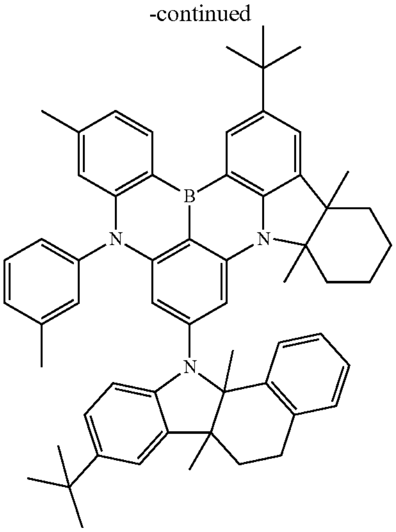
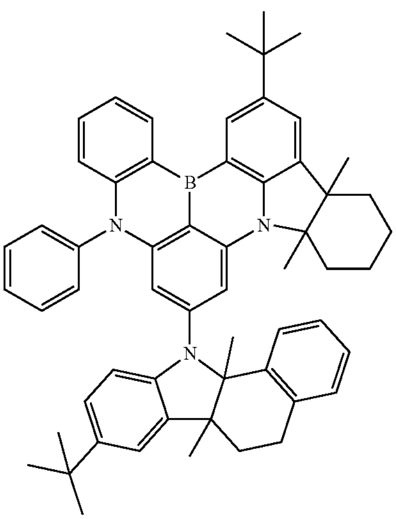
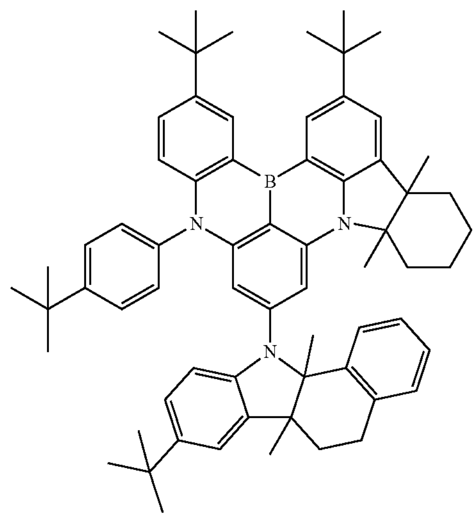
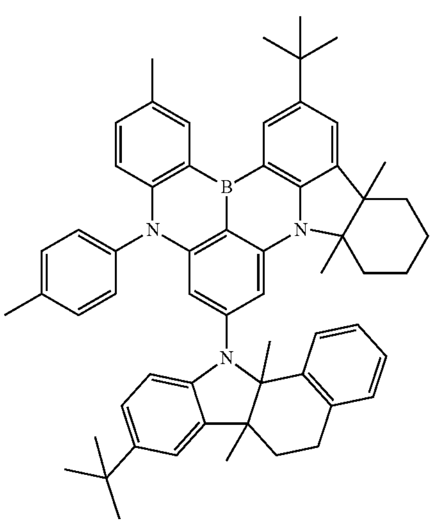
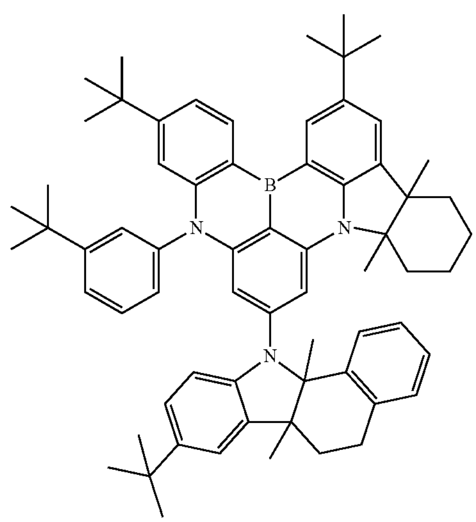
-continued

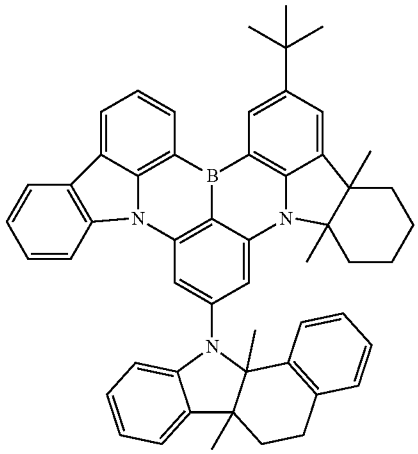
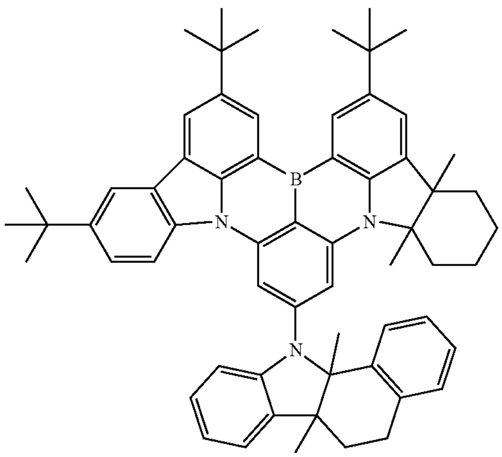
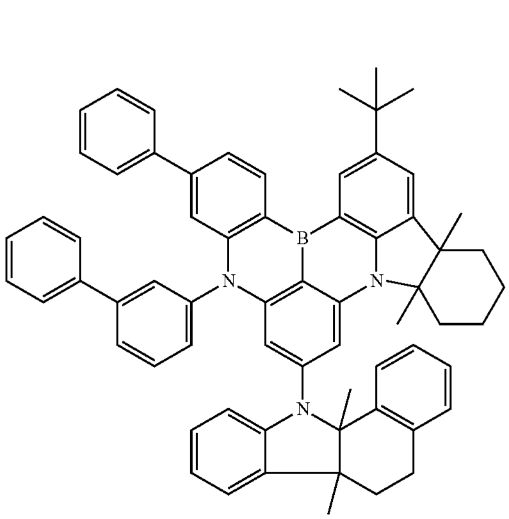
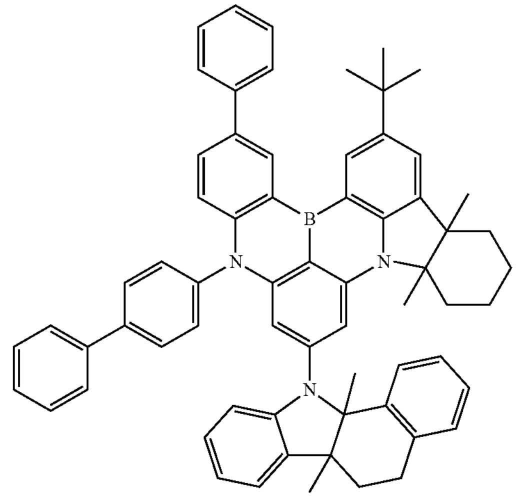
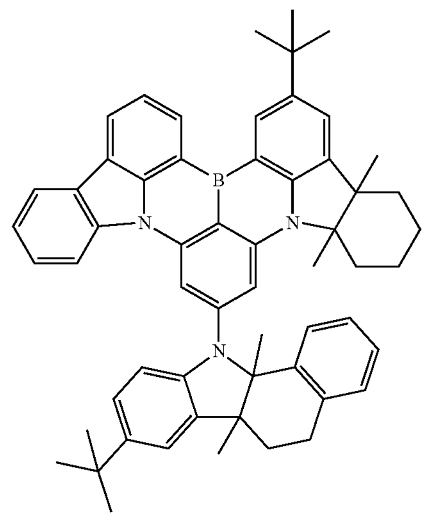
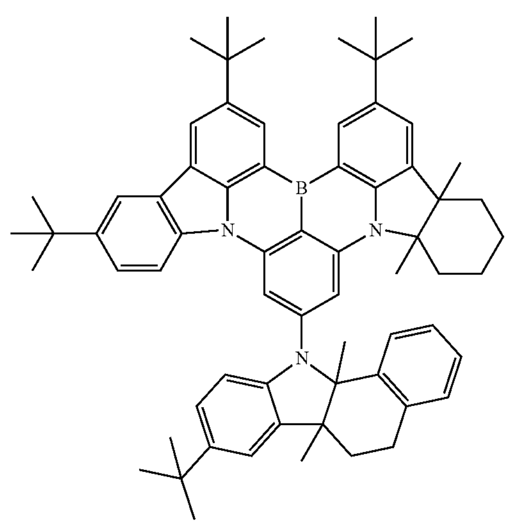

-continued
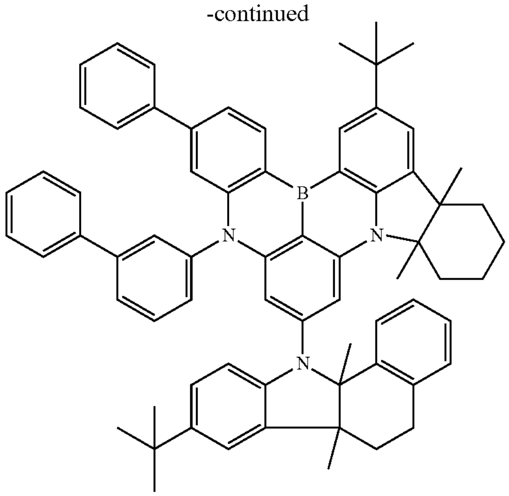
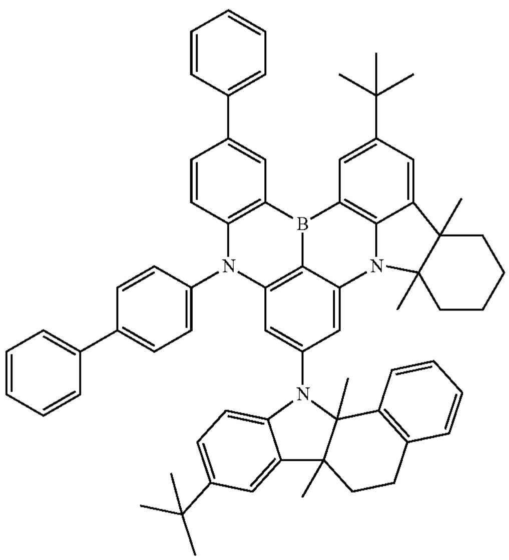
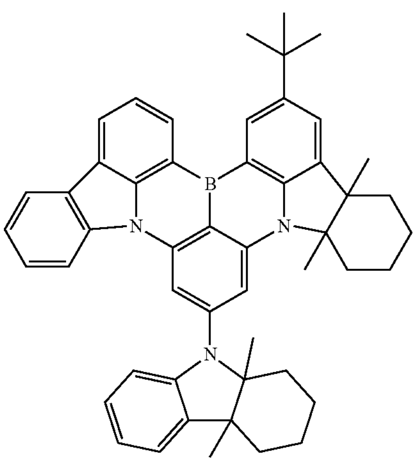
-continued
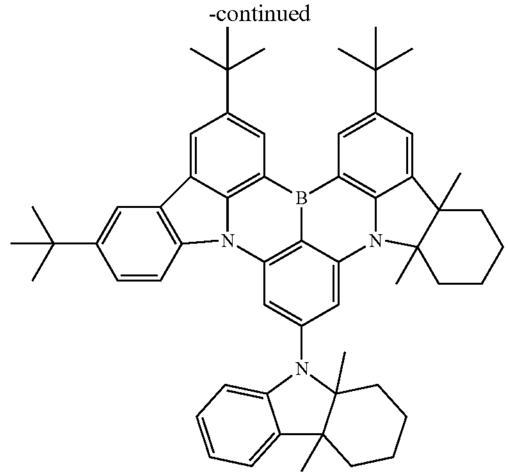
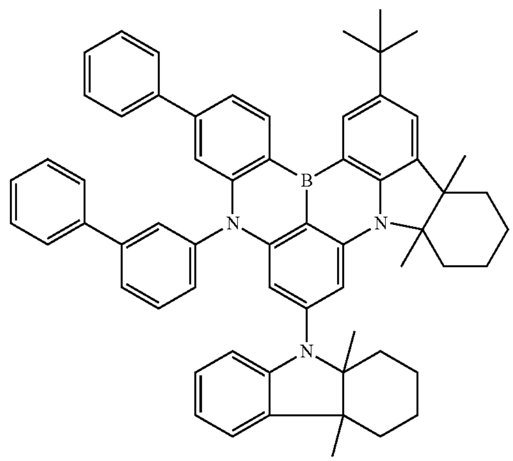
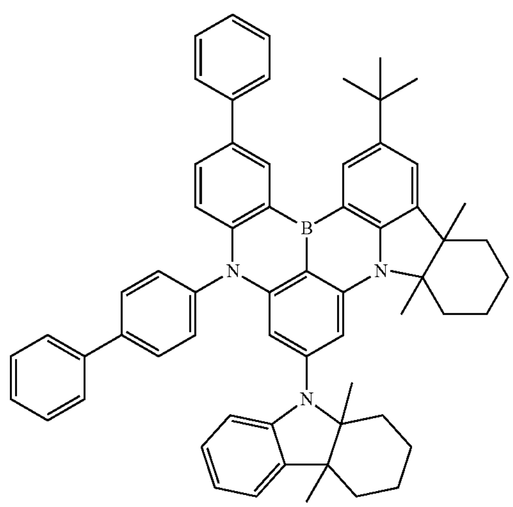

-continued
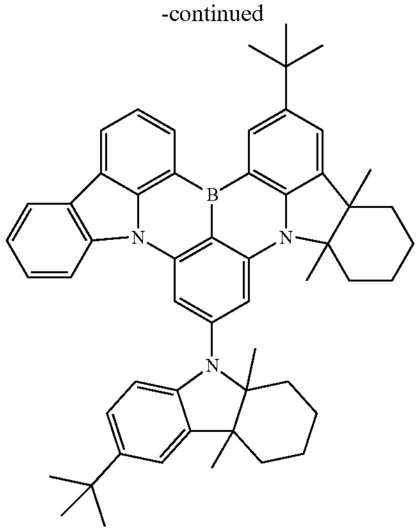
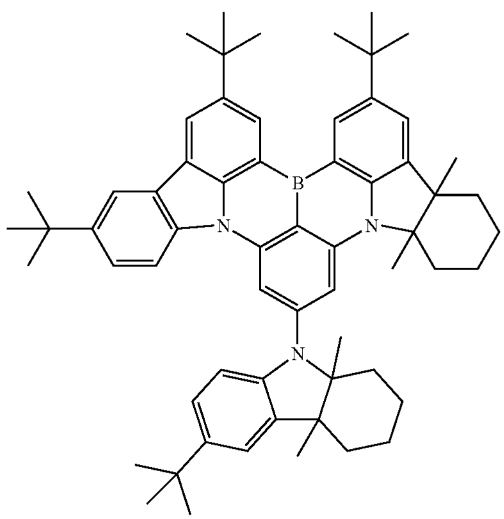
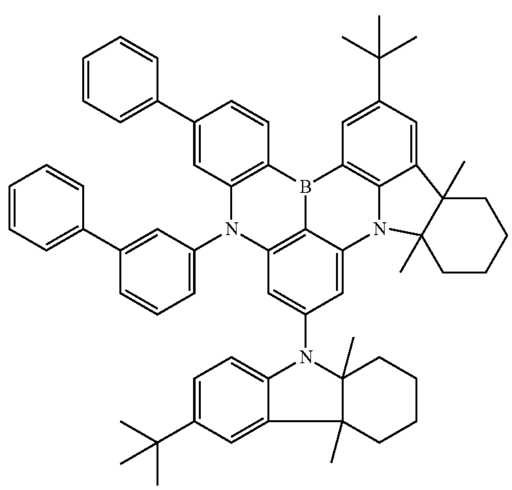
-continued
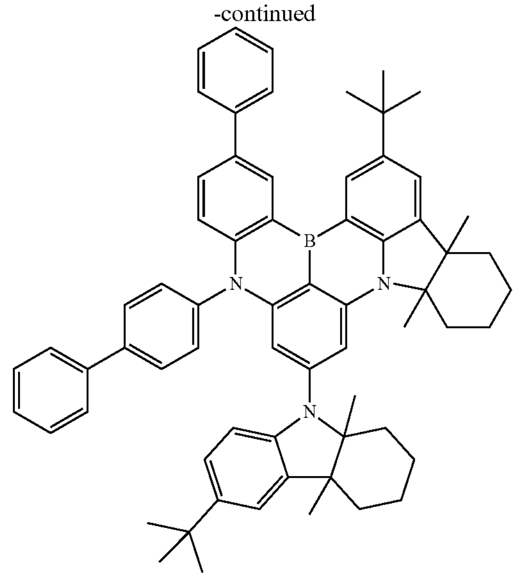
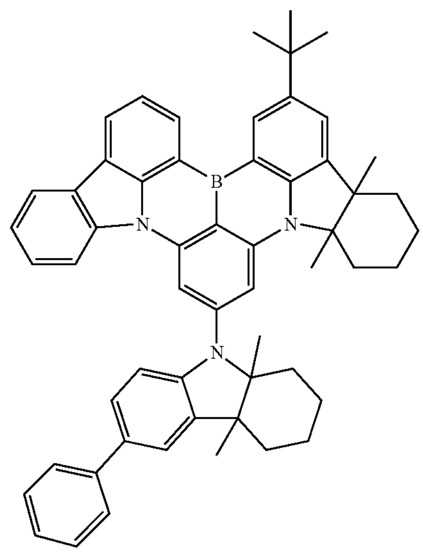
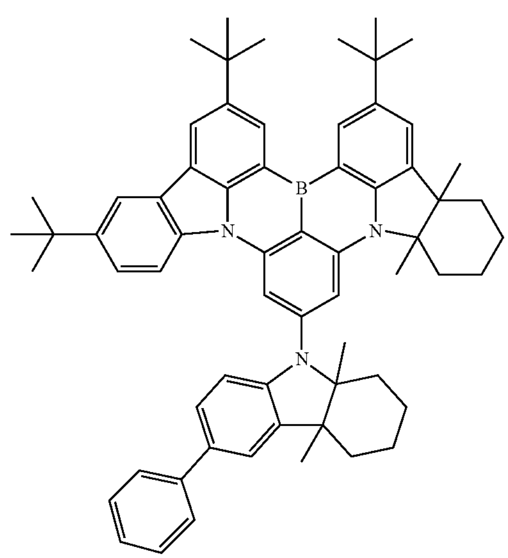

-continued
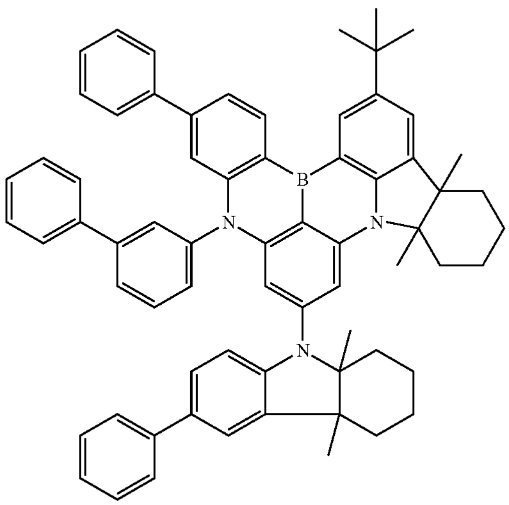
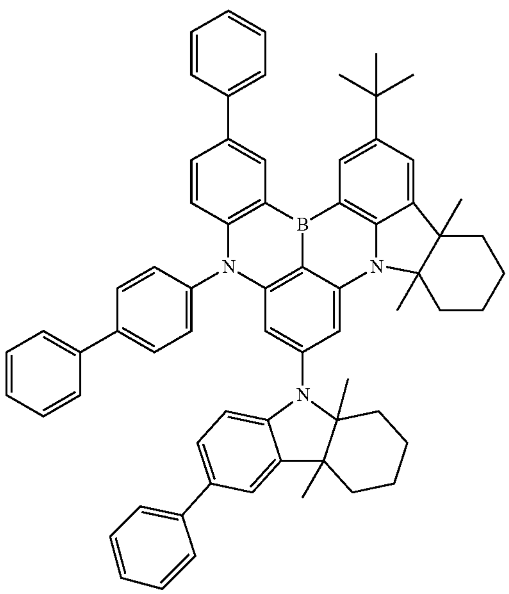
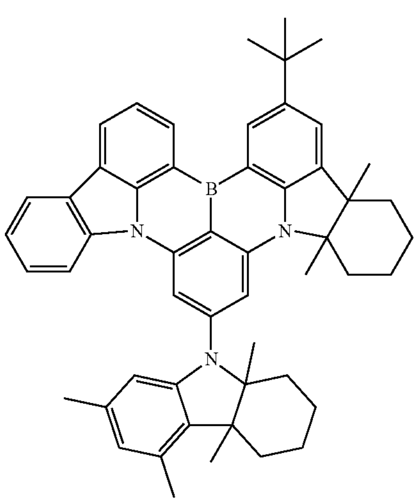
-continued
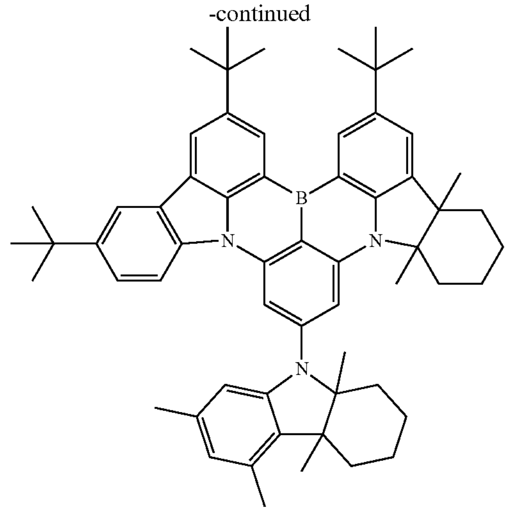
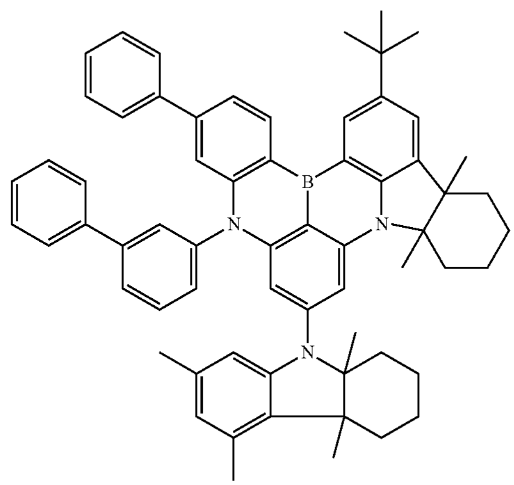
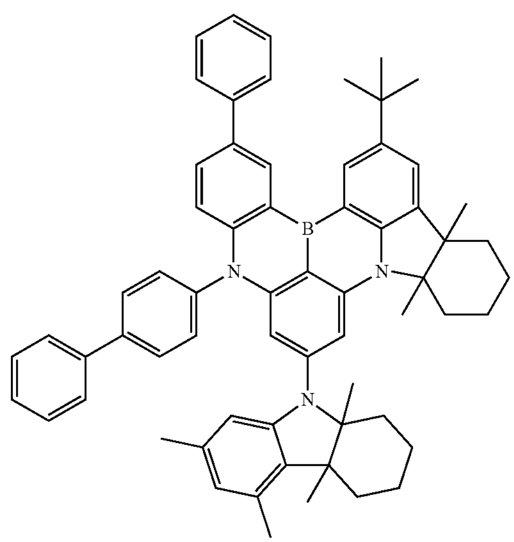

-continued
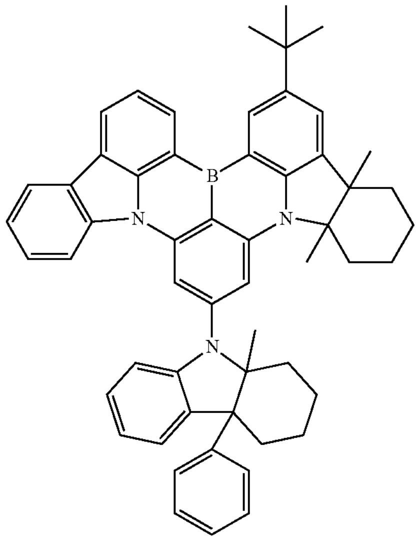
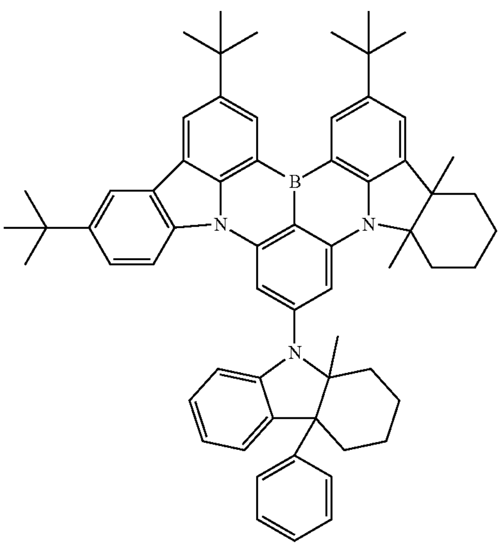
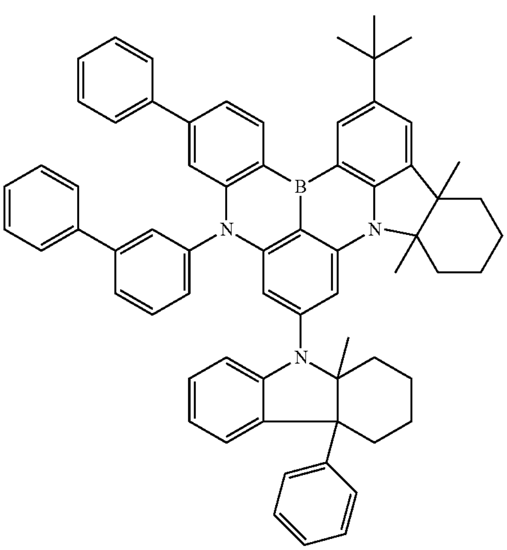
-continued
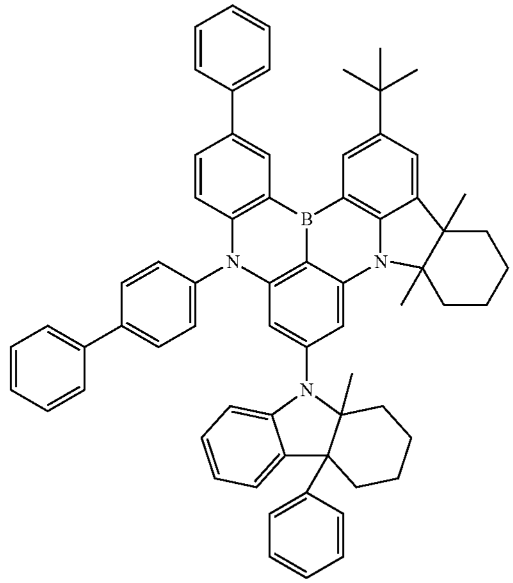
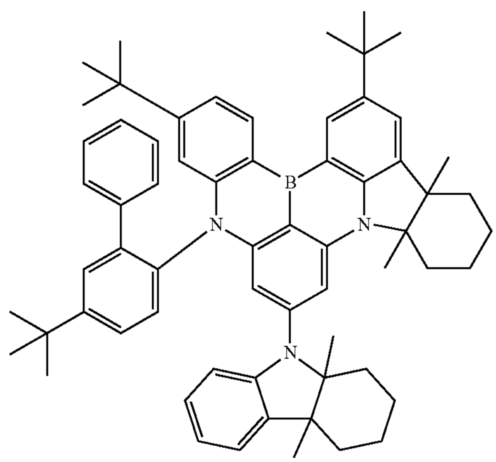
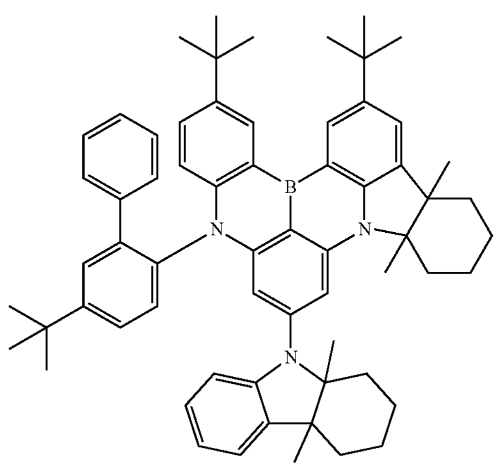

-continued
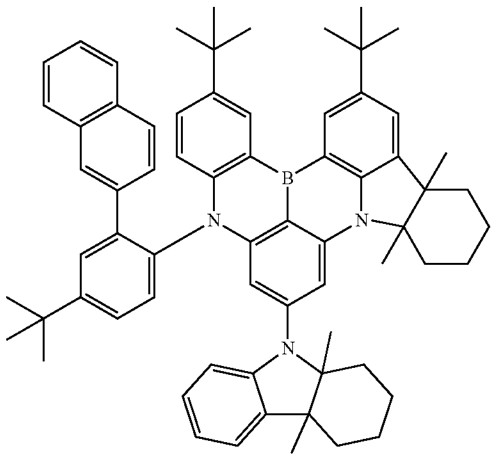
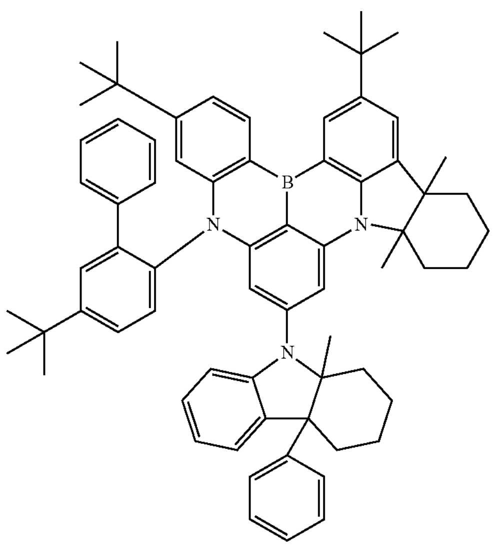
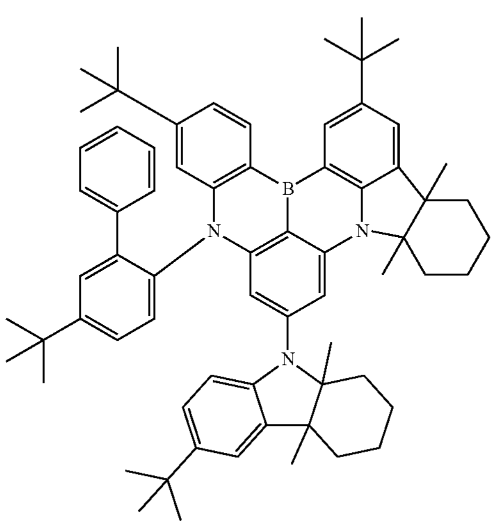
-continued
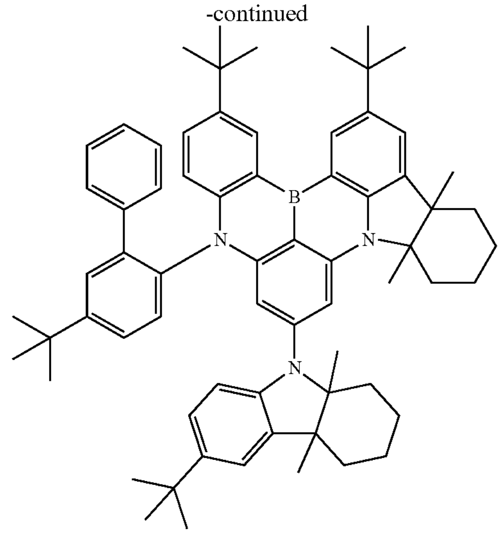
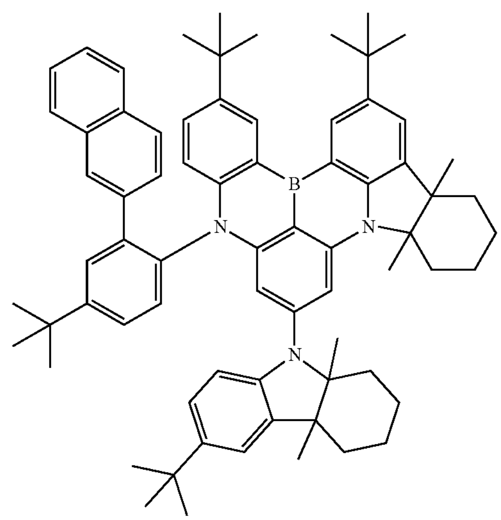
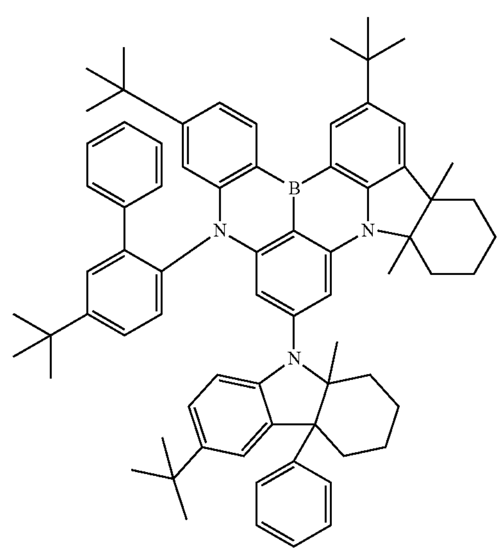

-continued
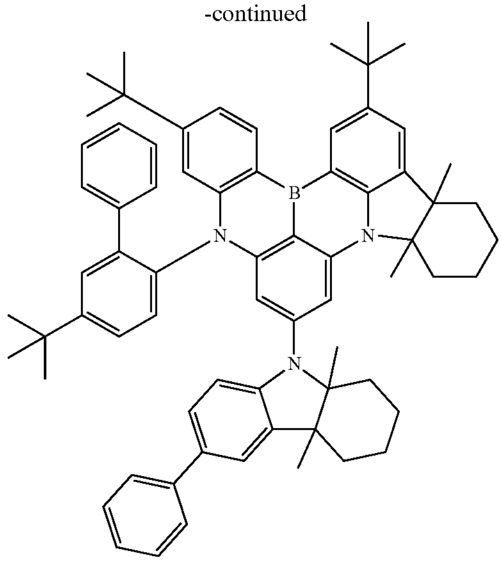
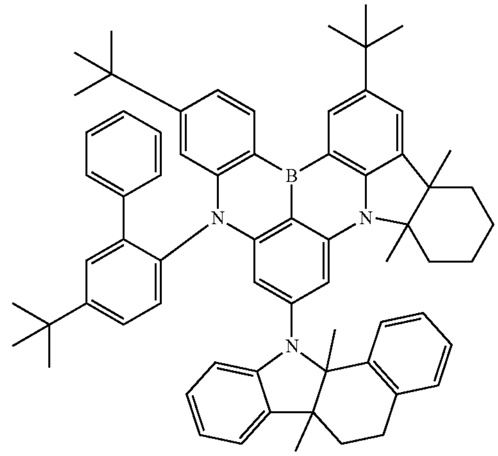
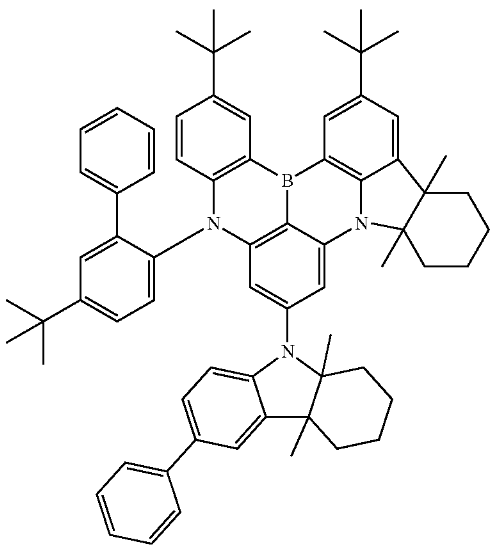
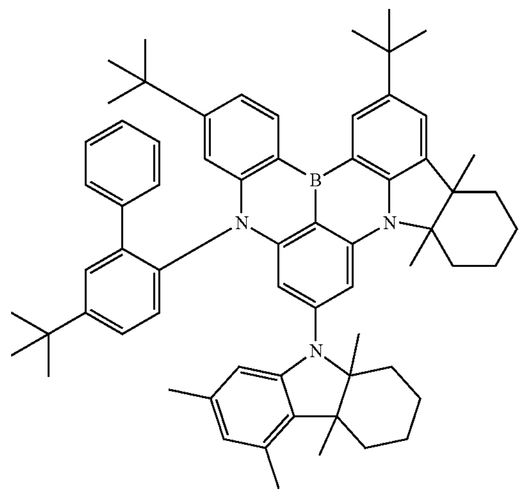
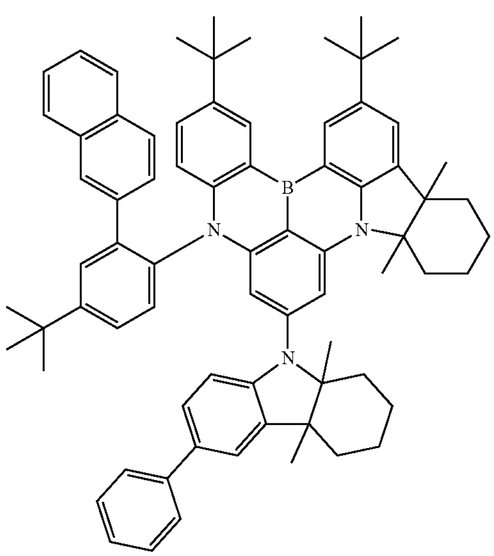
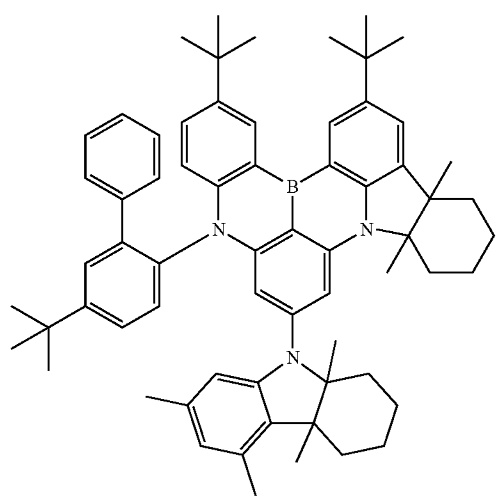
-continued -continued
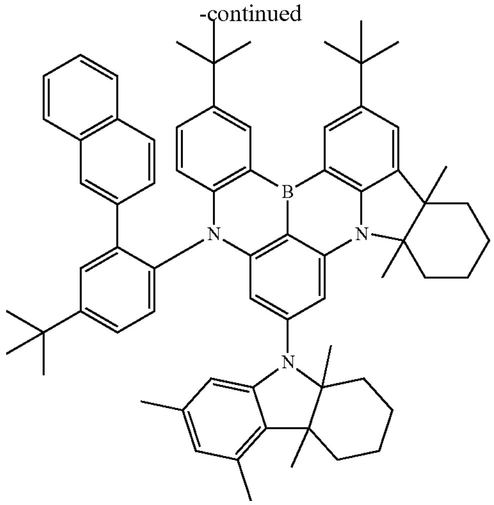
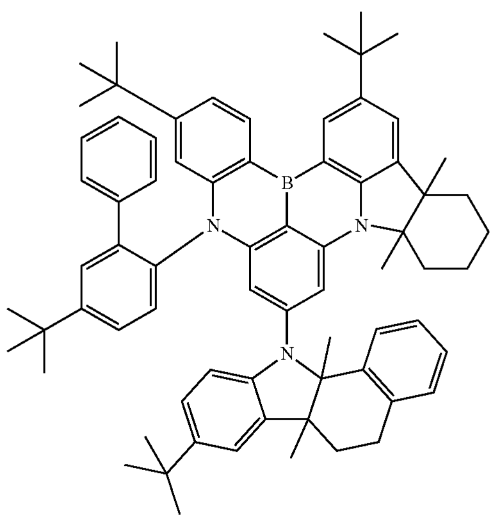
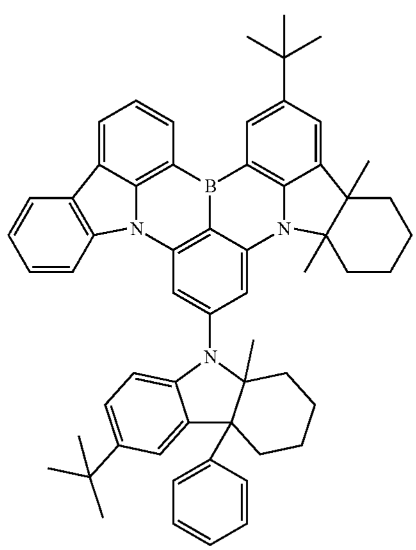
-continued
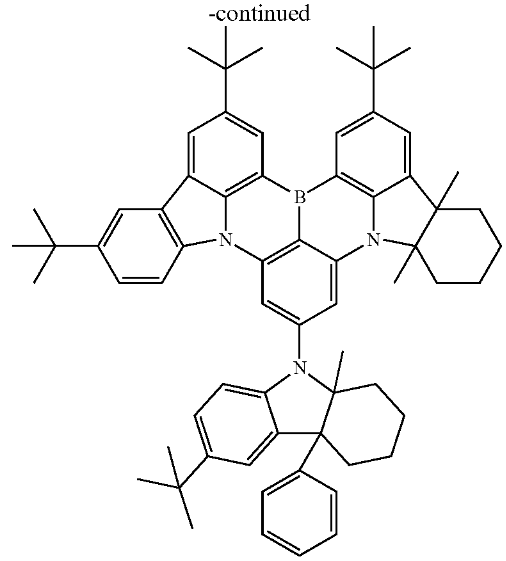
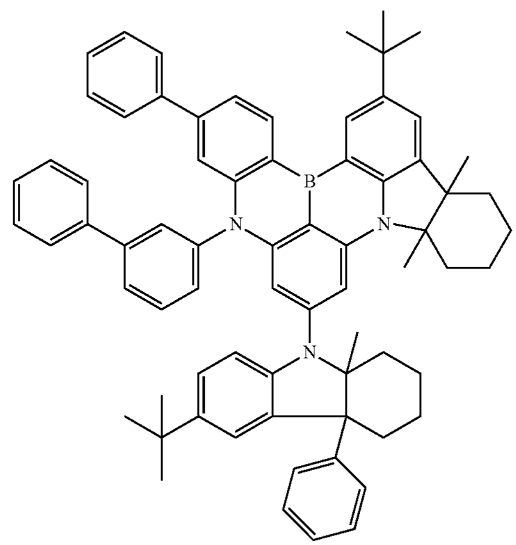
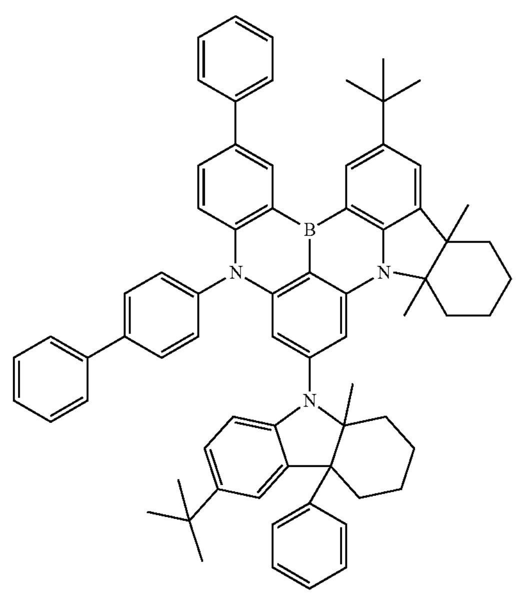

-continued
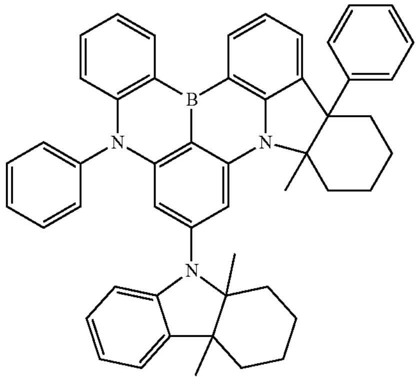
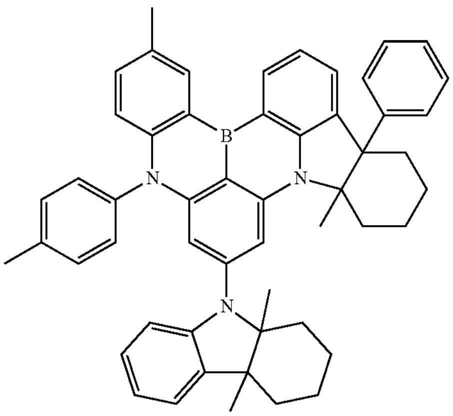
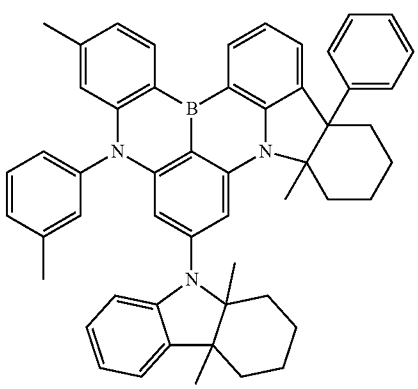
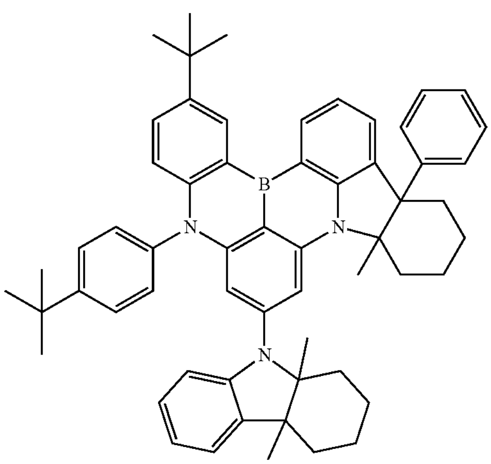
-continued
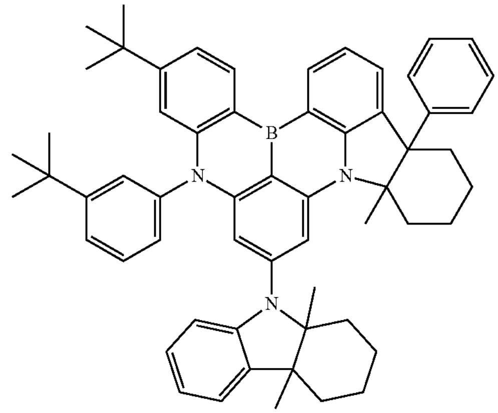
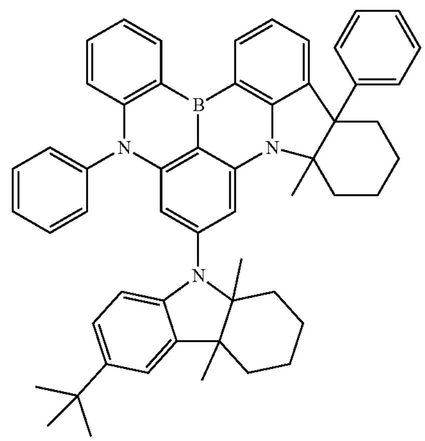
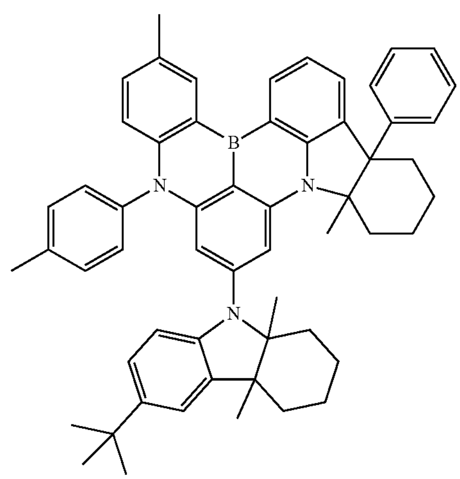

-continued
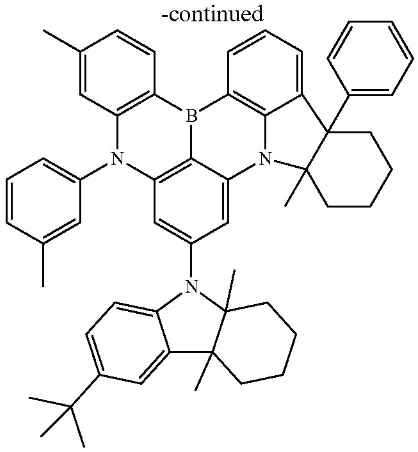
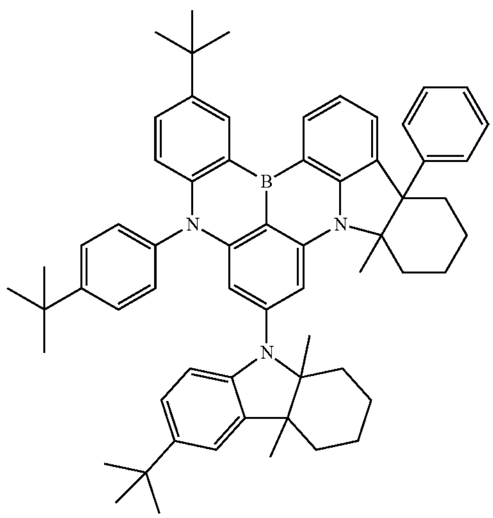
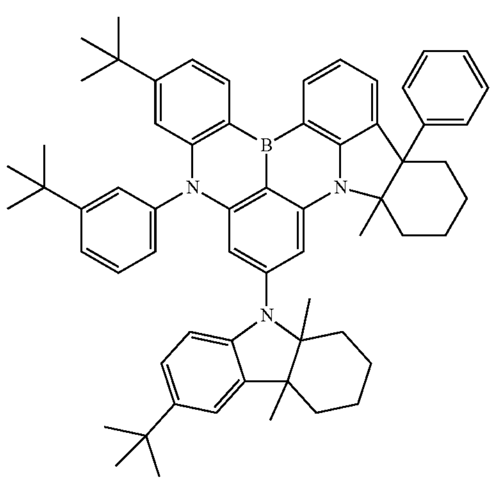
-continued
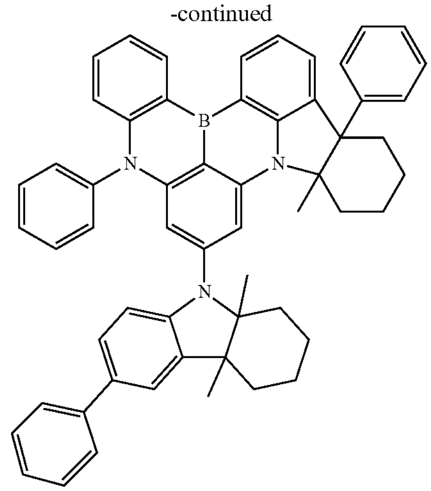
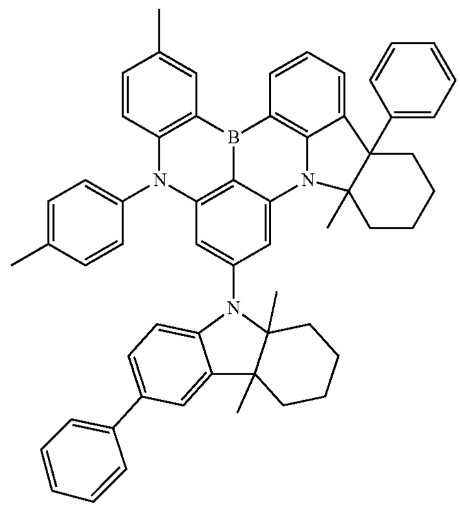
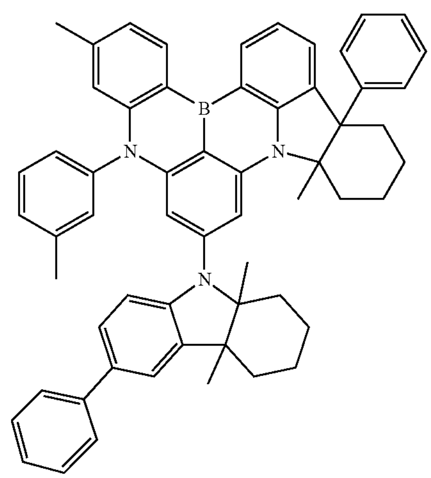

-continued
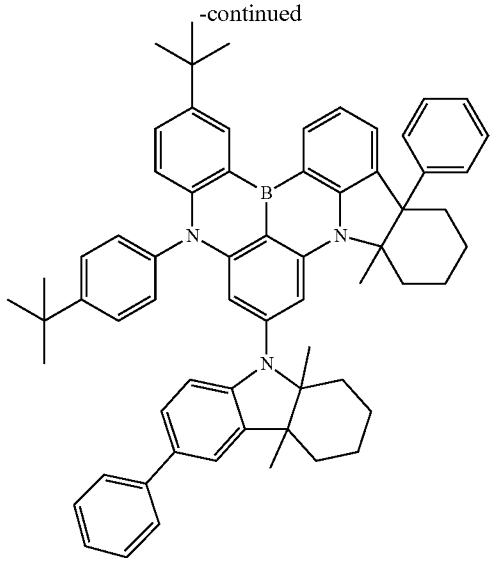
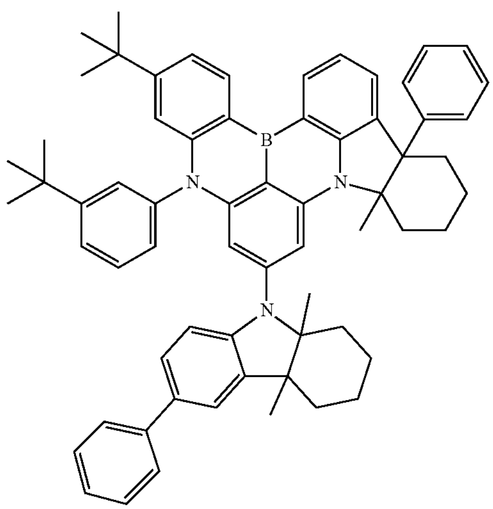
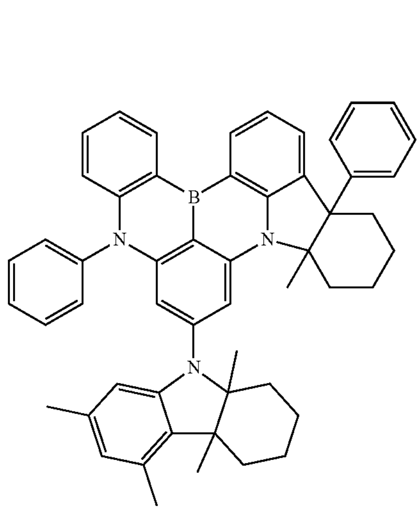
-continued
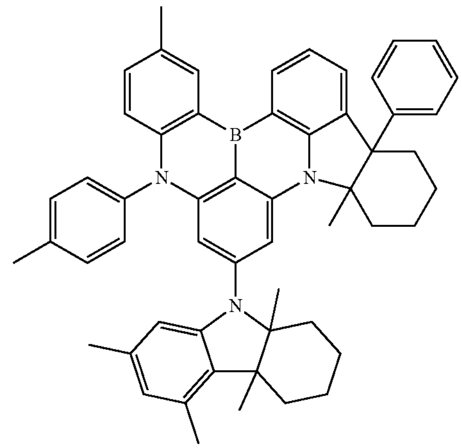
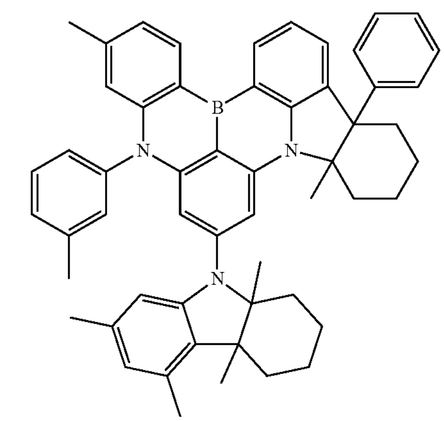
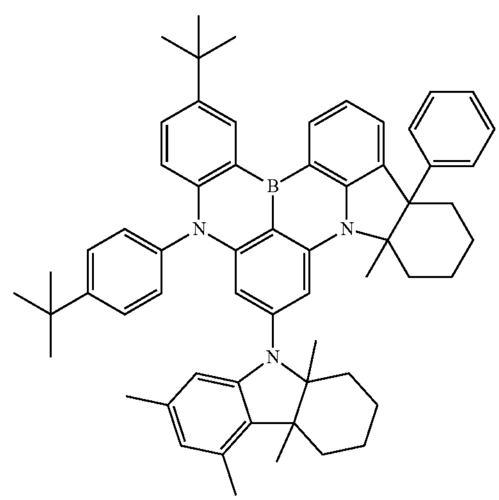

-continued
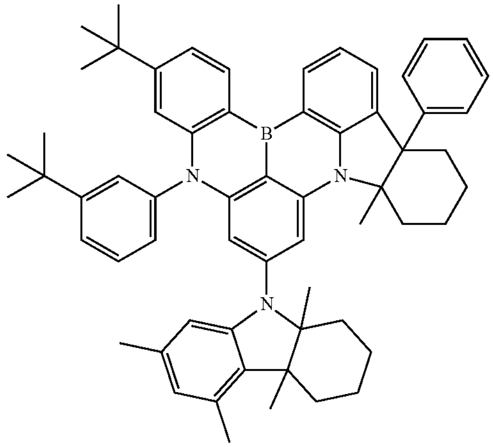
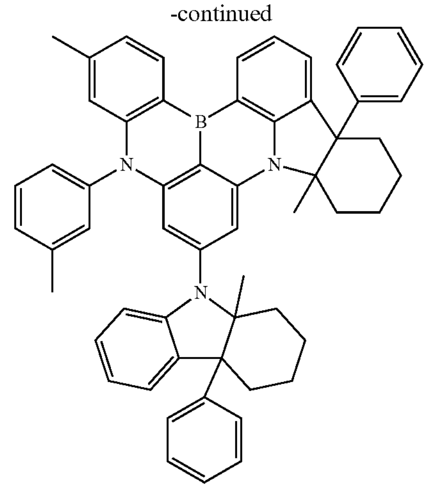
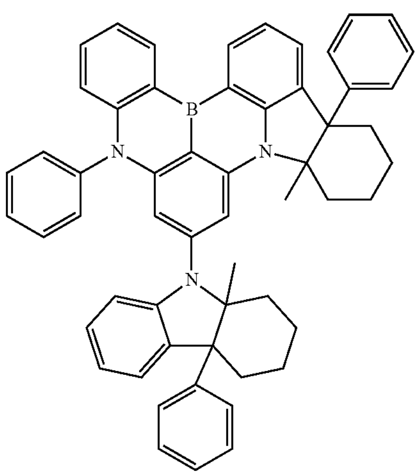
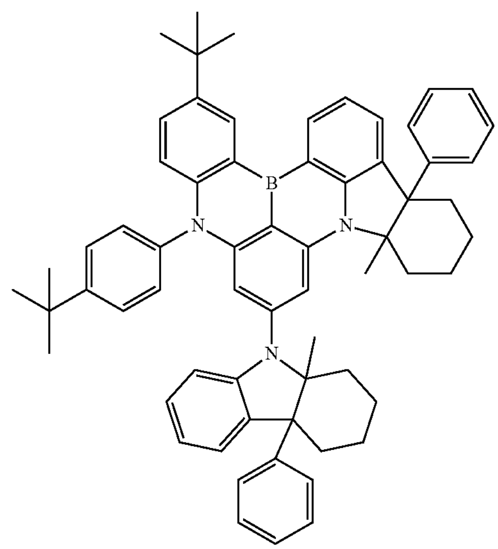
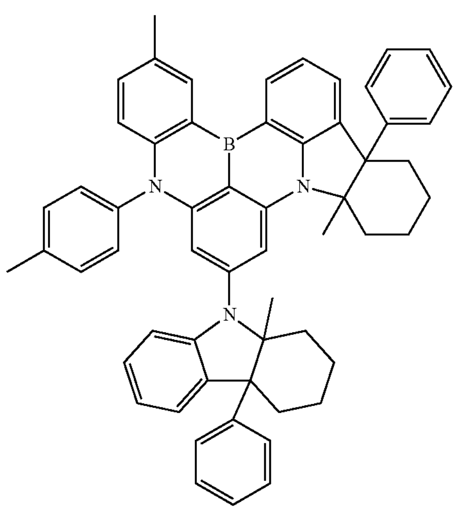
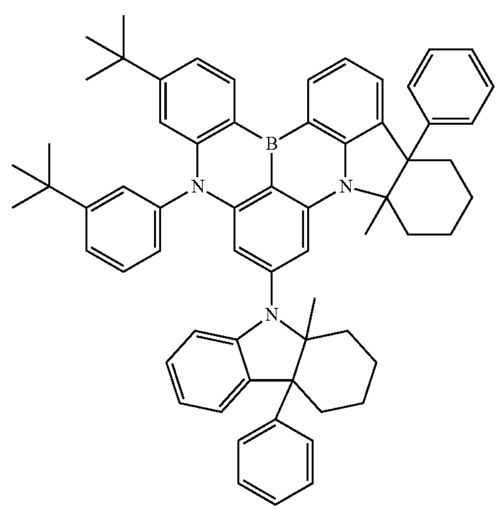
-continued -continued
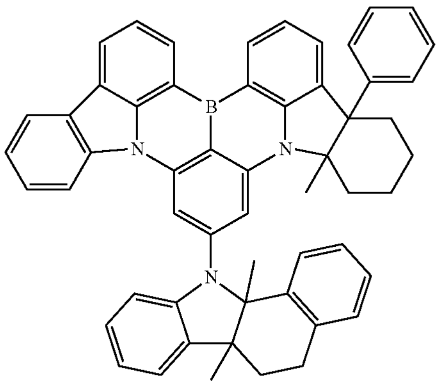
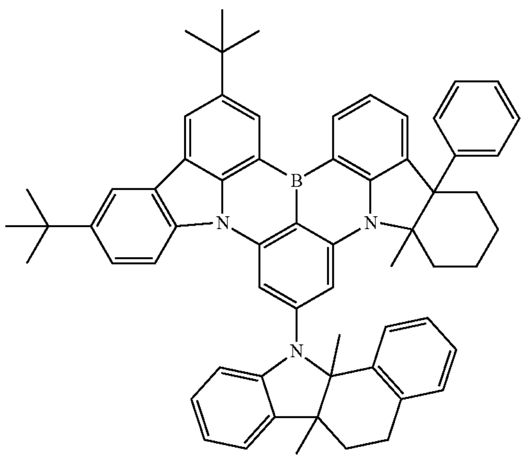
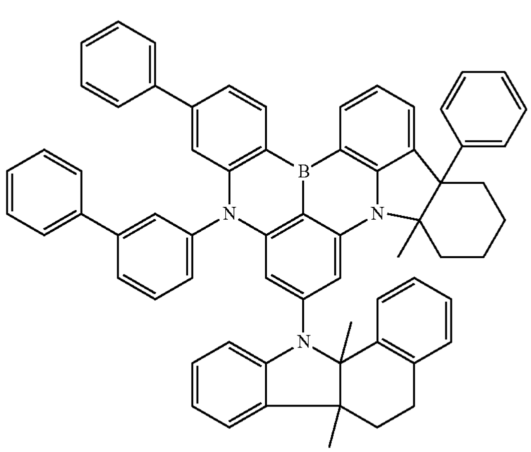
-continued
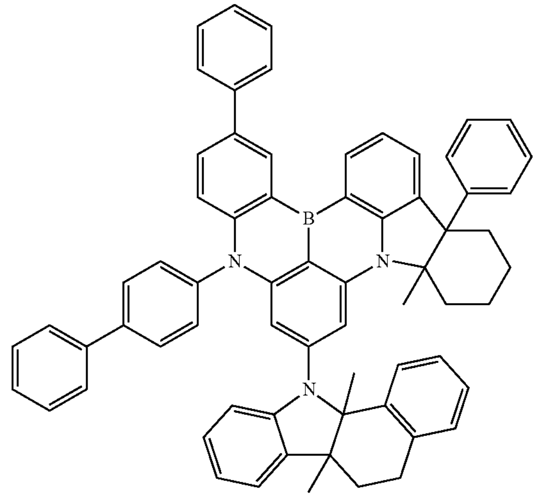
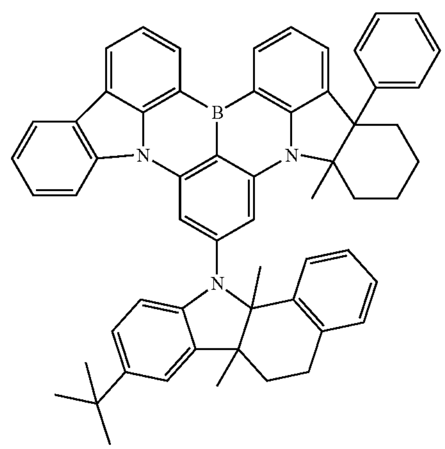
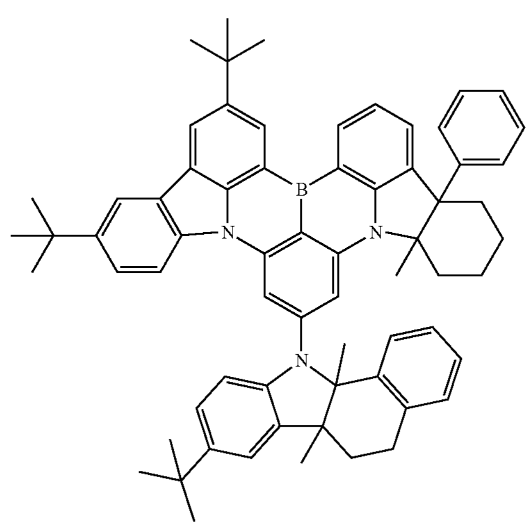

-continued
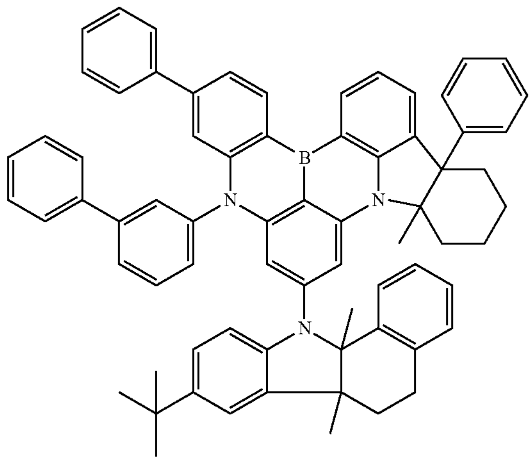
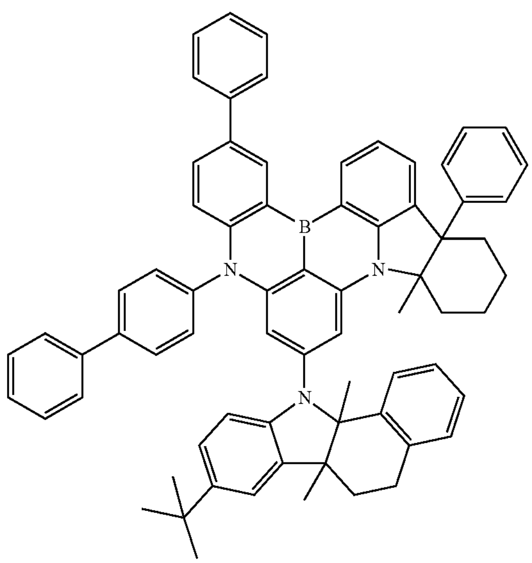
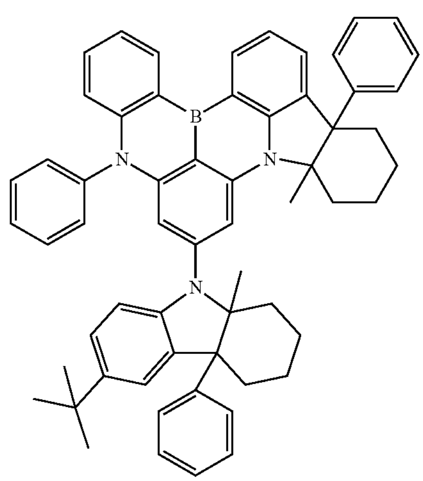
-continued
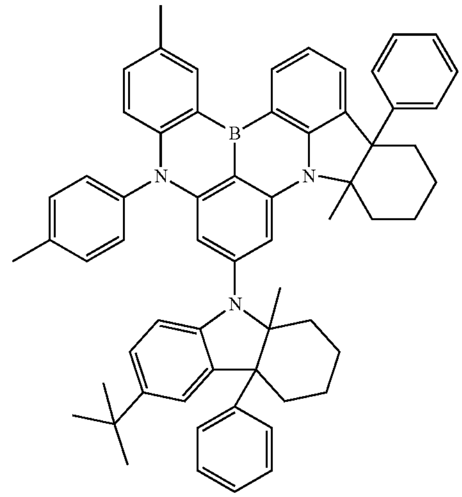
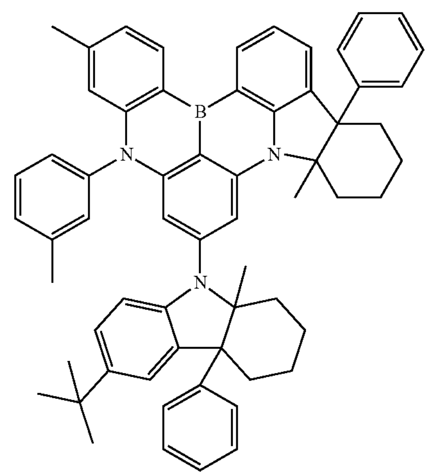
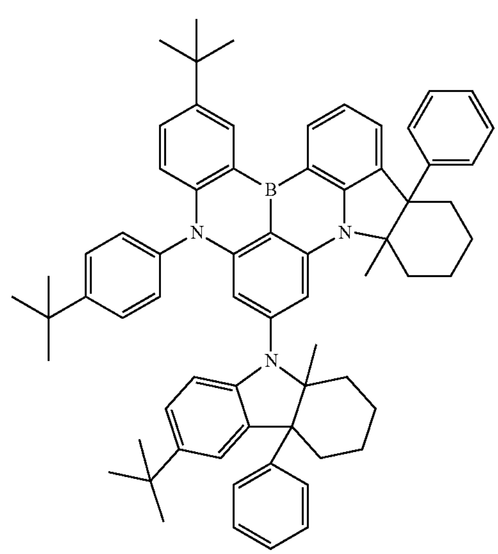

-continued
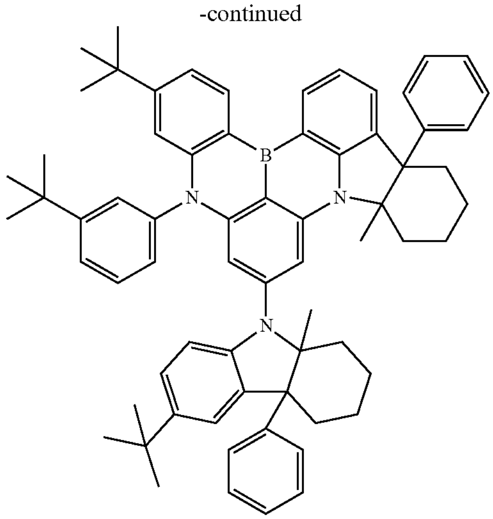
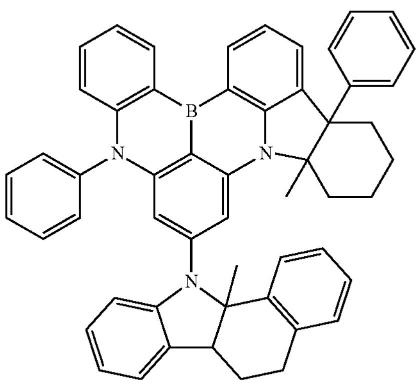
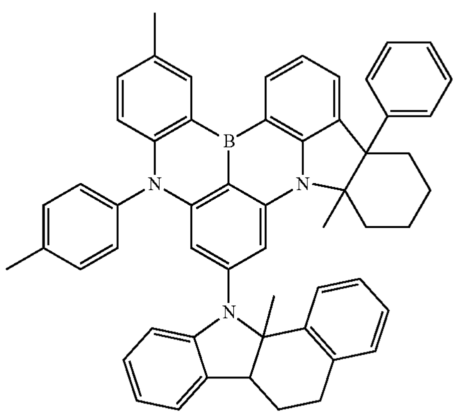
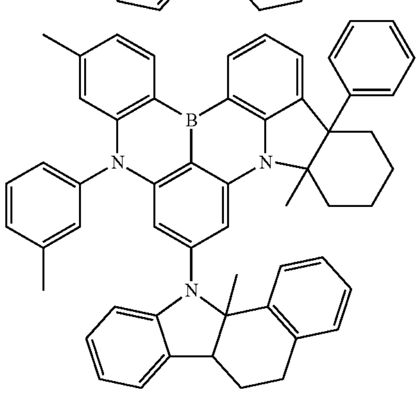
-continued
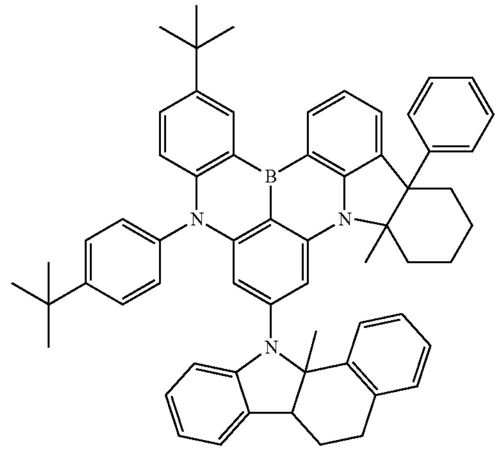
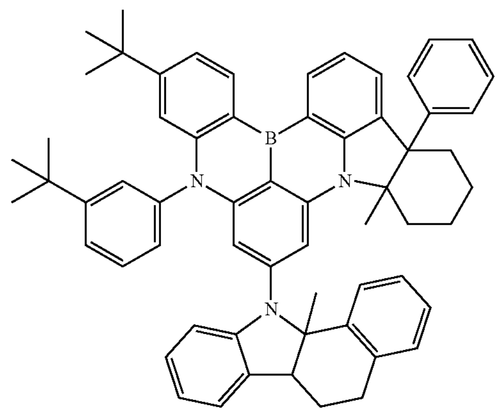
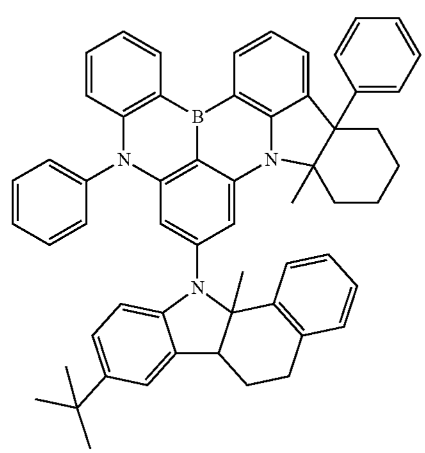

-continued
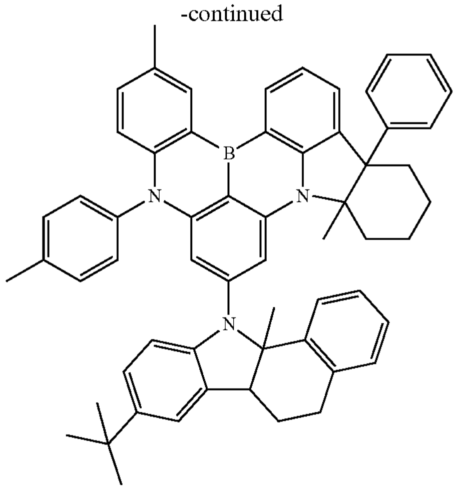
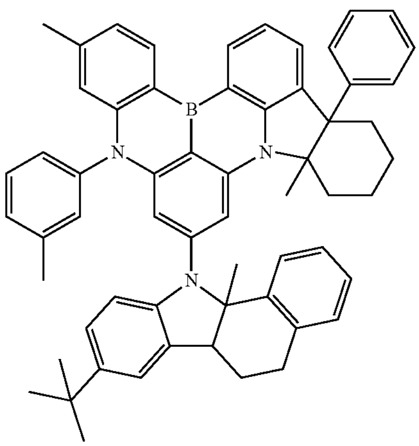
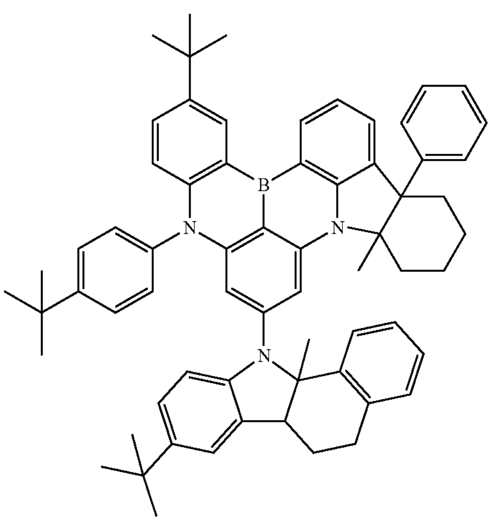
-continued
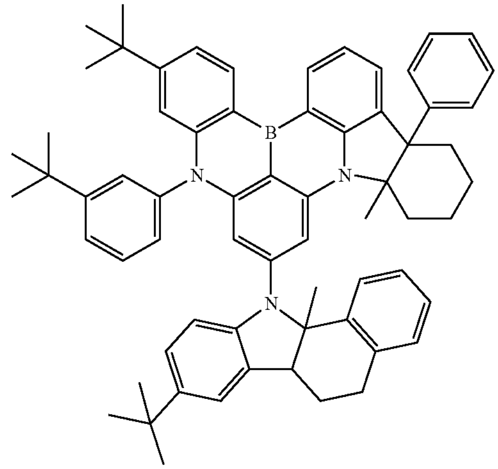
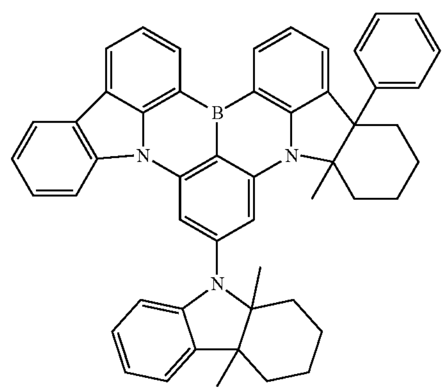
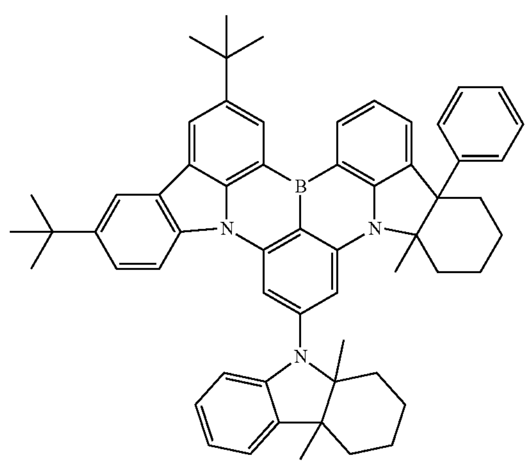

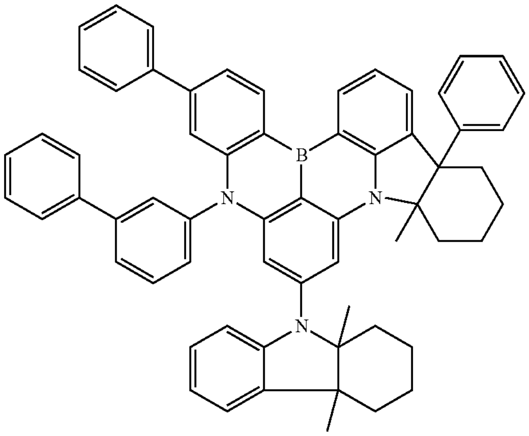
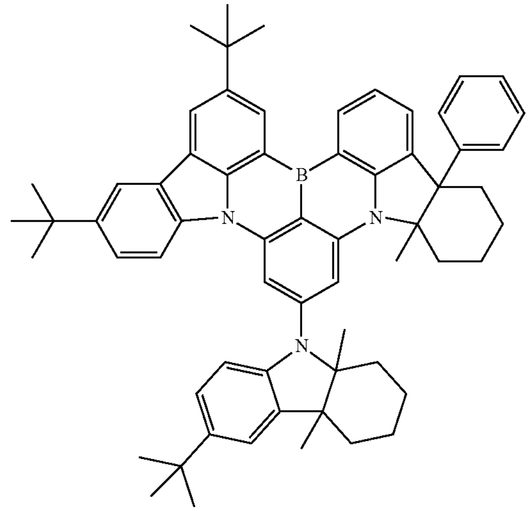
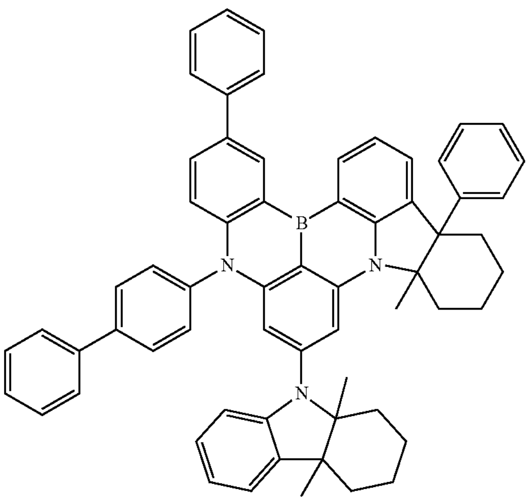
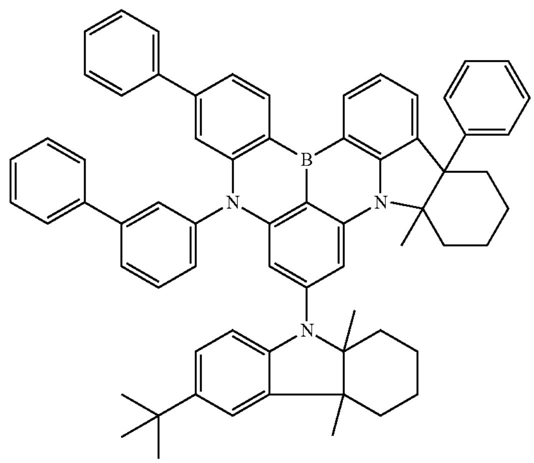
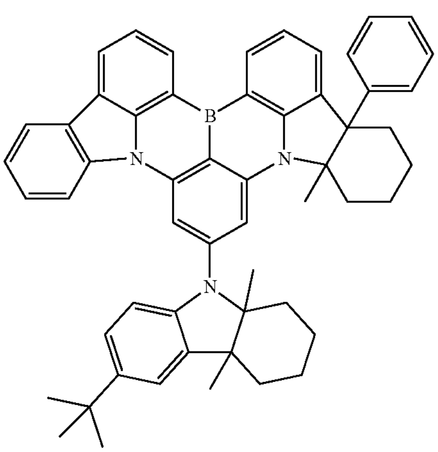
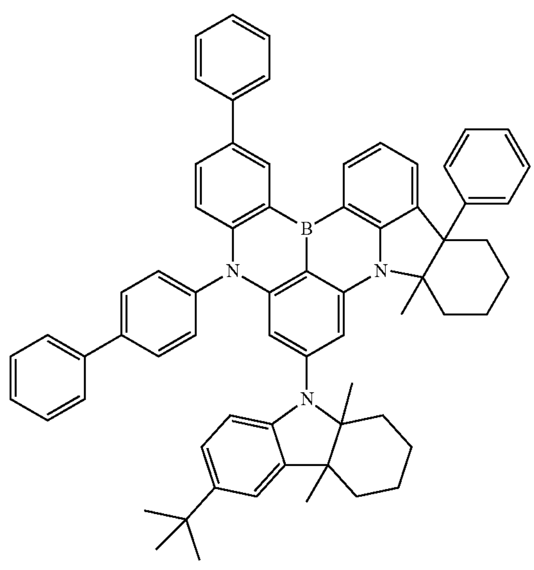

-continued
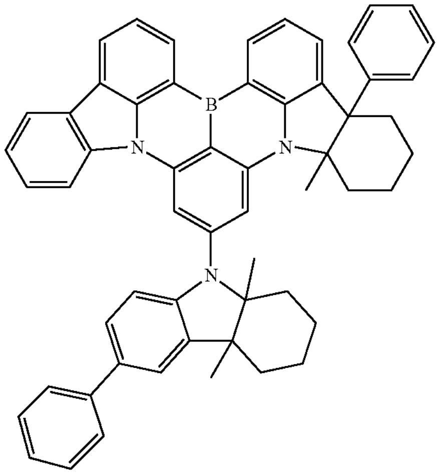
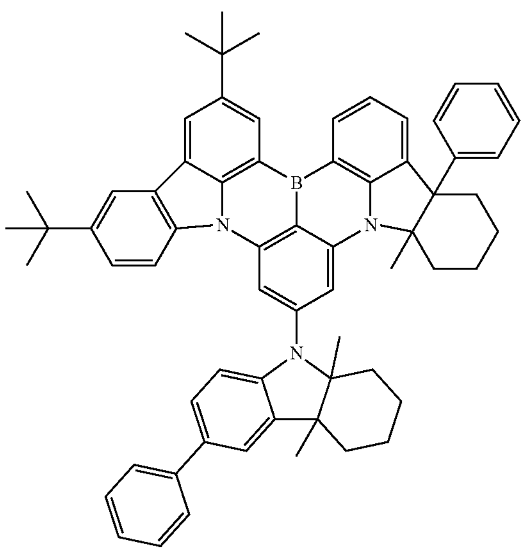
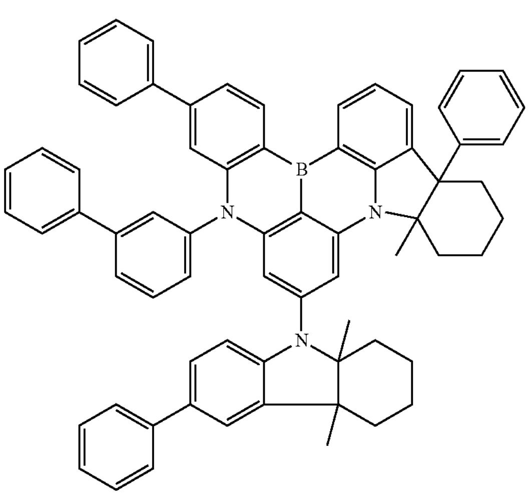
-continued
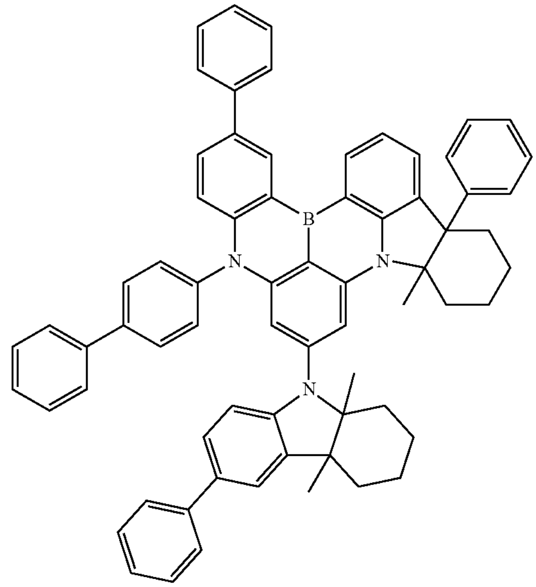
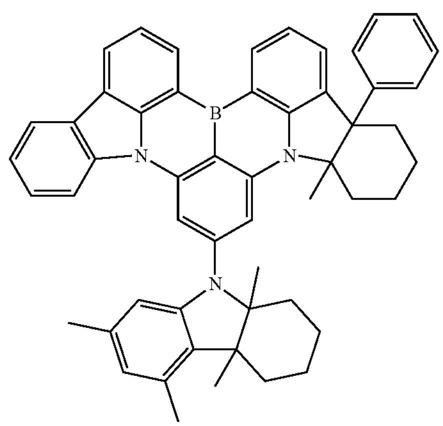
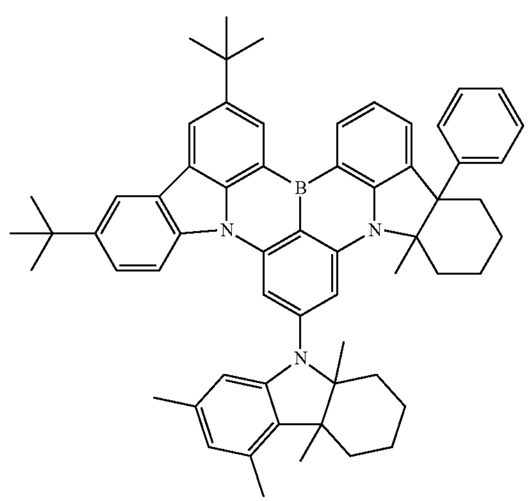

-continued
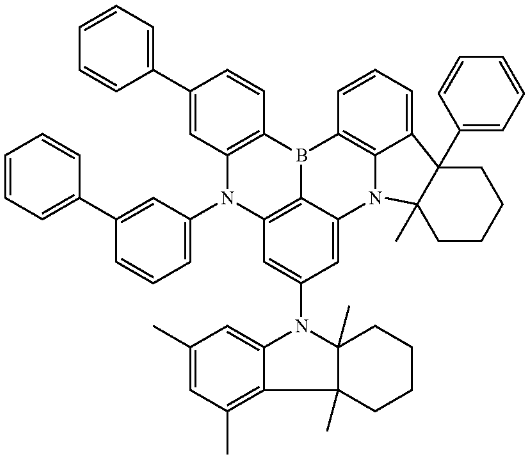
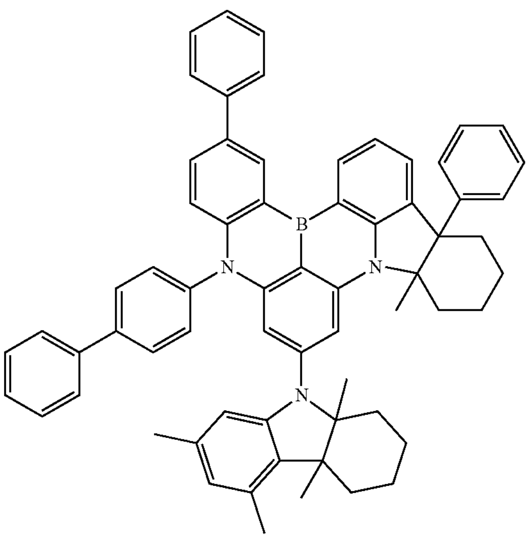
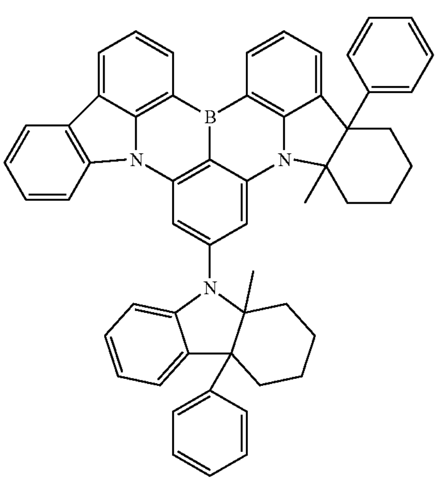
-continued
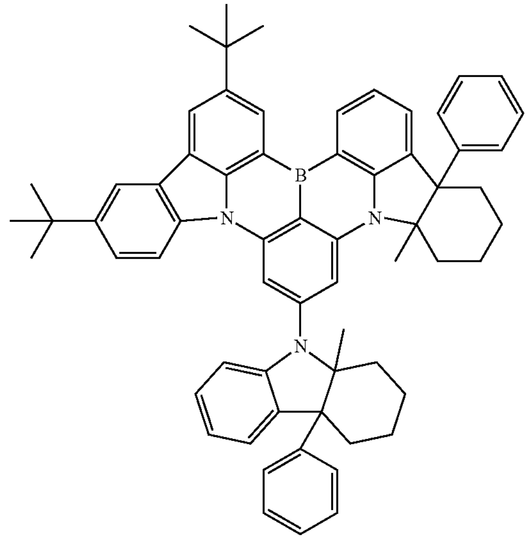
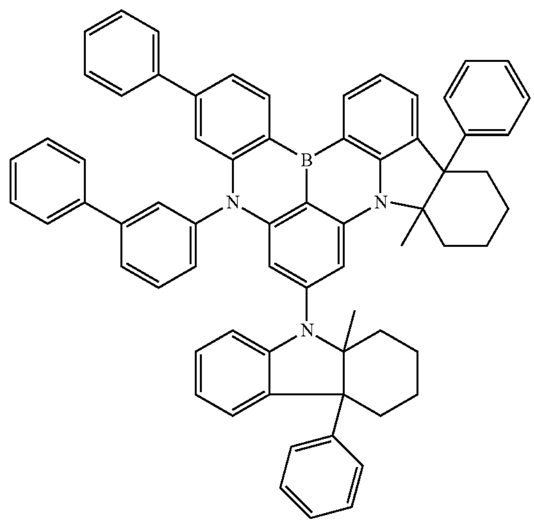
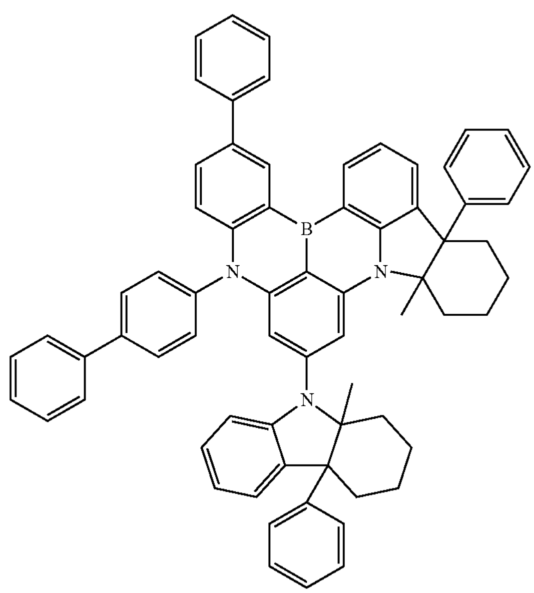

-continued
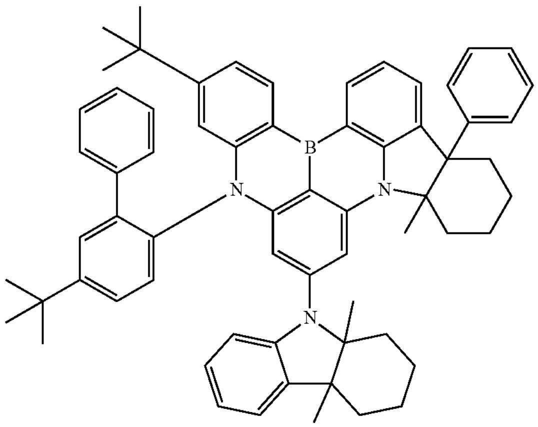
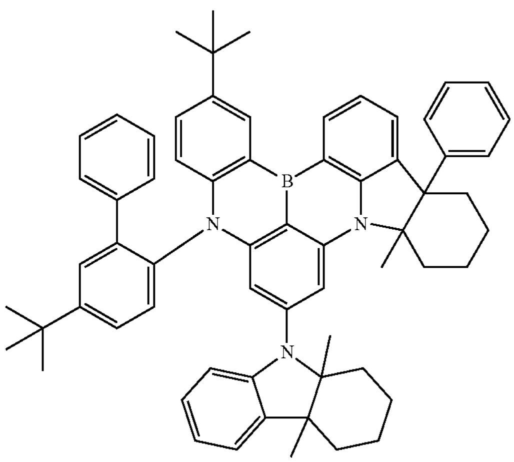
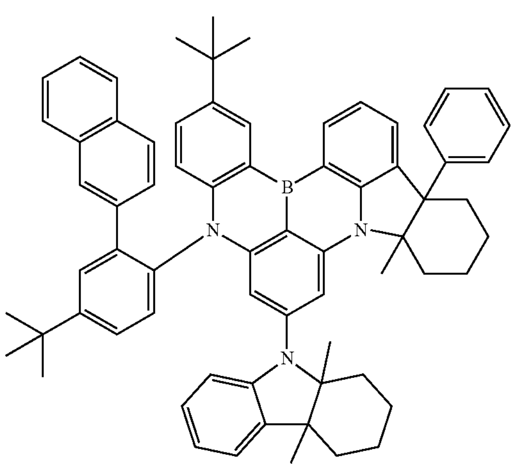
-continued
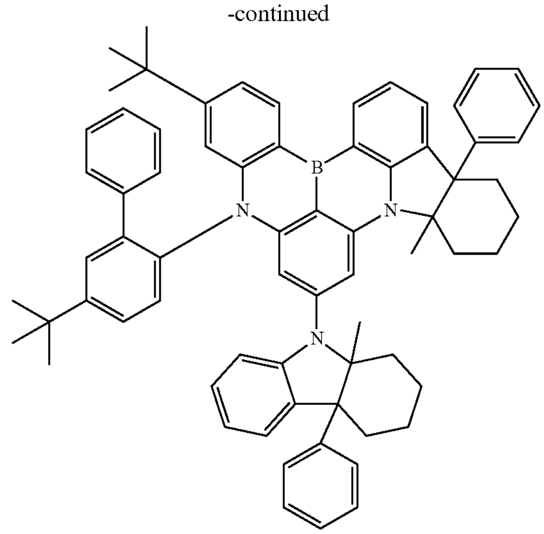
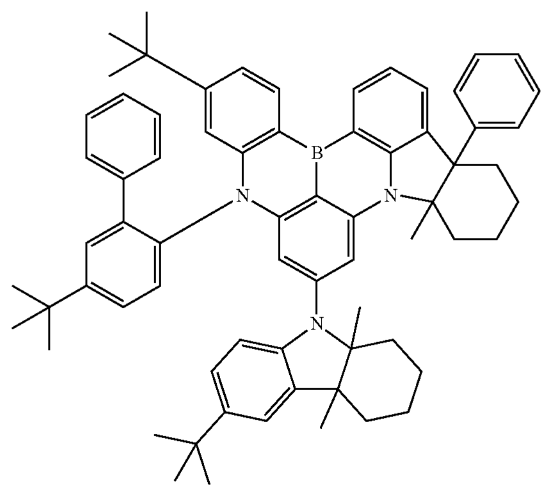
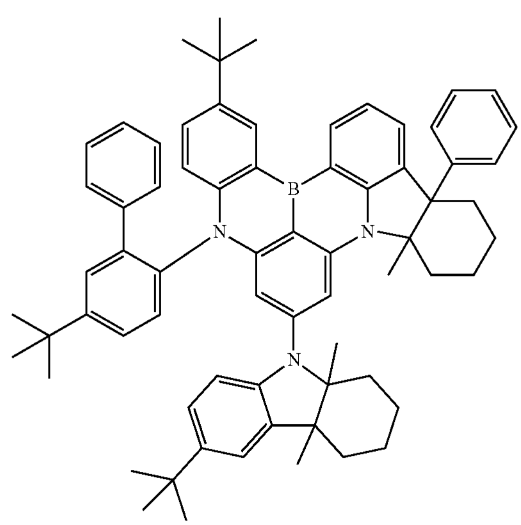

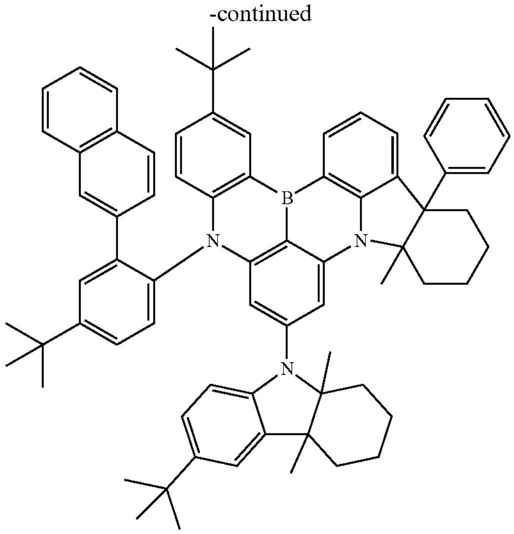
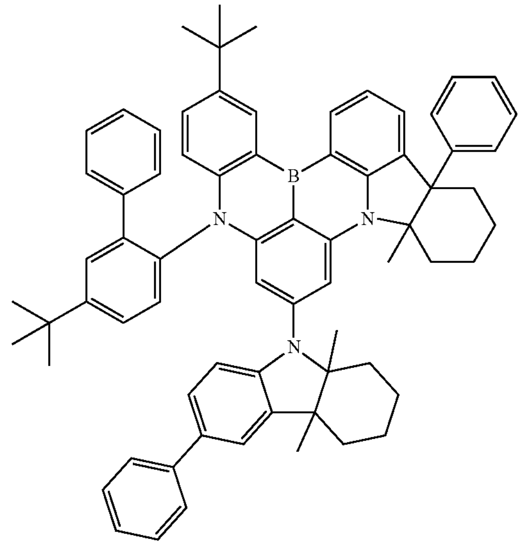
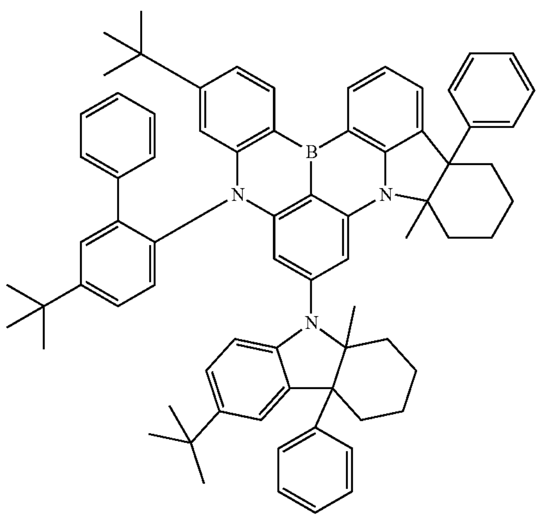
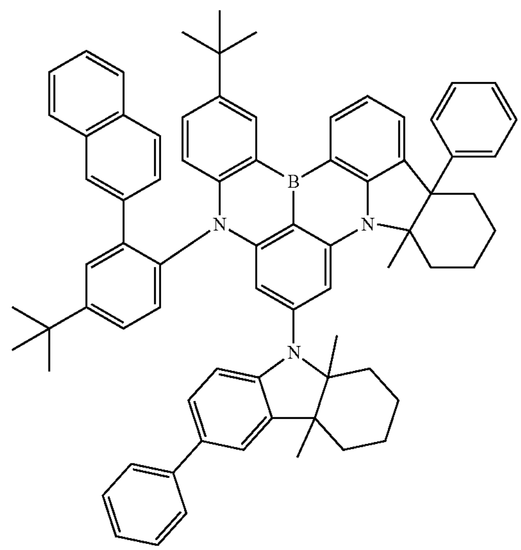
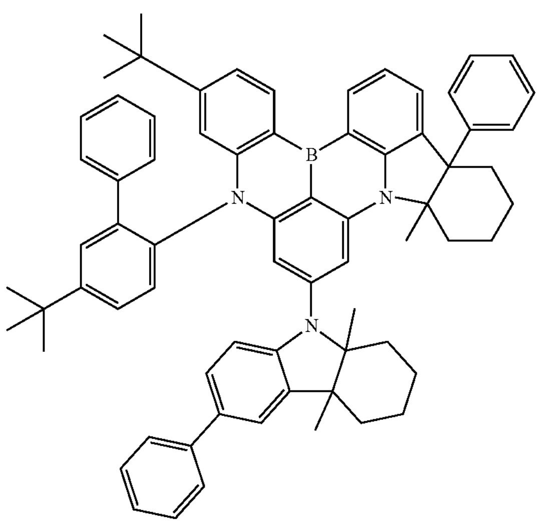
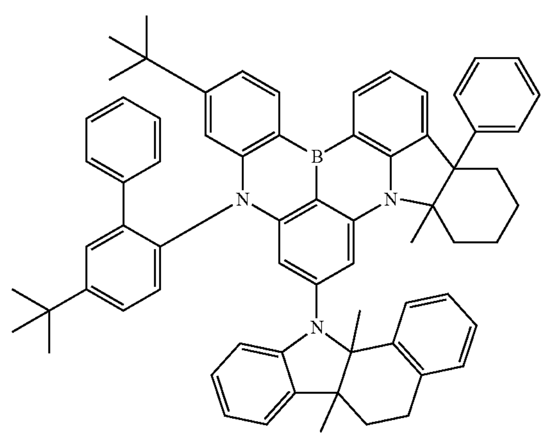

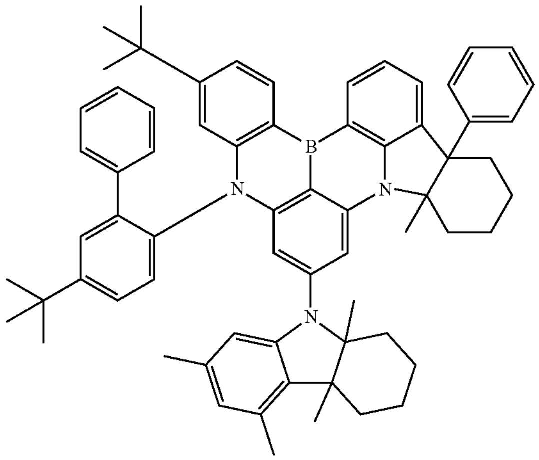
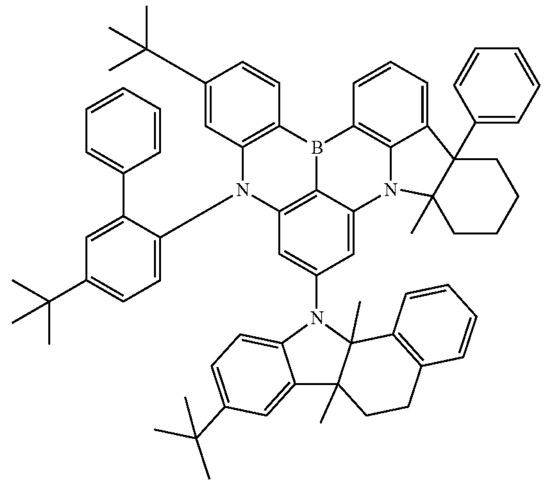
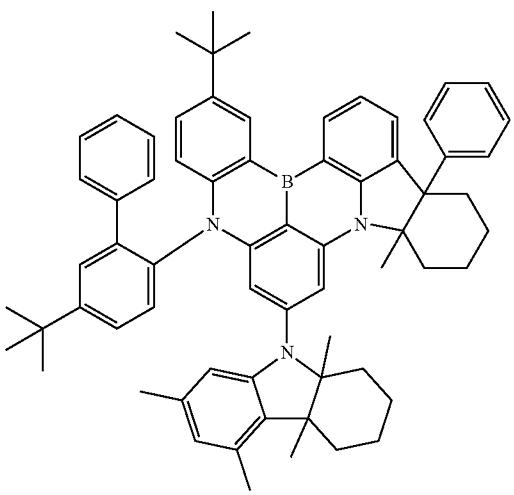
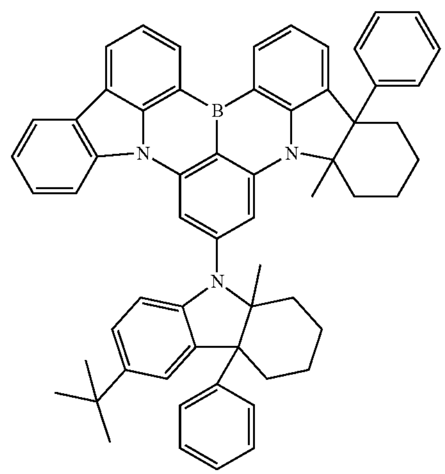
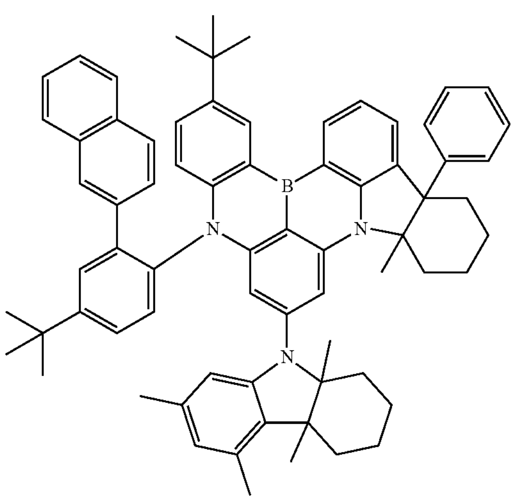
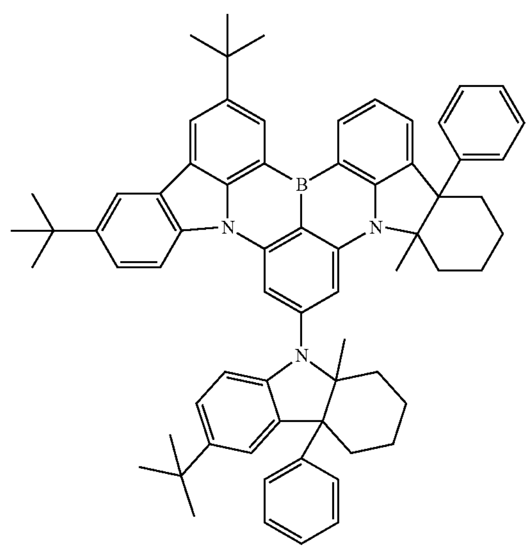

-continued
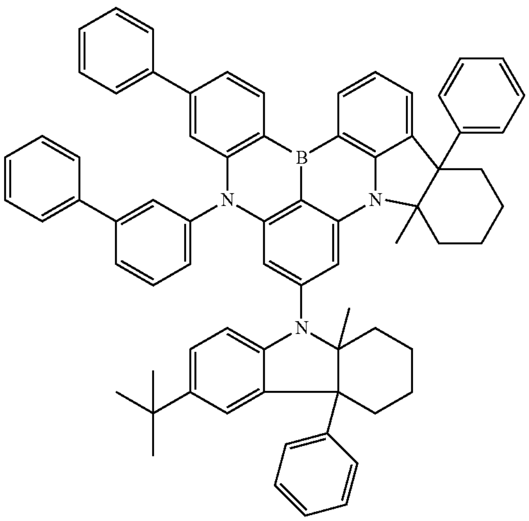
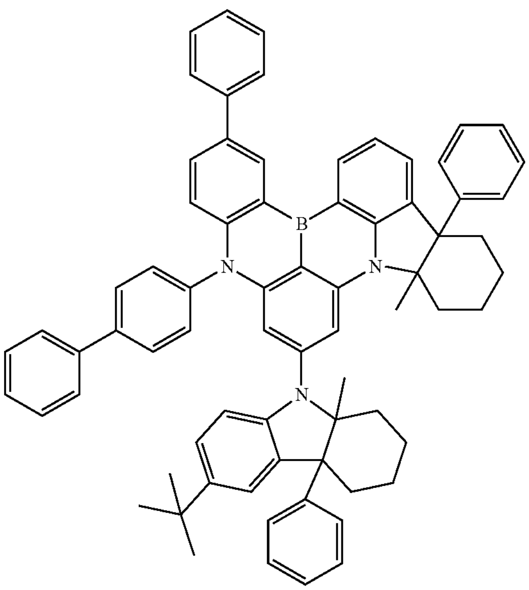
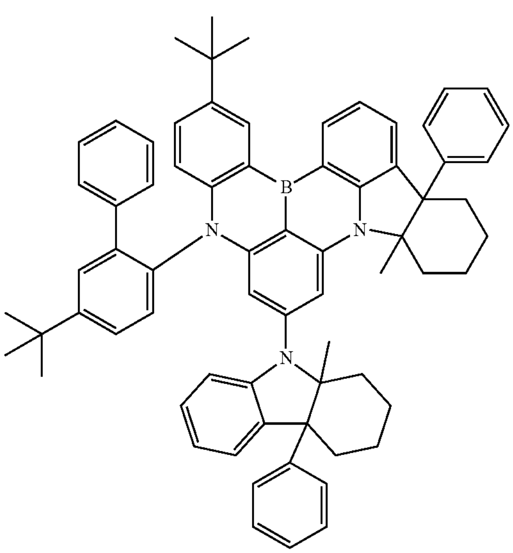
-continued
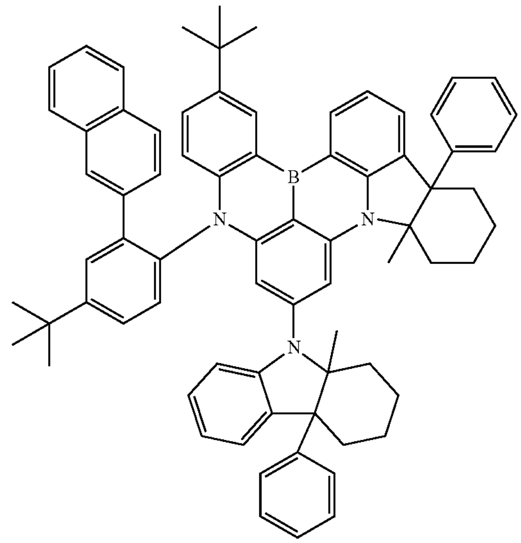
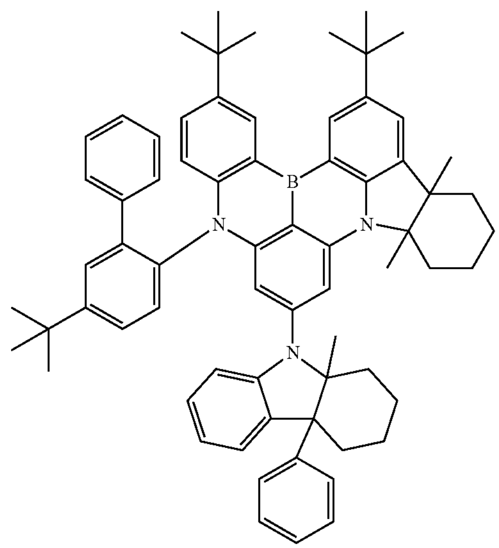
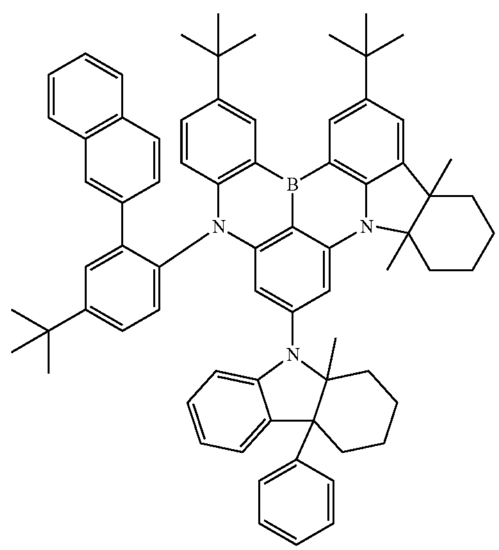

-continued
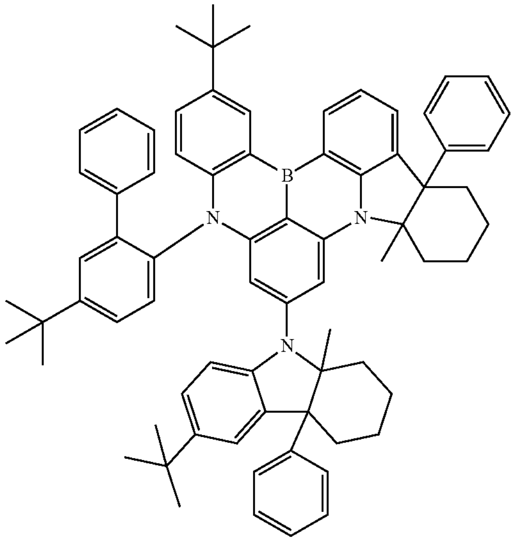
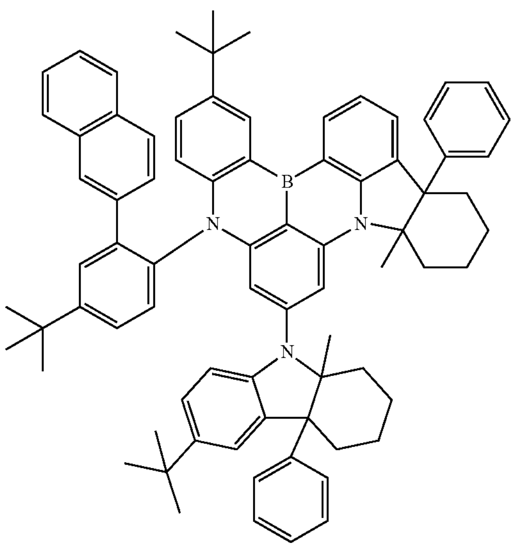
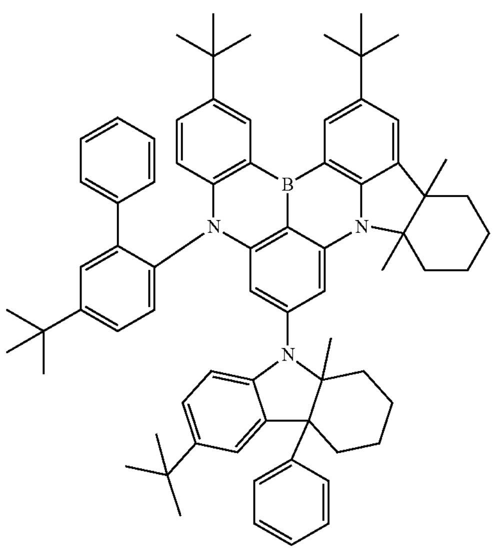
-continued
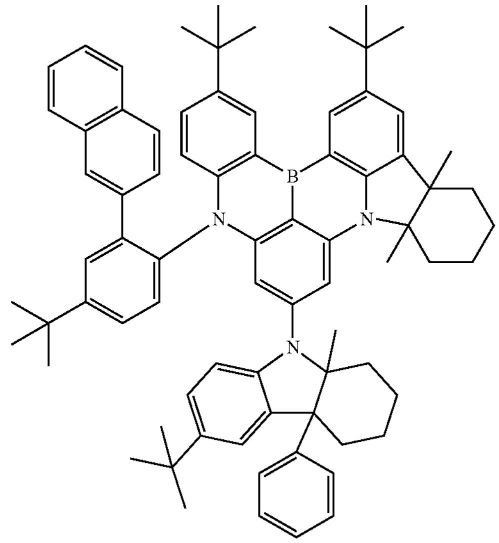
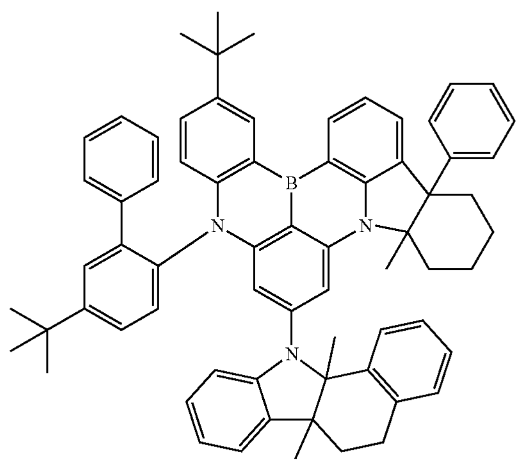
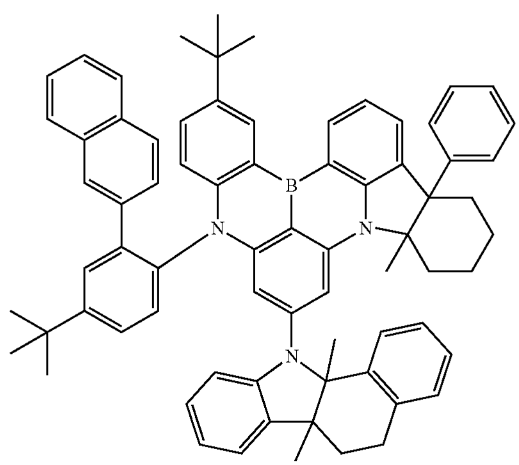

-continued
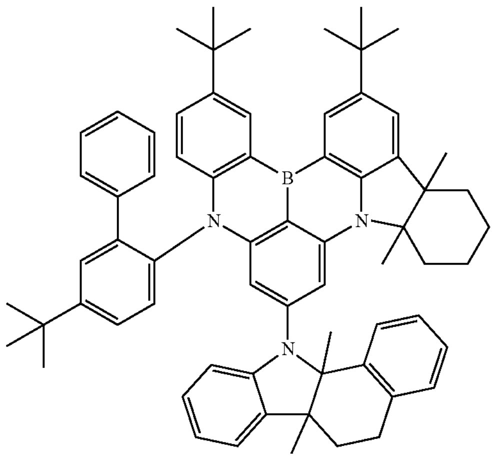
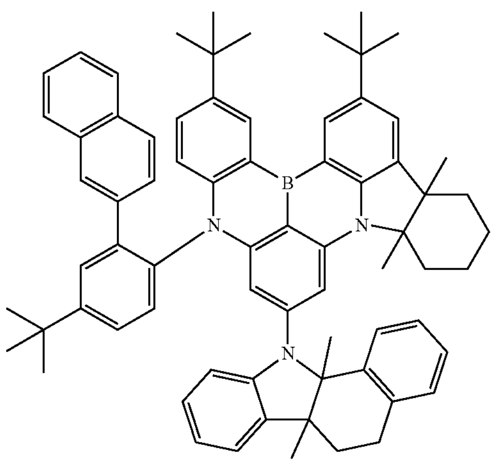
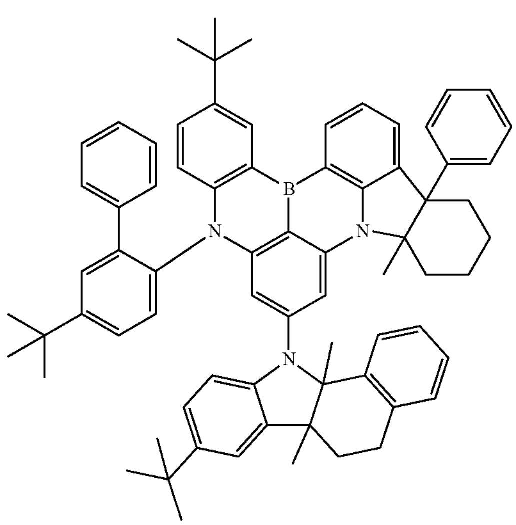
-continued
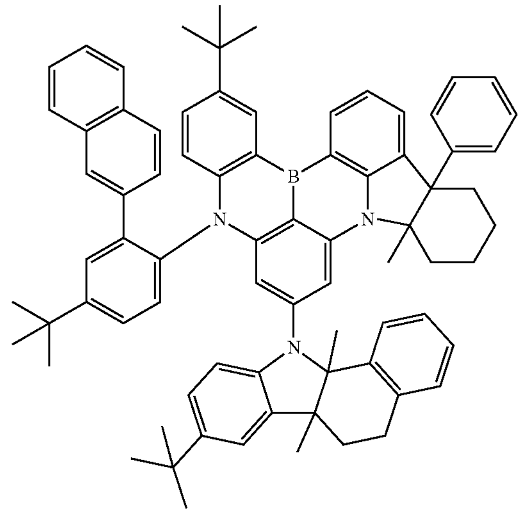
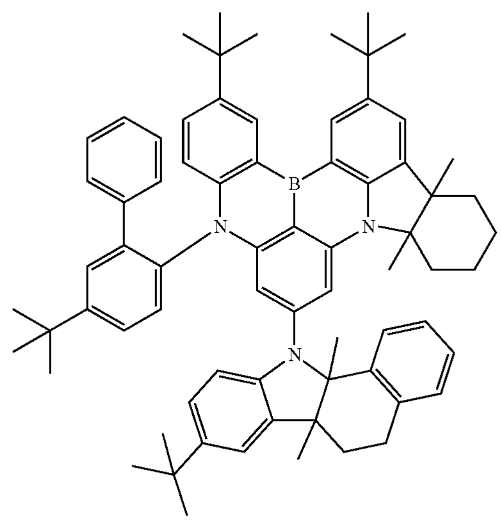
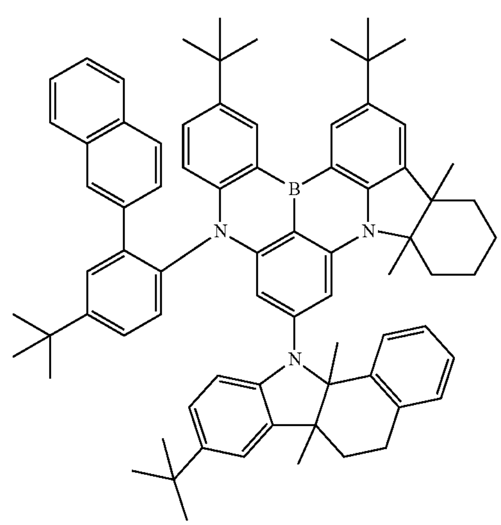

-continued
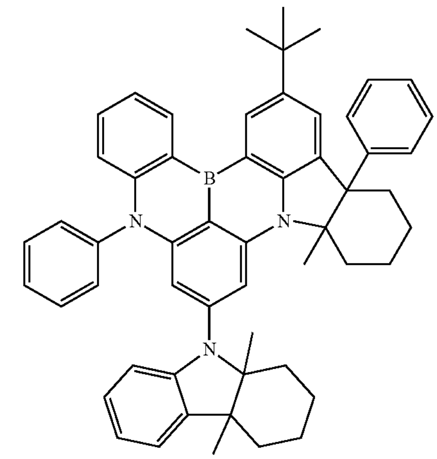
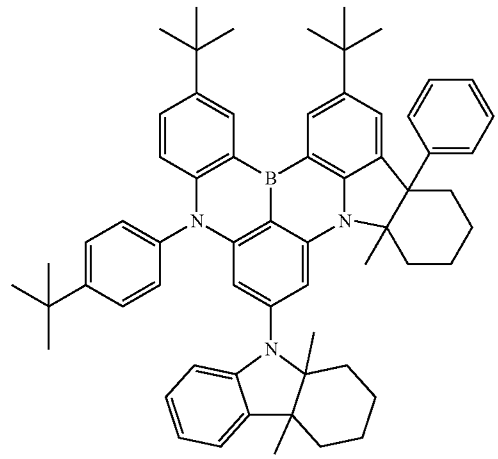
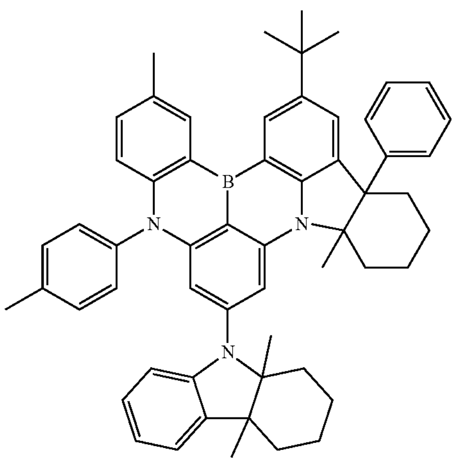
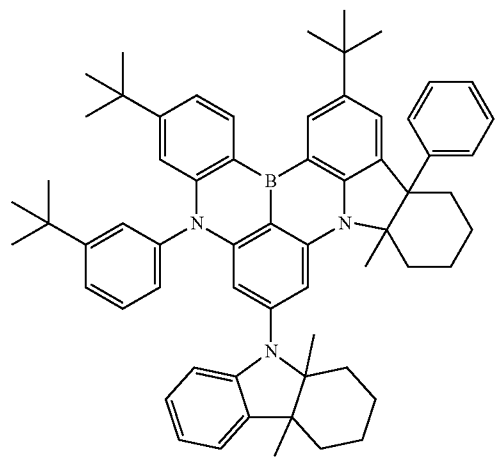
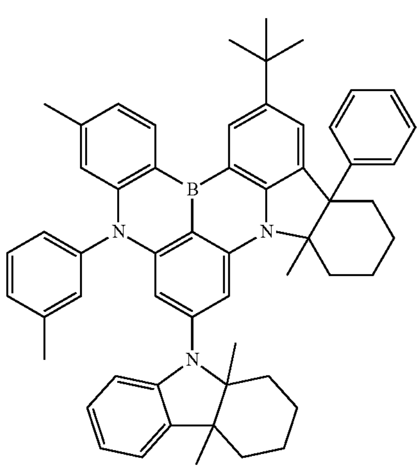
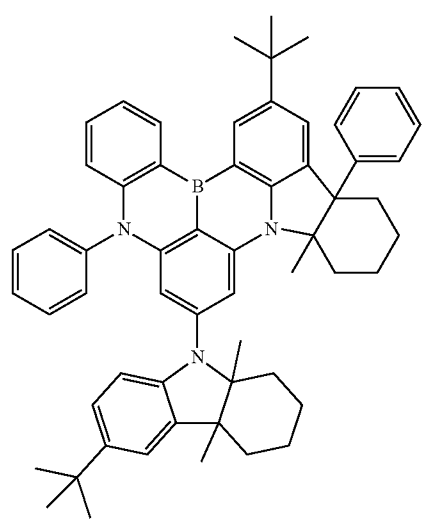

-continued
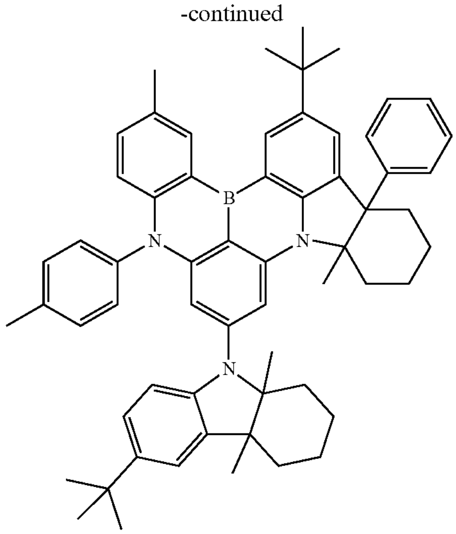
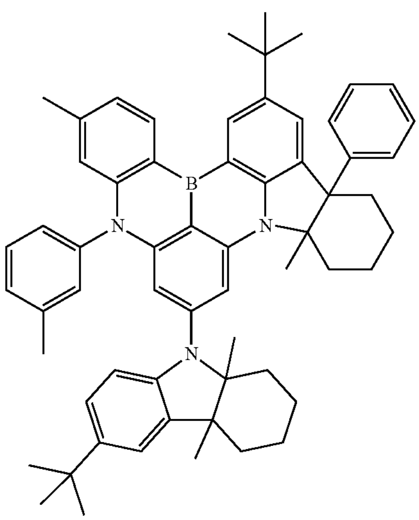
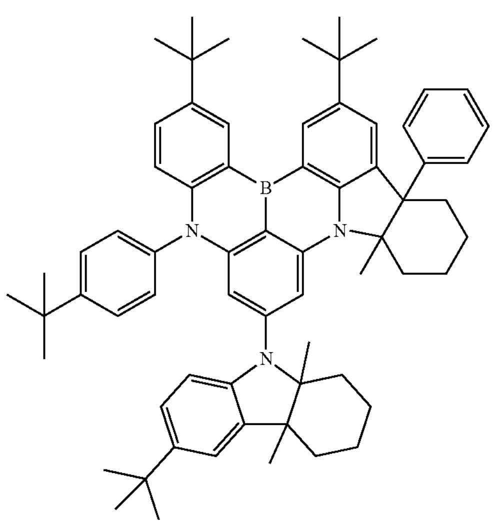
-continued
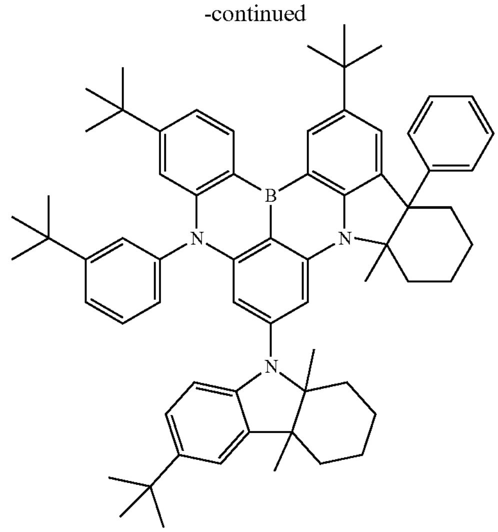
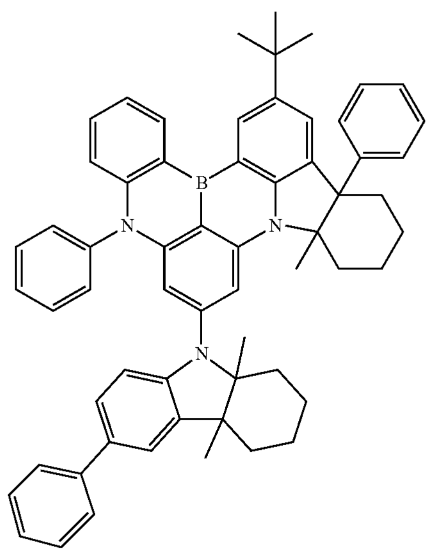
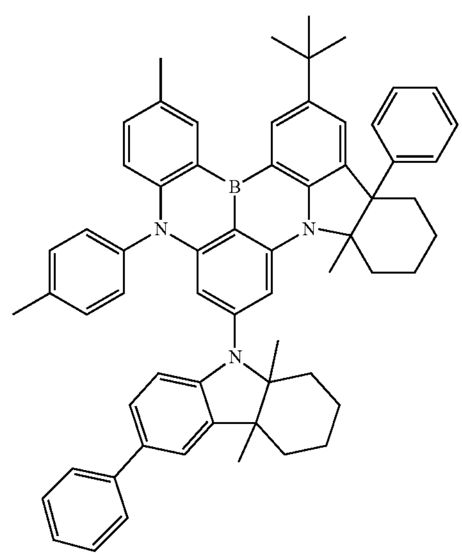

-continued
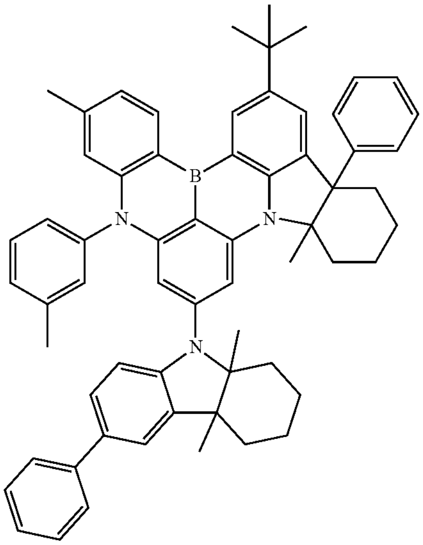
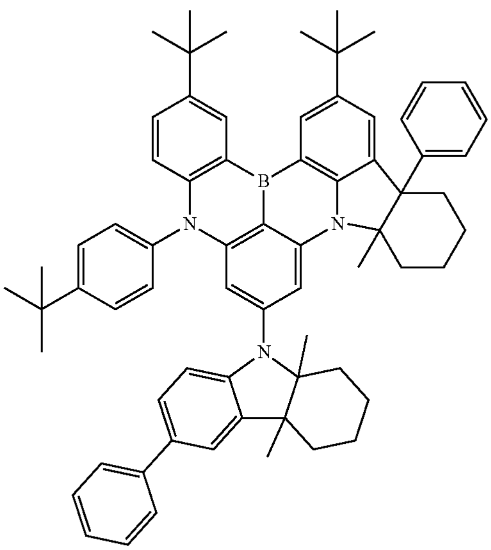
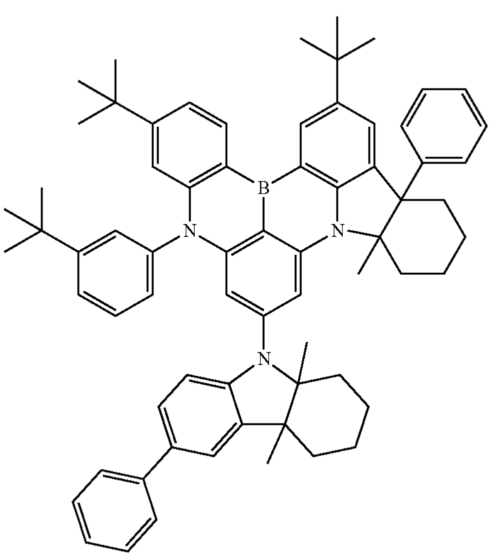
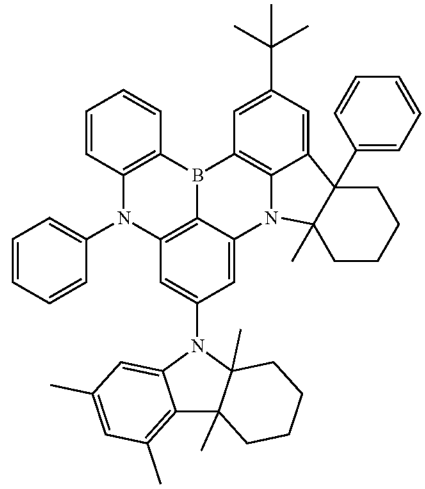
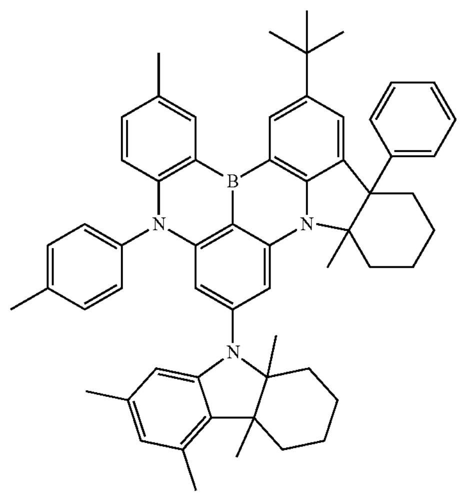
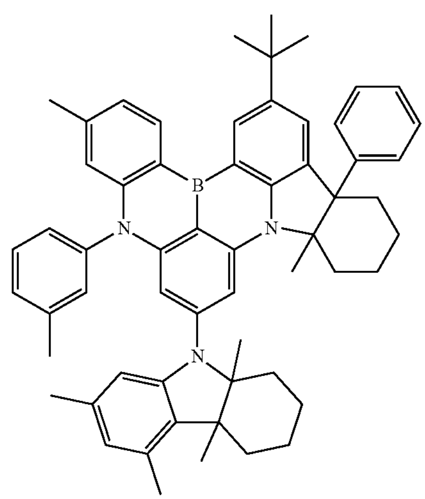
-continued -continued
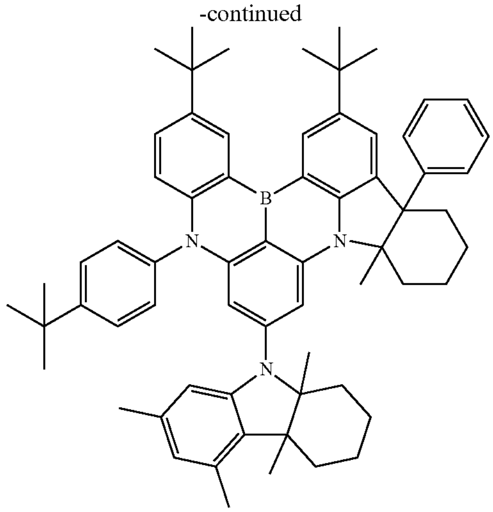
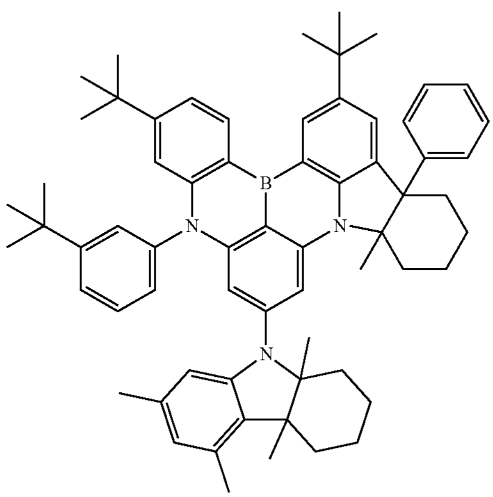
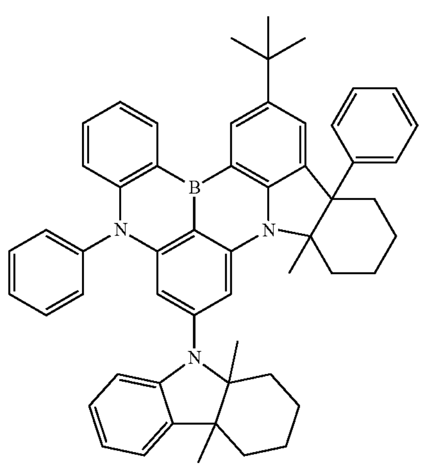
-continued
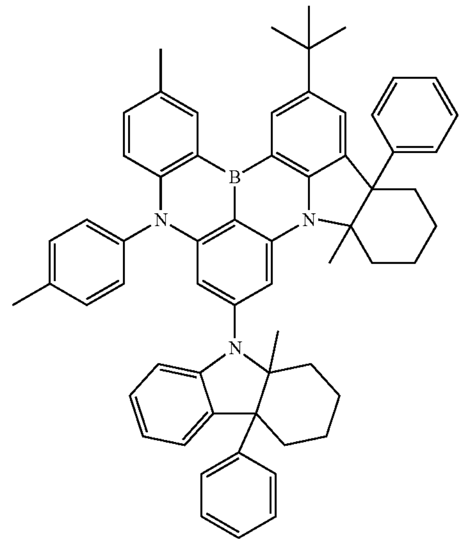
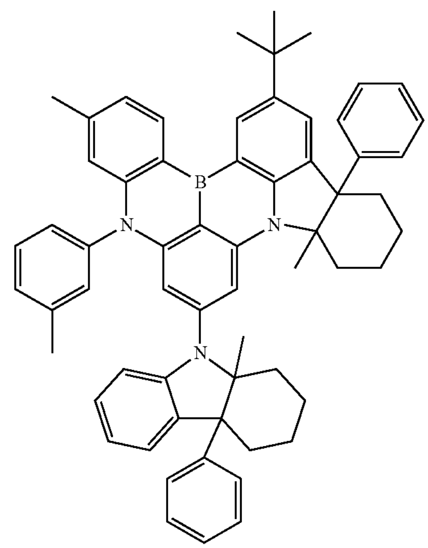
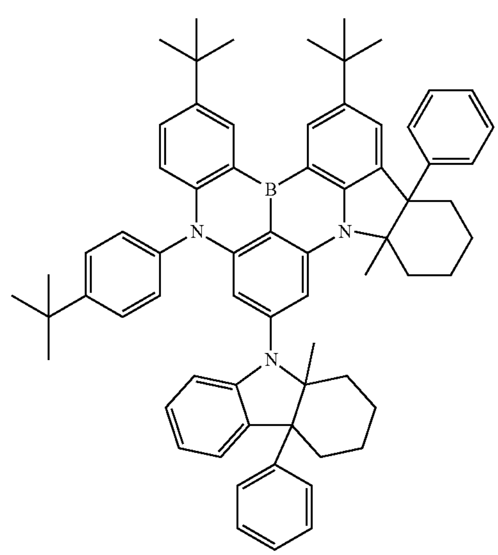

-continued
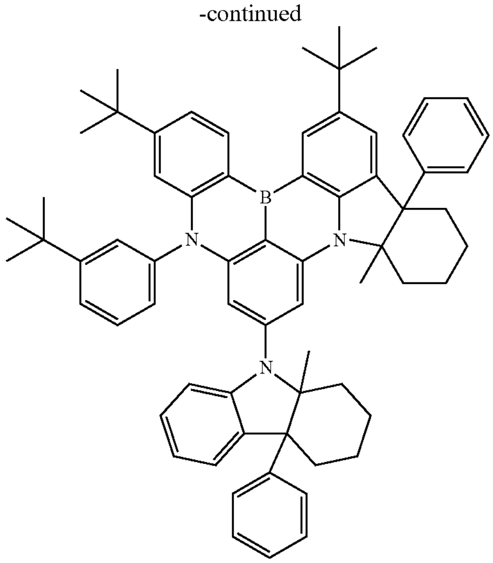
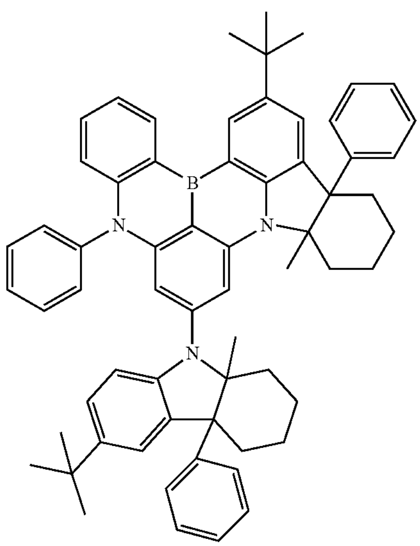
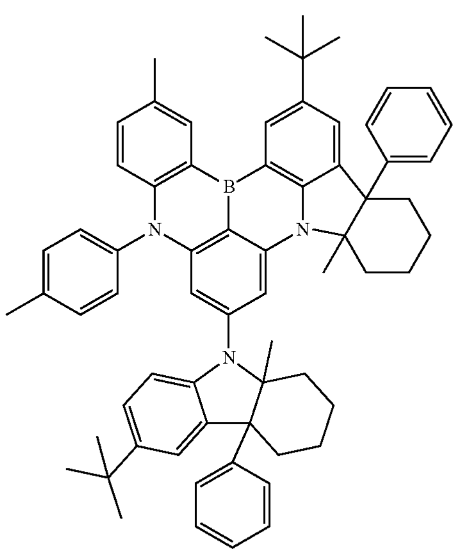
-continued
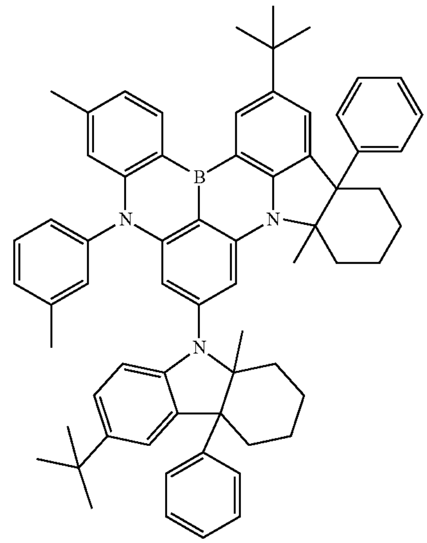
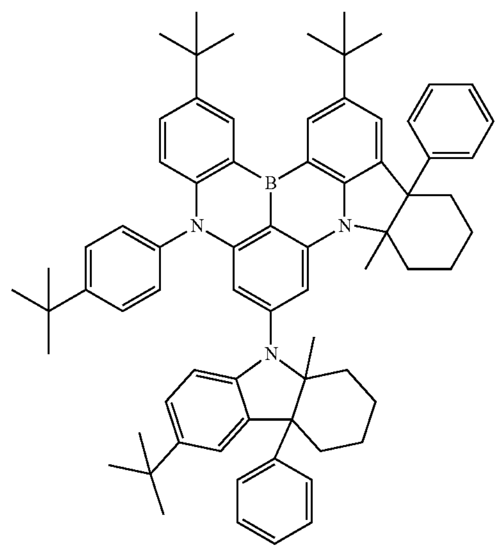
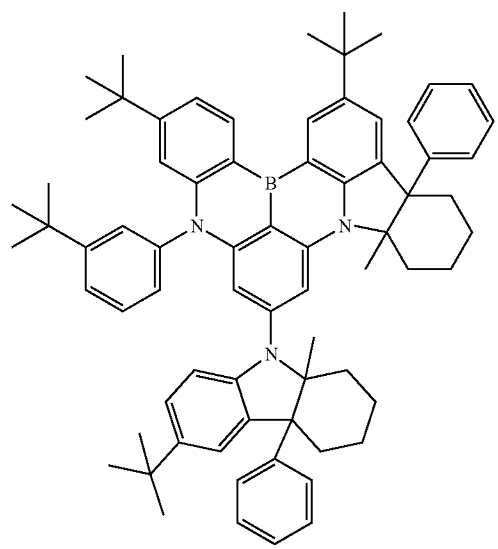

-continued
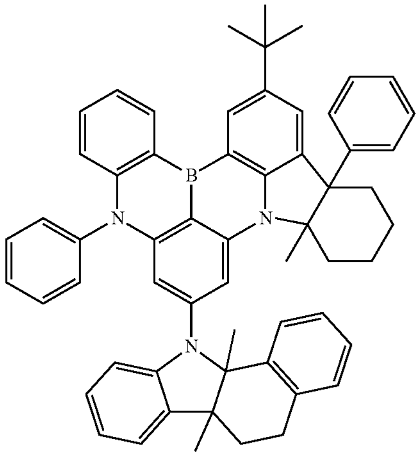
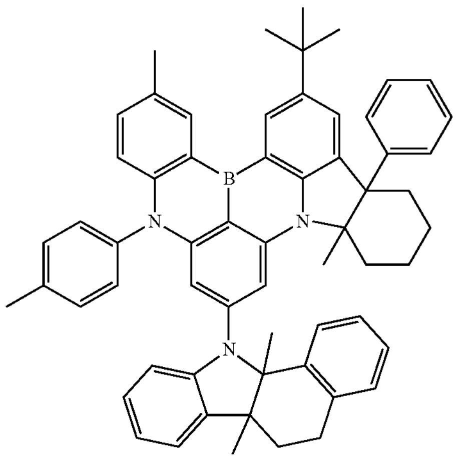
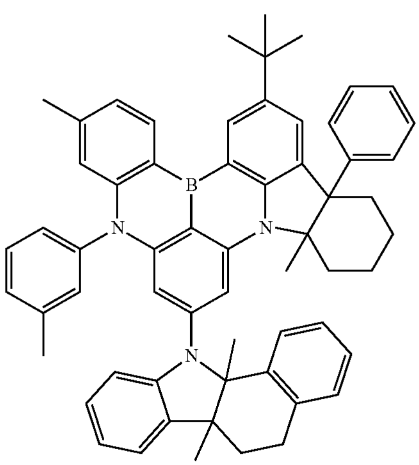
-continued
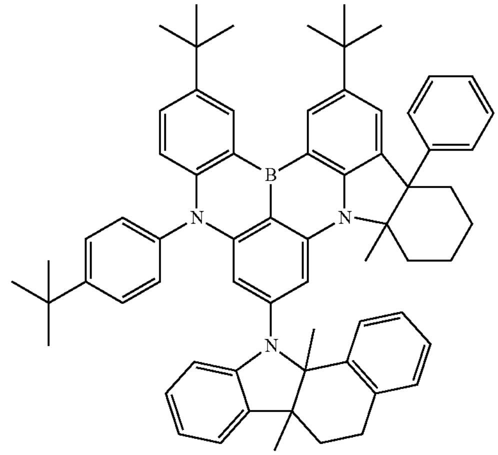
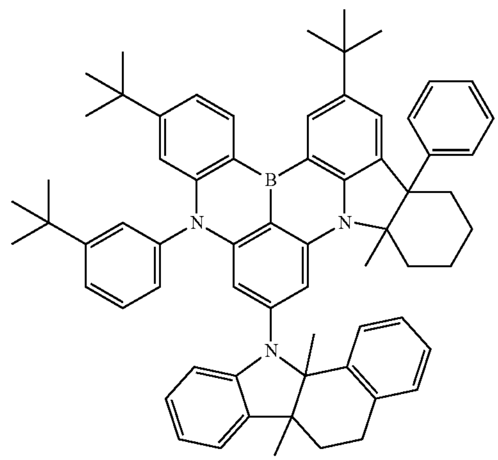
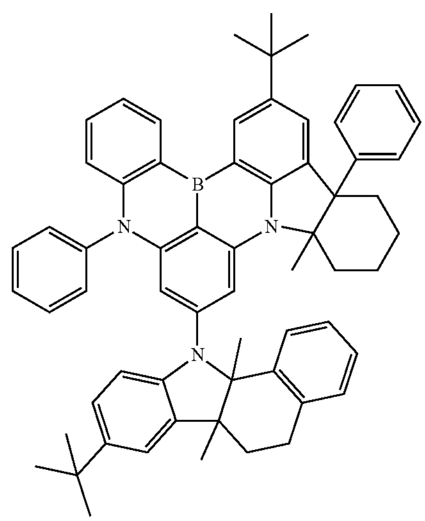

-continued
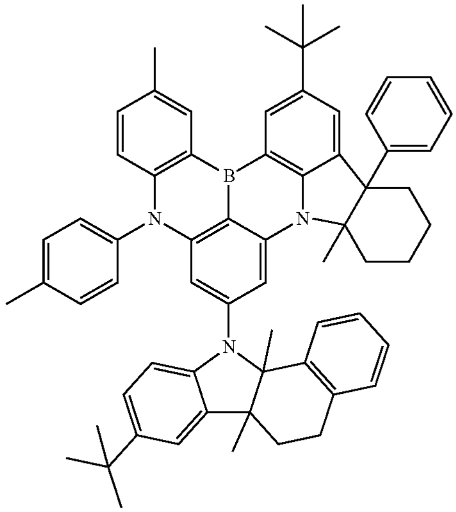
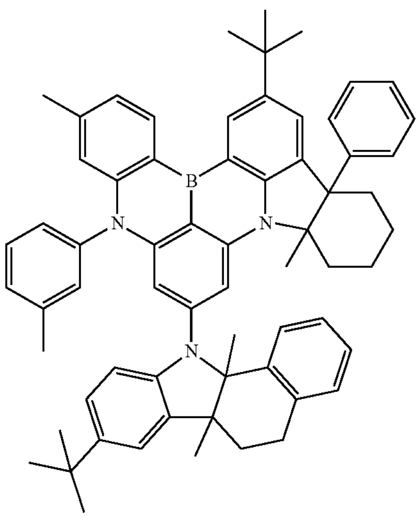
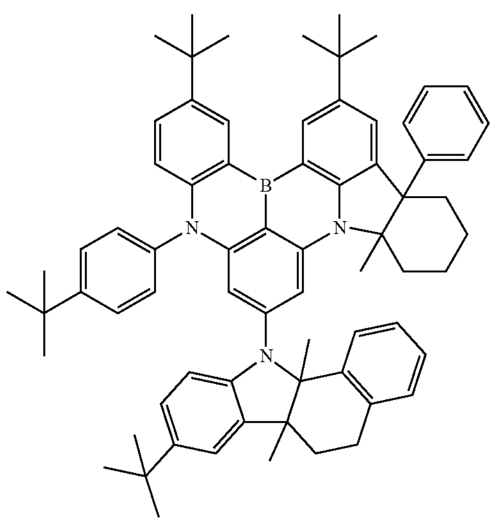
-continued
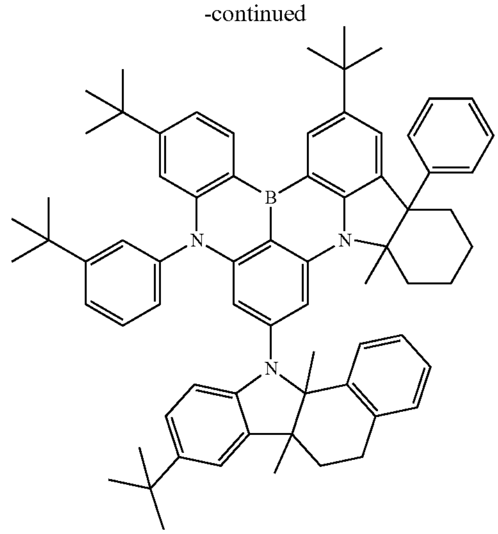
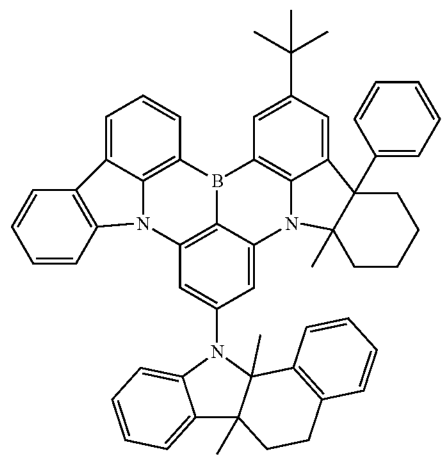
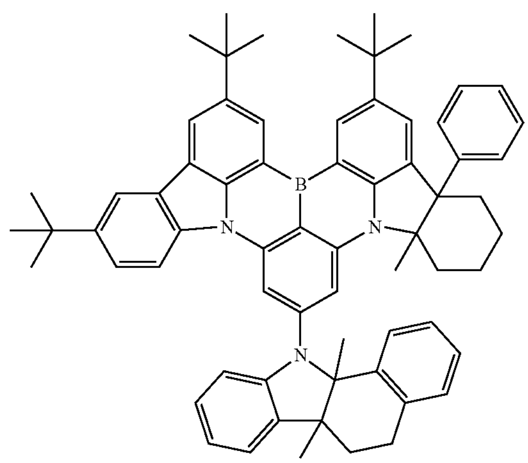

-continued
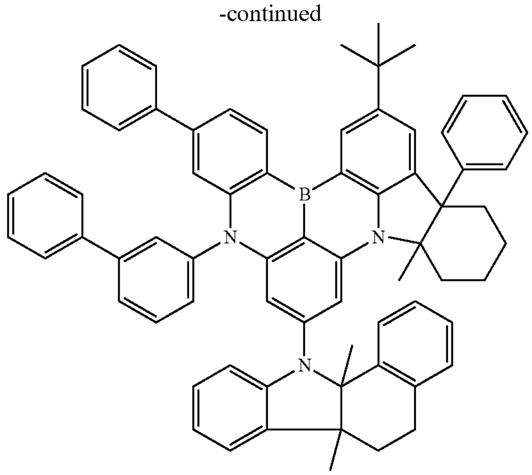
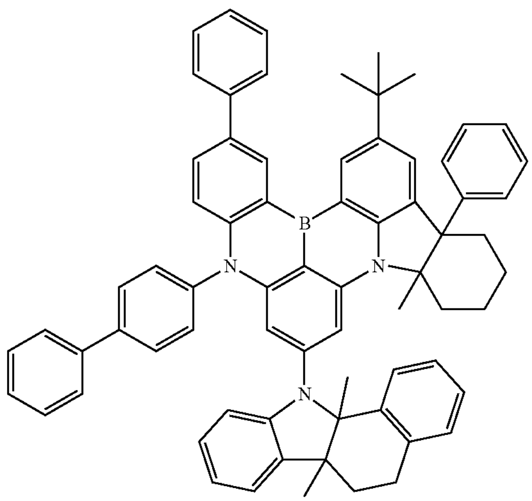
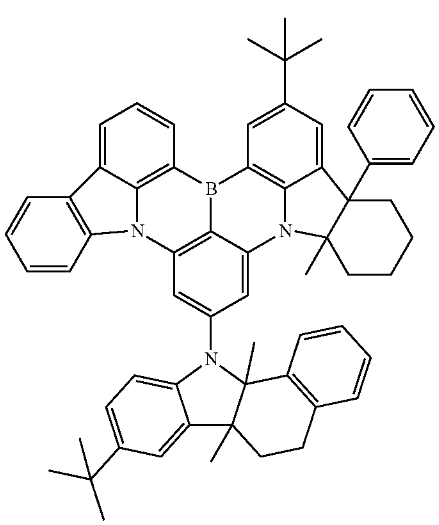
-continued
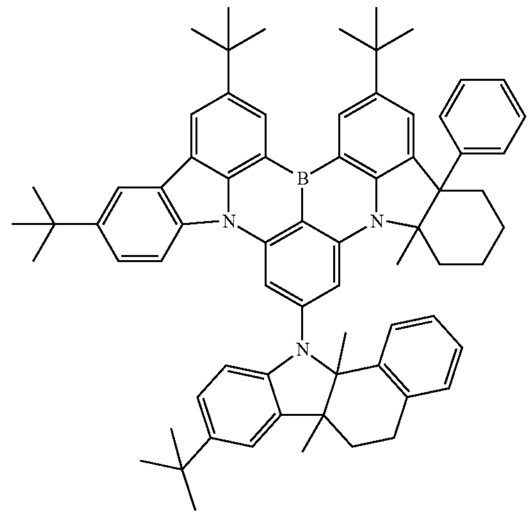
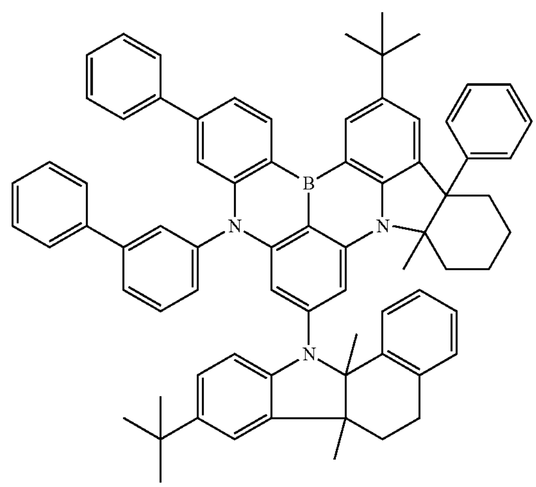
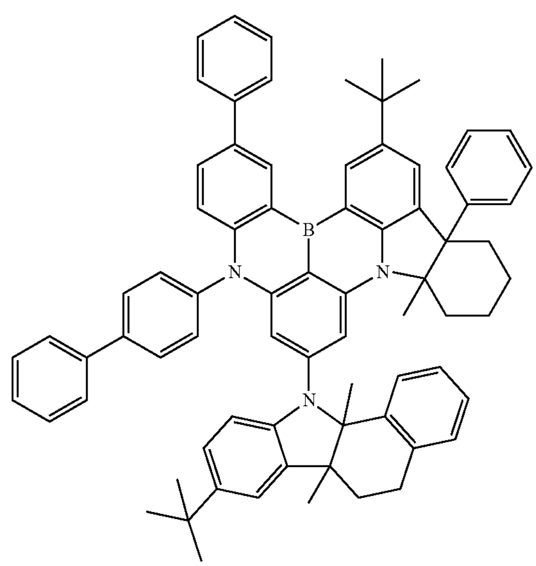

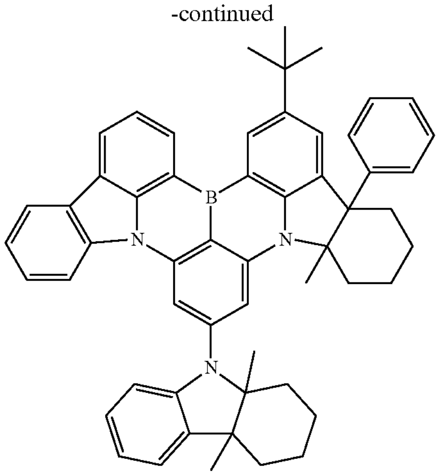
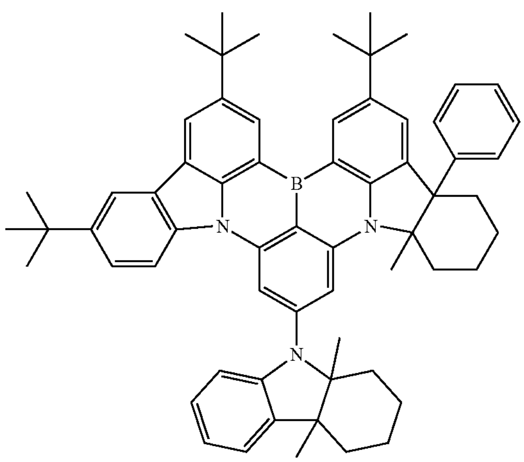
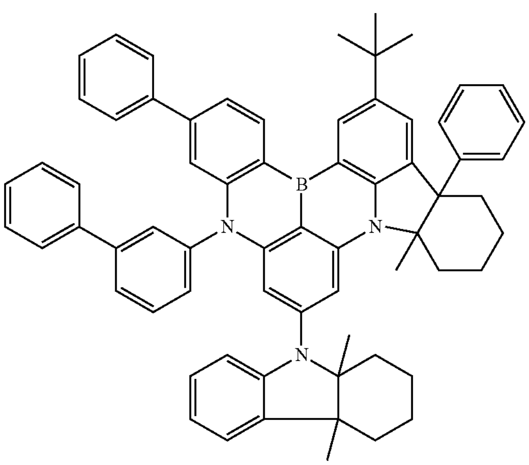
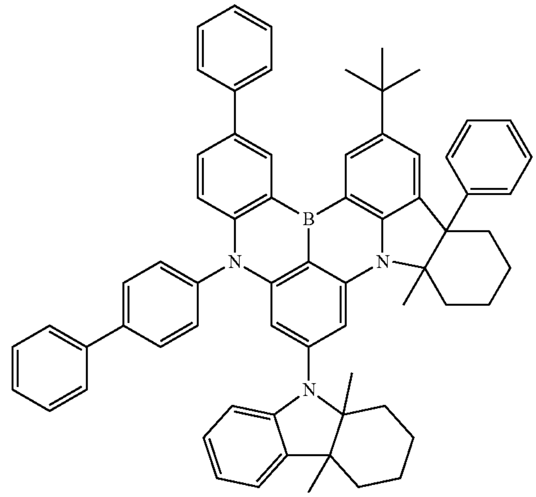
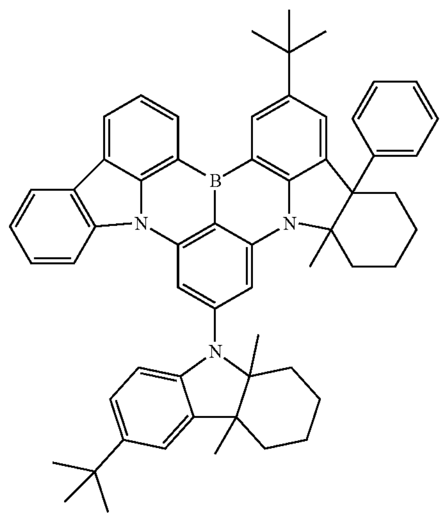
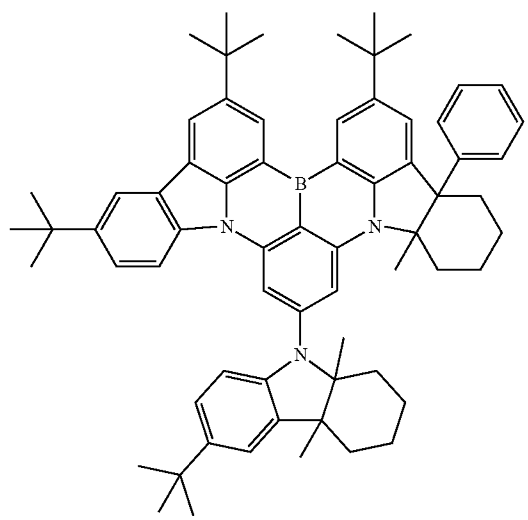

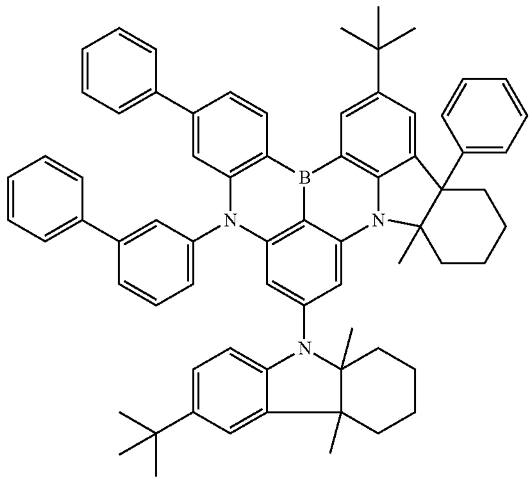
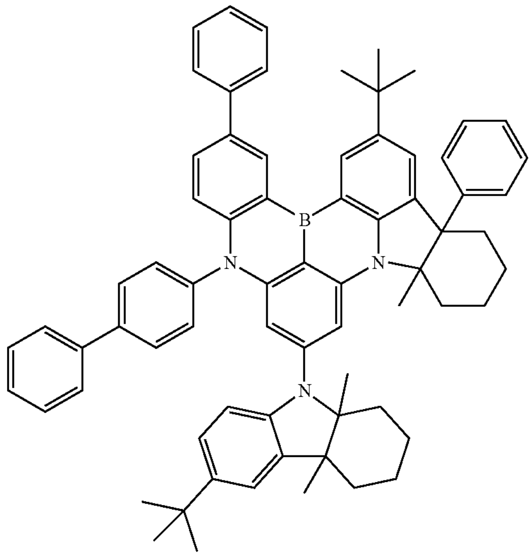
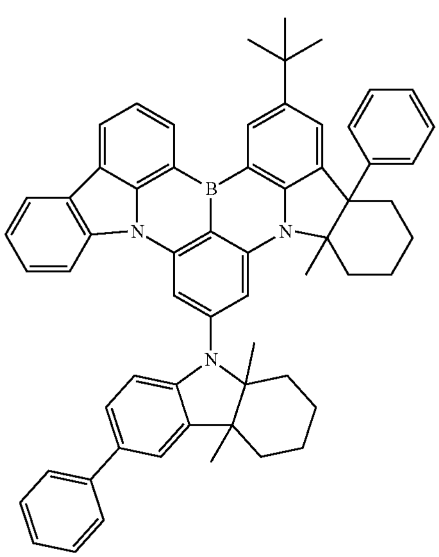
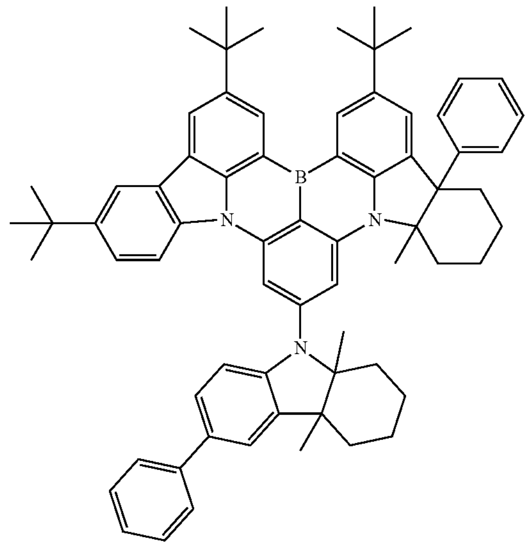
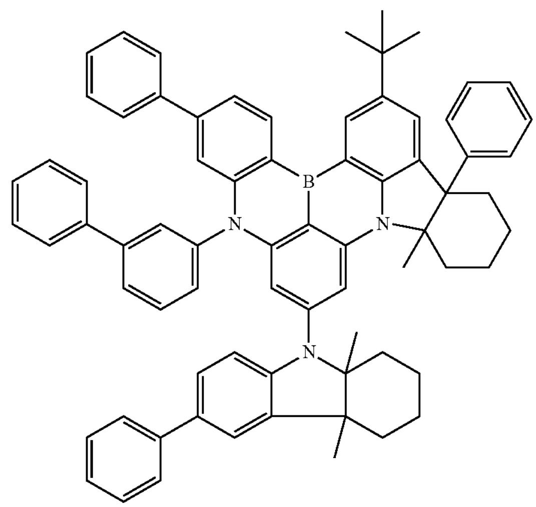
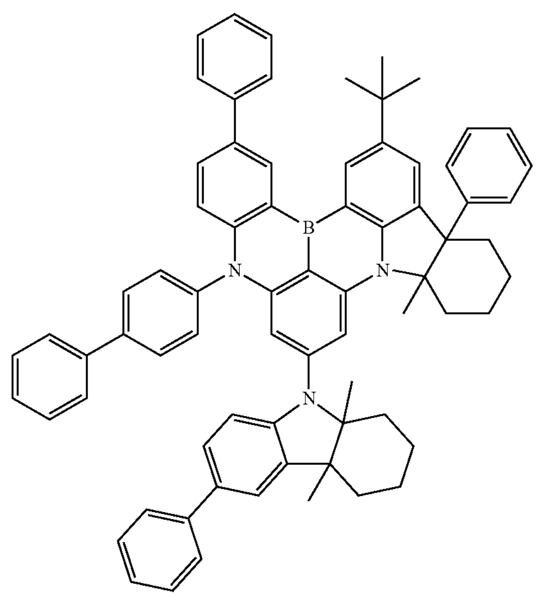

-continued
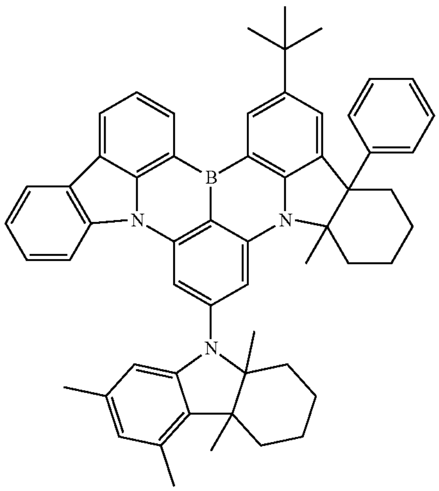
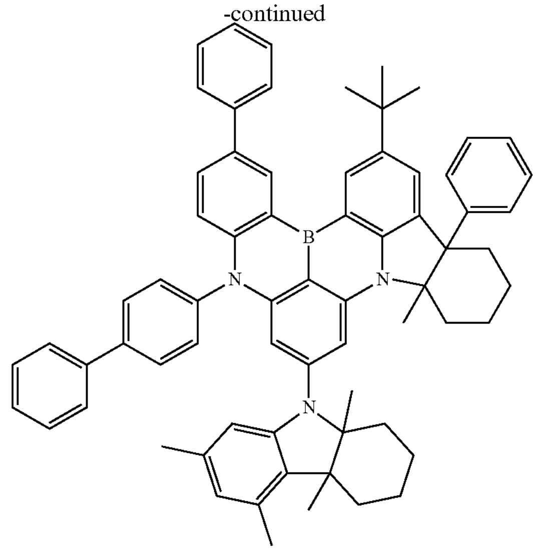
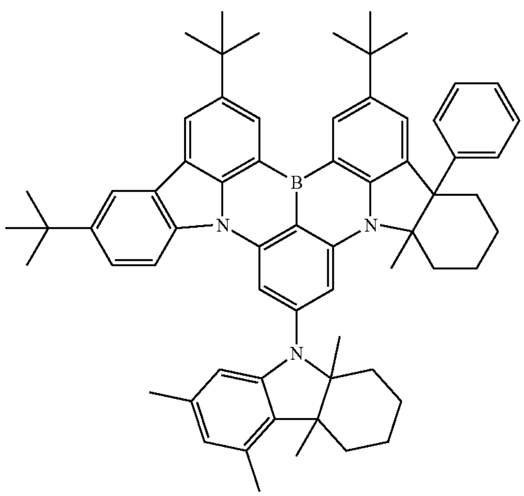
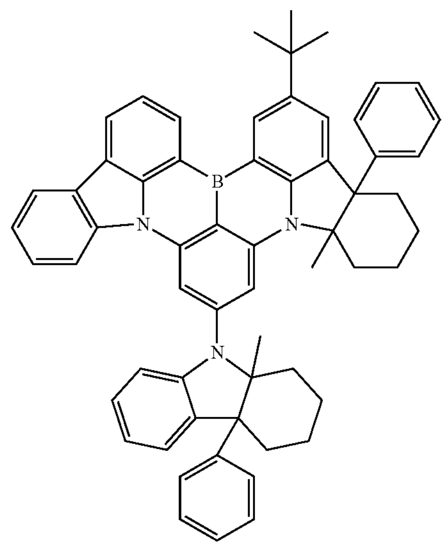
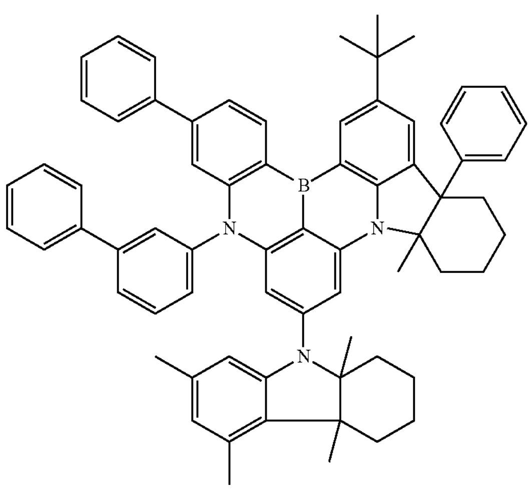
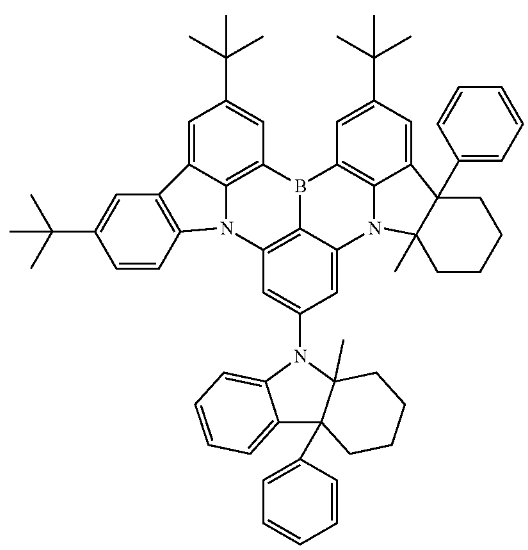
-continued -continued
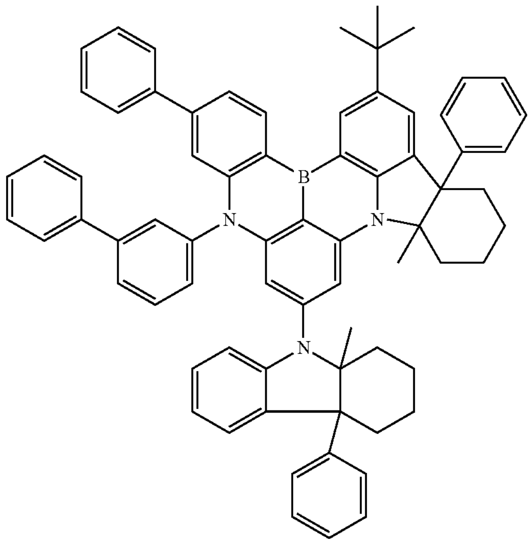
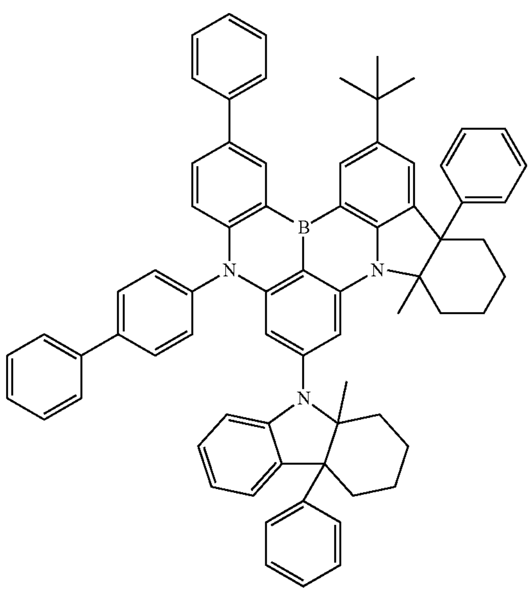
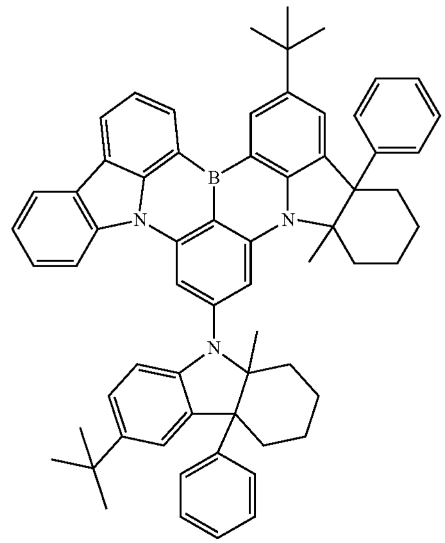
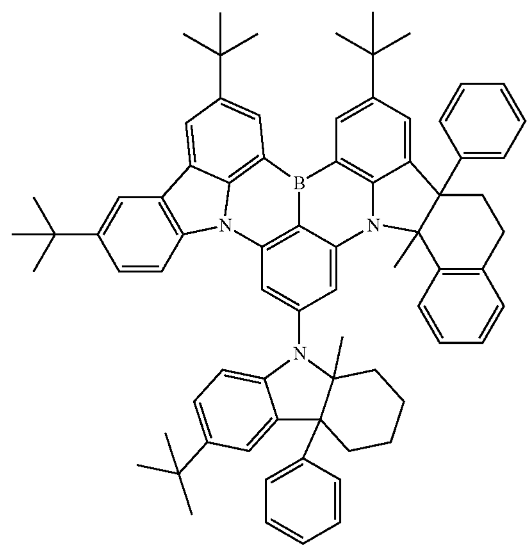
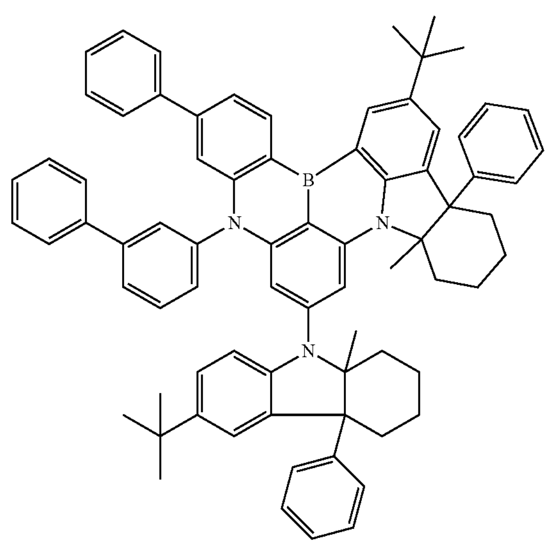

-continued
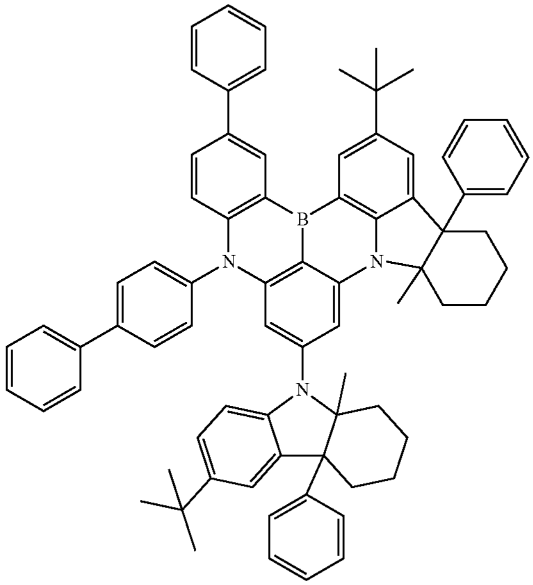
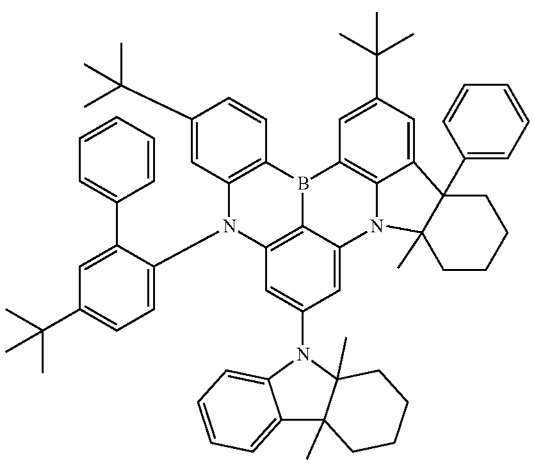
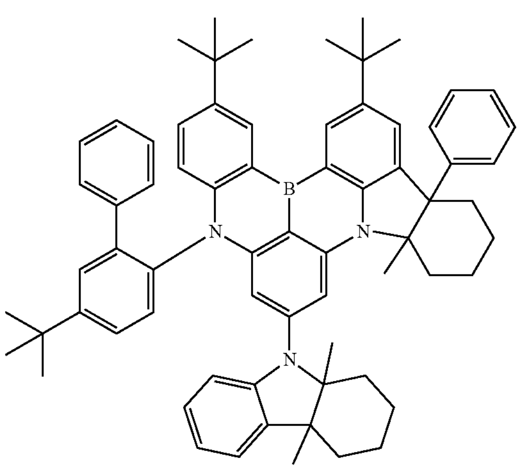
-continued
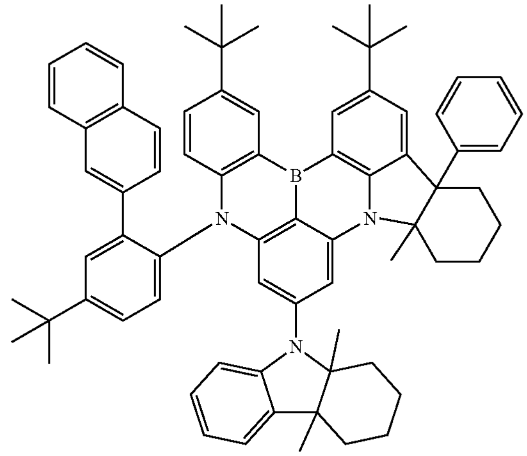
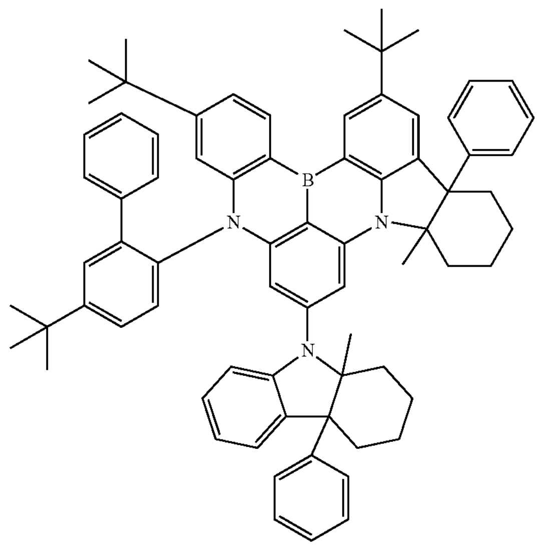
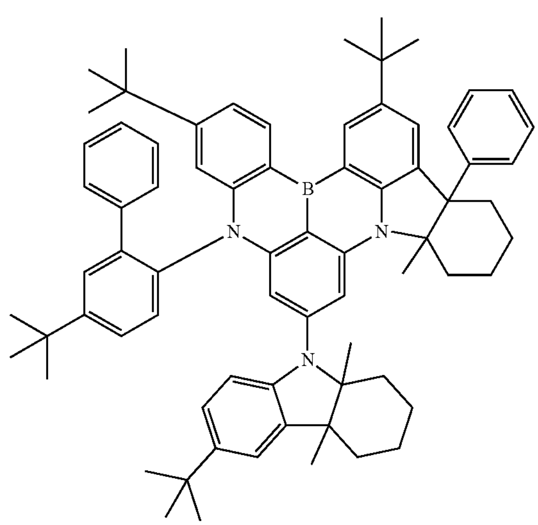

-continued
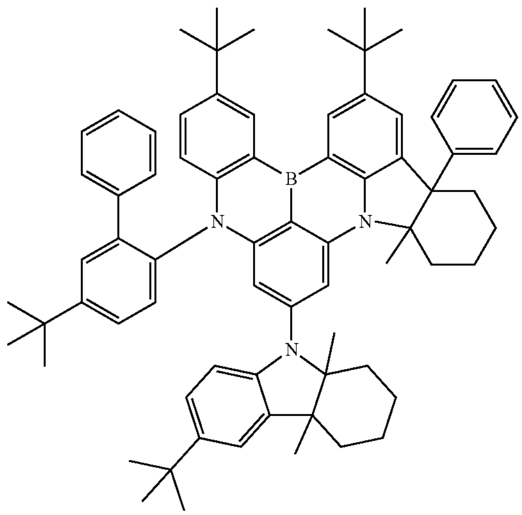
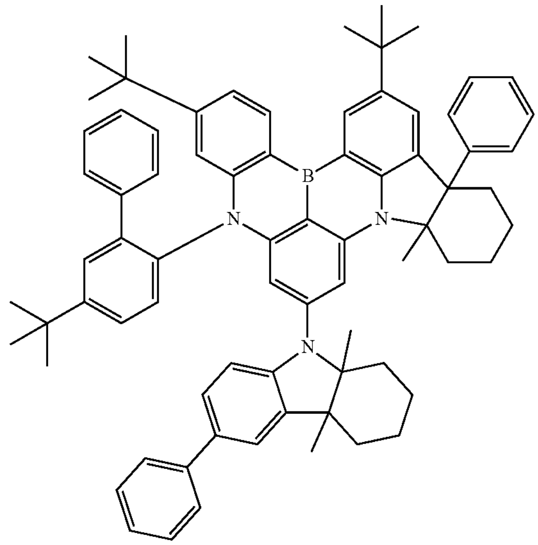
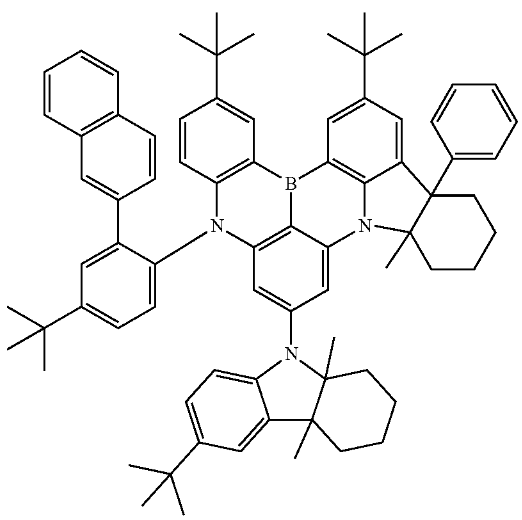
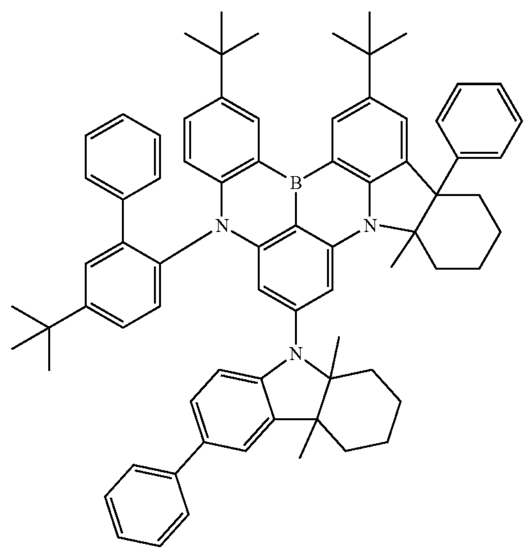
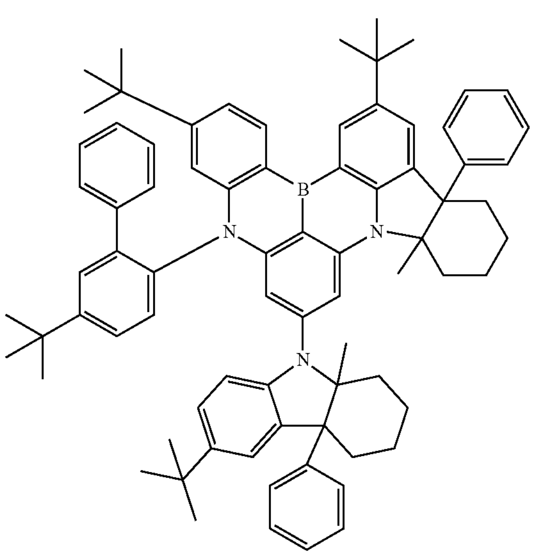
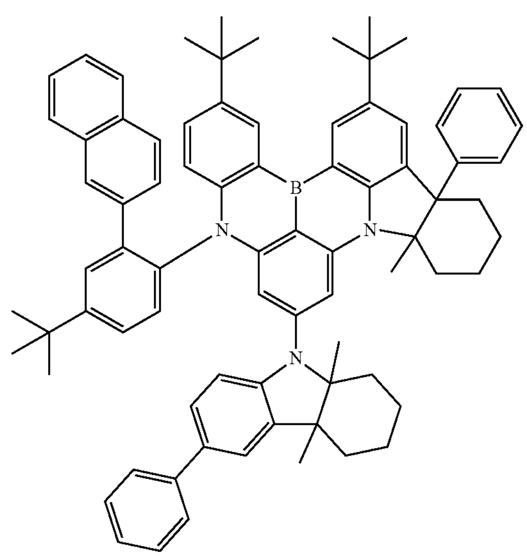
-continued -continued
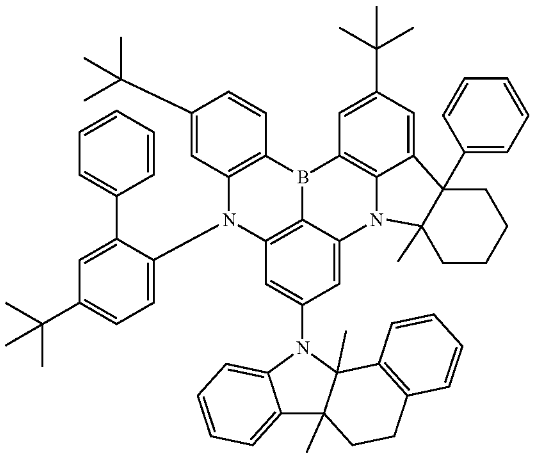
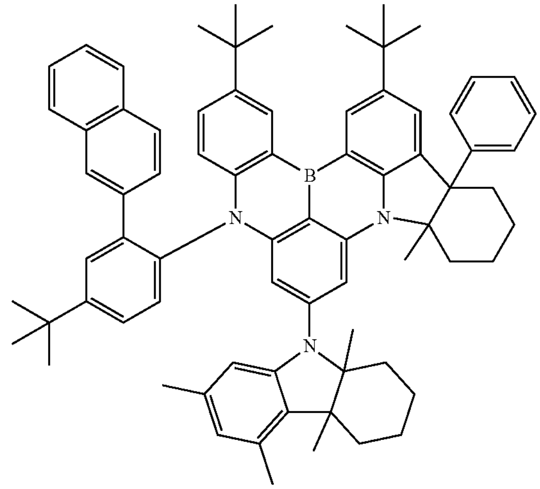
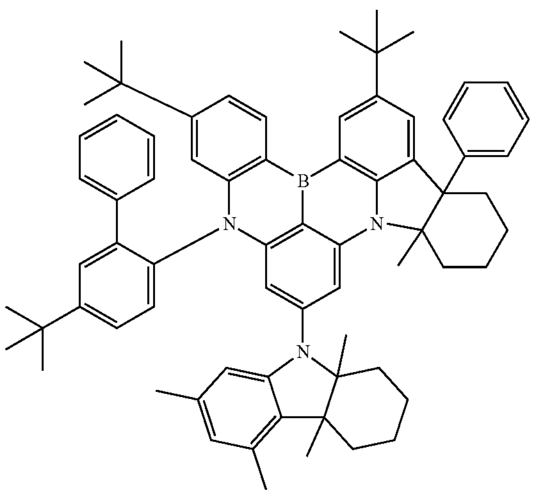
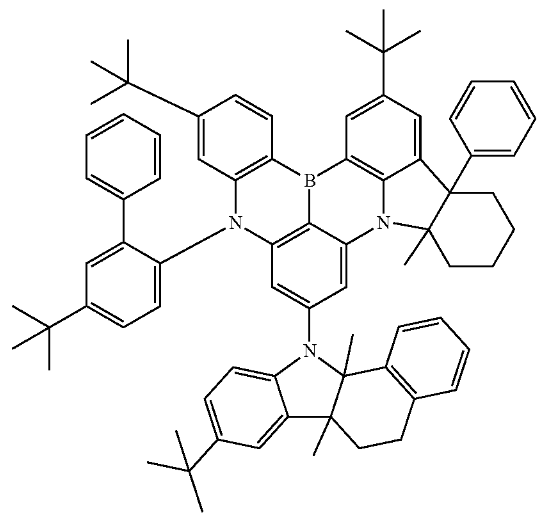
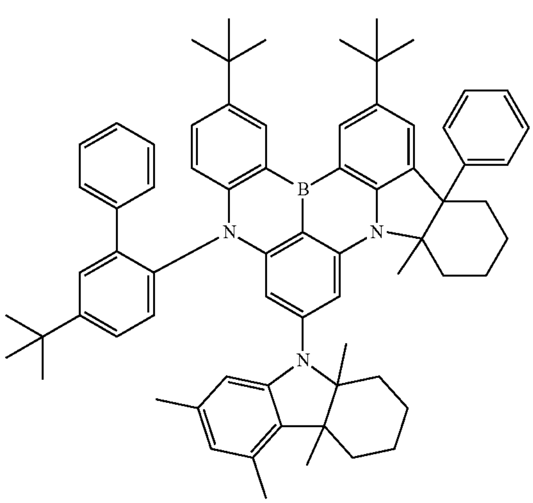
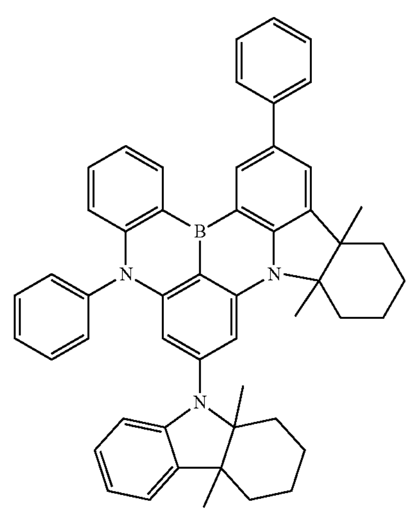
-continued

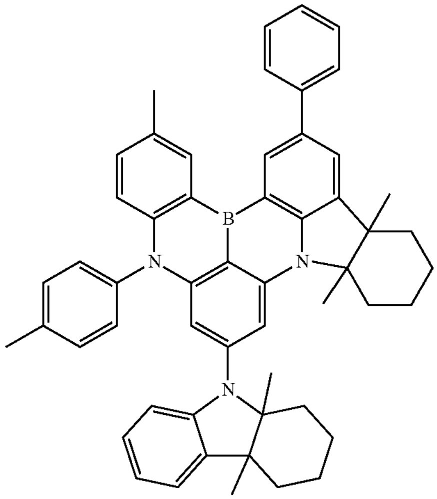
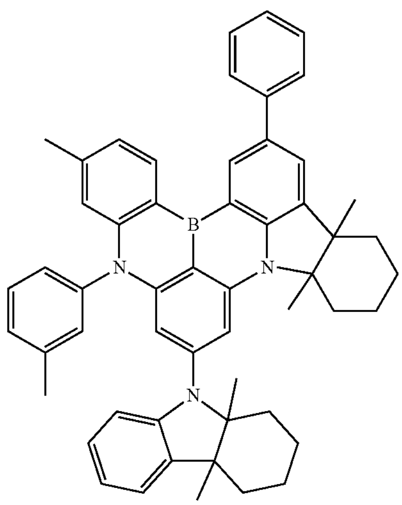
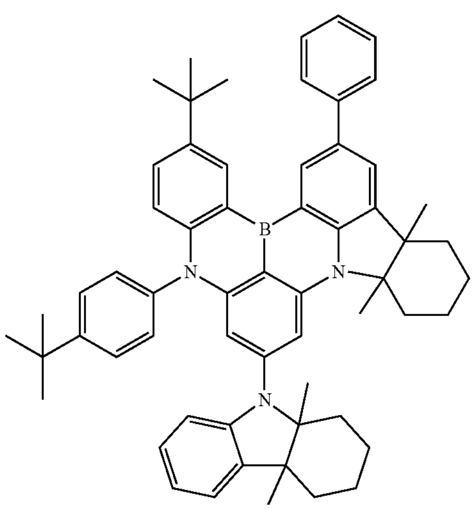
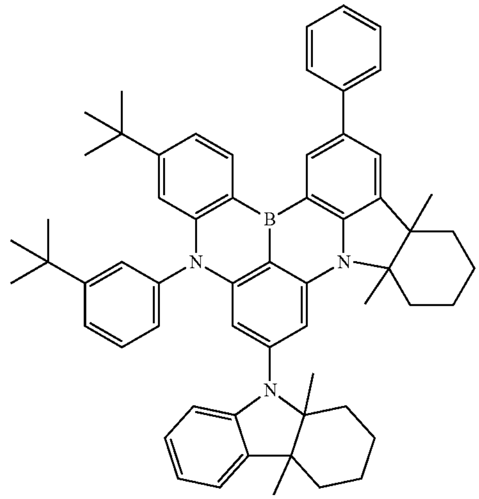
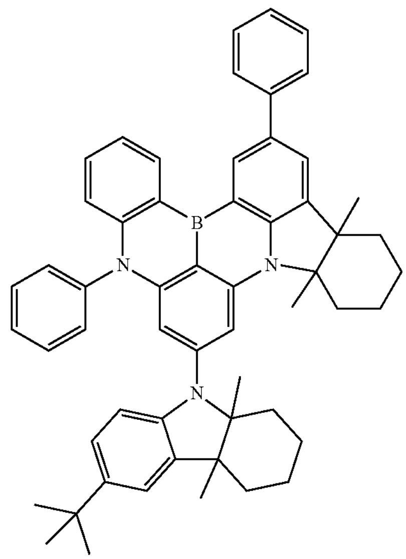
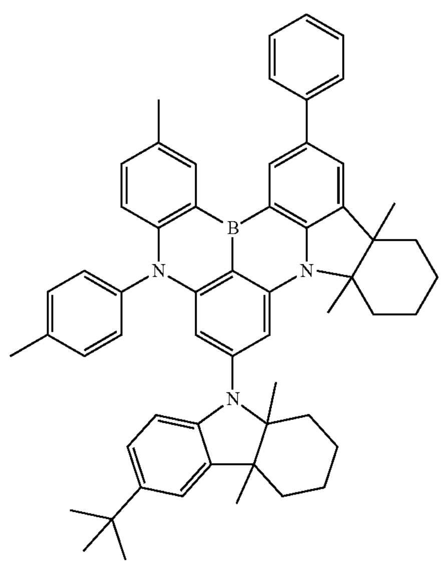
B
N
N
N -continued
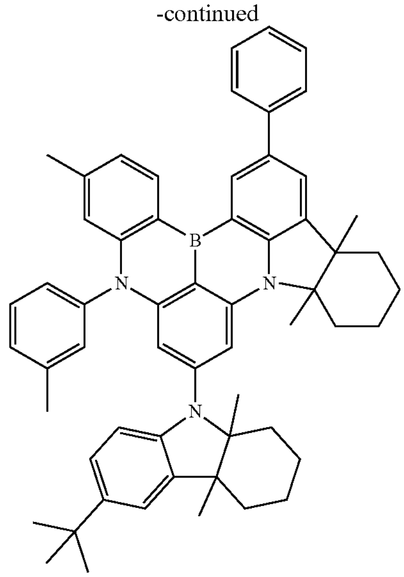
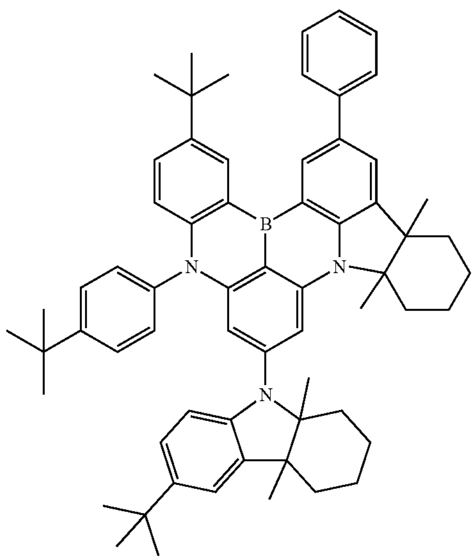
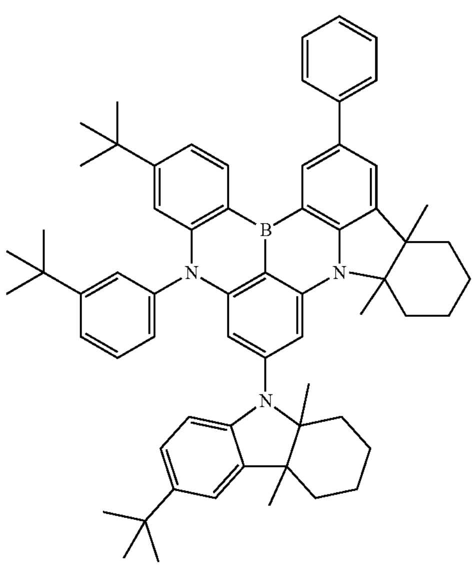
-continued
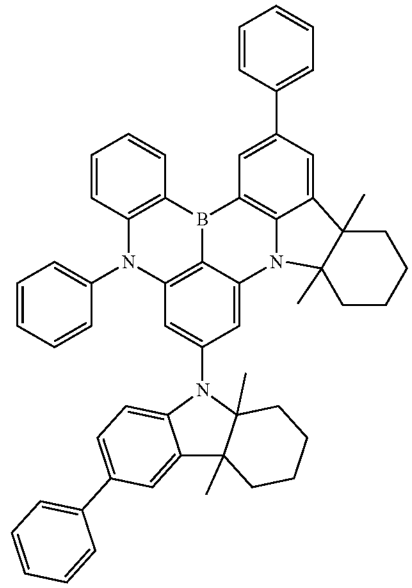
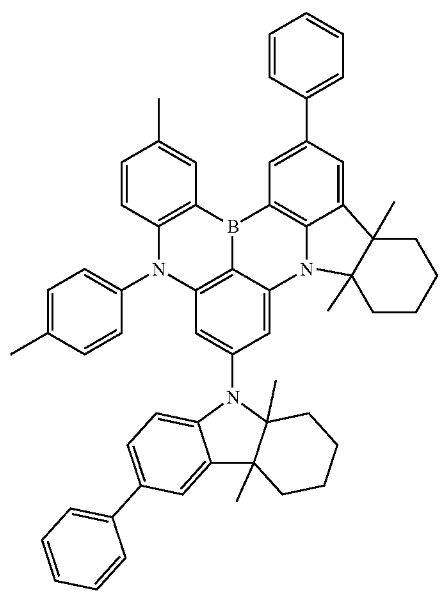

-continued
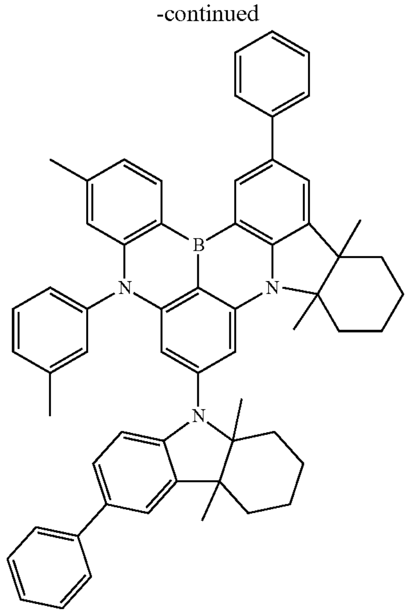
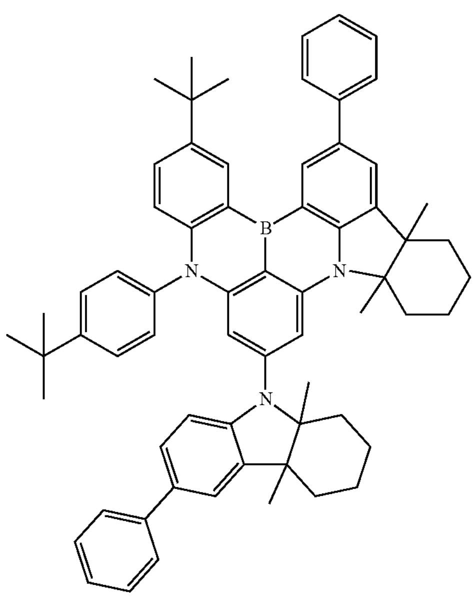
-continued
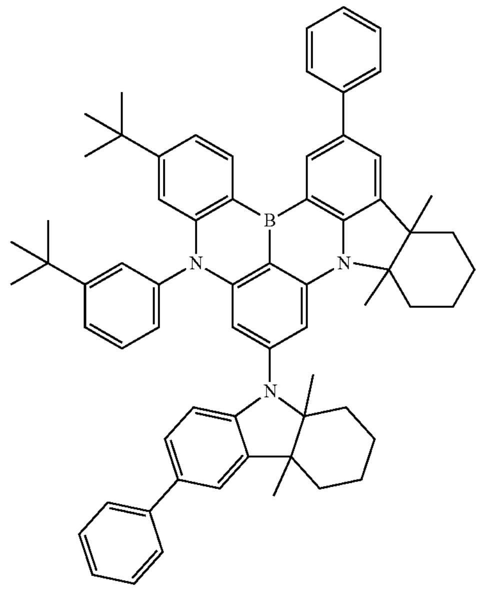
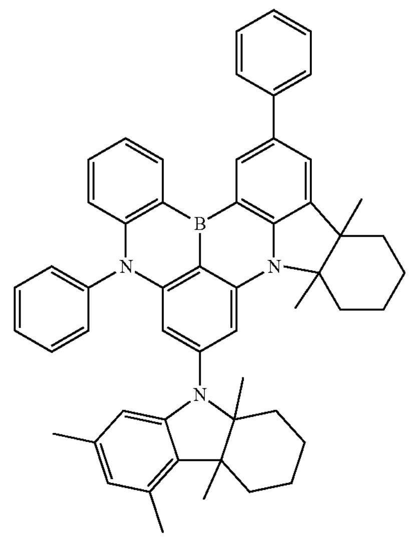
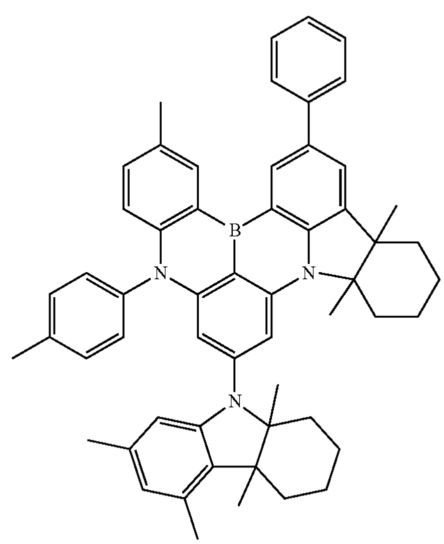

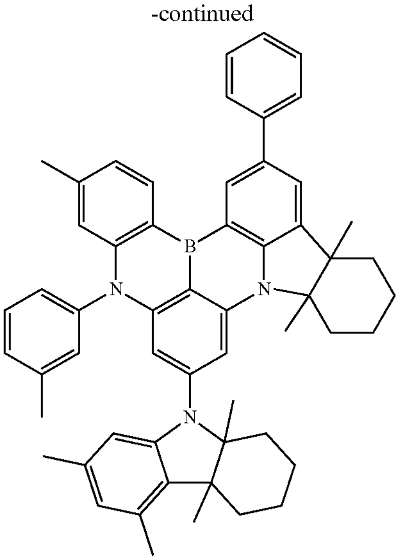
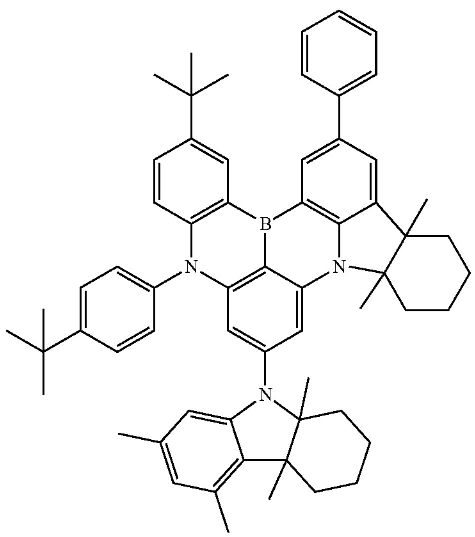
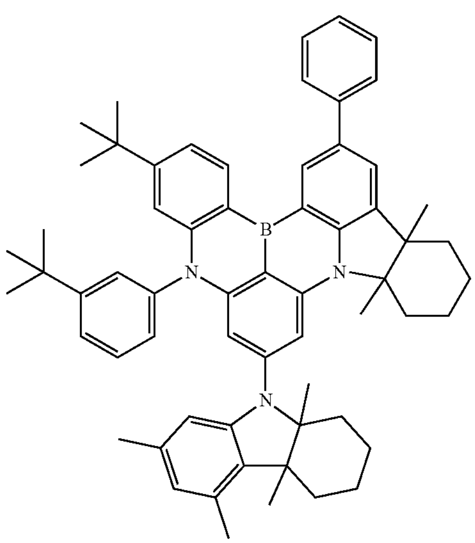
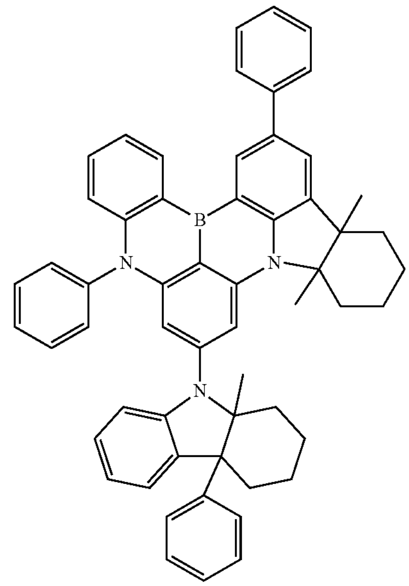
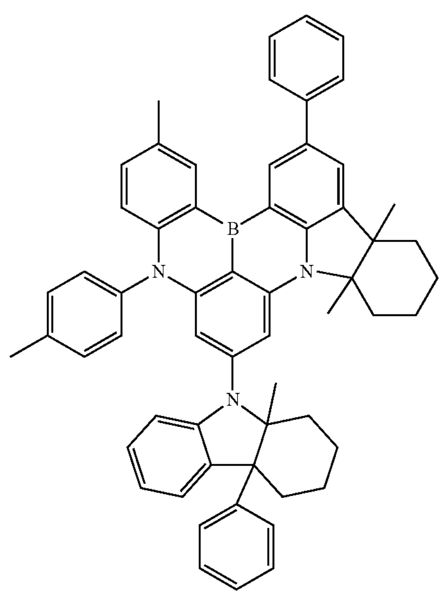
N
B
N
N

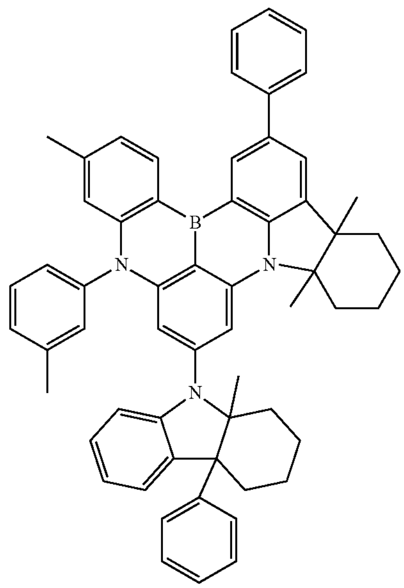
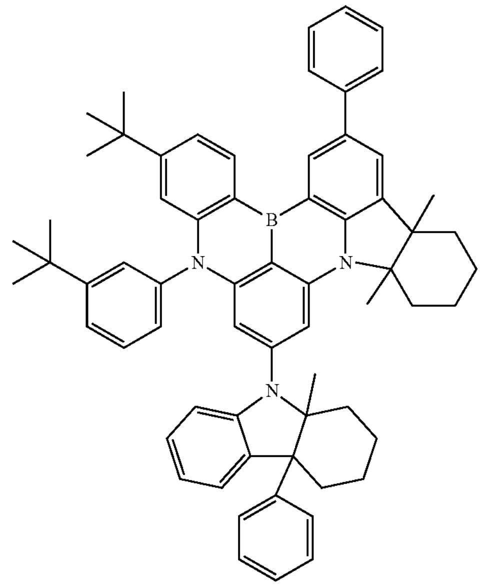
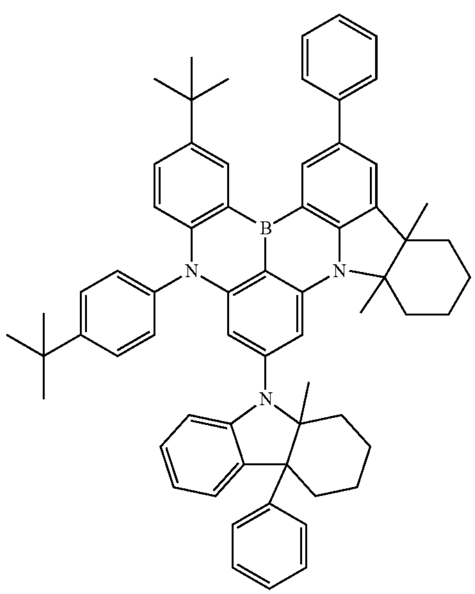
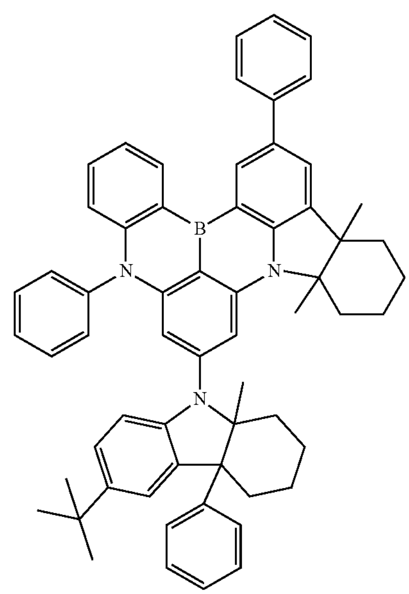

-continued
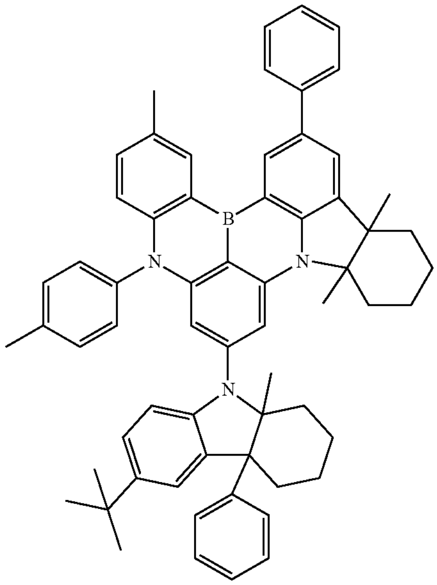
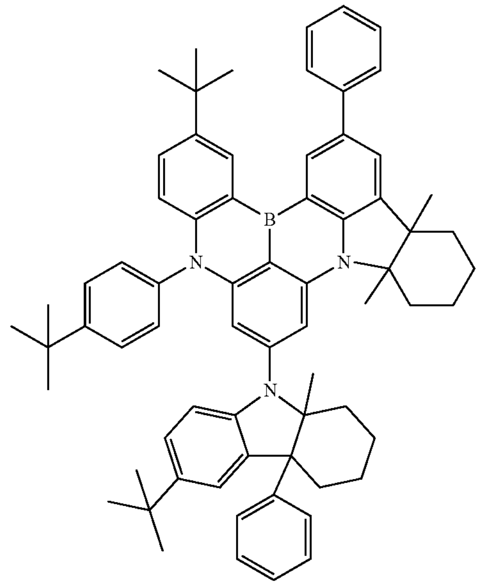
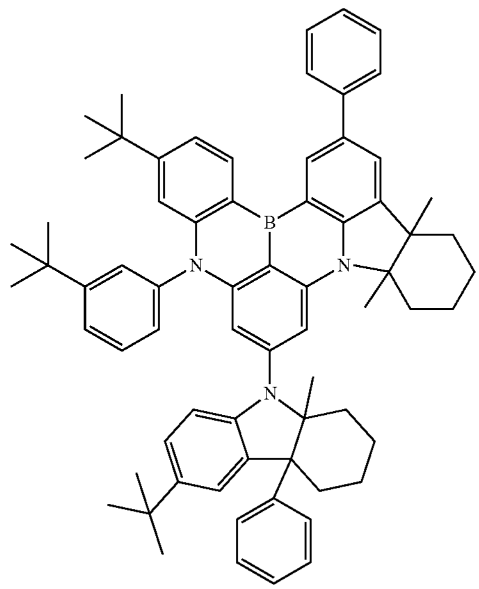
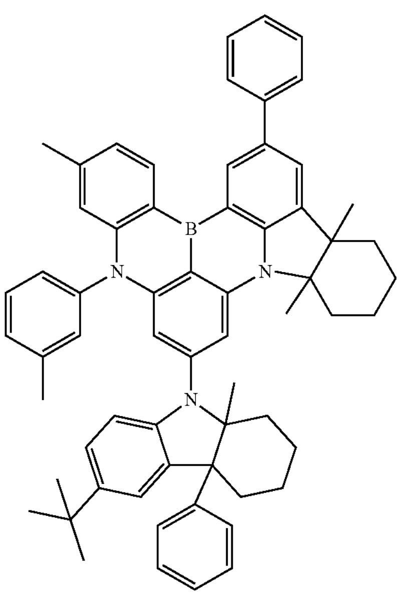
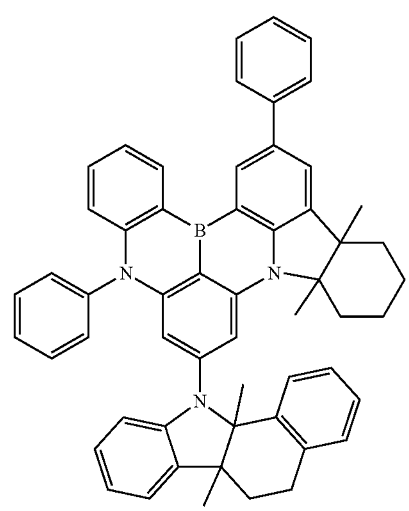

-continued
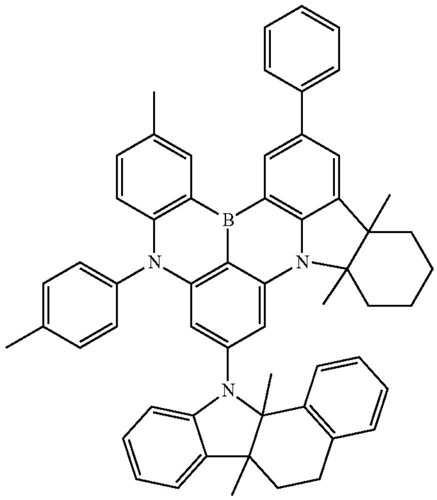
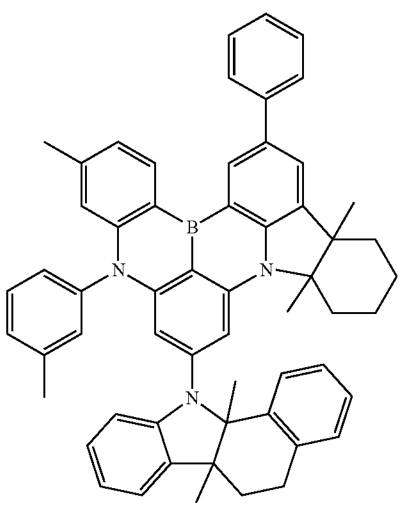
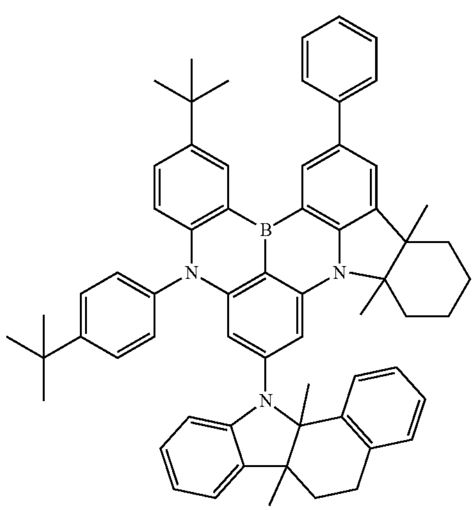
-continued
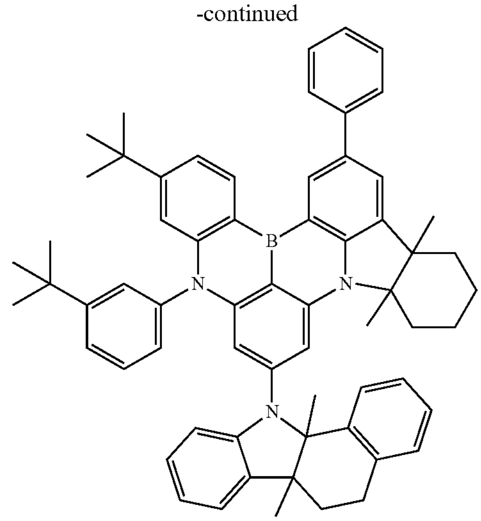
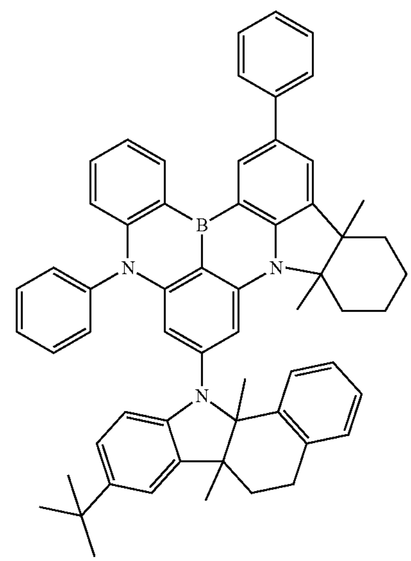
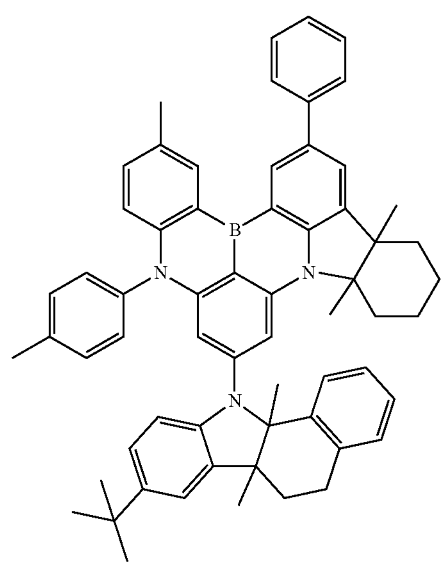

-continued
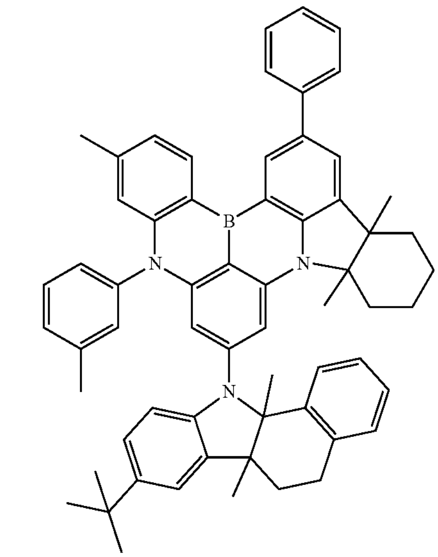
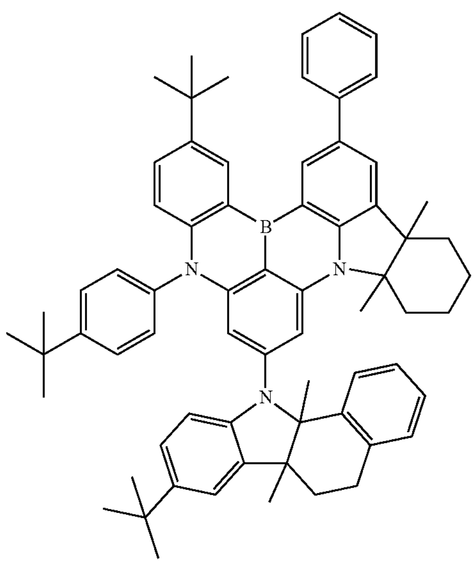
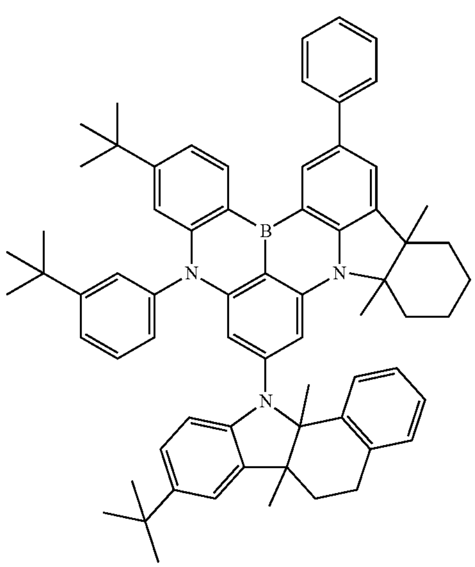
-continued
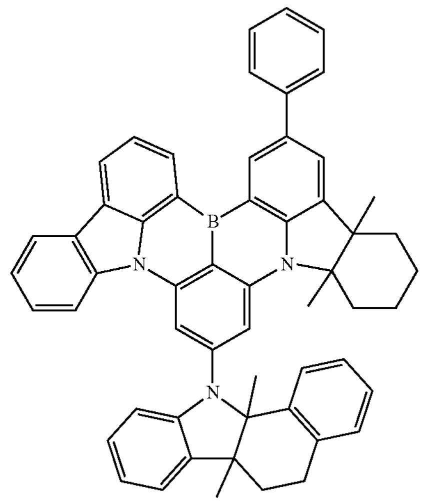
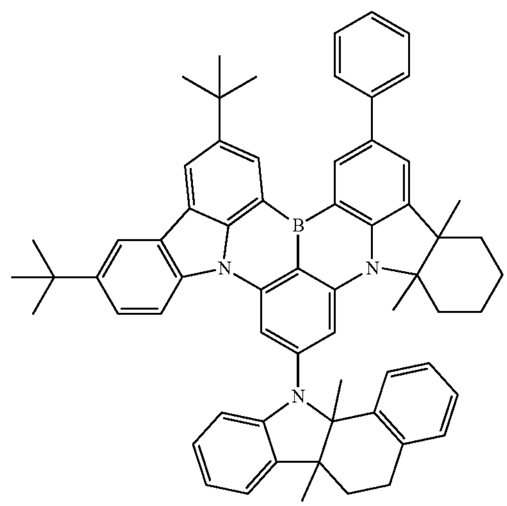
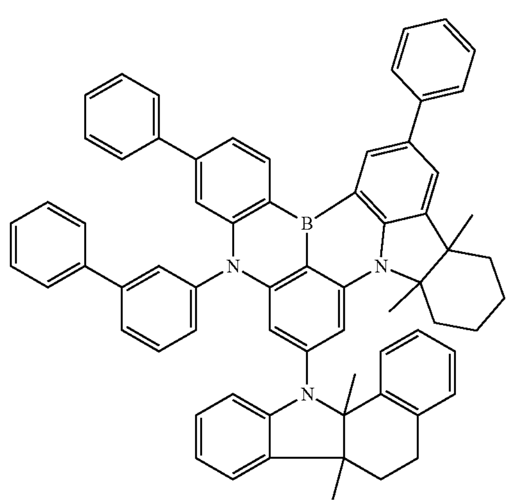

-continued
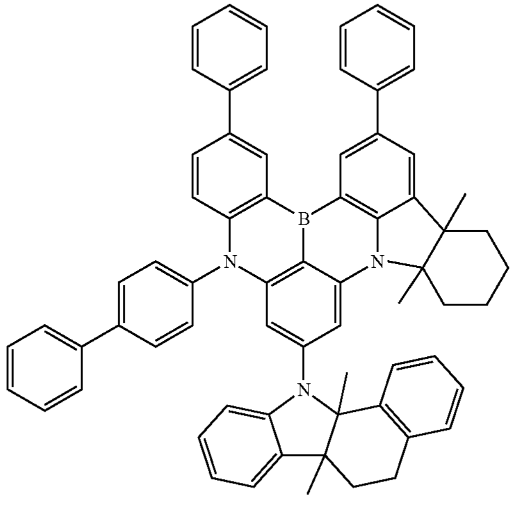
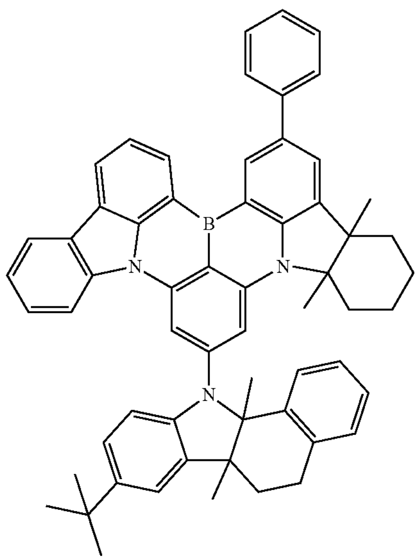
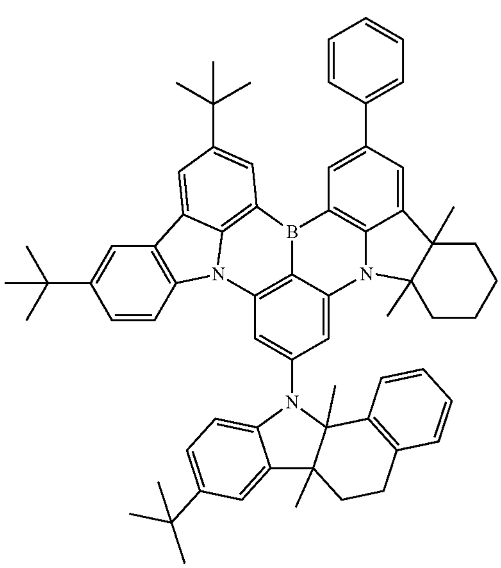
-continued
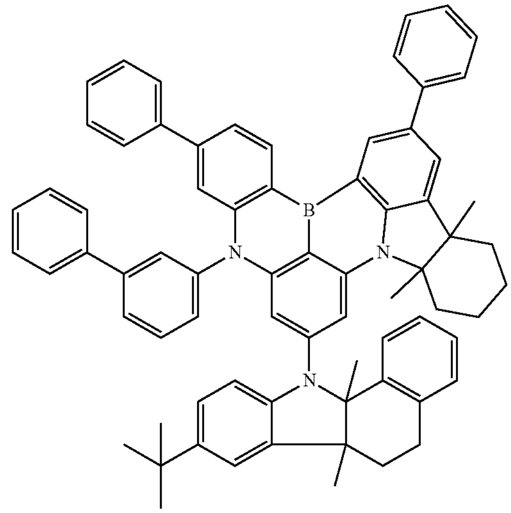
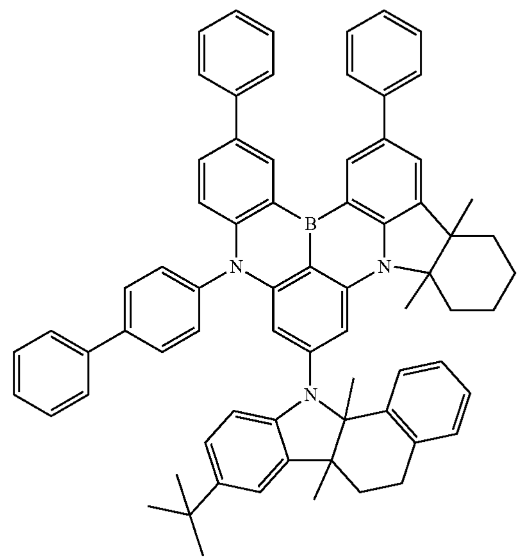
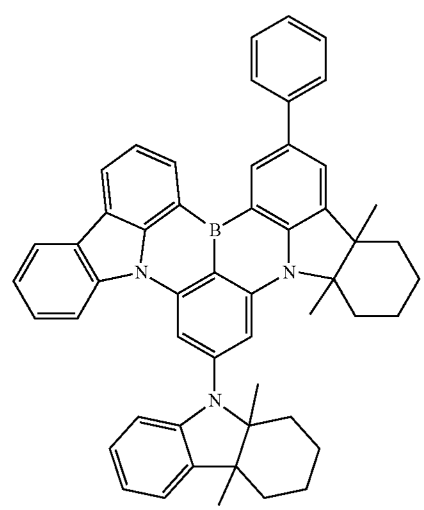

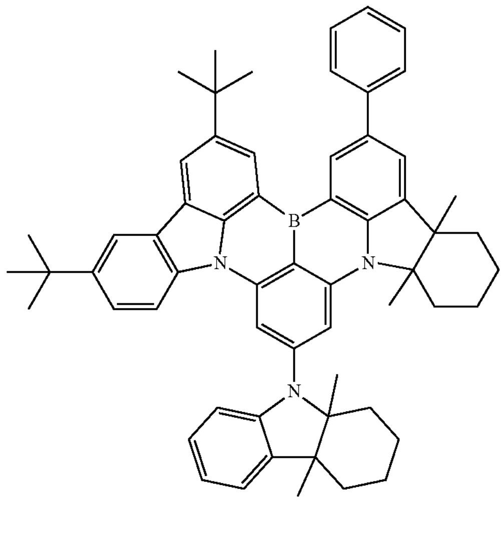
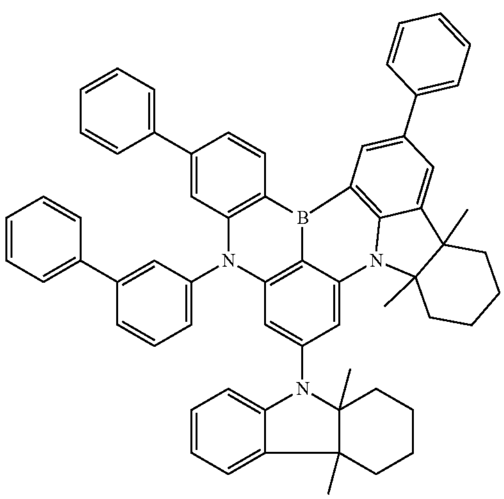
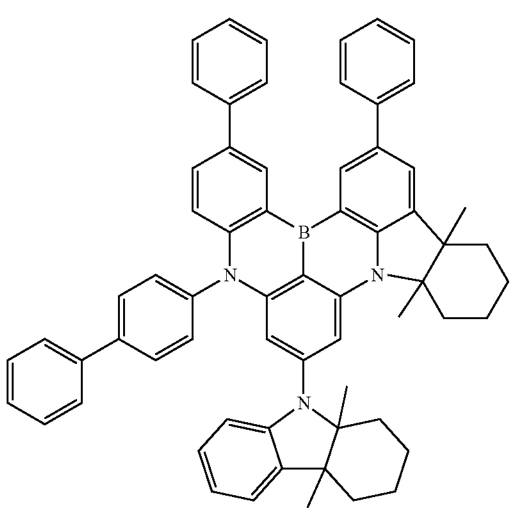
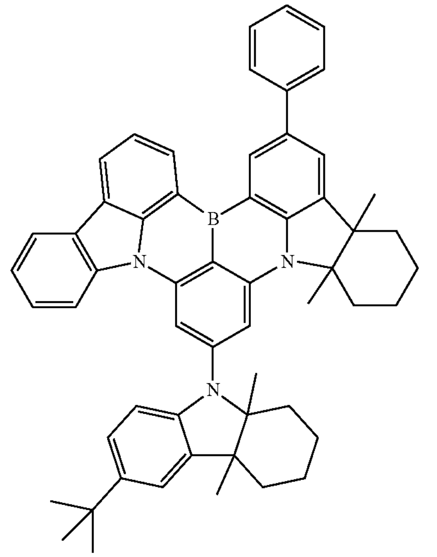
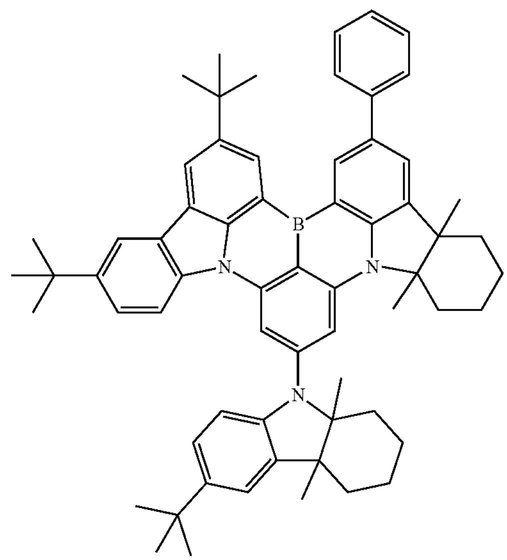
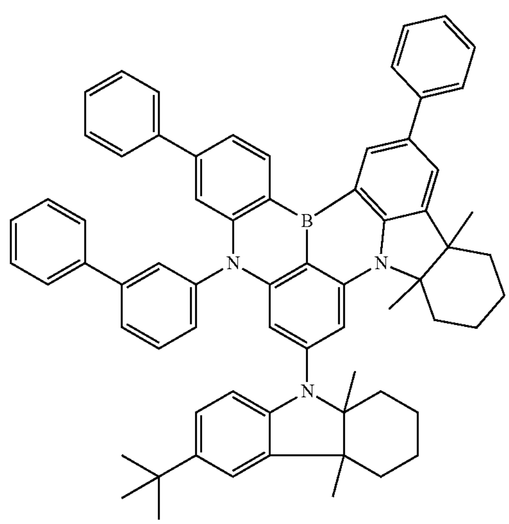

-continued
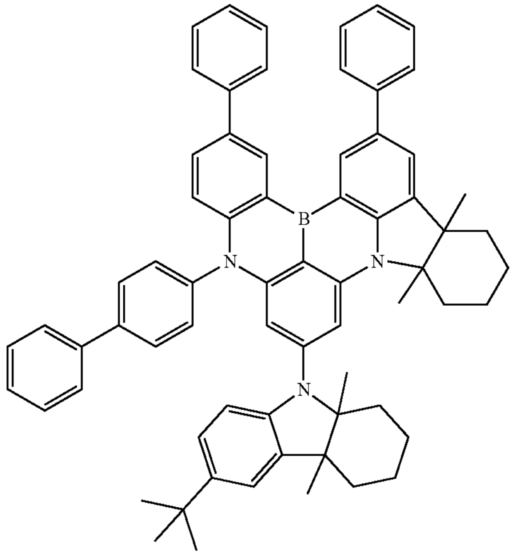
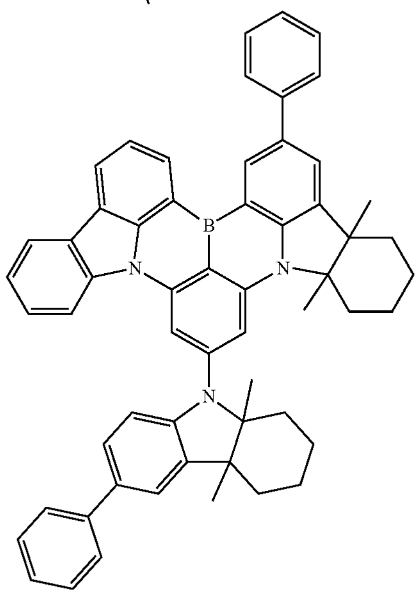
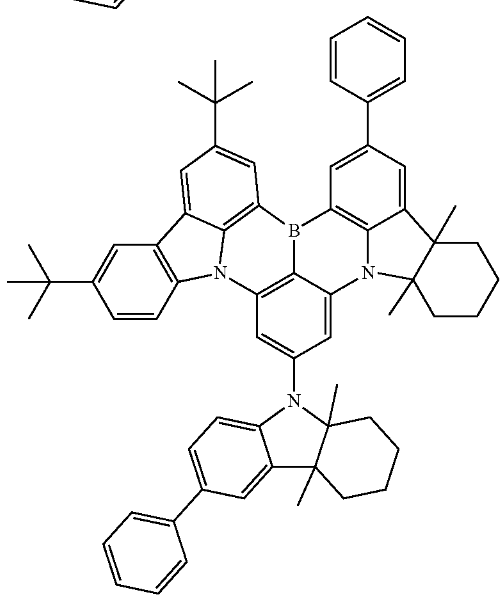
-continued
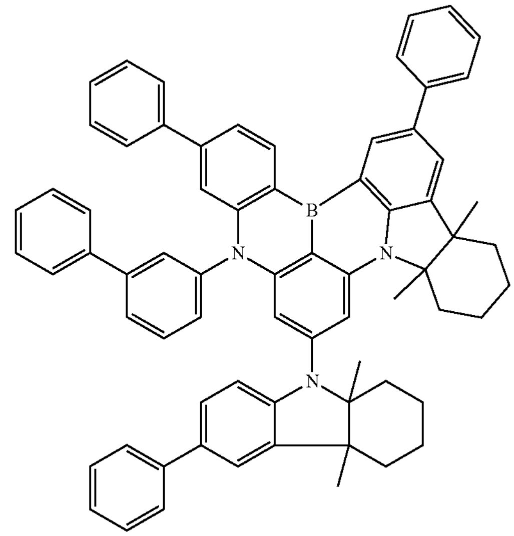
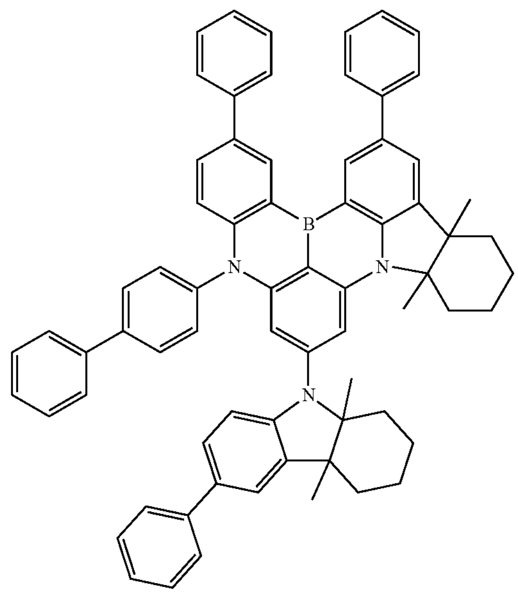
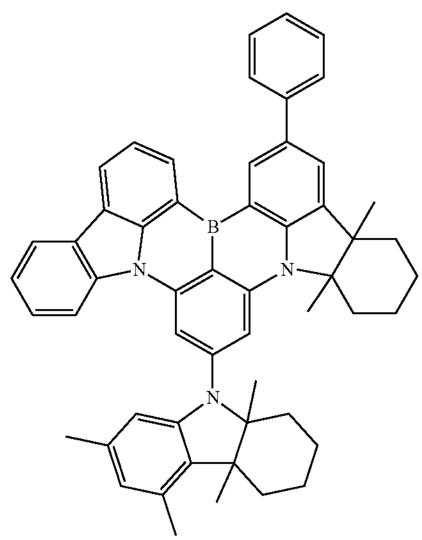

-continued
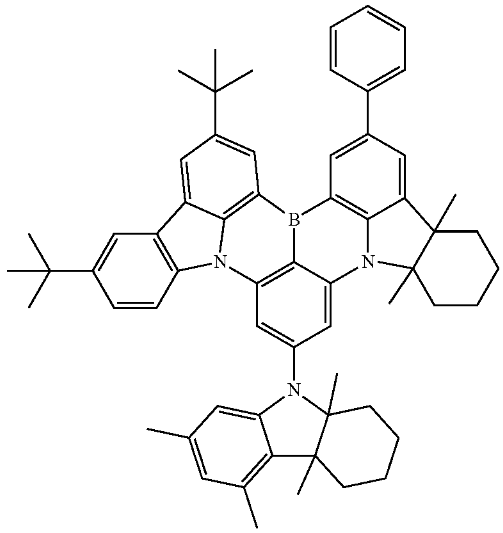
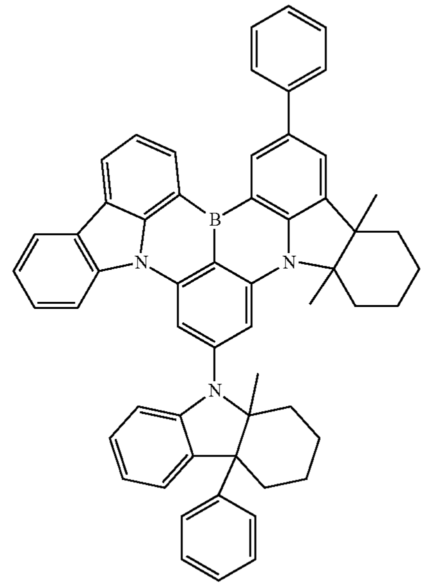
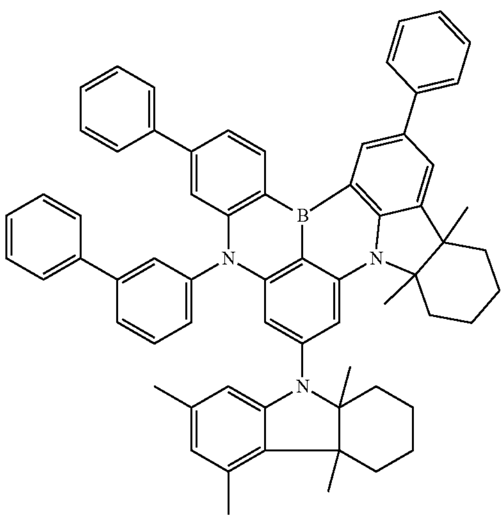
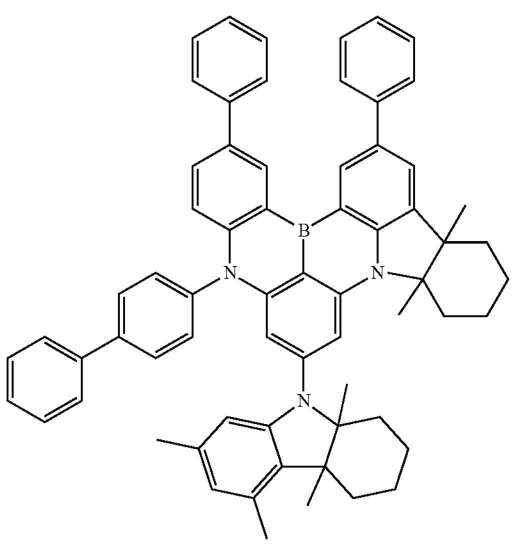
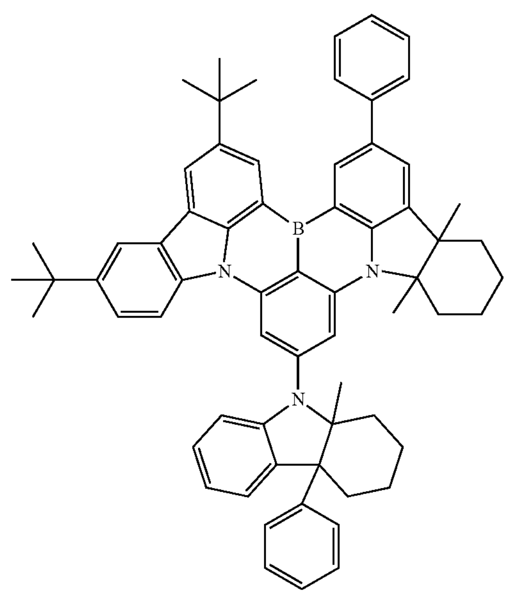

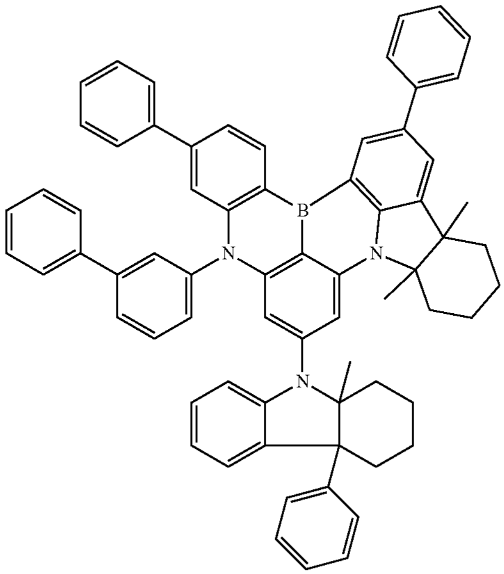
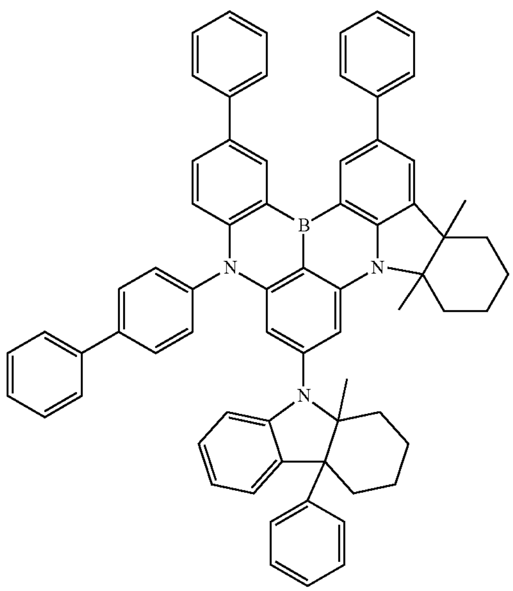
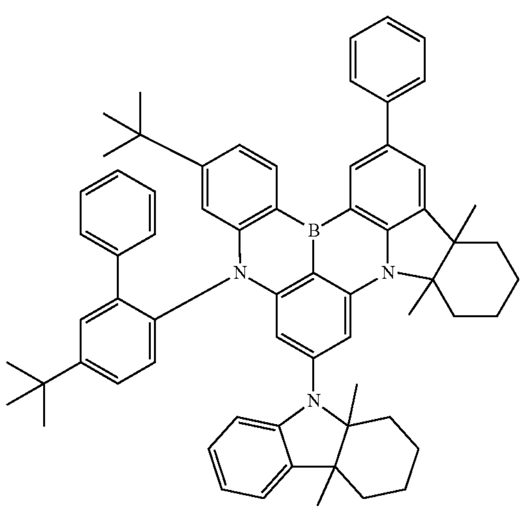
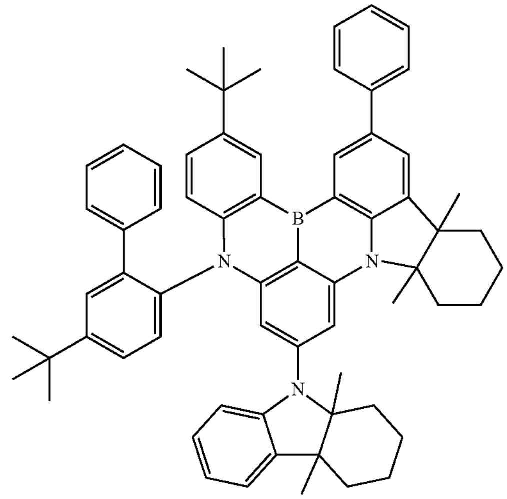
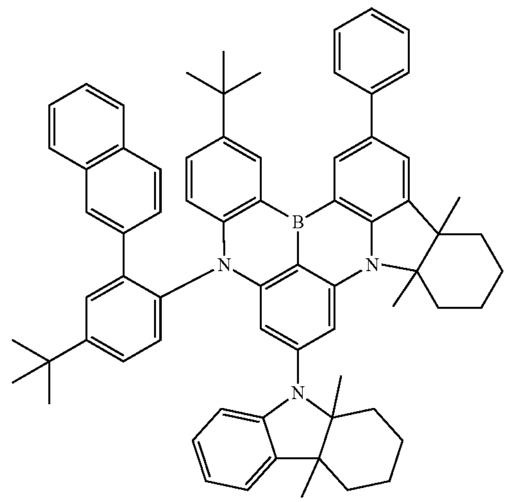
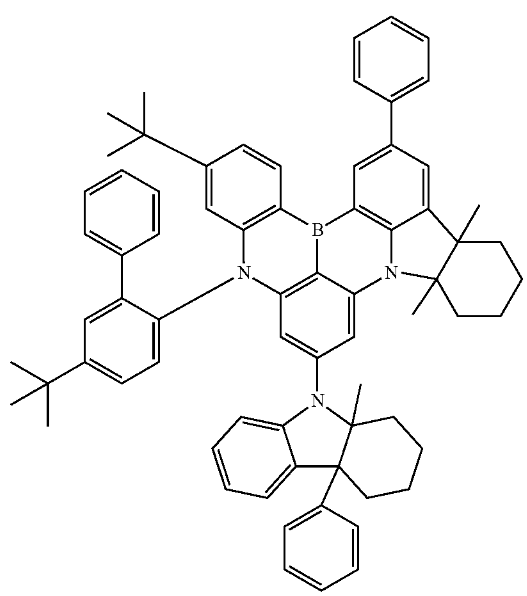

-continued
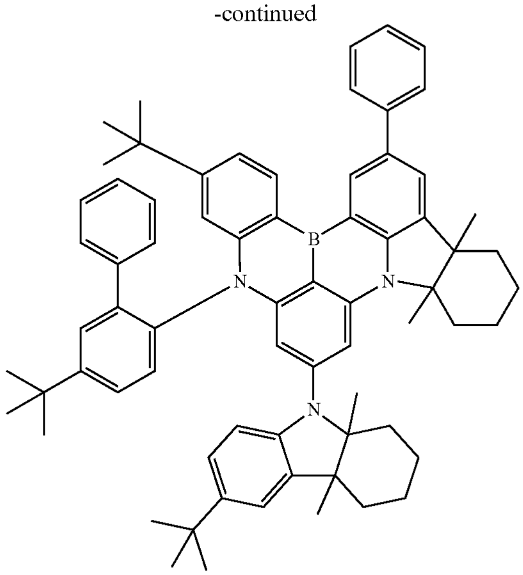
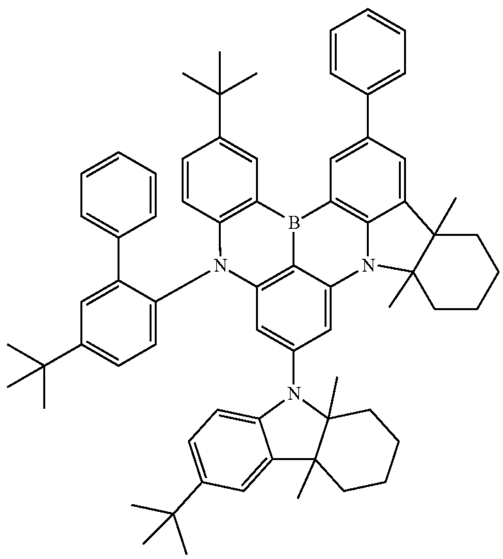
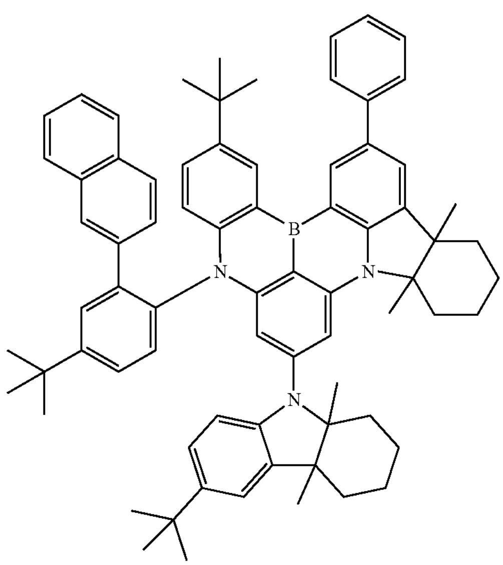
-continued
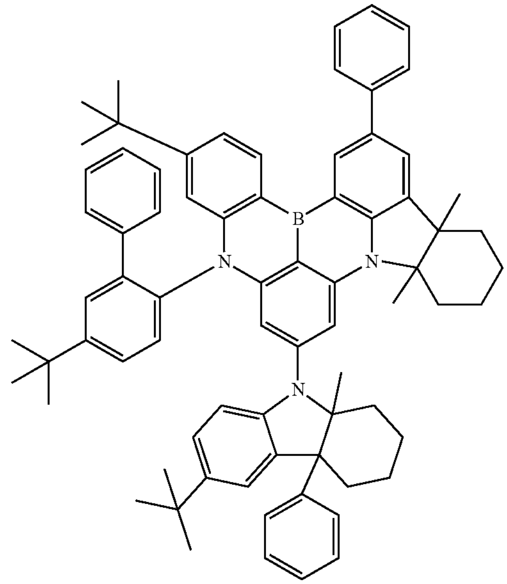
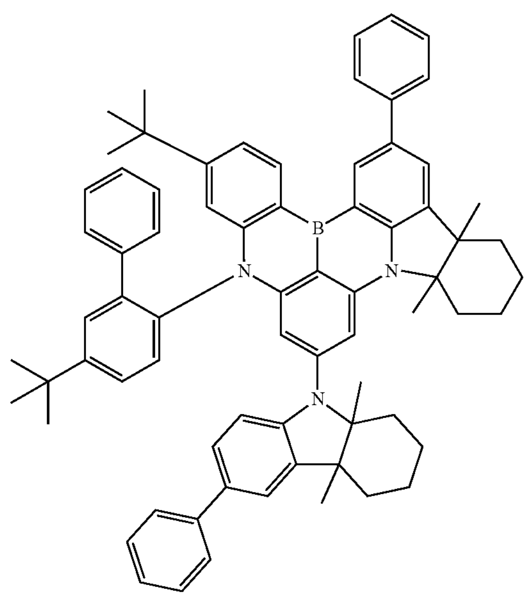

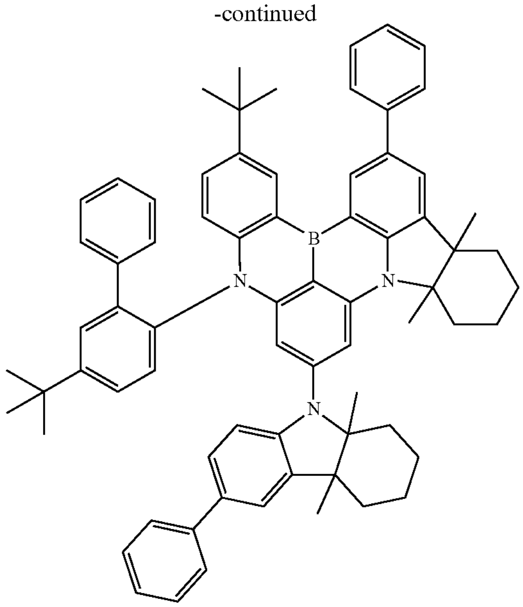
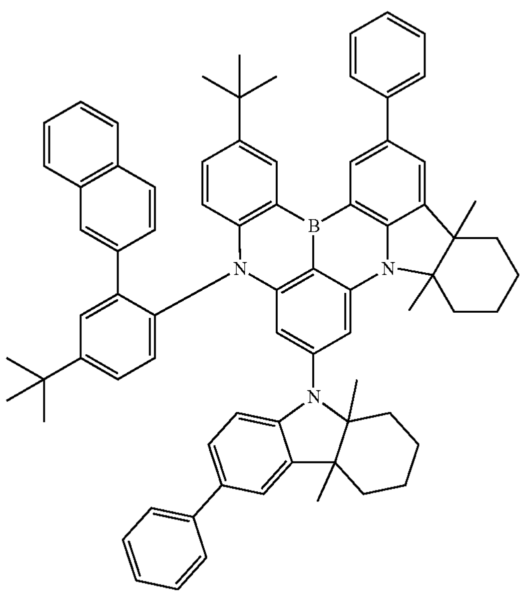
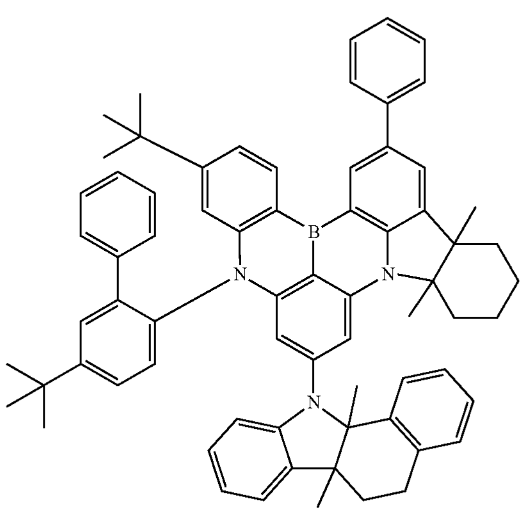
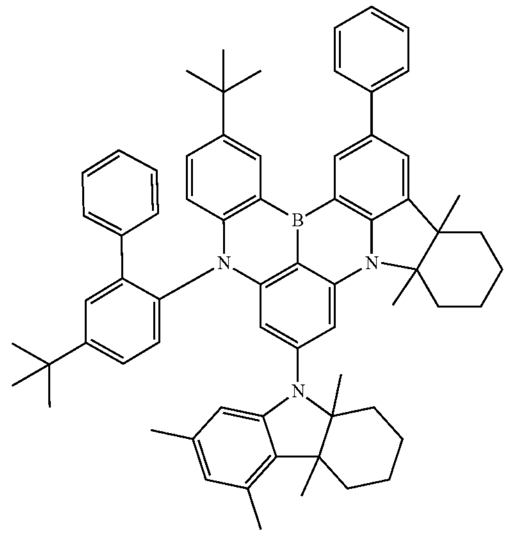
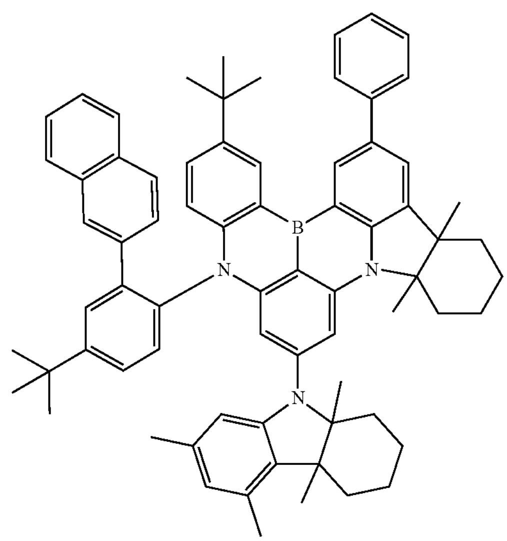
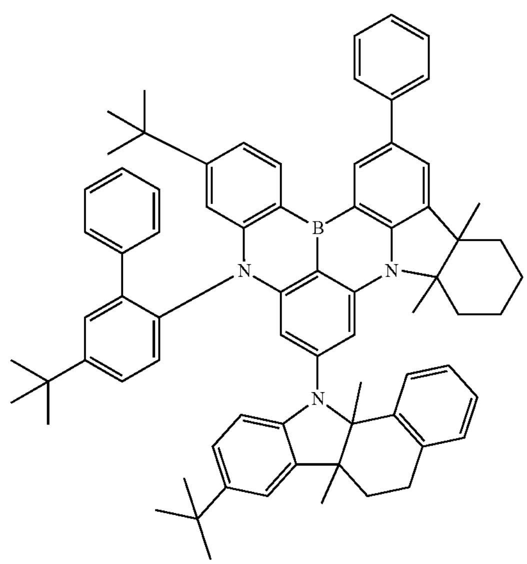

-continued
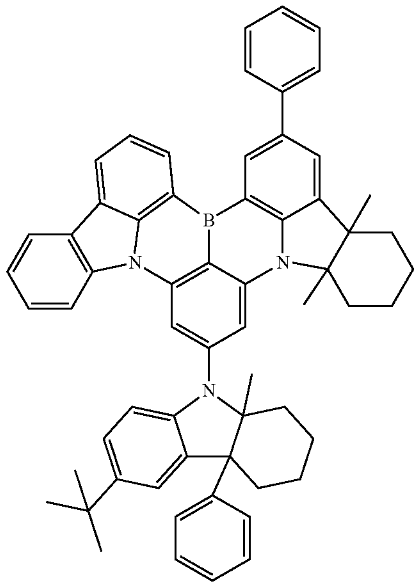
-continued
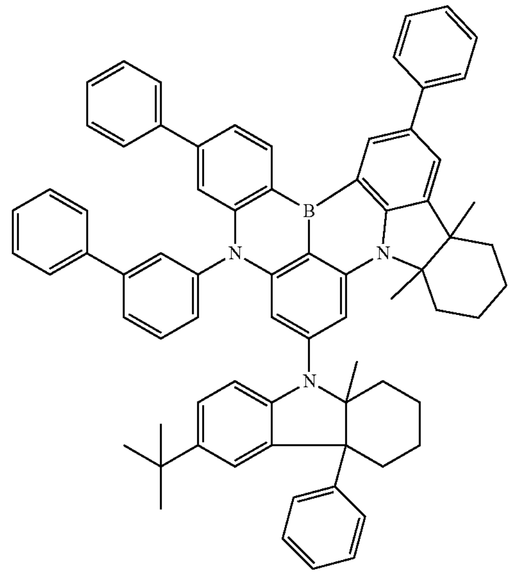
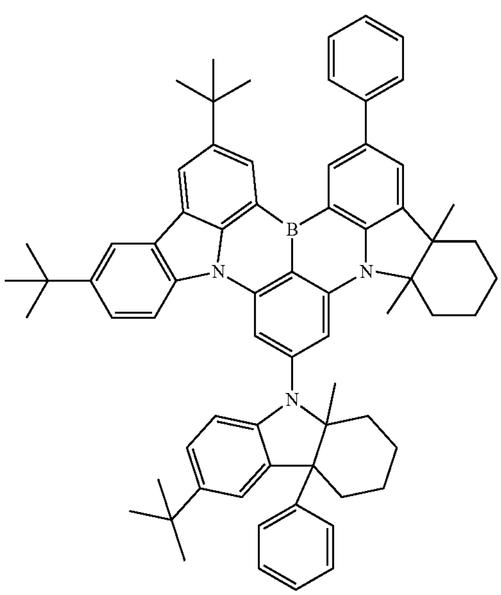
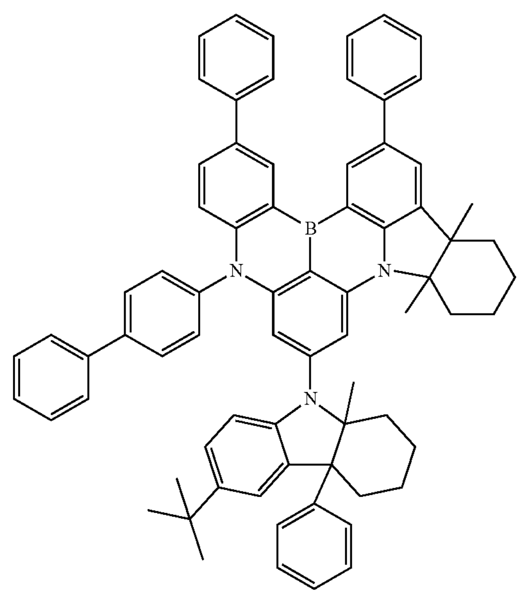

-continued
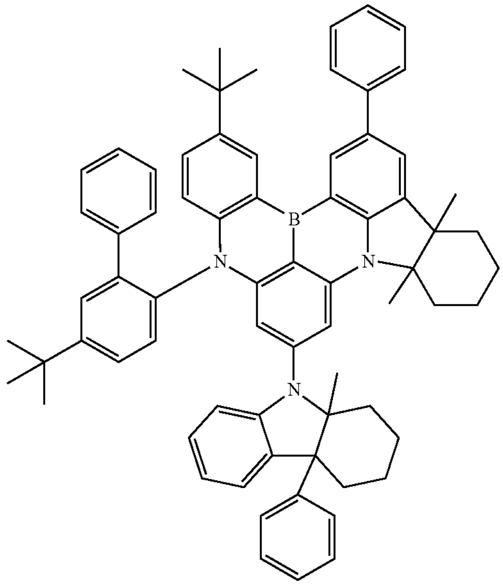
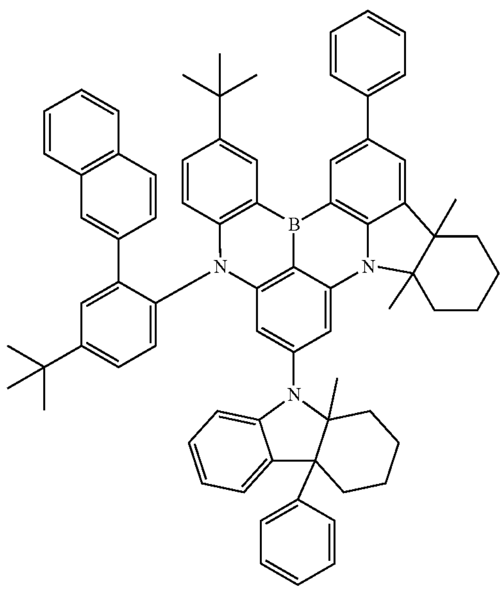
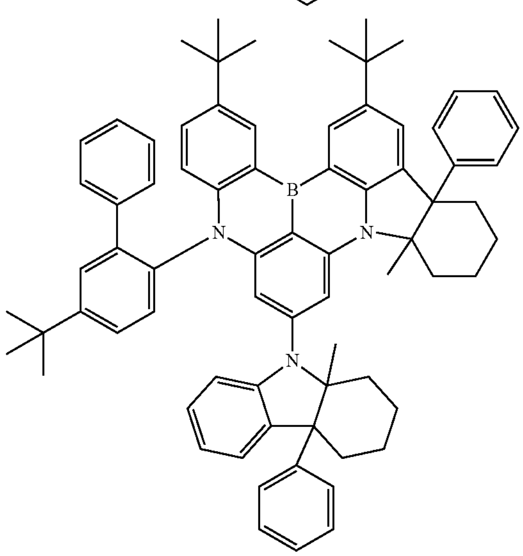
-continued
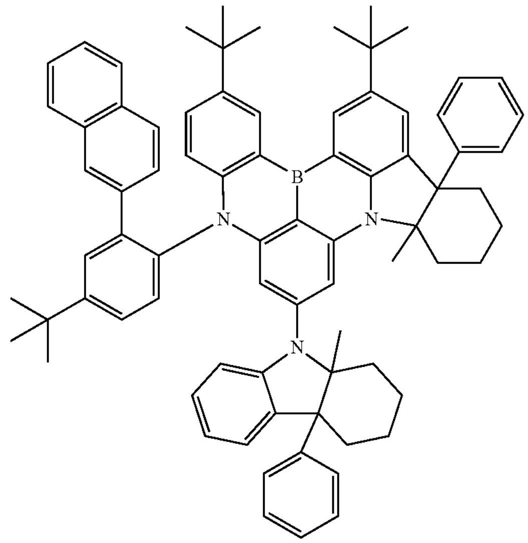
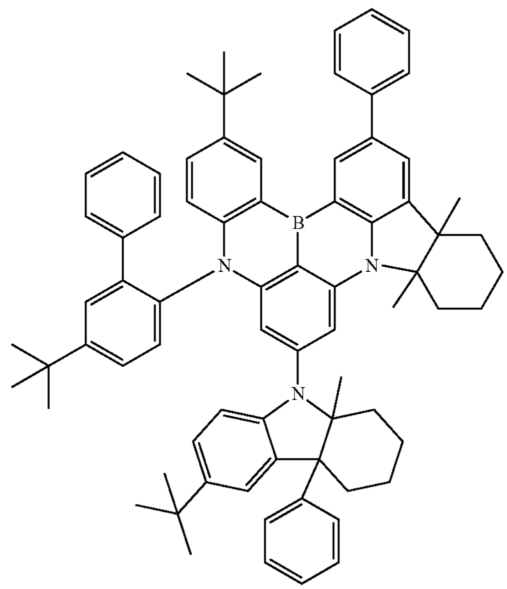
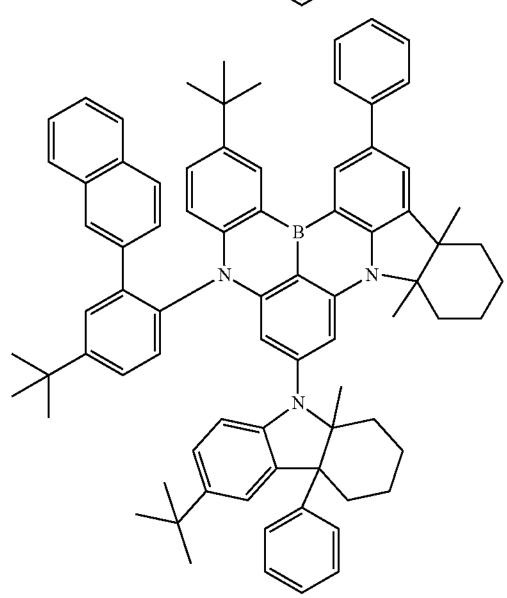

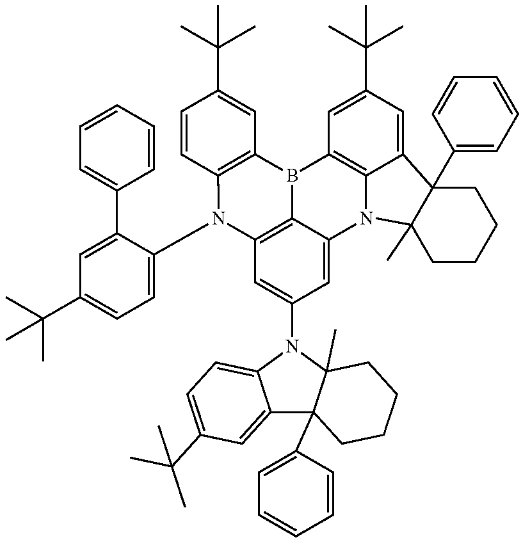
B
N
N
N
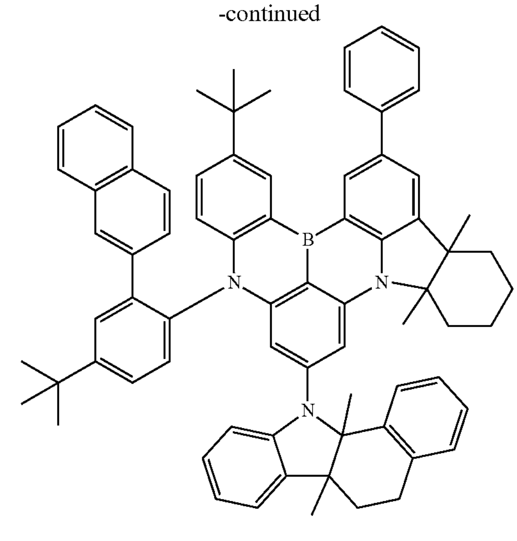
B
N
N
N
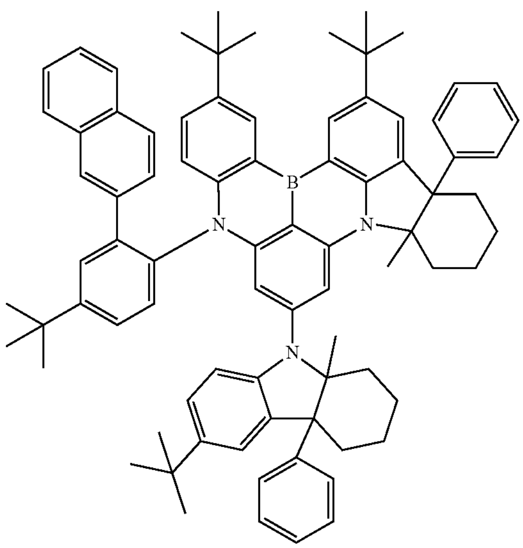
B
N
N
N
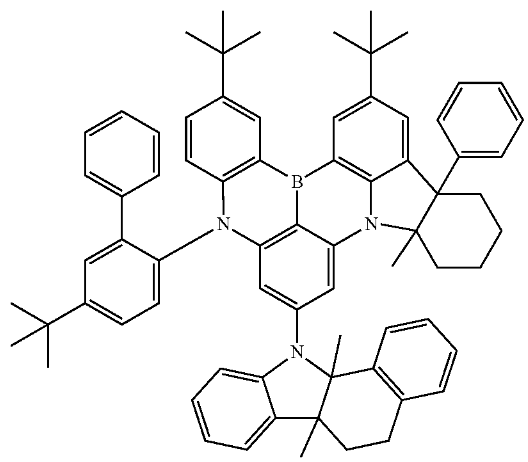
B
N
N
N
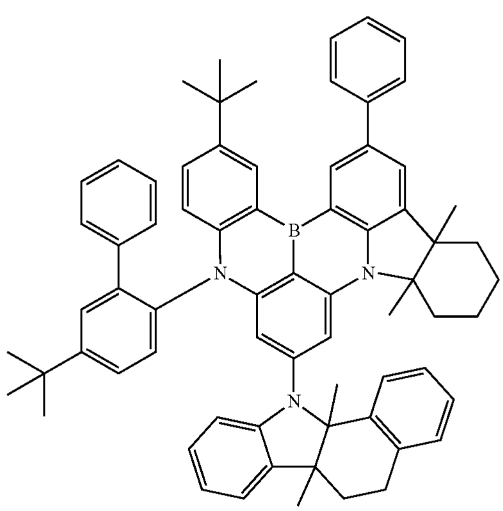
B
N
N
N
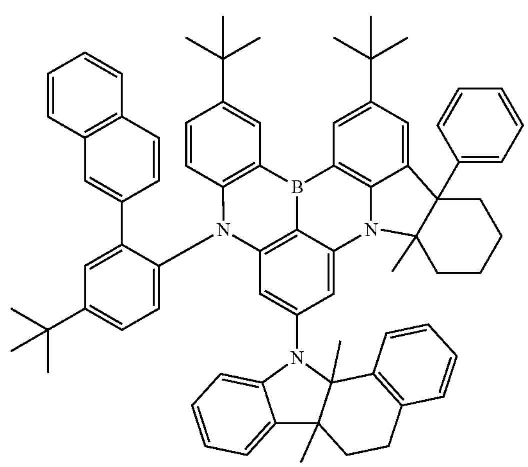
B
N
N
N -continued
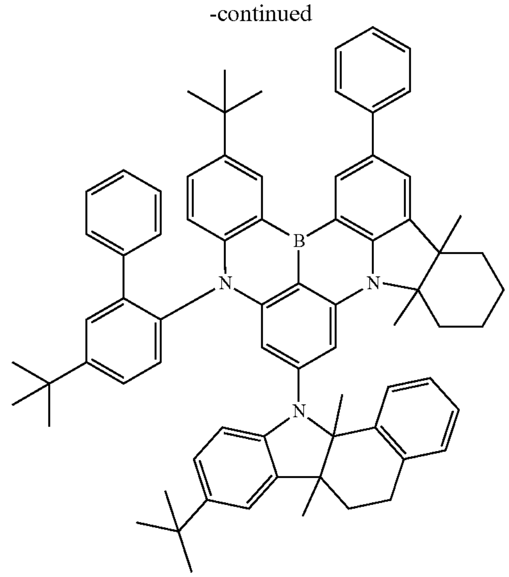
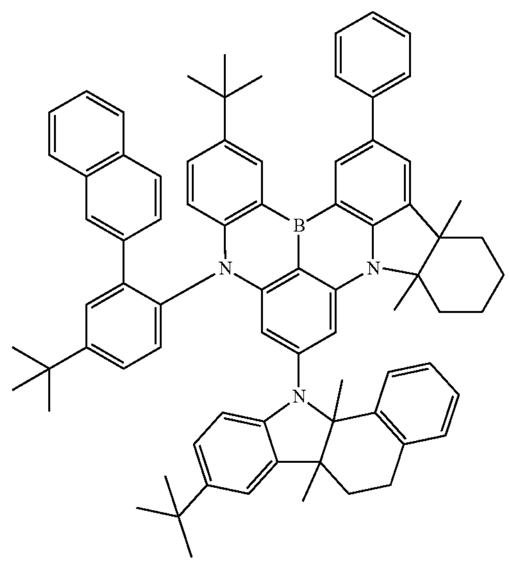
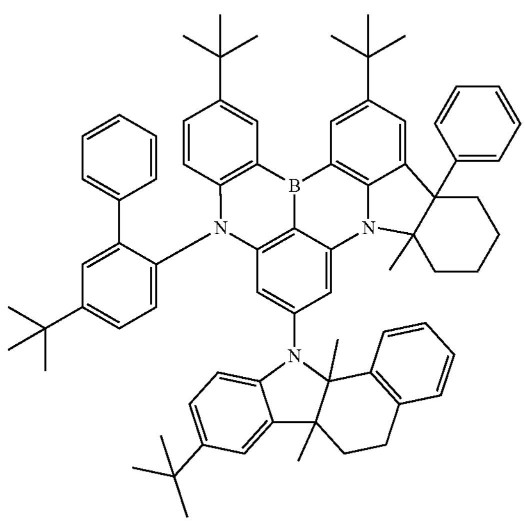
-continued
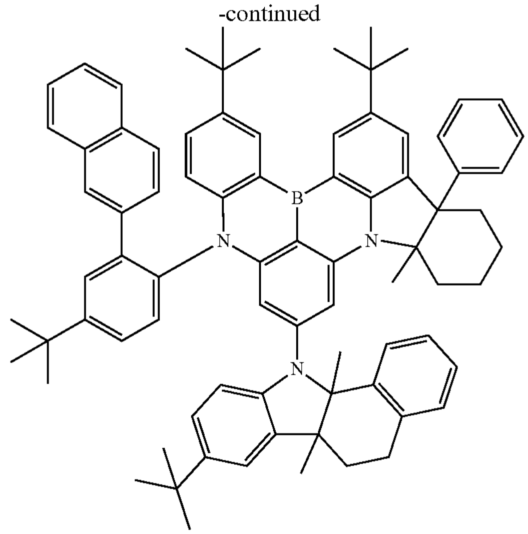
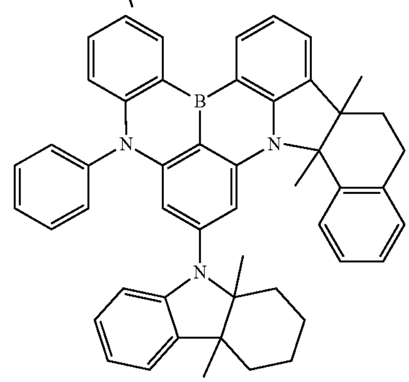
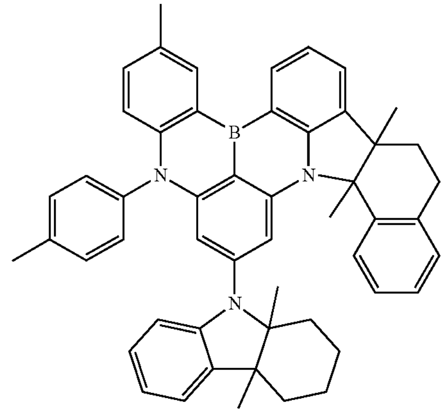
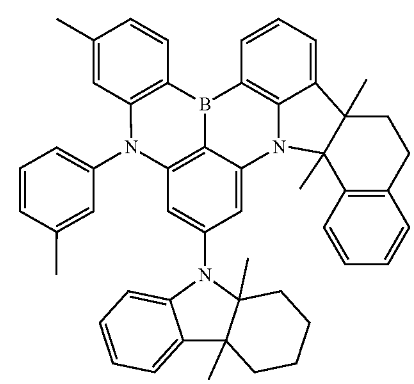

-continued
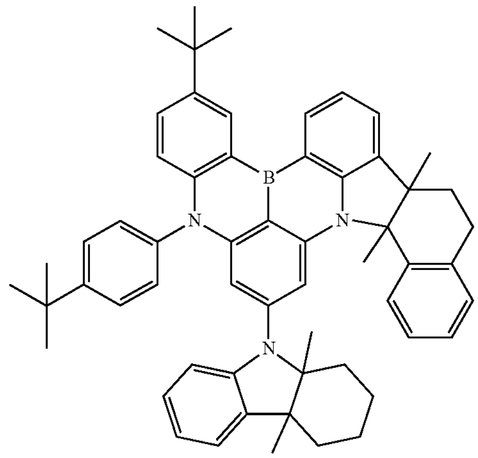
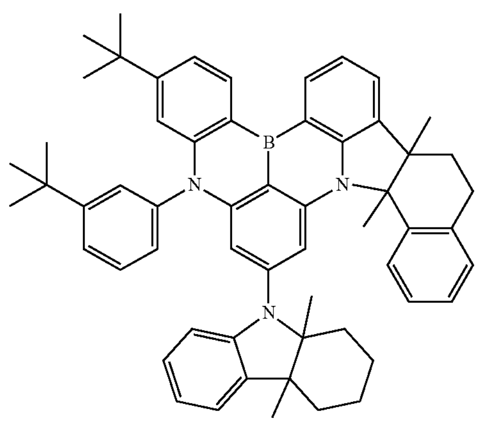
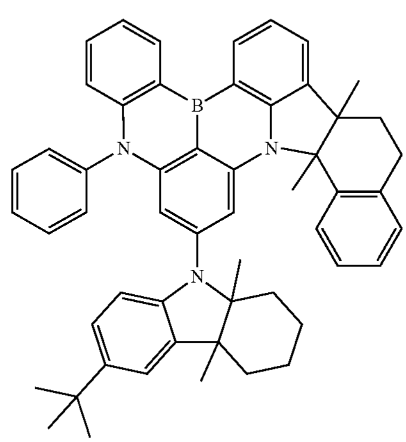
-continued
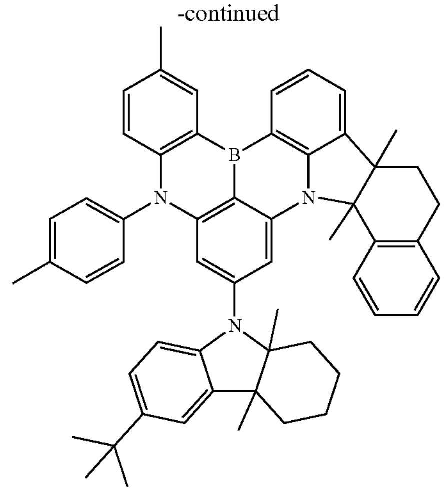
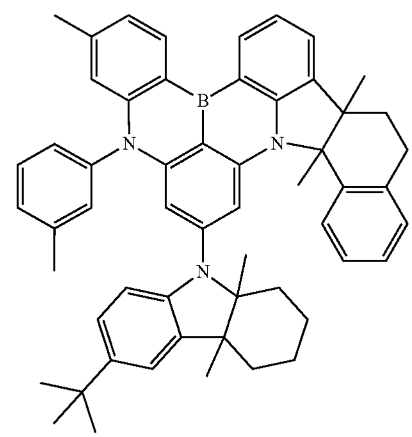
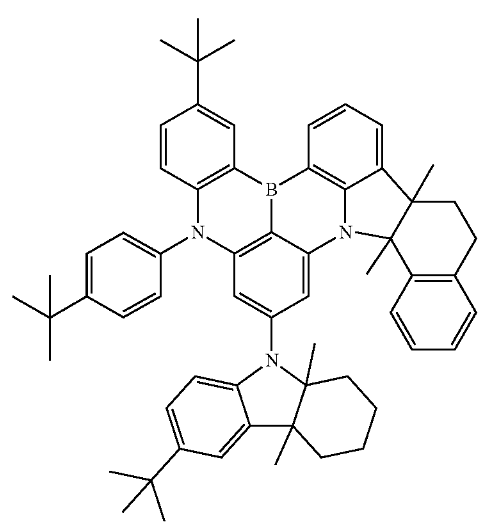

-continued
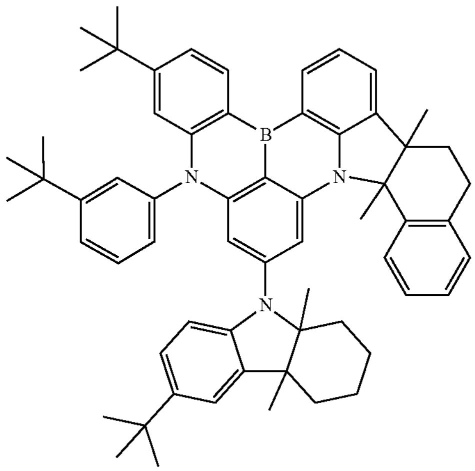
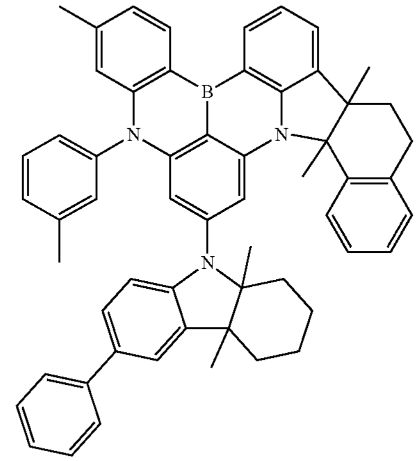
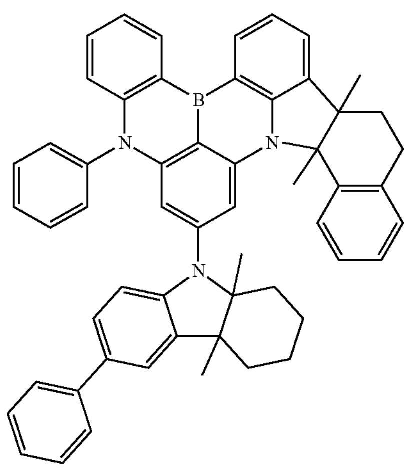
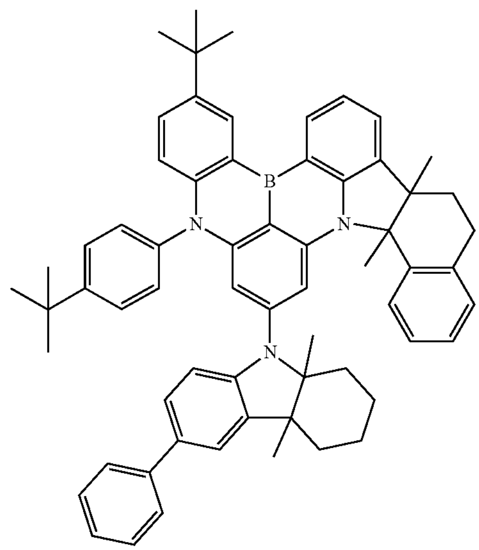
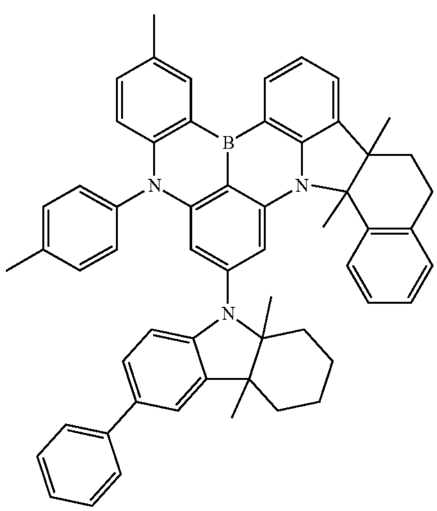
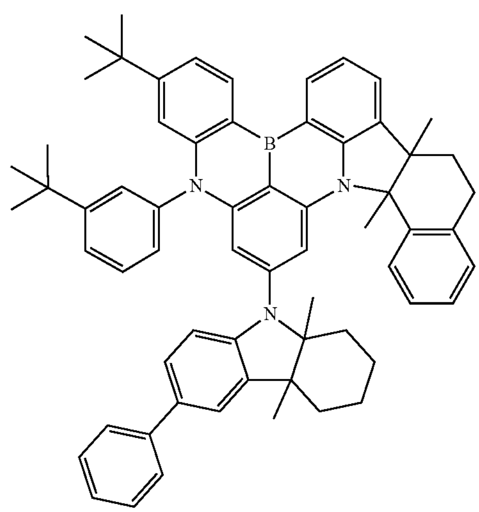
-continued

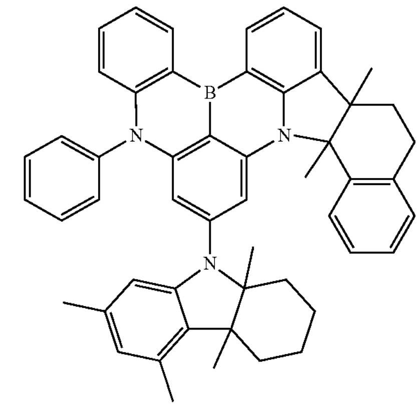
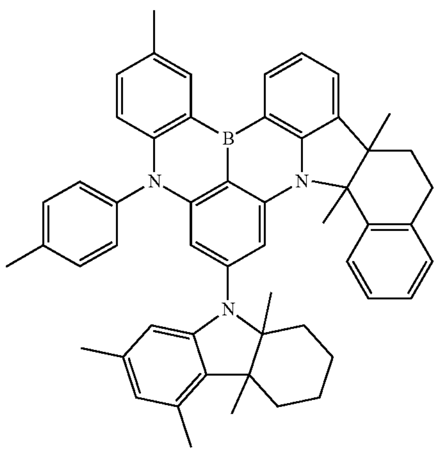
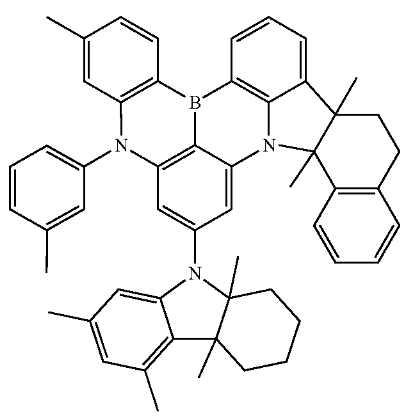
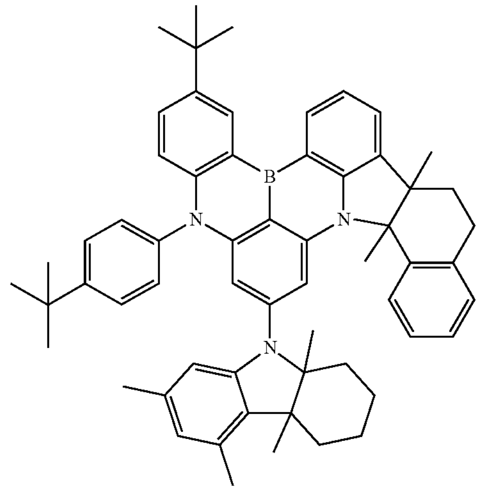
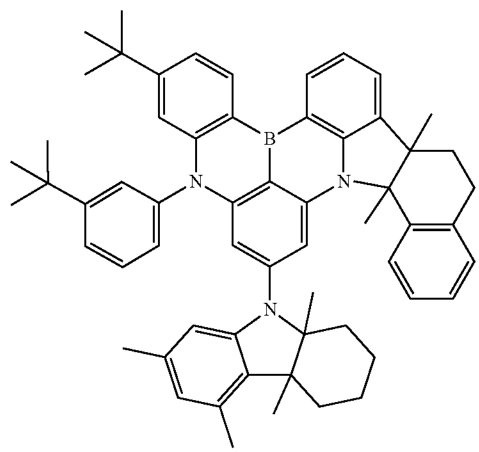
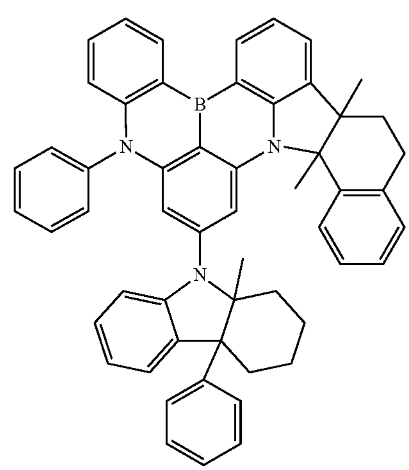

-continued
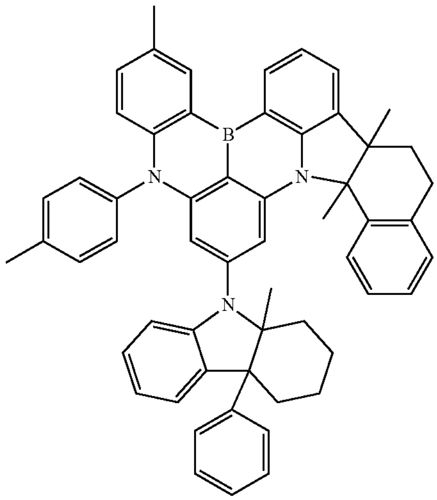
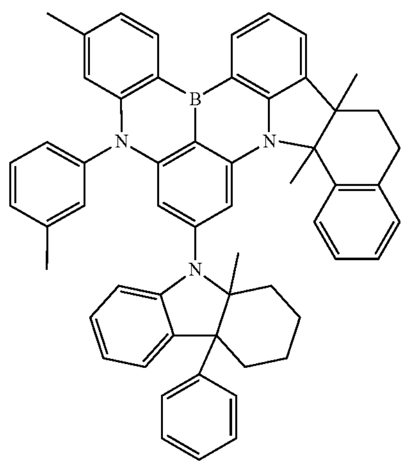
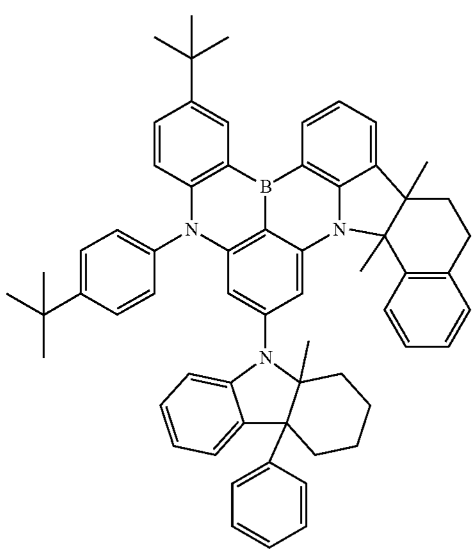
-continued
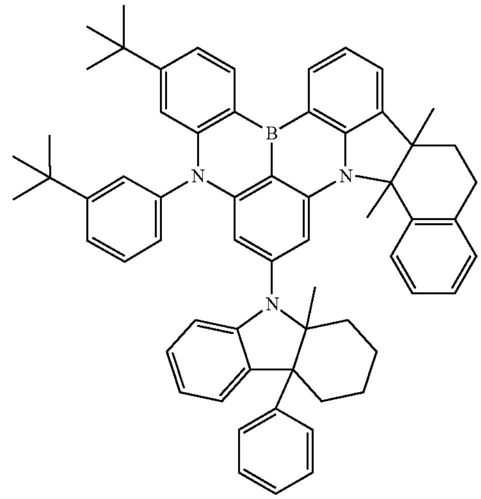
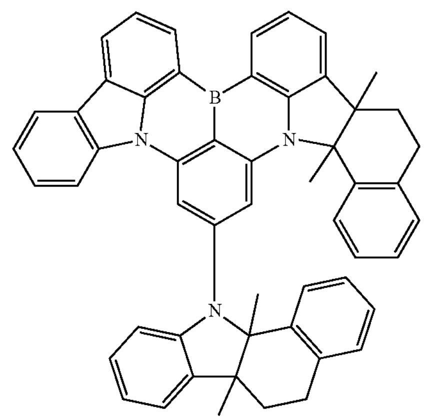
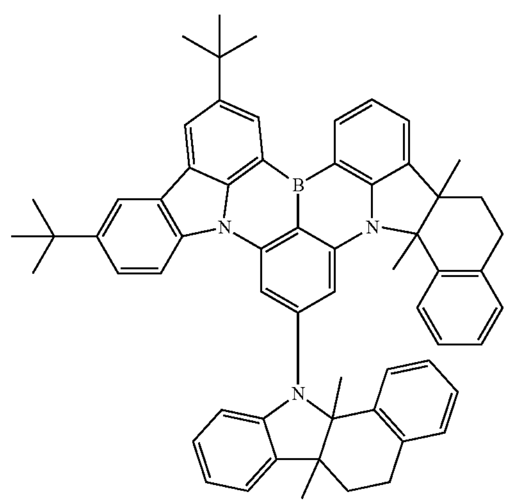

-continued
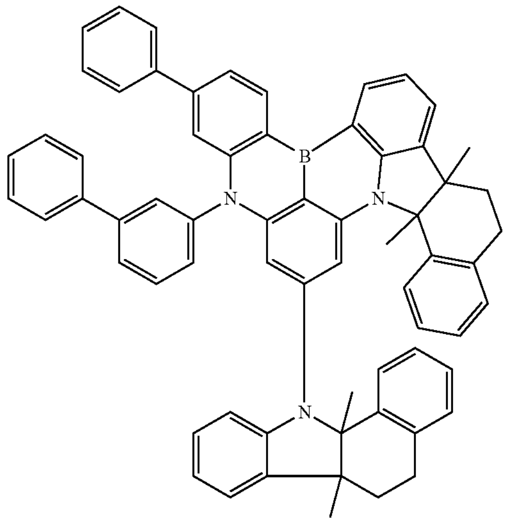
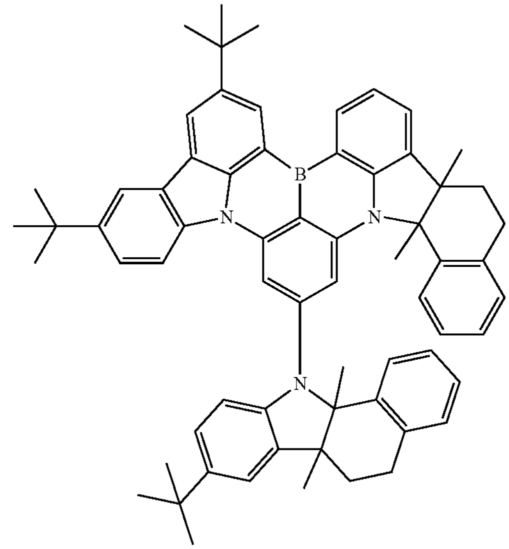
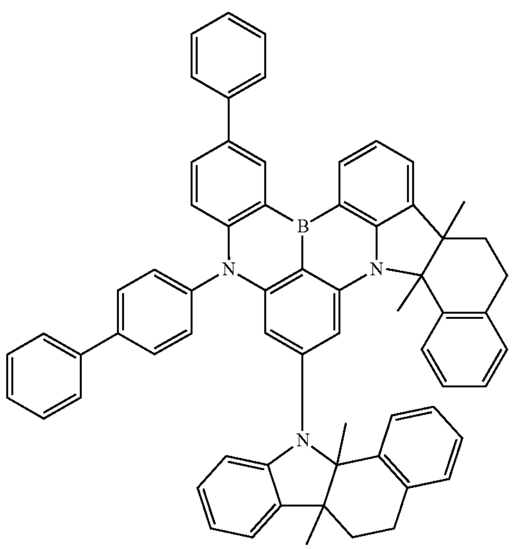
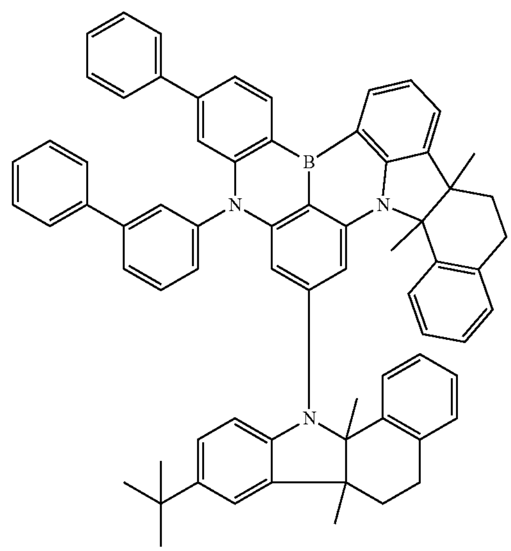
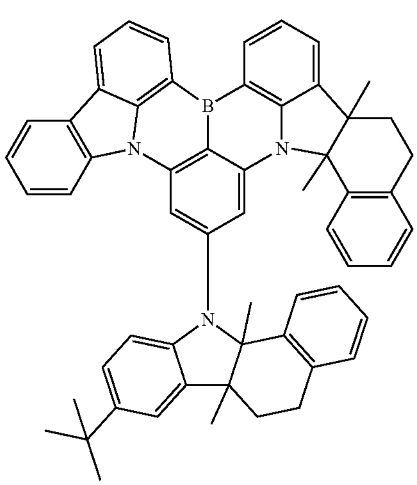
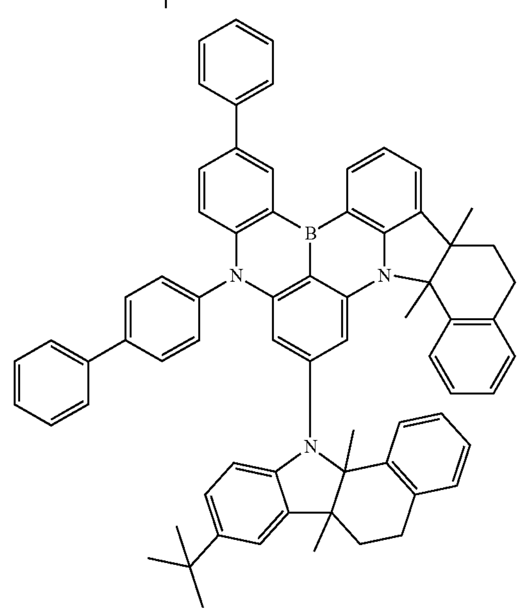

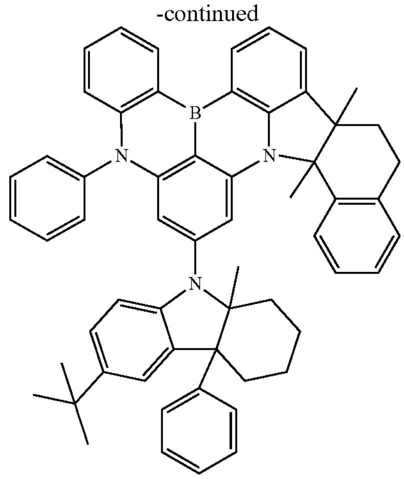
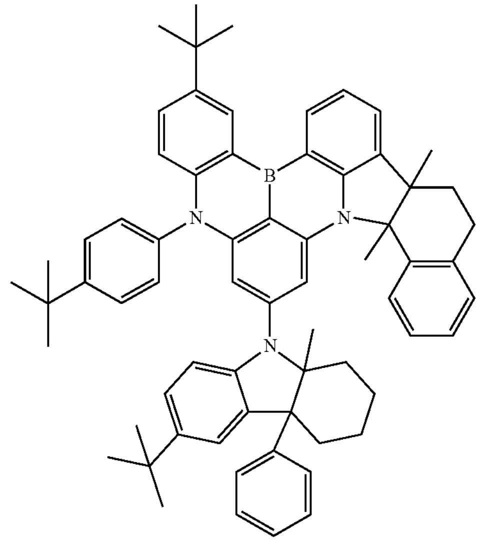
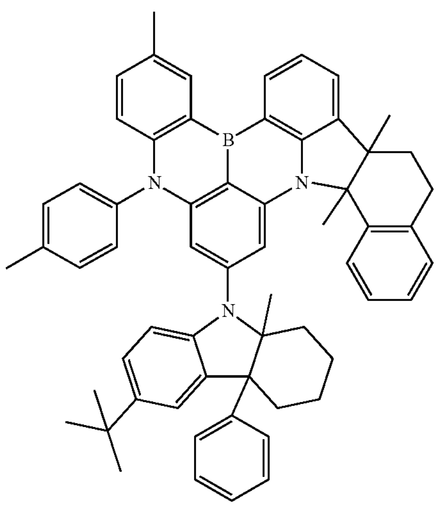
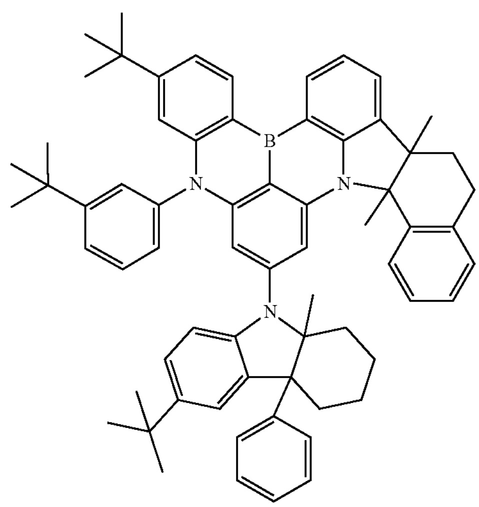
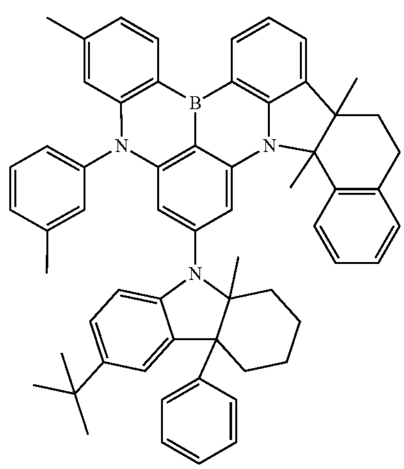
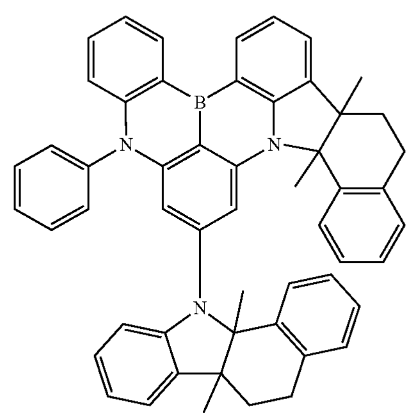
B
N
N
N

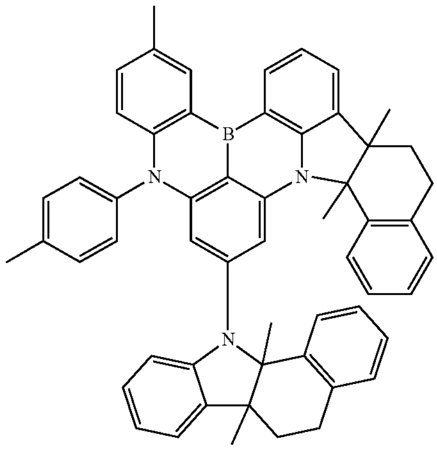
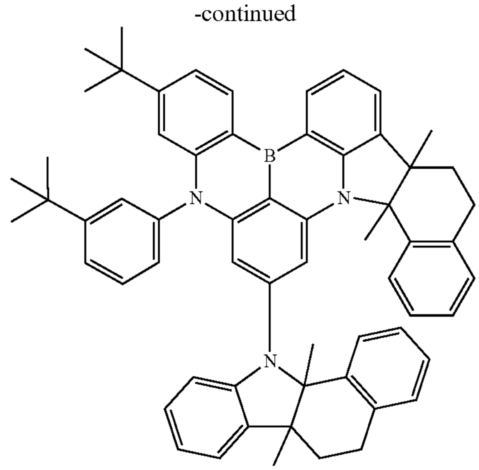
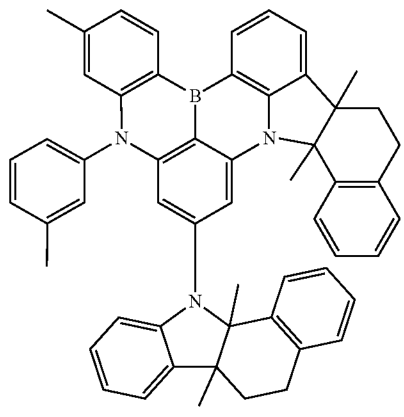
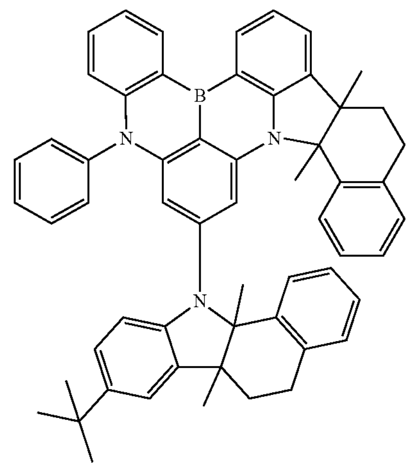
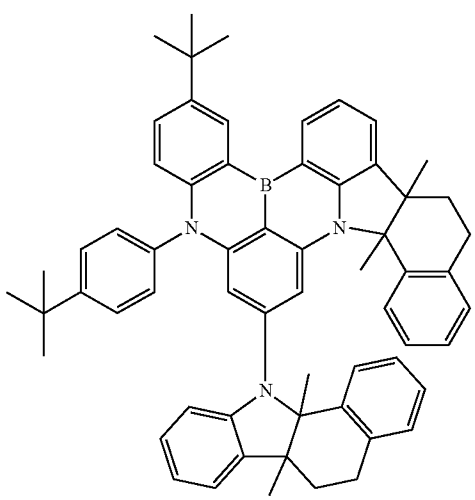
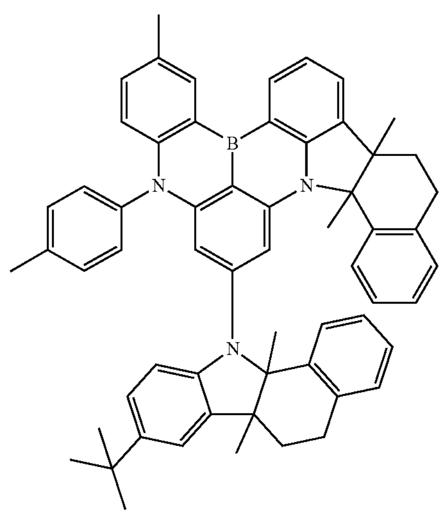

-continued
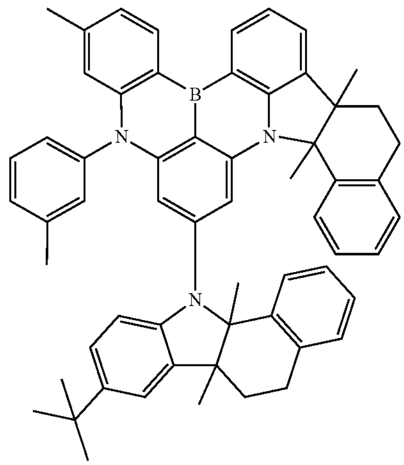
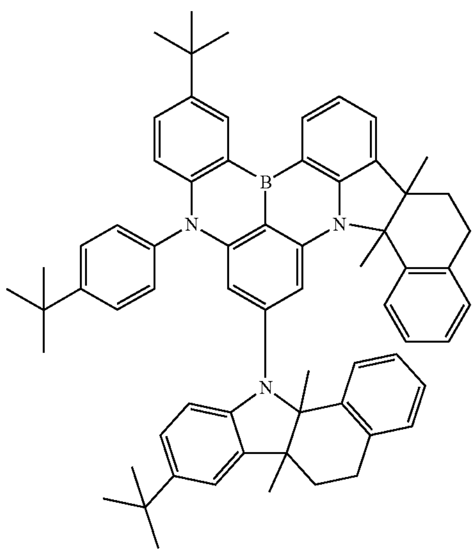
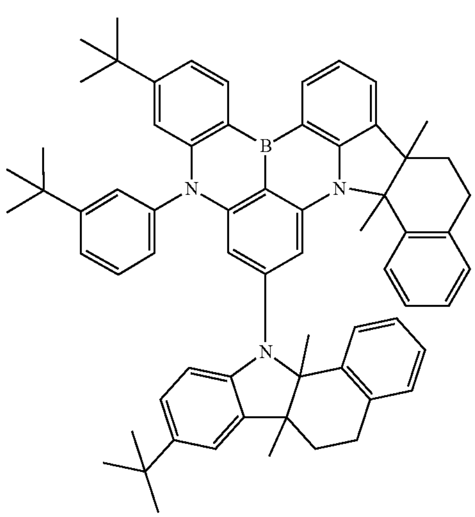
-continued
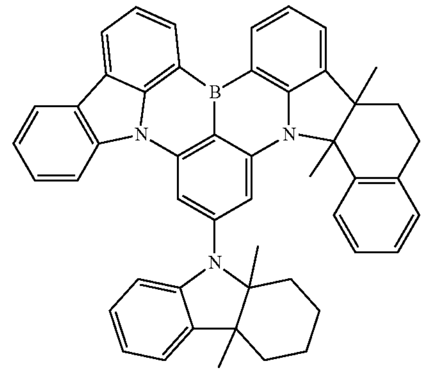
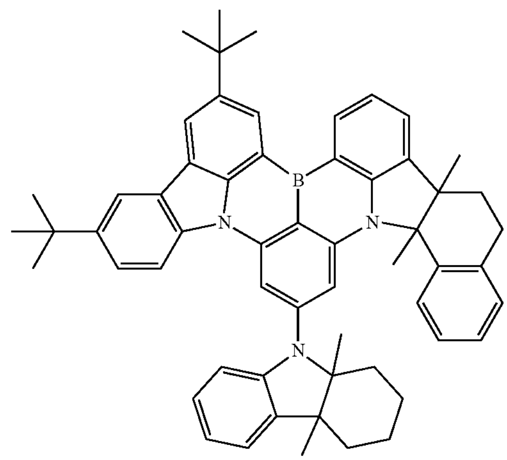
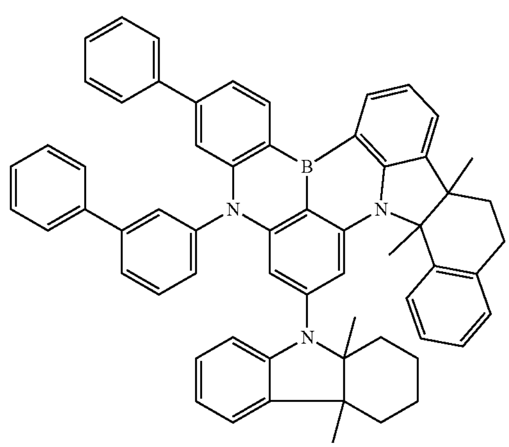

-continued
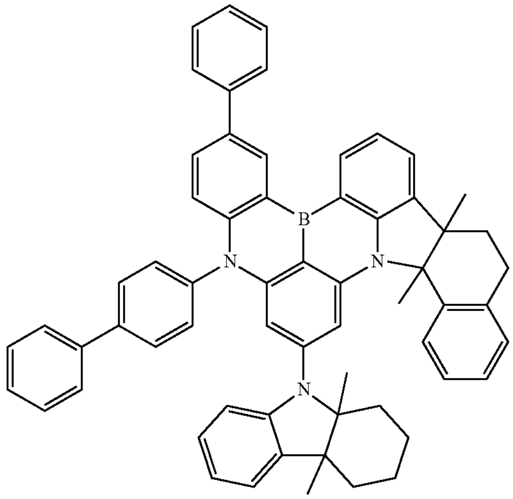
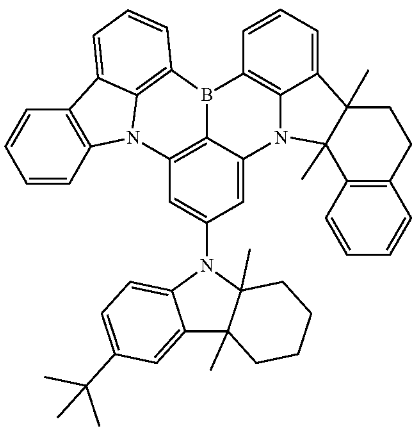
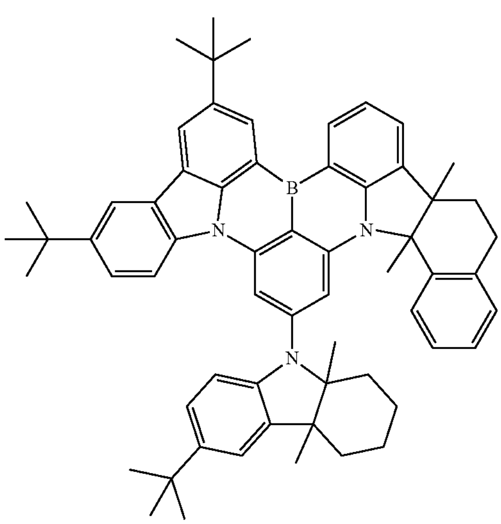
-continued
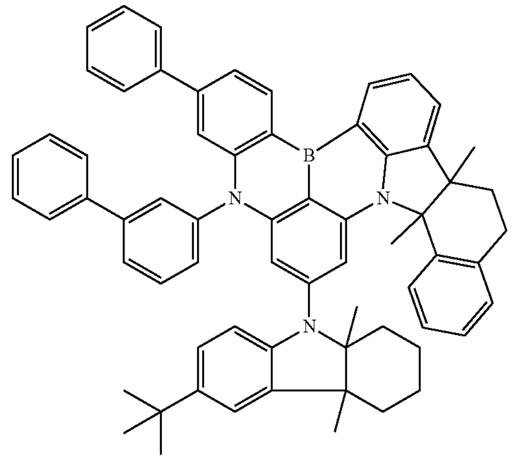
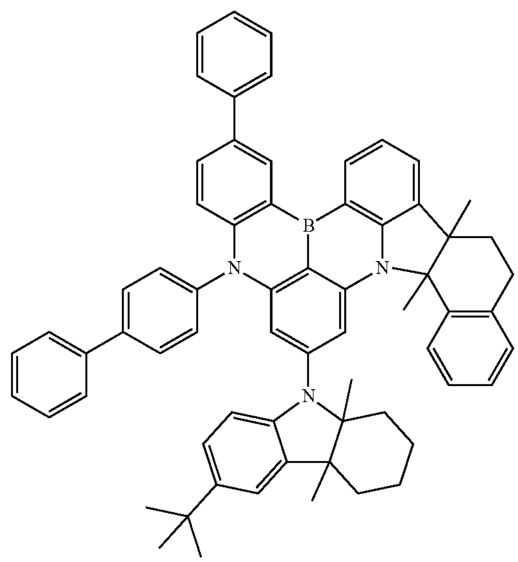
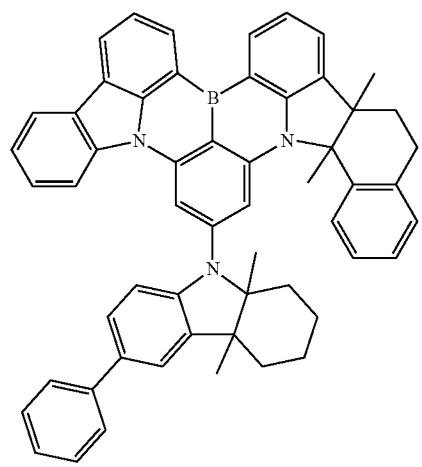

-continued
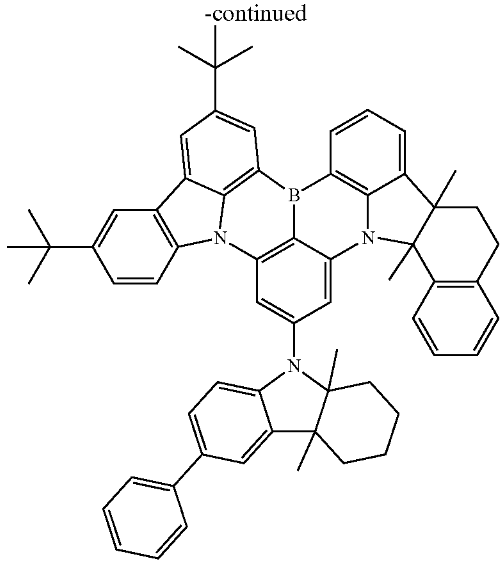
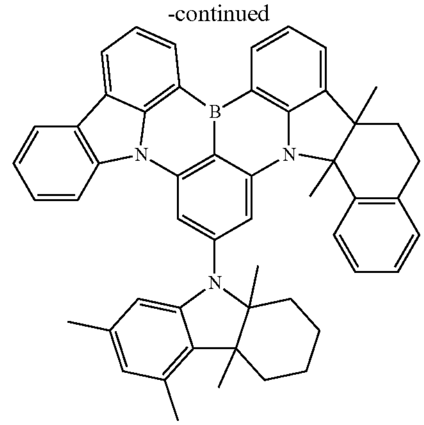
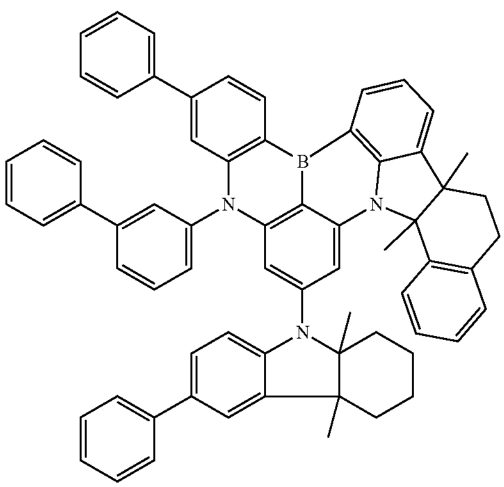
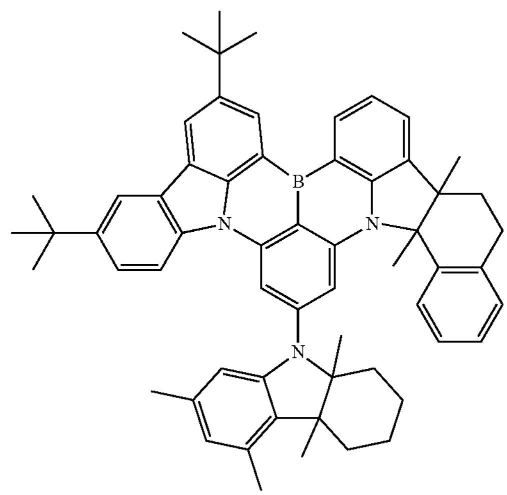
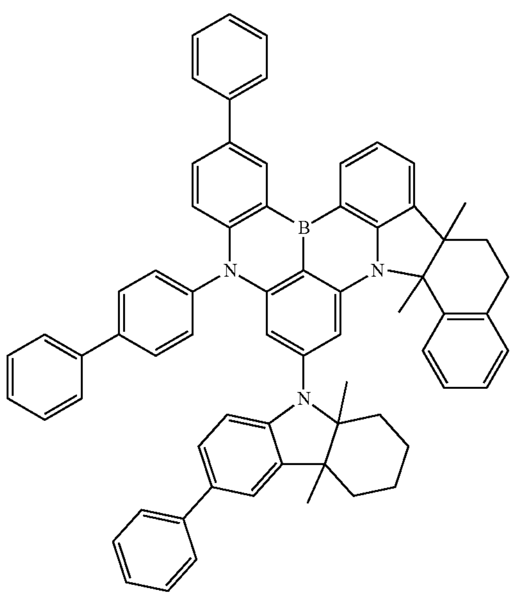
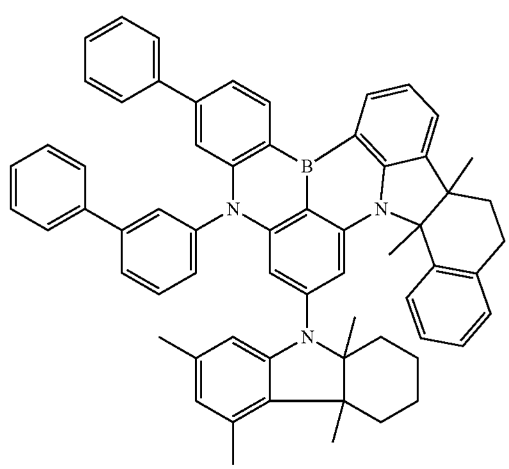
-continued -continued
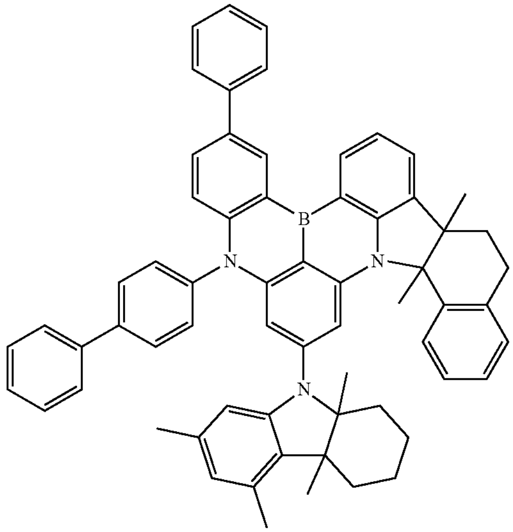
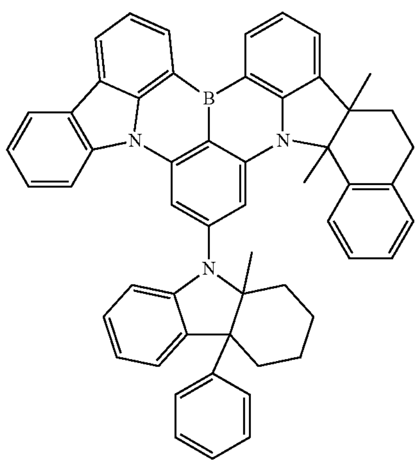
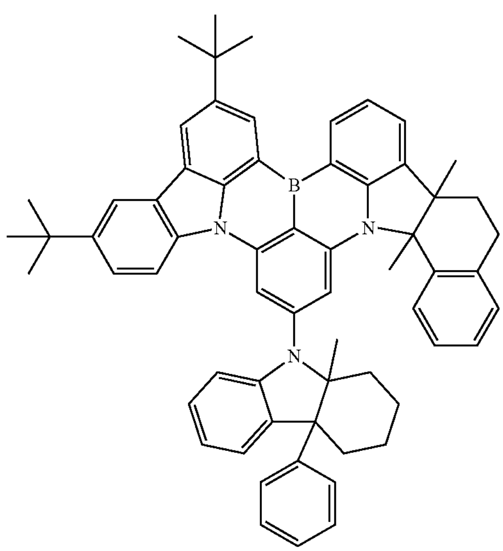
-continued
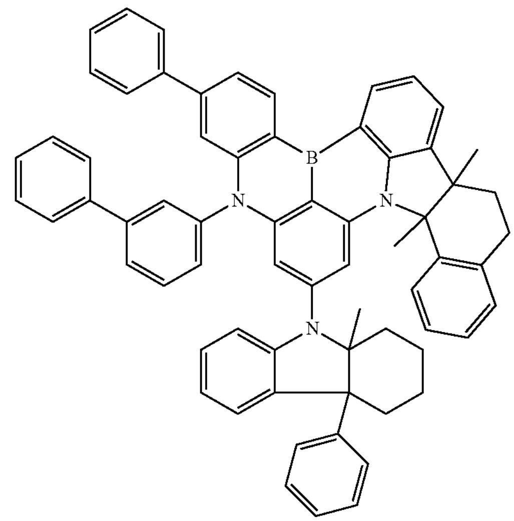
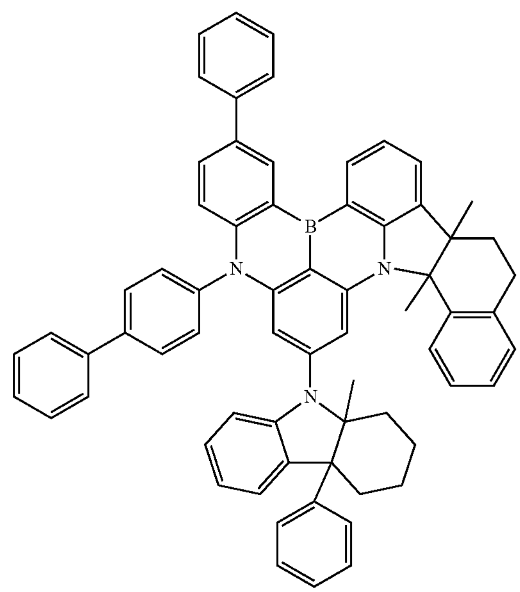
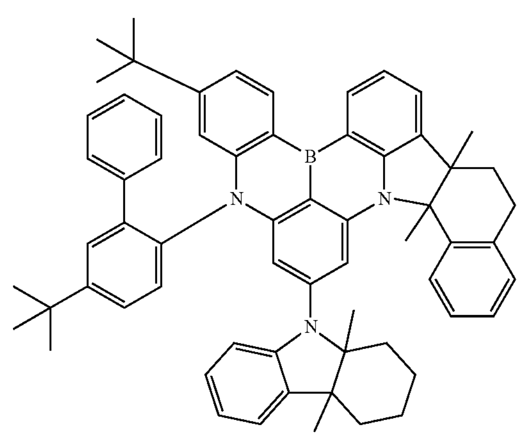

-continued
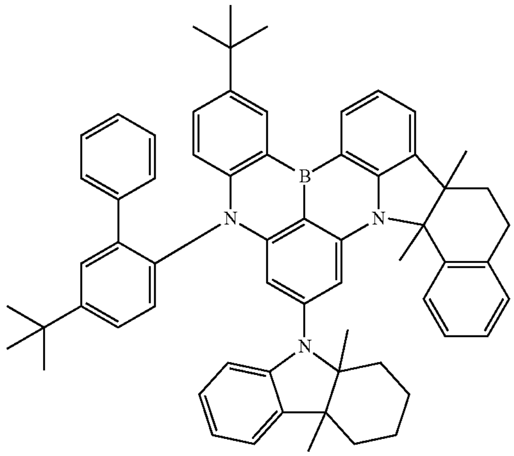
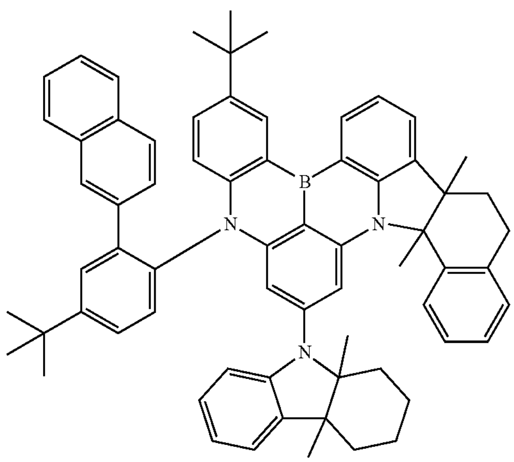
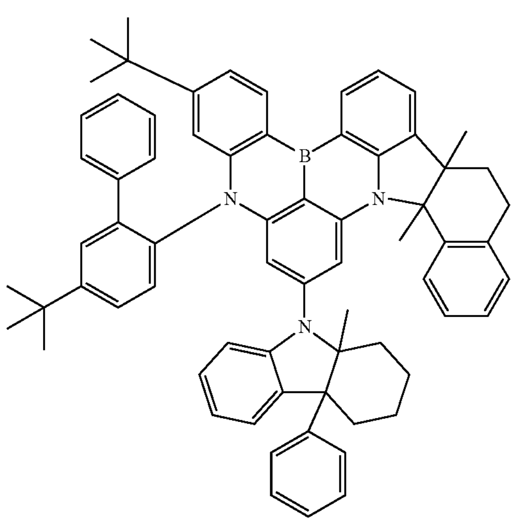
-continued
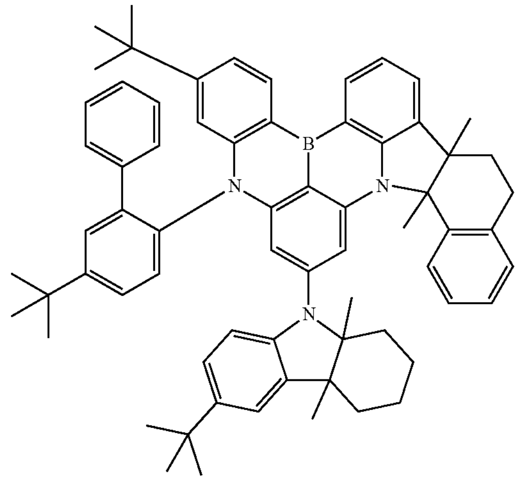
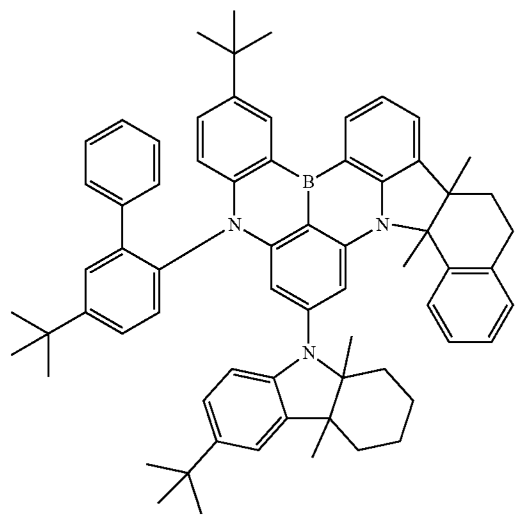
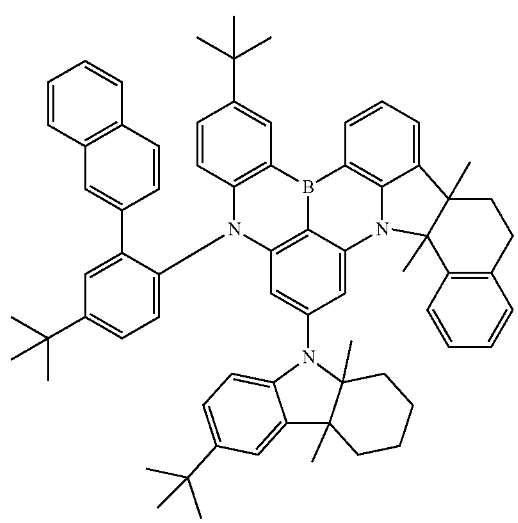

-continued
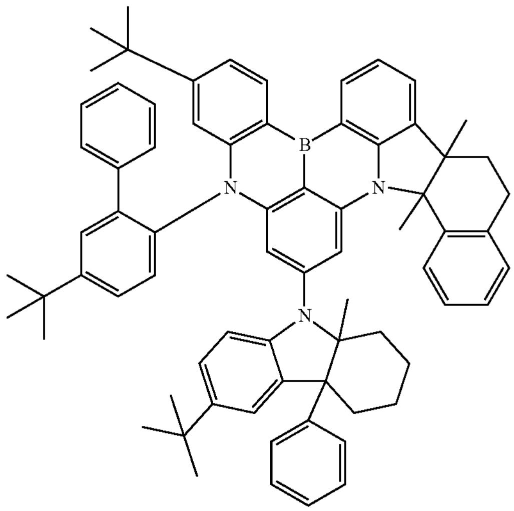
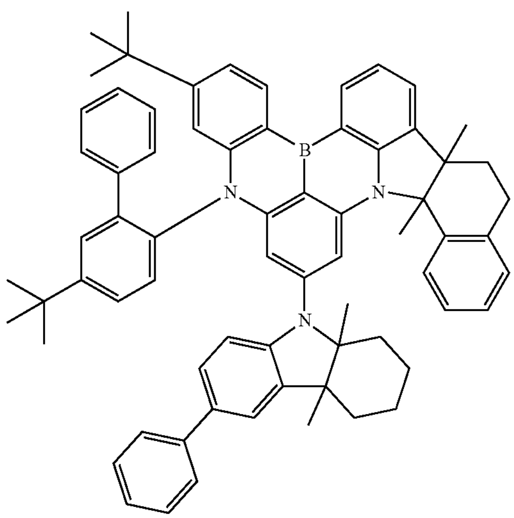
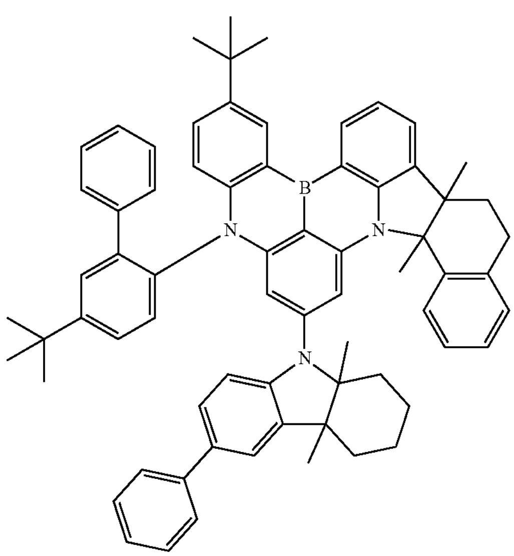
-continued
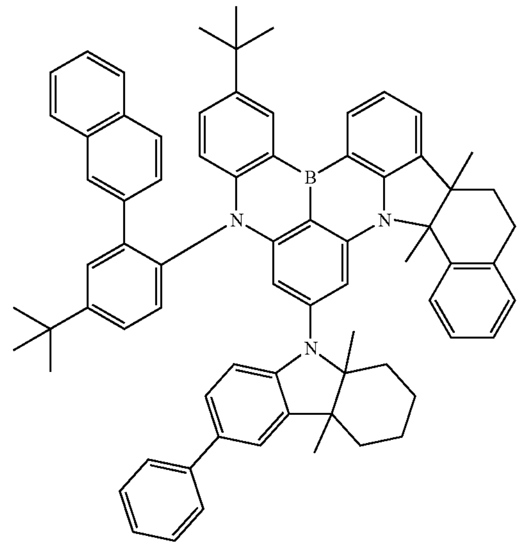
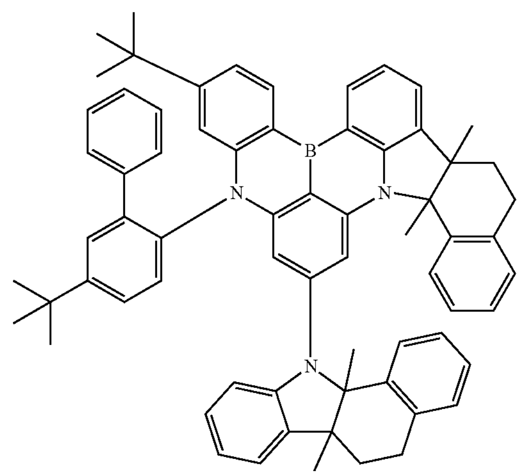
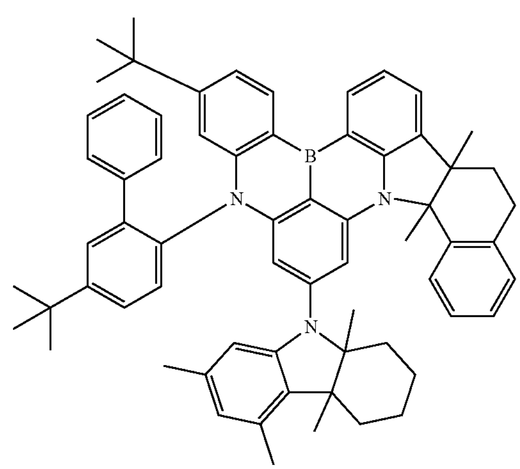

-continued
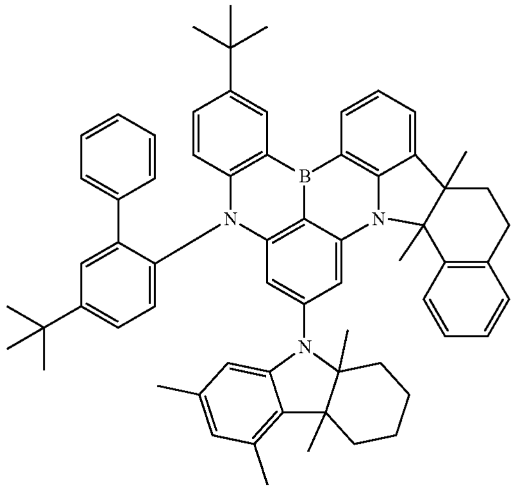
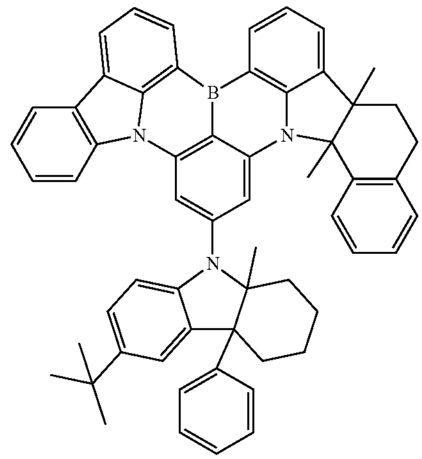
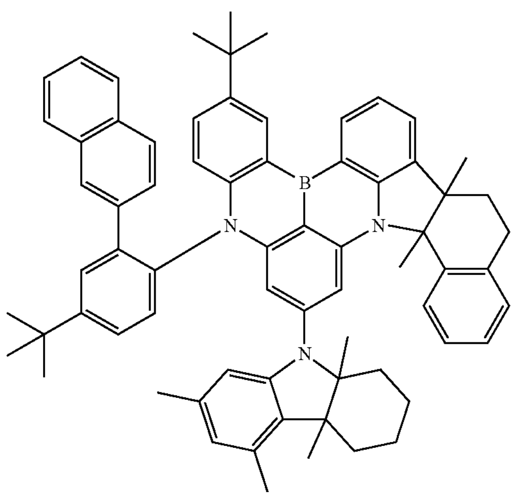
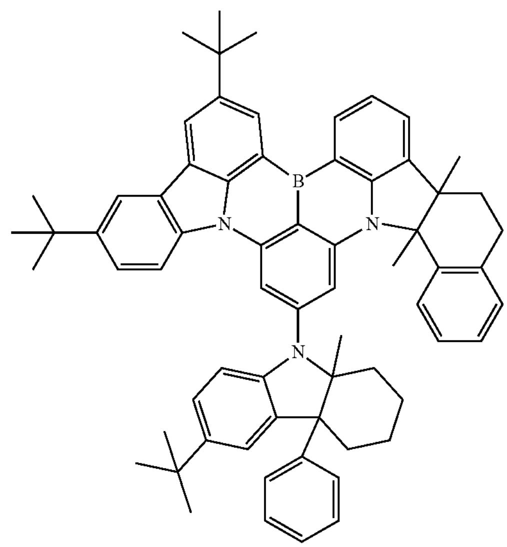
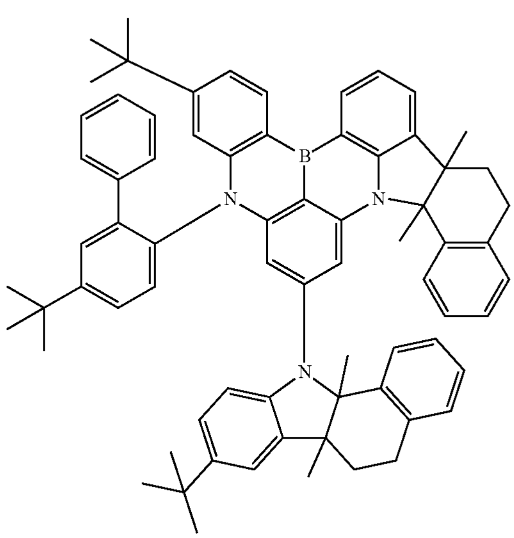
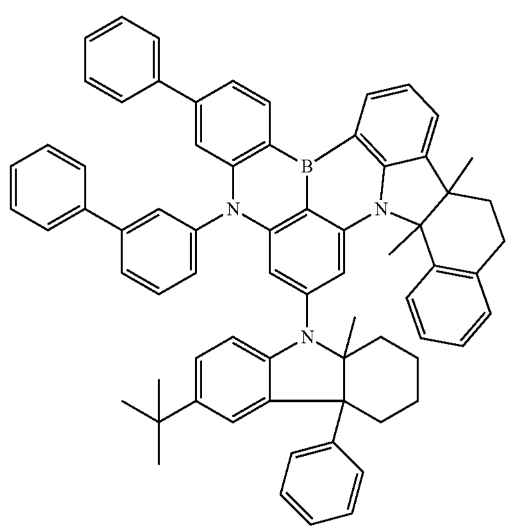

-continued
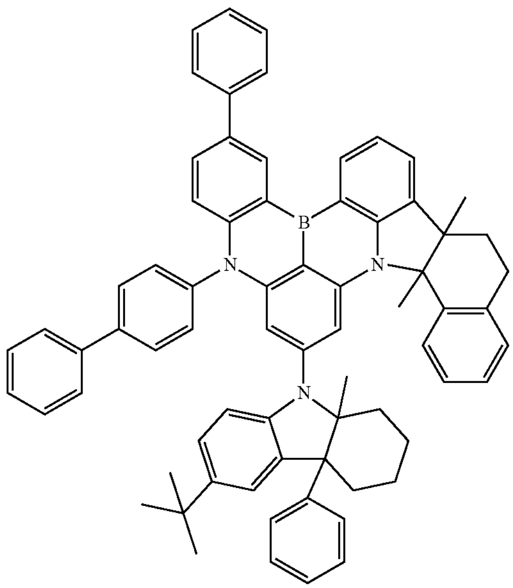
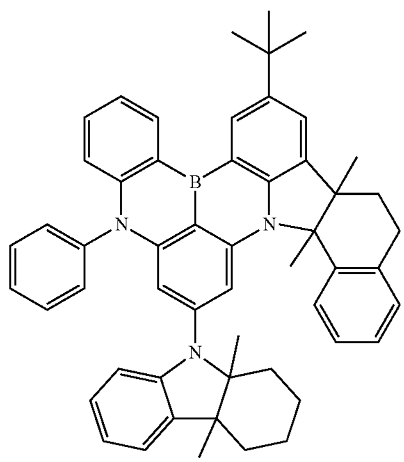
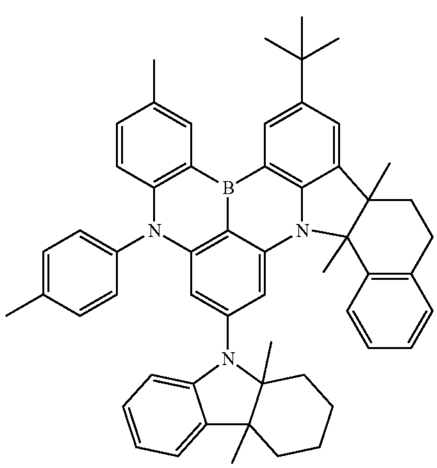
-continued
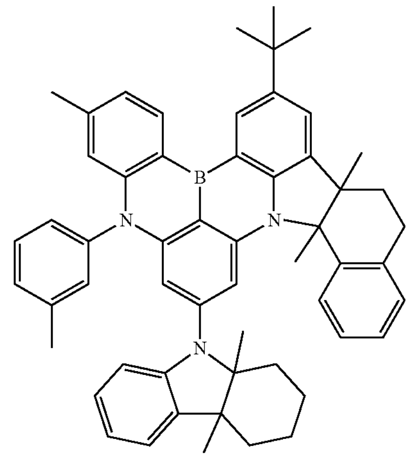
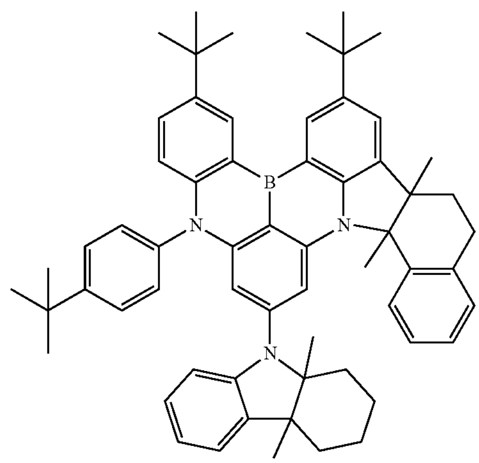
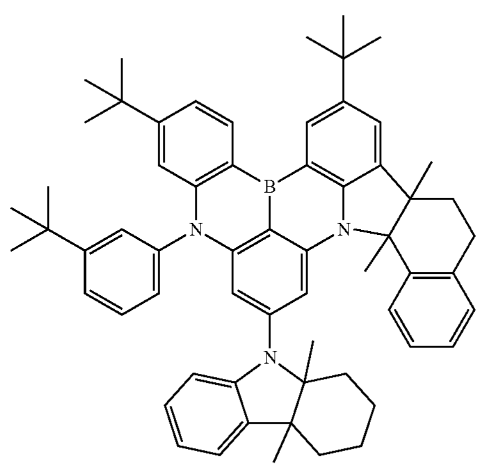

-continued
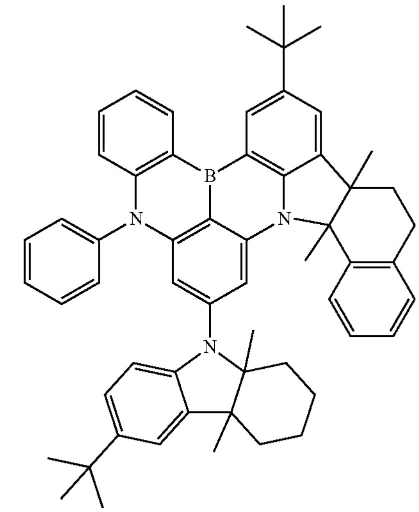
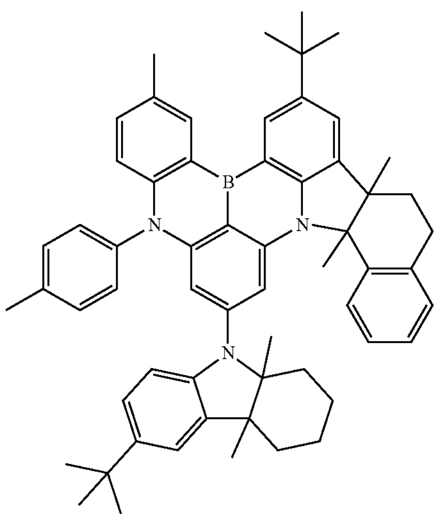
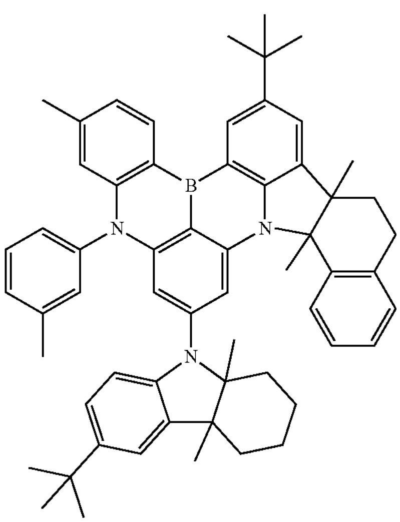
-continued
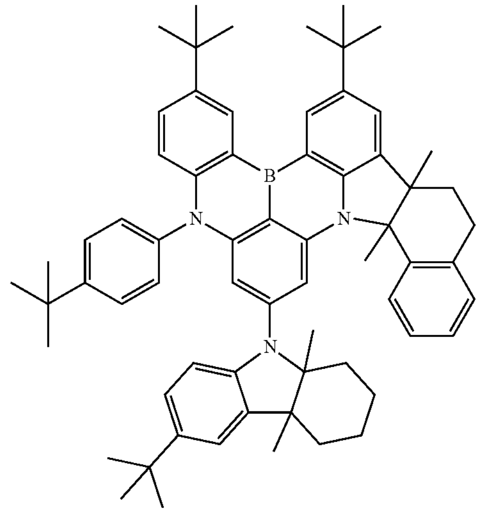
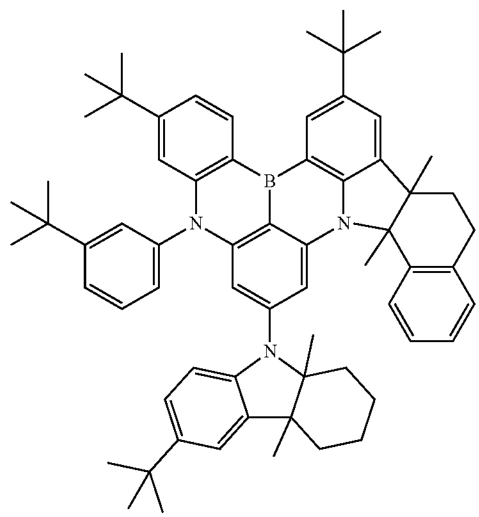
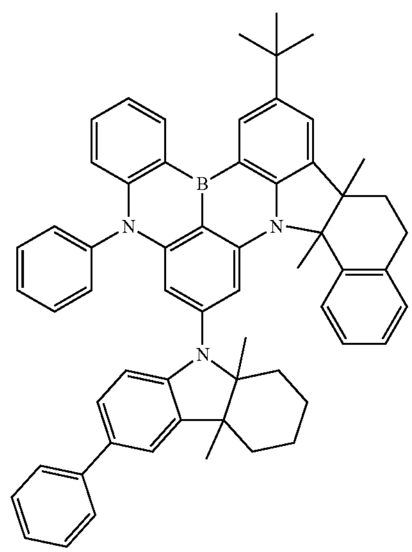

-continued
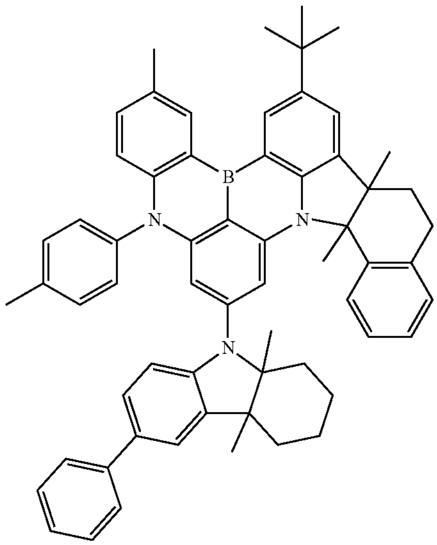
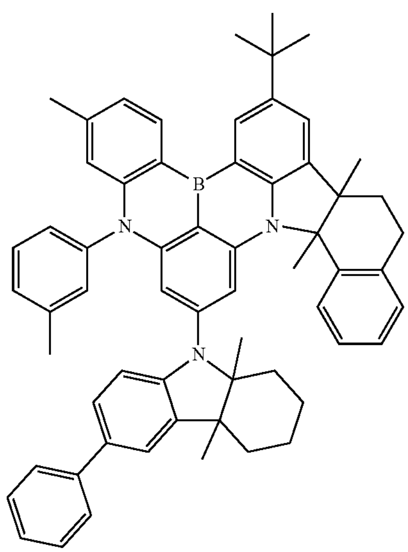
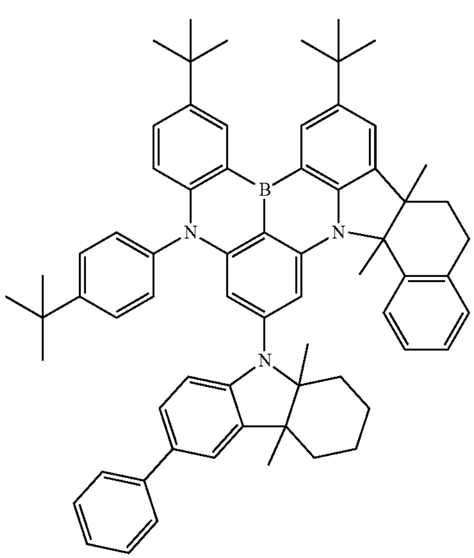
-continued
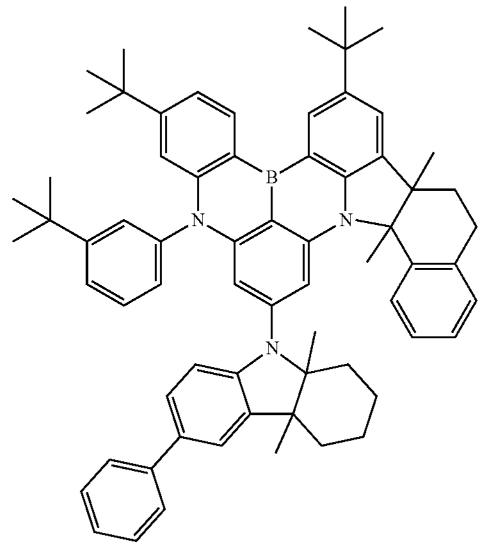
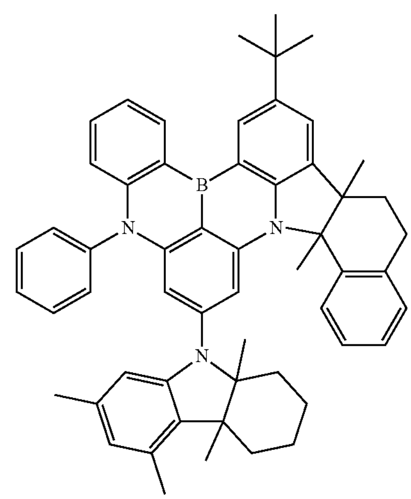
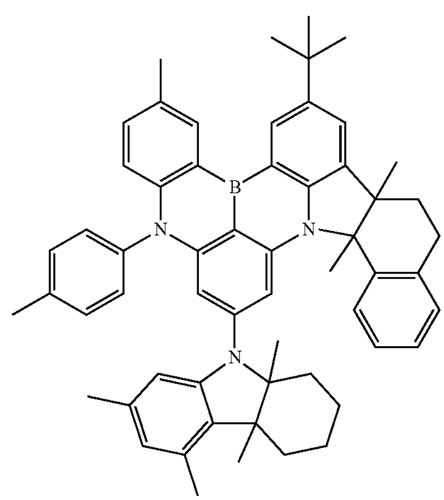

-continued
-continued
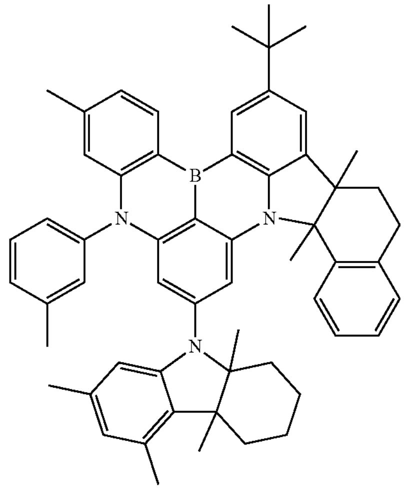
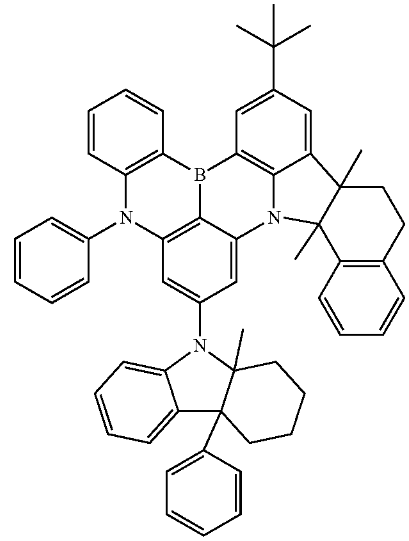
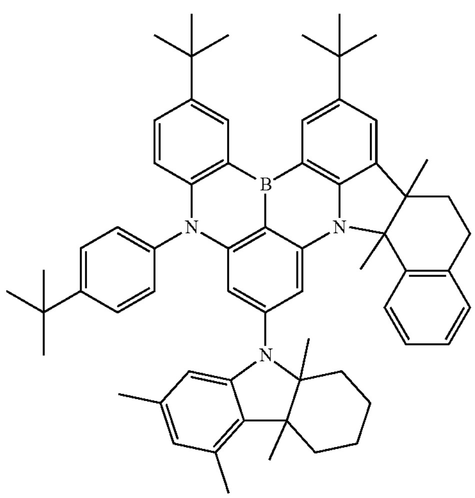
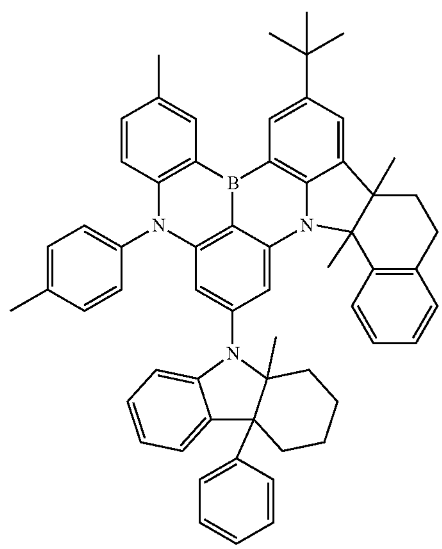
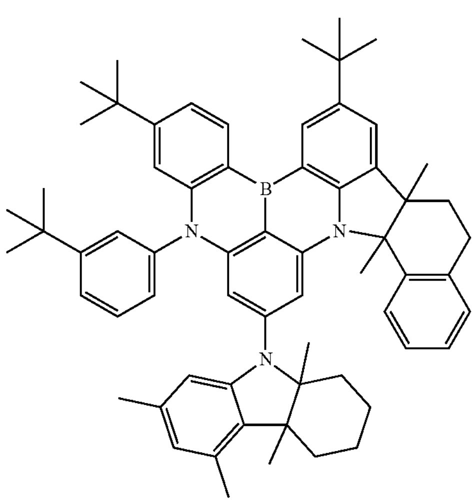
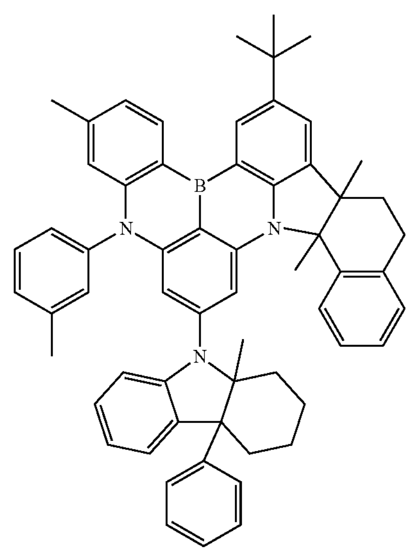

-continued
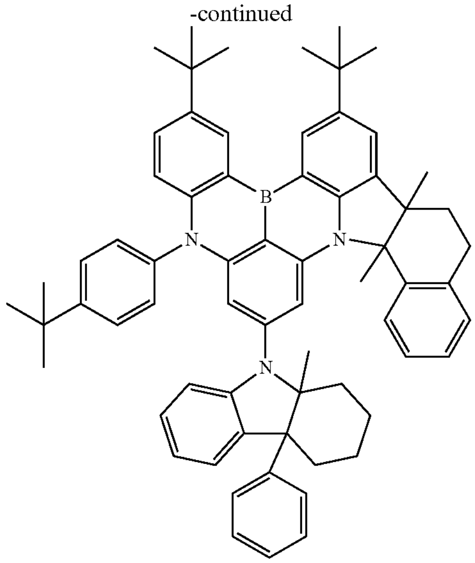
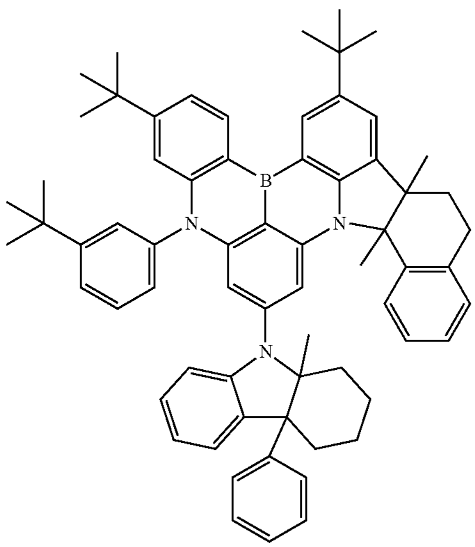
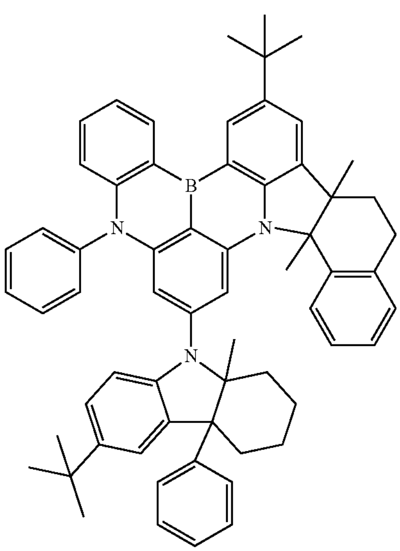
-continued
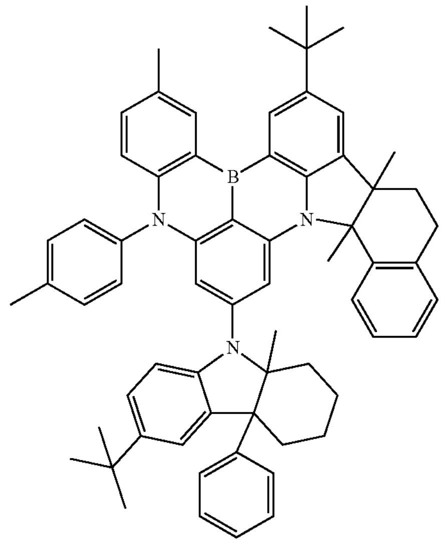
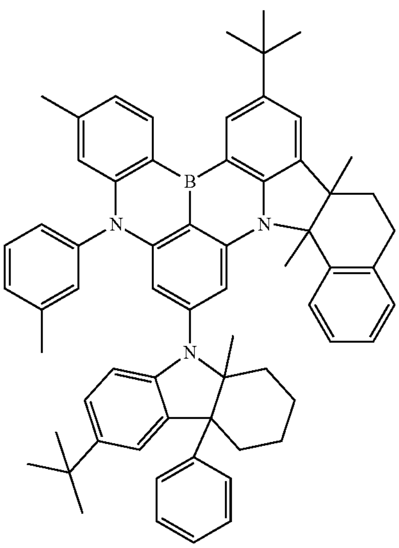
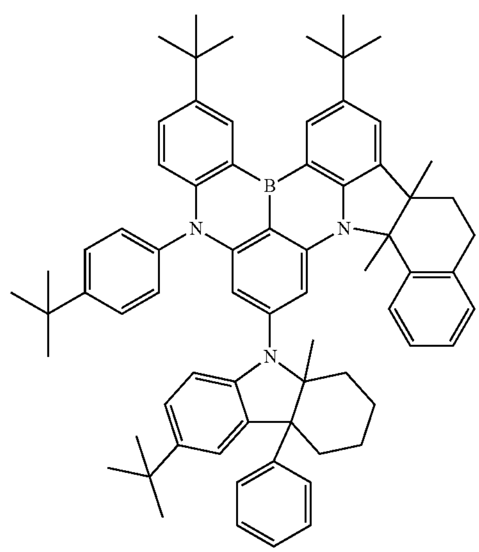

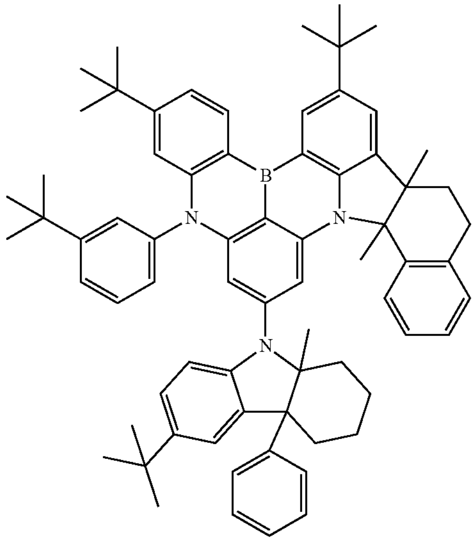
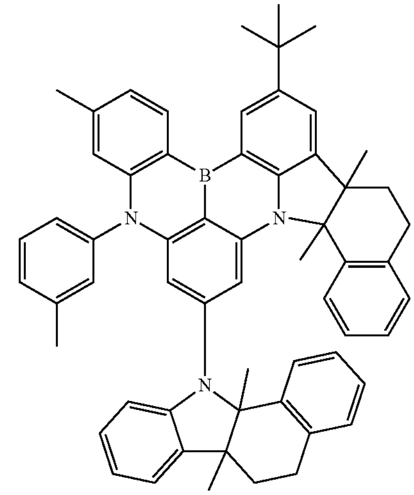
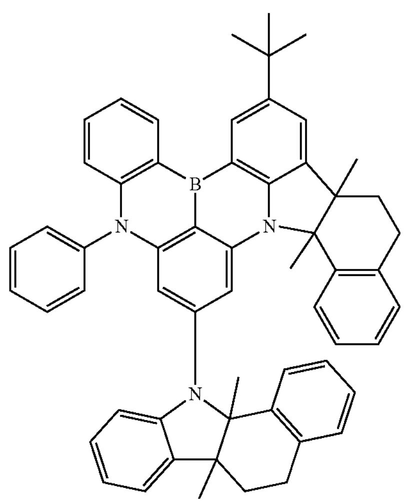
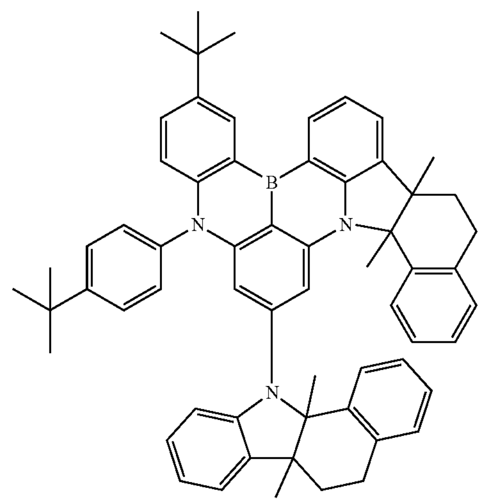
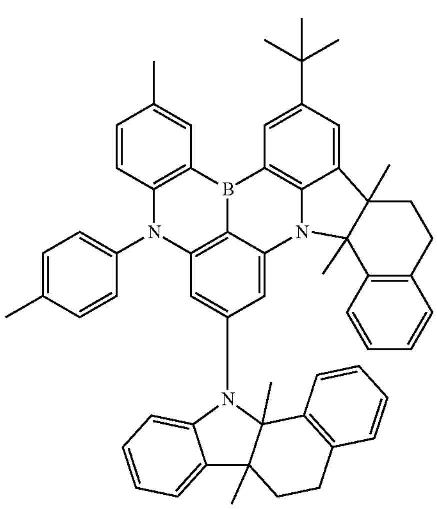
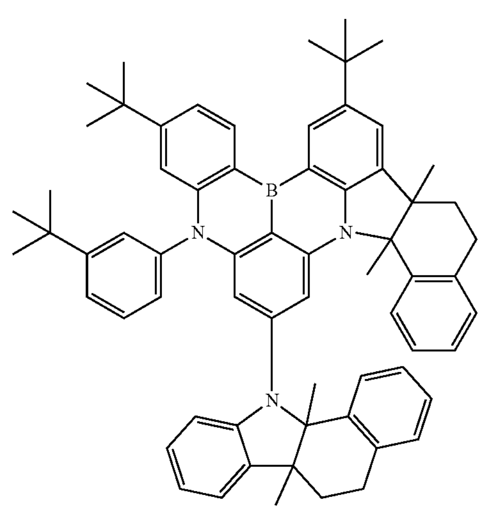

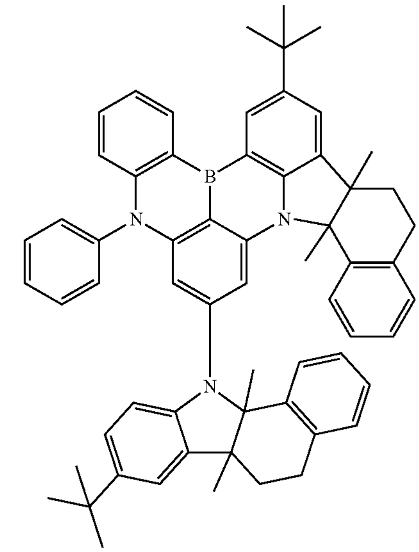
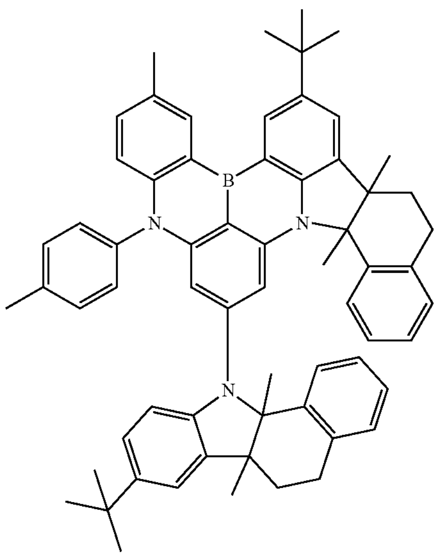
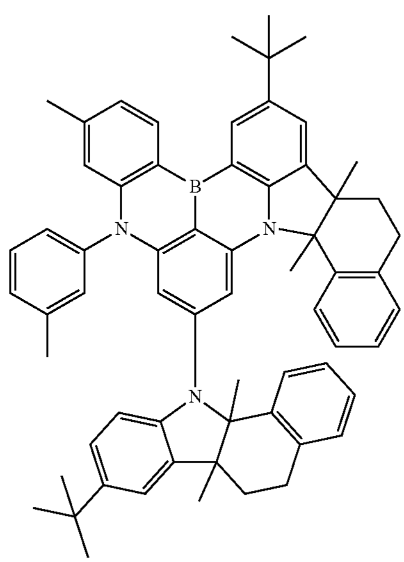
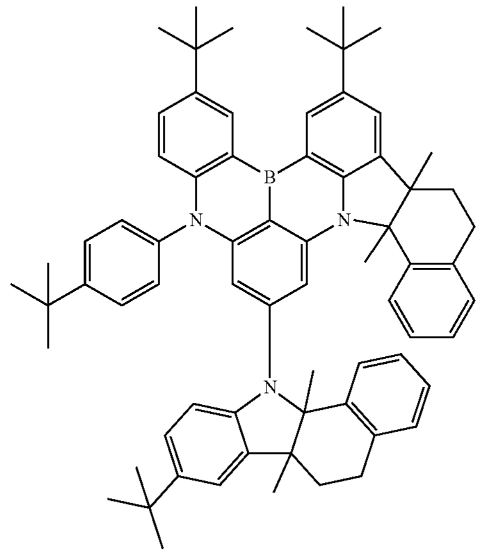
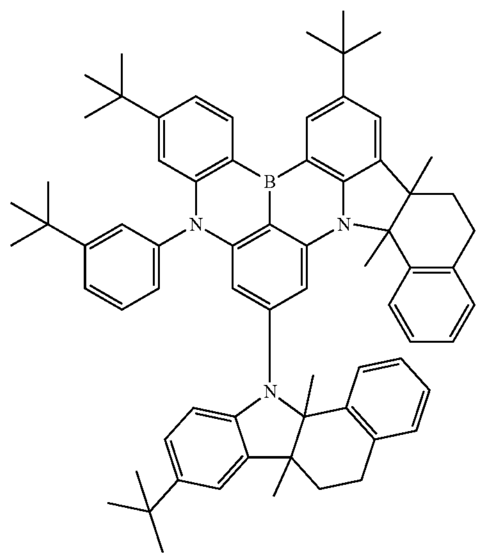
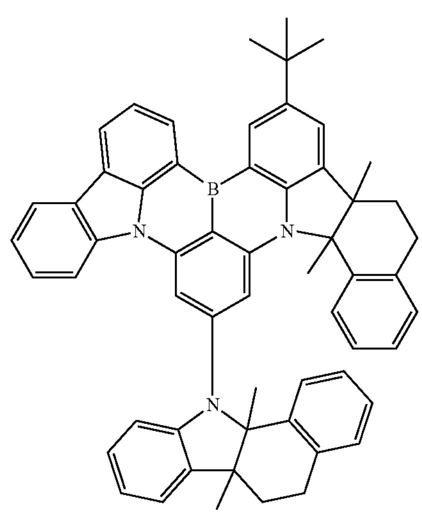

-continued
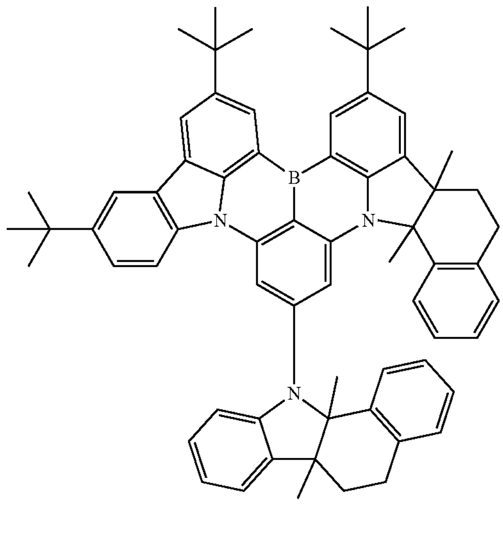
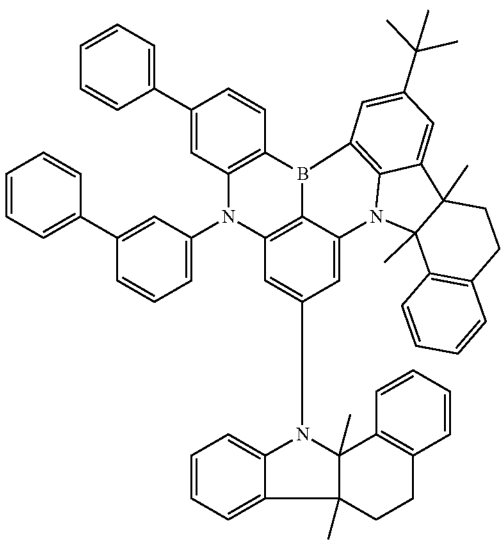
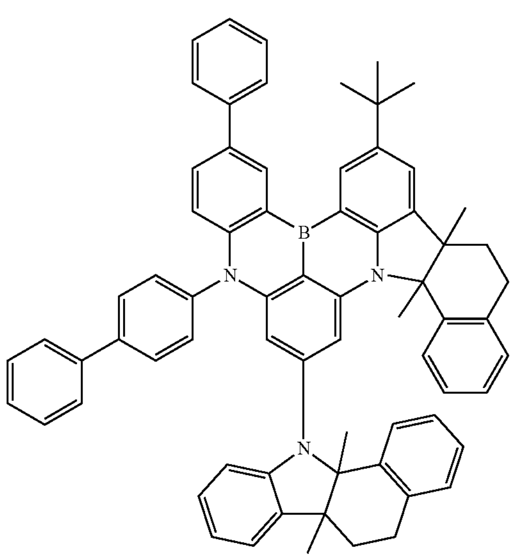
-continued
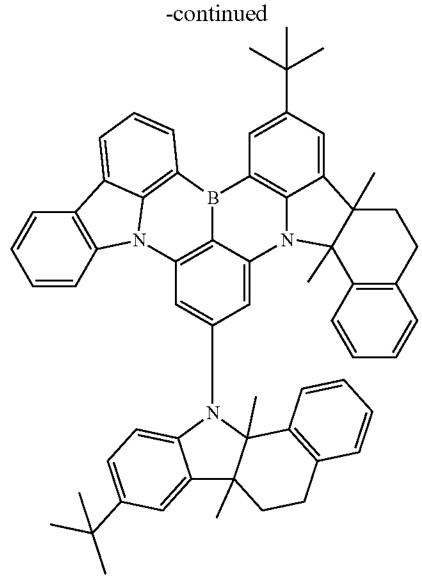
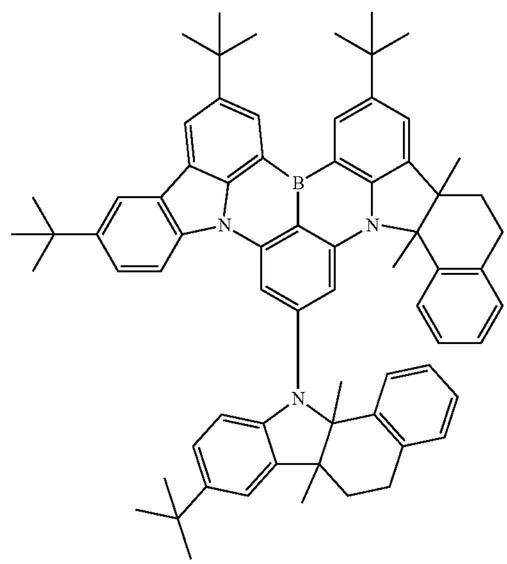
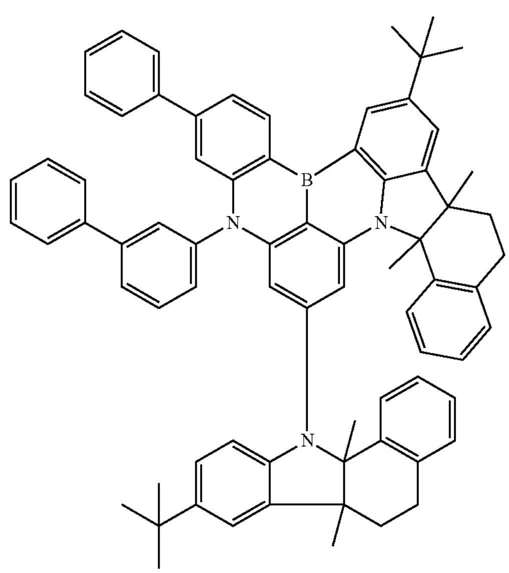

-continued
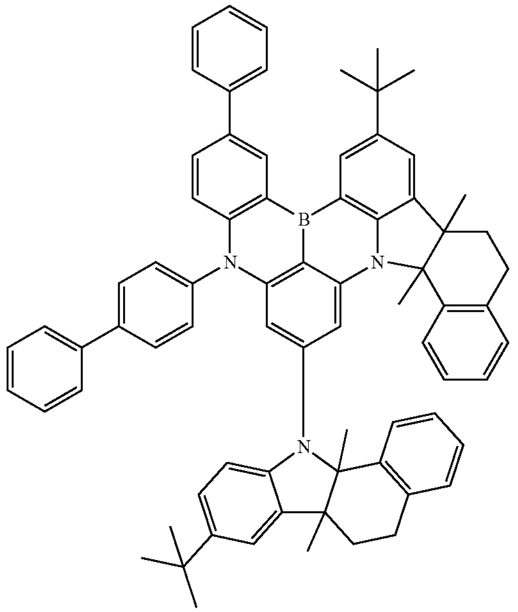 [SMILES: CC(C)(C)c1ccc2c(c1)C1(C)CCc3ccccc3C1(C)N2c1cc2c3c(c1)N1c4c(cc(C(C)(C)C)cc4C4(C)CCc5ccccc5C14C)B3c1cc(-c3ccccc3)ccc1N2c1ccc(-c2ccccc2)cc1]
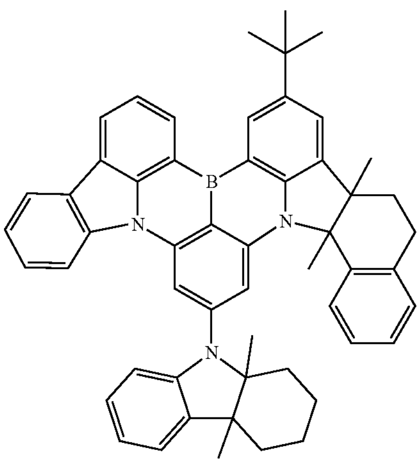
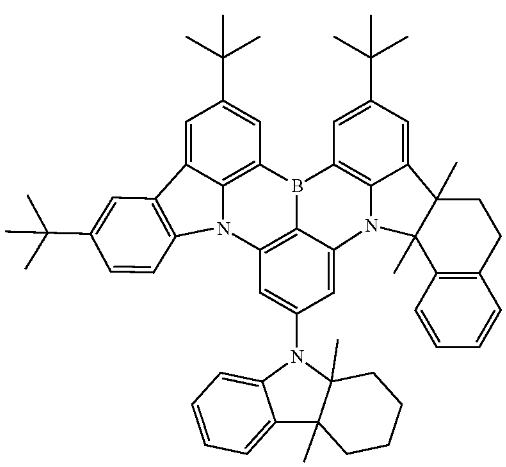
-continued
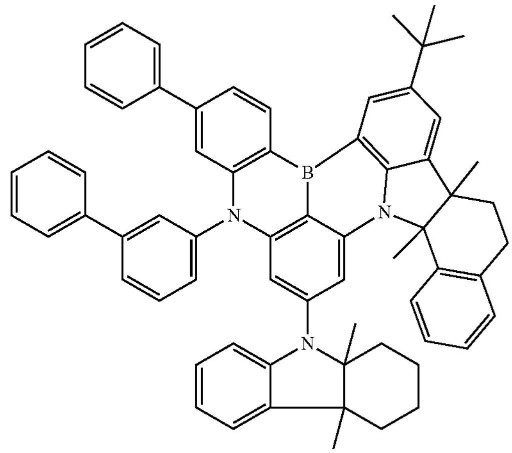
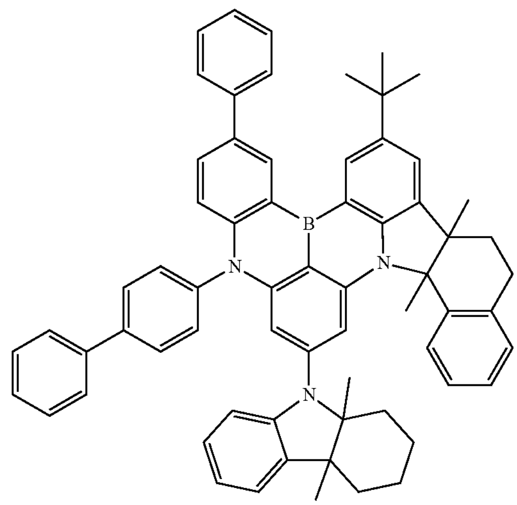
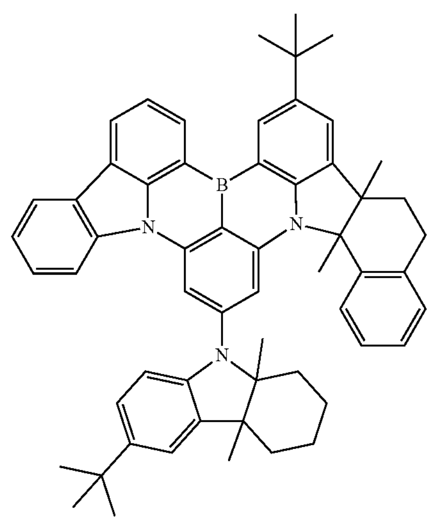

-continued
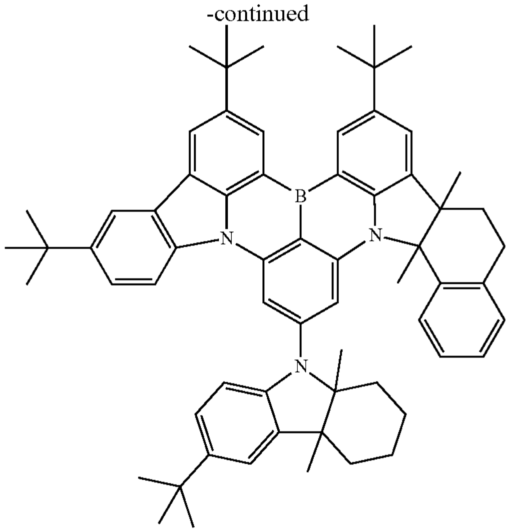
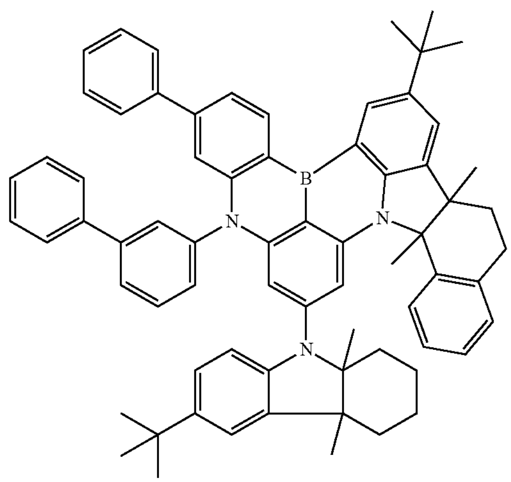
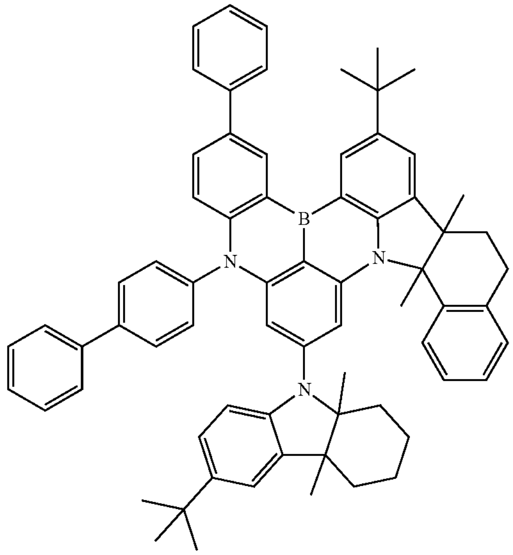
-continued
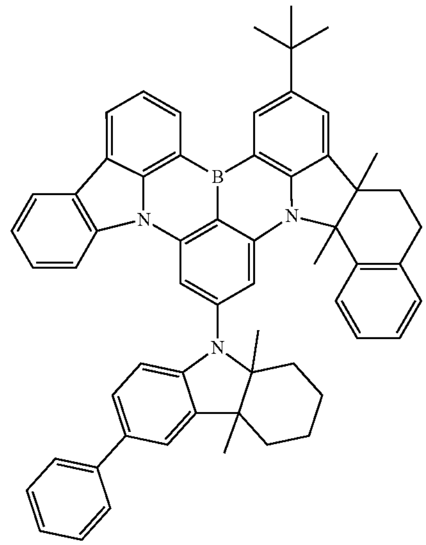
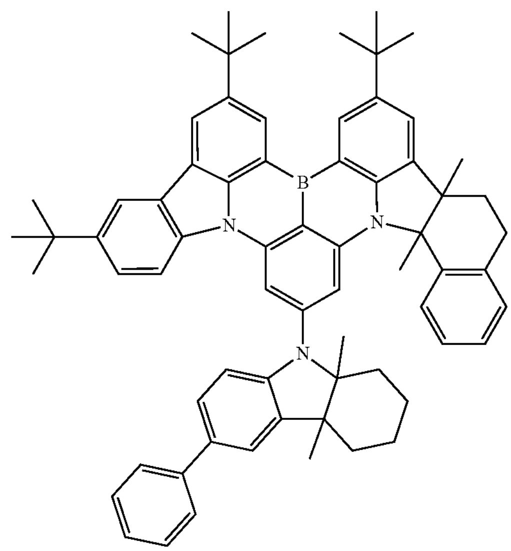
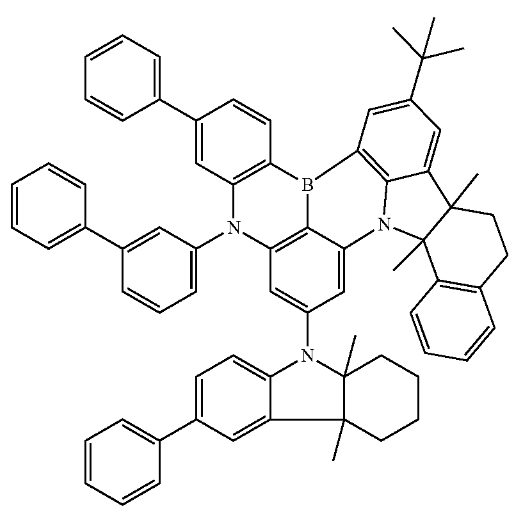

-continued
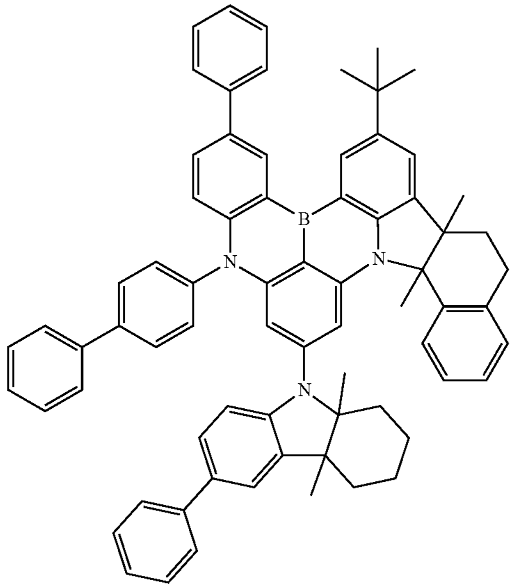
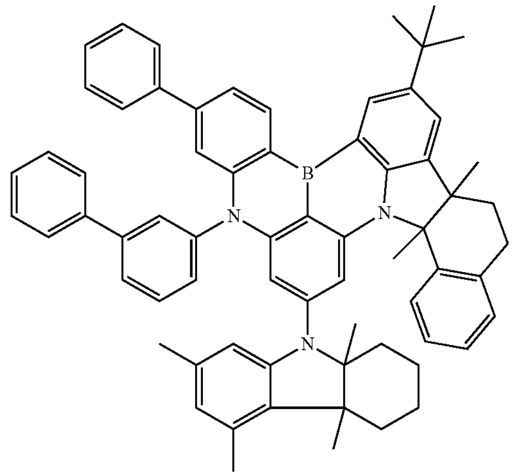
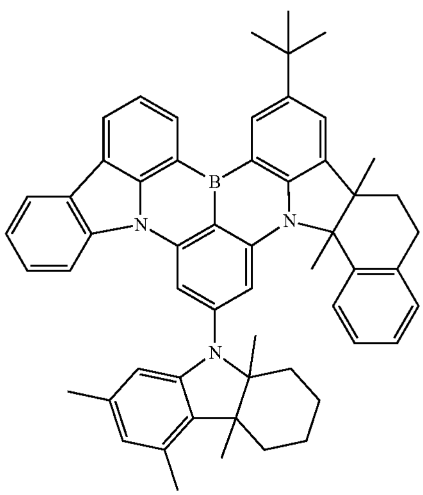
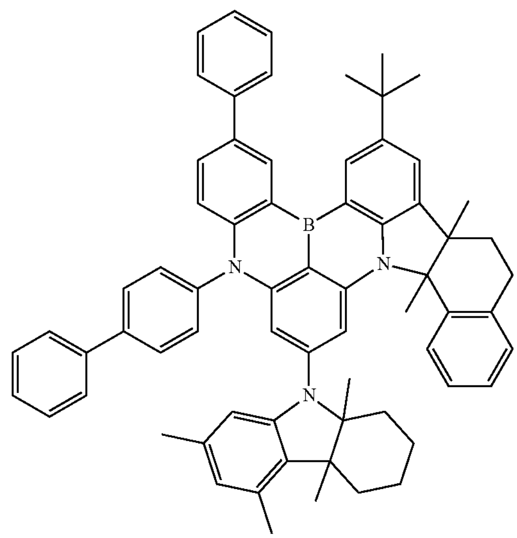
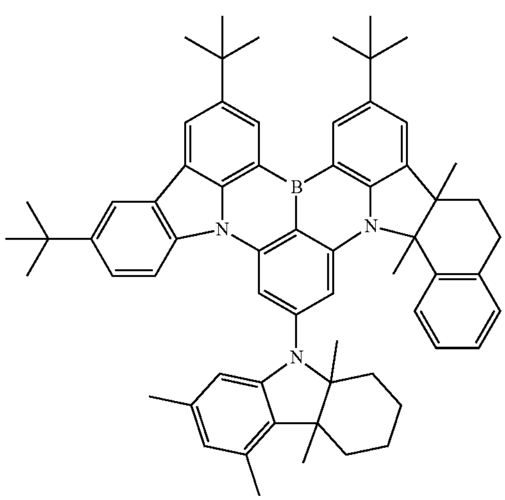
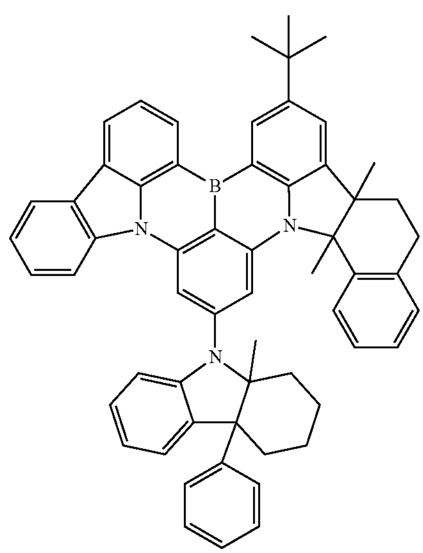
-continued -continued
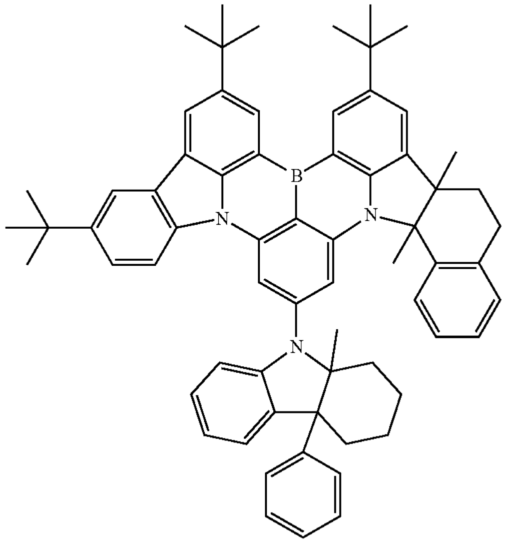
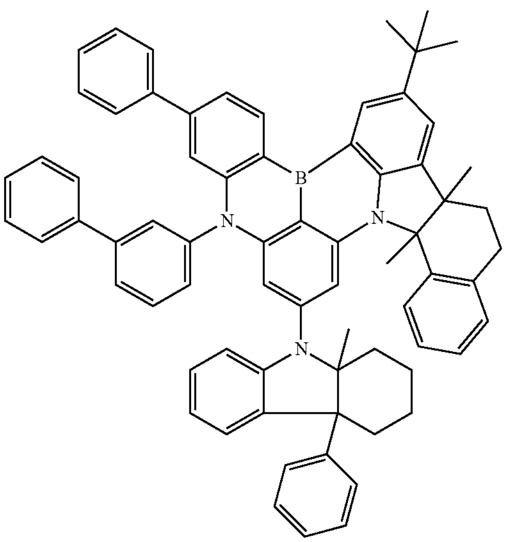
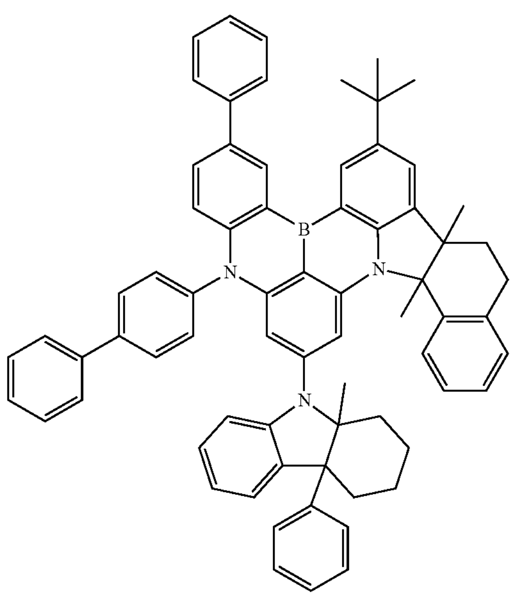
-continued
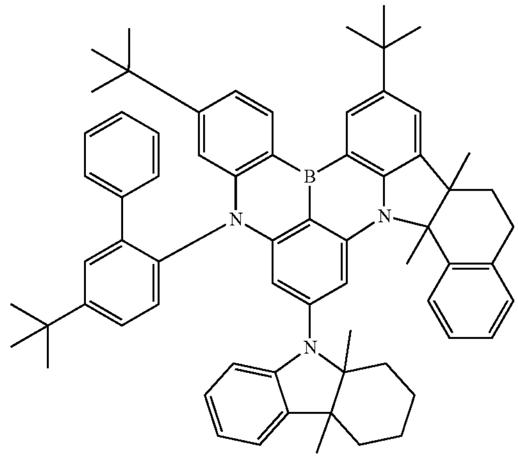
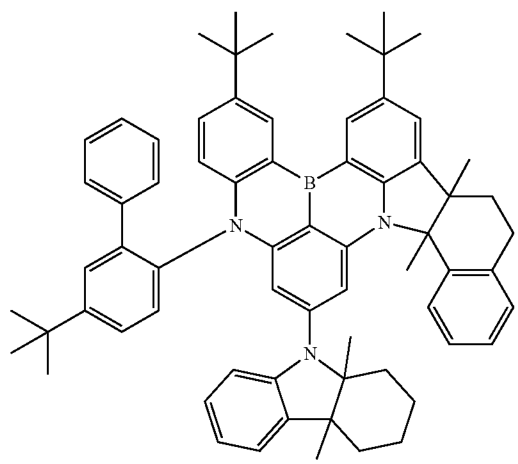
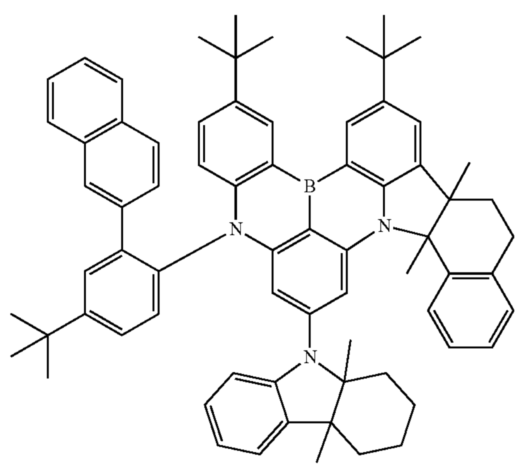

-continued
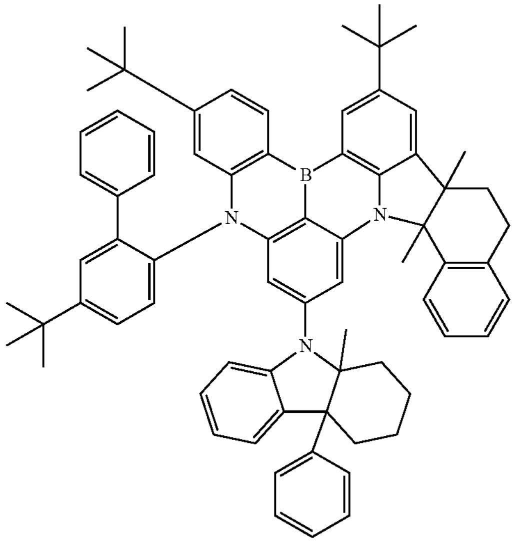
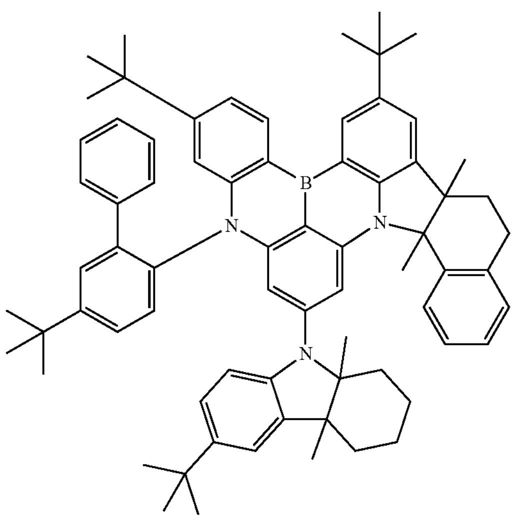
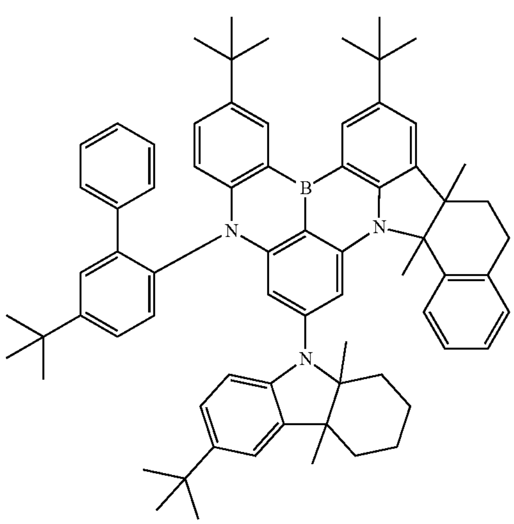
-continued
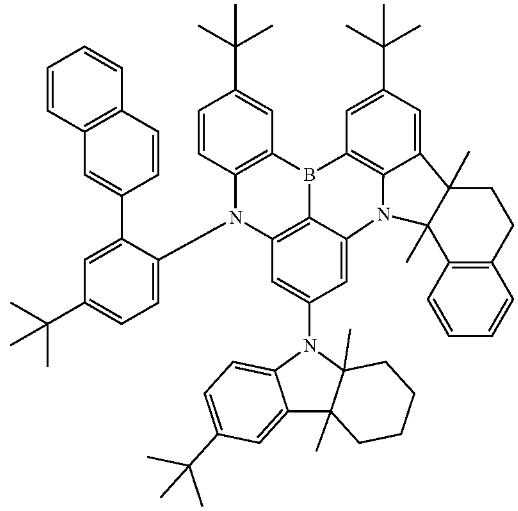
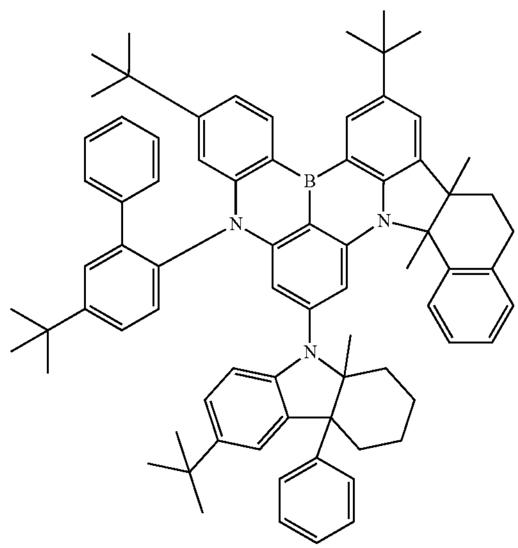
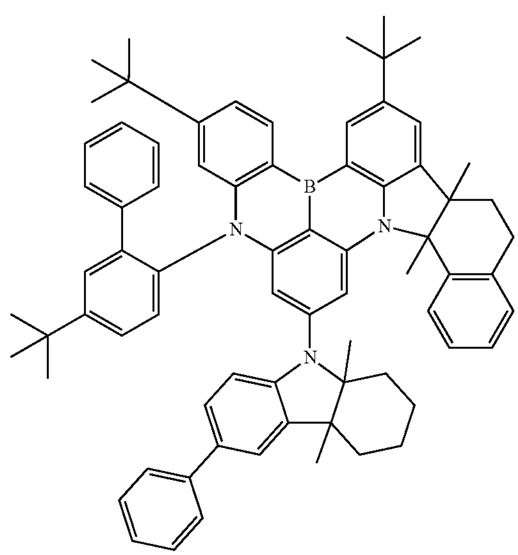

-continued
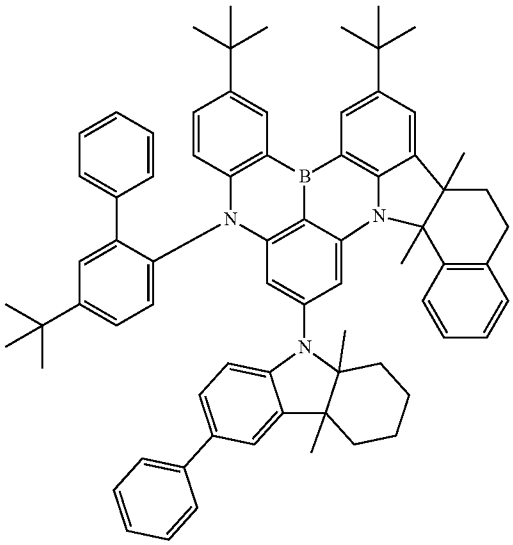
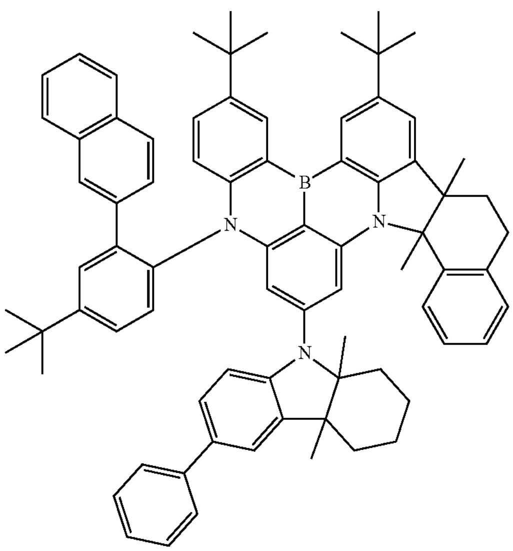
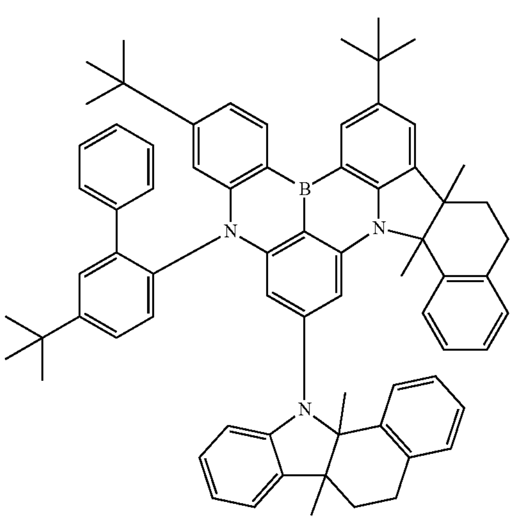
-continued
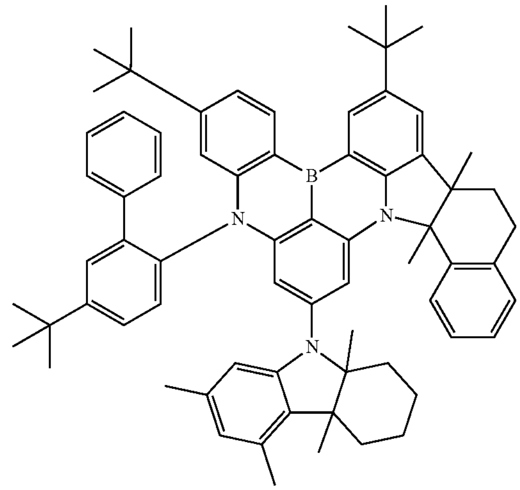
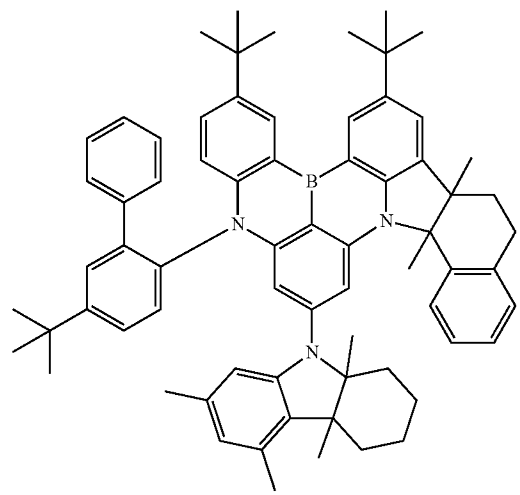
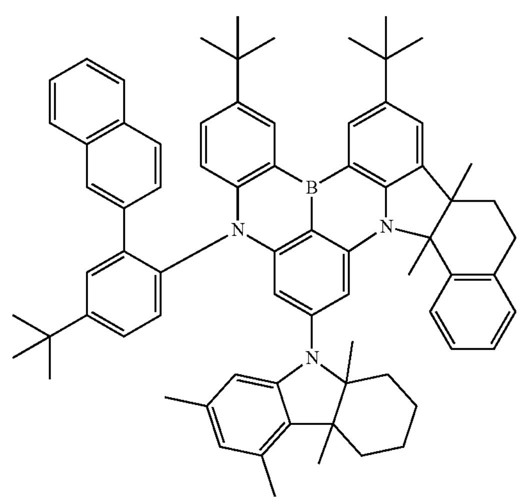

-continued
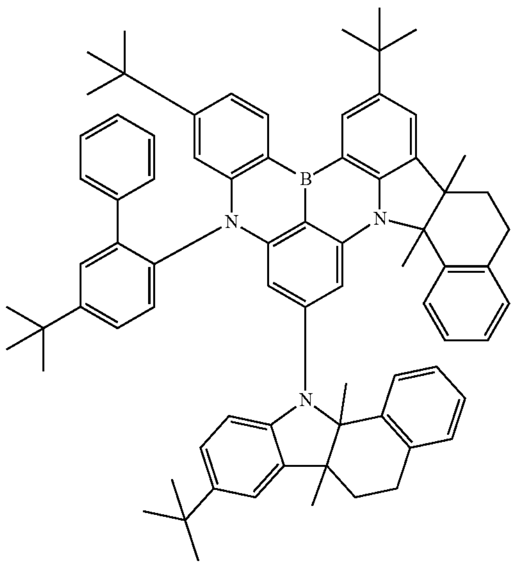
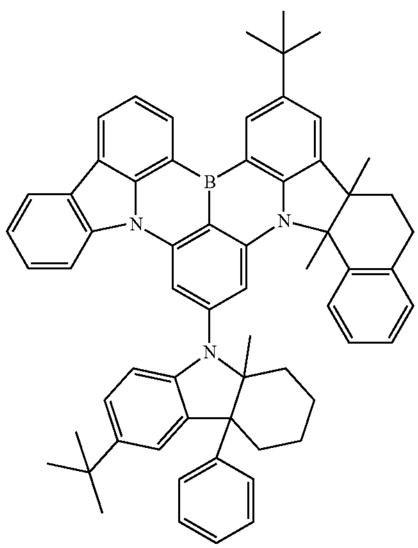
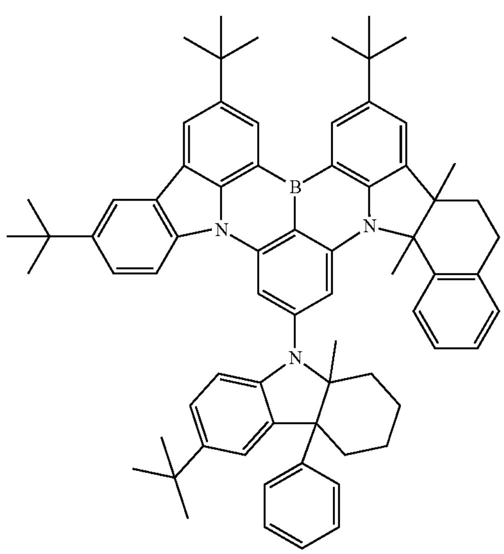
-continued
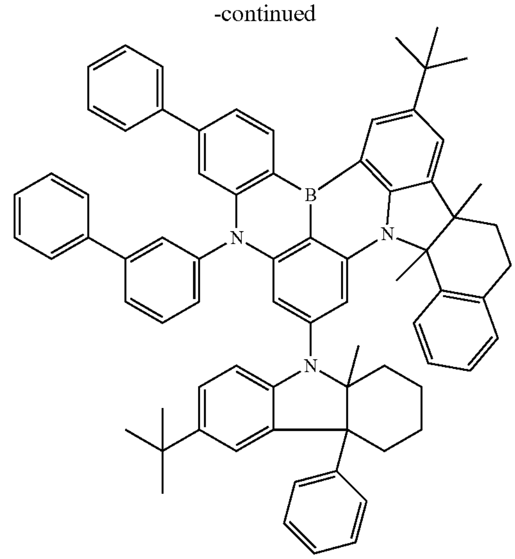
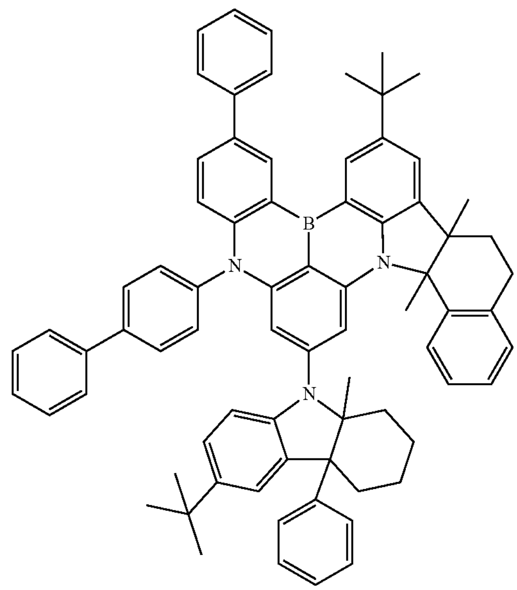
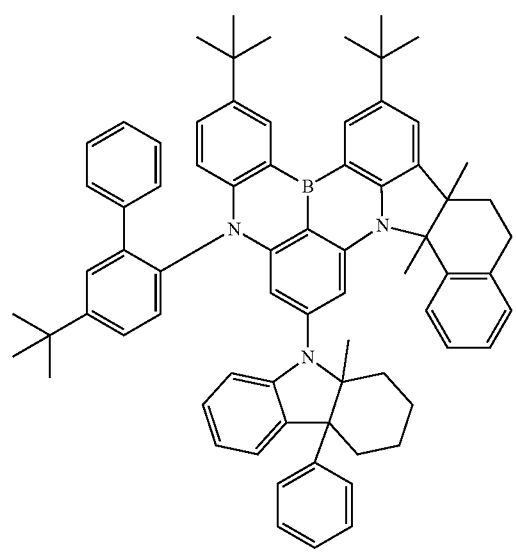

-continued
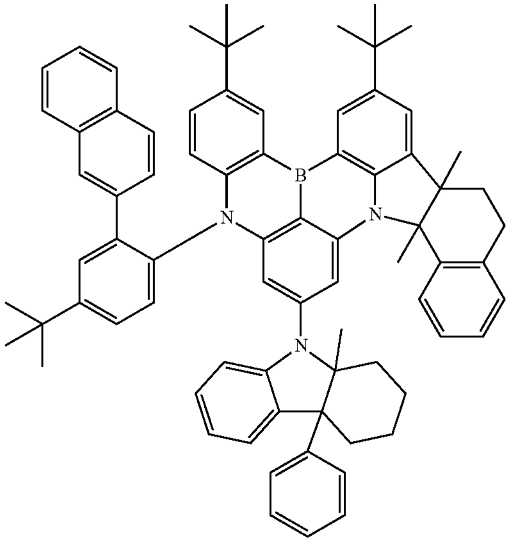
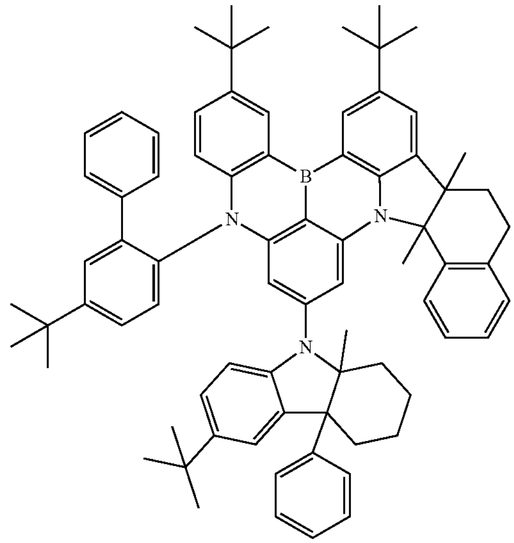
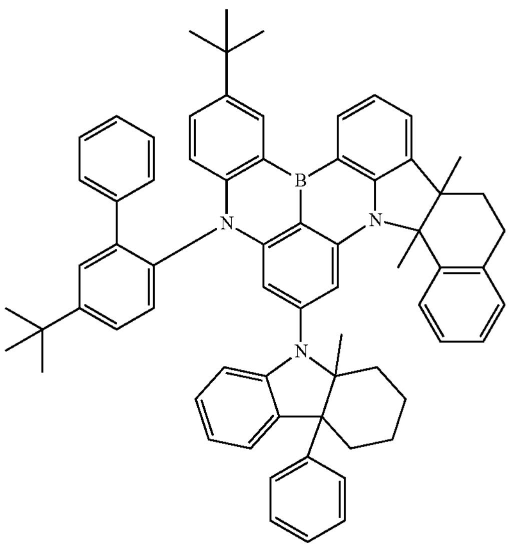
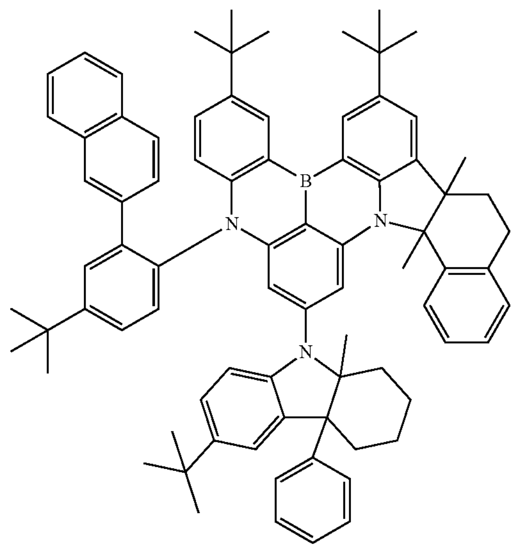
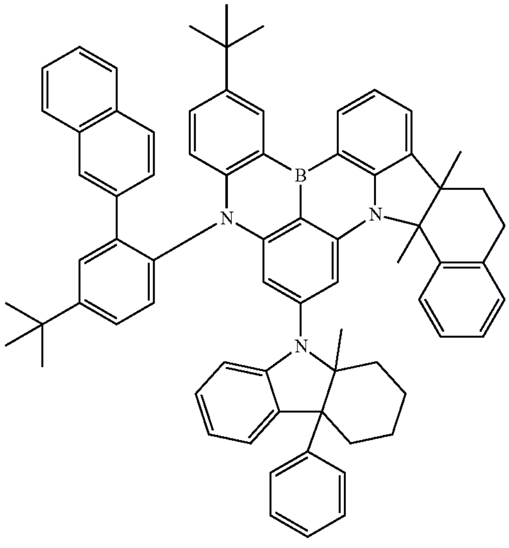
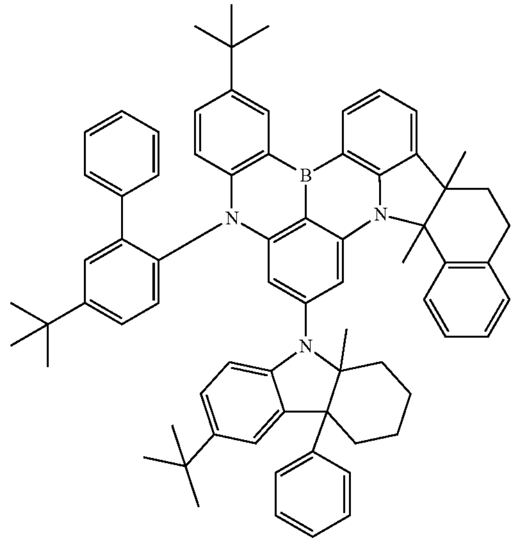
-continued -continued
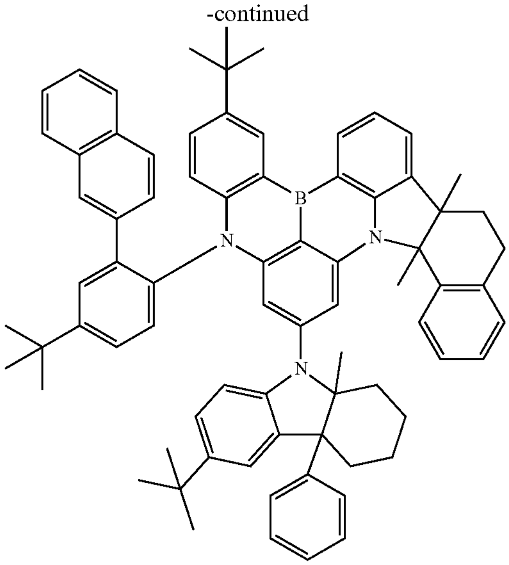
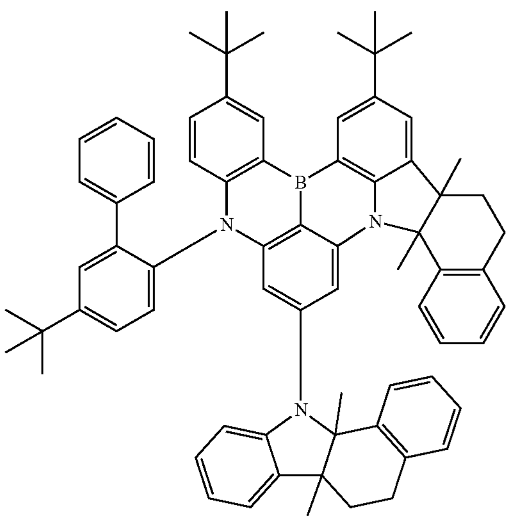
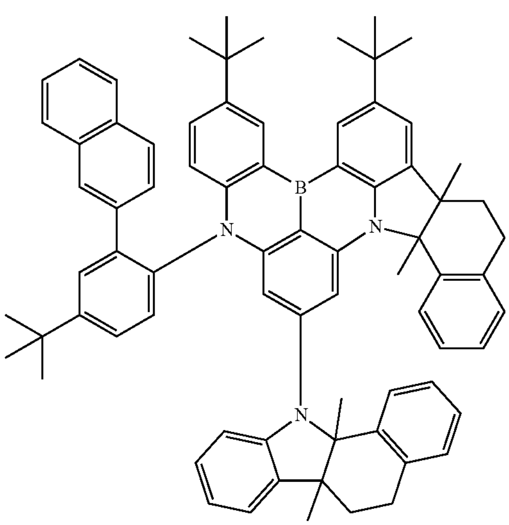
-continued
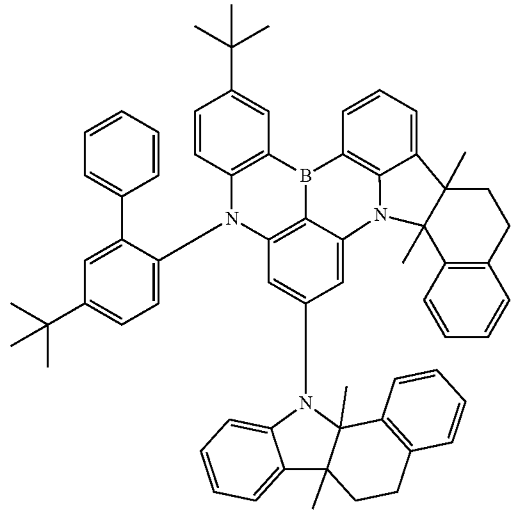
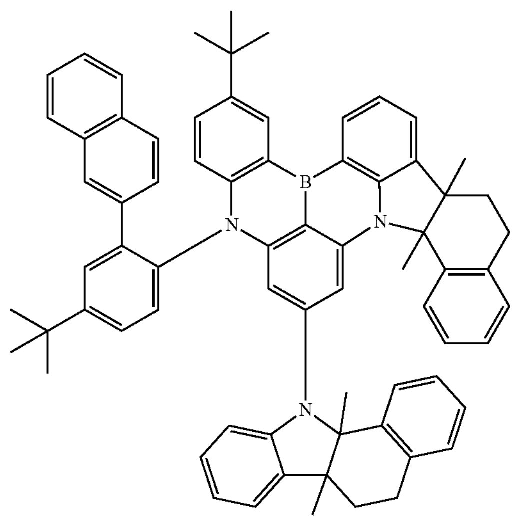
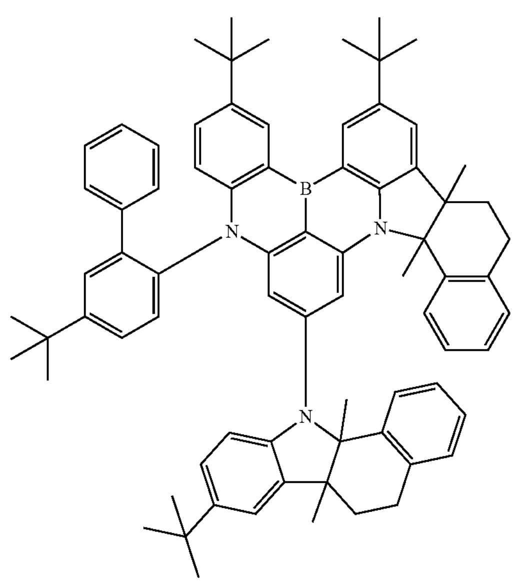

-continued
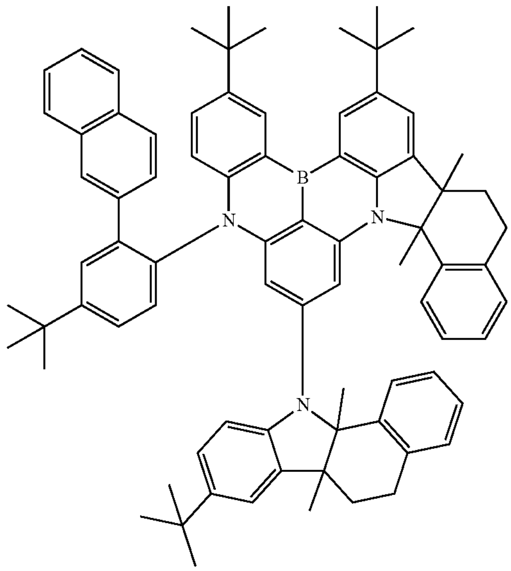
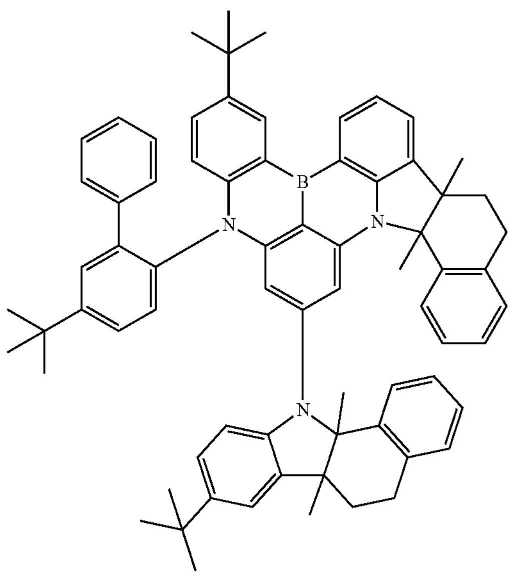
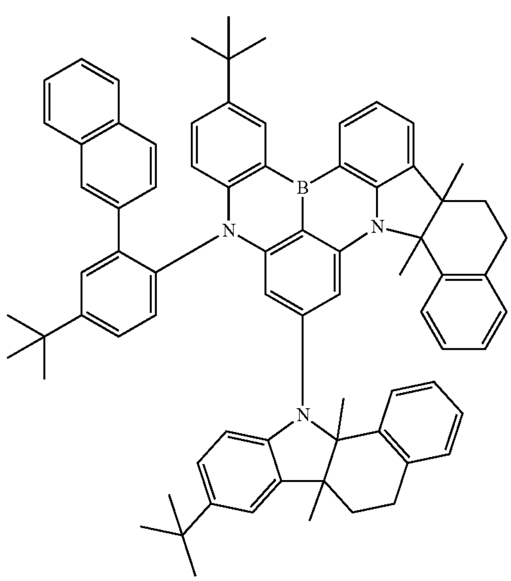
-continued
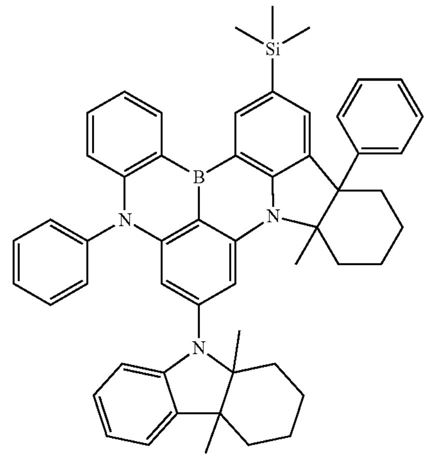
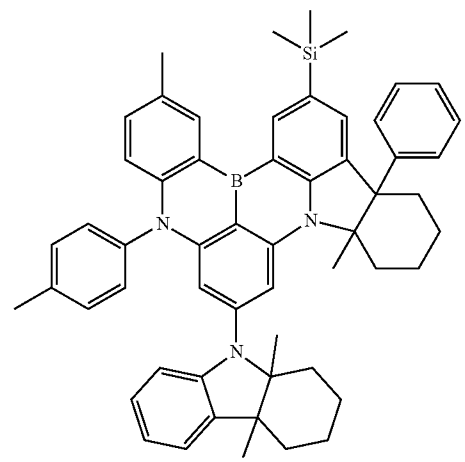
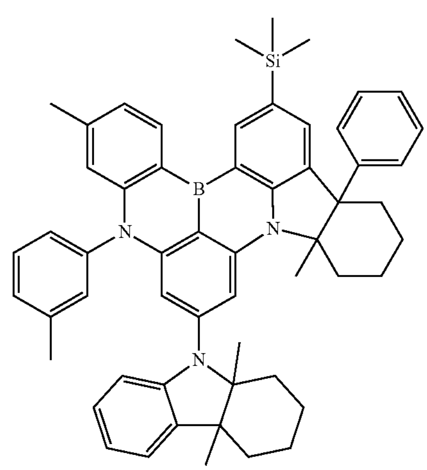

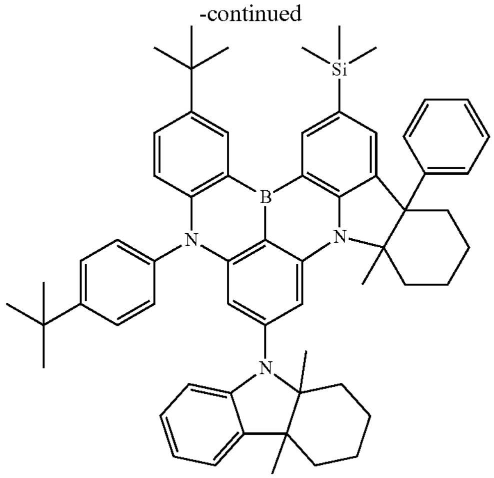
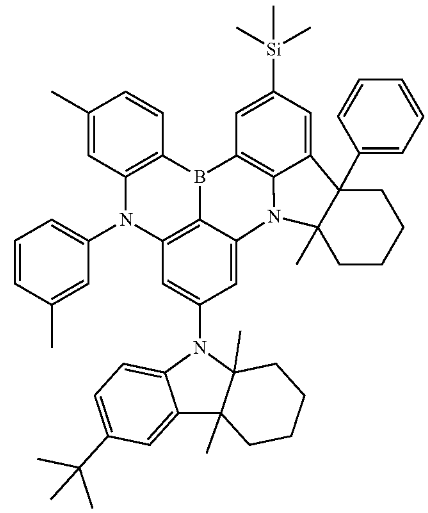
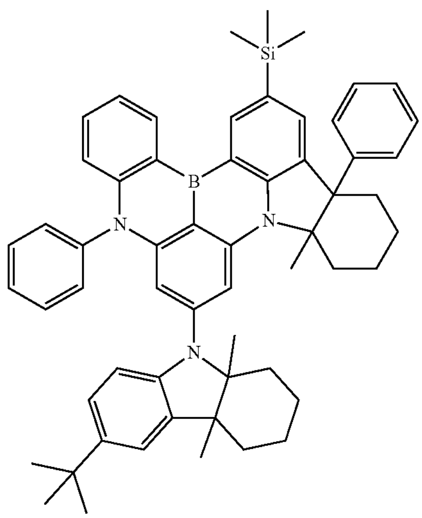
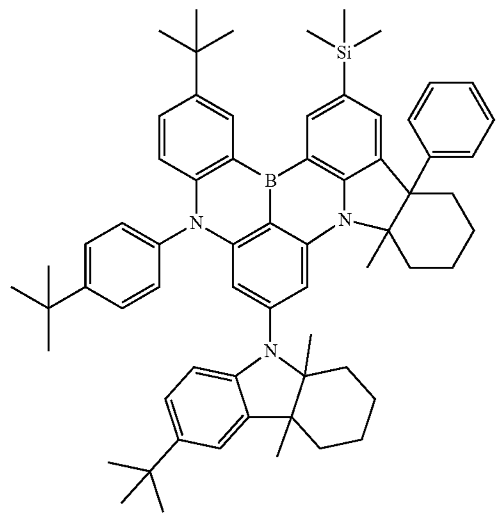
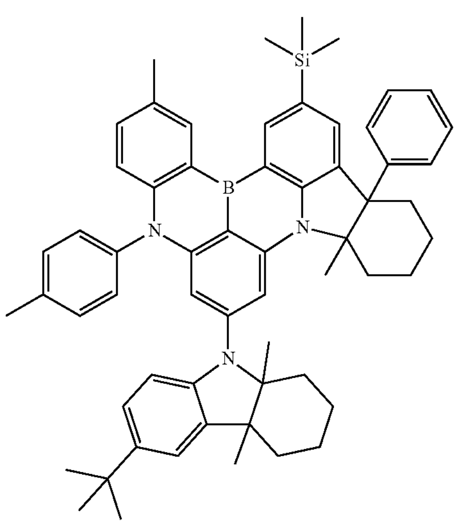
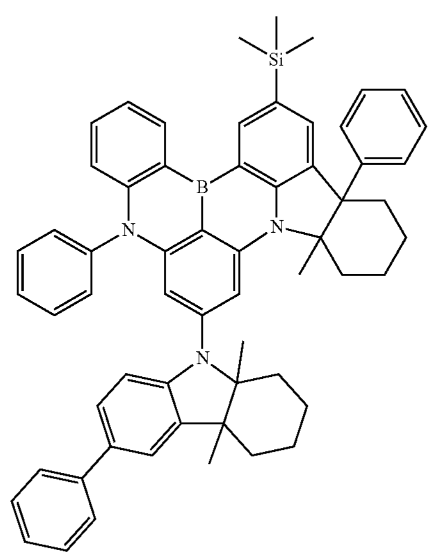

-continued
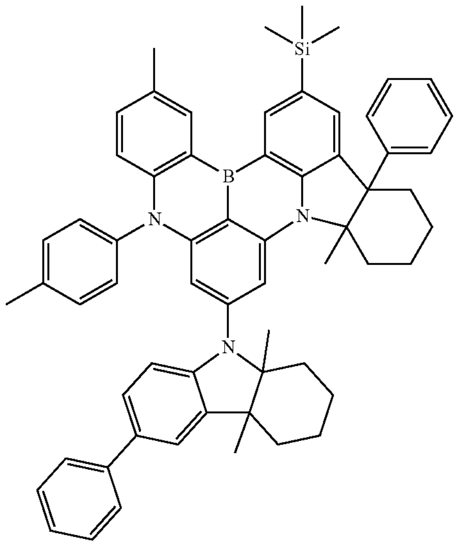
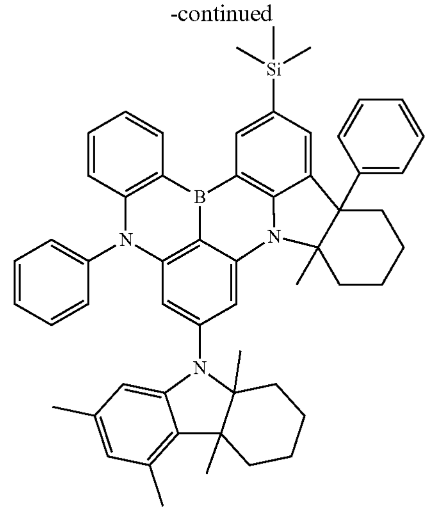
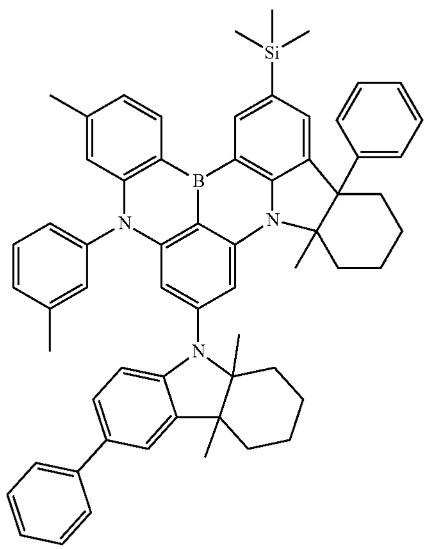
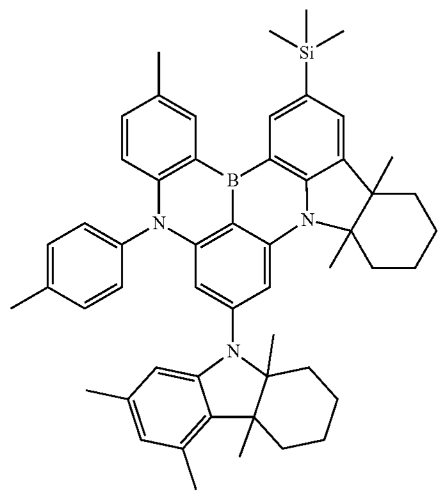
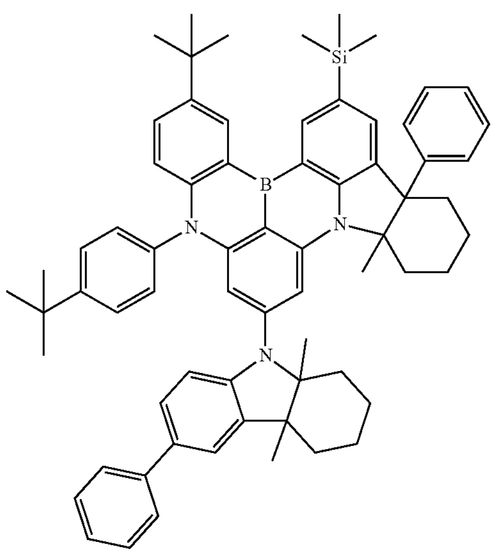
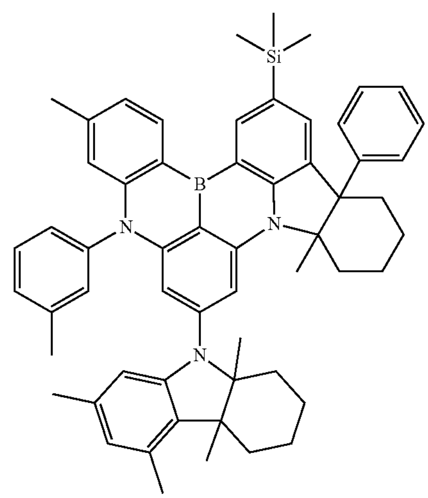

-continued
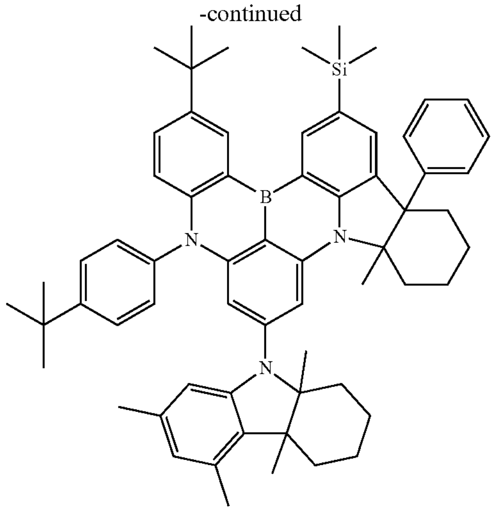
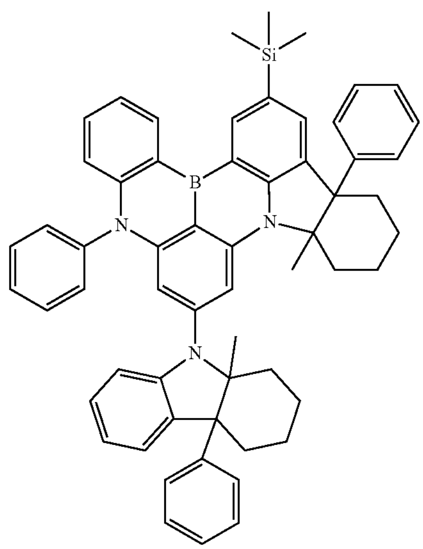
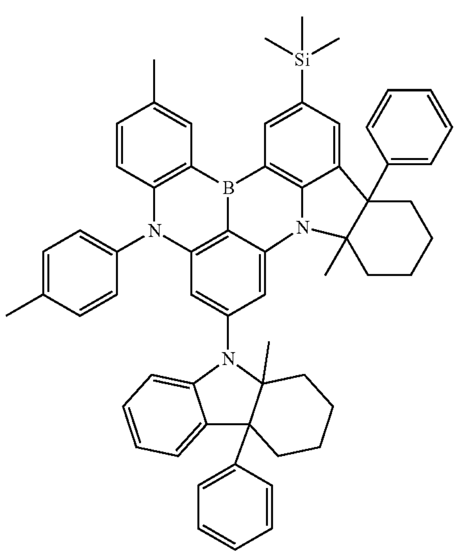
-continued
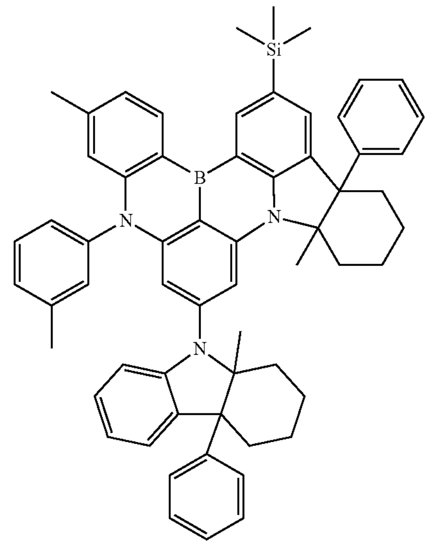
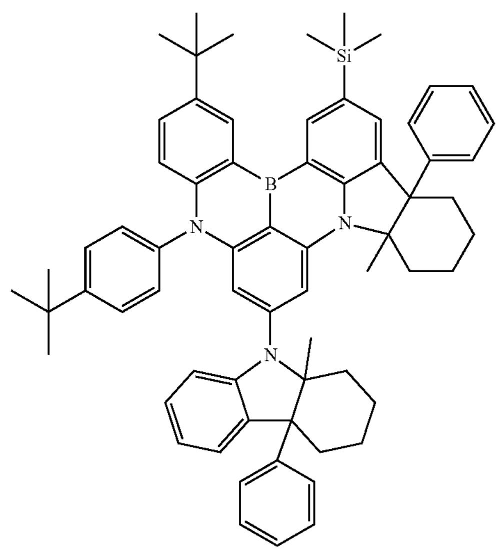
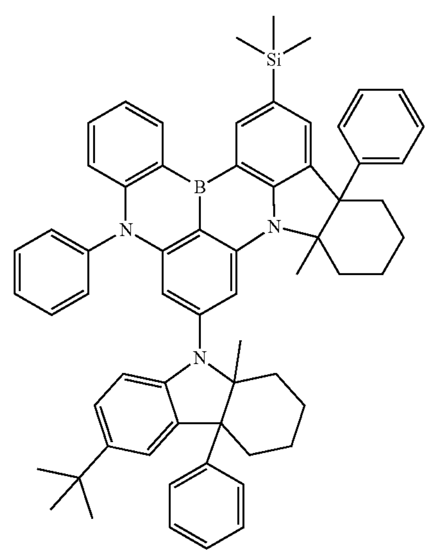

-continued
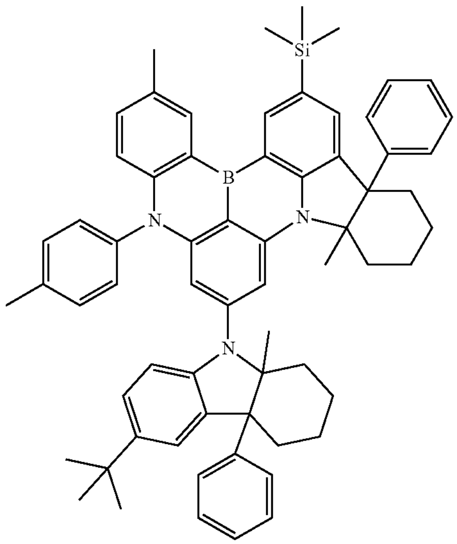
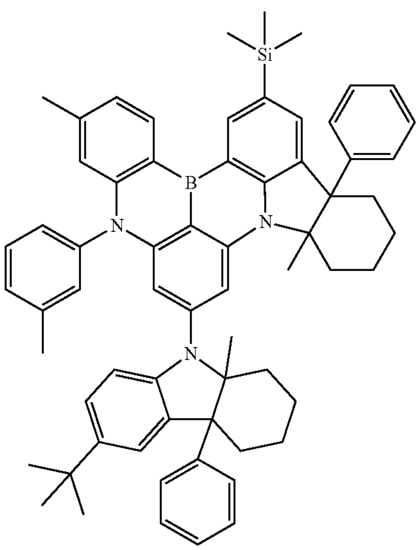
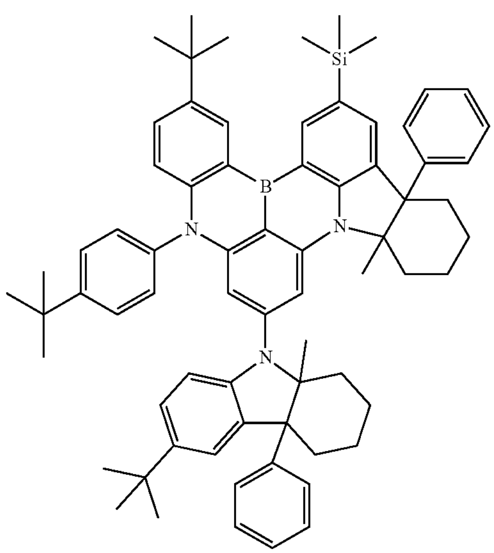
-continued
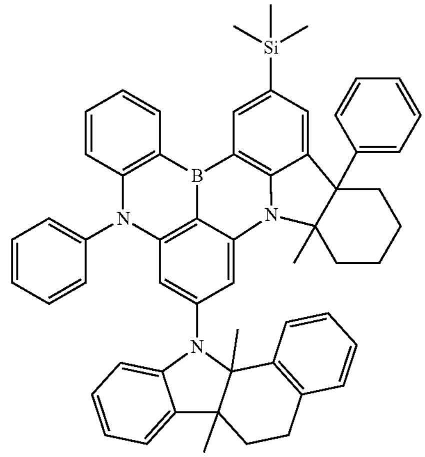
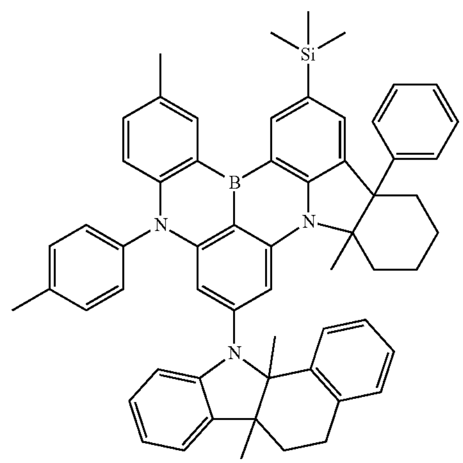
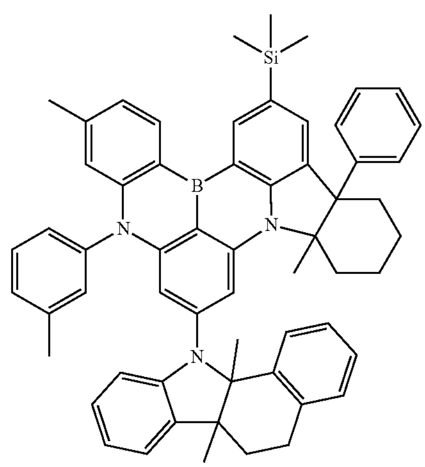

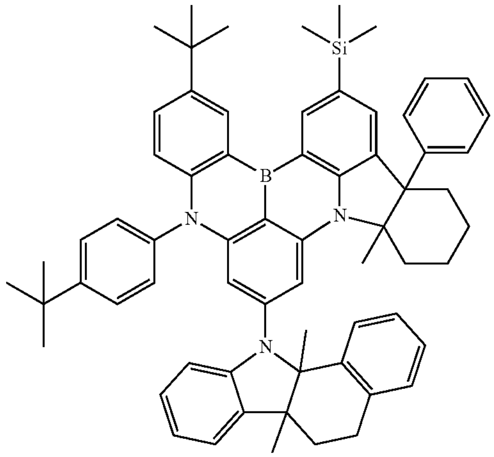
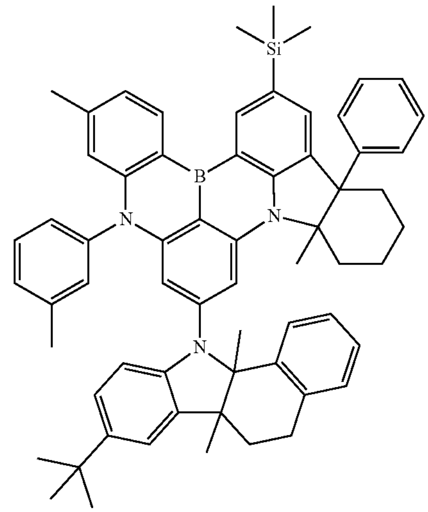
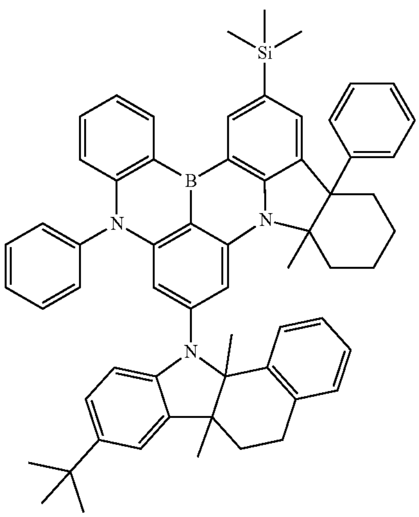
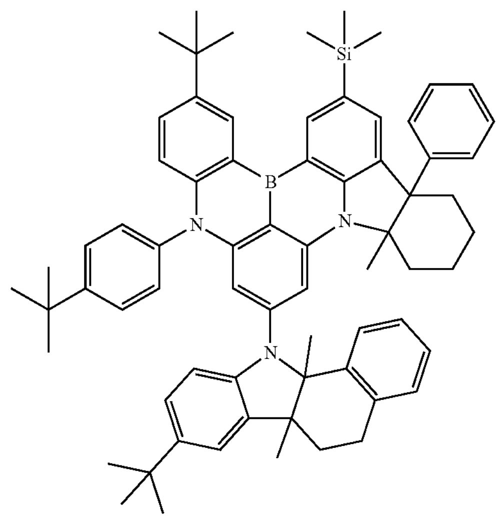
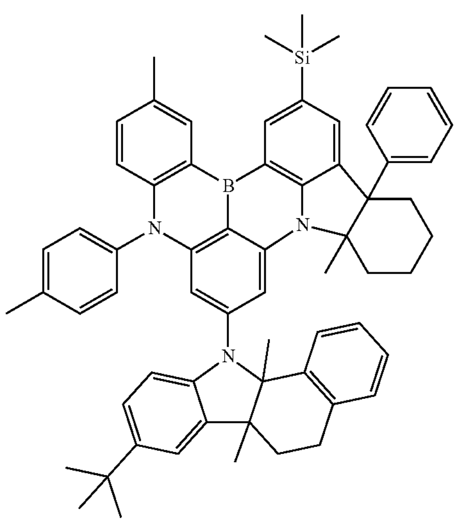
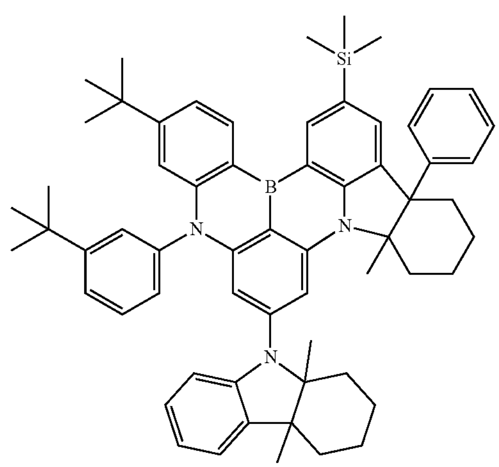

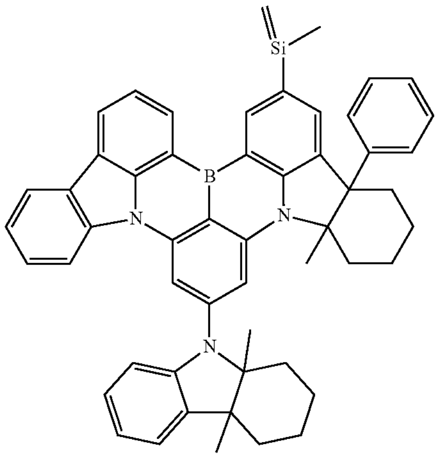
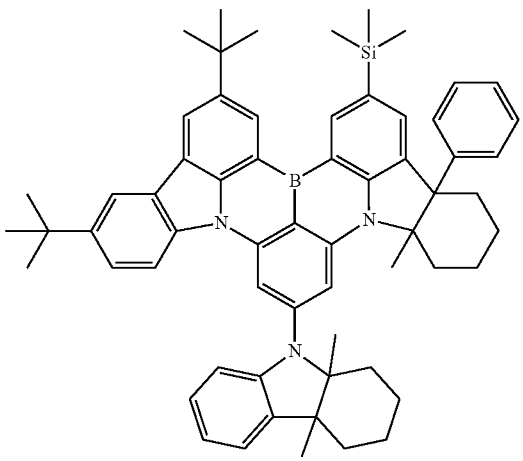
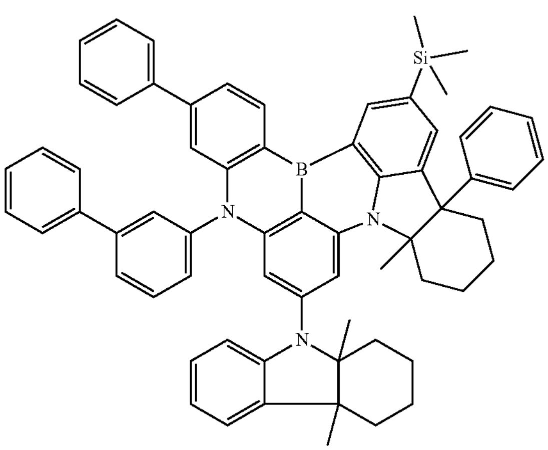
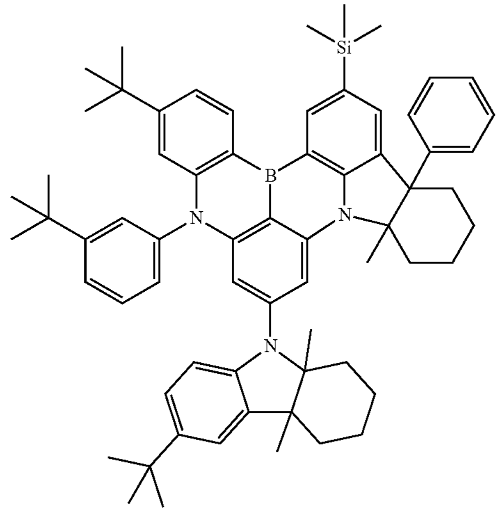
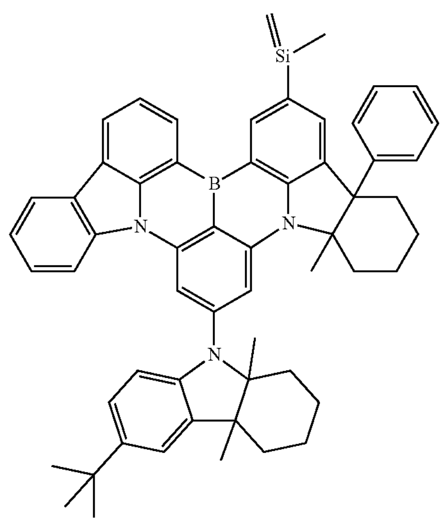
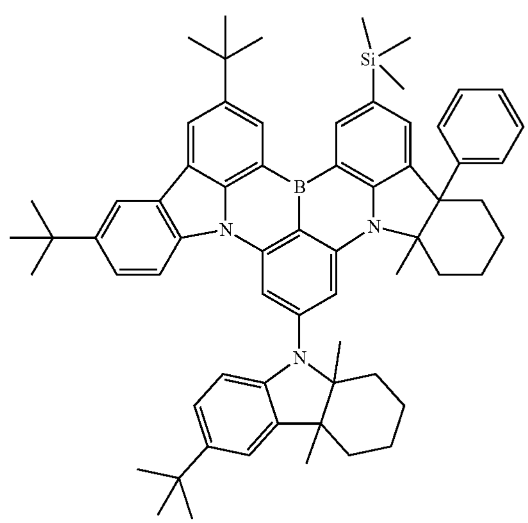

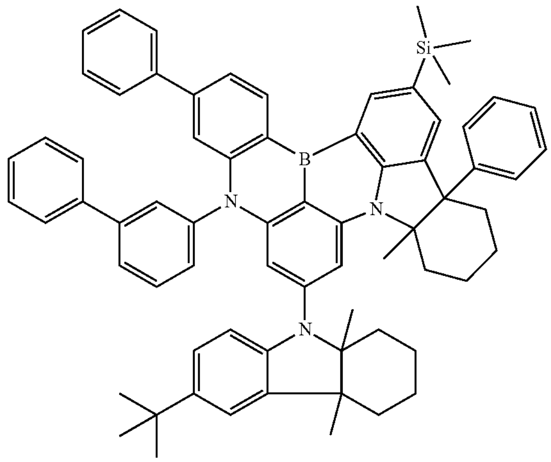
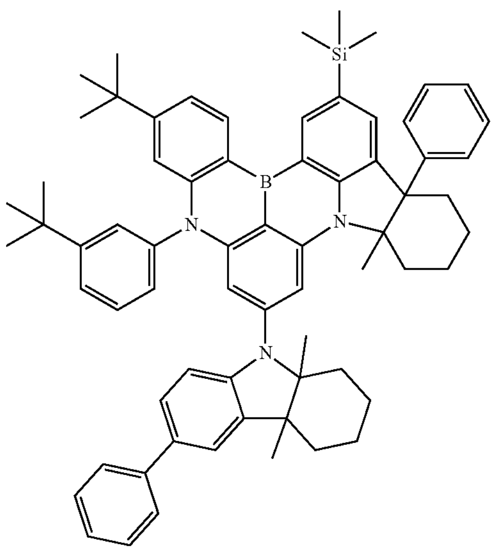
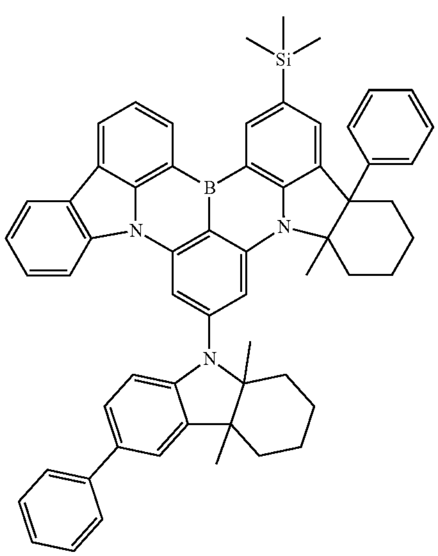
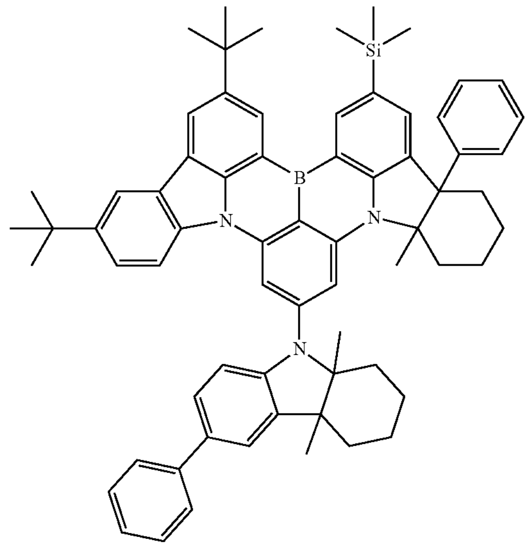
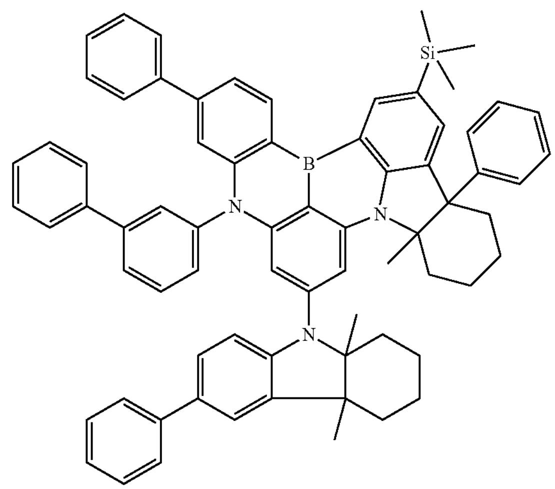
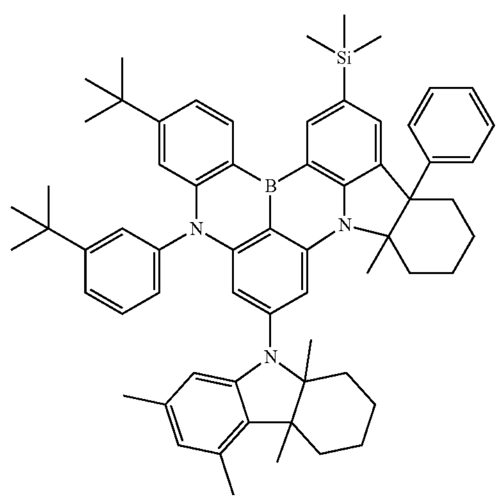

-continued
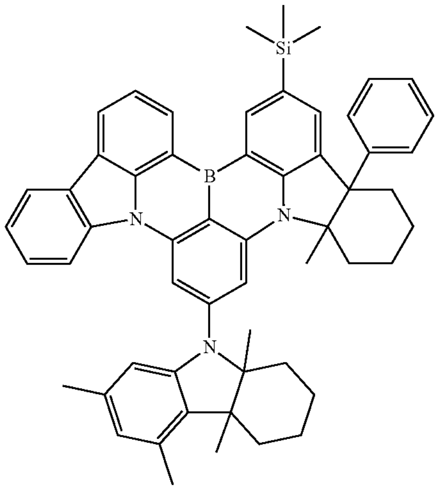
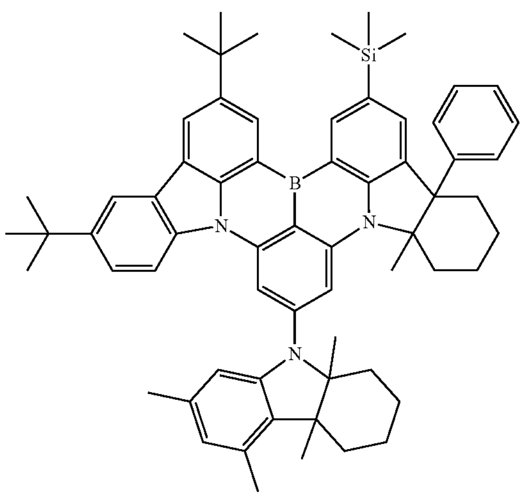
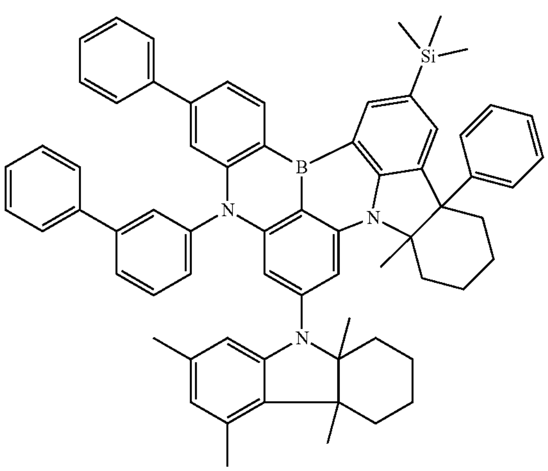
-continued
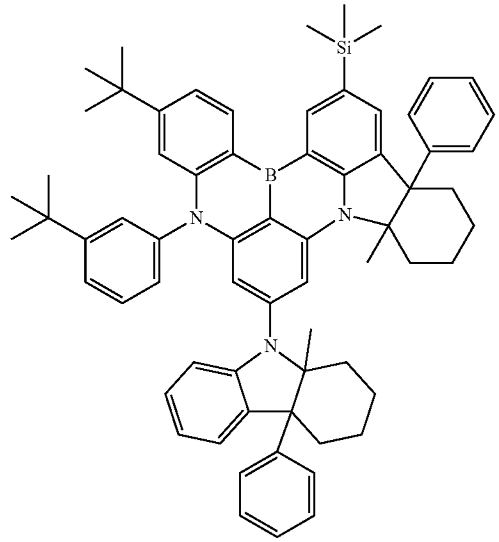
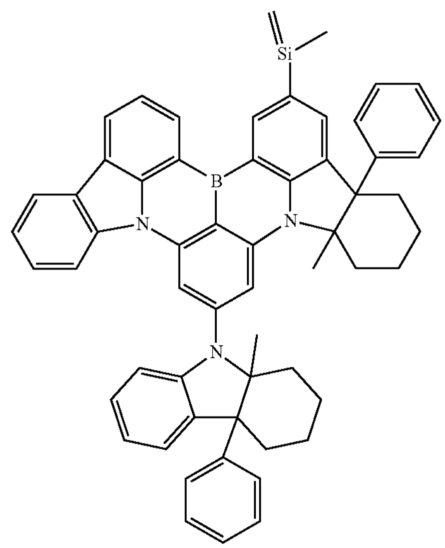
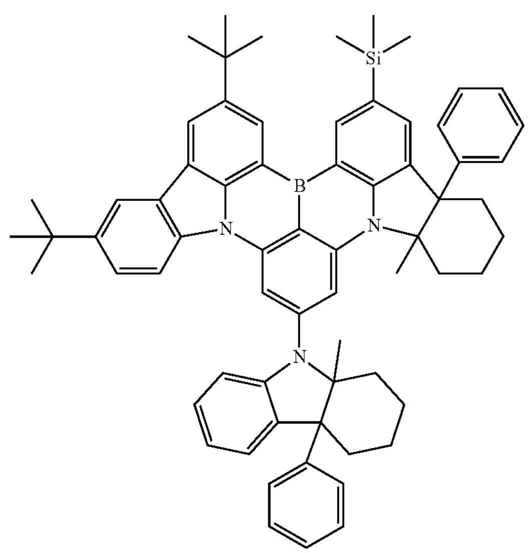

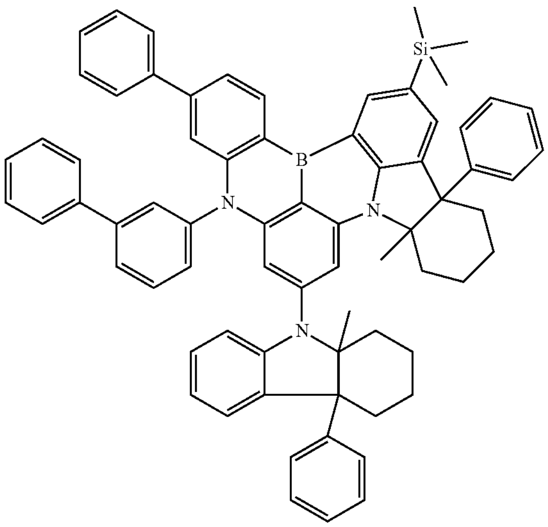
Si
B
N
N
N
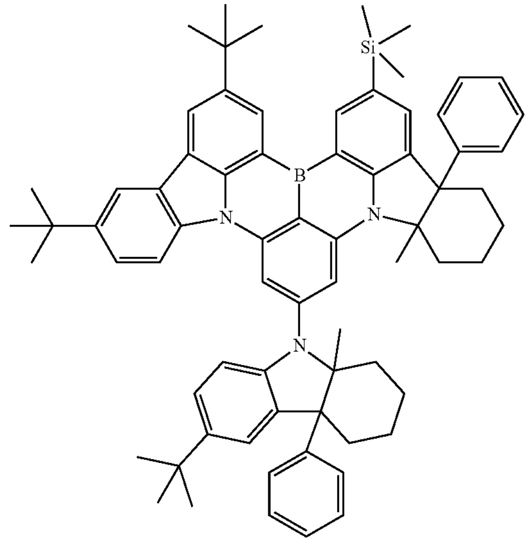
Si
B
N
N
N
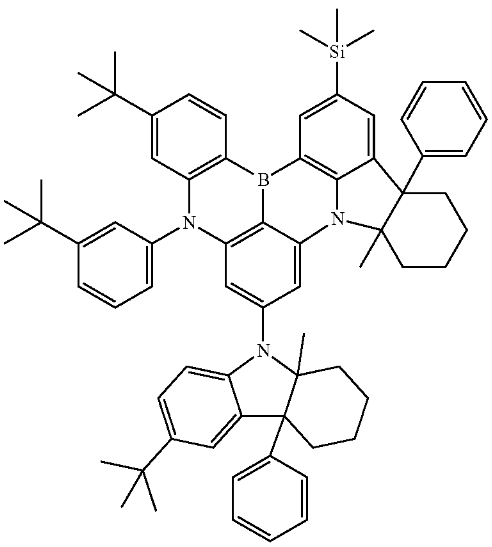
Si
B
N
N
N
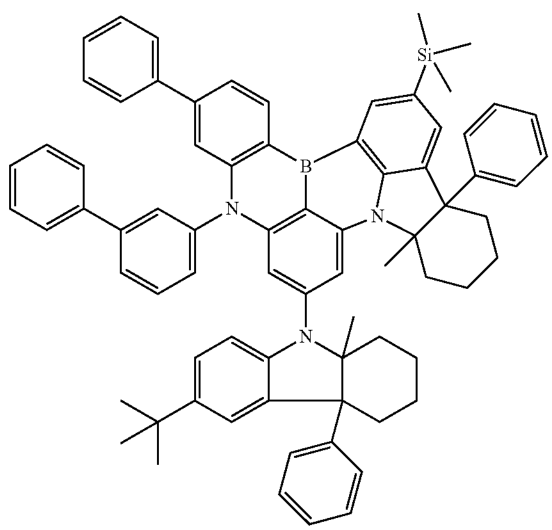
Si
B
N
N
N
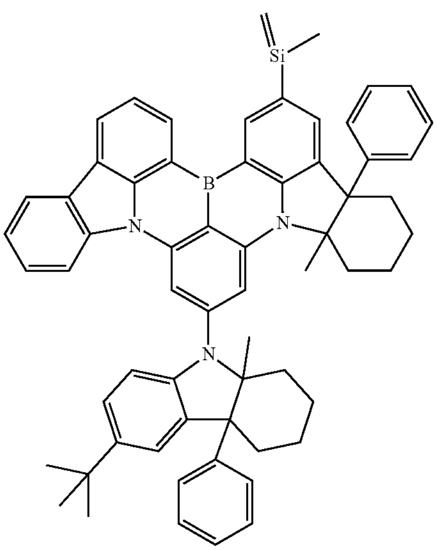
Si
B
N
N
N
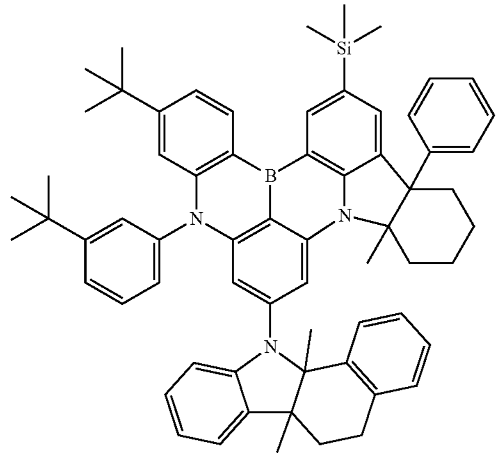
Si
B
N
N
N -continued
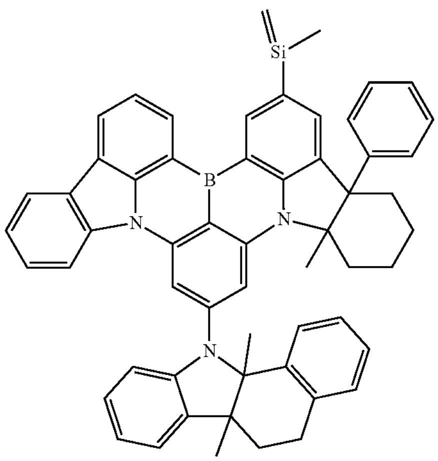
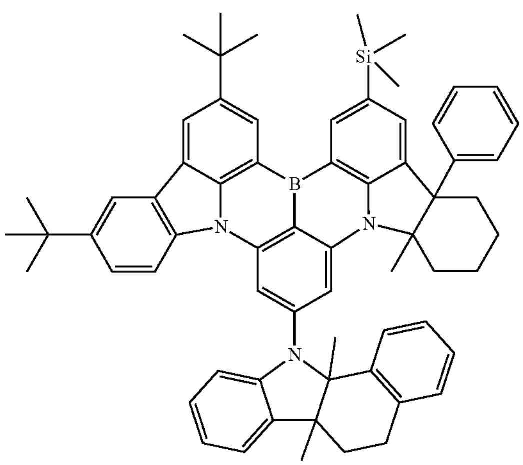
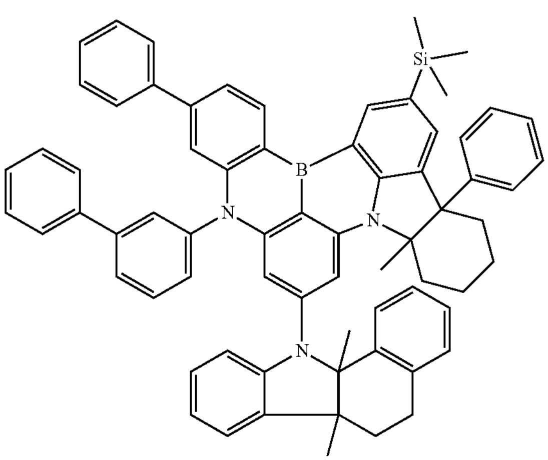
-continued
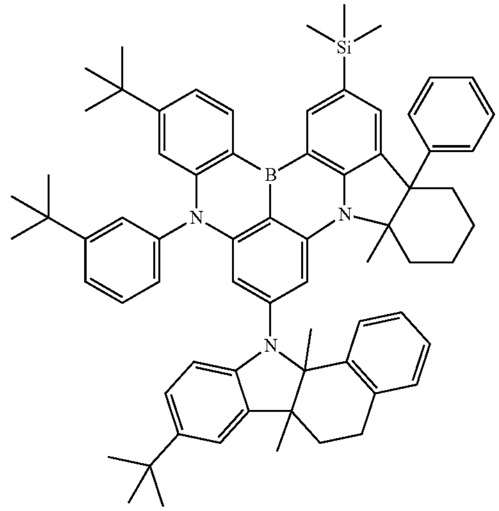
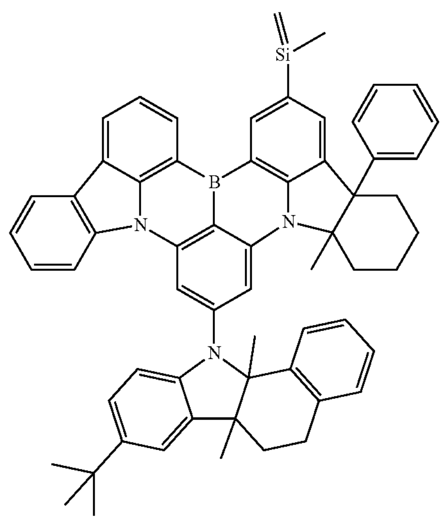
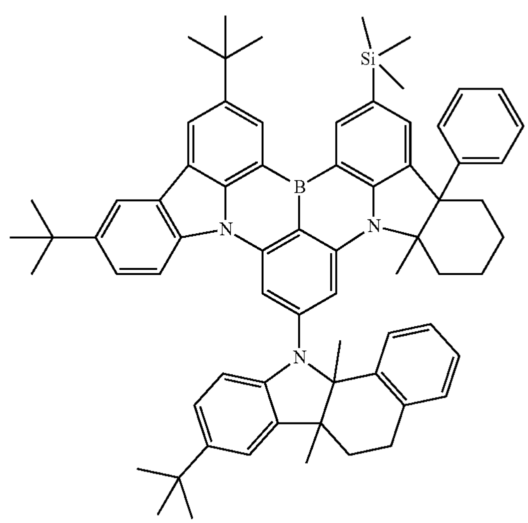

-continued
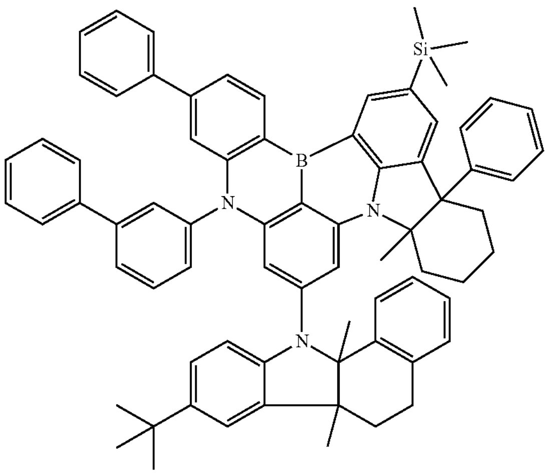
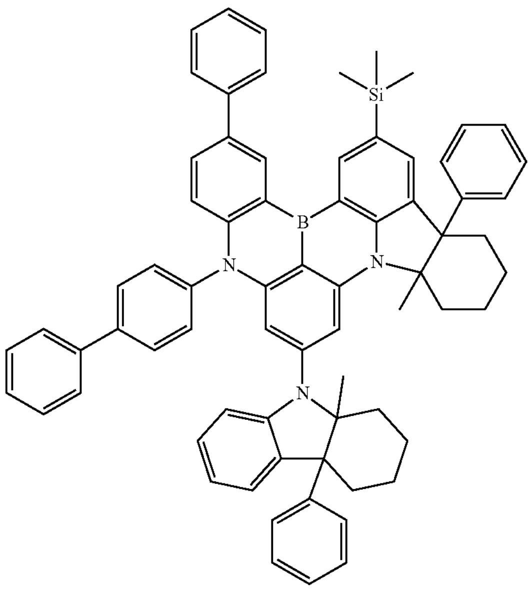
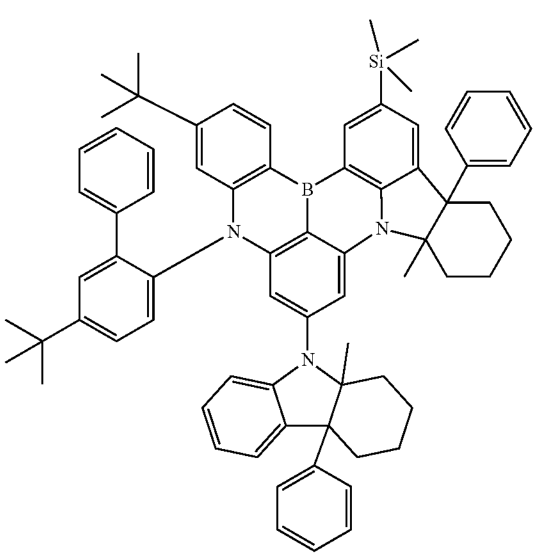
-continued
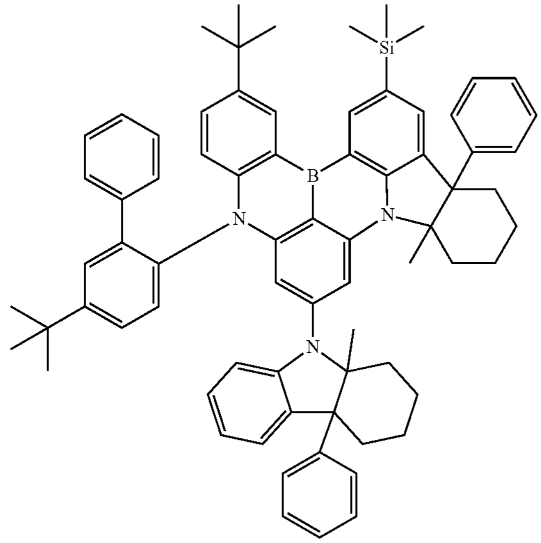
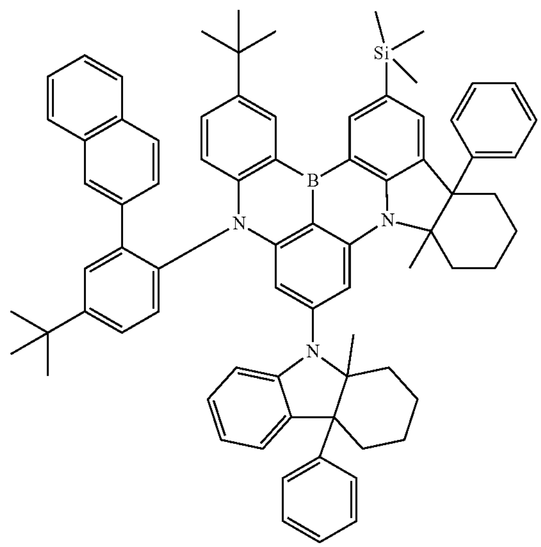
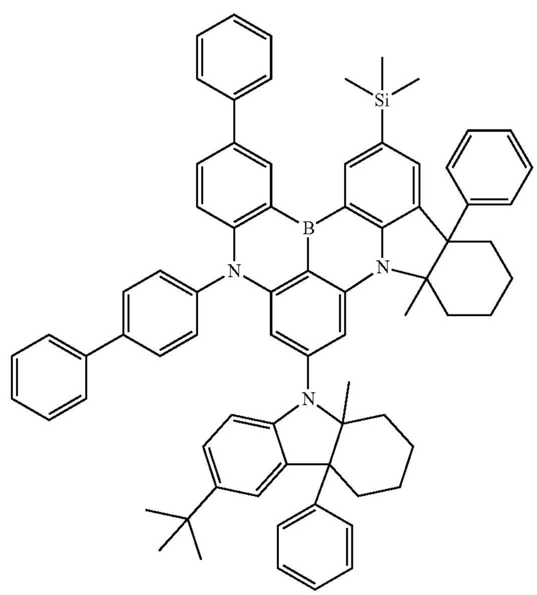

-continued
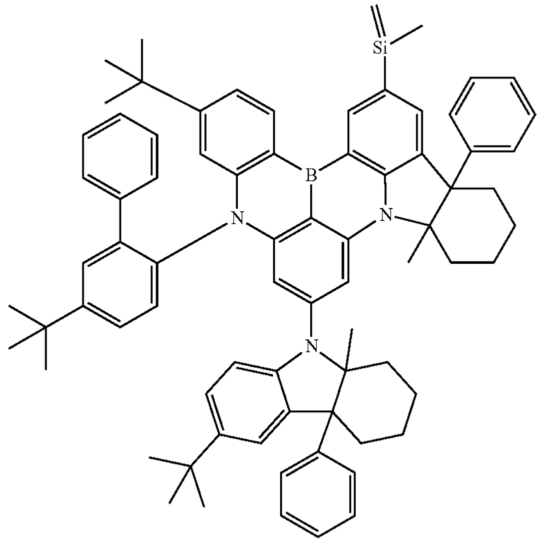
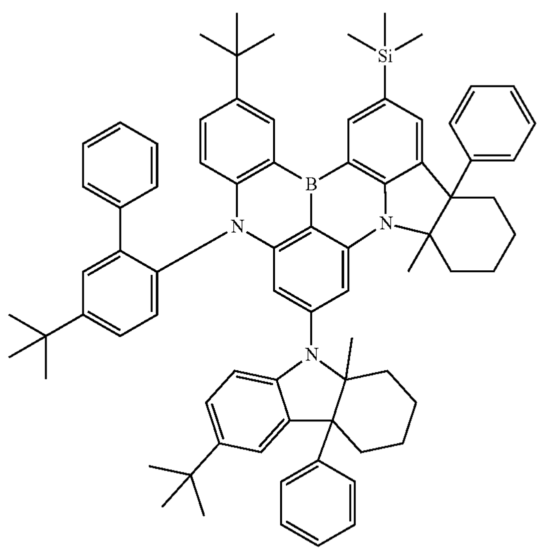
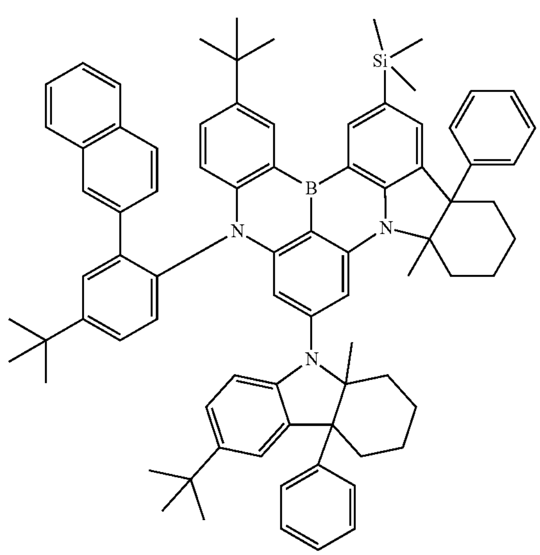
-continued
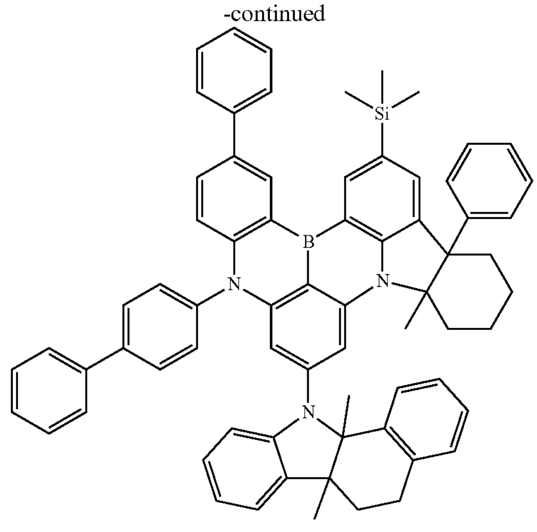
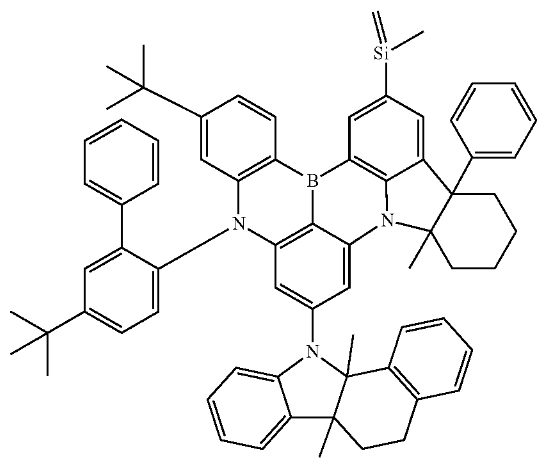
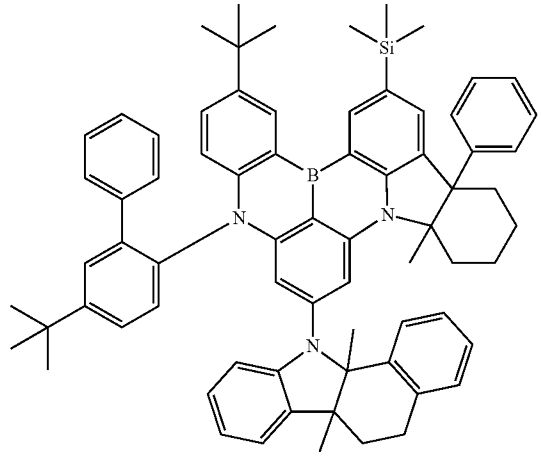

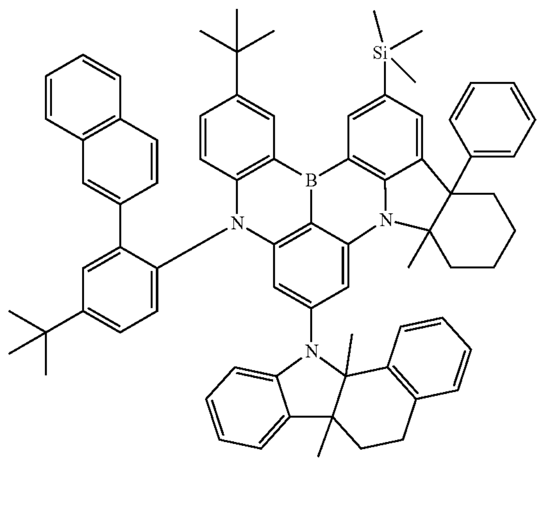
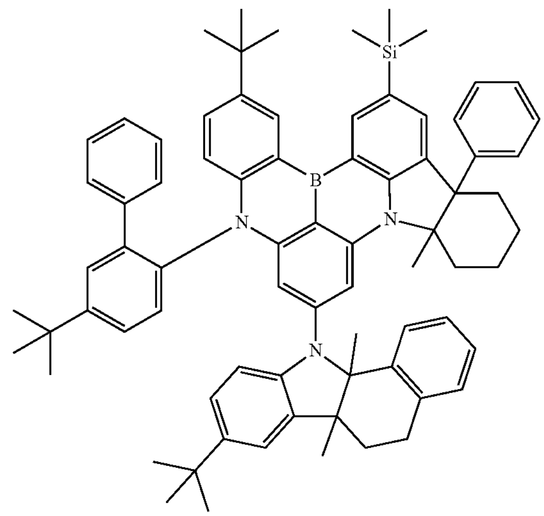
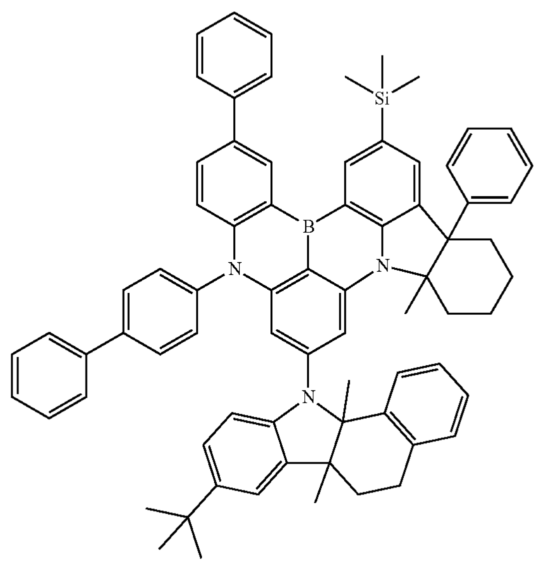
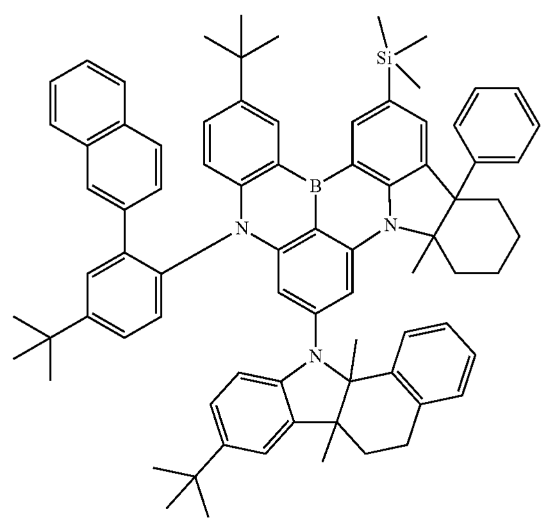
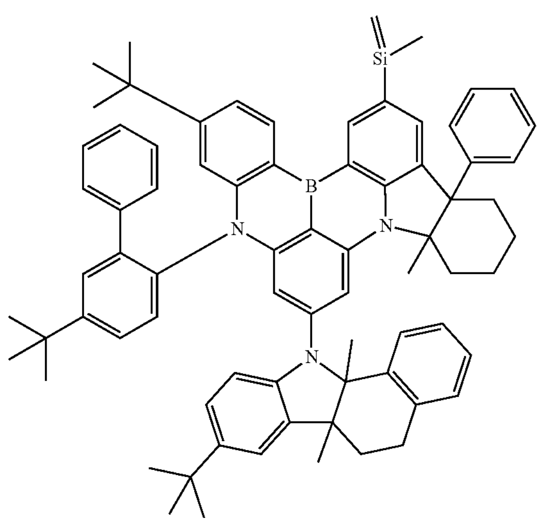
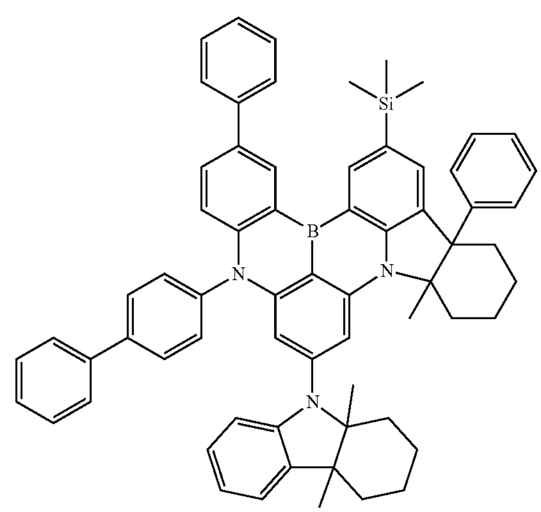

-continued
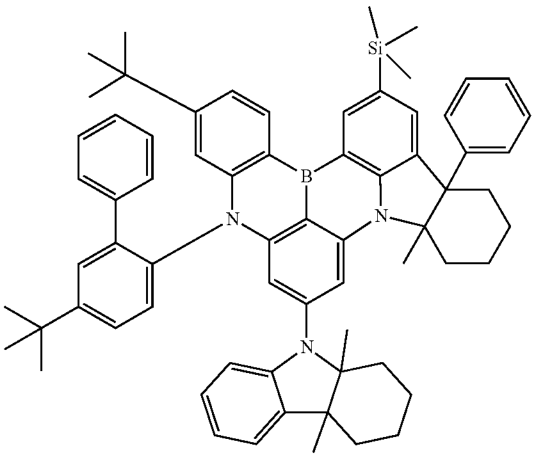
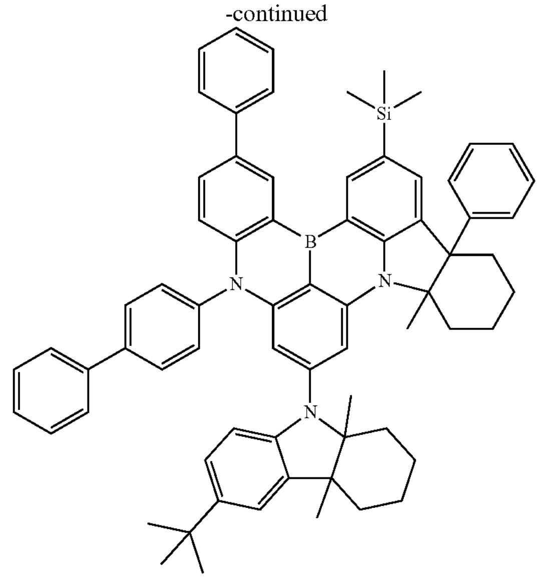
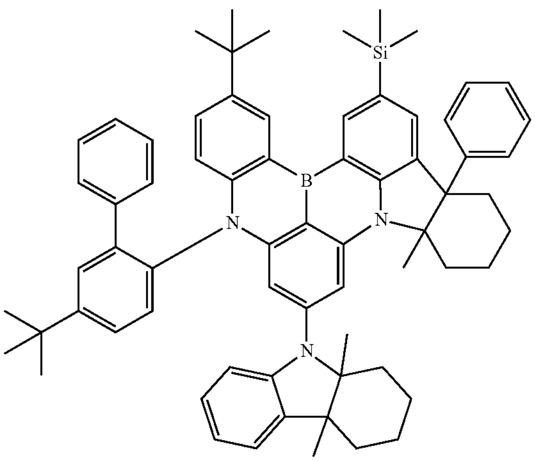
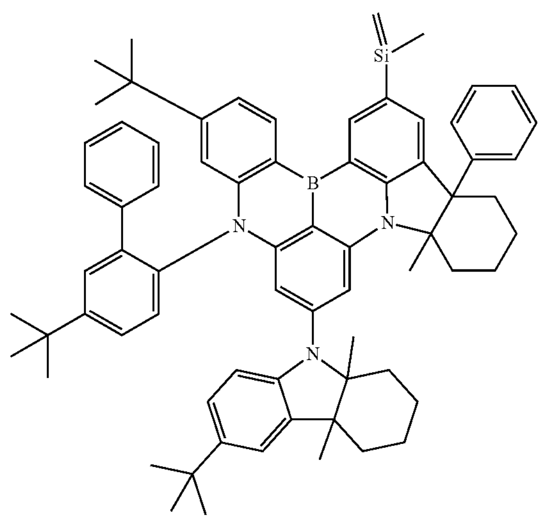
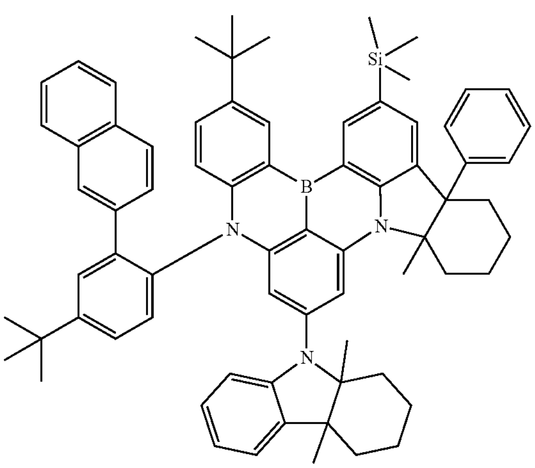
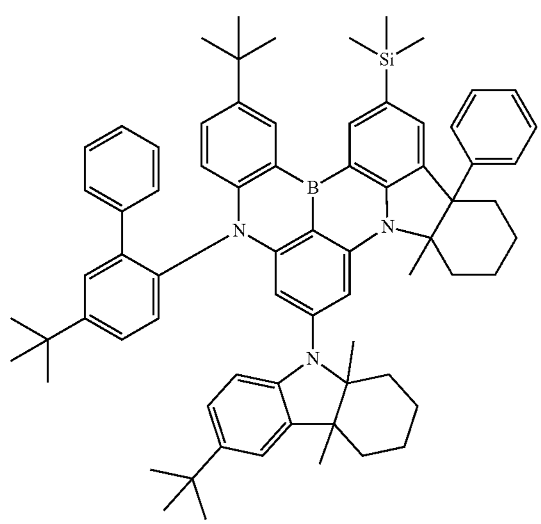

-continued
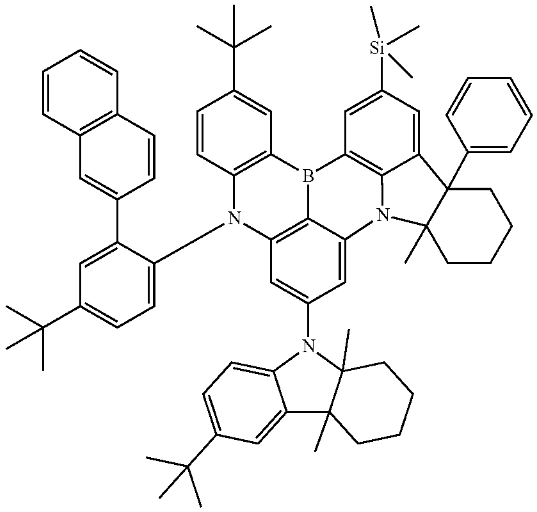
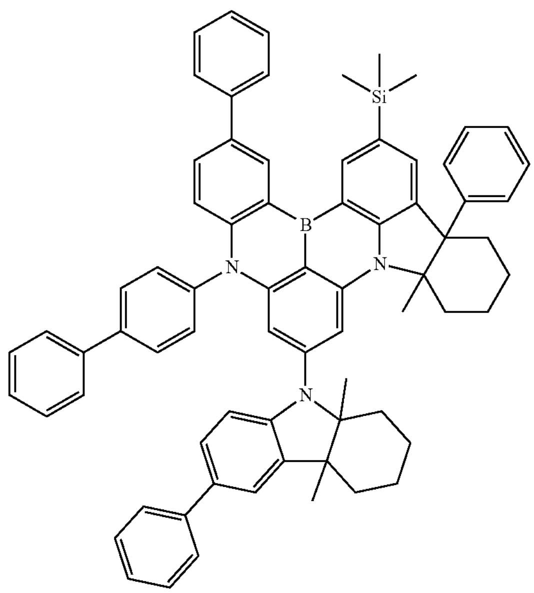
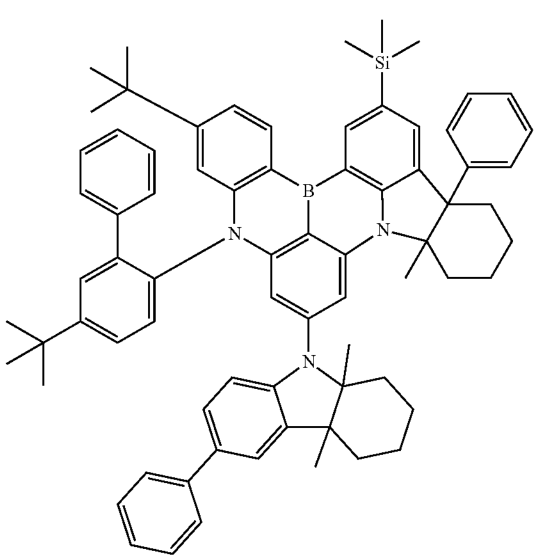
-continued
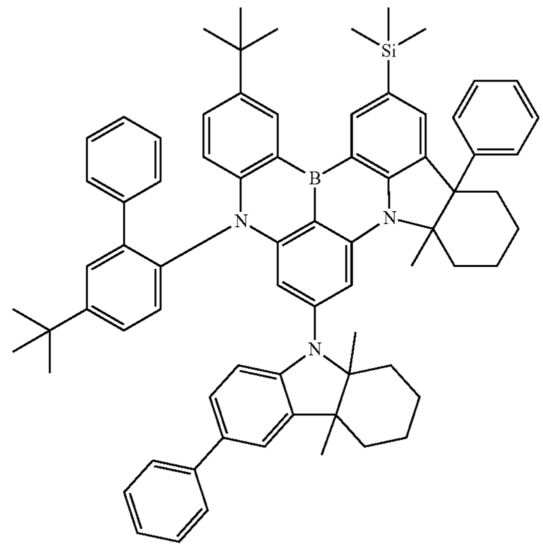
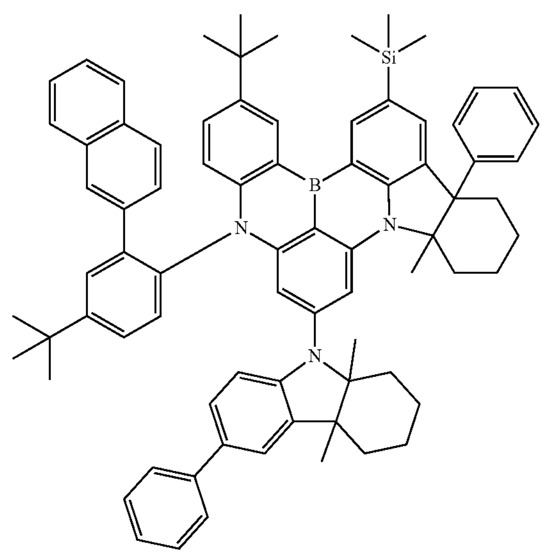
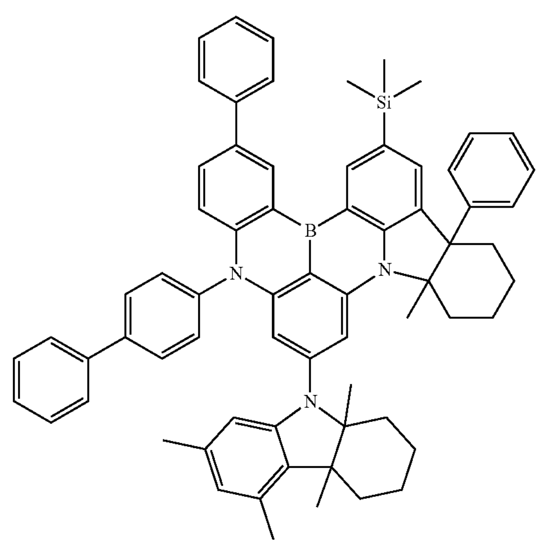

-continued
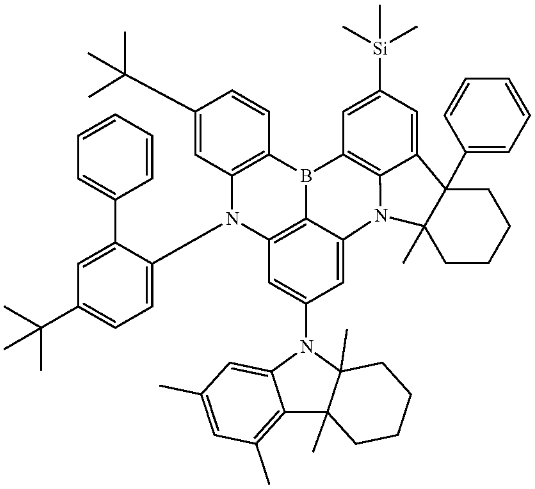
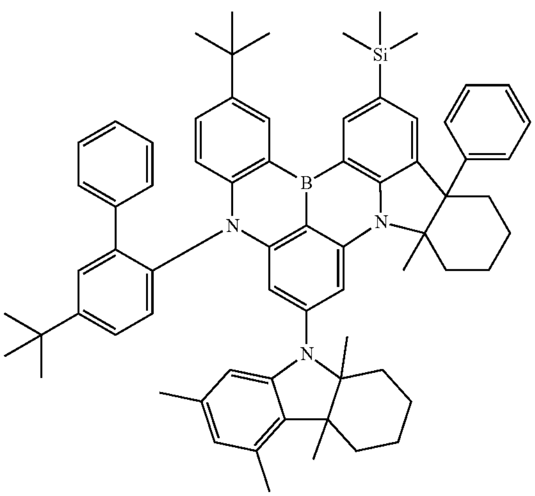
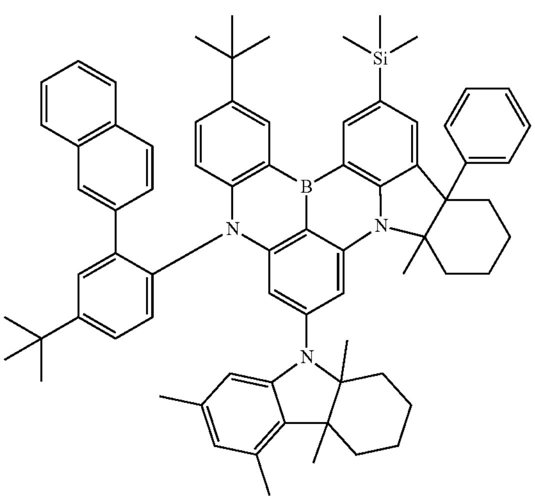
-continued
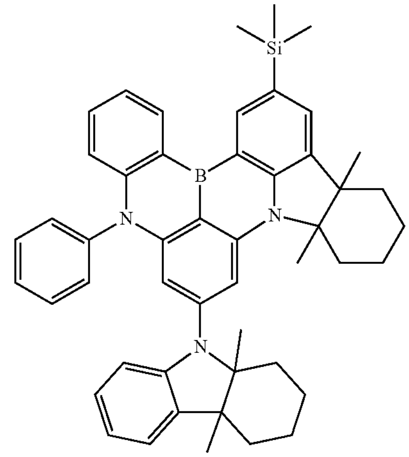
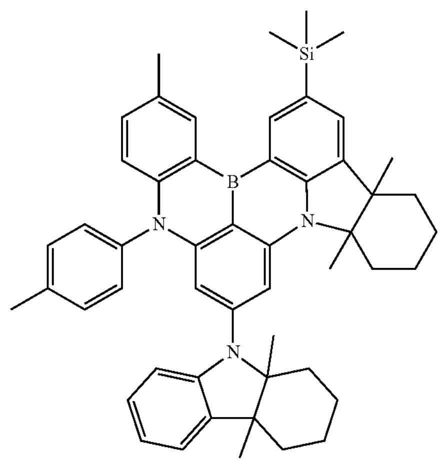
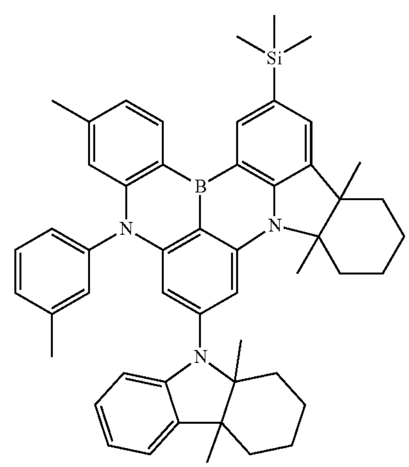

-continued
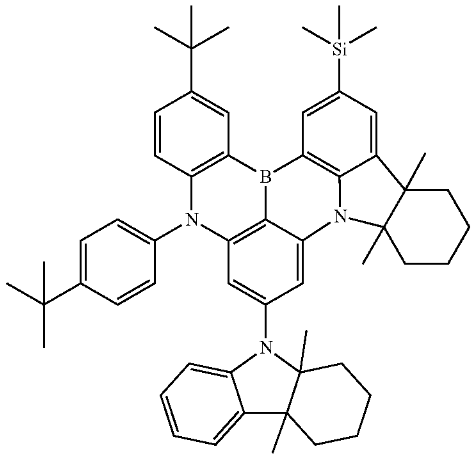
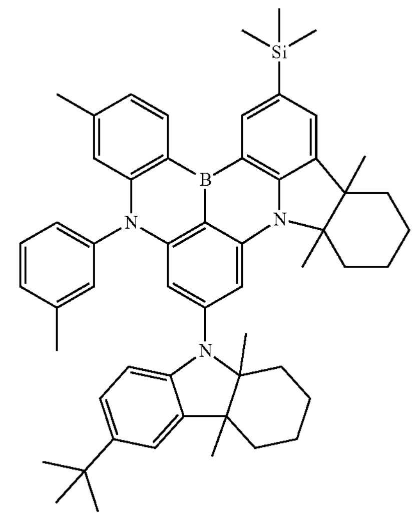
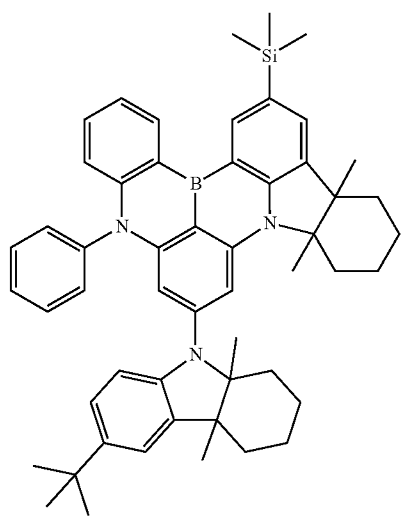
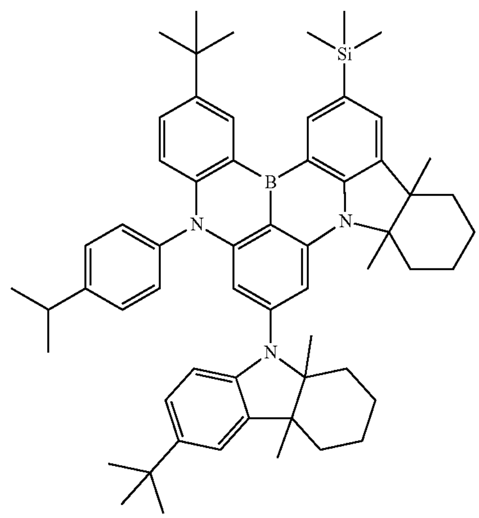
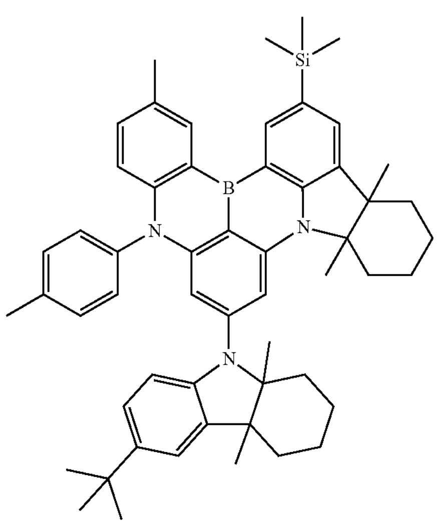
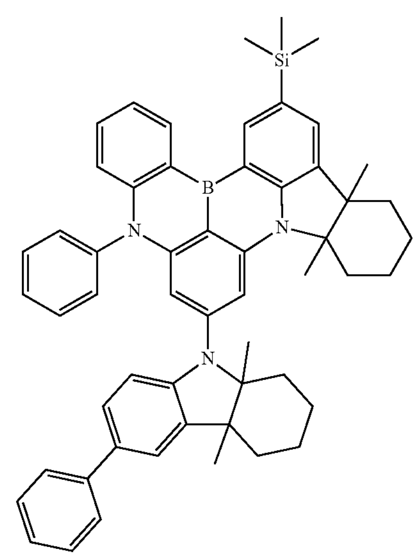
-continued

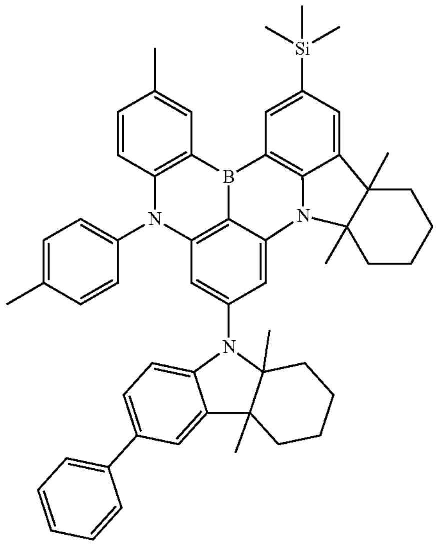
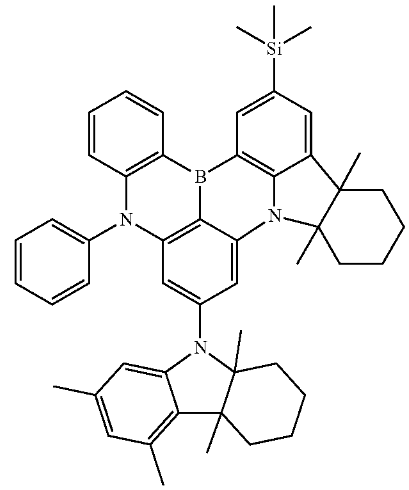
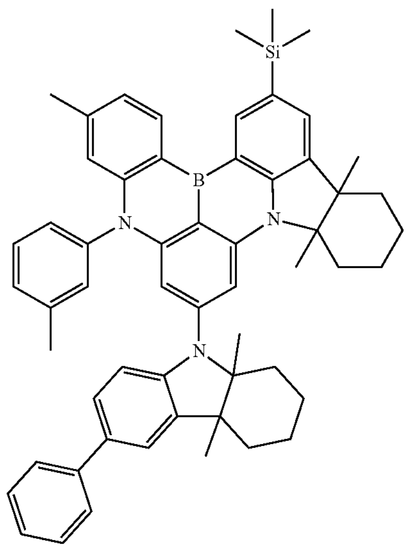
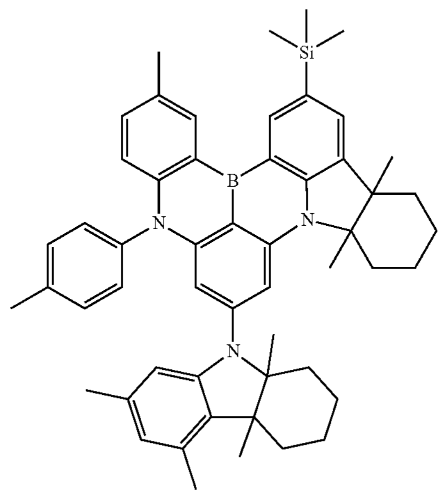
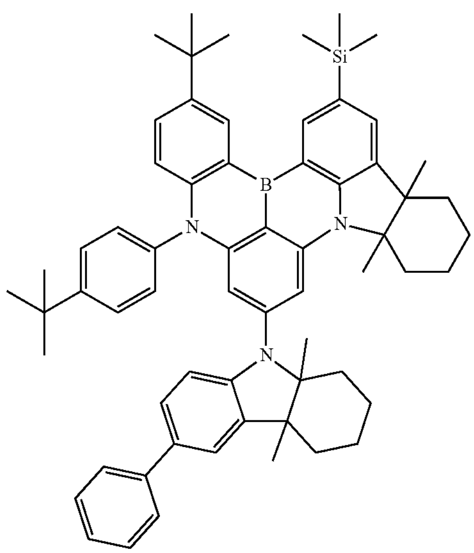
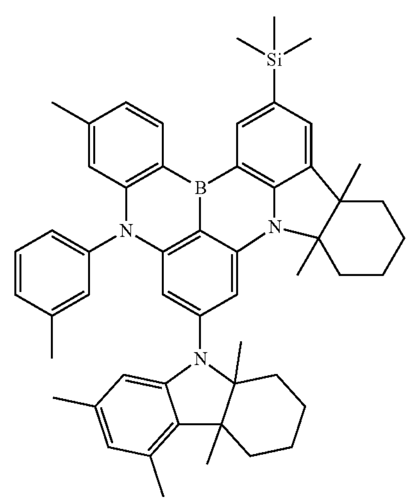

-continued
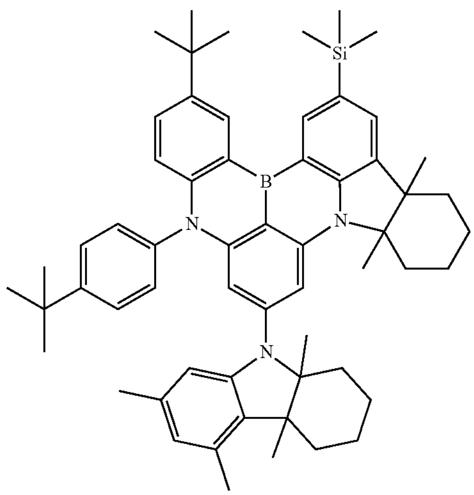
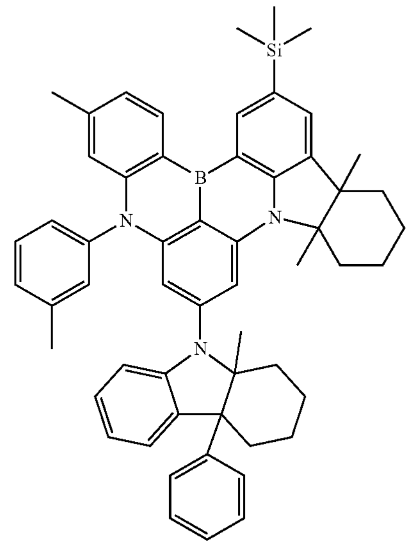
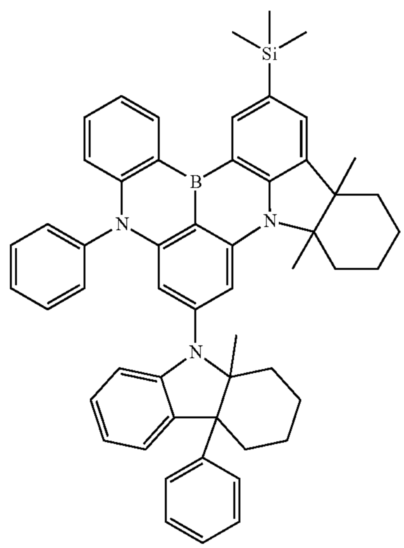
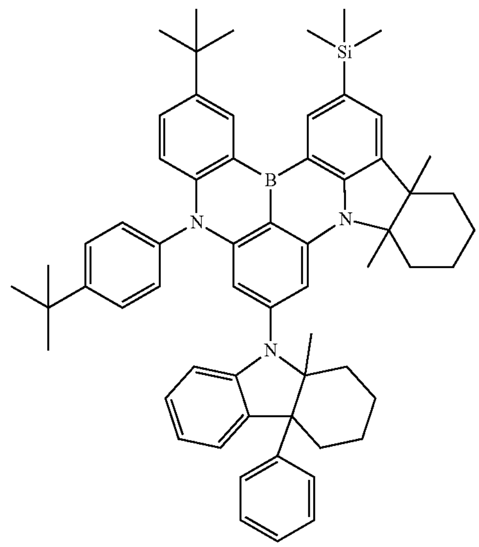
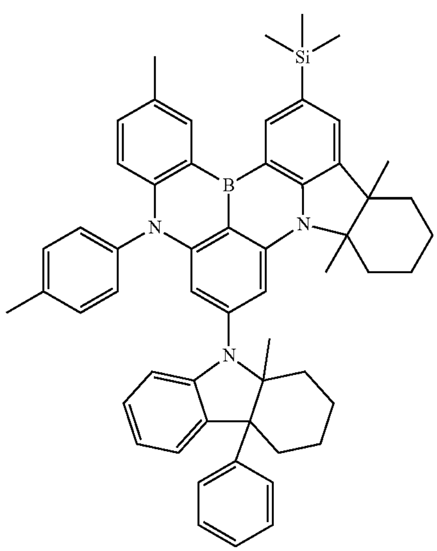
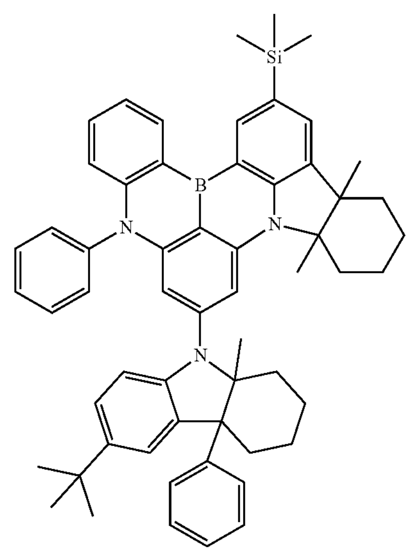

-continued
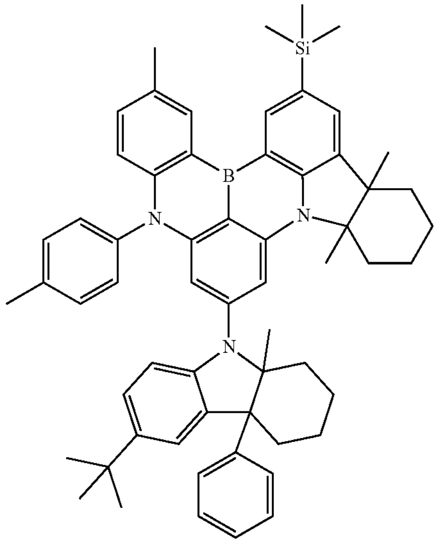
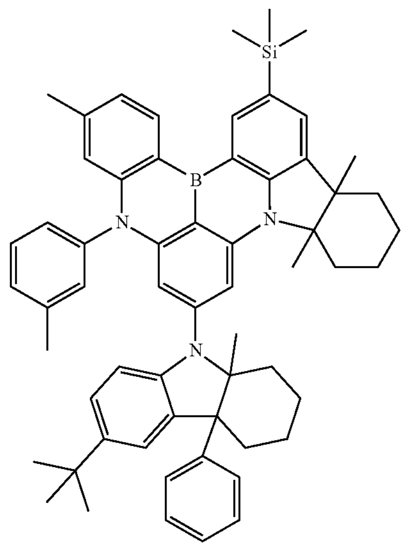
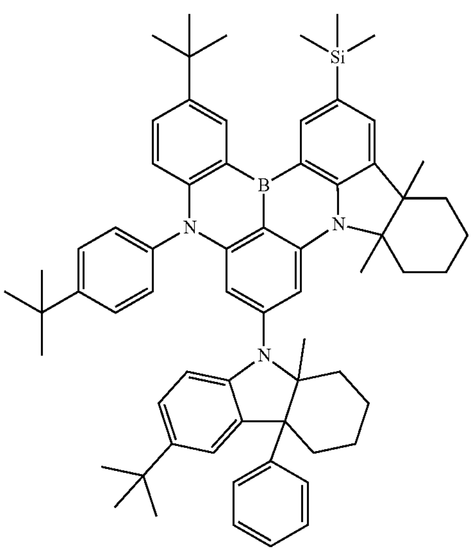
-continued
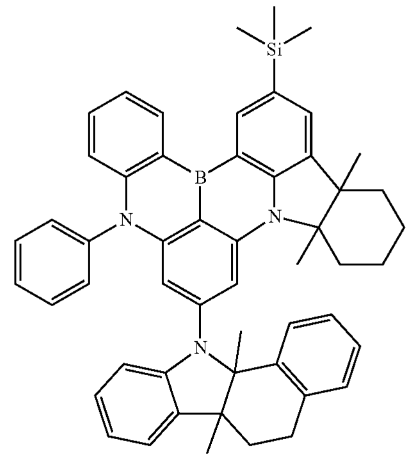
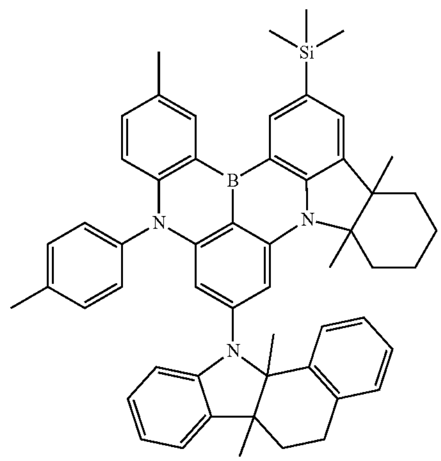
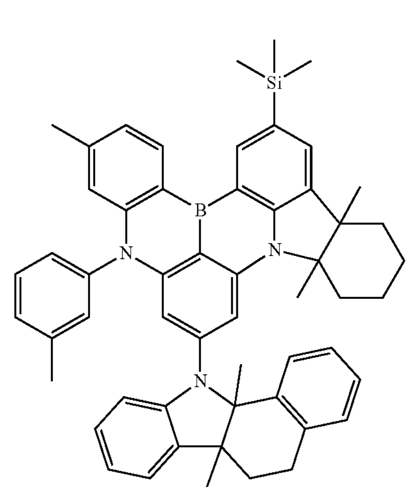

-continued
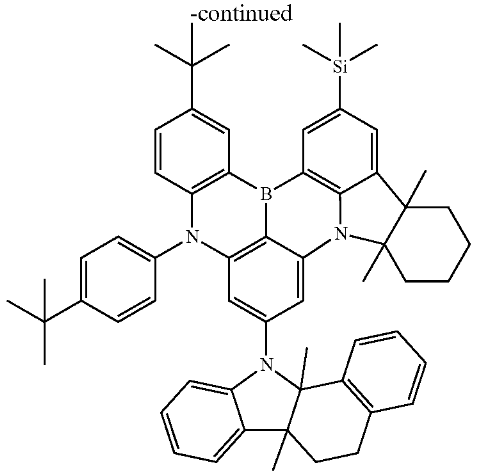
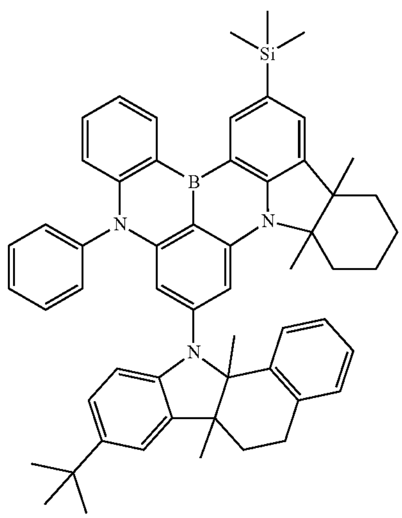
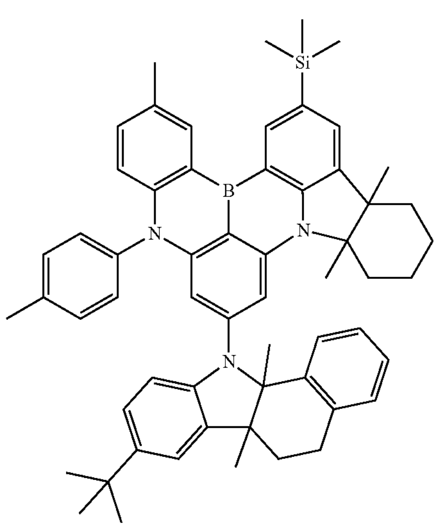
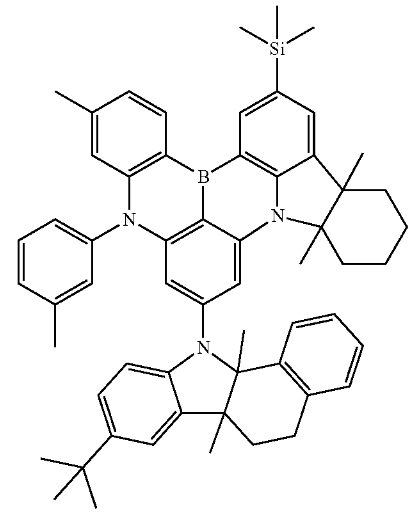
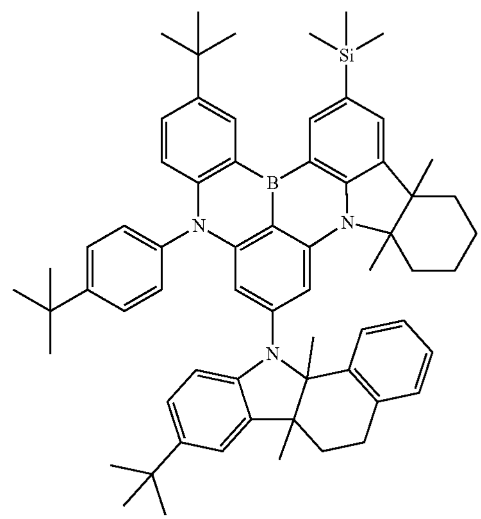
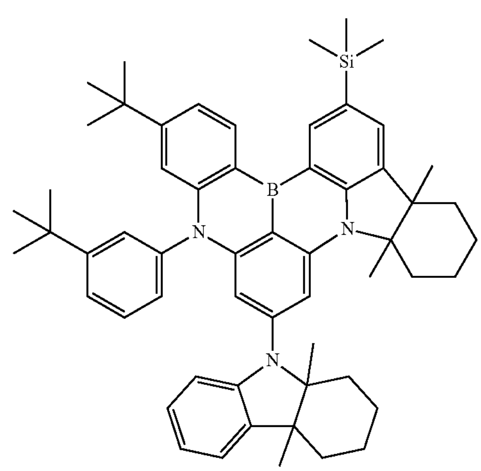

-continued
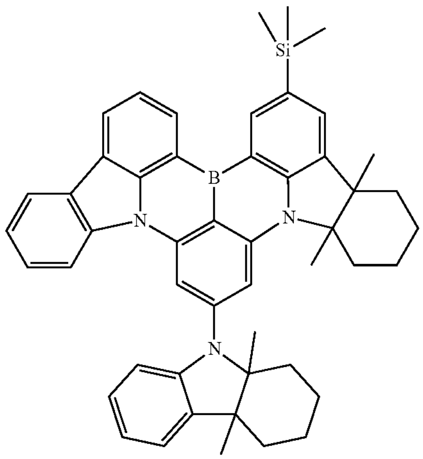
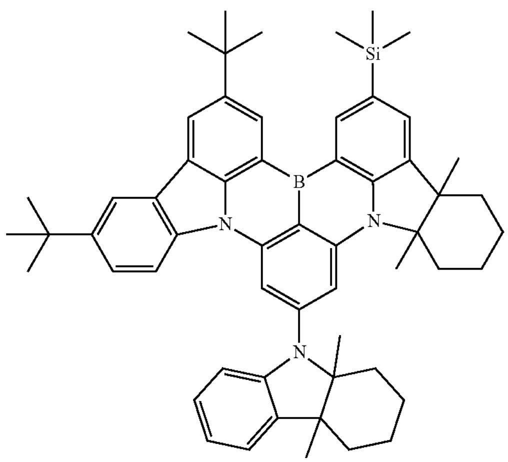
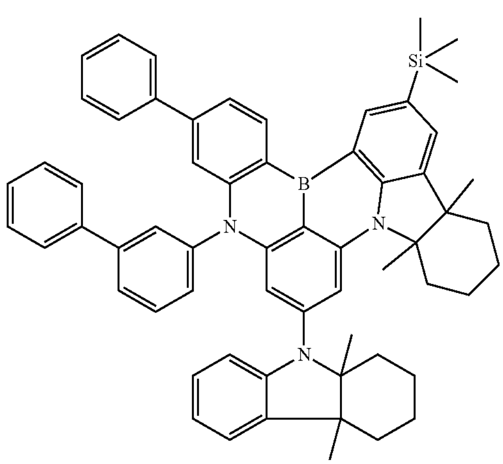
-continued
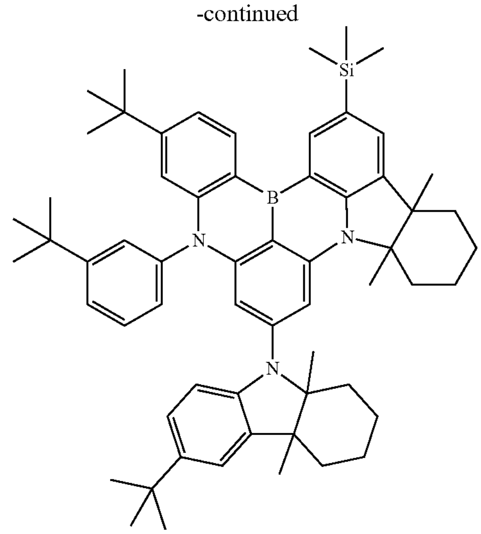
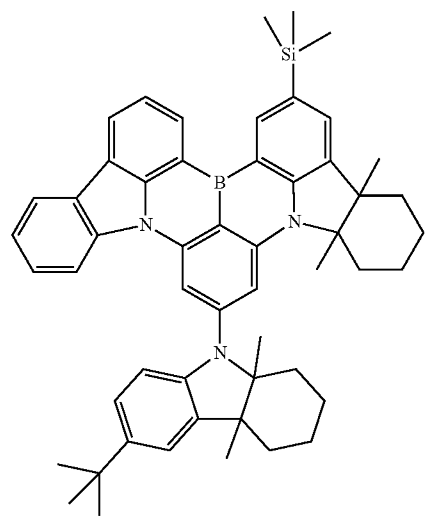
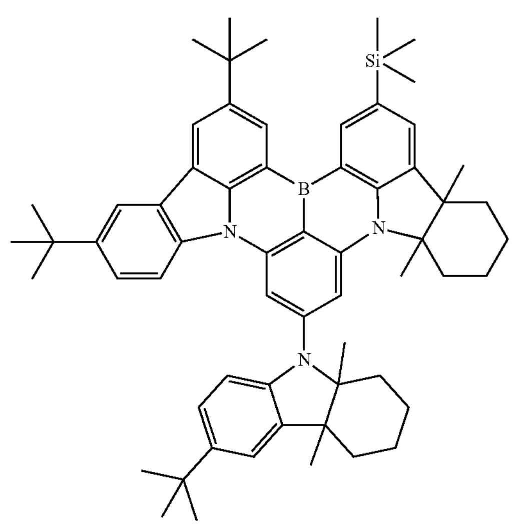

-continued
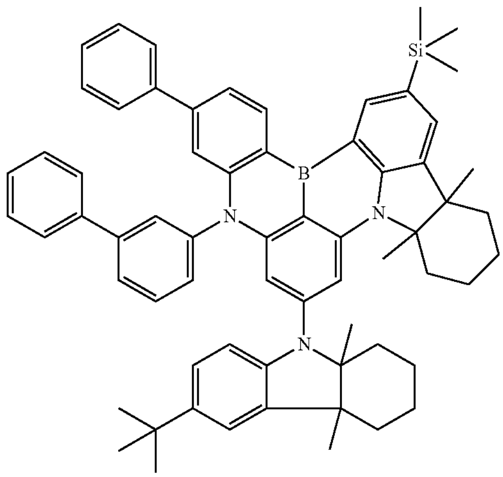
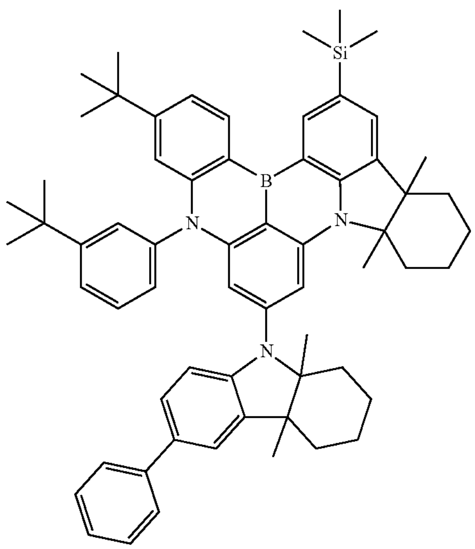
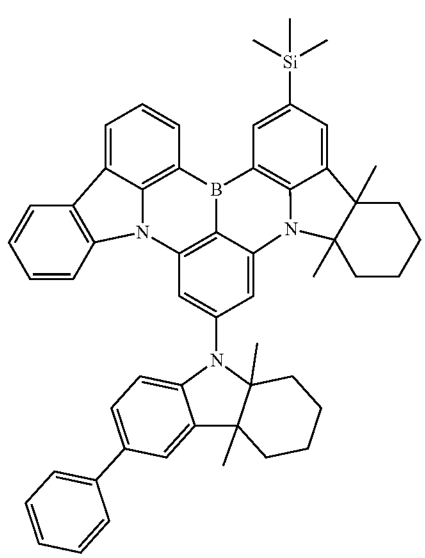
-continued
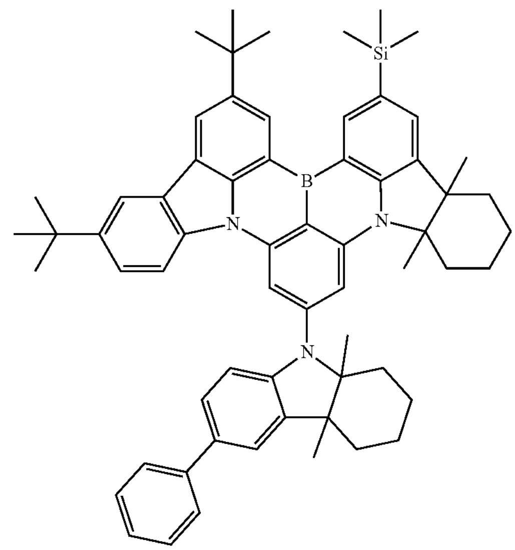
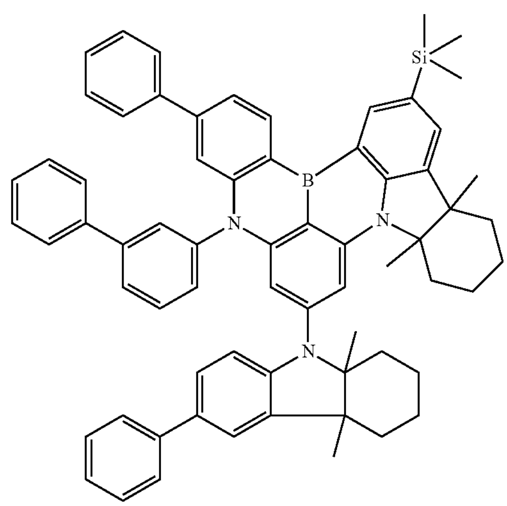
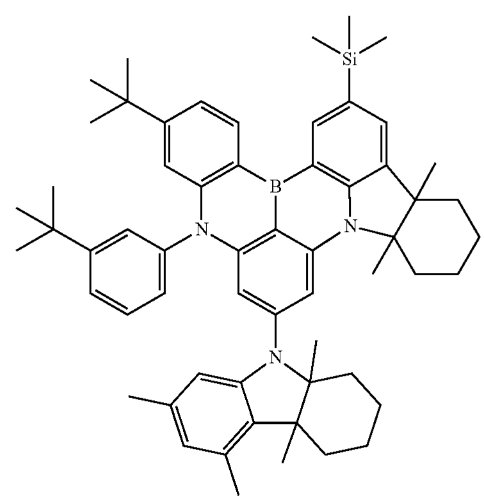

-continued
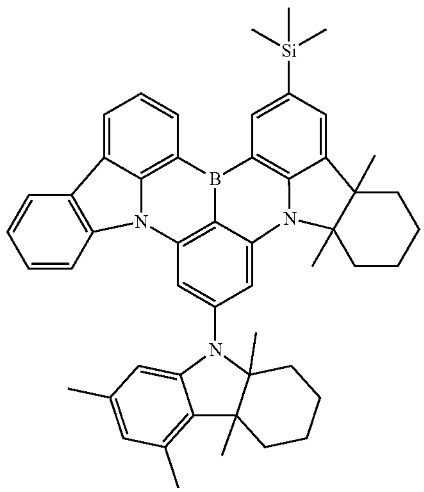
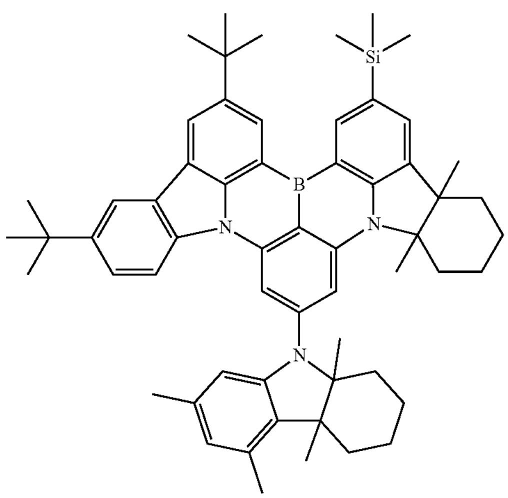
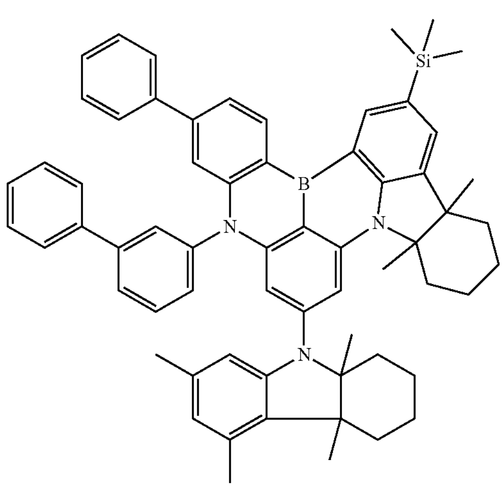
-continued
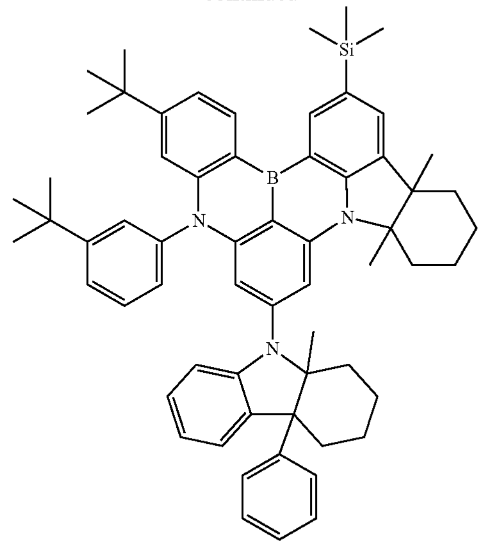
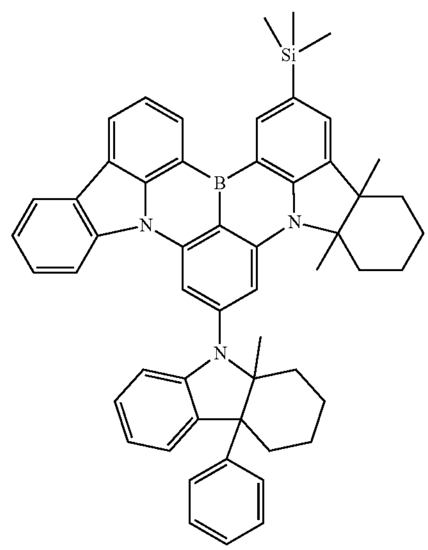
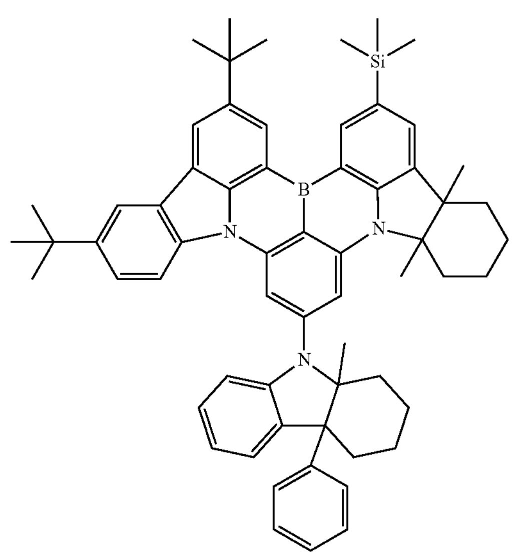

-continued
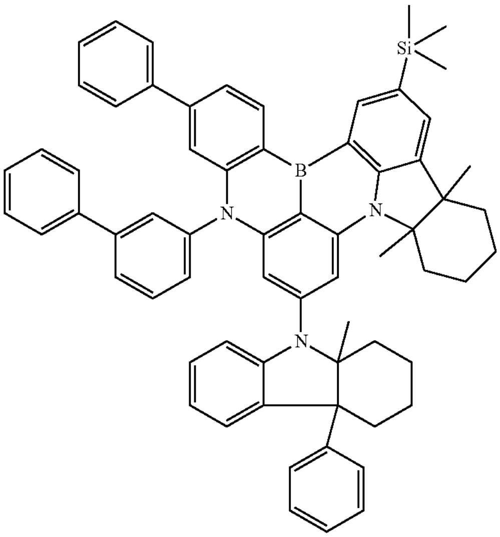
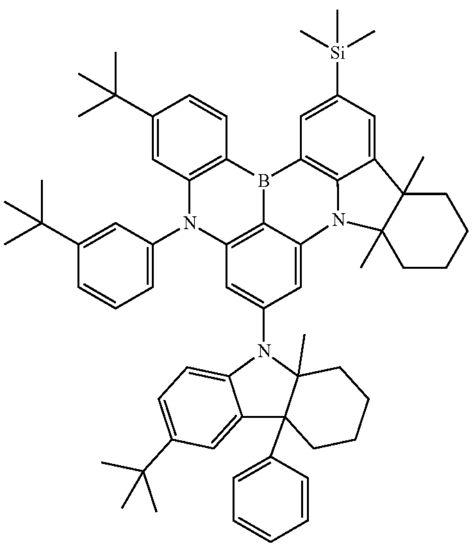
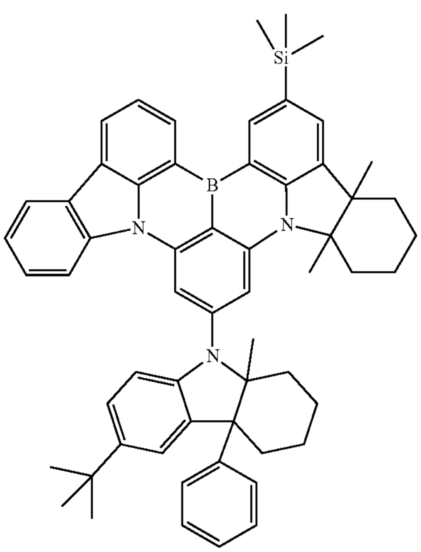
-continued
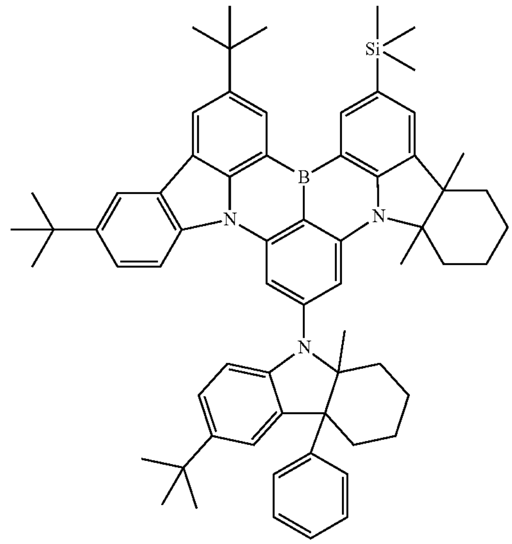
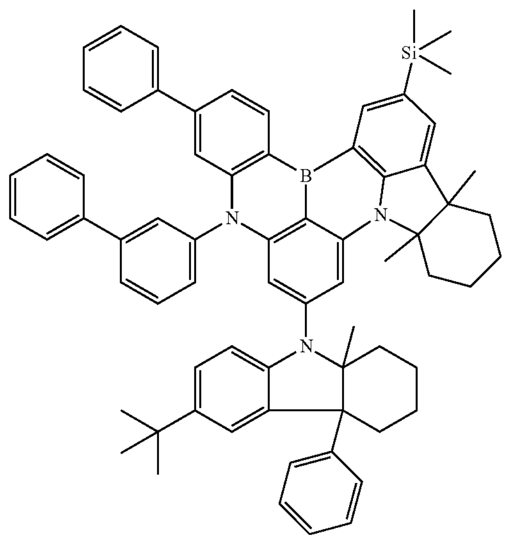
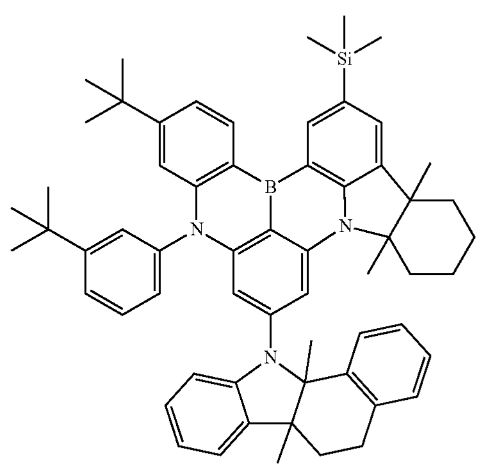

-continued
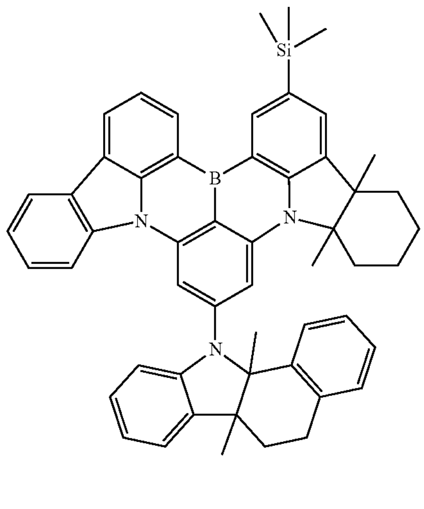
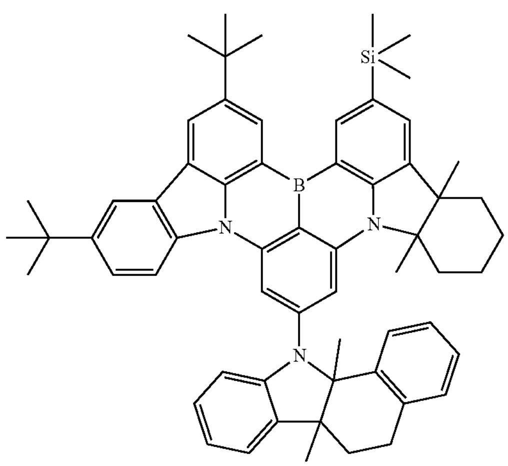
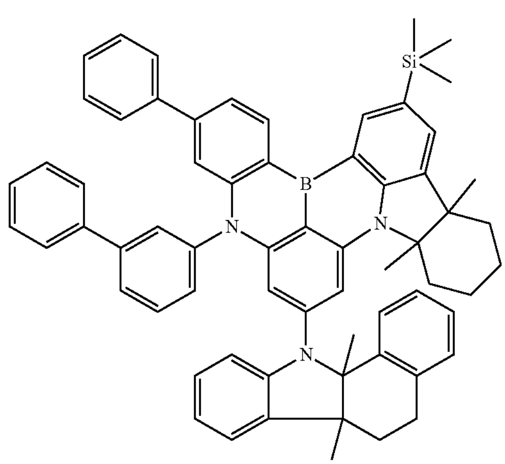
-continued
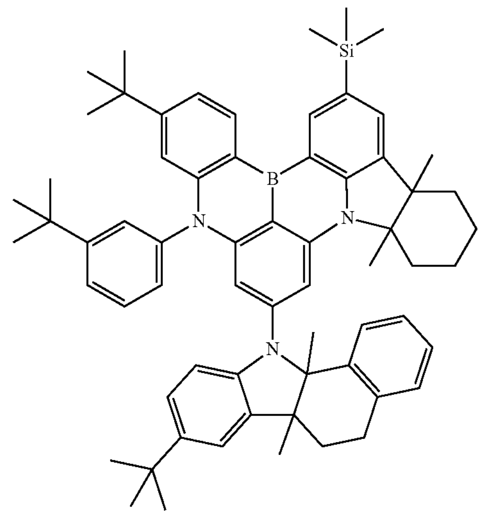
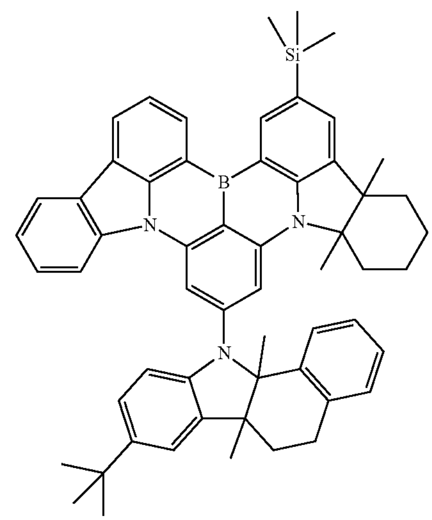
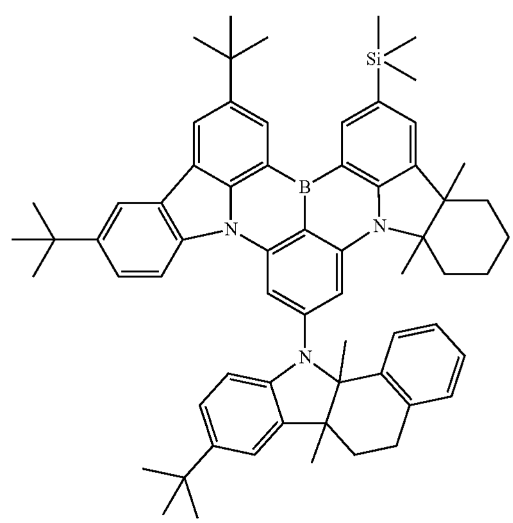

-continued
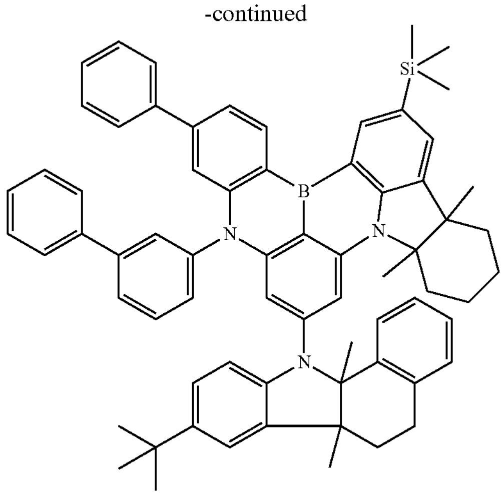
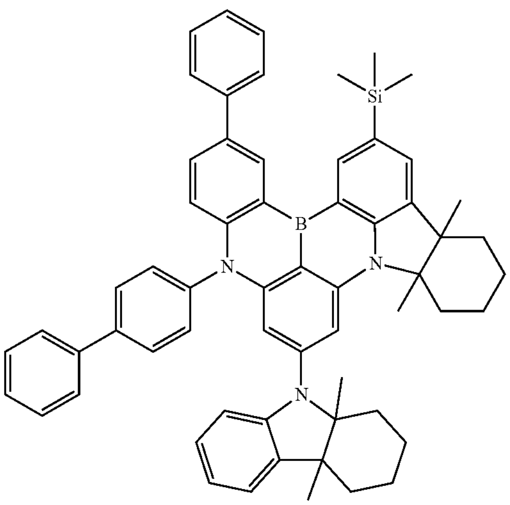
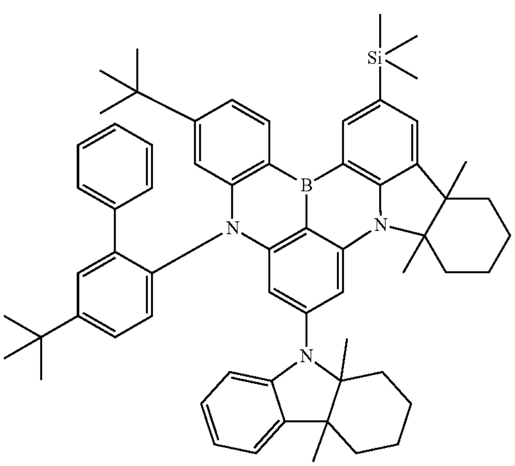
-continued
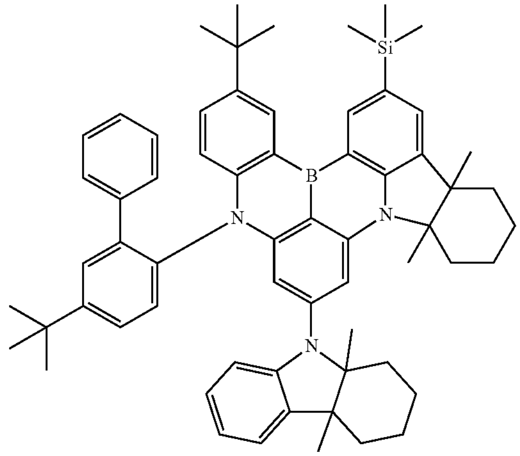
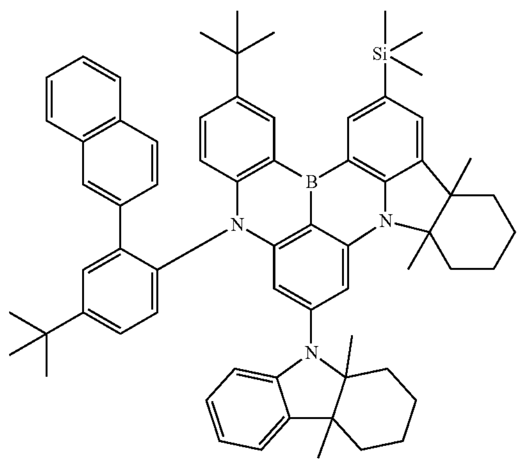
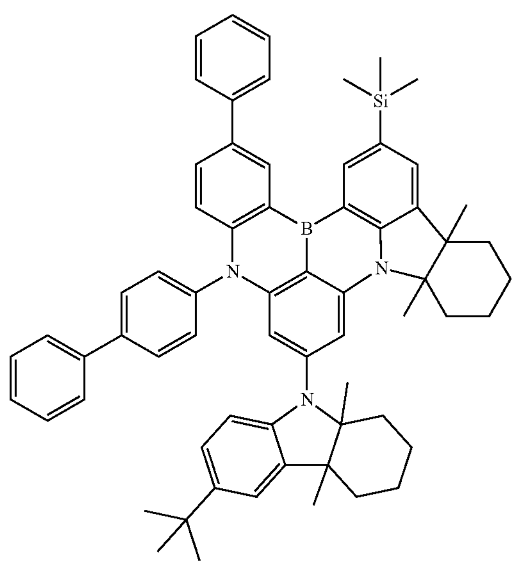

-continued
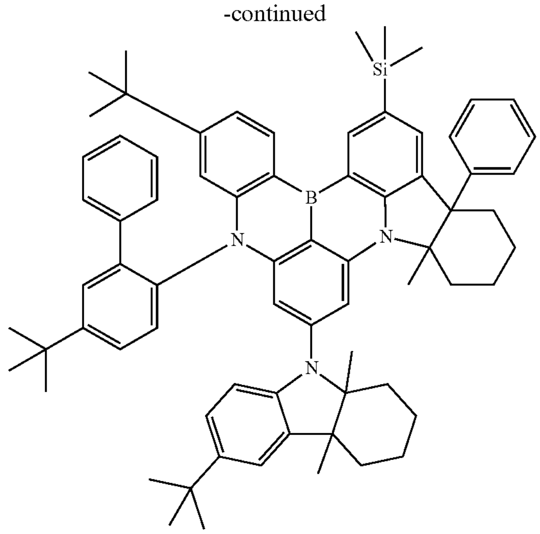
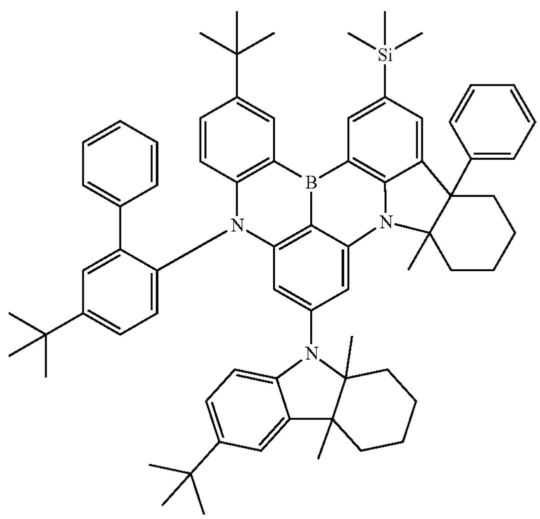
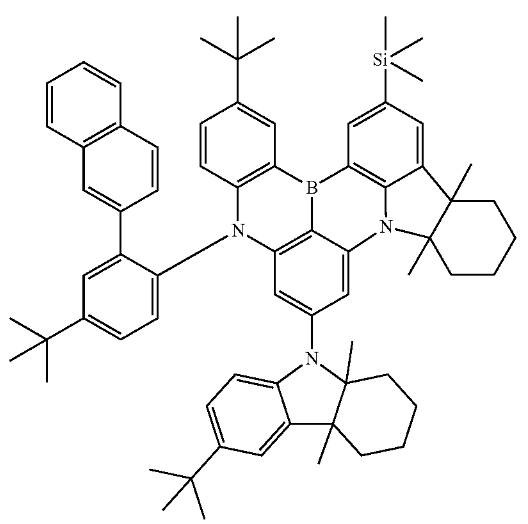
-continued
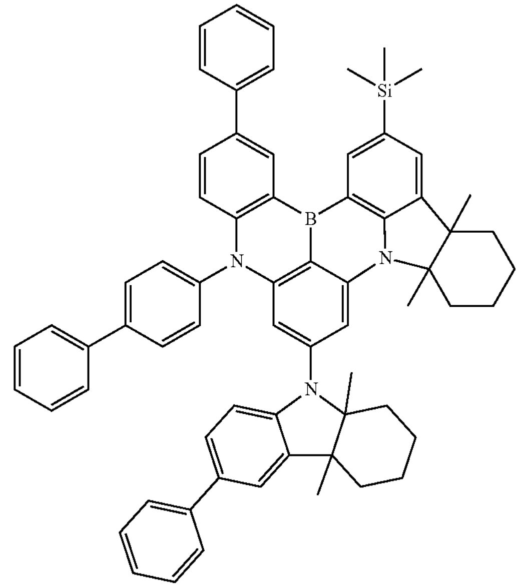
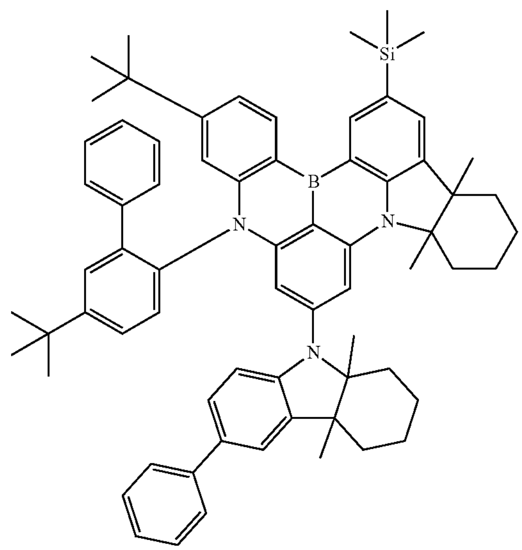
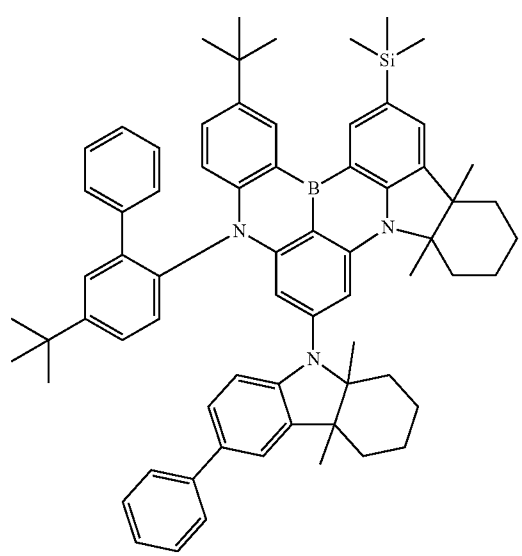

-continued
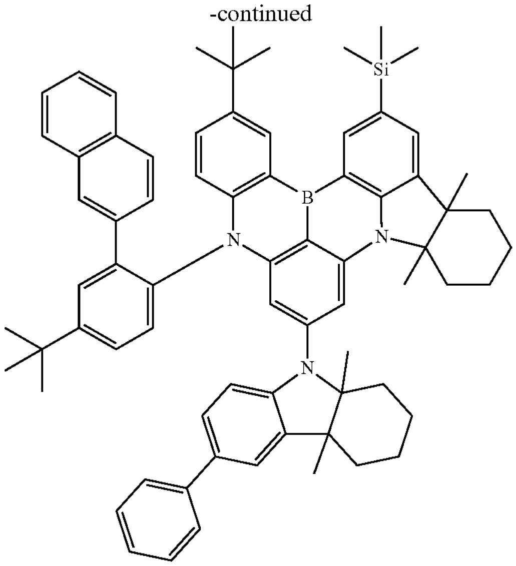
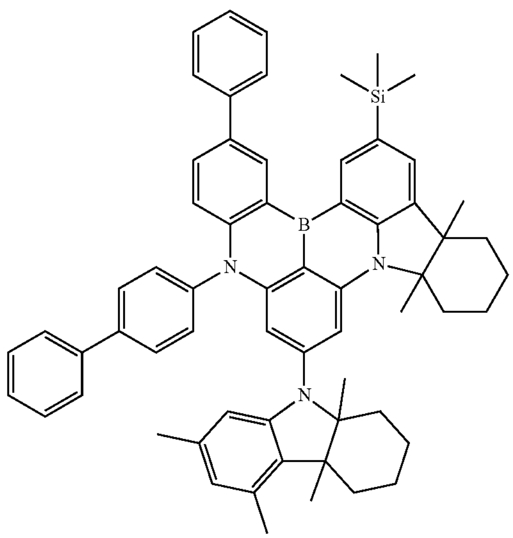
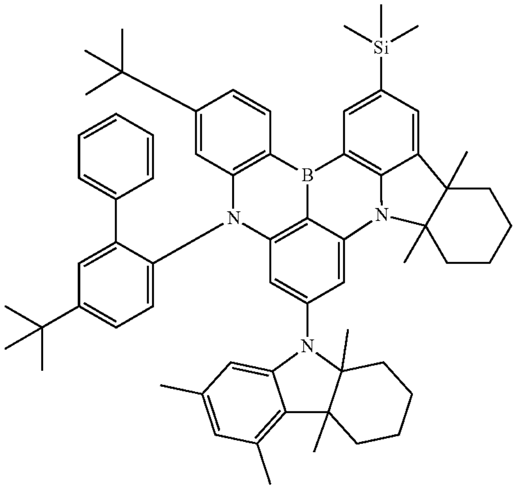
-continued
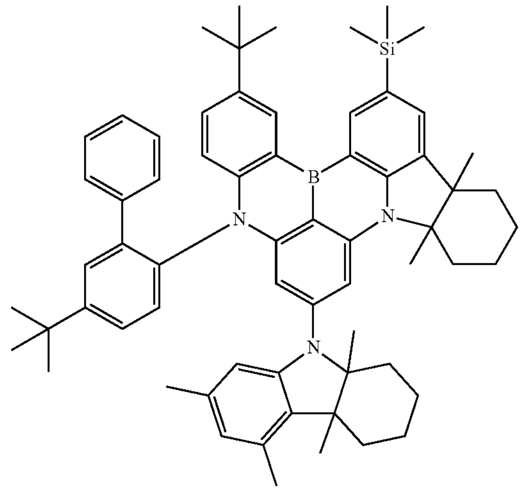
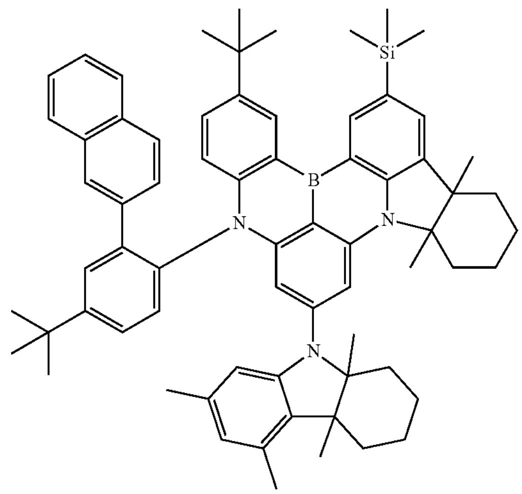 [SMILES: Cc1cc(C)c2c(c1)N(c1cc3c4c(c1)N1c5c(cc([Si](C)(C)C)cc5C5(C)CCCCC15C)B4c1cc(C(C)(C)C)ccc1N3c1ccc(C(C)(C)C)cc1-c1ccc3ccccc3c1)C1(C)CCCCC21C]
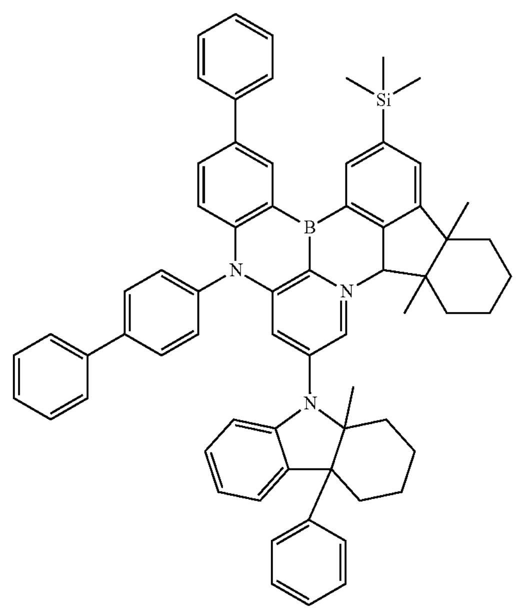

-continued
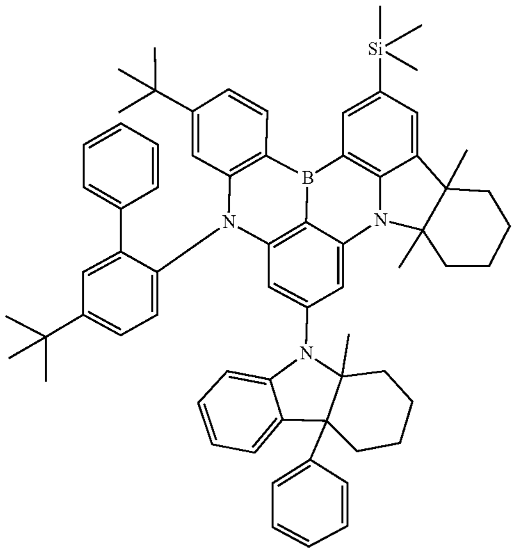
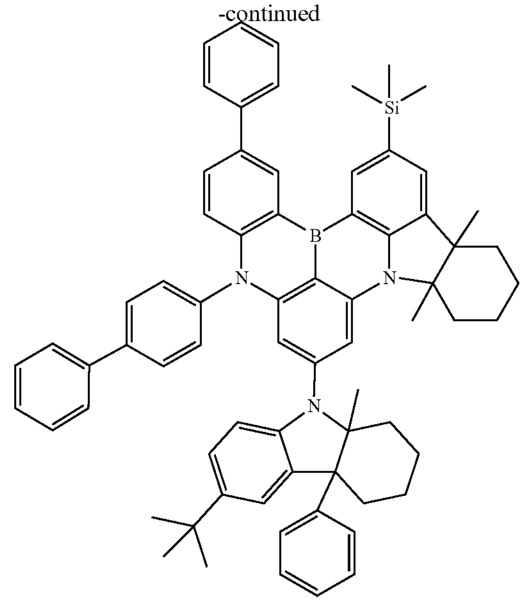
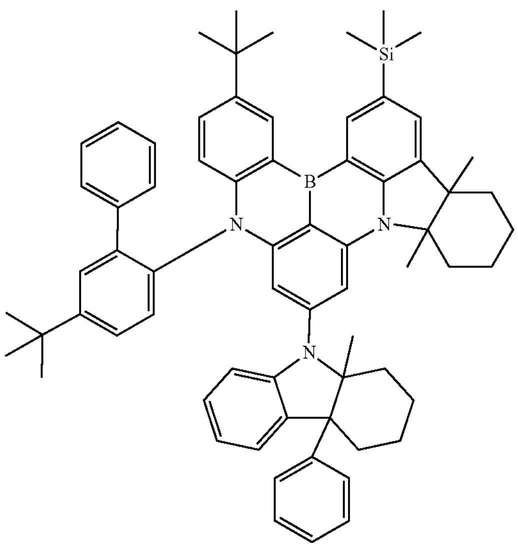
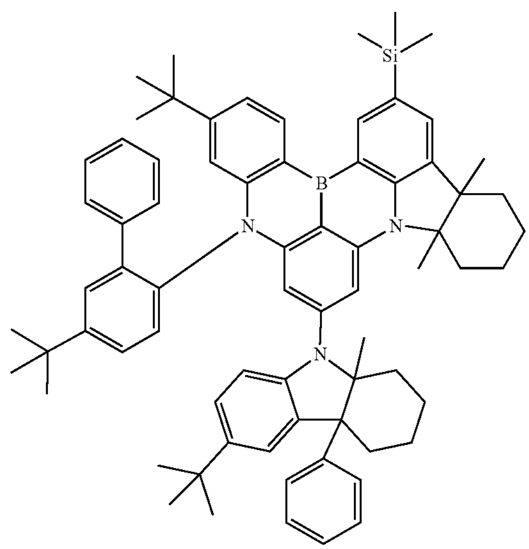
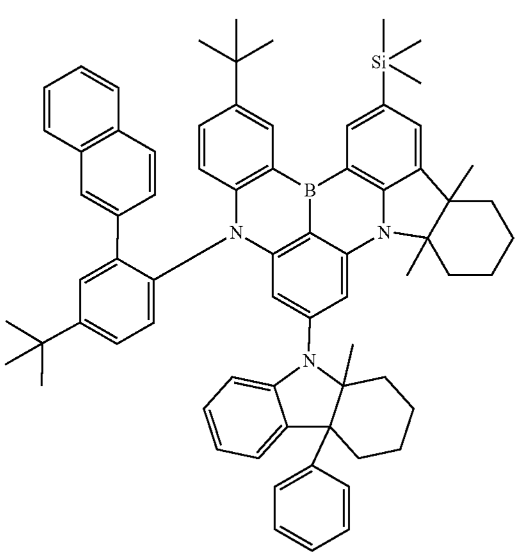
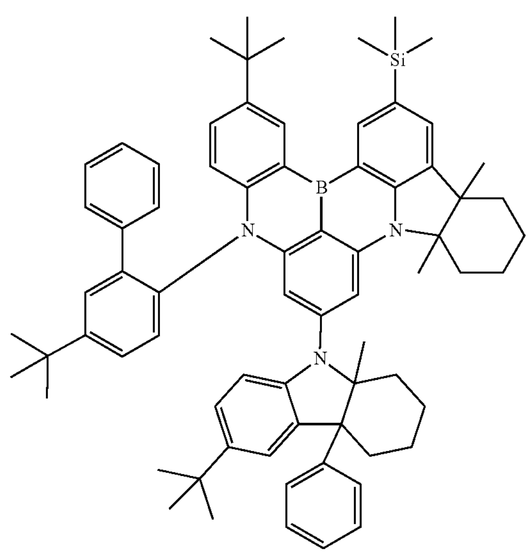

-continued
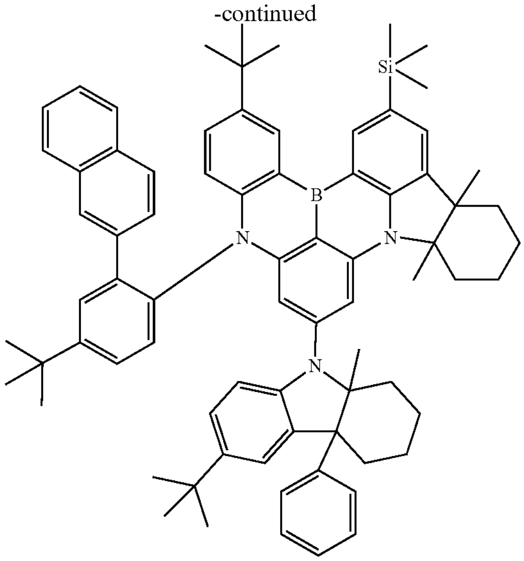
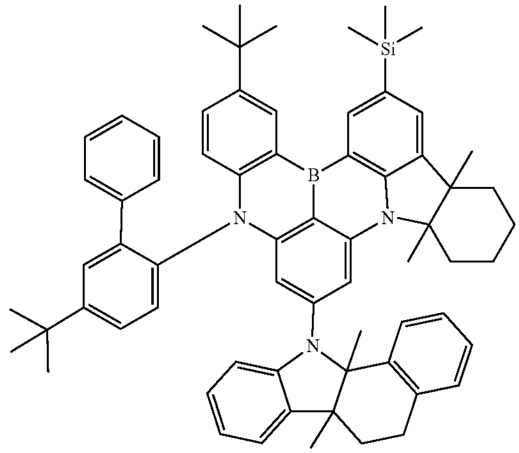
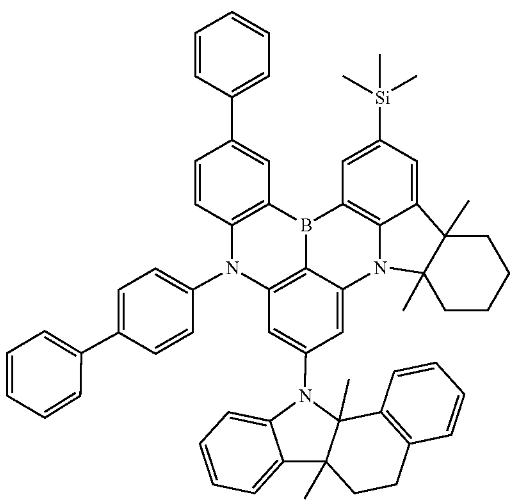
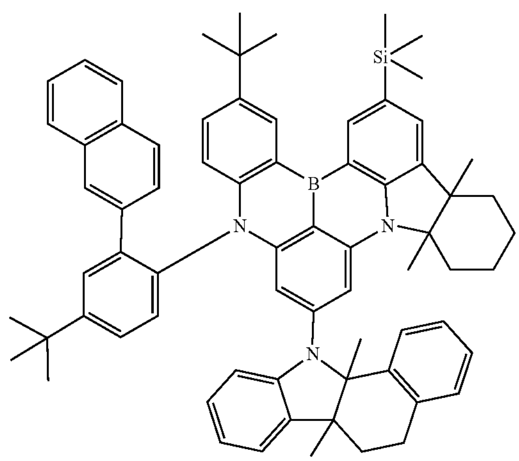
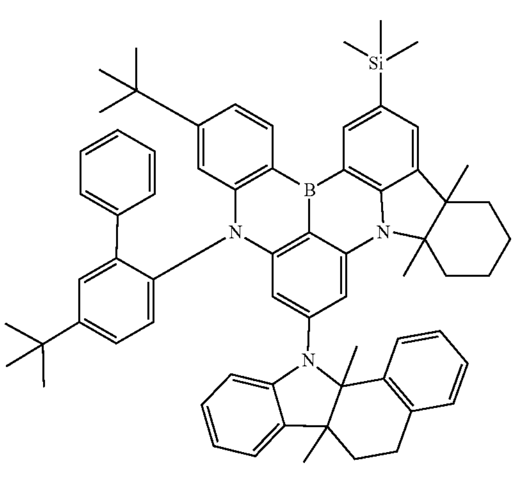
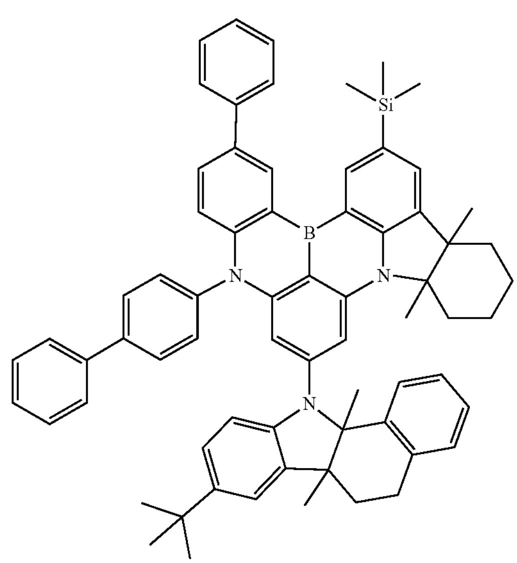
-continued -continued
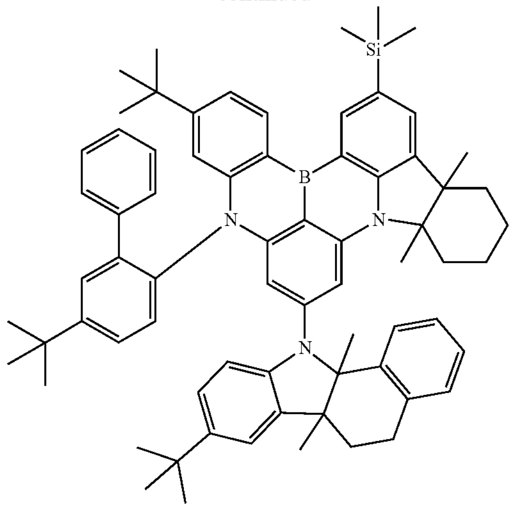
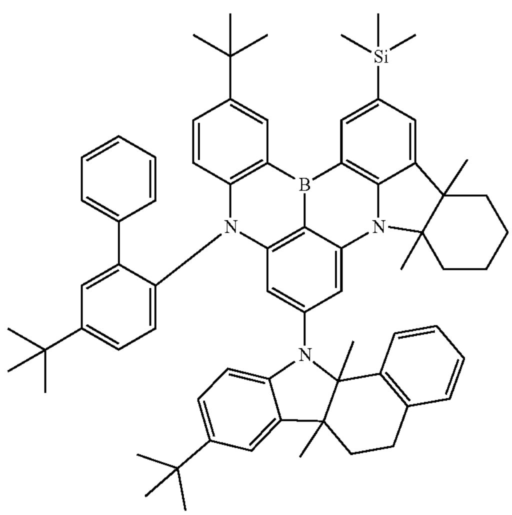
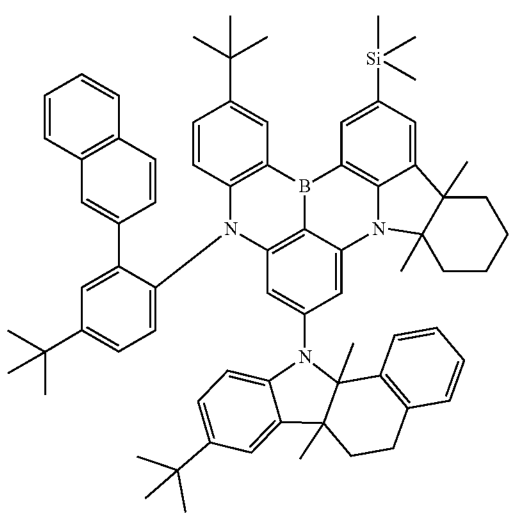
-continued
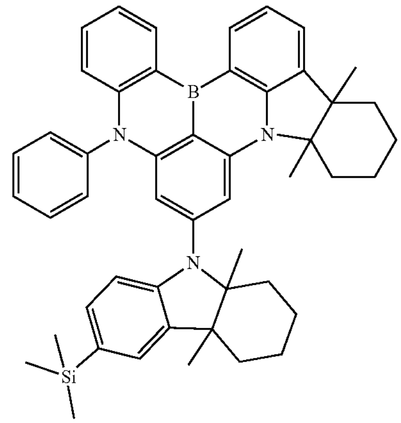
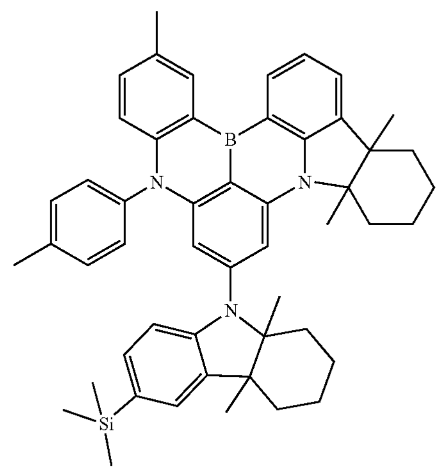
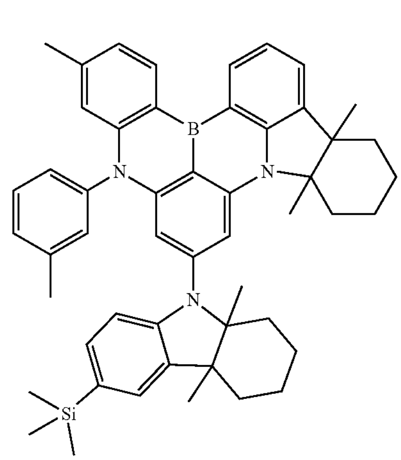

-continued
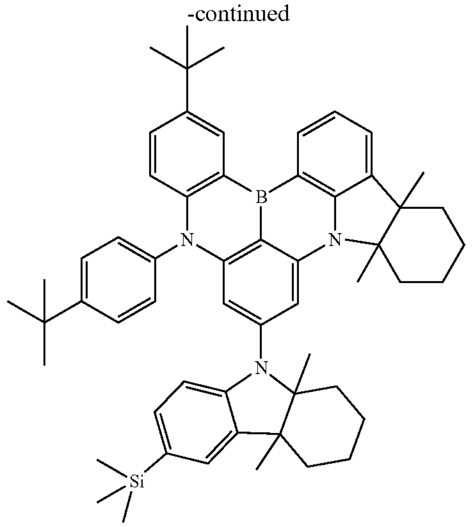
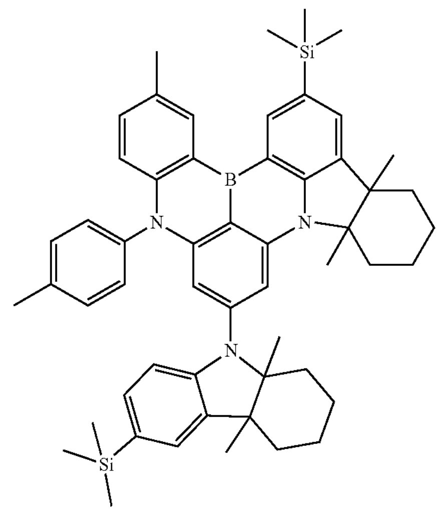
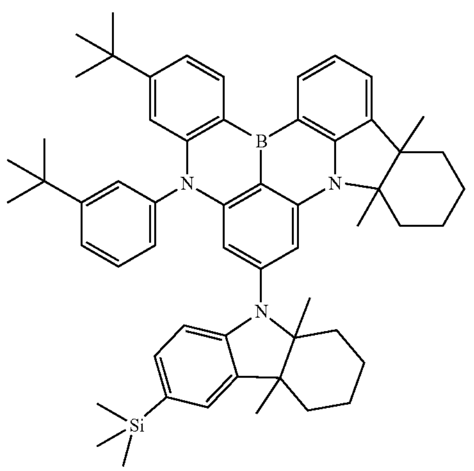
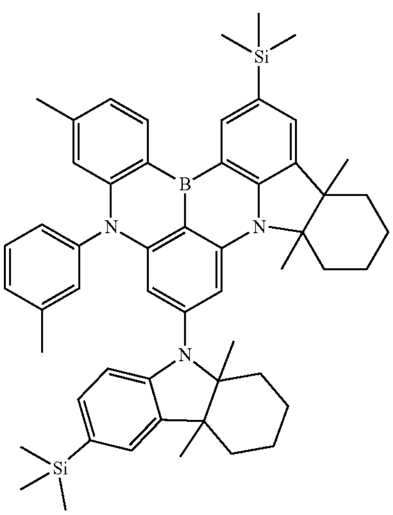
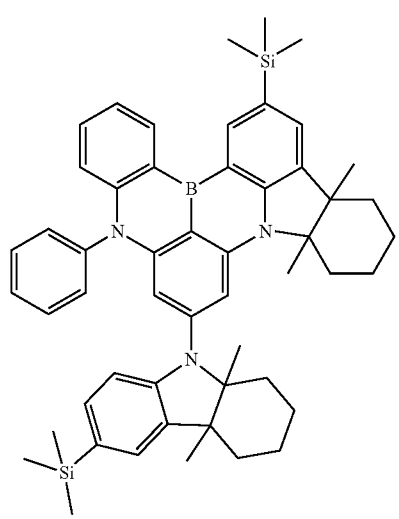
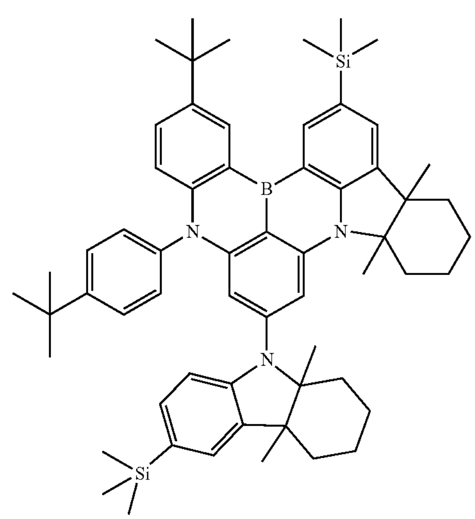

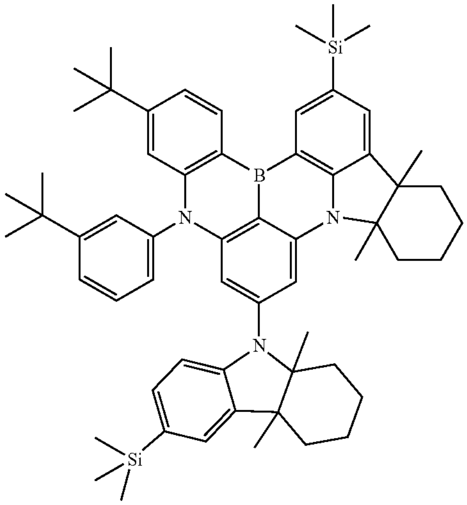
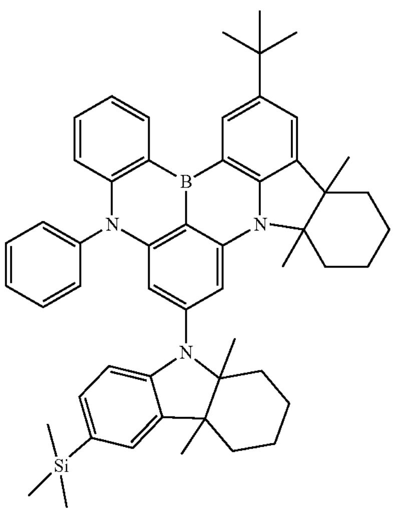
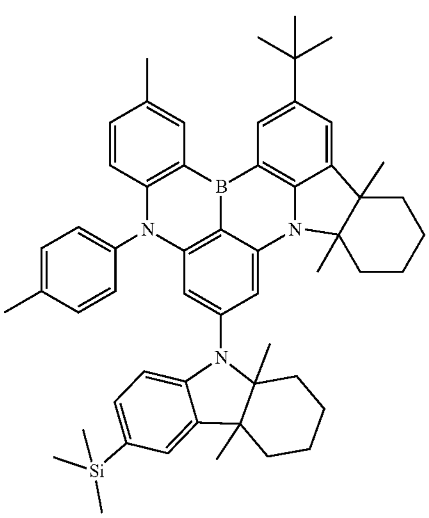
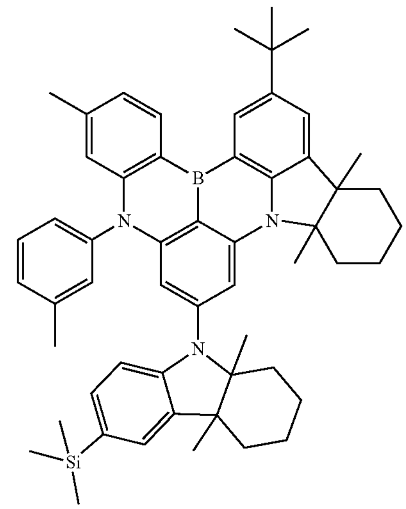
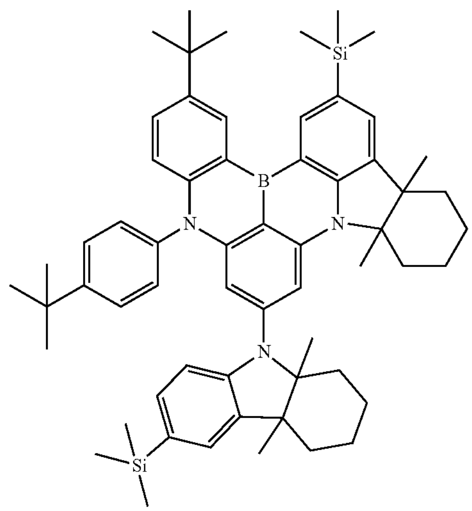
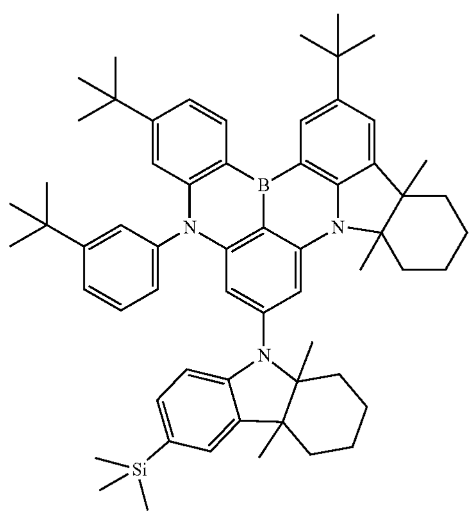

-continued
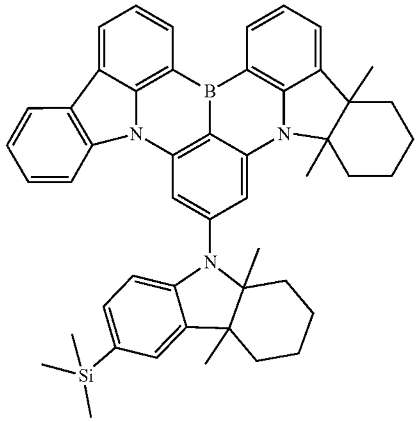
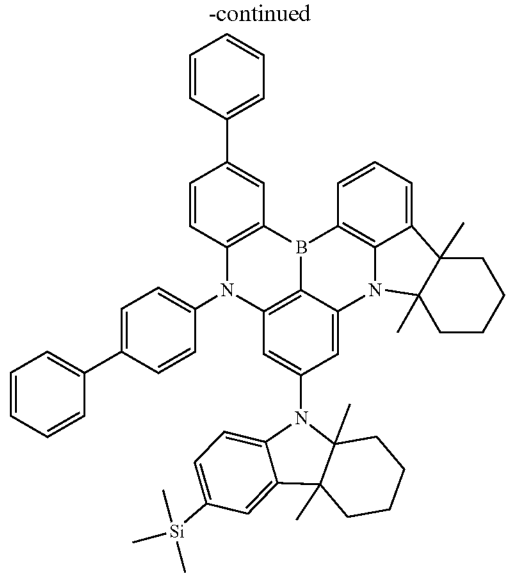
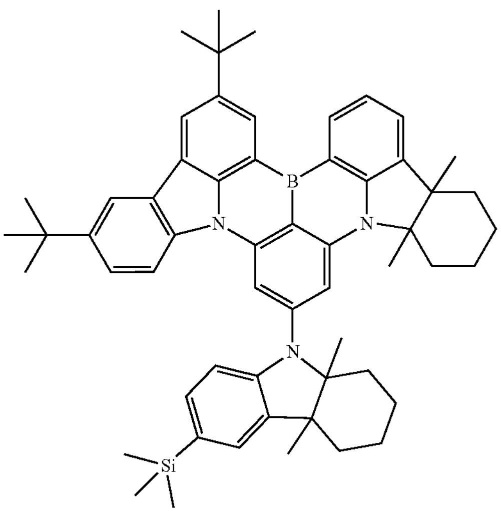
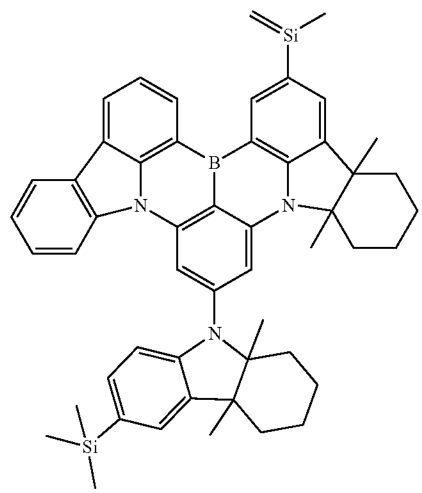
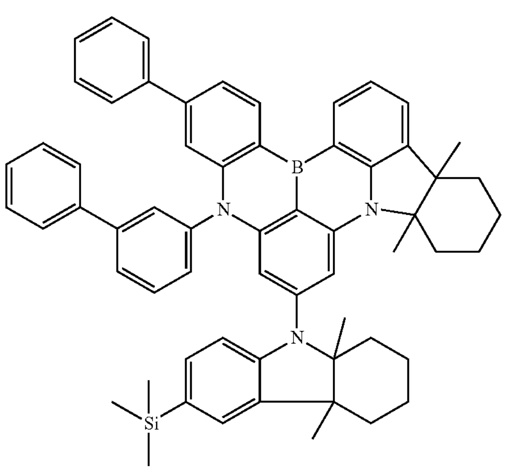
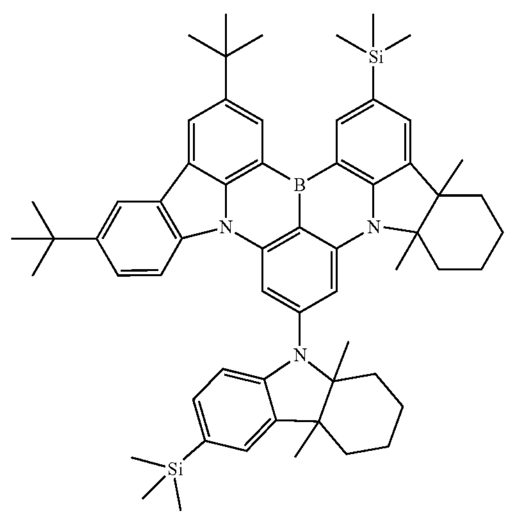
-continued -continued
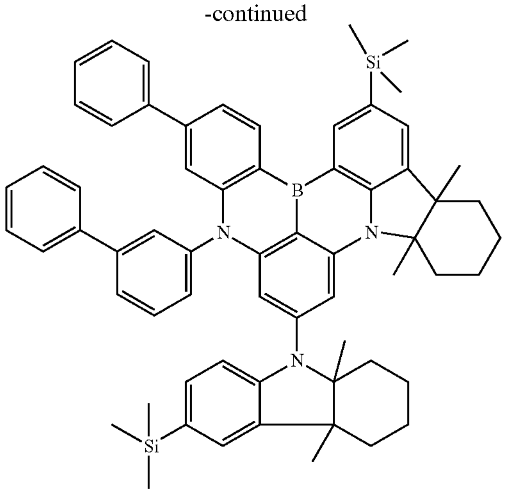
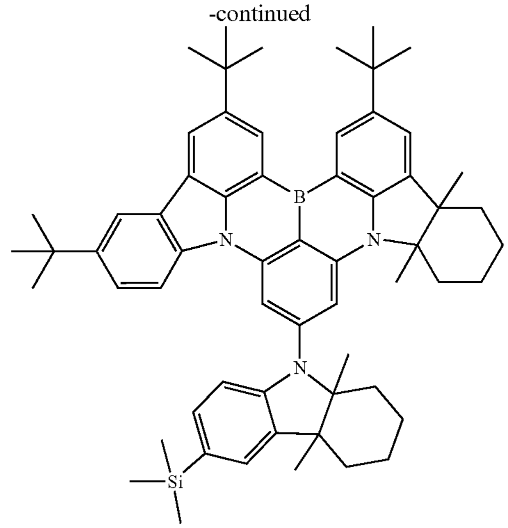
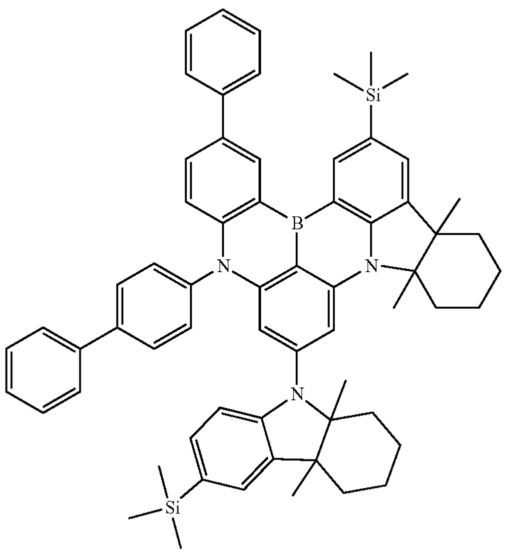
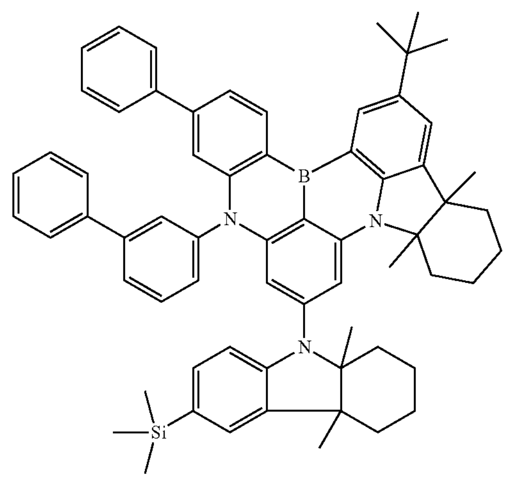
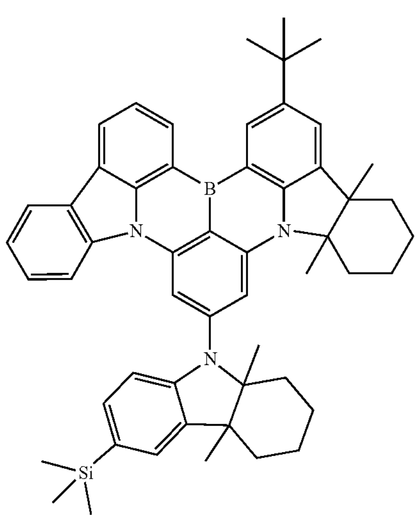
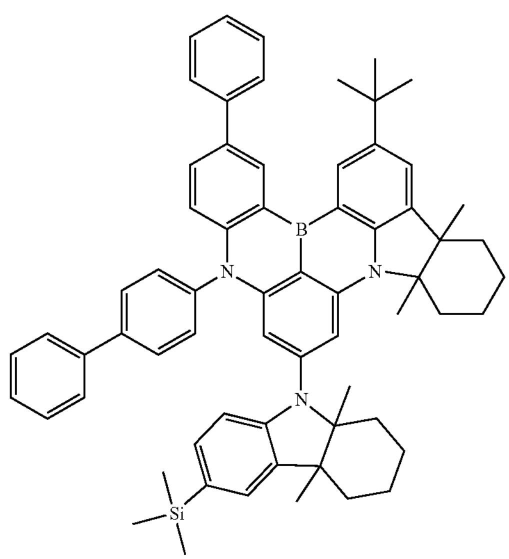

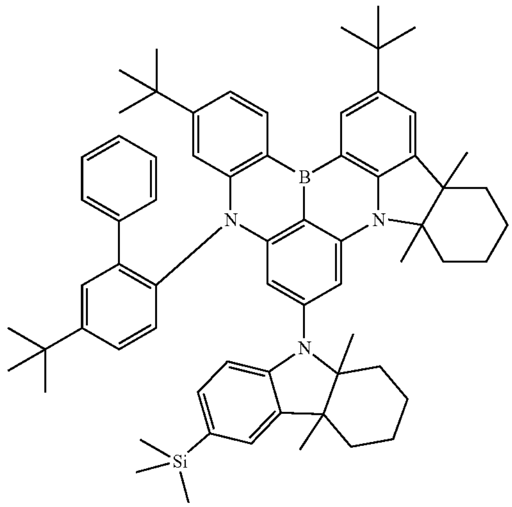
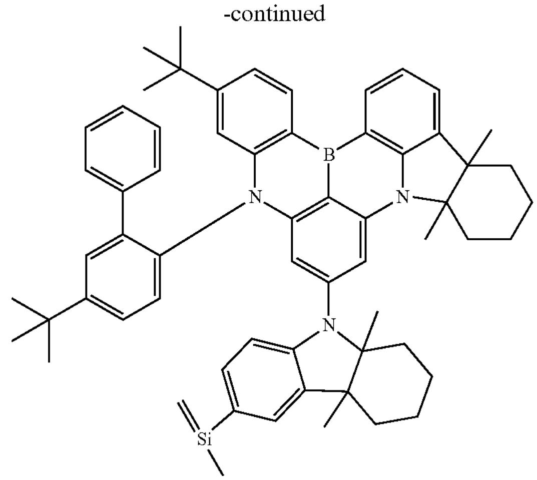
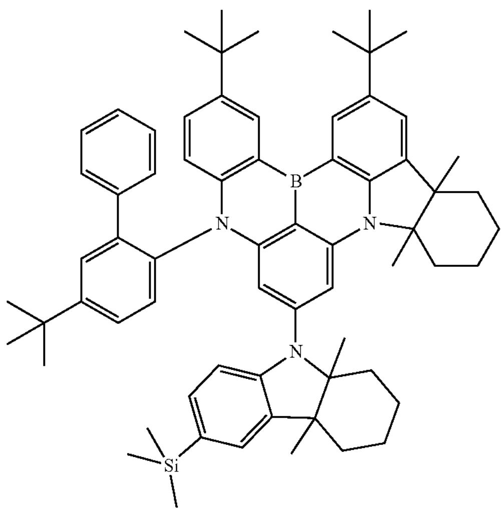
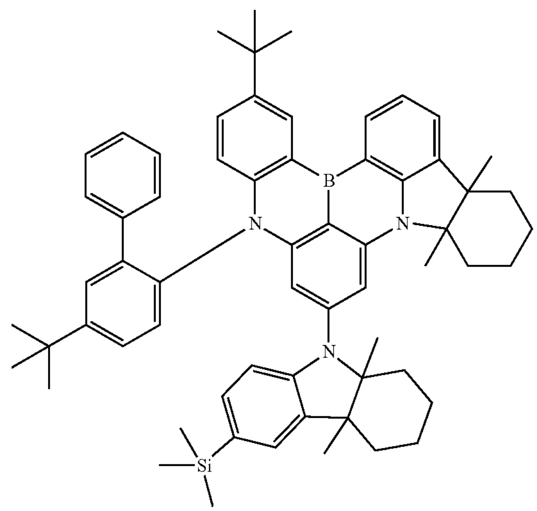
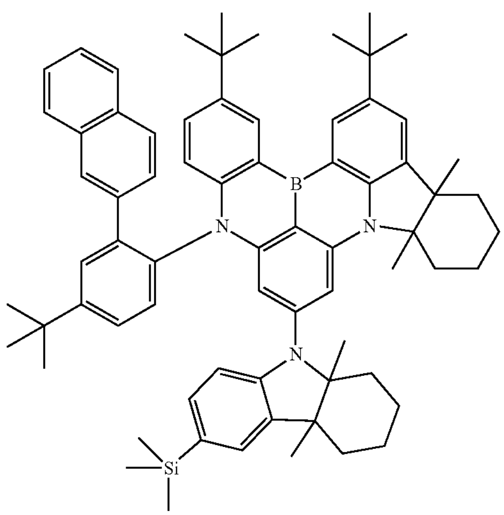
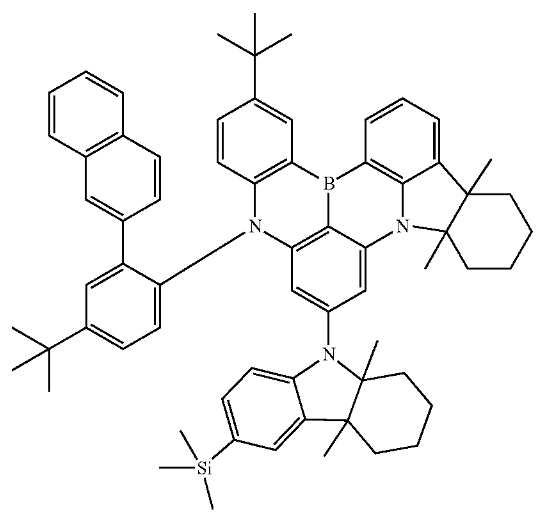

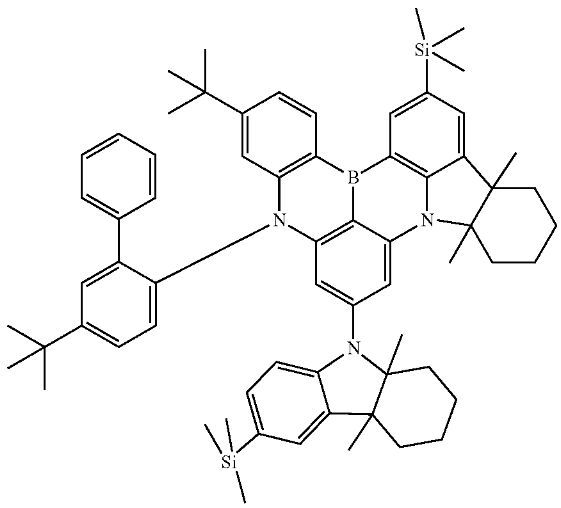
Si
B
N
N
N
Si
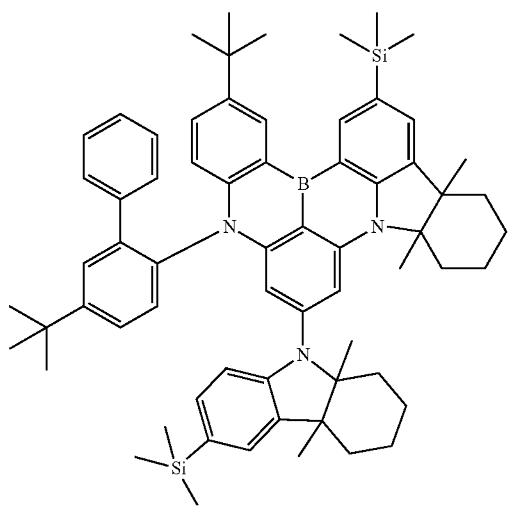
Si
B
N
N
N
Si
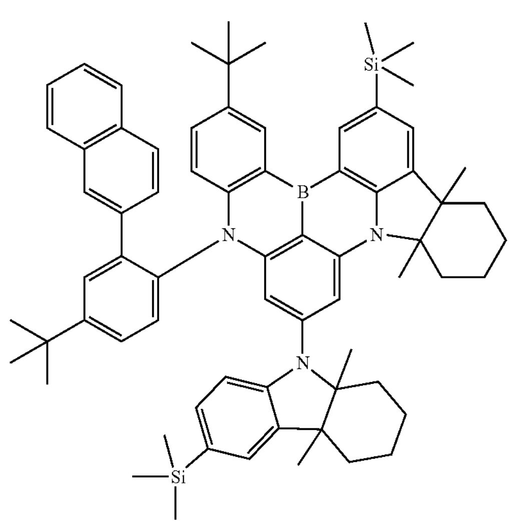
Si
B
N
N
N
Si
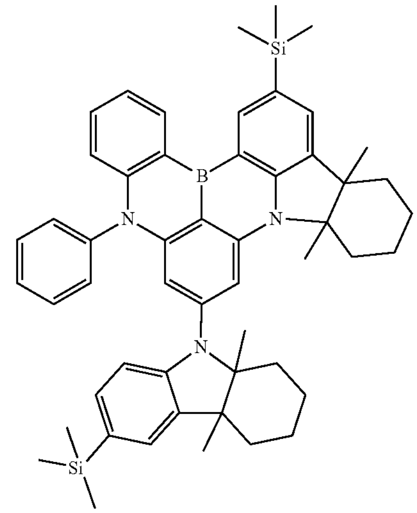
Si
B
N
N
N
Si
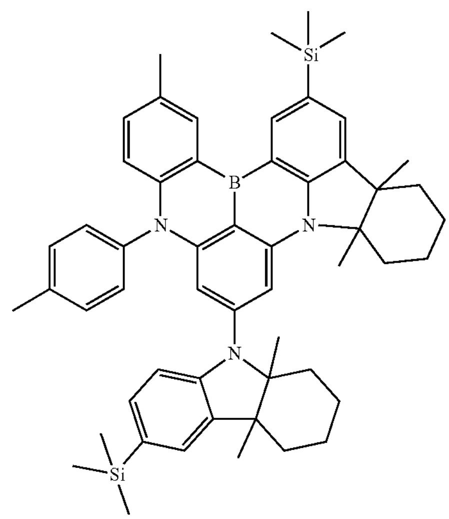
Si
B
N
N
N
Si
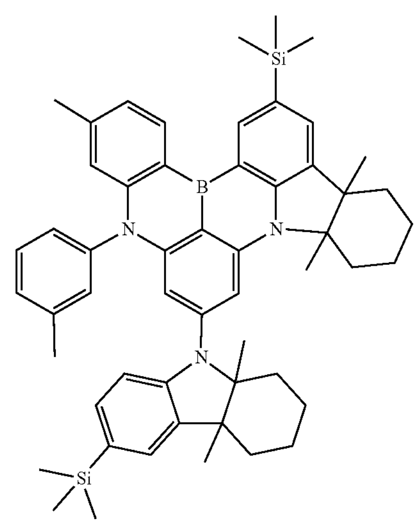
Si
B
N
N
N
Si

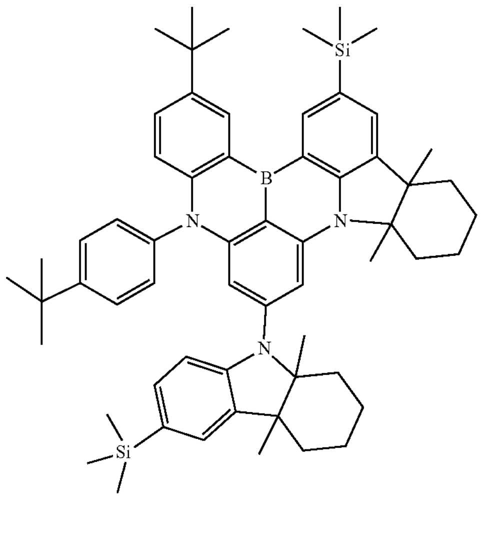
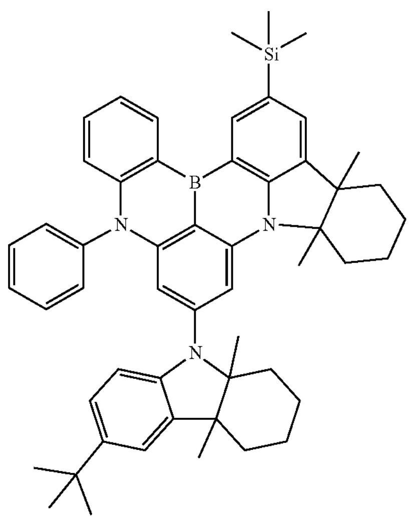
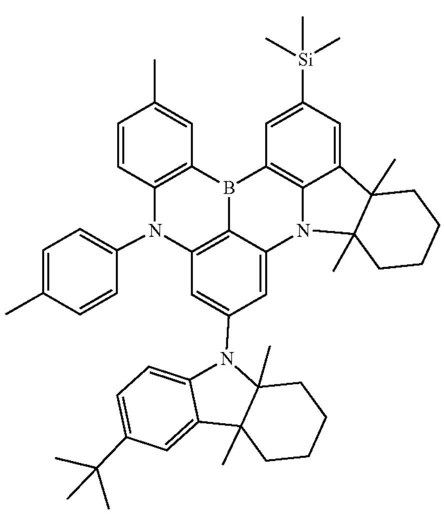
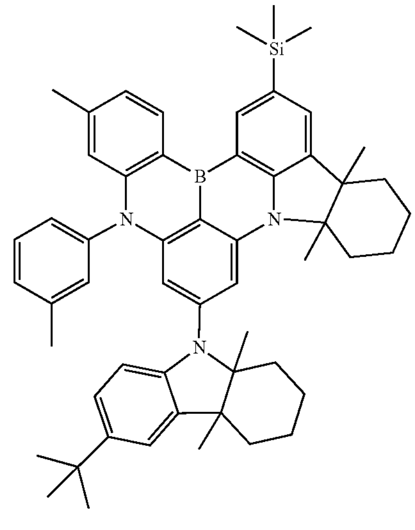
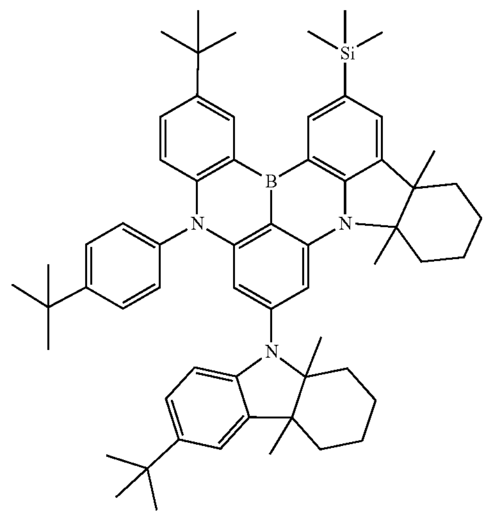
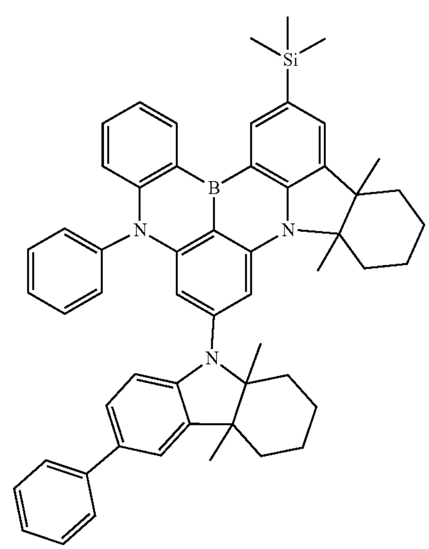

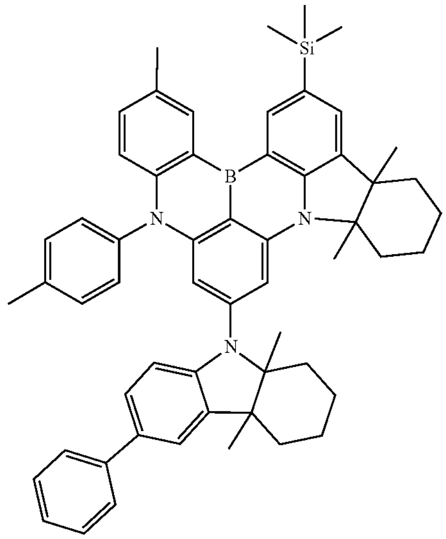
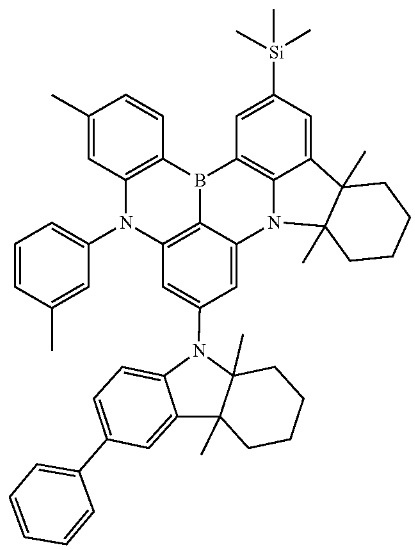
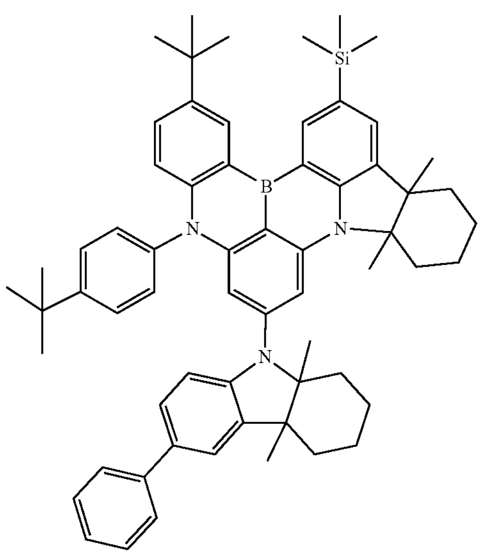
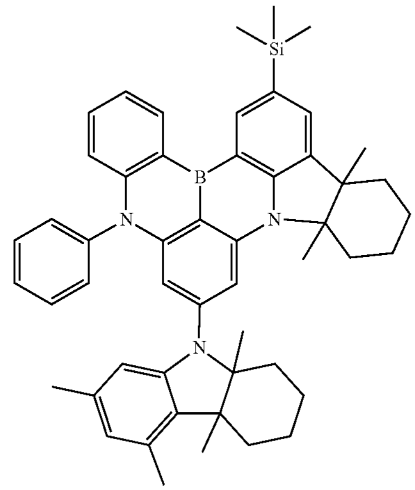
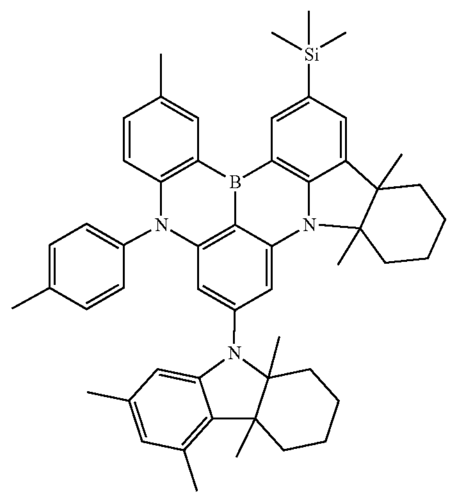
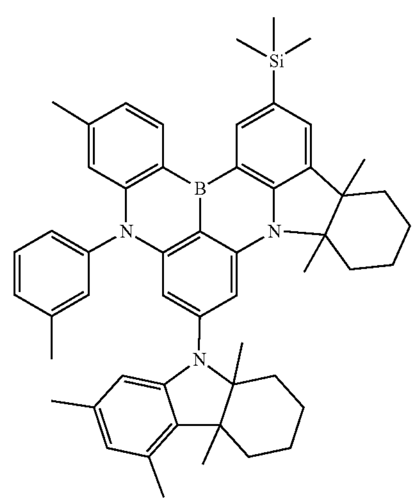

-continued
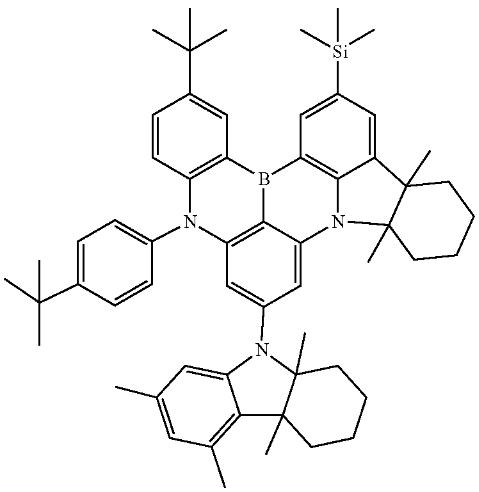
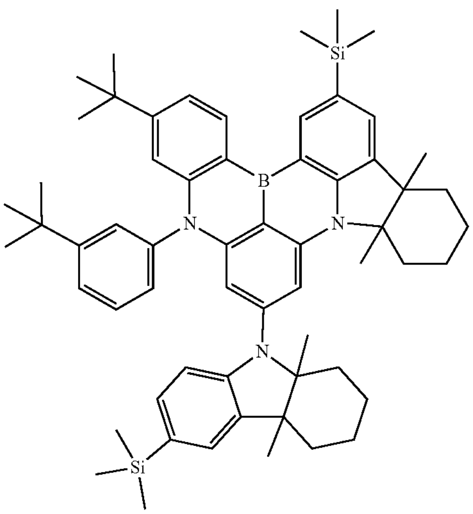
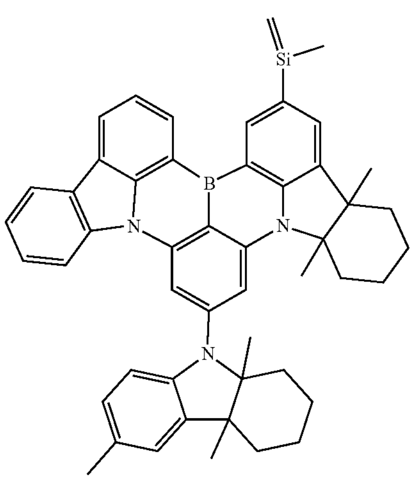
-continued
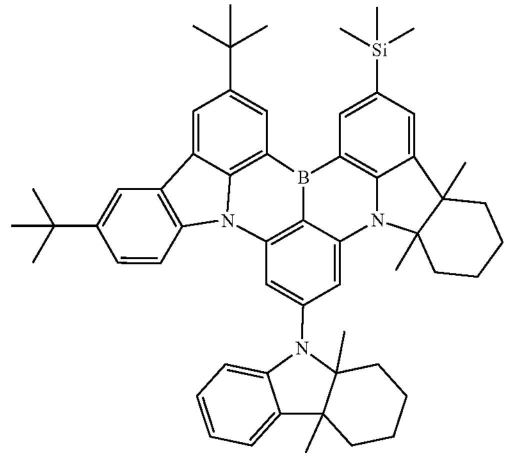
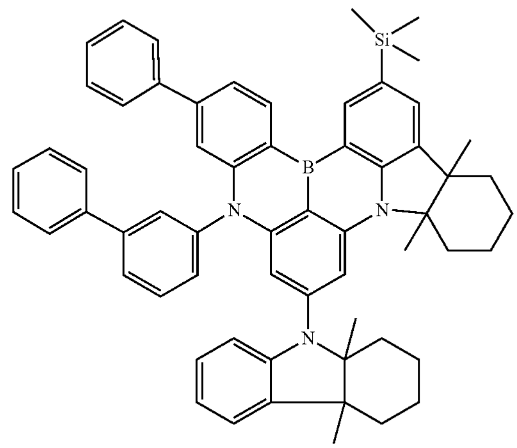
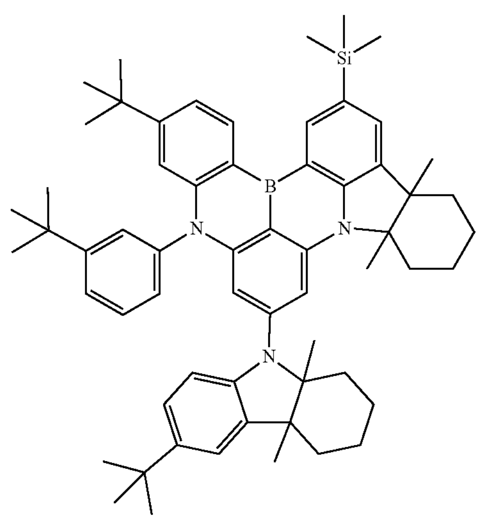

-continued
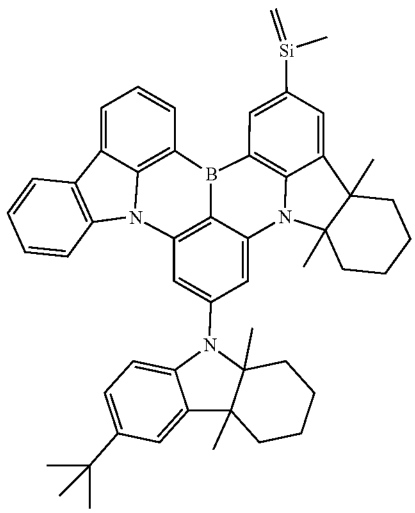
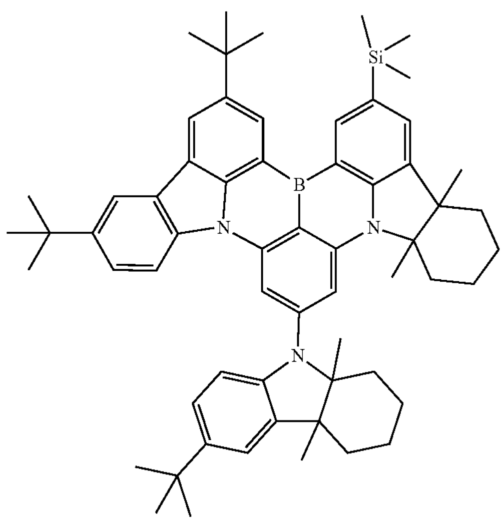
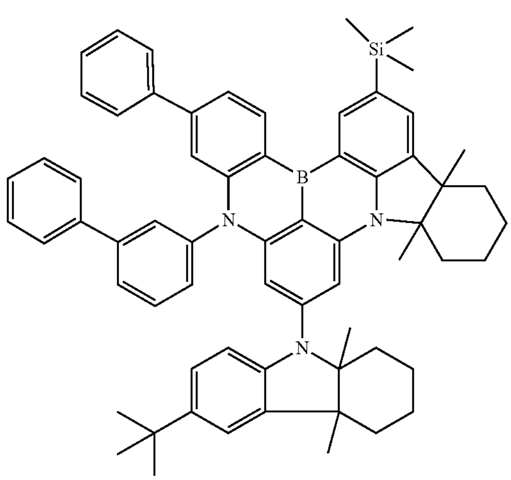
-continued
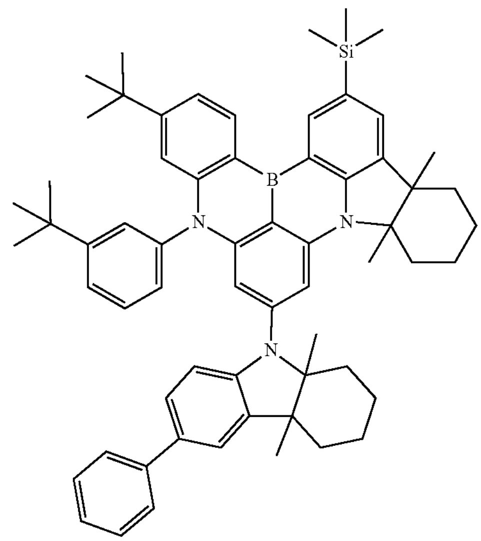
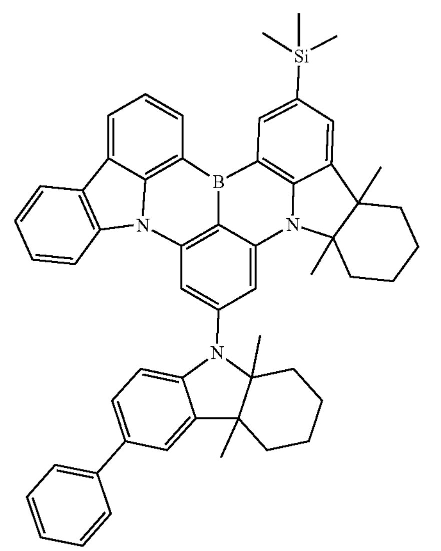
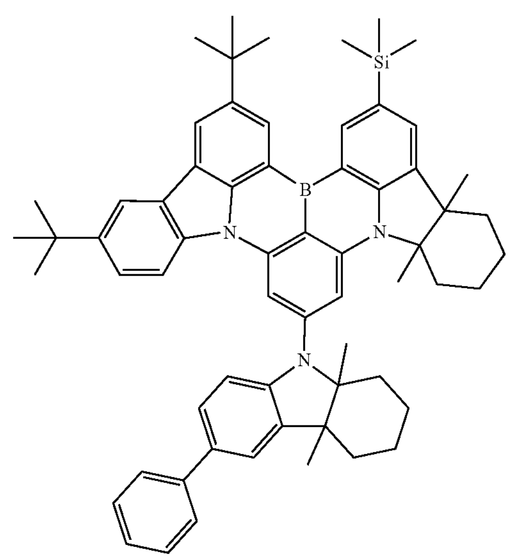

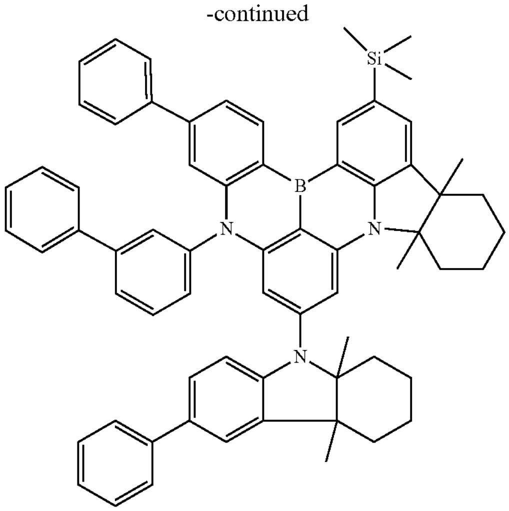
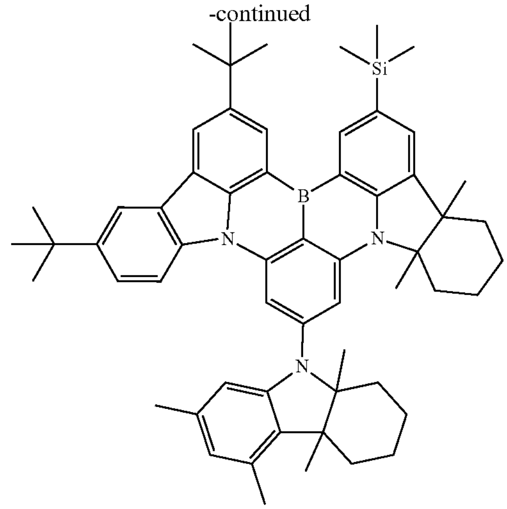
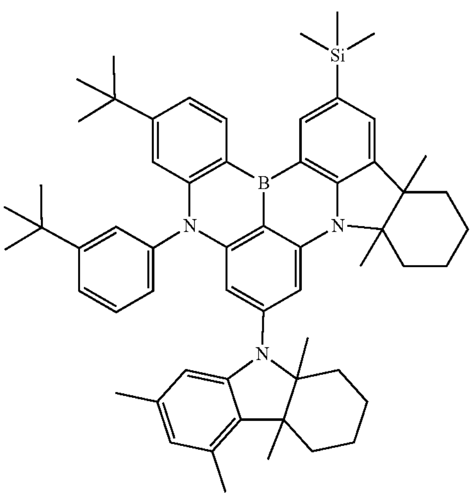
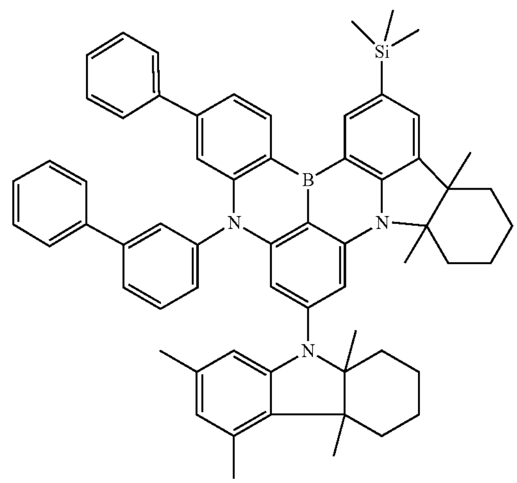
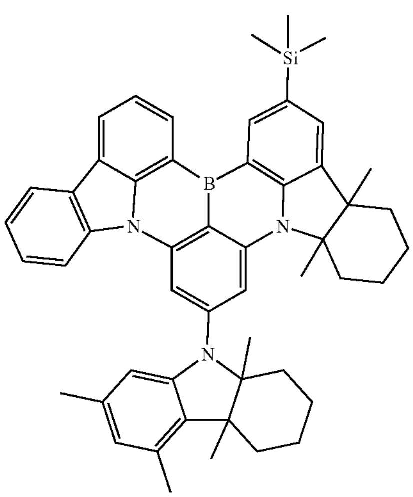
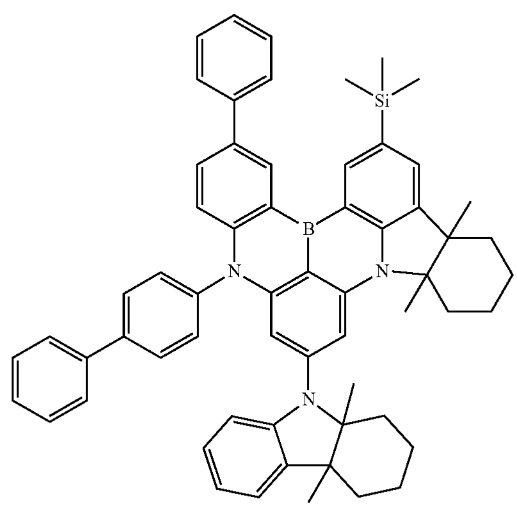

-continued
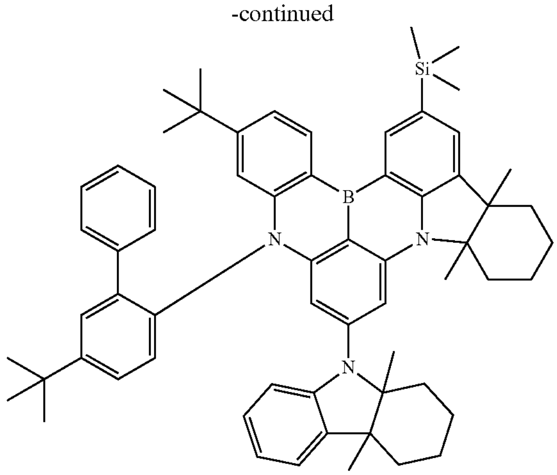
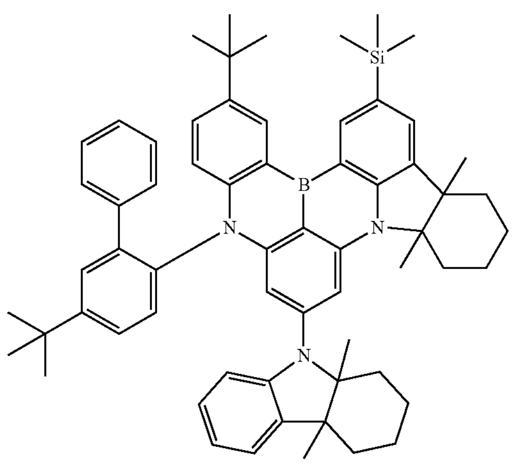
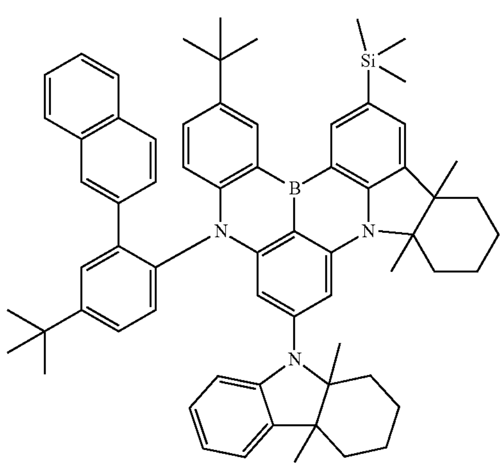
-continued
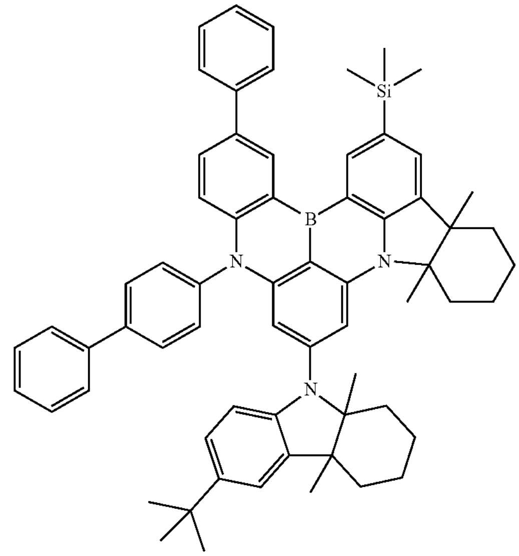
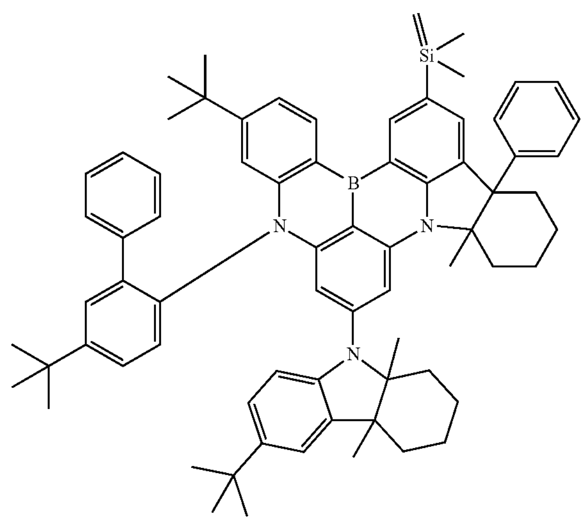
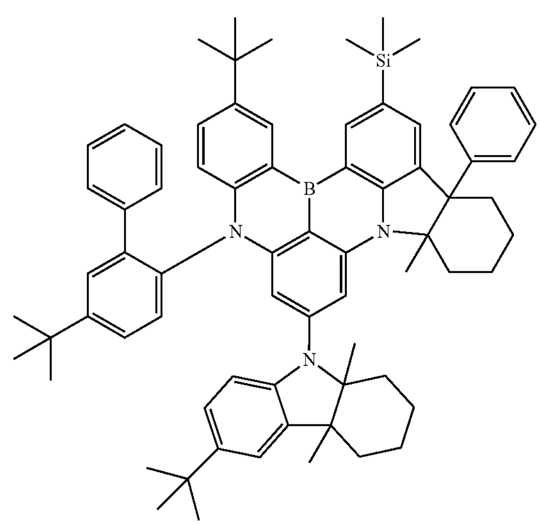

-continued
-continued
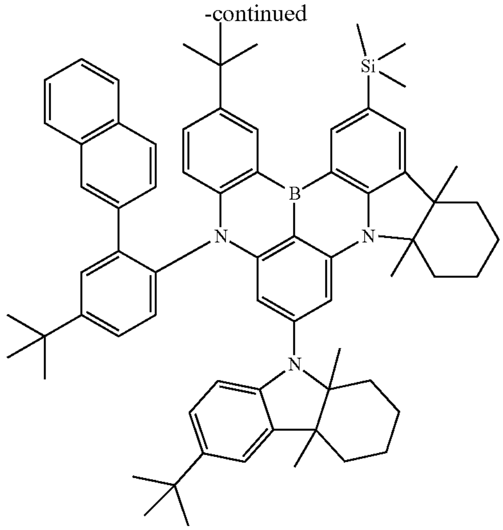
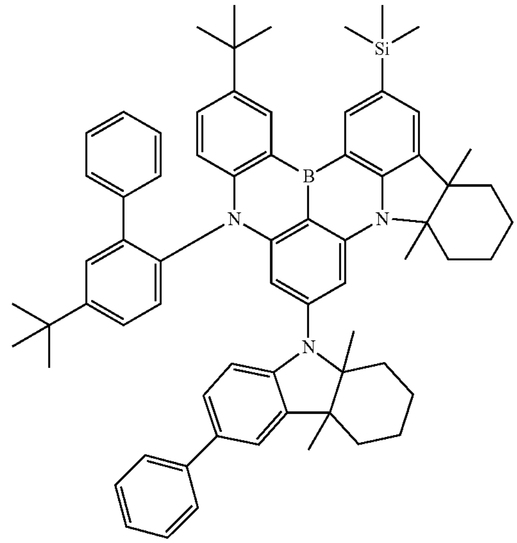
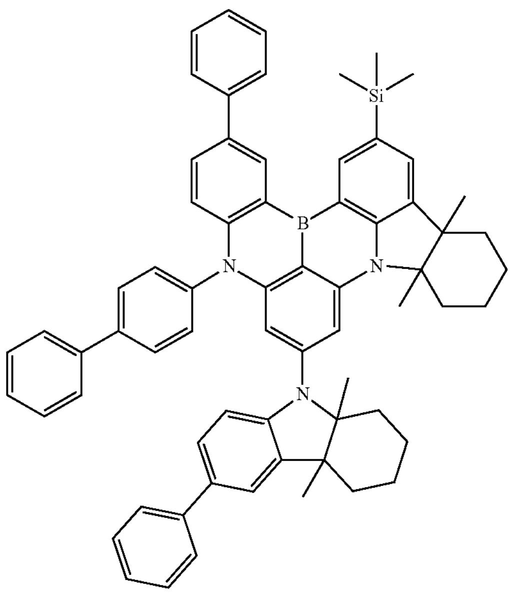
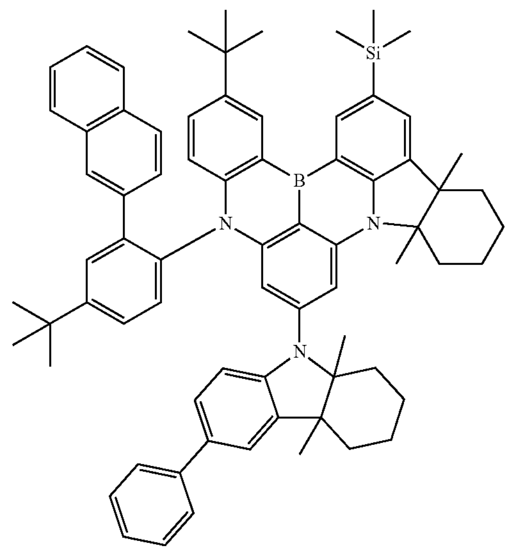
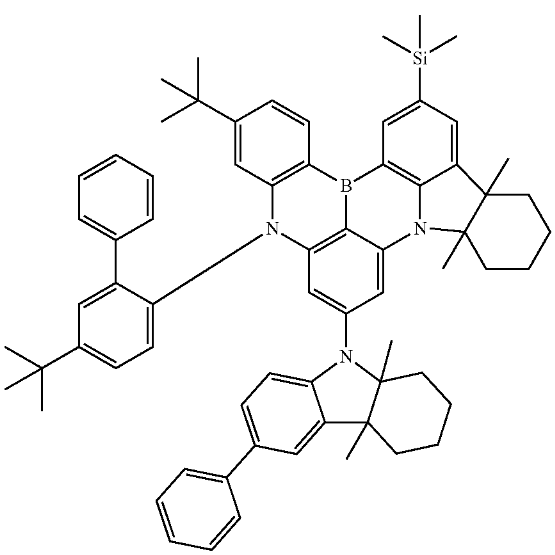
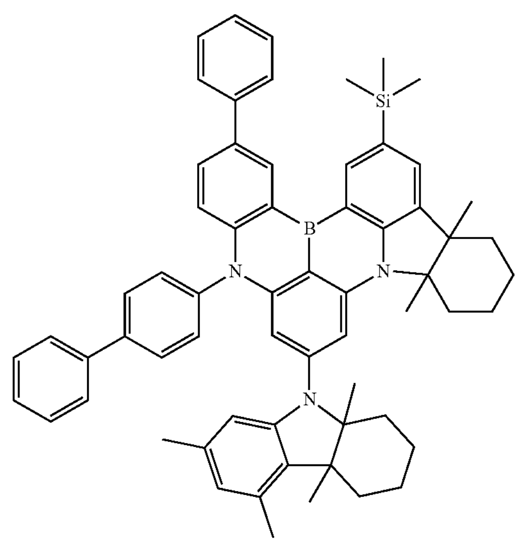

-continued
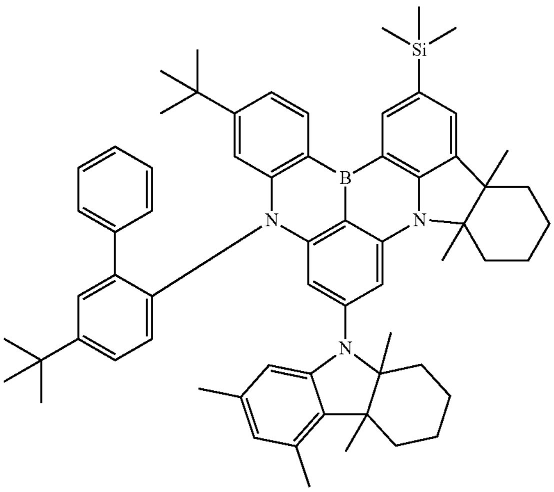
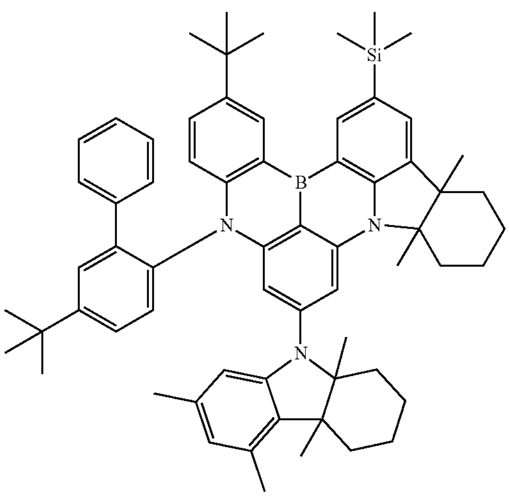
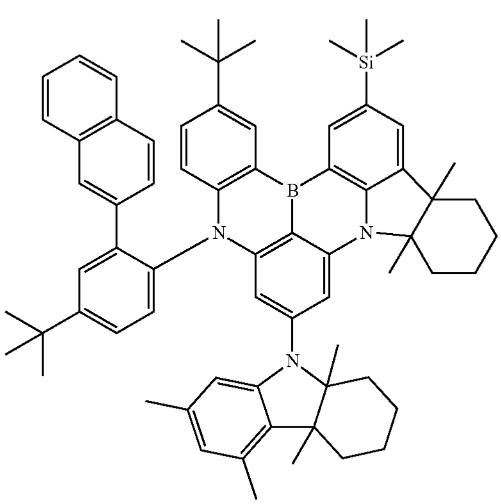
-continued
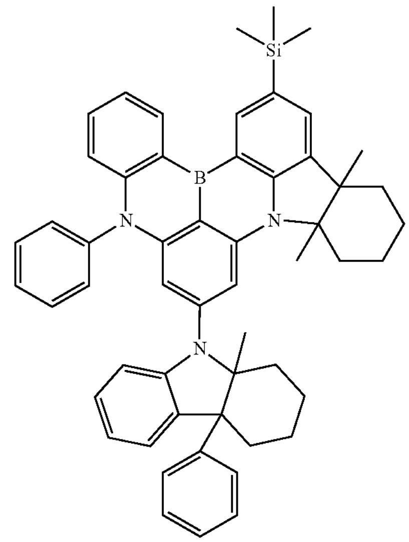
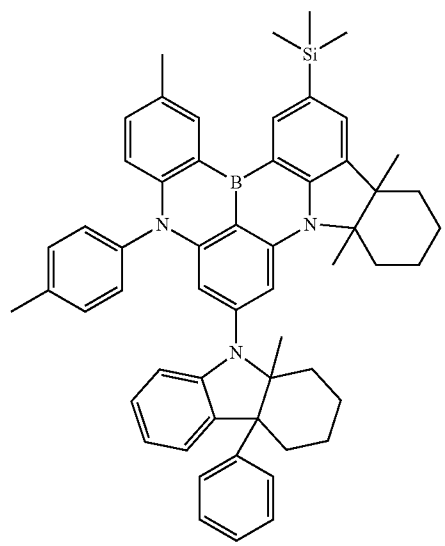
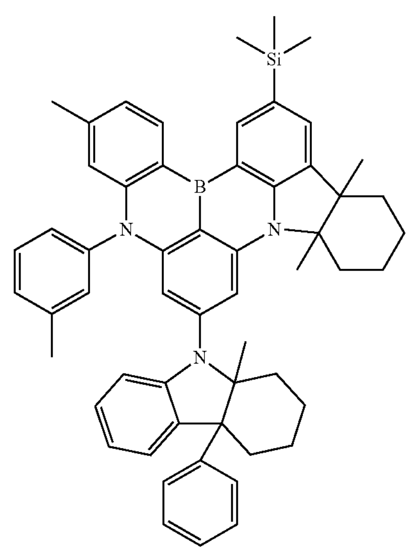

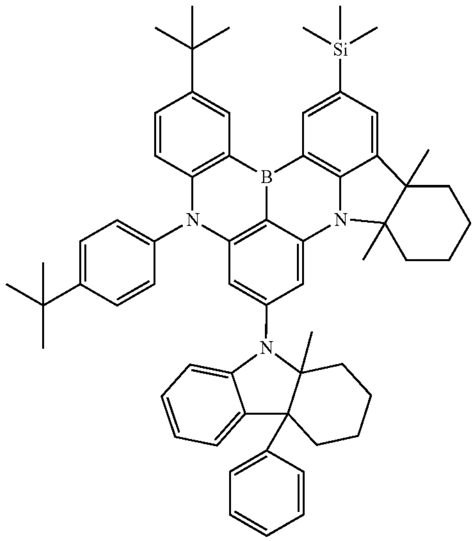
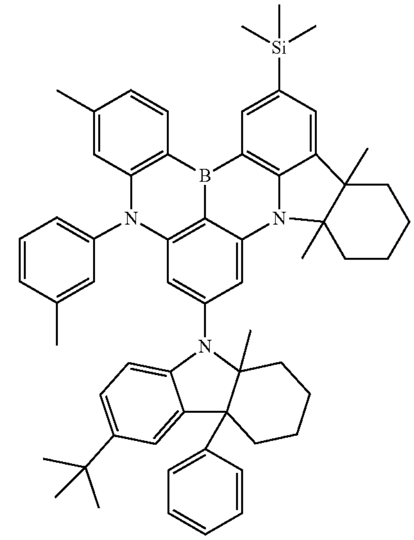
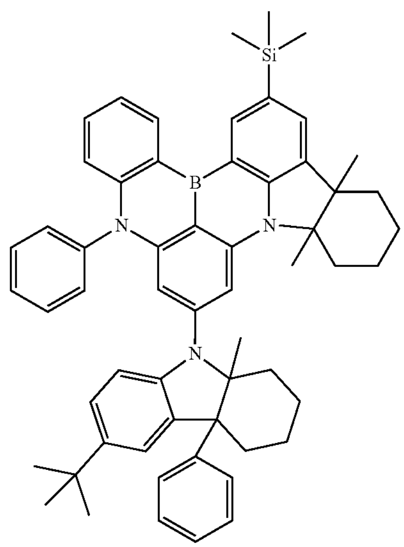
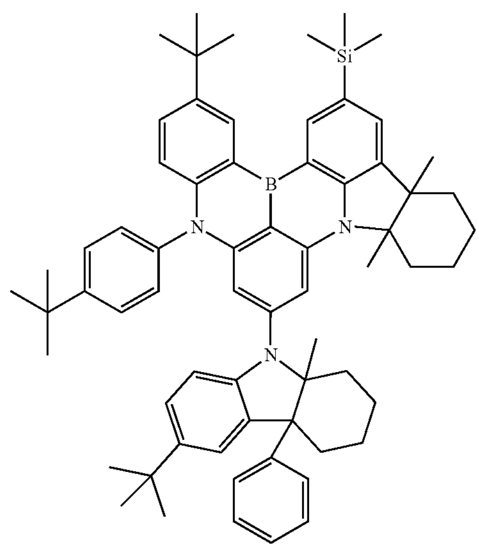
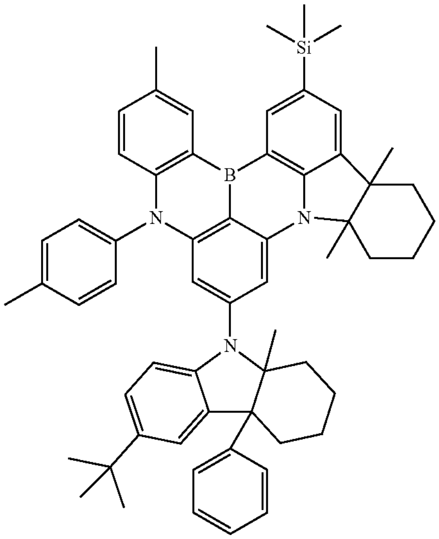
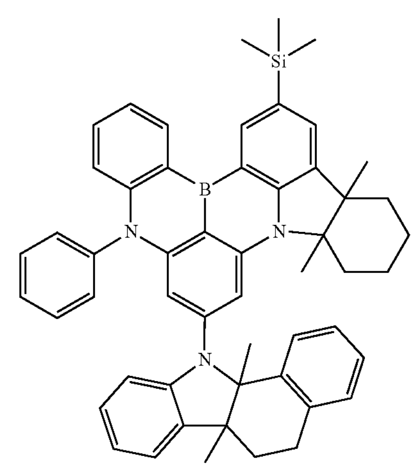

-continued
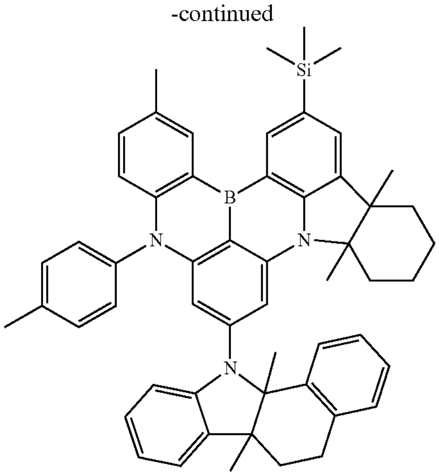
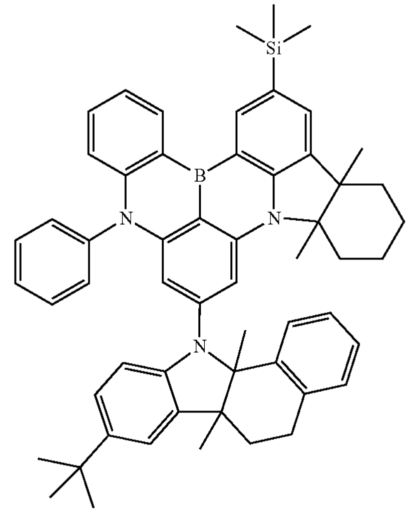
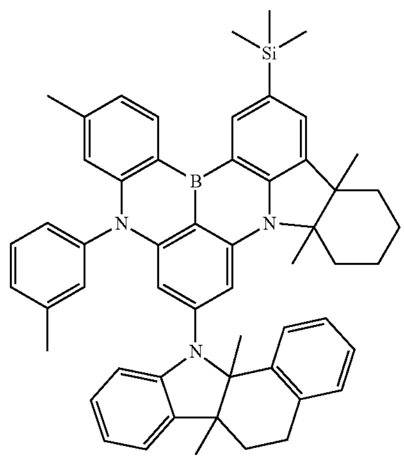
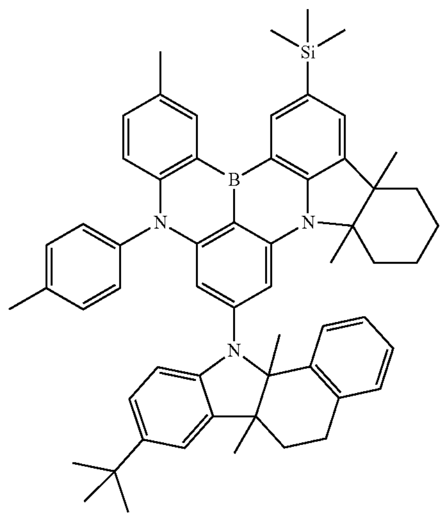
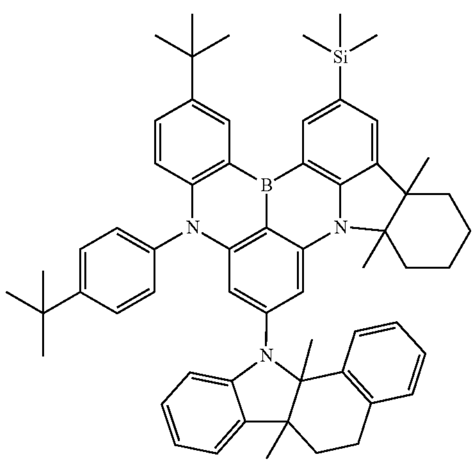
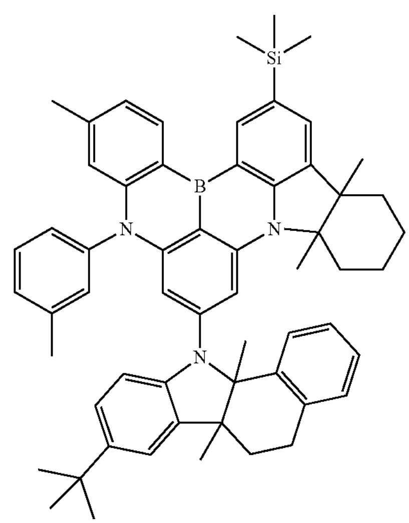

-continued
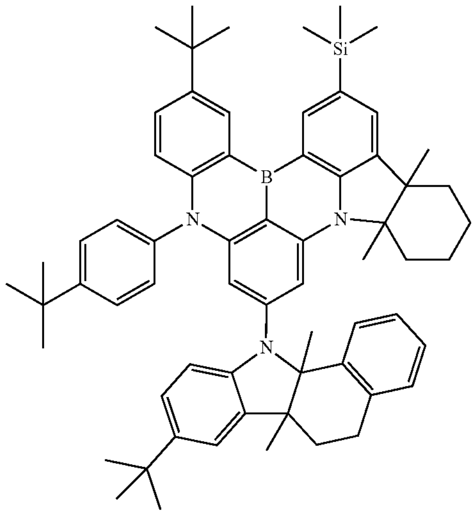
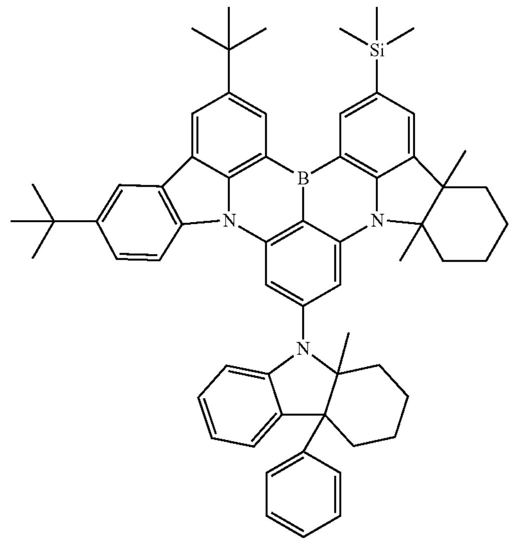
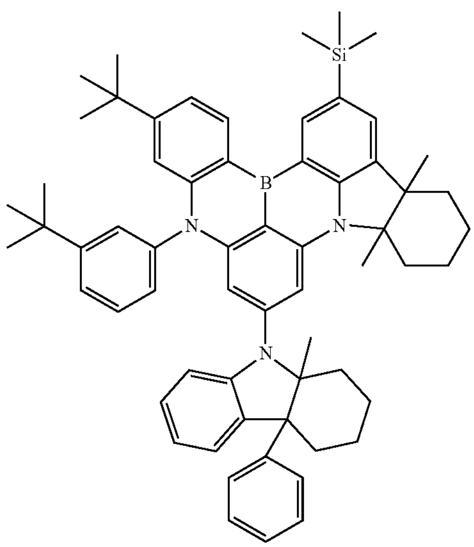
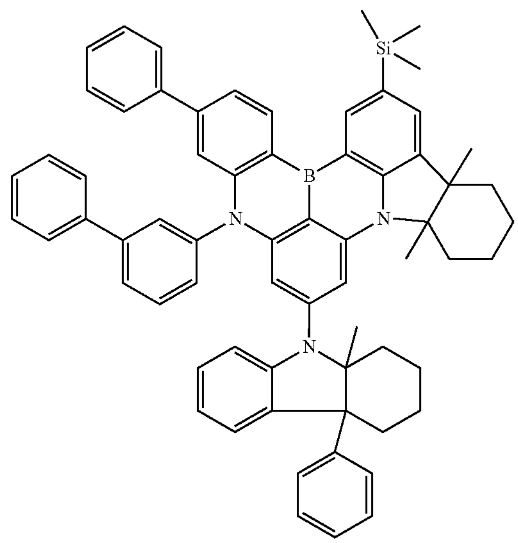
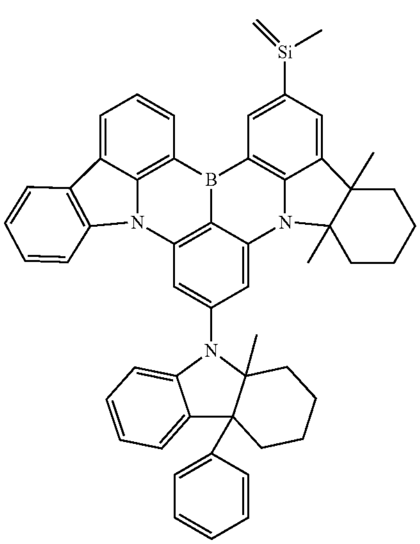
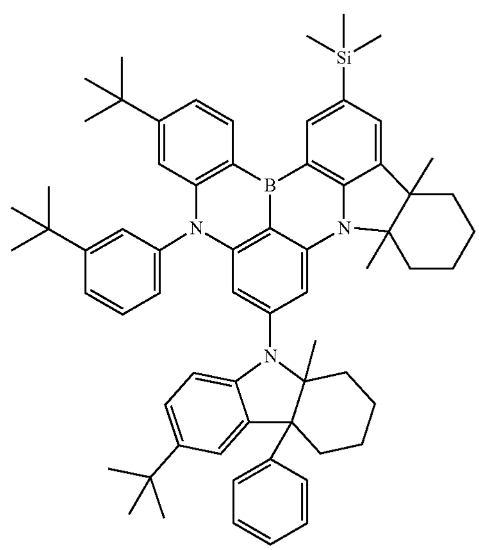

-continued
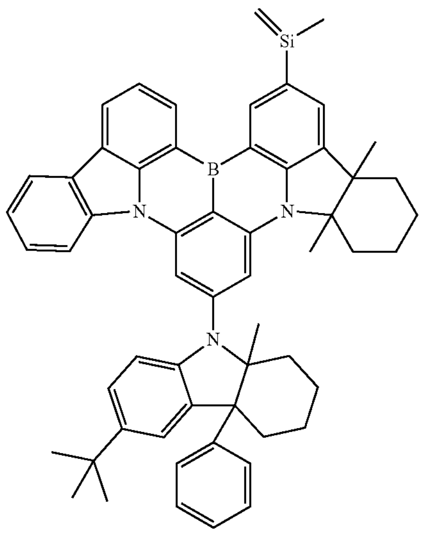
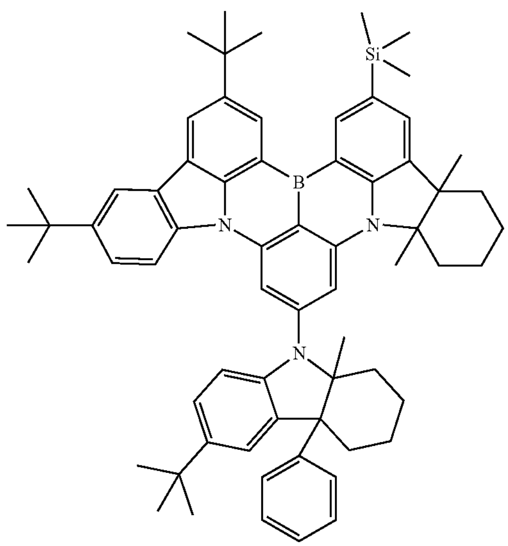
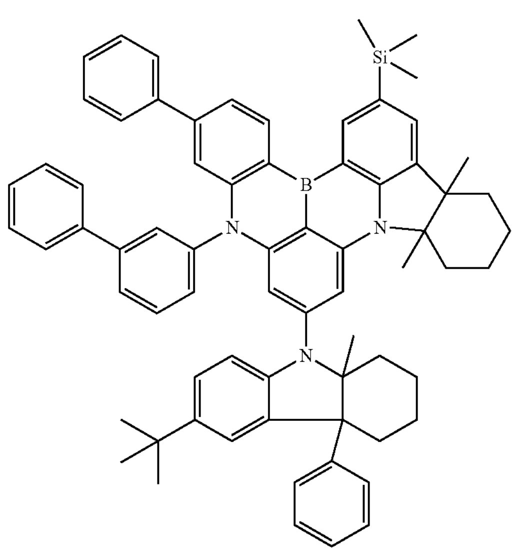
-continued
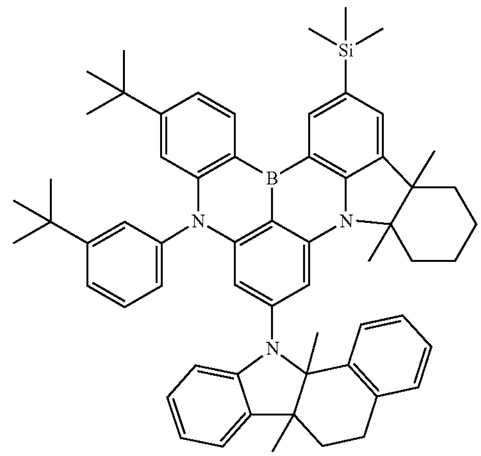
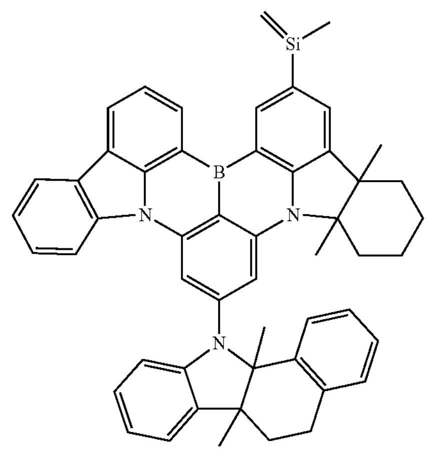
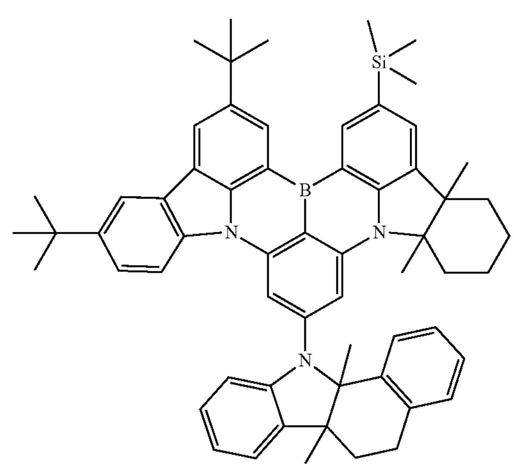

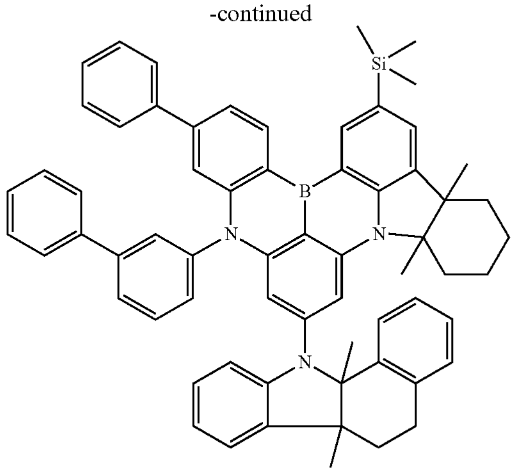
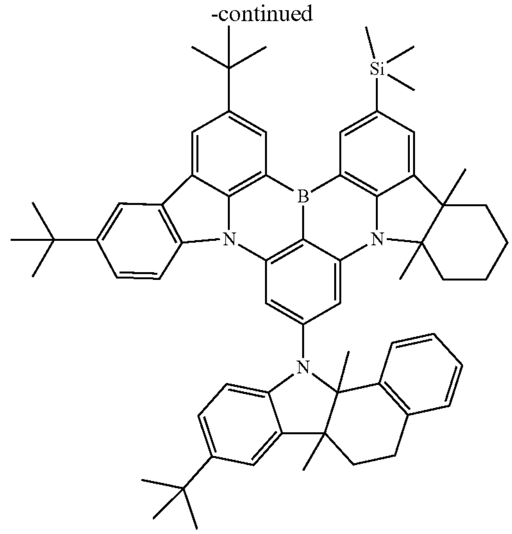
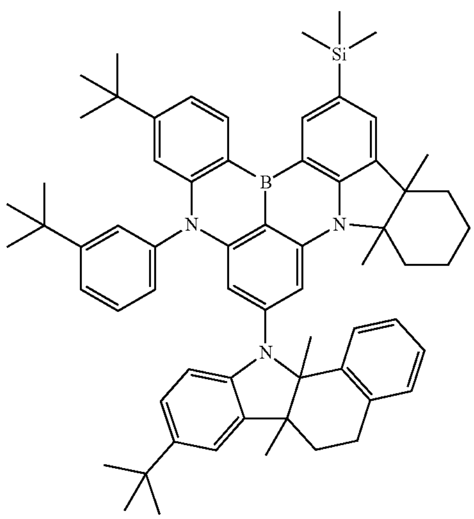
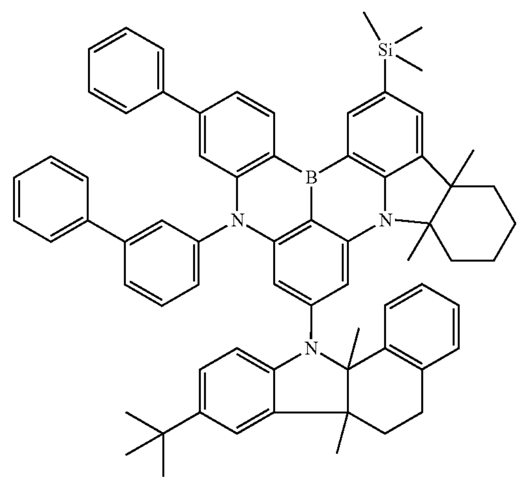
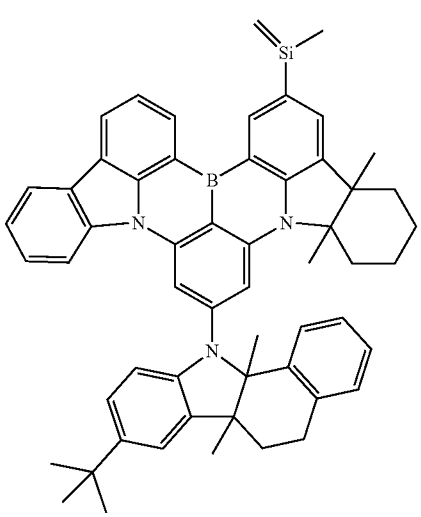
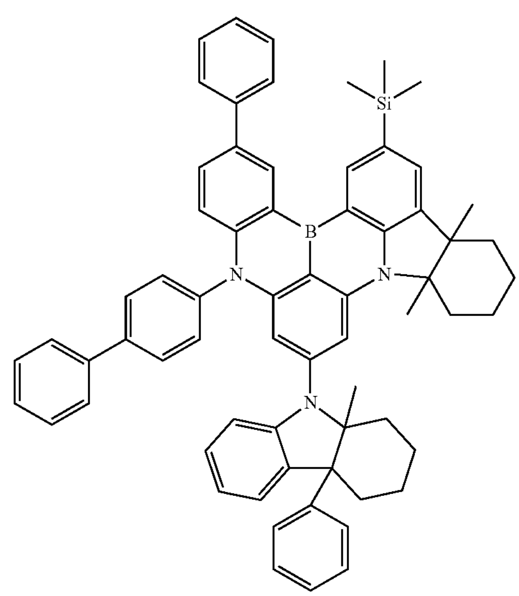

-continued
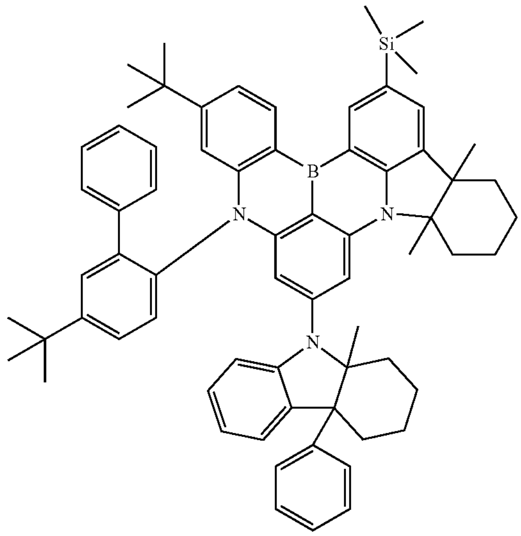
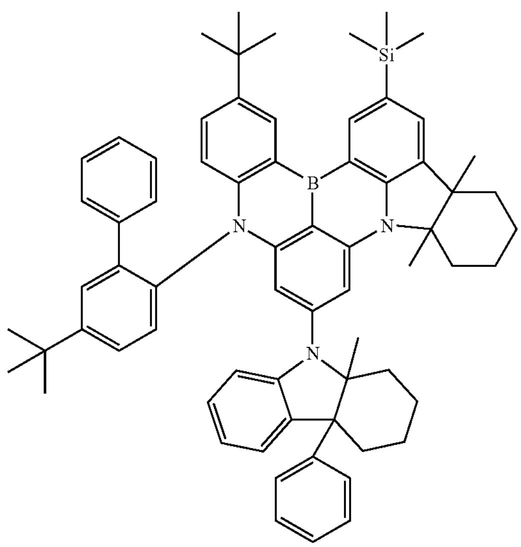
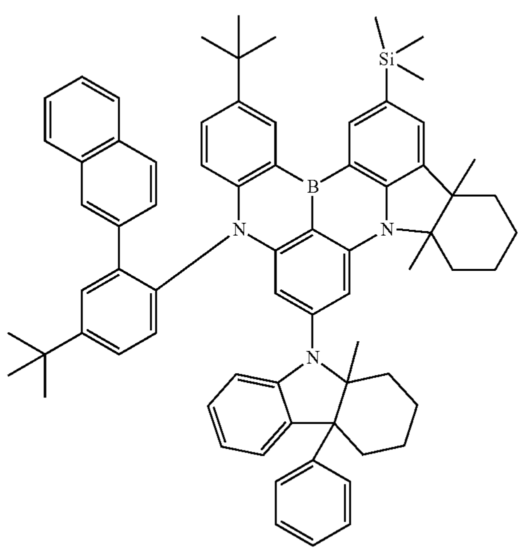
-continued
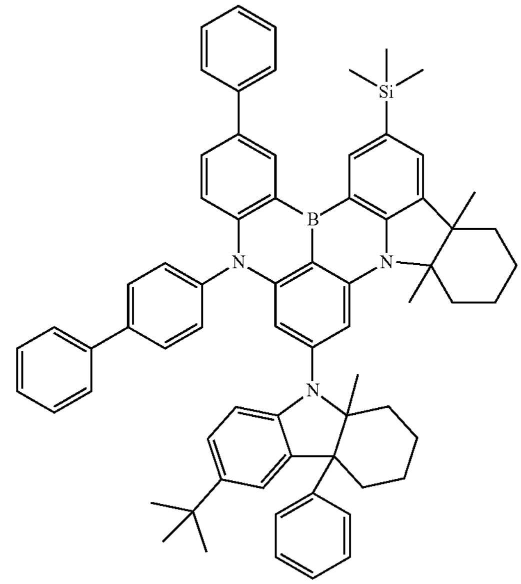
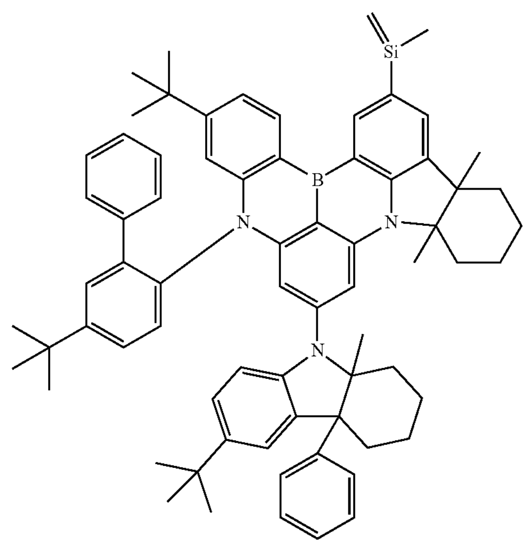
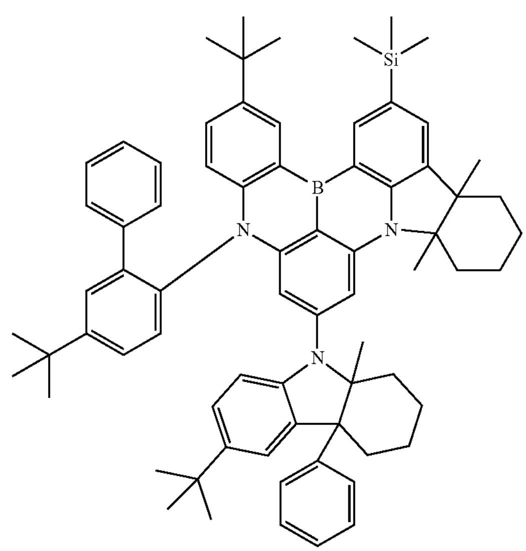

-continued
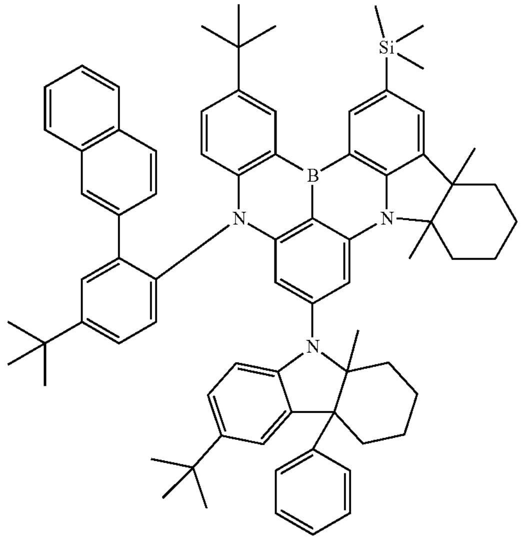
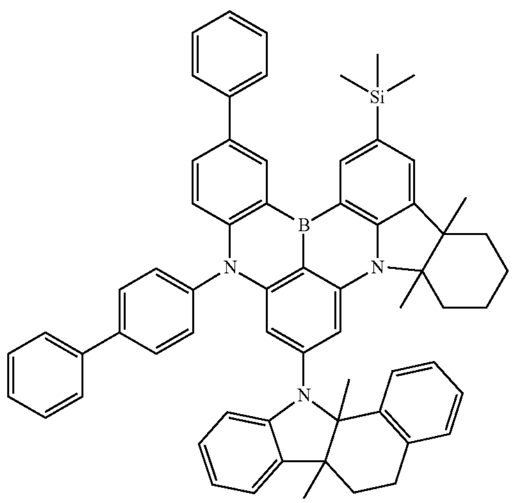
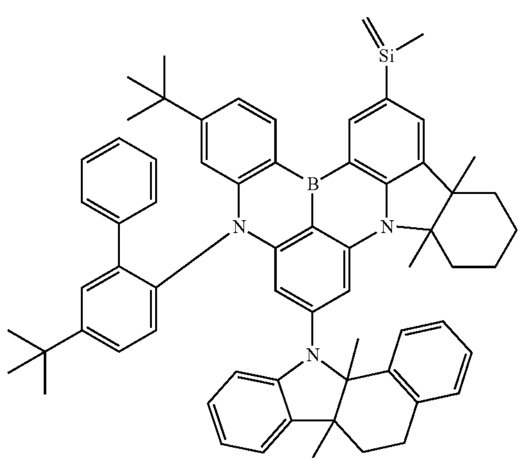
-continued
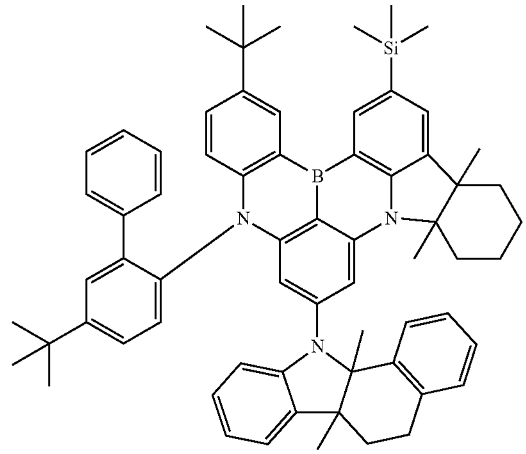
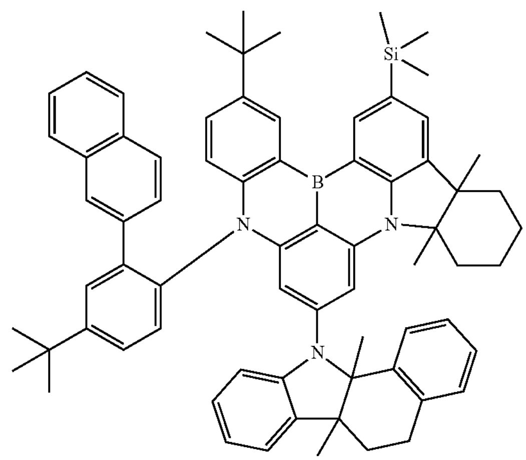
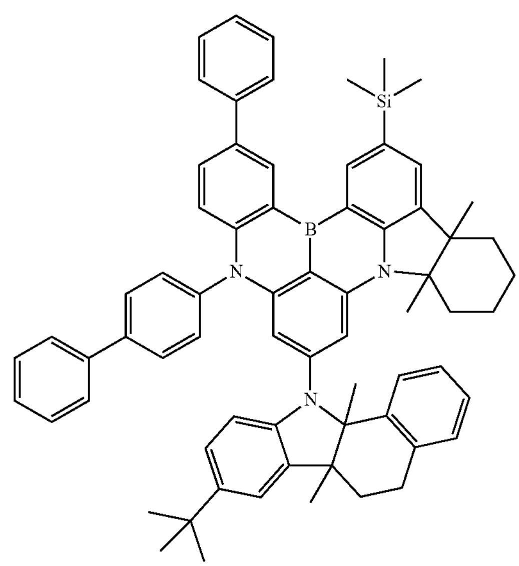

-continued
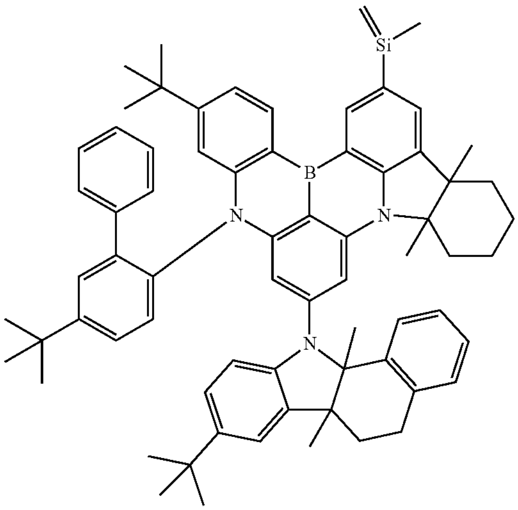
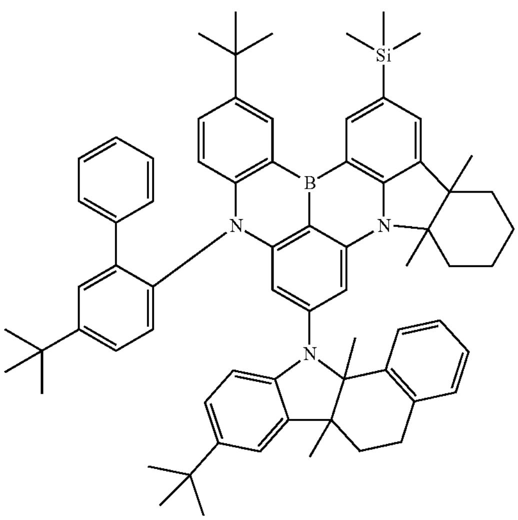
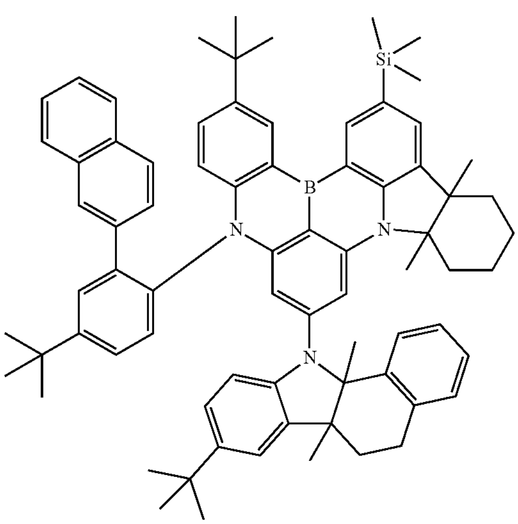
-continued
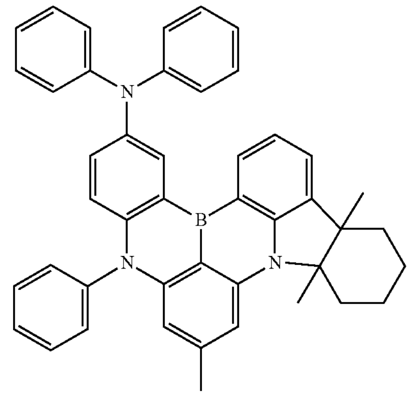
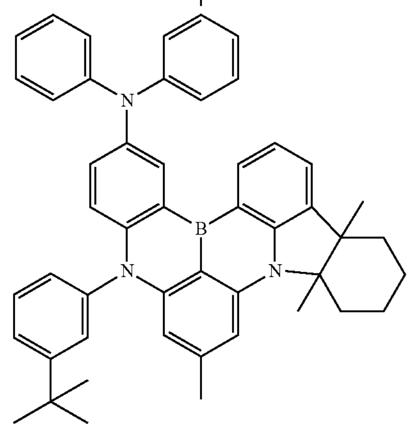
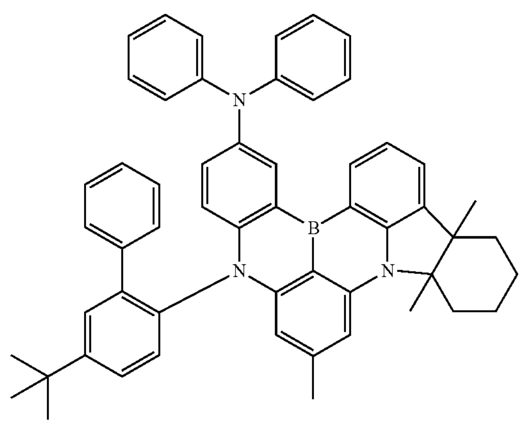
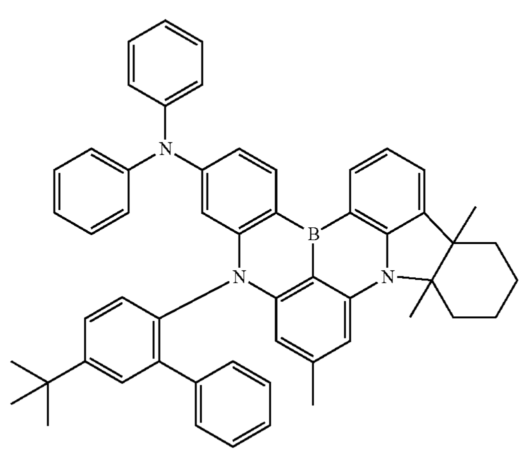

-continued
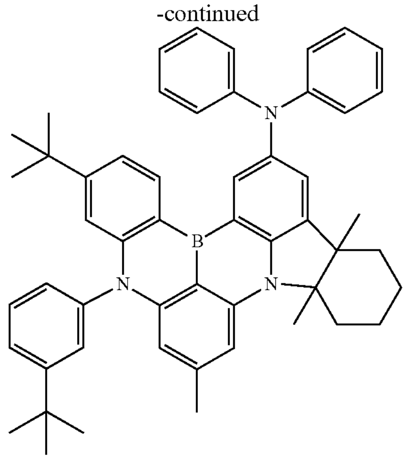
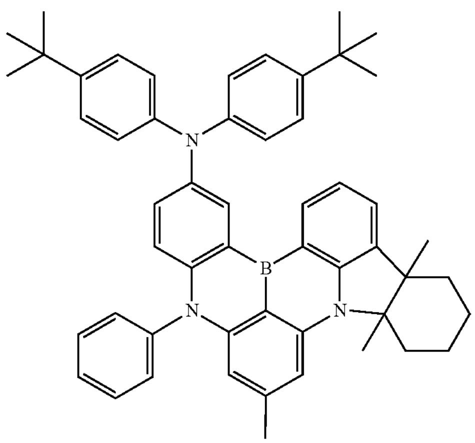
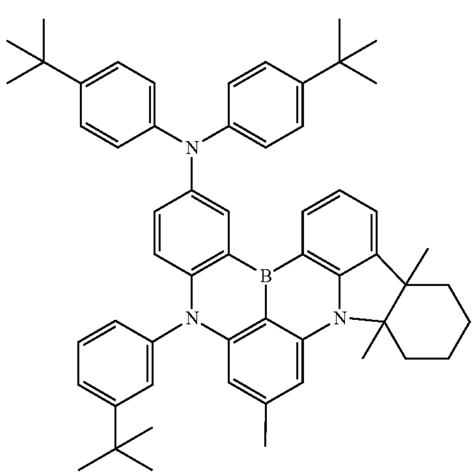
-continued
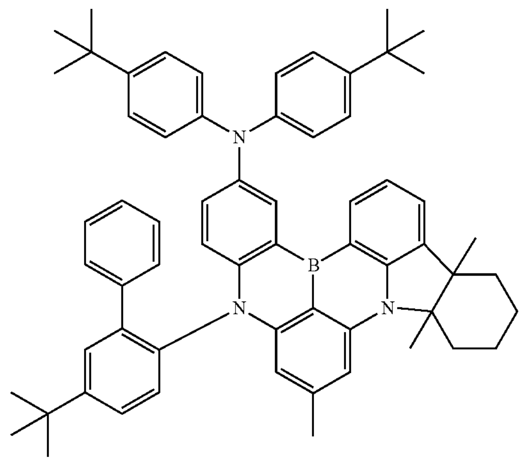
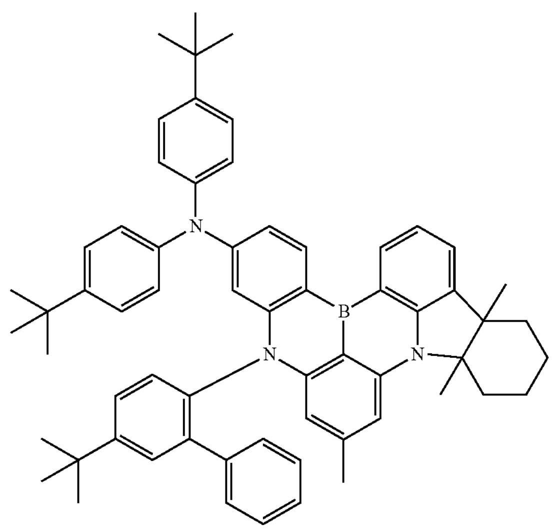
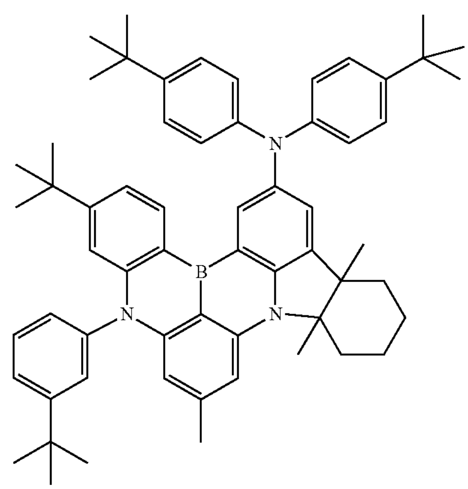

-continued
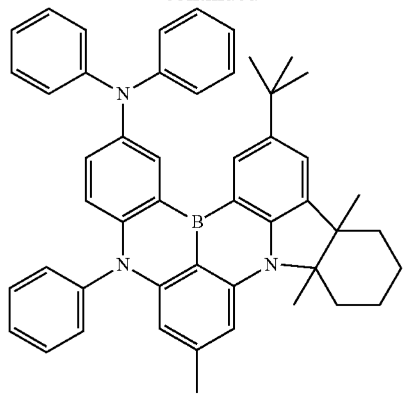
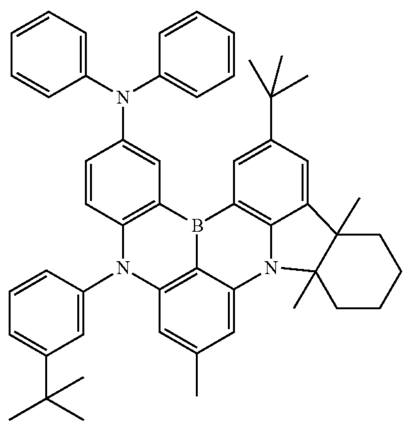
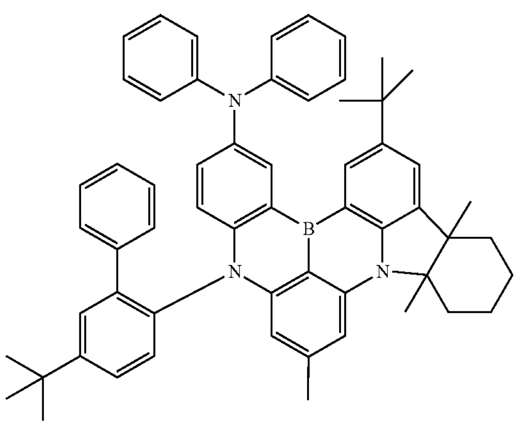
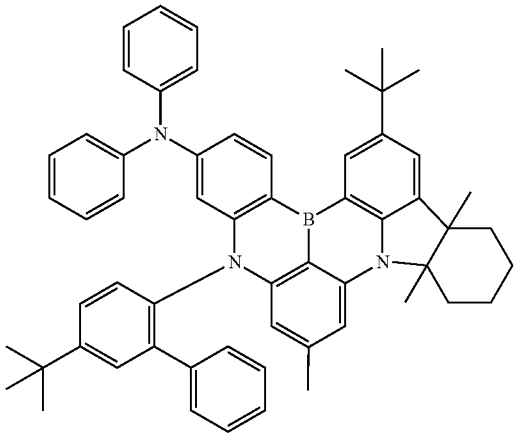
-continued
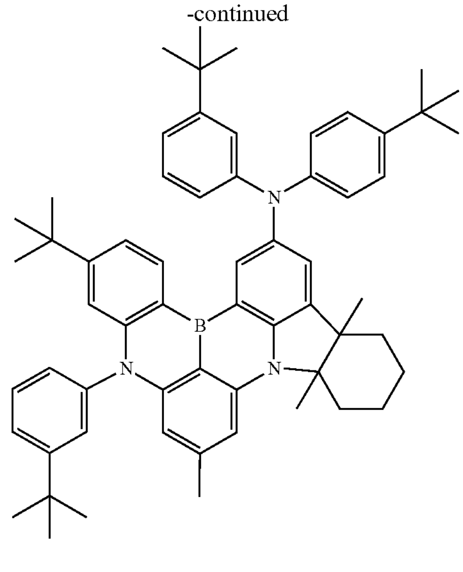
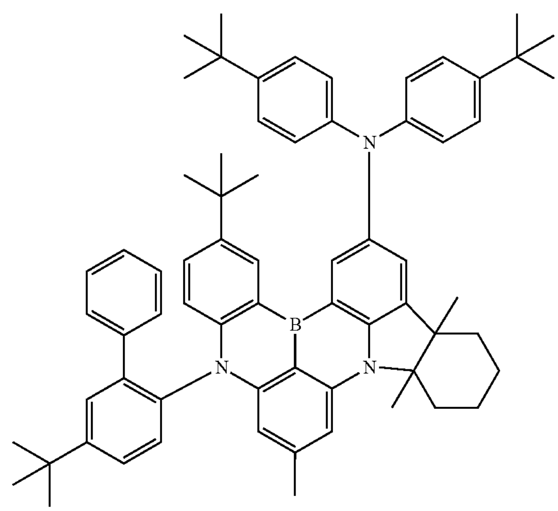
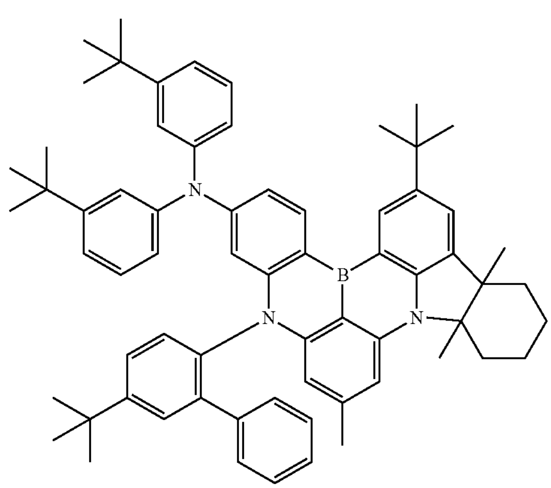

-continued
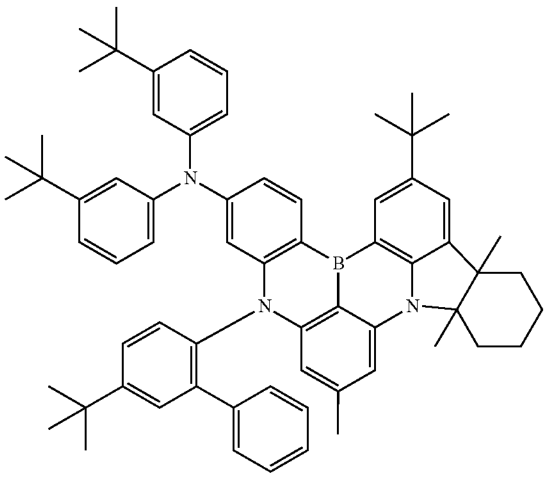
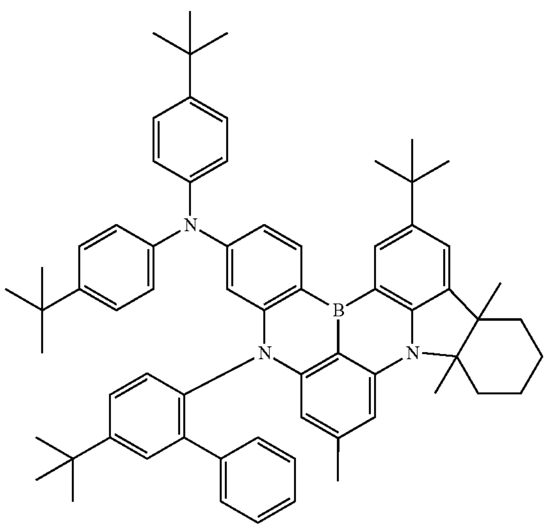
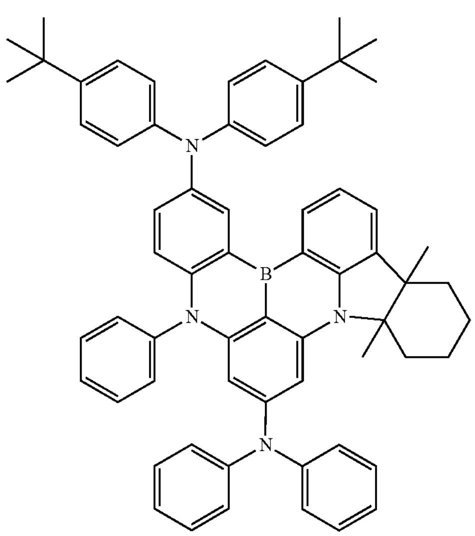
-continued
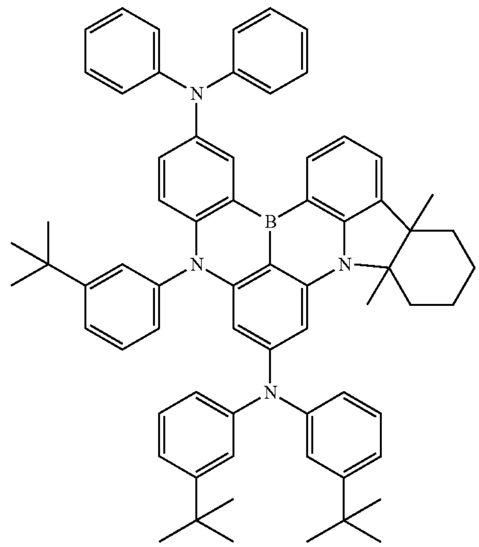
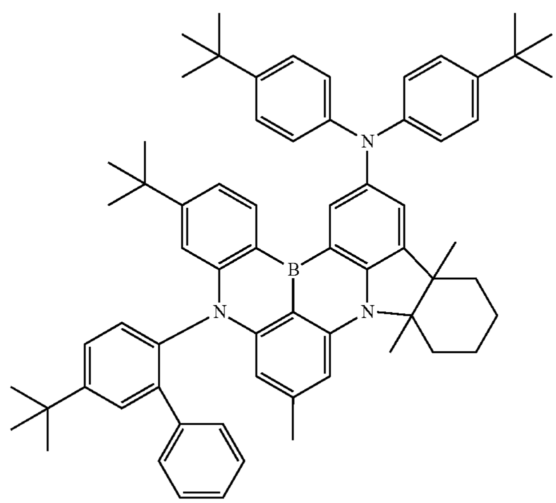
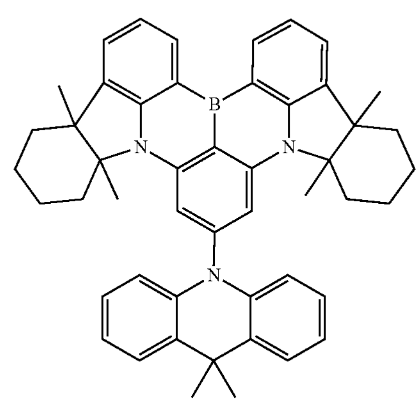

-continued
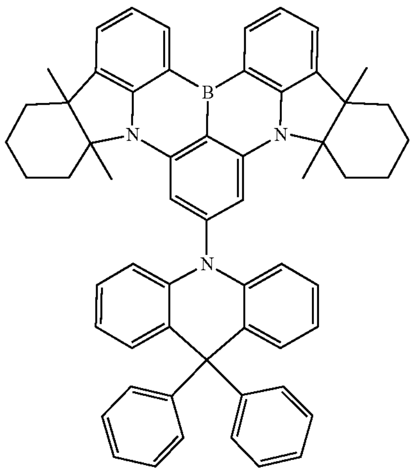
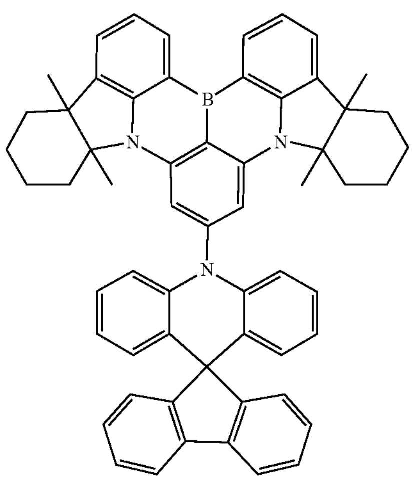
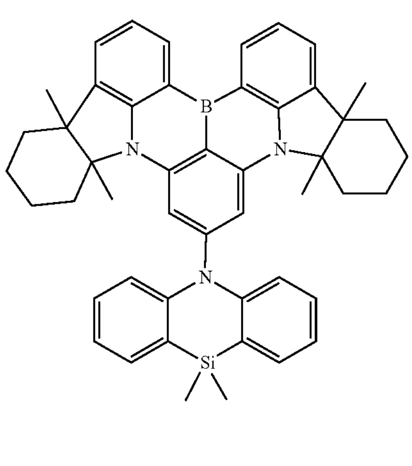
-continued
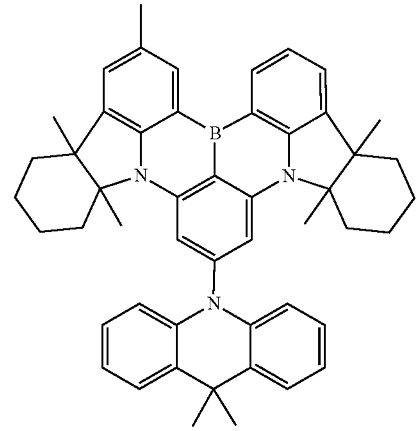
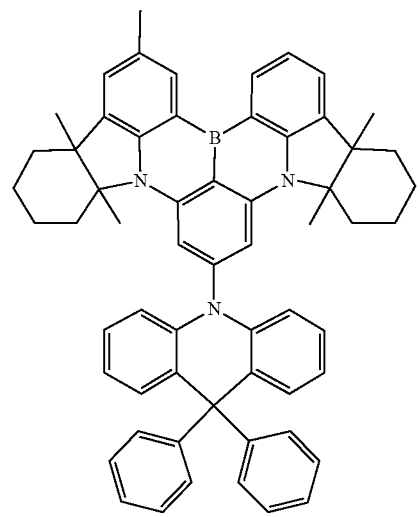
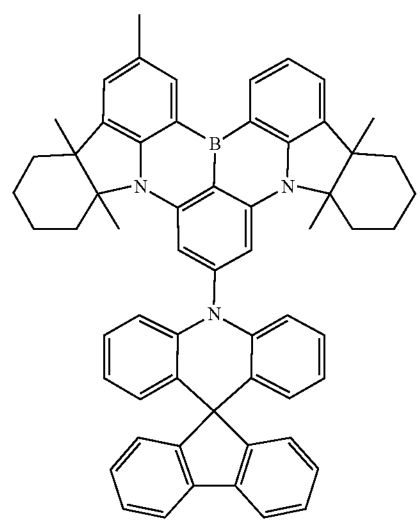

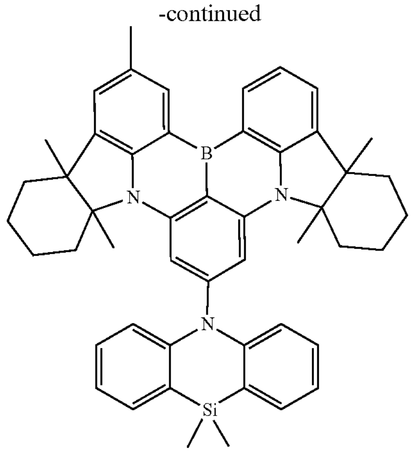
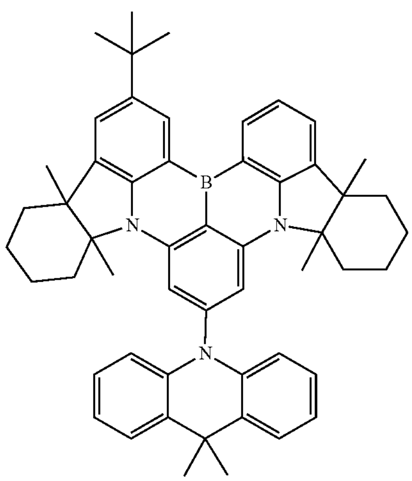
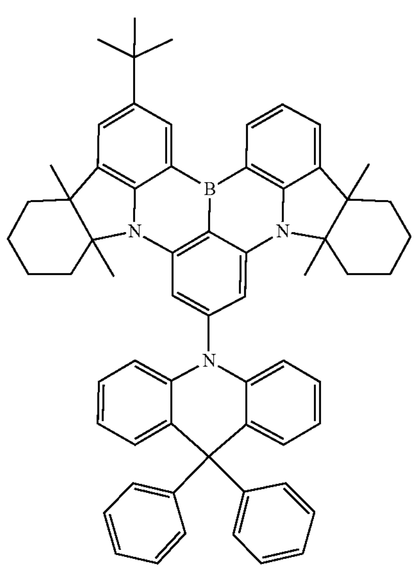
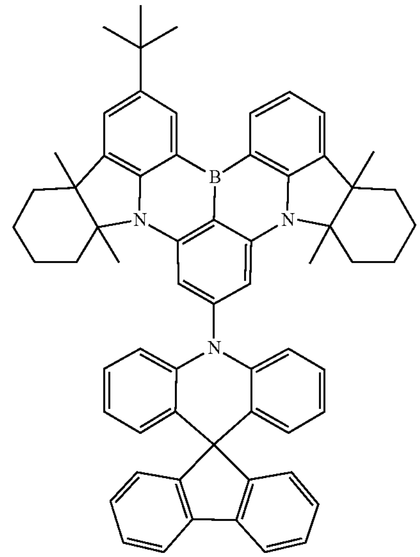
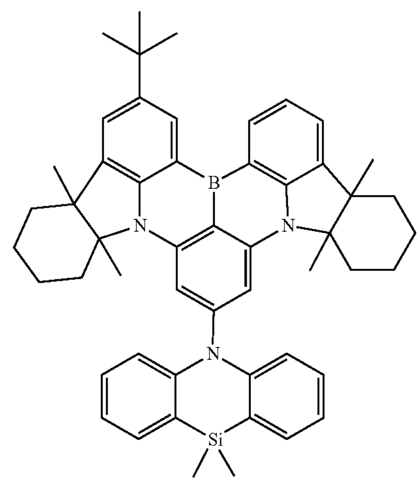
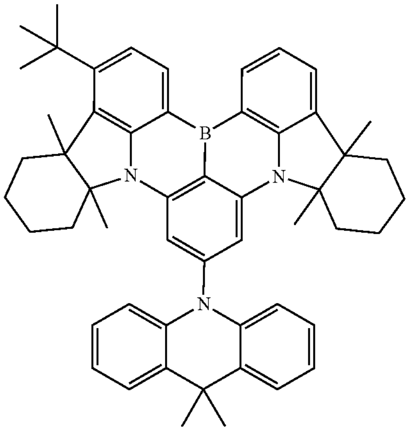

-continued
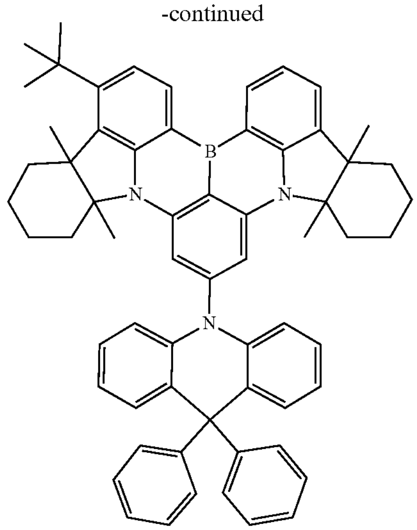
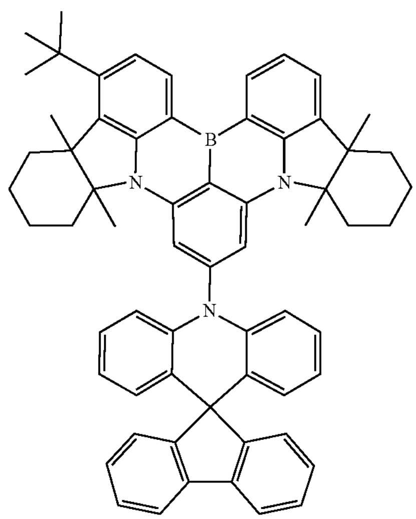
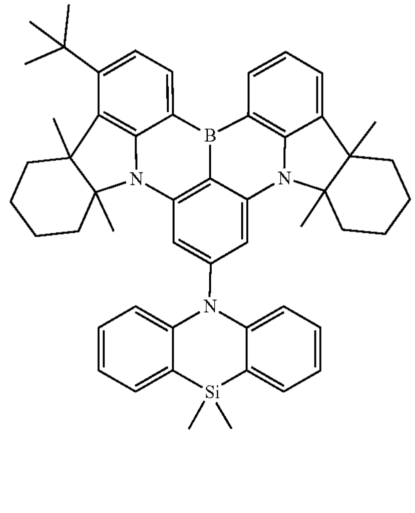
-continued
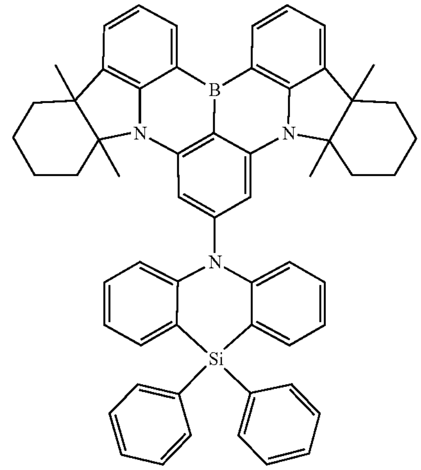
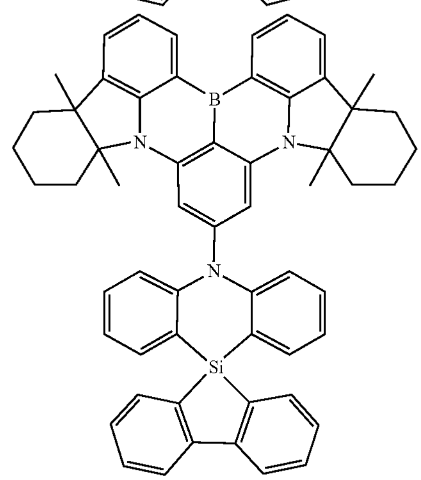
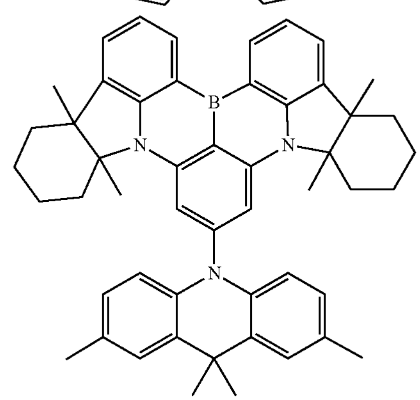
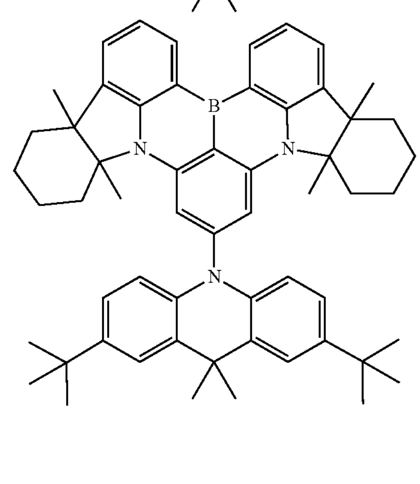

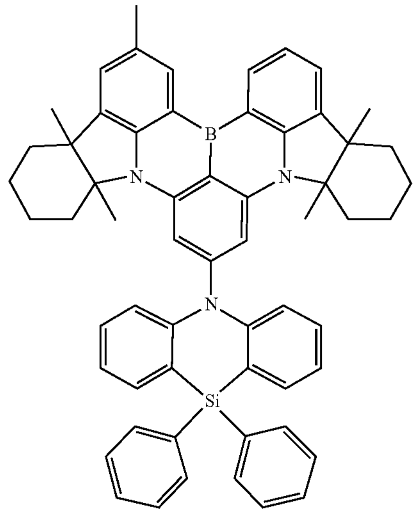
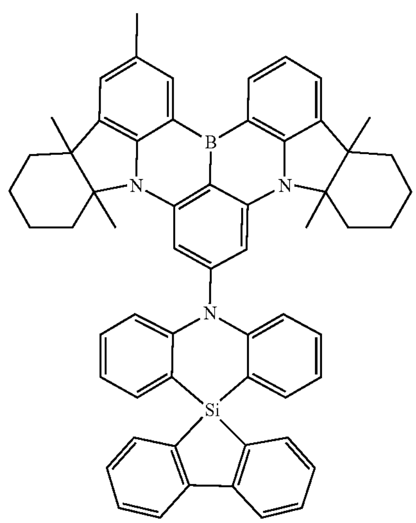
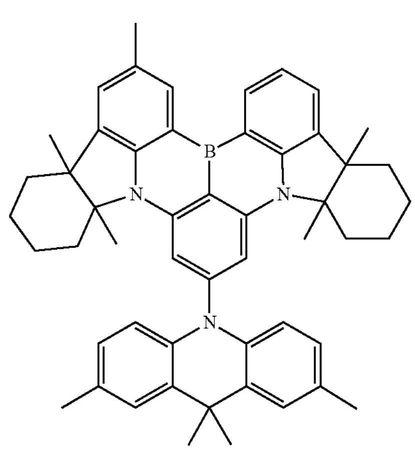
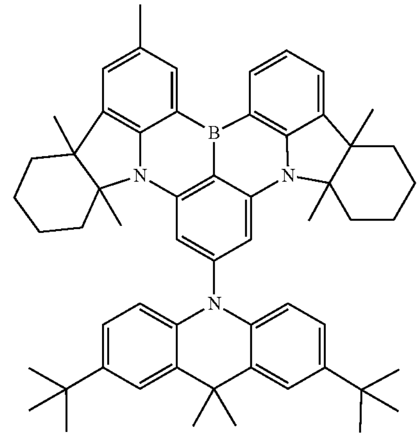
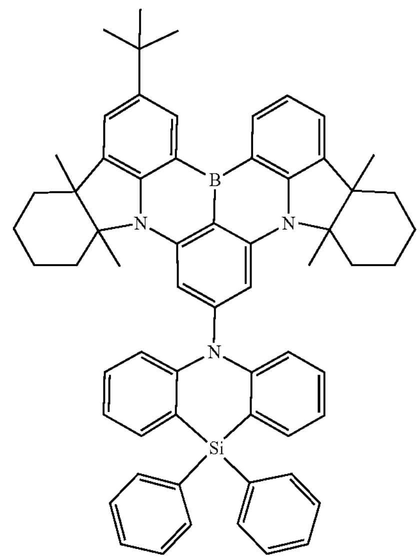
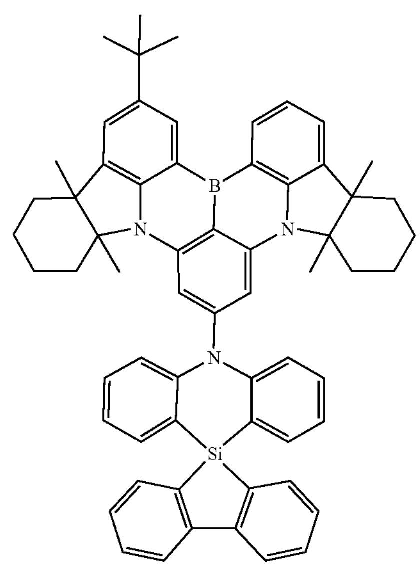

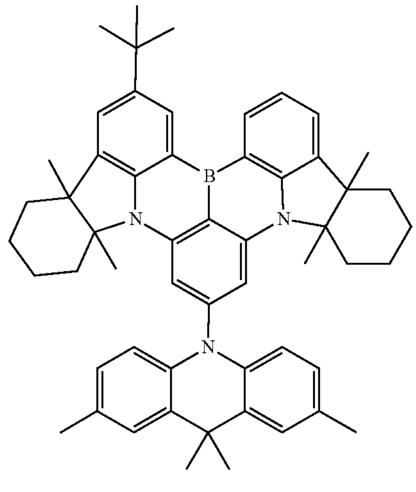
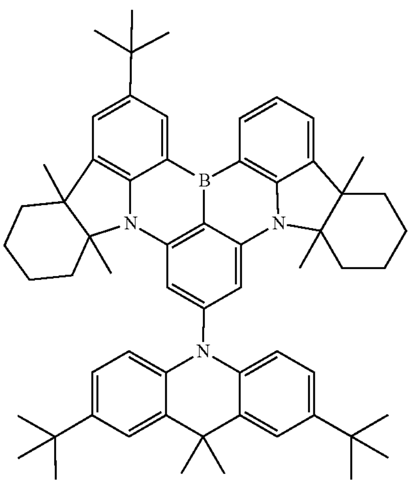
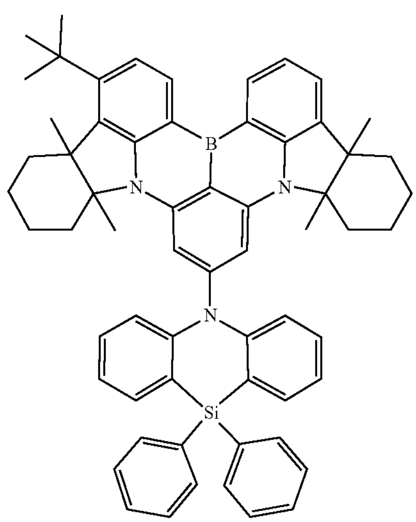
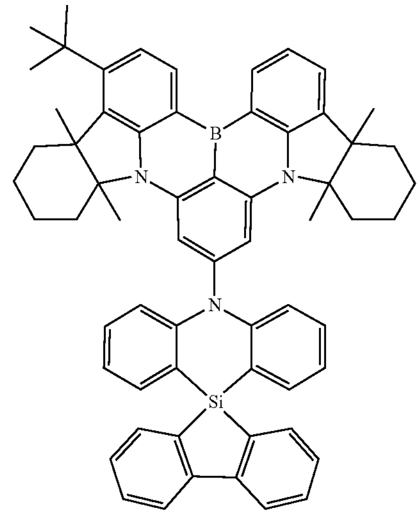
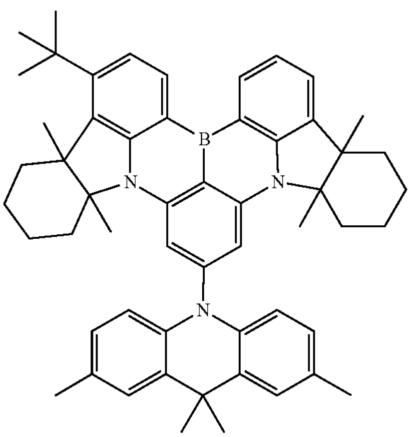
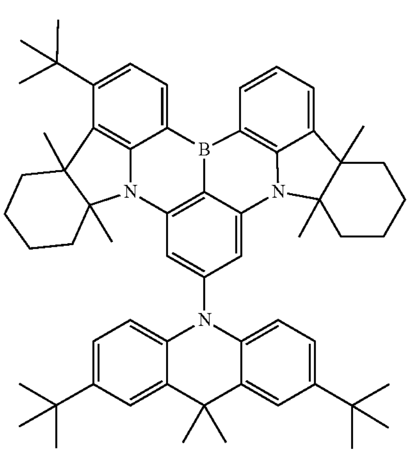

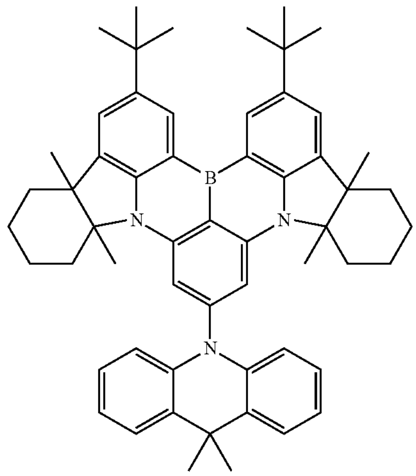
B
N
N
N
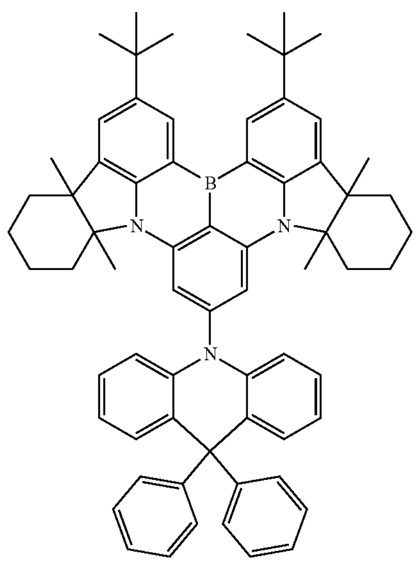
B
N
N
N
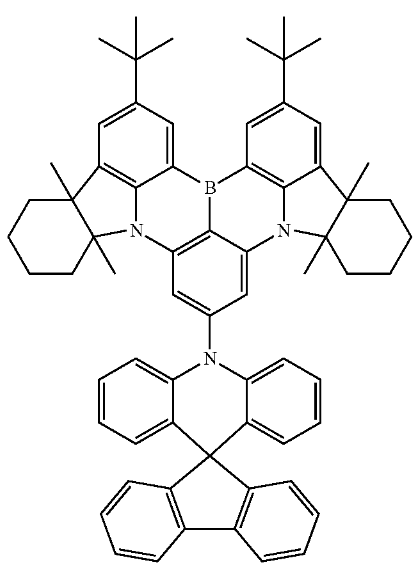
B
N
N
N
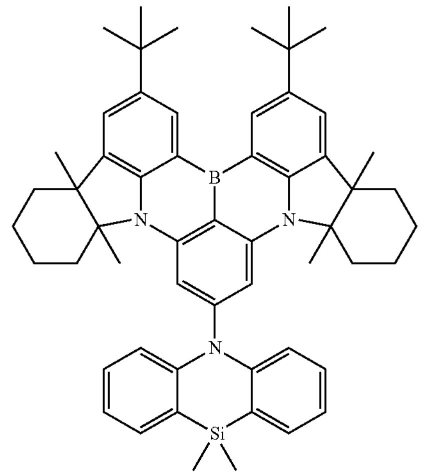
B
N
N
N
Si
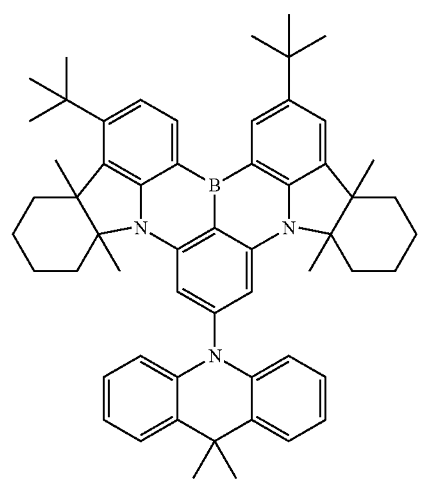
B
N
N
N
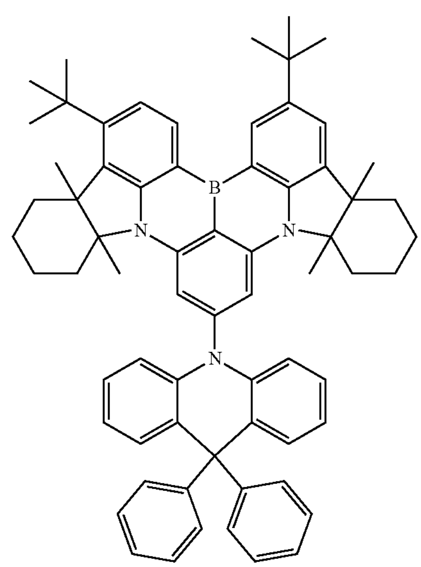
B
N
N
N

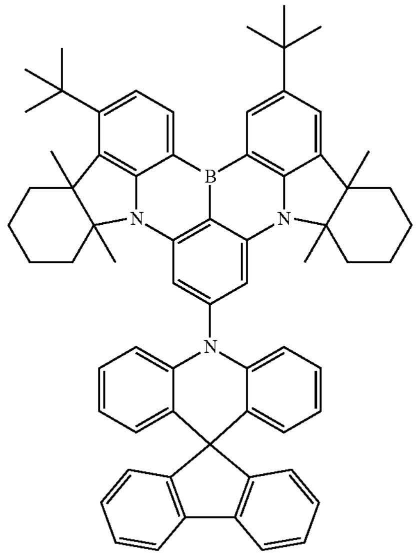
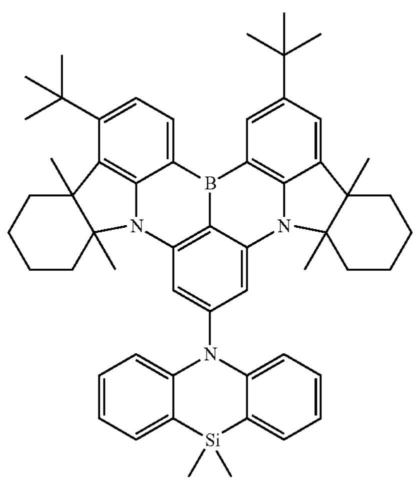
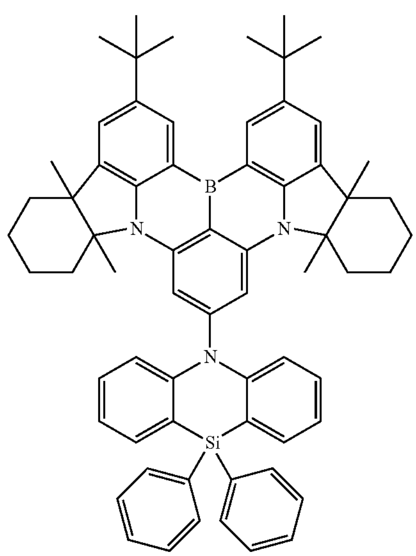
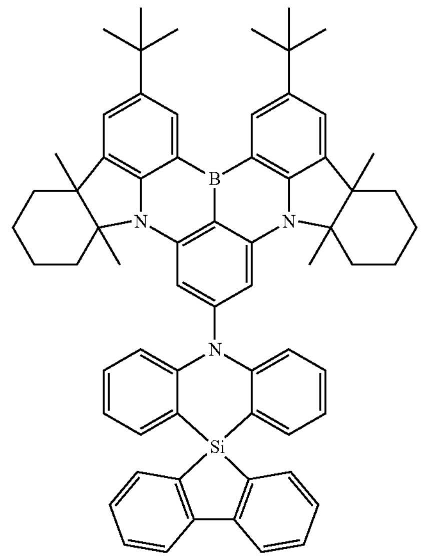
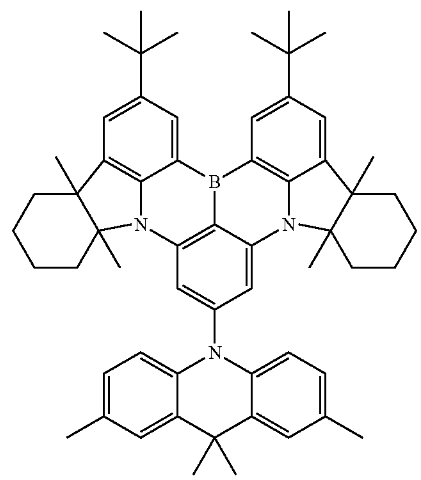
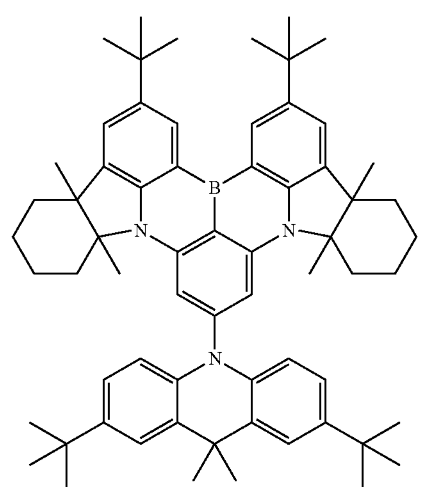

-continued

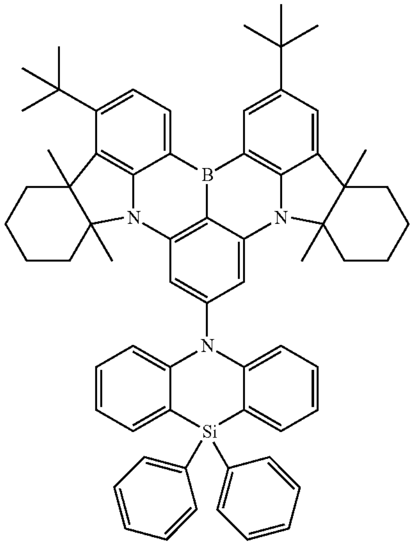

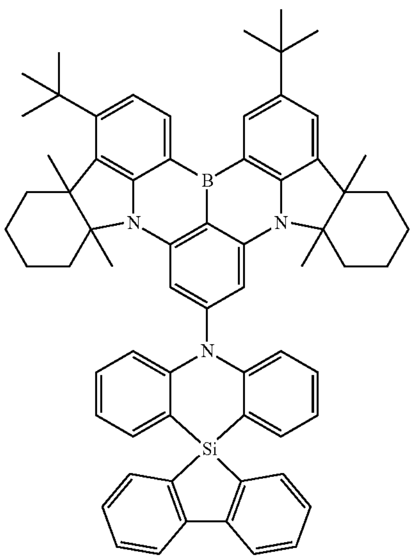

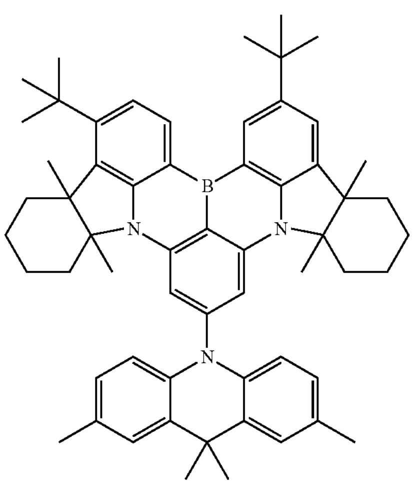

-continued

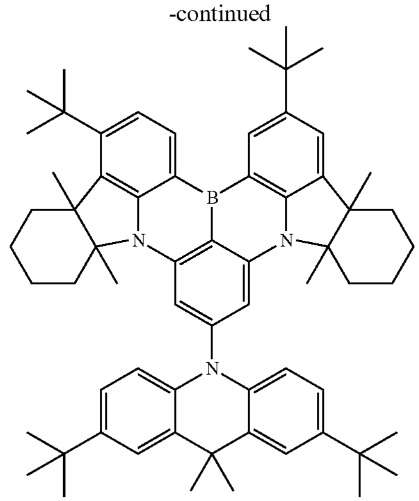

A core structure can be prepared using the following reaction scheme from the compound of Formula 1 according to an exemplary embodiment of the present specification. The substituent can be bonded by a method known in the art, and the kind and position of the substituent or the number of substituents can be changed according to the technology known in the art.

<Reaction Scheme 1>

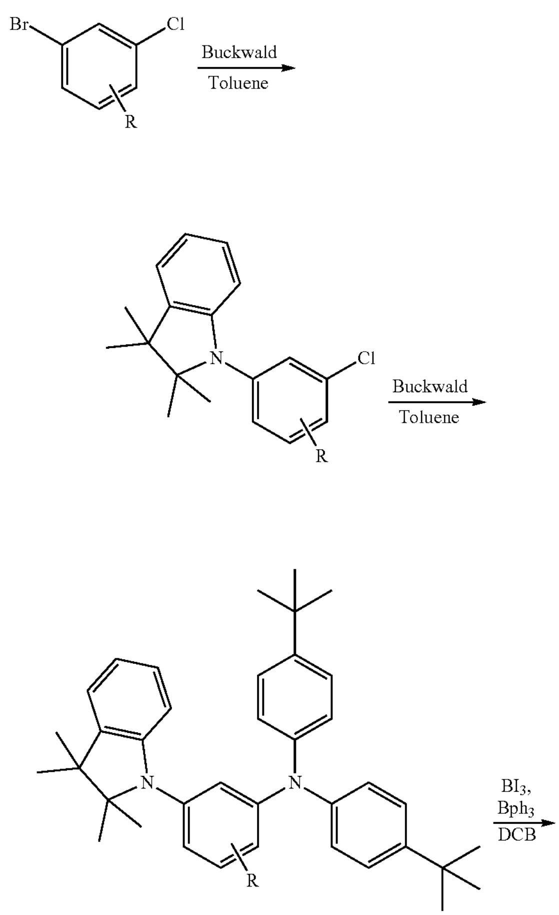

-continued

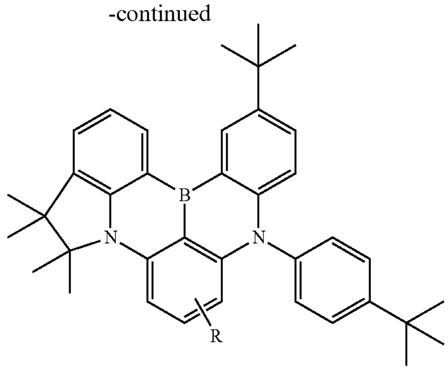

Final product

Starting from a bromochloride compound, an aryl intermediate substituted with various types of amines is synthesized by an amination reaction using a palladium catalyst. Next, the final product can be obtained by using boron triiodide to introduce boron. Reaction Scheme 1 exemplifies a process of synthesizing a compound in which a specific substituent is bonded to a specific position, but compounds corresponding to the range of Formula 1 can be synthesized by any synthesis method known in the art using a starting material, an intermediate material, and the like known in the art.

In the present invention, various substituents can be introduced into the core structure as described above to synthesize compounds having various energy bandgaps. Further, in the present invention, various substituents can be introduced into the core structure described above to adjust the HOMO and LUMO energy levels of compounds.

In addition, various substituents can be introduced into the core structure having the structure described above to synthesize compounds having inherent characteristics of the introduced substituents. For example, a substituent usually used for a hole injection layer material, a material for transporting holes, a light emitting layer material, and an electron transporting layer material, which are used for manufacturing an organic light emitting device, can be introduced into the core structure to synthesize a material which satisfies conditions required for each organic material layer.

Furthermore, the organic light emitting device according to the present invention is an organic light emitting device including: a first electrode; a second electrode provided to face the first electrode; and an organic material layer having one or more layers provided between the first electrode and the second electrode, in which one or more layers of the organic material layer include the above-described compound.

The organic light emitting device of the present invention can be manufactured using typical preparation methods and materials of an organic light emitting device, except that the above-described compound is used to form an organic material layer having one or more layers.

The compound can be formed as an organic material layer by not only a vacuum deposition method, but also a solution application method when an organic light emitting device is manufactured. Here, the solution application method means spin coating, dip coating, inkjet printing, screen printing, a spray method, roll coating, and the like, but is not limited thereto.

The organic material layer of the organic light emitting device of the present invention can also be composed of a single-layered structure, but can be composed of a multi-layered structure in which organic material layers having two or more layer are stacked. For example, the organic light emitting device of the present invention can have a structure including a hole injection layer, a hole transport layer, a layer which injects and transports holes simultaneously, a light emitting layer, an electron transport layer, an electron injection layer, and the like as organic material layers. However, the structure of the organic light emitting device is not limited thereto, and can include a fewer or greater number of organic material layers.

In the organic light emitting device of the present invention, the organic material layer can include one or more layers of an electron transport layer, an electron injection layer, and a layer which injects and transports electrons simultaneously, and one or more layers of the layers can include the compound of Formula 1.

In another organic light emitting device, the organic material layer can include an electron transport layer or an electron injection layer, and the electron transport layer or the electron injection layer can include the compound of Formula 1.

In the organic light emitting device of the present invention, the organic material layer can include one or more layers of a hole injection layer, a hole transport layer, and a layer which injects and transports holes simultaneously, and one or more layers of the layers can include the compound of Formula 1.

In still another organic light emitting device, the organic material layer can include a hole injection layer or a hole transport layer, and the hole transport layer or the hole injection layer can include the compound of Formula 1.

In still yet another exemplary embodiment, the organic material layer includes a light emitting layer, and the light emitting layer includes the compound of Formula 1. As an example, the compound of Formula 1 can be included as a dopant of the light emitting layer.

In an exemplary embodiment of the present specification, the organic light emitting device is a green organic light emitting device in which the light emitting layer includes the compound of Formula 1 as a dopant.

According to an exemplary embodiment of the present specification, the organic light emitting device is a red organic light emitting device in which the light emitting layer includes the compound of Formula 1 as a dopant.

In another exemplary embodiment, the organic light emitting device is a blue organic light emitting device in which the light emitting layer includes the compound of Formula 1 as a dopant.

As another example, the organic material layer including the compound of Formula 1 can include the compound of Formula 1 as a dopant, and can include an organic compound such as an anthracene-based compound as a host.

As still another example, the organic material layer including the compound of Formula 1 can include the compound of Formula 1 as a dopant, and can further include a fluorescent host or a phosphorescent host.

In still another exemplary embodiment, the organic material layer including the compound of Formula 1 can include the compound of Formula 1 as a dopant, include a fluorescent host or a phosphorescent host, and include another organic compound, a metal or a metal compound as a dopant.

As yet another example, the organic material layer including the compound of Formula 1 can include the compound of Formula 1 as a dopant and include a fluorescent host or a phosphorescent host, and can be used with an iridium (Ir)-based dopant.

When the light emitting layer includes a dopant and a host, the dopant can be included in an amount of 0.01 to 10 parts by weight based on 100 parts by weight of the host.

In an exemplary embodiment of the present specification, the first electrode is a positive electrode, and the second electrode is a negative electrode.

According to another exemplary embodiment, the first electrode is a negative electrode, and the second electrode is a positive electrode.

The organic light emitting device can have, for example, the stacking structure described below, but the stacking structure is not limited thereto:

(1) Positive electrode/Hole transport layer/Light emitting layer/Negative electrode (2) Positive electrode/Hole injection layer/Hole transport layer/Light emitting layer/Negative electrode (3) Positive electrode/Hole injection layer/Hole buffer layer/Hole transport layer/Light emitting layer/Negative electrode (4) Positive electrode/Hole transport layer/Light emitting layer/Electron transport layer/Negative electrode (5) Positive electrode/Hole transport layer/Light emitting layer/Electron transport layer/Electron injection layer/Negative electrode (6) Positive electrode/Hole injection layer/Hole transport layer/Light emitting layer/Electron transport layer/Negative electrode (7) Positive electrode/Hole injection layer/Hole transport layer/Light emitting layer/Electron transport layer/Electron injection layer/Negative electrode (8) Positive electrode/Hole injection layer/Hole buffer layer/Hole transport layer/Light emitting layer/Electron transport layer/Negative electrode (9) Positive electrode/Hole injection layer/Hole buffer layer/Hole transport layer/Light emitting layer/Electron transport layer/Electron injection layer/Negative electrode

(10) Positive electrode/Hole transport layer/Electron blocking layer/Light emitting layer/Electron transport layer/Negative electrode

(11) Positive electrode/Hole transport layer/Electron blocking layer/Light emitting layer/Electron transport layer/Electron injection layer/Negative electrode

(12) Positive electrode/Hole injection layer/Hole transport layer/Electron blocking layer/Light emitting layer/Electron transport layer/Negative electrode

(13) Positive electrode/Hole injection layer/Hole transport layer/Electron blocking layer/Light emitting layer/Electron transport layer/Electron injection layer/Negative electrode

(14) Positive electrode/Hole transport layer/Light emitting layer/Hole blocking layer/Electron transport layer/Negative electrode

(15) Positive electrode/Hole transport layer/Light emitting layer/Hole blocking layer/Electron transport layer/Electron injection layer/Negative electrode

(16) Positive electrode/Hole injection layer/Hole transport layer/Light emitting layer/Hole blocking layer/Electron transport layer/Negative electrode

(17) Positive electrode/Hole injection layer/Hole transport layer/Light emitting layer/Hole blocking layer/Electron transport layer/Electron injection layer/Negative electrode

(18) Positive electrode/Hole injection layer/Hole transport layer/Electron blocking layer/Light emitting layer/Hole blocking layer/Electron injection and transport layer/Negative electrode

(19) Positive electrode/Hole injection layer/Hole transport layer/Electron blocking layer/Light emitting layer/First electron transport layer/Second electron transport layer/Negative electrode.

The structure of the organic light emitting device of the present invention can have a structure illustrated in FIG. 1, but is not limited thereto.

FIG. 1 exemplifies a structure of an organic light emitting device in which a positive electrode 2, a hole injection layer 3, a hole transport layer 4, an electron blocking layer 5, a light emitting layer 6, a first electron transport layer 7, a second electron transport layer 8, and a negative electrode 9 are sequentially stacked on a substrate 1. In the structure described above, the compound of Formula 1 can be included in the light emitting layer 6.

For example, the organic light emitting device according to the present invention can be manufactured by depositing a metal or a metal oxide having conductivity, or an alloy thereof on a substrate to form a positive electrode, forming an organic material layer having one or more layers selected from the group consisting of a hole injection layer, a hole transport layer, an electron blocking layer, a layer which transports and injects holes simultaneously, a light emitting layer, an electron transport layer, an electron injection layer, a hole blocking layer, and a layer which transports and injects electrons simultaneously, thereon, and then depositing a material, which can be used as a negative electrode, thereon, by using a physical vapor deposition (PVD) method such as sputtering or e-beam evaporation. In addition to the method described above, an organic light emitting device can also be made by sequentially depositing a negative electrode material, an organic material layer, and a positive electrode material on a substrate.

The organic material layer can have a multi-layered structure including a hole injection layer, a hole transport layer, a light emitting layer, and an electron transport layer, and the like, but is not limited thereto and can have a single-layered structure. Further, the organic material layer can be manufactured with a fewer number of layers by a method, such as a solvent process, for example, spin coating, dip coating, doctor blading, a screen printing, inkjet printing, or a thermal transfer method, using various polymers, instead of a deposition method.

The positive electrode is an electrode which injects holes, and as the positive electrode material, materials having a high work function are usually preferred so as to facilitate the injection of holes into an organic material layer. Specific examples of a positive electrode material which can be used in the present invention include: a metal, such as vanadium, chromium, copper, zinc, and gold, or an alloy thereof; a metal oxide, such as zinc oxide, indium oxide, indium tin oxide (ITO), and indium zinc oxide (IZO); a combination of metal and oxide, such as ZnO:Al or $SnO_2$:Sb; a conductive polymer, such as poly(3-methylthiophene), poly[3,4-(ethylene-1,2-dioxy)thiophene] (PEDOT), polypyrrole, and polyaniline; and the like, but are not limited thereto.

The negative electrode is an electrode which injects electrons, and as the negative electrode material, materials having a low work function are usually preferred so as to facilitate the injection of electrons into an organic material layer. Specific examples of a negative electrode material include: a metal such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al, and the like, but are not limited thereto.

The hole injection layer is a layer which serves to facilitate the injection of holes from a positive electrode to a light emitting layer, and a hole injection material is a material which can proficiently receive holes injected from a positive electrode at low voltage, and it is preferred that the highest occupied molecular orbital (HOMO) of the hole injection material is between the work function of the positive electrode material and the HOMO of the peripheral organic material layer. Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone, polyaniline-based and polythiophene-based conductive polymers, and the like, but are not limited thereto.

The hole transport layer can serve to smoothly transport holes. A hole transport material is suitably a material having high hole mobility which can receive holes transported from a positive electrode or a hole injection layer and transfer the holes to a light emitting layer. Specific examples thereof include arylamine-based organic material, conductive polymers, block copolymers having both conjugated portions and non-conjugated portions, and the like, but are not limited thereto.

A hole buffer layer can be additionally provided between the hole injection layer and the hole transport layer, and include hole injection or transport materials known in the art.

An electron blocking layer can be provided between the hole transport layer and the light emitting layer. As the electron blocking layer, a spiroindoloacridine-based compound or a material known in the art can be used.

The light emitting layer can emit red, green, or blue light, and can be composed of a phosphorescent material or a fluorescent material. The light emitting material is a material which can receive holes and electrons from a hole transport layer and an electron transport layer, respectively, and combine the holes and the electrons to emit light in a visible ray region, and is preferably a material having good quantum efficiency to fluorescence or phosphorescence. Specific examples thereof include: 8-hydroxy-quinoline aluminum complexes ($Alq_3$); carbazole-based compounds; dimerized styryl compounds; $BAlq_3$; 10-hydroxybenzoquinoline-metal compounds; benzoxazole-based, benzothiazole-based and benzimidazole-based compounds; poly(p-phenylenevinylene) (PPV)-based polymers; spiro compounds; polyfluorene, rubrene, and the like, but are not limited thereto.

Examples of a host material for the light emitting layer include fused aromatic ring derivatives, or hetero ring-containing compounds, and the like. Specifically, examples of the fused aromatic ring derivative include anthracene derivatives, pyrene derivatives, naphthalene derivatives, pentacene derivatives, phenanthrene compounds, fluoranthene compounds, and the like, and examples of the hetero ring-containing compound include carbazole derivatives, dibenzofuran derivatives, ladder-type furan compounds, pyrimidine derivatives, and the like, but the examples thereof are not limited thereto.

When the light emitting layer emits red light, it is possible to use a phosphorescent material such as bis(1-phenylisoquinoline) acetylacetonate iridium (PIQIr(acac)), bis(1-phenylquinoline)acetylacetonate iridium (PQIr(acac)), tris(1-phenylquinoline)iridium (PQIr), or octaethylporphyrin platinum (PtOEP), or a fluorescent material such as tris(8-hydroxyquinolino)aluminum ($Alq_3$), as a light emitting dopant, but the light emitting dopant is not limited thereto. When the light emitting layer emits green light, it is possible to use a phosphorescent material such as fac-tris(2-phenylpyridine)iridium ($Ir(ppy)_3$), or a fluorescent material such as tris(8-hydroxyquinolino)aluminum ($Alq_3$), as the light emitting dopant, but the light emitting dopant is not limited thereto. When the light emitting layer emits blue light, it is possible to use a phosphorescent material such as $(4,6\text{-}F_2PPY)_2Irpic$, or a fluorescent material such as spiro-DPVBi, spiro-6P, distyrylbenzene (DSB), distyrylarylene (DSA), PFO-based polymers or PPV-based polymer, as the light emitting dopant, but the light emitting dopant is not limited thereto.

The electron transport layer can serve to smoothly transport electrons. An electron transport material is suitably a material having high electron mobility which can proficiently receive electrons injected from a negative electrode and transfer the electrons to a light emitting layer. Specific examples thereof include: Al complexes of 8-hydroxyquinoline, complexes including $Alq_3$, organic radical compounds, hydroxyflavone-metal complexes, 8-quinolinolato lithium (LiQ), benzoimidazole-based compounds, or a combination thereof, and the like, but are not limited thereto. Further, the electron transport layer can be formed of one layer, but can be formed of two or more layers.

The electron injection layer can serve to smoothly inject electrons. An electron injection material is preferably a compound which has a capability of transporting electrons, an effect of injecting electrons from a negative electrode, and an excellent effect of injecting electrons into a light emitting layer or a light emitting material, prevents excitons produced from a light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, metal complex compounds, nitrogen-containing 5-membered ring derivatives, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxy-quinolinato) manganese, tris(8-hydroxyquinolinato) aluminum, tris (2-methyl-8-hydroxyquinolinato) aluminum, tris(8-hydroxyquinolinato) gallium, bis(10-hydroxy-benzo[h] quinolinato) beryllium, bis(10-hydroxybenzo[h]-quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which blocks holes from reaching a negative electrode, and can be generally formed under the same conditions as those of the hole injection layer. Specific examples thereof include oxadiazole derivatives or triazole derivatives, phenanthroline derivatives, BCP, aluminum complexes, and the like, but are not limited thereto.

The organic light emitting device according to the present invention can be a top emission type, a bottom emission type, or a dual emission type according to the material to be used.

Examples

Hereinafter, the present specification will be described in detail with reference to Examples in order to specifically explain the present specification. However, the Examples according to the present specification can be modified in various forms, and it is not interpreted that the scope of the present application is limited to the Examples described in detail below. The Examples of the present application are provided for more completely explaining the present specification to the person with ordinary skill in the art.

Synthesis Examples

Reactant Synthesis

1) 6-bromo-4a,9a-dimethyl-2,3,4,4a,9,9a-hexahydro-1H-carbazole

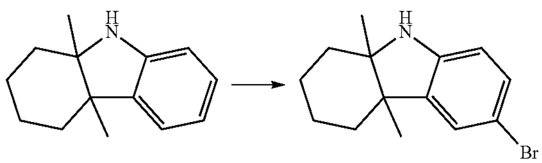 [SMILES: CC12CCCCC1(C)c1ccccc1N2 ; CC12CCCCC1(C)c1cc(Br)ccc1N2]

After 50 g of 4a,9a-dimethyl-2,3,4,4a,9,9a-hexahydro-1H-carbazole was dissolved in 1,000 ml of tetrahydrofuran under nitrogen atmosphere, the temperature was lowered to 0° C., and then 44.2 g of N-bromosuccinimide was slowly added thereto, and 1 hour later, the resulting product was extracted after the completion of the reaction, and then purified with an ethyl acetate:hexane column to obtain 62 g of 6-bromo-4a,9a-dimethyl-2,3,4,4a,9,9a-hexahydro-1H-carbazole (yield 89%).

MS[M+H]+=281

2) 4a,9a-dimethyl-6-phenyl-2,3,4,4a,9,9a-hexahydro-1H-carbazole

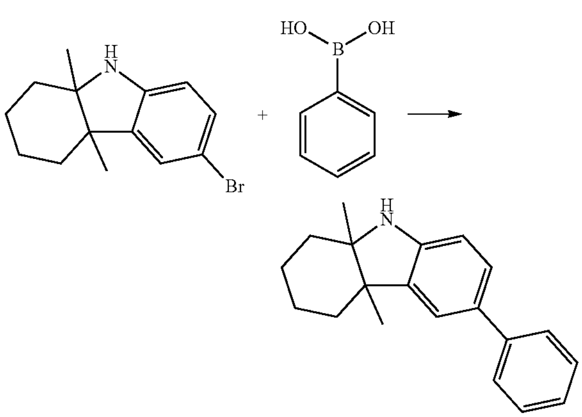

After 50 g of 6-bromo-4a,9a-dimethyl-2,3,4,4a,9,9a-hexahydro-1H-carbazole, 23.9 g of phenyl boronic acid, 49.32 g of potassium carbonate, and 2.73 g of bis(tri-tert-butylphosphine)palladium(0) were dissolved in 600 m1 of tetrahydrofuran under nitrogen atmosphere, and 3 hours later, the resulting product was extracted under reflux conditions using 300 ml of water after the completion of the reaction, and then purified with an ethyl acetate:hexane column to obtain 40 g of 4a,9a-dimethyl-6-phenyl-2,3,4,4a,9,9a-hexahydro-1H-carbazole (yield 81%).

MS[M+H]+=278

3) 4a,9a-dimethyl-6-(trimethylsilyl)-2,3,4,4a,9,9a-hexahydro-1H-carbazole

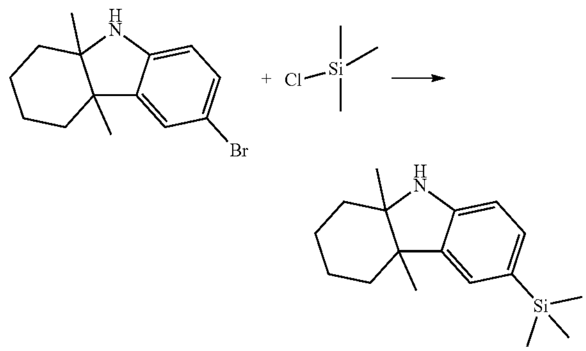

After 50 g of 6-bromo-4a,9a-dimethyl-2,3,4,4a,9,9a-hexahydro-1H-carbazole was dissolved in 1,000 ml of tetrahydrofuran under nitrogen atmosphere, the temperature was lowered to −78° C., and then 22.86 g of N-butyllithium (2.5 M) was slowly added dropwise thereto, 1 hour later, 25.2 g of chlorotrimethylsilane was slowly added dropwise thereto, and 3 hours later, the resulting product was extracted after the completion of the reaction, and then purified with an ethyl acetate:hexane column to obtain 34 g of 4a,9a-dimethyl-6-(trimethylsilyl)-2,3,4,4a,9,9a-hexahydro-1H-carbazole (yield 70%).

MS[M+H]+=274

4) 4a,9a-dimethyl-6-(trimphenylsilyl)-2,3,4,4a,9,9a-hexahydro-1H-carbazole

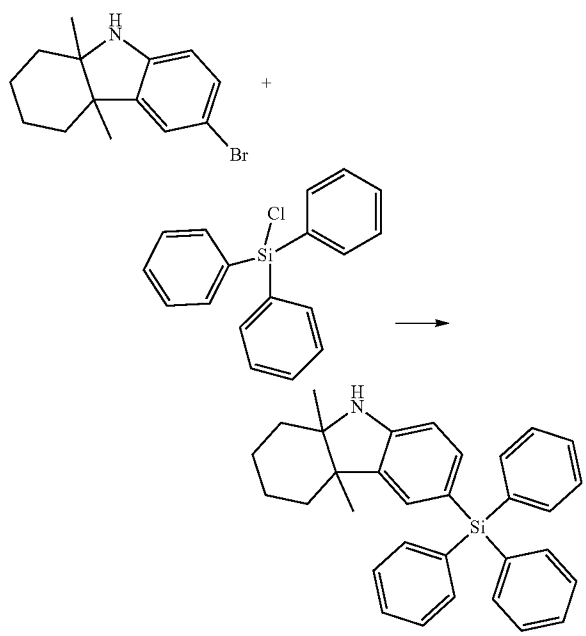

After 50 g of 6-bromo-4a,9a-dimethyl-2,3,4,4a,9,9a-hexahydro-1H-carbazole was dissolved in 1,000 ml of tetrahydrofuran under nitrogen atmosphere, the temperature was lowered to −78° C., and then 22.86 g of N-butyllithium (2.5 M) was slowly added dropwise thereto, 1 hour later, 68.39 g of chlorotriphenylsilane dissolved in tetrahydrofuran was slowly added dropwise thereto, and 6 hours later, the resulting product was extracted after the completion of the reaction, and then purified with an ethyl acetate:hexane column to obtain 61 g of 4a,9a-dimethyl-6-(triphenylsilyl)-2,3,4,4a,9,9a-hexahydro-1H-carbazole (yield 74%).

MS[M+H]+=460

5) 3,6-dibromo-9H-carbazole

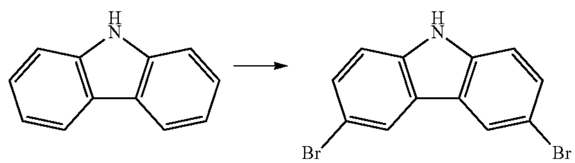 [SMILES: c1ccc2c(c1)[nH]c1ccccc12 ; Brc1ccc2[nH]c3ccc(Br)cc3c2c1]

After 50 g of 9H-carbazole was dissolved in 1,000 ml of N,N-dimethylformamide under nitrogen atmosphere, 95.6 g of bromine was slowly added thereto at room temperature, and 6 hours later, a solid was obtained by putting the resulting product into water after the completion of the reaction, and then purified with an ethyl acetate:hexane column to obtain 84 g of 3,6-dibromo-9H-carbazole (yield 86%).

MS[M+H]+=326

6) 3,6-diphenyl-9H-carbazole

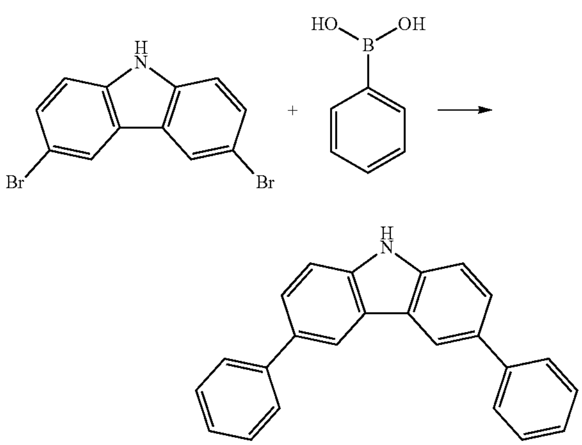

After 50 g of 3,6-dibromo-9H-carbazole, 39.3 g of phenyl boronic acid, 42.42 g of potassium carbonate, and 2.35 g of bis(tri-tert-butylphosphine)palladium(0) were dissolved in 700 ml of tetrahydrofuran under nitrogen atmosphere, and 3 hours later, the resulting product was extracted under reflux conditions using 300 ml of water after the completion of the reaction, and then purified with an ethyl acetate:hexane column and then recrystallized to obtain 41 g of 3,6-diphenyl-9H-carbazole (yield 84%).

MS[M+H]+=320

7) 3,6-bis(trimethylsilyl)-9H-carbazole

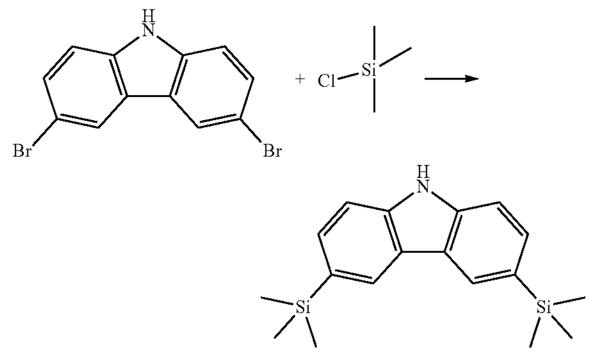

After 50 g of 3,6-dibromo-9H-carbazole was dissolved in 1,200 ml of tetrahydrofuran under nitrogen atmosphere, the temperature was lowered to −78° C., and then 30.6 g of N-butyllithium (2.5 M) was slowly added dropwise thereto, and then 1 hour later, 35.1 g of chlorotrimethylsilane was slowly added dropwise thereto, and 3 hours later, the resulting product was extracted after the completion of the reaction, and then purified with an ethyl acetate:hexane column to obtain 37 g of 3,6-bis(trimethylsilyl)-9H-carbazole (yield 77%).

MS[M+H]+=312

8) 3,6-bis(triphenylsilyl)-9H-carbazole

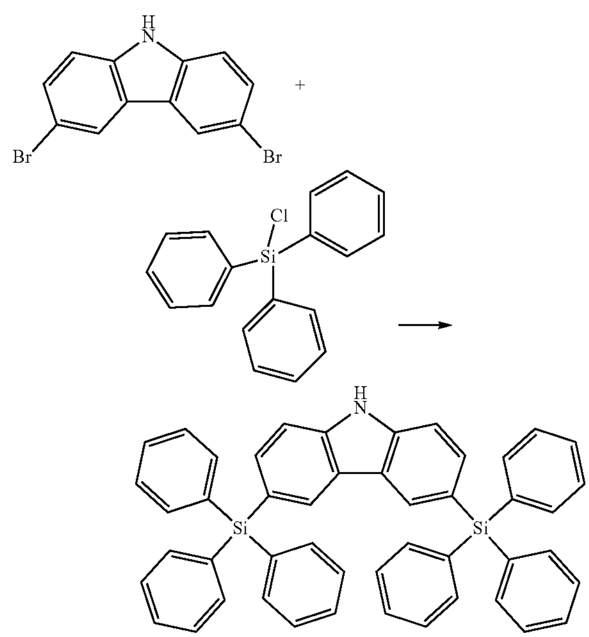

After 50 g of 3,6-dibromo-9H-carbazole was dissolved in 1,000 ml of tetrahydrofuran under nitrogen atmosphere, the temperature was lowered to −78° C., and then 22.86 g of N-butyllithium (2.5 M) was slowly added dropwise thereto, and then 1 hour later, 95.3 g of chlorotriphenyl-silane dissolved in tetrahydrofuran was slowly added dropwise thereto, and 6 hours later, the resulting product was extracted after the completion of the reaction, and then purified with an ethyl acetate:hexane column and then recrystallized to obtain 79 g of 3,6-bis(triphenylsilyl)-9H-carbazole (yield 75%).

MS[M+H]+=685

Synthesis Example 1: Synthesis of Compound 1

1) Synthesis of Intermediate I1

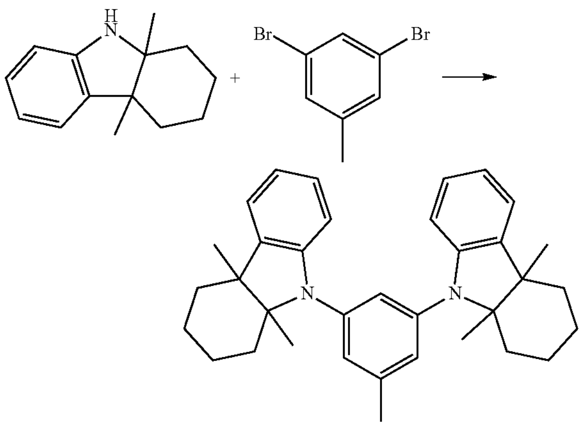

I1

After 15.1 g of 4a,9a-dimethyl-2,3,4,4a,9,9a-hexahydro-1H-carbazole, 9.4 g of 1,3-dibromo-5-methylbenzene, 24 g of sodium-tert-butoxide, and 0.96 g of bis(tri-tert-butylphosphine)palladium(0) were put into 150 ml of toluene under nitrogen atmosphere, the resulting mixture was stirred for 3 hours. After the completion of the reaction, the resulting product was extracted, and then recrystallized with an ethyl acetate:hexane, and then 16 g of Intermediate I1 was obtained. (Yield 87%).

MS[M+H]+=491

2) Synthesis of Compound 1

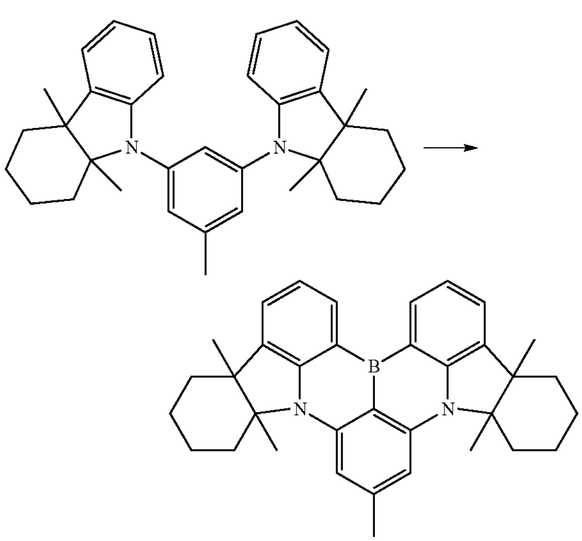

1

Under nitrogen atmosphere, 5 g of Intermediate I1, 10 g of boron triiodide, and 2.7 g of triphenylborane were stirred using dichlorobenzene at 160° C. for 4 hours. The reaction was completed, and the resulting product was extracted at room temperature, and then recrystallized with ethyl acetate: hexane, and then 3 g of Compound 1 was obtained (yield 59%).

MS[M+H]+=499

Synthesis Example 2. Synthesis of Compound 2

1) Synthesis of Intermediate I2

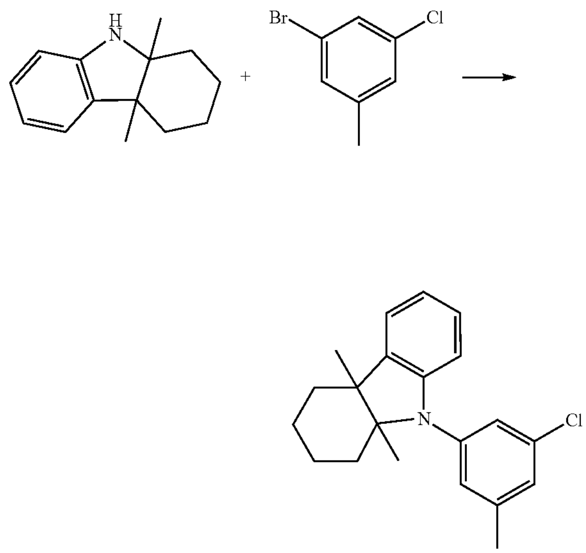

I2

After 30 g of 4a,9a-dimethyl-2,3,4,4a,9,9a-hexahydro-1H-carbazole, 29.4 g of 1-bromo-3-chloro-5-methylbenzene, 62 g of sodium-tert-butoxide, and 2.23 g of bis(tri-tert-butylphosphine)palladium(0) were put into 300 ml of toluene under nitrogen atmosphere, the resulting mixture was stirred for 3 hours. After the completion of the reaction, the resulting product was extracted, and then purified with an ethyl acetate:hexane column to obtain 40 g of Intermediate I2 which was in a liquid state (yield 84%).

MS[M+H]+=326

2) Synthesis of Intermediate I3

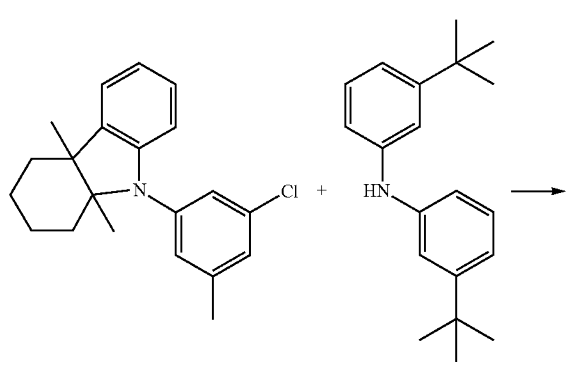

-continued

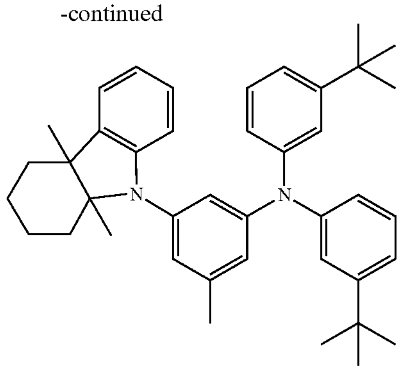

I3

After 6.9 g of Intermediate I2, 8 g of bis(3-(tert-butyl)phenyl)amine, 15.6 g of sodium-tert-butoxide, and 0.1 g of bis(tri-tert-butylphosphine)palladium(0) were put into 150 ml of toluene under nitrogen atmosphere, the resulting mixture was stirred for 6 hours. After the completion of the reaction, the resulting product was extracted, and then purified with an ethyl acetate:hexane column to obtain 10 g of Intermediate I3 (yield 71%).

MS[M+H]+=571

3) Synthesis of Compound 2

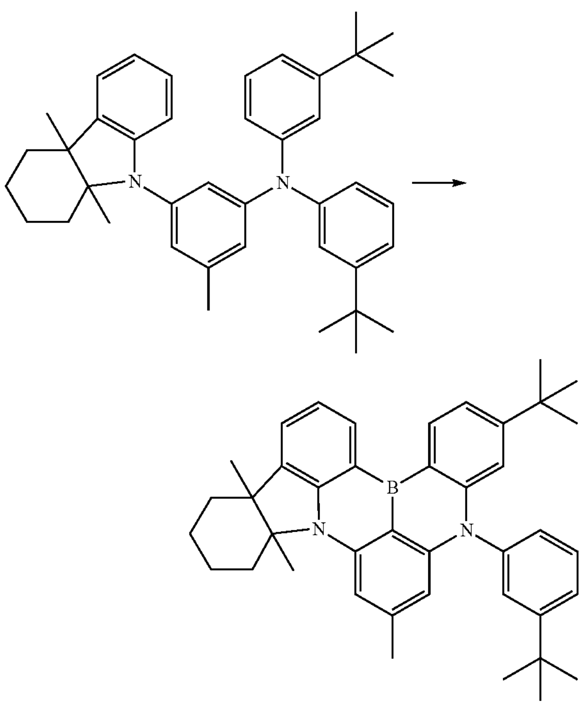

2

Under nitrogen atmosphere, 2 g of Intermediate I3, 3.4 g of boron triiodide, and 0.9 g of triphenylborane were stirred using dichlorobenzene at 160° C. for 4 hours. The reaction was completed, and the resulting product was extracted at room temperature, and then recrystallized with ethyl acetate:hexane, and then 1.5 g of Compound 2 was obtained (yield 74%).

MS[M+H]+=579

Synthesis Example 3. Synthesis of Compound 3

1) Synthesis of Intermediate I4

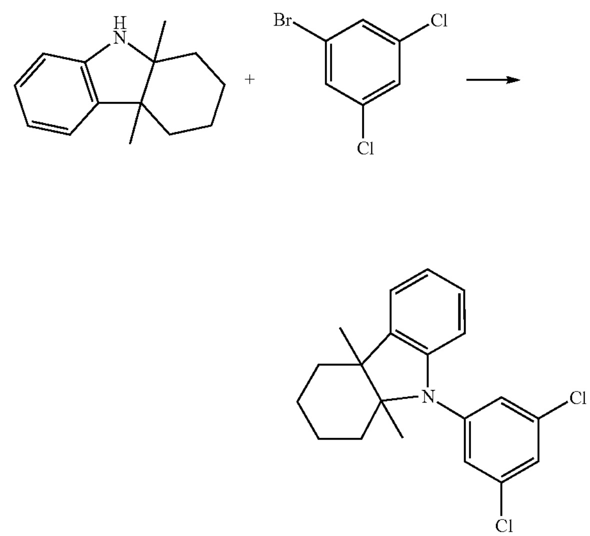

I4

After 26.75 g of 4a,9a-dimethyl-2,3,4,4a,9,9a-hexahydro-1H-carbazole, 30 g of 1-bromo-3,5-dichlorobenzene, 56 g of sodium-tert-butoxide, and 2.03 g of bis(tri-tert-butylphosphine)palladium(0) were put into 300 ml of toluene under nitrogen atmosphere, the resulting mixture was stirred for 3 hours. After the completion of the reaction, the resulting product was extracted, and then purified with an ethyl acetate:hexane column to obtain 35 g of Intermediate I4 (yield 76%).

MS[M+H]+=346

2) Synthesis of Intermediate I5

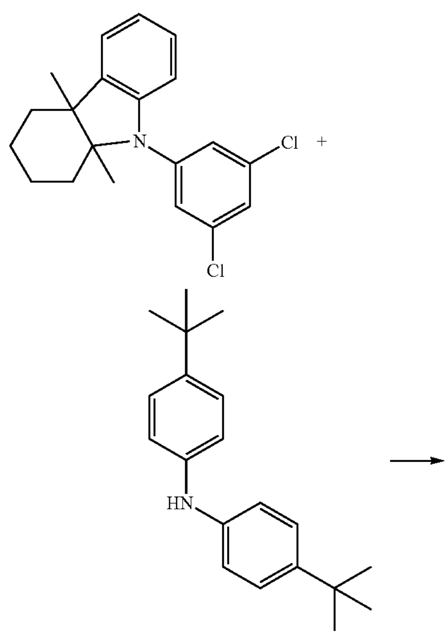

-continued

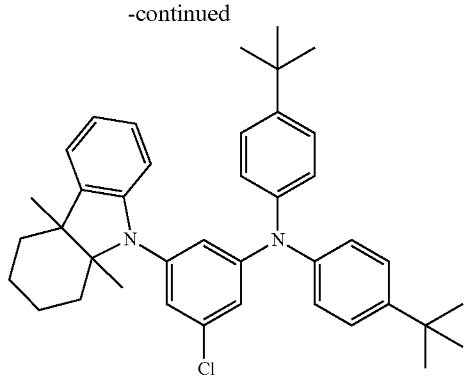

I5

After 41.3 g of Intermediate I4, 33.6 g of bis(4-(tert-butyl)phenyl)amine, 76.1 g of sodium-tert-butoxide, and 1.8 g of bis(tri-tert-butylphosphine)palladium(0) were put into 500 ml of toluene under nitrogen atmosphere, the resulting mixture was stirred for 6 hours. After the completion of the reaction, the resulting product was extracted, and then purified with an ethyl acetate:hexane column to obtain 50 g of Intermediate I5 (yield 71%).

MS[M+H]+=591

3) Synthesis of Intermediate I6

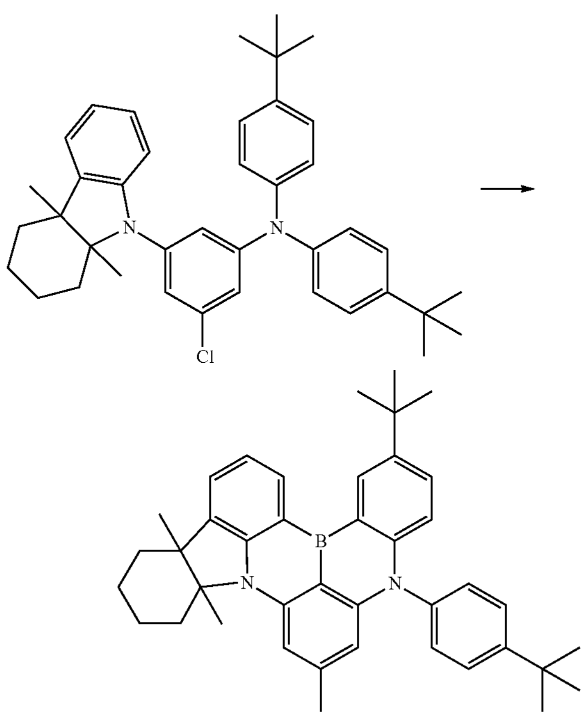

I6

Under nitrogen atmosphere, 2 g of Intermediate I5, 3.3 g of boron triiodide, and 0.9 g of triphenylborane were stirred using dichlorobenzene at 160° C. for 4 hours. The reaction was completed, the resulting product was extracted at room temperature, and then recrystallized with ethyl acetate:hexane to obtain 1.3 g of Intermediate I6 (yield 66%).

MS[M+H]+=599

4) Synthesis of Compound 3

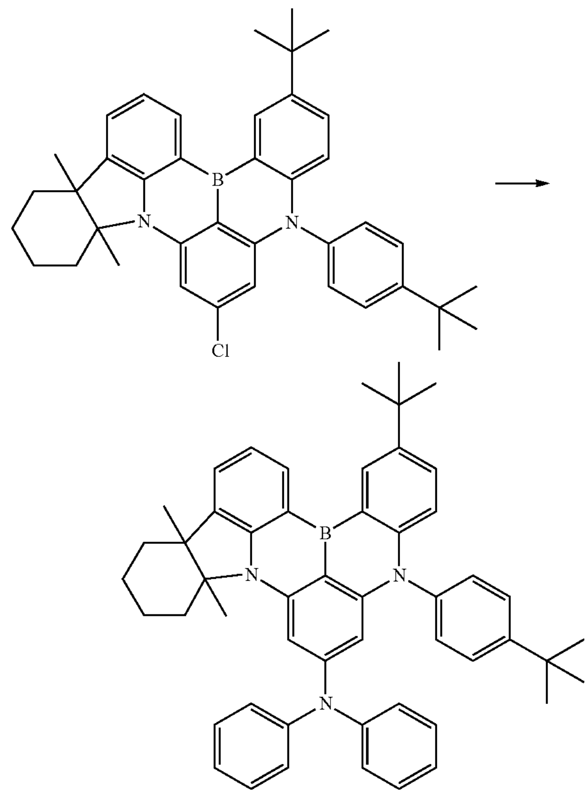

3

After 5 g of Intermediate I6, 1.9 g of diphenylamine, 3.6 g of sodium-tert-butoxide, and 0.1 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column to obtain 4 g of Compound 3 (yield 71%).

MS[M+H]+=731

Synthesis Example 4. Synthesis of Compound 4

1) Synthesis of Intermediate I7

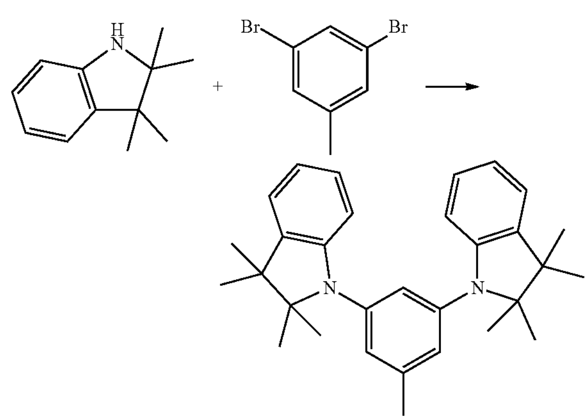

I7

After 14.1 g of 2,2,3,3-tetramethylindolin, 10 g of 1,3-dibromo-5-methylbenzene, 25 g of sodium-tert-butoxide, and 1.02 g of bis(tri-tert-butylphosphine)palladium(0) were put into 100 ml of toluene under nitrogen atmosphere, the resulting mixture was stirred for 3 hours. After the completion of the reaction, the resulting product was extracted, and then column-purified with ethyl acetate:hexane, and then 12 g of Intermediate I7 was obtained. (Yield 68%).

MS[M+H]+=438

2) Synthesis of Compound 4

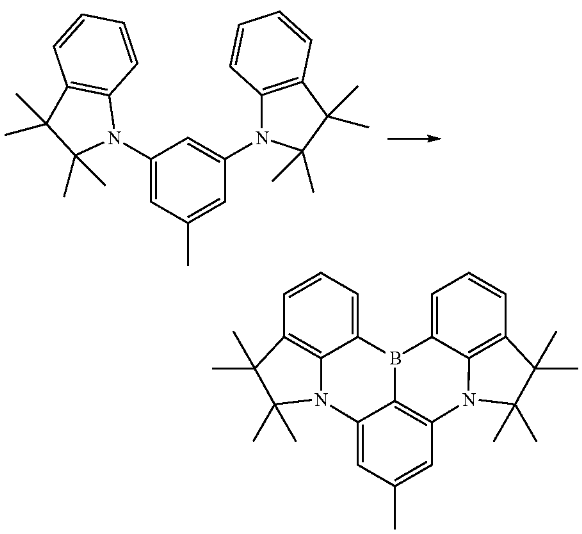

4

Under nitrogen atmosphere, 4 g of Intermediate I7, 8.9 g of boron triiodide, and 2.4 g of triphenylborane were stirred using dichlorobenzene at 160° C. for 4 hours. The reaction was completed, and the resulting product was extracted at room temperature, and then column-purified with ethyl acetate:hexane, and then recrystallized to obtain 3.1 g of Compound 4 (yield 76%).

MS[M+H]+=447

Synthesis Example 5. Synthesis of Compound 5

1) Synthesis of Intermediate I8

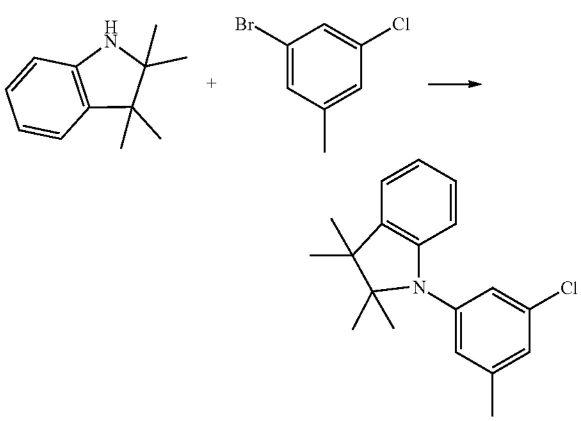

I8

After 10.0 g of 2,2,3,3-tetramethylindolin, 11.72 g of 1-bromo-3-chloro-5-methylbenzene, 24.2 g of sodium-tert-butoxide, and 0.87 g of bis(tri-tert-butylphosphine)palladium(0) were put into 100 ml of toluene under nitrogen atmosphere, the resulting mixture was stirred for 5 hours. After the completion of the reaction, the resulting product was extracted, and then purified with an ethyl acetate:hexane column to obtain 12 g of Intermediate I8 (yield 70%).

MS[M+H]+=300

2) Synthesis of Intermediate I9

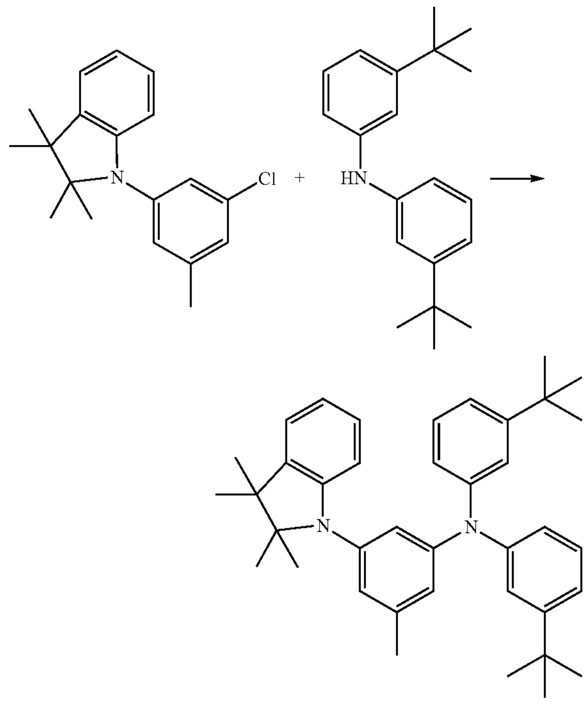

I9

After 10.65 g of Intermediate I8, 10.00 g of bis(3-(tert-butyl)phenyl)amine, 22.63 g of sodium-tert-butoxide, and 0.54 g of bis(tri-tert-butylphosphine)-palladium(0) were put into 150 ml of toluene under nitrogen atmosphere, the resulting mixture was stirred for 6 hours. After the completion of the reaction, the resulting product was extracted, and then purified with an ethyl acetate:hexane column to obtain 14 g of Intermediate I9 (yield 72%).

MS[M+H]+=545

3) Synthesis of Compound 5

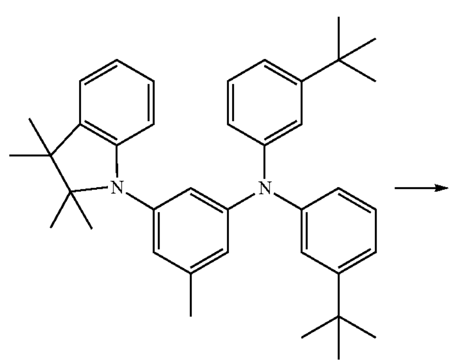

I9

-continued

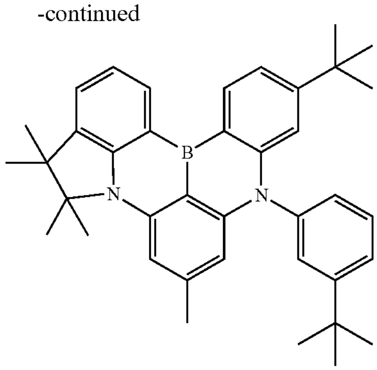

5

Under nitrogen atmosphere, 4.00 g of Intermediate I9, 7.18 g of boron triiodide, and 1.95 g of triphenylborane were stirred using dichlorobenzene at 160° C. for 4 hours. The reaction was completed, and the resulting product was extracted at room temperature, and then column-purified with ethyl acetate:hexane, and then recrystallized to obtain 3.0 g of Compound 5 (yield 74%).

MS[M+H]+=553

Synthesis Example 6. Synthesis of Compound 6

1) Synthesis of Intermediate I10

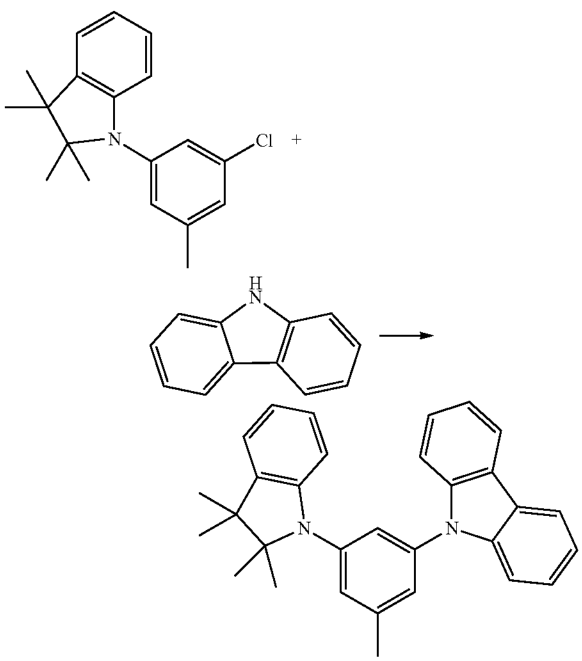

I10

After 17.93 g of Intermediate I8, 10.00 g of 9H-carbazole, 38.08 g of sodium-tert-butoxide, and 0.92 g of bis(tri-tert-butylphosphine)palladium(0) were put into 200 ml of toluene under nitrogen atmosphere, the resulting mixture was stirred for 8 hours. After the completion of the reaction, the resulting product was extracted, and then purified with an ethyl acetate:hexane column to obtain 17 g of Intermediate I10 (yield 66%).

MS[M+H]+=431

2) Synthesis of Compound 6

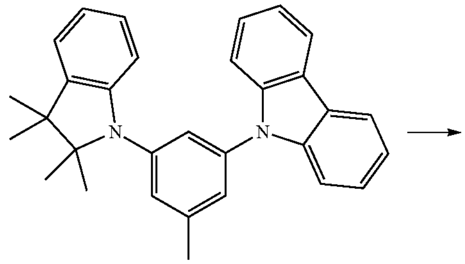

I10

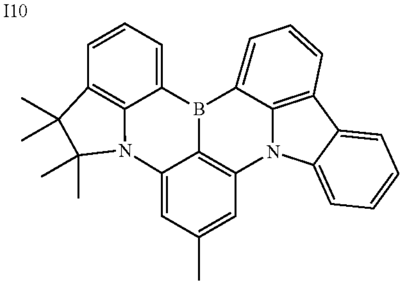

6

Under nitrogen atmosphere, 3.00 g of Intermediate I10, 6.82 g of boron triiodide, and 1.86 g of triphenylborane were stirred using dichlorobenzene at 160° C. for 5 hours. The reaction was completed, and the resulting product was extracted at room temperature, and then column-purified with ethyl acetate:hexane, and then recrystallized to obtain 2.3 g of Compound 6 (yield 75%).

MS[M+H]+=553

Synthesis Example 7. Synthesis of Compound 7

1) Synthesis of Intermediate I11

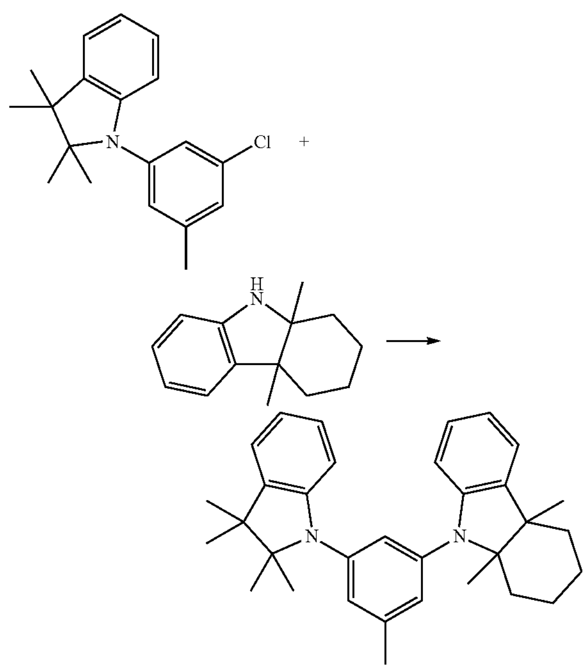

I11

After 14.89 g of Intermediate I8, 10 g of 4a,9a-dimethyl-2,3,4,4a,9,9a-hexahydro-1H-carbazole, 31.63 g of sodium-tert-butoxide, and 0.76 g of bis(tri-tert-butylphosphine)palladium(0) were put into 150 ml of toluene under nitrogen atmosphere, the resulting mixture was stirred for 6 hours. After the completion of the reaction, the resulting product was extracted, and then purified with an ethyl acetate:hexane column to obtain 16 g of Intermediate I11 (yield 69%).

MS[M+H]+=465

2) Synthesis of Compound 7

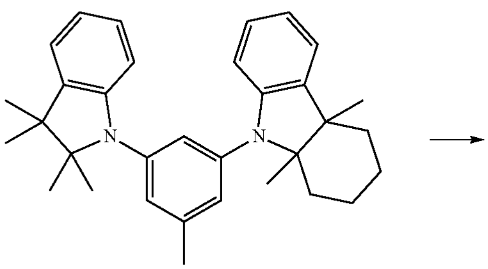

I11

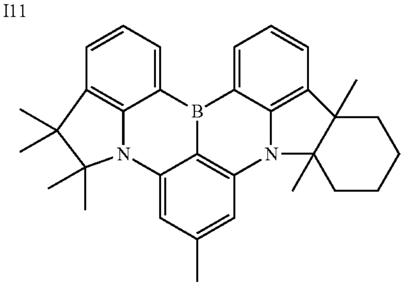

7

Under nitrogen atmosphere, 3.00 g of Intermediate I11, 6.31 g of boron triiodide, and 1.72 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 2.5 g of Compound 7 (yield 82%).

MS[M+H]+=472

Synthesis Example 8. Synthesis of Compound 8

1) Synthesis of Intermediate I12

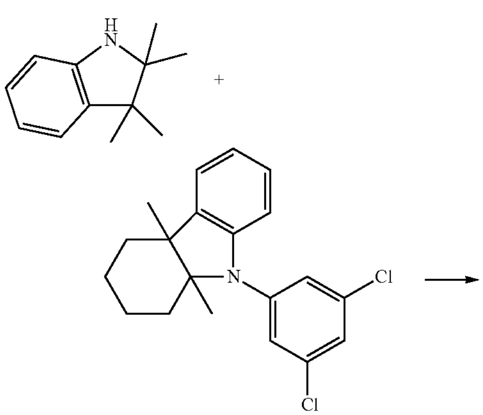

-continued

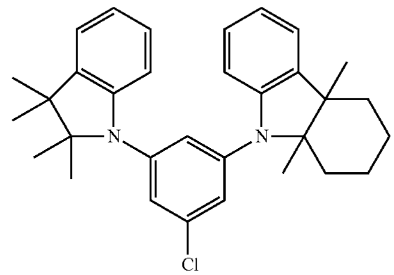

I12

After 10 g of Intermediate I4, 5.06 g of 2,2,3,3-tetramethylindolin, 12.26 g of sodium-tert-butoxide, and 0.44 g of bis(tri-tert-butylphosphine)palladium(0) were put into 110 ml of toluene under nitrogen atmosphere, the resulting mixture was stirred for 4 hours. After the completion of the reaction, the resulting product was extracted, and then purified with an ethyl acetate:hexane column to obtain 11 g of Intermediate I12 (yield 79%).

MS[M+H]+=486

2) Synthesis of Intermediate I13

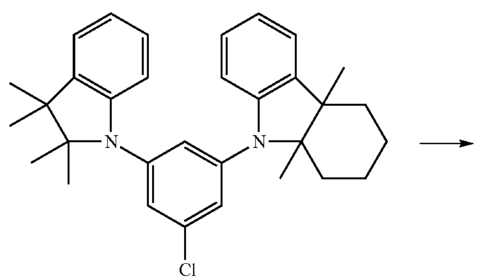

I12

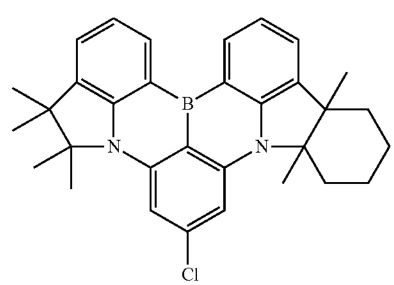

I13

Under nitrogen atmosphere, 5.00 g of Intermediate I12, 10.07 g of boron triiodide, and 2.74 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 3 g of Intermediate I13 (yield 59%).

MS[M+H]+=493

3) Synthesis of Compound 8

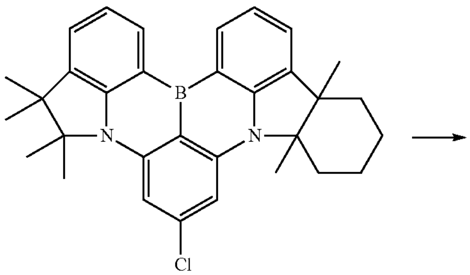

I13

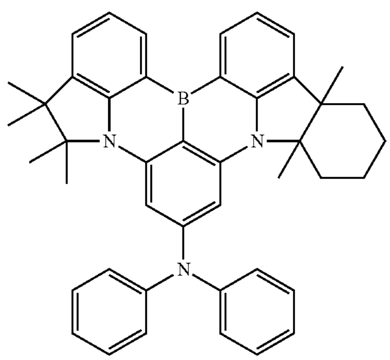

8

After 3 g of Intermediate I13, 1.02 g of diphenylamine, 3.87 g of sodium-tert-butoxide, and 0.09 g of bis(tri-tert-butylphosphine)palladium(0) were put into 40 ml of toluene under nitrogen atmosphere, the resulting mixture was stirred for 5 hours. After the completion of the reaction, the resulting product was extracted, and then purified with an ethyl acetate:hexane column, and then recrystallized to obtain 4 g of Compound 8 (yield 71%).

MS[M+H]+=626

Synthesis Example 9. Synthesis of Compound 9

1) Synthesis of Intermediate I14

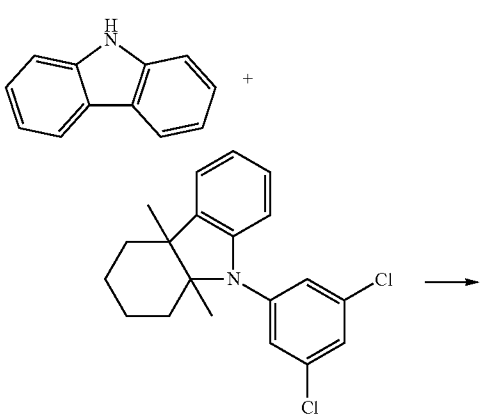

-continued

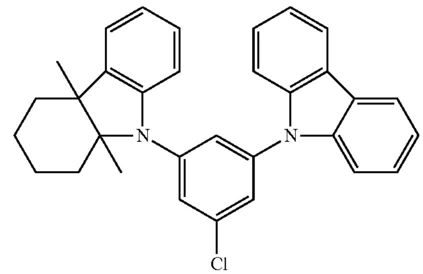

I14

After 10 g of Intermediate I4, 4.82 g of 9H-carbazole, 12.25 g of sodium-tert-butoxide, and 0.44 g of bis(tri-tert-butylphosphine)palladium(0) were put into 110 ml of toluene under nitrogen atmosphere, the resulting mixture was stirred for 8 hours. After the completion of the reaction, the resulting product was extracted, and then purified with an ethyl acetate:hexane column to obtain 9 g of Intermediate I14 (yield 65%).

MS[M+H]+=478

2) Synthesis of Intermediate I15

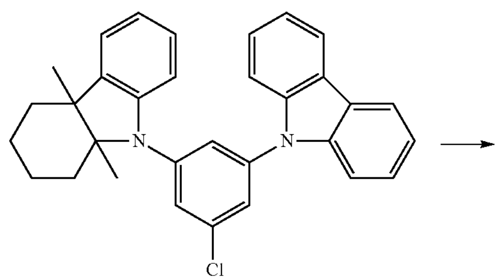

I14

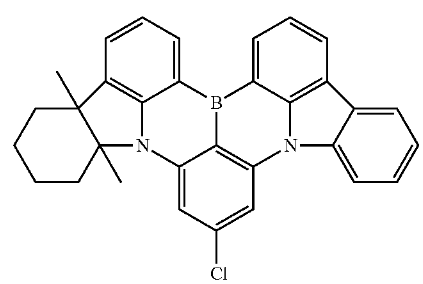

I15

Under nitrogen atmosphere, 5.00 g of Intermediate I14, 10.23 g of boron triiodide, and 2.78 g of triphenylborane were stirred using dichlorobenzene at 160° C. for 5 hours. The reaction was completed, and the resulting product was extracted at room temperature, and then column-purified with ethyl acetate:hexane, and then recrystallized to obtain 3.4 g of Intermediate I15 (yield 67%).

MS[M+H]+=485

3) Synthesis of Compound 9

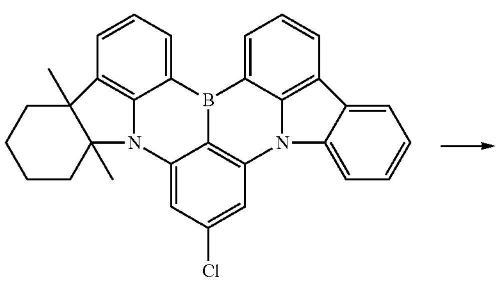

I15

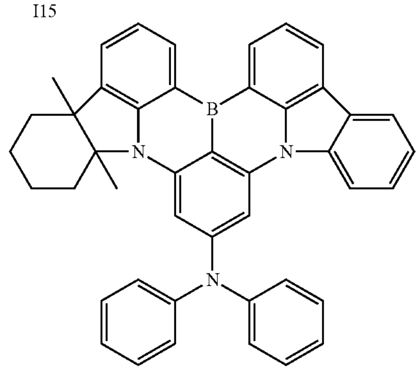

9

After 3 g of Intermediate I15, 1.03 g of diphenylamine, 3.87 g of sodium-tert-butoxide, and 0.09 g of bis(tri-tert-butylphosphine)palladium(0) were put into 40 ml of toluene under nitrogen atmosphere, the resulting mixture was stirred for 7 hours. After the completion of the reaction, the resulting product was extracted, and then purified with an ethyl acetate:hexane column, and then recrystallized to obtain 2.3 g of Compound 9 (yield 61%).

MS[M+H]+=618

Synthesis Example 10. Synthesis of Compound 10

1) Synthesis of Intermediate I16

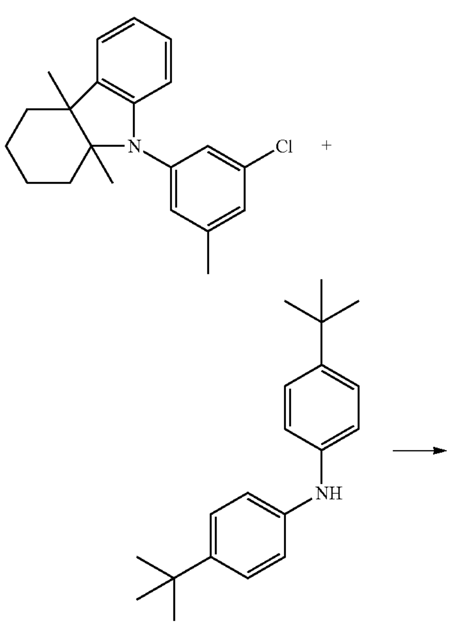

-continued

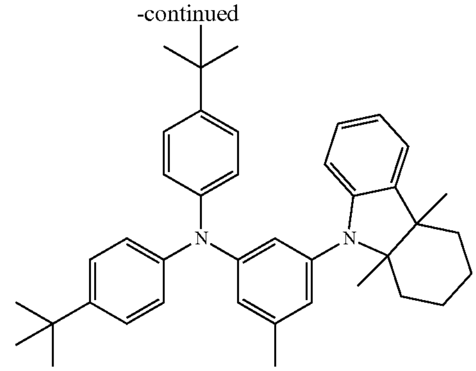

I16

After 6.9 g of Intermediate I2, 8 g of bis(4-(tert-butyl)phenyl)amine, 15.6 g of sodium-tert-butoxide, and 0.1 g of bis(tri-tert-butylphosphine)palladium(0) were put into 150 ml of toluene under nitrogen atmosphere, the resulting mixture was stirred for 6 hours. After the completion of the reaction, the resulting product was extracted, and then purified with an ethyl acetate:hexane column to obtain 11 g of Intermediate I16 (yield 78.1%).

MS[M+H]+=571

2) Synthesis of Compound 10

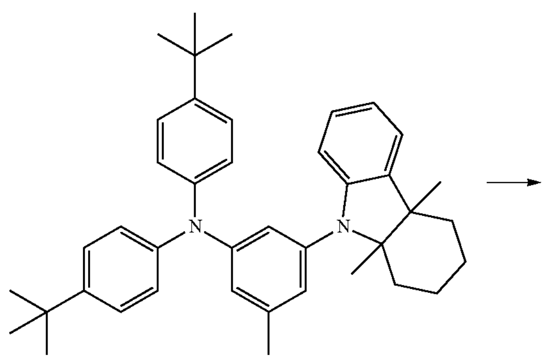

I16

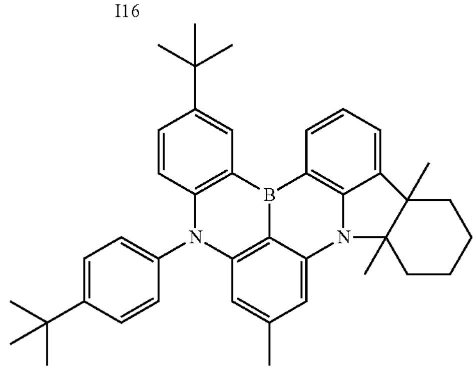

10

Under nitrogen atmosphere, 3.00 g of Intermediate I16, 5.1 g of boron triiodide, and 1.35 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 2 g of Compound 10 (yield 66.0%).

MS[M+H]+=579

Synthesis Example 11. Synthesis of Compound 11

1) Synthesis of Intermediate I17

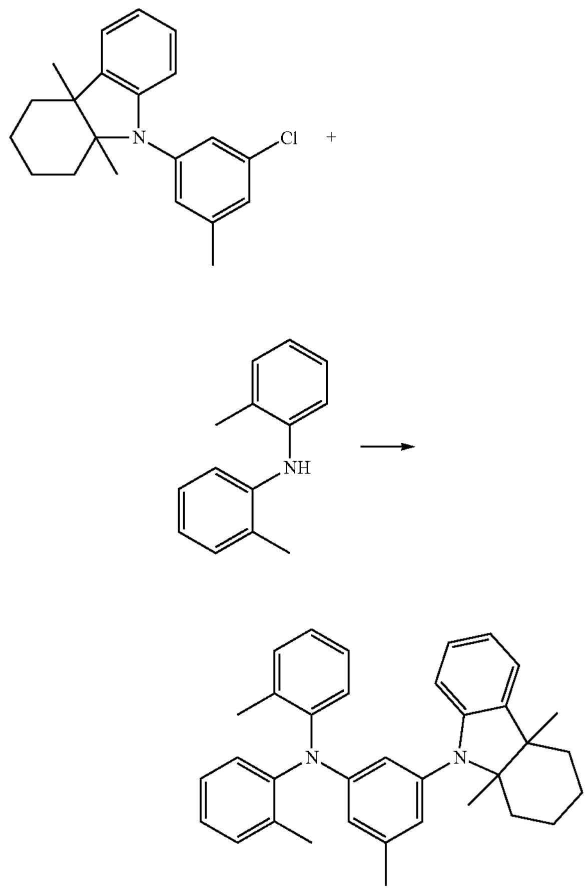

I17

After 6 g of Intermediate I2, 4 g of di-o-tolylamine, 5.31 g of sodium-tert-butoxide, and 0.1 g of bis(tri-tert-butylphosphine)palladium(0) were put into 150 ml of toluene under nitrogen atmosphere, the resulting mixture was stirred for 6 hours. After the completion of the reaction, the resulting product was extracted, and then purified with an ethyl acetate:hexane column to obtain 6 g of Intermediate I17 (yield 67%).

MS[M+H]+=487

2) Synthesis of Compound 11

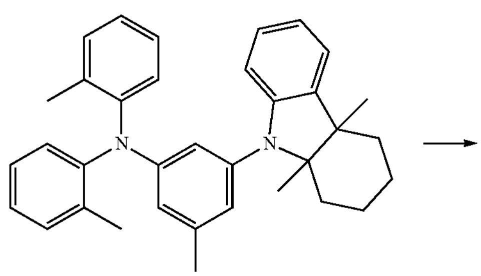

I17

-continued

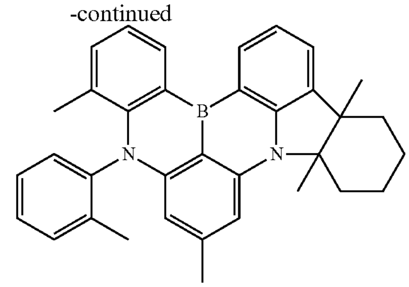

11

Under nitrogen atmosphere, 3.00 g of Intermediate I17, 6.02 g of boron triiodide, and 1.64 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.8 g of Compound 11 (yield 59.0%).

MS[M+H]+=495

Synthesis Example 12. Synthesis of Compound 12

1) Synthesis of Intermediate I18

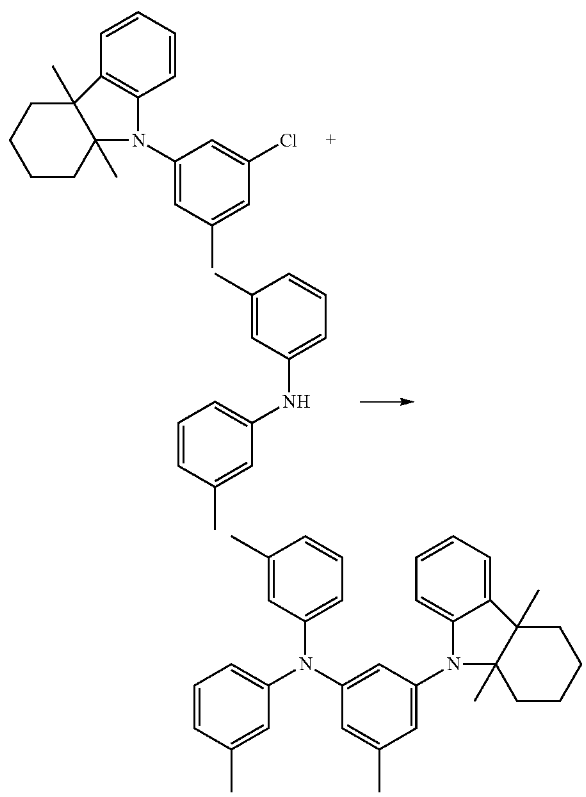

I18

After 6 g of Intermediate I2, 4 g of di-m-tolylamine, 5.31 g of sodium-tert-butoxide, and 0.1 g of bis(tri-tert-butylphosphine)palladium(0) were put into 150 ml of toluene under nitrogen atmosphere, the resulting mixture was stirred for 6 hours. After the completion of the reaction, the resulting product was extracted, and then purified with an ethyl acetate:hexane column to obtain 5.5 g of Intermediate I18 (yield 61%).

MS[M+H]+=487

2) Synthesis of Compound 12

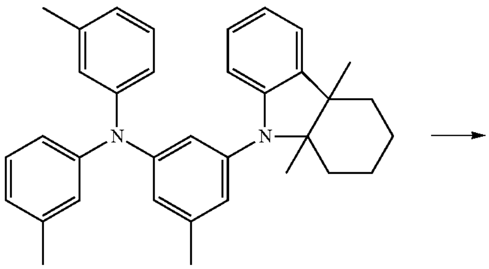

I18

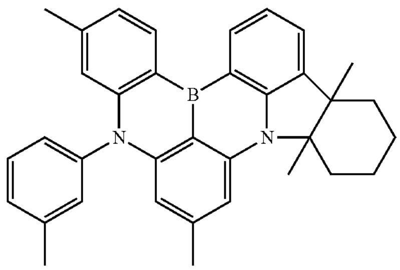

12

Under nitrogen atmosphere, 3.00 g of Intermediate I18, 6.02 g of boron triiodide, and 1.64 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.5 g of Compound 12 (yield 49.0%).

MS[M+H]+=495

Synthesis Example 13. Synthesis of Compound 13

1) Synthesis of Intermediate I19

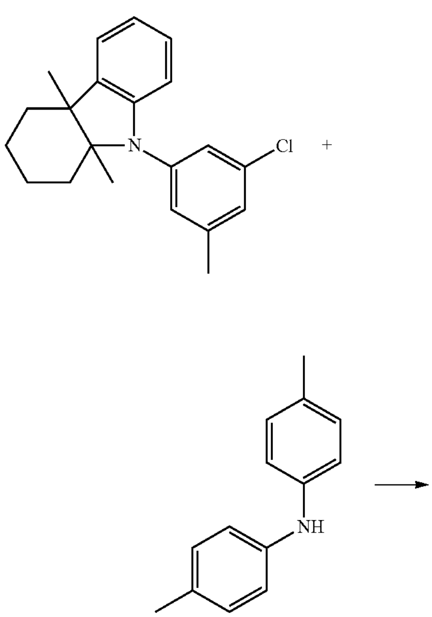

-continued

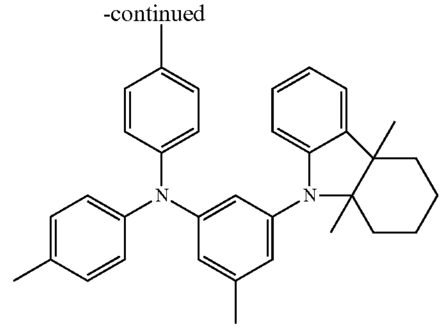

I19

After 6 g of Intermediate I2, 4 g of di-p-tolylamine, 5.31 g of sodium-tert-butoxide, and 0.1 g of bis(tri-tert-butylphosphine)palladium(0) were put into 150 ml of toluene under nitrogen atmosphere, the resulting mixture was stirred for 6 hours. After the completion of the reaction, the resulting product was extracted, and then purified with an ethyl acetate:hexane column to obtain 5.8 g of Intermediate I19 (yield 65%).

MS[M+H]+=487

2) Synthesis of Compound 13

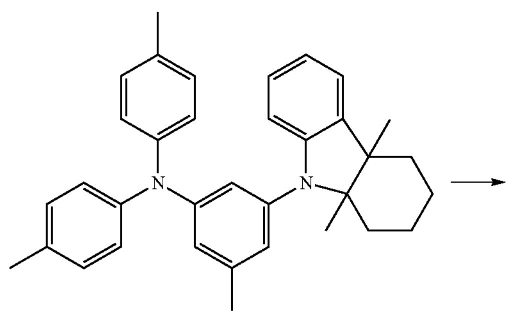

I19

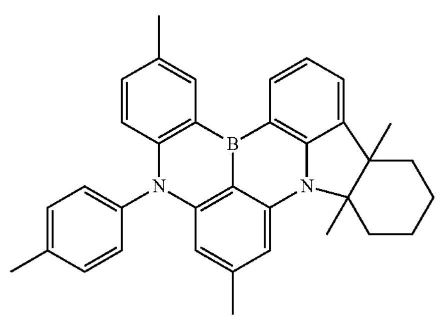

13

Under nitrogen atmosphere, 3.00 g of Intermediate I19, 6.02 g of boron triiodide, and 1.64 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.8 g of Compound 13 (yield 59.0%).

MS[M+H]+=495

Synthesis Example 14. Synthesis of Compound 14

1) Synthesis of Intermediate I20

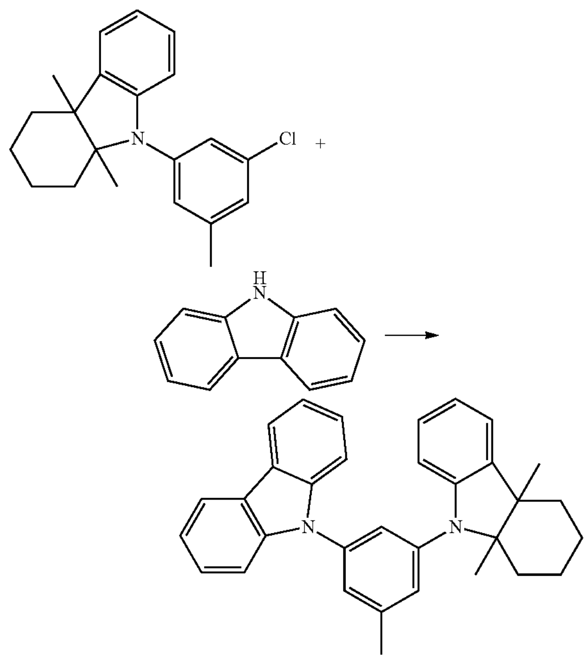

I20

After 6 g of Intermediate I2, 3.38 g of 9H-carbazole, 5.31 g of sodium-tert-butoxide, and 0.1 g of bis(tri-tert-butylphosphine)palladium(0) were put into 150 ml of toluene under nitrogen atmosphere, the resulting mixture was stirred for 10 hours. After the completion of the reaction, the resulting product was extracted, and then purified with an ethyl acetate:hexane column to obtain 5.1 g of Intermediate I20 (yield 61%).

MS[M+H]+=457

2) Synthesis of Compound 14

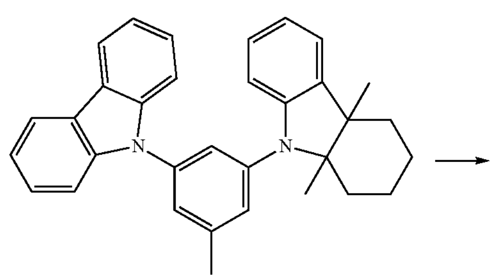

I20

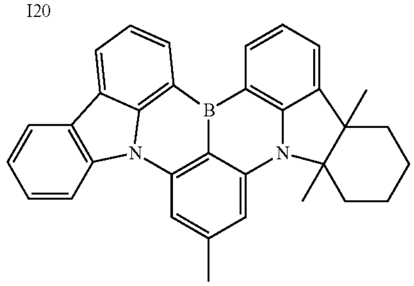

14

Under nitrogen atmosphere, 3.00 g of Intermediate I20, 6.42 g of boron triiodide, and 1.74 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.9 g of Compound 14 (yield 62.0%).

MS[M+H]+=465

Synthesis Example 15. Synthesis of Compound 15

1) Synthesis of Intermediate I21

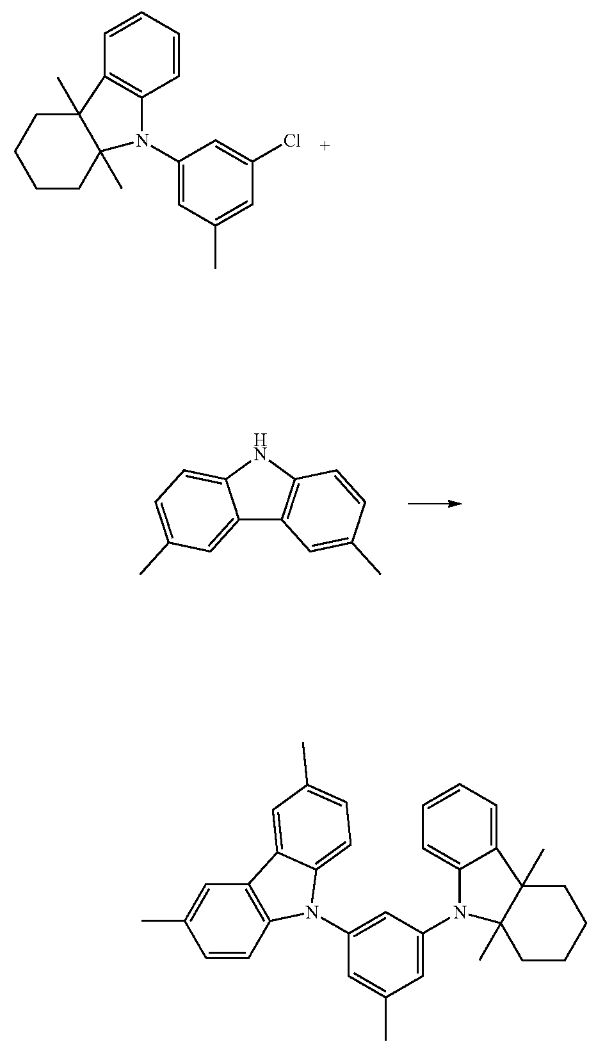

I21

After 6 g of Intermediate I2, 3.95 g of 3,6-dimethyl-9H-carbazole, 5.31 g of sodium-tert-butoxide, and 0.1 g of bis(tri-tert-butylphosphine)palladium(0) were put into 150 ml of toluene under nitrogen atmosphere, the resulting mixture was stirred for 10 hours. After the completion of the reaction, the resulting product was extracted, and then purified with an ethyl acetate:hexane column to obtain 5.5 g of Intermediate I21 (yield 62%).

MS[M+H]+=485

2) Synthesis of Compound 15

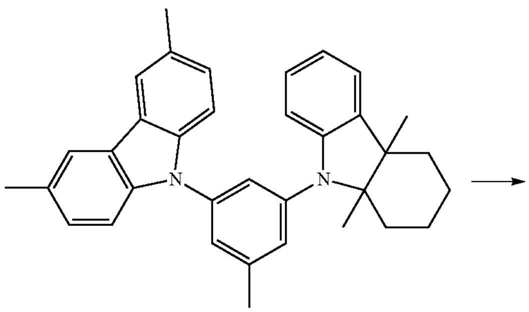

I21

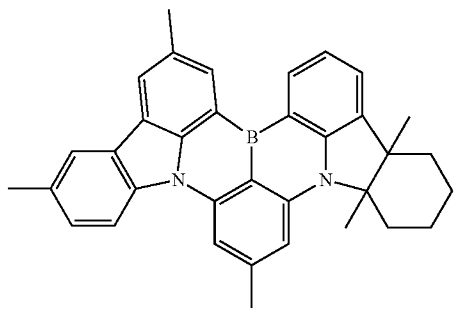

15

Under nitrogen atmosphere, 3.00 g of Intermediate I21, 6.42 g of boron triiodide, and 1.74 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.4 g of Compound 15 (yield 46.0%).

MS[M+H]+=465

Synthesis Example 16. Synthesis of Compound 16

1) Synthesis of Intermediate I22

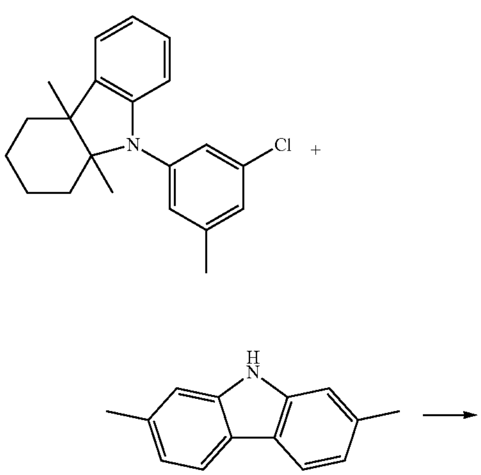

-continued

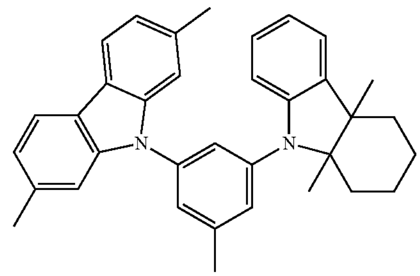

I22

After 6 g of Intermediate I2, 3.95 g of 2.7-dimethyl-9H-carbazole, 5.31 g of sodium-tert-butoxide, and 0.1 g of bis(tri-tert-butylphosphine)palladium(0) were put into 150 ml of toluene under nitrogen atmosphere, the resulting mixture was stirred for 10 hours. After the completion of the reaction, the resulting product was extracted, and then purified with an ethyl acetate:hexane column to obtain 5.4 g of Intermediate I22 (yield 61%).

MS[M+H]+=485

2) Synthesis of Compound 16

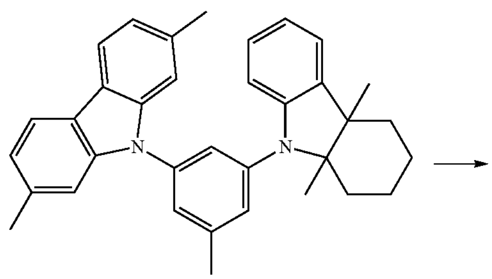

I22

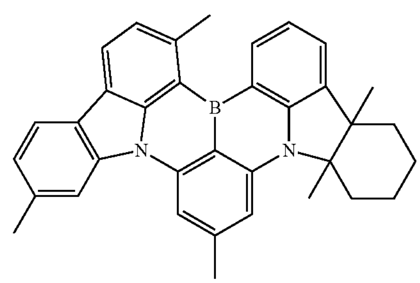

16

Under nitrogen atmosphere, 3.00 g of Intermediate I22, 6.42 g of boron triiodide, and 1.74 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.5 g of Compound 16 (yield 49.0%).

MS[M+H]+=465

Synthesis Example 17. Synthesis of Compound 17

1) Synthesis of Intermediate I23

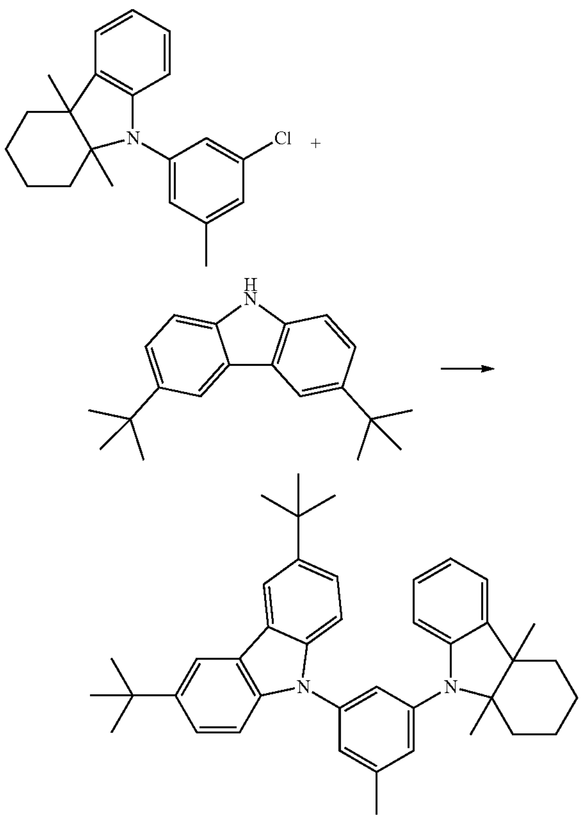

I23

After 6 g of Intermediate I2, 5.66 g of 3,6-di-tert-butyl-9H-carbazole, 5.31 g of sodium-tert-butoxide, and 0.1 g of bis(tri-tert-butylphosphine)palladium(0) were put into 150 ml of toluene under nitrogen atmosphere, the resulting mixture was stirred for 10 hours. After the completion of the reaction, the resulting product was extracted, and then purified with an ethyl acetate:hexane column to obtain 5.5 g of Intermediate I23 (yield 53%).

MS[M+H]+=569

2) Synthesis of Compound 17

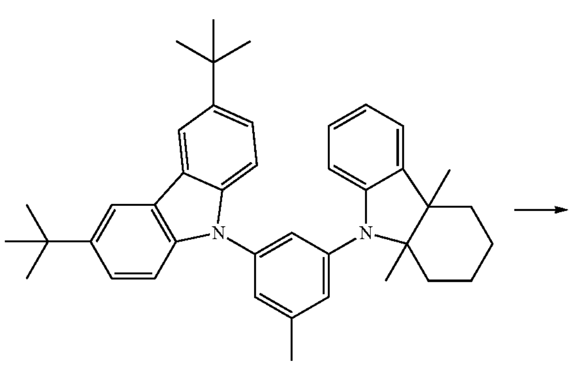

I23

-continued

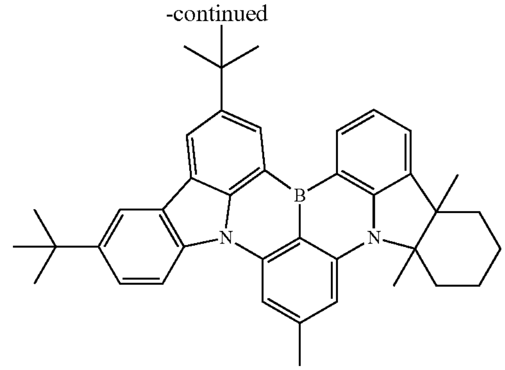

17

Under nitrogen atmosphere, 3.00 g of Intermediate I23, 6.42 g of boron triiodide, and 1.74 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.5 g of Compound 17 (yield 49.0%).

MS[M+H]+=465

Synthesis Example 18. Synthesis of Compound 18

1) Synthesis of Intermediate I24

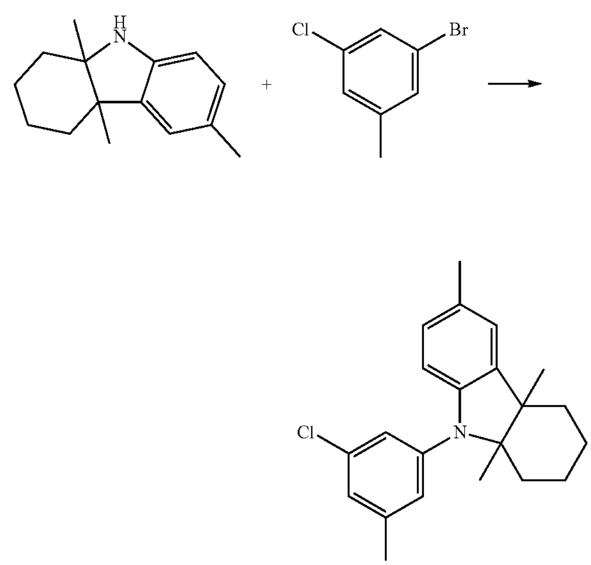

I24 j

After 50 g of 4a,6,9a-trimethyl-2,3,4,4a,9,9a-hexahydro-1H-carbazole, 52.48 g of 1-bromo-3-chloro-5-methyl-benzene, 66.94 g of sodium-tert-butoxide, and 1.19 g of bis(tri-tert-butylphosphine)palladium(0) were put into 600 ml of toluene under nitrogen atmosphere, the resulting mixture was stirred for 3 hours. After the completion of the reaction, the resulting product was extracted, and then purified with an ethyl acetate:hexane column to obtain 60 g of Intermediate I24 (yield 76%).

MS[M+H]+=341

2) Synthesis of Intermediate I25

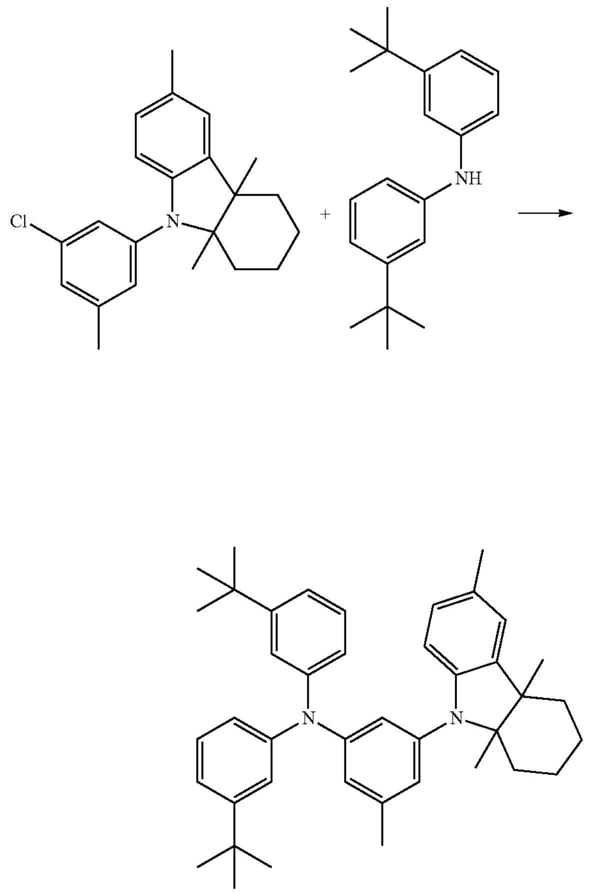

I25

After 6 g of Intermediate I24, 5.46 g of bis(3-(tert-butyl)phenyl)amine, 5.08 g of sodium-tert-butoxide, and 0.1 g of bis(tri-tert-butylphosphine)palladium(0) were put into 100 ml of toluene under nitrogen atmosphere, the resulting mixture was stirred for 6 hours. After the completion of the reaction, the resulting product was extracted, and then purified with an ethyl acetate:hexane column to obtain 6.0 g of Intermediate I25 (yield 58%).

MS[M+H]+=585

3) Synthesis of Compound 18

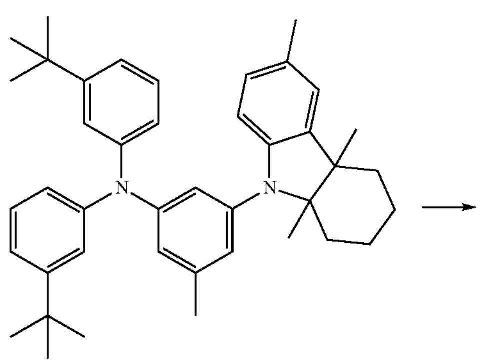

I25

-continued

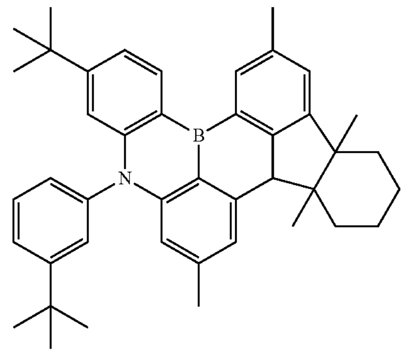

18

Under nitrogen atmosphere, 3.00 g of Intermediate I25, 6.02 g of boron triiodide, and 1.74 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.9 g of Compound 18 (yield 63.0%).

MS[M+H]+=593

Synthesis Example 19. Synthesis of Compound 19

1) Synthesis of Intermediate I26

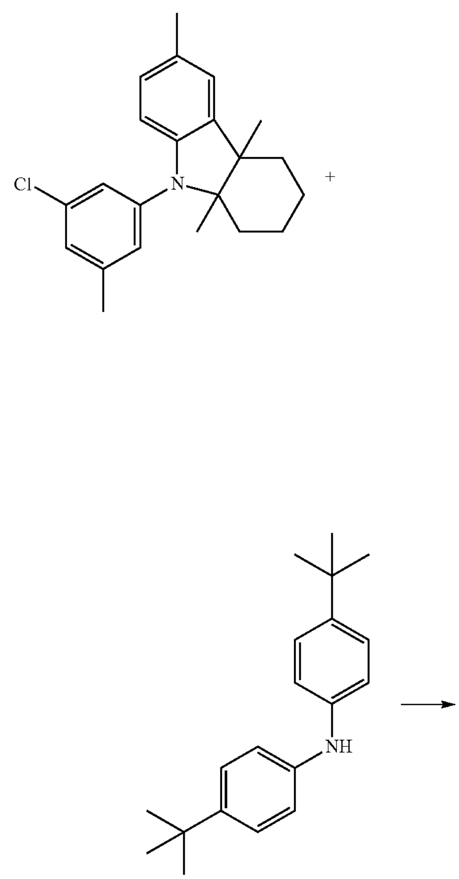

-continued

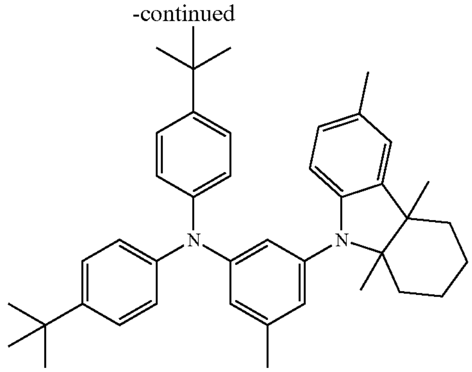

I26

After 6 g of Intermediate I24, 5.46 g of bis(4-(tert-butyl) phenyl)amine, 5.08 g of sodium-tert-butoxide, and 0.1 g of bis(tri-tert-butylphosphine)palladium(0) were put into 100 ml of toluene under nitrogen atmosphere, the resulting mixture was stirred for 6 hours. After the completion of the reaction, the resulting product was extracted, and then purified with an ethyl acetate:hexane column to obtain 6.1 g of Intermediate I26 (yield 59%).

MS[M+H]+=585

2) Synthesis of Compound 19

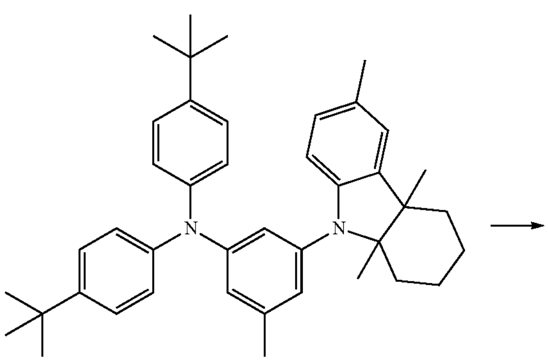

I26

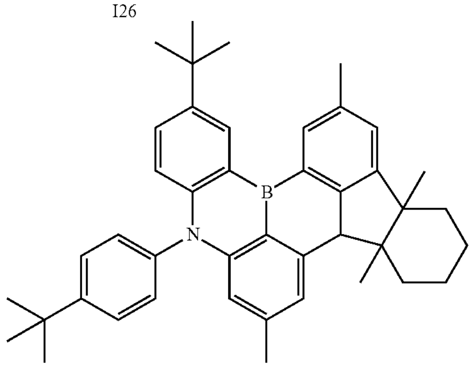

19

Under nitrogen atmosphere, 3.00 g of Intermediate I26, 6.02 g of boron triiodide, and 1.74 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.8 g of Compound 19 (yield 59.0%).

MS[M+H]+=593

Synthesis Example 20. Synthesis of Compound 20

1) Synthesis of Intermediate I27

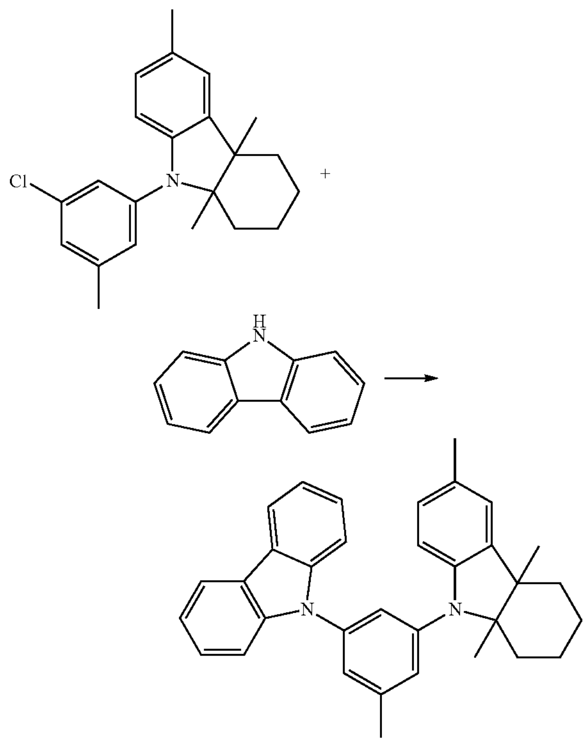

I27

After 6 g of Intermediate I24, 3.24 g of 9H-carbazole, 5.08 g of sodium-tert-butoxide, and 0.1 g of bis(tri-tert-butylphosphine)palladium(0) were put into 120 ml of toluene under nitrogen atmosphere, the resulting mixture was stirred for 10 hours. After the completion of the reaction, the resulting product was extracted, and then purified with an ethyl acetate:hexane column to obtain 5.9 g of Intermediate I27 (yield 71%).

MS[M+H]+=471

2) Synthesis of Compound 20

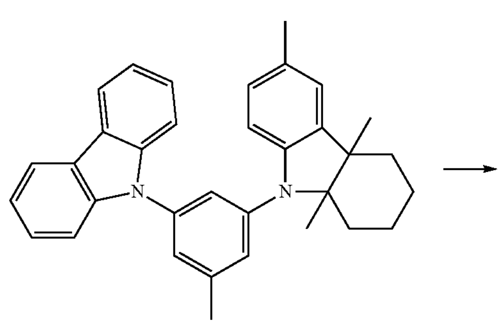

I27

-continued

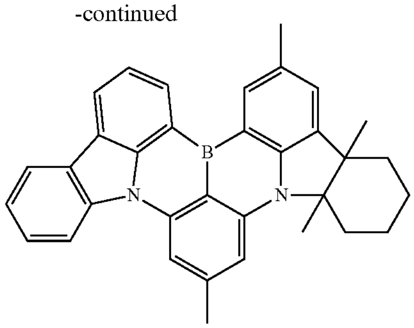

20

Under nitrogen atmosphere, 3.00 g of Intermediate I27, 7.48 g of boron triiodide, and 1.74 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.4 g of Compound 20 (yield 46.0%).

MS[M+H]+=479

Synthesis Example 21. Synthesis of Compound 21

1) Synthesis of Intermediate I28

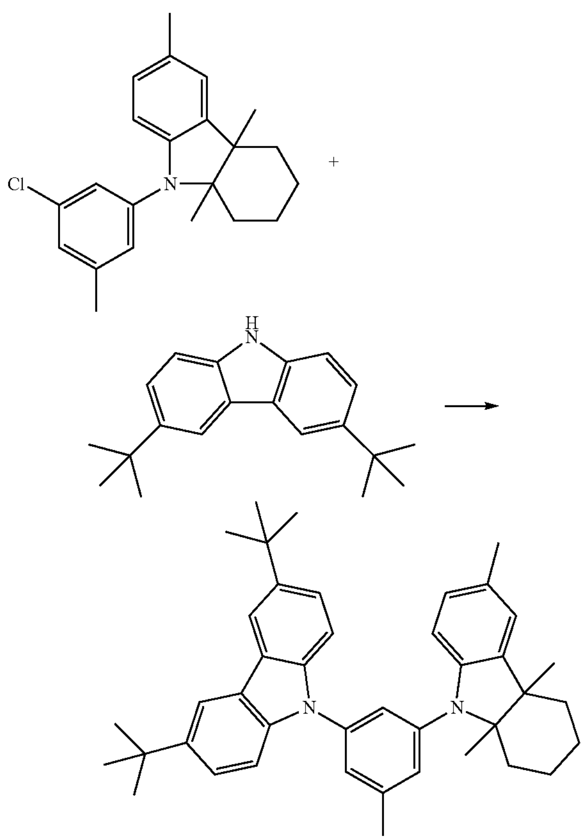

I28

After 6 g of Intermediate I24, 5.42 g of 3,6-di-tert-butyl-9H-carbazole, 5.08 g of sodium-tert-butoxide, and 0.1 g of bis(tri-tert-butylphosphine)palladium(0) were put into 120 ml of toluene under nitrogen atmosphere, the resulting mixture was stirred for 10 hours. After the completion of the reaction, the resulting product was extracted, and then purified with an ethyl acetate:hexane column to obtain 5.6 g of Intermediate I28 (yield 54%).

MS[M+H]+=583

2) Synthesis of Compound 21

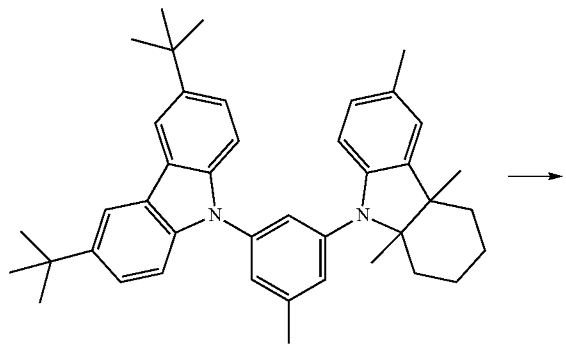

I28

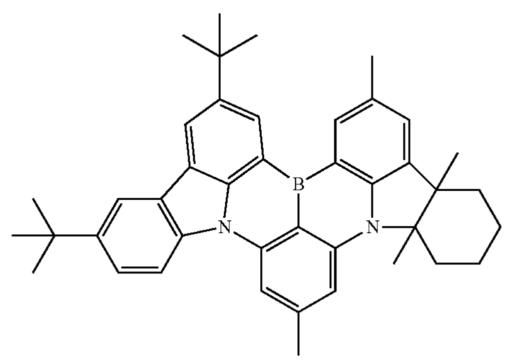

21

Under nitrogen atmosphere, 3.00 g of Intermediate I28, 6.04 g of boron triiodide, and 1.37 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.3 g of Compound 21 (yield 43.0%).

MS[M+H]+=591

Synthesis Example 22. Synthesis of Compound 22

1) Synthesis of Intermediate I29

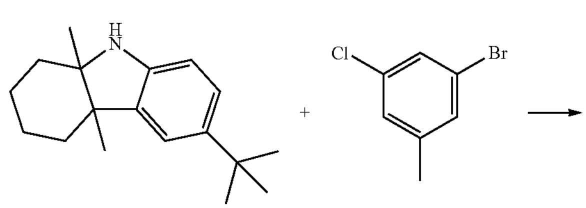

-continued

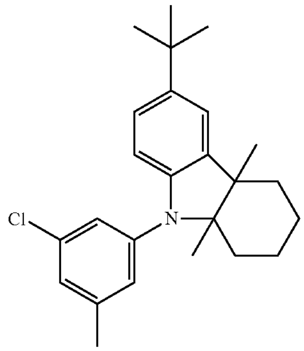

I29

After 50 g of 6-(tert-butyl)-4a,9a-dimethyl-2,3,4,4a,9,9a-hexahydro-1H-carbazole, 59.70 g of 1-bromo-3-chloro-5-methylbenzene, 55.99 g of sodium-tert-butoxide, and 1.00 g of bis(tri-tert-butylphosphine)palladium(0) were put into 600 ml of toluene under nitrogen atmosphere, the resulting mixture was stirred for 3 hours. After the completion of the reaction, the resulting product was extracted, and then purified with an ethyl acetate:hexane column to obtain 58 g of Intermediate I29 (yield 78%).

MS[M+H]+=382

2) Synthesis of Intermediate I30

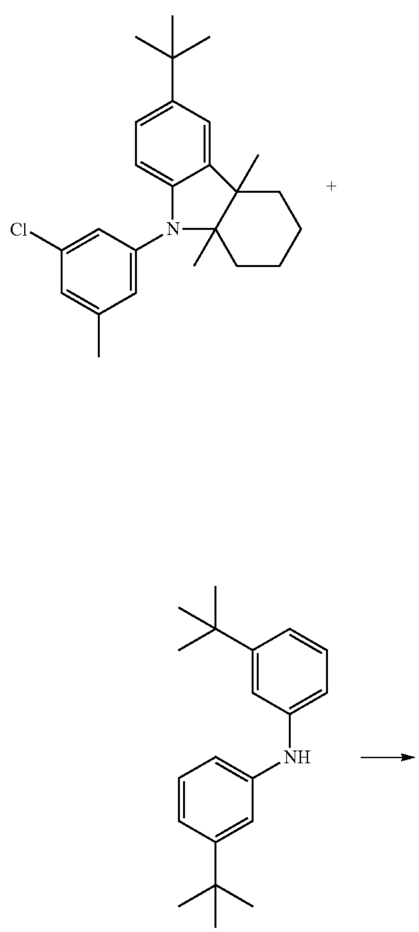

-continued

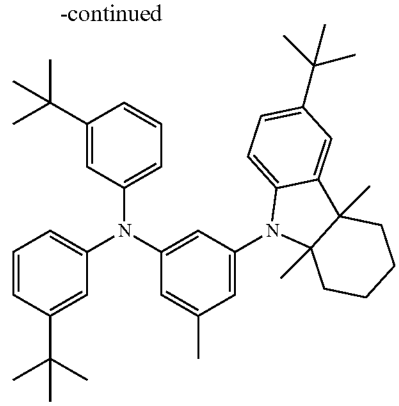

I30

After 6 g of Intermediate I29, 4.86 g of bis(3-(tert-butyl) phenyl)amine, 4.53 g of sodium-tert-butoxide, and 0.1 g of bis(tri-tert-butylphosphine)palladium(0) were put into 100 ml of toluene under nitrogen atmosphere, the resulting mixture was stirred for 6 hours. After the completion of the reaction, the resulting product was extracted, and then purified with an ethyl acetate: hexane column to obtain 6.2 g of Intermediate I30 (yield 63%).

MS[M+H]+=627

3) Synthesis of Compound 22

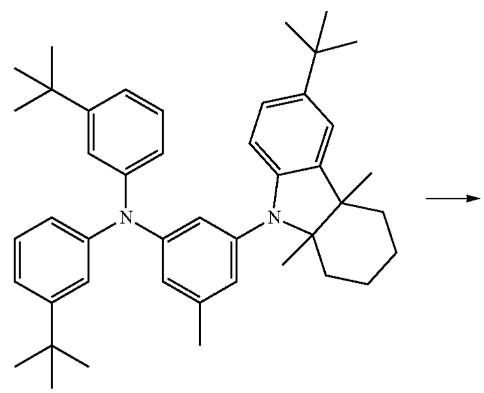

I30

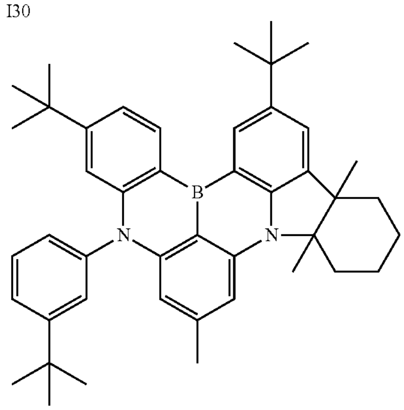

22

Under nitrogen atmosphere, 3.00 g of Intermediate I30, 5.6 g of boron triiodide, and 1.27 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.8 g of Compound 22 (yield 59.0%).

MS[M+H]+=635

Synthesis Example 23. Synthesis of Compound 23

1) Synthesis of Intermediate I31

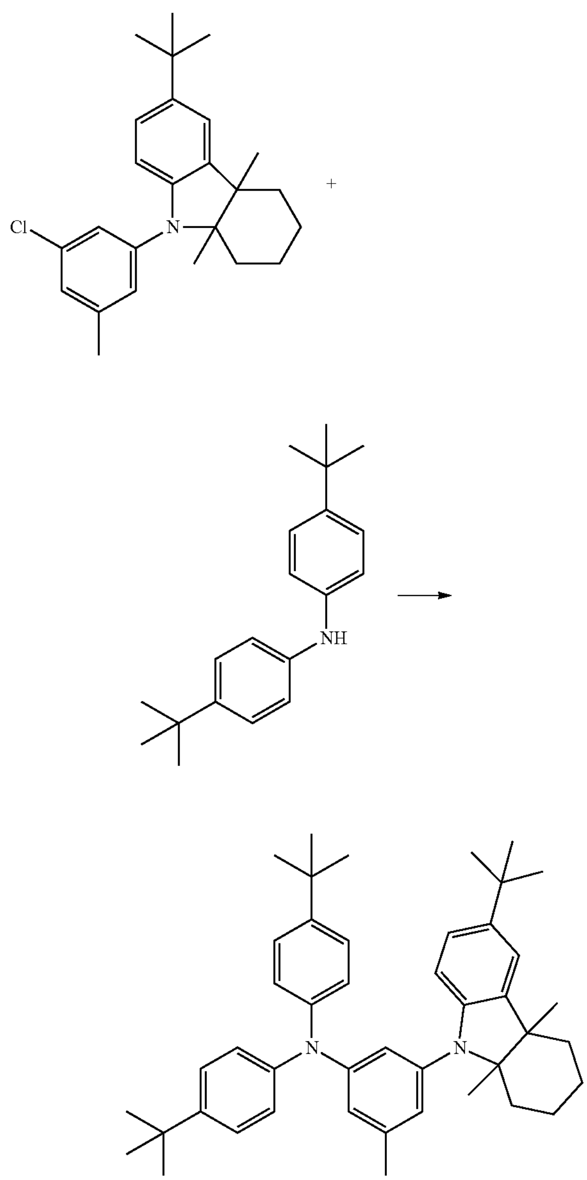

I31

After 6 g of Intermediate I29, 4.86 g of bis(4-(tert-butyl) phenyl)amine, 4.52 g of sodium-tert-butoxide, and 0.1 g of bis(tri-tert-butylphosphine)palladium(0) were put into 100 ml of toluene under nitrogen atmosphere, the resulting mixture was stirred for 10 hours. After the completion of the reaction, the resulting product was extracted, and then purified with an ethyl acetate:hexane column to obtain 6.3 g of Intermediate I31 (yield 64%).

MS[M+H]+=627

2) Synthesis of Compound 23

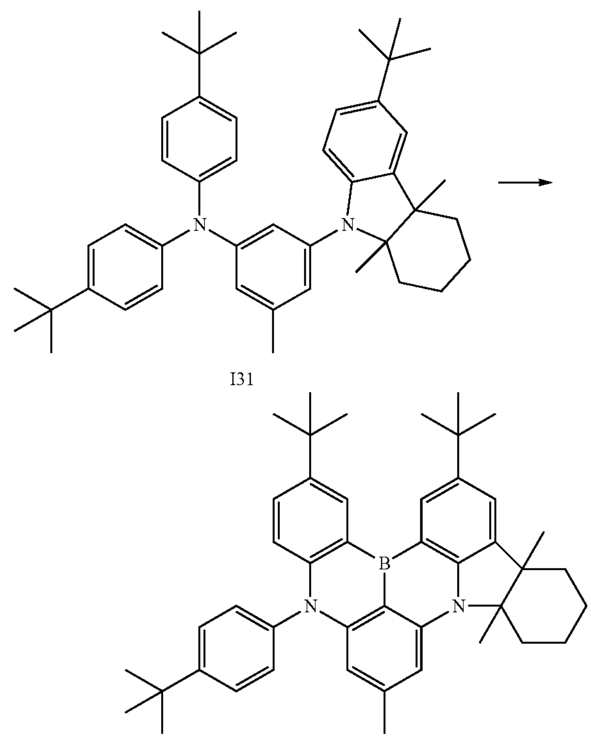

I31

23

Under nitrogen atmosphere, 3.00 g of Intermediate I31, 5.62 g of boron triiodide, and 1.27 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.9 g of Compound 23 (yield 63.0%).

MS[M+H]+=635

Synthesis Example 24. Synthesis of Compound 24

1) Synthesis of Intermediate I32

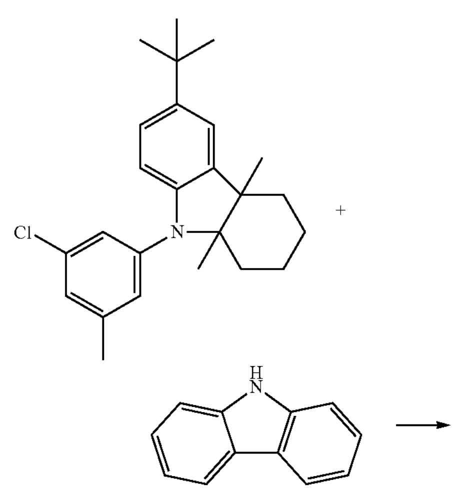

-continued

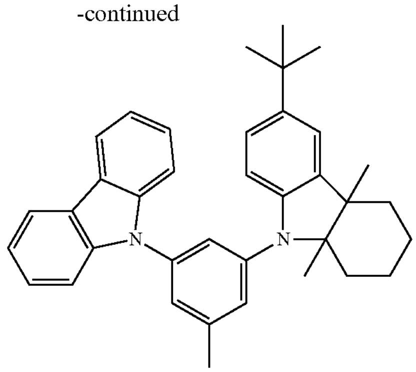

I32

After 6 g of Intermediate I29, 2.89 g of 9H-carbazole, 4.53 g of sodium-tert-butoxide, and 0.1 g of bis(tri-tert-butylphosphine)palladium(0) were put into 120 ml of toluene under nitrogen atmosphere, the resulting mixture was stirred for 10 hours. After the completion of the reaction, the resulting product was extracted, and then purified with an ethyl acetate:hexane column to obtain 5.5 g of Intermediate I32 (yield 68%).

MS[M+H]+=513

2) Synthesis of Compound 24

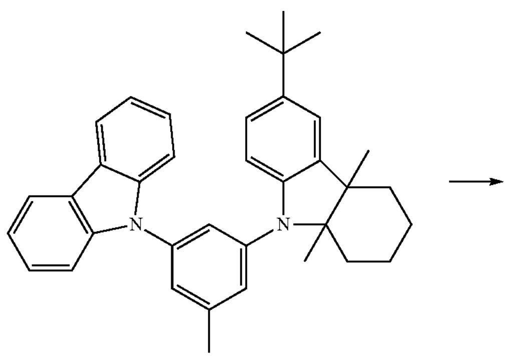

I32

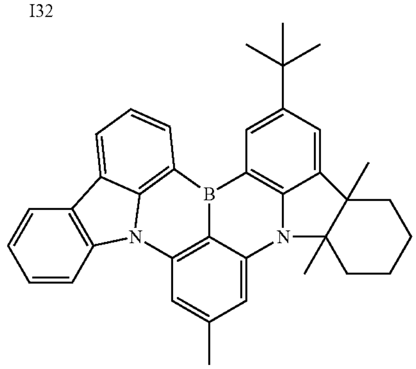

24

Under nitrogen atmosphere, 3.00 g of Intermediate I32, 6.86 g of boron triiodide, and 1.55 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.4 g of Compound 24 (yield 46.0%).

MS[M+H]+=521

Synthesis Example 25. Synthesis of Compound 25

1) Synthesis of Intermediate I33

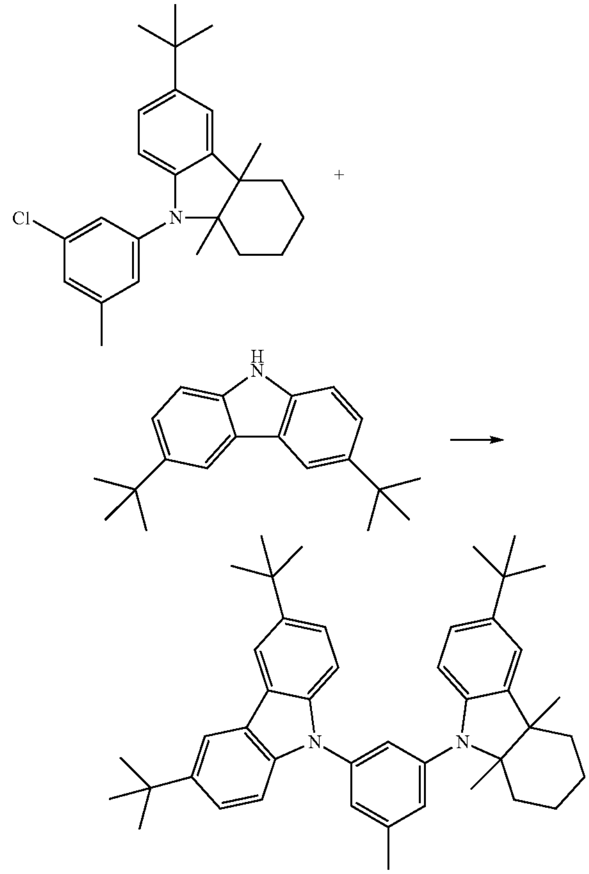

I33

After 6 g of Intermediate I29, 4.82 g of 3,6-di-methyl-9H-carbazole, 4.53 g of sodium-tert-butoxide, and 0.1 g of bis(tri-tert-butylphosphine)palladium(0) were put into 120 ml of toluene under nitrogen atmosphere, the resulting mixture was stirred for 10 hours. After the completion of the reaction, the resulting product was extracted, and then purified with an ethyl acetate:hexane column to obtain 6.6 g of Intermediate I33 (yield 67%).

MS[M+H]+=625

2) Synthesis of Compound 25

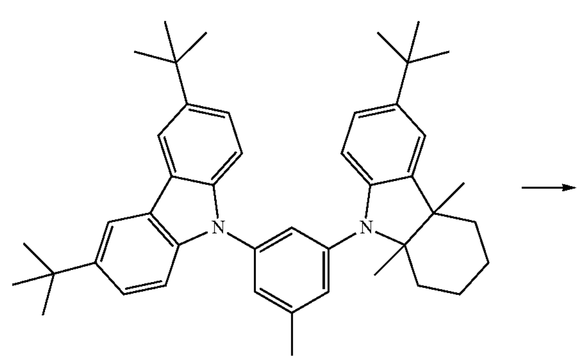

I33

-continued

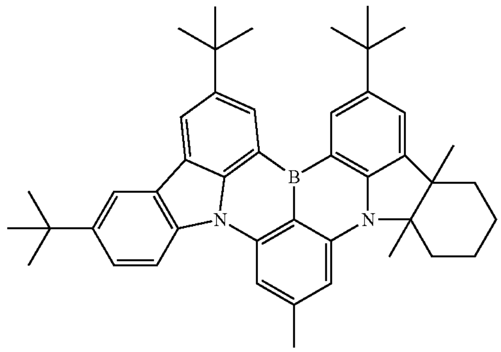

25

Under nitrogen atmosphere, 3.00 g of Intermediate I33, 5.63 g of boron triiodide, and 1.27 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.5 g of Compound 25 (yield 49.0%).

MS[M+H]+=633

Synthesis Example 26. Synthesis of Compound 26

1) Synthesis of Intermediate I34

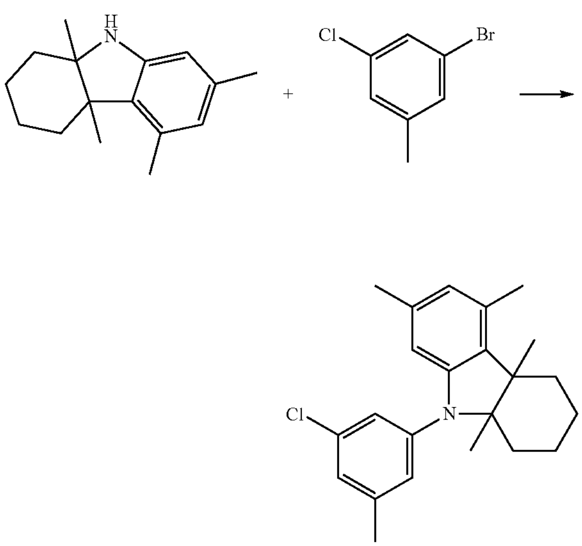

I34

After 50 g of 4a,5,7,9a-tetramethyl-2,3,4,4a,9,9a-hexahydro-1H-carbazole, 49.27 g of 1-bromo-3-chloro-5-methylbenzene, 62.85 g of sodium-tert-butoxide, and 1.11 g of bis(tri-tert-butylphosphine)palladium(0) were put into 600 ml of toluene under nitrogen atmosphere, the resulting mixture was stirred for 3 hours. After the completion of the reaction, the resulting product was extracted, and then purified with an ethyl acetate:hexane column to obtain 58 g of Intermediate I34 (yield 75%).

MS[M+H]+=354

2) Synthesis of Intermediate I35

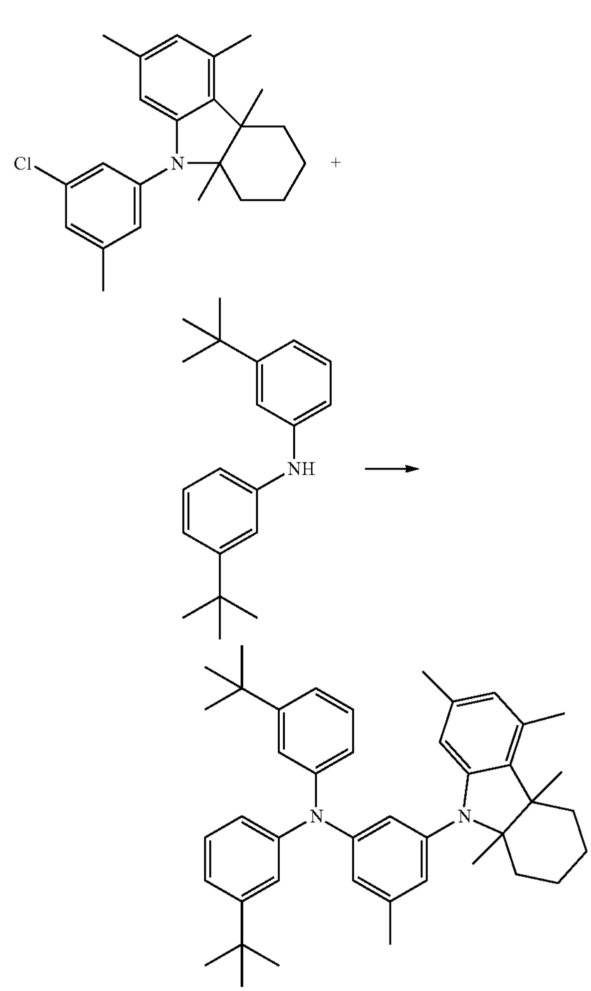

I35

After 6 g of Intermediate I34, 5.24 g of bis(3-(tert-butyl) phenyl)amine, 4.89 g of sodium-tert-butoxide, and 0.1 g of bis(tri-tert-butylphosphine)palladium(0) were put into 100 ml of toluene under nitrogen atmosphere, the resulting mixture was stirred for 6 hours. After the completion of the reaction, the resulting product was extracted, and then purified with an ethyl acetate:hexane column to obtain 6.1 g of Intermediate I35 (yield 60%).

MS[M+H]+=599

3) Synthesis of Compound 26

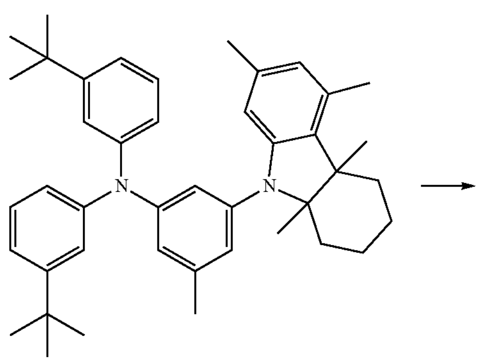

I35

-continued

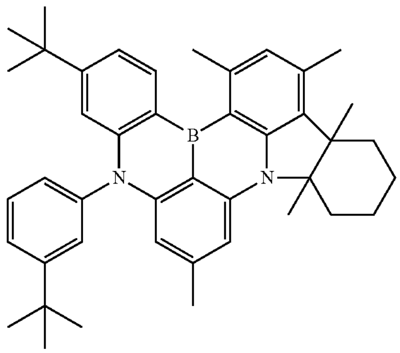

26

Under nitrogen atmosphere, 3.00 g of Intermediate I35, 5.88 g of boron triiodide, and 1.33 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.7 g of Compound 26 (yield 56.0%).

MS[M+H]+=607

Synthesis Example 27. Synthesis of Compound 27

1) Synthesis of Intermediate I36

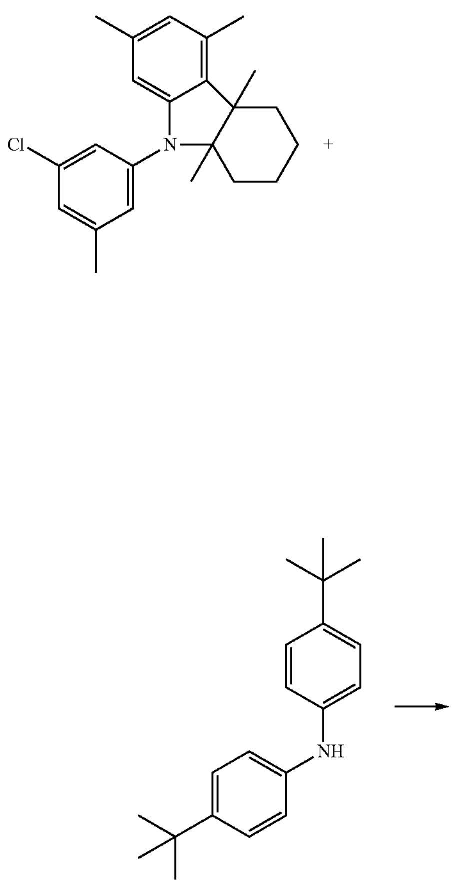

-continued

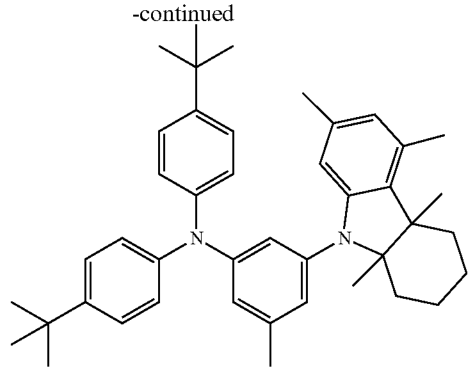

I36

After 6 g of Intermediate I34, 5.24 g of bis(4-(tert-butyl)phenyl)amine, 4.89 g of sodium-tert-butoxide, and 0.1 g of bis(tri-tert-butylphosphine)palladium(0) were put into 100 ml of toluene under nitrogen atmosphere, the resulting mixture was stirred for 6 hours. After the completion of the reaction, the resulting product was extracted, and then purified with an ethyl acetate:hexane column to obtain 6.0 g of Intermediate I36 (yield 59%).

MS[M+H]+=599

2) Synthesis of Compound 27

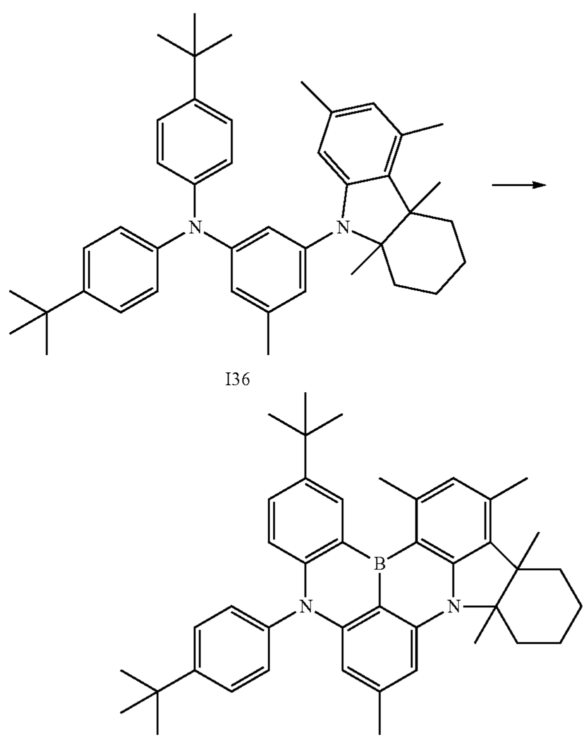

I36

27

Under nitrogen atmosphere, 3.00 g of Intermediate I36, 5.88 g of boron triiodide, and 1.33 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.8 g of Compound 27 (yield 59.0%).

MS[M+H]+=607

Synthesis Example 28. Synthesis of Compound 28

1) Synthesis of Intermediate I37

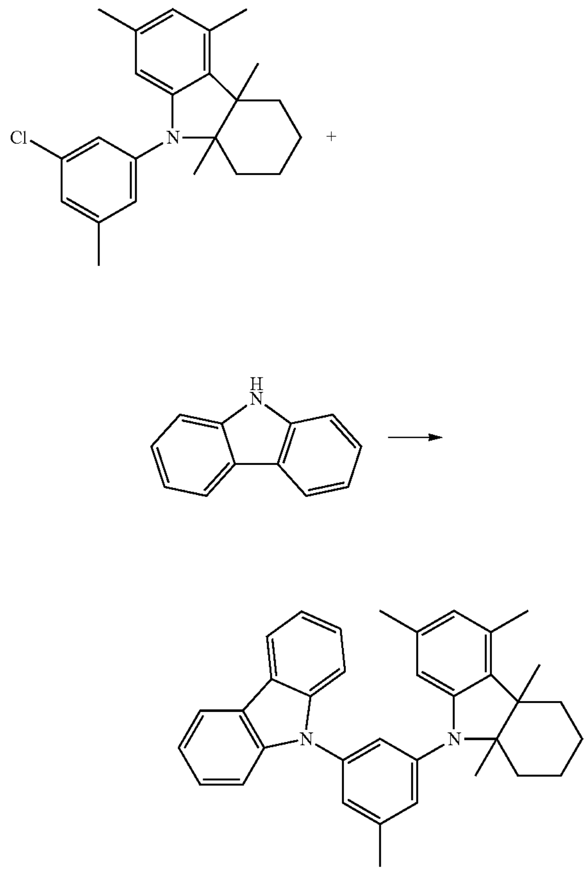

I37

After 6 g of Intermediate I34, 3.12 g of 9H-carbazole, 4.88 g of sodium-tert-butoxide, and 0.1 g of bis(tri-tert-butylphosphine)palladium(0) were put into 120 ml of toluene under nitrogen atmosphere, the resulting mixture was stirred for 10 hours. After the completion of the reaction, the resulting product was extracted, and then purified with an ethyl acetate:hexane column to obtain 5.8 g of Intermediate I37 (yield 71%).

MS[M+H]+=485

2) Synthesis of Compound 28

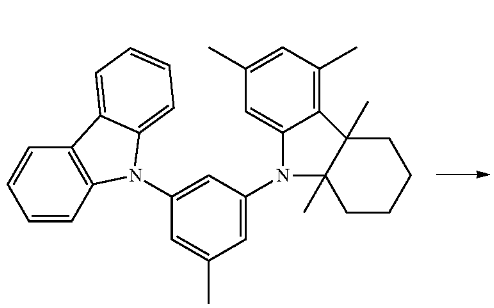

I37

-continued

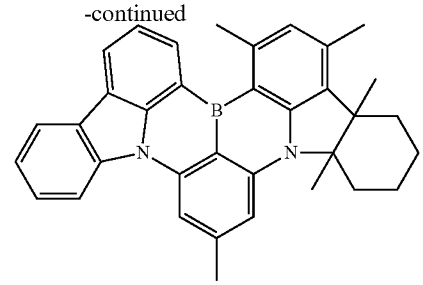

28

Under nitrogen atmosphere, 3.00 g of Intermediate I37, 7.27 g of boron triiodide, and 1.64 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.8 g of Compound 28 (yield 59.0%).

MS[M+H]+=493

Synthesis Example 29. Synthesis of Compound 29

1) Synthesis of Intermediate I38

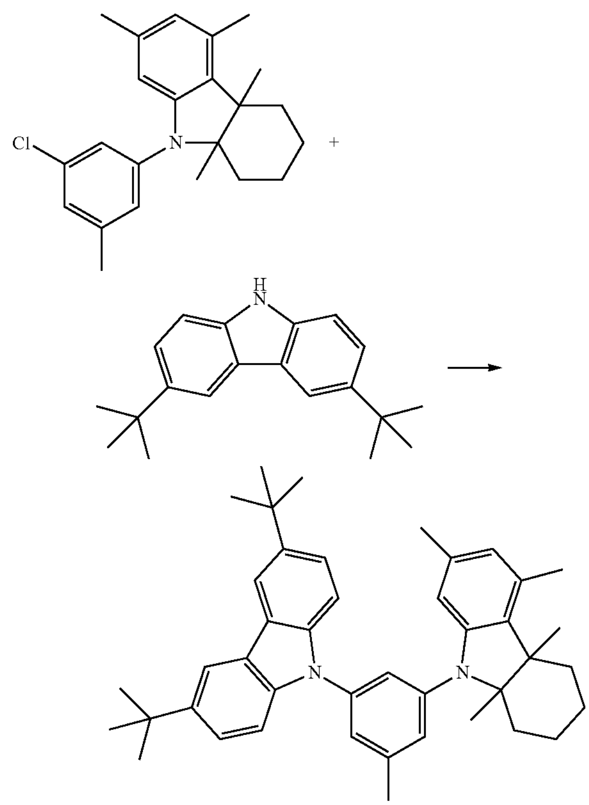

I38

After 6 g of Intermediate I34, 5.21 g of 3,6-di-methyl-9H-carbazole, 4.88 g of sodium-tert-butoxide, and 0.1 g of bis(tri-tert-butylphosphine)palladium(0) were put into 120 ml of toluene under nitrogen atmosphere, the resulting mixture was stirred for 10 hours. After the completion of the reaction, the resulting product was extracted, and then purified with an ethyl acetate:hexane column to obtain 6.1 g of Intermediate I38 (yield 60%).

MS[M+H]+=597

2) Synthesis of Compound 29

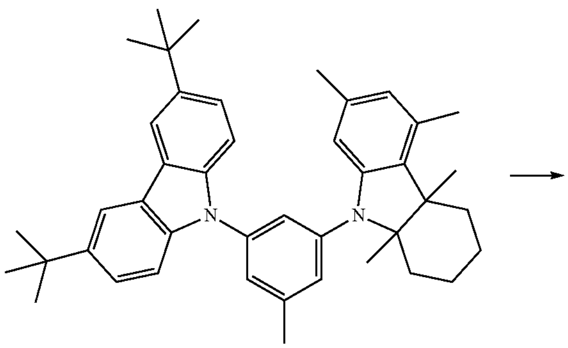

I38

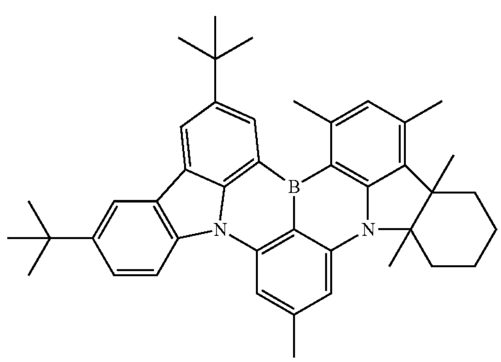

29

Under nitrogen atmosphere, 3.00 g of Intermediate I38, 5.90 g of boron triiodide, and 1.34 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.7 g of Compound 29 (yield 56.0%).

MS[M+H]+=605

Synthesis Example 30. Synthesis of Compound 30

1) Synthesis of Intermediate I39

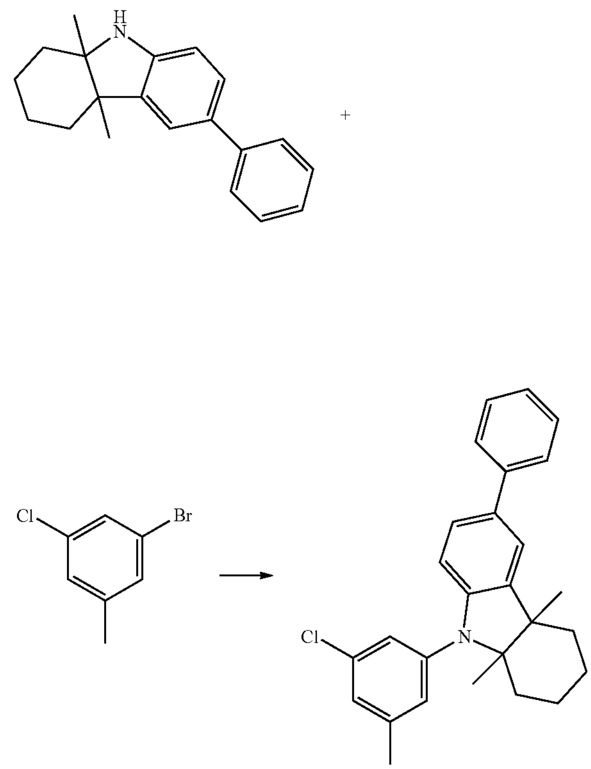

I39

After 50 g of 4a, 9a-dimethyl-6-phenyl-2,3,4,4a,9,9a-hexahydro-1H-carbazole, 40.74 g of 1-bromo-3-chloro-5-methylbenzene, 51.96 g of sodium-tert-butoxide, and 0.92 g of bis(tri-tert-butylphosphine)-palladium(0) were put into 600 ml of toluene under nitrogen atmosphere, the resulting mixture was stirred for 3 hours. After the completion of the reaction, the resulting product was extracted, and then purified with an ethyl acetate: hexane column to obtain 61 g of Intermediate I39 (yield 84%).

MS[M+H]+=402

2) Synthesis of Intermediate I40

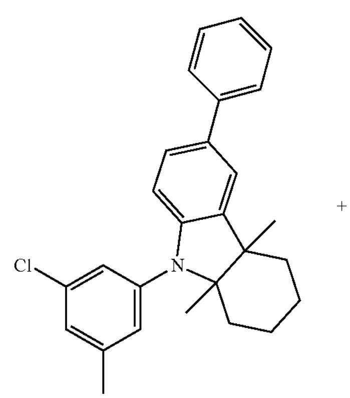

-continued

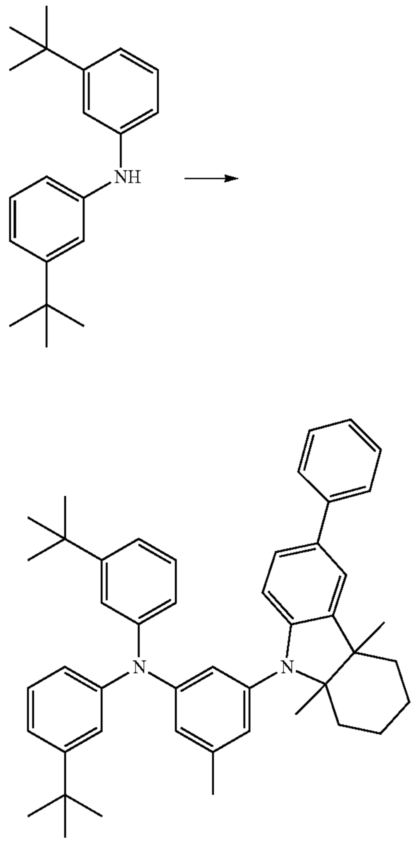

I40

After 6 g of Intermediate I39, 4.62 g of bis(3-(tert-butyl)phenyl)amine, 4.30 g of sodium-tert-butoxide, and 0.08 g of bis(tri-tert-butylphosphine)palladium(0) were put into 100 ml of toluene under nitrogen atmosphere, the resulting mixture was stirred for 6 hours. After the completion of the reaction, the resulting product was extracted, and then purified with an ethyl acetate:hexane column to obtain 6.3 g of Intermediate I40 (yield 65%).

MS[M+H]+=647

3) Synthesis of Compound 30

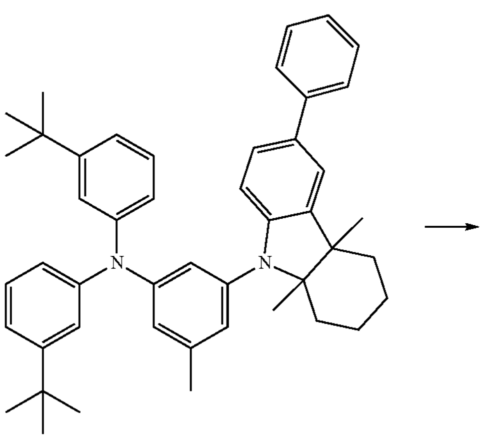

I40

-continued

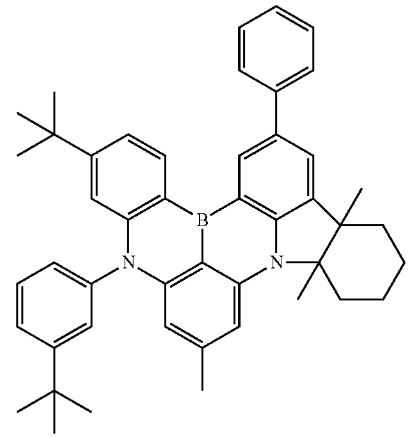

30

Under nitrogen atmosphere, 3.00 g of Intermediate I40, 5.88 g of boron triiodide, and 1.33 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.9 g of Compound 30 (yield 63.0%).

MS[M+H]+=655

Synthesis Example 31. Synthesis of Compound 31

1) Synthesis of Intermediate I41

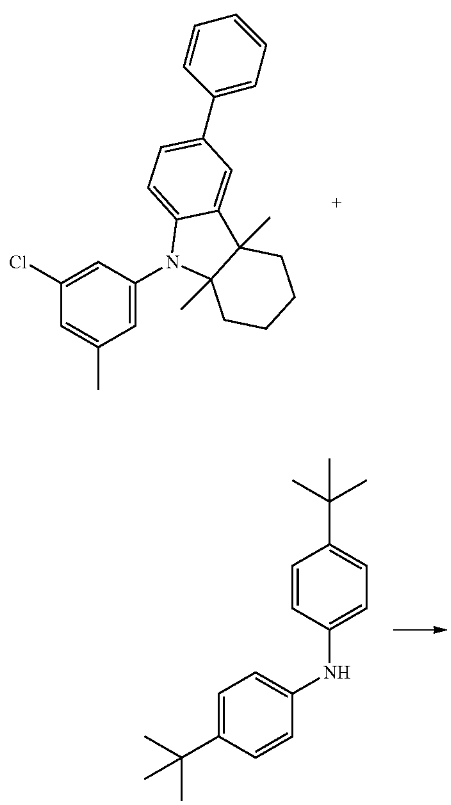

-continued

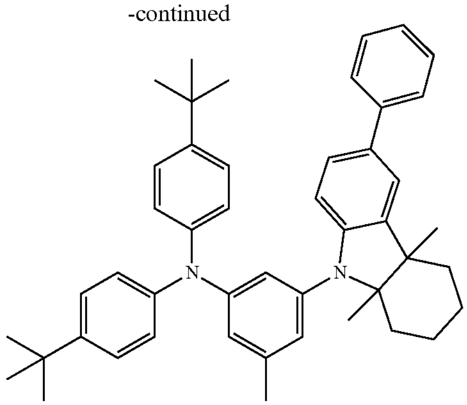

I41

After 6 g of Intermediate I39, 4.62 g of bis(4-(tert-butyl)phenyl)amine, 4.30 g of sodium-tert-butoxide, and 0.08 g of bis(tri-tert-butylphosphine)palladium(0) were put into 100 ml of toluene under nitrogen atmosphere, the resulting mixture was stirred for 6 hours. After the completion of the reaction, the resulting product was extracted, and then purified with an ethyl acetate:hexane column to obtain 6.1 g of Intermediate I41 (yield 63%).

MS[M+H]+=647

2) Synthesis of Compound 31

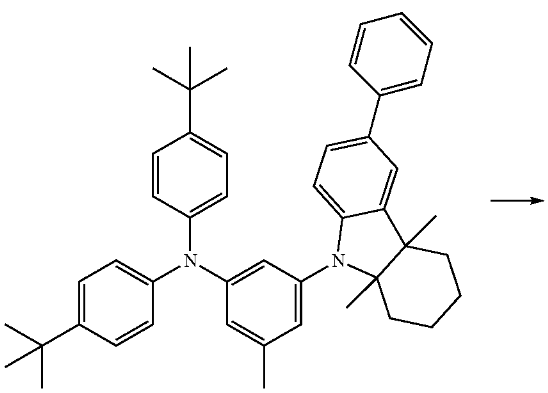

I41

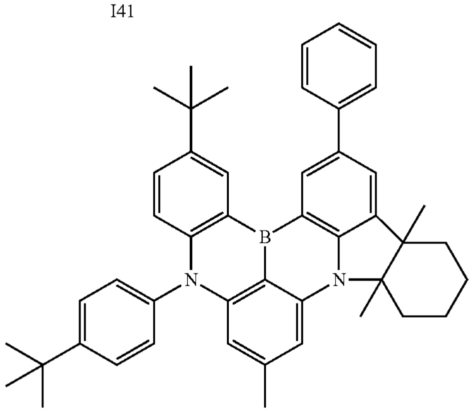

31

Under nitrogen atmosphere, 3.00 g of Intermediate I41, 5.88 g of boron triiodide, and 1.33 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.7 g of Compound 31 (yield 58.0%).

MS[M+H]+=655

Synthesis Example 32. Synthesis of Compound 32

1) Synthesis of Intermediate I42

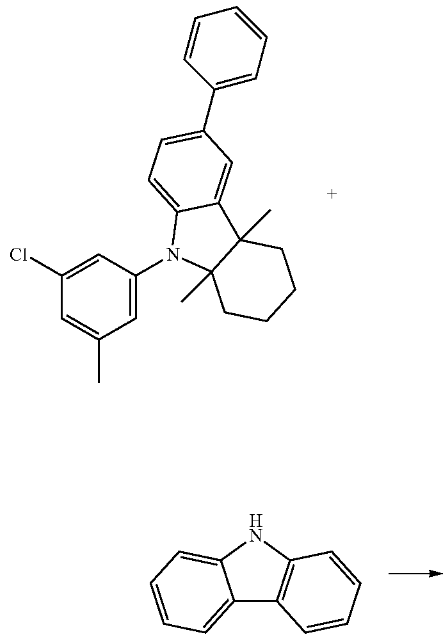

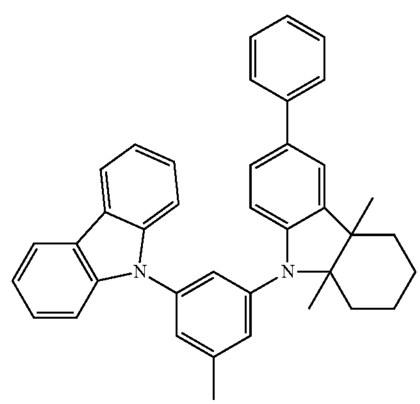

I42

After 6 g of Intermediate I39, 3.12 g of 9H-carbazole, 4.88 g of sodium-tert-butoxide, and 0.1 g of bis(tri-tert-butylphosphine)palladium(0) were put into 120 ml of toluene under nitrogen atmosphere, the resulting mixture was stirred for 10 hours. After the completion of the reaction, the resulting product was extracted, and then purified with an ethyl acetate:hexane column to obtain 5.8 g of Intermediate I42 (yield 68%).

MS[M+H]+=533

2) Synthesis of Compound 32

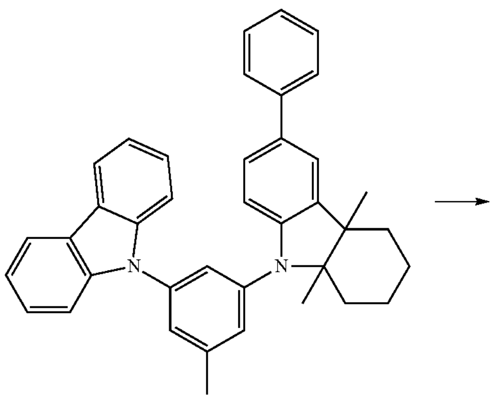

I42

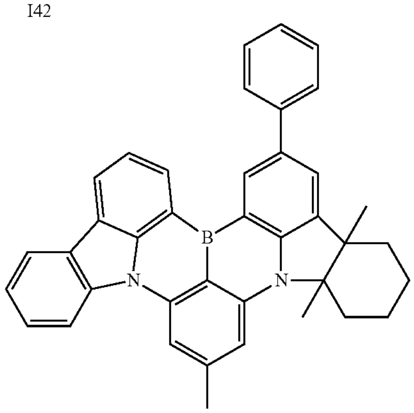

32

Under nitrogen atmosphere, 3.00 g of Intermediate I42, 6.61 g of boron triiodide, and 1.50 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.8 g of Compound 32 (yield 59.0%).

MS[M+H]+=541

Synthesis Example 33. Synthesis of Compound 33

1) Synthesis of Intermediate I43

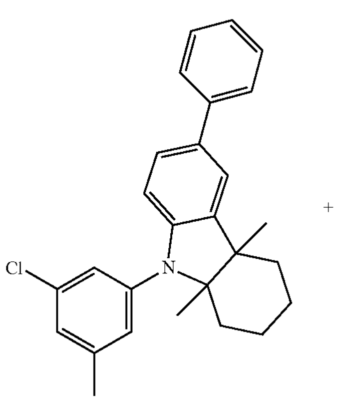

-continued

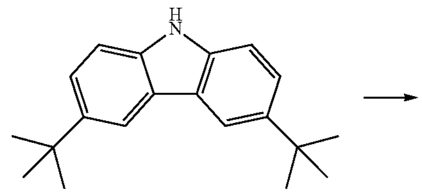

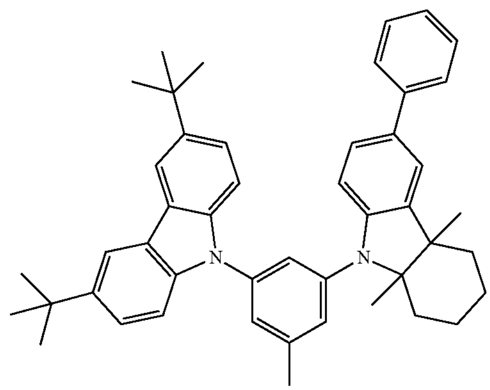

I43

After 6 g of Intermediate I39, 4.58 g of 3,6-di-(tert-butyl)-9H-carbazole, 4.30 g of sodium-tert-butoxide, and 0.08 g of bis(tri-tert-butylphosphine)palladium(0) were put into 120 ml of toluene under nitrogen atmosphere, the resulting mixture was stirred for 10 hours. After the completion of the reaction, the resulting product was extracted, and then purified with an ethyl acetate:hexane column to obtain 6.4 g of Intermediate I43 (yield 66%).

MS[M+H]+=645

2) Synthesis of Compound 33

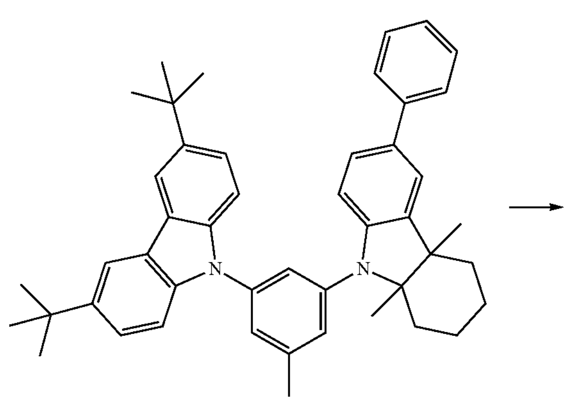

I43

-continued

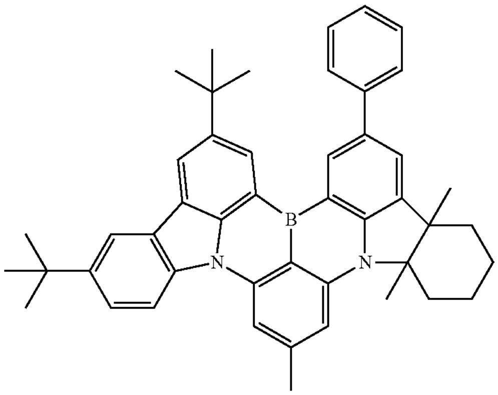

33

Under nitrogen atmosphere, 3.00 g of Intermediate I43, 5.90 g of boron triiodide, and 1.34 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.8 g of Compound 33 (yield 59.0%).

MS[M+H]+=653

Synthesis Example 34. Synthesis of Compound 34

1) Synthesis of Intermediate I44

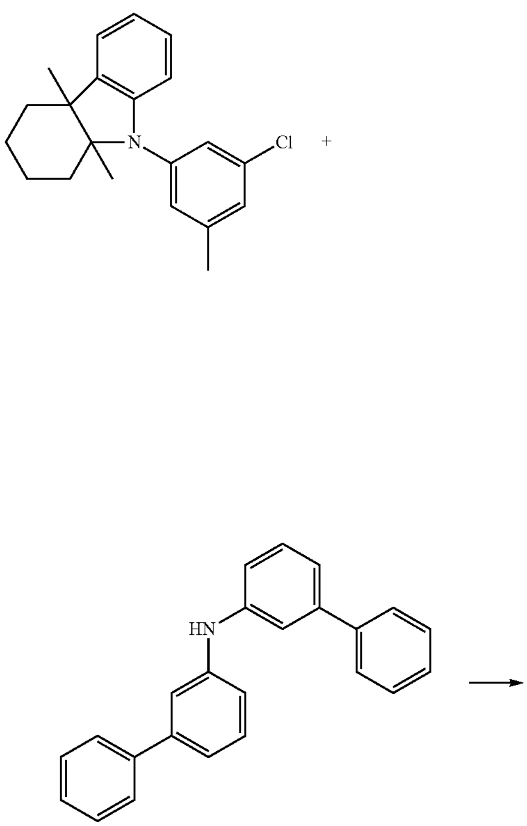

-continued

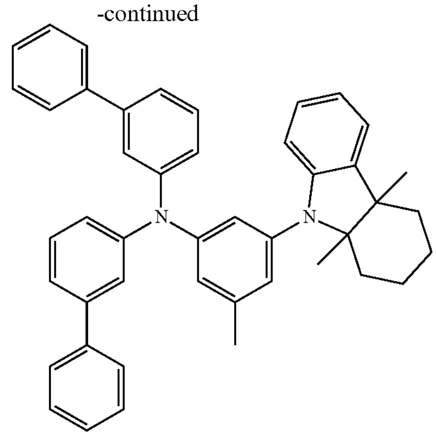

I44

After 6 g of Intermediate I2, 6.51 g of di([1,1'-biphenyl]-3-yl)amine, 5.30 g of sodium-tert-butoxide, and 0.09 g of bis(tri-tert-butylphosphine)palladium(0) were put into 120 ml of toluene under nitrogen atmosphere, the resulting mixture was stirred for 10 hours. After the completion of the reaction, the resulting product was extracted, and then purified with an ethyl acetate:hexane column to obtain 7.2 g of Intermediate I44 (yield 64%).

MS[M+H]+=611

2) Synthesis of Compound 34

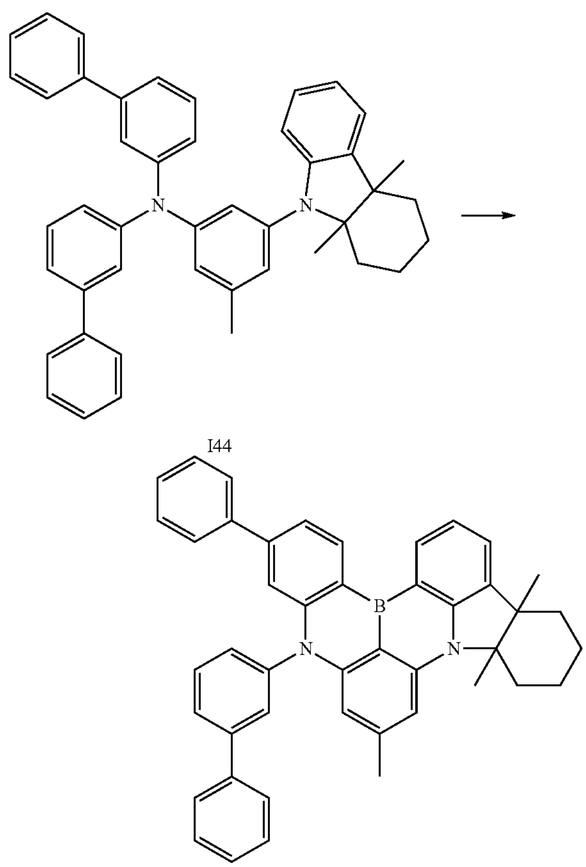

34

Under nitrogen atmosphere, 3.00 g of Intermediate I44, 5.77 g of boron triiodide, and 1.31 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.9 g of Compound 34 (yield 63.0%).

MS[M+H]+=619

Synthesis Example 35. Synthesis of Compound 35

1) Synthesis of Intermediate I45

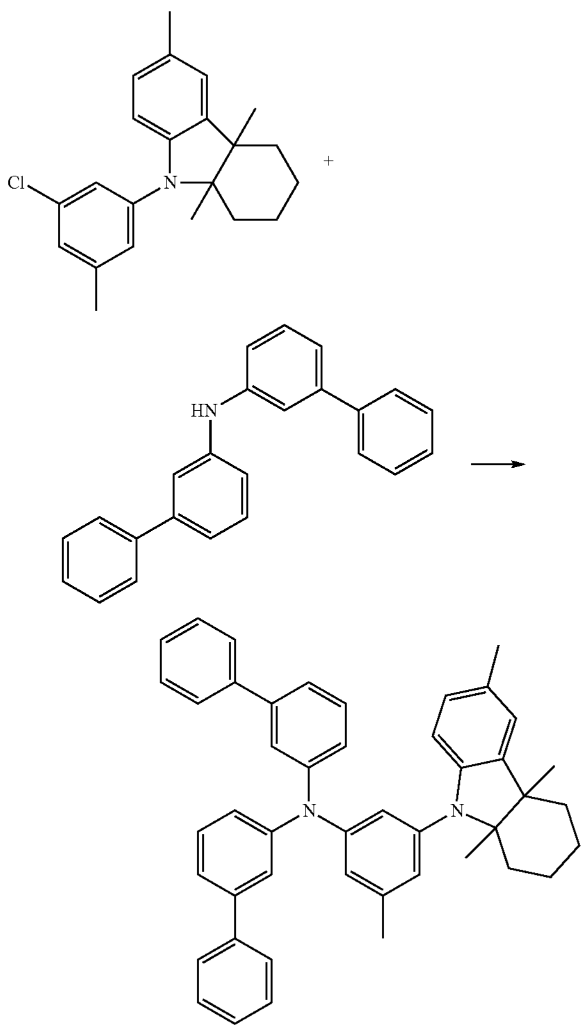

I45

After 6 g of Intermediate I24, 6.24 g of di([1,1'-biphenyl]-3-yl)amine, 5.09 g of sodium-tert-butoxide, and 0.09 g of bis(tri-tert-butylphosphine)palladium(0) were put into 120 ml of toluene under nitrogen atmosphere, the resulting mixture was stirred for 10 hours. After the completion of the reaction, the resulting product was extracted, and then purified with an ethyl acetate:hexane column to obtain 7.3 g of Intermediate I45 (yield 66%).

MS[M+H]+=625

2) Synthesis of Compound 35

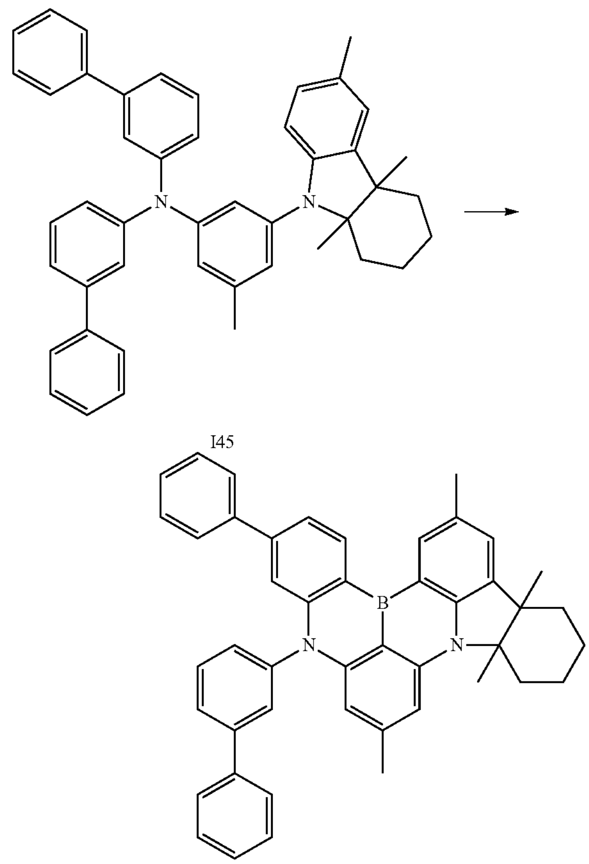

35

Under nitrogen atmosphere, 3.00 g of Intermediate I45, 5.64 g of boron triiodide, and 1.27 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.8 g of Compound 35 (yield 59.0%).

MS[M+H]+=633

Synthesis Example 36. Synthesis of Compound 36

1) Synthesis of Intermediate I46

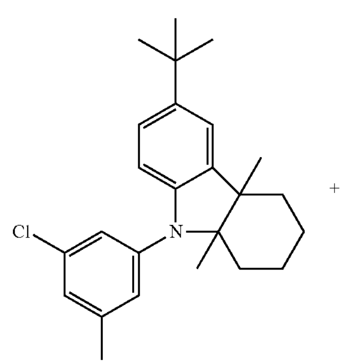

-continued

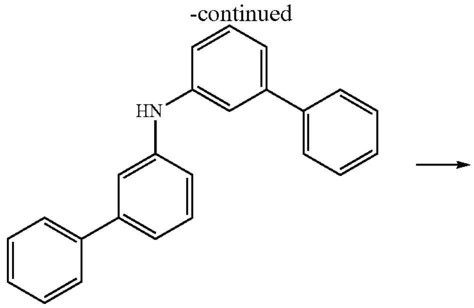

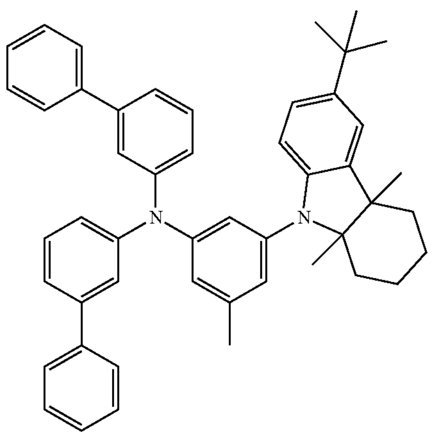

I46

After 6 g of Intermediate I29, 5.55 g of di([1,1'-biphenyl]-3-yl)amine, 4.52 g of sodium-tert-butoxide, and 0.08 g of bis(tri-tert-butylphosphine)palladium(0) were put into 120 ml of toluene under nitrogen atmosphere, the resulting mixture was stirred for 10 hours. After the completion of the reaction, the resulting product was extracted, and then purified with an ethyl acetate:hexane column to obtain 7.3 g of Intermediate I46 (yield 70%).

MS[M+H]+=667

2) Synthesis of Compound 36

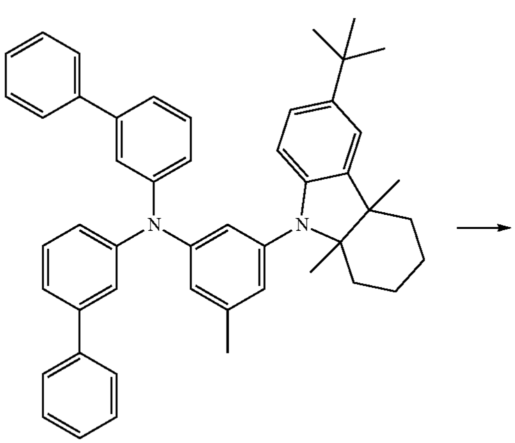

I46

-continued

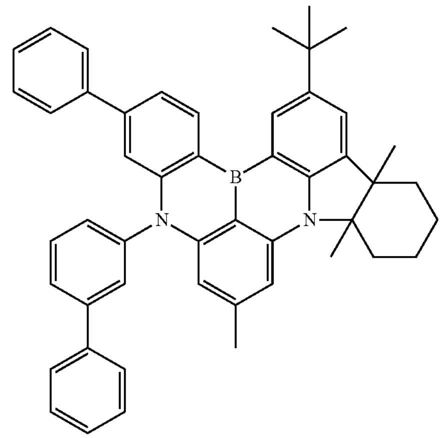

36

Under nitrogen atmosphere, 3.00 g of Intermediate I46, 5.28 g of boron triiodide, and 1.20 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.7 g of Compound 36 (yield 56.0%).

MS[M+H]+=675

Synthesis Example 37. Synthesis of Compound 37

1) Synthesis of Intermediate I47

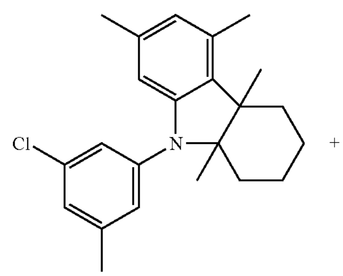

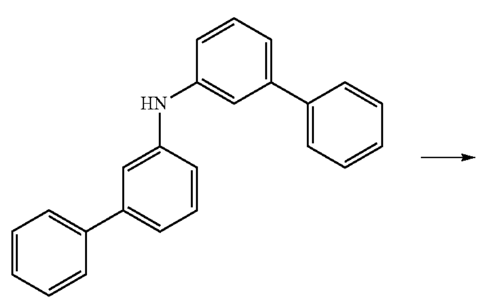

-continued

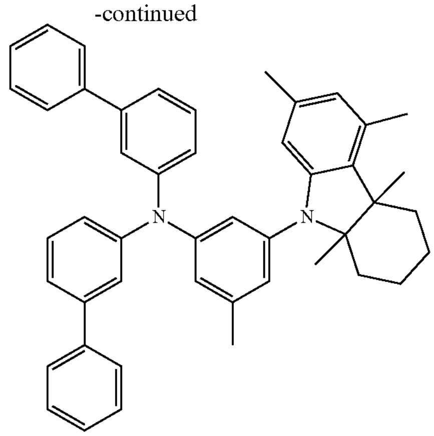

I47

After 6 g of Intermediate I34, 5.99 g of di([1,1'-biphenyl]-3-yl)amine, 4.89 g of sodium-tert-butoxide, and 0.08 g of bis(tri-tert-butylphosphine)palladium(0) were put into 120 ml of toluene under nitrogen atmosphere, the resulting mixture was stirred for 10 hours. After the completion of the reaction, the resulting product was extracted, and then purified with an ethyl acetate:hexane column to obtain 7.1 g of Intermediate I47 (yield 67%).

MS[M+H]+=639

2) Synthesis of Compound 37

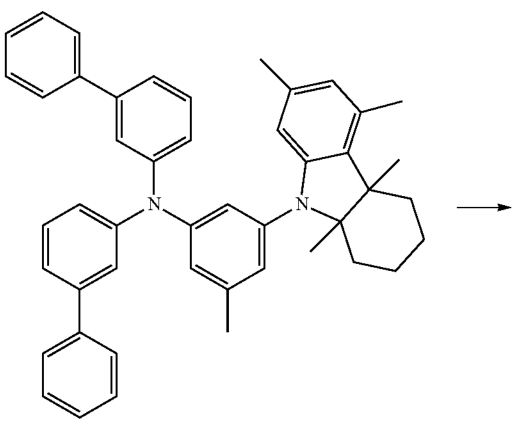

I47

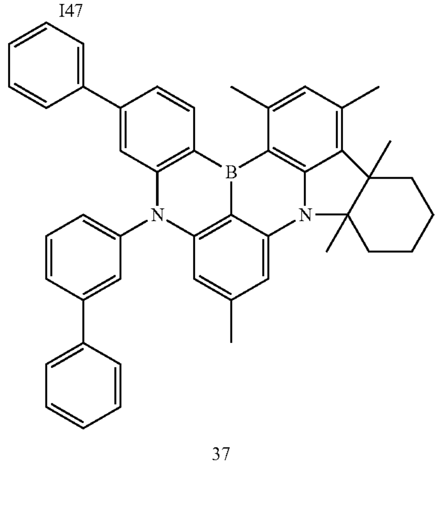

37

Under nitrogen atmosphere, 3.00 g of Intermediate I47, 5.51 g of boron triiodide, and 1.25 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.8 g of Compound 37 (yield 59.0%).

MS[M+H]+=647

Synthesis Example 38. Synthesis of Compound 38

1) Synthesis of Intermediate I48

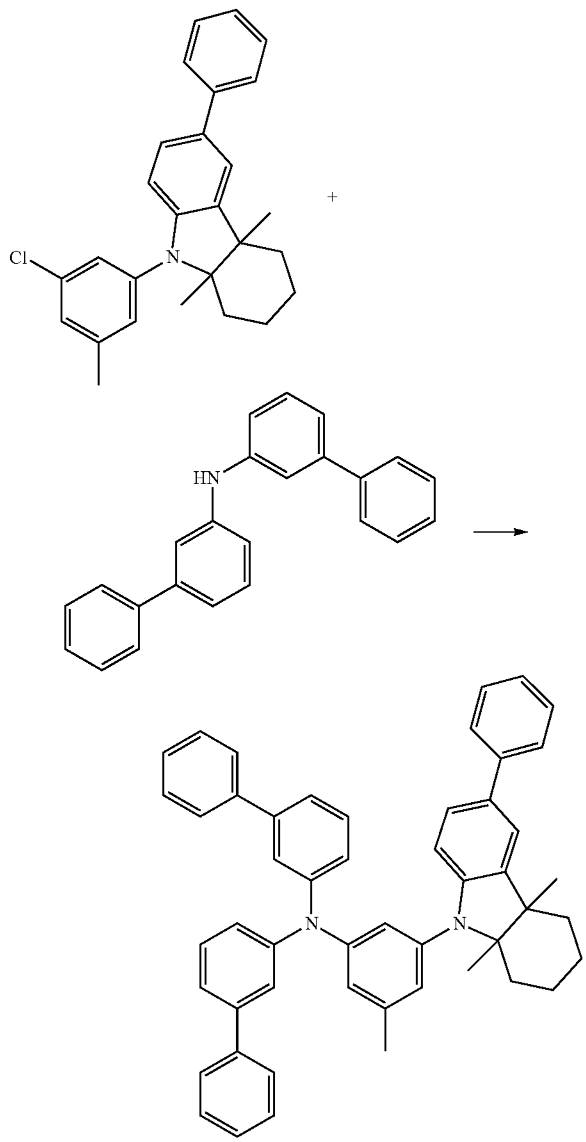

I48

After 6 g of Intermediate I39, 5.28 g of di([1,1'-biphenyl]-3-yl)amine, 4.30 g of sodium-tert-butoxide, and 0.08 g of bis(tri-tert-butylphosphine)palladium(0) were put into 120 ml of toluene under nitrogen atmosphere, the resulting mixture was stirred for 10 hours. After the completion of the reaction, the resulting product was extracted, and then purified with an ethyl acetate:hexane column to obtain 6.4 g of Intermediate I48 (yield 62%).

MS[M+H]+=687

2) Synthesis of Compound 38

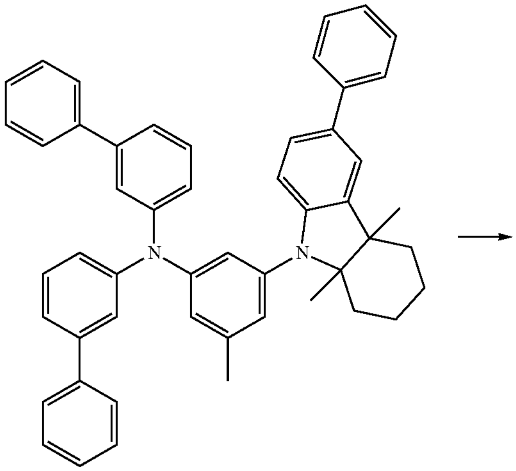

I48

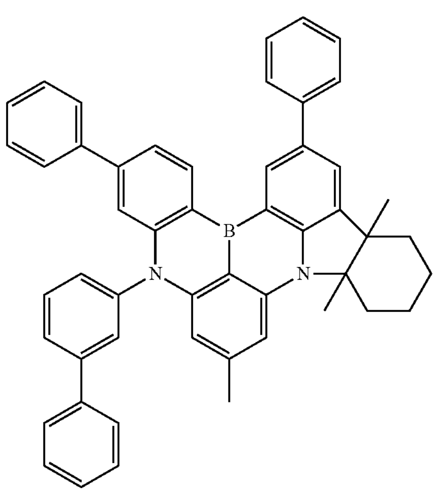

38

Under nitrogen atmosphere, 3.00 g of Intermediate I47, 5.51 g of boron triiodide, and 1.25 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.9 g of Compound 38 (yield 58.0%).

MS[M+H]+=695

Synthesis Example 39. Synthesis of Compound 39

1) Synthesis of Intermediate I49

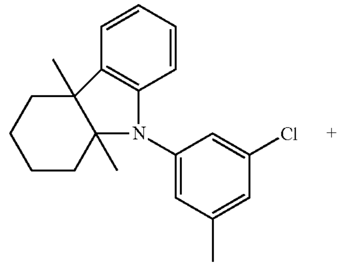

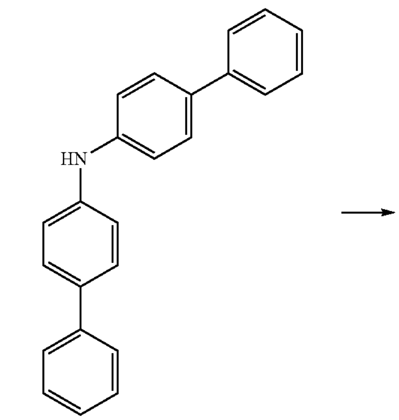

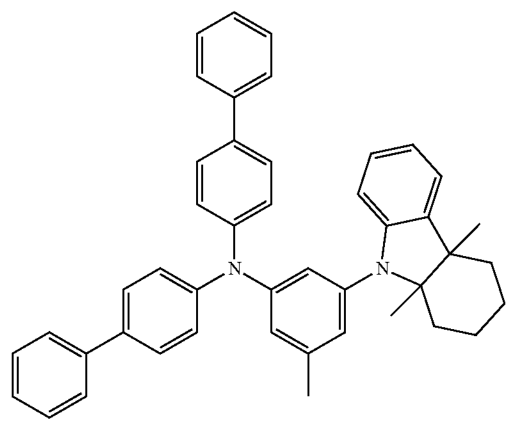

I49

After 6 g of Intermediate I2, 6.51 g of di([1,1'-biphenyl]-4-yl)amine, 5.30 g of sodium-tert-butoxide, and 0.09 g of bis(tri-tert-butylphosphine)palladium(0) were put into 120 ml of toluene under nitrogen atmosphere, the resulting mixture was stirred for 10 hours. After the completion of the reaction, the resulting product was extracted, and then purified with an ethyl acetate:hexane column to obtain 7.1 g of Intermediate I49 (yield 62%).

MS[M+H]+=611

2) Synthesis of Compound 39

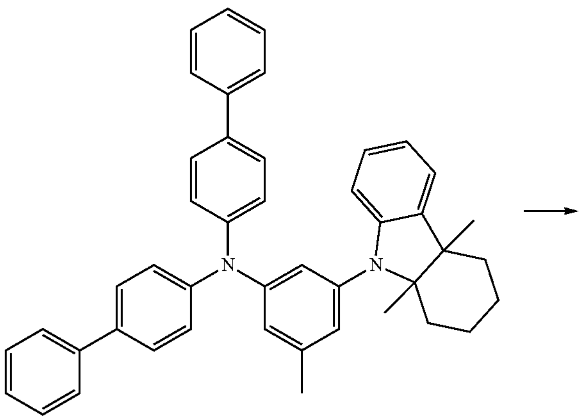

I49

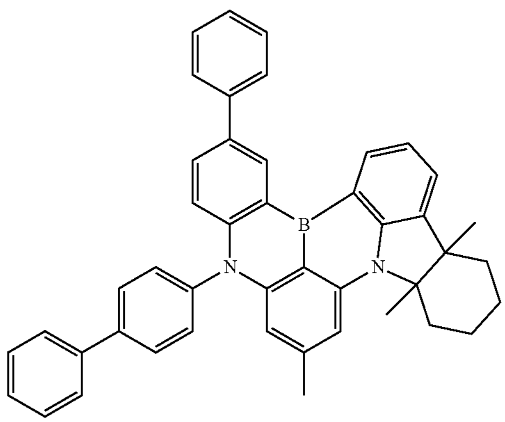

39

Under nitrogen atmosphere, 3.00 g of Intermediate I49, 5.77 g of boron triiodide, and 1.31 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.5 g of Compound 39 (yield 49.0%).

MS[M+H]+=619

Synthesis Example 40. Synthesis of Compound 40

1) Synthesis of Intermediate I50

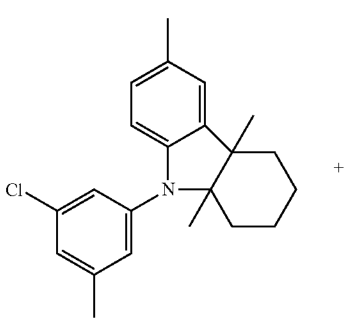

-continued

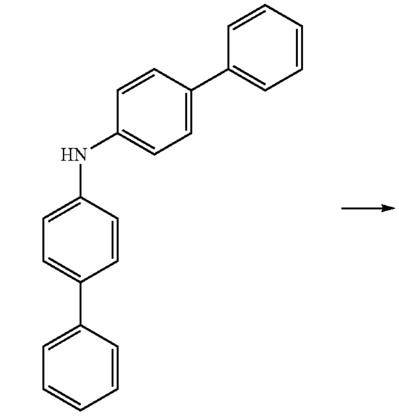

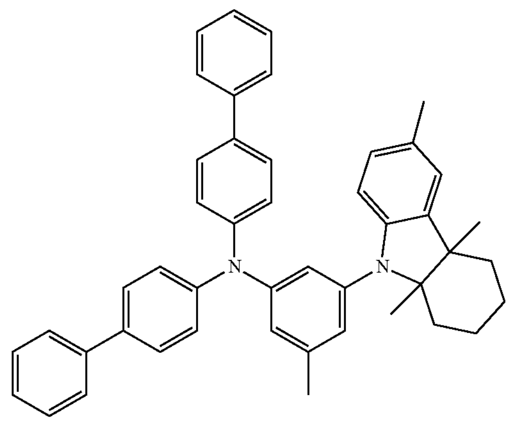

I50

After 6 g of Intermediate I24, 6.24 g of di([1,1'-biphenyl]-4-yl)amine, 5.09 g of sodium-tert-butoxide, and 0.09 g of bis(tri-tert-butylphosphine)palladium(0) were put into 120 ml of toluene under nitrogen atmosphere, the resulting mixture was stirred for 10 hours. After the completion of the reaction, the resulting product was extracted, and then purified with an ethyl acetate:hexane column to obtain 7.1 g of Intermediate I50 (yield 64%).

MS[M+H]+=625

2) Synthesis of Compound 40

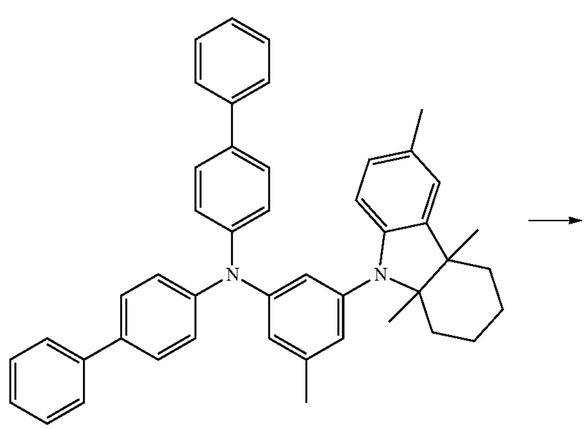

I50

-continued

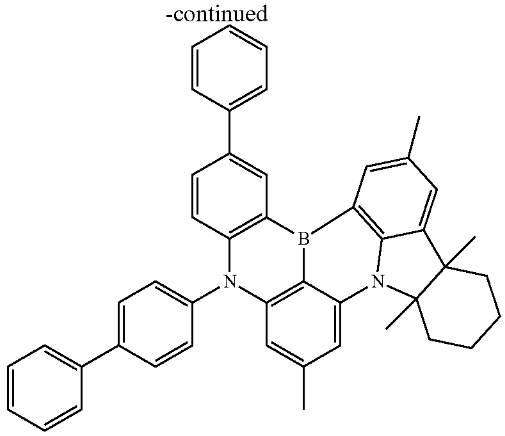

40

Under nitrogen atmosphere, 3.00 g of Intermediate I50, 5.64 g of boron triiodide, and 1.27 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.6 g of Compound 40 (yield 53.0%).

MS[M+H]+=633

Synthesis Example 41. Synthesis of Compound 41

1) Synthesis of Intermediate I51

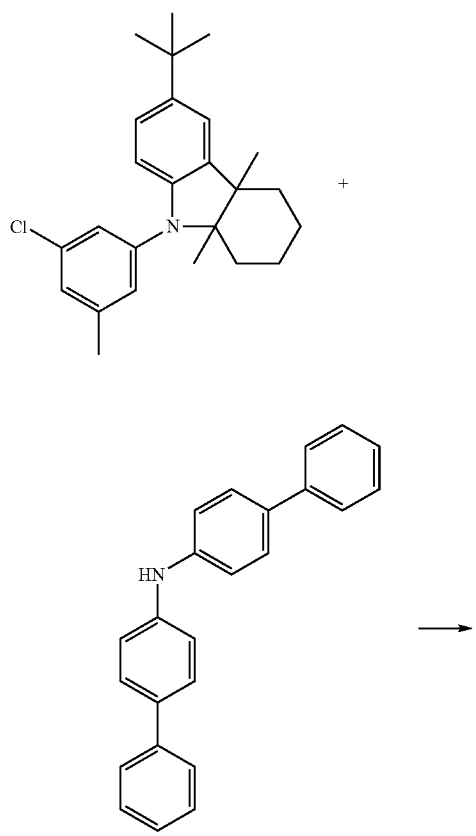

-continued

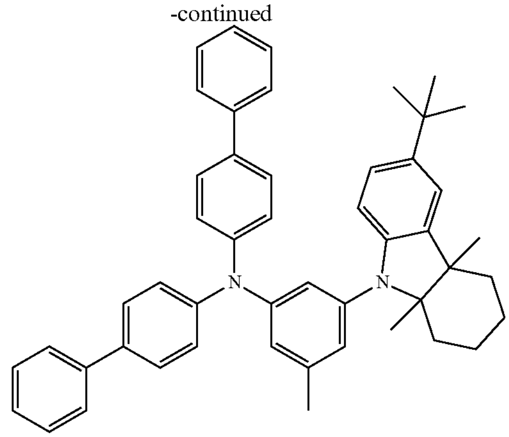

I51

After 6 g of Intermediate I29, 5.55 g of di([1,1'-biphenyl]-4-yl)amine, 4.52 g of sodium-tert-butoxide, and 0.08 g of bis(tri-tert-butylphosphine)palladium(0) were put into 120 ml of toluene under nitrogen atmosphere, the resulting mixture was stirred for 10 hours. After the completion of the reaction, the resulting product was extracted, and then purified with an ethyl acetate:hexane column to obtain 7.0 g of Intermediate I51 (yield 67%).

MS[M+H]+=667

2) Synthesis of Compound 41

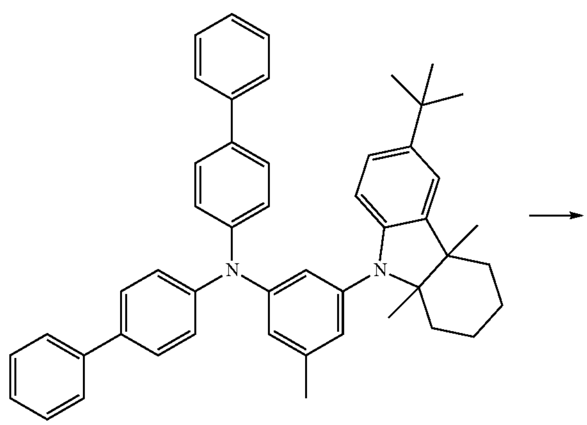

I51

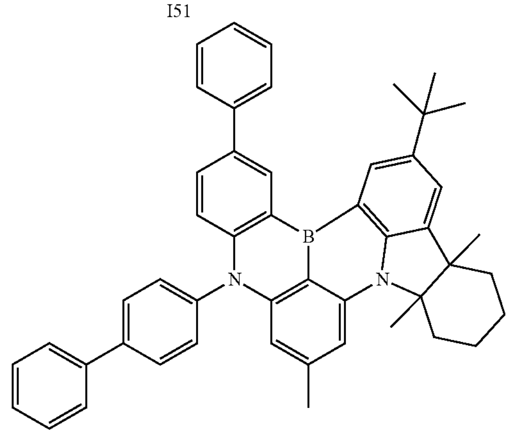

41

Under nitrogen atmosphere, 3.00 g of Intermediate I51, 5.28 g of boron triiodide, and 1.20 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.6 g of Compound 41 (yield 53.0%).

MS[M+H]+=675

Synthesis Example 42. Synthesis of Compound 42

1) Synthesis of Intermediate I52

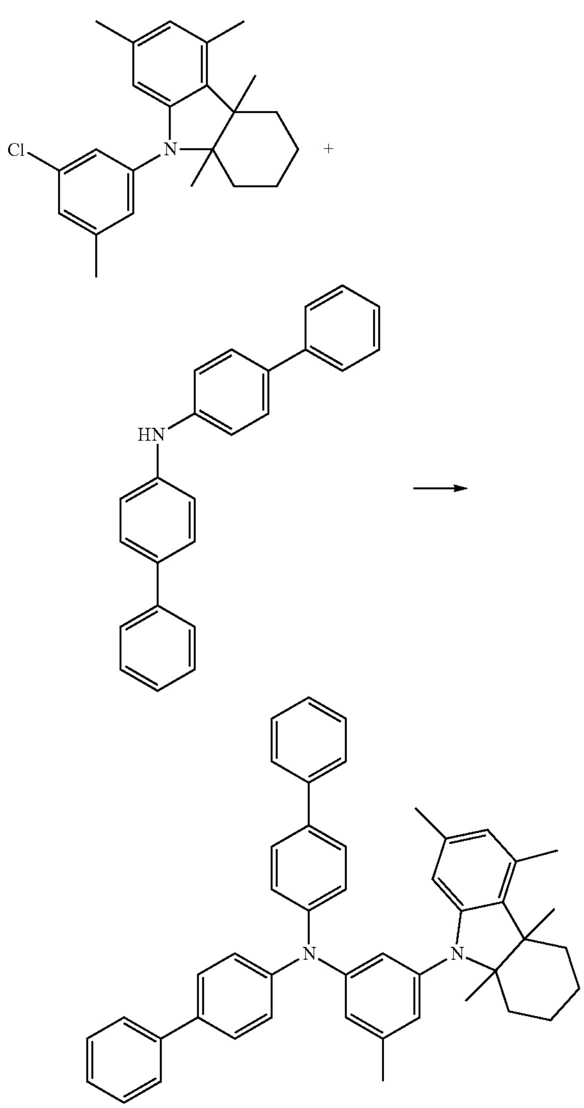

I52

After 6 g of Intermediate I34, 5.99 g of di([1,1'-biphenyl]-4-yl)amine, 4.89 g of sodium-tert-butoxide, and 0.08 g of bis(tri-tert-butylphosphine)palladium(0) were put into 120 ml of toluene under nitrogen atmosphere, the resulting mixture was stirred for 10 hours. After the completion of the reaction, the resulting product was extracted, and then purified with an ethyl acetate:hexane column to obtain 7.0 g of Intermediate I52 (yield 65%).

MS[M+H]+=639

2) Synthesis of Compound 42

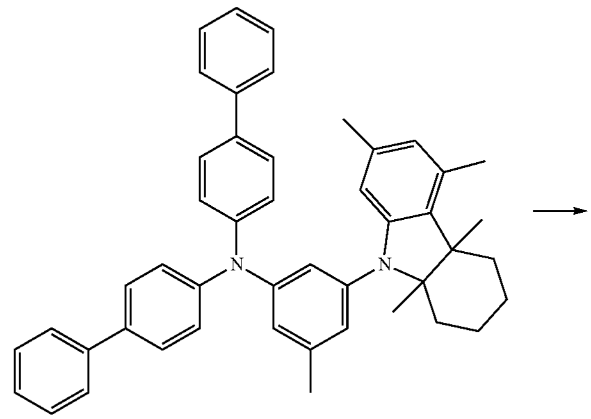

I52

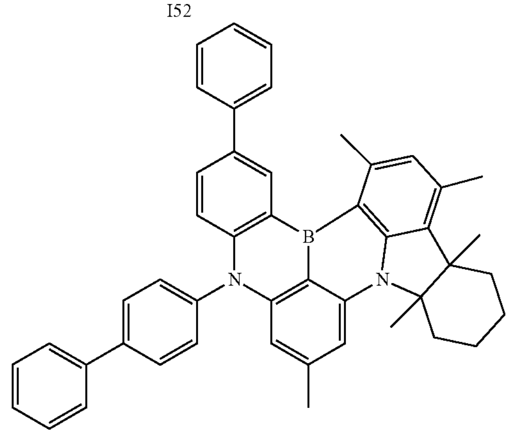

42

Under nitrogen atmosphere, 3.00 g of Intermediate I52, 5.51 g of boron triiodide, and 1.25 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.7 g of Compound 42 (yield 56.0%).

MS[M+H]+=647

Synthesis Example 43. Synthesis of Compound 43

1) Synthesis of Intermediate I53

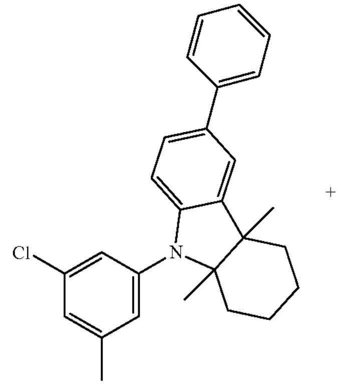

-continued

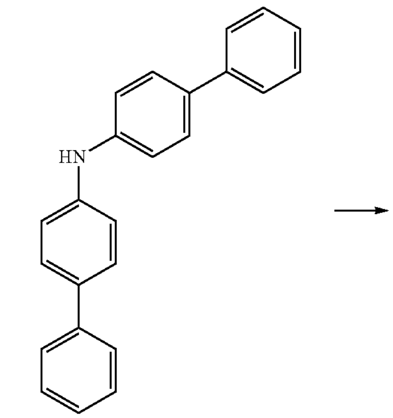

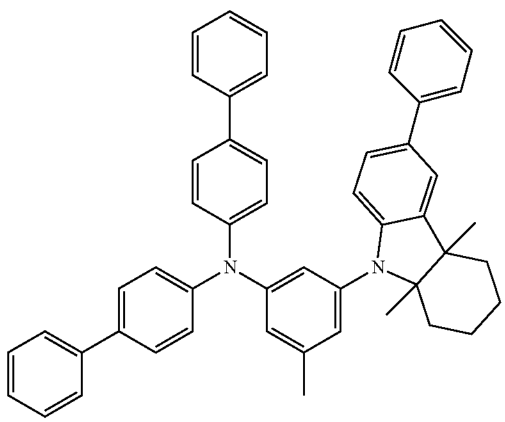

I53

After 6 g of Intermediate I39, 5.28 g of di([1,1'-biphenyl]-4-yl)amine, 4.30 g of sodium-tert-butoxide, and 0.08 g of bis(tri-tert-butylphosphine)palladium(0) were put into 120 ml of toluene under nitrogen atmosphere, the resulting mixture was stirred for 10 hours. After the completion of the reaction, the resulting product was extracted, and then purified with an ethyl acetate:hexane column to obtain 6.5 g of Intermediate I53 (yield 63%).

MS[M+H]+=687

2) Synthesis of Compound 43

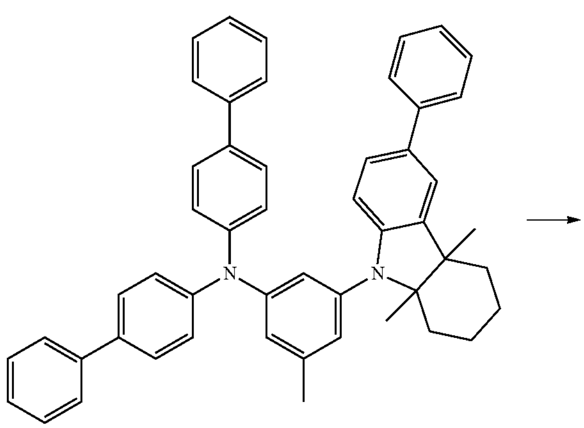

I53

-continued

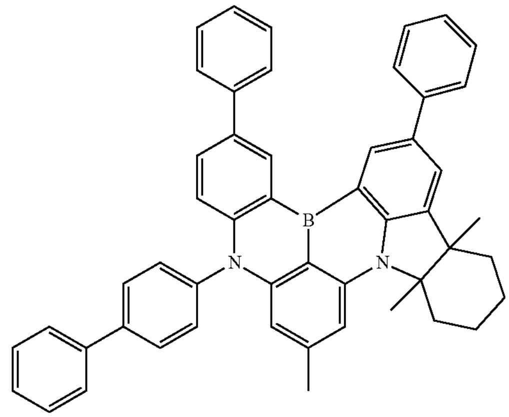

43

Under nitrogen atmosphere, 3.00 g of Intermediate I53, 5.13 g of boron triiodide, and 1.16 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.5 g of Compound 43 (yield 49.0%).

MS[M+H]+=695

Synthesis Example 44. Synthesis of Compound 44

1) Synthesis of Intermediate I54

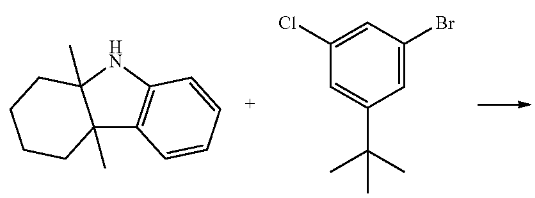

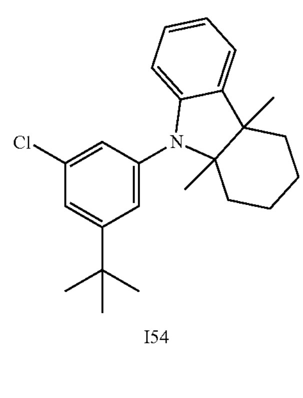

I54

45 g of Intermediate I54 was obtained using the same conditions as in the synthesis method of Intermediate I2 under nitrogen atmosphere (yield 82%).

MS[M+H]+=368

2) Synthesis of Intermediate I55

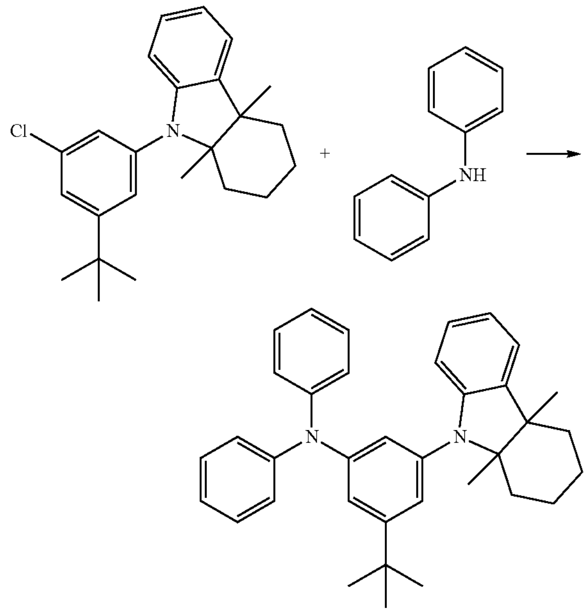

I55

6.2 g of Intermediate I55 was obtained using the same conditions as in the synthesis method of Intermediate I3 under nitrogen atmosphere (yield 76%).

MS[M+H]+=501

3) Synthesis of Compound 44

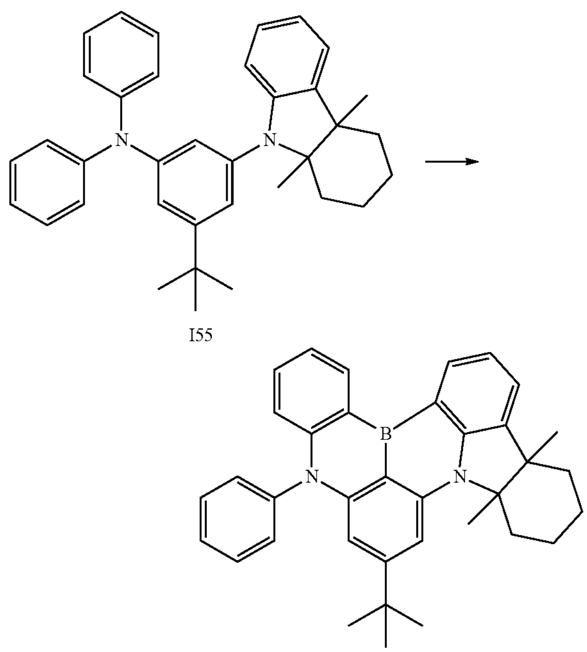

I55

44

Under nitrogen atmosphere, 3.00 g of Intermediate I55, 7.03 g of boron triiodide, and 1.60 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.6 g of Compound 44 (yield 53.0%).

MS[M+H]+=509

Synthesis Example 45. Synthesis of Compound 45

1) Synthesis of Intermediate I56

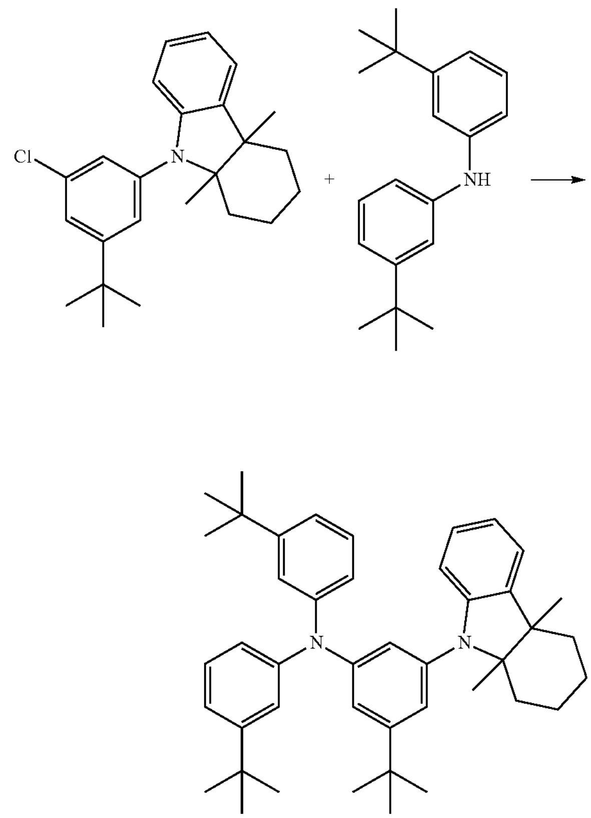

I56

6.5 g of Intermediate I56 was obtained using the same conditions as in the synthesis method of Intermediate I3 under nitrogen atmosphere (yield 65%).

MS[M+H]+=613

2) Synthesis of Compound 45

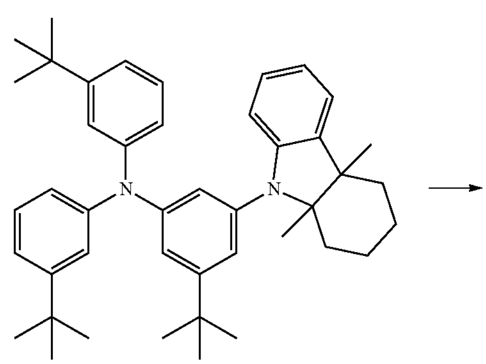

I56

-continued

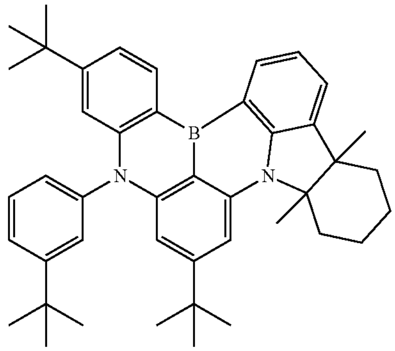

45

Under nitrogen atmosphere, 3.00 g of Intermediate I56, 5.67 g of boron triiodide, and 1.28 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.7 g of Compound 45 (yield 56.0%).

MS[M+H]+=621

Synthesis Example 46. Synthesis of Compound 46

1) Synthesis of Intermediate I57

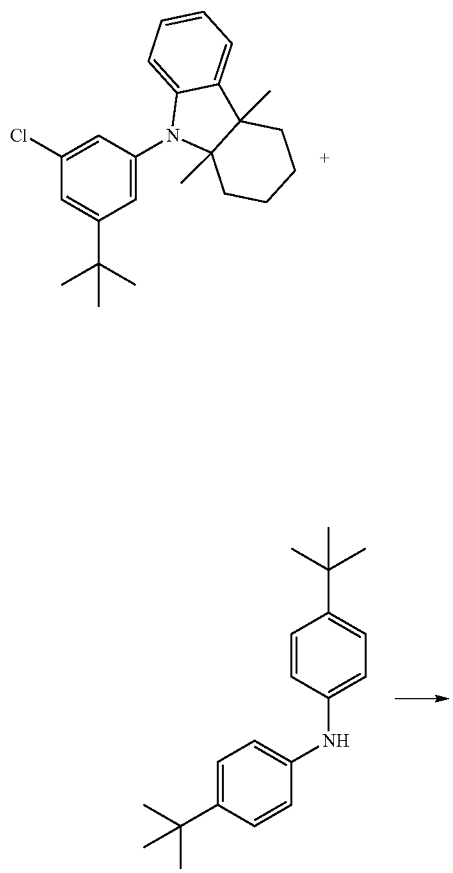

-continued

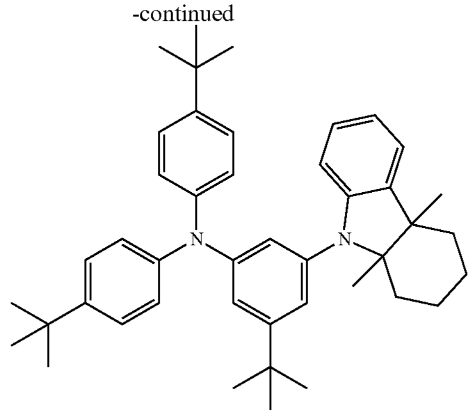

I57

6.6 g of Intermediate I57 was obtained using the same conditions as in the synthesis method of Intermediate I3 under nitrogen atmosphere (yield 66%).

MS[M+H]+=613

2) Synthesis of Compound 46

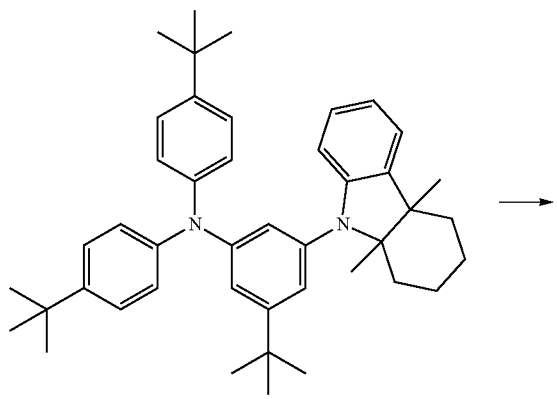

I57

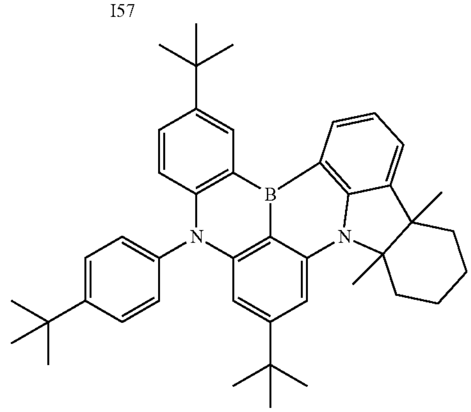

46

Under nitrogen atmosphere, 3.00 g of Intermediate I57, 5.74 g of boron triiodide, and 1.30 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.6 g of Compound 46 (yield 53.0%).

MS [M+H]+=621

Synthesis Example 47. Synthesis of Compound 47

1) Synthesis of Intermediate I58

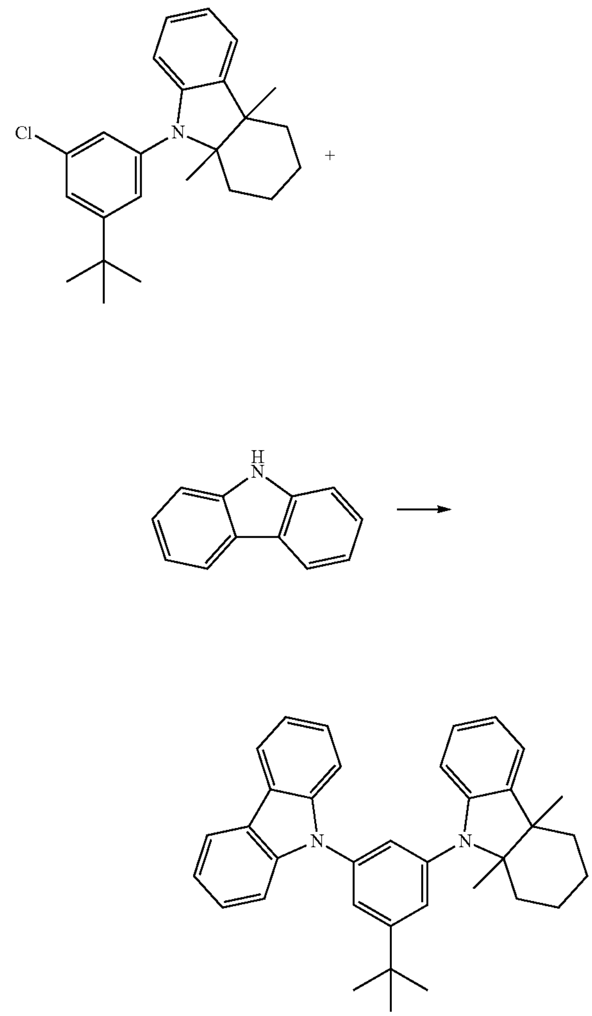

I58

6.4 g of Intermediate I58 was obtained using the same conditions as in the synthesis method of Intermediate I3 under nitrogen atmosphere (yield 79%).

MS[M+H]+=499

2) Synthesis of Compound 47

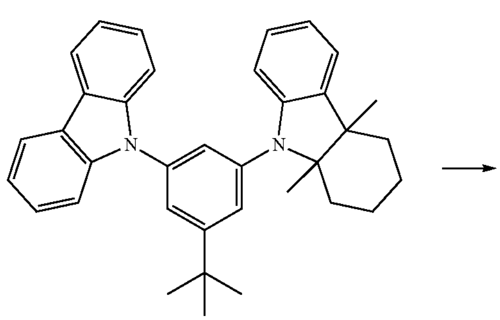

I58

-continued

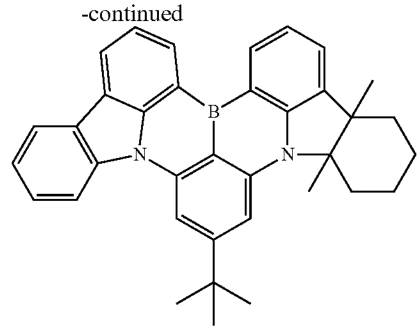

47

Under nitrogen atmosphere, 3.00 g of Intermediate I58, 7.06 g of boron triiodide, and 1.60 g of triphenylborane were stirred using dichlorobenzene at 160° C. for 6 hours.

The reaction was completed, and the resulting product was extracted at room temperature, and then column-purified with ethyl acetate:hexane, and then recrystallized to obtain 1.3 g of Compound 47 (yield 52.0%).

MS[M+H]+=507

Synthesis Example 48. Synthesis of Compound 48

1) Synthesis of Intermediate I59

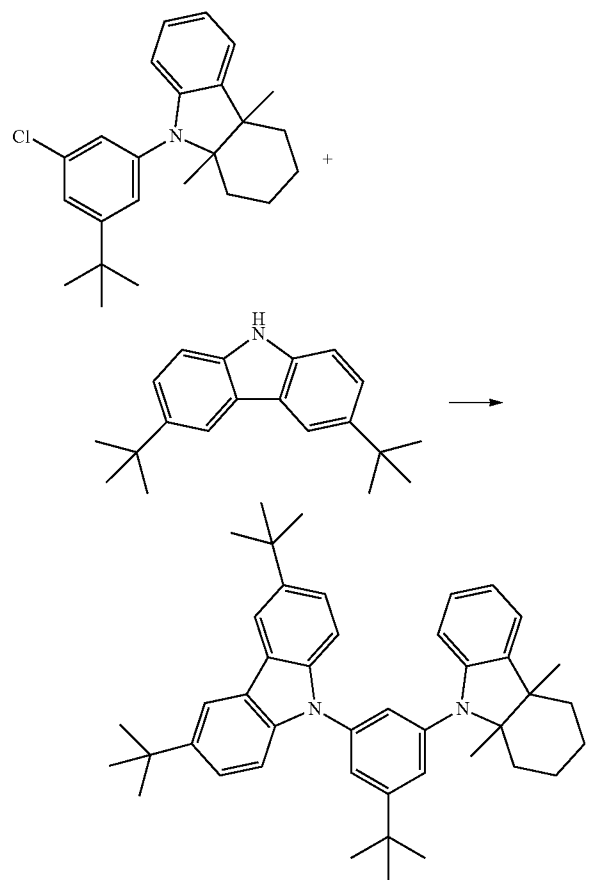

I59

6.1 g of Intermediate I59 was obtained using the same conditions as in the synthesis method of Intermediate I3 under nitrogen atmosphere (yield 61%).

MS[M+H]+=611

2) Synthesis of Compound 48

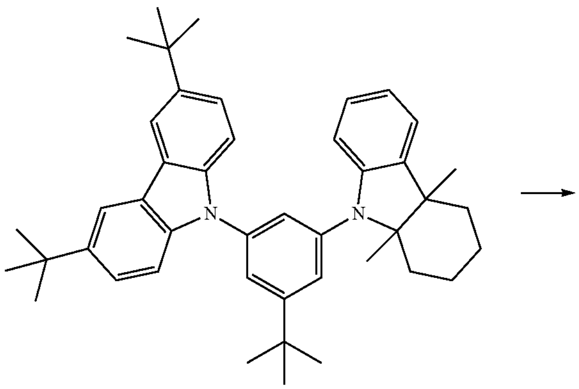

I59

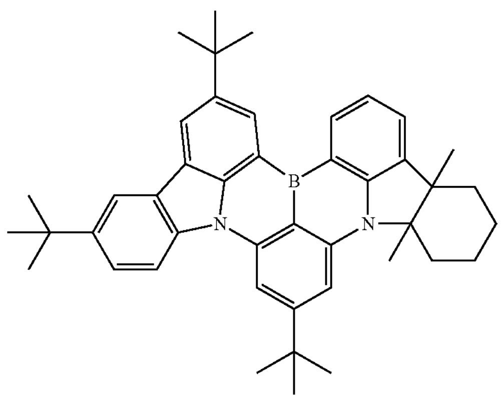

48

Under nitrogen atmosphere, 3.00 g of Intermediate I59, 5.76 g of boron triiodide, and 1.31 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.5 g of Compound 48 (yield 50.0%).

MS[M+H]+=619

Synthesis Example 49. Synthesis of Compound 49

1) Synthesis of Intermediate I60

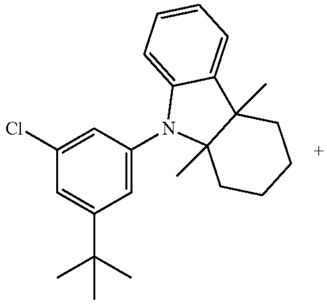

-continued

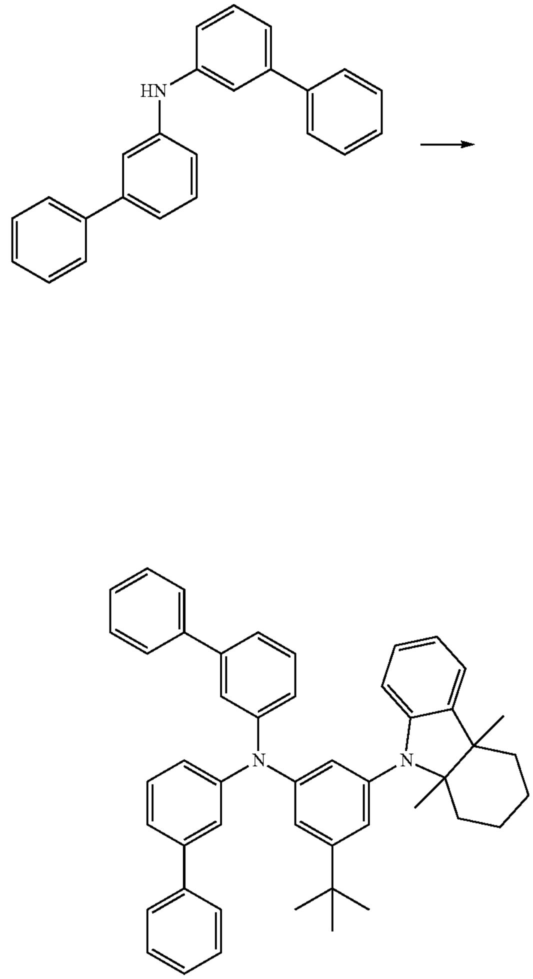

I60

7.5 g of Intermediate I60 was obtained using the same conditions as in the synthesis method of Intermediate I3 under nitrogen atmosphere (yield 70%).

MS[M+H]+=653

2) Synthesis of Compound 49

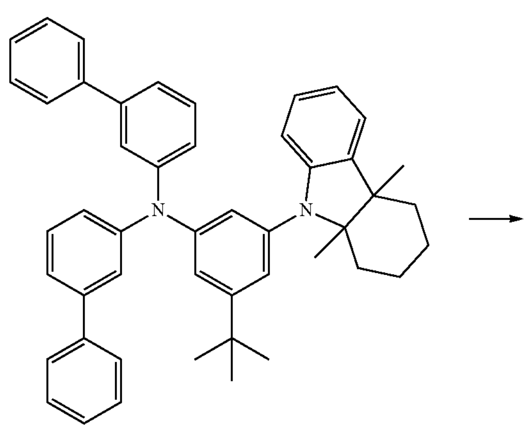

I60

-continued

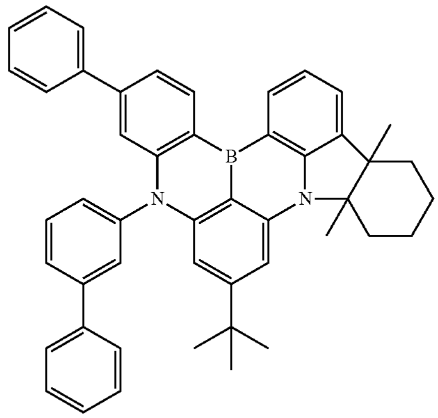

49

Under nitrogen atmosphere, 3.00 g of Intermediate I60, 5.40 g of boron triiodide, and 1.22 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.6 g of Compound 49 (yield 53.0%).

MS[M+H]+=661

Synthesis Example 50. Synthesis of Compound 50

1) Synthesis of Intermediate I61

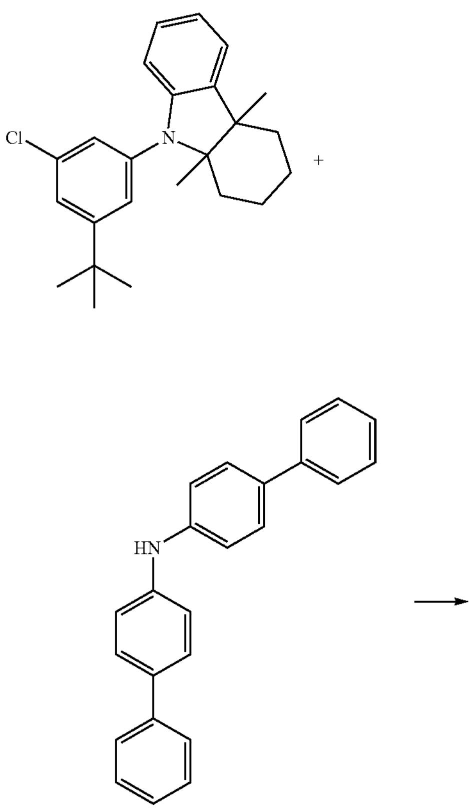

-continued

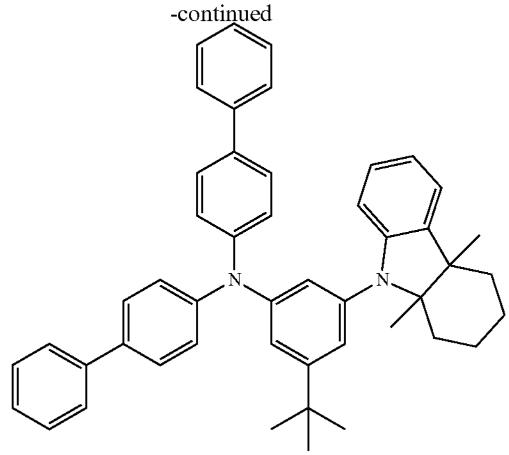

I61

7.7 g of Intermediate I61 was obtained using the same conditions as in the synthesis method of Intermediate I3 under nitrogen atmosphere (yield 72%).

MS[M+H]+=653

2) Synthesis of Compound 50

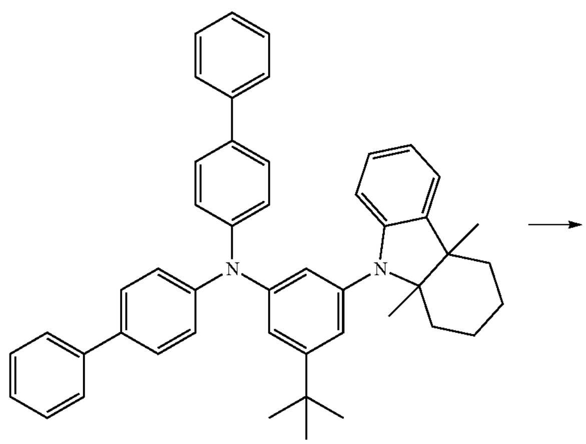

I61

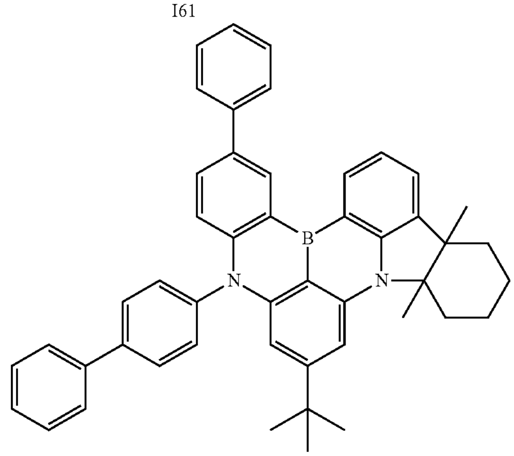

50

Under nitrogen atmosphere, 3.00 g of Intermediate I61, 5.40 g of boron triiodide, and 1.22 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.7 g of Compound 50 (yield 56.0%).

MS[M+H]+=661

Synthesis Example 51. Synthesis of Compound 51

1) Synthesis of Intermediate I62

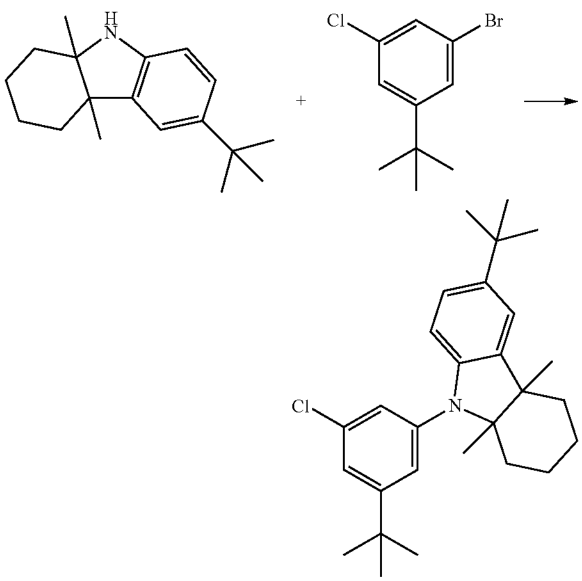

I62

40 g of Intermediate I62 was obtained using the same conditions as in the synthesis method of Intermediate I2 under nitrogen atmosphere (yield 81%).

MS[M+H]+=425

2) Synthesis of Intermediate I63

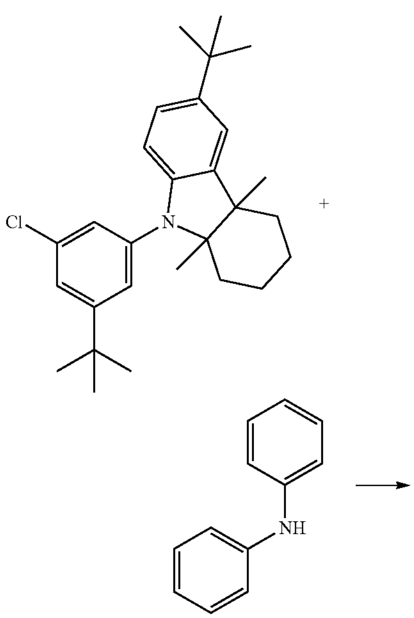

-continued

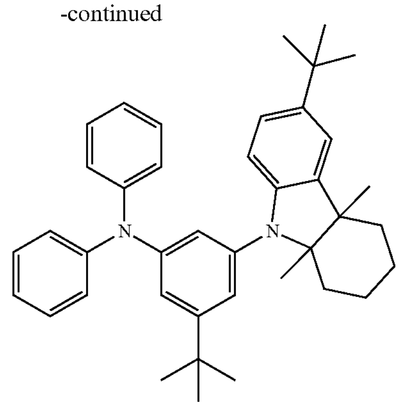

I63

6.6 g of Intermediate I63 was obtained using the same conditions as in the synthesis method of Intermediate I3 under nitrogen atmosphere (yield 84%).

MS[M+H]+=557

3) Synthesis of Compound 51

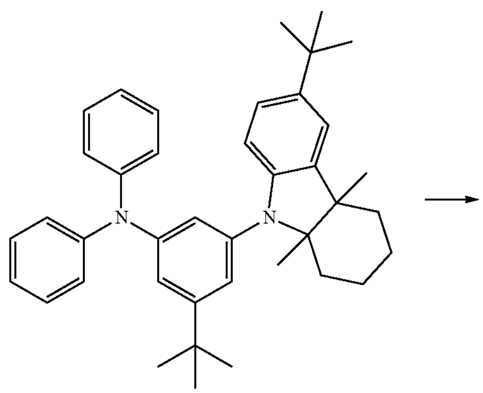

I63

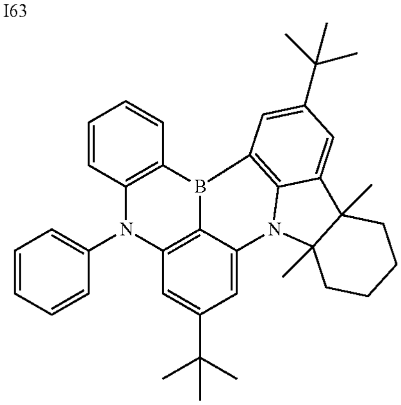

51

Under nitrogen atmosphere, 3.00 g of Intermediate I63, 6.32 g of boron triiodide, and 1.43 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.7 g of Compound 51 (yield 56.0%).

MS[M+H]+=565

Synthesis Example 52. Synthesis of Compound 52

1) Synthesis of Intermediate I64

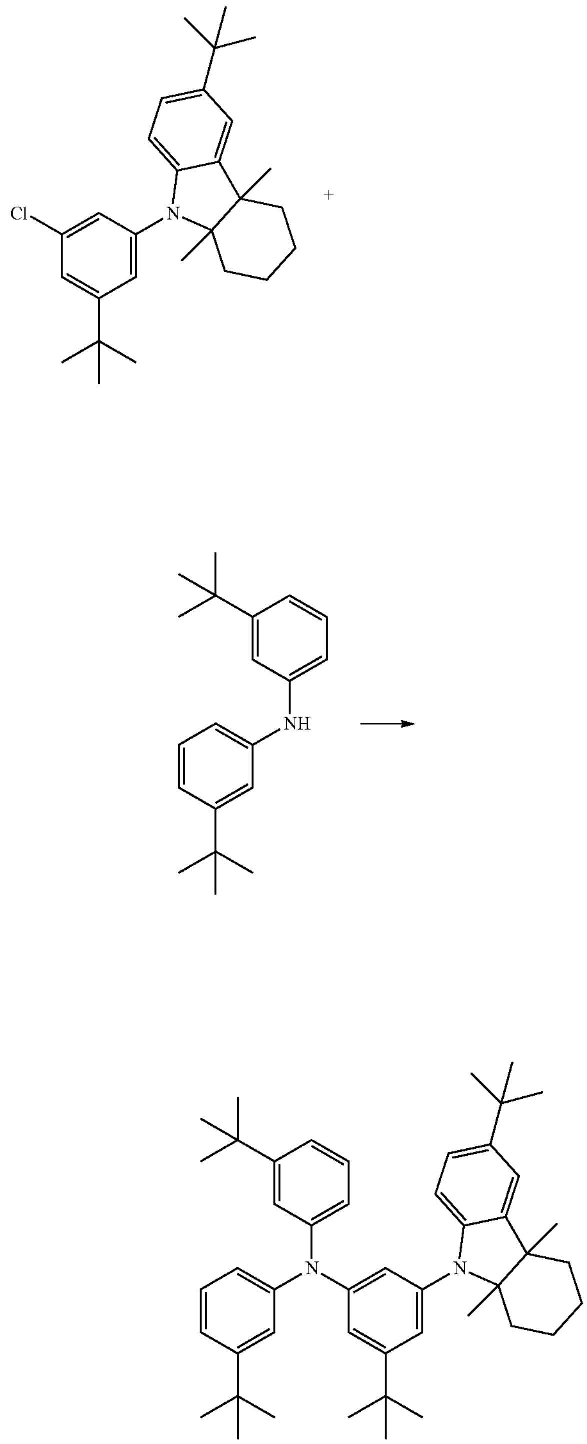

I64

6.9 g of Intermediate I64 was obtained using the same conditions as in the synthesis method of Intermediate I3 under nitrogen atmosphere (yield 73%).

MS[M+H]+=670

2) Synthesis of Compound 52

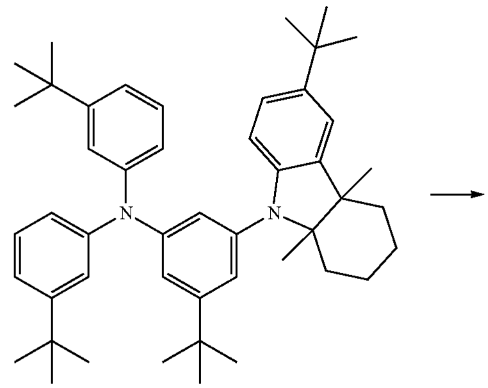

I64

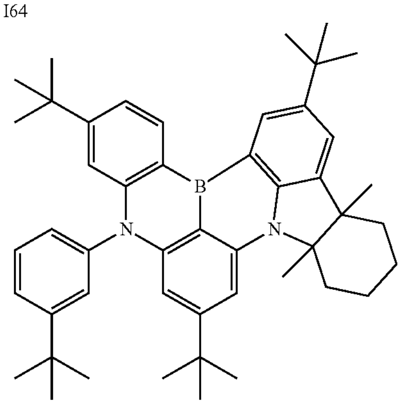

52

Under nitrogen atmosphere, 3.00 g of Intermediate I64, 5.26 g of boron triiodide, and 1.19 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.4 g of Compound 52 (yield 46.0%).

MS[M+H]+=677

Synthesis Example 53. Synthesis of Compound 53

1) Synthesis of Intermediate I65

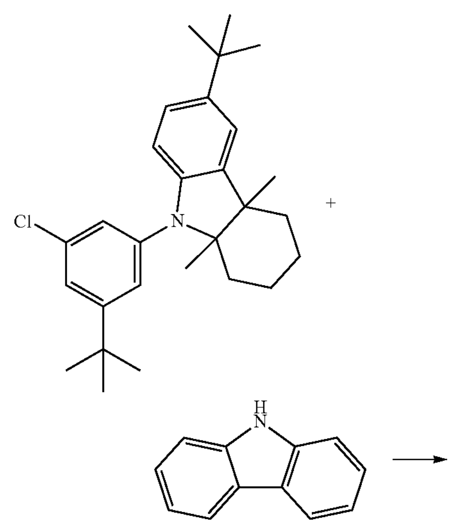

-continued

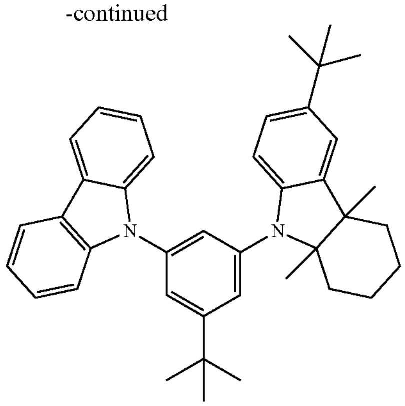

I65

5.9 g of Intermediate I65 was obtained using the same conditions as in the synthesis method of Intermediate I3 under nitrogen atmosphere (yield 75%).

MS[M+H]+=555

2) Synthesis of Compound 53

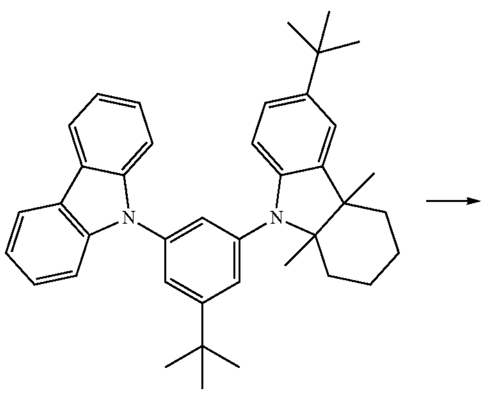

I65

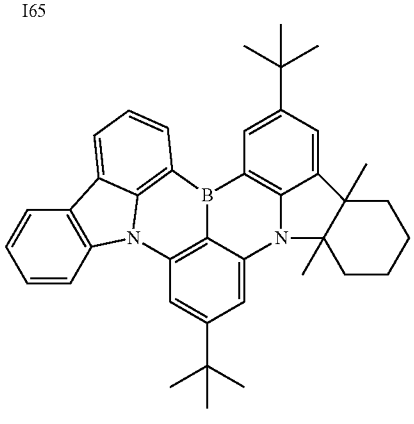

53

Under nitrogen atmosphere, 3.00 g of Intermediate I65, 6.35 g of boron triiodide, and 1.44 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.3 g of Compound 53 (yield 43.0%).

MS[M+H]+=563

Synthesis Example 54. Synthesis of Compound 54

1) Synthesis of Intermediate I66

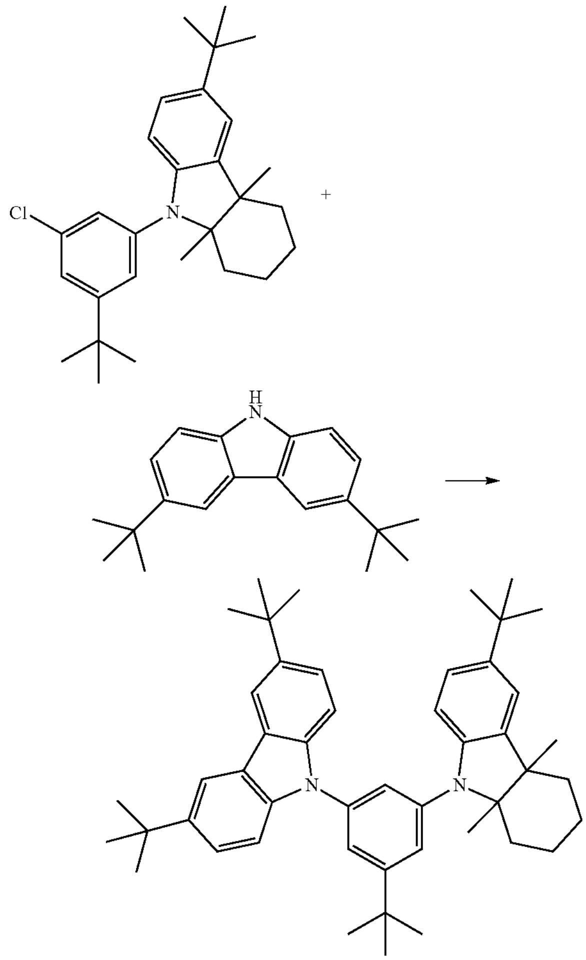

I66

6.6 g of Intermediate I66 was obtained using the same conditions as in the synthesis method of Intermediate I3 under nitrogen atmosphere (yield 70%).

MS[M+H]+=668

2) Synthesis of Compound 54

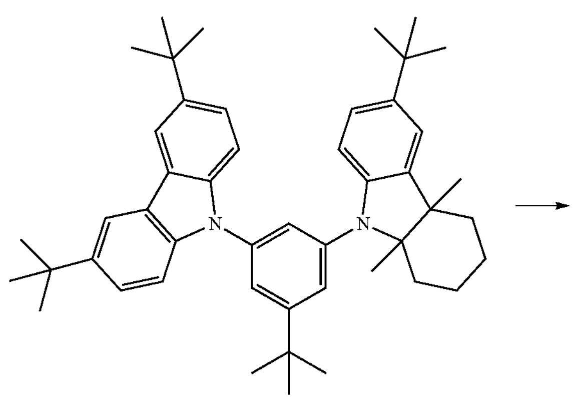

I66

-continued

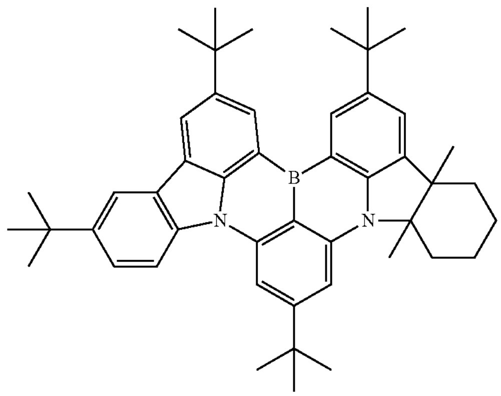

54

Under nitrogen atmosphere, 3.00 g of Intermediate I66, 6.35 g of boron triiodide, and 1.44 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.4 g of Compound 54 (yield 46.0%).

MS[M+H]+=675

Synthesis Example 55. Synthesis of Compound 55

1) Synthesis of Intermediate I67

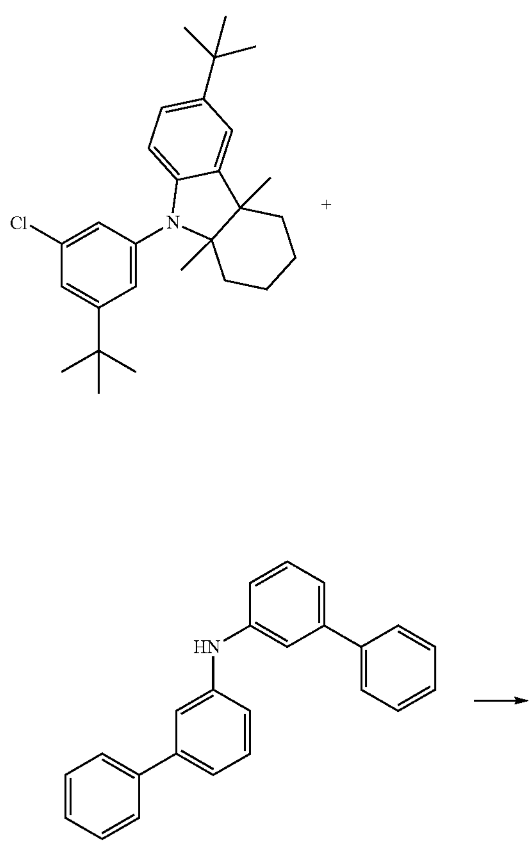

-continued

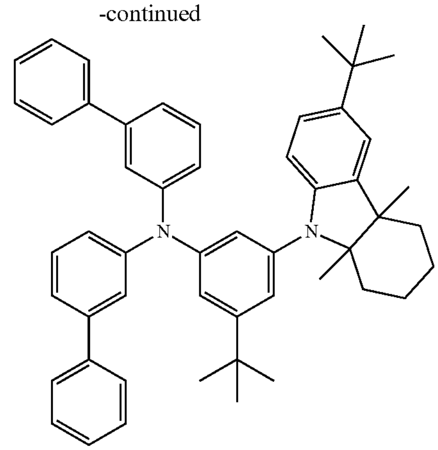

I67

7.6 g of Intermediate I67 was obtained using the same conditions as in the synthesis method of Intermediate I3 under nitrogen atmosphere (yield 76%).

MS[M+H]+=710

2) Synthesis of Compound 55

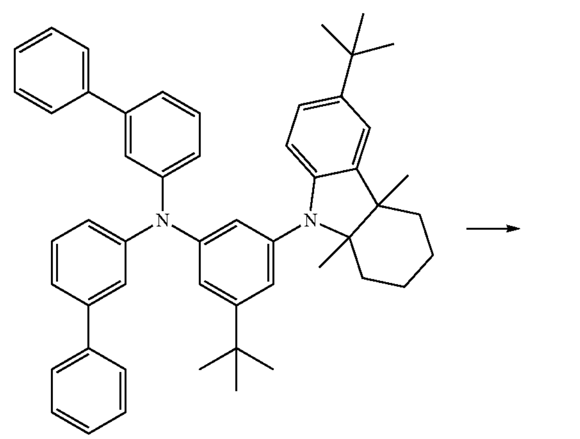

I67

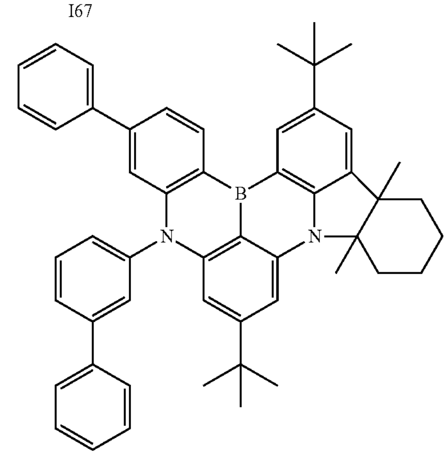

55

Under nitrogen atmosphere, 3.00 g of Intermediate I67, 4.97 g of boron triiodide, and 1.13 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.6 g of Compound 55 (yield 53.0%).

MS[M+H]+=717

Synthesis Example 56. Synthesis of Compound 56

1) Synthesis of Intermediate I68

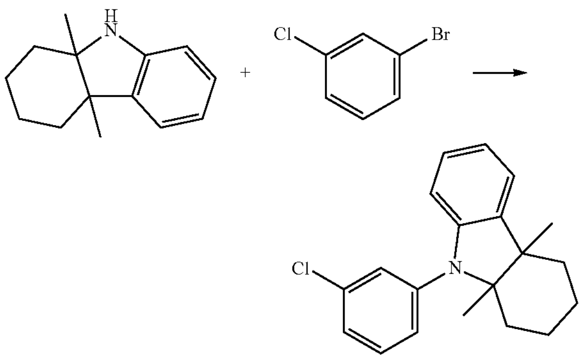

I68

38 g of Intermediate I68 was obtained using the same conditions as in the synthesis method of Intermediate I2 under nitrogen atmosphere (yield 82%).

MS[M+H]+=312

2) Synthesis of Intermediate I69

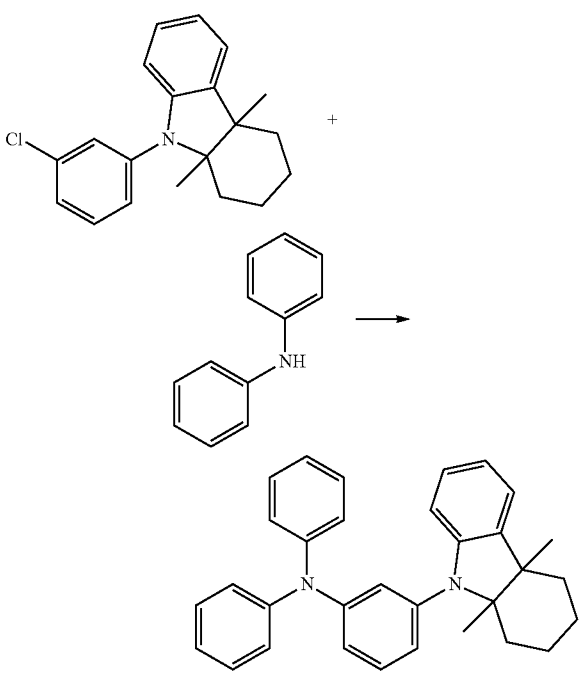

I69

7.1 g of Intermediate I69 was obtained using the same conditions as in the synthesis method of Intermediate I3 under nitrogen atmosphere (yield 83%).

MS [M+H]+=445

3) Synthesis of Compound 56

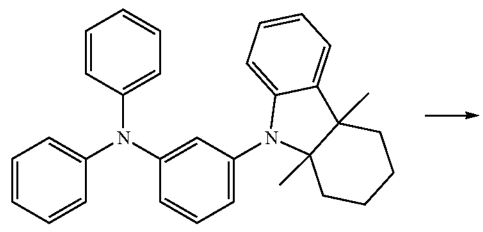

I69

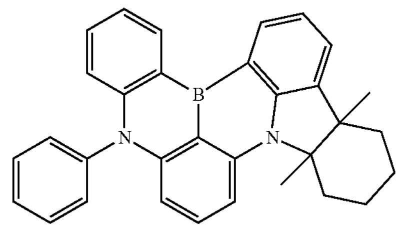

56

Under nitrogen atmosphere, 3.00 g of Intermediate I69, 6.32 g of boron triiodide, and 1.43 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.4 g of Compound 56 (yield 46.0%).

MS[M+H]+=453

Synthesis Example 57. Synthesis of Compound 57

1) Synthesis of Intermediate I70

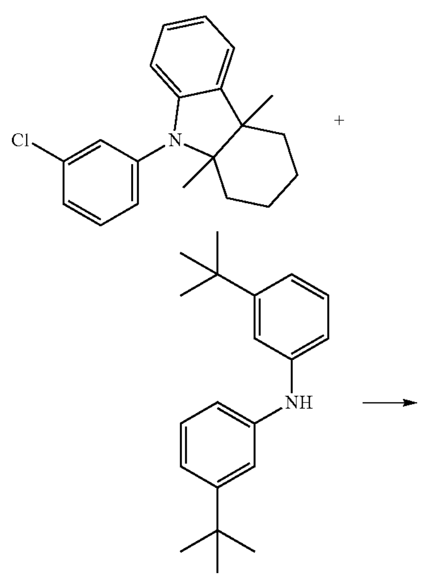

-continued

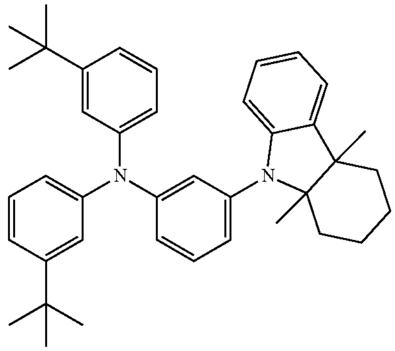

I70

7.2 g of Intermediate I70 was obtained using the same conditions as in the synthesis method of Intermediate I3 under nitrogen atmosphere (yield 67%).

MS[M+H]+=557

2) Synthesis of Compound 57

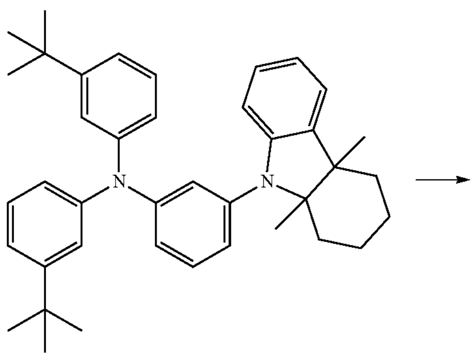

I70

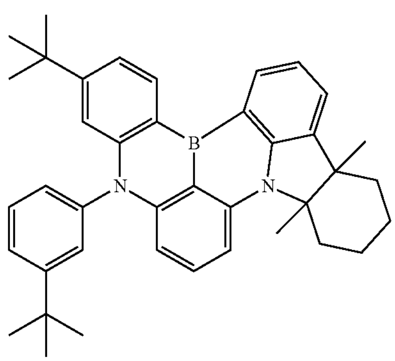

57

Under nitrogen atmosphere, 3.00 g of Intermediate I70, 6.32 g of boron triiodide, and 1.43 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.5 g of Compound 57 (yield 49.0%).

MS[M+H]+=565

Synthesis Example 58. Synthesis of Compound 58

1) Synthesis of Intermediate I71

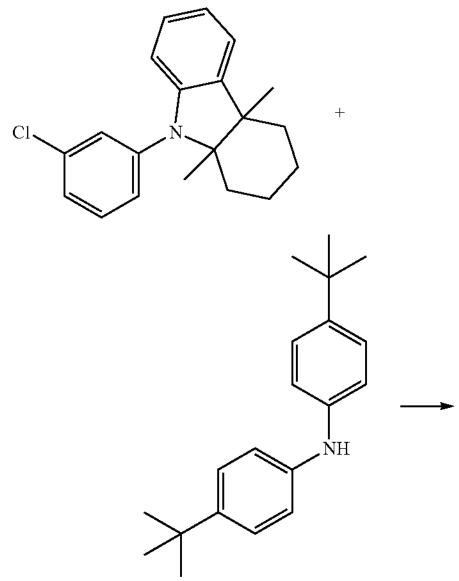

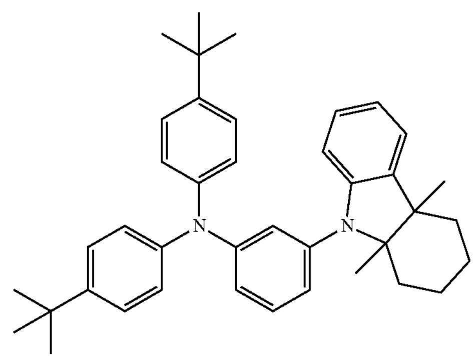

I71

7.1 g of Intermediate I71 was obtained using the same conditions as in the synthesis method of Intermediate I3 under nitrogen atmosphere (yield 66%).

MS[M+H]+=557

2) Synthesis of Compound 58

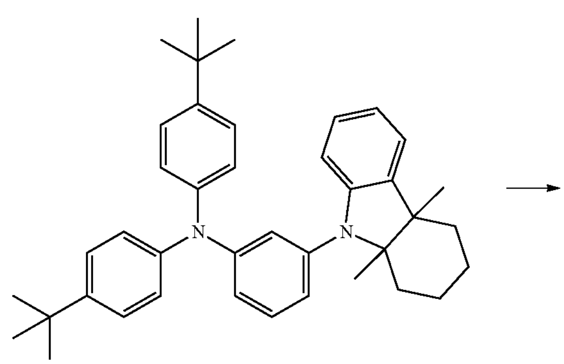

I71

-continued

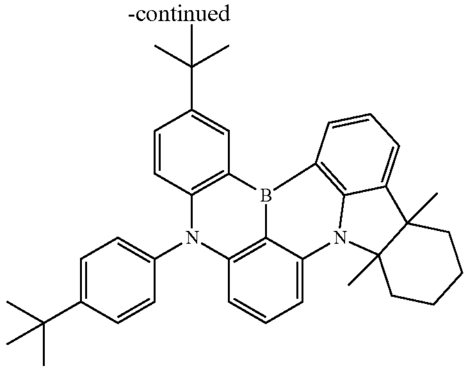

58

Under nitrogen atmosphere, 3.00 g of Intermediate I71, 6.32 g of boron triiodide, and 1.43 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.4 g of Compound 58 (yield 46.0%).

MS [M+H]+=565

Synthesis Example 59. Synthesis of Compound 59

1) Synthesis of Intermediate I72

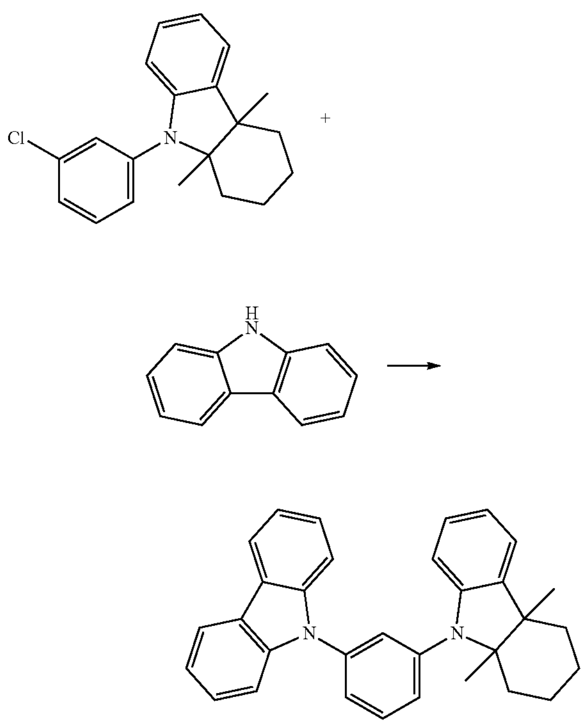

I72

7.1 g of Intermediate I72 was obtained using the same conditions as in the synthesis method of Intermediate I3 under nitrogen atmosphere (yield 83%).

MS[M+H]+=443

2) Synthesis of Compound 59

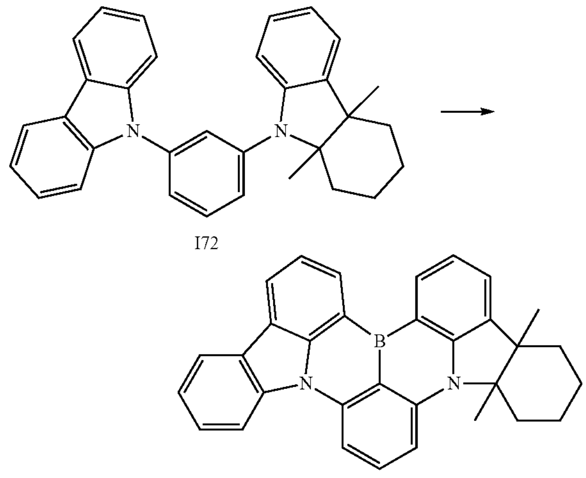

I72

59

Under nitrogen atmosphere, 3.00 g of Intermediate I72, 7.96 g of boron triiodide, and 1.80 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.3 g of Compound 59 (yield 43.0%).

MS [M+H]+=451

Synthesis Example 60. Synthesis of Compound 60

1) Synthesis of Intermediate I73

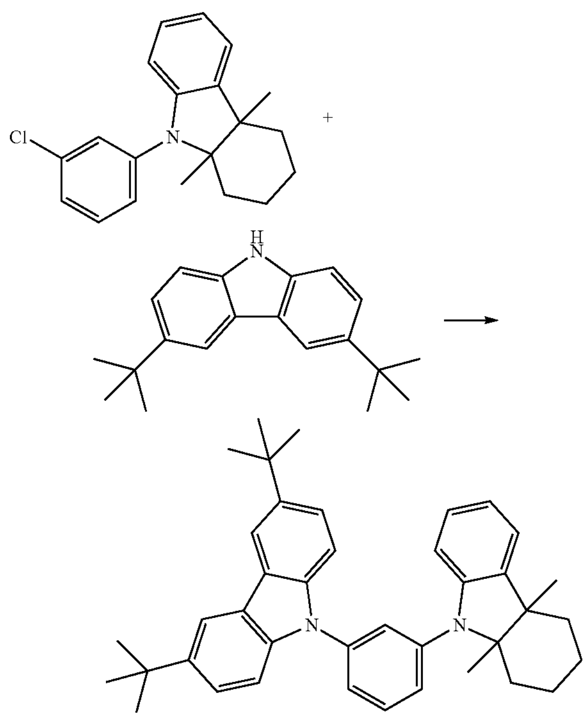

I73

7.7 g of Intermediate I73 was obtained using the same conditions as in the synthesis method of Intermediate I3 under nitrogen atmosphere (yield 72%).

MS[M+H]+=554

2) Synthesis of Compound 60

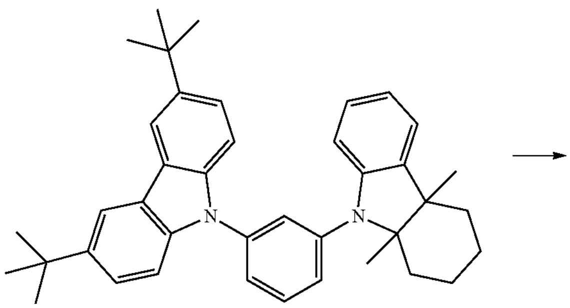

I73

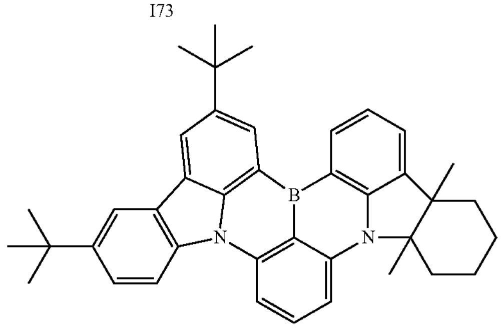

60

Under nitrogen atmosphere, 3.00 g of Intermediate I73, 6.35 g of boron triiodide, and 1.44 g of triphenylborane were stirred using dichlorobenzene at 160° C. for 6 hours.

The reaction was completed, and the resulting product was extracted at room temperature, and then column-purified with ethyl acetate:hexane, and then recrystallized to obtain 1.5 g of Compound 60 (yield 49.0%).

MS[M+H]+=563

Synthesis Example 61. Synthesis of Compound 61

1) Synthesis of Intermediate I74

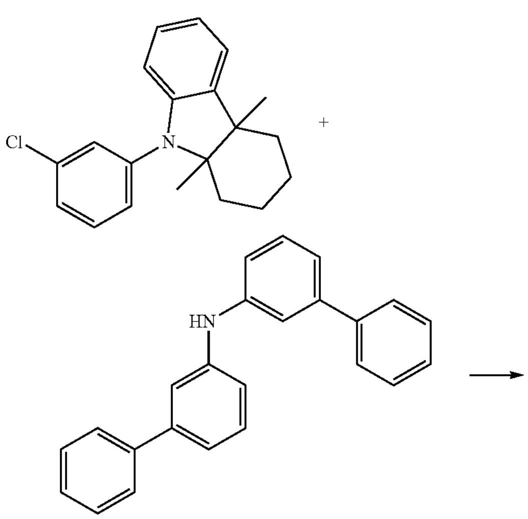

-continued

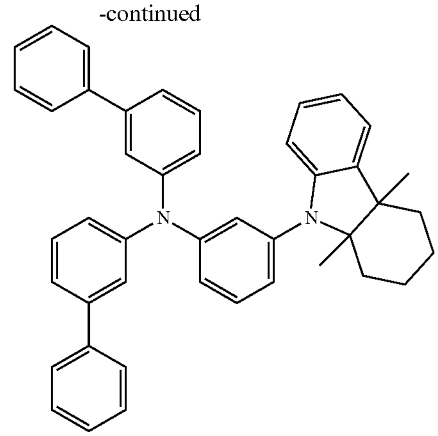

I74

8.3 g of Intermediate I74 was obtained using the same conditions as in the synthesis method of Intermediate I3 under nitrogen atmosphere (yield 72%).

MS[M+H]+=597

2) Synthesis of Compound 61

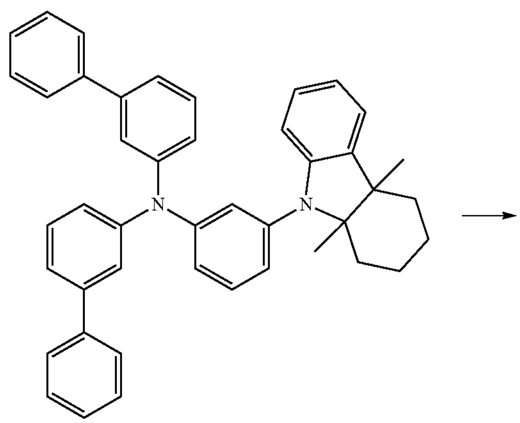

I74

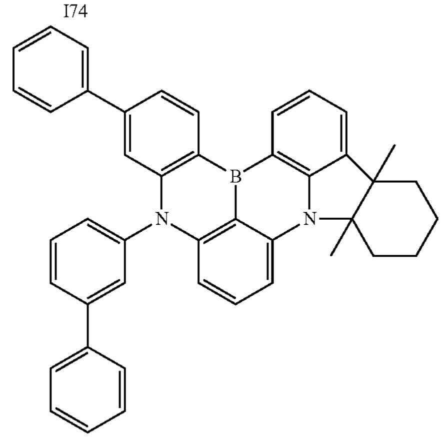

61

Under nitrogen atmosphere, 3.00 g of Intermediate I74, 5.90 g of boron triiodide, and 1.34 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.4 g of Compound 61 (yield 46.0%).

MS[M+H]+=605

Synthesis Example 62. Synthesis of Compound 62

1) Synthesis of Intermediate I75

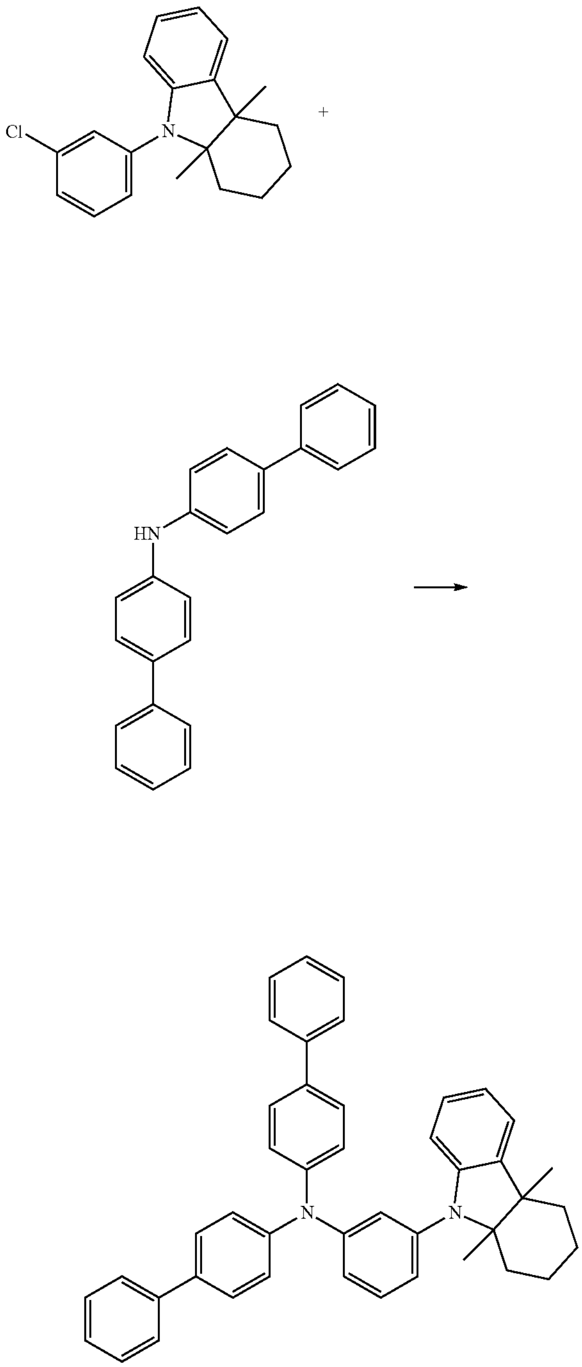

I75

8.4 g of Intermediate I75 was obtained using the same conditions as in the synthesis method of Intermediate I3 under nitrogen atmosphere (yield 73%).

MS[M+H]+=597

2) Synthesis of Compound 62

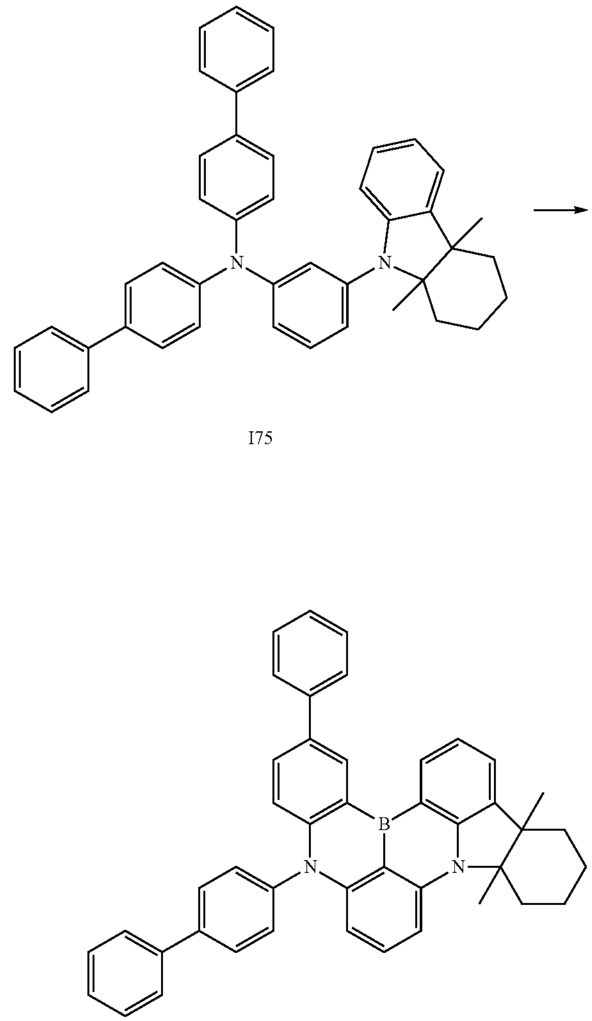

I75

62

Under nitrogen atmosphere, 3.00 g of Intermediate I75, 5.90 g of boron triiodide, and 1.34 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.4 g of Compound 62 (yield 46.0%).

MS[M+H]+=605

Synthesis Example 63. Synthesis of Compound 63

1) Synthesis of Intermediate I76

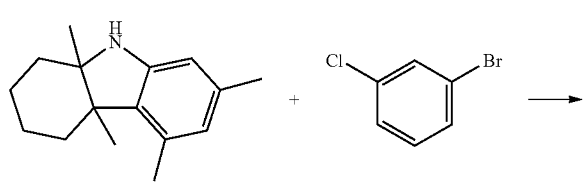

-continued

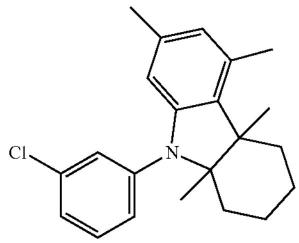

I76

39 g of Intermediate I76 was obtained using the same conditions as in the synthesis method of Intermediate I2 under nitrogen atmosphere (yield 88%).

MS[M+H]+=340

2) Synthesis of Intermediate I77

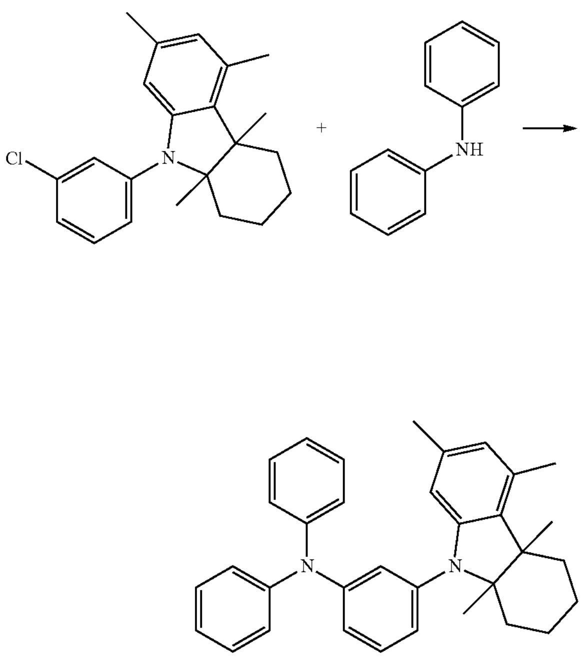

I77

6.6 g of Intermediate I77 was obtained using the same conditions as in the synthesis method of Intermediate I3 under nitrogen atmosphere (yield 79%).

MS[M+H]+=473

3) Synthesis of Compound 63

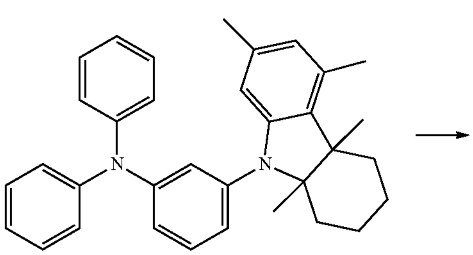

-continued

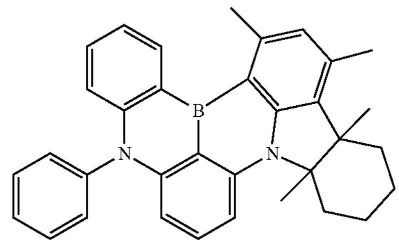

63

Under nitrogen atmosphere, 3.00 g of Intermediate I77, 7.45 g of boron triiodide, and 1.69 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.3 g of Compound 63 (yield 43.0%).

MS[M+H]+=481

Synthesis Example 64. Synthesis of Compound 64

1) Synthesis of Intermediate I78

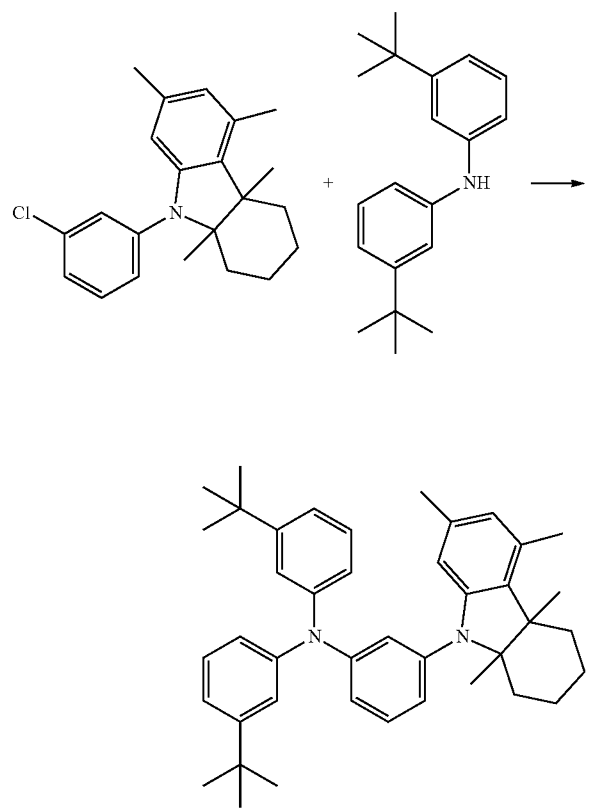

I78

8.1 g of Intermediate I78 was obtained using the same conditions as in the synthesis method of Intermediate I3 under nitrogen atmosphere (yield 78%).

MS [M+H]+=585

2) Synthesis of Compound 64

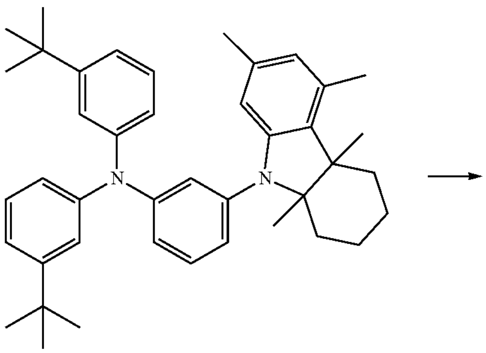

I78

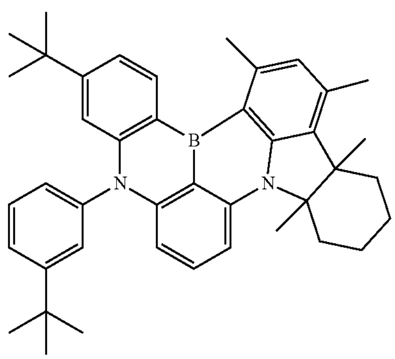

64

Under nitrogen atmosphere, 3.00 g of Intermediate I78, 6.02 g of boron triiodide, and 1.37 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.4 g of Compound 64 (yield 46.0%).

MS[M+H]+=593

Synthesis Example 65. Synthesis of Compound 65

1) Synthesis of Intermediate I79

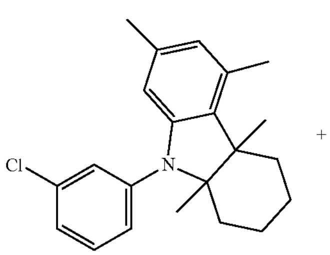

-continued

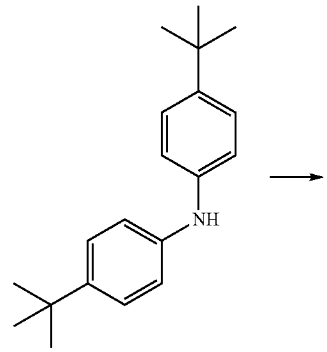

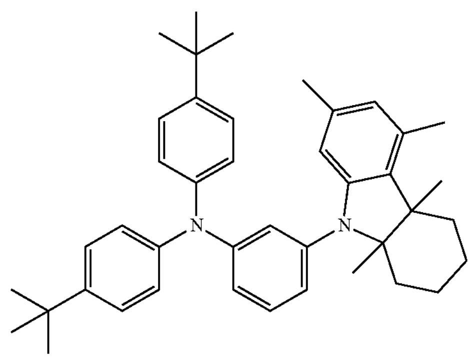

I79

8.0 g of Intermediate I79 was obtained using the same conditions as in the synthesis method of Intermediate I3 under nitrogen atmosphere (yield 77%).

MS[M+H]+=585

2) Synthesis of Compound 65

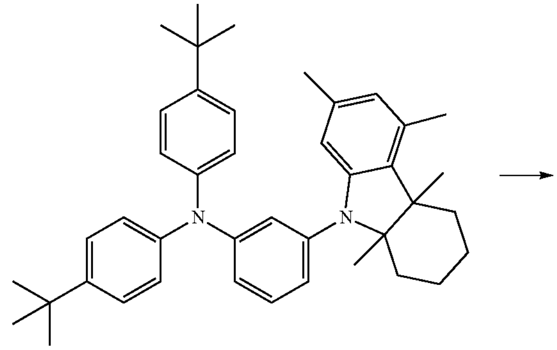

I79

-continued

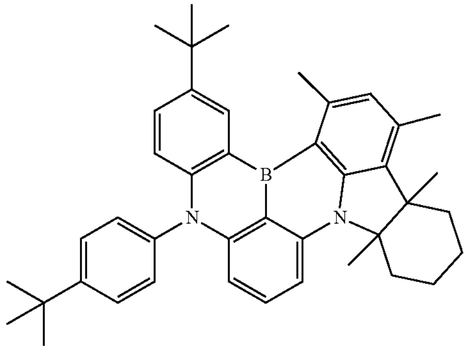

65

Under nitrogen atmosphere, 3.00 g of Intermediate I79, 6.02 g of boron triiodide, and 1.37 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.3 g of Compound 65 (yield 43.0%).

MS [M+H]+=593

Synthesis Example 66. Synthesis of Compound 66

1) Synthesis of Intermediate I80

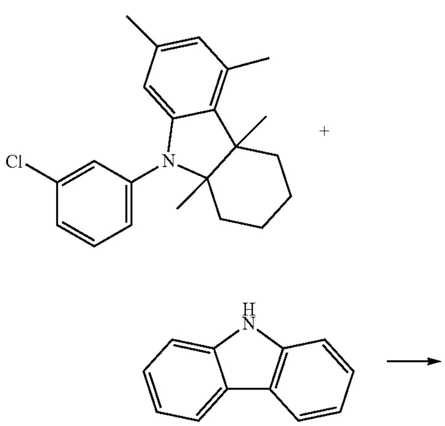

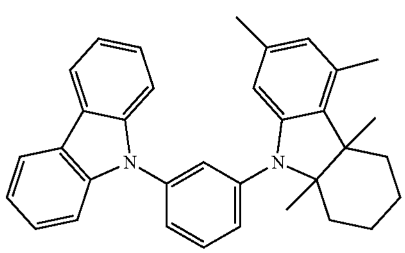

I80

7.1 g of Intermediate I80 was obtained using the same conditions as in the synthesis method of Intermediate I3 under nitrogen atmosphere (yield 85%).

MS[M+H]+=471

2) Synthesis of Compound 66

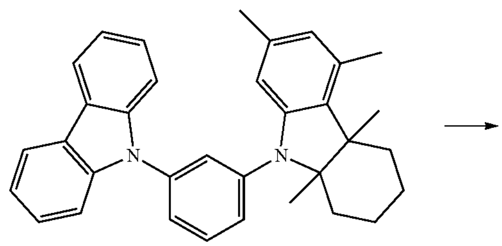

I80

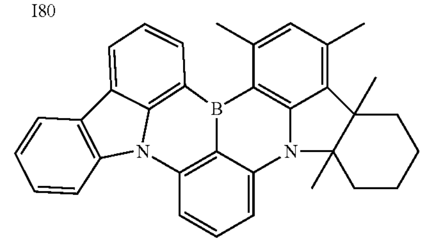

66

Under nitrogen atmosphere, 3.00 g of Intermediate I80, 7.49 g of boron triiodide, and 1.70 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.2 g of Compound 66 (yield 39.0%).

MS [M+H]+=479

Synthesis Example 67. Synthesis of Compound 67

1) Synthesis of Intermediate I81

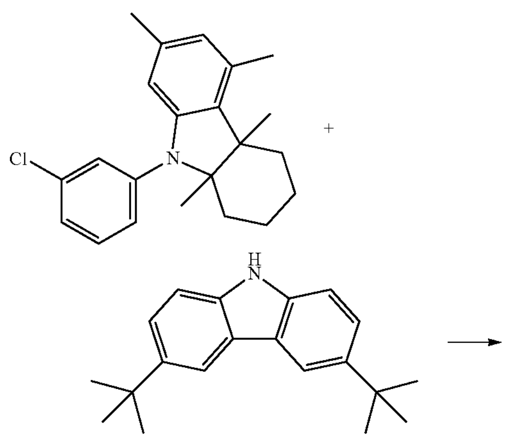

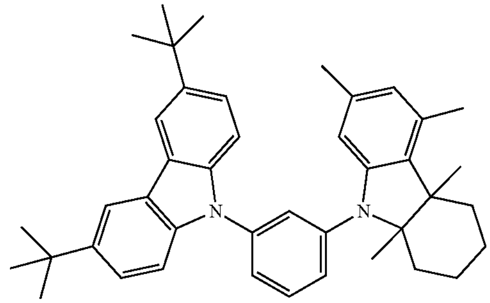

I81

7.7 g of Intermediate I81 was obtained using the same conditions as in the synthesis method of Intermediate I3 under nitrogen atmosphere (yield 75%).

MS[M+H]+=583

2) Synthesis of Compound 67

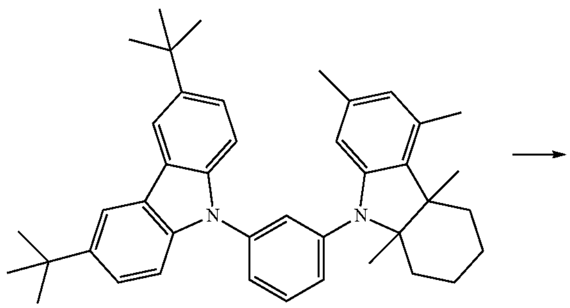

I81

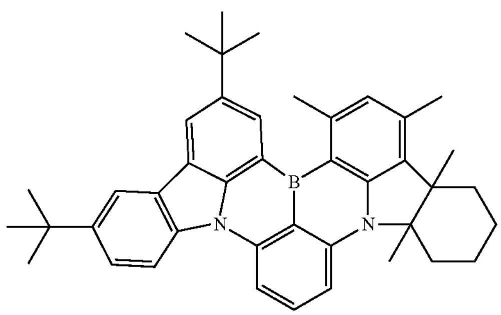

67

Under nitrogen atmosphere, 3.00 g of Intermediate I81, 6.05 g of boron triiodide, and 1.37 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.3 g of Compound 67 (yield 43.0%).

MS[M+H]+=591

Synthesis Example 68. Synthesis of Compound 68

1) Synthesis of Intermediate I82

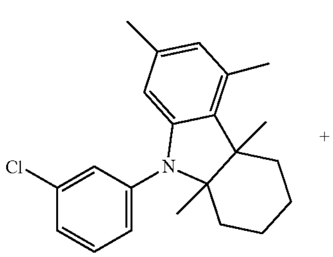

-continued

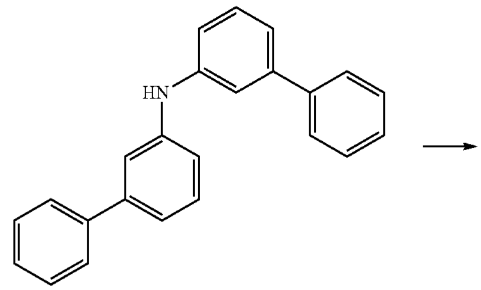

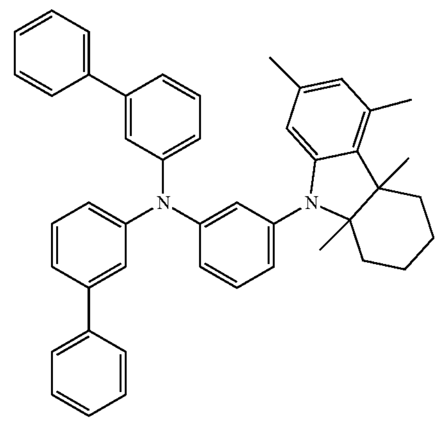

I82

8.1 g of Intermediate I82 was obtained using the same conditions as in the synthesis method of Intermediate I3 under nitrogen atmosphere (yield 73%).

MS [M+H]+=625

2) Synthesis of Compound 68

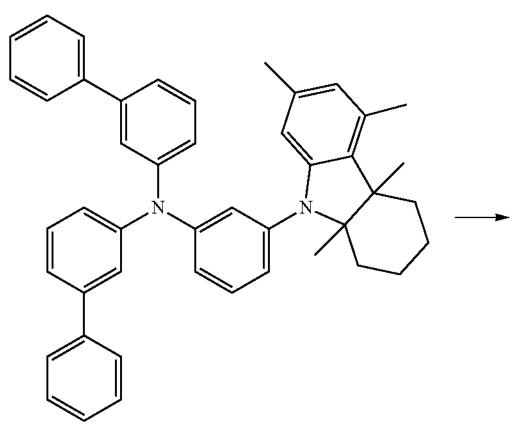

I82

-continued

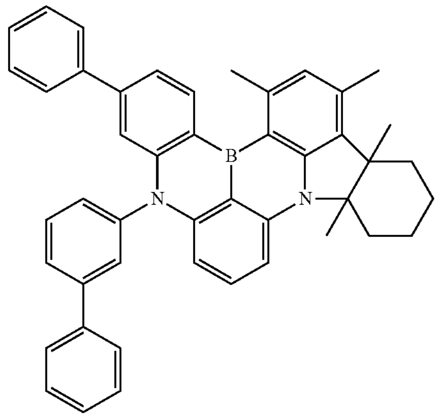

68

Under nitrogen atmosphere, 3.00 g of Intermediate I82, 5.64 g of boron triiodide, and 1.28 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.3 g of Compound 68 (yield 43.0%).

MS[M+H]+=633

Synthesis Example 69. Synthesis of Compound 69

1) Synthesis of Intermediate I83

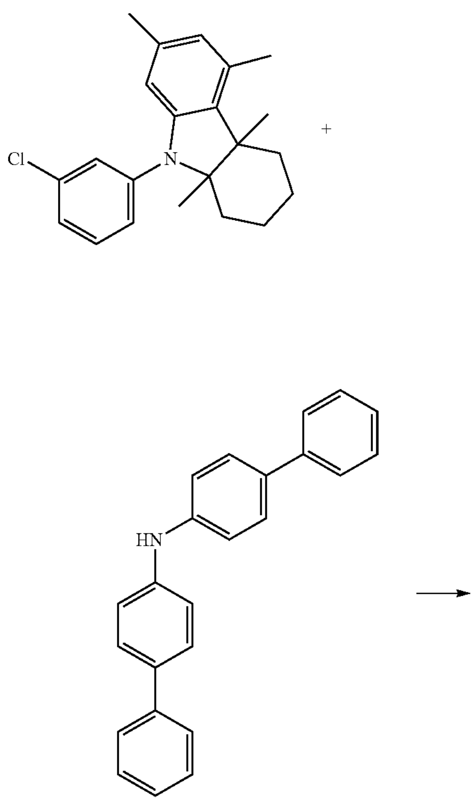

-continued

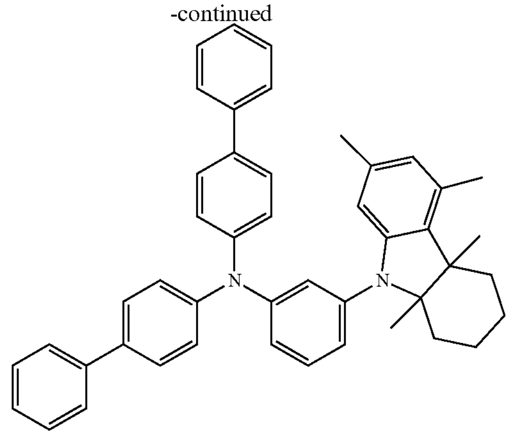

I83

8.0 g of Intermediate I83 was obtained using the same conditions as in the synthesis method of Intermediate I3 under nitrogen atmosphere (yield 73%).

MS[M+H]+=625

2) Synthesis of Compound 69

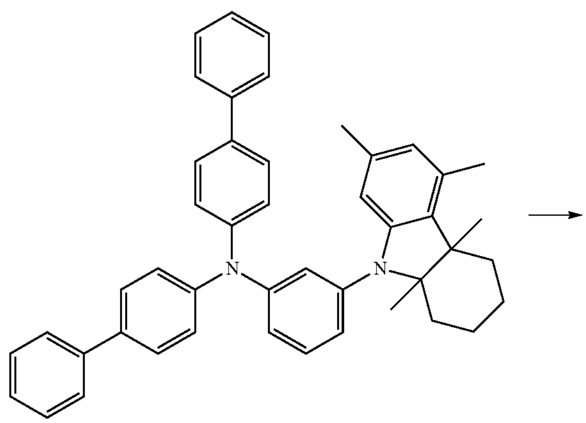

I83

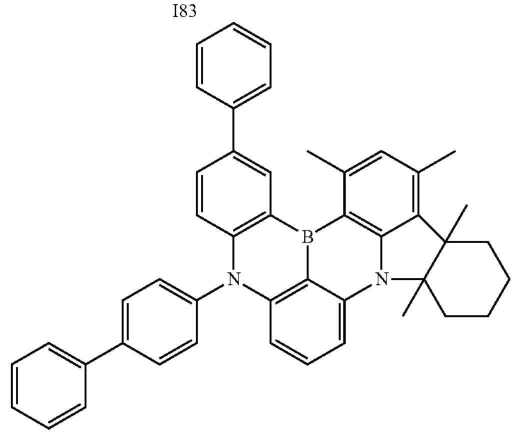

69

Under nitrogen atmosphere, 3.00 g of Intermediate I83, 5.64 g of boron triiodide, and 1.28 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 1.4 g of Compound 69 (yield 46.0%).

MS[M+H]+=633

Synthesis Example 70. Synthesis of Compound 70

1) Synthesis of Intermediate I84

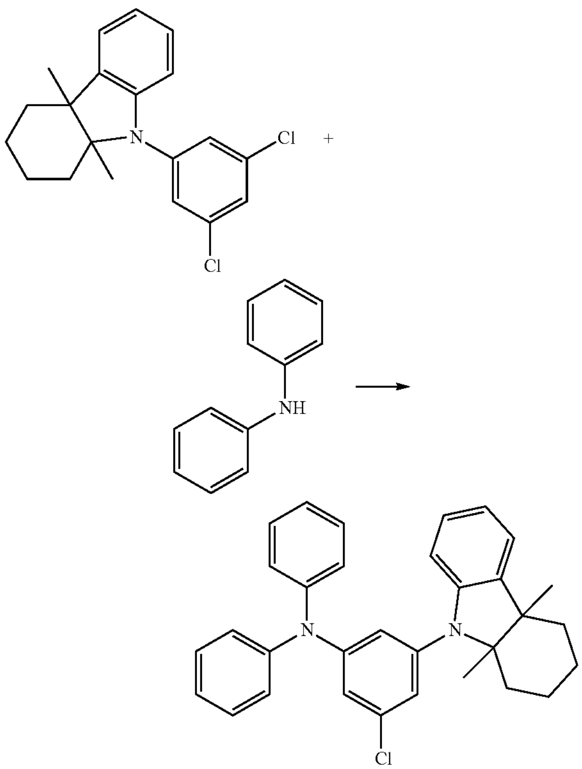

I84

After 40 g of Intermediate I4, 19.56 g of diphenylamine, 33.28 g of sodium-tert-butoxide, and 0.56 g of bis(tri-tert-butylphosphine)palladium(0) were put into 800 ml of toluene under nitrogen atmosphere, the resulting mixture was stirred for 3 hours. After the completion of the reaction, the resulting product was extracted, and then purified with an ethyl acetate:hexane column to obtain 48 g of Intermediate I84 (yield 87%).

MS[M+H]+=480

2) Synthesis of Intermediate I85

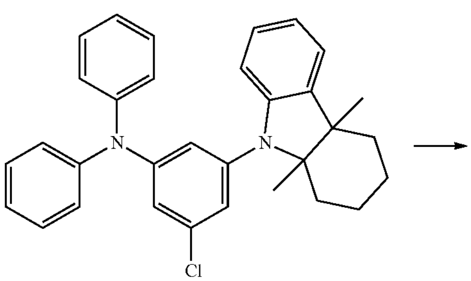

I84

-continued

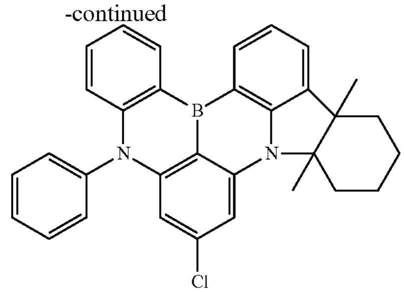

I85

Under nitrogen atmosphere, 30 g of Intermediate I84, 73.55 g of boron triiodide, and 16.65 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 14.5 g of Intermediate I85 (yield 48.0%).

MS[M+H]+=487

3) Synthesis of Compound 70

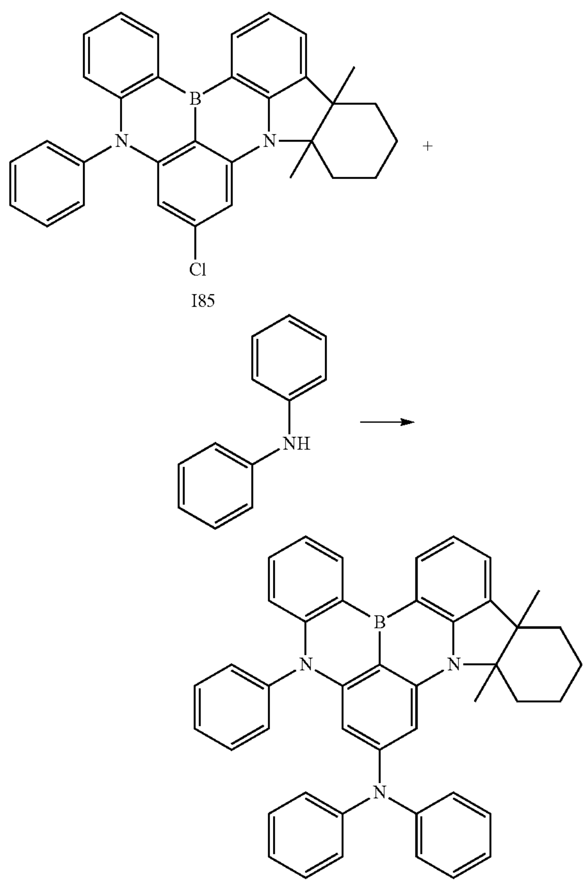

I85

70

After 2 g of Intermediate I85, 0.69 g of diphenylamine, 1.18 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 2.0 g of Compound 70 (yield 79%).

MS[M+H]+=620

Synthesis Example 71. Synthesis of Compound 71

1) Synthesis of Compound 71

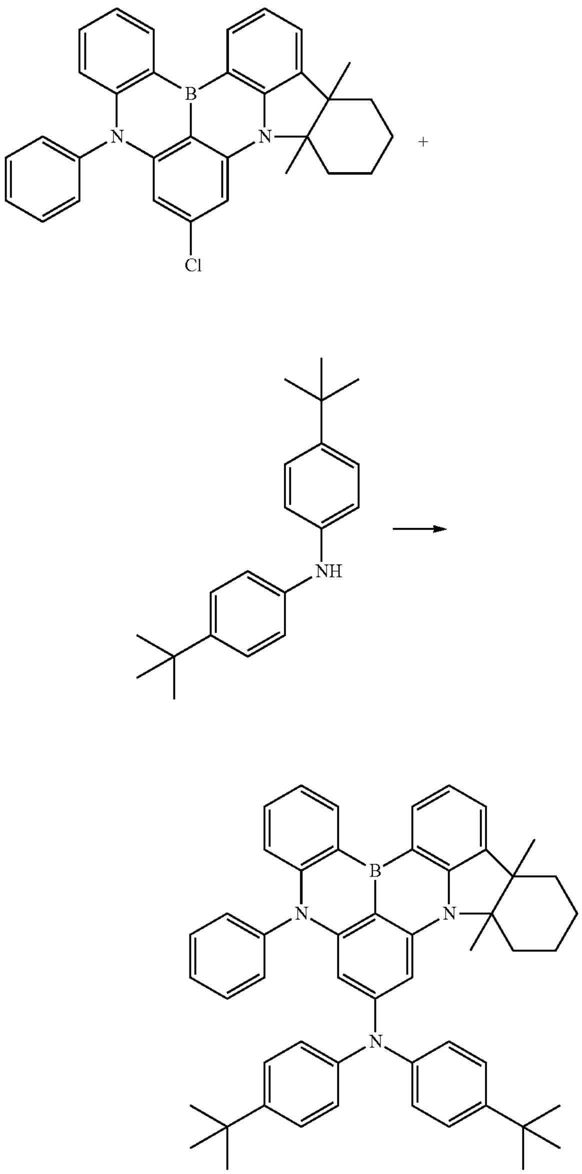

71

After 2 g of Intermediate I85, 1.16 g of bis(4-(tert-butyl)phenyl)amine, 1.18 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 2.3 g of Compound 71 (yield 77%).

MS[M+H]+=732

Synthesis Example 72. Synthesis of Compound 72

1) Synthesis of Compound 72

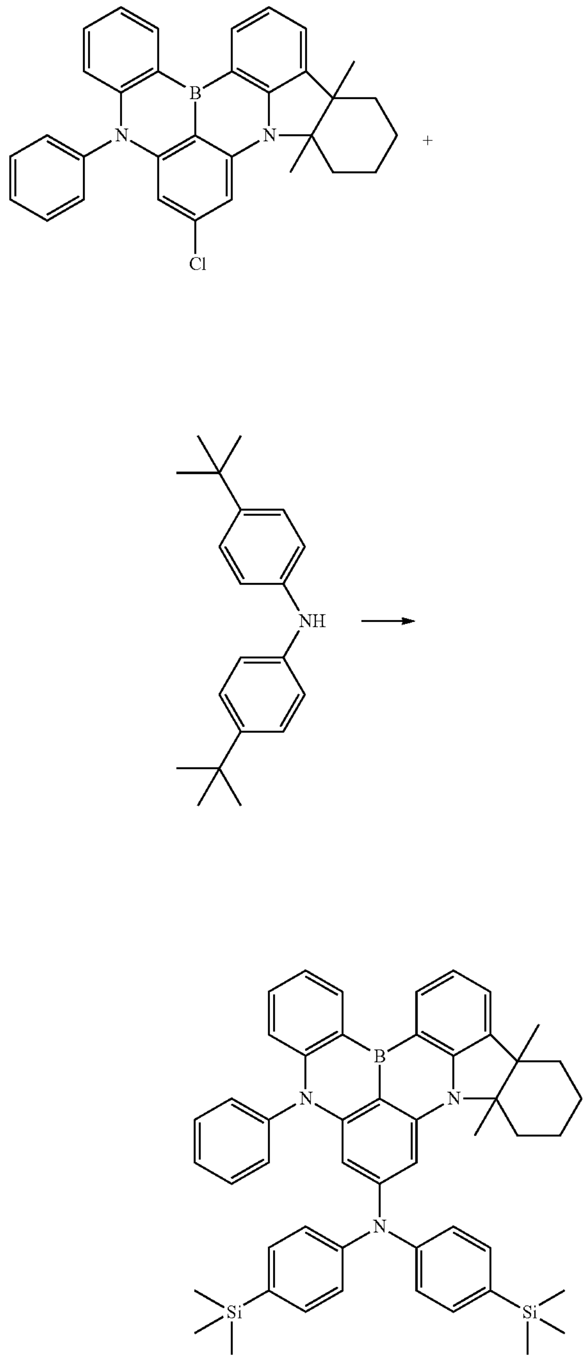

72

After 2 g of Intermediate I85, 1.29 g of bis(4-(trimethylsilyl)phenyl)amine, 1.18 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 2.4 g of Compound 72 (yield 76%).

MS [M+H]+=764

Synthesis Example 73. Synthesis of Compound 73

1) Synthesis of Compound 73

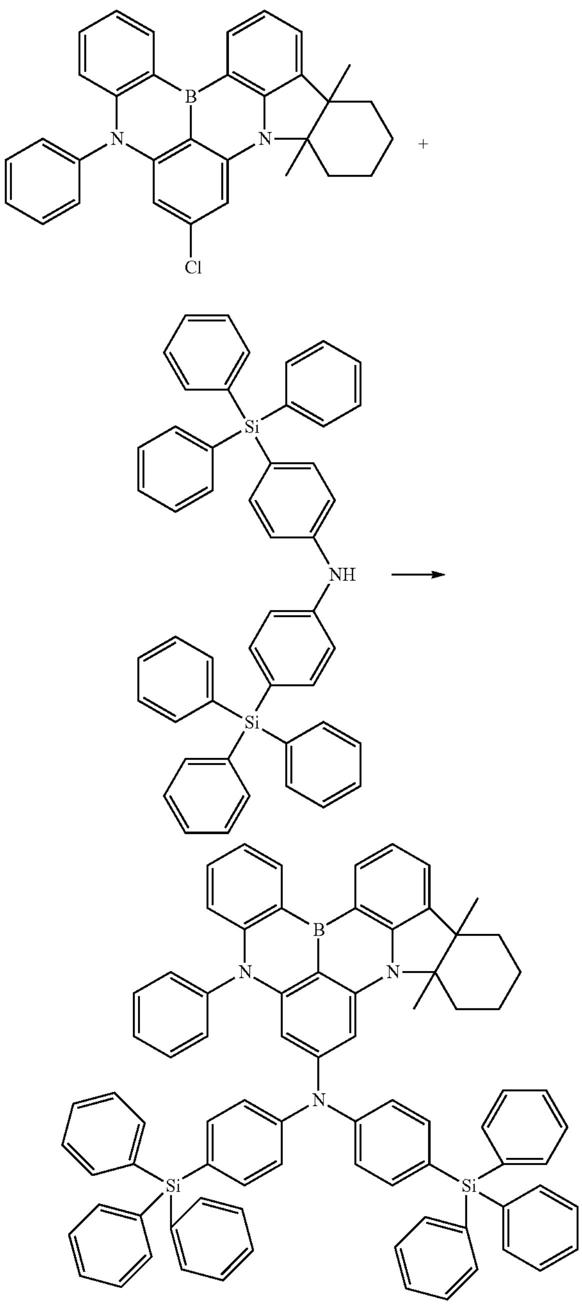

73

After 2 g of Intermediate I85, 2.82 g of bis(4-(triphenylsilyl)phenyl)amine, 1.18 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 2.5 g of Compound 73 (yield 54%).

MS[M+H]+=1137

Synthesis Example 74. Synthesis of Compound 74

1) Synthesis of Compound 74

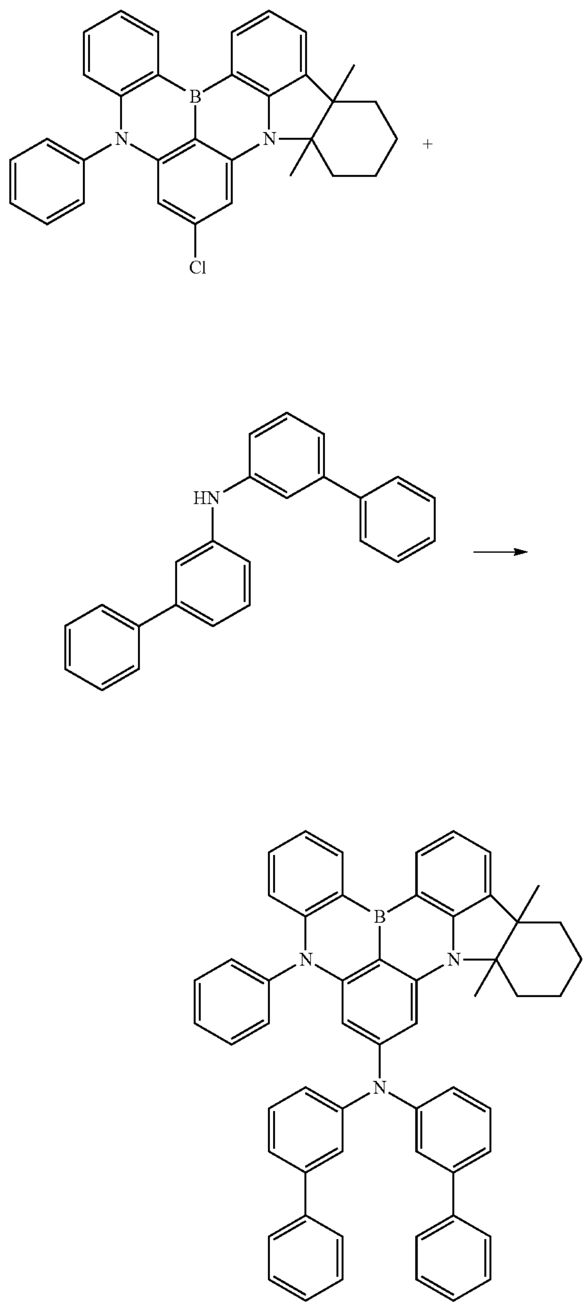

74

After 2 g of Intermediate I85, 1.32 g of di([1,1'-biphenyl]-3-yl)amine, 1.18 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 2.2 g of Compound 74 (yield 69%).

MS[M+H]+=772

Synthesis Example 75. Synthesis of Compound 75

1) Synthesis of Intermediate I86

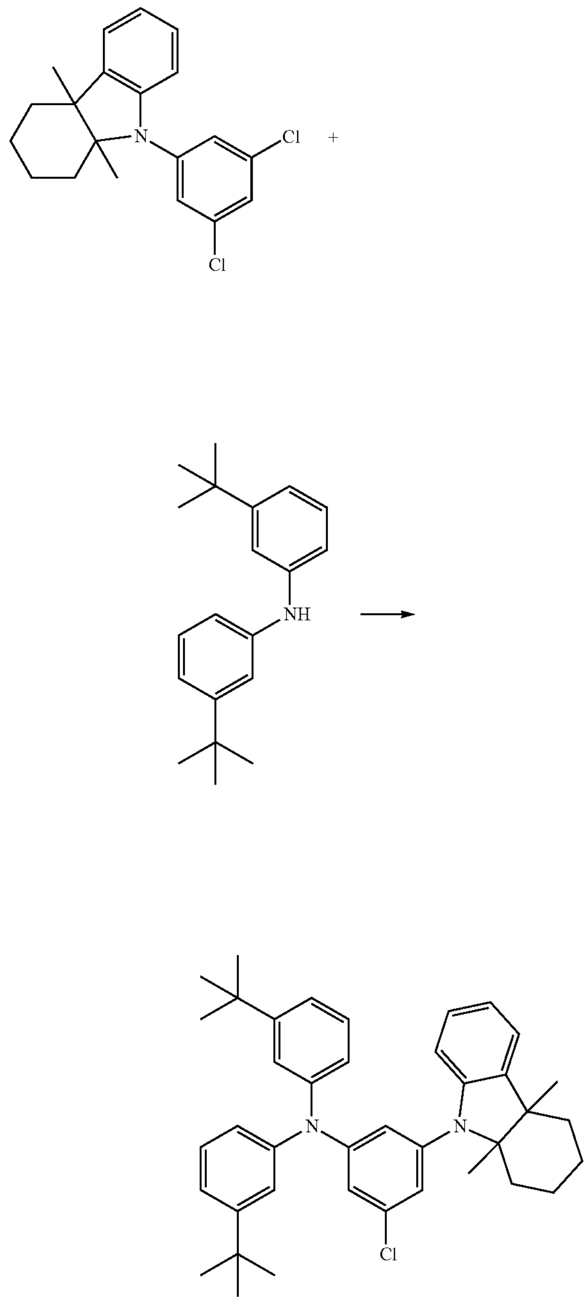

I86

After 40 g of Intermediate I4, 32.5 g of bis(3-(tert-butyl)phenyl)amine, 33.3 g of sodium-tert-butoxide, and 0.59 g of bis(tri-tert-butylphosphine)palladium(0) were put into 800 ml of toluene under nitrogen atmosphere, the resulting mixture was stirred for 3 hours. After the completion of the reaction, the resulting product was extracted, and then purified with an ethyl acetate:hexane column to obtain 50 g of Intermediate I86 (yield 73%).

MS[M+H]+=592

2) Synthesis of Intermediate I87

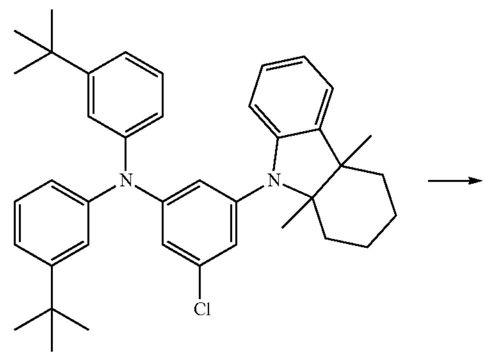

I86

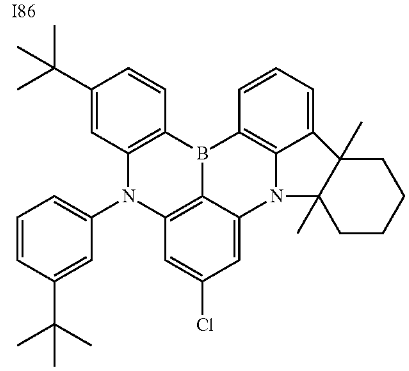

I87

Under nitrogen atmosphere, 30 g of Intermediate I86, 59.59 g of boron triiodide, and 13.51 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 14.1 g of Intermediate I87 (yield 46.0%).

MS[M+H]+=600

3) Synthesis of Compound 75

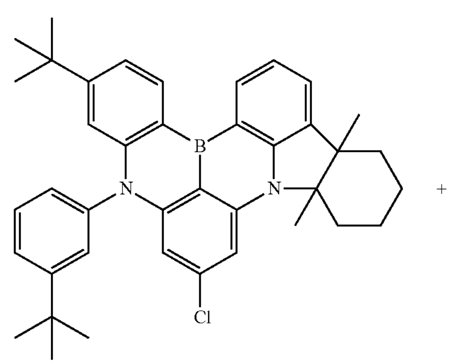

I87

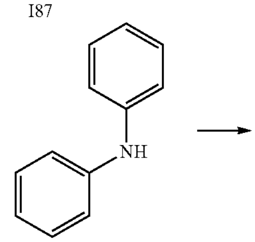

-continued

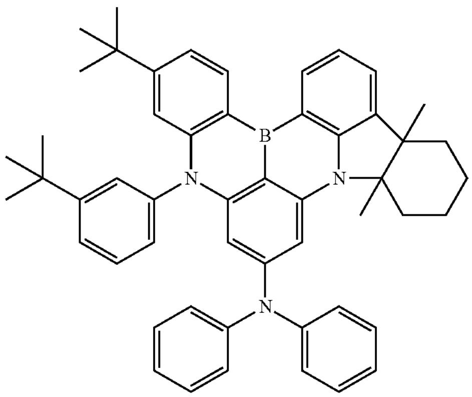

75

After 2 g of Intermediate I87, 0.57 g of diphenylamine, 0.96 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.9 g of Compound 75 (yield 78%).

MS [M+H]+=732

Synthesis Example 76. Synthesis of Compound 76

1) Synthesis of Compound 76

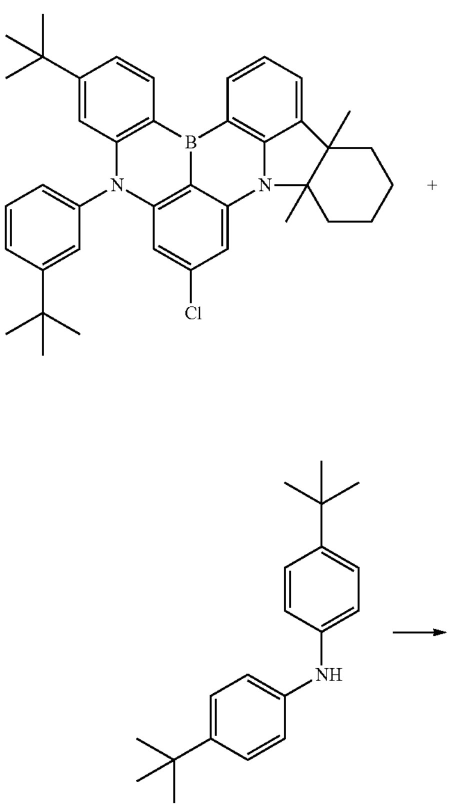

-continued

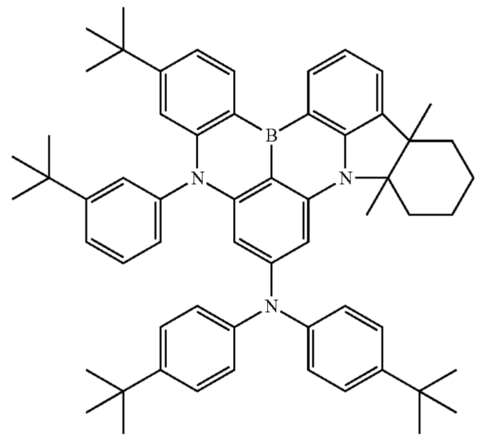

76

After 2 g of Intermediate I87, 0.94 g of bis(4-(tert-butyl)phenyl)amine, 0.96 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 2.1 g of Compound 76 (yield 75%).

MS[M+H]+=845

Synthesis Example 77. Synthesis of Compound 77

1) Synthesis of Compound 77

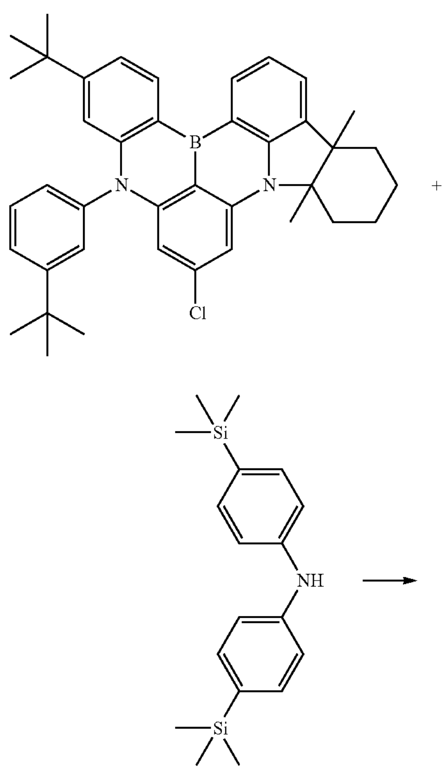

-continued

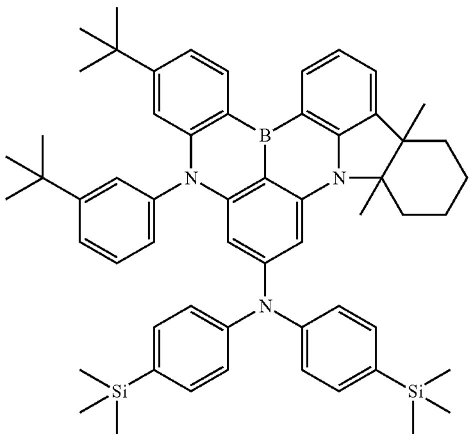

77

After 2 g of Intermediate I87, 1.05 g of bis(4-(trimethylsilyl)phenyl)amine, 0.96 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 2.0 g of Compound 77 (yield 68%).

MS[M+H]+=877

Synthesis Example 78. Synthesis of Compound 78

1) Synthesis of Compound 78

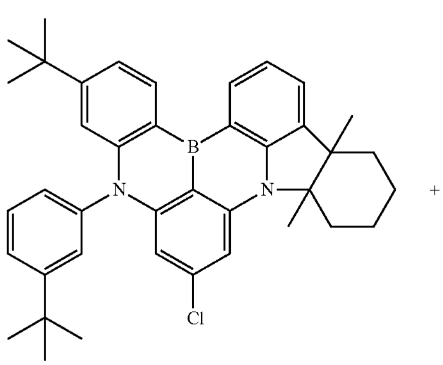

-continued

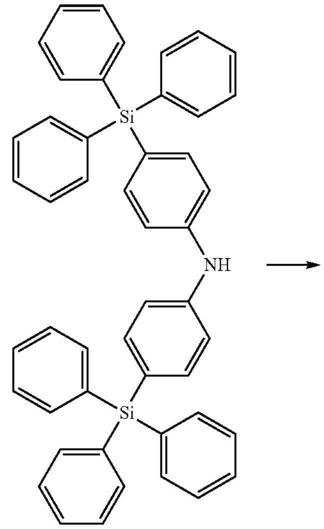

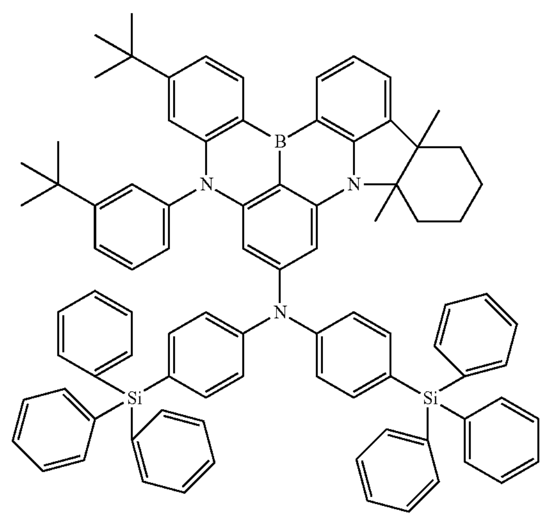

78

After 2 g of Intermediate I87, 2.29 g of bis(4-(triphenylsilyl)phenyl)amine, 0.96 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 2.3 g of Compound 78 (yield 55%).

MS[M+H]+=1249

Synthesis Example 79. Synthesis of Compound 79

1) Synthesis of Compound 79

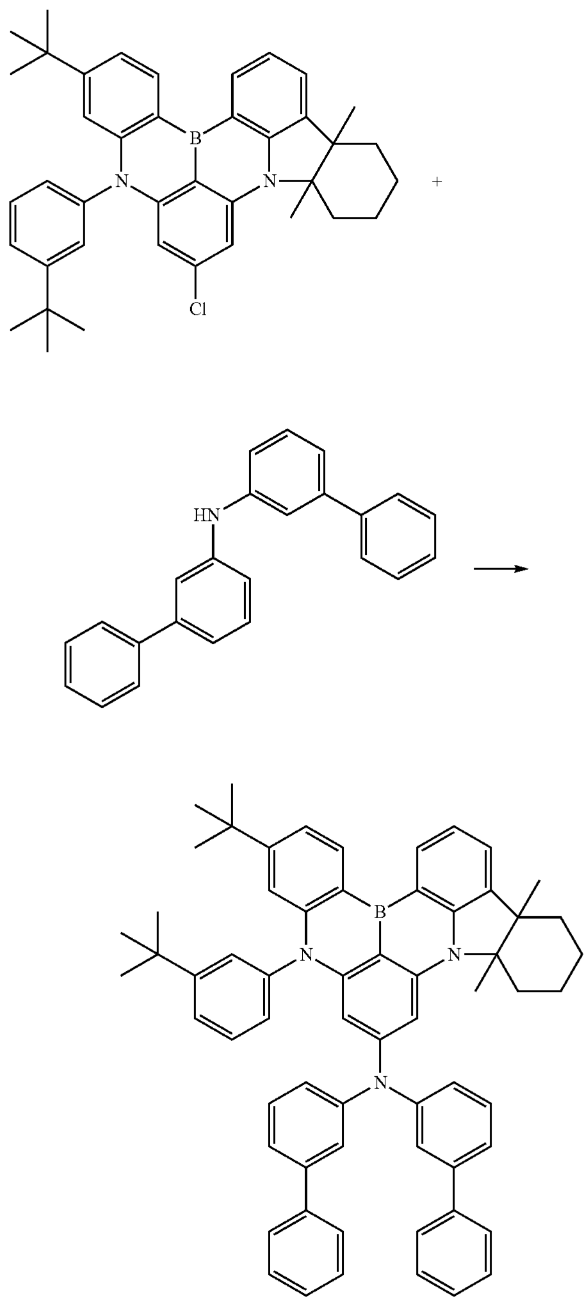

79

After 2 g of Intermediate I87, 1.07 g of di([1,1'-biphenyl]-3-yl)amine, 0.96 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 2.4 g of Compound 79 (yield 81%).

MS[M+H]+=885

Synthesis Example 80. Synthesis of Compound 80

1) Synthesis of Intermediate I88

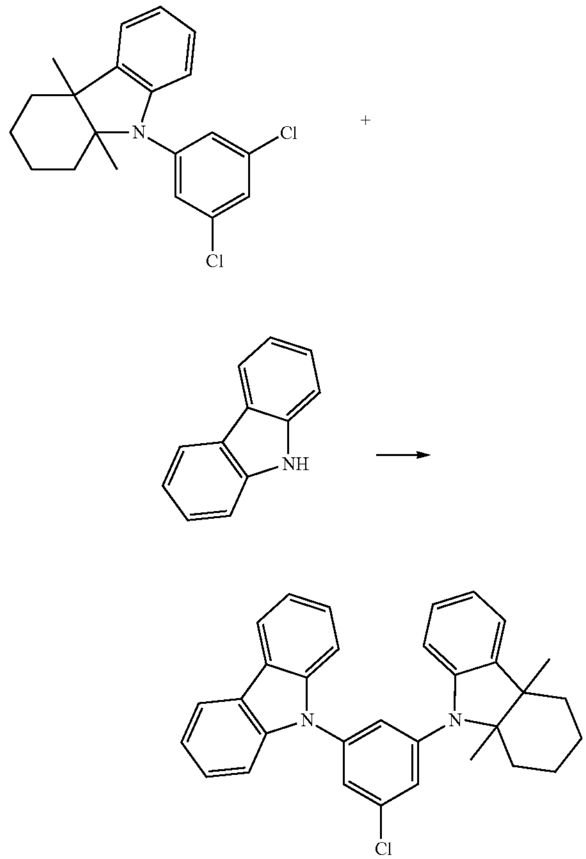

I88

After 40 g of Intermediate I4, 19.3 g of 9H-carbazole, 33.3 g of sodium-tert-butoxide, and 0.59 g of bis(tri-tert-butylphosphine)palladium(0) were put into 800 ml of toluene under nitrogen atmosphere, the resulting mixture was stirred for 6 hours. After the completion of the reaction, the resulting product was extracted, and then purified with an ethyl acetate:hexane column to obtain 43 g of Intermediate I88 (yield 78%).

MS[M+H]+=478

2) Synthesis of Intermediate I89

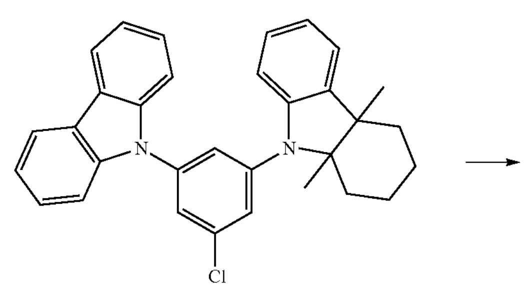

I88

-continued

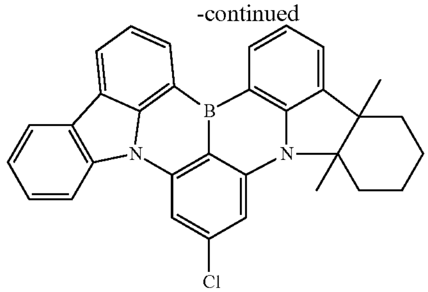

I89

Under nitrogen atmosphere, 30 g of Intermediate I88, 73.86 g of boron triiodide, and 16.75 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 14.5 g of Intermediate I89 (yield 48.0%).

MS[M+H]+=485

3) Synthesis of Compound 80

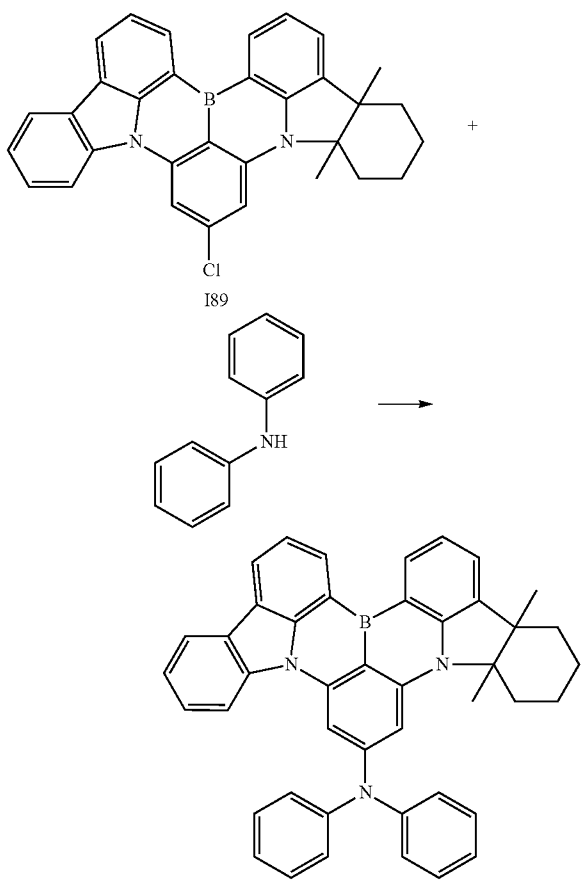

I89

80

After 2 g of Intermediate I89, 0.69 g of diphenylamine, 1.19 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.9 g of Compound 80 (yield 78%).

MS[M+H]+=732

Synthesis Example 81. Synthesis of Compound 81

1) Synthesis of Compound 81

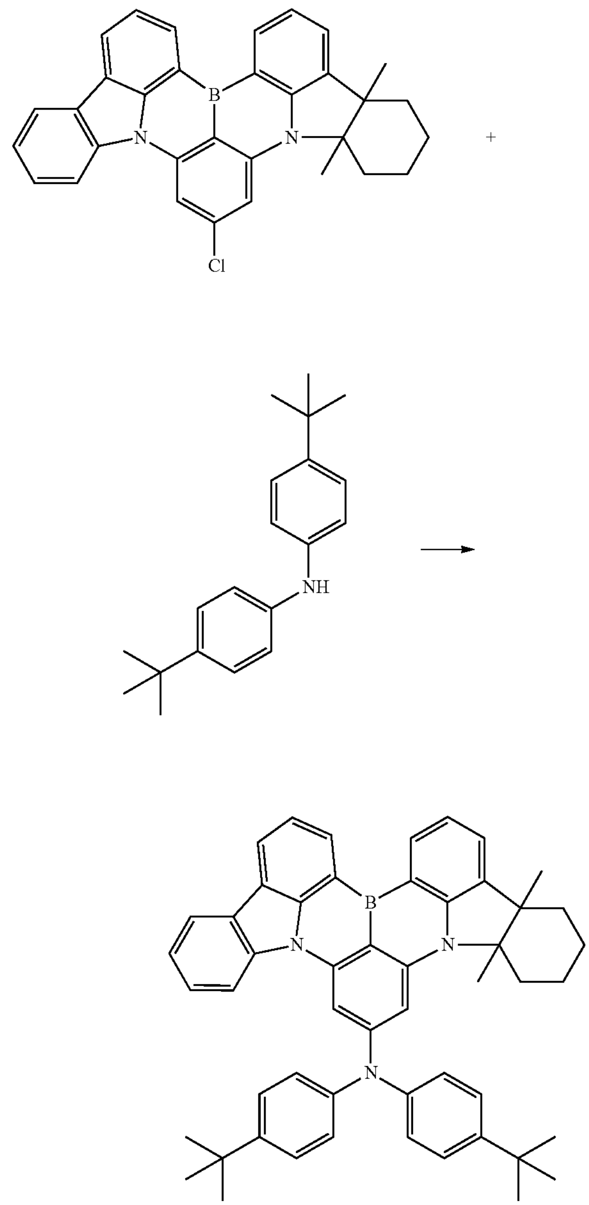

81

After 2 g of Intermediate I89, 1.16 g of bis(4-(tert-butyl) phenyl)amine, 1.19 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 2.3 g of Compound 81 (yield 76%).

MS [M+H]+=730

Synthesis Example 82. Synthesis of Compound 82

1) Synthesis of Compound 82

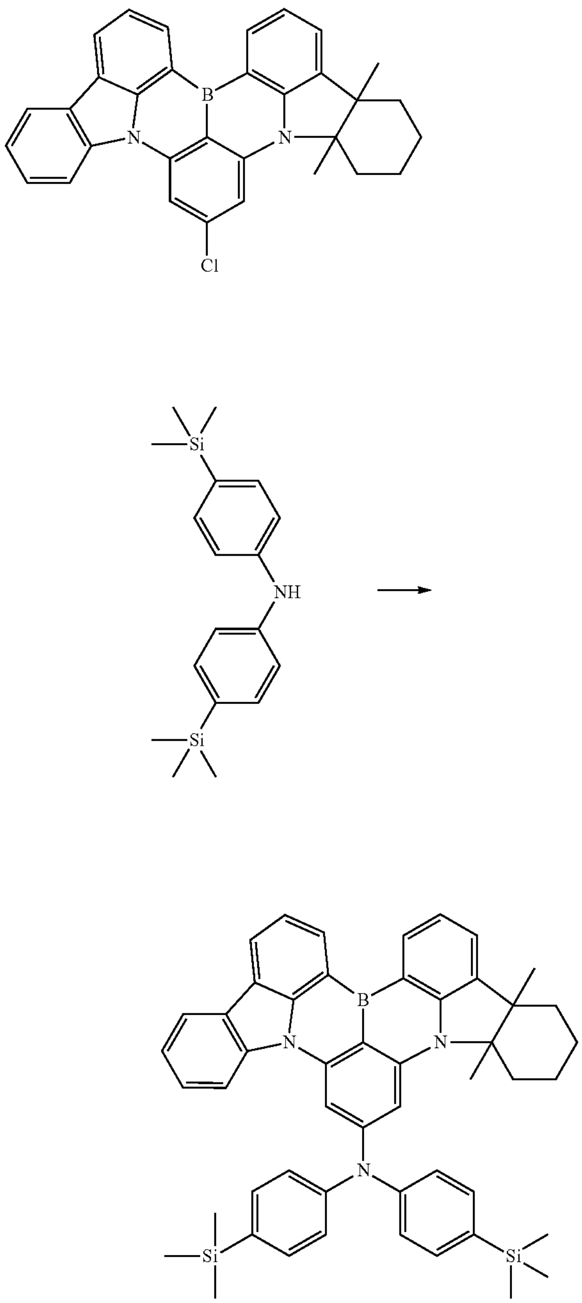

82

After 2 g of Intermediate I89, 1.29 g of bis(4-(trimethylsilyl)phenyl)amine, 1.19 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 2.6 g of Compound 82 (yield 83%).

MS[M+H]+=762

Synthesis Example 83. Synthesis of Compound 83

1) Synthesis of Compound 83

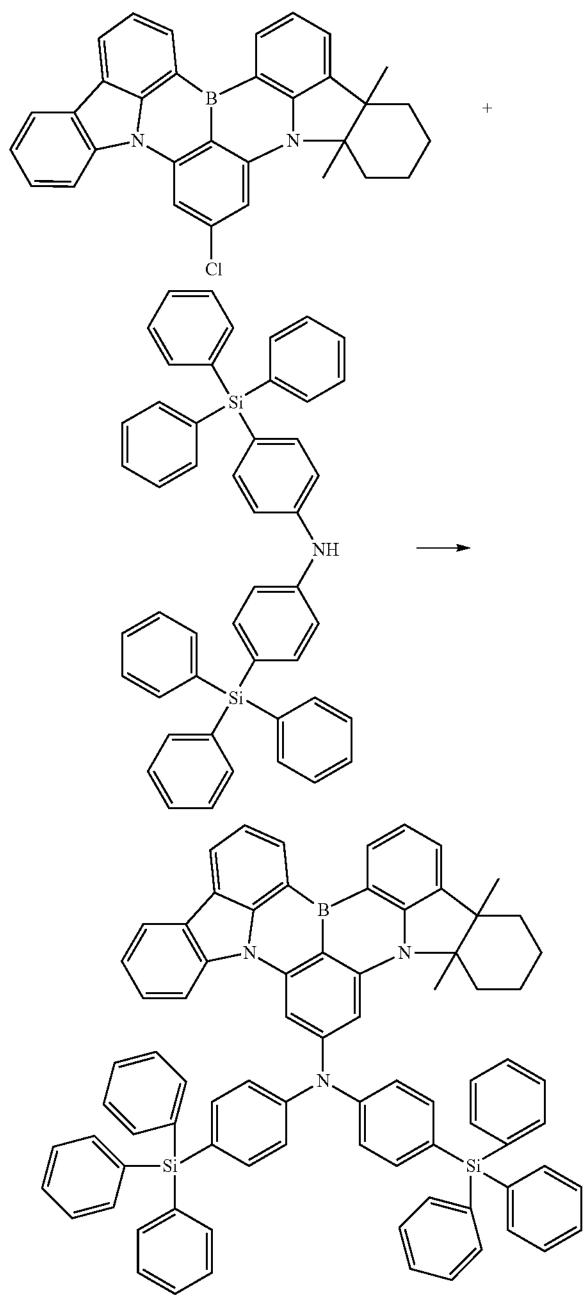

83

After 2 g of Intermediate I89, 2.82 g of bis(4-(triphenylsilyl)phenyl)amine, 1.19 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 2.8 g of Compound 83 (yield 60%).

MS[M+H]+=1135

Synthesis Example 84. Synthesis of Compound 84

1) Synthesis of Compound 84

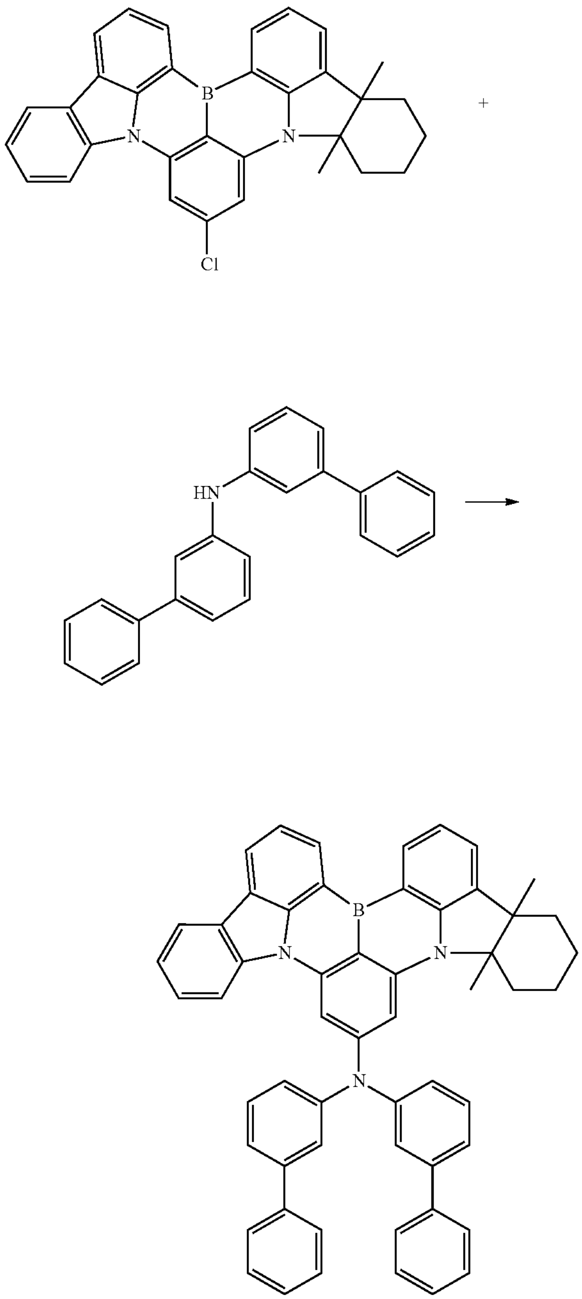

84

After 2 g of Intermediate I89, 1.32 g of di([1,1'-biphenyl]-3-yl)amine, 1.19 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 2.1 g of Compound 84 (yield 66%).

MS[M+H]+=770

Synthesis Example 85. Synthesis of Compound 85

1) Synthesis of Intermediate I90

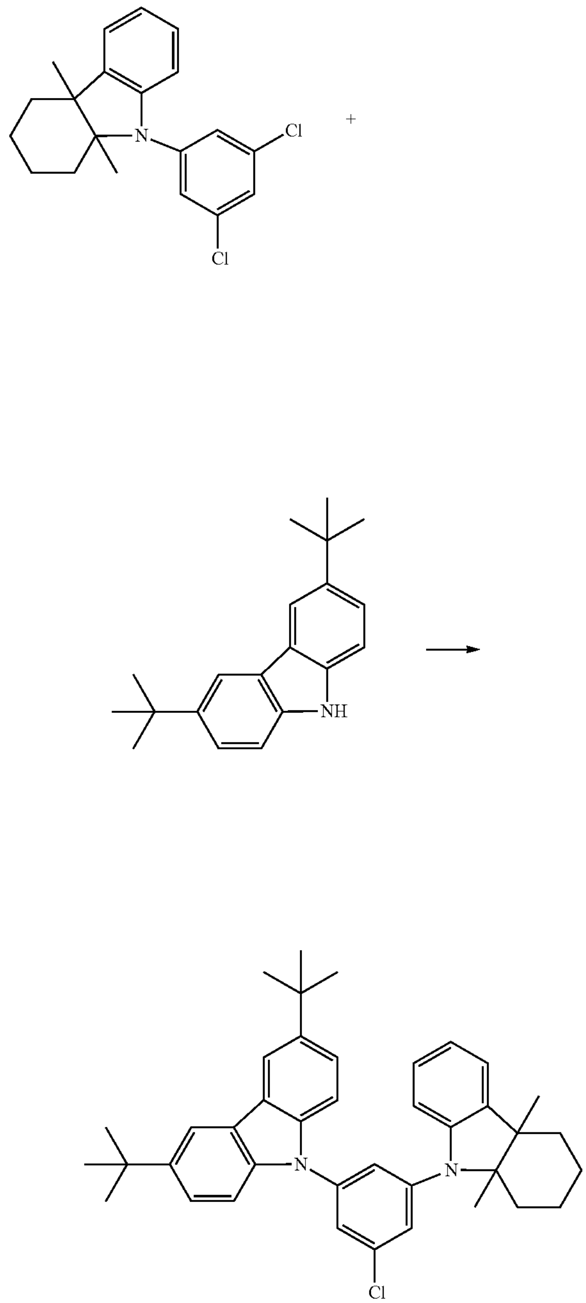

I90

After 40 g of Intermediate I4, 32.28 g of 3,6-di-tert-butyl-9H-carbazole, 33.3 g of sodium-tert-butoxide, and 0.59 g of bis(tri-tert-butylphosphine)palladium(0) were put into 800 ml of toluene under nitrogen atmosphere, the resulting mixture was stirred for 6 hours. After the completion of the reaction, the resulting product was extracted, and then purified with an ethyl acetate:hexane column to obtain 47 g of Intermediate I90 (yield 69%).

MS[M+H]+=590

2) Synthesis of Intermediate I91

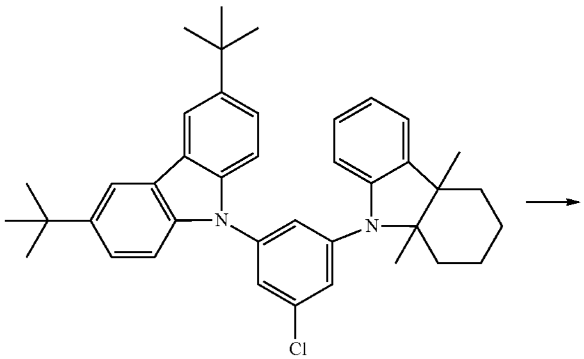

I90

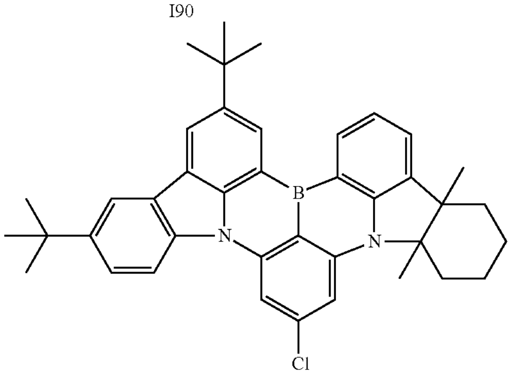

I91

Under nitrogen atmosphere, 30 g of Intermediate I90, 59.80 g of boron triiodide, and 13.56 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 14.6 g of Intermediate I91 (yield 48.0%).

MS[M+H]+=598

3) Synthesis of Compound 85

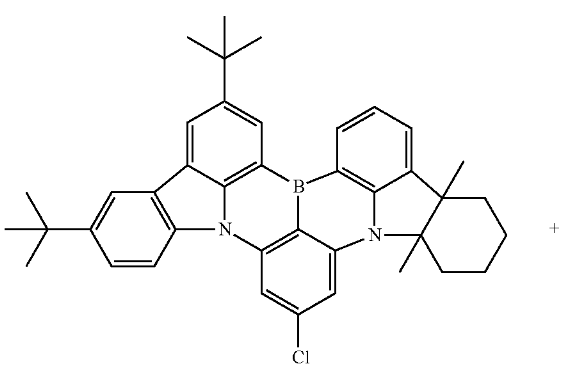

I91

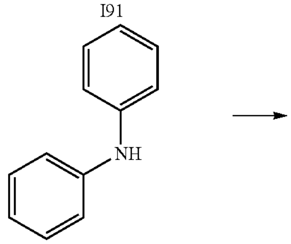

-continued

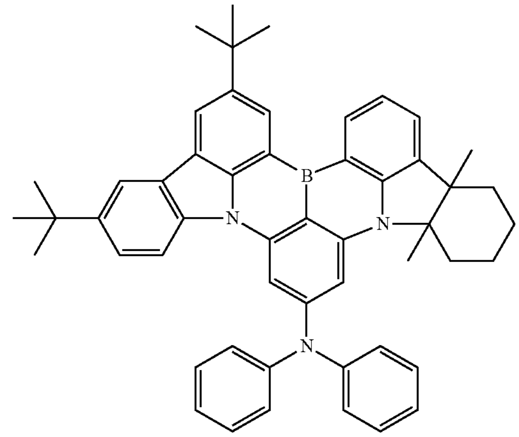

85

After 2 g of Intermediate I91, 0.57 g of diphenylamine, 0.97 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.2 g of Compound 85 (yield 49%).

MS[M+H]+=730

Synthesis Example 86. Synthesis of Compound 86

1) Synthesis of Compound 86

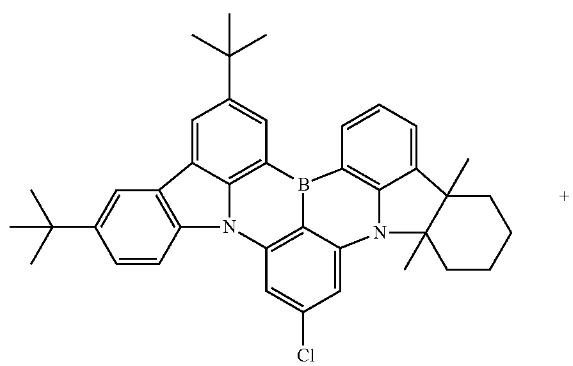

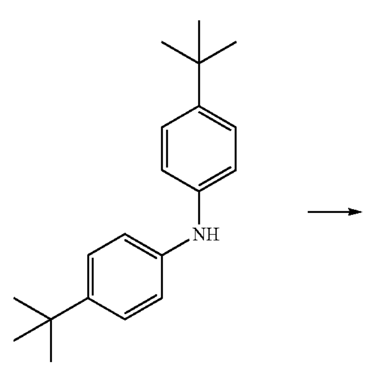

-continued

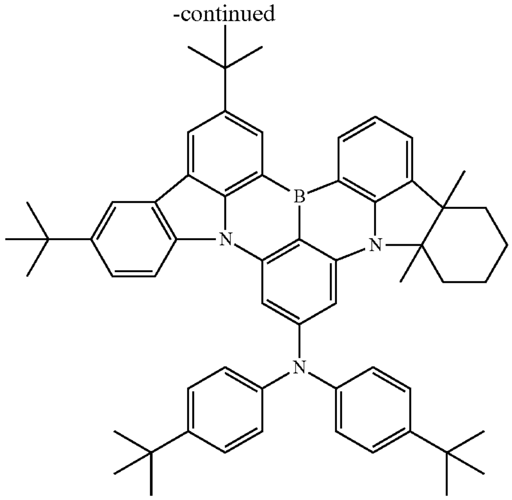

86

-continued

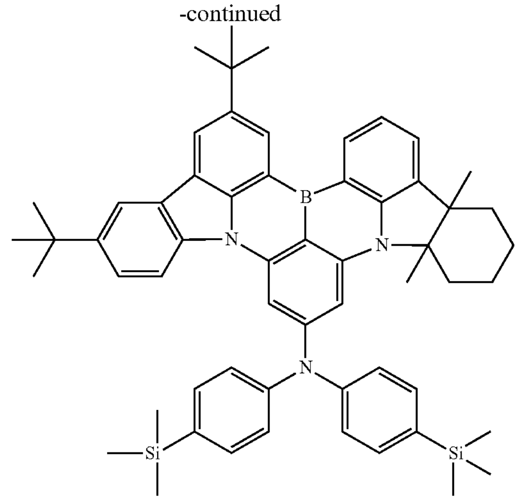

87

After 2 g of Intermediate I91, 0.94 g of bis(4-(tert-butyl) phenyl)amine, 1.19 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 2.1 g of Compound 86 (yield 74%).

MS[M+H]+=843

Synthesis Example 87. Synthesis of Compound 87

1) Synthesis of Compound 87

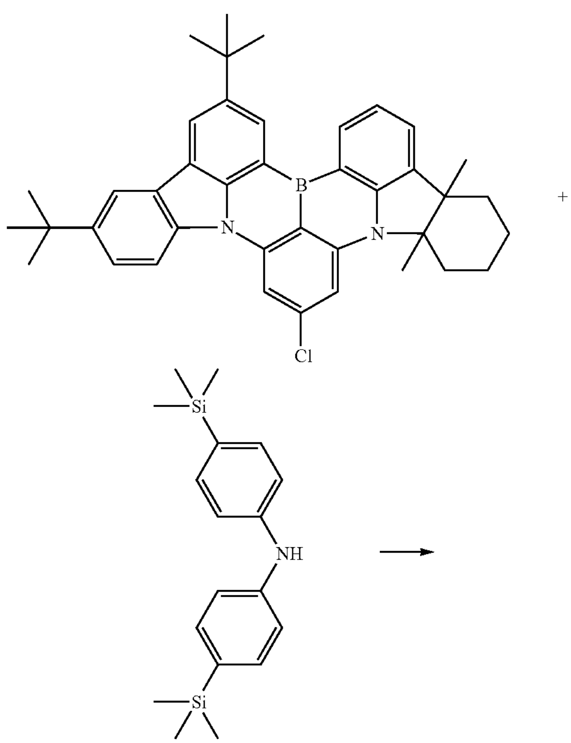

After 2 g of Intermediate I91, 1.05 g of bis(4-(trimethylsilyl)phenyl)amine, 0.97 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 2.0 g of Compound 87 (yield 68%).

MS[M+H]+=875

Synthesis Example 88. Synthesis of Compound 88

1) Synthesis of Compound 88

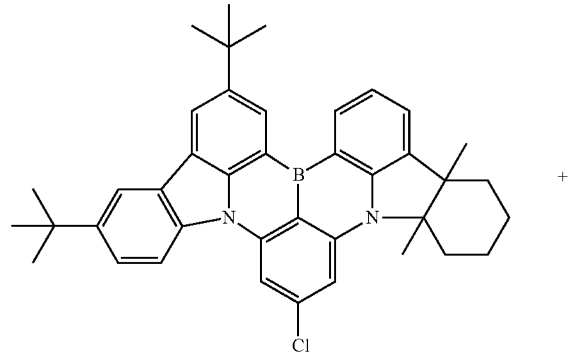

-continued

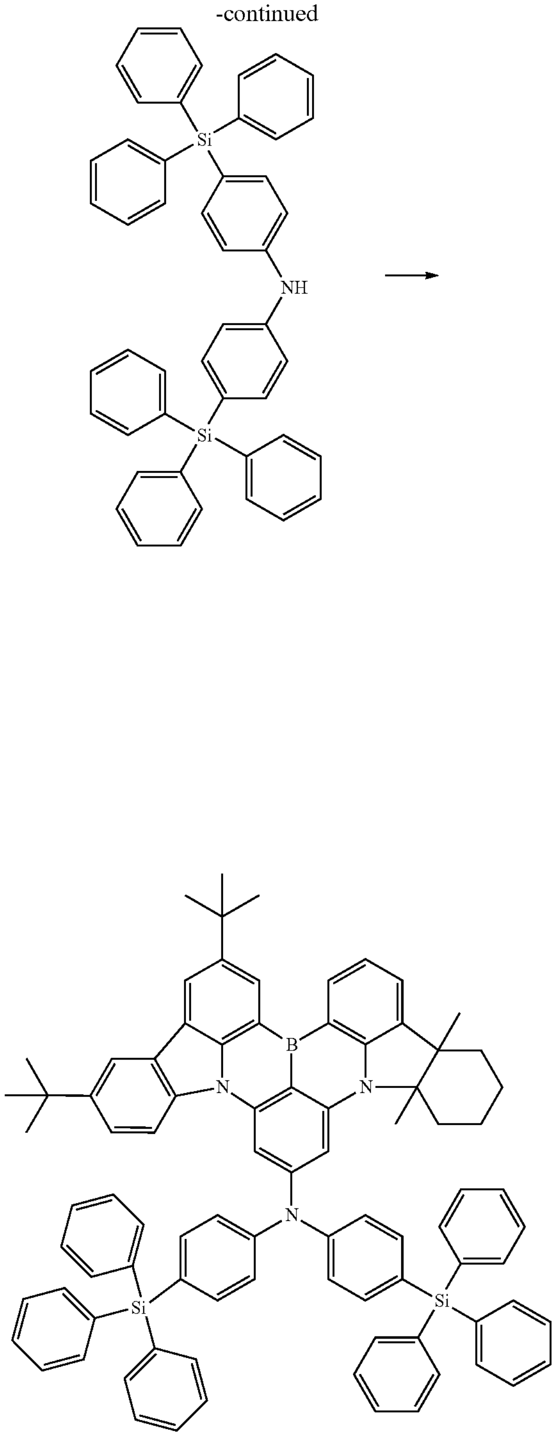

88

After 2 g of Intermediate I91, 2.30 g of bis(4-(triphenylsilyl)phenyl)amine, 0.97 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 3.1 g of Compound 88 (yield 74%).

MS[M+H]+=1247

Synthesis Example 89. Synthesis of Compound 89

1) Synthesis of Compound 89

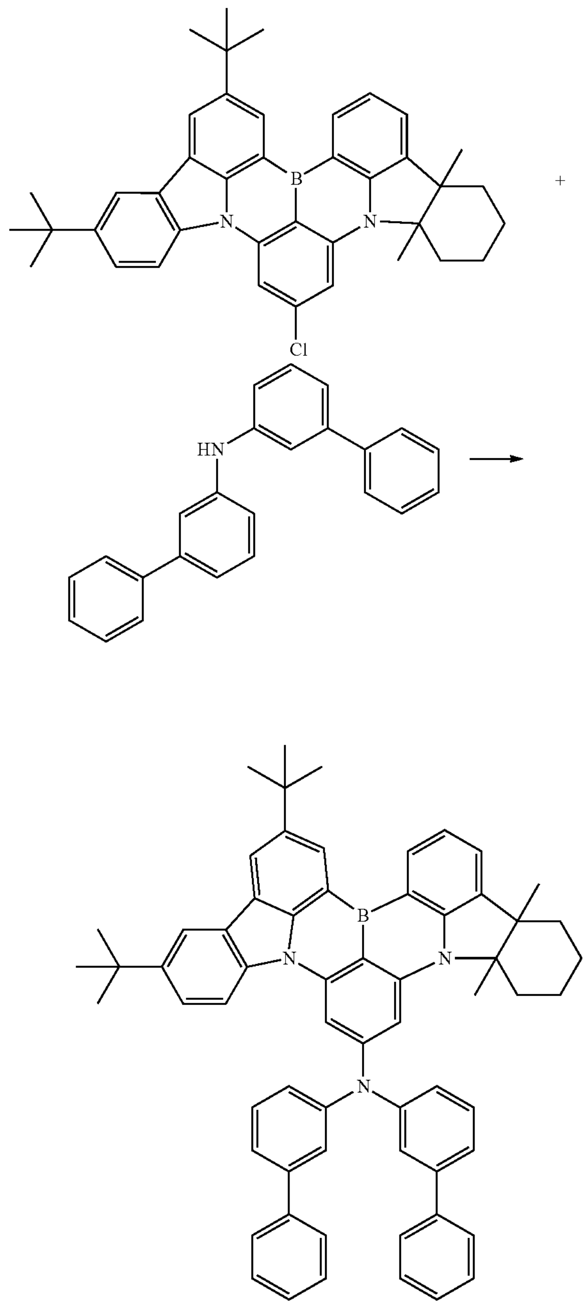

89

After 2 g of Intermediate I91, 1.08 g of di([1,1'-biphenyl]-3-yl)amine, 0.97 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 2.0 g of Compound 89 (yield 78%).

MS[M+H]+=883

Synthesis Example 90. Synthesis of Compound 90

1) Synthesis of Intermediate I92

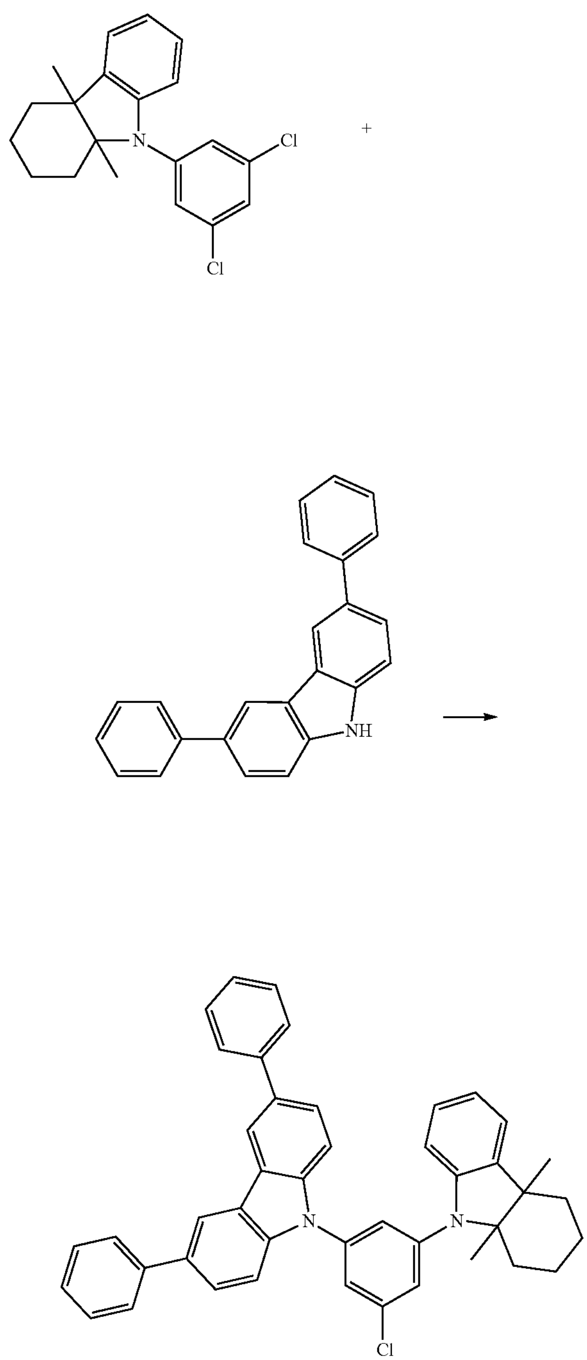

I92

After 40 g of Intermediate I4, 32.28 g of 3,6-di-tert-butyl-9H-carbazole, 33.3 g of sodium-tert-butoxide, and 0.59 g of bis(tri-tert-butylphosphine)palladium(0) were put into 800 ml of toluene under nitrogen atmosphere, the resulting mixture was stirred for 6 hours. After the completion of the reaction, the resulting product was extracted, and then purified with an ethyl acetate:hexane column to obtain 50 g of Intermediate I92 (yield 69%).

MS[M+H]+=630

2) Synthesis of Intermediate I93

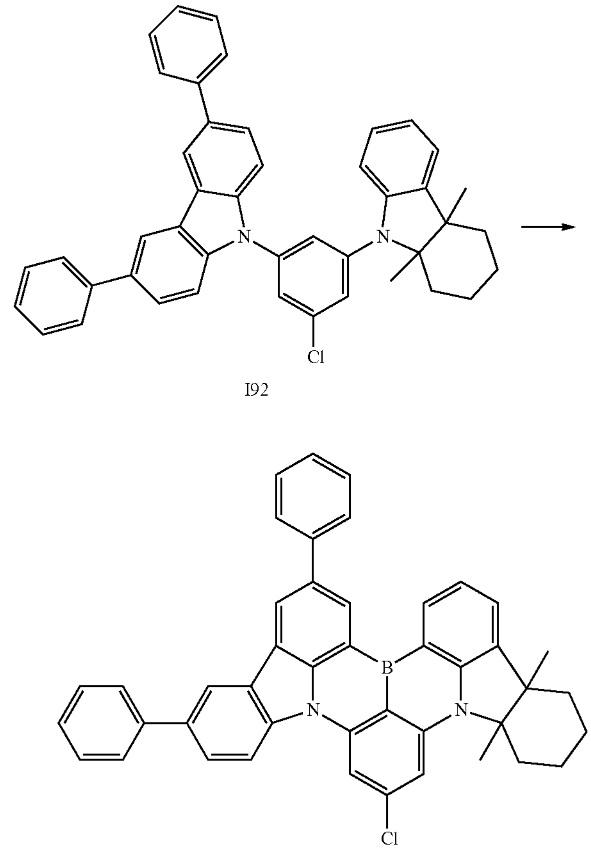

I93

Under nitrogen atmosphere, 30 g of Intermediate I92, 56.0 g of boron triiodide, and 12.7 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 13.9 g of Intermediate I93 (yield 46.0%).

MS[M+H]+=638

3) Synthesis of Compound 90

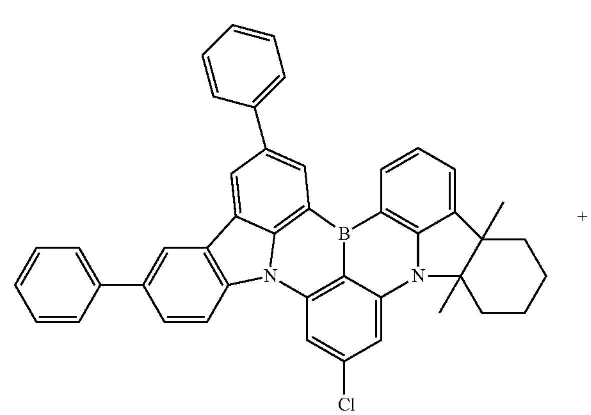

I93

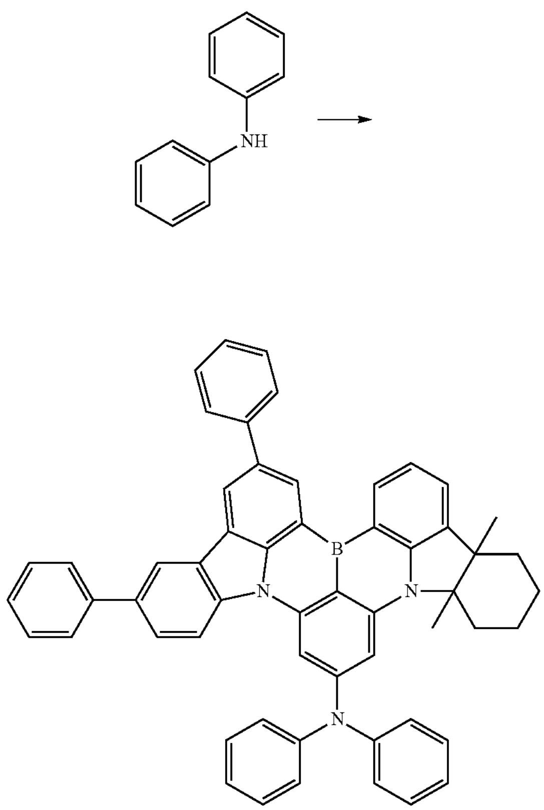

90

After 2 g of Intermediate I93, 0.53 g of diphenylamine, 0.90 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.5 g of Compound 90 (yield 62%).

MS [M+H]+=770

Synthesis Example 91. Synthesis of Compound 91

1) Synthesis of Compound 91

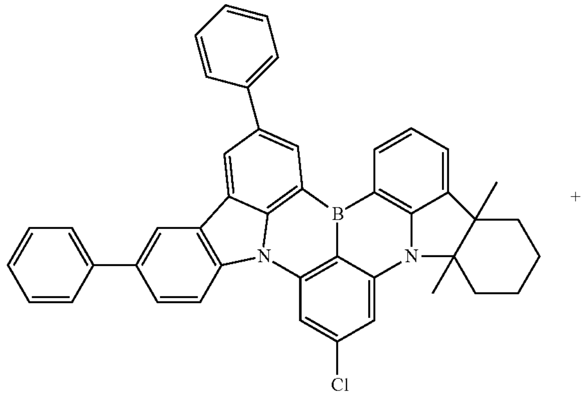

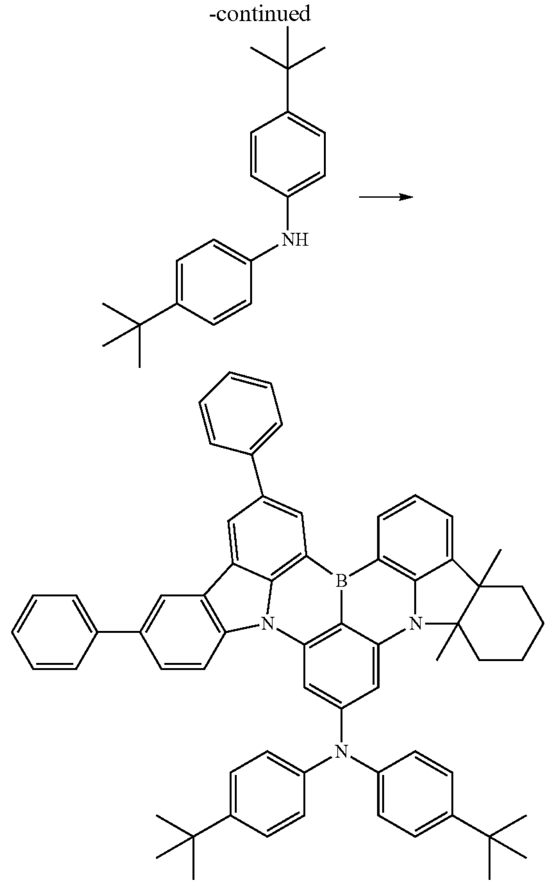

91

After 2 g of Intermediate I93, 0.88 g of bis(4-(tert-butyl)phenyl)amine, 0.91 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.9 g of Compound 91 (yield 69%).

MS[M+H]+=883

Synthesis Example 92. Synthesis of Compound 92

1) Synthesis of Compound 92

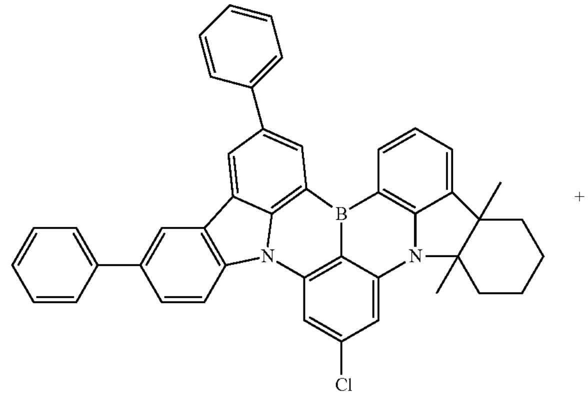

-continued

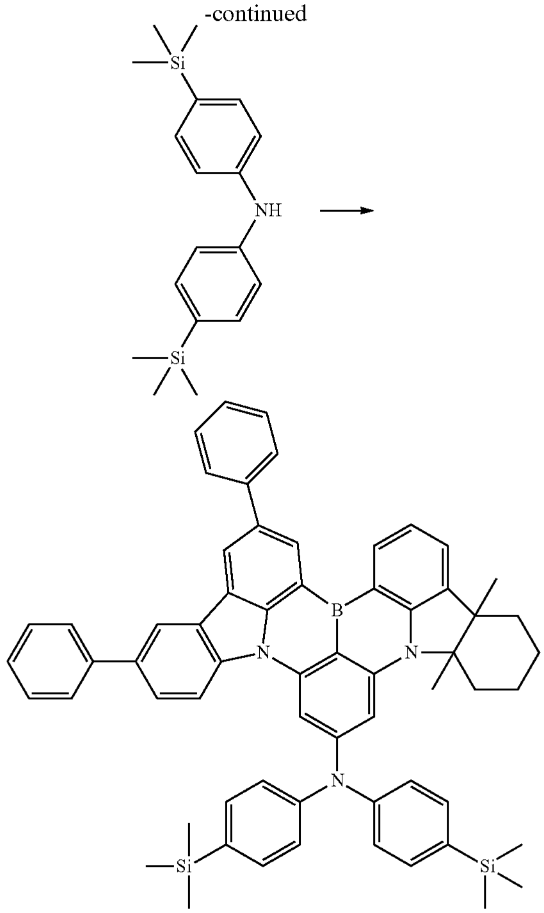

92

After 2 g of Intermediate I93, 0.98 g of bis(4-(trimethylsilyl)phenyl)amine, 0.91 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.8 g of Compound 92 (yield 63%).

MS[M+H]+=915

Synthesis Example 93. Synthesis of Compound 93

1) Synthesis of Compound 93

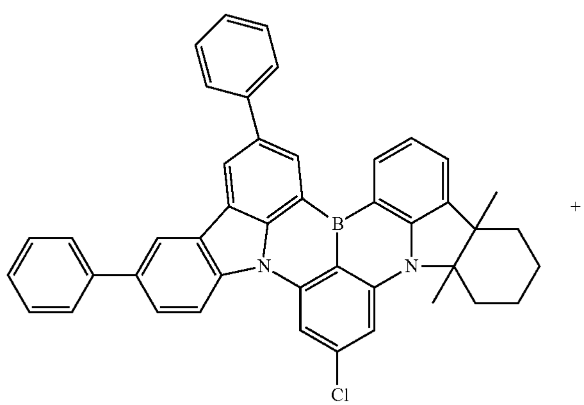

-continued

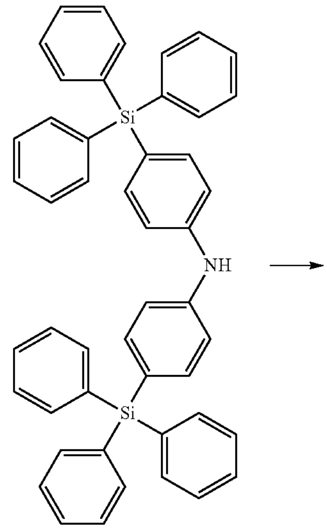

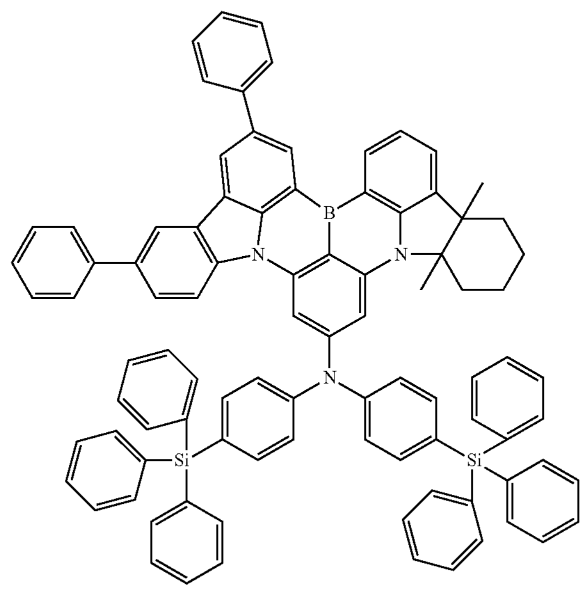

93

After 2 g of Intermediate I93, 2.15 g of bis(4-(trimethylsilyl)phenyl)amine, 0.91 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 2.3 g of Compound 93 (yield 57%).

MS[M+H]+=1287

Synthesis Example 94. Synthesis of Compound 94

1) Synthesis of Compound 94

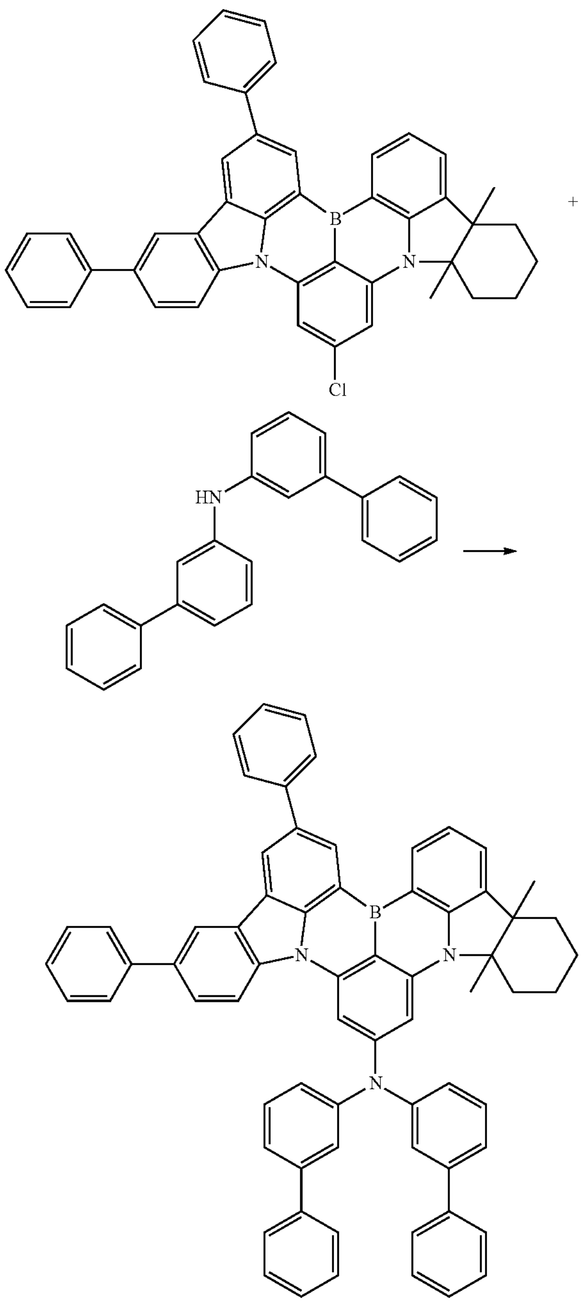

94

After 2 g of Intermediate I93, 1.01 g of di([1,1'-biphenyl]-3-yl)amine, 0.91 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.7 g of Compound 94 (yield 59%).

MS[M+H]+=923

Synthesis Example 95. Synthesis of Compound 95

1) Synthesis of Intermediate I94

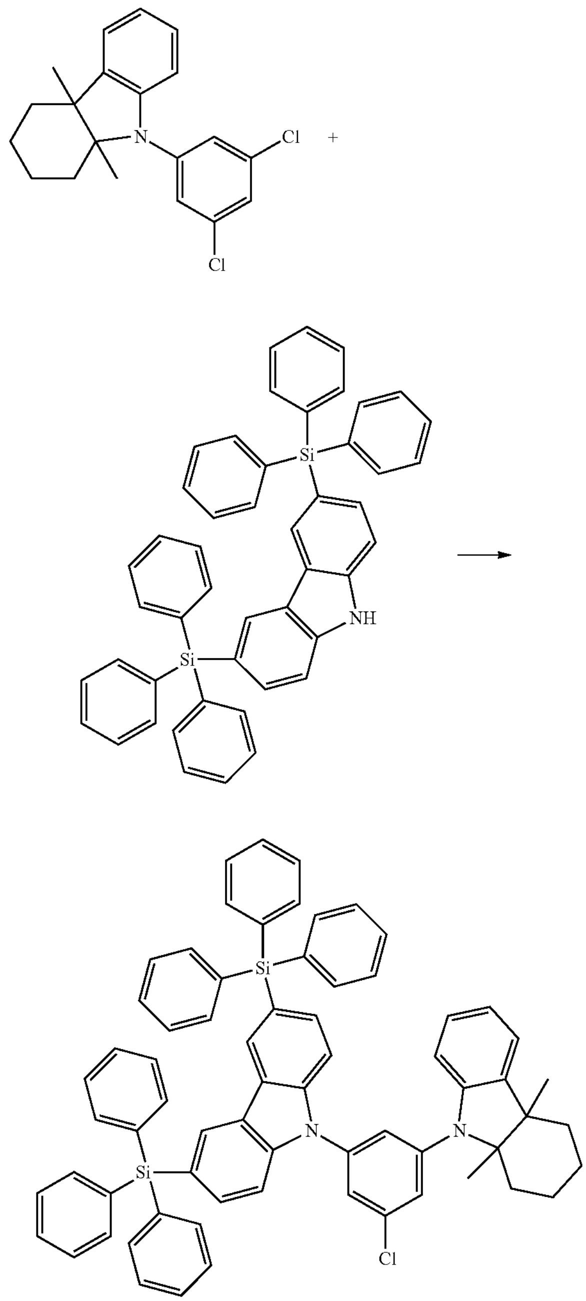

I94

After 20 g of Intermediate I4, 39.5 g of 3,6-bis(triphenylsilyl)-9H-carbazole, 16.7 g of sodium-tert-butoxide, and 0.3 g of bis(tri-tert-butylphosphine)palladium(0) were put into 800 ml of toluene under nitrogen atmosphere, the resulting mixture was stirred for 6 hours. After the completion of the reaction, the resulting product was extracted, and then purified with an ethyl acetate:hexane column to obtain 40 g of Intermediate I94 (yield 70%).

MS[M+H]+=994

2) Synthesis of Intermediate I95

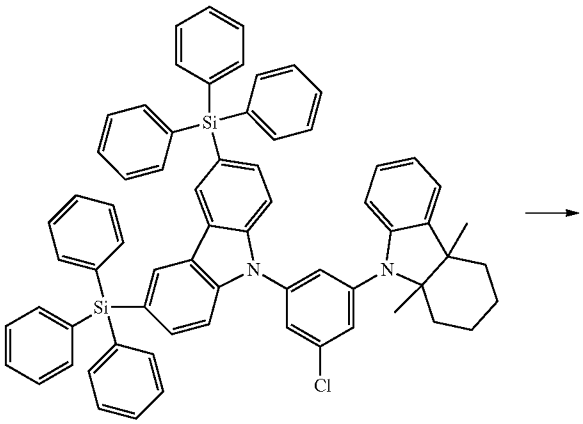

I94

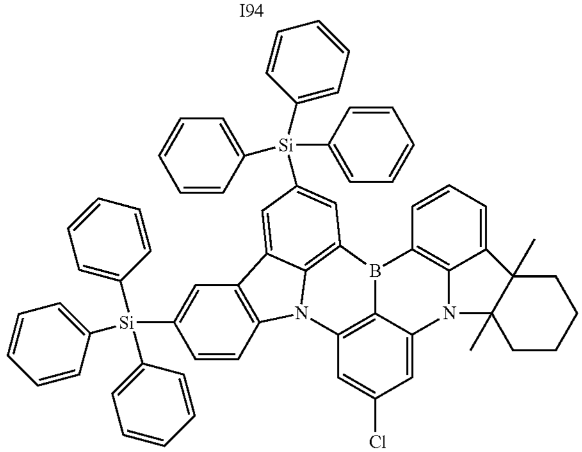

I95

Under nitrogen atmosphere, 30 g of Intermediate I94, 35.5 g of boron triiodide, and 8.1 g of triphenylborane were stirred using dichlorobenzene at 160° C. for 6 hours. The reaction was completed, and the resulting product was extracted at room temperature, and then recrystallized to obtain 12.0 g of Intermediate I95 (yield 40.0%).

MS[M+H]+=1002

3) Synthesis of Compound 95

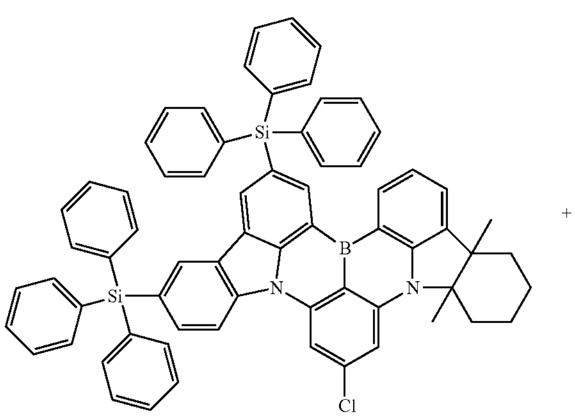

I95

-continued

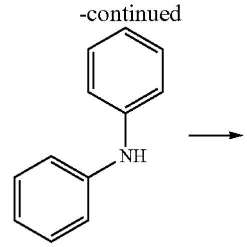

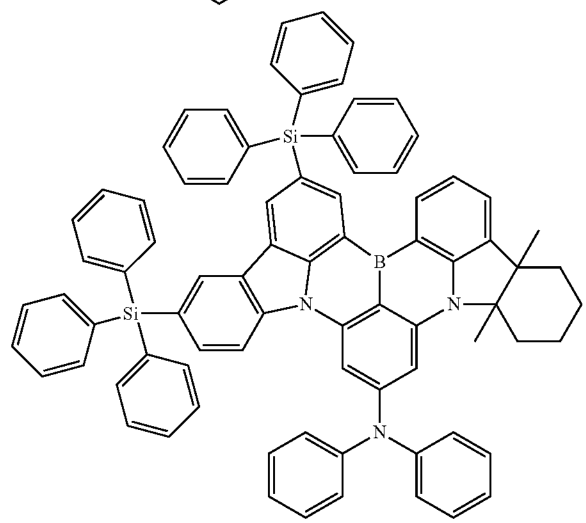

95

After 2 g of Intermediate I95, 0.33 g of diphenylamine, 0.58 g of sodium-tert-butoxide, and 0.01 g of bis(tri-tert-butylphosphine)palladium(0) were put into 30 ml of toluene under nitrogen atmosphere, the resulting mixture was stirred for 3 hours. After the completion of the reaction, the resulting product was extracted, and then recrystallized to obtain 1.4 g of Compound 95 (yield 62%).

MS[M+H]+=1135

Synthesis Example 96. Synthesis of Compound 96

1) Synthesis of Intermediate I96

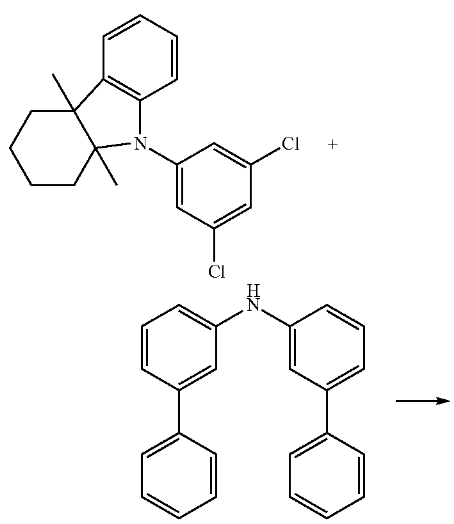

-continued

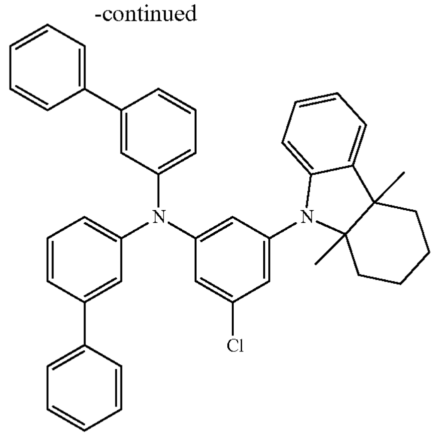

I96

After 30 g of Intermediate I4, 27.8 g of di([1,1'-biphenyl]-3-yl)amine, 24.9 g of sodium-tert-butoxide, and 0.4 g of bis(tri-tert-butylphosphine)palladium(0) were put into 800 ml of toluene under nitrogen atmosphere, the resulting mixture was stirred for 6 hours. After the completion of the reaction, the resulting product was extracted, and then purified with an ethyl acetate:hexane column to obtain 41 g of Intermediate I96 (yield 75%).

MS[M+H]+=632

2) Synthesis of Intermediate I97

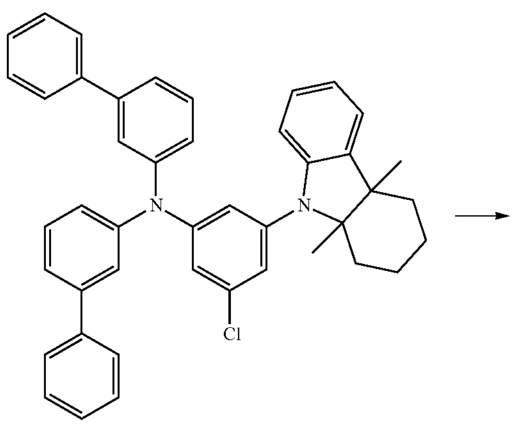

I96

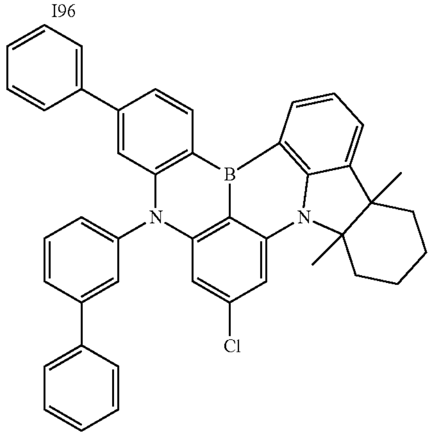

I97

Under nitrogen atmosphere, 30 g of Intermediate I96, 55.82 g of boron triiodide, and 12.6 g of triphenylborane were stirred using dichlorobenzene at 160° C. for 6 hours. The reaction was completed, and the resulting product was extracted at room temperature, and then recrystallized to obtain 14.0 g of Intermediate I97 (yield 46.0%).

MS [M+H]+=640

3) Synthesis of Compound 96

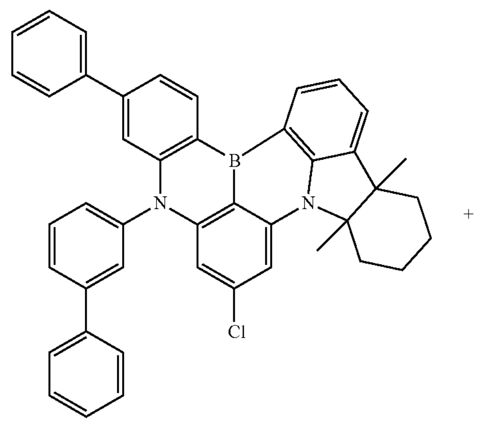

I97

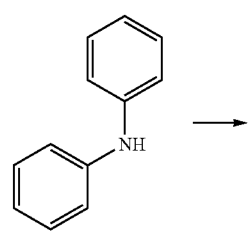

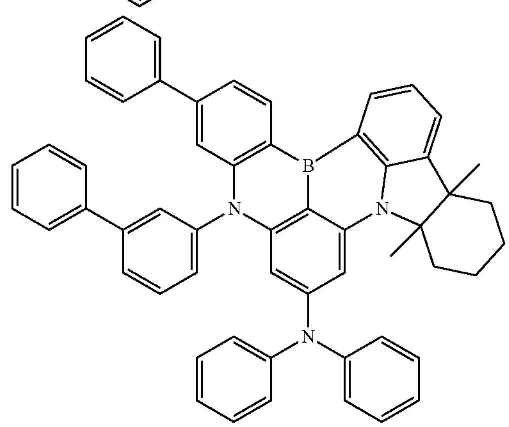

96

After 2 g of Intermediate I97, 0.53 g of diphenylamine, 0.9 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then recrystallized to obtain 1.3 g of Compound 96 (yield 54%).

MS[M+H]+=772

Synthesis Example 97. Synthesis of Compound 97

1) Synthesis of Compound 97

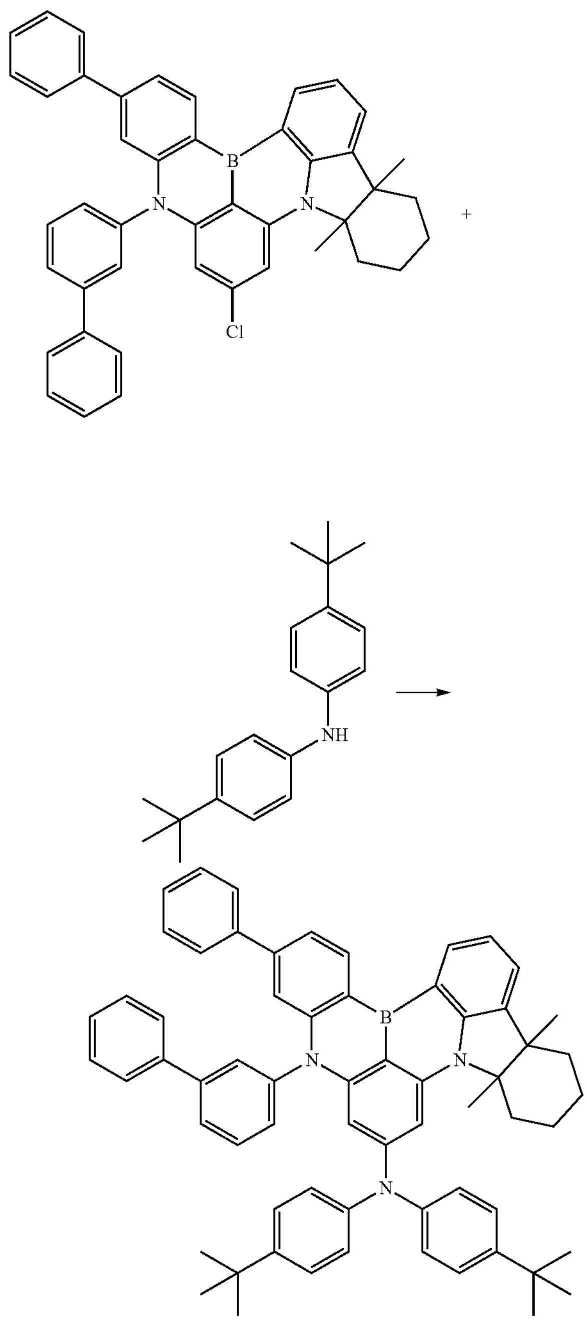

97

After 2 g of Intermediate I97, 0.88 g of bis(4-(tert-butyl)phenyl)amine, 0.91 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.8 g of Compound 97 (yield 65%).

MS [M+H]+=885

Synthesis Example 98. Synthesis of Compound 98

1) Synthesis of Compound 98

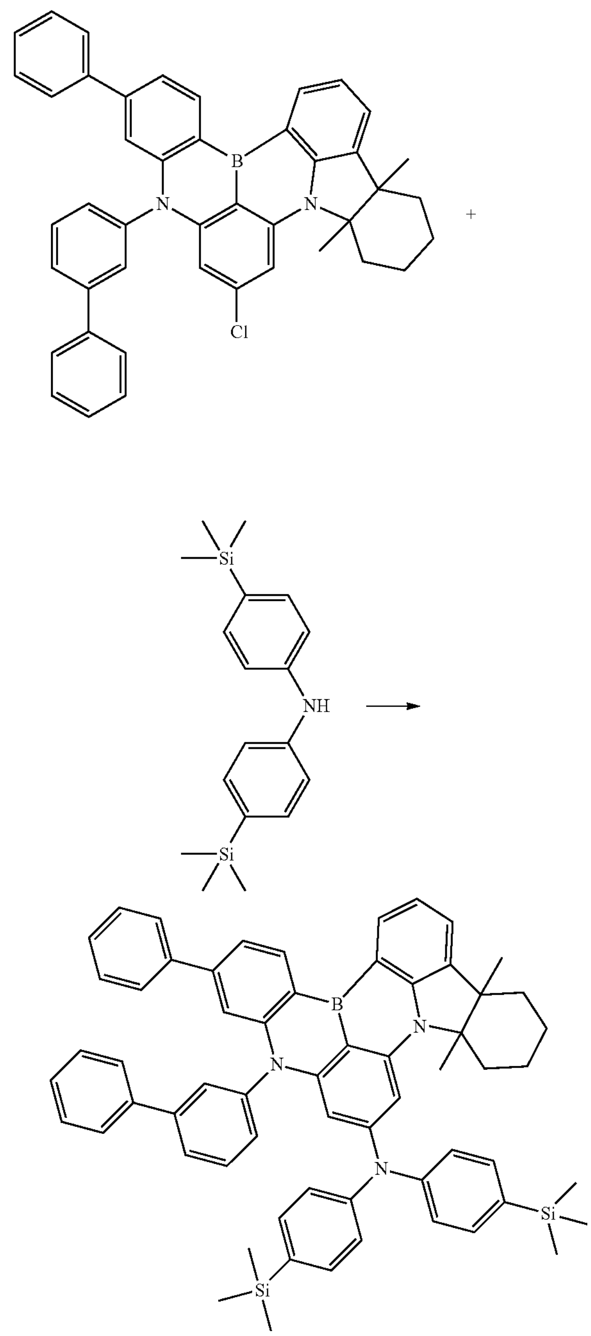

98

After 2 g of Intermediate I97, 0.98 g of bis(4-(trimethylsilyl)phenyl)amine, 0.91 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then recrystallized to obtain 1.9 g of Compound 98 (yield 66%).

MS[M+H]+=917

Synthesis Example 99. Synthesis of Compound 99

1) Synthesis of Compound 99

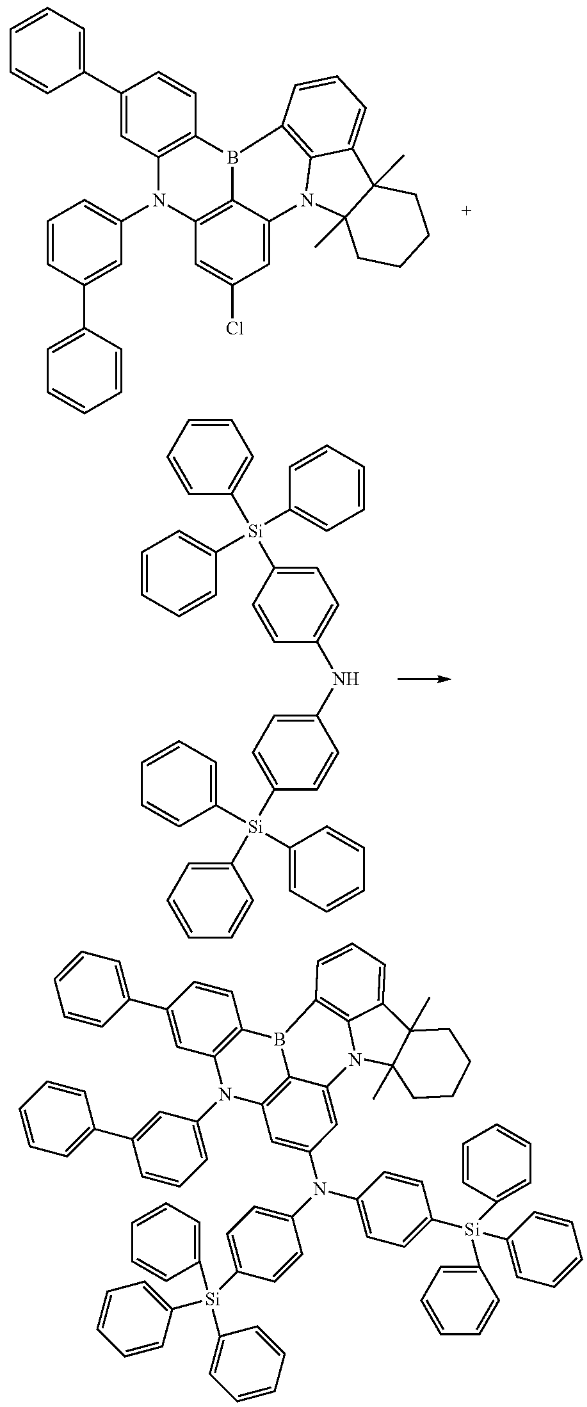

99

After 2 g of Intermediate I97, 2.14 g of bis(4-(triphenylsilyl)phenyl)amine, 0.90 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then recrystallized to obtain 2.4 g of Compound 99 (yield 60%).

MS[M+H]+=1289

Synthesis Example 100. Synthesis of Compound 100

1) Synthesis of Compound 100

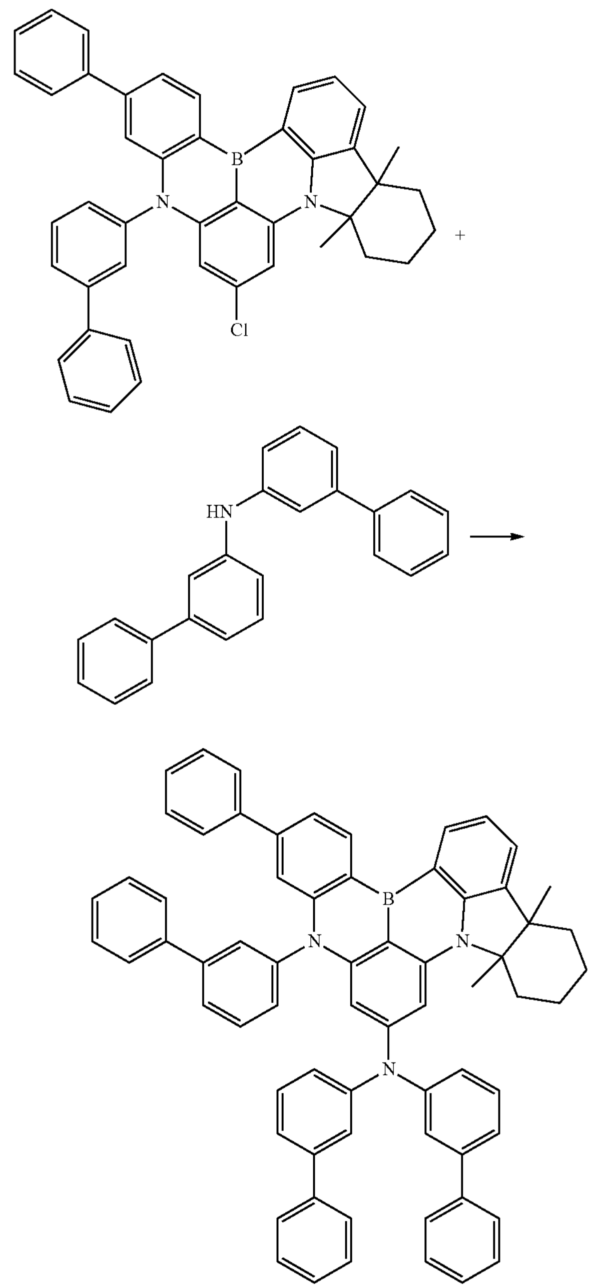

100

After 2 g of Intermediate I97, 1.01 g of di([1,1'-biphenyl]-3-yl)amine, 0.90 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then recrystallized to obtain 2.1 g of Compound 100 (yield 73%).

MS[M+H]+=923

Synthesis Example 101. Synthesis of Compound 101

1) Synthesis of Intermediate I98

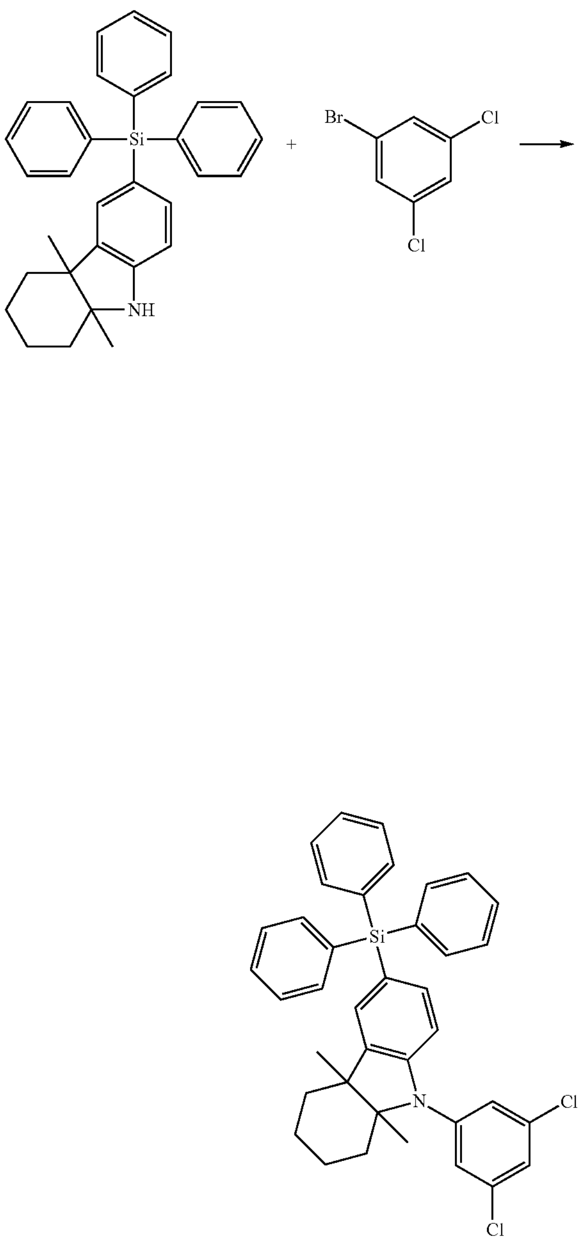

I98

After 10 g of 4a,9a-dimethyl-6-(triphenylsilyl)-2,3,4,4a,9,9a-hexahydro-1H-carbazole, 4.91 g of 1-bromo-3,5-dichlorobenzene, 6.28 g of sodium-tert-butoxide, and 0.11 g of bis(tri-tert-butylphosphine)palladium(0) were put into 150 ml of toluene under nitrogen atmosphere, the resulting mixture was stirred for 3 hours. After the completion of the reaction, the resulting product was extracted, and then purified with an ethyl acetate:hexane column to obtain 11 g of Intermediate I98 (yield 84%).

MS[M+H]+=605

2) Synthesis of Intermediate I99

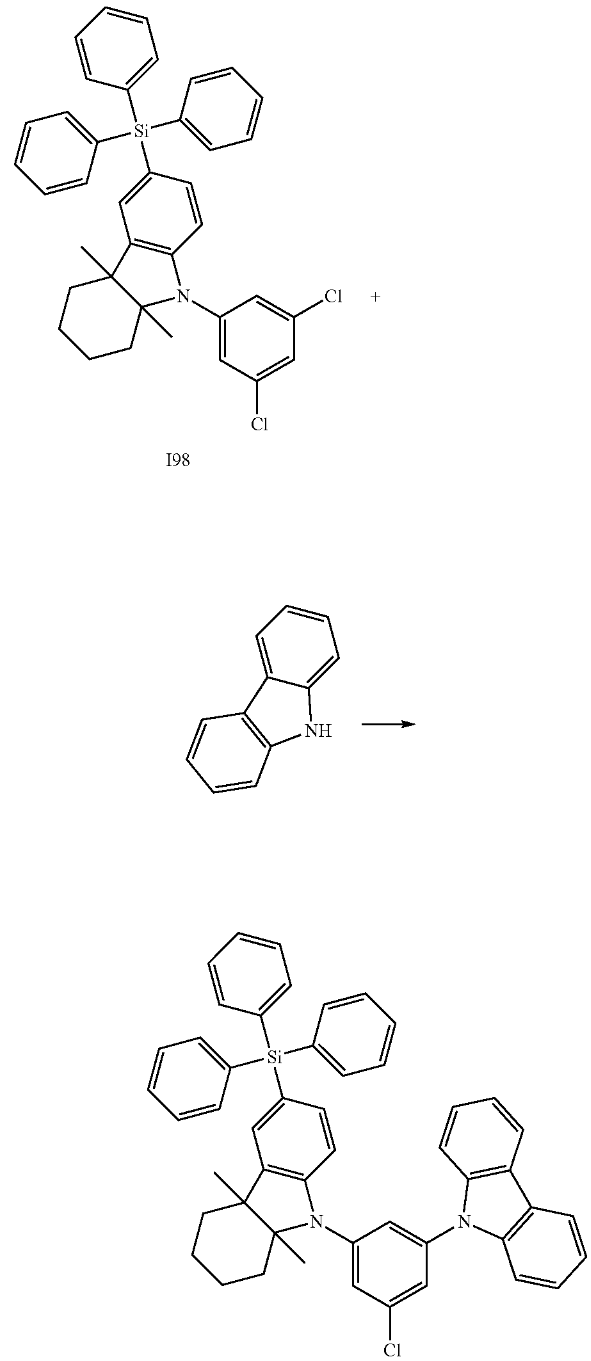

I99

After 11 g of Intermediate I98, 3.04 g of 9H-carbazole, 0.09 g of bis(tri-tert-butylphosphine)palladium(0), and 5.24 g of sodium-tert-butoxide were put into 180 ml of toluene under nitrogen atmosphere, the resulting mixture was stirred for 3 hours. After the completion of the reaction, the resulting product was extracted, and then purified with an ethyl acetate:hexane column to obtain 10 g of Intermediate I99 (yield 75%).

MS[M+H]+=736

3) Synthesis of Intermediate I100

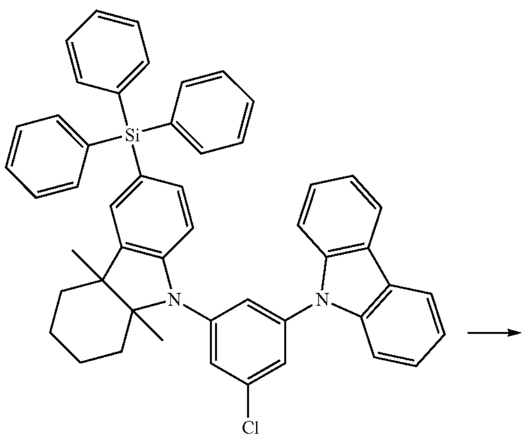

I99

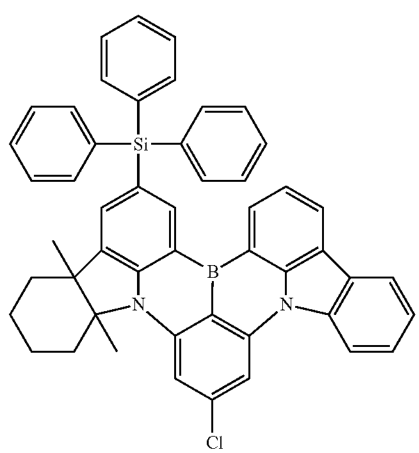

I100

Under nitrogen atmosphere, 10 g of Intermediate I99, 15.97 g of boron triiodide, and 3.62 g of triphenylborane were stirred using dichlorobenzene at 160° C. for 6 hours. The reaction was completed, and the resulting product was extracted at room temperature, and then recrystallized to obtain 4.0 g of Intermediate I100 (yield 40.0%).

MS[M+H]+=744

4) Synthesis of Compound 101

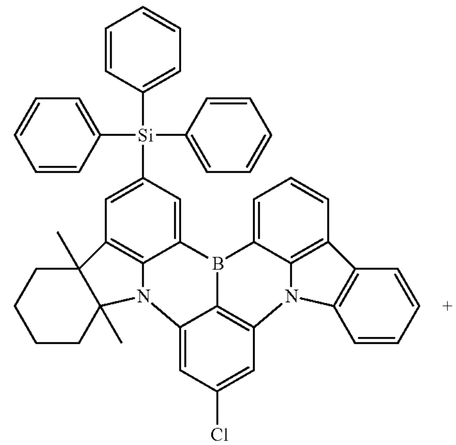

I100

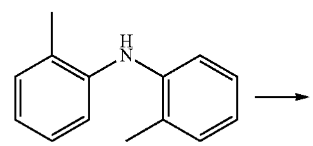

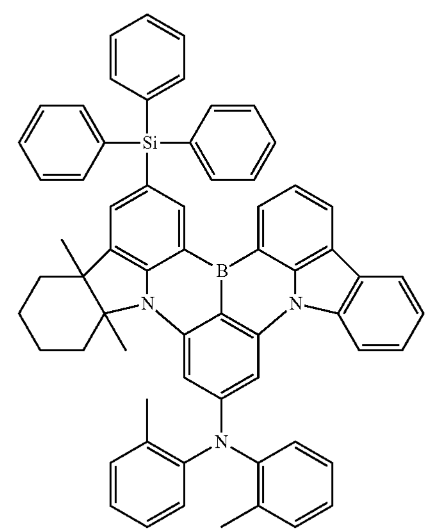

101

After 2 g of Intermediate I100, 0.53 g of di-o-tolylamine, 0.78 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then recrystallized to obtain 1.8 g of Compound 101 (yield 74%).

MS[M+H]+=905

Synthesis Example 102. Synthesis of Compound 102

1) Synthesis of Compound 102

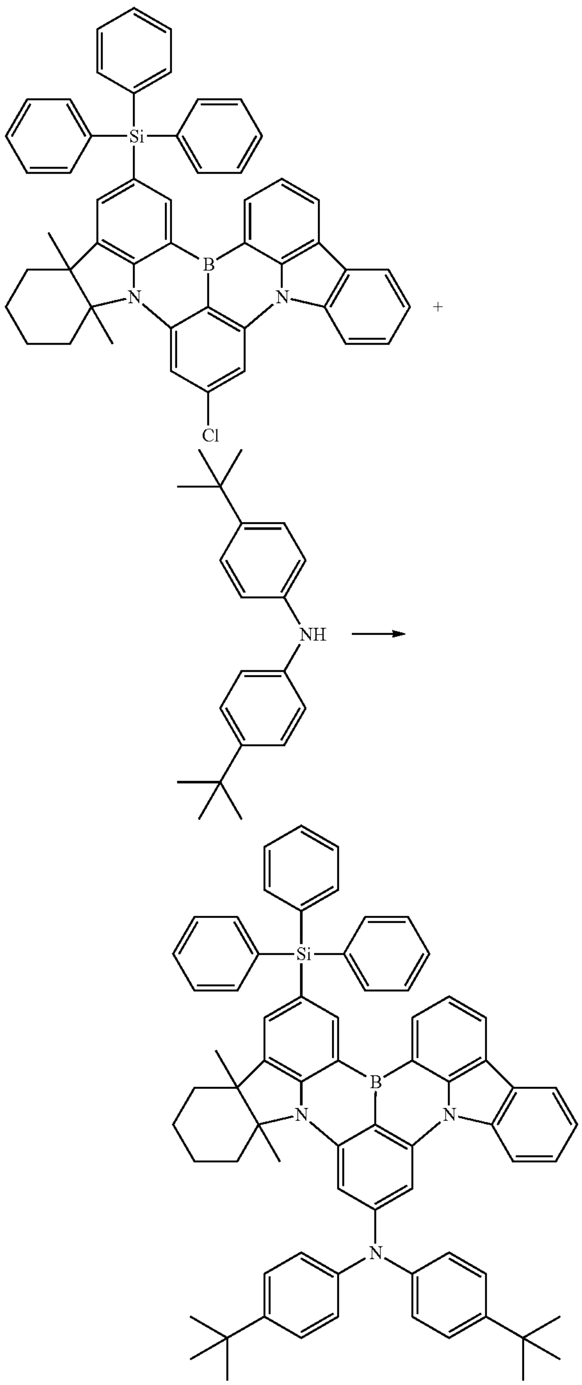

102

After 2 g of Intermediate I100, 0.75 g of bis(4-(tert-butyl)phenyl)amine, 0.77 g of sodium-tert-butoxide, and 0.01 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.8 g of Compound 102 (yield 68%).

MS[M+H]+=989

Synthesis Example 103. Synthesis of Compound 103

1) Synthesis of Intermediate I100

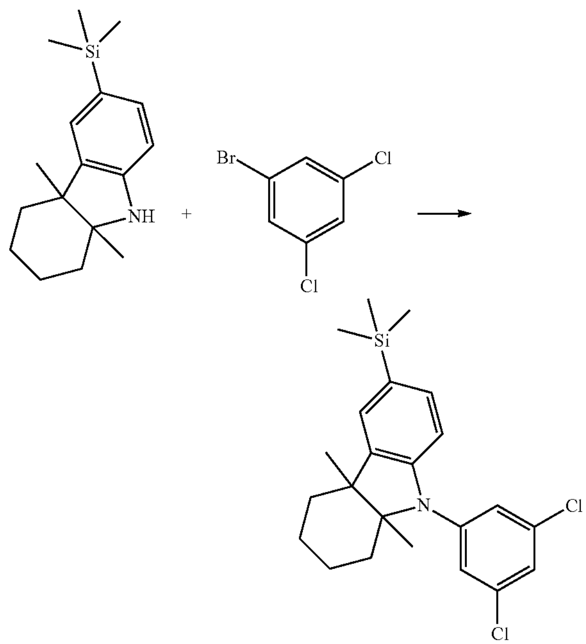

I100

After 15 g of 4a,9a-dimethyl-6-(trimethylsilyl)-2,3,4,4a,9,9a-hexahydro-1H-carbazole, 12.39 g of 1-bromo-3,5-dichlorobenzene, 15.81 g of sodium-tert-butoxide, and 0.28 g of bis(tri-tert-butylphosphine)palladium(0) were put into 300 ml of toluene under nitrogen atmosphere, the resulting mixture was stirred for 3 hours. After the completion of the reaction, the resulting product was extracted, and then purified with an ethyl acetate:hexane column to obtain 18 g of Intermediate I100 (yield 78%).

MS[M+H]+=419

2) Synthesis of Intermediate I101

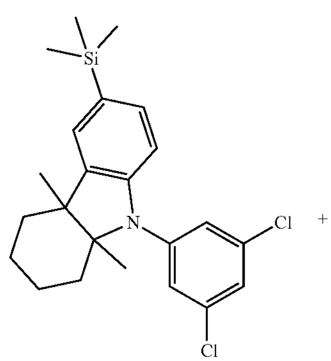

I100

-continued

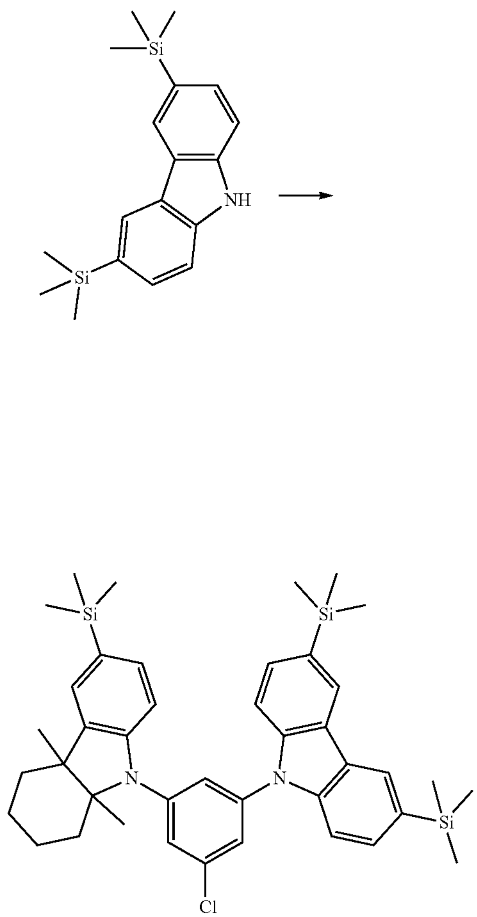

I101

After 15 g of Intermediate I100, 11.16 g of 3,6-bis(trimethylsilyl)-9H-carbazole, 0.18 g of bis(tri-tert-butylphosphine)palladium(0), and 10.33 g of sodium-tert-butoxide were put into 180 ml of toluene under nitrogen atmosphere, the resulting mixture was stirred for 3 hours. After the completion of the reaction, the resulting product was extracted, and then purified with an ethyl acetate:hexane column to obtain 16 g of Intermediate I101 (yield 64%).

MS[M+H]+=694

3) Synthesis of Intermediate I102

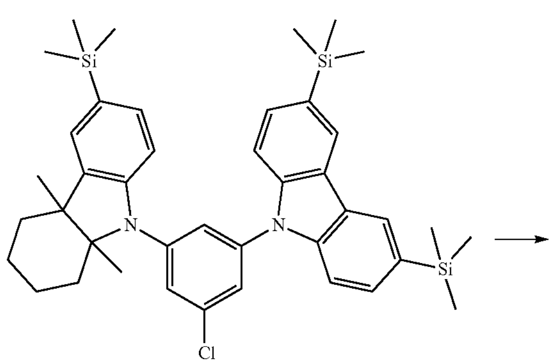

I101

-continued

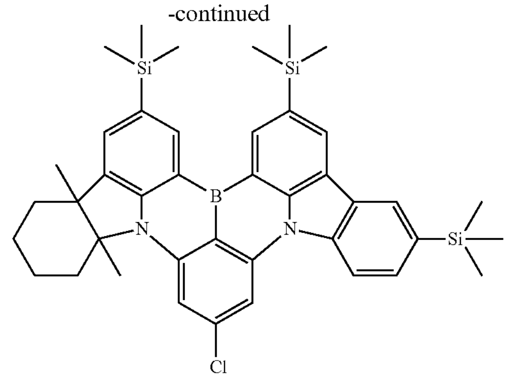

I102

Under nitrogen atmosphere, 15 g of Intermediate I101, 25.4 g of boron triiodide, and 5.76 g of triphenylborane were stirred using dichlorobenzene at 160° C. for 6 hours. The reaction was completed, and the resulting product was extracted at room temperature, and then column-purified with ethyl acetate:hexane, and then recrystallized to obtain 5.5 g of Intermediate I102 (yield 36.0%).

MS[M+H]+=702

4) Synthesis of Compound 103

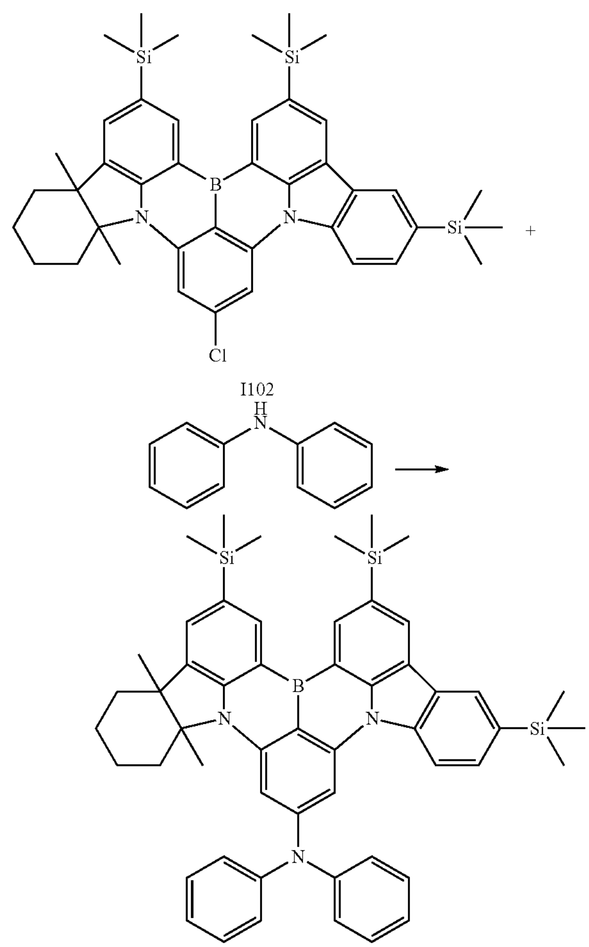

I102

103

After 2 g of Intermediate I102, 0.48 g of diphenylamine, 0.82 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then recrystallized to obtain 1.5 g of Compound 103 (yield 63%).

MS[M+H]+=835

Synthesis Example 104. Synthesis of Compound 104

1) Synthesis of Compound 104

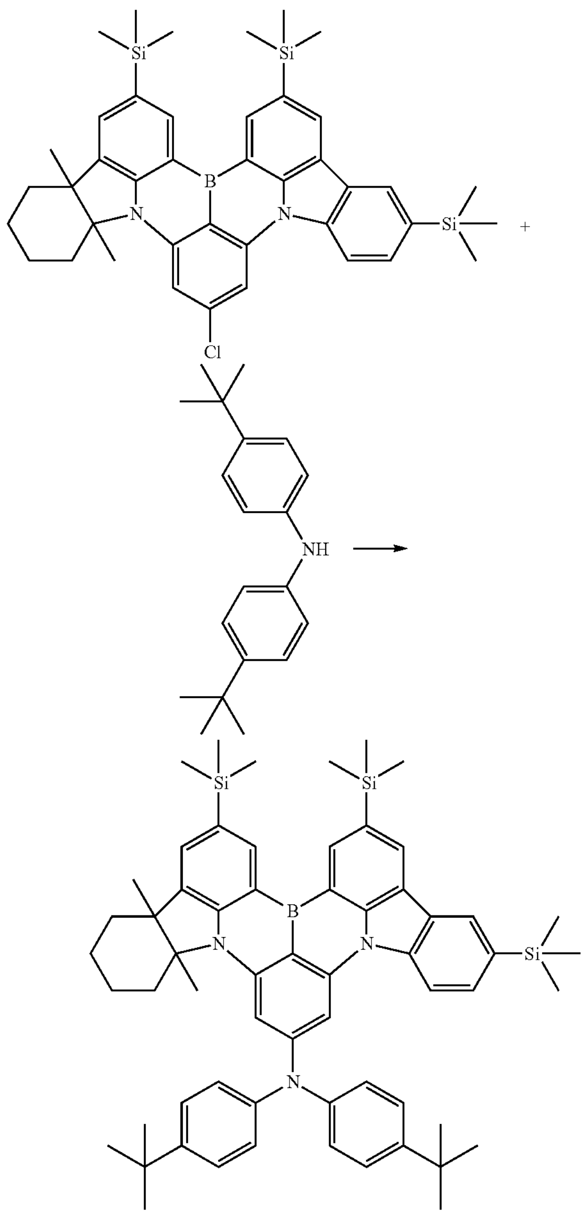

104

After 2 g of Intermediate I102, 0.80 g of bis(4-(tert-butyl) phenyl)amine, 0.82 g of sodium-tert-butoxide, and 0.02 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.6 g of Compound 104 (yield 59%).

MS[M+H]+=947

Synthesis Example 105. Synthesis of Compound 105

1) Synthesis of Compound 105

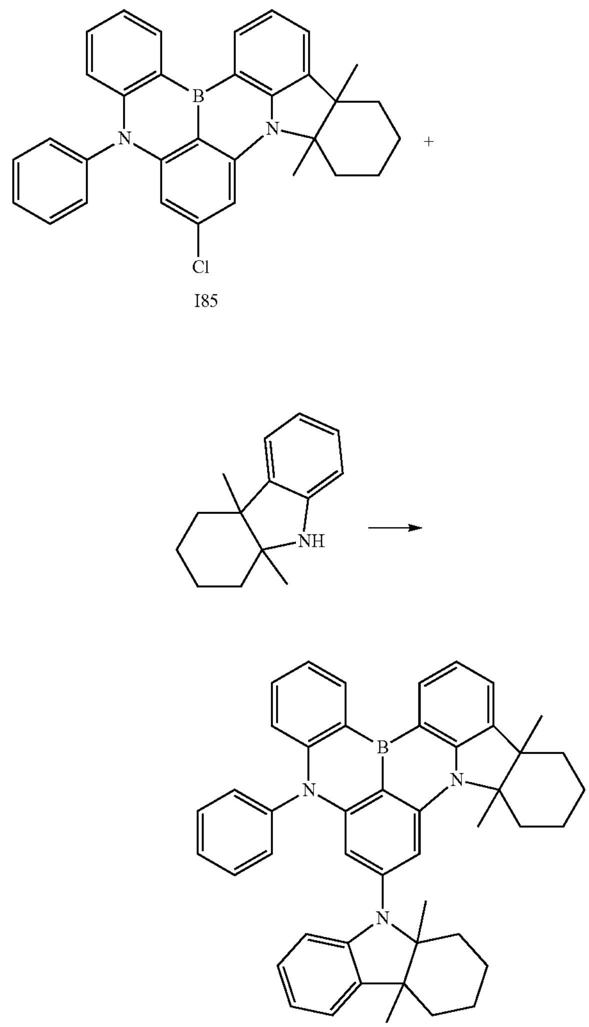

I85

105

After 2 g of Intermediate I85, 0.86 g of 4a,9a-dimethyl-2,3,4,4a,9,9a-hexahydro-1H-carbazole, 1.18 g of sodium-tert-butoxide, and 0.06 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 2.1 g of Compound 105 (yield 78%).

MS[M+H]+=652

Synthesis Example 106. Synthesis of Compound 106

1) Synthesis of Intermediate I103

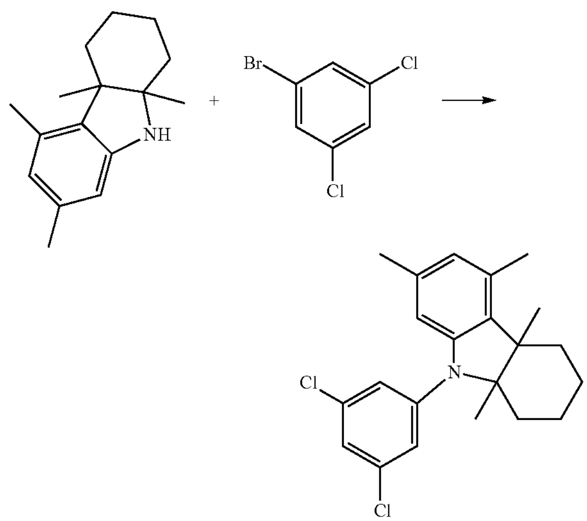

I103

After 40 g of 4a,5,7,9a-tetramethyl-2,3,4,4a,9,9a-hexahydro-1H-carbazole, 39.4 g of 1-bromo-3,5-dichlorobenzene, 50.3 g of sodium-tert-butoxide, and 2.67 g of bis(tri-tert-butylphosphine)palladium(0) were put into 800 ml of toluene under nitrogen atmosphere, the resulting mixture was stirred for 6 hours. After the completion of the reaction, the resulting product was extracted, and then purified with an ethyl acetate:hexane column to obtain 45 g of Intermediate I103 (yield 69%).

MS[M+H]+=375

2) Synthesis of Intermediate I104

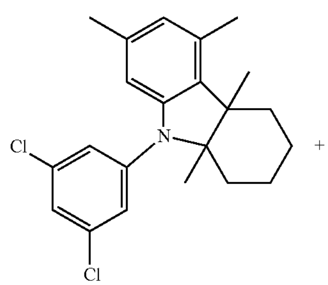

I103

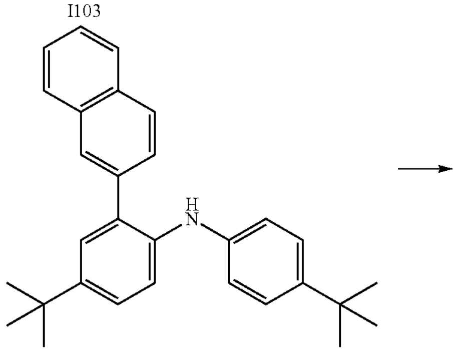

-continued

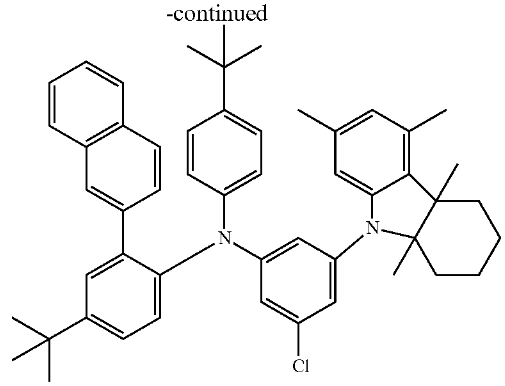

I104

After 30 g of Intermediate I103, 32.7 g of 4-(tert-butyl)-N-(4-(tert-butyl)phenyl)-2-(naphthalen-2-yl)aniline, 23.1 g of sodium-tert-butoxide, and 1.23 g of bis(tri-tert-butylphosphine)palladium(0) were put into 600 ml of toluene under nitrogen atmosphere, the resulting mixture was stirred for 4 hours. After the completion of the reaction, the resulting product was extracted, and then purified with an ethyl acetate:hexane column to obtain 31 g of Intermediate I104 (yield 52%).

MS[M+H]+=746

3) Synthesis of Intermediate I105

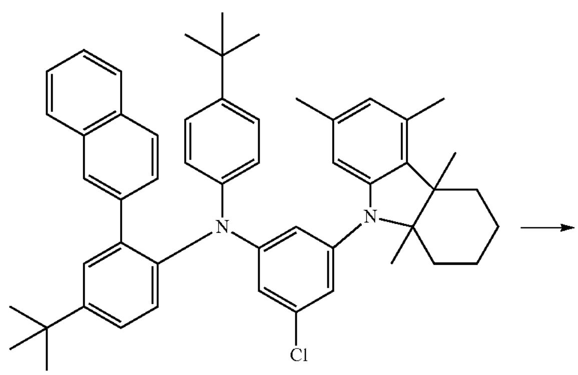

I104

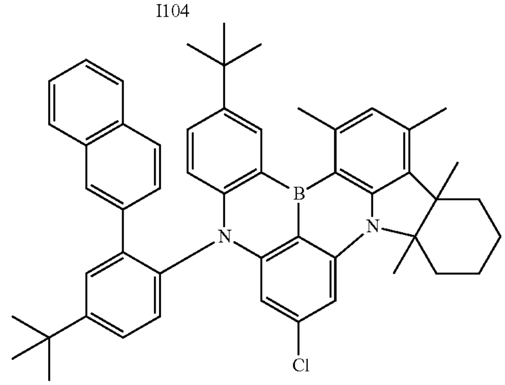

I105

Under nitrogen atmosphere, 15 g of Intermediate I104, 23.6 g of boron triiodide, and 5.4 g of triphenylborane were stirred using 150 ml of dichlorobenzene at 160° C. for 6 hours. The reaction was completed, and the resulting product was extracted at room temperature, and then column-purified with ethyl acetate:hexane, and then recrystallized to obtain 6.9 g of Intermediate I105 (yield 47%).

MS [M+H]+=736

4) Synthesis of Compound 106

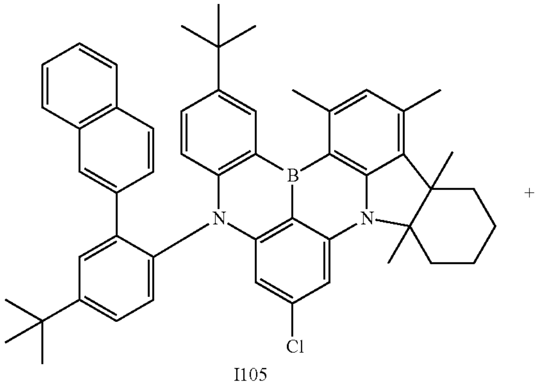

I105

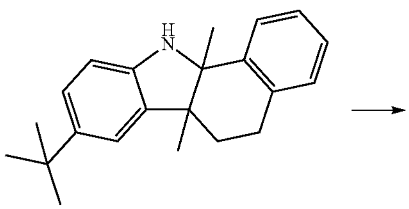

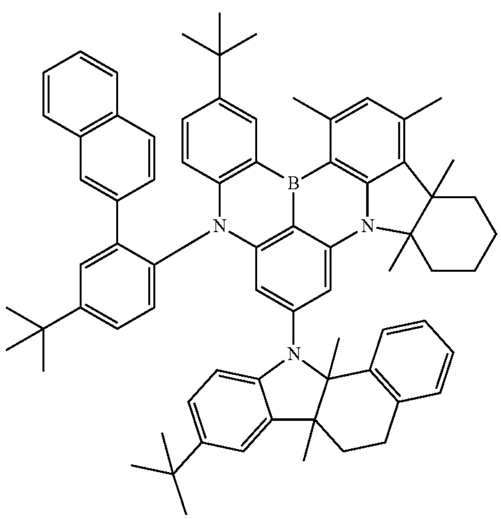

106

After 2 g of Intermediate I105, 0.83 g of 8-(tert-butyl)-6,6a,11,11a-tetrahydro-5H-benzo[a]carbazole, 0.78 g of sodium-tert-butoxide, and 0.04 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.8 g of Compound 106 (yield 65%).

MS [M+H]+=1023

Synthesis Example 107. Synthesis of Compound 107

1) Synthesis of Intermediate I106

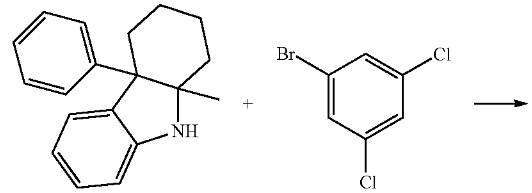

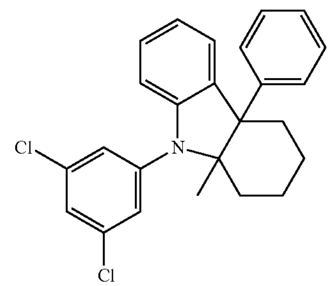

I106

After 40 g of 9a-methyl-4a-phenyl-2,3,4,4a,9,9a-hexahydro-1H-carbazole, 34.3 g of 1-bromo-3,5-dichlorobenzene, 43.8 g of sodium-tert-butoxide, and 2.32 g of bis(tri-tert-butylphosphine)palladium(0) were put into 800 ml of toluene under nitrogen atmosphere, the resulting mixture was stirred for 6 hours. After the completion of the reaction, the resulting product was extracted, and then purified with an ethyl acetate:hexane column to obtain 41 g of Intermediate I106 (yield 66%).

MS[M+H]+=409

2) Synthesis of Intermediate I107

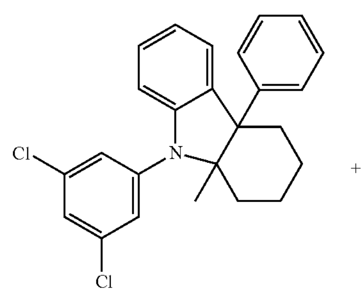

I106

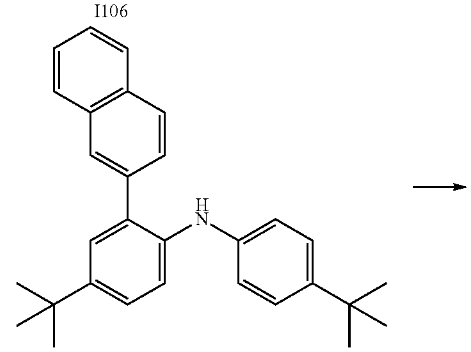

-continued

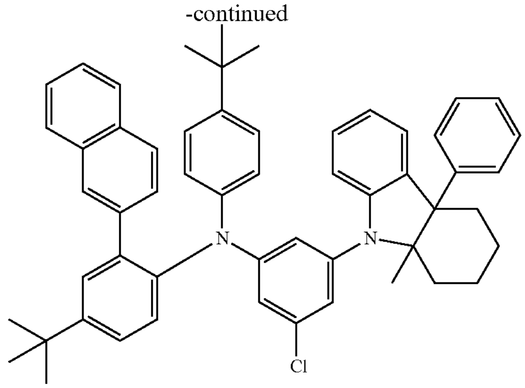

I107

After 30 g of Intermediate I106, 29.9 g of 4-(tert-butyl)-N-(4-(tert-butyl)phenyl)-2-(naphthalen-2-yl)aniline, 21.2 g of sodium-tert-butoxide, and 1.13 g of bis(tri-tert-butylphosphine)palladium(0) were put into 600 ml of toluene under nitrogen atmosphere, the resulting mixture was stirred for 4 hours. After the completion of the reaction, the resulting product was extracted, and then purified with an ethyl acetate:hexane column to obtain 29 g of Intermediate I107 (yield 51%).

MS[M+H]+=780

3) Synthesis of Intermediate I108

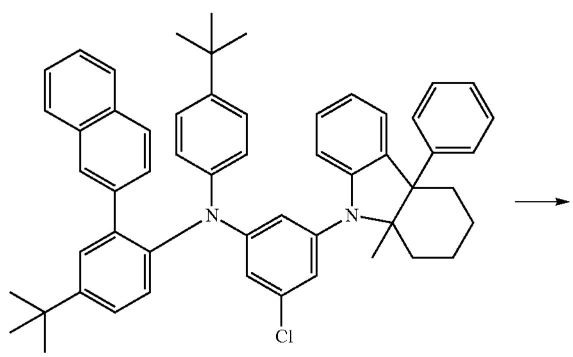

I107

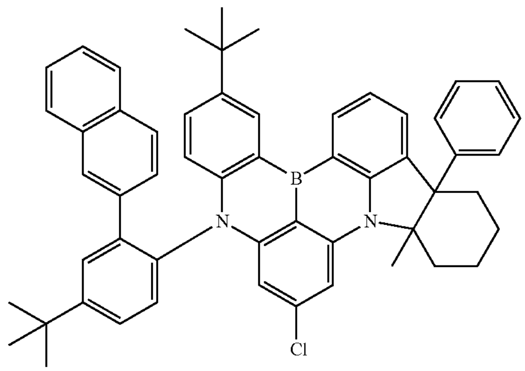

I108

Under nitrogen atmosphere, 15 g of Intermediate I107, 22.6 g of boron triiodide, and 5.1 g of triphenylborane were stirred using 150 ml of dichlorobenzene at 160° C. for 6 hours. The reaction was completed, and the resulting product was extracted at room temperature, and then column-purified with ethyl acetate:hexane, and then recrystallized to obtain 6.9 g of Intermediate I108 (yield 46%).

MS[M+H]+=788

4) Synthesis of Compound 107

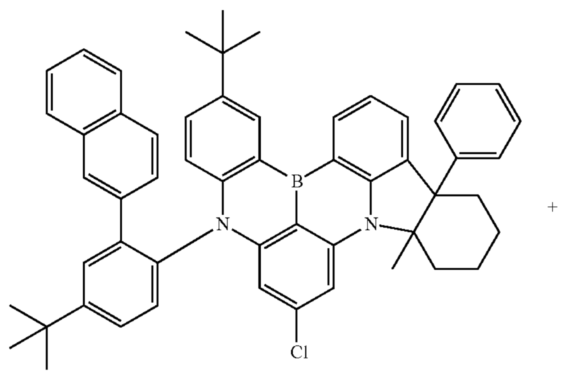

I108

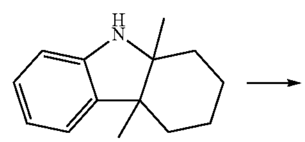

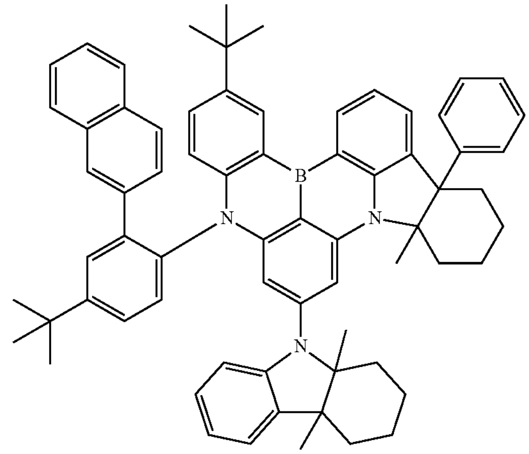

107

After 2 g of Intermediate I108, 0.78 g of 4a,9a-dimethyl-2,3,4,4a,9,9a-hexahydro-1H-carbazole, 0.73 g of sodium-tert-butoxide, and 0.04 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.6 g of Compound 107 (yield 66%).

MS[M+H]+=953

Synthesis Example 108. Synthesis of Compound 108

1) Synthesis of Intermediate I109

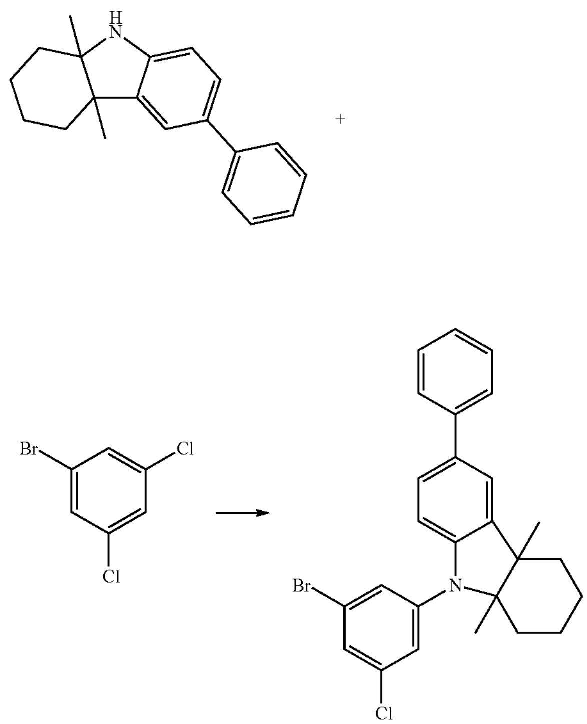

I109

After 40 g of 4a,9a-dimethyl-6-phenyl-2,3,4,4a,9,9a-hexahydro-1H-carbazole, 32.6 g of 1-bromo-3,5-dichlorobenzene, 41.6 g of sodium-tert-butoxide, and 2.21 g of bis(tri-tert-butylphosphine)palladium(0) were put into 800 ml of toluene under nitrogen atmosphere, the resulting mixture was stirred for 6 hours. After the completion of the reaction, the resulting product was extracted, and then purified with an ethyl acetate: hexane column to obtain 39 g of Intermediate I109 (yield 64%).

MS[M+H]+=423

2) Synthesis of Intermediate I110

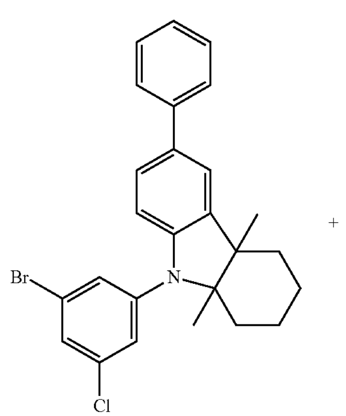

I109

-continued

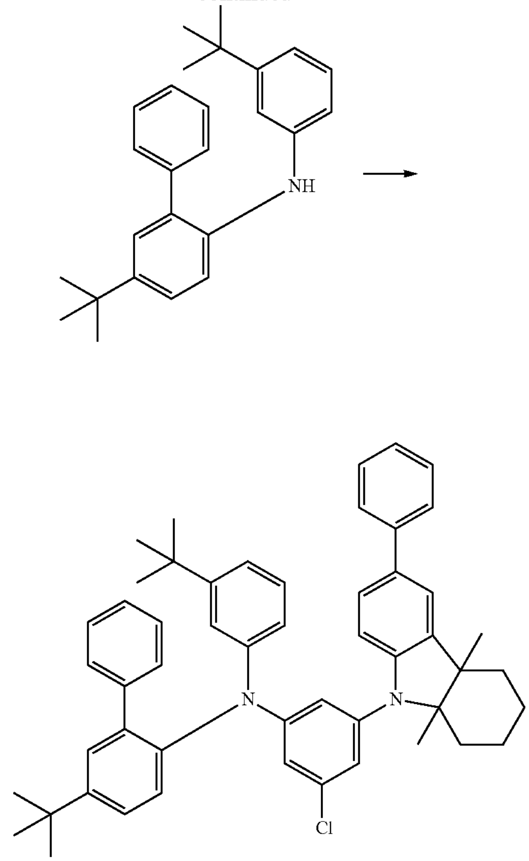

I110

After 30 g of Intermediate I109, 28.9 g of 5-(tert-butyl)-N-(3-(tert-butyl)phenyl)-[1,1'-biphenyl]-2-amine, 20.5 g of sodium-tert-butoxide, and 1.01 g of bis(tri-tert-butylphosphine)palladium(0) were put into 600 ml of toluene under nitrogen atmosphere, the resulting mixture was stirred for 4 hours. After the completion of the reaction, the resulting product was extracted, and then purified with an ethyl acetate:hexane column to obtain 25 g of Intermediate I110 (yield 47%).

MS[M+H]+=744

3) Synthesis of Intermediate I111

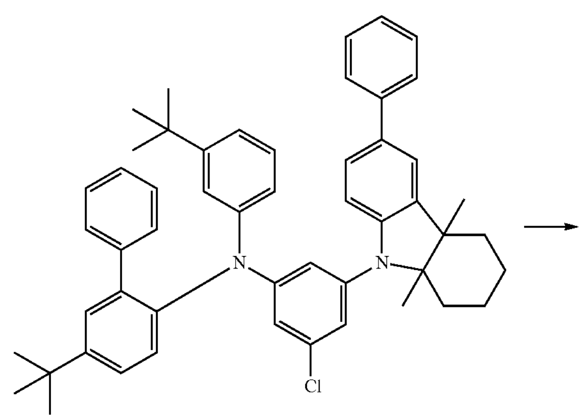

I110

-continued

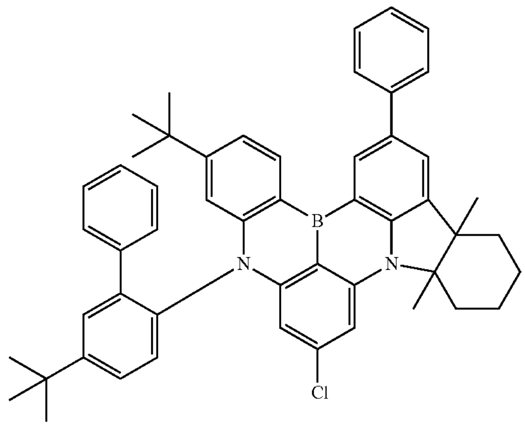

I111

Under nitrogen atmosphere, 15 g of Intermediate I110, 23.7 g of boron triiodide, and 5.4 g of triphenylborane were stirred using 150 ml of dichlorobenzene at 160° C. for 6 hours. The reaction was completed, and the resulting product was extracted at room temperature, and then column-purified with ethyl acetate:hexane, and then recrystallized to obtain 5.9 g of Intermediate I111 (yield 39%).

MS[M+H]+=752

4) Synthesis of Compound 108

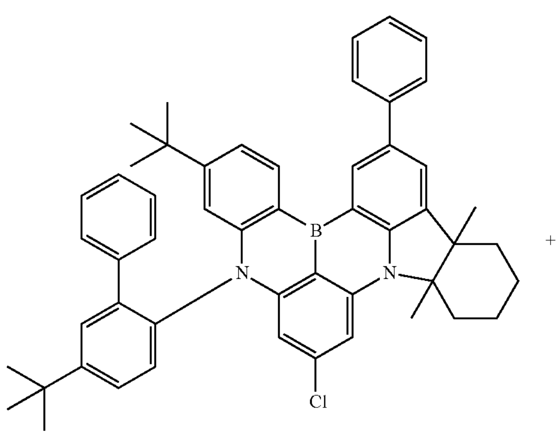

I111

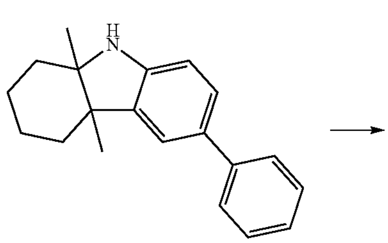

-continued

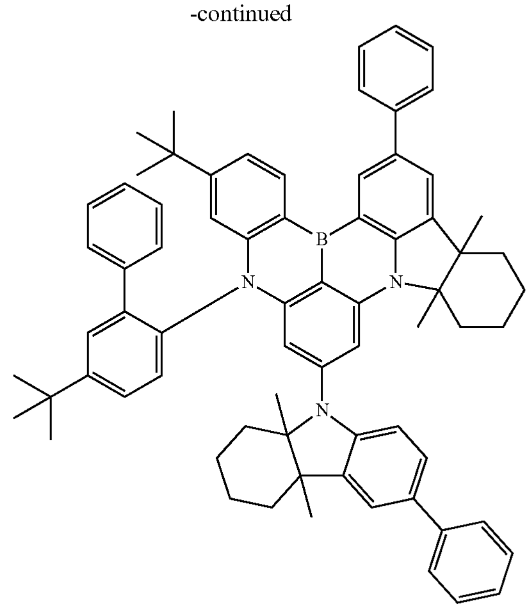

108

After 2 g of Intermediate I111, 0.74 g of 4a,9a-dimethyl-6-phenyl-2,3,4,4a,9,9a-hexahydro-1H-carbazole, 0.77 g of sodium-tert-butoxide, and 0.04 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.7 g of Compound 108 (yield 64%).

MS[M+H]+=993

Synthesis Example 109. Synthesis of Compound 109

1) Synthesis of Intermediate I112

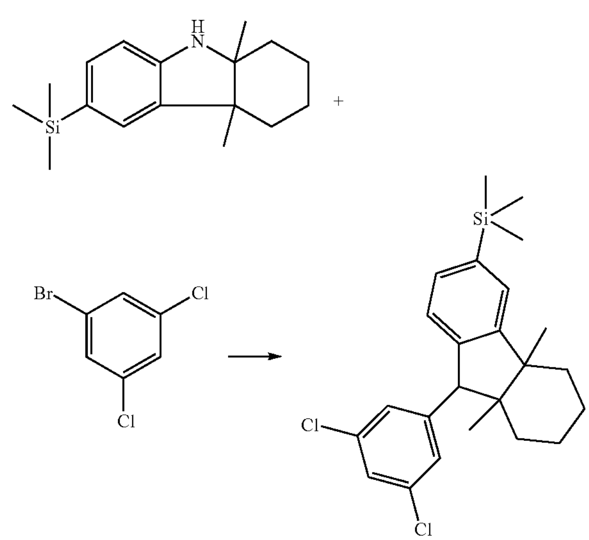

I112

After 40 g of 4a,9a-dimethyl-6-(trimethylsilyl)-2,3,4,4a,9,9a-hexahydro-1H-carbazole, 33.0 g of 1-bromo-3,5-dichlorobenzene, 42.2 g of sodium-tert-butoxide, and 2.24 g of bis(tri-tert-butylphosphine)palladium(0) were put into 800 ml of toluene under nitrogen atmosphere, the resulting mixture was stirred for 6 hours. After the completion of the reaction, the resulting product was extracted, and then purified with an ethyl acetate: hexane column to obtain 39 g of Intermediate I112 (yield 64%).

MS[M+H]+=419

2) Synthesis of Intermediate I113

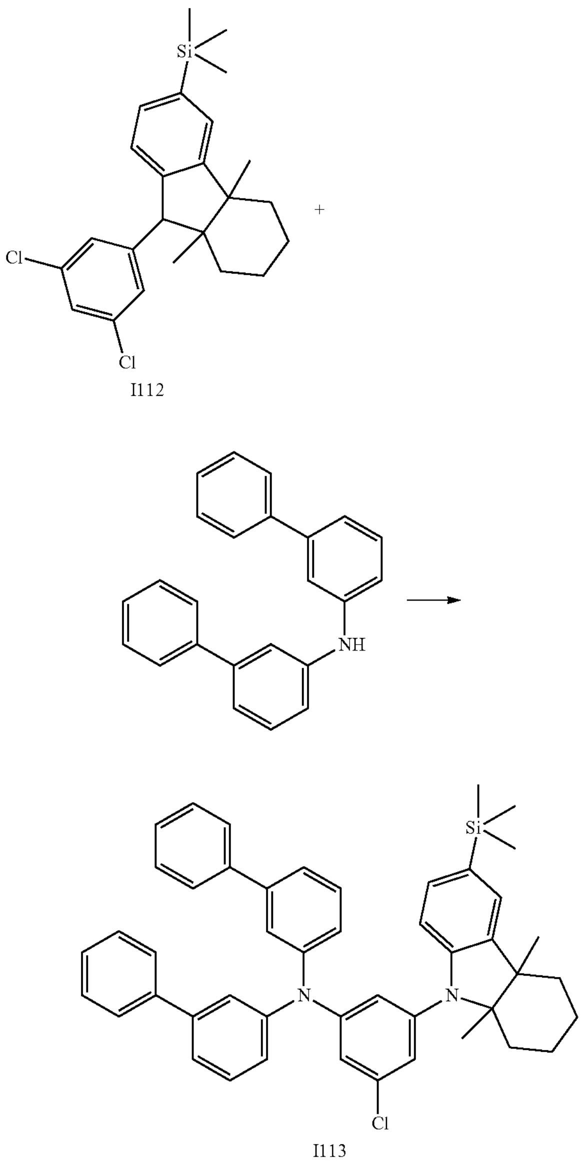

After 30 g of Intermediate I112, 23.0 g of di([1,1'-biphenyl]-3-yl), 20.7 g of sodium-tert-butoxide, and 1.10 g of bis(tri-tert-butylphosphine)palladium(0) were put into 600 ml of toluene under nitrogen atmosphere, the resulting mixture was stirred for 4 hours. After the completion of the reaction, the resulting product was extracted, and then purified with an ethyl acetate:hexane column to obtain 24 g of Intermediate I113 (yield 48%).

MS[M+H]+=704

3) Synthesis of Intermediate I114

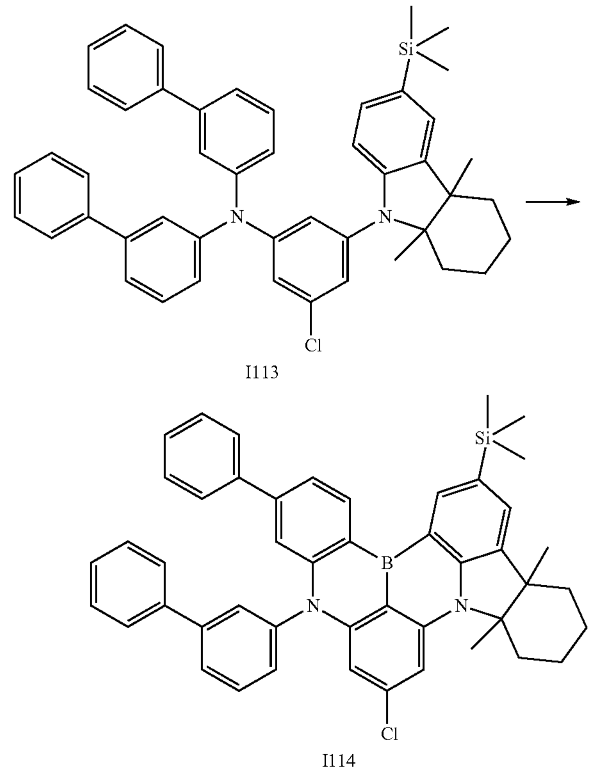 [SMILES: "I113" ; "I114" ; CC12CCCCC1(C)N(c1cc(Cl)cc(N(c3cccc(-c4ccccc4)c3)c3cccc(-c4ccccc4)c3)c1)c1ccc([Si](C)(C)C)cc12 ; CC12CCCCC1(C)N1c3cc(Cl)cc4c3B(c3ccc(-c5ccccc5)cc3N4c3cccc(-c4ccccc4)c3)c3cc([Si](C)(C)C)cc2c31]

Under nitrogen atmosphere, 15 g of Intermediate I113, 25.0 g of boron triiodide, and 5.7 g of triphenylborane were stirred using 150 ml of dichlorobenzene at 160° C. for 6 hours. The reaction was completed, and the resulting product was extracted at room temperature, and then column-purified with ethyl acetate:hexane, and then recrystallized to obtain 6.0 g of Intermediate I114 (yield 40%).

MS[M+H]+=712

4) Synthesis of Compound 109

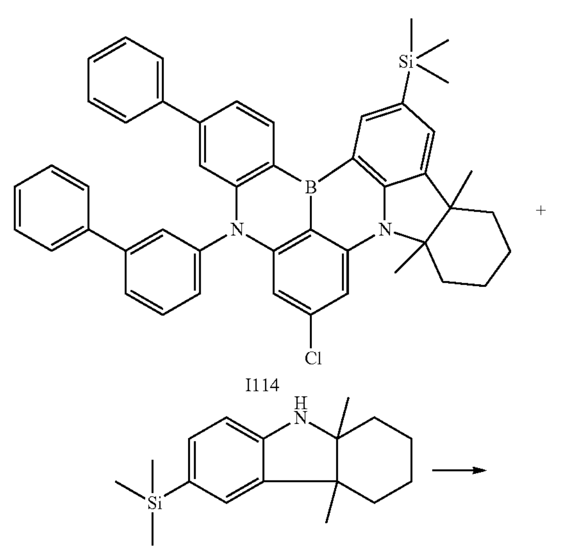

-continued

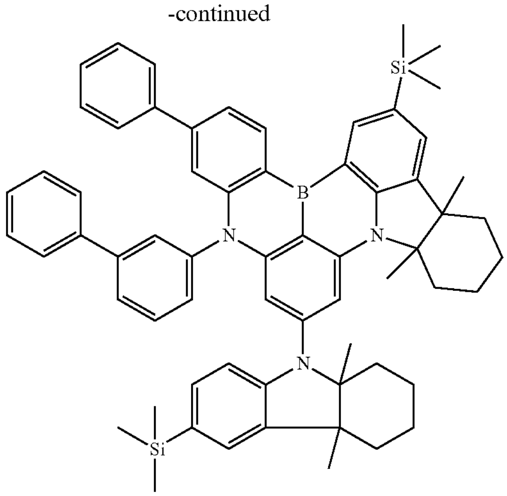

109

After 2 g of Intermediate I114, 0.77 g of 4a,9a-dimethyl-6-(trimethylsilyl)-2,3,4,4a,9,9a-hexahydro-1H-carbazole, 0.81 g of sodium-tert-butoxide, and 0.04 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.8 g of Compound 109 (yield 68%).

MS[M+H]+=949

Synthesis Example 110. Synthesis of Compound 110

1) Synthesis of Intermediate I115

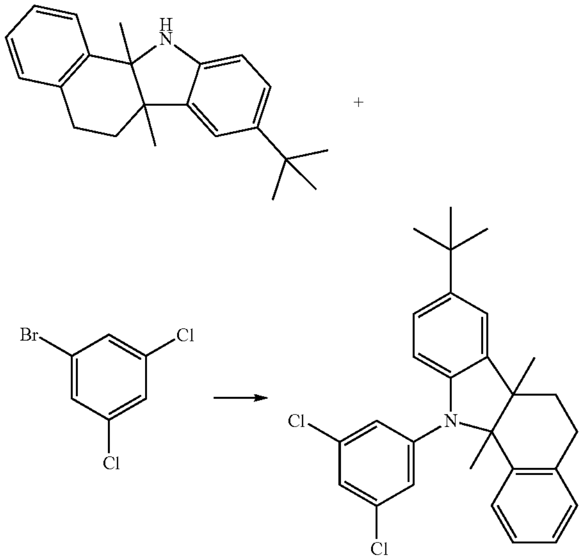

I115

After 40 g of 8-(tert-butyl)-6a,11a-dimethyl-6,6a,11,11a-tetrahydro-5H-benzo[a]carbazole, 29.6 g of 1-bromo-3,5-dichlorobenzene, 37.8 g of sodium-tert-butoxide, and 2.0 g of bis(tri-tert-butylphosphine)palladium(0) were put into 800 ml of toluene under nitrogen atmosphere, the resulting mixture was stirred for 6 hours. After the completion of the reaction, the resulting product was extracted, and then purified with an ethyl acetate:hexane column to obtain 38 g of Intermediate I115 (yield 64%).

MS[M+H]+=451

2) Synthesis of Intermediate I116

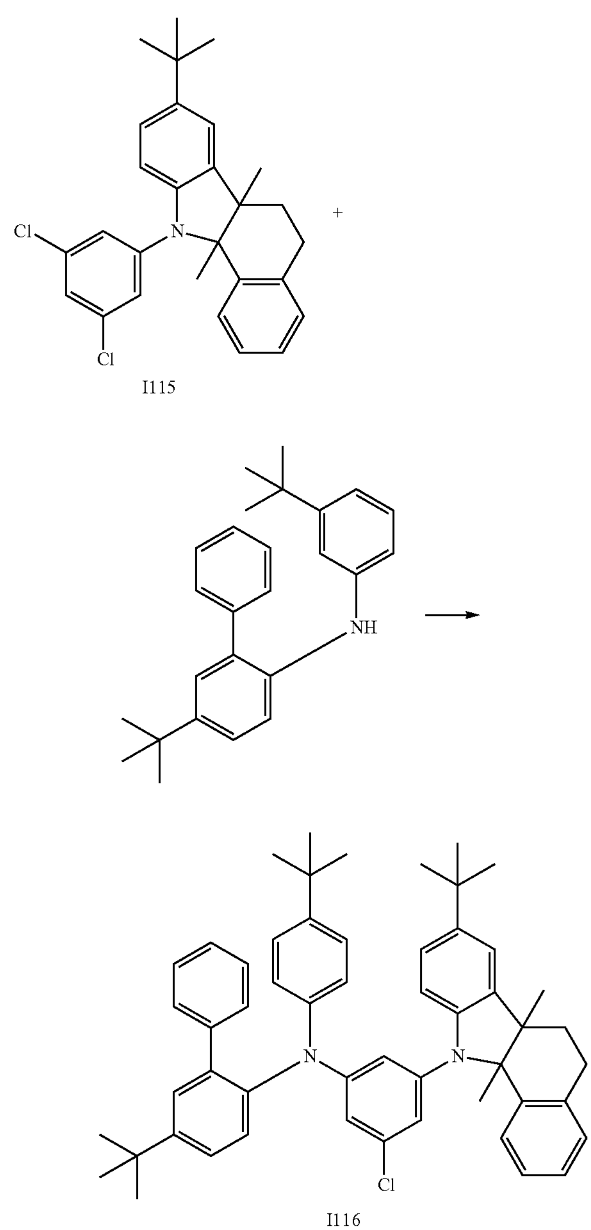

I115

I116

After 30 g of Intermediate I115, 23.8 g of 5-(tert-butyl)-N-(3-(tert-butyl)phenyl)-[1,1'-biphenyl]-2-amine, 19.2 g of sodium-tert-butoxide, and 1.02 g of bis(tri-tert-butylphosphine)palladium(0) were put into 600 ml of toluene under nitrogen atmosphere, the resulting mixture was stirred for 4 hours. After the completion of the reaction, the resulting product was extracted, and then purified with an ethyl acetate:hexane column to obtain 25 g of Intermediate I116 (yield 49%).

MS[M+H]+=772

3) Synthesis of Intermediate I117

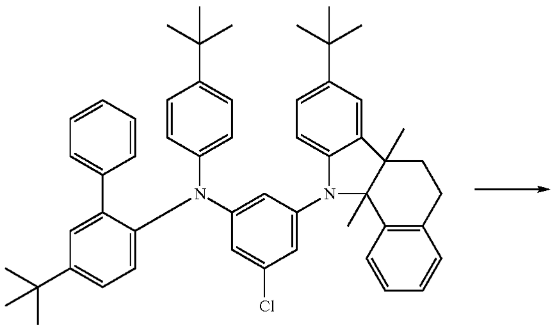

I116

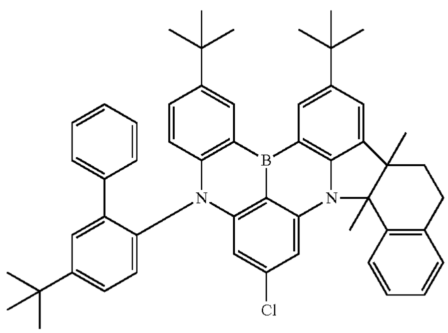

I117

Under nitrogen atmosphere, 15 g of Intermediate I116, 22.8 g of boron triiodide, and 5.2 g of triphenylborane were stirred using 150 ml of dichlorobenzene at 160° C. for 6 hours. The reaction was completed, and the resulting product was extracted at room temperature, and then column-purified with ethyl acetate:hexane, and then recrystallized to obtain 6.1 g of Intermediate I117 (yield 40%).

MS[M+H]+=780

4) Synthesis of Compound 110

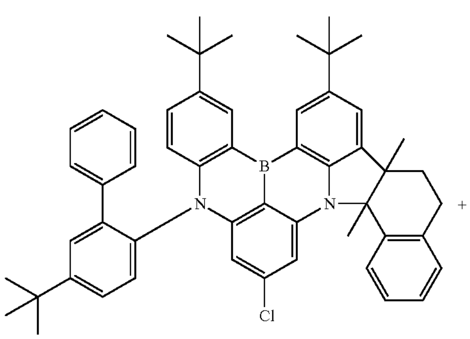

I117

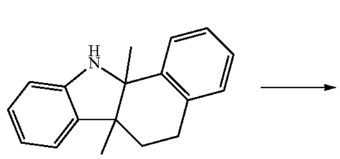

-continued

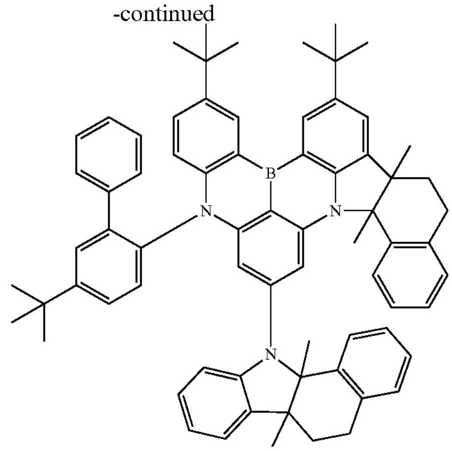

110

After 2 g of Intermediate I117, 0.70 g of 6a,11a-dimethyl-6,6a,11,11a-tetrahydro-5H-benzo[a]carbazole, 0.81 g of sodium-tert-butoxide, and 0.04 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.9 g of Compound 110 (yield 68%).

MS[M+H]+=993

Synthesis Example 111. Synthesis of Compound 111

1) Synthesis of Intermediate I118

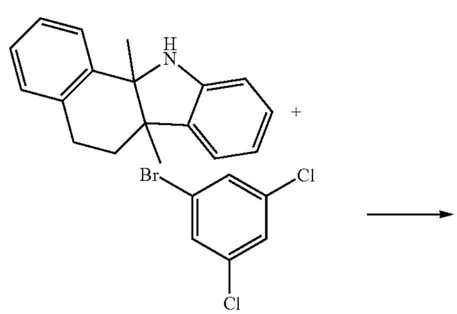

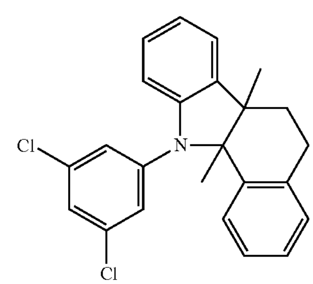

I118

After 40 g of 6a,11a-dimethyl-6,6a,11,11a-tetrahydro-5H-benzo[a]carbazole, 36.2 g of 1-bromo-3,5-dichlorobenzene, 46.2 g of sodium-tert-butoxide, and 2.5 g of bis(tri-tert-butylphosphine)palladium(0) were put into 800 ml of toluene under nitrogen atmosphere, the resulting mixture was stirred for 6 hours. After the completion of the reaction, the resulting product was extracted, and then purified with an ethyl acetate:hexane column to obtain 41 g of Intermediate I118 (yield 65%).

MS[M+H]+=395

2) Synthesis of Intermediate I119

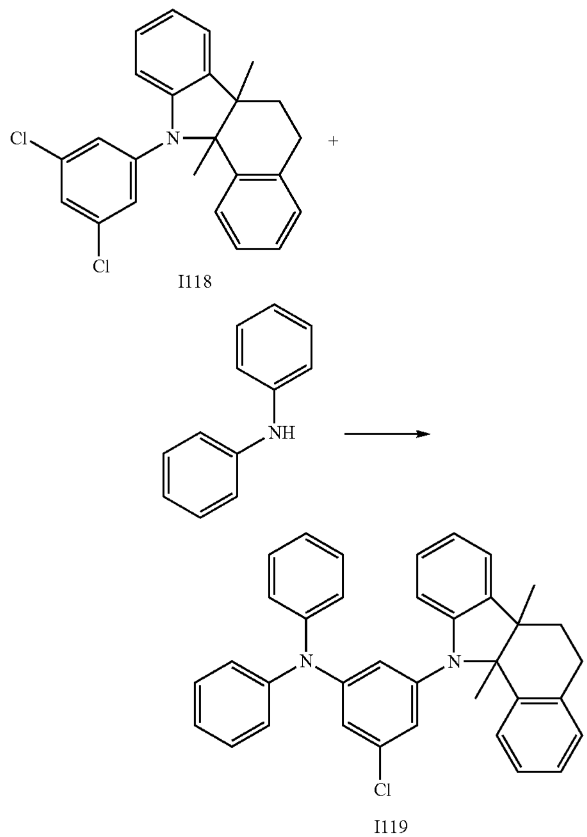

After 30 g of Intermediate I118, 12.9 g of diphenylamine, 21.9 g of sodium-tert-butoxide, and 1.17 g of bis(tri-tert-butylphosphine)palladium(0) were put into 600 ml of toluene under nitrogen atmosphere, the resulting mixture was stirred for 4 hours. After the completion of the reaction, the resulting product was extracted, and then purified with an ethyl acetate:hexane column to obtain 22 g of Intermediate I119 (yield 55%).

MS[M+H]+=528

3) Synthesis of Intermediate I120

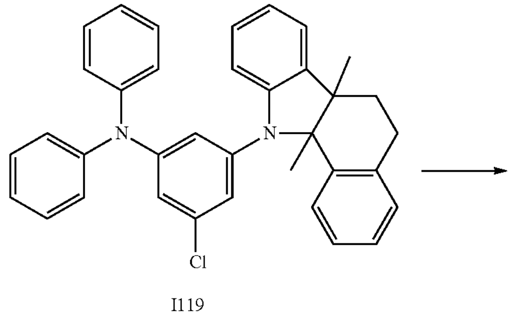

-continued

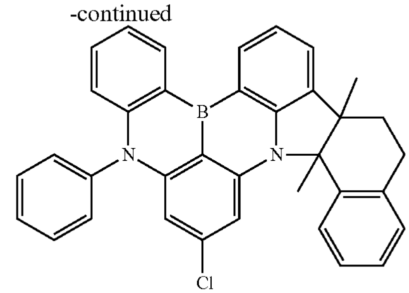

I120

Under nitrogen atmosphere, 15 g of Intermediate I119, 33.4 g of boron triiodide, and 7.6 g of triphenylborane were stirred using 150 ml of dichlorobenzene at 160° C. for 6 hours. The reaction was completed, and the resulting product was extracted at room temperature, and then column-purified with ethyl acetate:hexane, and then recrystallized to obtain 5.9 g of Intermediate I120 (yield 39%).

MS[M+H]+=535

4) Synthesis of Compound 111

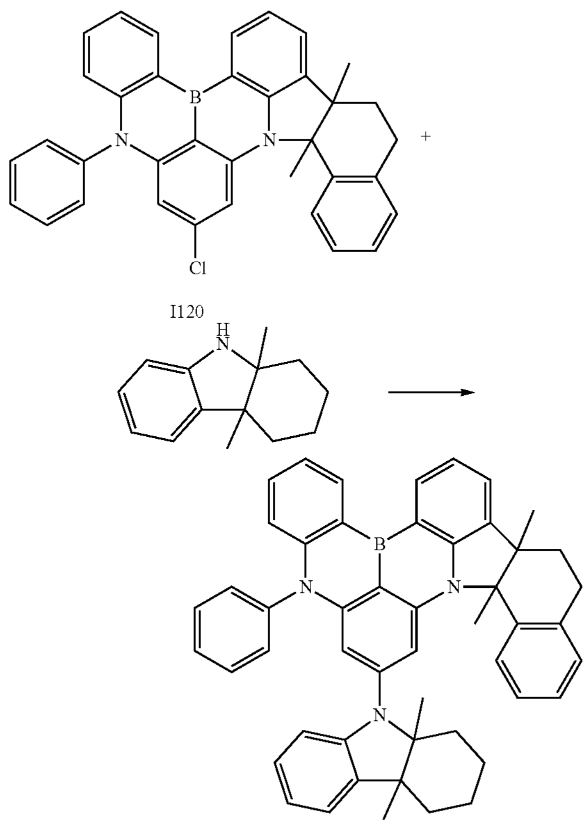

After 2 g of Intermediate I120, 0.75 g of 4a,9a-dimethyl-2,3,4,4a,9,9a-hexahydro-1H-carbazole, 1.1 g of sodium-tert-butoxide, and 0.06 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.6 g of Compound 111 (yield 61%).

MS[M+H]+=700

Synthesis Example 112. Synthesis of Compound 112

1) Synthesis of Intermediate I21

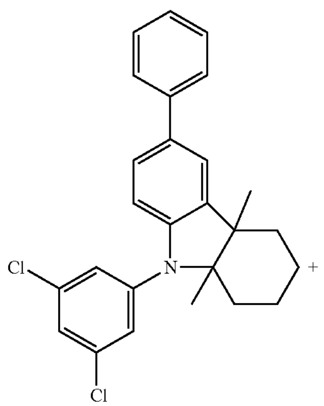

I109

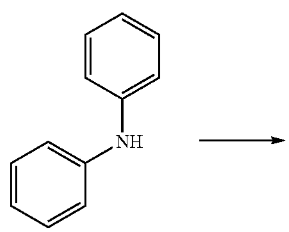

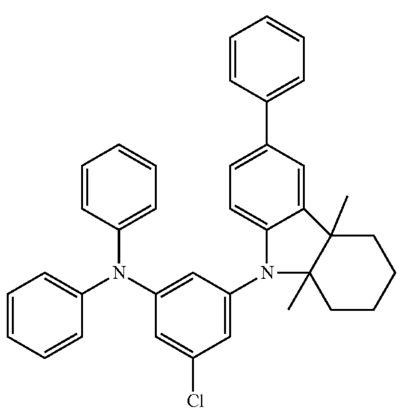

I121

After 30 g of Intermediate I109, 12.0 g of diphenylamine, 20.5 g of sodium-tert-butoxide, and 1.09 g of bis(tri-tert-butylphosphine)palladium(0) were put into 600 ml of toluene under nitrogen atmosphere, the resulting mixture was stirred for 4 hours. After the completion of the reaction, the resulting product was extracted, and then purified with an ethyl acetate:hexane column to obtain 21 g of Intermediate I121 (yield 53%).

MS [M+H]+=556

2) Synthesis of Intermediate I122

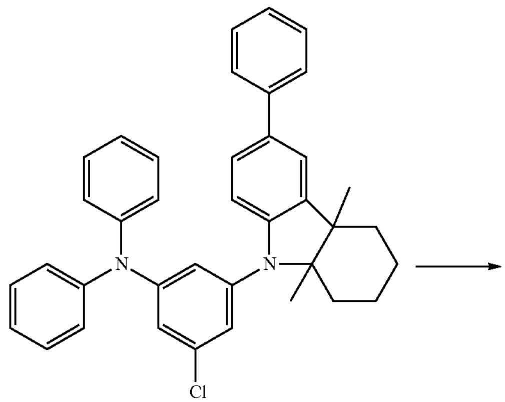

I121

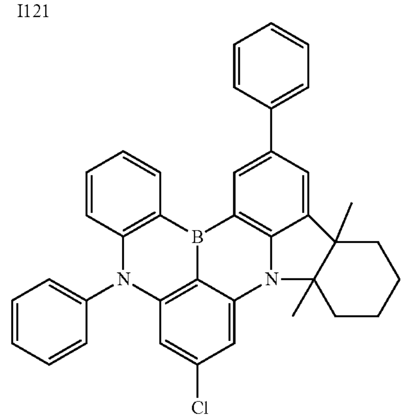

I122

Under nitrogen atmosphere, 15 g of Intermediate I121, 31.7 g of boron triiodide, and 7.2 g of triphenylborane were stirred using 150 ml of dichlorobenzene at 160° C. for 6 hours. The reaction was completed, and the resulting product was extracted at room temperature, and then column-purified with ethyl acetate:hexane, and then recrystallized to obtain 6.3 g of Intermediate I122 (yield 41%).

MS[M+H]+=563

3) Synthesis of Compound 112

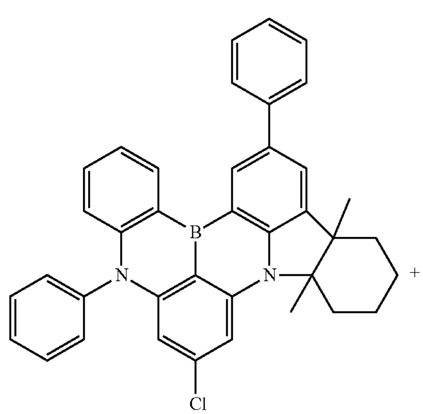

I122

-continued

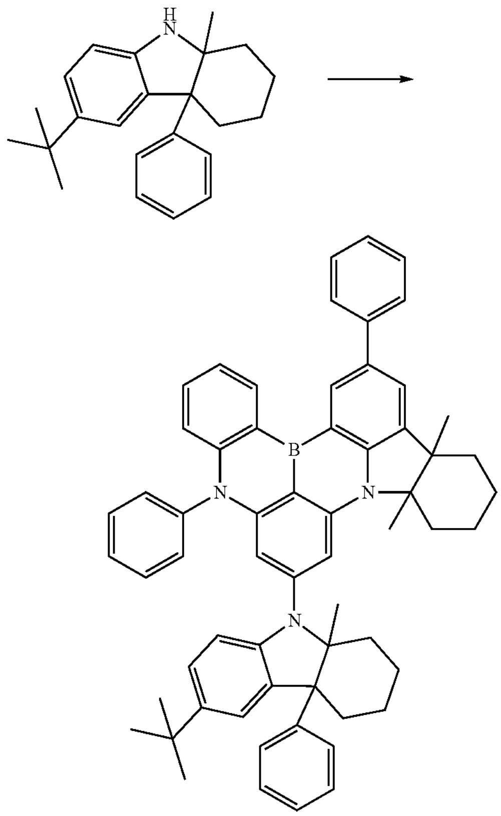

112

After 2 g of Intermediate I121, 1.39 g of 6-(tert-butyl)-9a-methyl-4a-phenyl-2,3,4,4a,9,9a-hexahydro-1H-carbazole, 1.0 g of sodium-tert-butoxide, and 0.06 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate: hexane column, and then recrystallized to obtain 1.6 g of Compound 112 (yield 53%).

MS[M+H]+=846

Synthesis Example 113. Synthesis of Compound 113

1) Synthesis of Intermediate I123

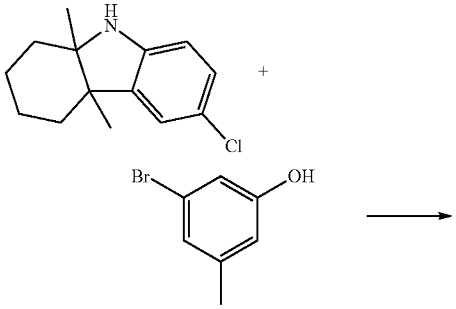

-continued

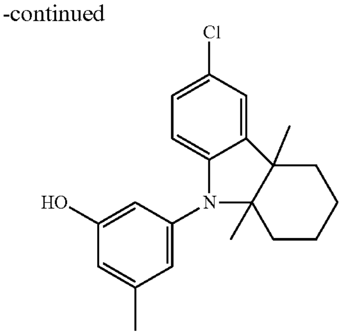

I123

After 40 g of 6-chloro-4a,9a-dimethyl-2,3,4,4a,9,9a-hexahydro-1H-carbazole, 31.7 g of 3-bromo-5-methylphenol, 48.9 g of sodium-tert-butoxide, and 2.6 g of bis(tri-tert-butylphosphine)palladium(0) were put into 800 ml of toluene under nitrogen atmosphere, the resulting mixture was stirred at 70° C. for 8 hours. After the completion of the reaction, the resulting product was extracted, and then purified with an ethyl acetate:hexane column to obtain 38 g of Intermediate I123 (yield 66%).

MS[M+H]+=341.88

2) Synthesis of Intermediate I124

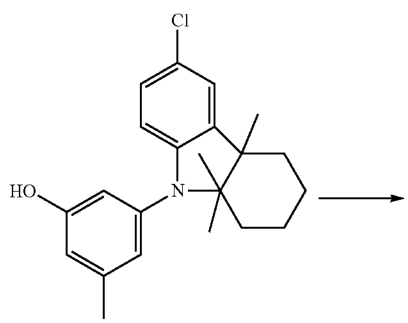

I123

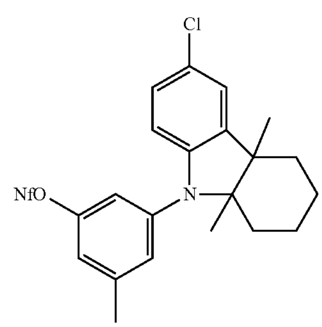

I124

After 30 g of Intermediate I123, 23.6 ml of 1,1,2,2,3,3,4,4,4-nonafluorobutane-1-sulfonyl fluoride, and 36.4 g of potassium carbonate were put into 400 ml of methyl chloride, the resulting mixture was stirred at room temperature for 3 hours. After the completion of the reaction, the resulting product was extracted, and then purified with an ethyl acetate:hexane column to obtain 45 g of Intermediate I124 (yield 82%).

MS[M+H]+=624

2) Synthesis of Intermediate I125

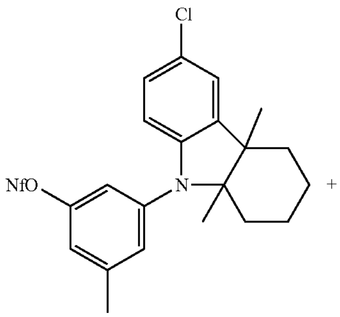

I124

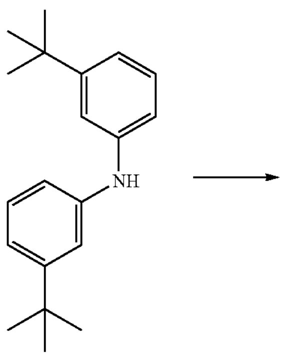

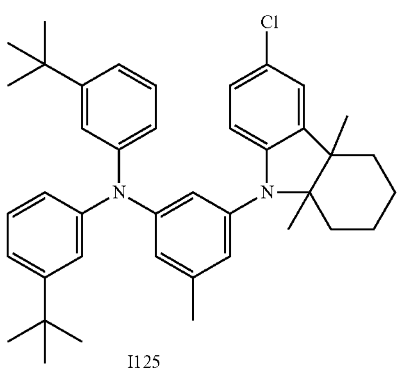

I125

After 30 g of Intermediate I124, 20.9 g of bis(3-(tert-butyl)phenyl)amine, 47.0 g of cesium carbonate, 0.83 g of bis(dibenzylidineacetone)palladium(0), and 1.38 g of Xphos were put into 600 ml of xylene, the resulting mixture was refluxed and stirred for 8 hours. After the completion of the reaction, the resulting product was extracted, and then purified with an ethyl acetate:hexane column to obtain 19 g of Intermediate I125 (yield 65%).

MS[M+H]+=606

3) Synthesis of Intermediate I126

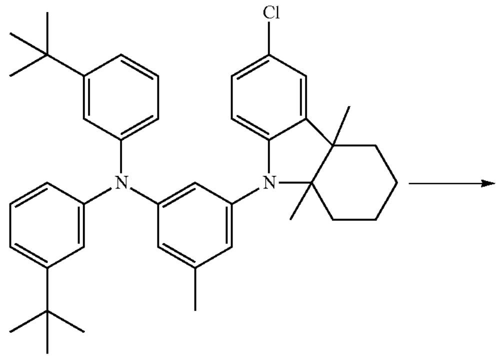

I125

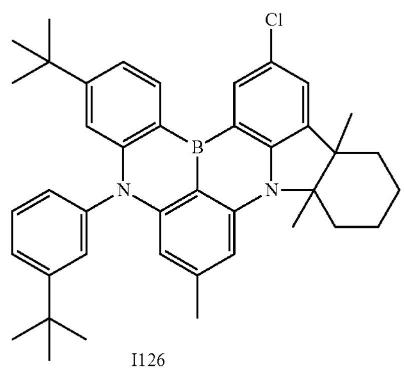

I126

Under nitrogen atmosphere, 15 g of Intermediate I125, 29.1 g of boron triiodide, and 6.6 g of triphenylborane were stirred using 150 ml of dichlorobenzene at 160° C. for 6 hours. The reaction was completed, and the resulting product was extracted at room temperature, and then column-purified with ethyl acetate:hexane, and then recrystallized to obtain 5.8 g of Intermediate I126 (yield 38%).

MS[M+H]+=614

4) Synthesis of Compound 113

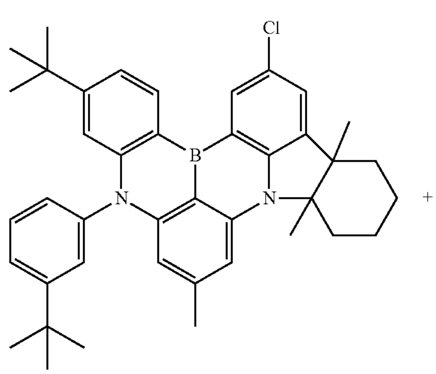

I126

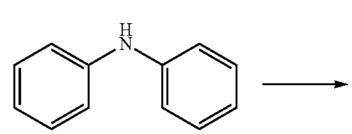

-continued

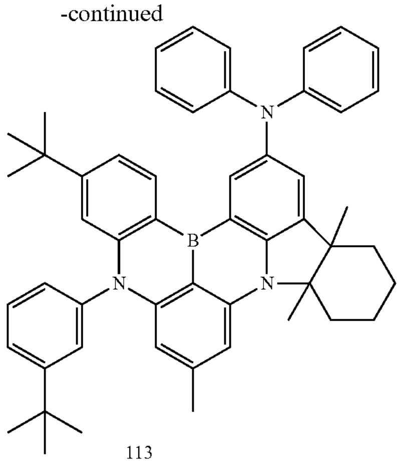

113

After 2 g of Intermediate I126, 0.55 g of diphenylamine, 0.9 g of sodium-tert-butoxide, and 0.05 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.6 g of Compound 113 (yield 66%).

MS[M+H]+=746

Synthesis Example 114. Synthesis of Compound 114

1) Synthesis of Intermediate I127

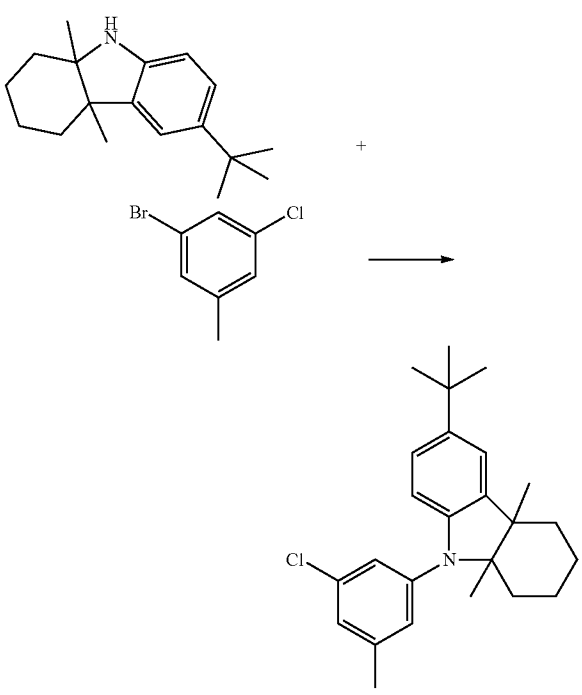

I127

After 40 g of 6-(tert-butyl)-4a,9a-dimethyl-2,3,4,4a,9,9a-hexahydro-1H-carbazole, 31.9 g of 1-bromo-3-chloro-5-methylbenzene, 44.8 g of sodium-tert-butoxide, and 2.4 g of bis(tri-tert-butylphosphine)palladium(0) were put into 800 ml of toluene under nitrogen atmosphere, the resulting mixture was stirred at 70° C. for 8 hours. After the completion of the reaction, the resulting product was extracted, and then purified with an ethyl acetate:hexane column to obtain 41 g of Intermediate I127 (yield 69%).

MS[M+H]+=382

2) Synthesis of Intermediate I128

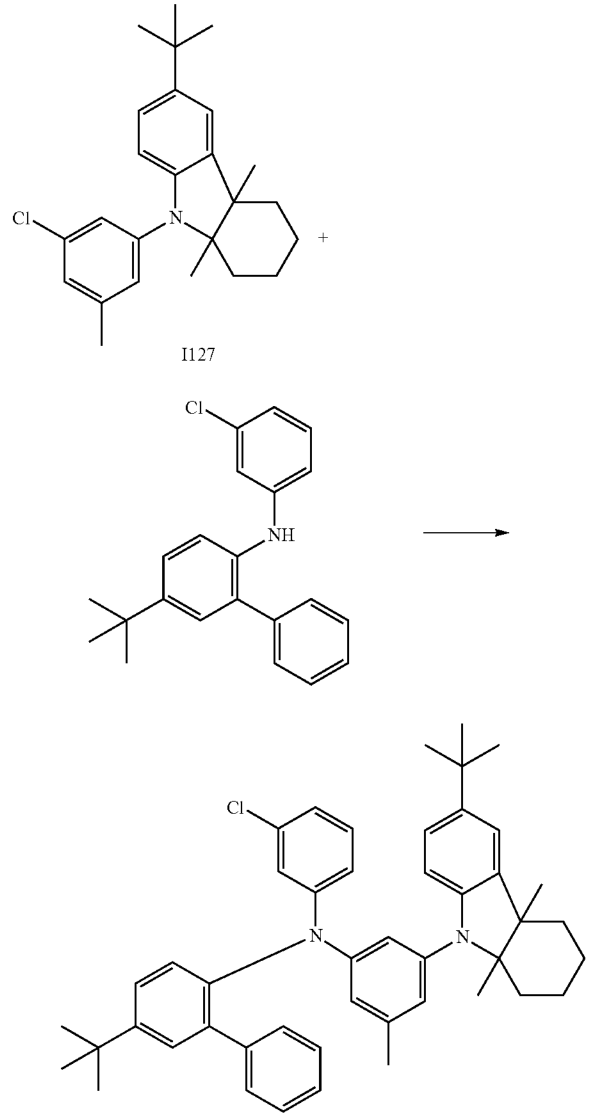

I127

I128

After 30 g of Intermediate I127, 20.3 g of sodium-tert-butoxide, and 1.07 g of bis(tri-tert-butylphosphine)palladium(0) were put into 500 ml of toluene under nitrogen atmosphere, a solution in which 23.6 g of 5-(tert-butyl)-N-(3-chlorophenyl)-[1,1'-biphenyl]-2-amine was dissolved in toluene was added dropwise thereto when the resulting mixture began to boil, and stirred for 2 hours. After the completion of the reaction, the resulting product was extracted, and then purified with an ethyl acetate:hexane column to obtain 28 g of Intermediate I128 (yield 58%).

MS[M+H]+=682

3) Synthesis of Intermediate I129

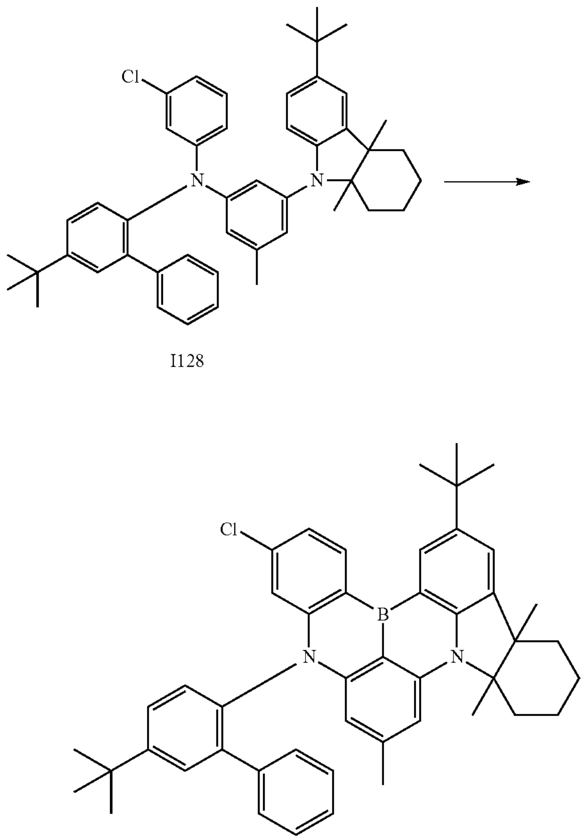

I128

I129

Under nitrogen atmosphere, 15 g of Intermediate I128, 25.9 g of boron triiodide, and 5.9 g of triphenylborane were stirred using 150 ml of dichlorobenzene at 160° C. for 6 hours. The reaction was completed, and the resulting product was extracted at room temperature, and then column-purified with ethyl acetate:hexane, and then recrystallized to obtain 5.4 g of Intermediate I129 (yield 36%).

MS[M+H]+=690

4) Synthesis of Compound 114

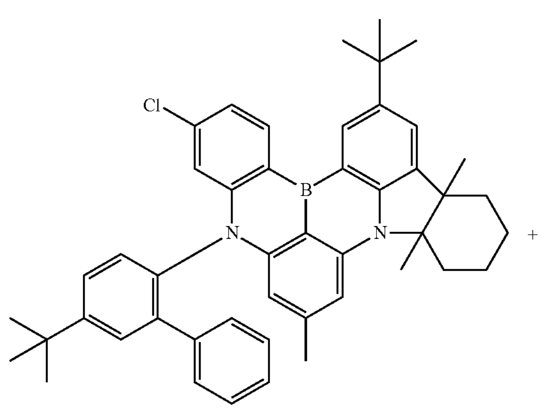

I129

-continued

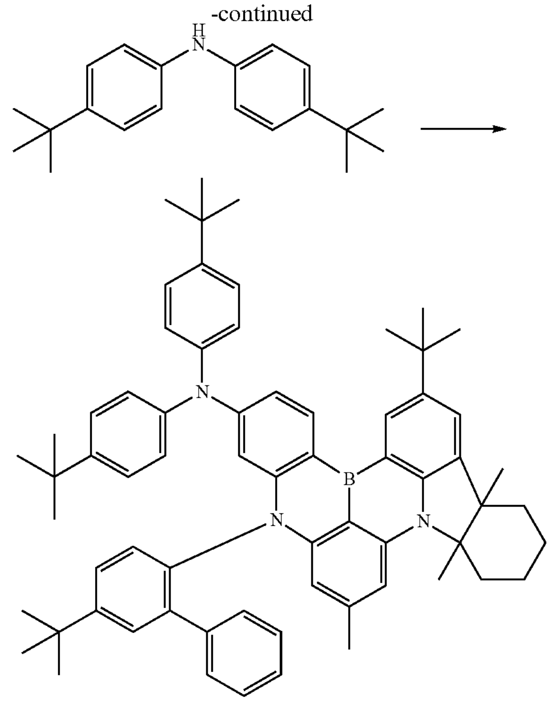

114

After 2 g of Intermediate I128, 0.82 g of bis(-4-(tert-butyl)phenyl)amine, 0.9 g of sodium-tert-butoxide, and 0.05 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.9 g of Compound 114 (yield 70%).

MS[M+H]+=935

Synthesis Example 115. Synthesis of Compound 115

1) Synthesis of Intermediate I130

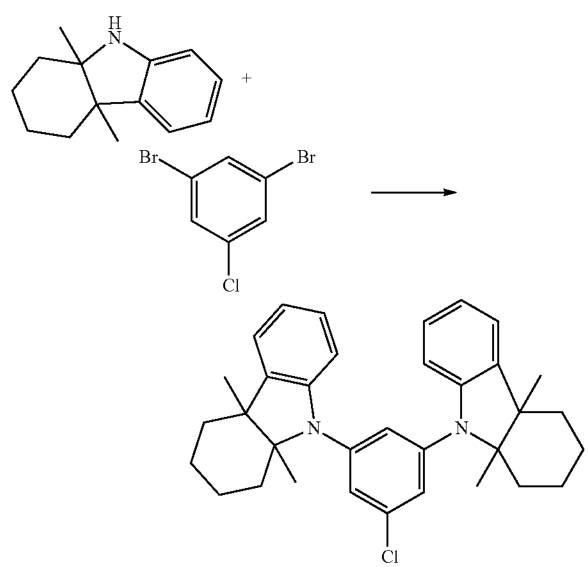

I130

After 40 g of 4a,9a-dimethyl-2,3,4,4a,9,9a-hexahydro-1H-carbazole, 26.9 g of 1,3-dibromo-5-chlorobenzene, 57.3 g of sodium-tert-butoxide, and 1.0 g of bis(tri-tert-butylphosphine)palladium(0) were put into 800 ml of toluene under nitrogen atmosphere, the resulting mixture was stirred for 4 hours. After the completion of the reaction, the resulting product was extracted, and then purified with an ethyl acetate:hexane column to obtain 33 g of Intermediate I130 (yield 65%).

MS[M+H]+=512

2) Synthesis of Intermediate I131

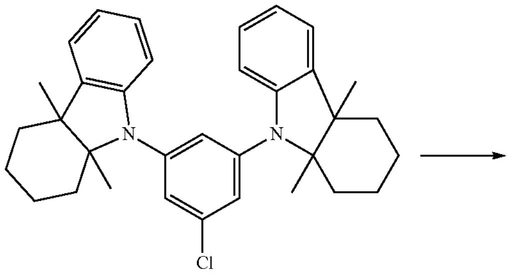

I130

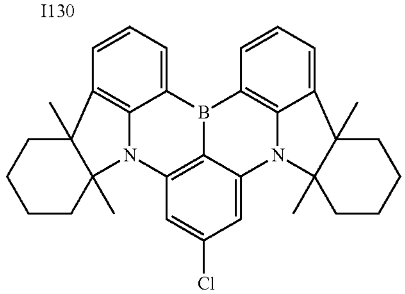

I131

Under nitrogen atmosphere, 15 g of Intermediate I130, 34.4 g of boron triiodide, and 7.8 g of triphenylborane were stirred using 150 ml of dichlorobenzene at 160° C. for 6 hours. The reaction was completed, and the resulting product was extracted at room temperature, and then column-purified with ethyl acetate:hexane, and then recrystallized to obtain 6.9 g of Intermediate I131 (yield 45%).

MS[M+H]+=519

3) Synthesis of Compound 115

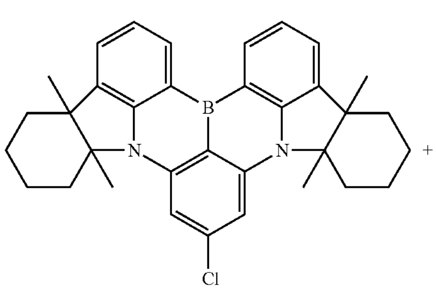

I131

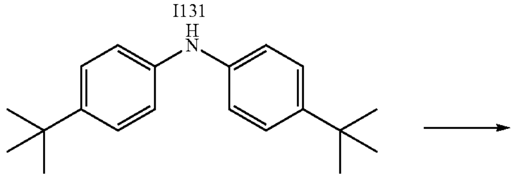

-continued

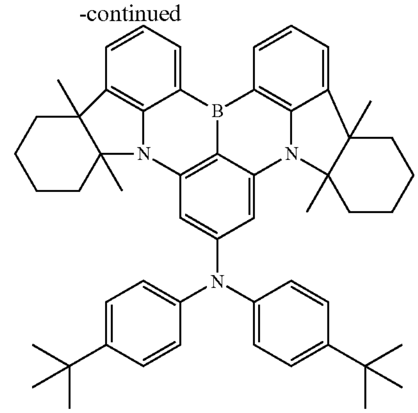

115

After 2 g of Intermediate I131, 1.08 g of bis(4-(tert-butyl)phenyl)amine, 1.11 g of sodium-tert-butoxide, and 0.06 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 2.1 g of Compound 115 (yield 71%).

MS[M+H]+=764

Synthesis Example 116. Synthesis of Compound 116

1) Synthesis of Compound 116

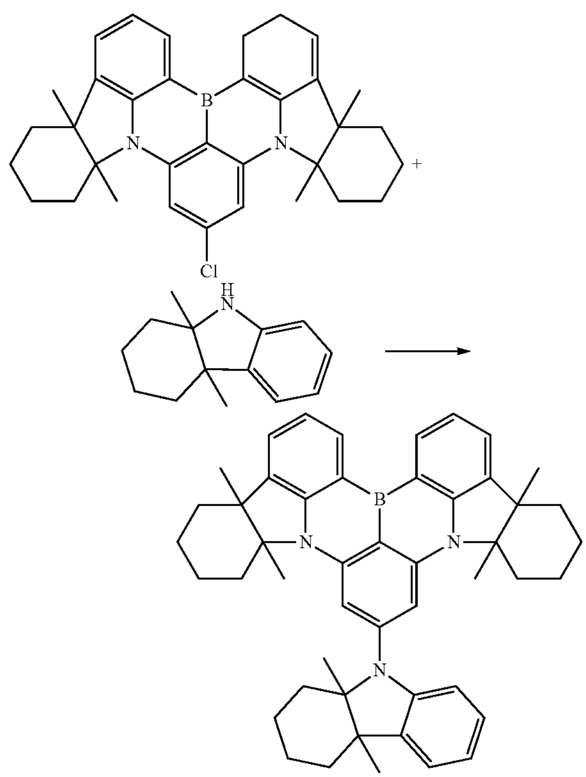

116

After 2 g of Intermediate I131, 0.78 g of 4a,9a-dimethyl-2,3,4,4a,9,9a-hexahydro-1H-carbazole, 1.11 g of sodium-tert-butoxide, and 0.06 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.8 g of Compound 116 (yield 68%).

MS[M+H]+=684

Synthesis Example 117. Synthesis of Compound 117

1) Synthesis of Intermediate I132

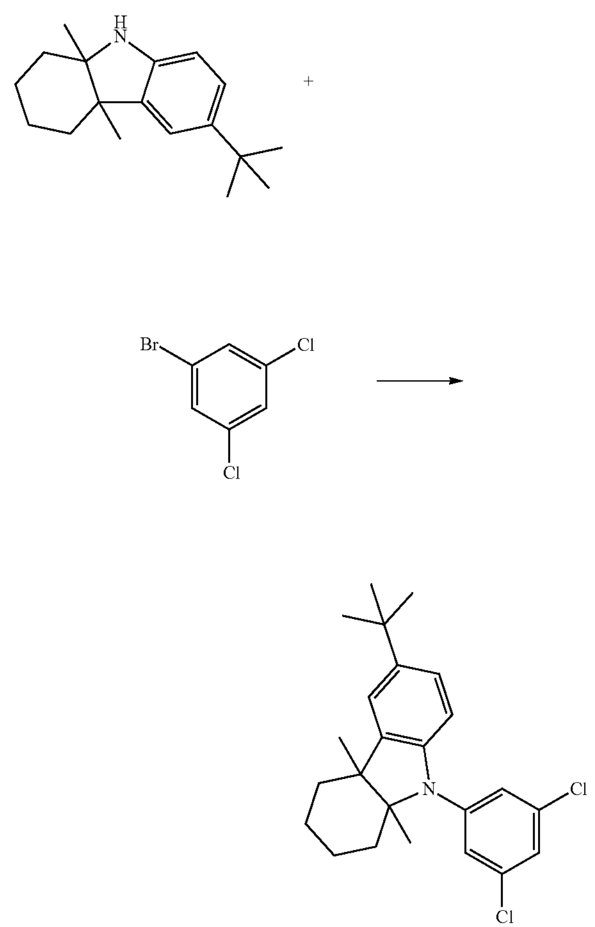

I132

After 40 g of 6-(tert-butyl)-4a,9a-dimethyl-2,3,4,4a,9,9a-hexahydro-1H-carbazole, 35.1 g of 1-bromo-3,5-dichlorobenzene, 44.8 g of sodium-tert-butoxide, and 0.79 g of bis(tri-tert-butylphosphine)palladium(0) were put into 800 ml of toluene under nitrogen atmosphere, the resulting mixture was stirred for 6 hours. After the completion of the reaction, the resulting product was extracted, and then purified with an ethyl acetate:hexane column to obtain 38 g of Intermediate I132 (yield 61%).

MS[M+H]+=403

2) Synthesis of Intermediate I133

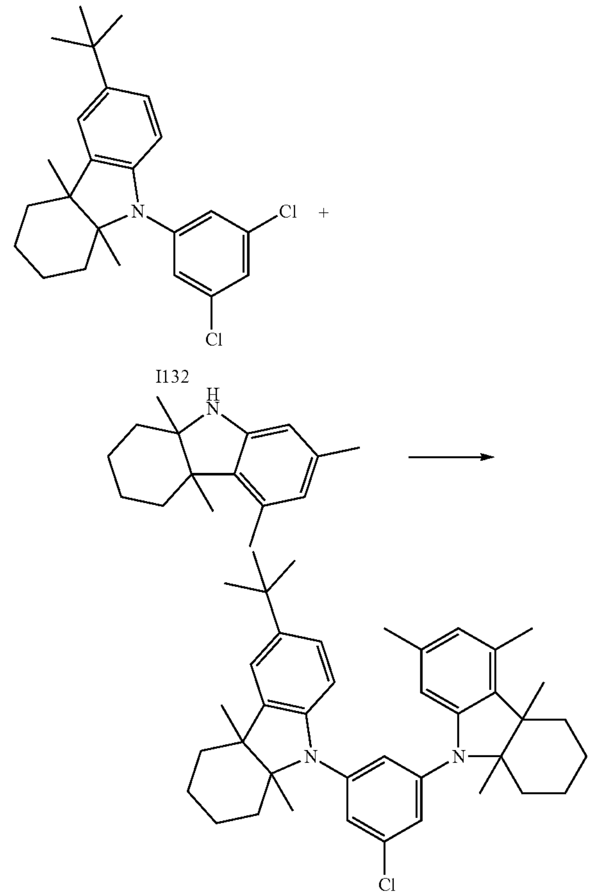

I133

After 30 g of Intermediate I132, 17.1 g of 4a,5,7,9a-tetramethyl-2,3,4,4a,9,9a-hexahydro-1H-carbazole, 21.5 g of sodium-tert-butoxide, and 1.14 g of bis(tri-tert-butylphosphine)palladium(0) were put into 600 ml of toluene under nitrogen atmosphere, the resulting mixture was stirred for 4 hours. After the completion of the reaction, the resulting product was extracted, and then purified with an ethyl acetate:hexane column to obtain 21 g of Intermediate I133 (yield 47%).

MS[M+H]+=596

3) Synthesis of Intermediate I134

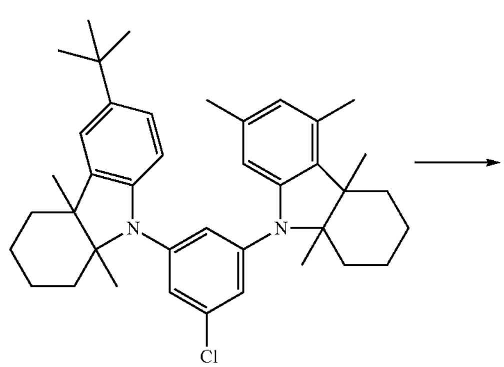

I133

-continued

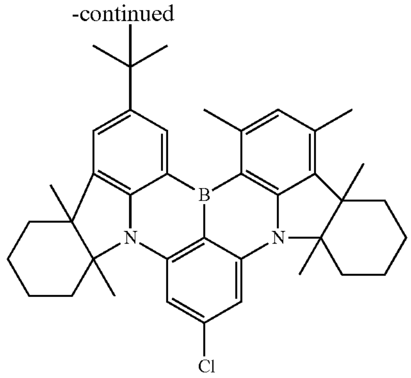

I134

Under nitrogen atmosphere, 15 g of Intermediate I133, 29.6 g of boron triiodide, and 6.7 g of triphenylborane were stirred using 150 ml of dichlorobenzene at 160° C. for 6 hours. The reaction was completed, and the resulting product was extracted at room temperature, and then column-purified with ethyl acetate:hexane, and then recrystallized to obtain 6.1 g of Intermediate I134 (yield 40%).

MS[M+H]+=604

4) Synthesis of Compound 117

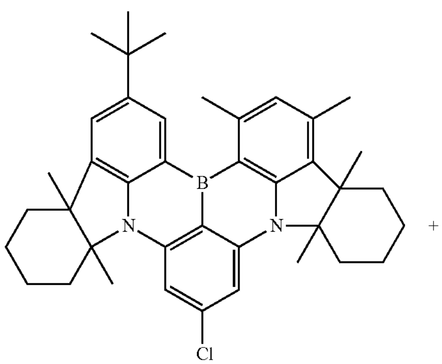

I134

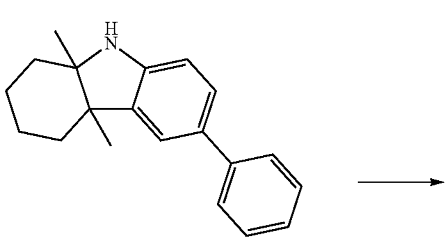

-continued

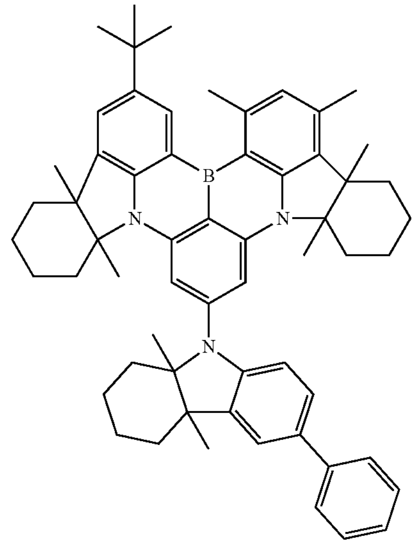

117

After 2 g of Intermediate I134, 0.92 g of 4a,9a-dimethyl-6-phenyl-2,3,4,4a,9,9a-hexahydro-1H-carbazole, 0.95 g of sodium-tert-butoxide, and 0.05 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.6 g of Compound 117 (yield 57%).

MS[M+H]+=845

Synthesis Example 118. Synthesis of Compound 118

1) Synthesis of Compound 118

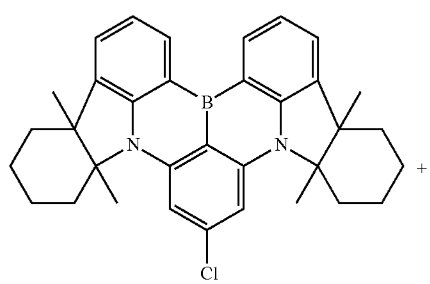

I131

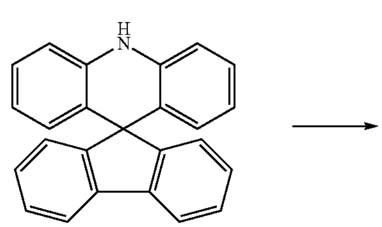

-continued

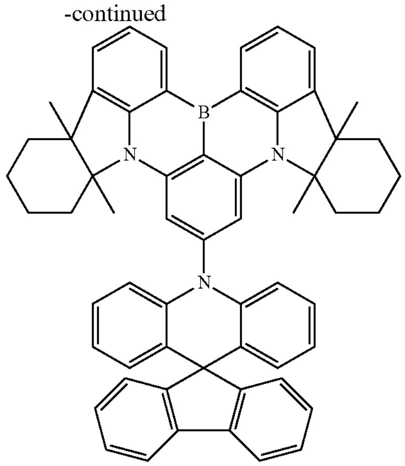

118

After 2 g of Intermediate I131, 1.28 g of 10H-spiro[acridine-9,9'-fluorene], 0.93 g of sodium-tert-butoxide, and 0.04 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.9 g of Compound 118 (yield 61%).

MS[M+H]+=814

Synthesis Example 119. Synthesis of Compound 119

1) Synthesis of Intermediate I135

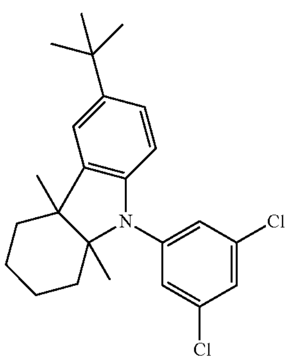

I132

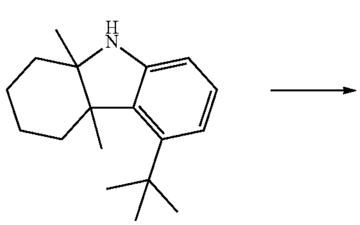

-continued

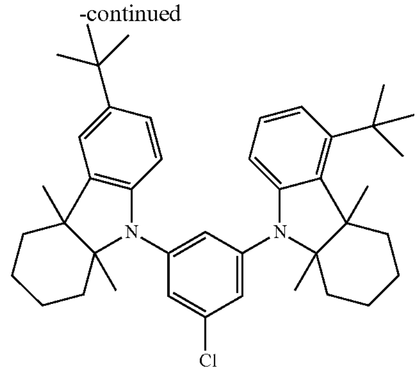

I135

After 30 g of Intermediate I132, 19.2 g of 5-(tert-butyl)-4a-9a-dimethyl-2,3,4,4a,9,9a-hexahydro-1H-carbazole, 17.9 g of sodium-tert-butoxide, and 1.14 g of bis(tri-tert-butylphosphine)palladium(0) were put into 600 ml of toluene under nitrogen atmosphere, the resulting mixture was stirred for 4 hours. After the completion of the reaction, the resulting product was extracted, and then purified with an ethyl acetate:hexane column to obtain 23 g of Intermediate I135 (yield 49%).

MS[M+H]+=624

2) Synthesis of Intermediate I136

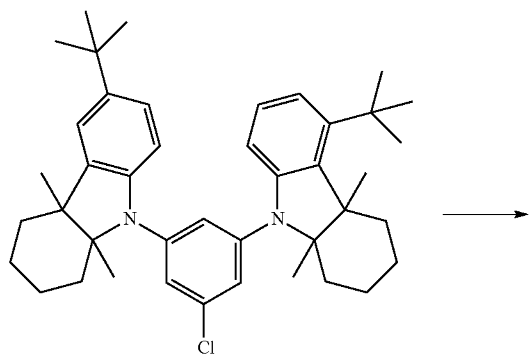

I135

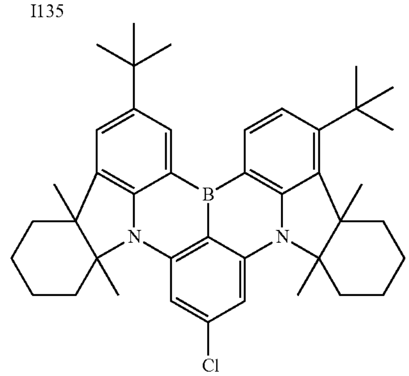

I136

Under nitrogen atmosphere, 15 g of Intermediate I135, 28.3 g of boron triiodide, and 6.3 g of triphenylborane were stirred using 150 ml of dichlorobenzene at 160° C. for 6 hours. The reaction was completed, and the resulting product was extracted at room temperature, and then column-purified with ethyl acetate:hexane, and then recrystallized to obtain 5.6 g of Intermediate I136 (yield 37%).

MS[M+H]+=632

3) Synthesis of Compound 119

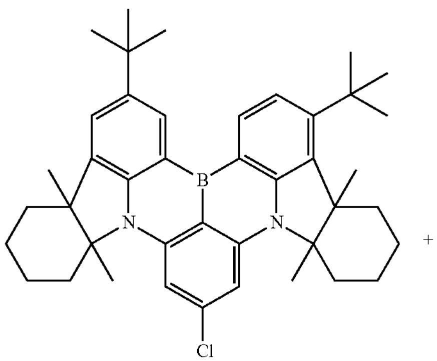

I136

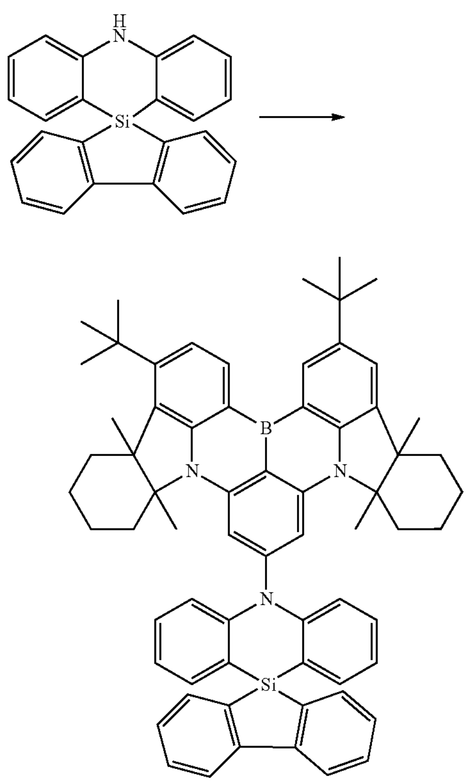

119

After 2 g of Intermediate I136, 1.10 g of 5'H-spiro [dibenzo[b,d]silole-5,10'-dibenzo[b,e][1,4]azasiline], 0.91 g of sodium-tert-butoxide, and 0.05 g of bis(tri-tert-butylphosphine)palladium(0) were put into 30 ml of toluene under nitrogen atmosphere, the resulting mixture was stirred for 3 hours. After the completion of the reaction, the resulting product was extracted, and then purified with an ethyl acetate:hexane column, and then recrystallized to obtain 1.8 g of Compound 119 (yield 60%).

MS[M+H]+=943

Experimental Example

Example 1

A glass substrate thinly coated with indium tin oxide (ITO) to have a thickness of 1,500 Å was put into distilled water in which a detergent was dissolved, and ultrasonically washed. In this case, a product manufactured by Fischer Co. was used as the detergent, and distilled water, which had been filtered twice with a filter manufactured by Millipore Co., was used as the distilled water. After the ITO was washed for 30 minutes, ultrasonic washing was conducted twice repeatedly using distilled water for 10 minutes. After the washing using distilled water was completed, ultrasonic washing was conducted by using isopropyl alcohol, acetone, and methanol solvents, and the resulting product was dried and then transported to a plasma washing machine. Furthermore, the substrate was washed by using oxygen plasma for 5 minutes, and then was transported to a vacuum deposition machine.

The following Formula [HAT] was thermally vacuum-deposited to have a thickness of 50 Å on a transparent ITO electrode, which was prepared as described above, thereby forming a hole injection layer. The following Formula [NPB] was vacuum-deposited to have a thickness of 1,100 Å on the hole injection layer, thereby forming a hole transport layer. The following Formula [HT-A] was vacuum-deposited to have a thickness of 200 Å on the hole transport layer, thereby forming an electron blocking layer. Next, 2 wt % of Compound 1 as a blue light emitting dopant based on the total weight of a light emitting layer and 9-(naphthalen-1-yl)-10-(4-(naphthalen-2-yl)phenyl)anthracene [BH] as a host were vacuum-deposited to have a thickness of 300 Å on the electron blocking layer, thereby forming the light emitting layer. [TPBI] and the following Formula [LiQ] were vacuum-deposited at a weight ratio of 1:1 on the light emitting layer, thereby forming a first electron transport layer having a thickness of 200 Å. [LiF] was vacuum-deposited on the first electron transport layer, thereby forming a second electron transport layer having a thickness of 100 Å. Aluminum was deposited to a thickness of 1,000 Å on the second electron transport layer, thereby forming a negative electrode. In the aforementioned procedure, the deposition rate of the organic material was maintained at 0.4 to 0.9 Å/sec, the deposition rates of lithium fluoride of the second electron transport layer and aluminum of the negative electrode were maintained at 0.3 Å/sec and 2 Å/sec, respectively, and the degree of vacuum during the deposition was maintained at 1×10-7 to 5×10-8 torr, thereby manufacturing an organic light emitting device.

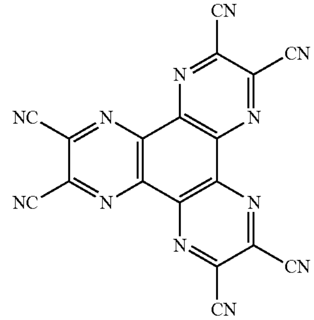

[HAT]

-continued
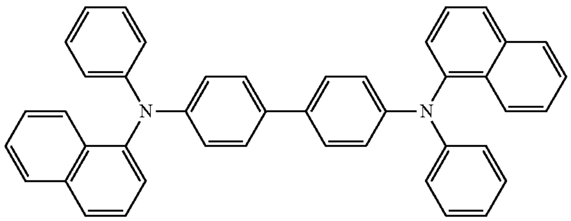
[NPB]
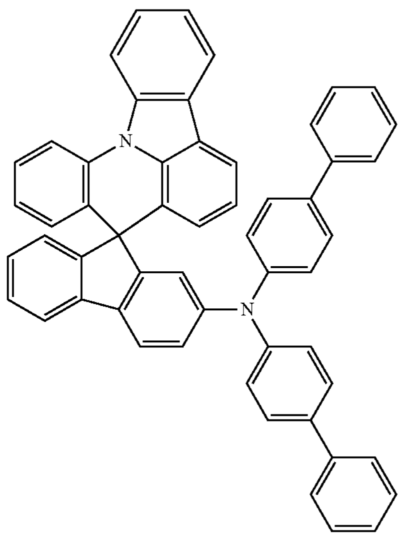
[HT-A]
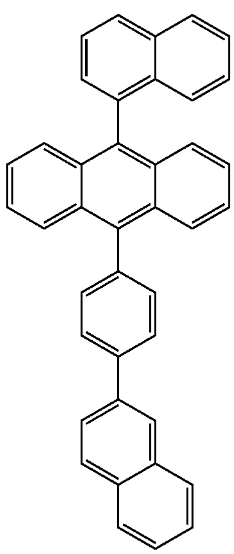
[BH]
-continued
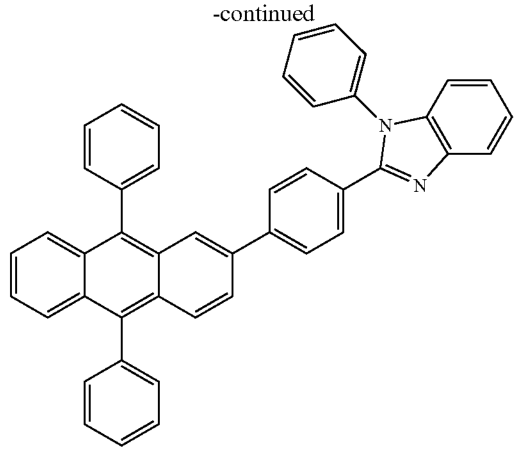
[TPBI]
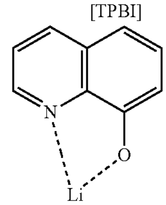
[LiQ]
Examples 2 to 119 and Comparative Examples 1 and 2
Organic light emitting devices were manufactured in the same manner as in Example 1, except that the compounds in the following Table 1 were used instead of Compound 1 in Example 1.
BD-1
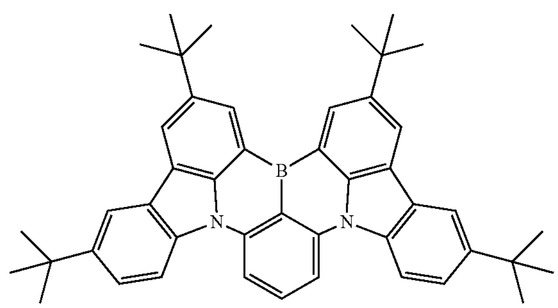
BD-2
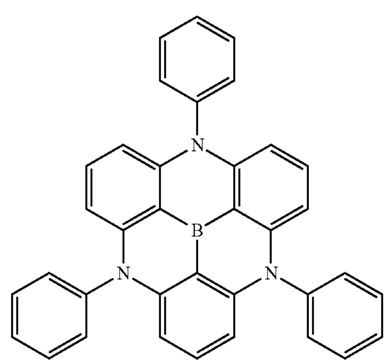

The efficiencies, service lives, and color coordinates (based on 1931 CIE color coordinate) of the organic light emitting devices, manufactured in Examples 1 to 119 and Comparative Examples 1 and 2, at a current density of 10 $mA/cm^2$ were measured, and the results thereof are shown in the following Table 1.

TABLE 1

| Material | Efficiency (cd/A) | Color coordinate CIE (x) | Color coordinate CIE (y) | Service life T95 (hr) |
|---|---|---|---|---|
| Example 1 (Compound 1) | 7.23 | 0.150 | 0.066 | 112 |
| Example 2 (Compound 2) | 6.75 | 0.141 | 0.061 | 107 |
| Example 3 (Compound 3) | 6.70 | 0.140 | 0.057 | 110 |
| Example 4 (Compound 4) | 7.22 | 0.149 | 0.065 | 111 |
| Example 5 (Compound 5) | 6.77 | 0.141 | 0.061 | 105 |
| Example 6 (Compound 6) | 7.30 | 0.150 | 0.074 | 118 |
| Example 7 (Compound 7) | 7.23 | 0.149 | 0.066 | 110 |
| Example 8 (Compound 8) | 6.72 | 0.141 | 0.060 | 100 |
| Example 9 (Compound 9) | 7.43 | 0.150 | 0.070 | 125 |
| Example 10 (Compound 10) | 6.77 | 0.141 | 0.064 | 110 |
| Example 11 (Compound 11) | 6.77 | 0.141 | 0.063 | 109 |
| Example 12 (Compound 12) | 6.75 | 0.141 | 0.061 | 107 |
| Example 13 (Compound 13) | 6.77 | 0.141 | 0.064 | 109 |
| Example 14 (Compound 14) | 7.21 | 0.150 | 0.092 | 116 |
| Example 15 (Compound 15) | 7.23 | 0.150 | 0.095 | 116 |
| Example 16 (Compound 16) | 7.23 | 0.150 | 0.091 | 116 |
| Example 17 (Compound 17) | 7.22 | 0.150 | 0.095 | 116 |
| Example 18 (Compound 18) | 6.77 | 0.141 | 0.063 | 107 |
| Example 19 (Compound 19) | 6.78 | 0.141 | 0.066 | 107 |
| Example 20 (Compound 20) | 7.21 | 0.150 | 0.095 | 116 |
| Example 21 (Compound 21) | 7.22 | 0.150 | 0.097 | 116 |
| Example 22 (Compound 22) | 6.77 | 0.141 | 0.063 | 107 |
| Example 23 (Compound 23) | 6.77 | 0.141 | 0.066 | 107 |
| Example 24 (Compound 24) | 7.21 | 0.150 | 0.095 | 116 |
| Example 25 (Compound 25) | 7.21 | 0.150 | 0.097 | 116 |
| Example 26 (Compound 26) | 6.77 | 0.141 | 0.059 | 107 |
| Example 27 (Compound 27) | 6.77 | 0.141 | 0.059 | 107 |
| Example 28 (Compound 28) | 7.21 | 0.150 | 0.097 | 116 |
| Example 29 (Compound 29) | 7.22 | 0.150 | 0.093 | 116 |
| Example 30 (Compound 30) | 6.80 | 0.141 | 0.068 | 108 |
| Example 31 (Compound 31) | 6.80 | 0.141 | 0.071 | 108 |
| Example 32 (Compound 32) | 7.31 | 0.150 | 0.098 | 117 |
| Example 33 (Compound 33) | 7.31 | 0.150 | 0.099 | 116 |
| Example 34 (Compound 34) | 6.78 | 0.141 | 0.069 | 108 |
| Example 35 (Compound 35) | 6.78 | 0.141 | 0.075 | 110 |
| Example 36 (Compound 36) | 6.78 | 0.141 | 0.075 | 110 |
| Example 37 (Compound 37) | 6.78 | 0.141 | 0.065 | 108 |
| Example 38 (Compound 38) | 6.81 | 0.141 | 0.081 | 109 |
| Example 39 (Compound 39) | 6.88 | 0.141 | 0.080 | 109 |
| Example 40 (Compound 40) | 6.89 | 0.141 | 0.081 | 109 |
| Example 41 (Compound 41) | 6.89 | 0.141 | 0.081 | 109 |
| Example 42 (Compound 42) | 6.89 | 0.141 | 0.079 | 109 |
| Example 43 (Compound 43) | 6.94 | 0.141 | 0.082 | 111 |
| Example 44 (Compound 44) | 6.71 | 0.141 | 0.066 | 109 |
| Example 45 (Compound 45) | 6.75 | 0.141 | 0.063 | 107 |
| Example 46 (Compound 46) | 6.76 | 0.141 | 0.069 | 107 |
| Example 47 (Compound 47) | 7.21 | 0.150 | 0.092 | 116 |
| Example 48 (Compound 48) | 7.22 | 0.150 | 0.095 | 116 |
| Example 49 (Compound 49) | 6.78 | 0.141 | 0.069 | 108 |
| Example 50 (Compound 50) | 6.88 | 0.141 | 0.071 | 109 |
| Example 51 (Compound 51) | 6.75 | 0.141 | 0.067 | 107 |
| Example 52 (Compound 52) | 6.77 | 0.141 | 0.063 | 107 |
| Example 53 (Compound 53) | 7.21 | 0.150 | 0.095 | 116 |
| Example 54 (Compound 54) | 7.21 | 0.150 | 0.097 | 116 |
| Example 55 (Compound 55) | 6.78 | 0.141 | 0.069 | 108 |
| Example 56 (Compound 56) | 6.70 | 0.141 | 0.068 | 109 |
| Example 57 (Compound 57) | 6.75 | 0.141 | 0.063 | 107 |
| Example 58 (Compound 58) | 6.75 | 0.141 | 0.069 | 107 |
| Example 59 (Compound 59) | 7.20 | 0.150 | 0.097 | 119 |
| Example 60 (Compound 60) | 7.23 | 0.150 | 0.099 | 117 |
| Example 61 (Compound 61) | 6.77 | 0.141 | 0.071 | 109 |
| Example 62 (Compound 62) | 6.88 | 0.141 | 0.081 | 110 |
| Example 63 (Compound 63) | 6.73 | 0.141 | 0.066 | 109 |
| Example 64 (Compound 64) | 6.78 | 0.141 | 0.062 | 109 |
| Example 65 (Compound 65) | 6.73 | 0.141 | 0.070 | 109 |
| Example 66 (Compound 66) | 7.20 | 0.150 | 0.097 | 115 |
| Example 67 (Compound 67) | 7.20 | 0.150 | 0.097 | 115 |
| Example 68 (Compound 68) | 6.78 | 0.141 | 0.069 | 108 |
| Example 69 (Compound 69) | 6.78 | 0.141 | 0.071 | 108 |
| Example 70 (Compound 70) | 6.68 | 0.140 | 0.054 | 110 |
| Example 71 (Compound 71) | 6.72 | 0.140 | 0.051 | 110 |
| Example 72 (Compound 72) | 6.72 | 0.140 | 0.051 | 110 |
| Example 73 (Compound 73) | 6.71 | 0.140 | 0.051 | 110 |
| Example 74 (Compound 74) | 6.75 | 0.140 | 0.051 | 111 |
| Example 75 (Compound 75) | 6.70 | 0.140 | 0.055 | 110 |
| Example 76 (Compound 76) | 6.69 | 0.140 | 0.054 | 110 |
| Example 77 (Compound 77) | 6.70 | 0.140 | 0.054 | 110 |
| Example 78 (Compound 78) | 6.70 | 0.140 | 0.054 | 109 |
| Example 79 (Compound 79) | 6.75 | 0.140 | 0.050 | 111 |
| Example 80 (Compound 80) | 7.43 | 0.150 | 0.070 | 125 |
| Example 81 (Compound 81) | 7.43 | 0.150 | 0.070 | 125 |
| Example 82 (Compound 82) | 7.43 | 0.150 | 0.070 | 125 |
| Example 83 (Compound 83) | 7.43 | 0.150 | 0.070 | 124 |
| Example 84 (Compound 84) | 7.44 | 0.150 | 0.071 | 125 |
| Example 85 (Compound 85) | 7.44 | 0.150 | 0.072 | 125 |
| Example 86 (Compound 86) | 7.44 | 0.150 | 0.071 | 125 |
| Example 87 (Compound 87) | 7.44 | 0.150 | 0.071 | 125 |
| Example 88 (Compound 88) | 7.44 | 0.150 | 0.072 | 125 |
| Example 89 (Compound 89) | 7.45 | 0.150 | 0.076 | 125 |
| Example 90 (Compound 90) | 7.47 | 0.150 | 0.077 | 127 |
| Example 91 (Compound 91) | 7.48 | 0.150 | 0.077 | 126 |
| Example 92 (Compound 92) | 7.48 | 0.150 | 0.077 | 126 |
| Example 93 (Compound 93) | 7.48 | 0.150 | 0.077 | 125 |
| Example 94 (Compound 94) | 7.49 | 0.150 | 0.079 | 125 |
| Example 95 (Compound 95) | 7.44 | 0.150 | 0.071 | 124 |
| Example 96 (Compound 96) | 6.75 | 0.140 | 0.054 | 111 |
| Example 97 (Compound 97) | 6.75 | 0.140 | 0.053 | 110 |
| Example 98 (Compound 98) | 6.75 | 0.140 | 0.053 | 110 |
| Example 99 (Compound 99) | 6.75 | 0.140 | 0.053 | 109 |
| Example 100 (Compound 100) | 6.79 | 0.140 | 0.051 | 111 |
| Example 101 (Compound 101) | 7.42 | 0.150 | 0.072 | 124 |
| Example 102 (Compound 102) | 7.42 | 0.150 | 0.074 | 124 |
| Example 103 (Compound 103) | 7.43 | 0.150 | 0.072 | 125 |
| Example 104 (Compound 104) | 7.41 | 0.150 | 0.073 | 125 |
| Example 105 (Compound 105) | 7.11 | 0.140 | 0.053 | 127 |
| Example 106 (Compound 106) | 7.32 | 0.140 | 0.055 | 125 |
| Example 107 (Compound 107) | 7.30 | 0.150 | 0.056 | 125 |
| Example 108 (Compound 108) | 7.39 | 0.150 | 0.060 | 130 |
| Example 109 (Compound 109) | 7.41 | 0.150 | 0.058 | 120 |
| Example 110 (Compound 110) | 7.39 | 0.150 | 0.057 | 126 |
| Example 111 (Compound 111) | 7.15 | 0.140 | 0.053 | 127 |
| Example 112 (Compound 112) | 7.22 | 0.150 | 0.060 | 129 |
| Example 113 (Compound 113) | 7.38 | 0.150 | 0.066 | 121 |
| Example 114 (Compound 114) | 7.43 | 0.140 | 0.051 | 121 |
| Example 115 (Compound 115) | 7.40 | 0.140 | 0.057 | 133 |
| Example 116 (Compound 116) | 7.20 | 0.140 | 0.055 | 139 |
| Example 117 (Compound 117) | 7.55 | 0.150 | 0.051 | 140 |
| Example 118 (Compound 118) | 7.57 | 0.150 | 0.050 | 131 |
| Example 119 (Compound 119) | 7.55 | 0.150 | 0.051 | 131 |
| Comparative Example 1 (Compound BD-1) | 6.11 | 0.174 | 0.190 | 95 |
| Comparative Example 2 (Compound BD-2) | 2.89 | 0.120 | 0.032 | 15 |

From Table 1, it can be confirmed that Examples 1 to 119, in which the compound of the present application including a non-aromatic pentagonal ring including N in the molecule is used, have better efficiency and service life characteristics than Comparative Example 1 in which the compound (BD-1) in which a benzene ring is fused to a pentagonal ring including N to form an aromatic ring is used and Comparative Example 2 in which the compound (BD-2) in which all benzene rings around a boron atom are bonded to each other to form a fused ring is used. Further, in general, when the color coordinate value is reduced, the service life characteristic deteriorates, but it can be confirmed that the compound of the present invention implements a dark blue color due to the low color coordinate value, and as a result, the color purity is excellent and the service life characteristic is also improved.

The invention claimed is:

1. A compound of Formula 1:

Formula 1

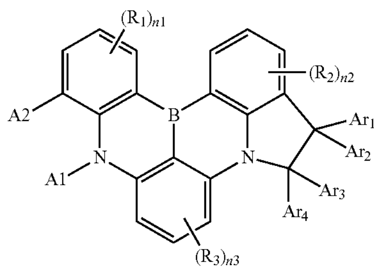

wherein in Formula 1:

$Ar_1$ and $Ar_4$ are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group, or adjacent groups are bonded to each other to form a substituted or unsubstituted aliphatic hydrocarbon ring;

$Ar_2$ and $Ar_3$ are bonded to each other to form a substituted or unsubstituted aliphatic hydrocarbon ring having 3 to 60 carbon atoms or are bonded to each other to form a substituted or unsubstituted monocyclic to tricyclic aliphatic hydrocarbon ring having 3 to 60 carbon atoms, in which an aliphatic hydrocarbon ring or an aromatic hydrocarbon ring is fused or unfused;

A1 and A2 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group, or are bonded to each other to form a substituted or unsubstituted ring;

$R_1$ to $R_3$ are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group; and n1 to n3 are each an integer from 0 to 3, and when n1 to n3 are each 2 or more, substituents in a plurality of parentheses are the same as or different from each other.

2. The compound of claim 1, wherein Formula 1 is any one of the following Formula 1-1 or 1-2:

Formula 1-1

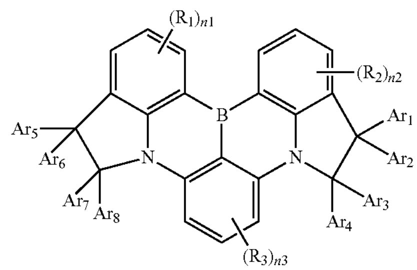

Formula 1-2

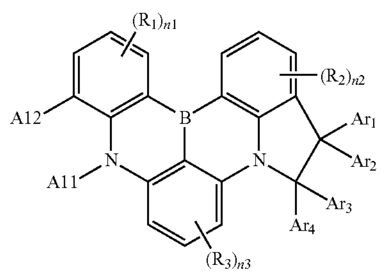

wherein in Formulae 1-1 and 1-2:

the definitions of $R_1$ to $R_3$, $Ar_1$ to $Ar_4$, and n1 to n3 are the same as those defined in Formula 1;

A11 and A12 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group; and $Ar_5$ to $Ar_8$ are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group, or adjacent groups are bonded to each other to form a substituted or unsubstituted ring.

3. The compound of claim 2, wherein Formula 1-1 is any one of the following Formulae 3 to 7:

Formula 3

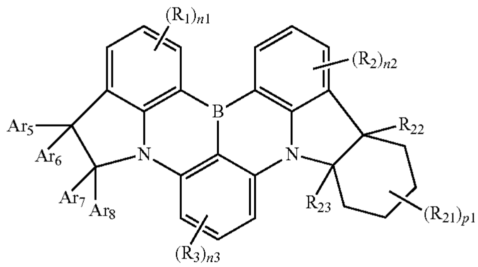

Formula 4

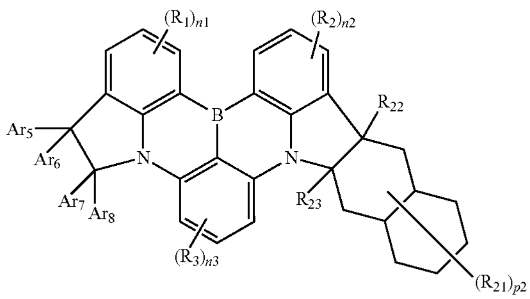

Formula 5

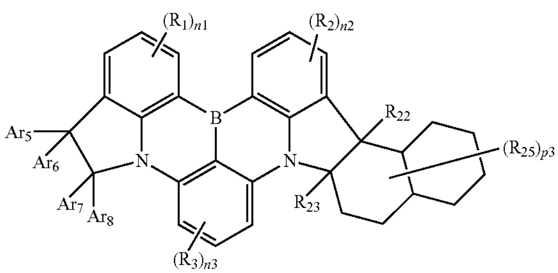

Formula 6

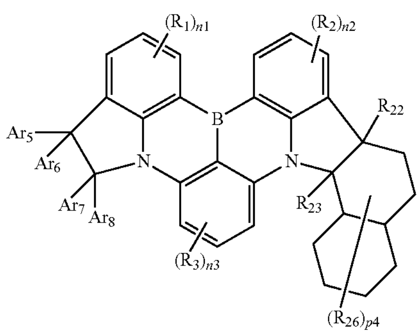

Formula 7

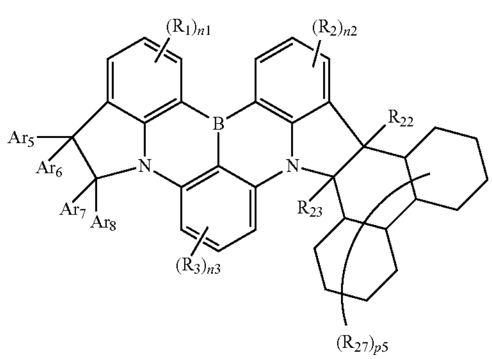

wherein in Formulae 3 to 7:

the definitions of $R_1$ to $R_3$, $Ar_5$ to $Ar_8$, and n1 to n3 are the same as those defined in Formula 1-1;

$R_{21}$ to $R_{27}$ are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted awl group, or a substituted or unsubstituted heterocyclic group;

p1 is an integer from 0 to 8;

p2 to p4 are each an integer from 0 to 14;

p5 is an integer from 0 to 20; and when p1 to p5 are each 2 or more, the substituents in a plurality of parentheses are the same as or different from each other.

4. The compound of claim 1, wherein Formula 1 is any one of the following Formula 2-1 or 2-2:

Formula 2-1

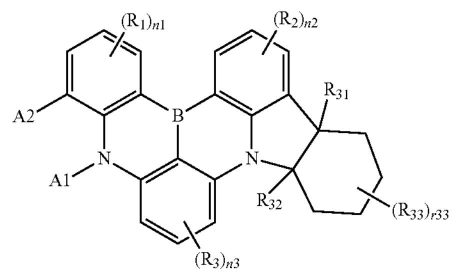

Formula 2-2

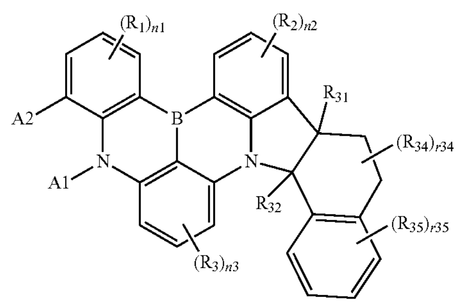

wherein in Formulae 2-1 and 2-2:

the definitions of A1, A2, $R_1$ to $R_3$, and n1 to n3 are the same as those defined in Formula 1;

$R_{31}$ to $R_{35}$ are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group;

adjacent $R_{35}$s are optionally bonded to each other to form a substituted or unsubstituted aliphatic hydrocarbon ring;

r33 is an integer from 0 to 8;

r34 and r35 are each an integer from 0 to 4; and when r33 to r35 are each 2 or more, substituents in a plurality of parentheses are the same as or different from each other.

5. The compound of claim 2, wherein Formula 1-1 is any one of the following Formulae 8 to 10:

Formula 8

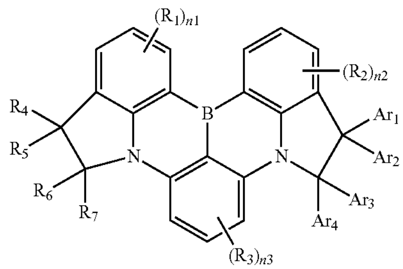

Formula 9

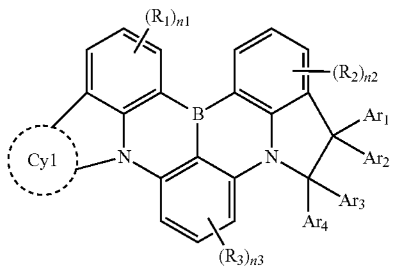

Formula 10

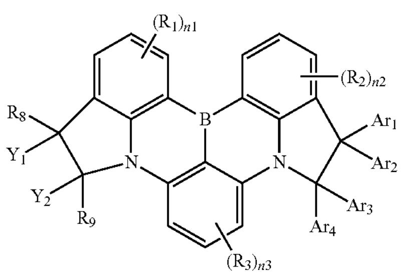

wherein in Formulae 8 to 10:

the definitions of $R_1$ to $R_3$, n1 to n3, and $Ar_1$ to $Ar_4$ are the same as those defined in Formula 1-1;

$R_4$ to $R_9$ are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group;

$Y_1$ and $Y_2$ are bonded to each other to form a substituted or unsubstituted aliphatic hydrocarbon ring; and Cy1 are a substituted or unsubstituted aromatic hydrocarbon ring.

6. The compound of claim 1, wherein Formula 1 is any one of the following Formulae 101 to 108:

Formula 101

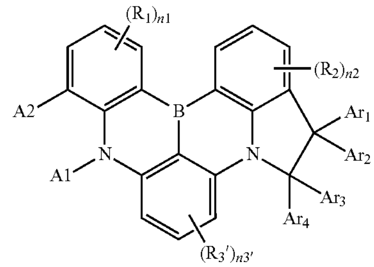

Formula 102

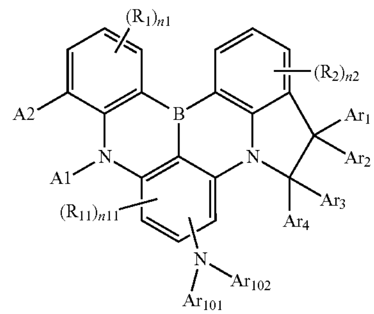

Formula 103

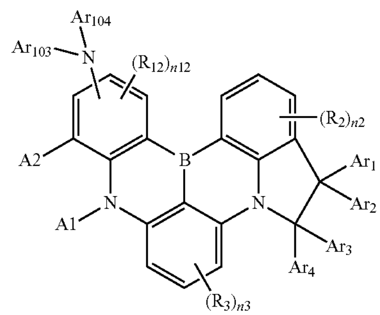

Formula 104

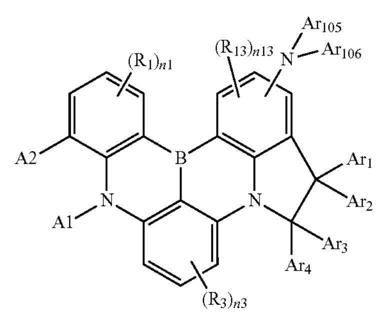

Formula 105

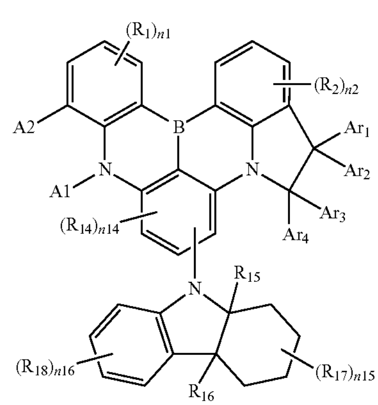

-continued

Formula 106

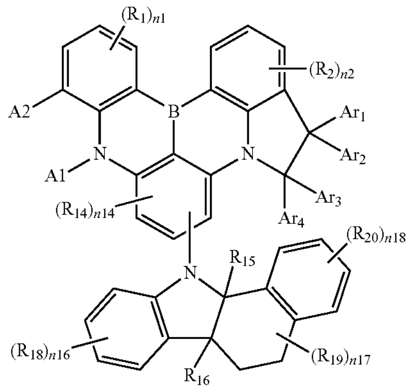

Formula 107

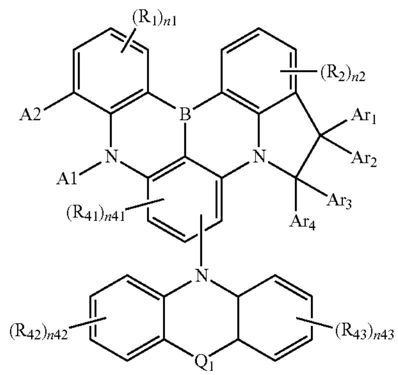

Formula 108

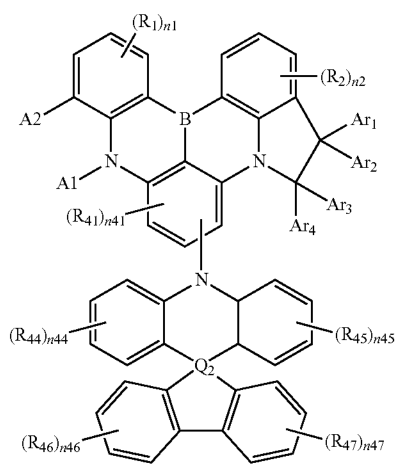

wherein in Formulae 101 to 108:

the definitions of A1, A2, $R_1$ to $R_3$, n1 to n3, and $Ar_1$ to $Ar_4$ are the same as those defined in Formula 1;

$Q_1$ is $C(R_{48})(R_{49})$ or $Si(R_{48})(R_{49})$;

$Q_2$ is C or Si;

$R_3'$, $R_{11}$ to $R_{20}$, and $R_{41}$ to $R_{49}$ are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group, and n3' are an integer from 0 to 3;

n11 to n14 and n41 are each an integer form 0 to 2;

n15 is an integer from 0 to 8;

n16 to n18 and n42 to n47 are each an integer from 0 to 4;

when n3', n15 to n18, and n42 to n47 are each 2 or more, the substituents in a plurality of parentheses are the same as or different from each other;

when n11 to n14 and n41 are each 2, the substituents in a plurality of parentheses are the same as or different from each other; and $Ar_{101}$ to $Ar_{106}$ are the same as or different from each other, and are each independently hydrogen, deuterium, a substituted or unsubstituted alkyl group, a substituted or unsubstituted aryl group, or a substituted or unsubstituted heteroaryl group.

7. A compound of any one of the following Formulae 12 to 18, 20 to 22, and 24 to 39:

Formula 12

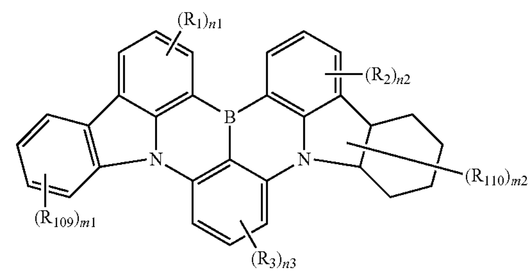

Formula 13

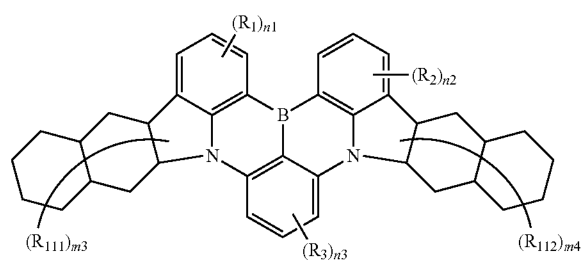

Formula 14

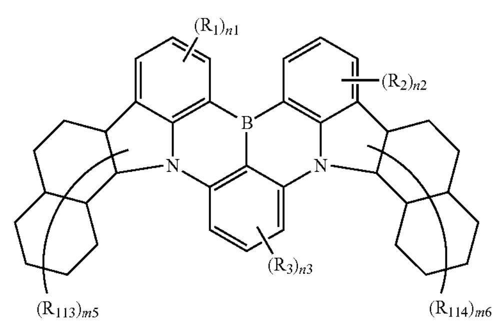

Formula 15

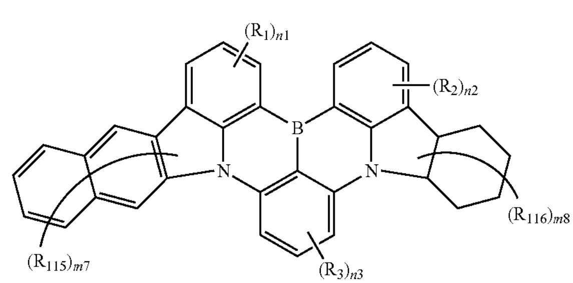

-continued
Formula 16
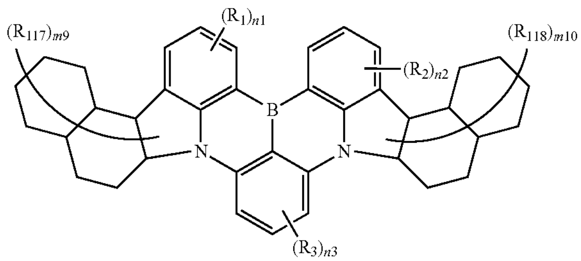
Formula 17
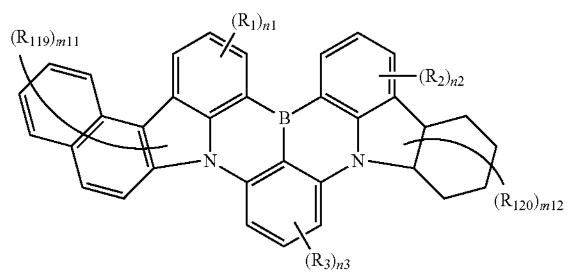
Formula 18
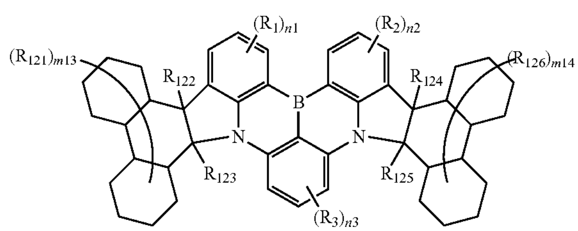
Formula 20
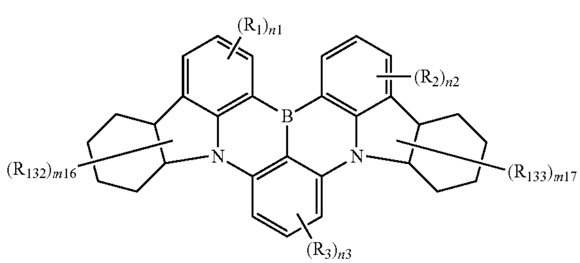
Formula 21
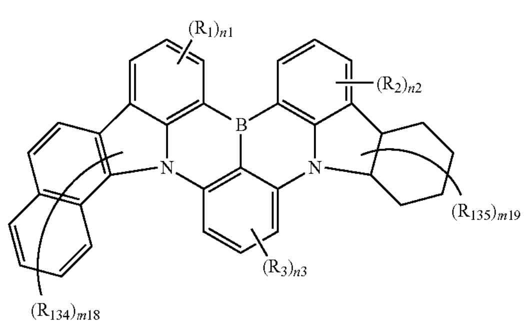
-continued
Formula 22
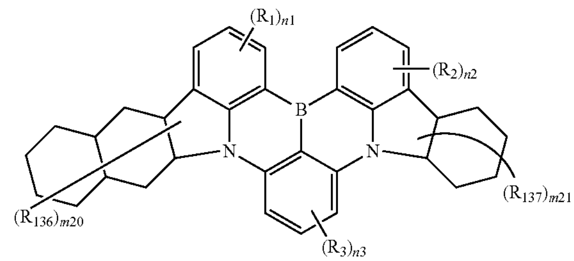
Formula 24
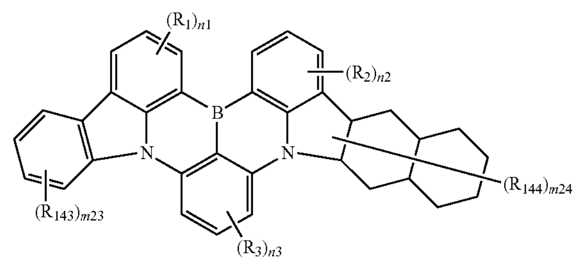
Formula 25
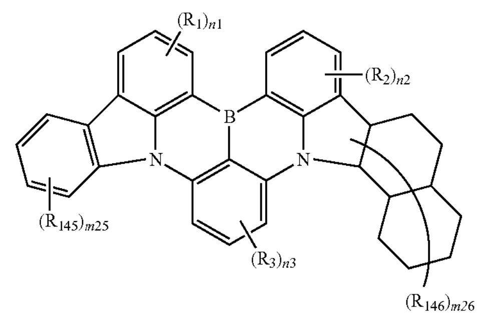
Formula 26
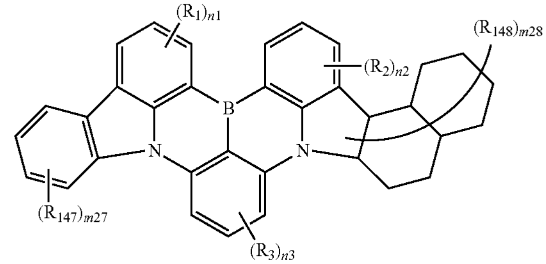
Formula 27]
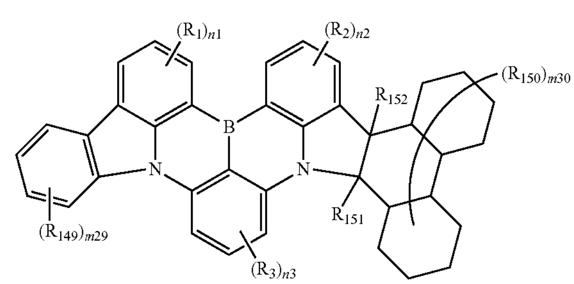

-continued
Formula 28
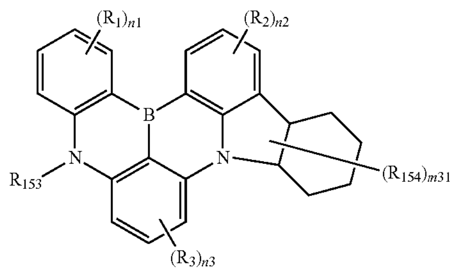
Formula 29
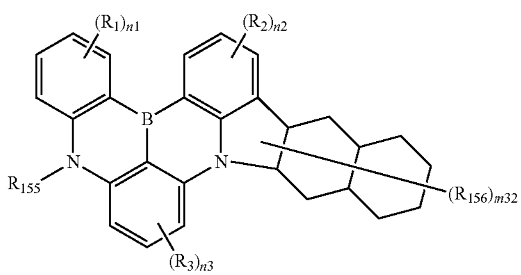
Formula 30
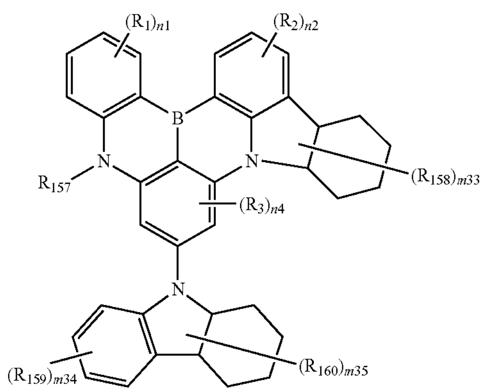
Formula 31
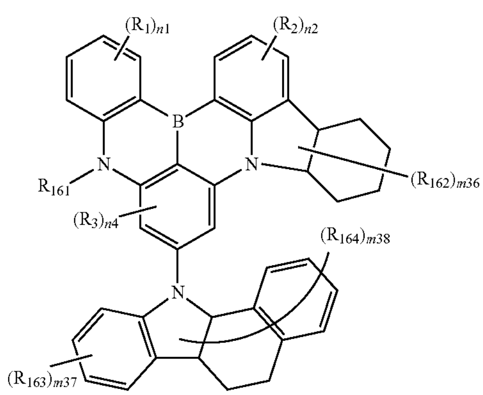
-continued
Formula 32
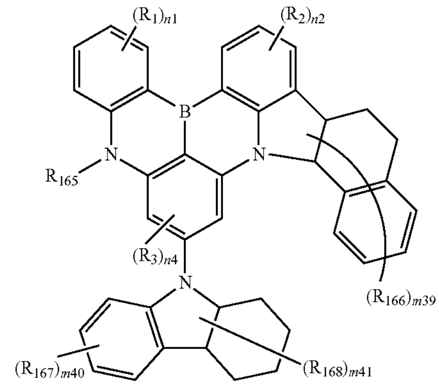
Formula 33
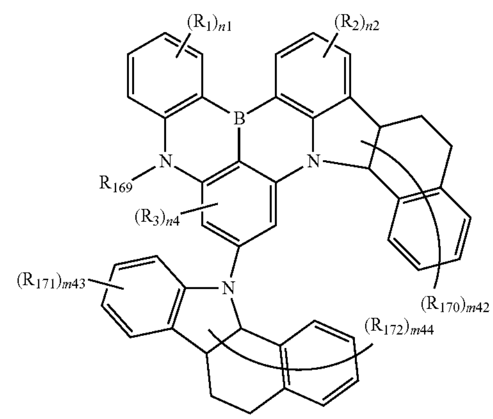
Formula 34
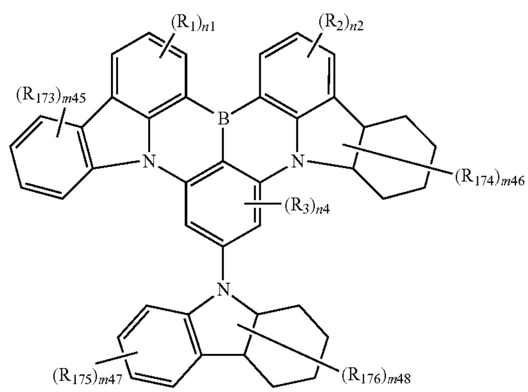
Formula 35
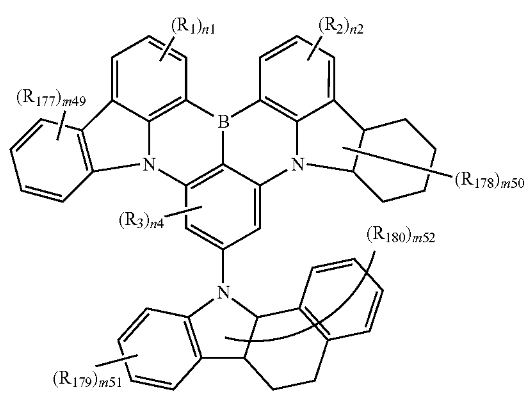

-continued

Formula 36

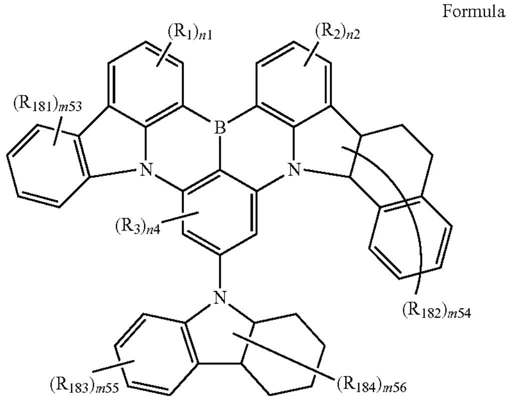

Formula 37

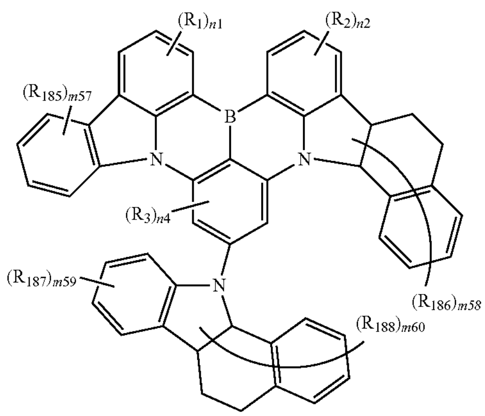

[Formula 38]

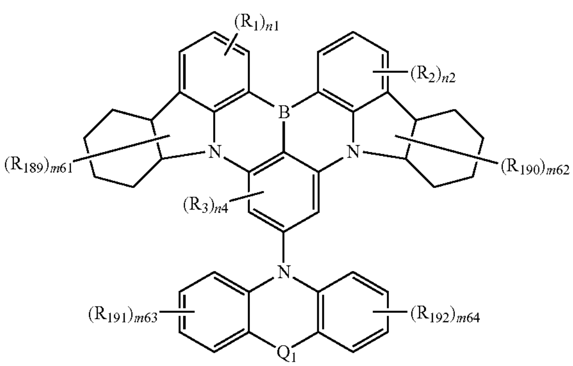

-continued

Formula 39

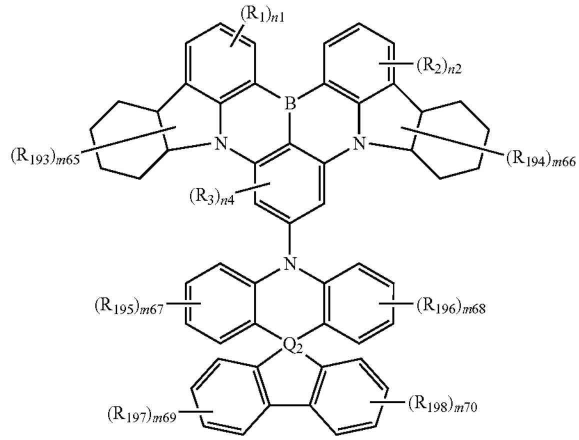

wherein in Formulae 12 to 18, 20 to 22, and 24 to 39:

$Q_1$ is $C(R_{199})(R_{200})$ or $Si(R_{199})(R_{200})$;

$Q_2$ is C or Si;

$R_1$ to $R_3$ and $R_{109}$ to $R_{126}$, $R_{132}$ to $R_{137}$, and $R_{143}$ to $R_{200}$ are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group;

n4 is an integer from 0 to 2, and when n4 is 2, the substituents in two parentheses are the same as or different from each other; and n1 to n3, m1 to m14, m16 to m21, and m23 to m70 are each an integer from 0 to 3, and when n1 to n3, m1 to m14, m16 to m21, and m23 to m70 are each 2 or more, the substituents in two or more parentheses are the same as or different from each other.

8. The compound of claim 1 that is any one of the following compounds:

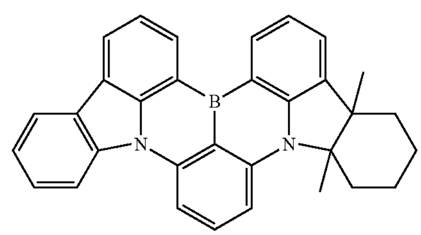

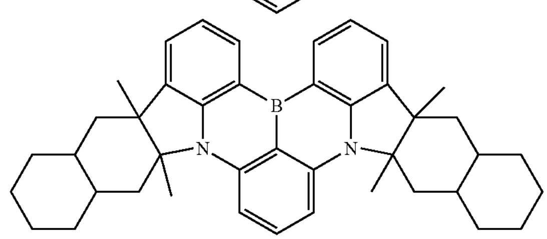

-continued
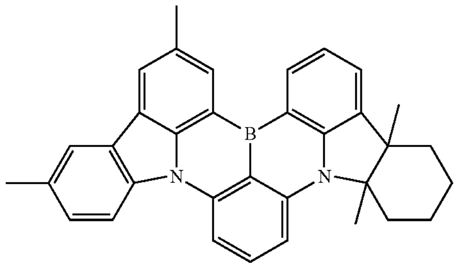
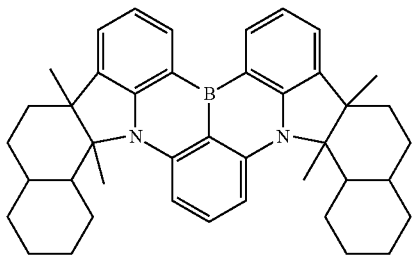
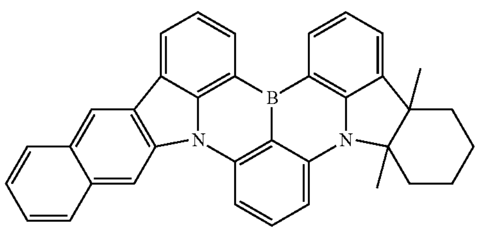
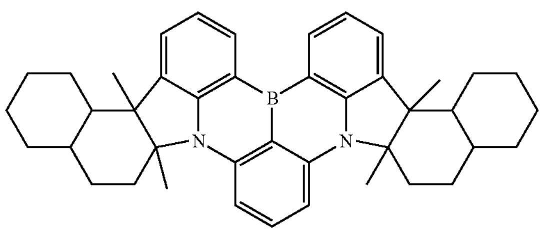
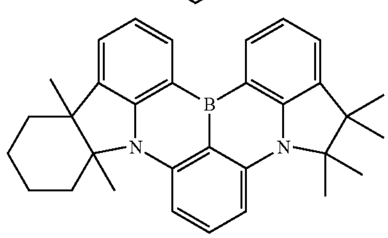
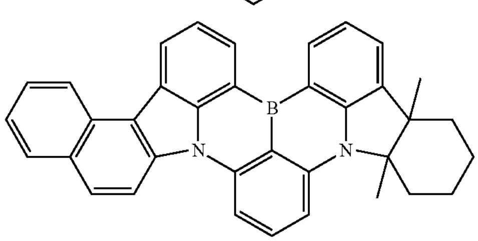
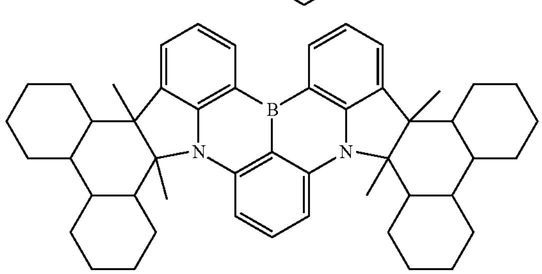
-continued
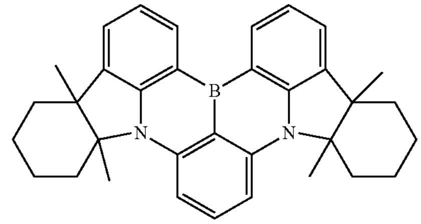
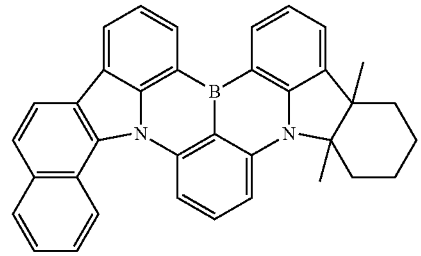
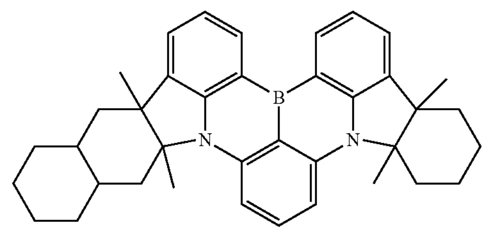
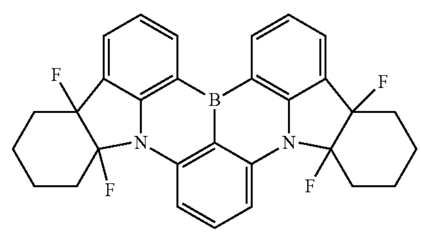
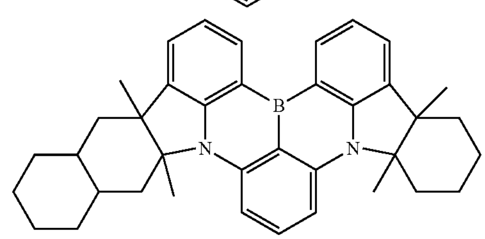
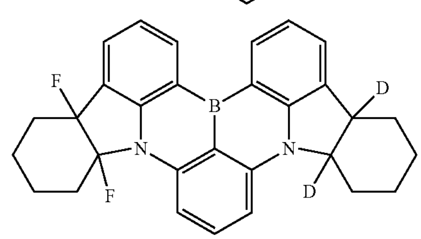
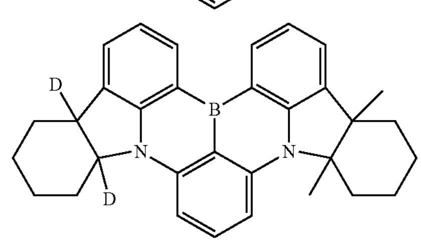

-continued
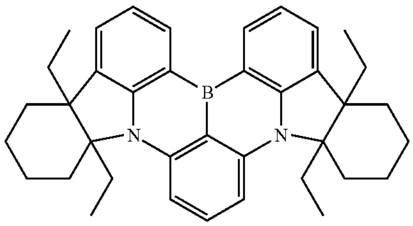
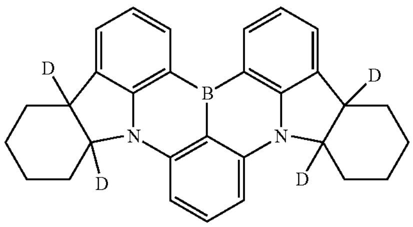
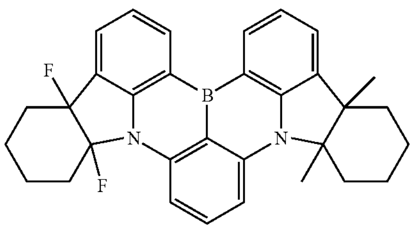
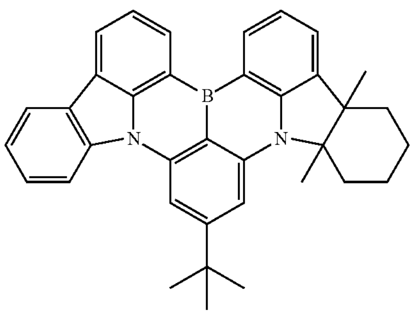
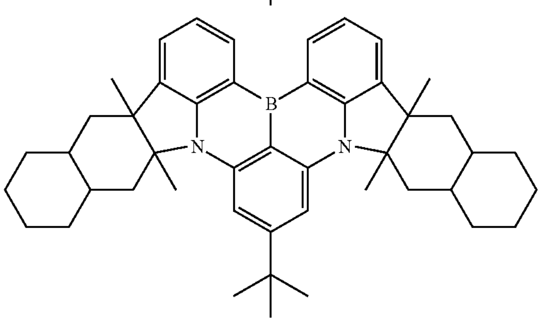
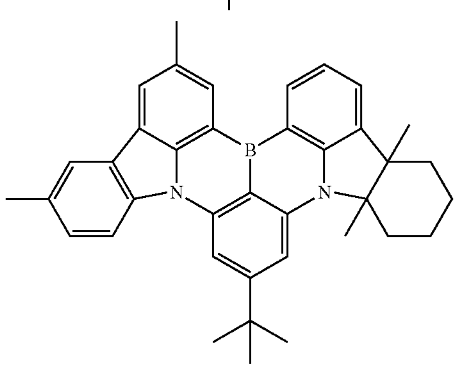
-continued
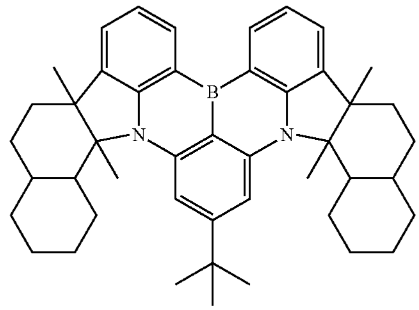
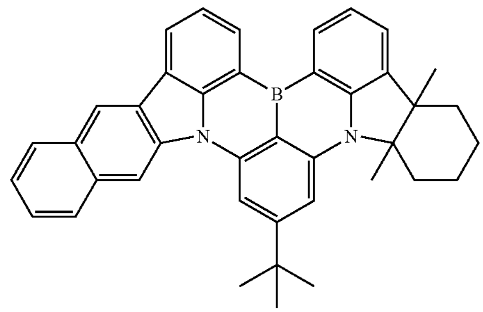
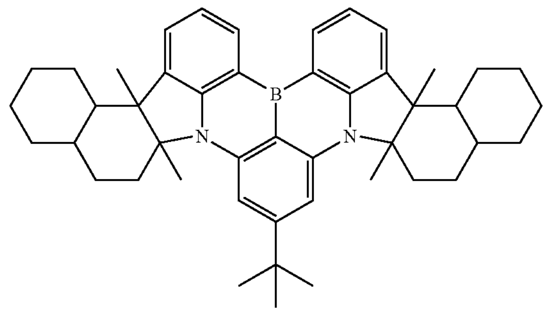
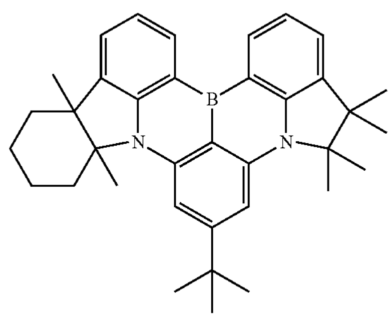
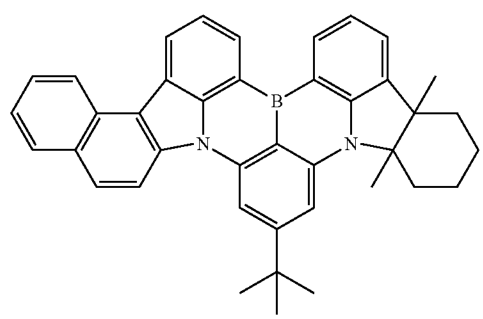

-continued
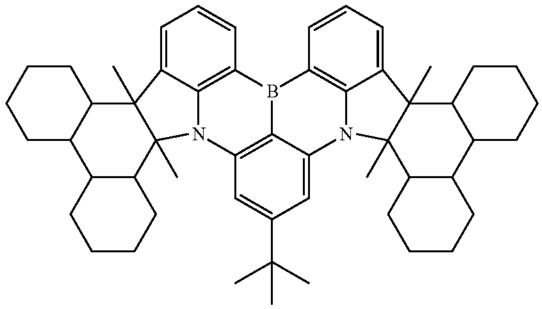
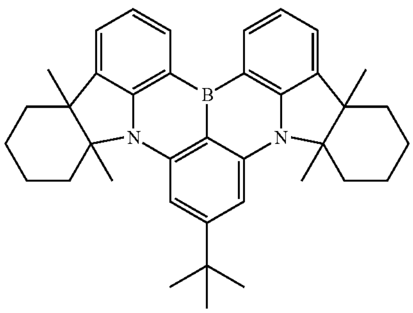
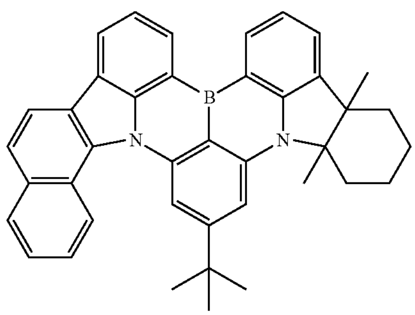
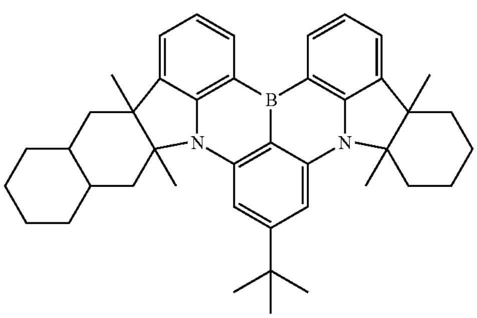
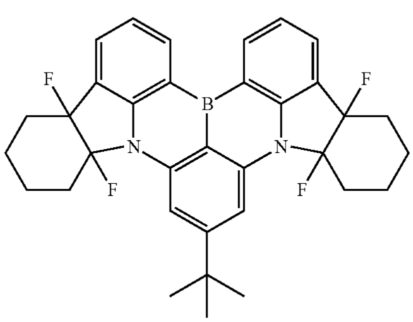
-continued
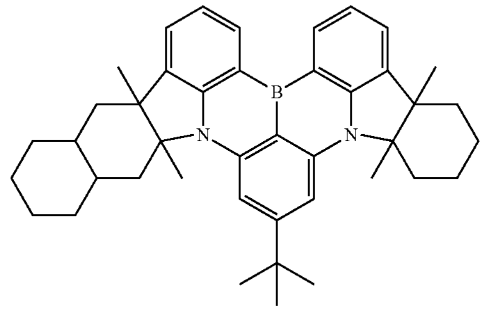
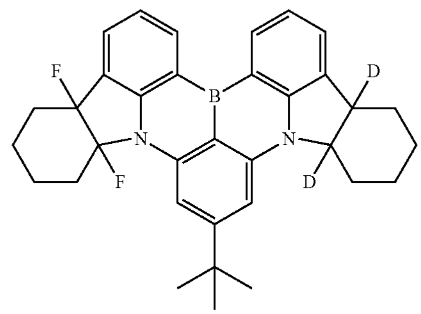
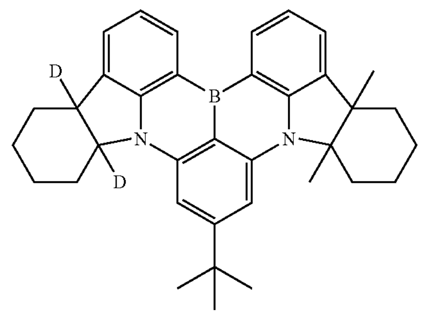
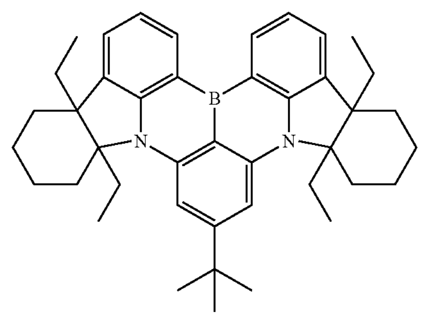
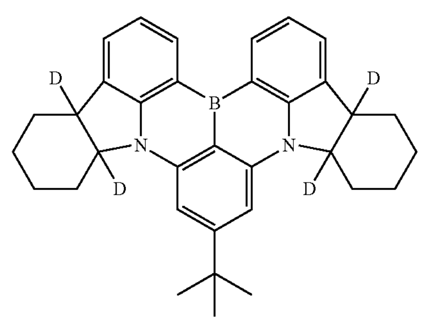

-continued
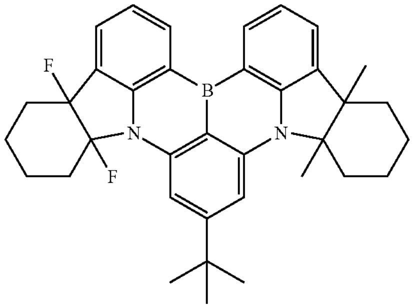
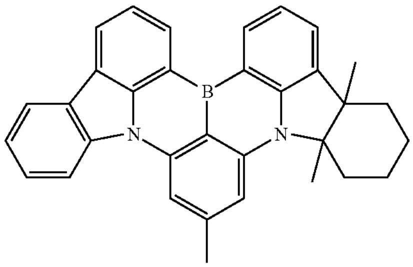
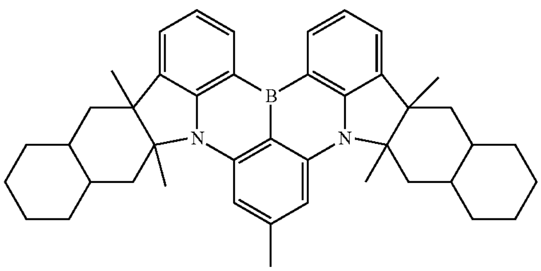
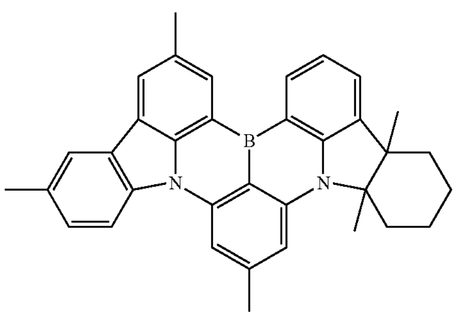
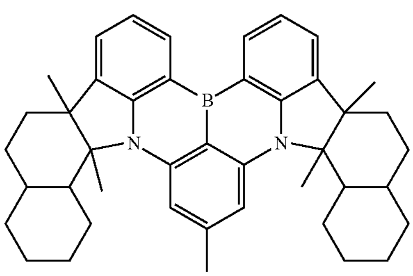
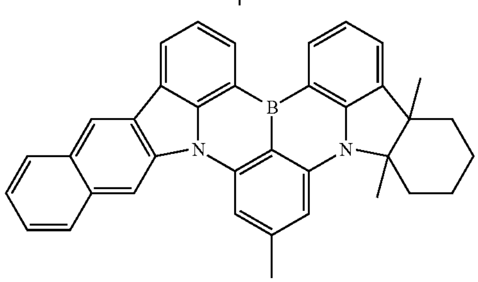
-continued
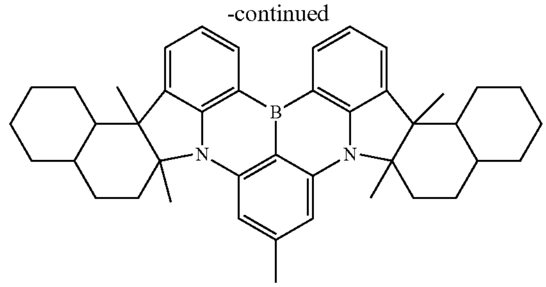
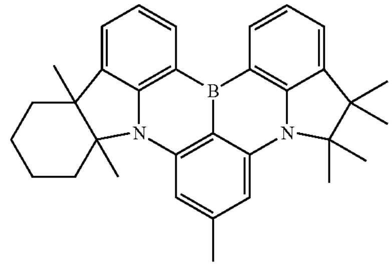
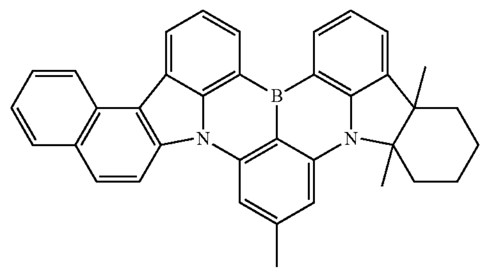
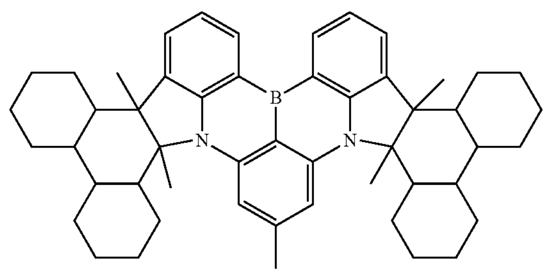
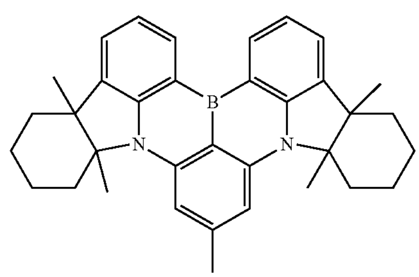
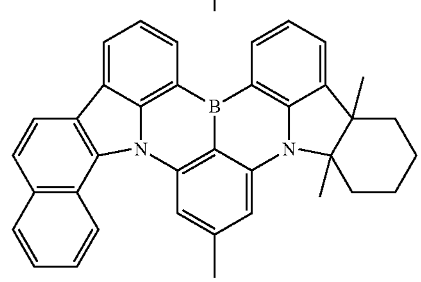

-continued
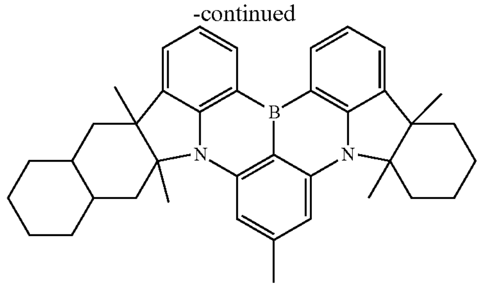
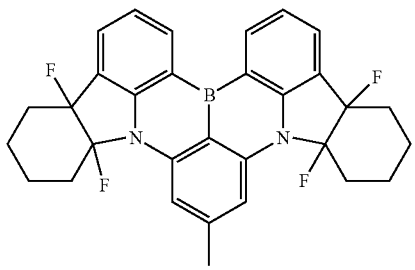
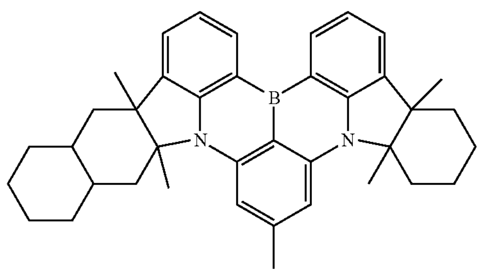
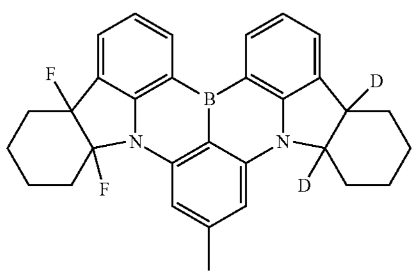
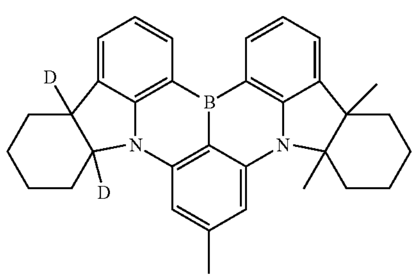
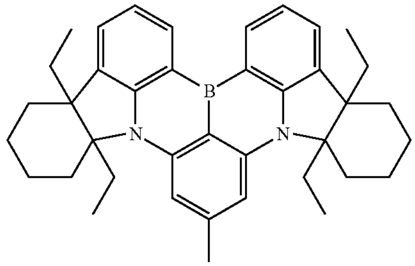
-continued
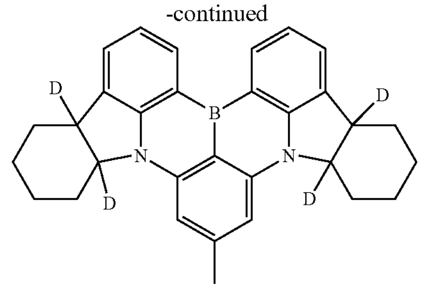
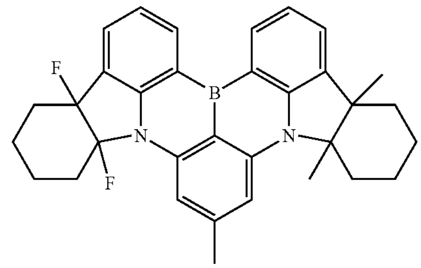
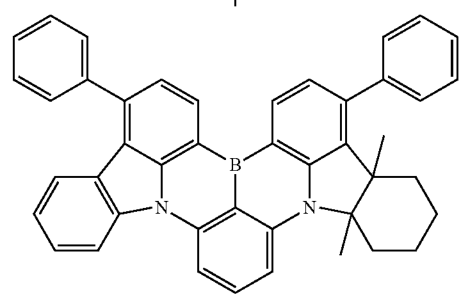
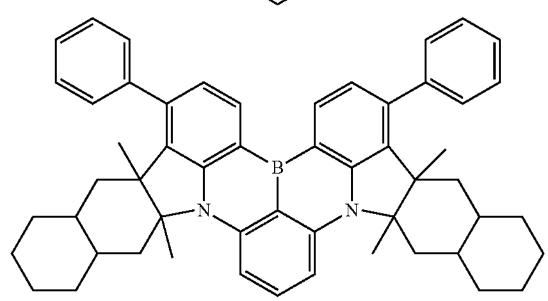
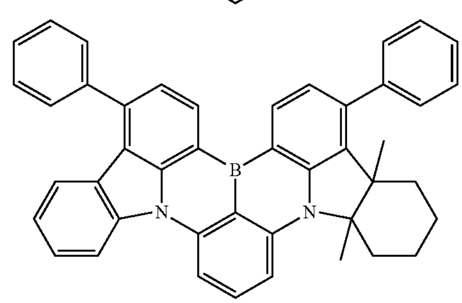
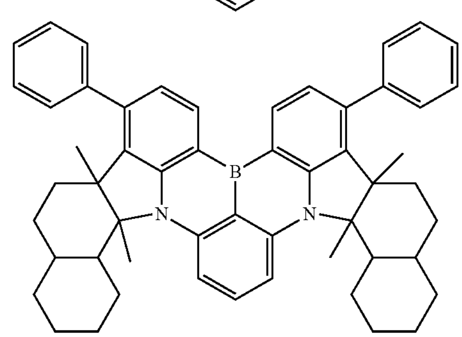

-continued
-continued
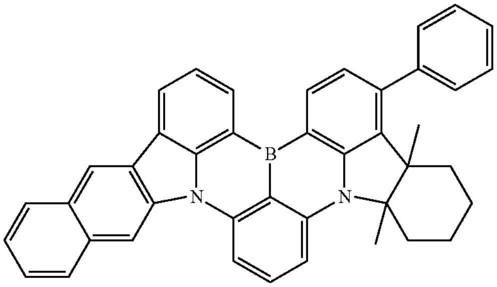
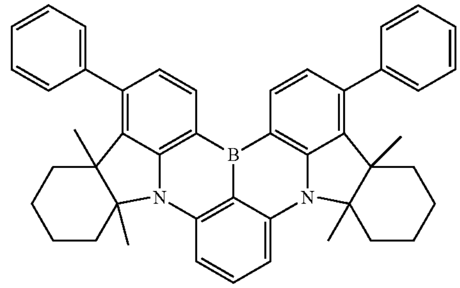
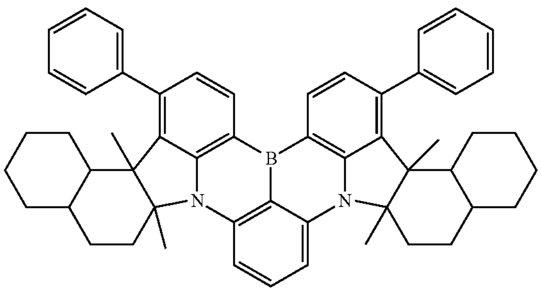
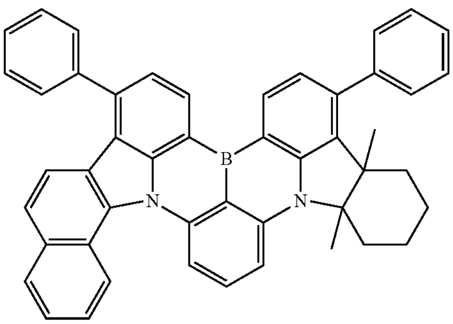
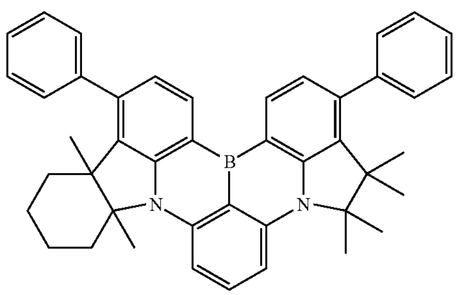
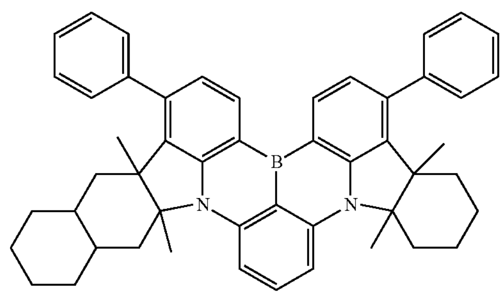
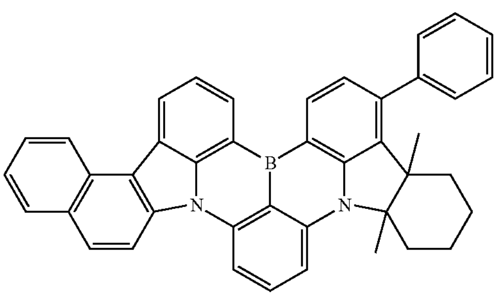
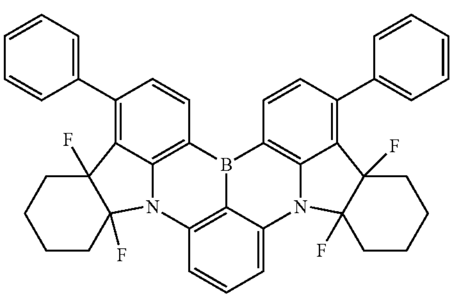
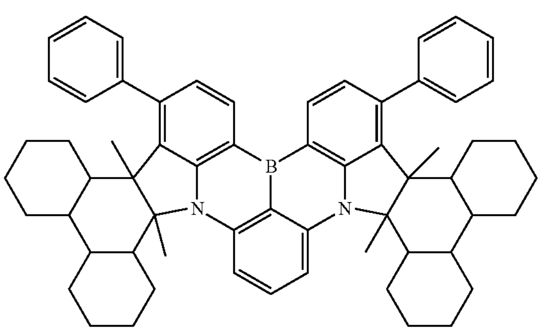
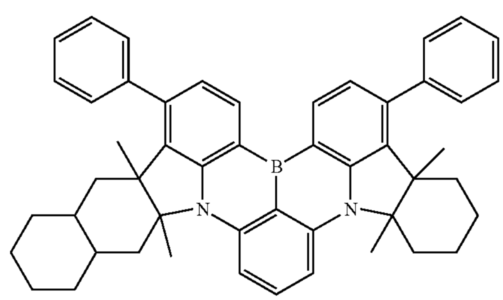

-continued
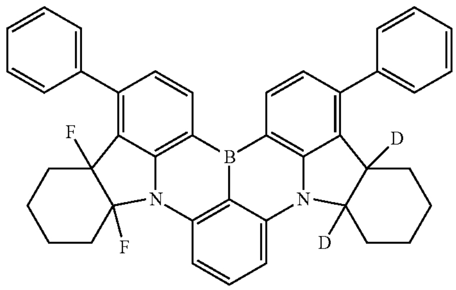
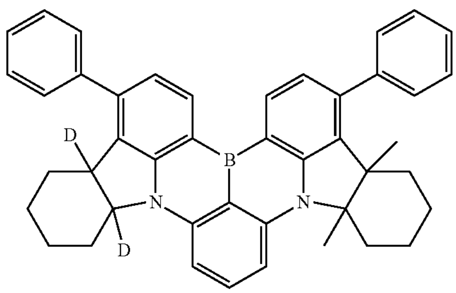
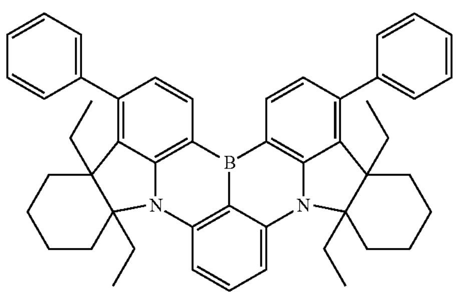
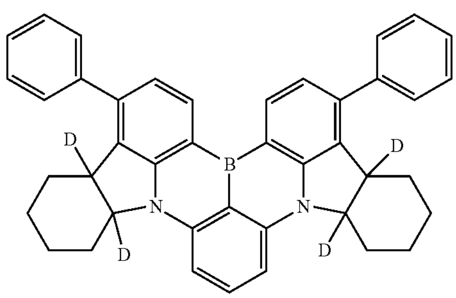
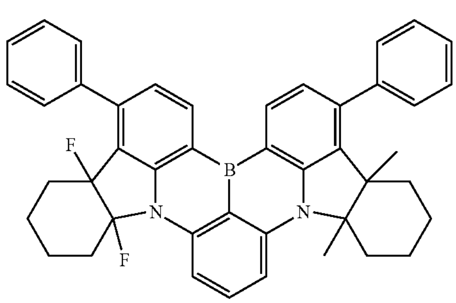
-continued
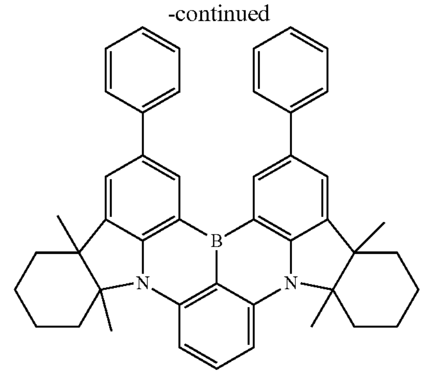
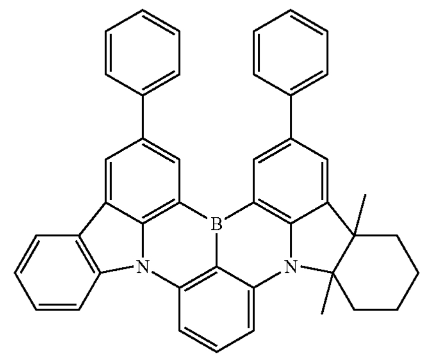
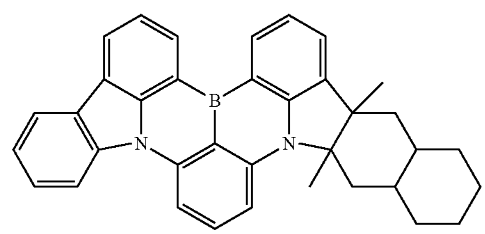
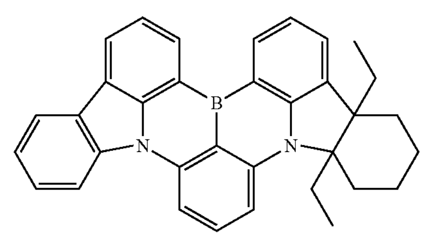
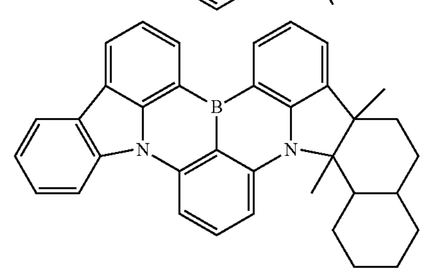
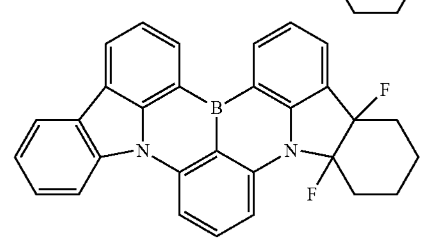

-continued
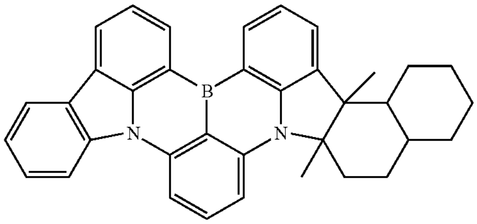
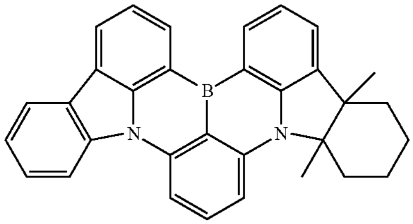
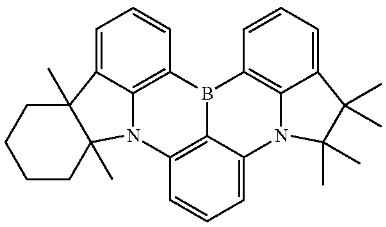
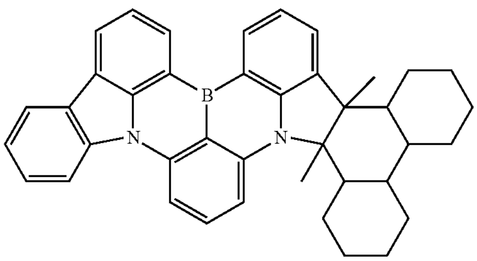
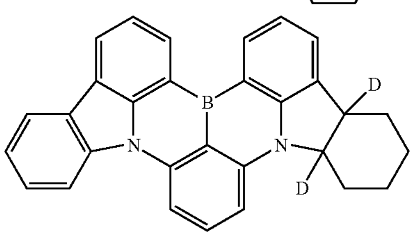
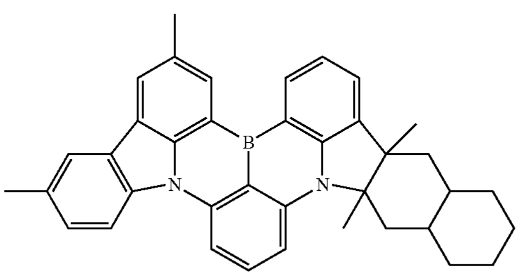
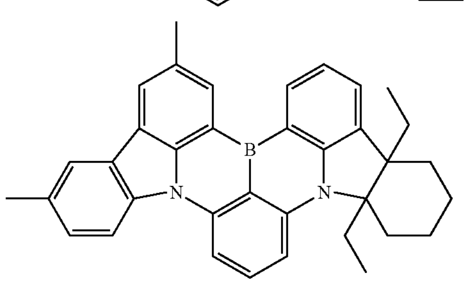
-continued
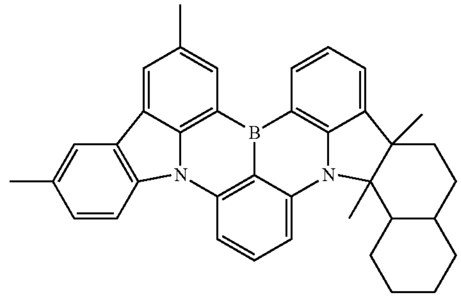
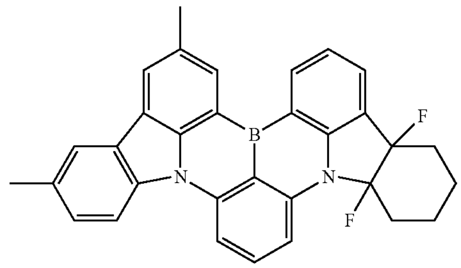
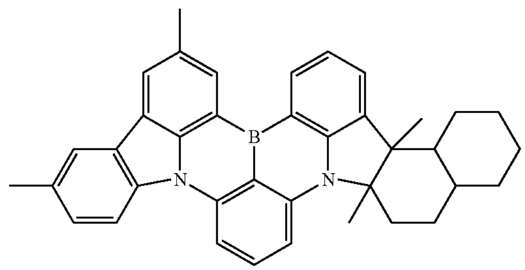
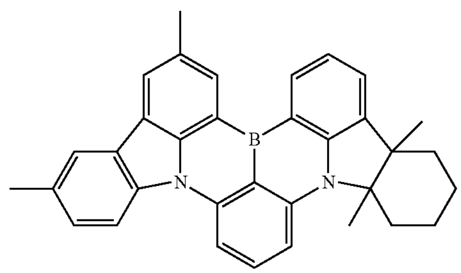
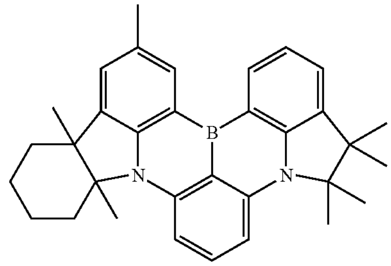
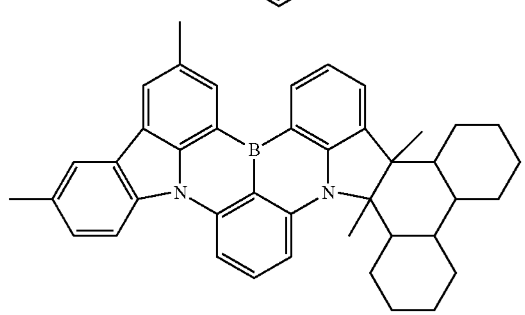

-continued
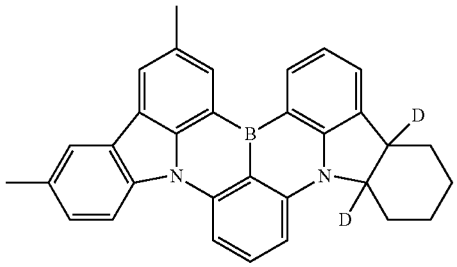
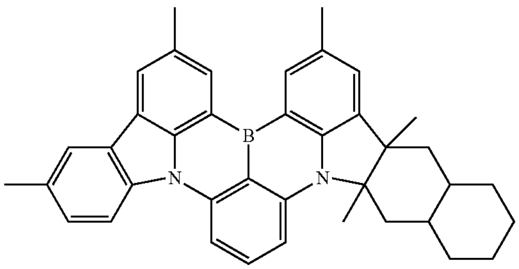
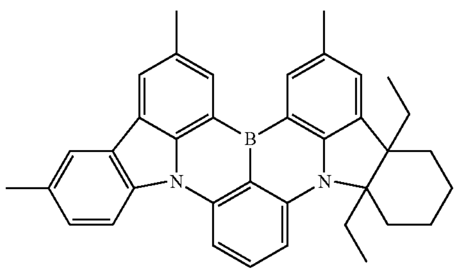
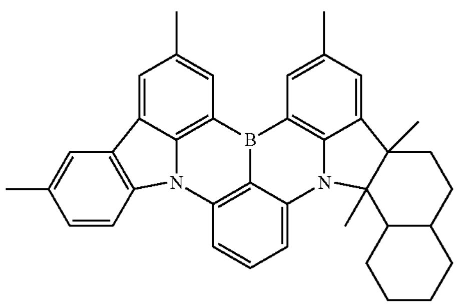
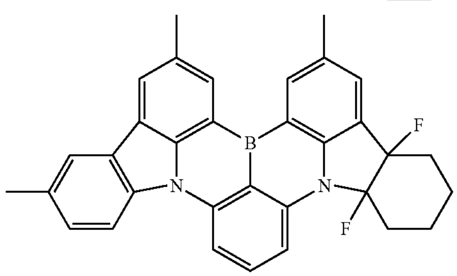
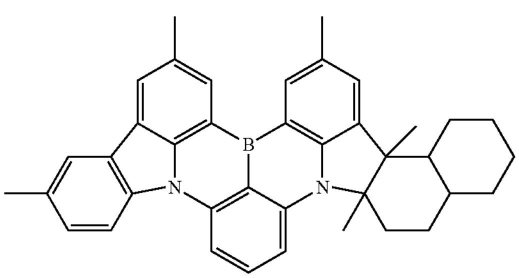
-continued
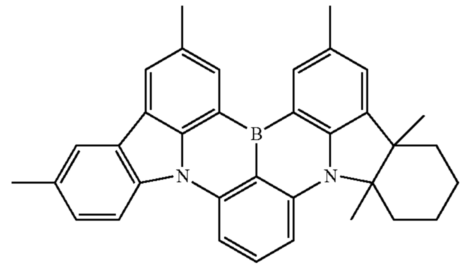
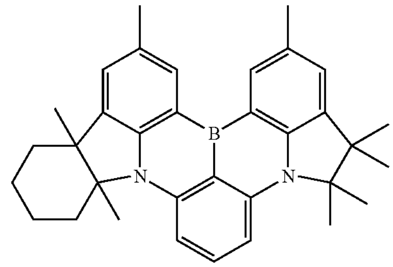
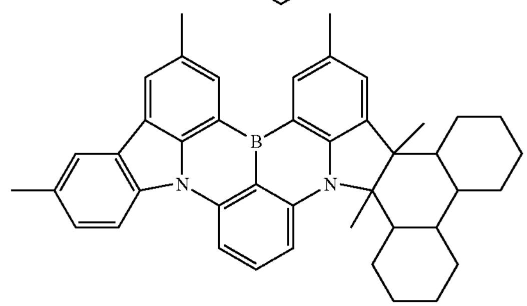
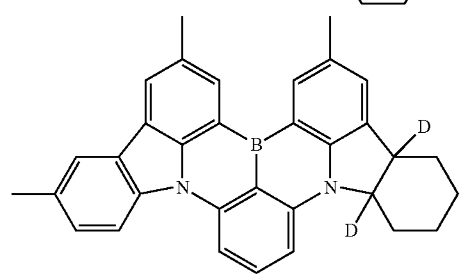
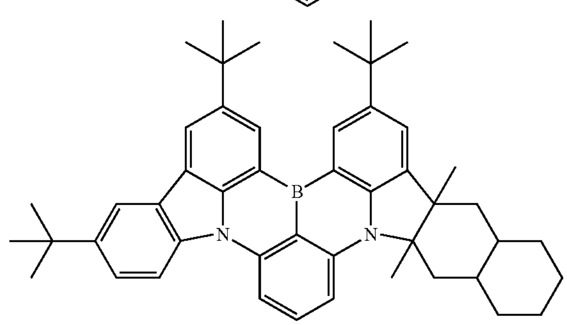
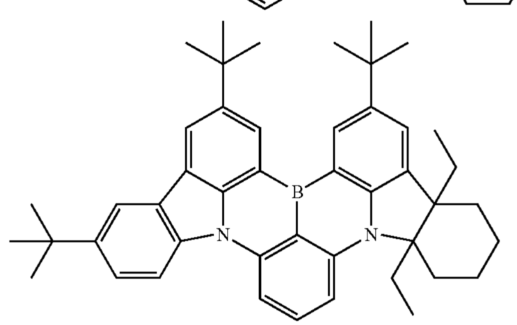

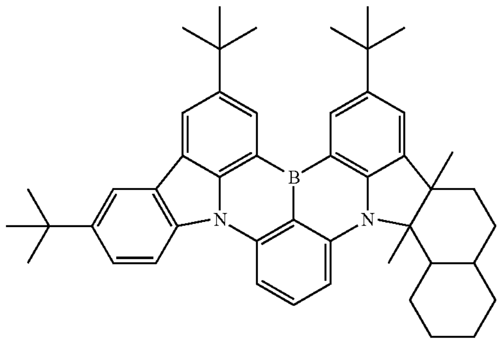
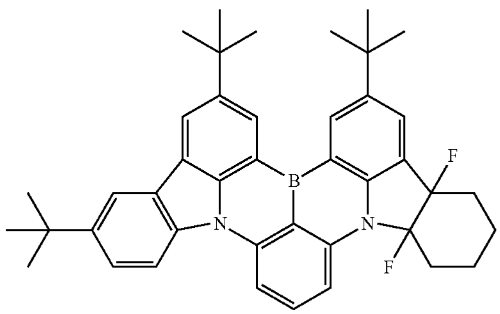
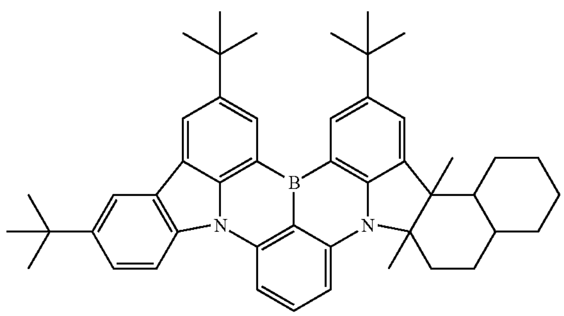
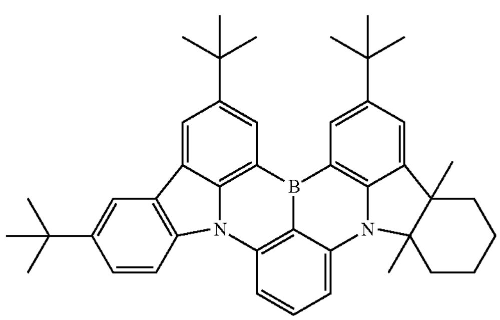
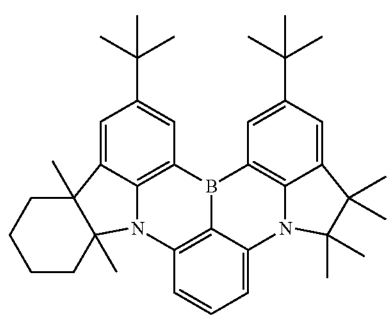
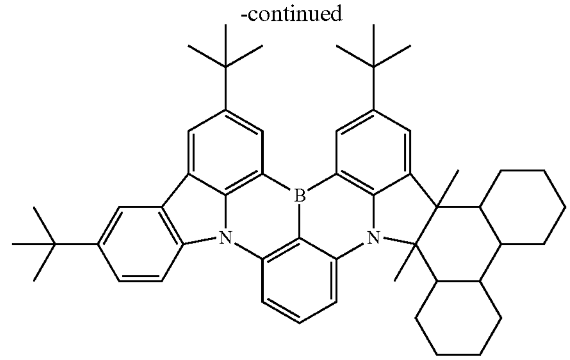
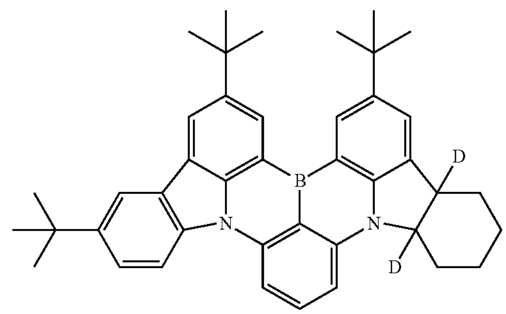
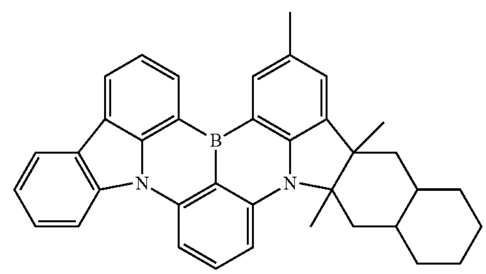
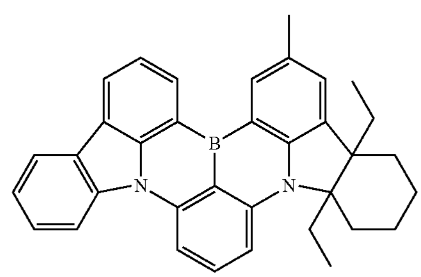
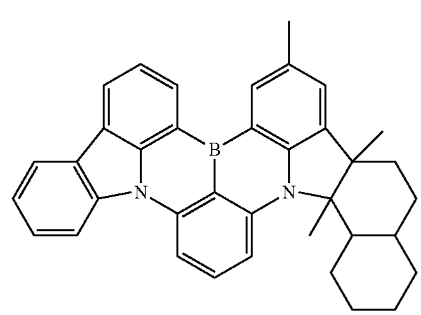

-continued
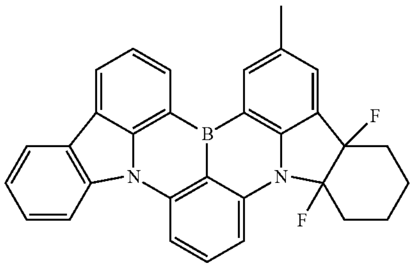
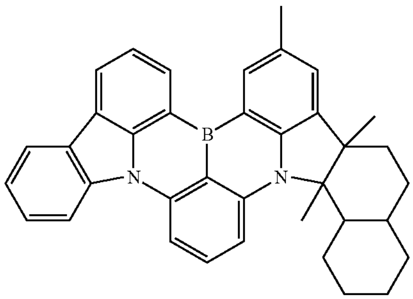
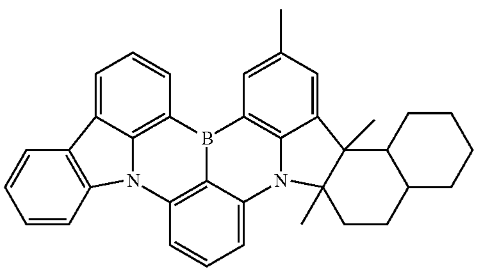
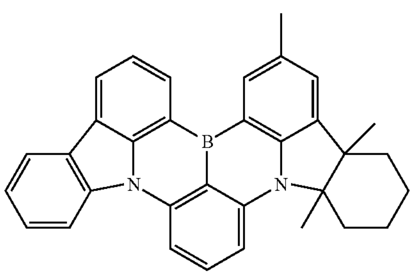
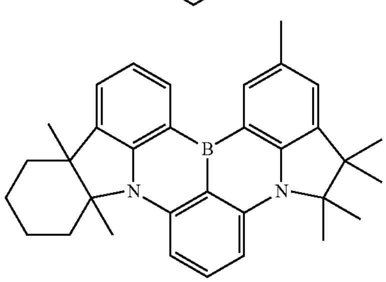
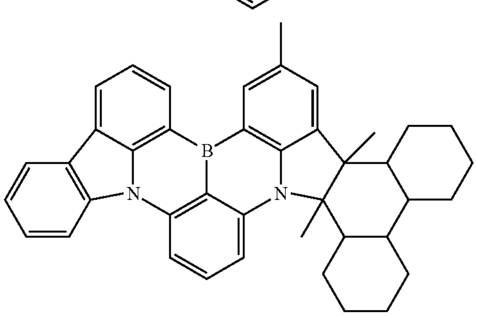
-continued
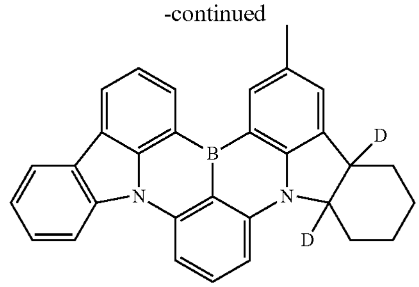
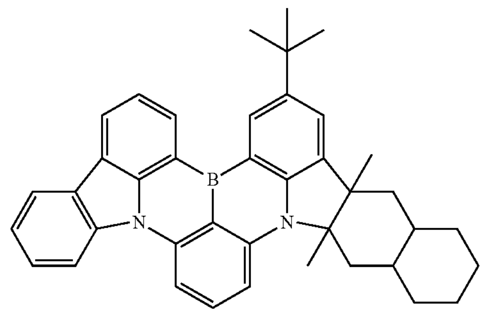
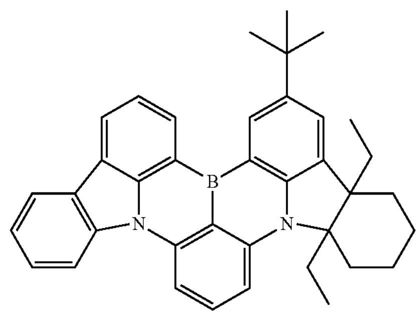
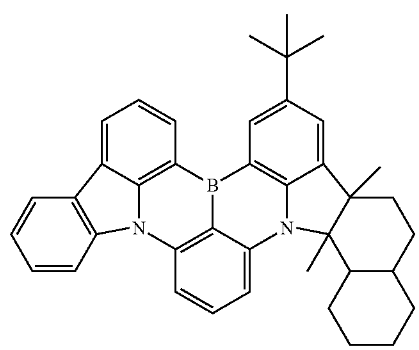
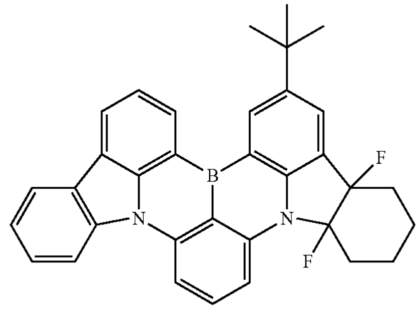

-continued
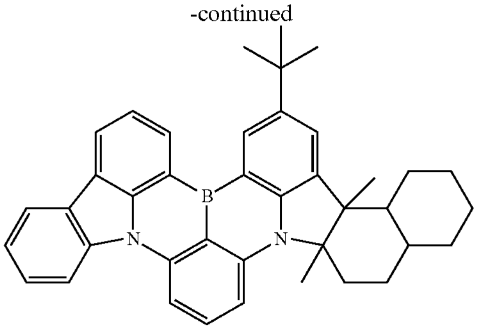
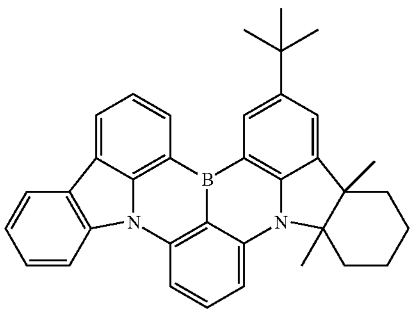
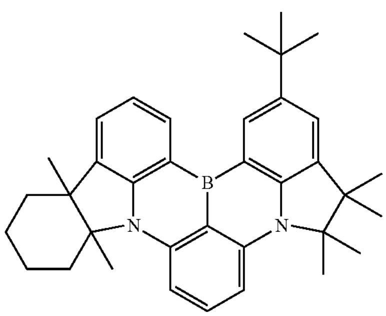
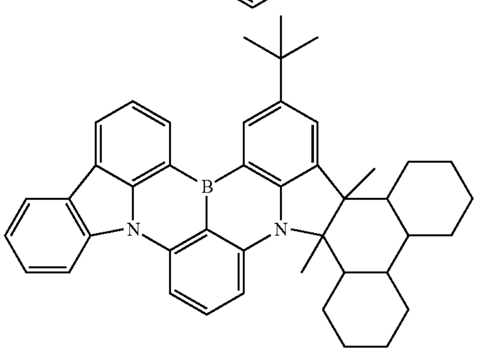
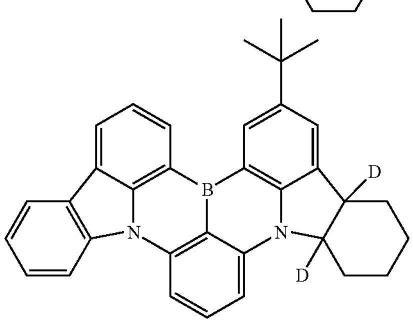
-continued
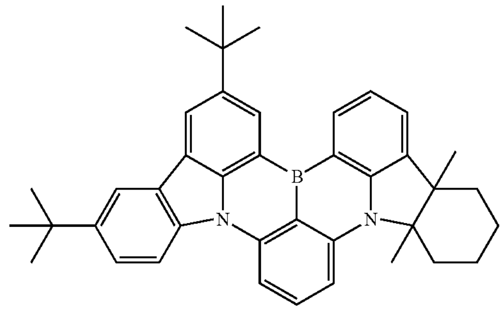
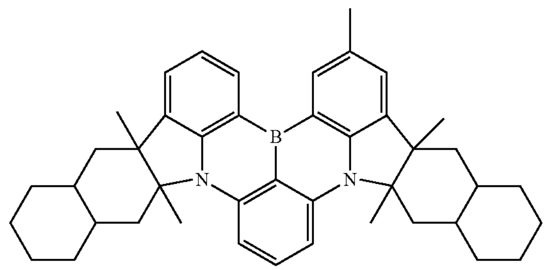
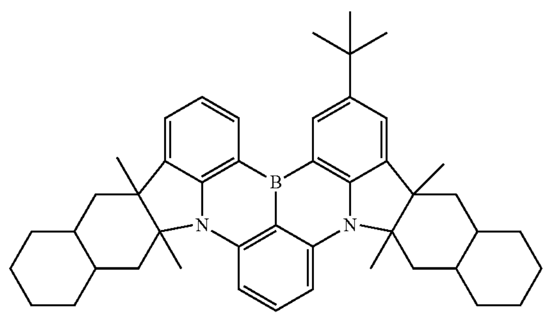
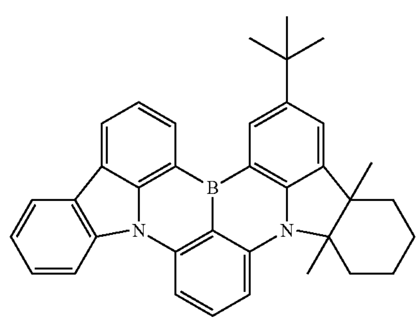
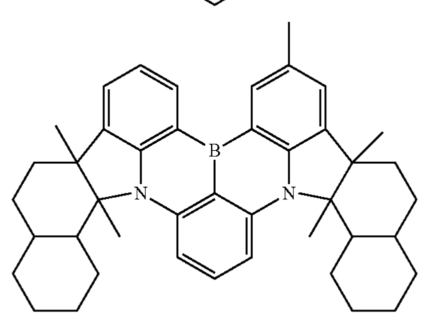

-continued
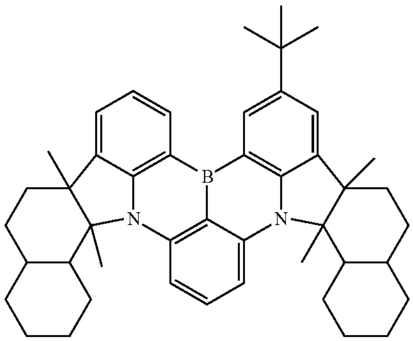
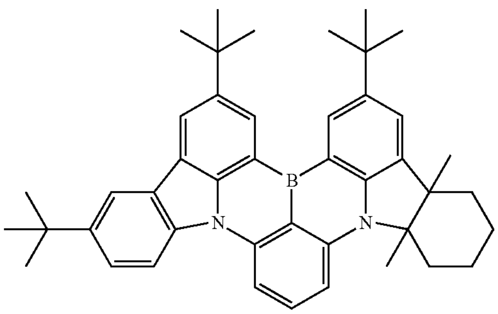
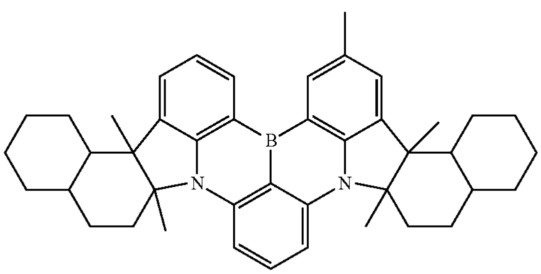
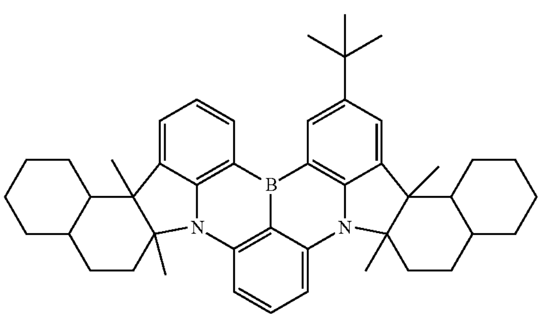
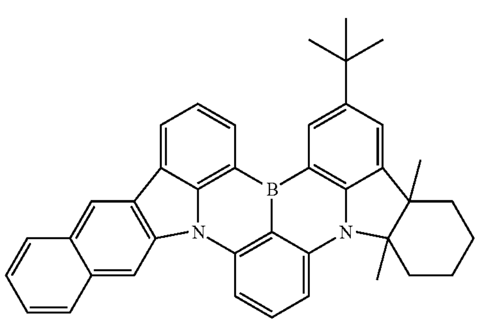
-continued
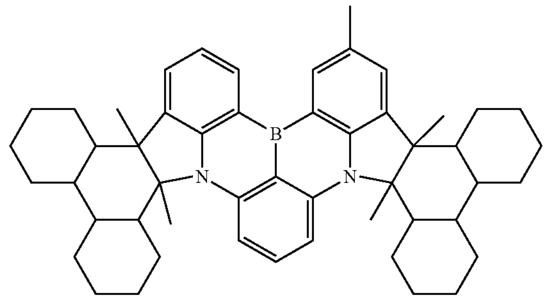
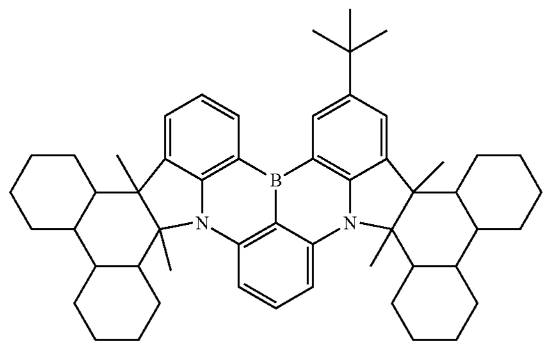
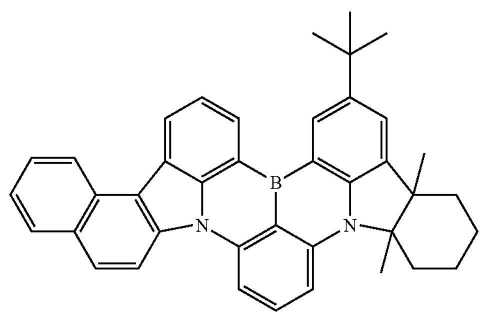
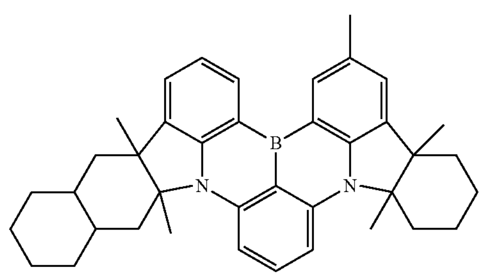
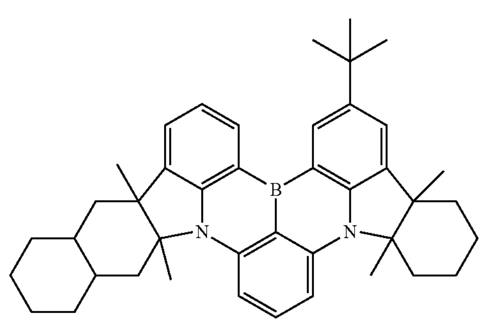

-continued
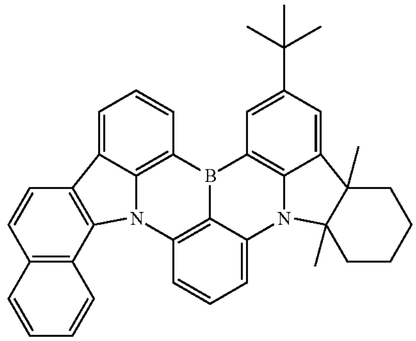
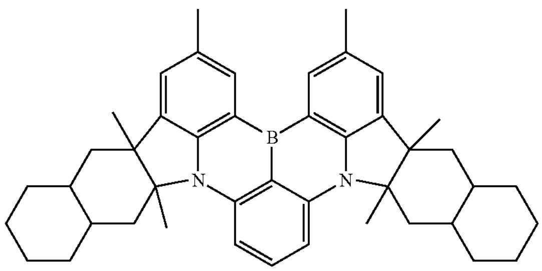
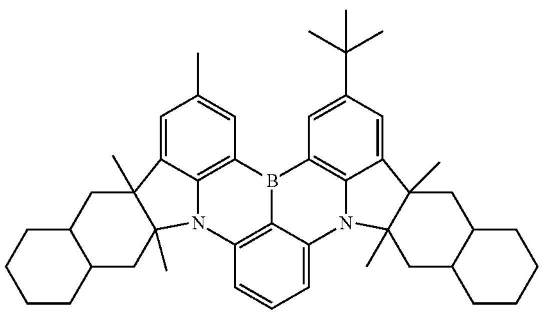
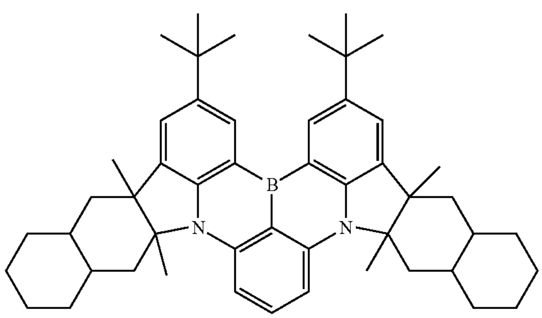
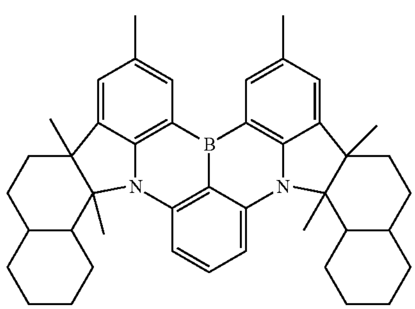
-continued
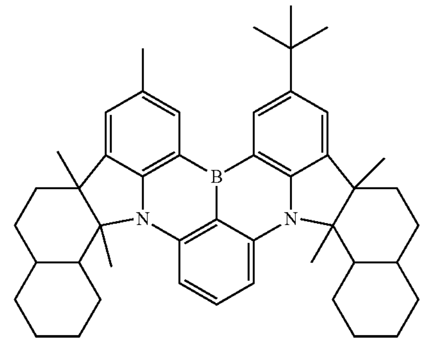
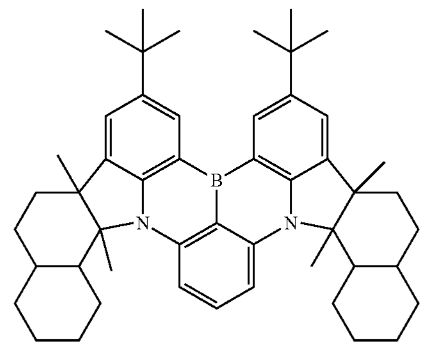
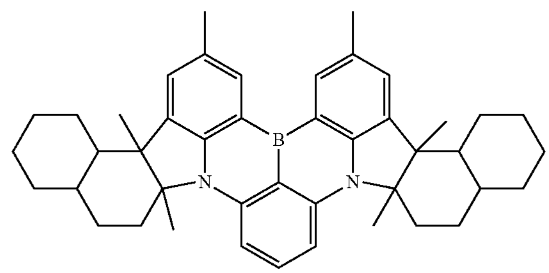
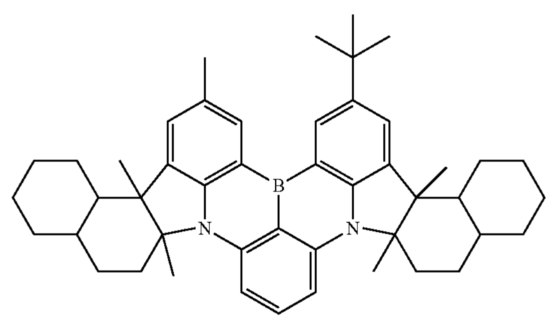
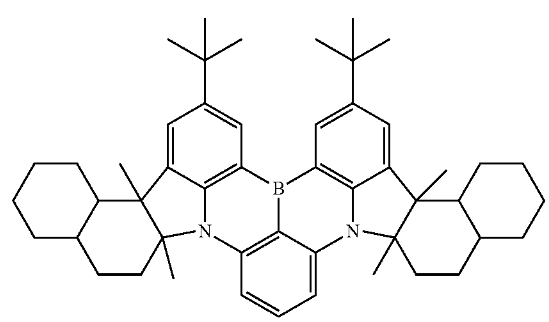

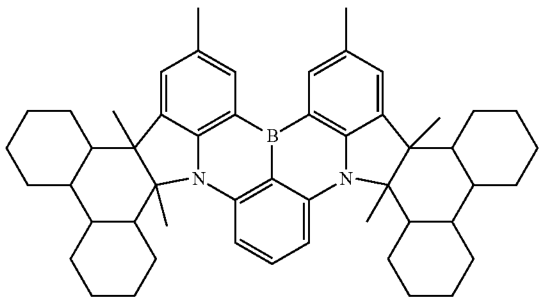
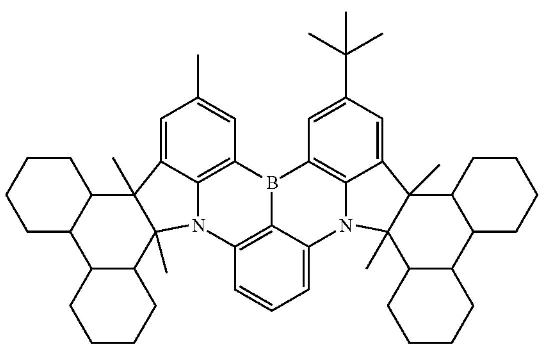
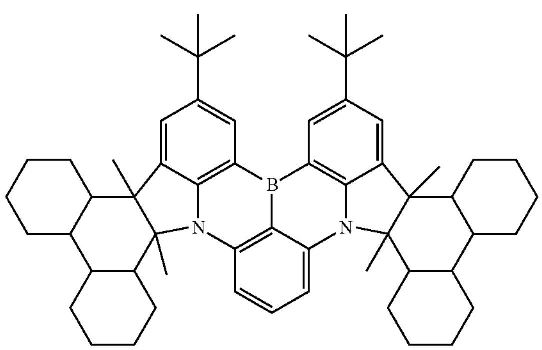
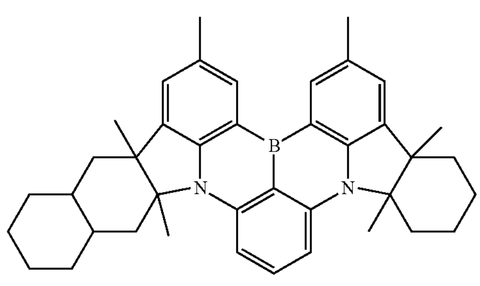
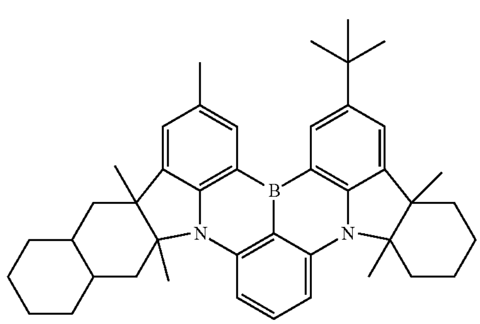
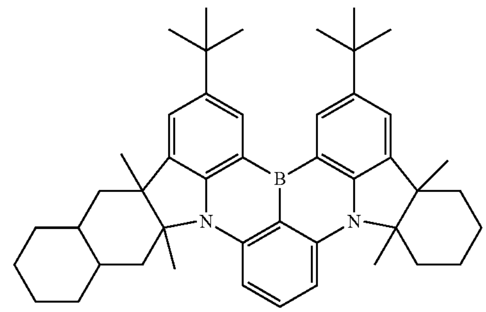
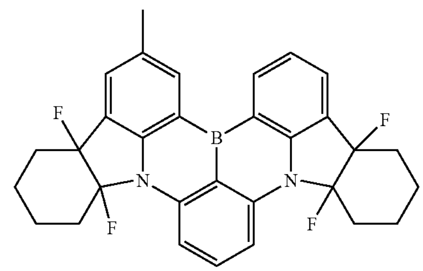
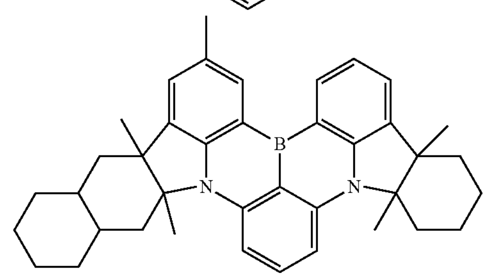
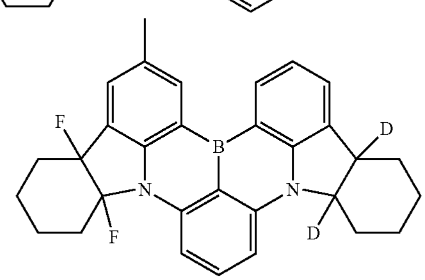
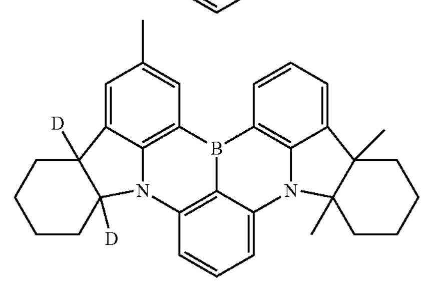
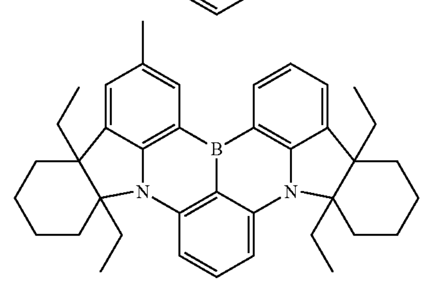

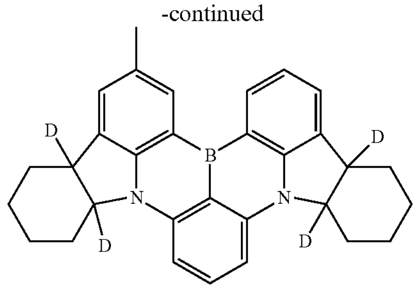
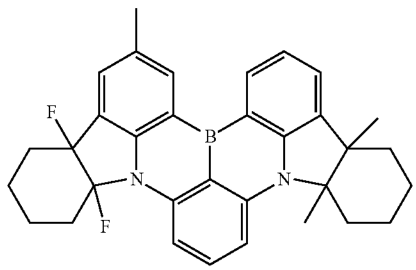
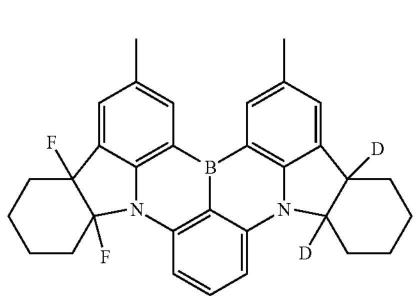
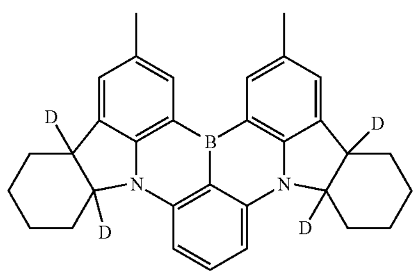
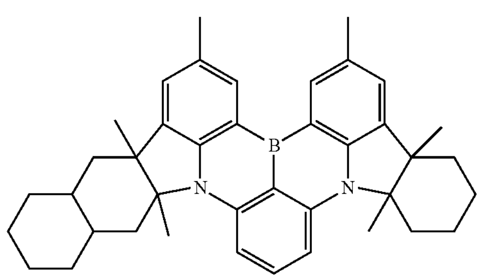
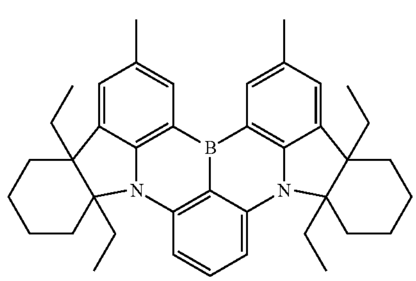
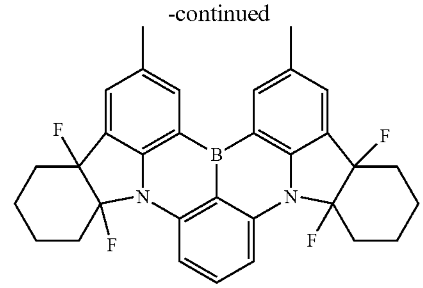
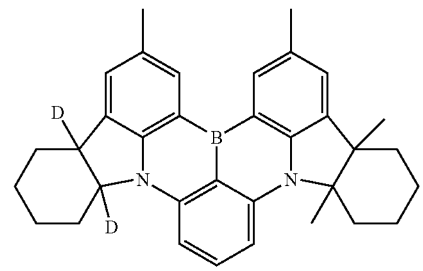
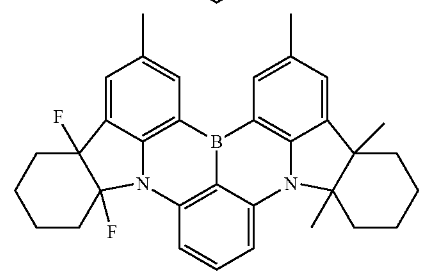
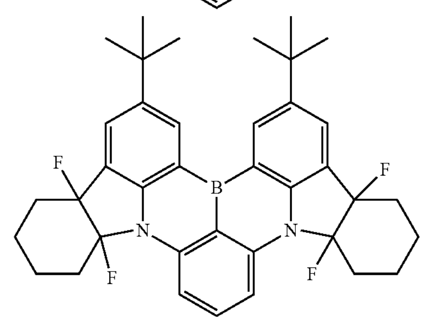
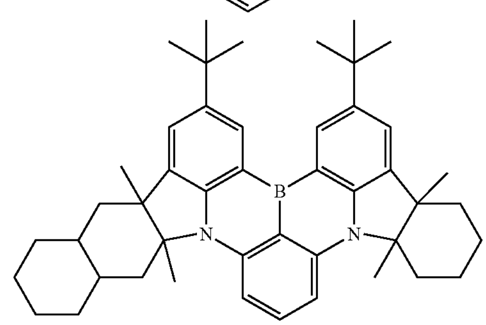
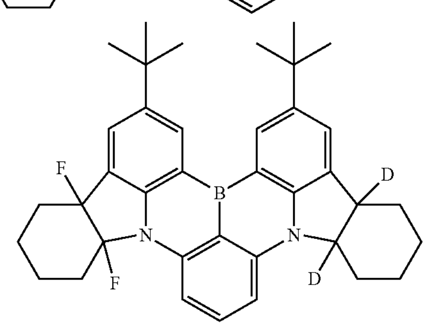

-continued
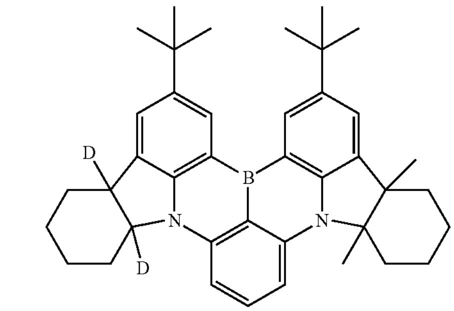
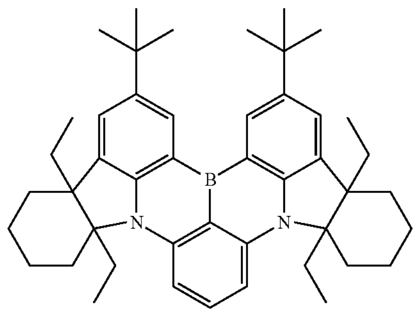
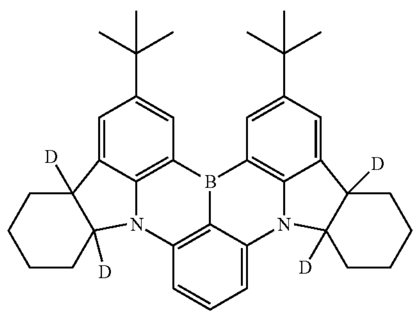
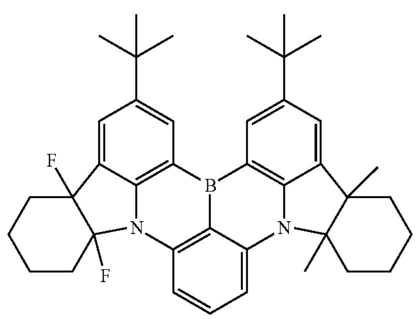
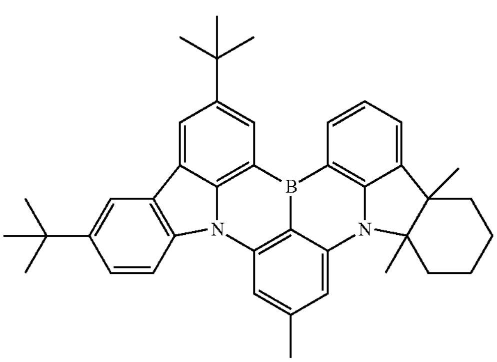
-continued
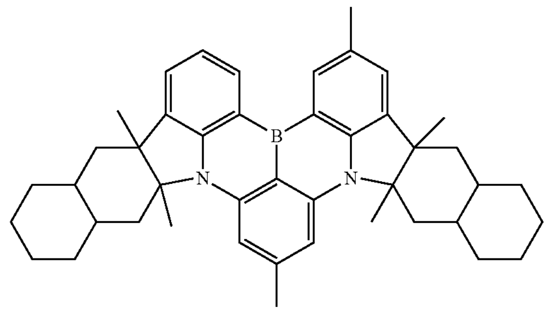
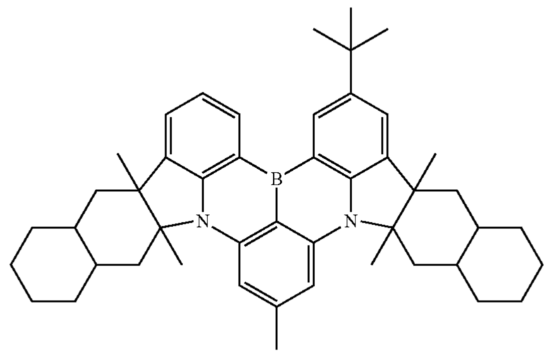
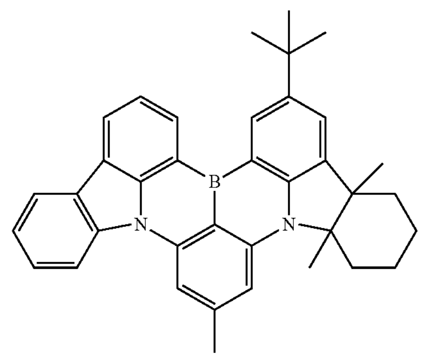
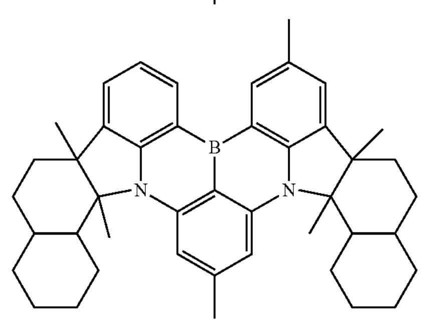
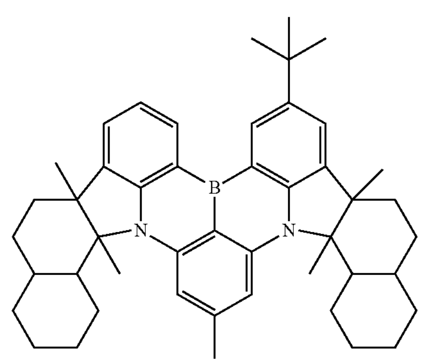

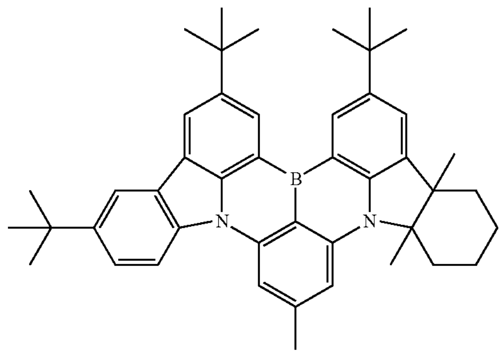
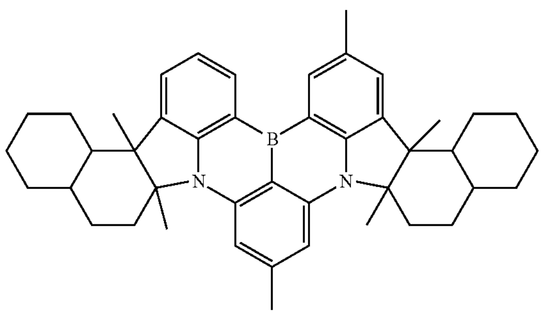
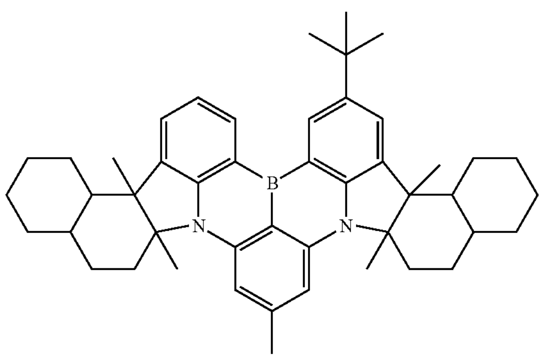
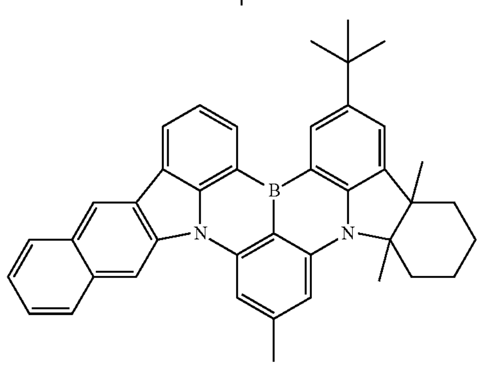
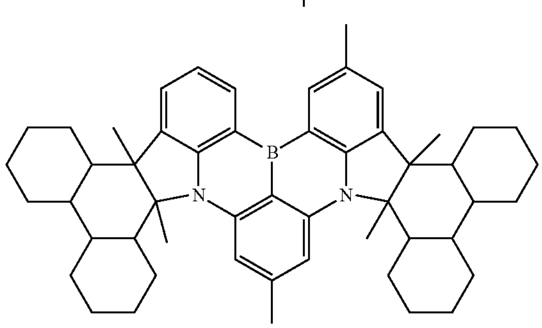
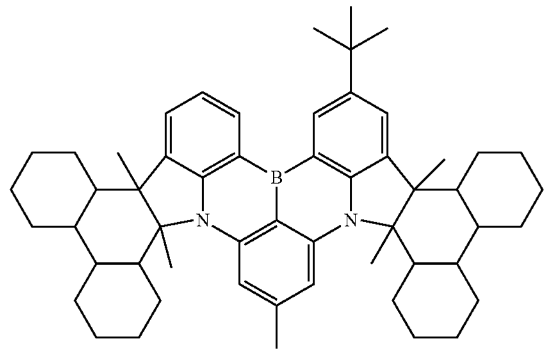
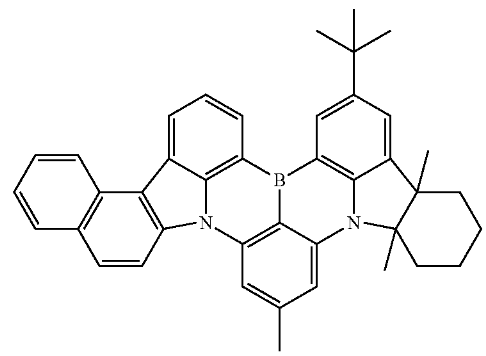
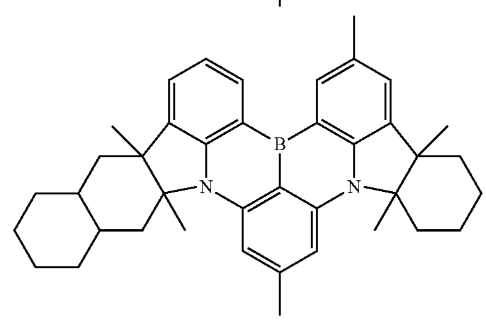
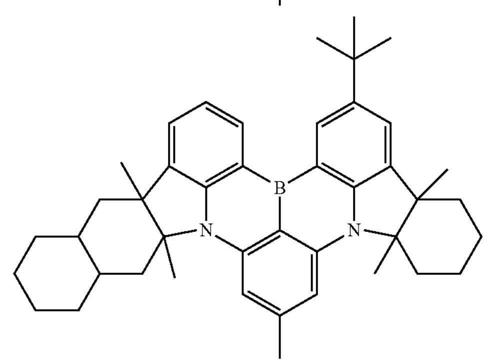
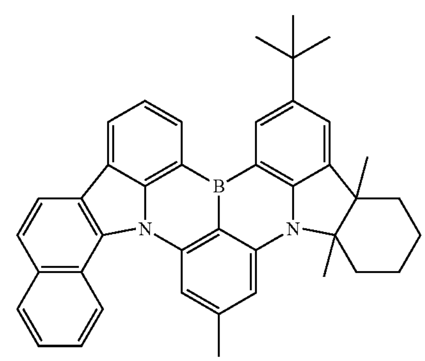 [SMILES: Cc1cc2c3c(c1)-n1c4c(cccc4c4ccc5ccccc5c41)B3c1cc(C(C)(C)C)cc3c1N2C1(C)CCCCC31C]

-continued
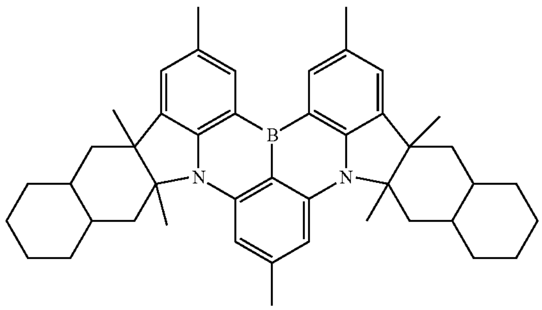
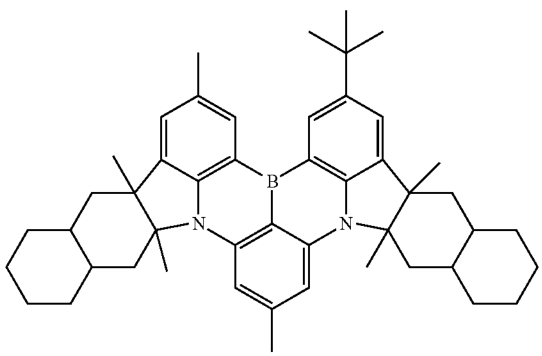
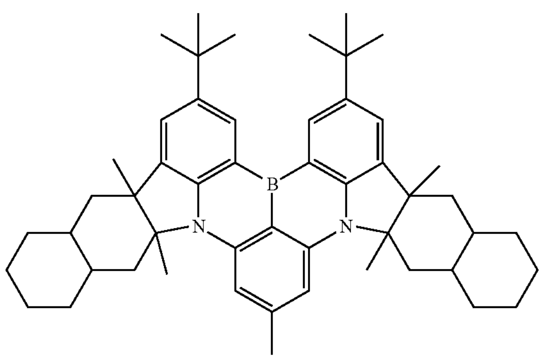
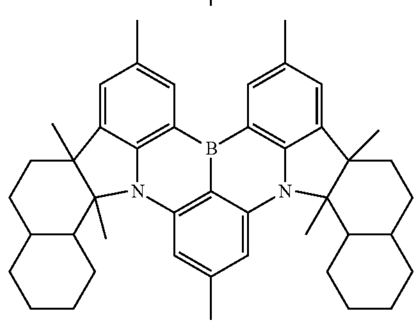
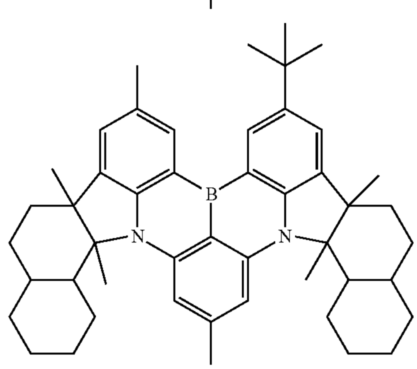
-continued
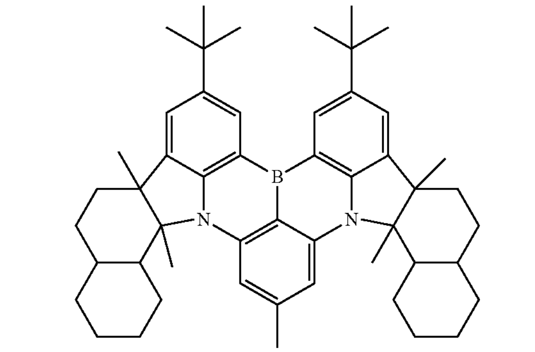
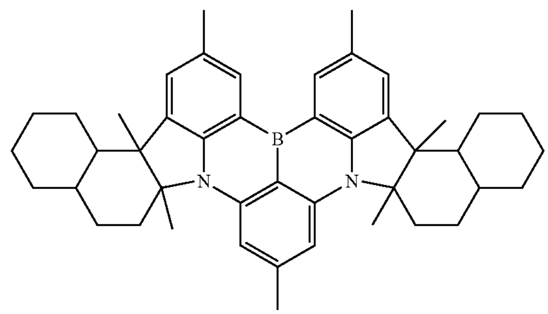
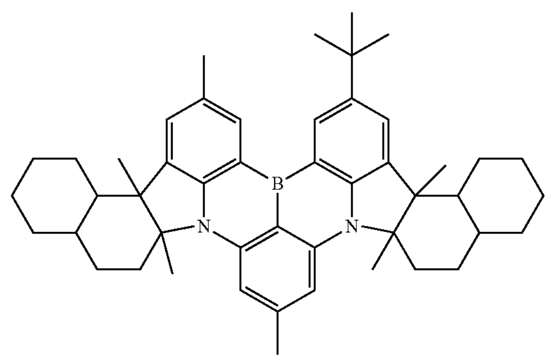
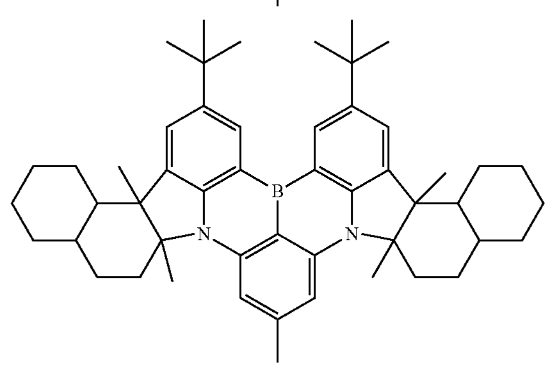
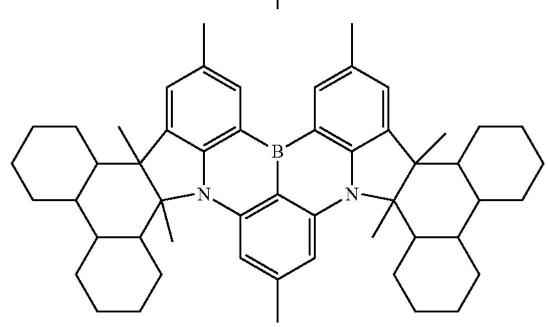

-continued
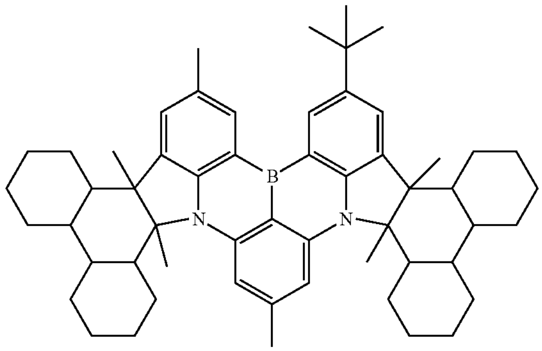
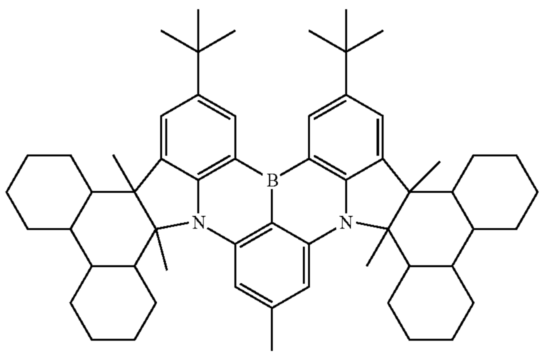
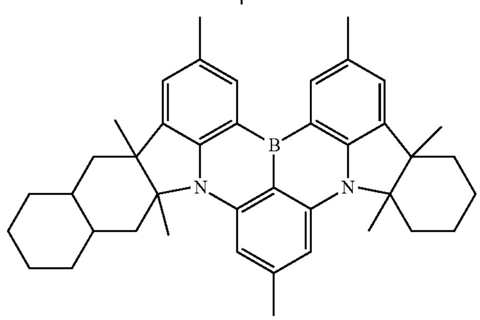
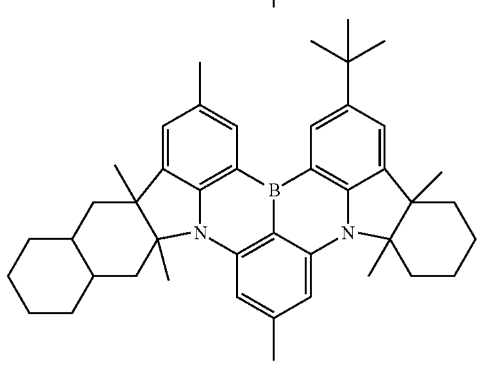
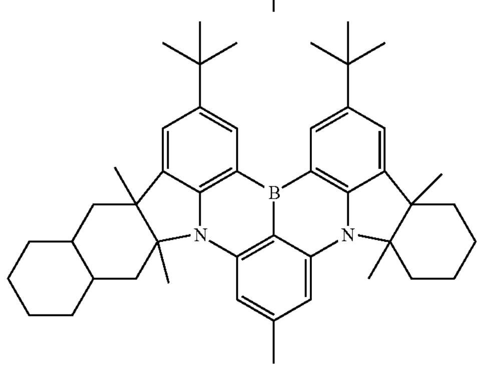
-continued
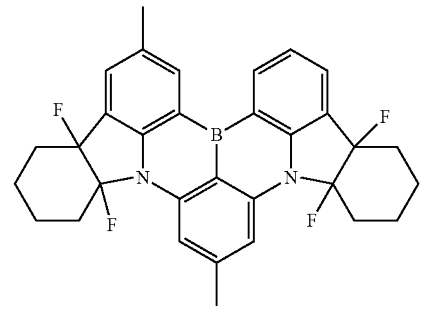
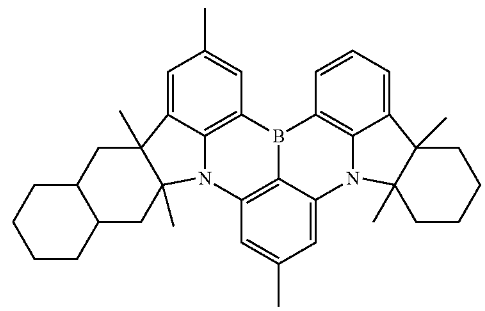
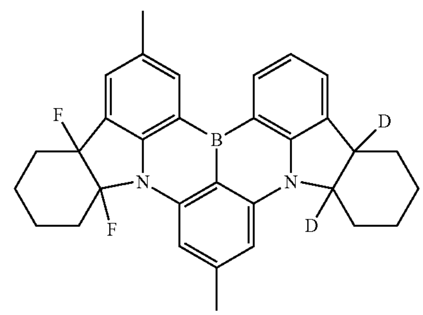
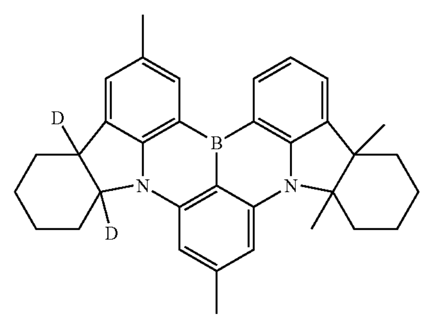
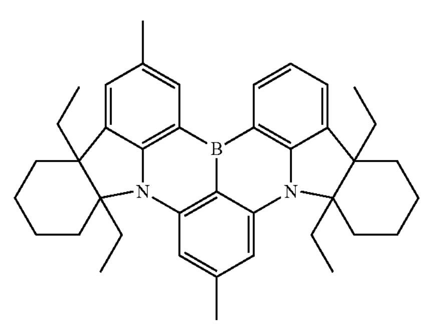

-continued
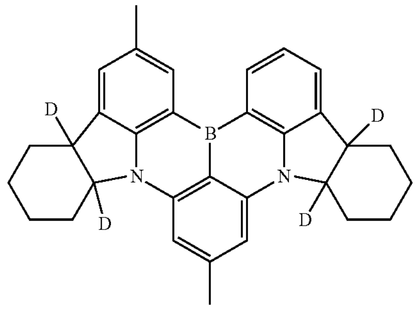
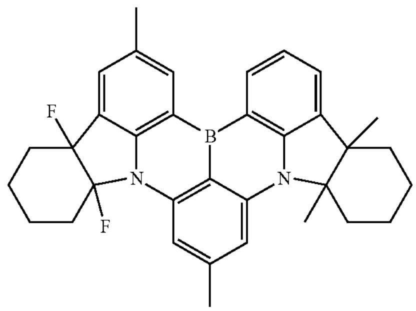
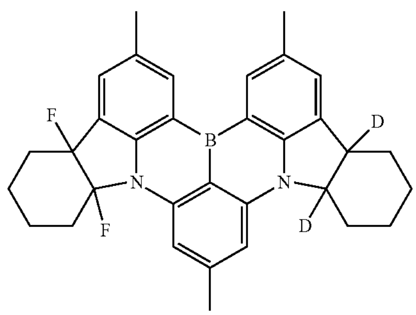
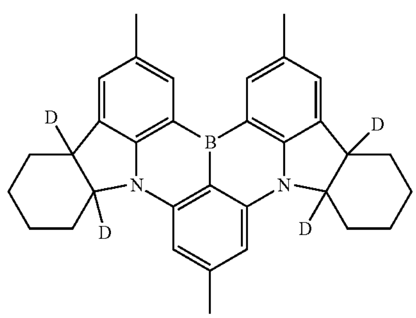
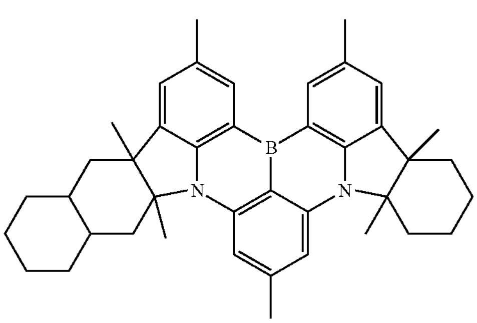
-continued
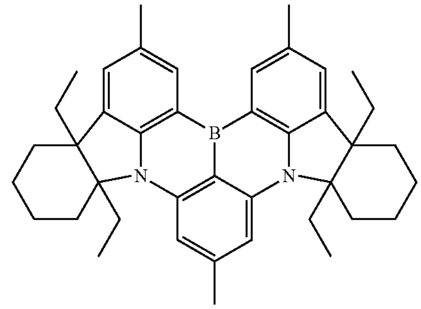
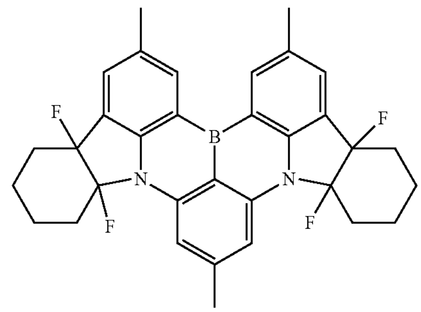
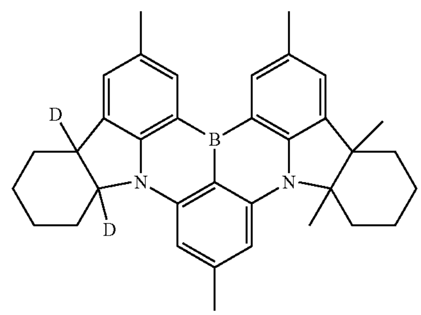
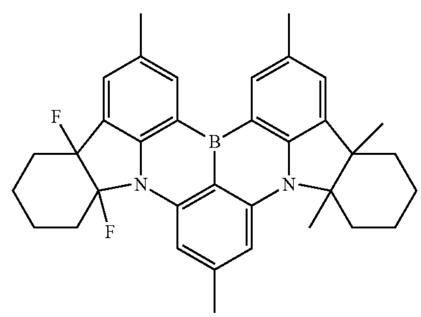
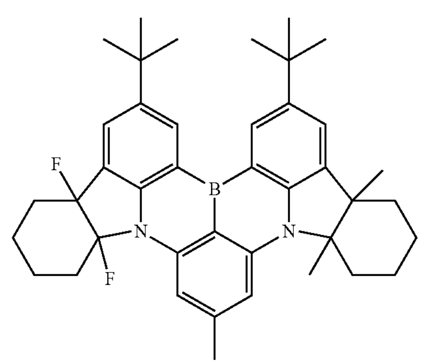

-continued
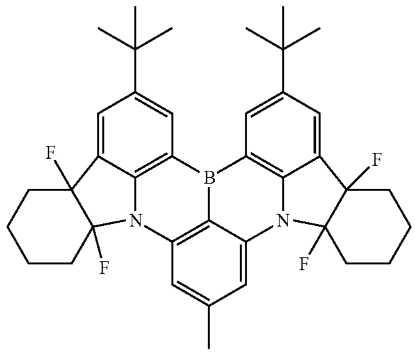
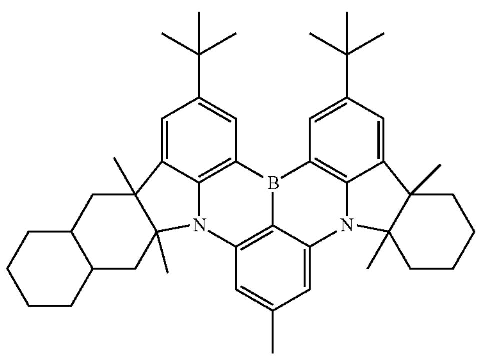
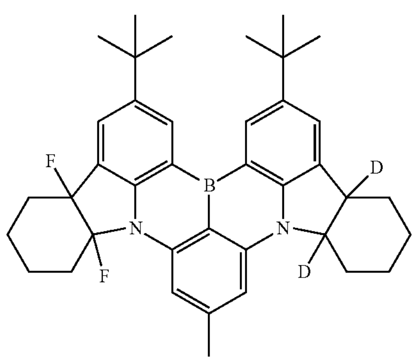
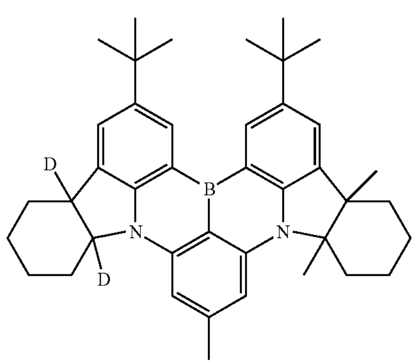
-continued
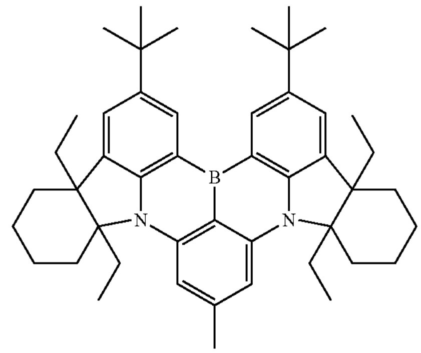
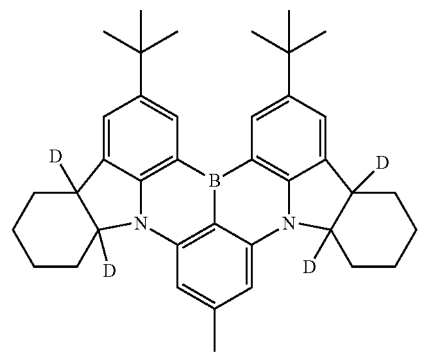
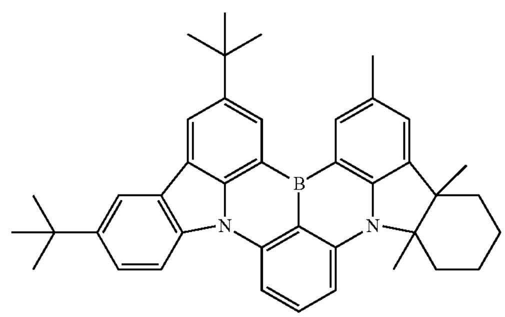
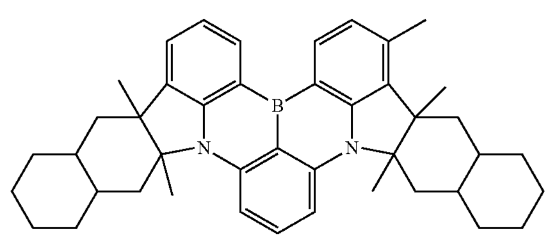
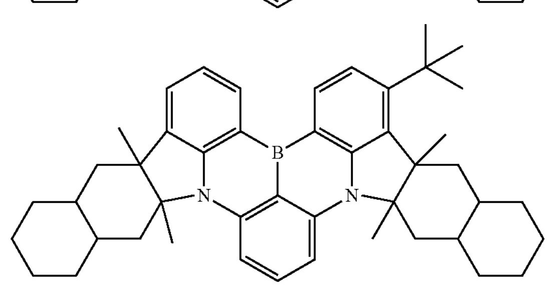

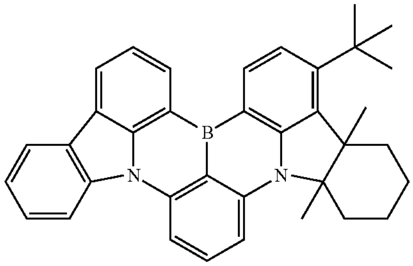
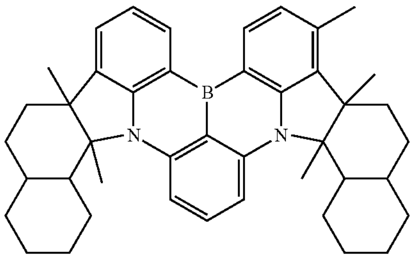
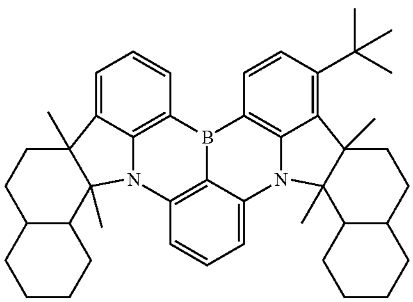
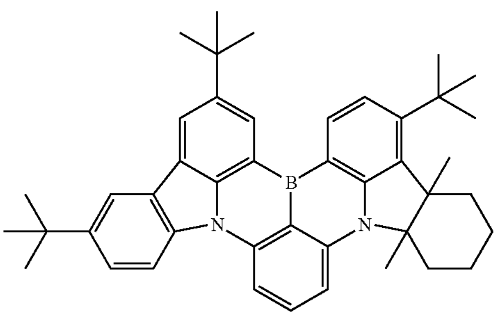
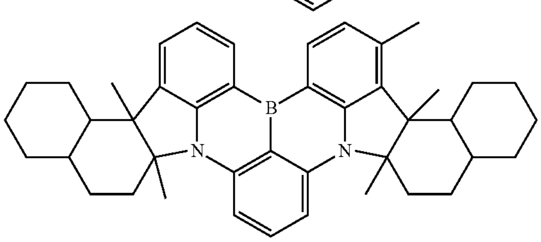
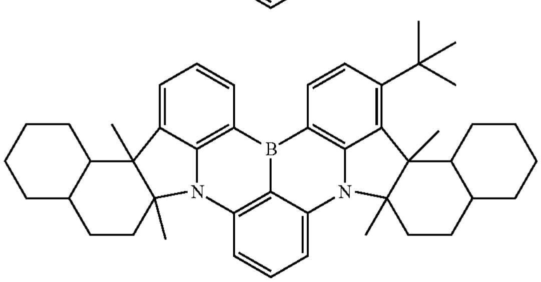
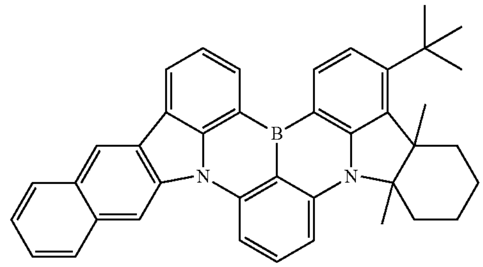
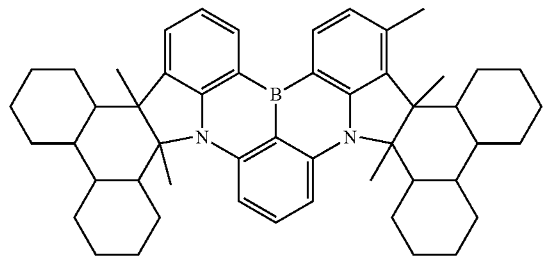
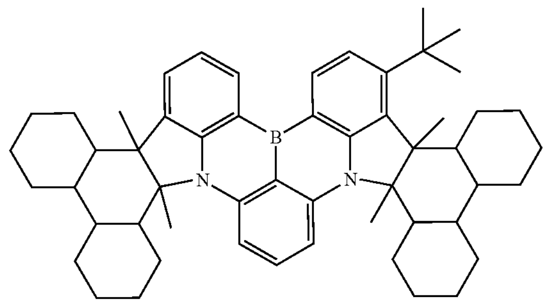
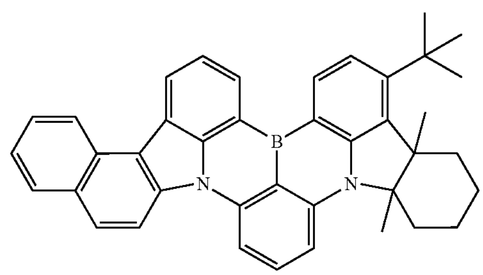
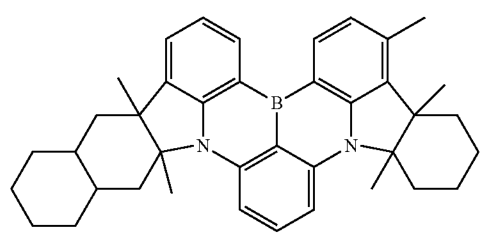
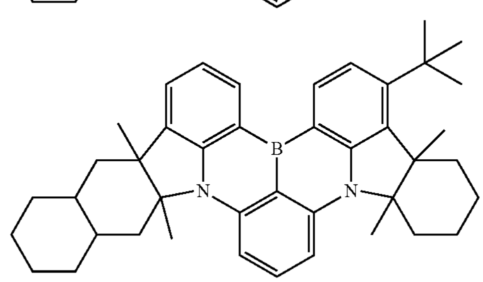

-continued
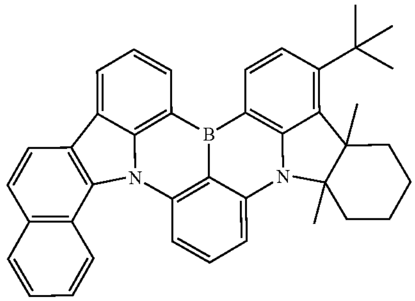
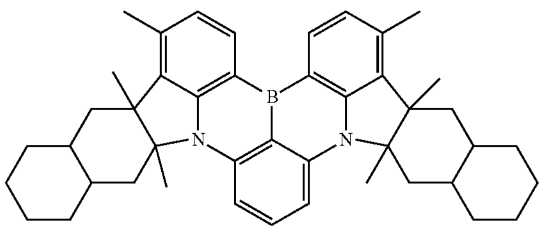
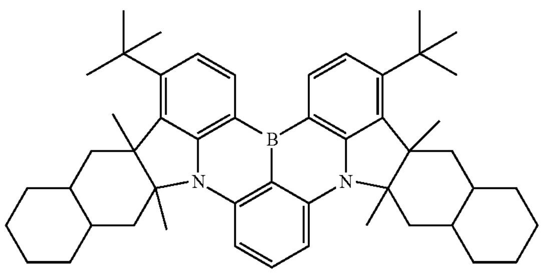
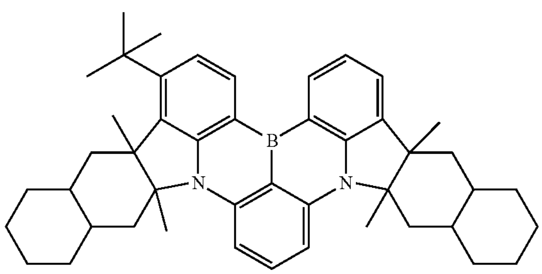
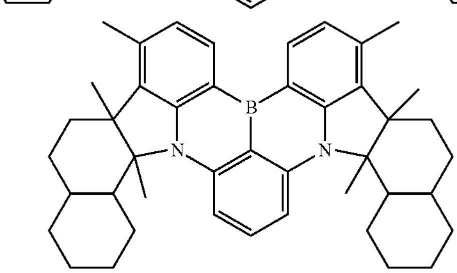
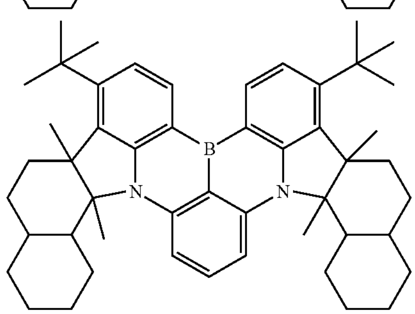
-continued
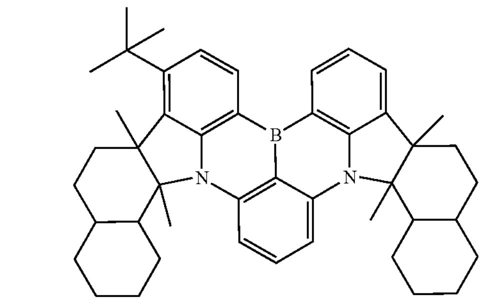
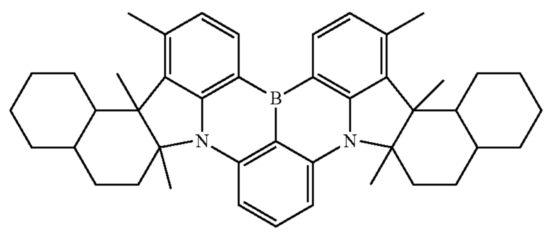
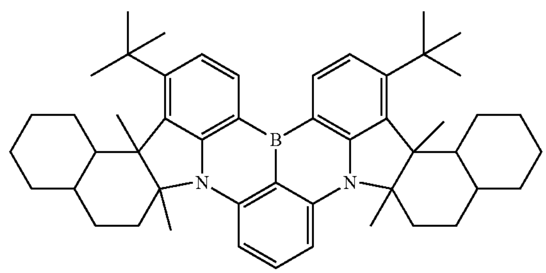
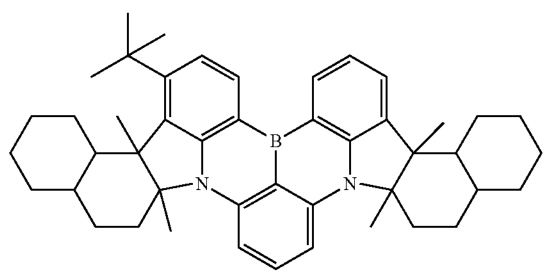
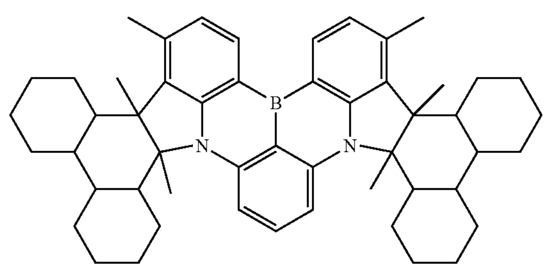
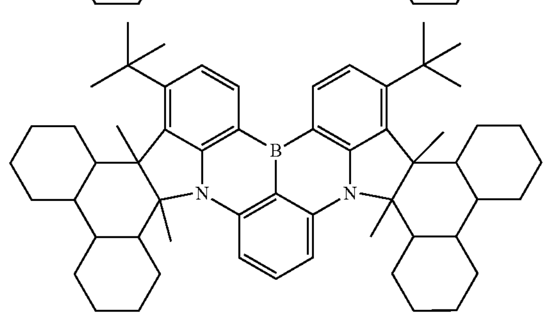

-continued
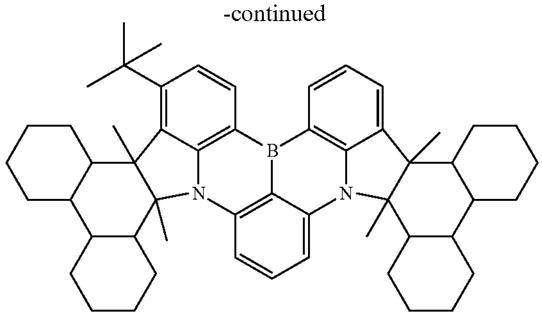
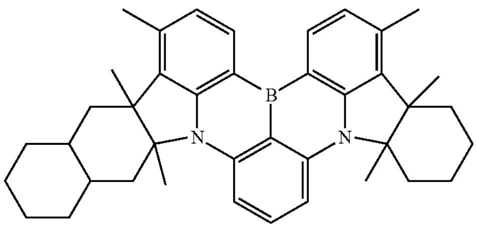
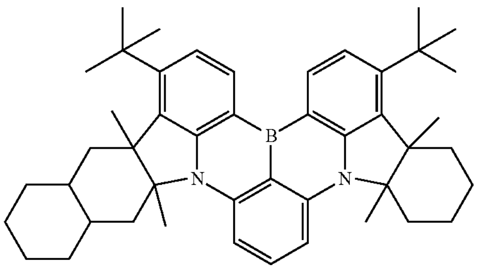
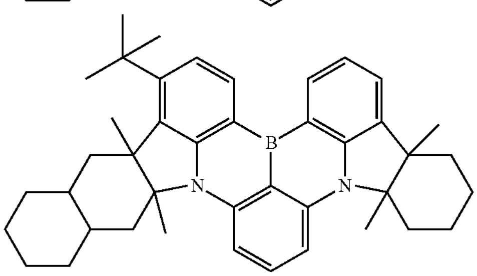
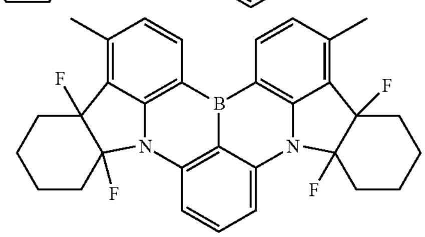
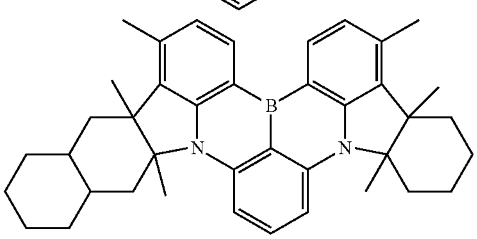
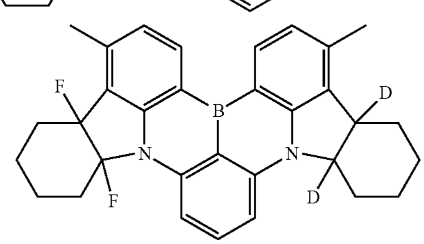
-continued
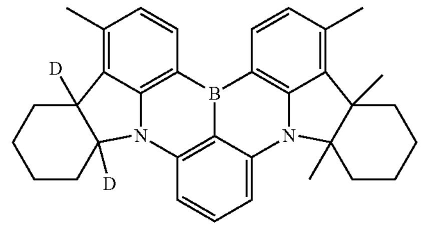
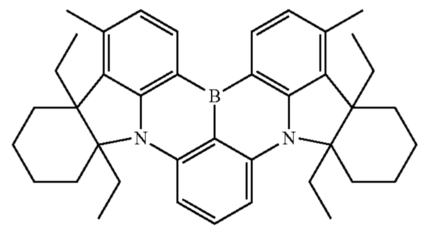
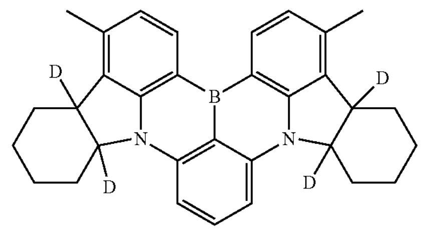
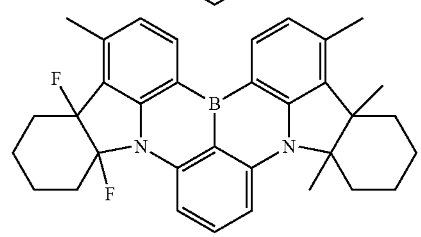
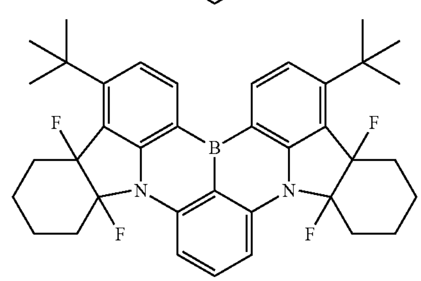
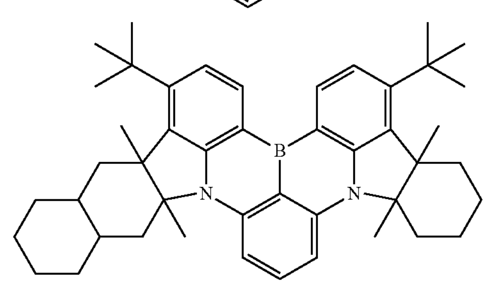
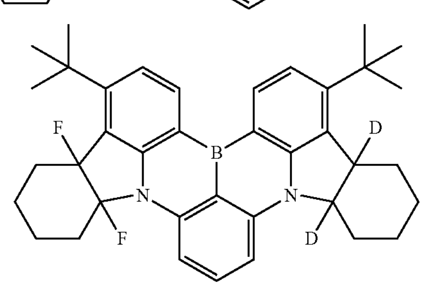

-continued
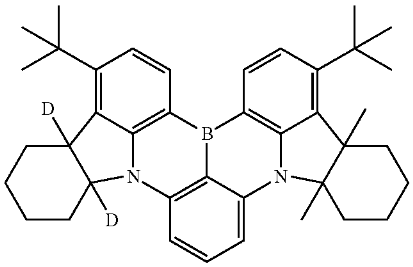
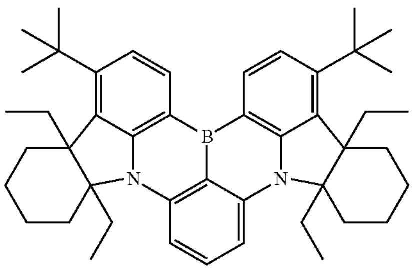
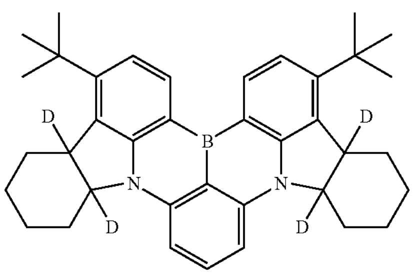
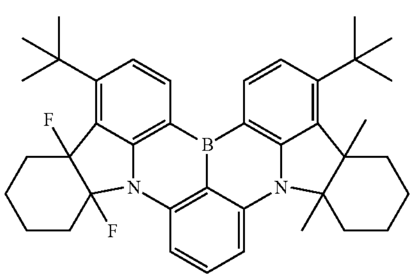
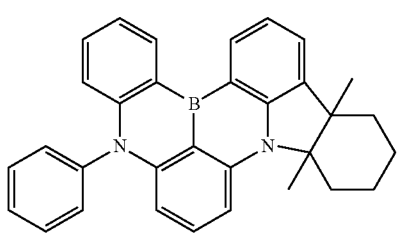
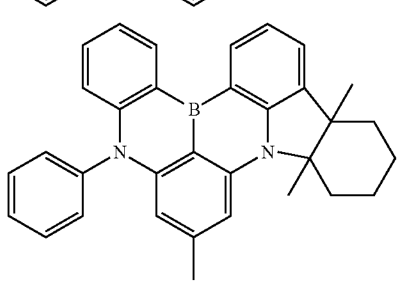
-continued
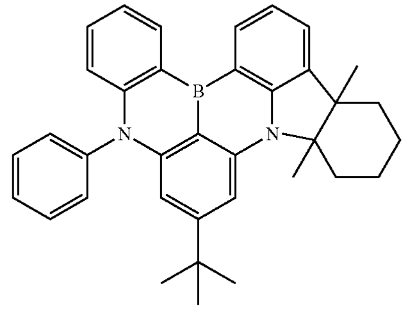
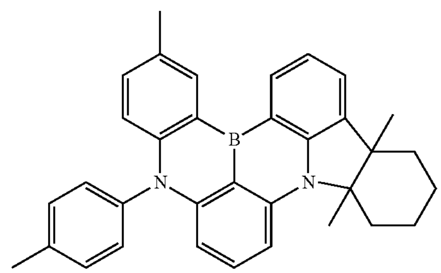
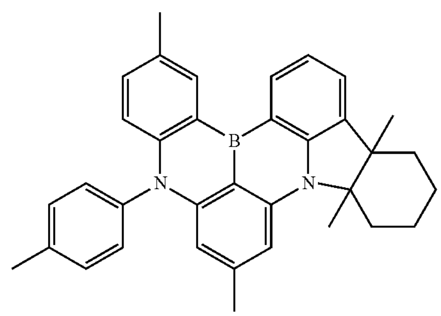
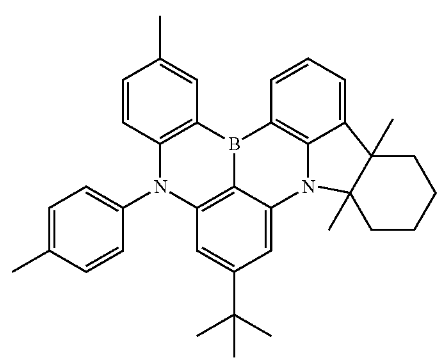
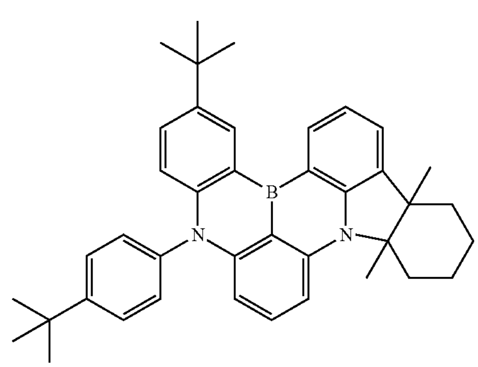

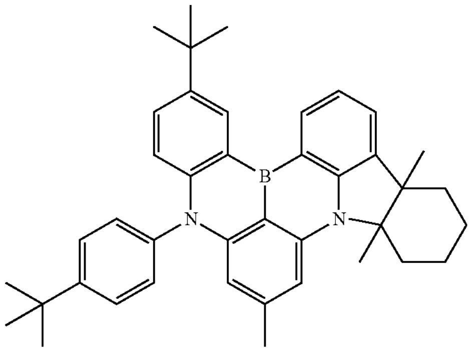
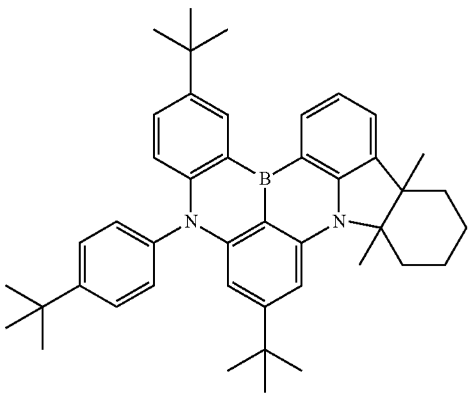
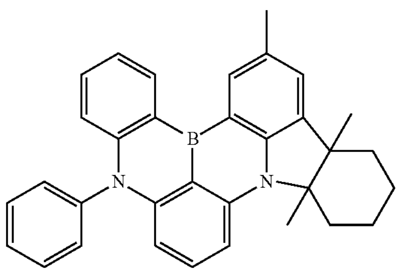
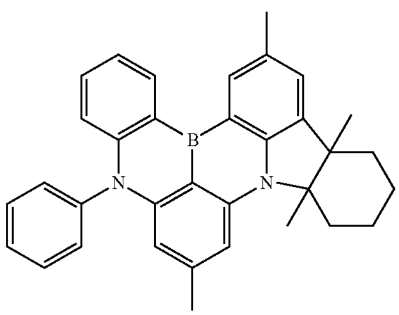
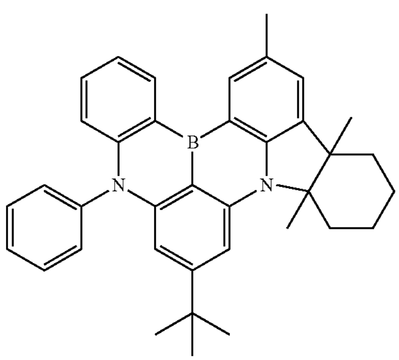
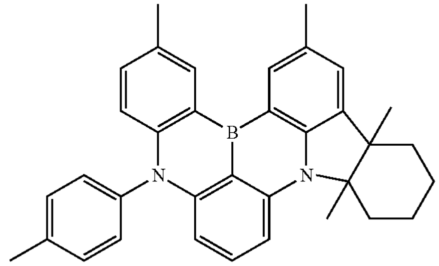
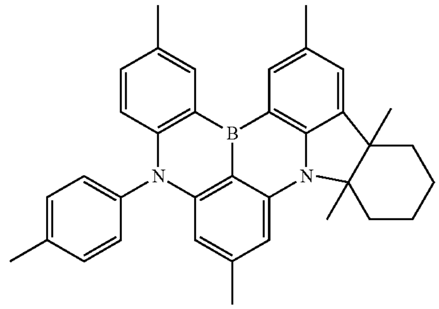
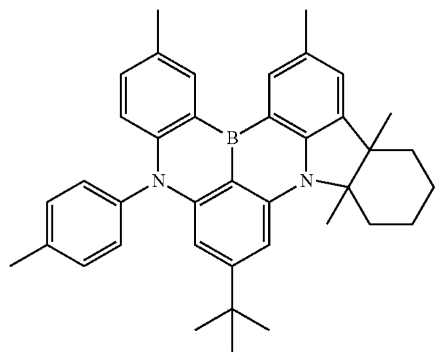
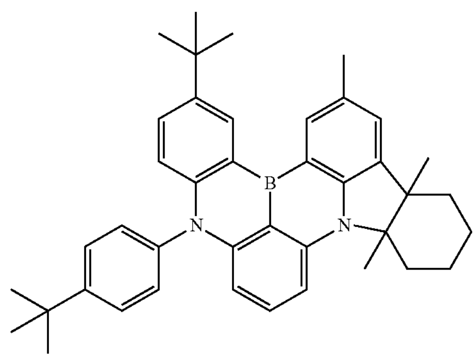
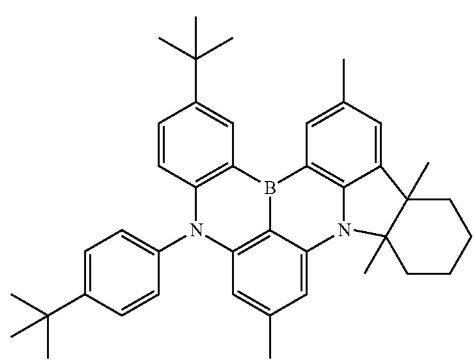

-continued
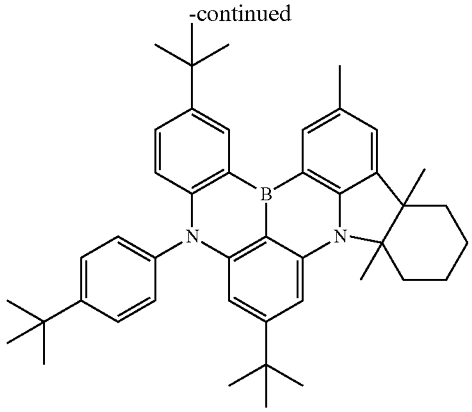
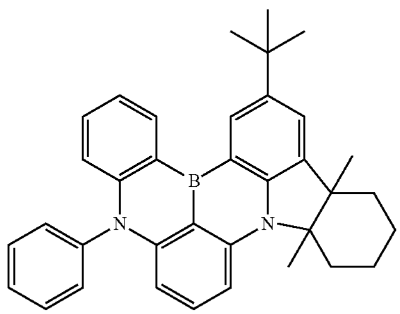
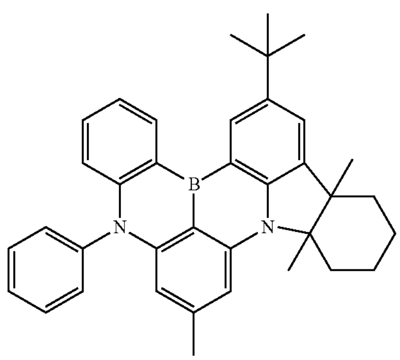
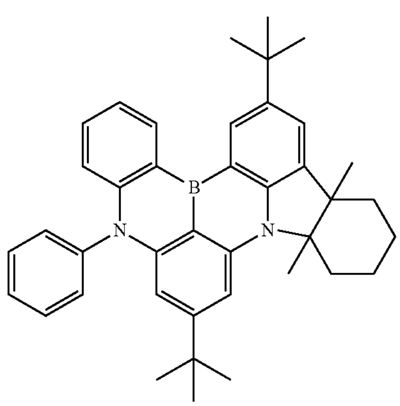
-continued
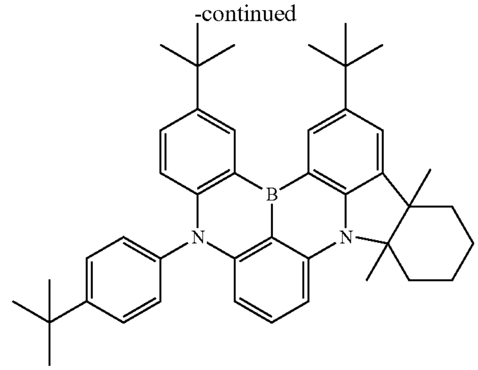
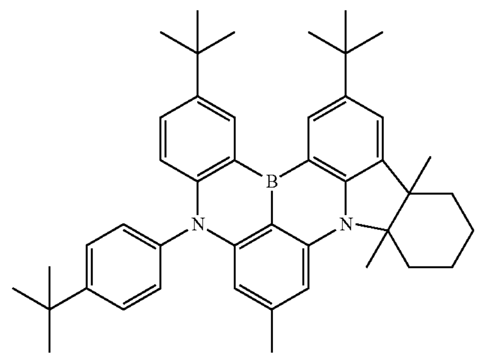
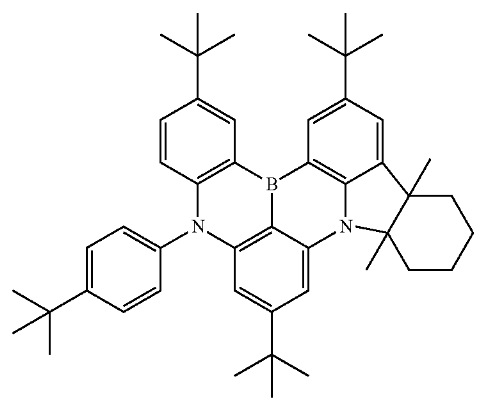
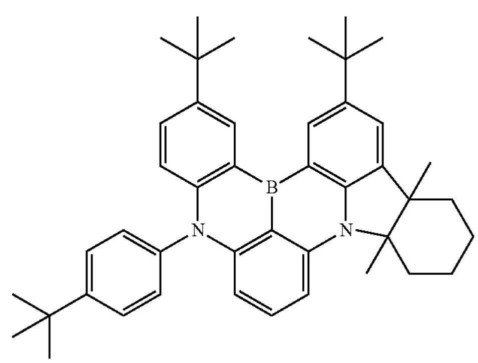

-continued
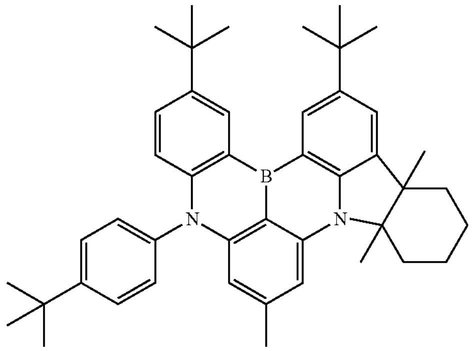
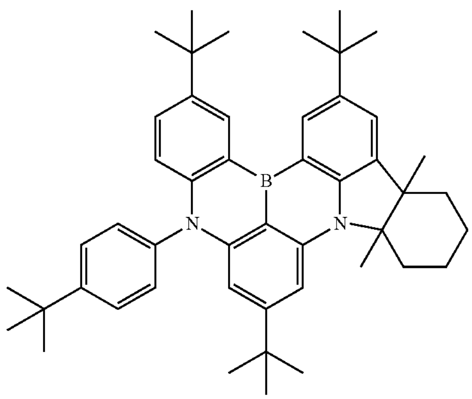
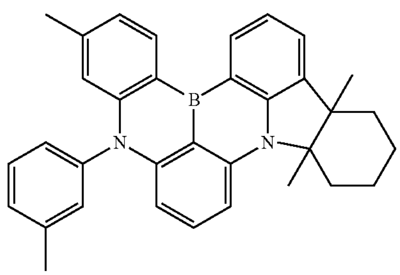
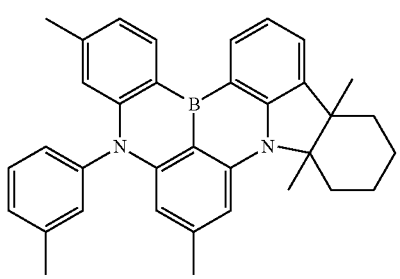
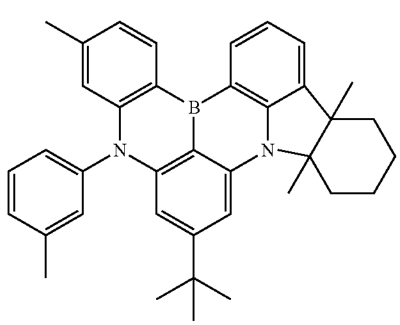
-continued
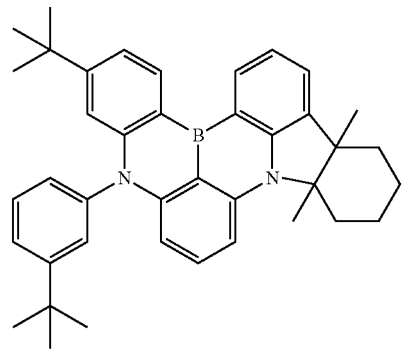
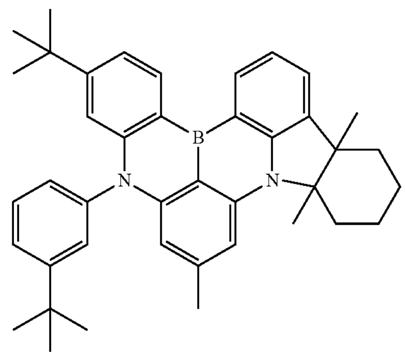
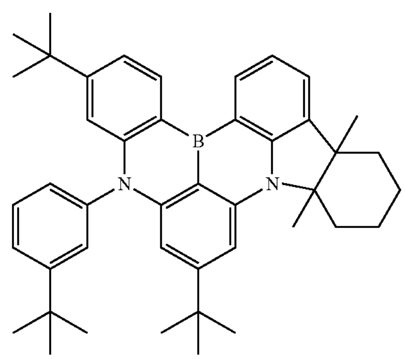
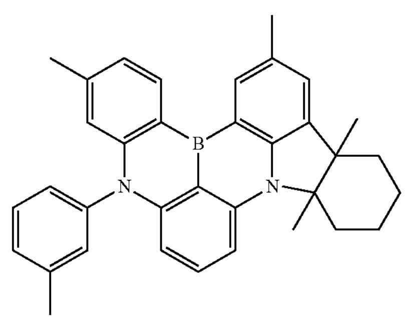
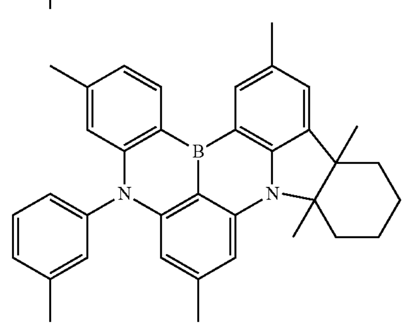

-continued
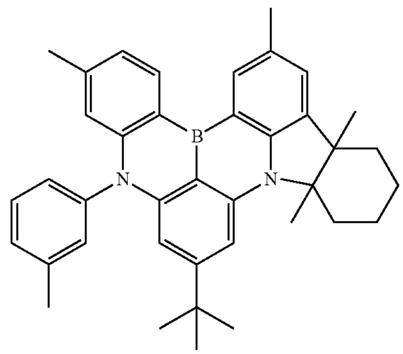
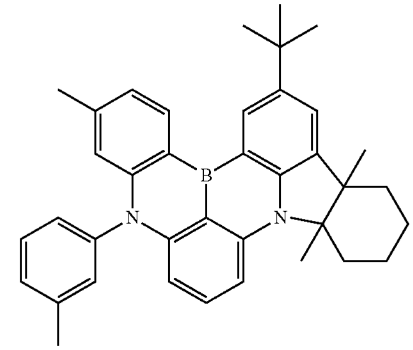
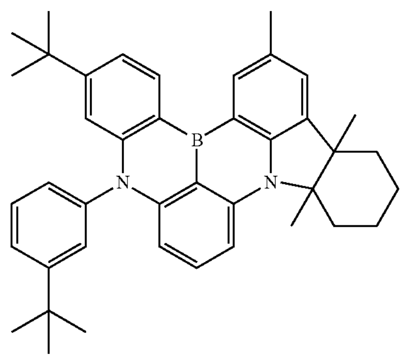
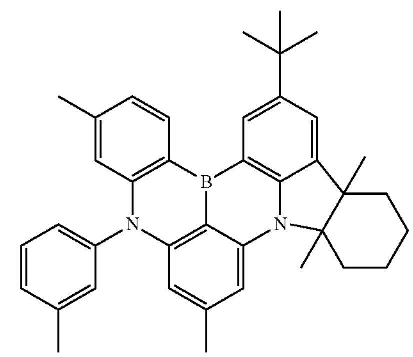
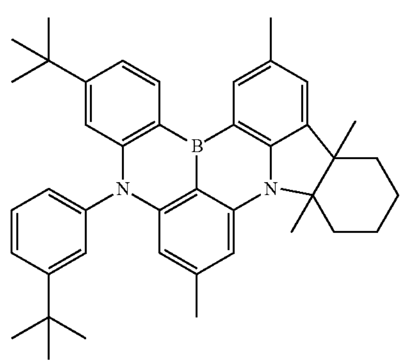
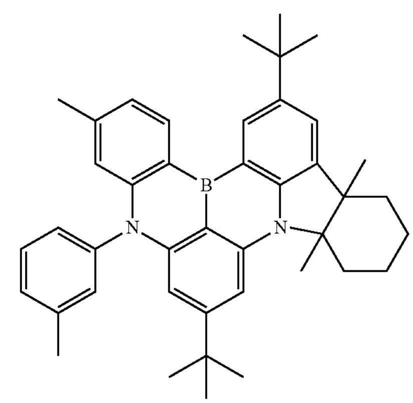
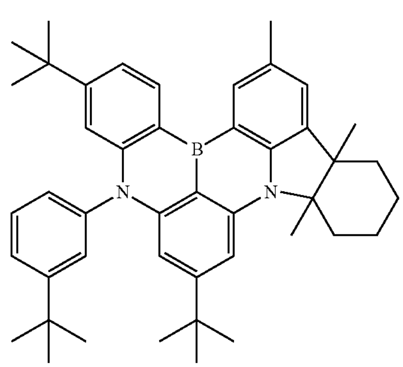
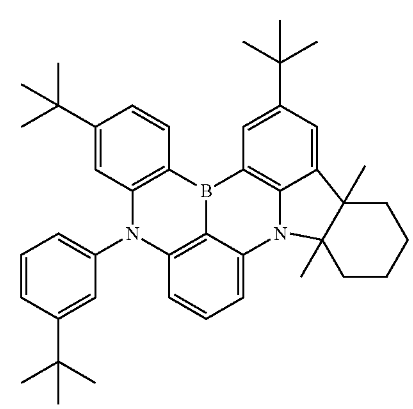
-continued

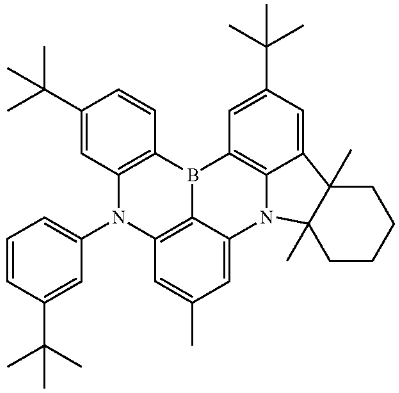
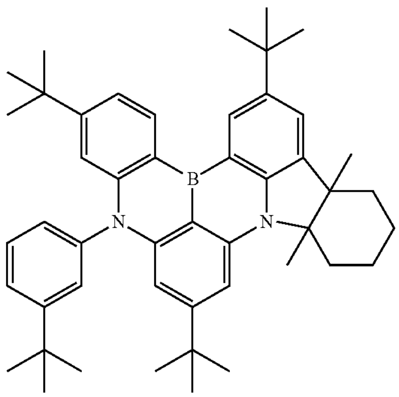
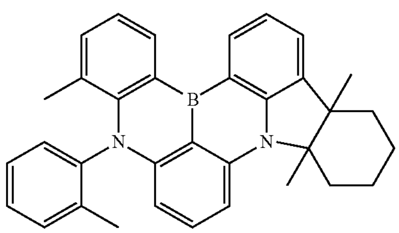
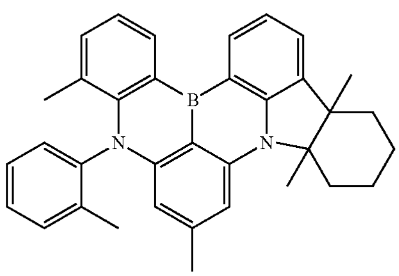
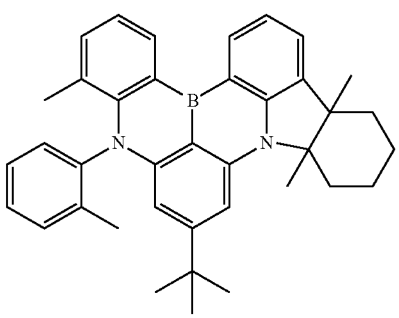
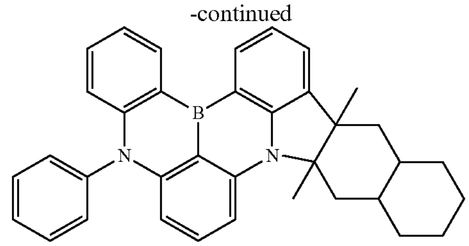
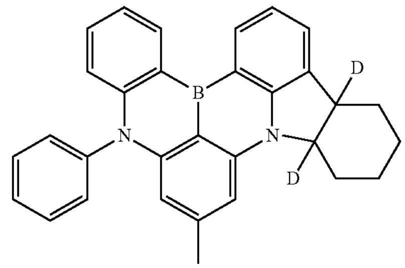
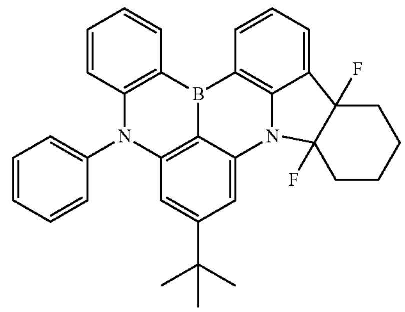
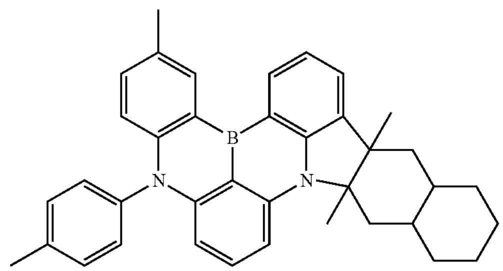
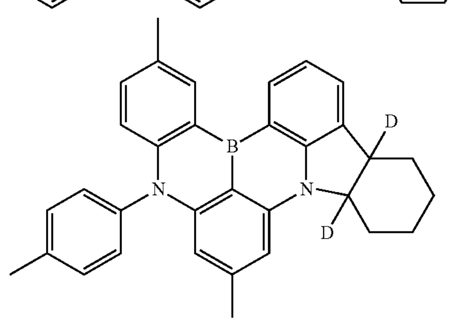
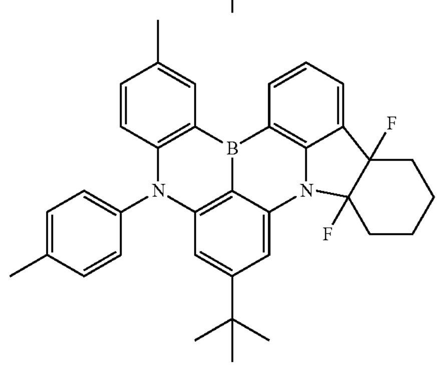

-continued
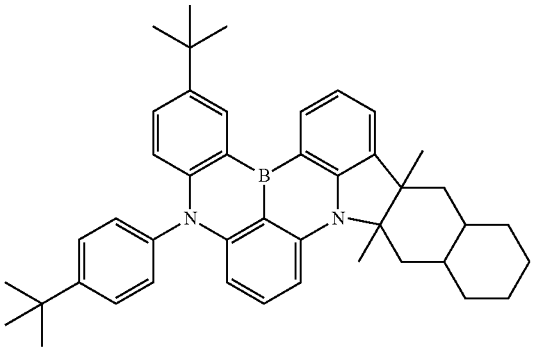
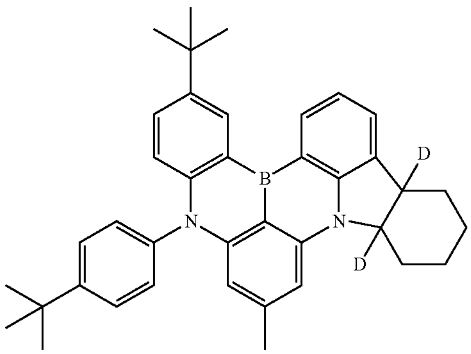
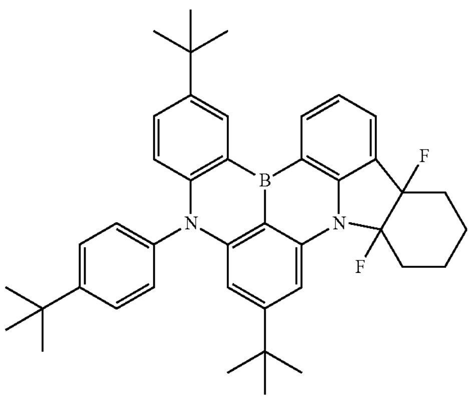
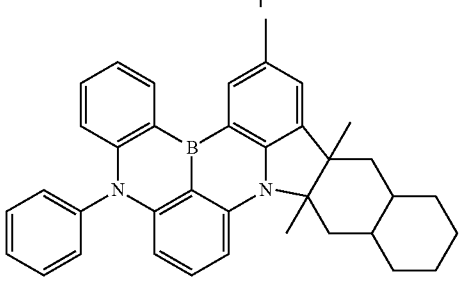
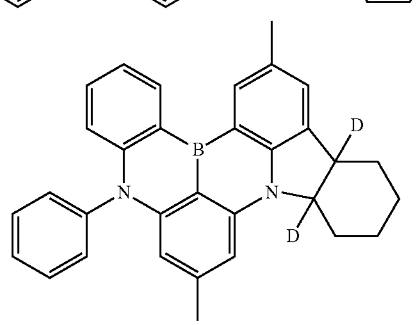
-continued
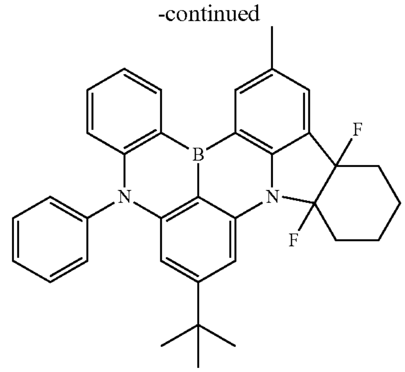
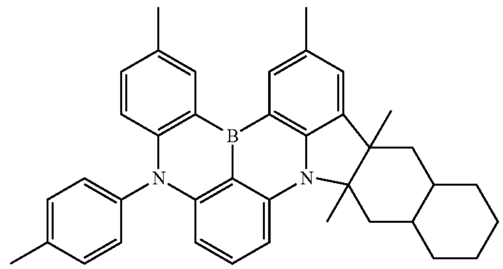
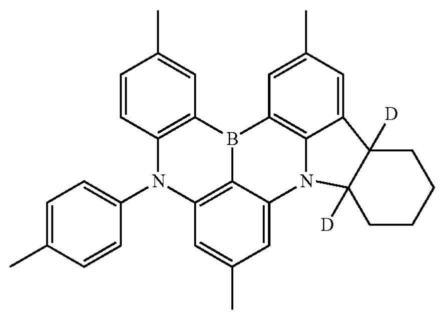
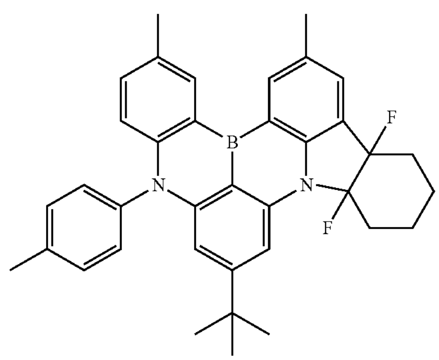
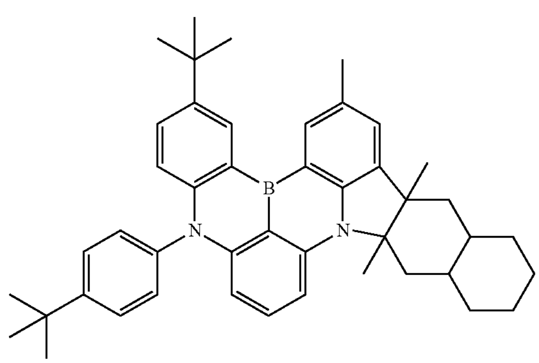

-continued
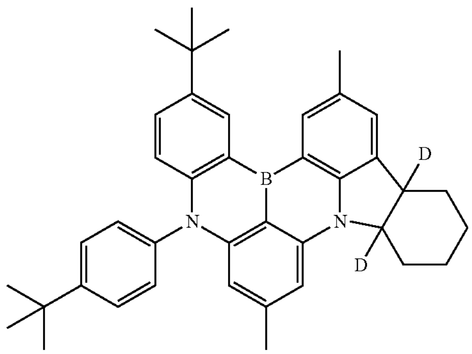
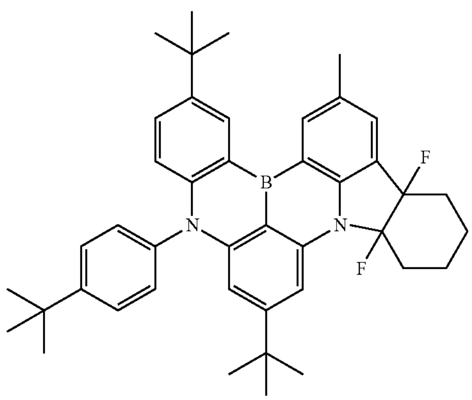
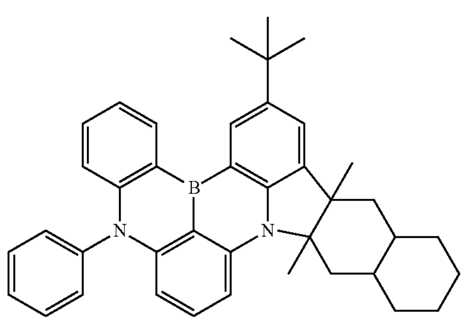
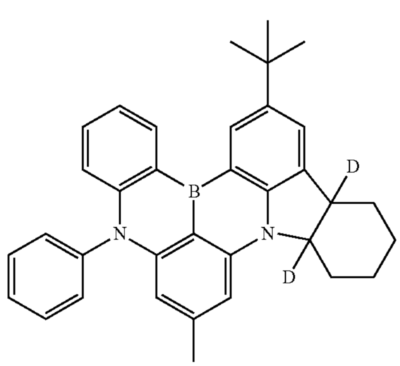
-continued
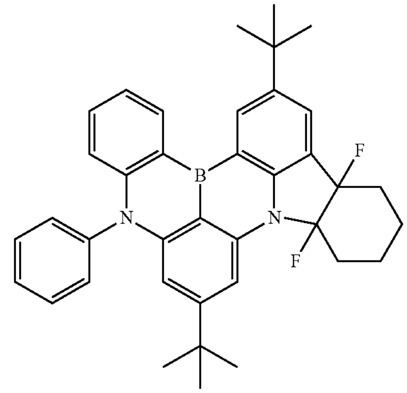
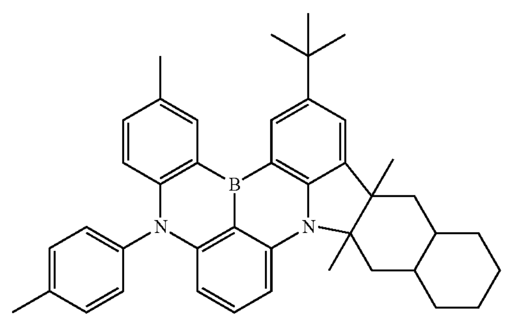
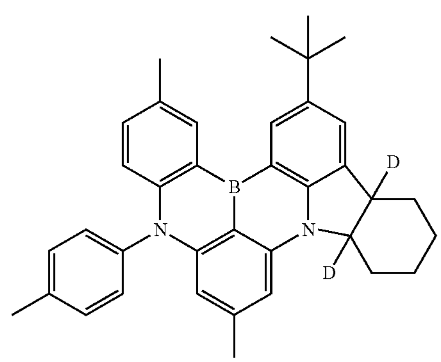
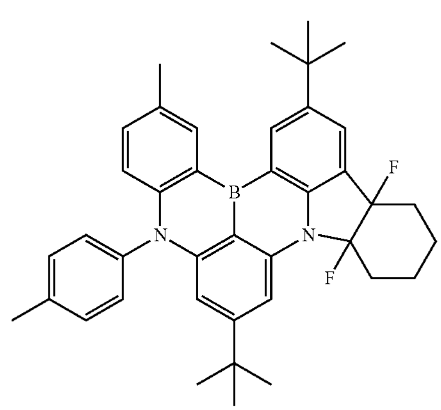

-continued
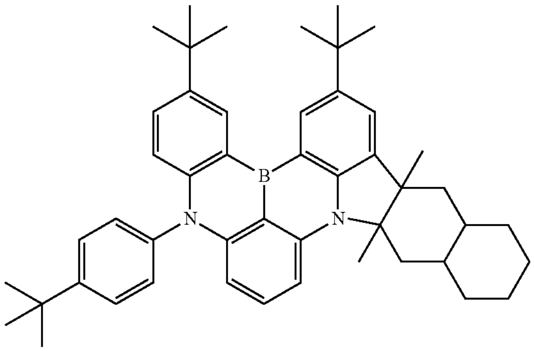
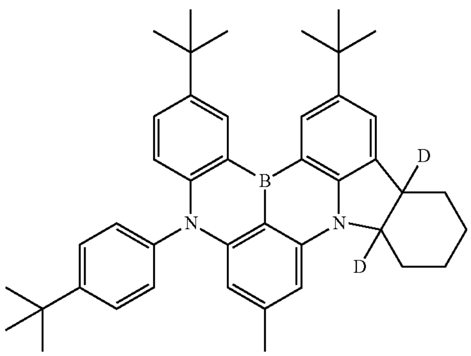
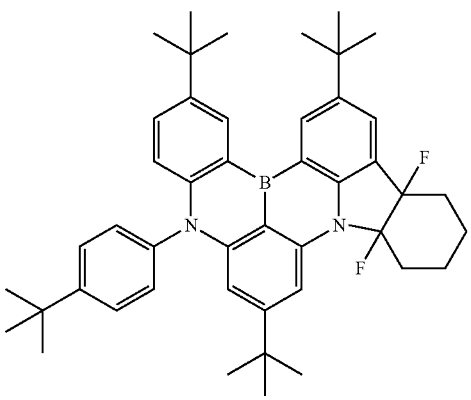
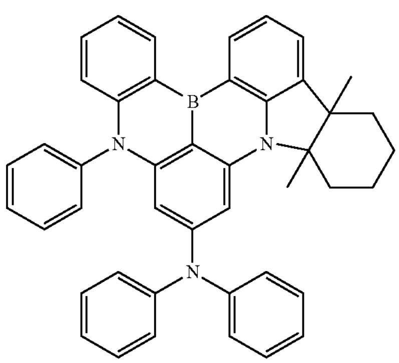
-continued
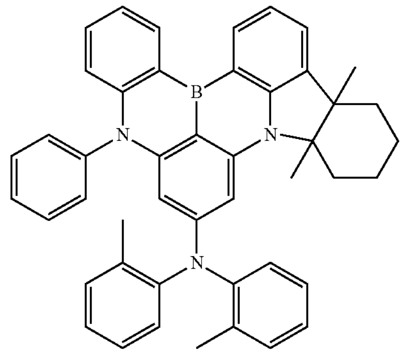
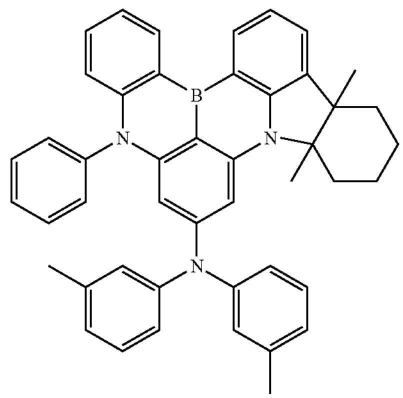
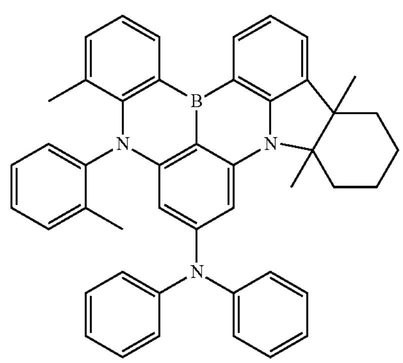
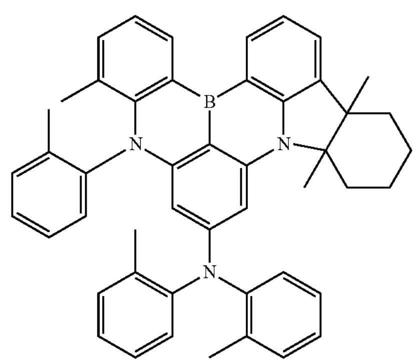

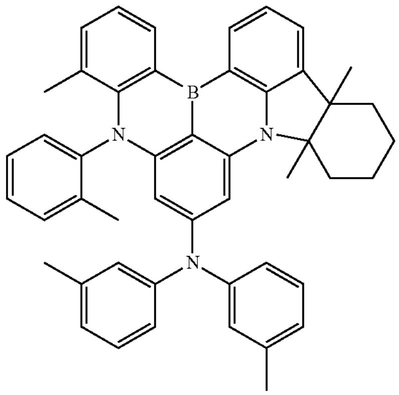
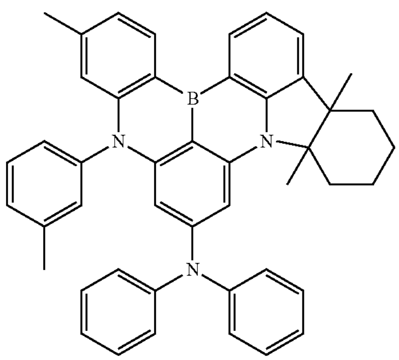
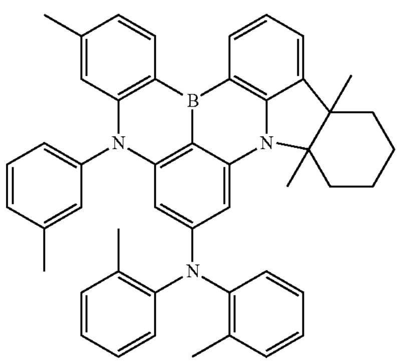
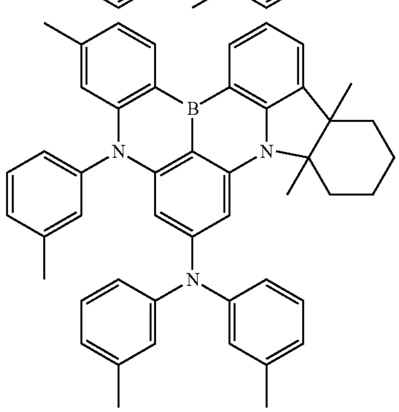
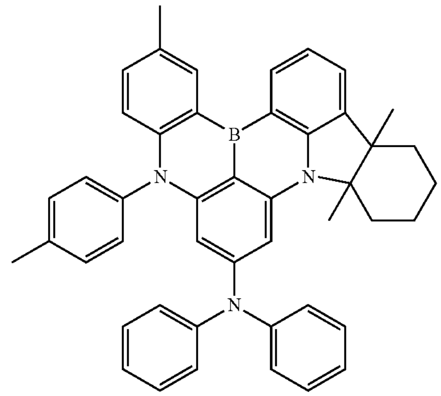
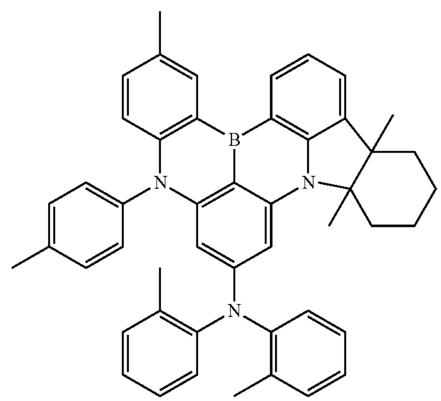
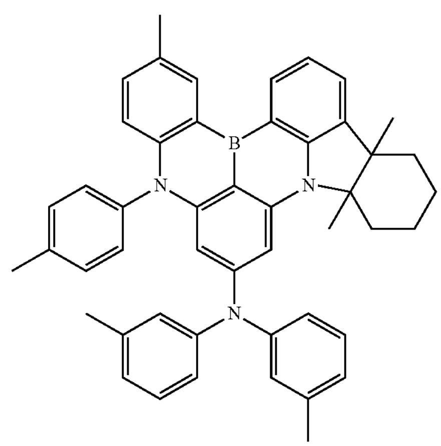
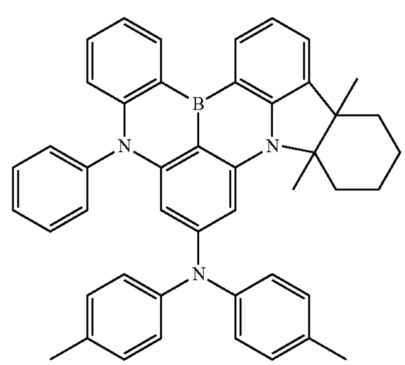

-continued
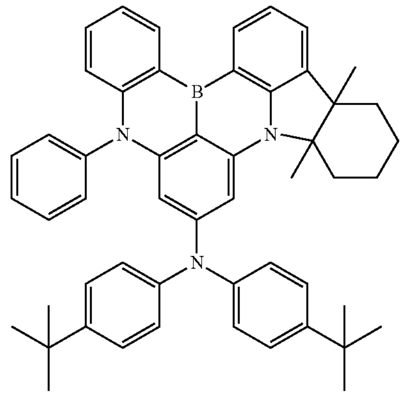
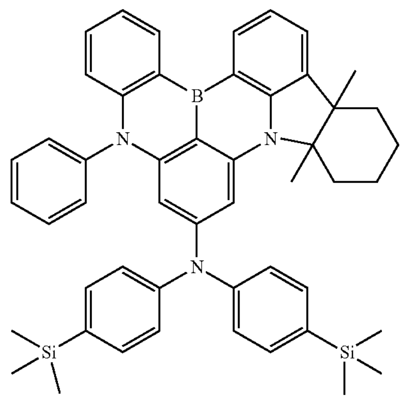
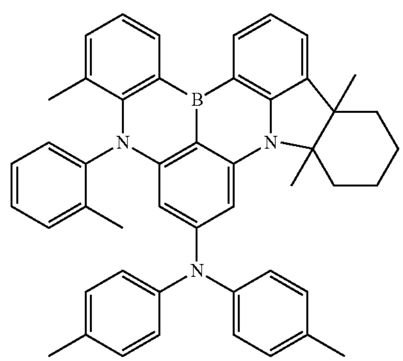
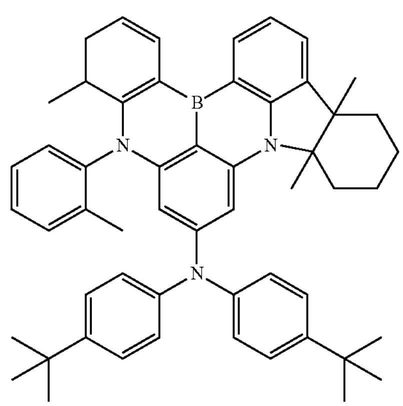
-continued
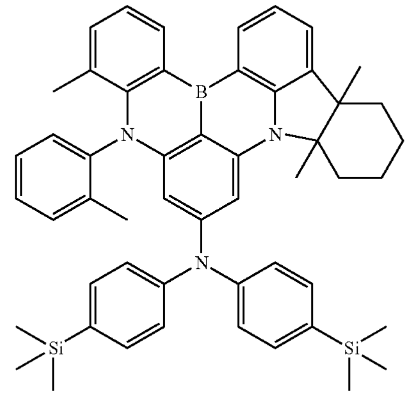
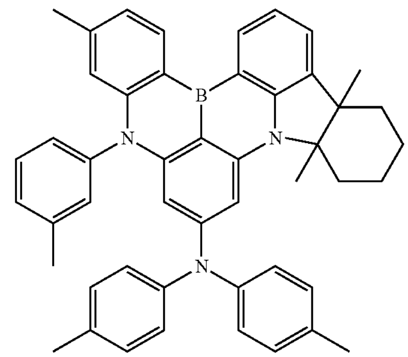
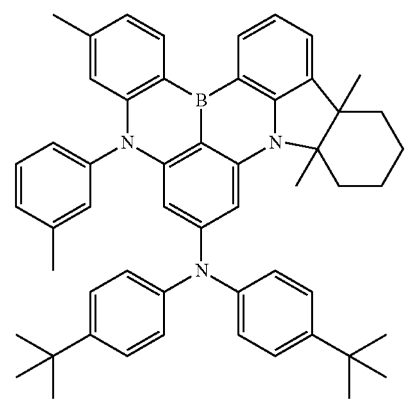
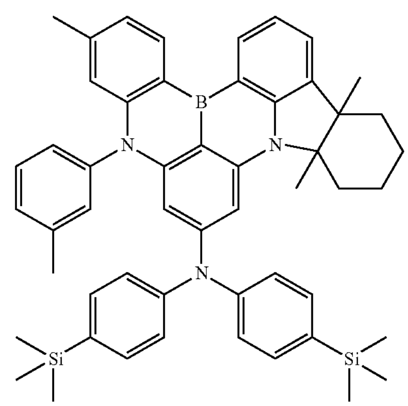

-continued
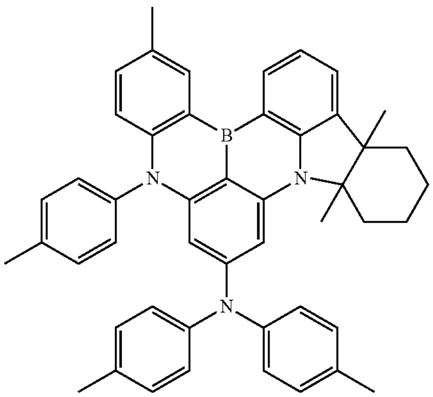
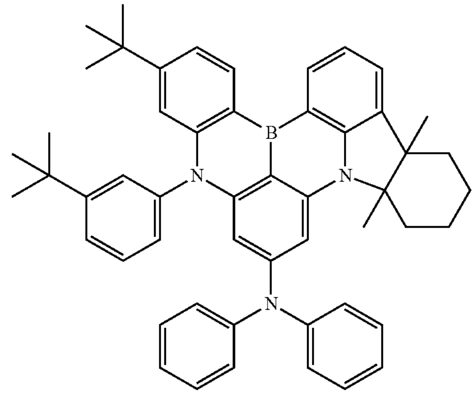
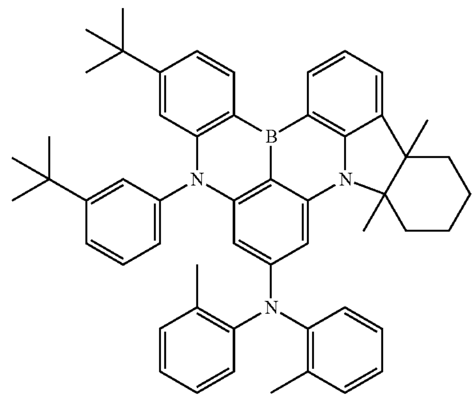
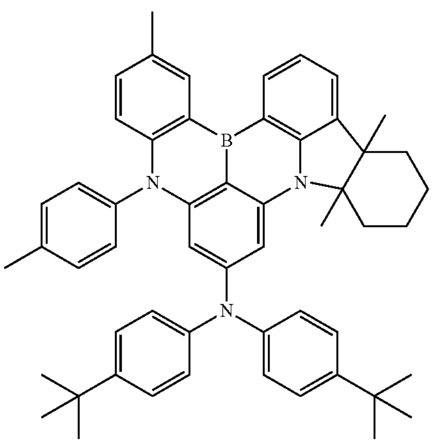
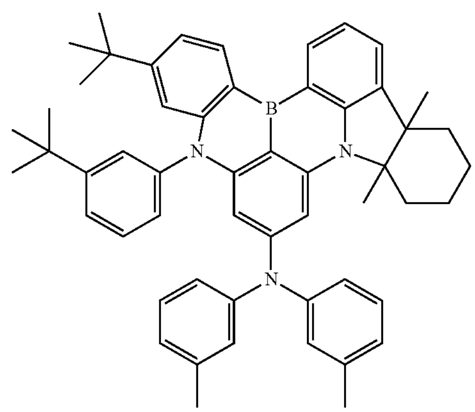
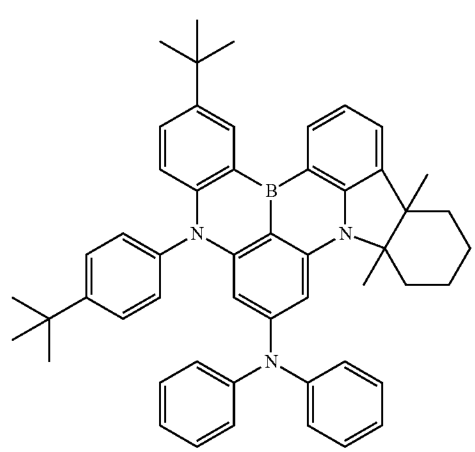
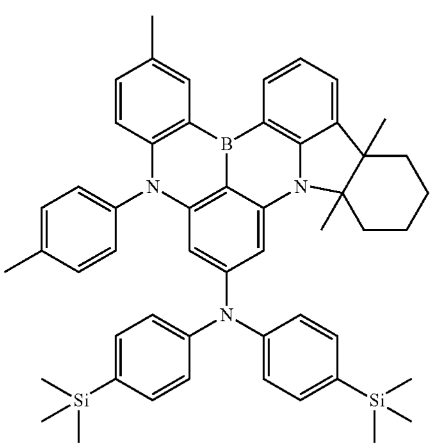

-continued
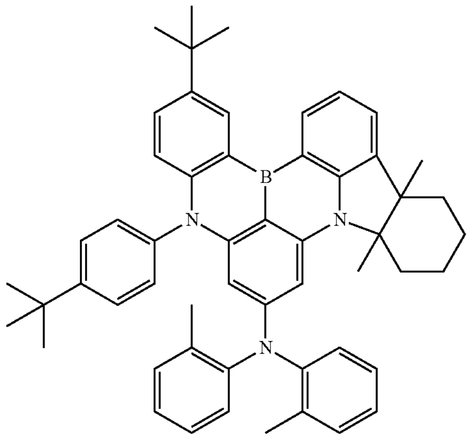
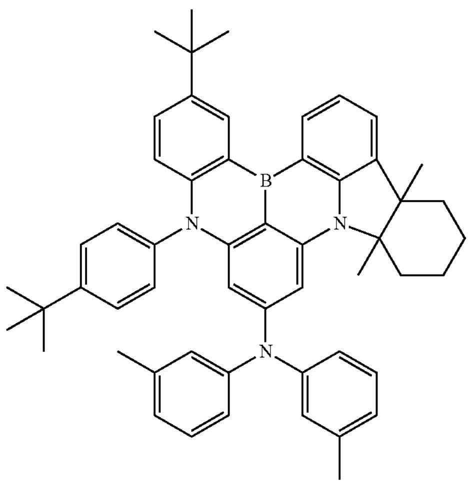
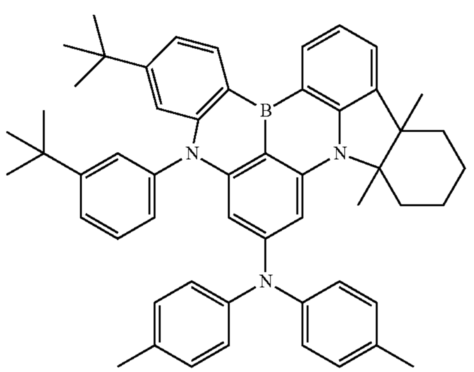
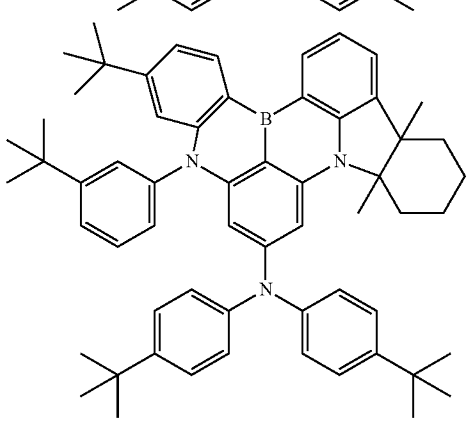
-continued
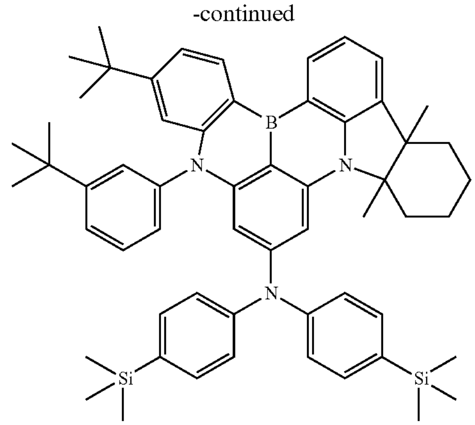
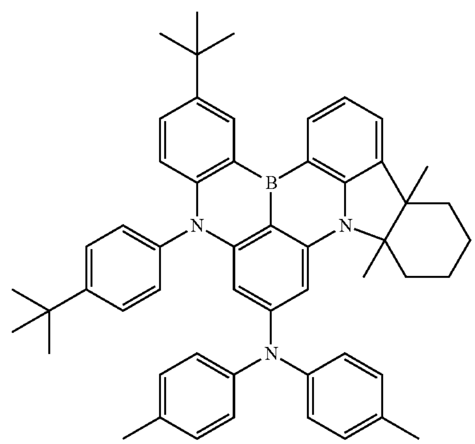
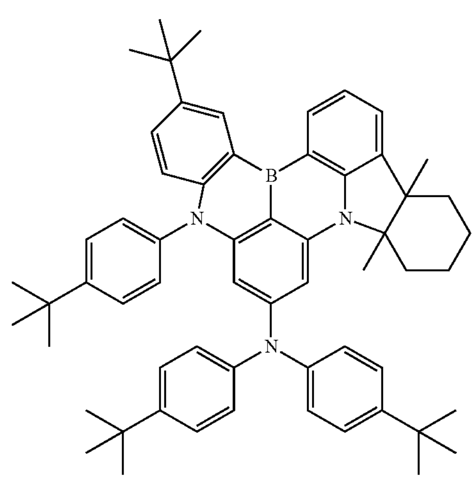

-continued
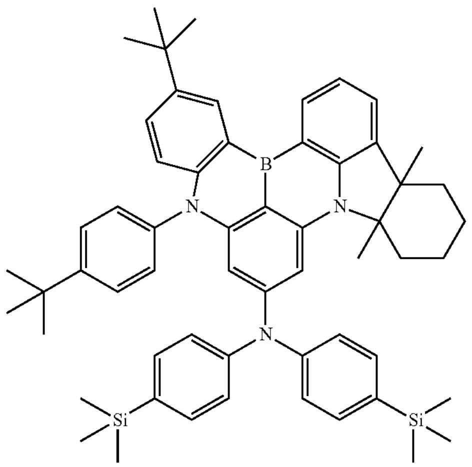
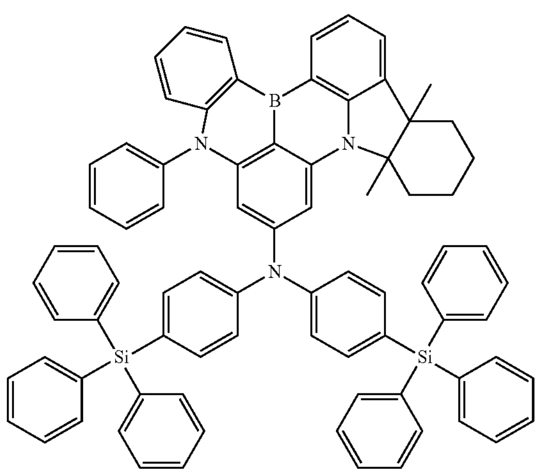
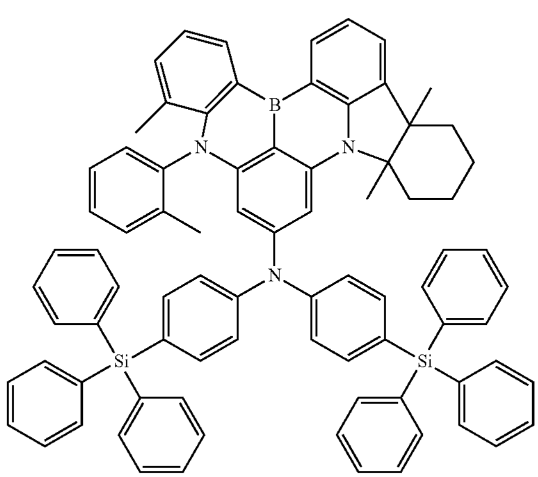
-continued
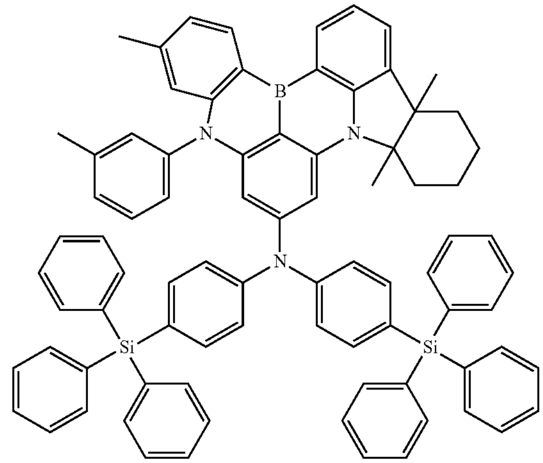
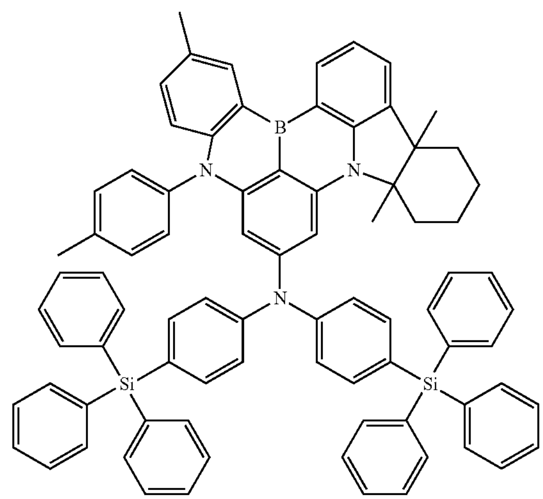
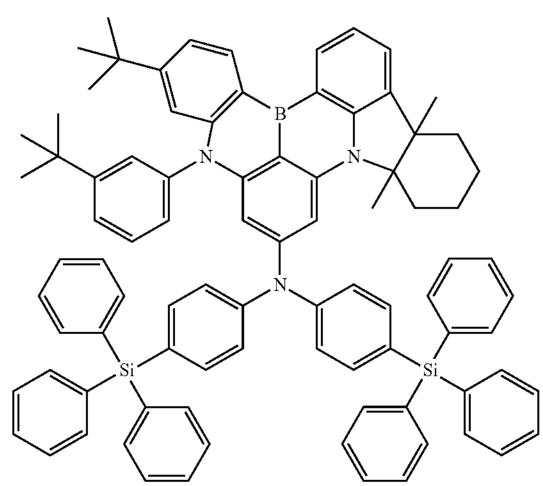

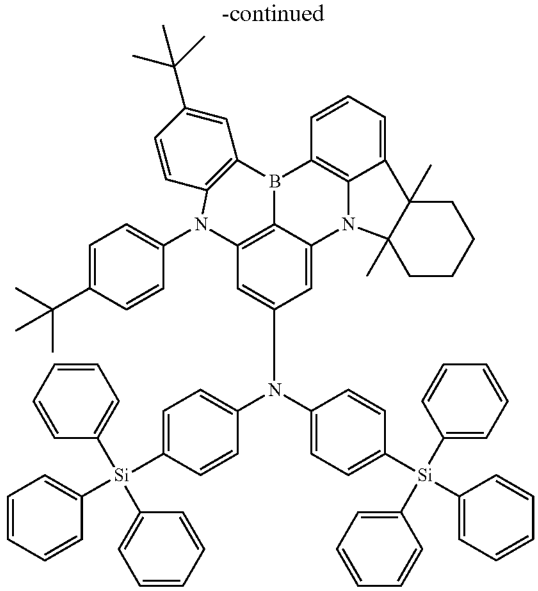
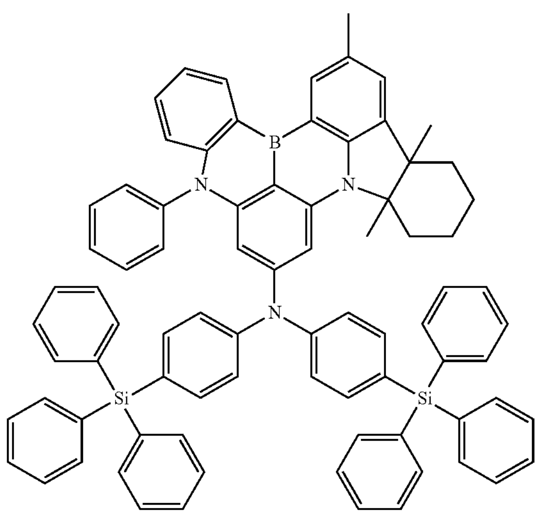
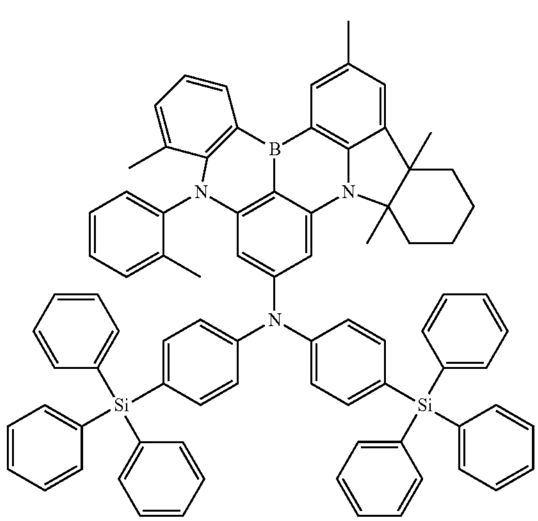
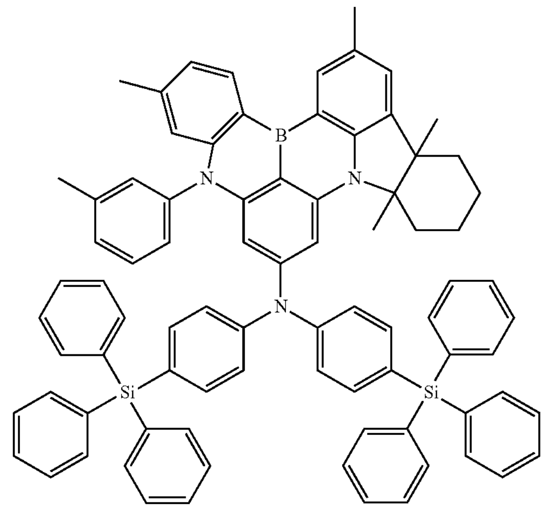
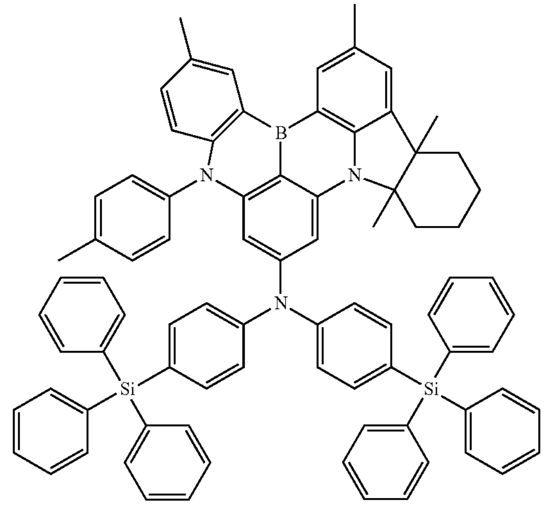
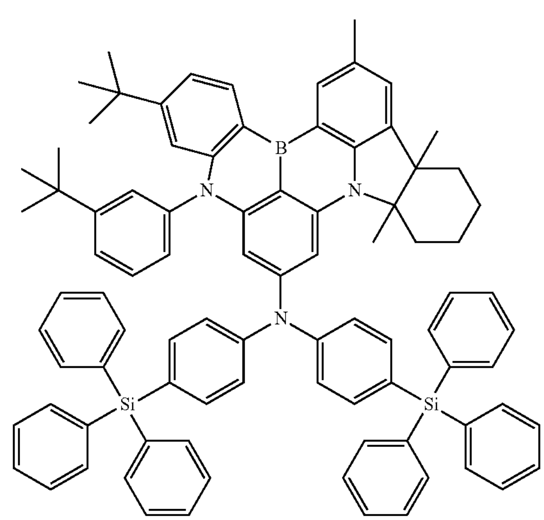

-continued
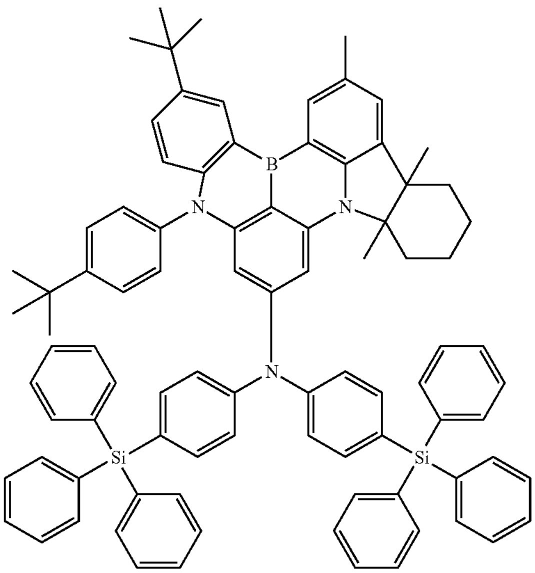
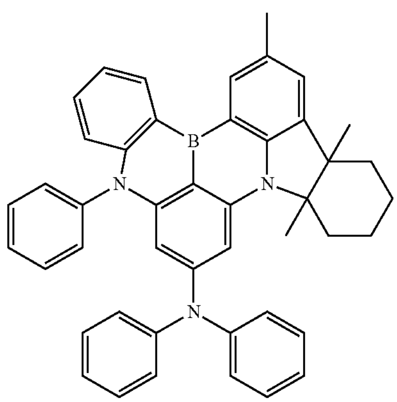
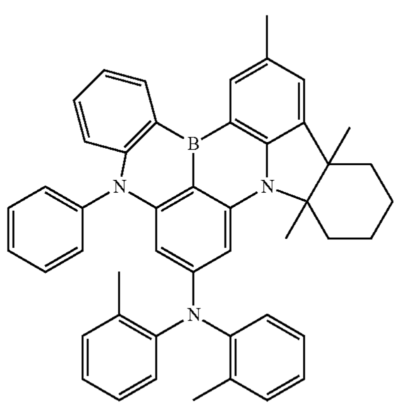
-continued
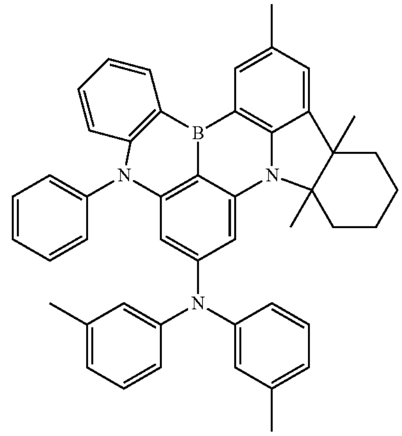
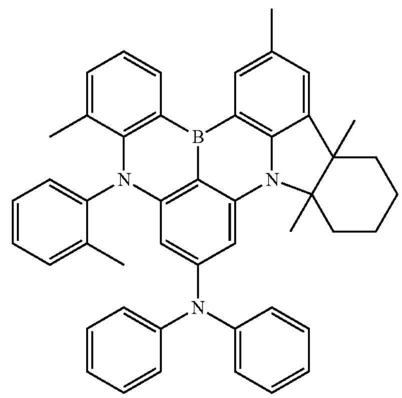
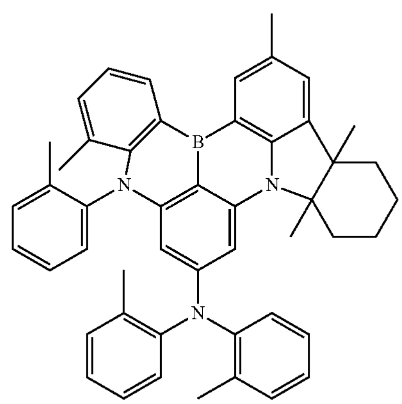
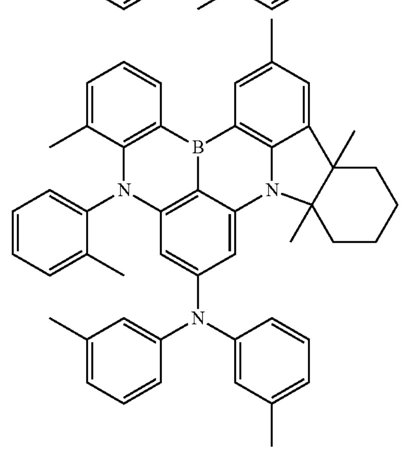

-continued
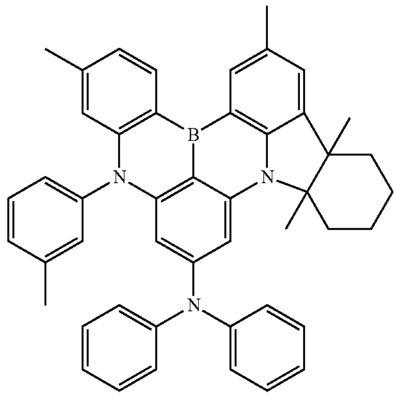
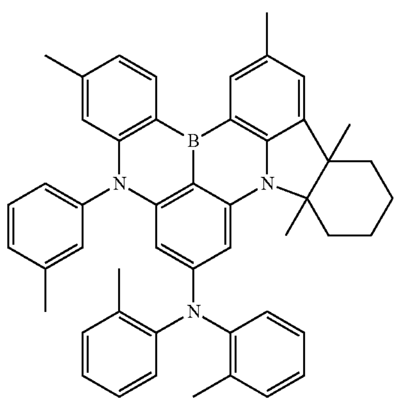
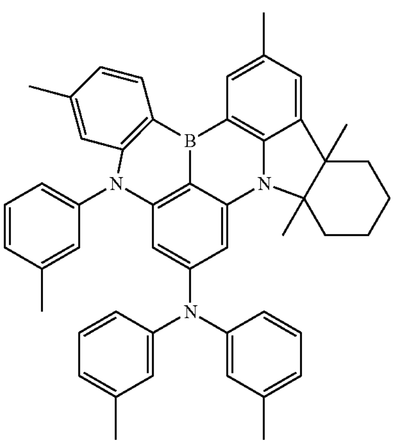
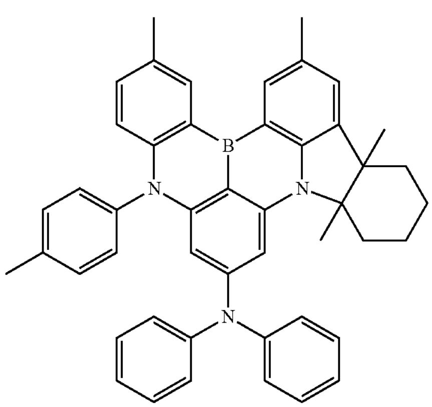
-continued
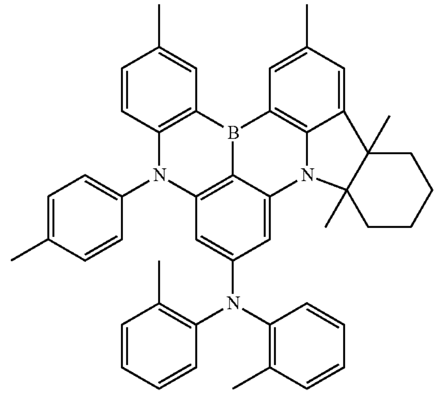
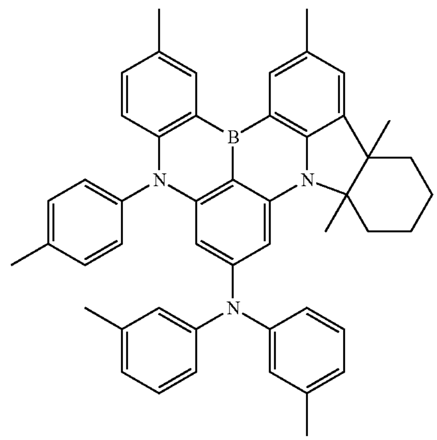
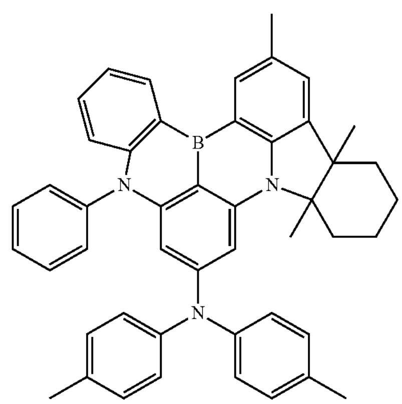
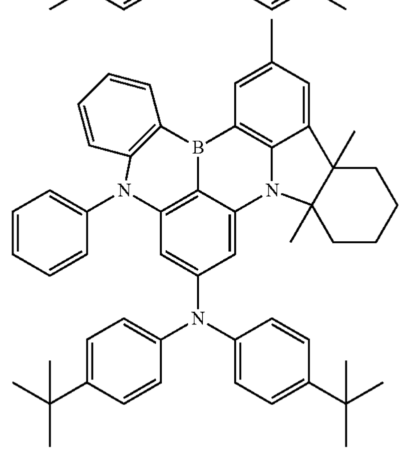

-continued
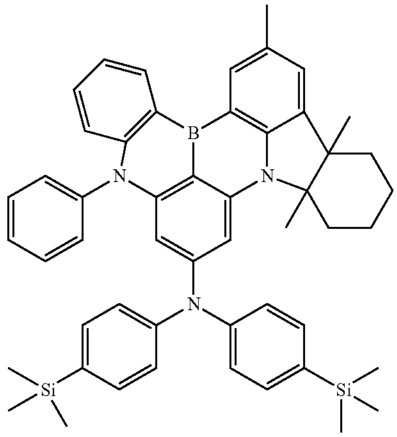
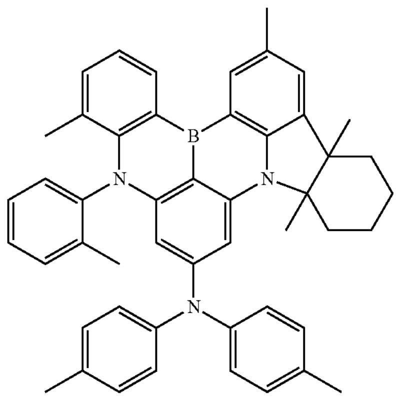
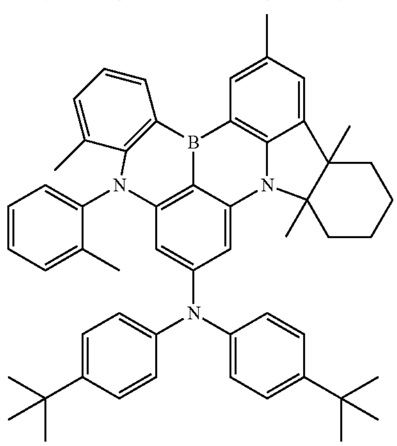
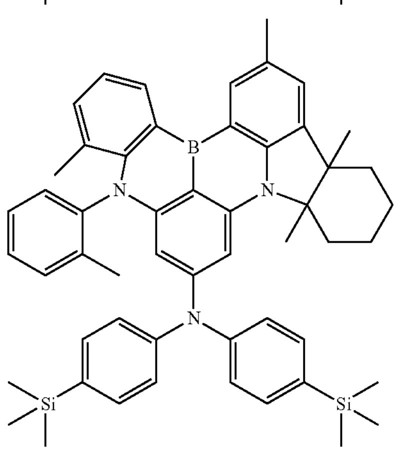
-continued
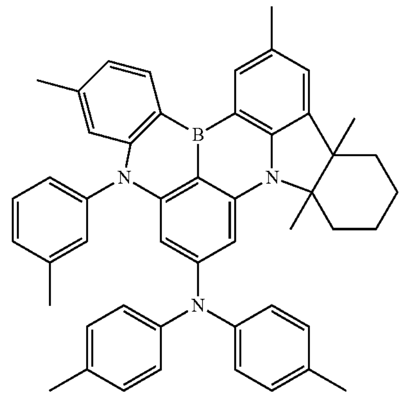
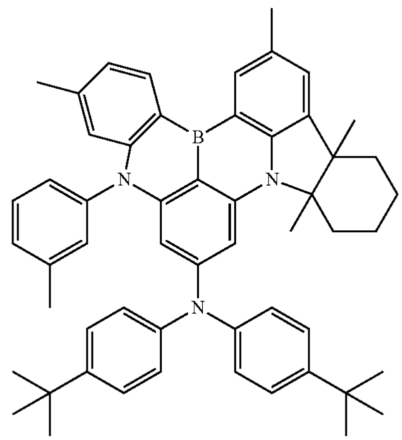
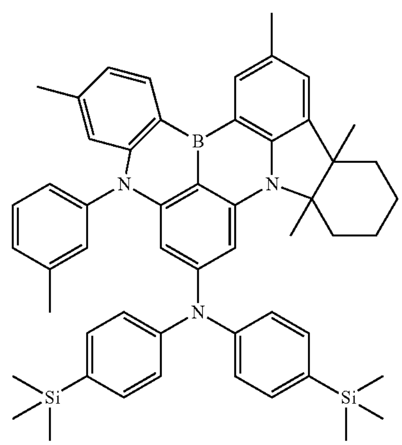
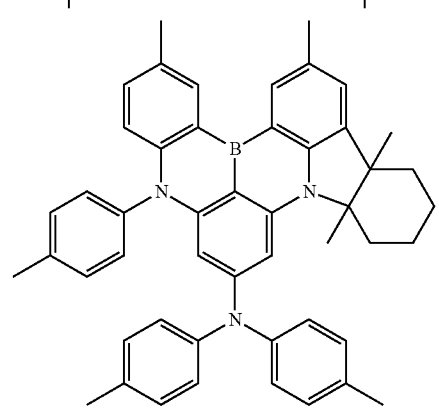

-continued
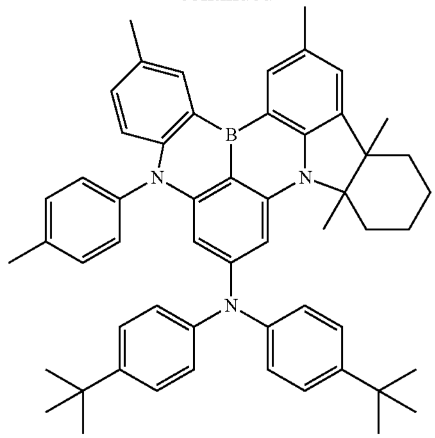
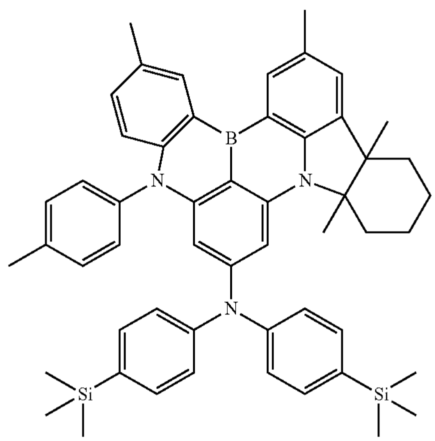
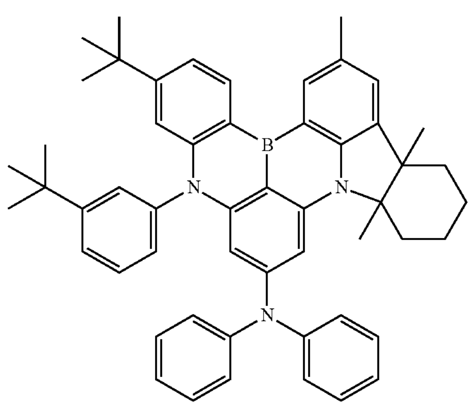
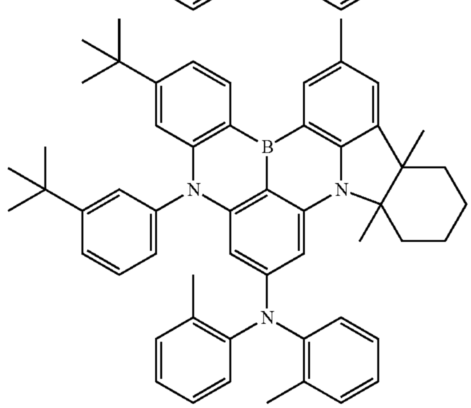
-continued
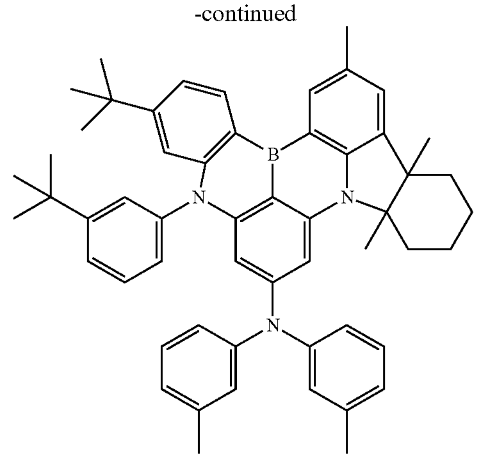
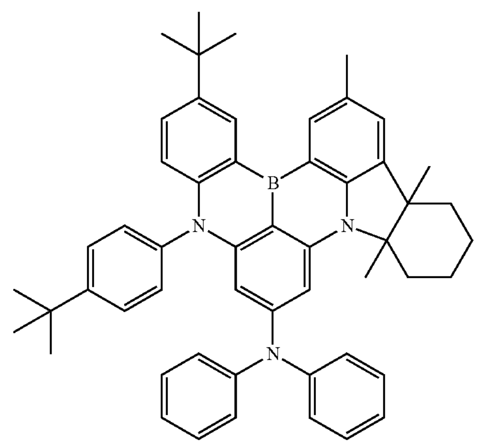
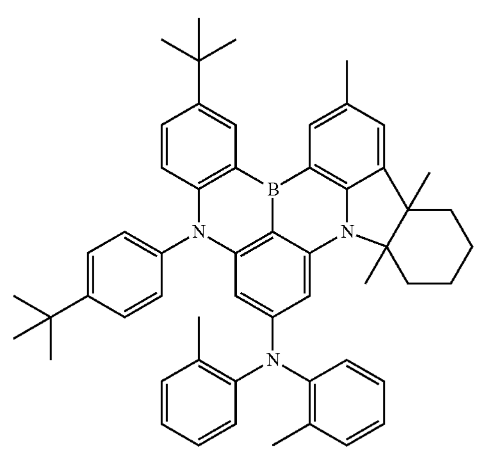

-continued
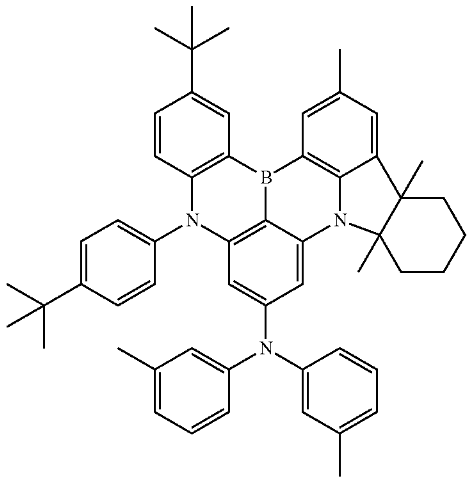
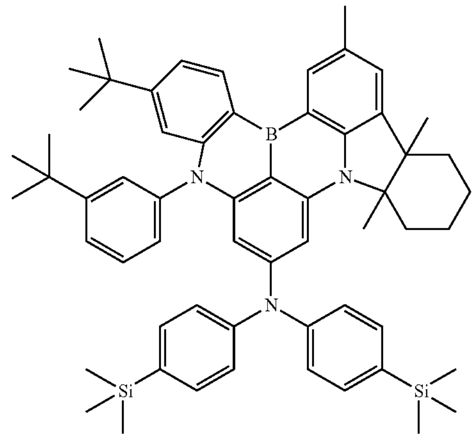
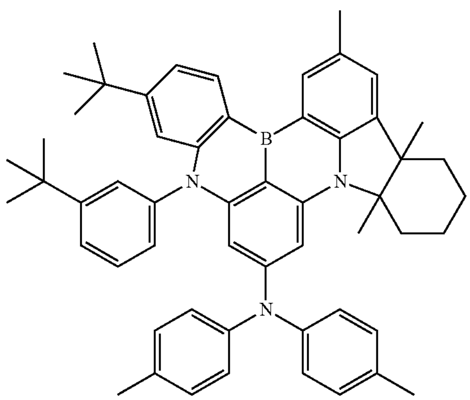
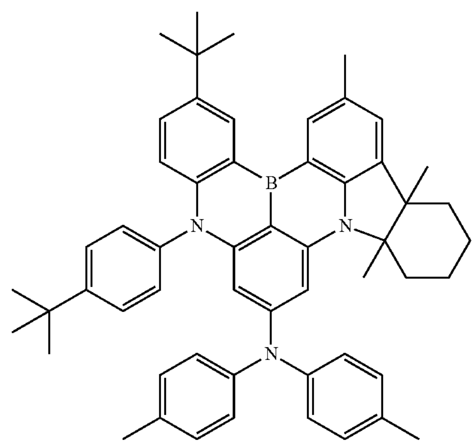
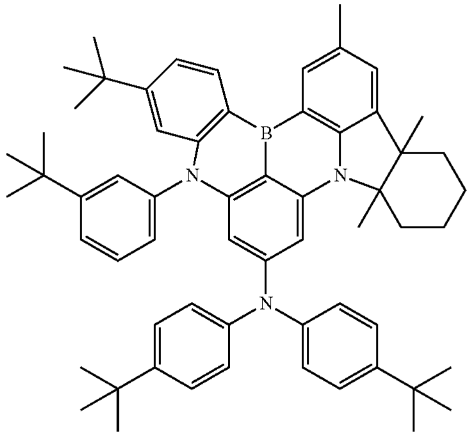
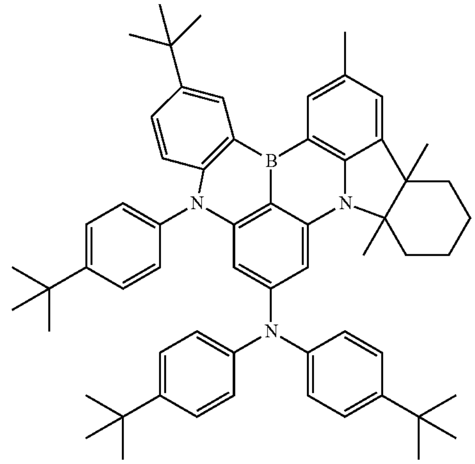
-continued -continued
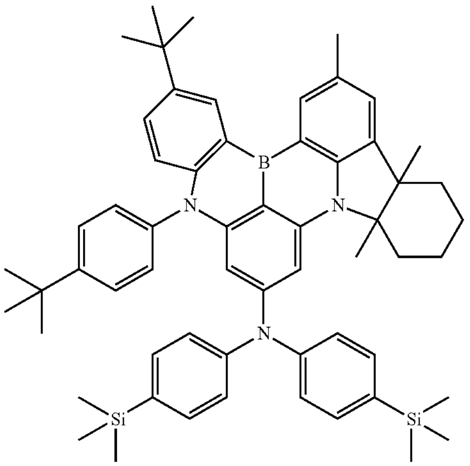
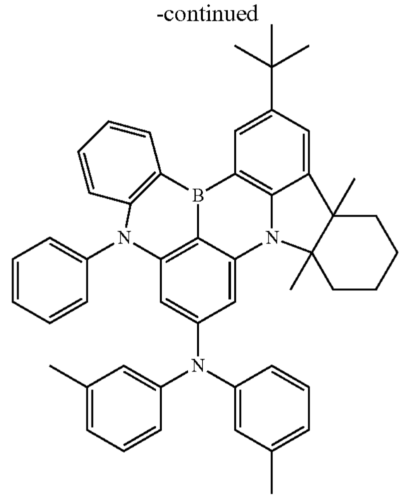
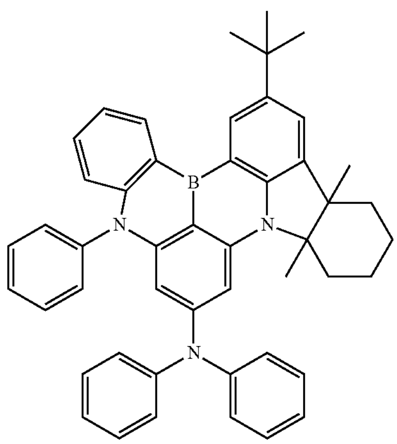
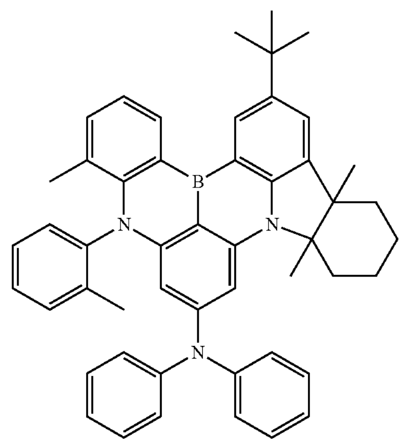
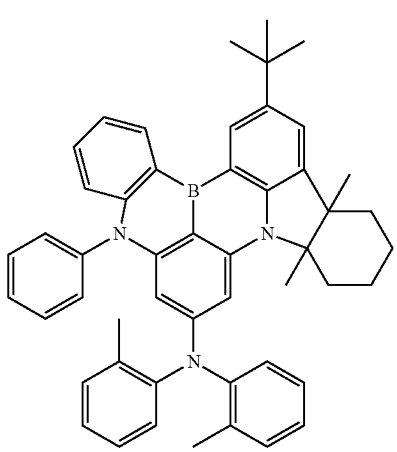
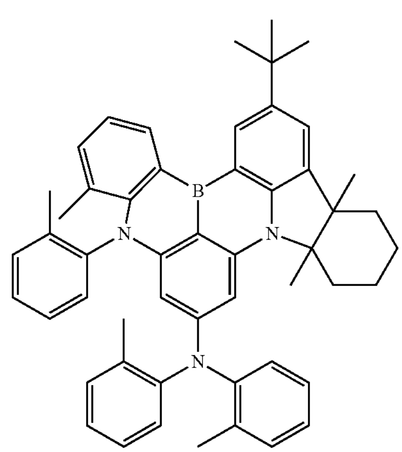
-continued

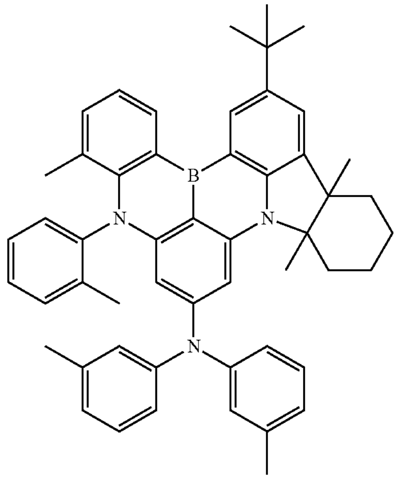
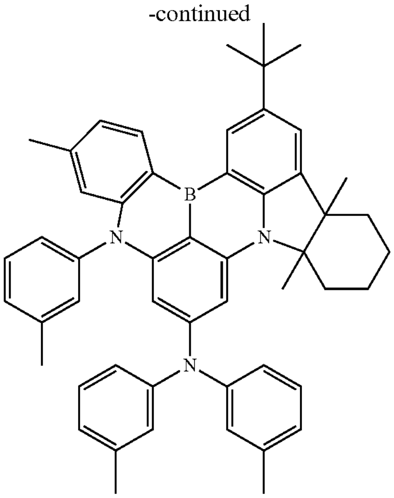
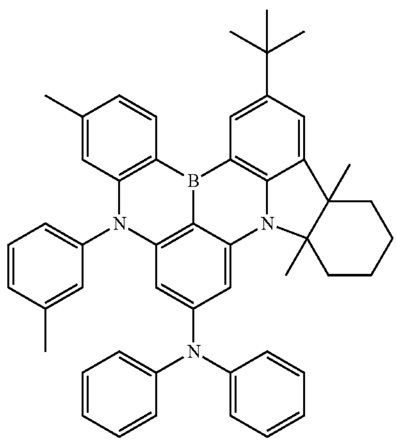
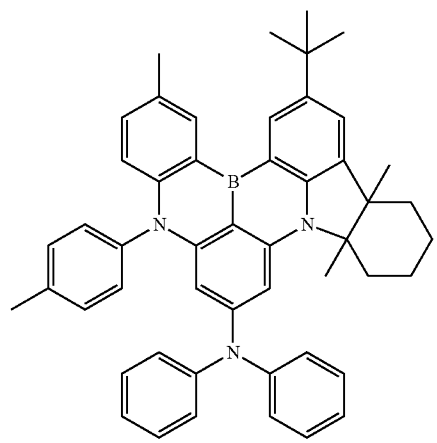
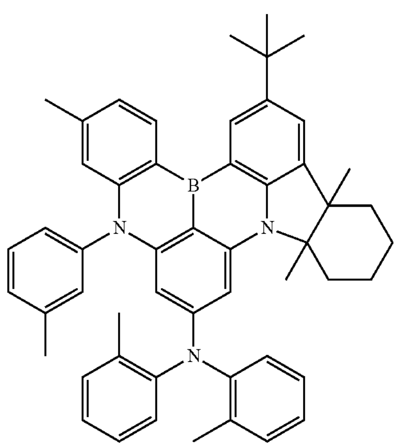
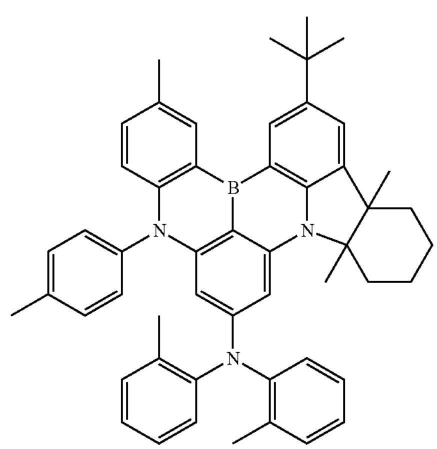

-continued
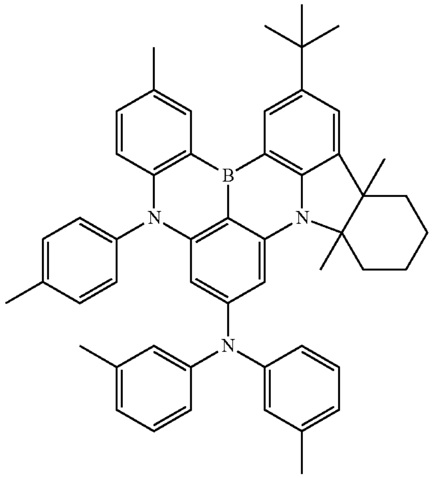
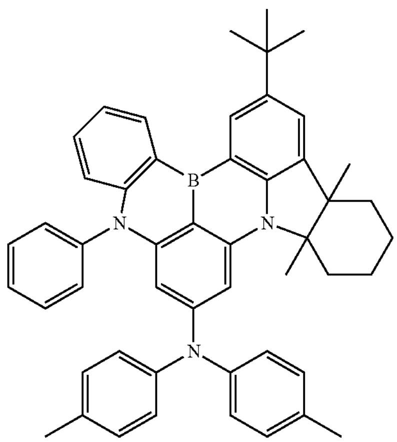
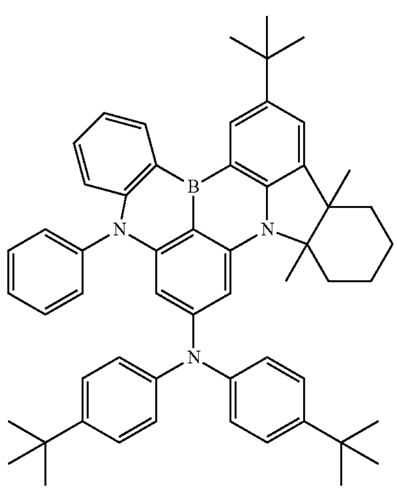
-continued
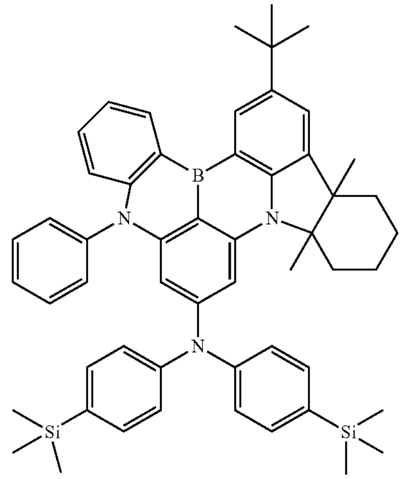
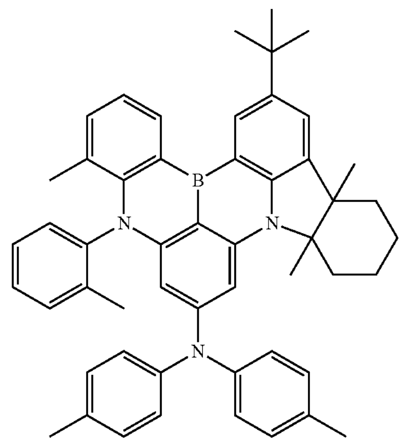
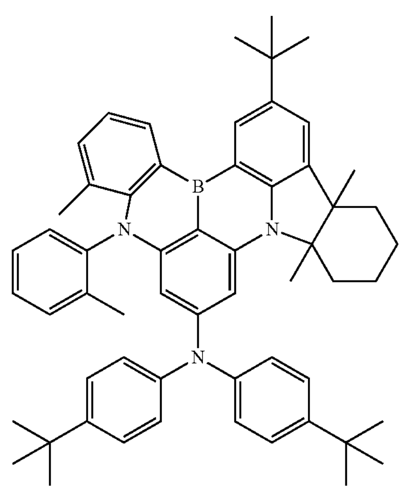

-continued
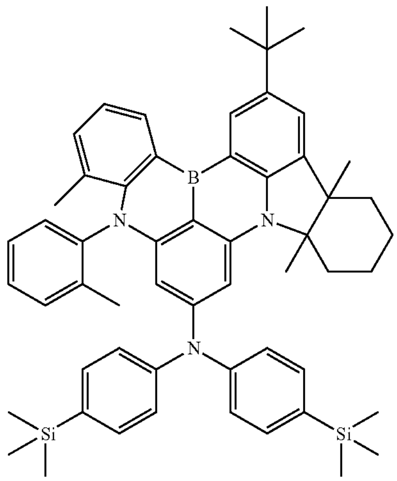
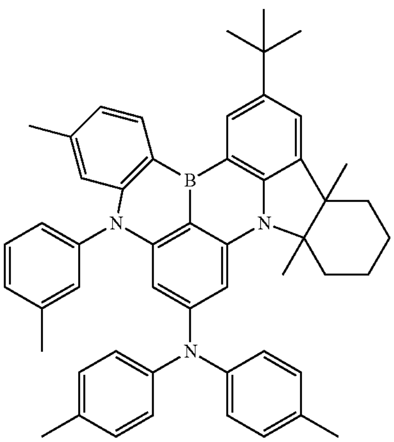
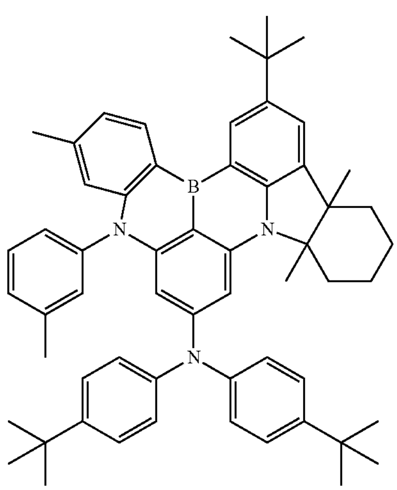
-continued
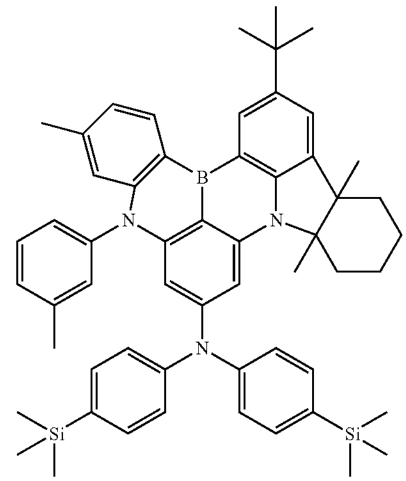
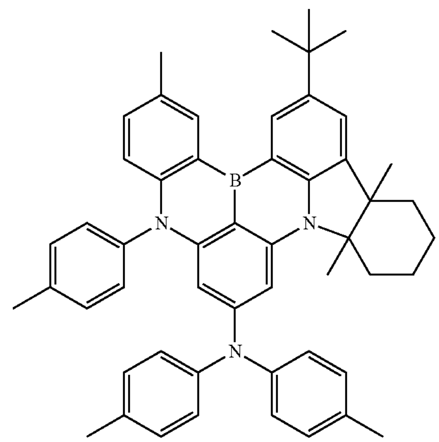
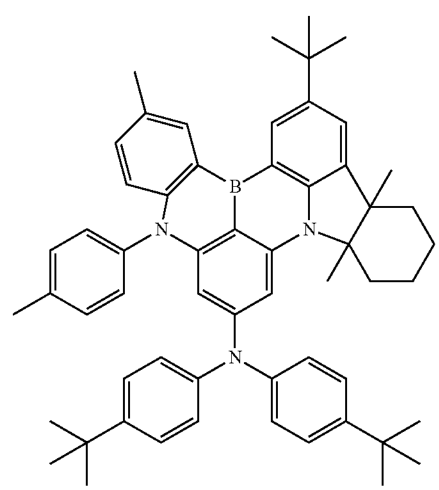

-continued
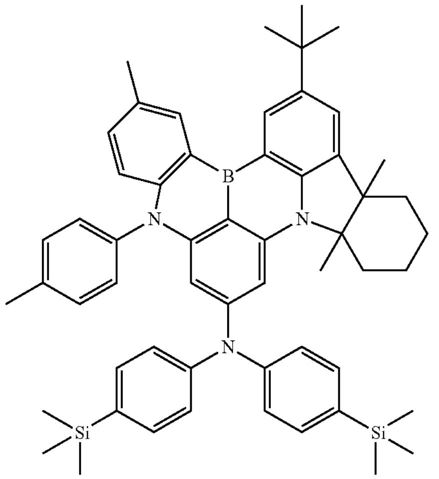
-continued
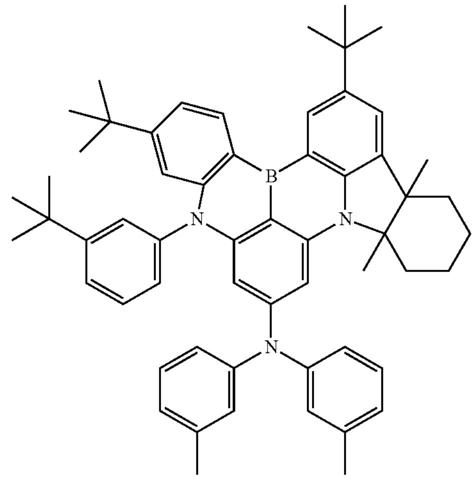
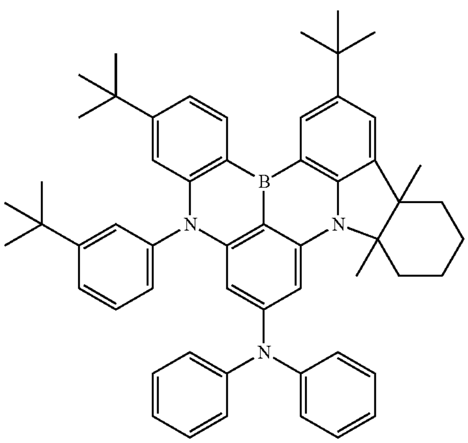
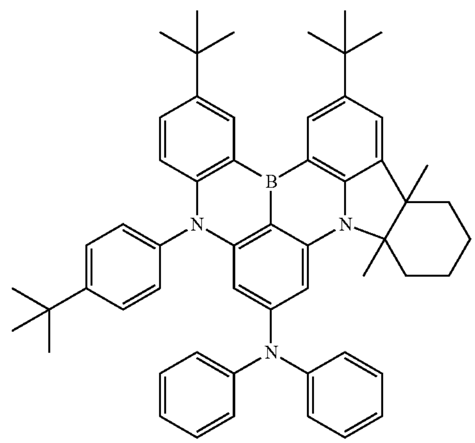
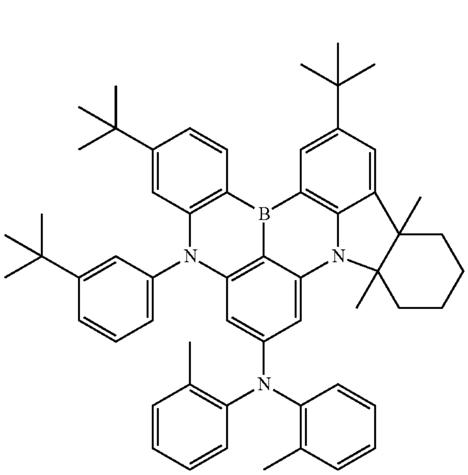
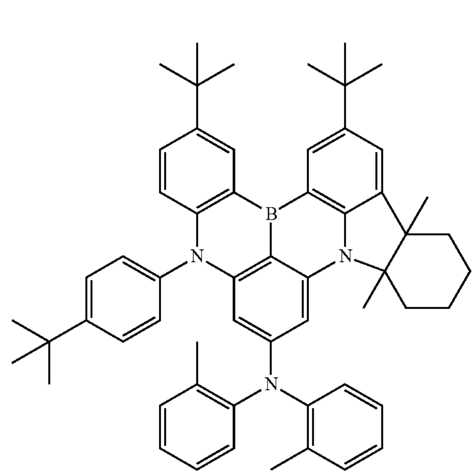

-continued
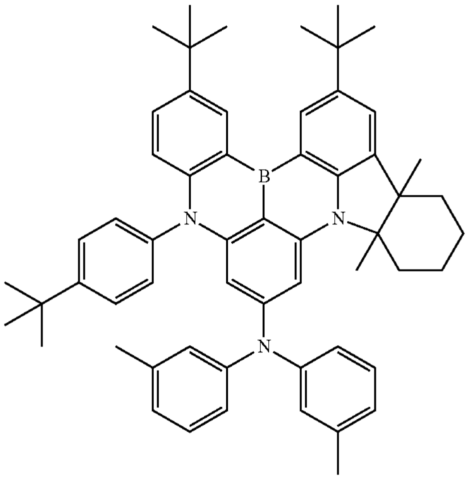
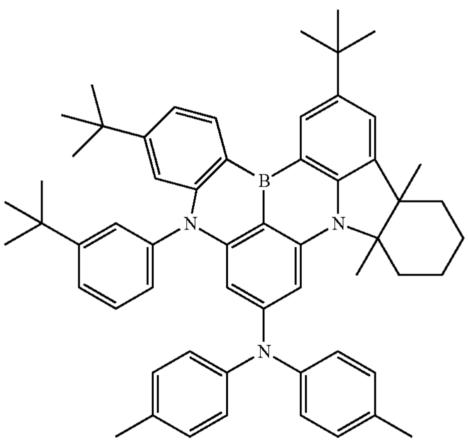
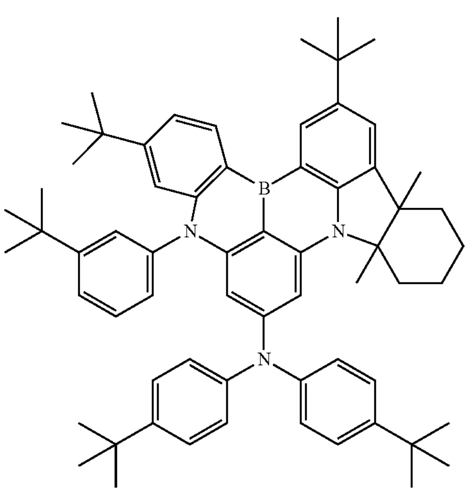
-continued
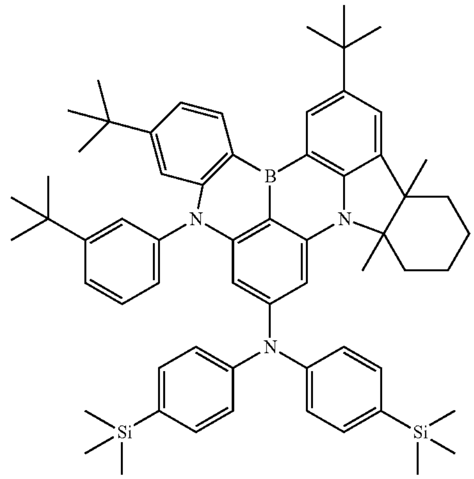
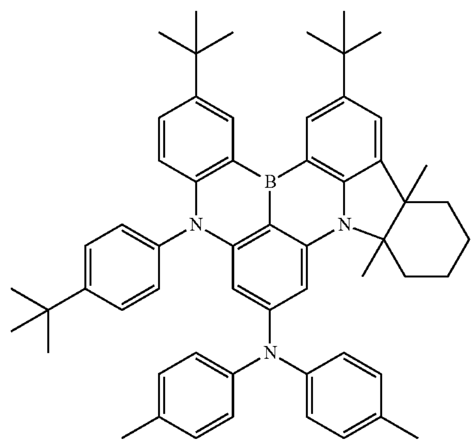
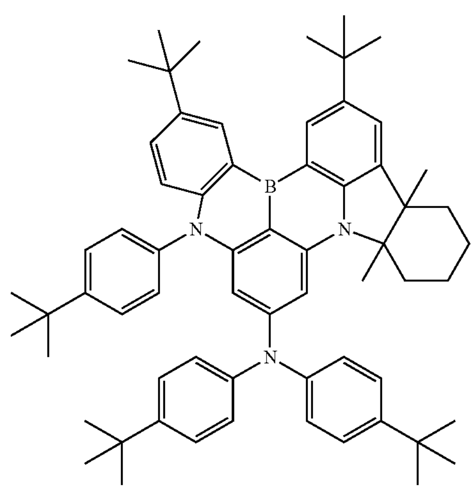

-continued
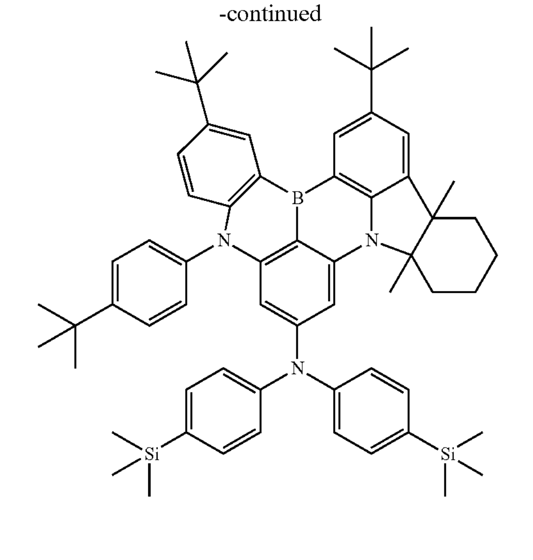
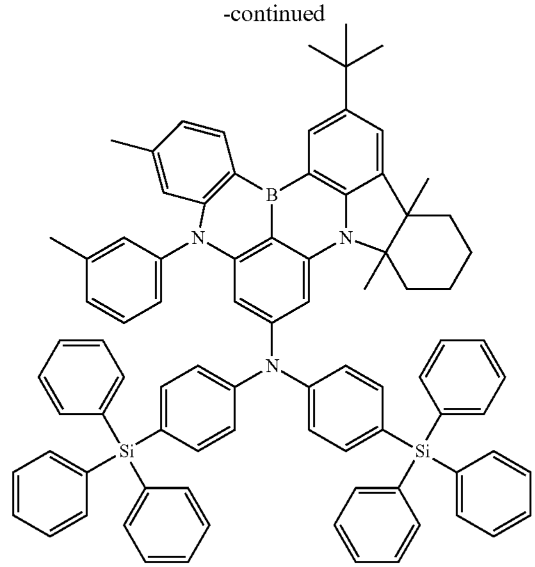
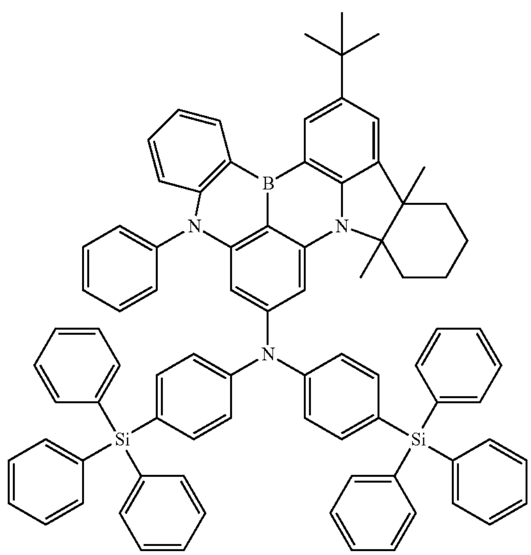
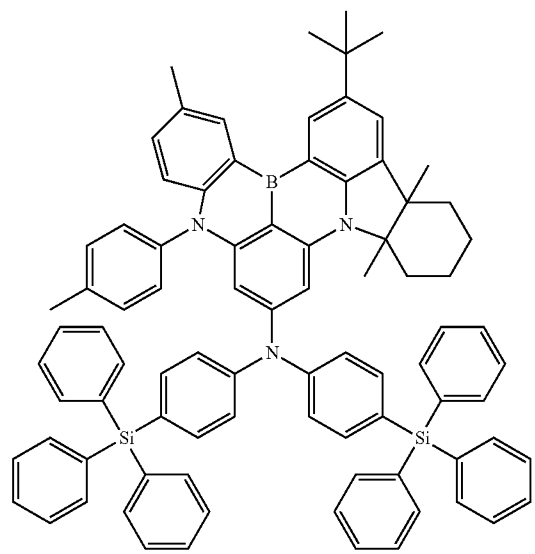
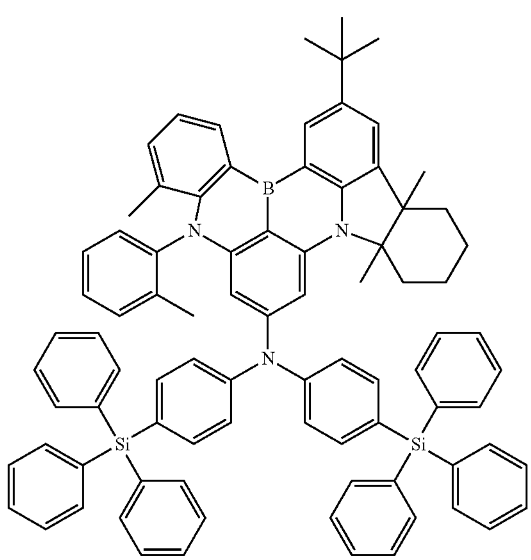
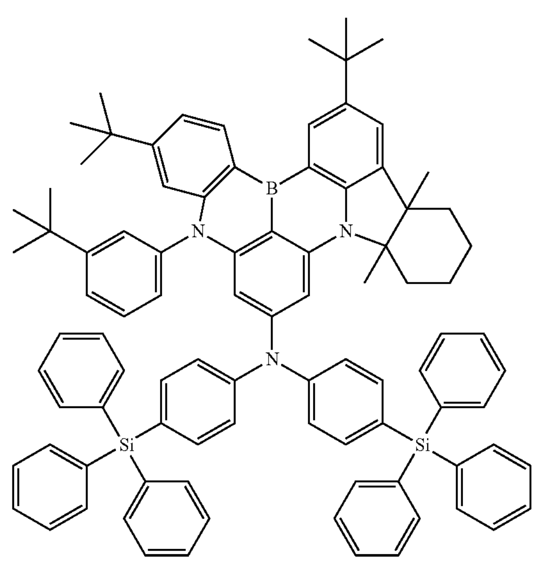

-continued
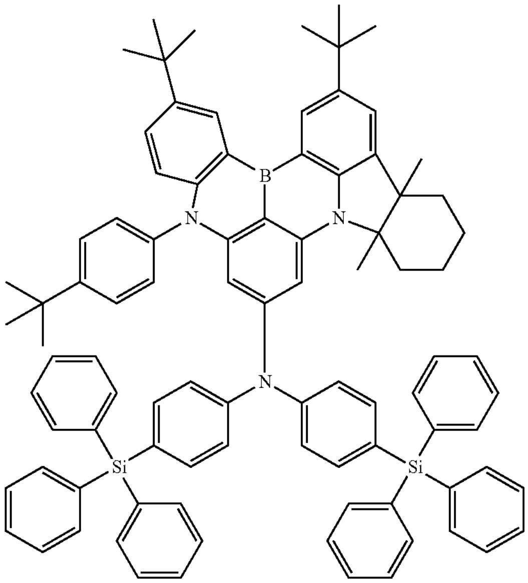
-continued
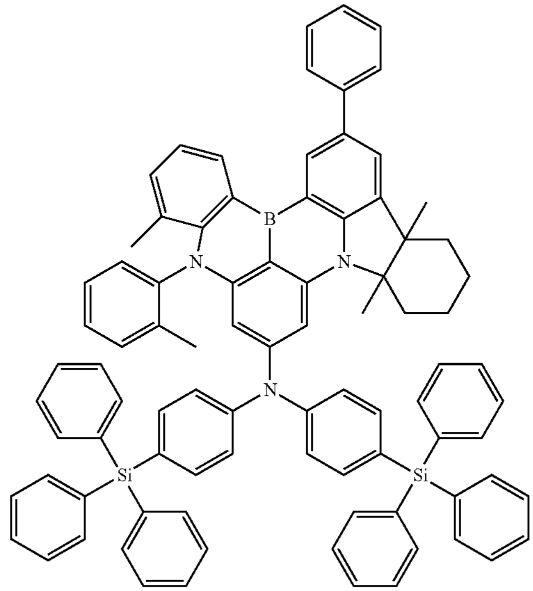
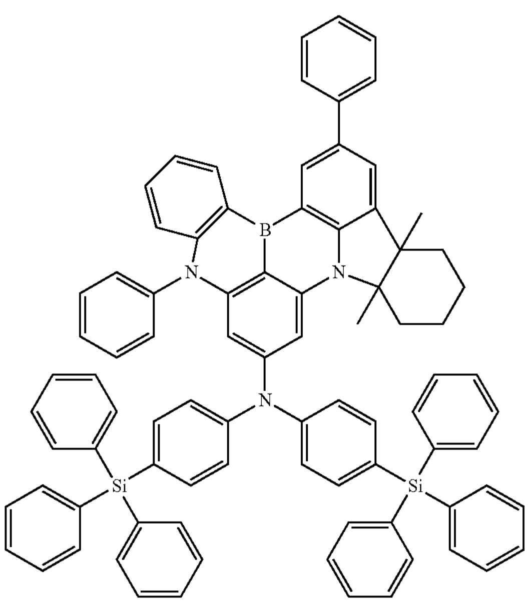
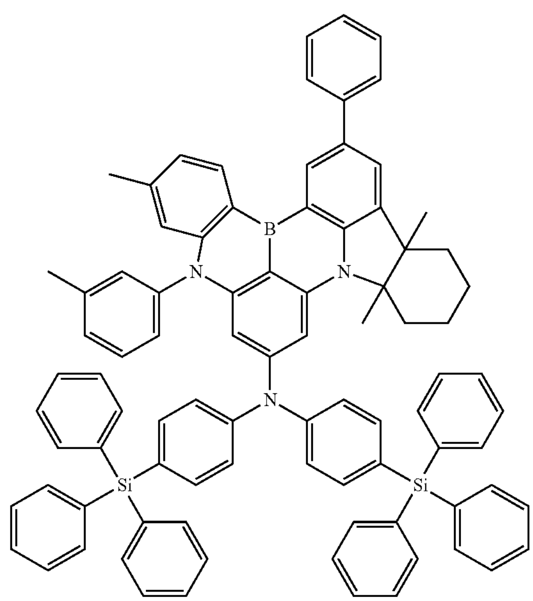

-continued
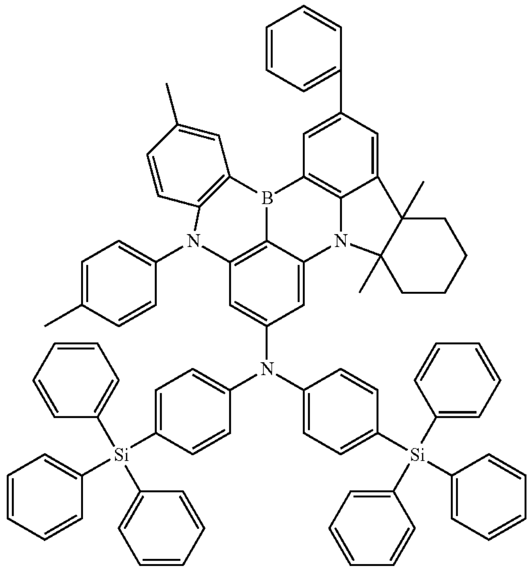
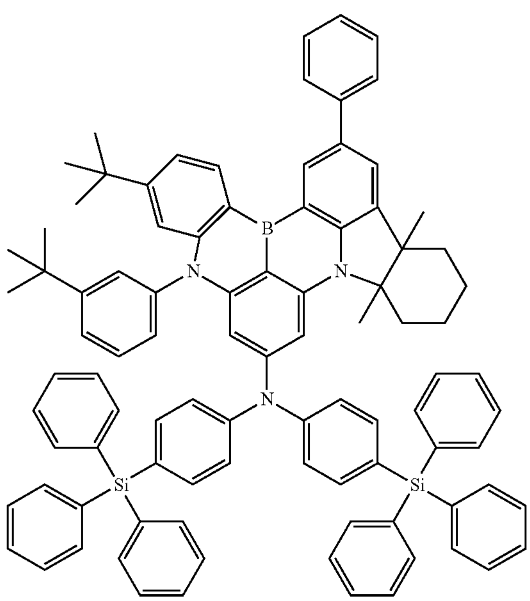
-continued
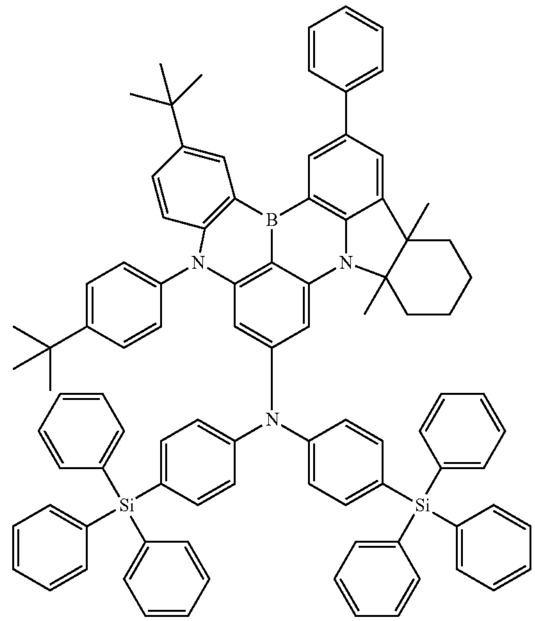
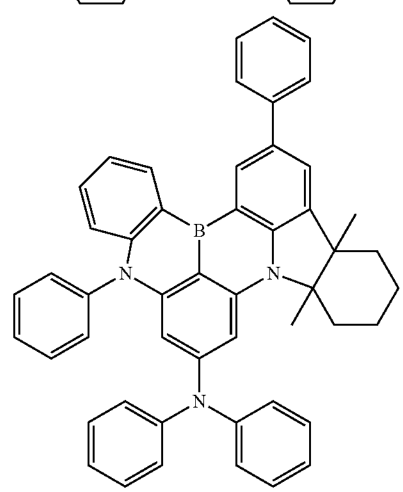
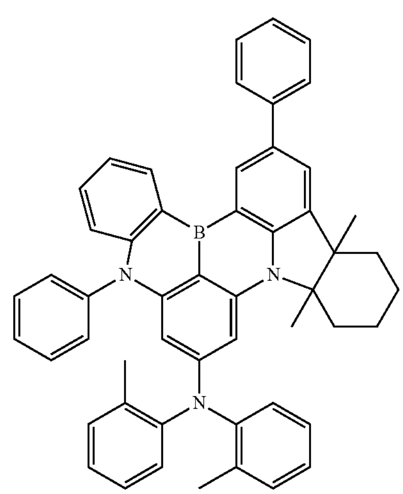

-continued
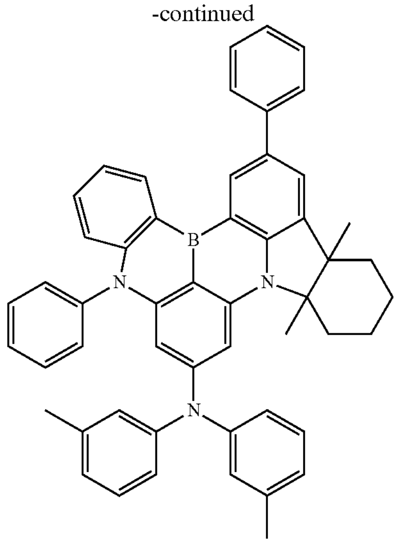
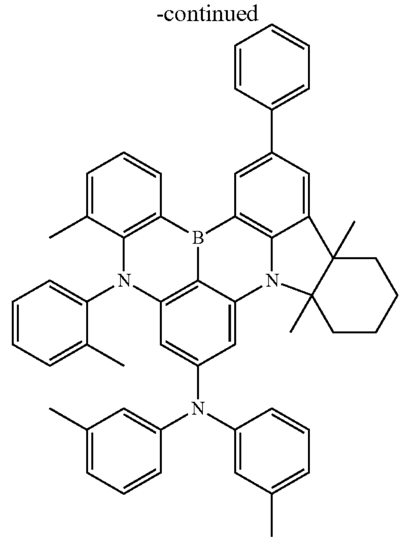
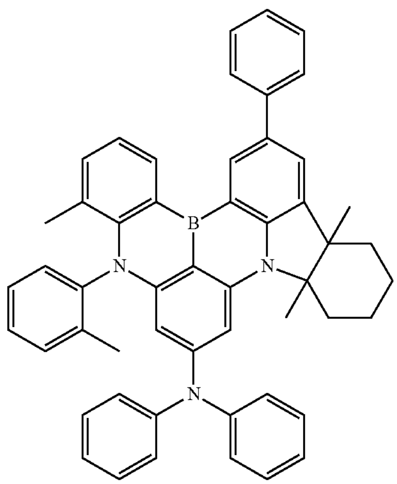
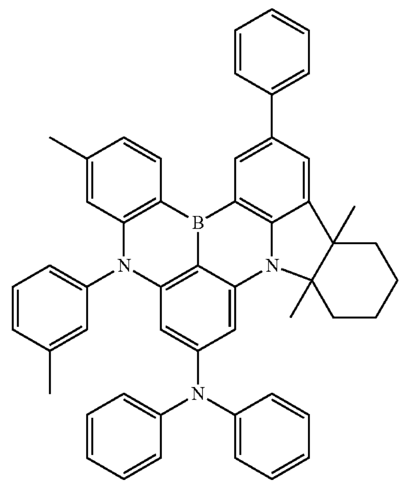
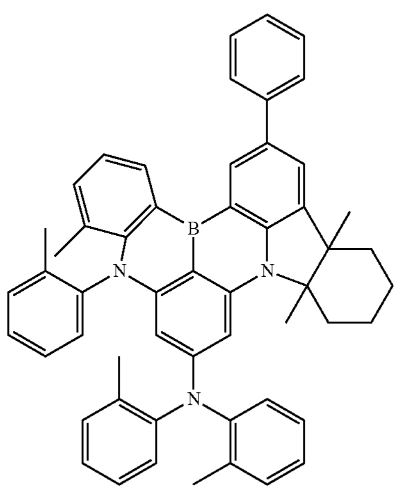
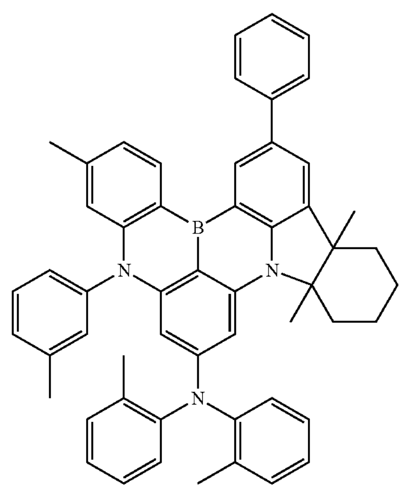
-continued -continued
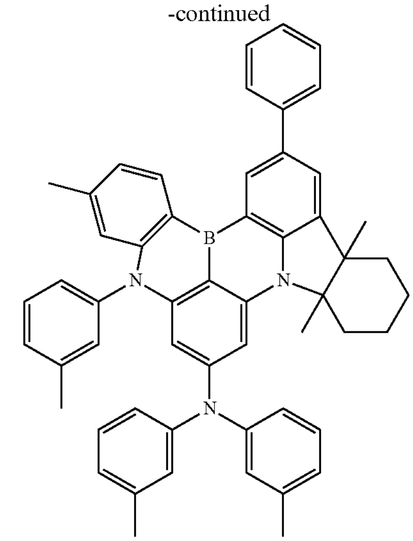
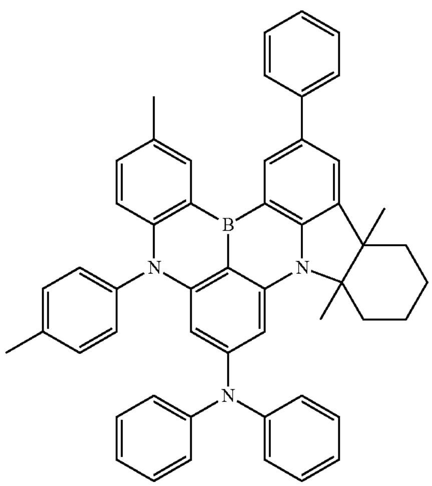
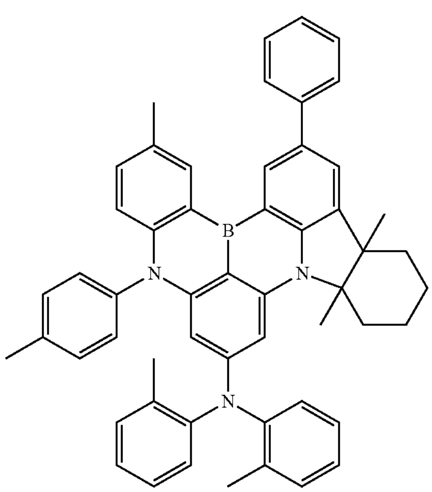
-continued
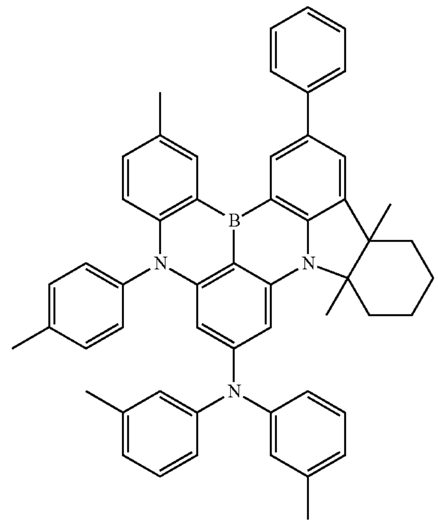
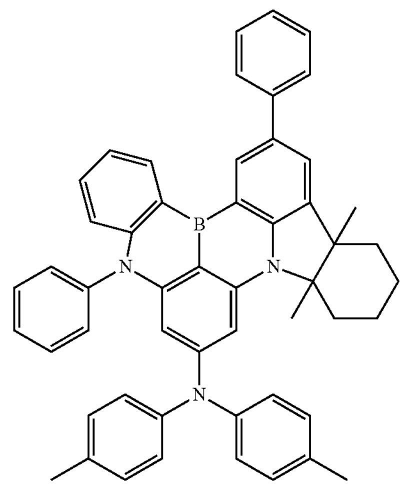
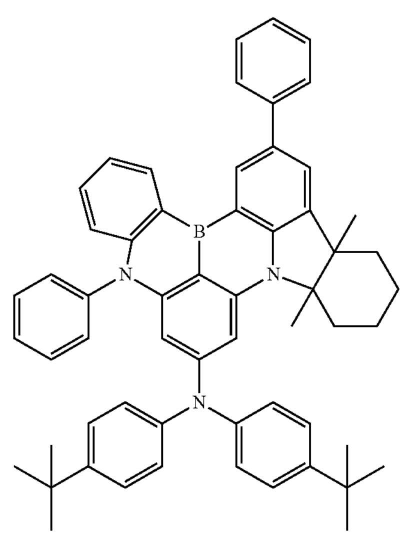

-continued
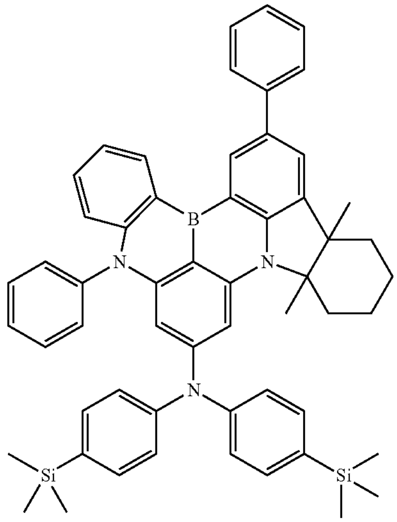
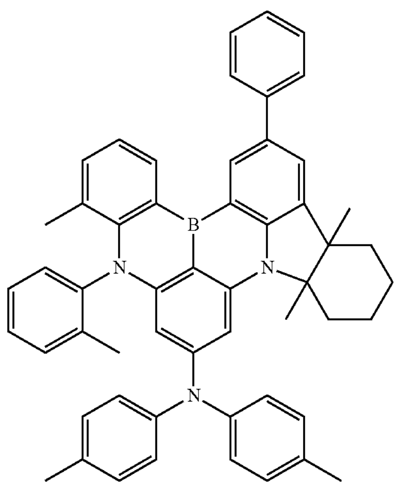
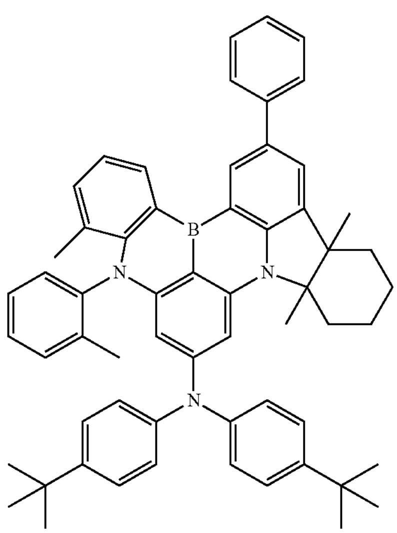
-continued
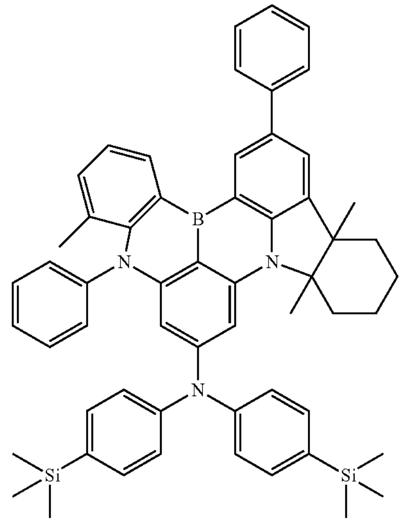
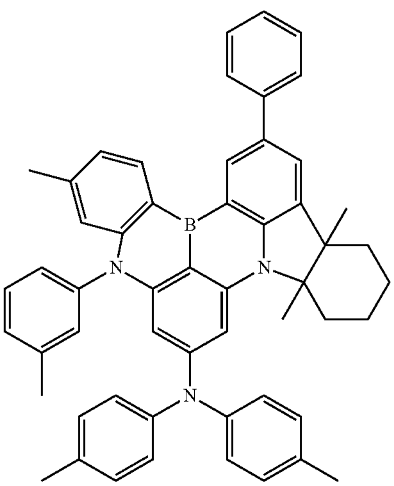
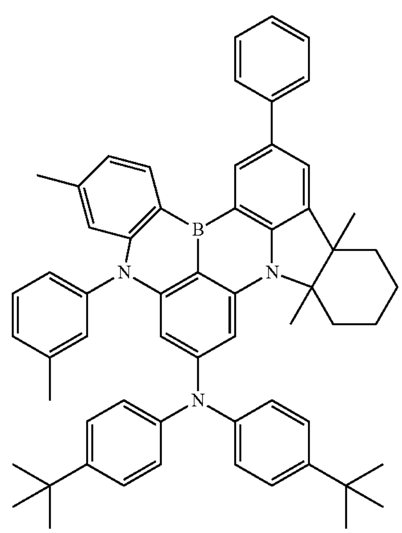

-continued
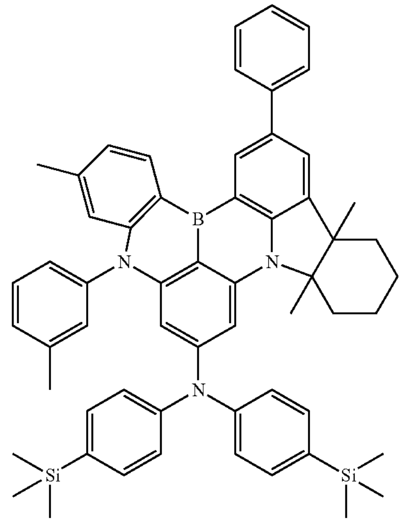
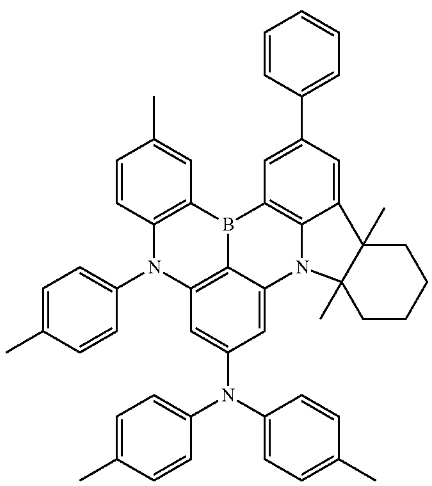
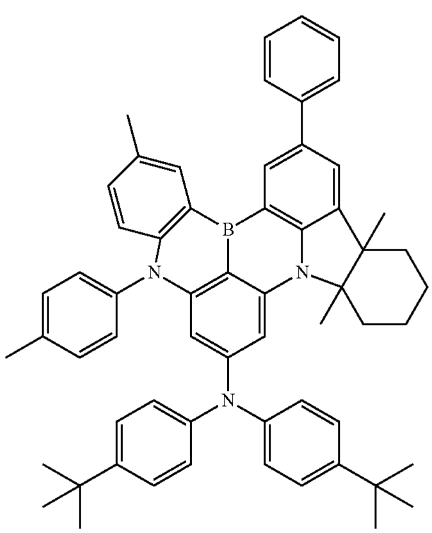
-continued
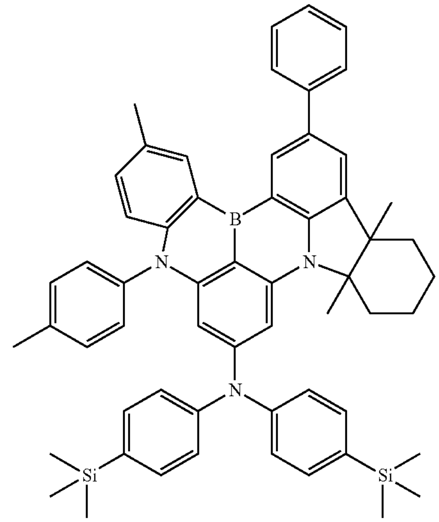
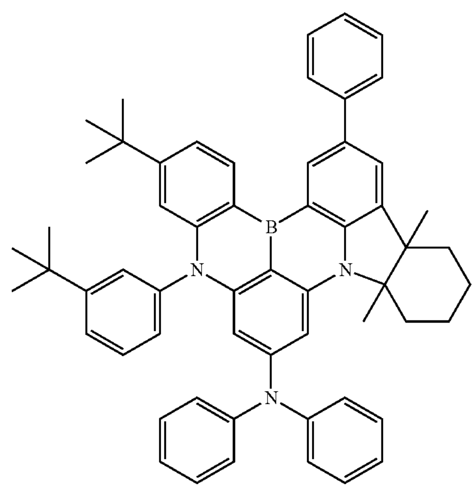
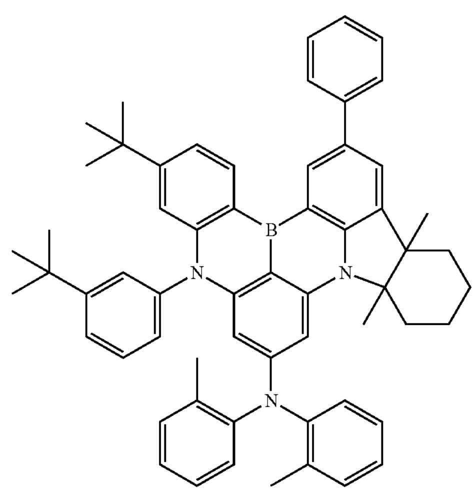

-continued
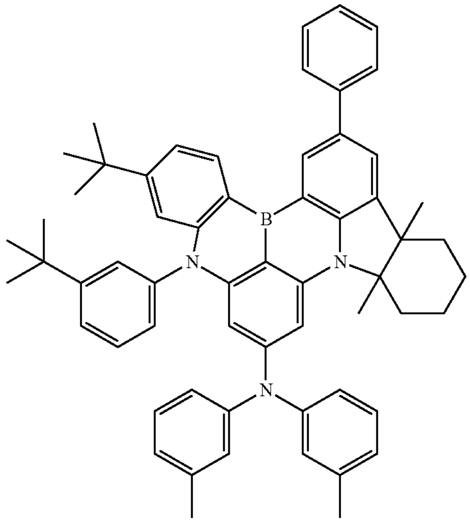
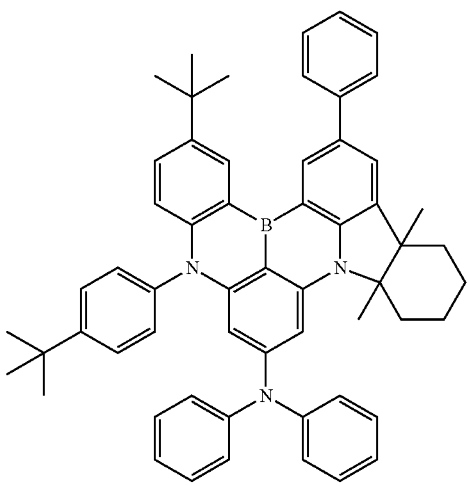
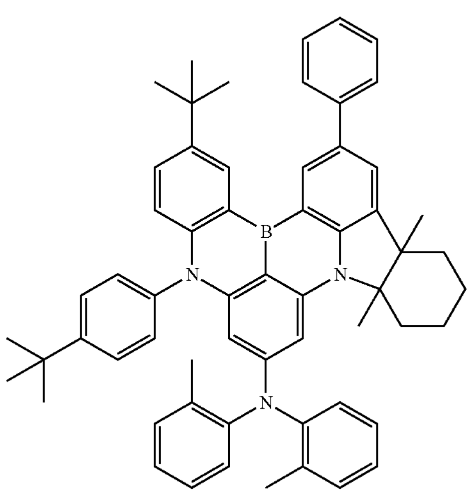
-continued
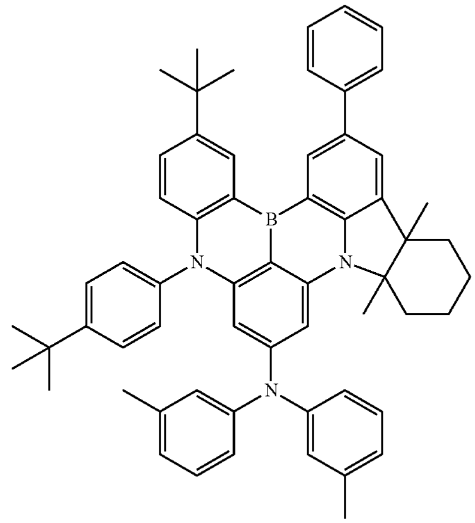
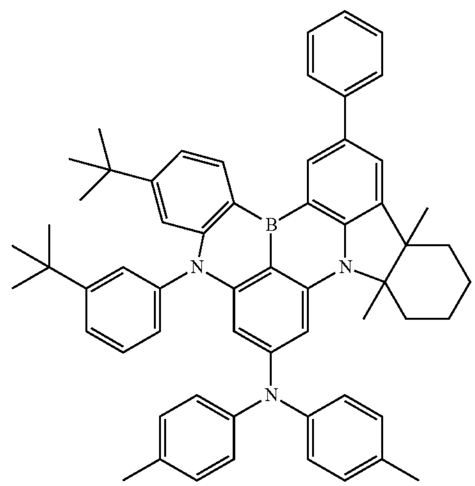
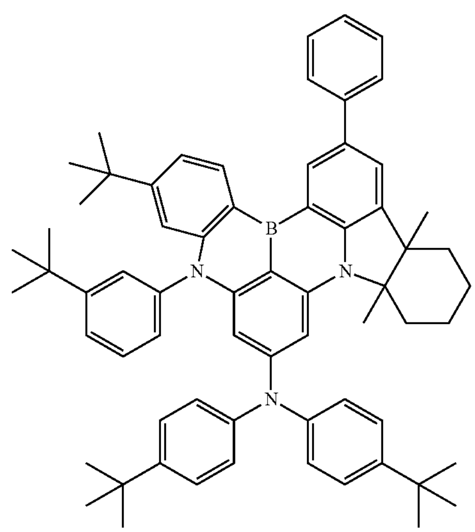

-continued
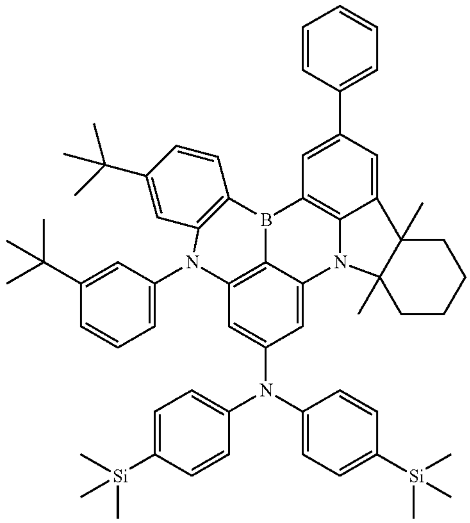
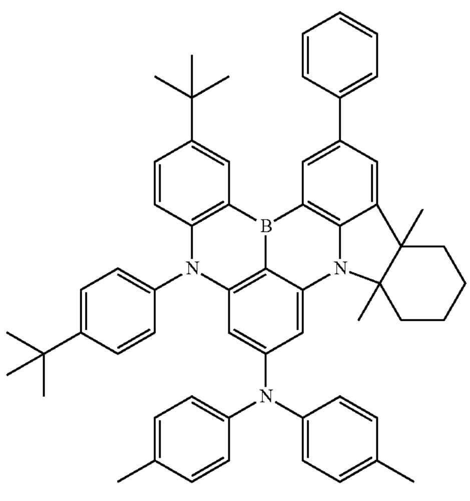
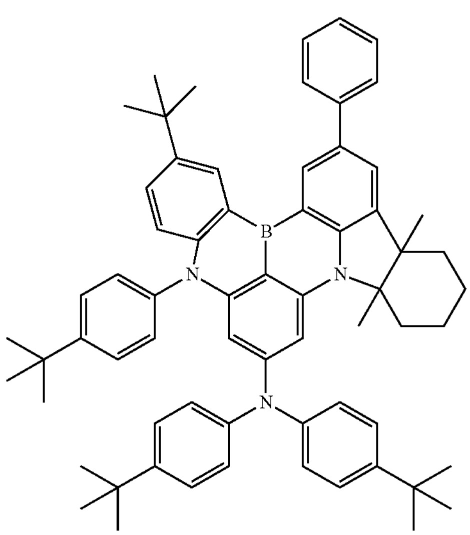
-continued
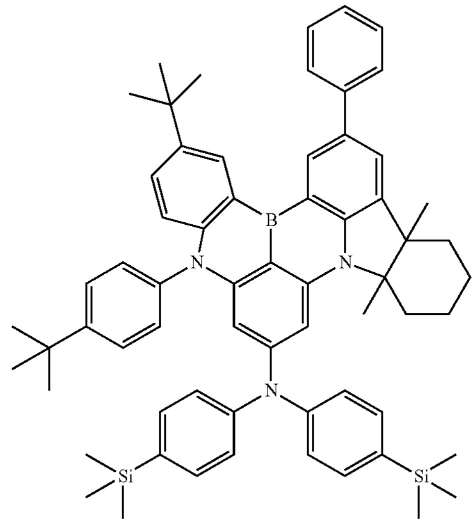
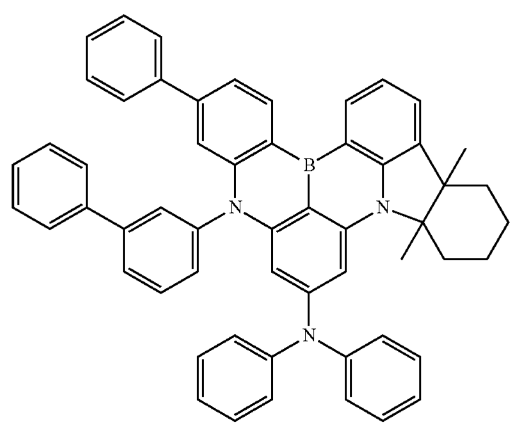
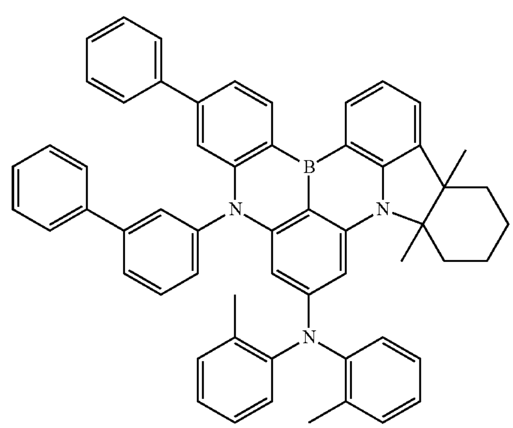

-continued
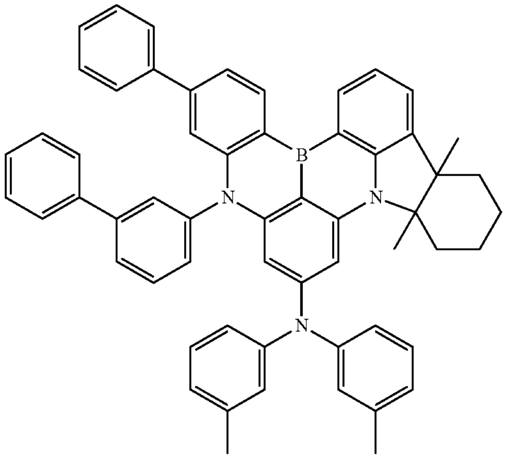
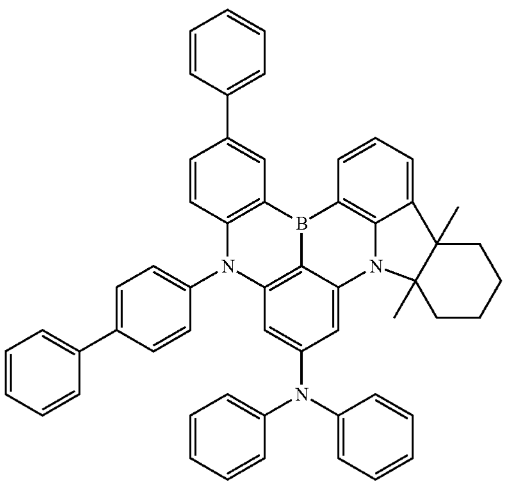
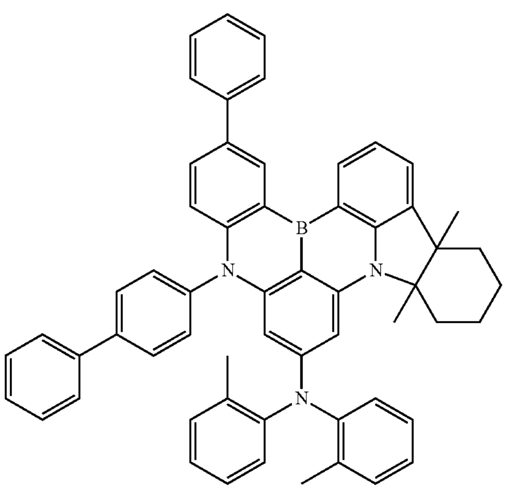
-continued
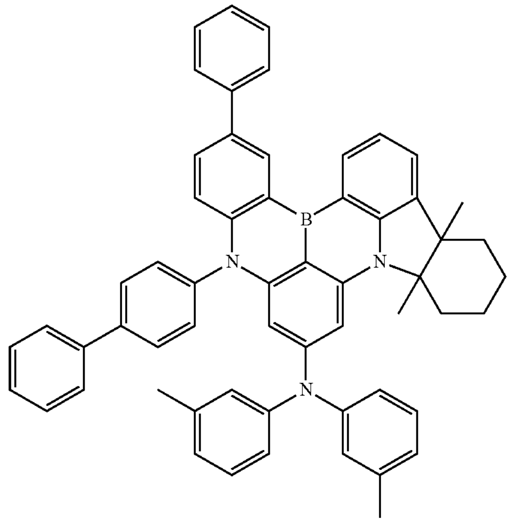
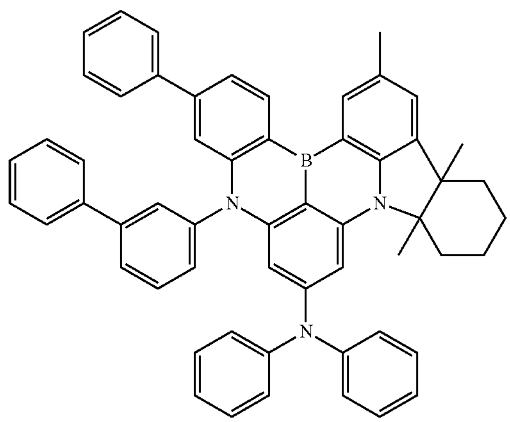
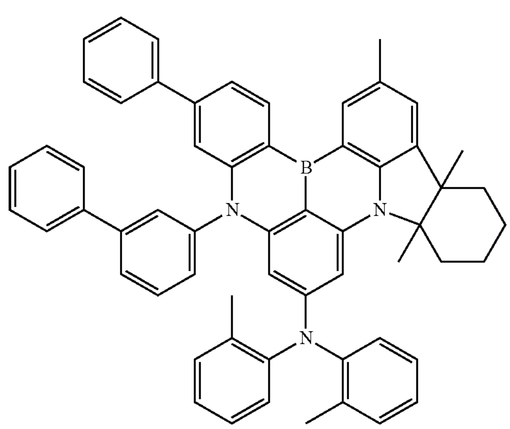

-continued
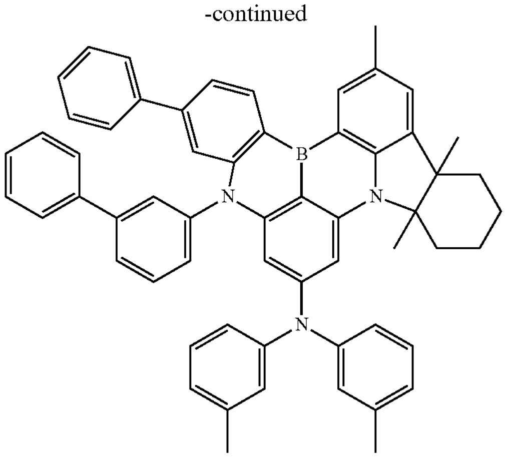
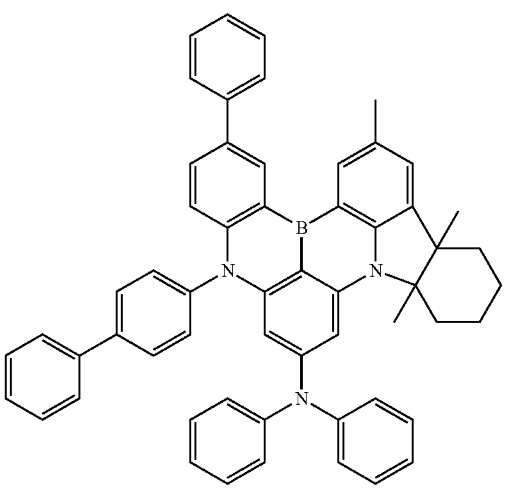
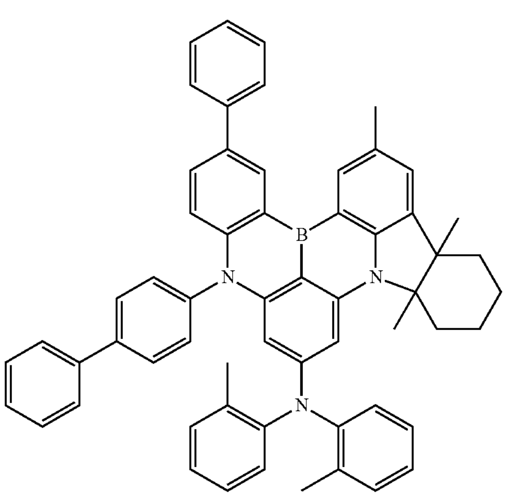
-continued
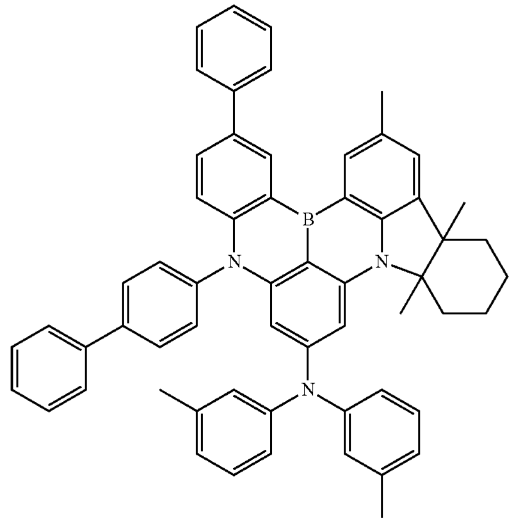
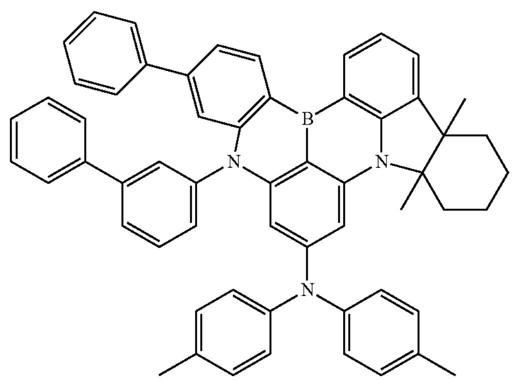
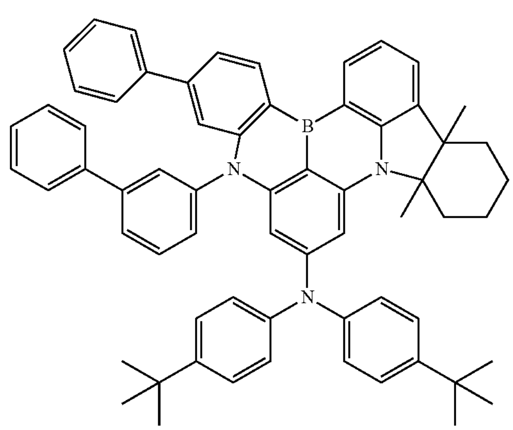

-continued
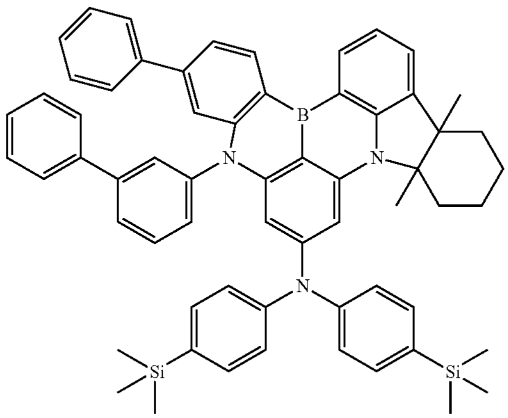
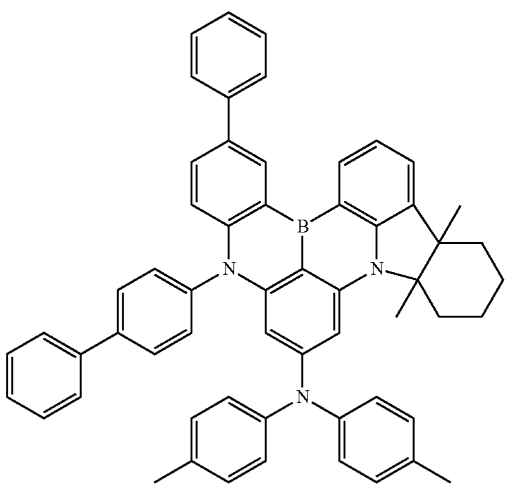
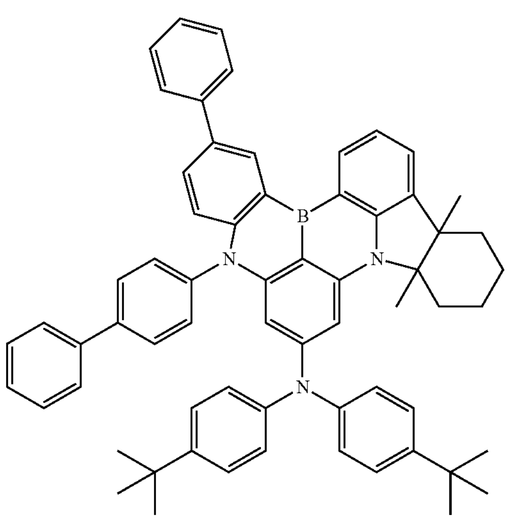
-continued
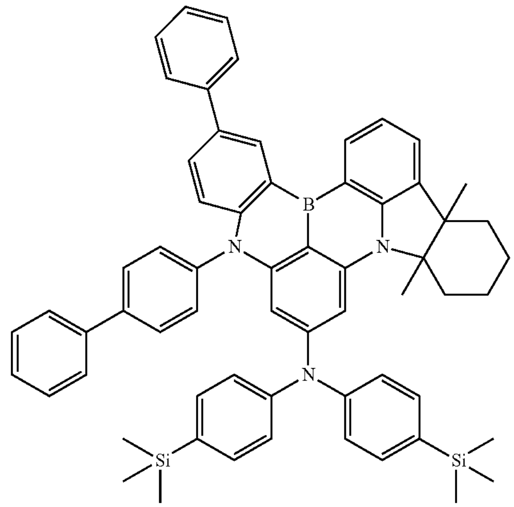
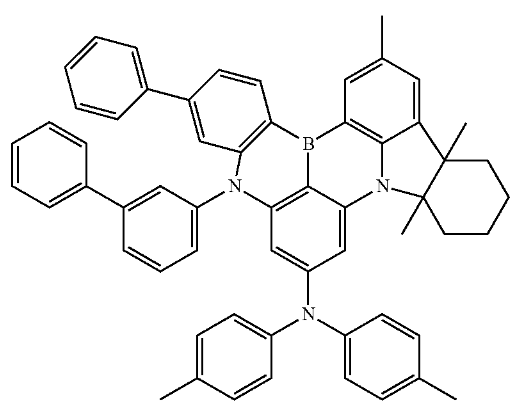
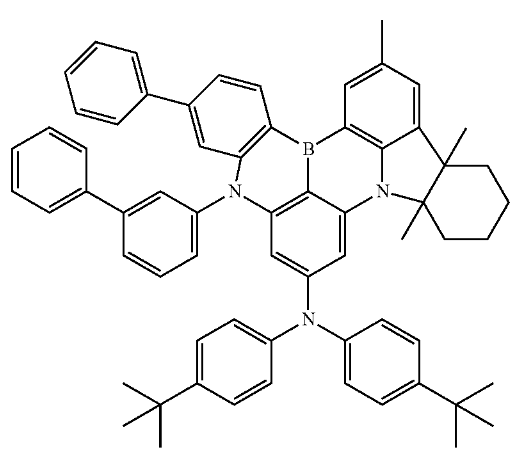

-continued
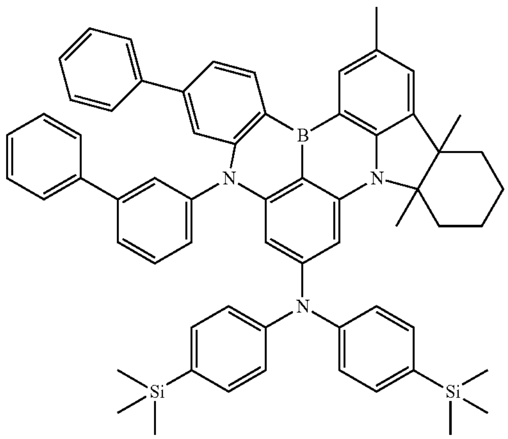
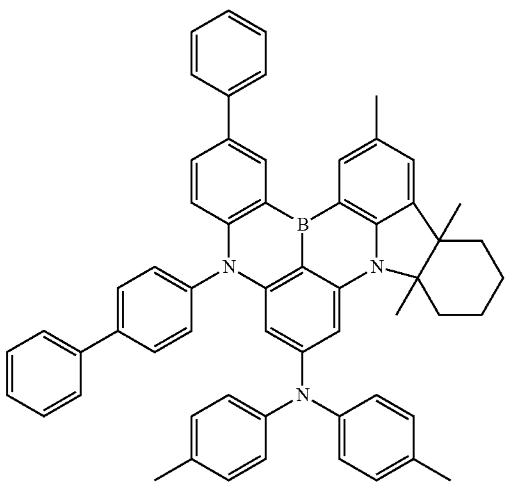
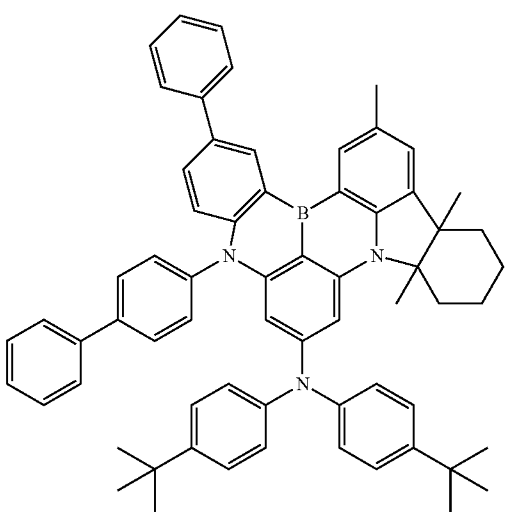
-continued
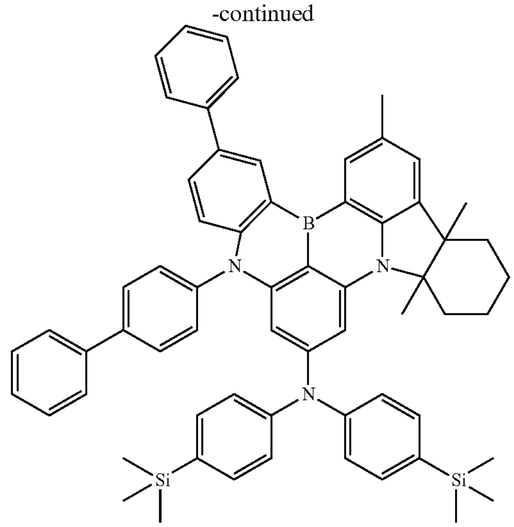
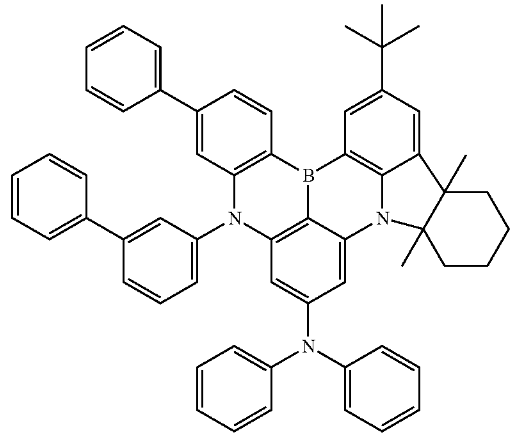
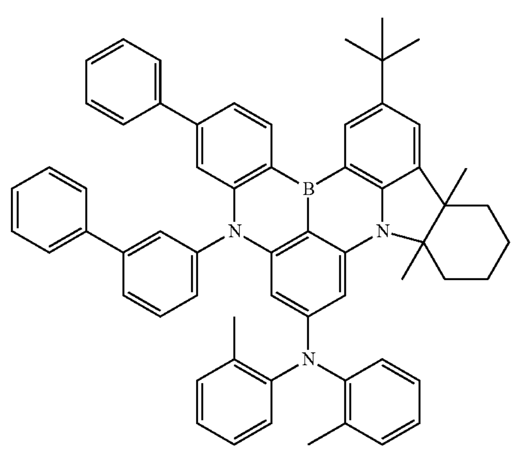

-continued
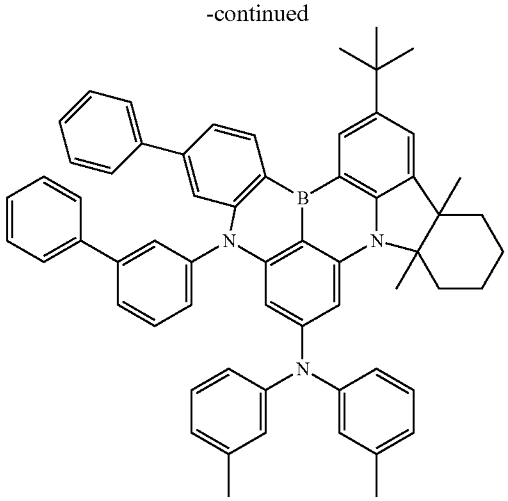
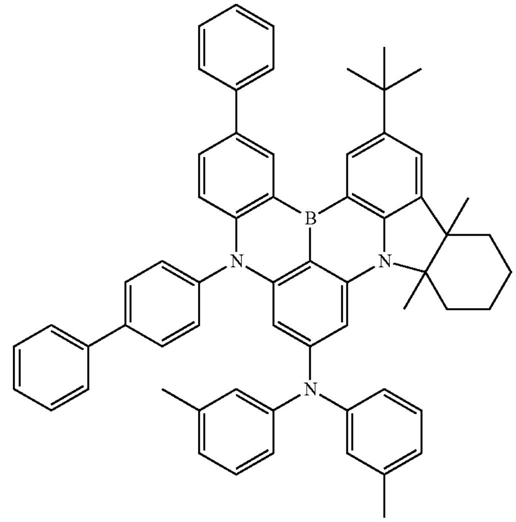
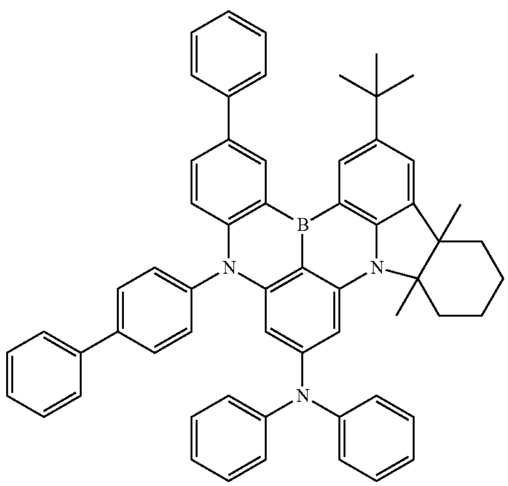
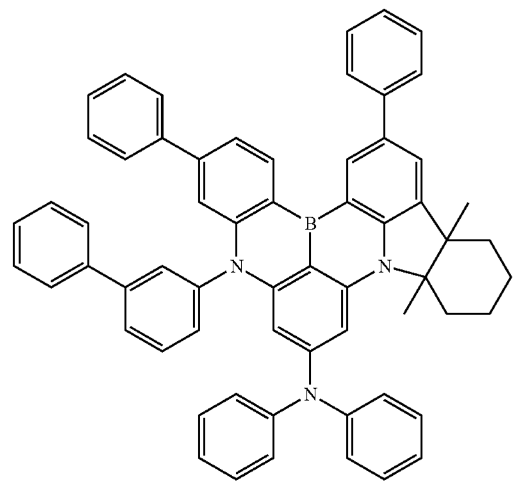
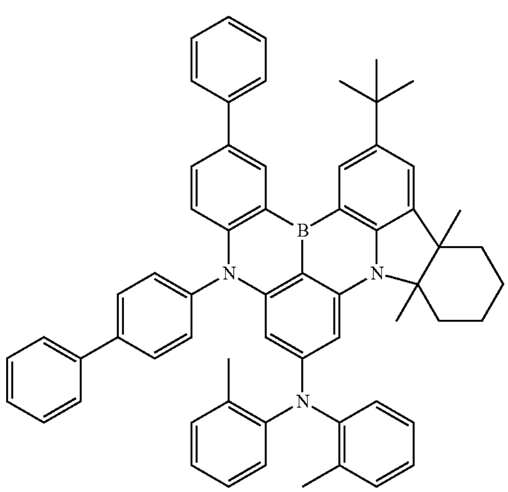
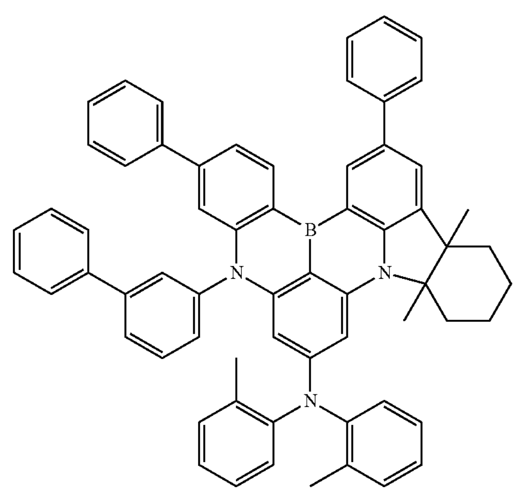

-continued
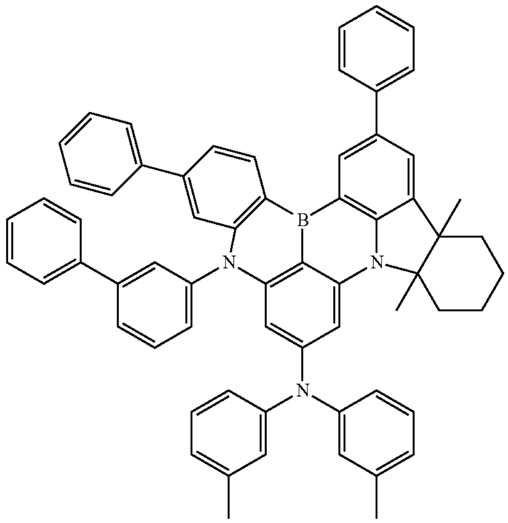
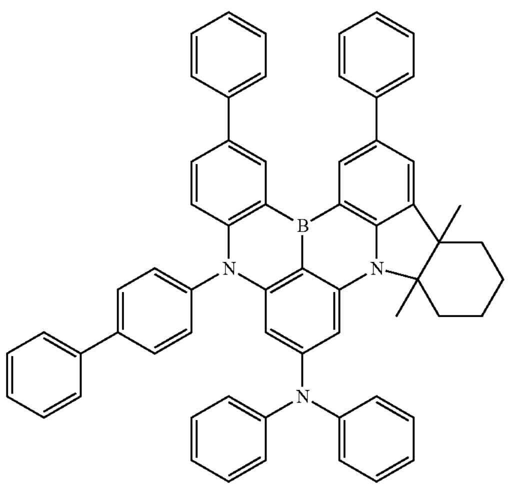
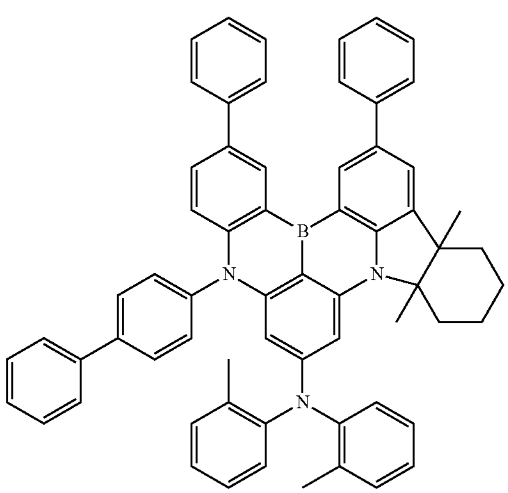
-continued
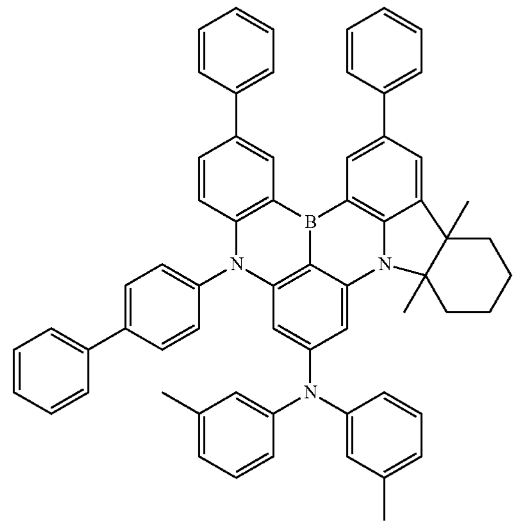
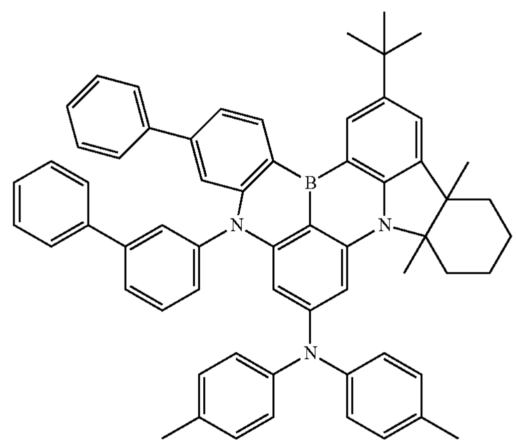
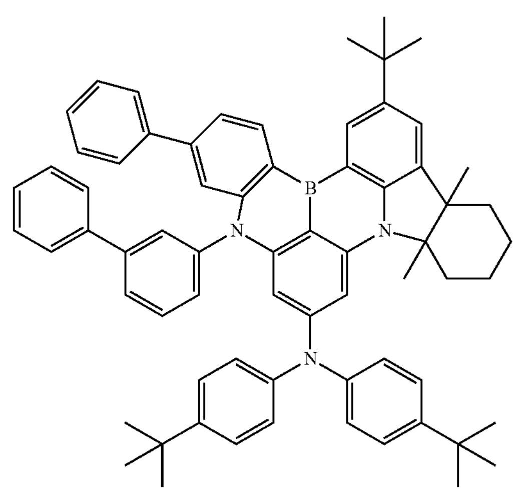

-continued
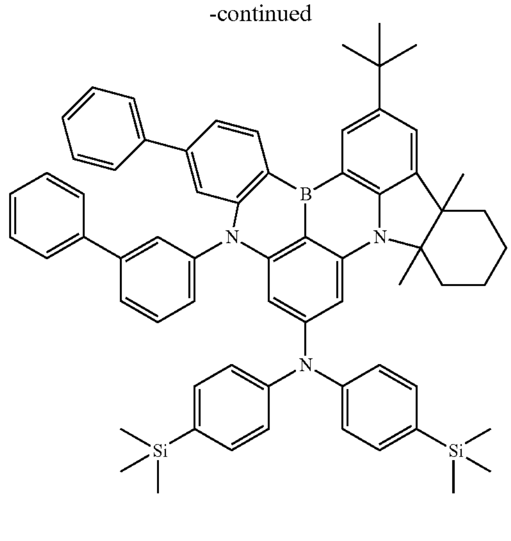
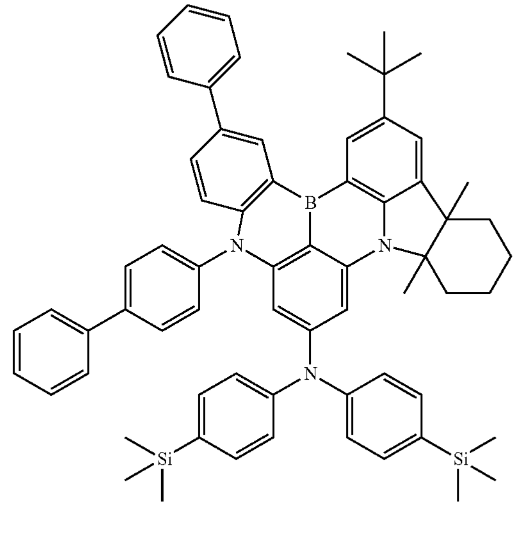
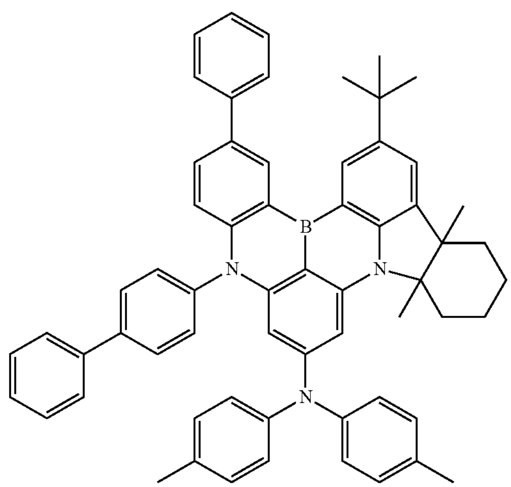
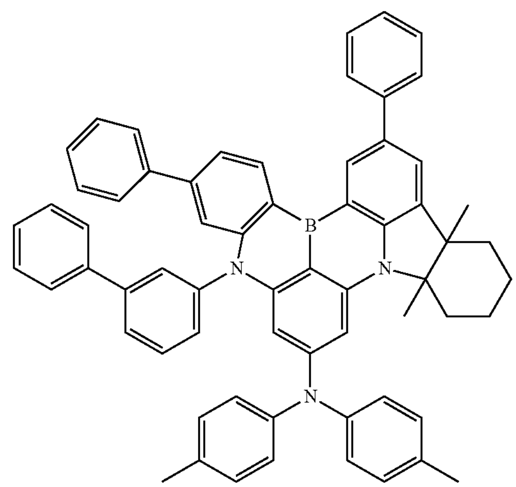
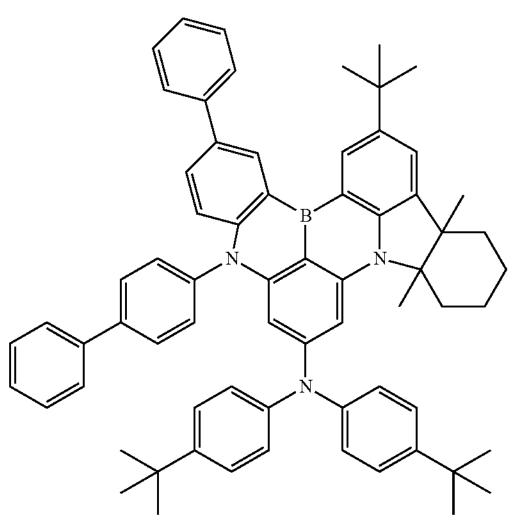
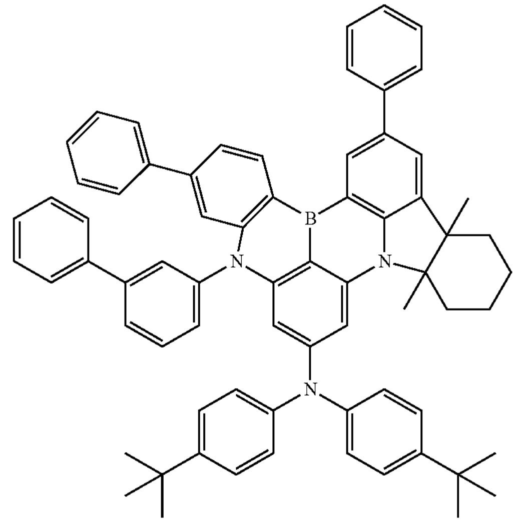

-continued
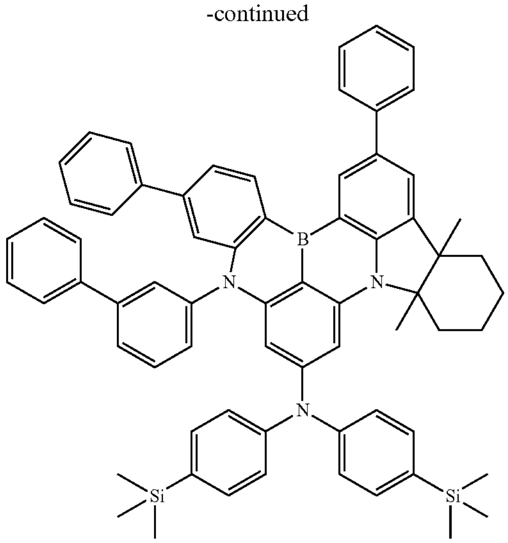
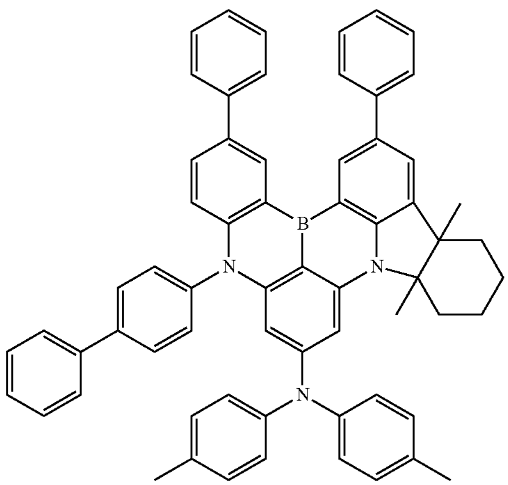
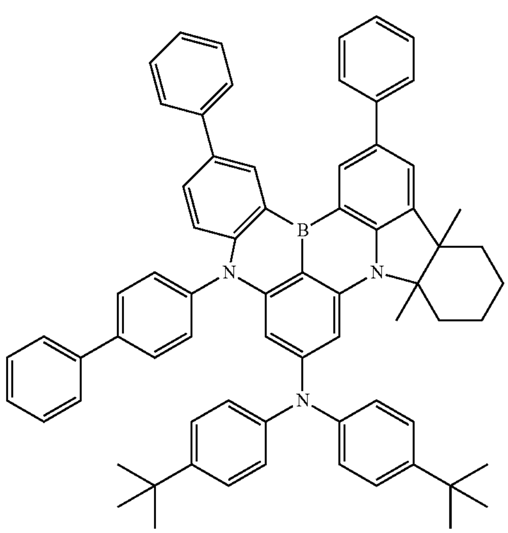
-continued
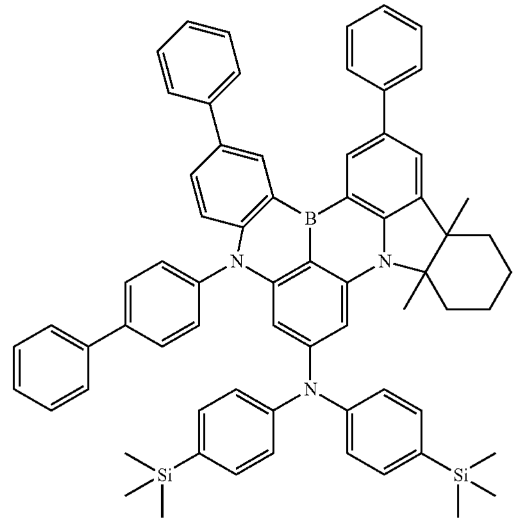
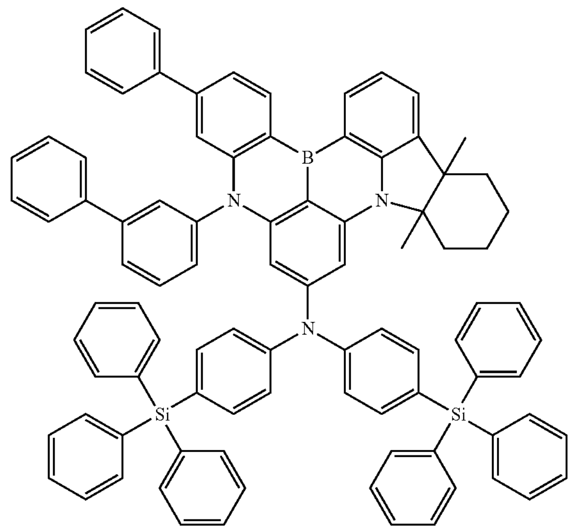
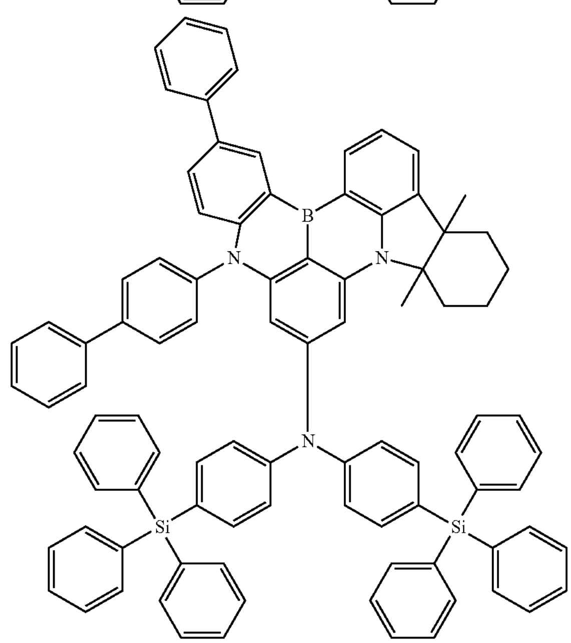

-continued
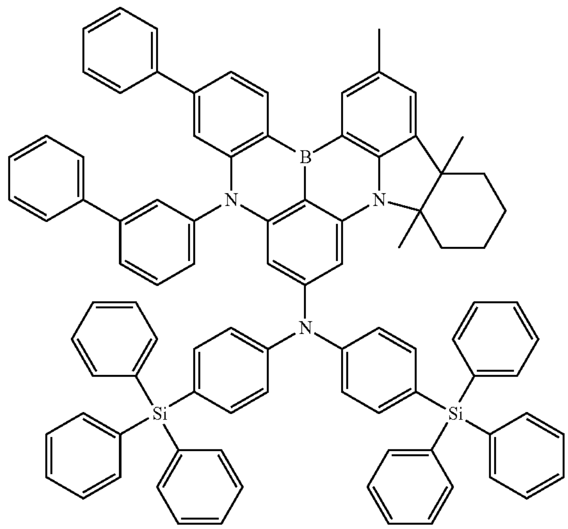
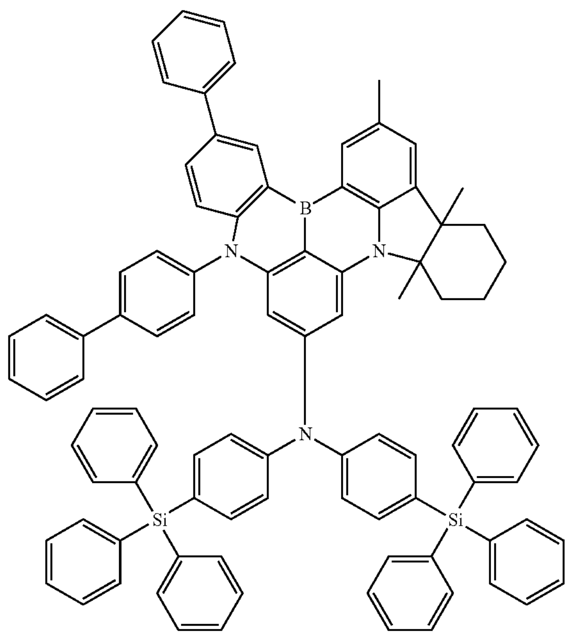
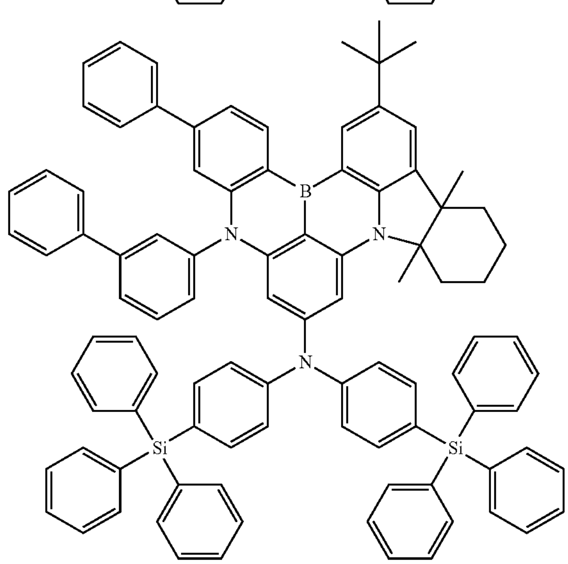
-continued
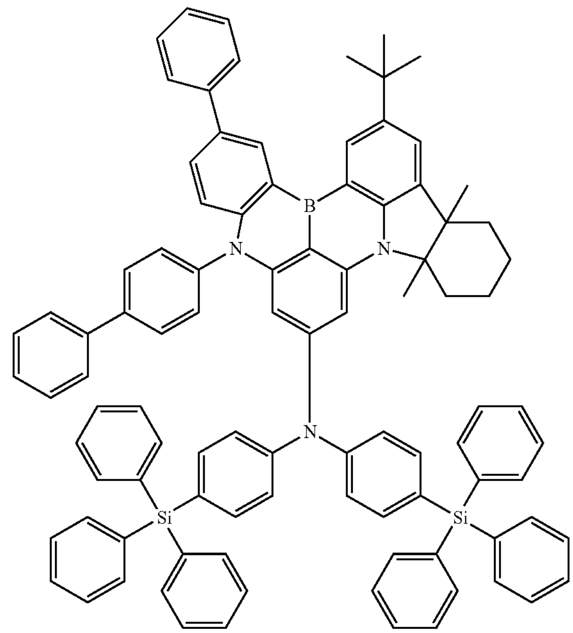
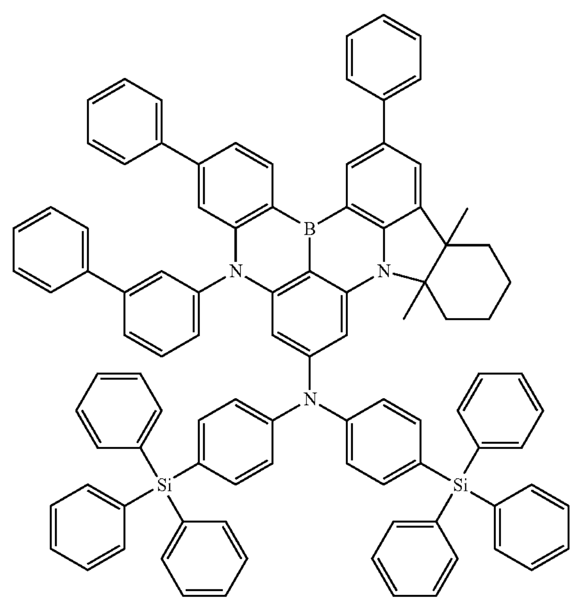

-continued
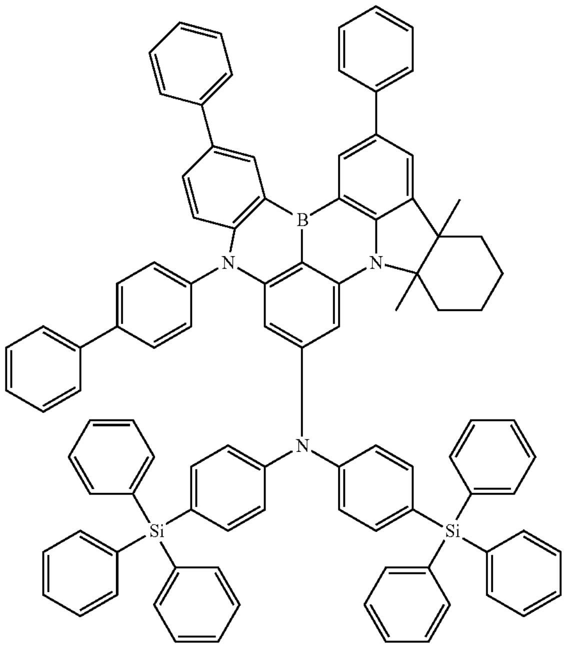
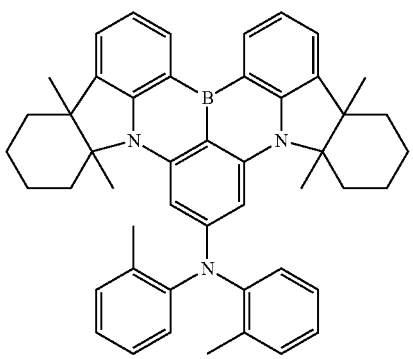
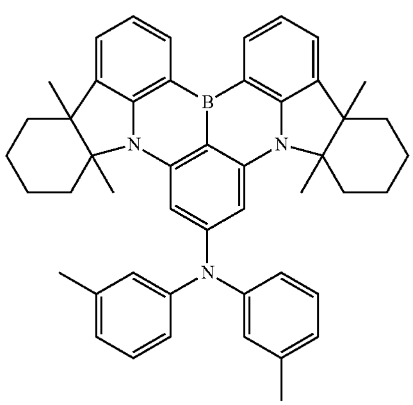
-continued
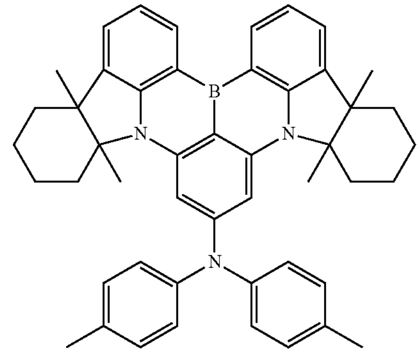
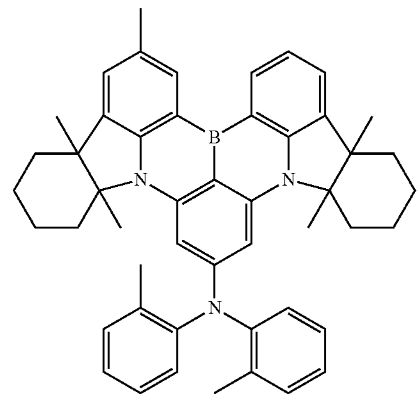
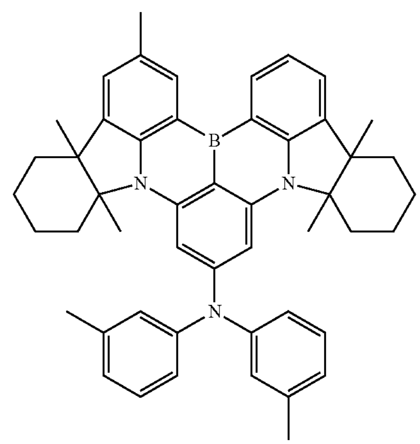
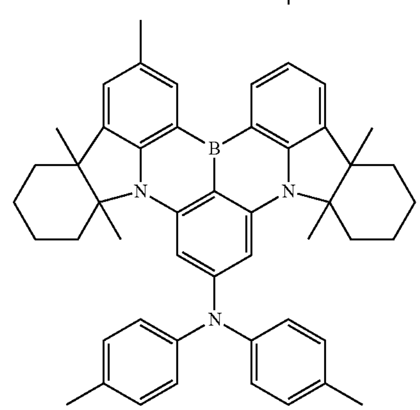

-continued
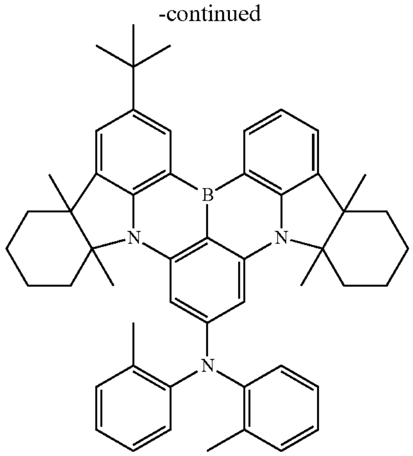
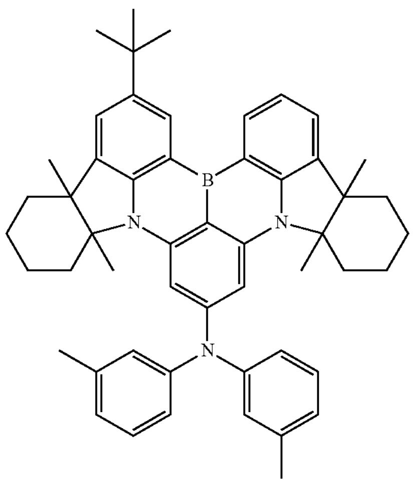
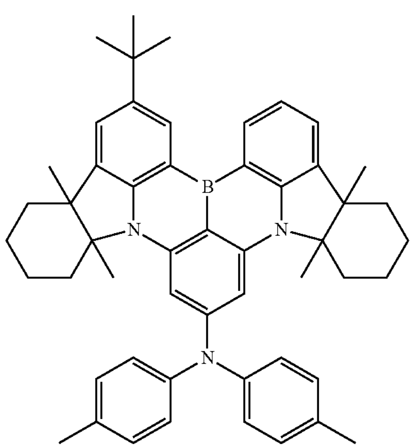
-continued
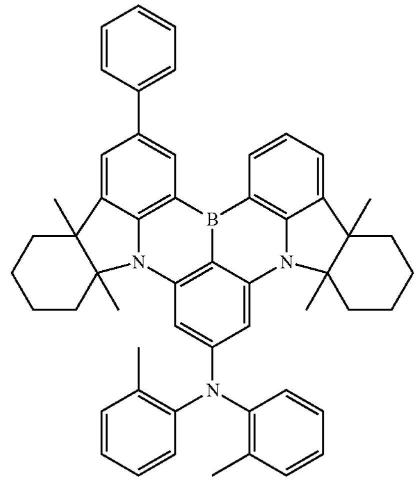
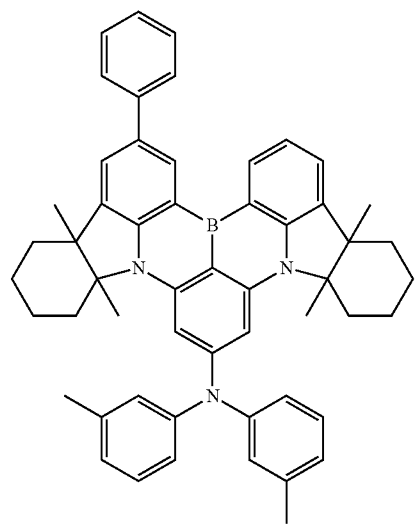
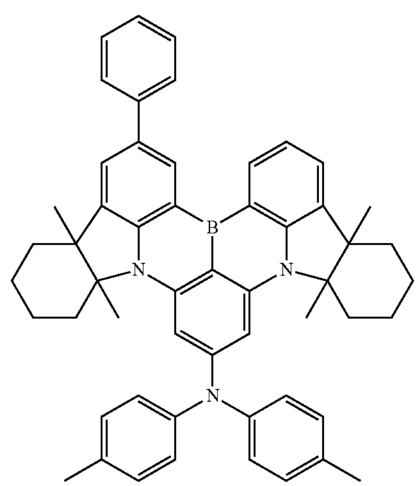

-continued
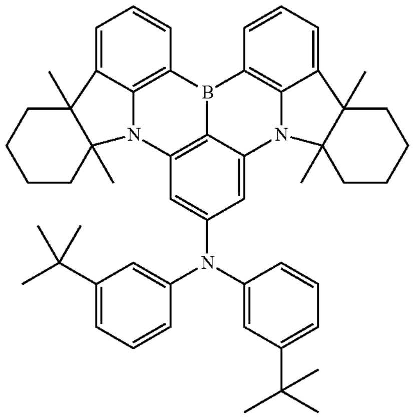
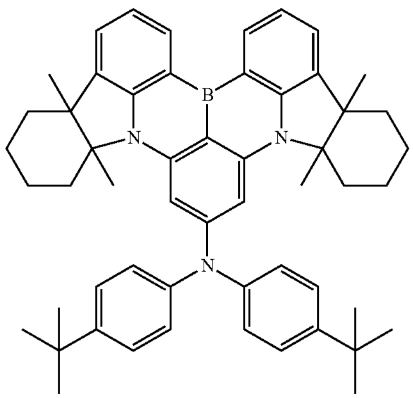
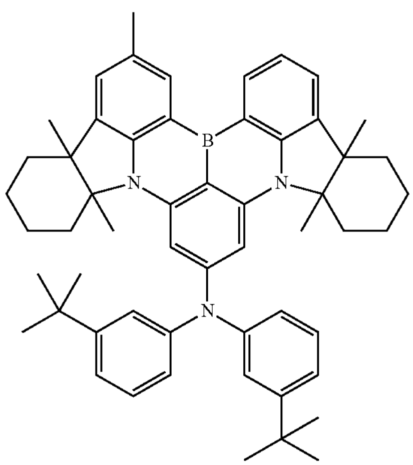
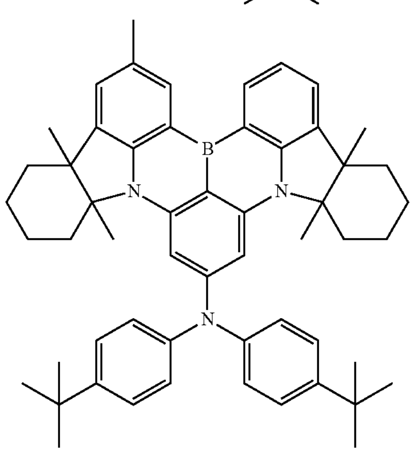
-continued
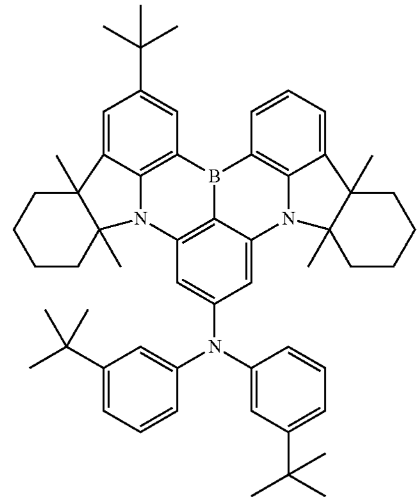
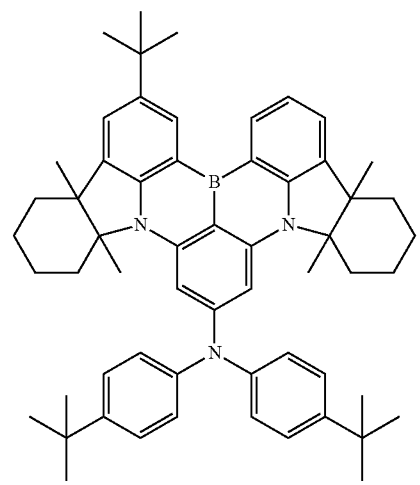
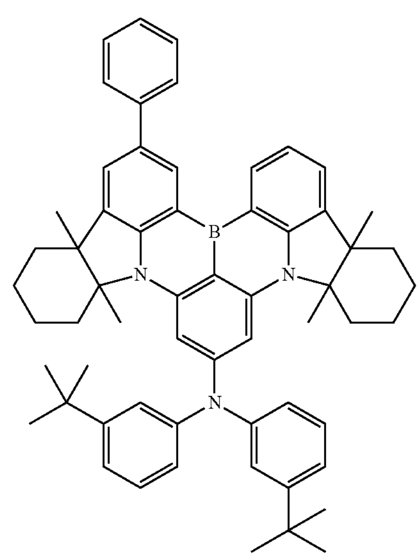

-continued
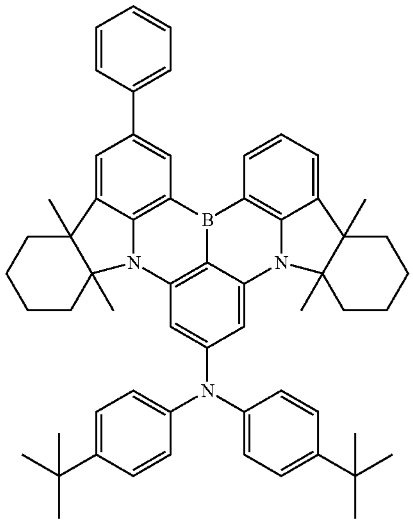 [SMILES: CC(C)(C)c1ccc(N(c2ccc(C(C)(C)C)cc2)c2cc3c4c(c2)N2c5c(cc(-c6ccccc6)cc5C5(C)CCCCC25C)B4c2cccc4c2N3C2(C)CCCCC42C)cc1]
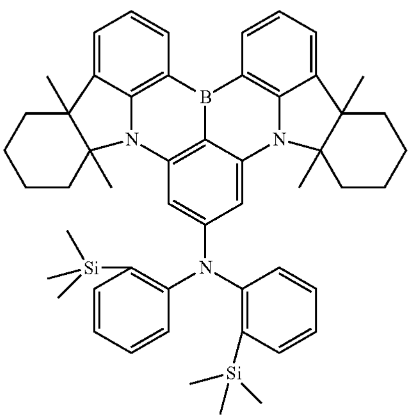
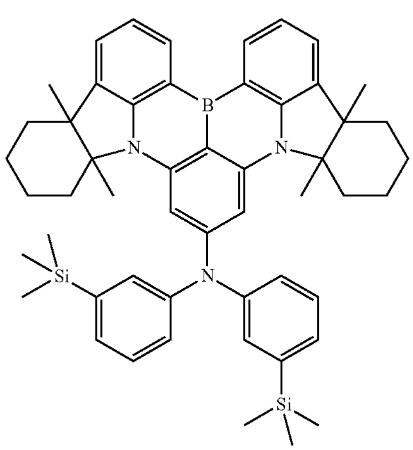
-continued
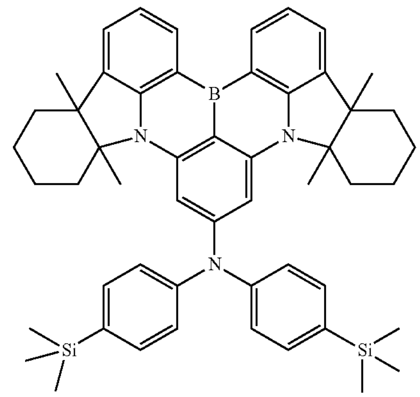
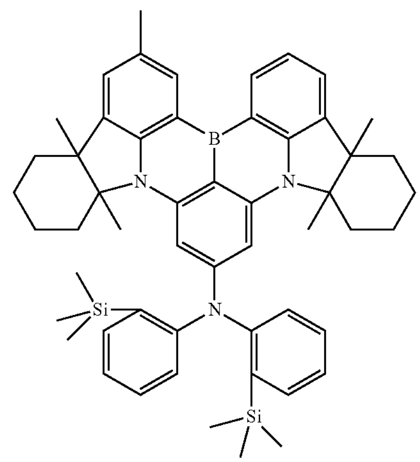
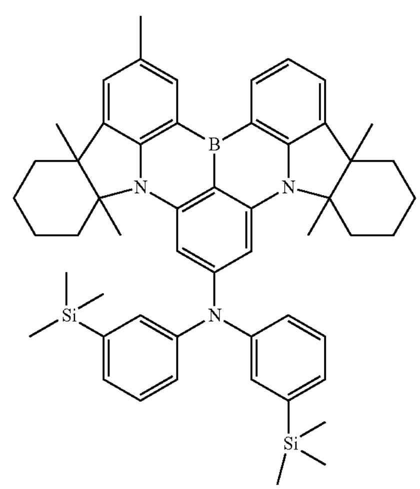

-continued
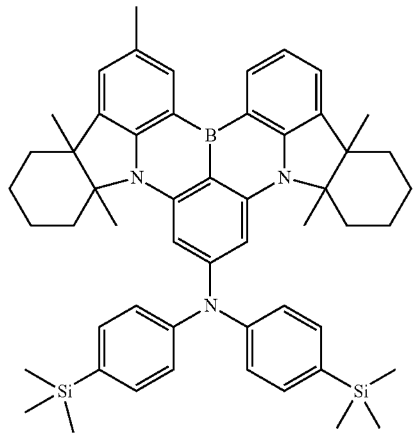
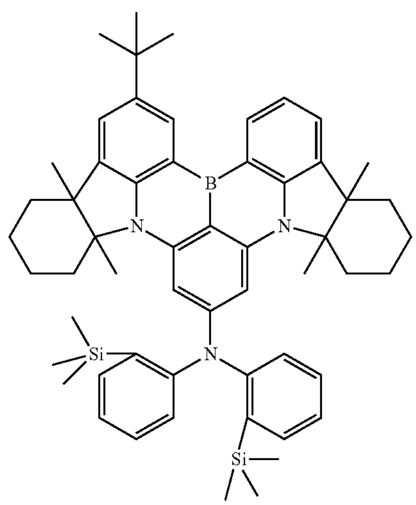
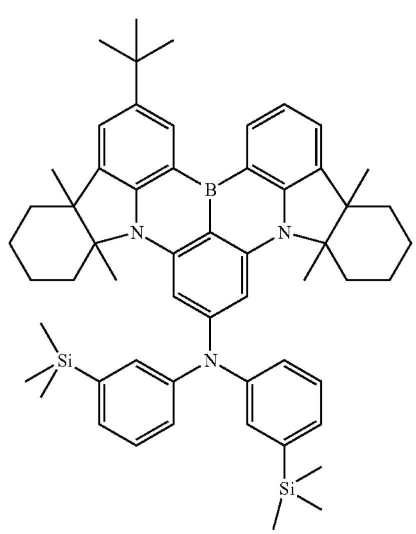
-continued
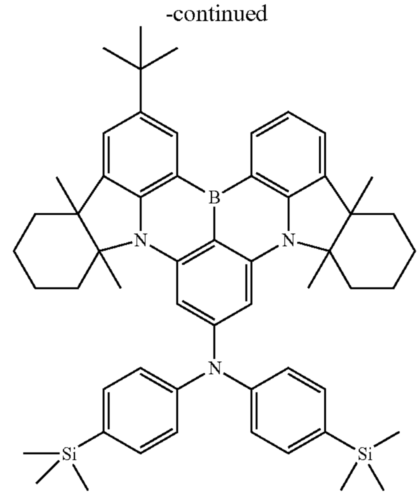
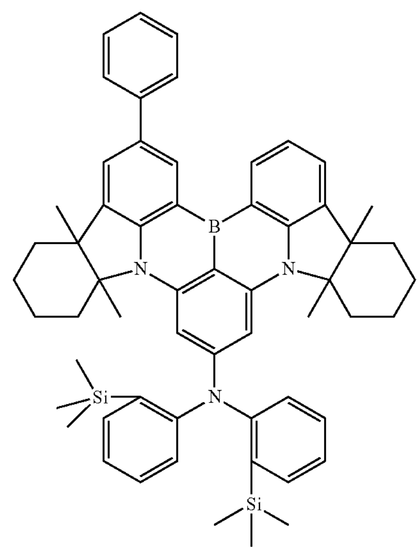
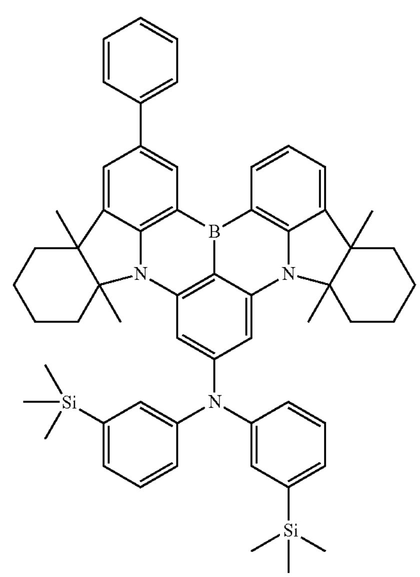

-continued
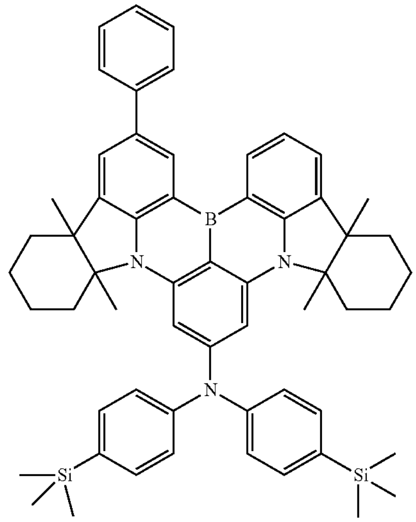
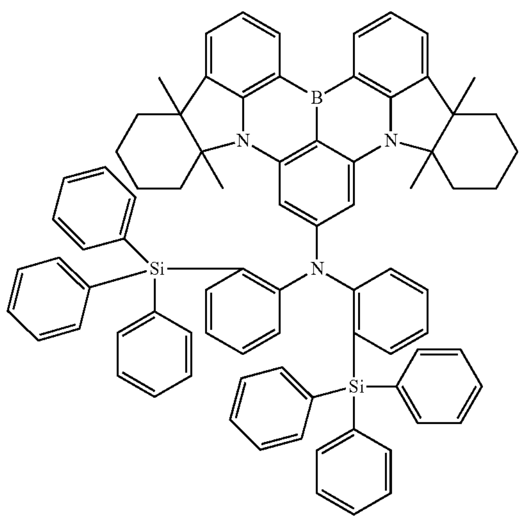
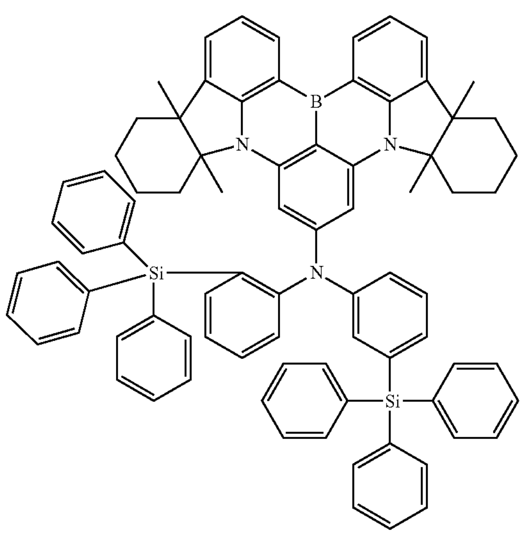
-continued
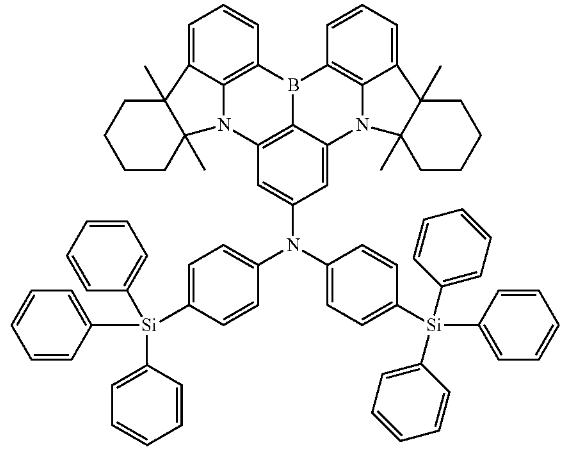
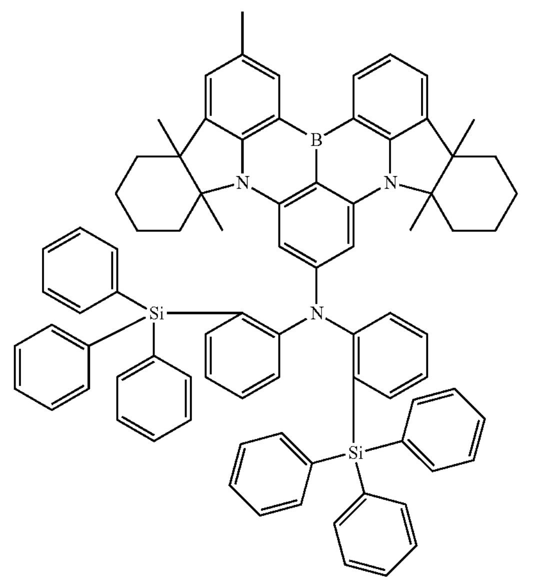
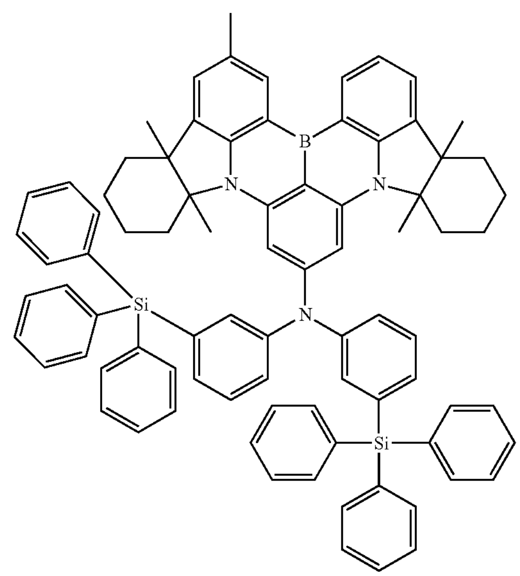

-continued
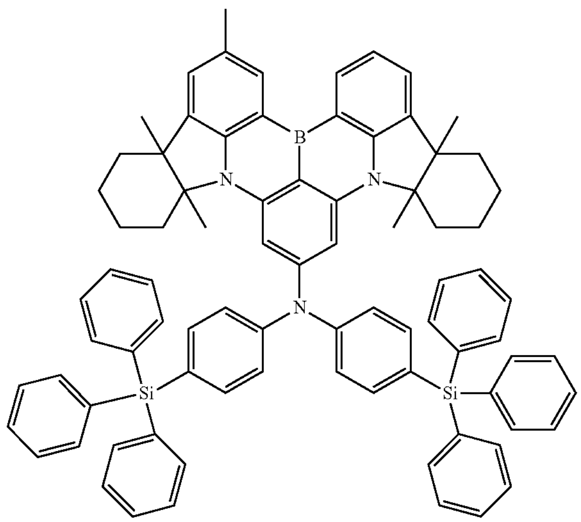
-continued
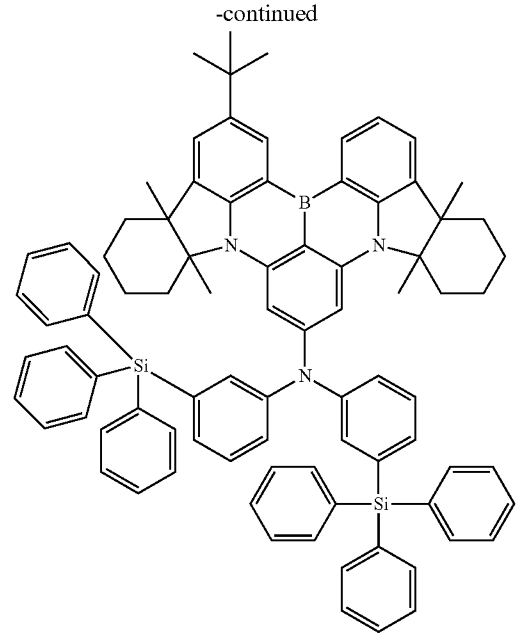
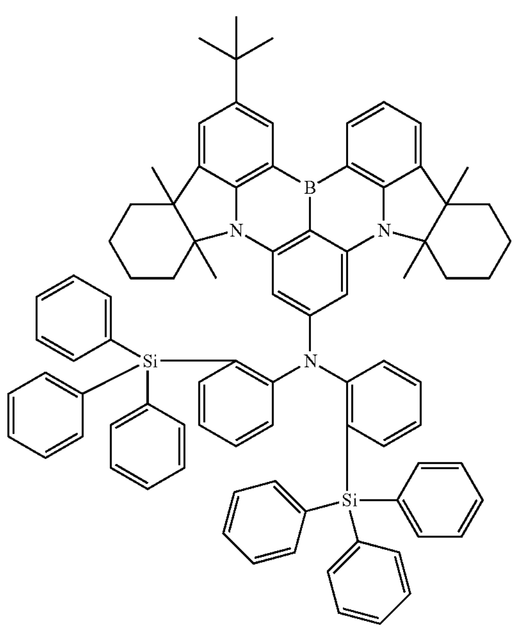
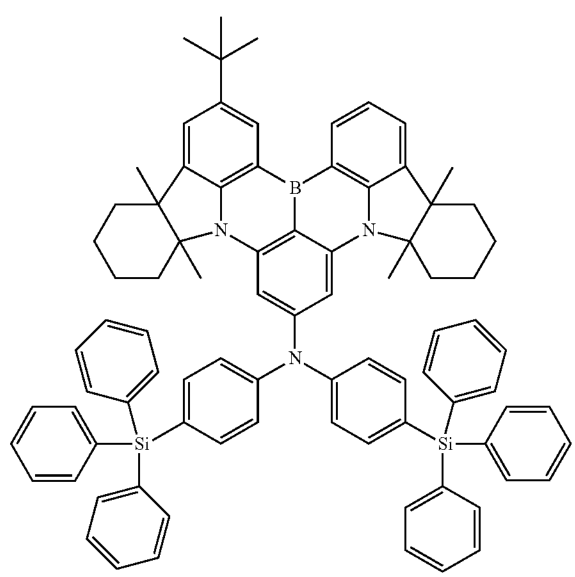

-continued
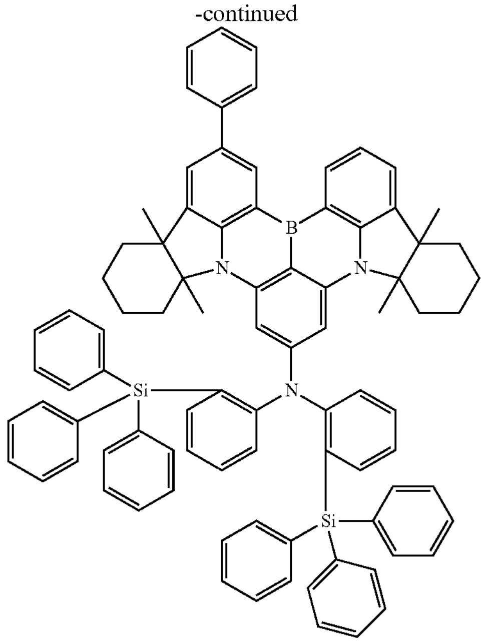
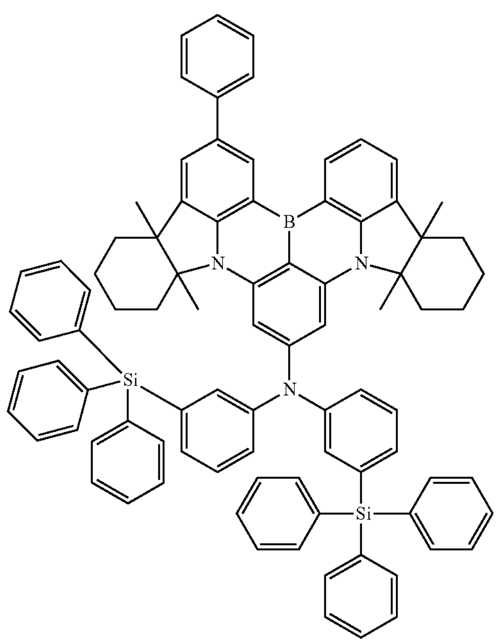
-continued
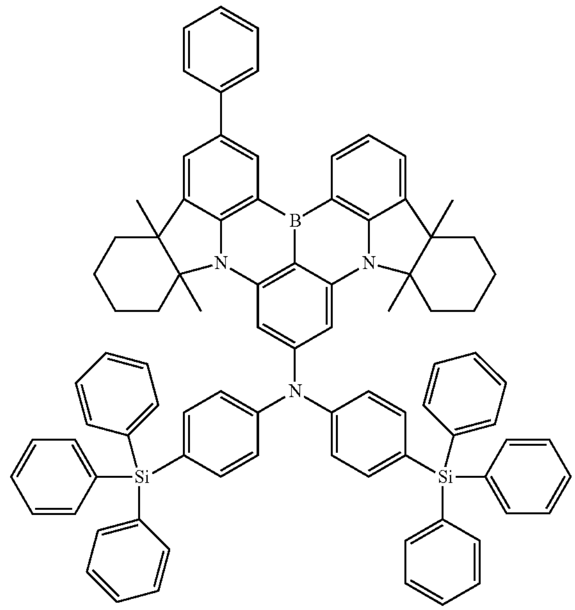
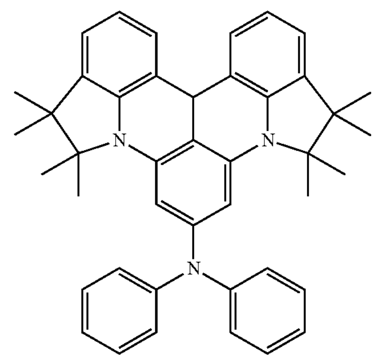
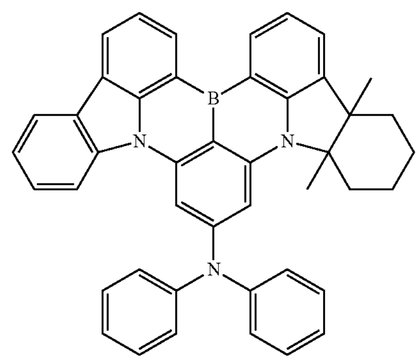
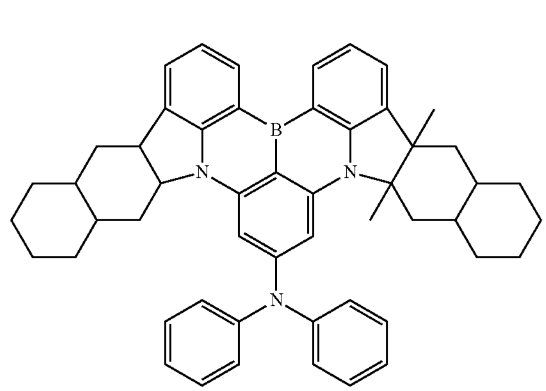

-continued
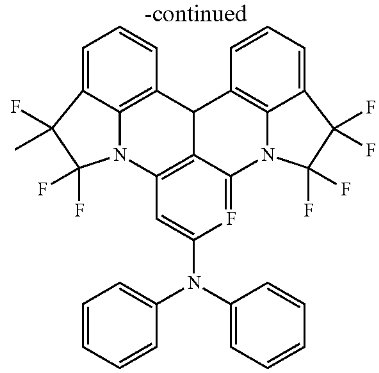
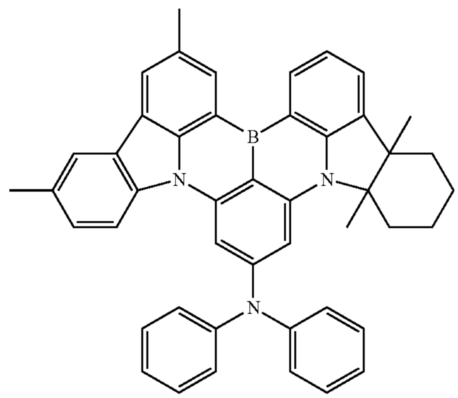
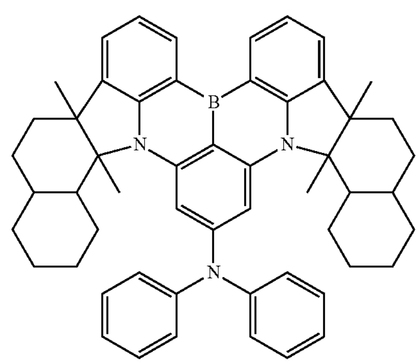
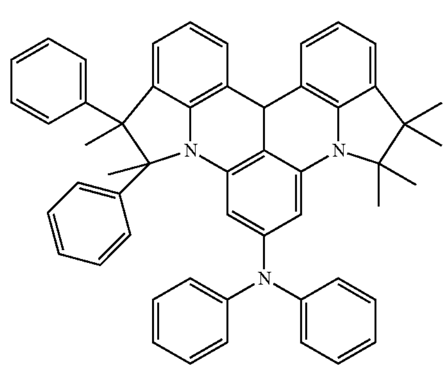
-continued
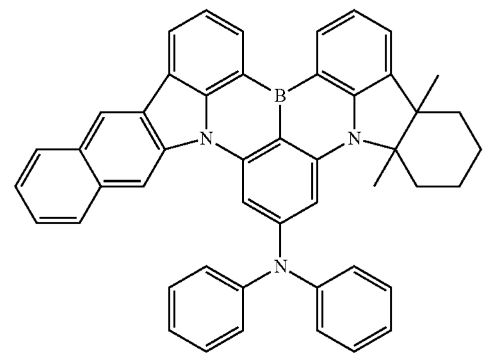
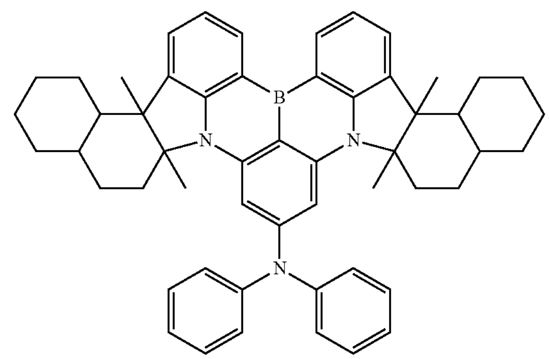
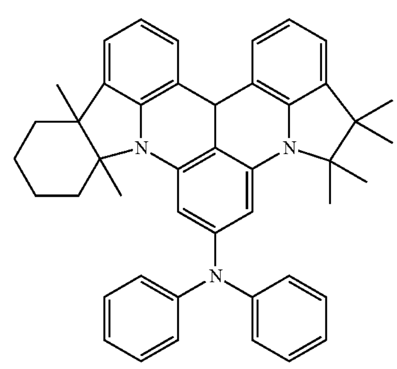
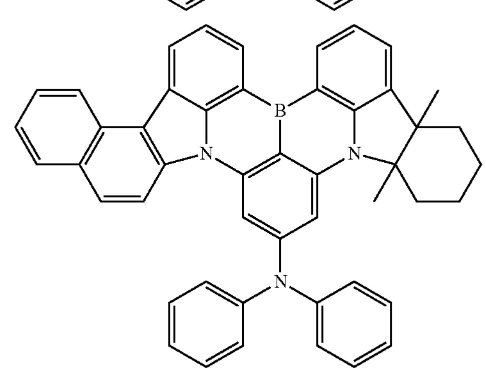

-continued
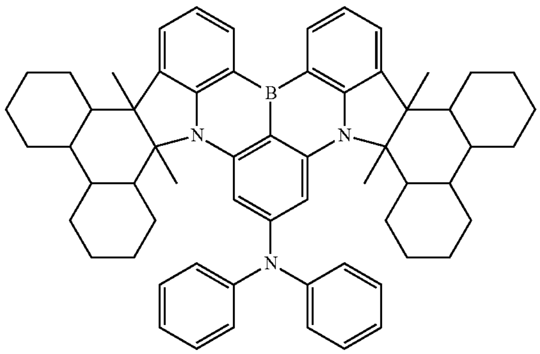
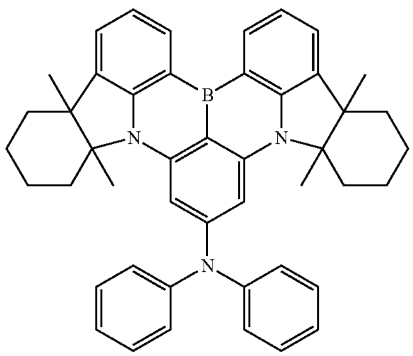
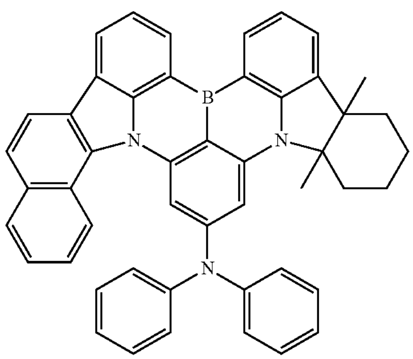
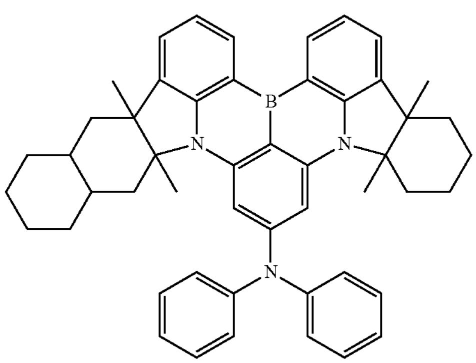
-continued
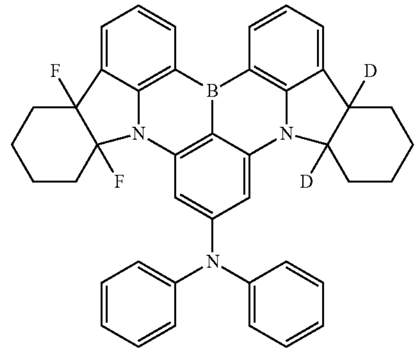
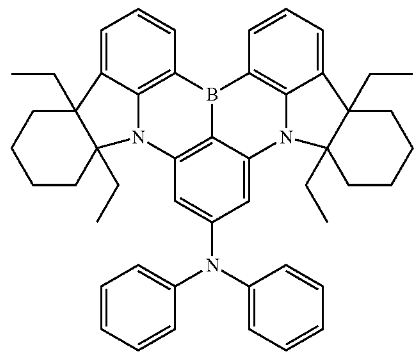
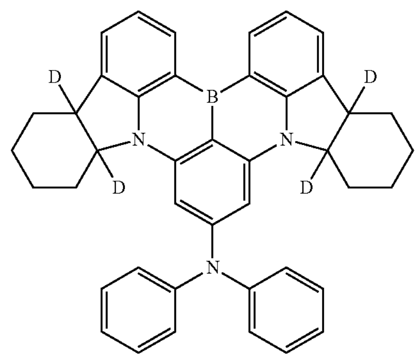
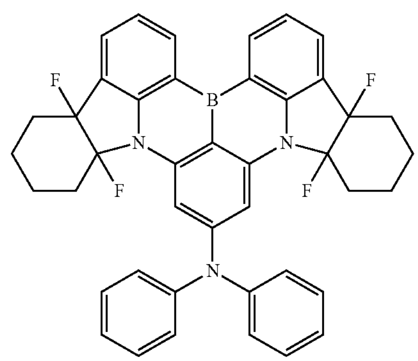

-continued
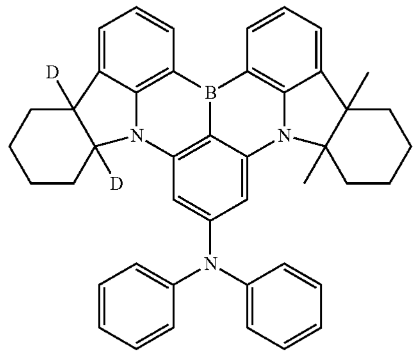
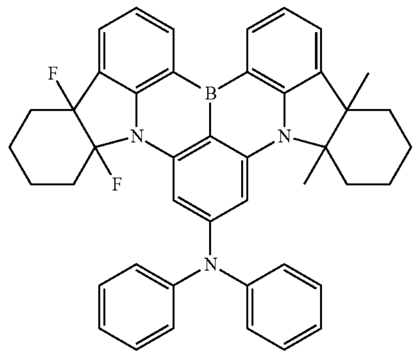 [SMILES: CC12CCCCC1(C)N1c3cc(N(c4ccccc4)c4ccccc4)cc4c3B(c3cccc2c31)c1cccc2c1N4C1(F)CCCCC21F]
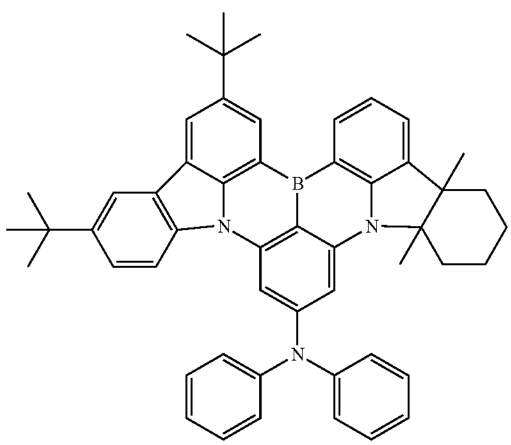
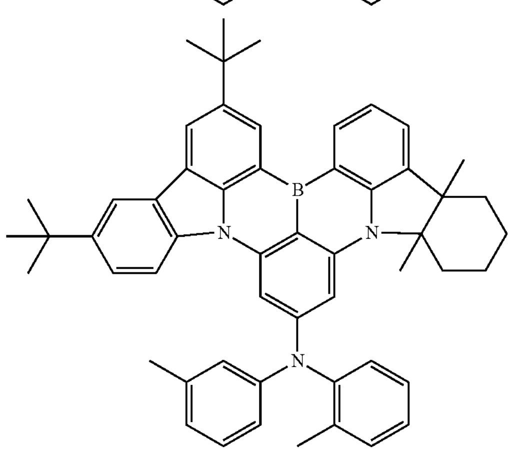
-continued
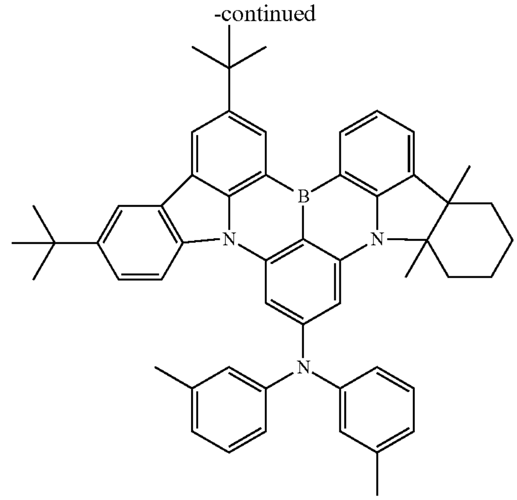
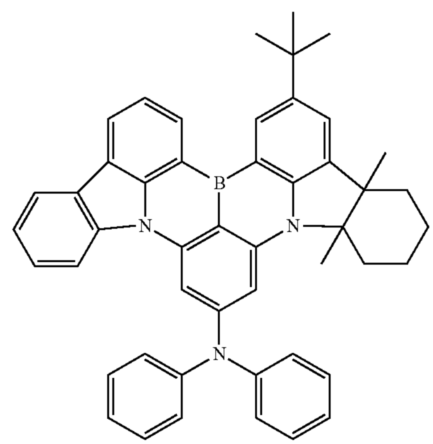
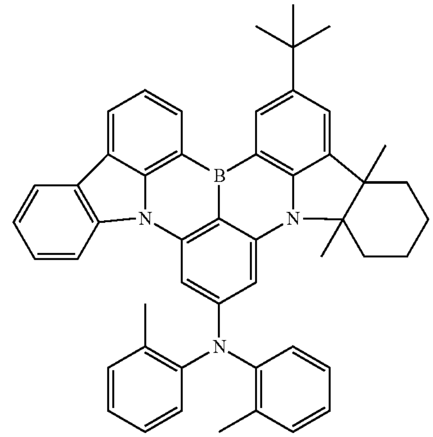

-continued
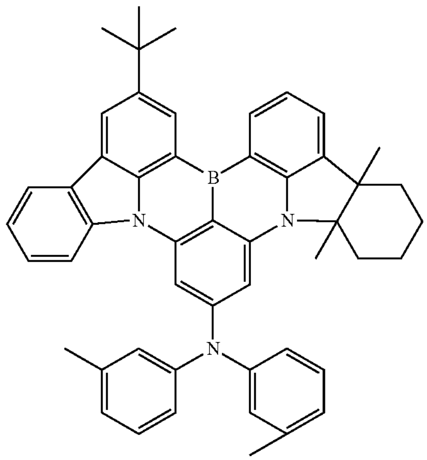
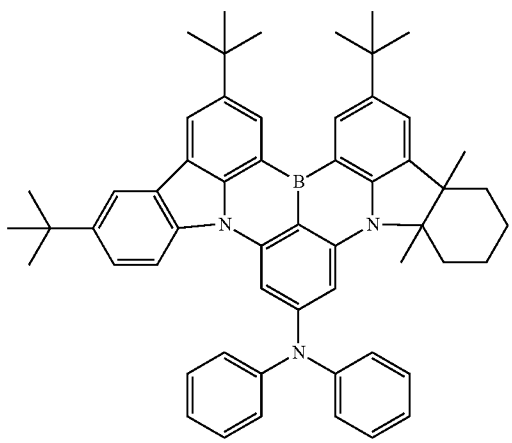
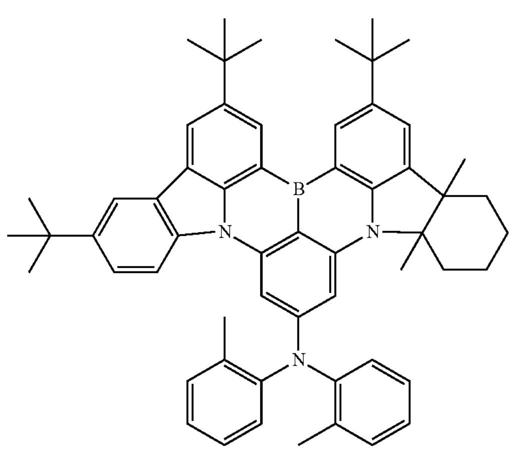
-continued
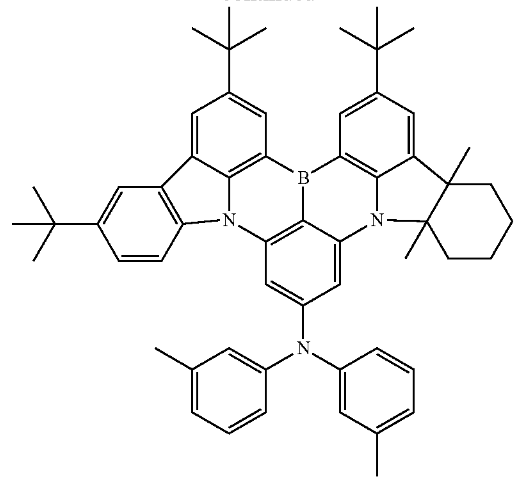
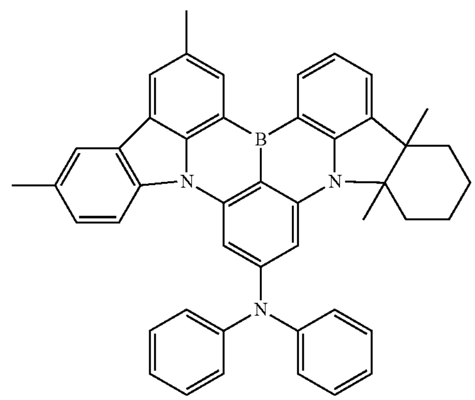
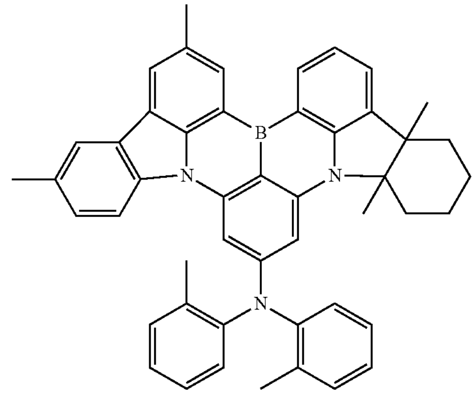
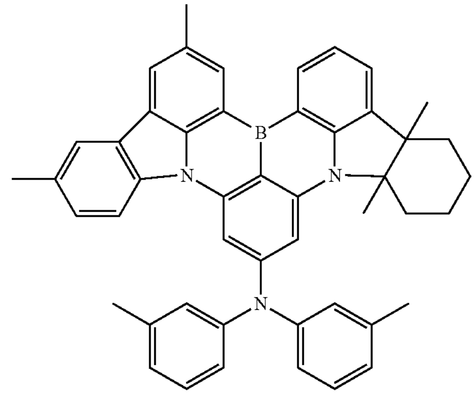

-continued
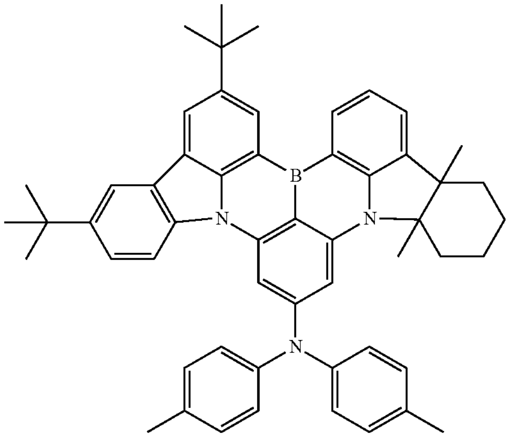
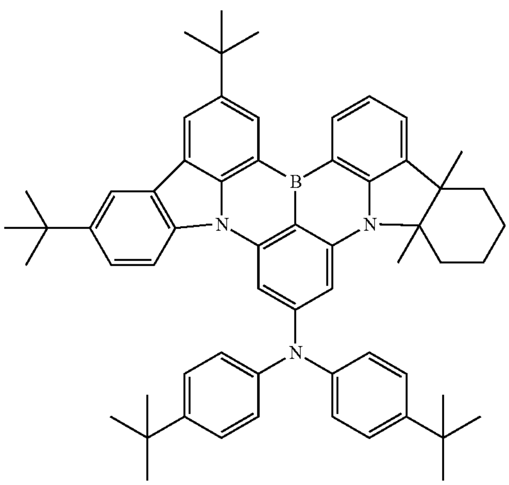
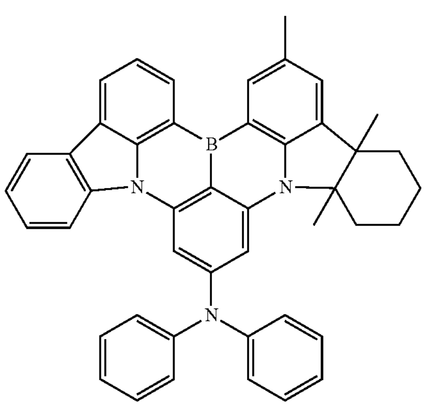
-continued
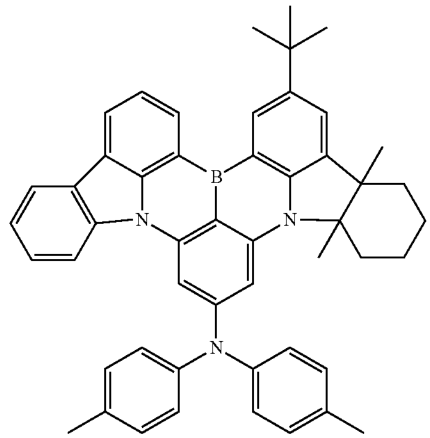
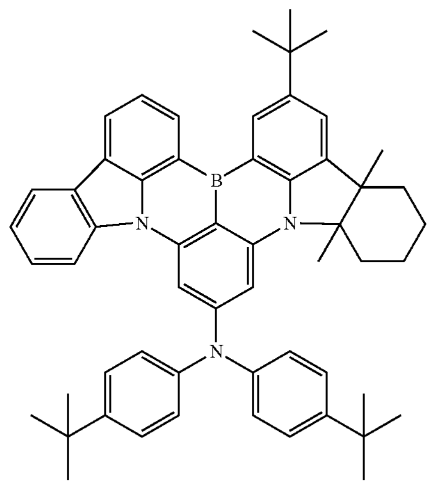
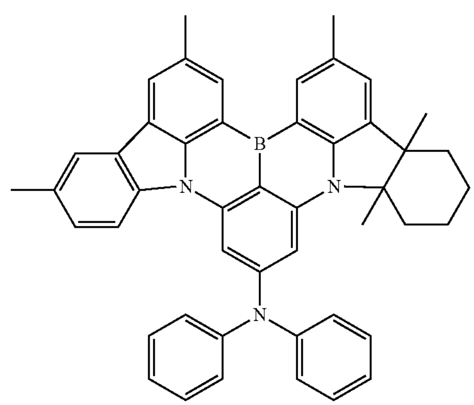

-continued
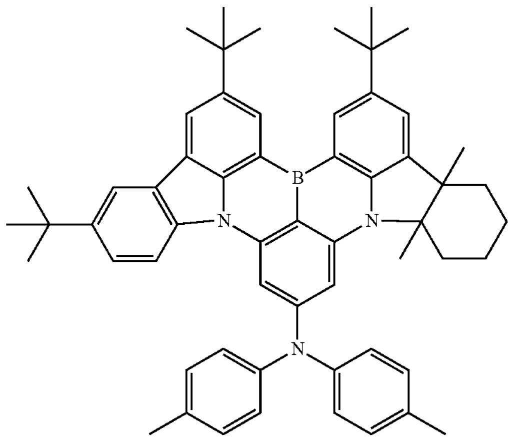
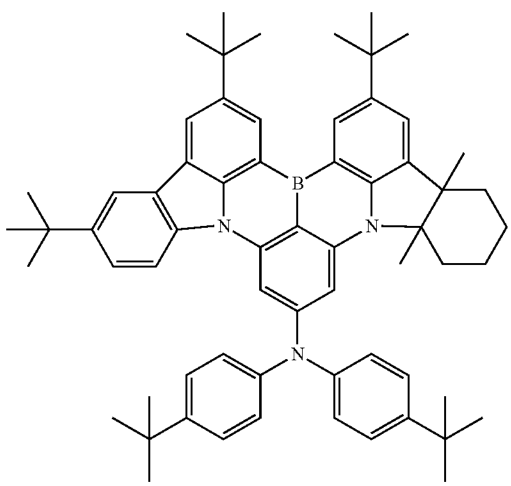
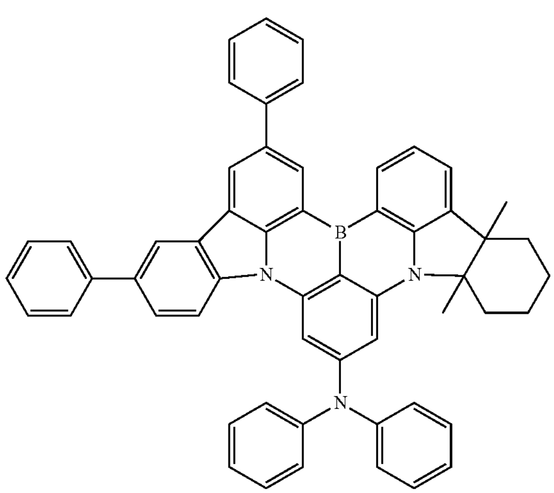
-continued
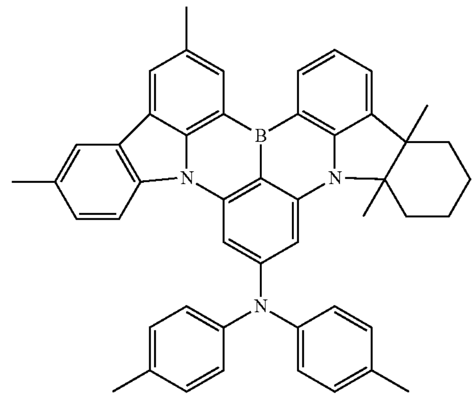
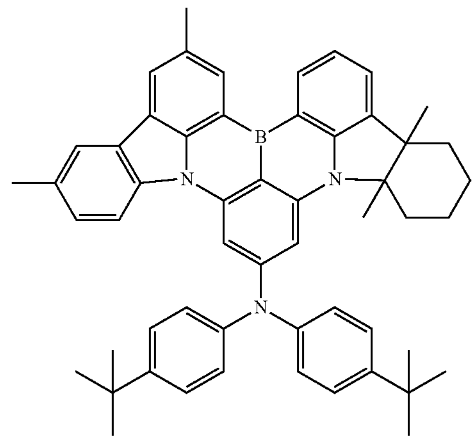
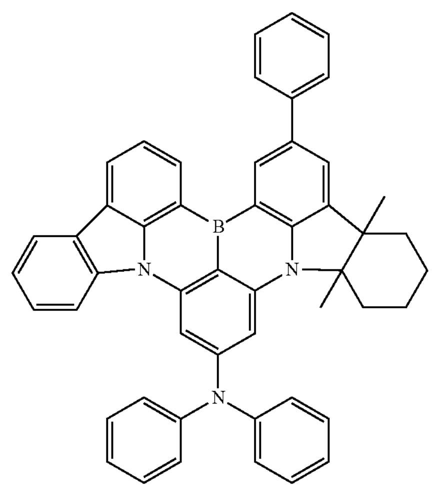
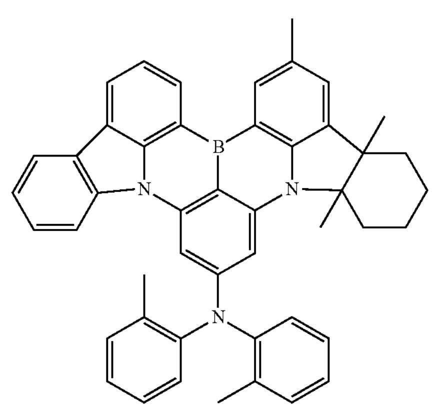

-continued
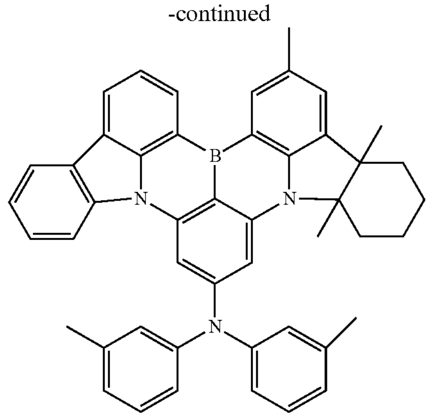
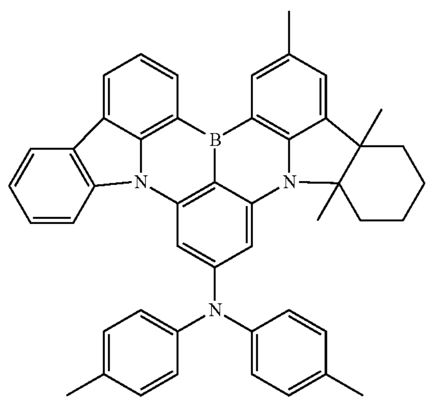
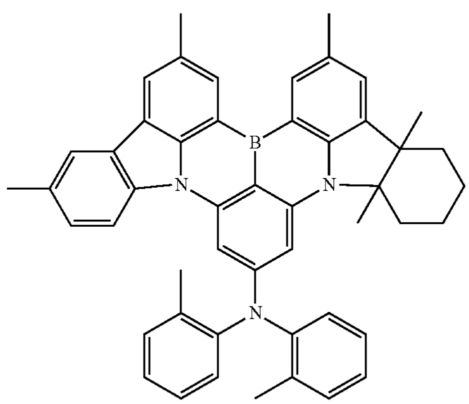
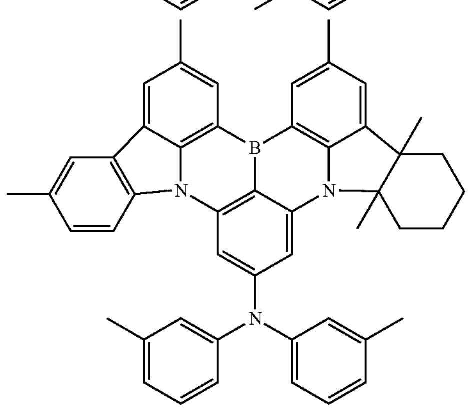
-continued
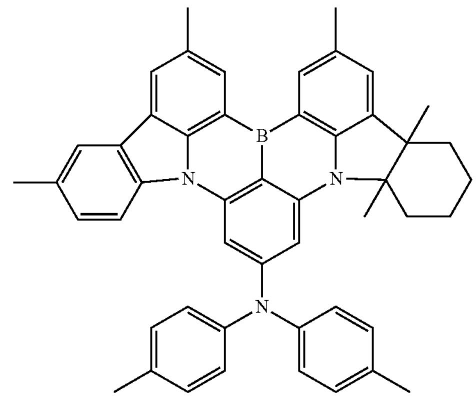
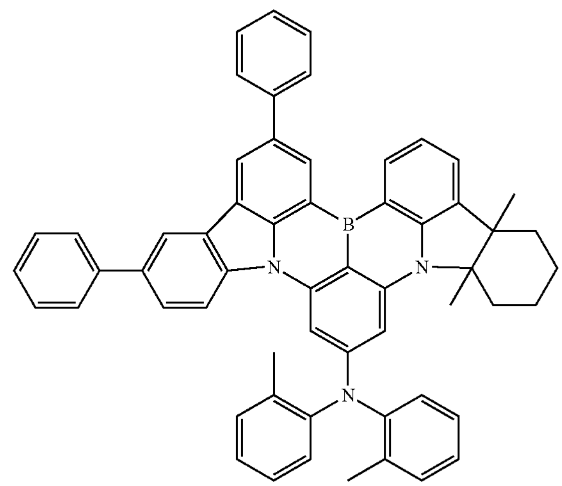
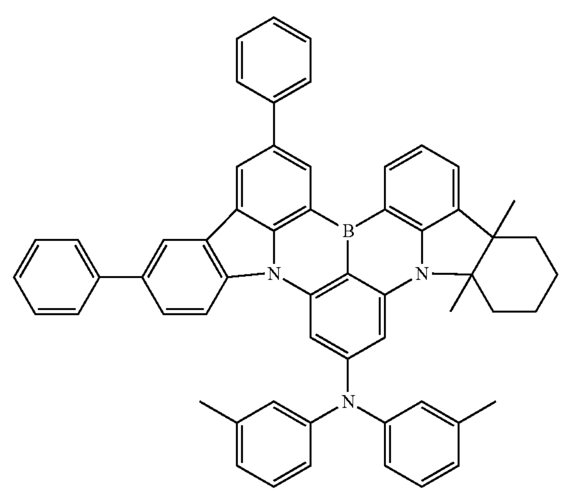

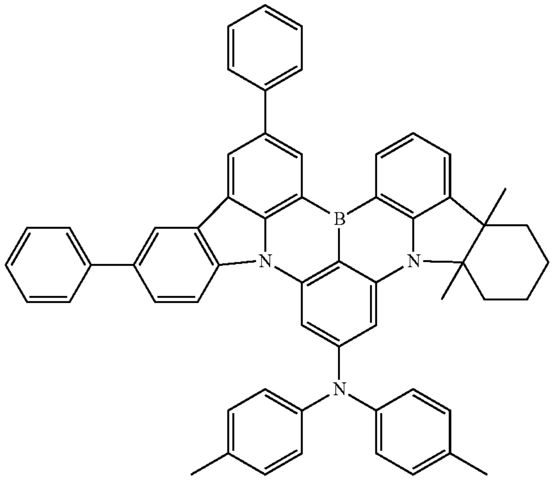
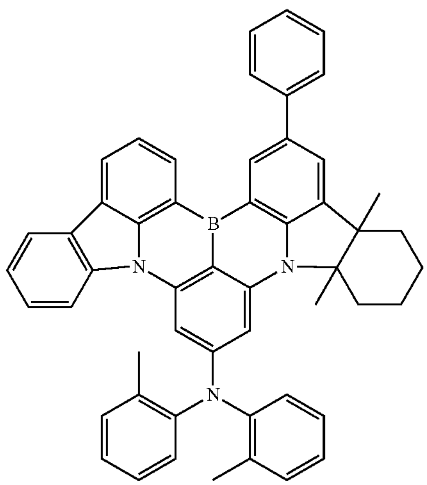
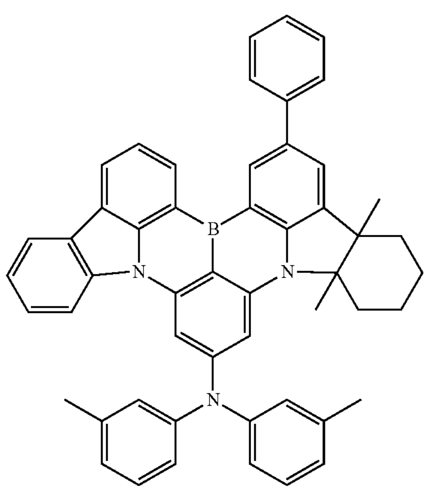
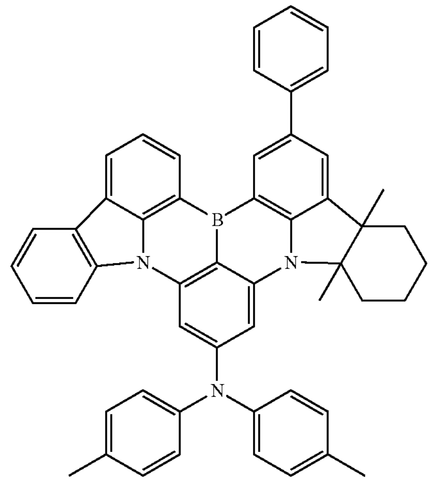
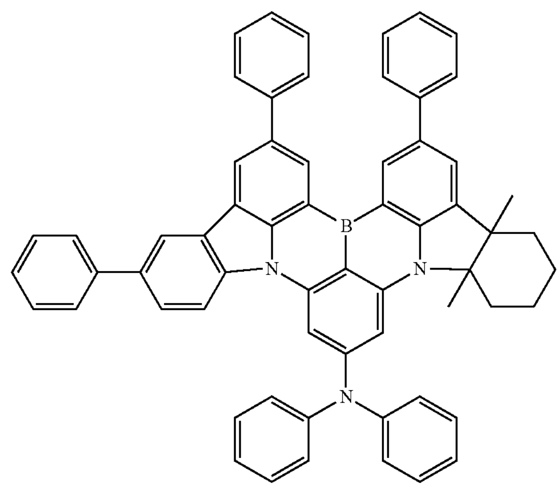
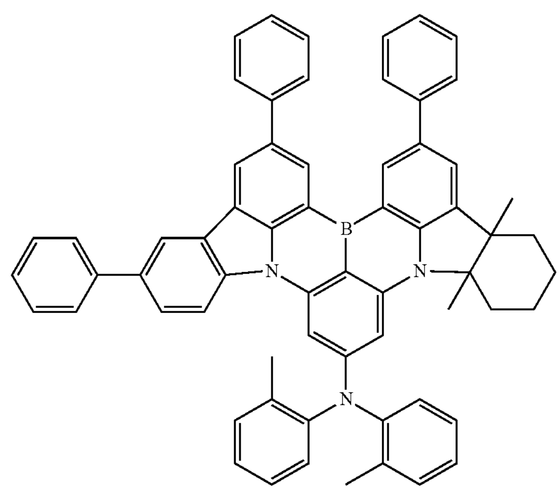

-continued
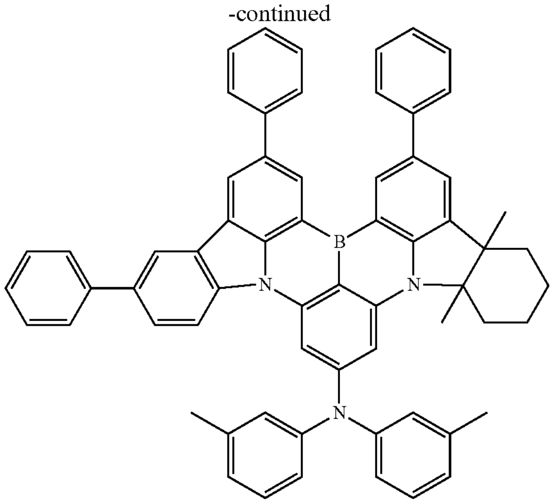
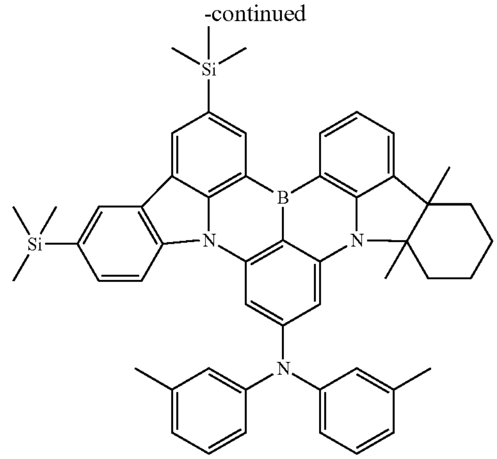
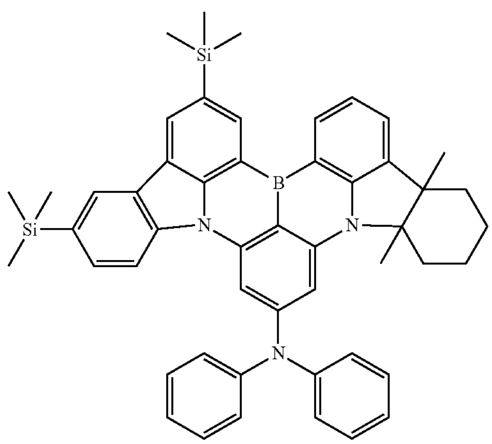
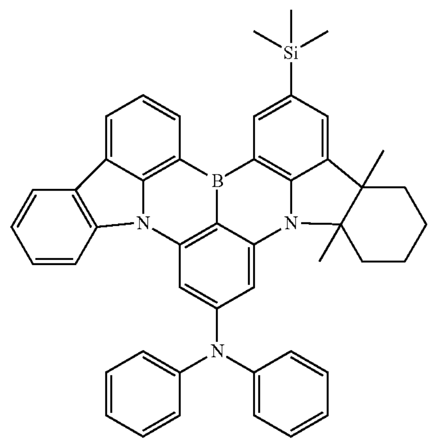
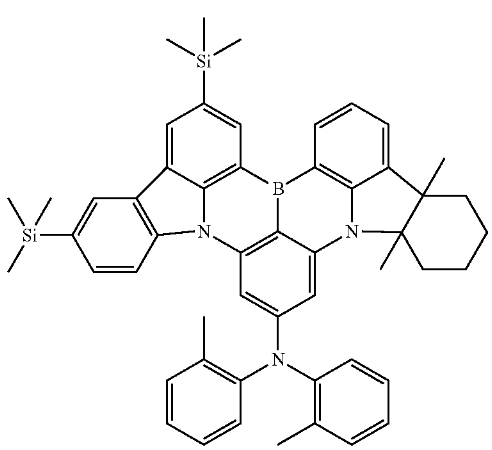
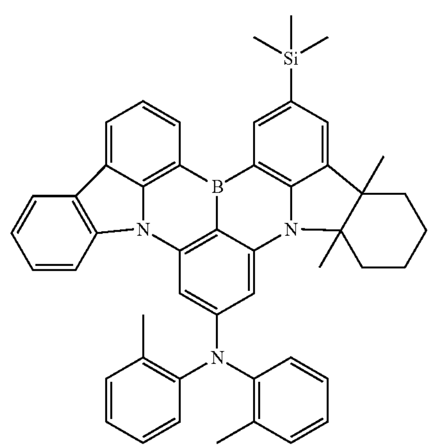

-continued
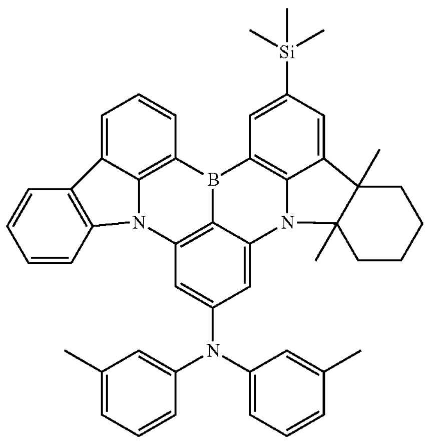
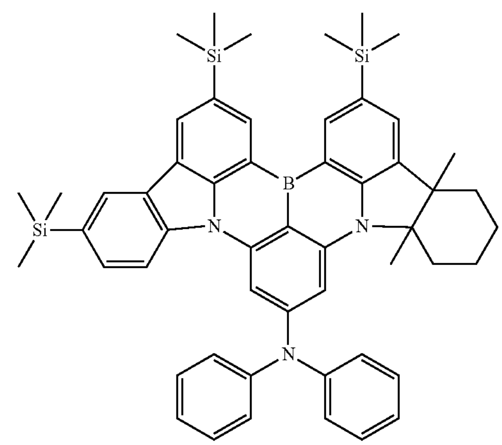
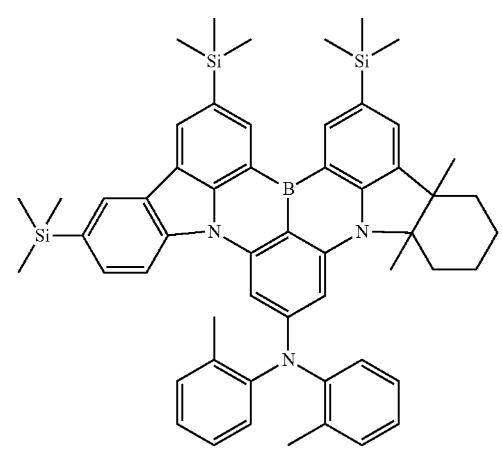
-continued
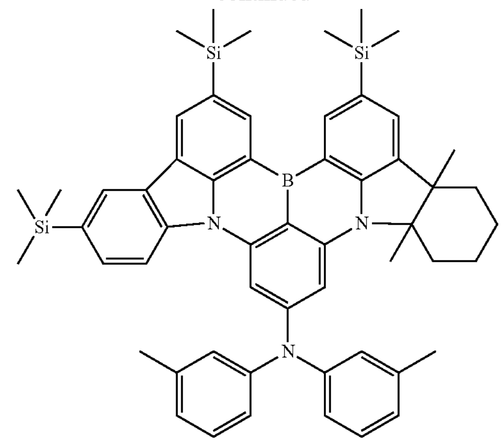
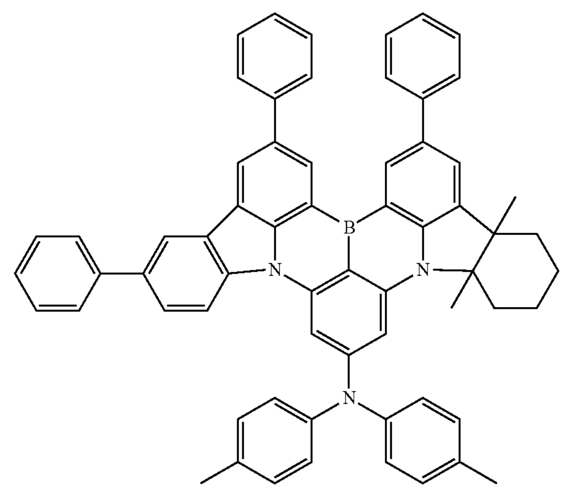
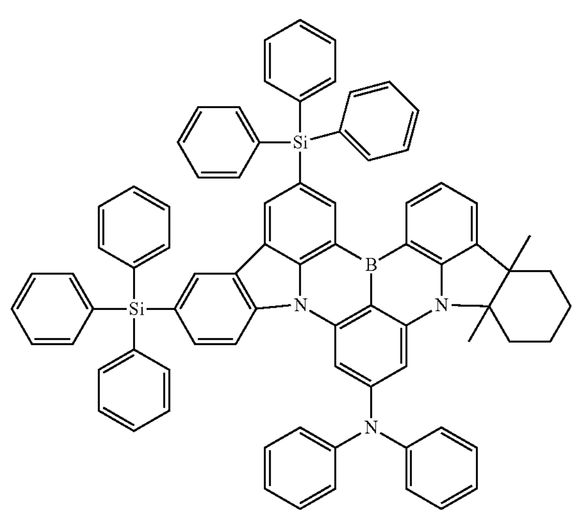

-continued
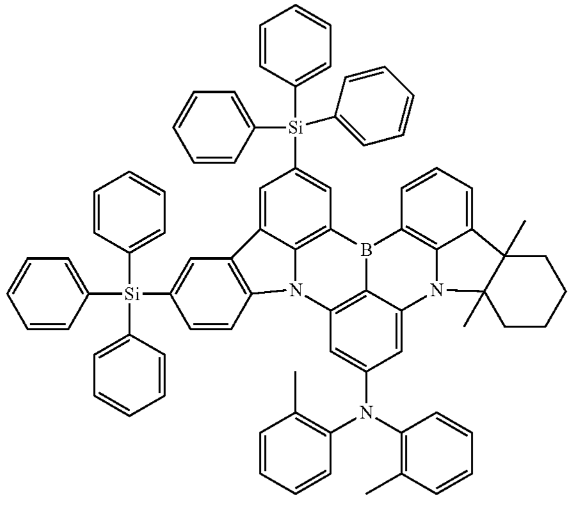
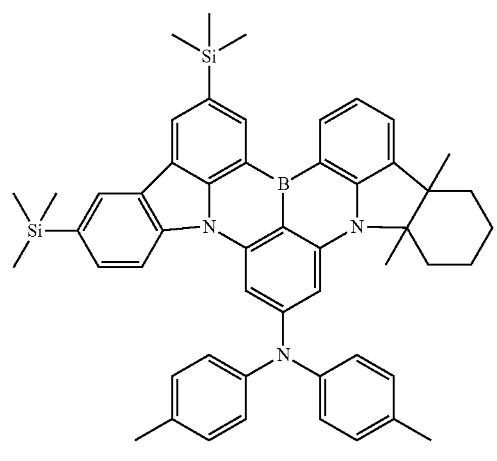
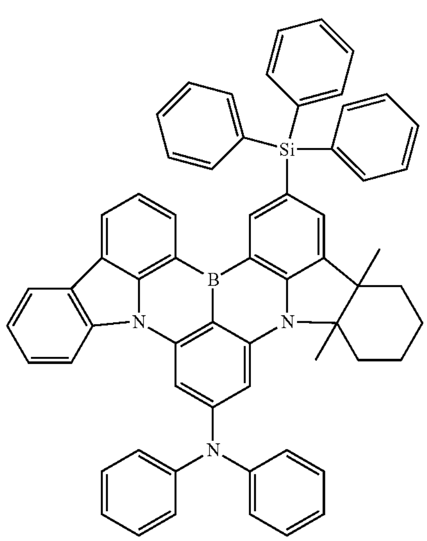
-continued
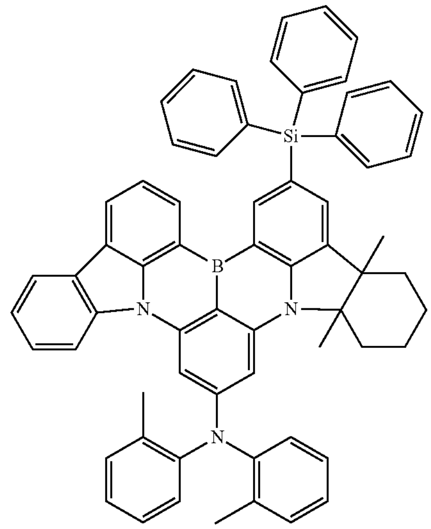
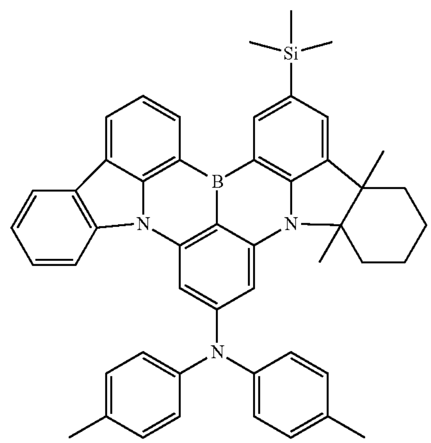
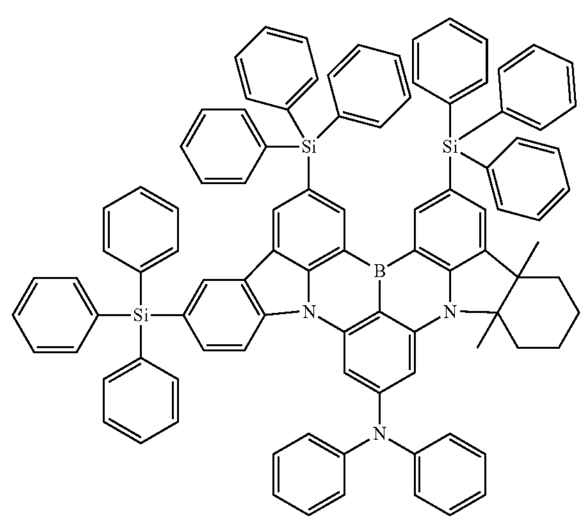

-continued
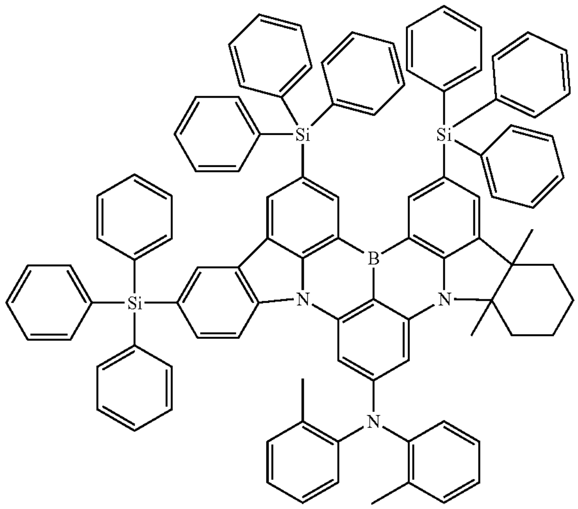
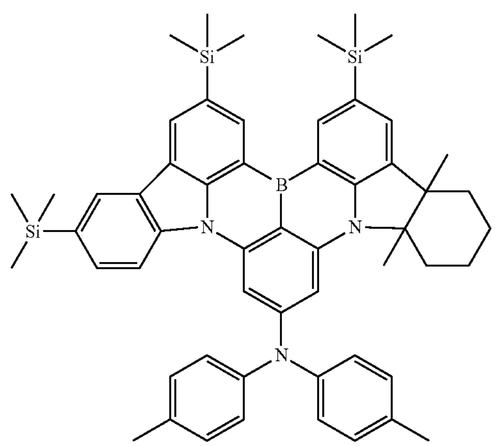
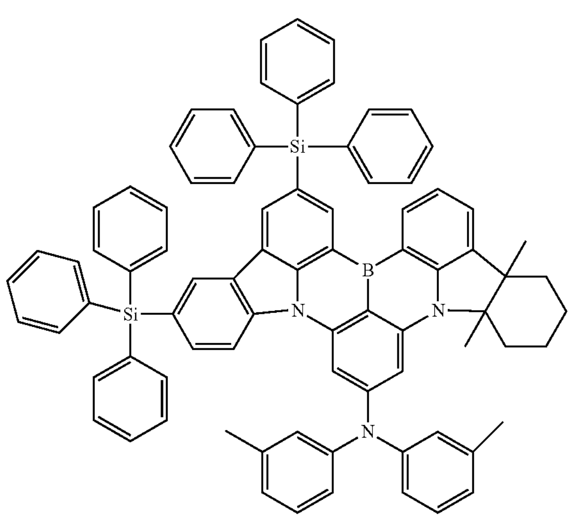
-continued
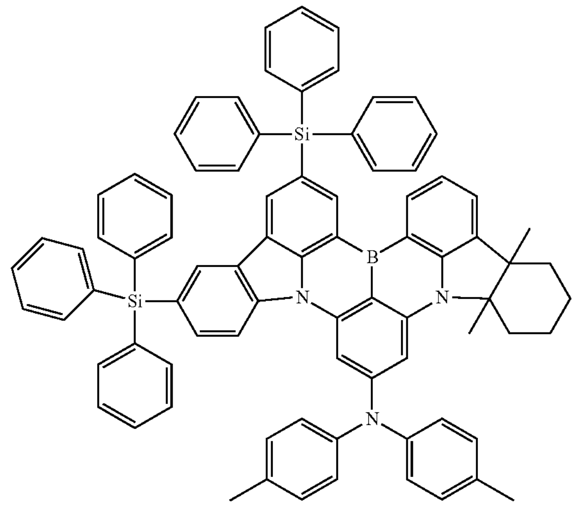
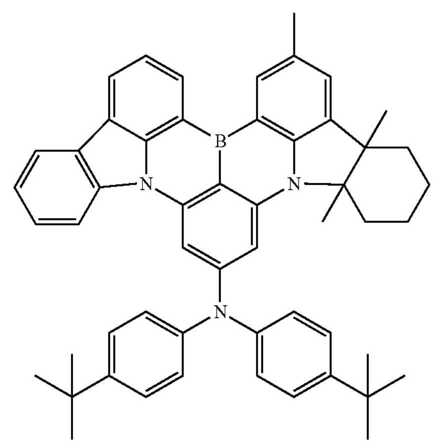
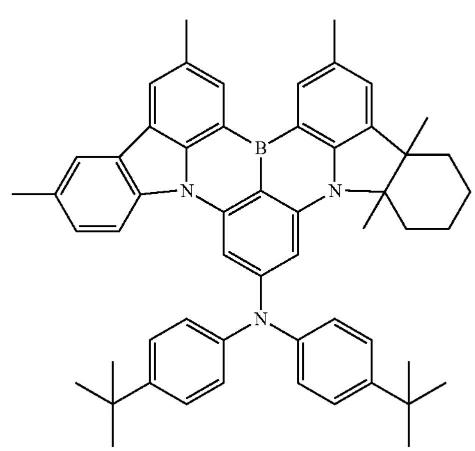

-continued
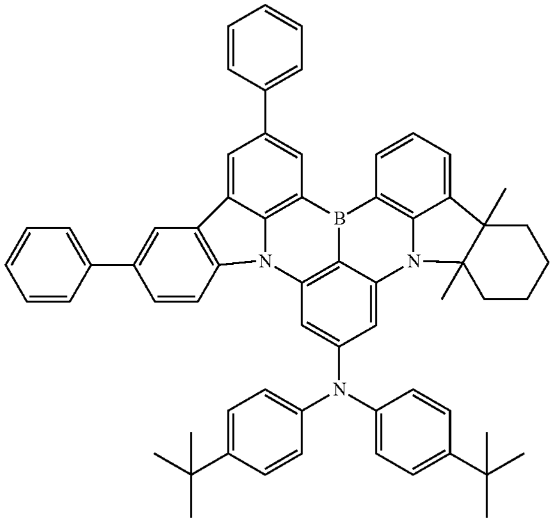
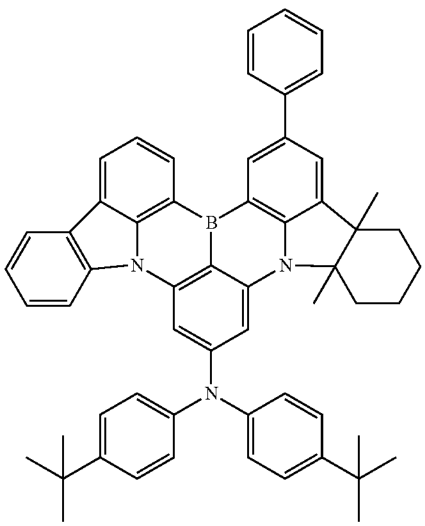
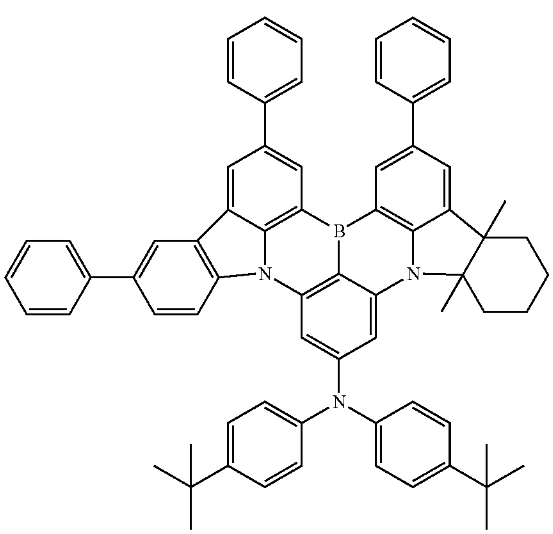
-continued
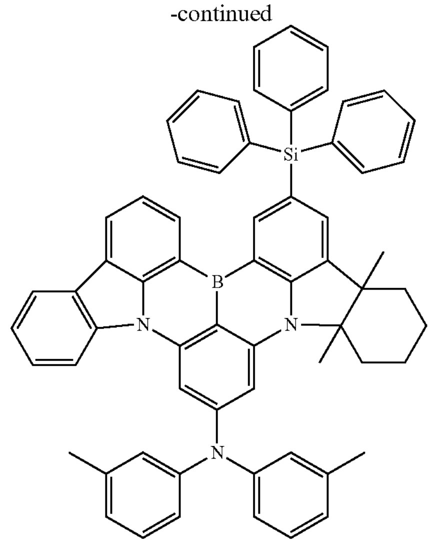
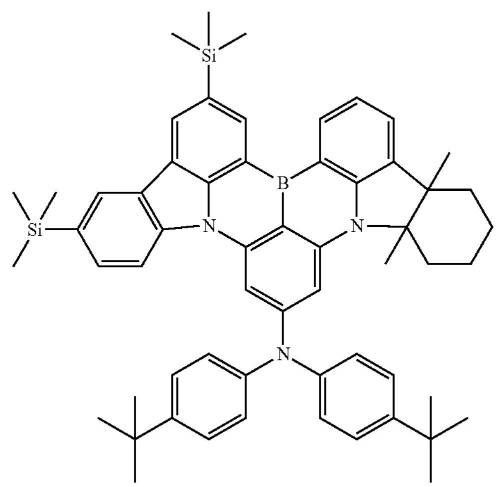
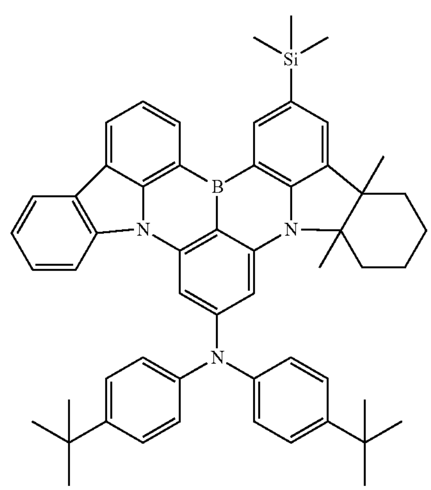

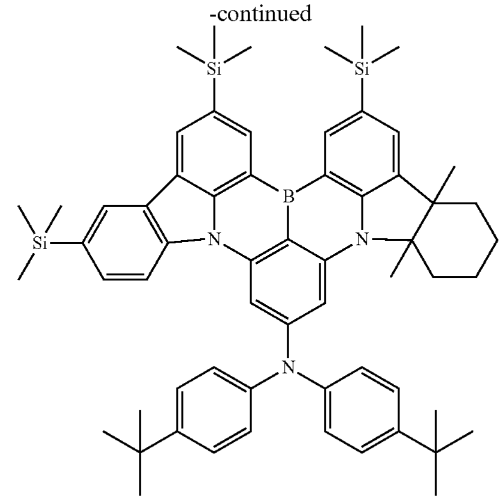
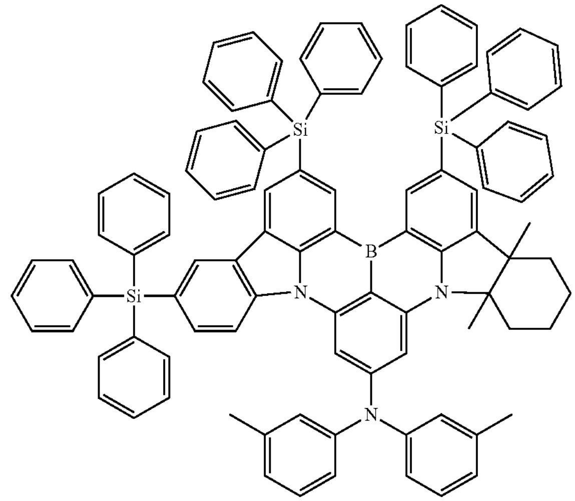
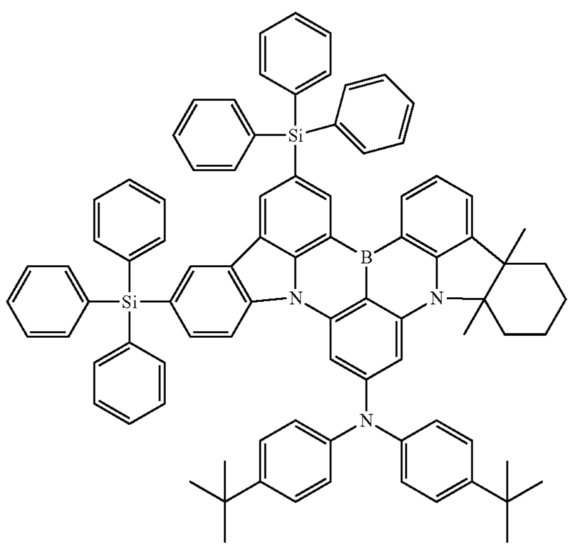
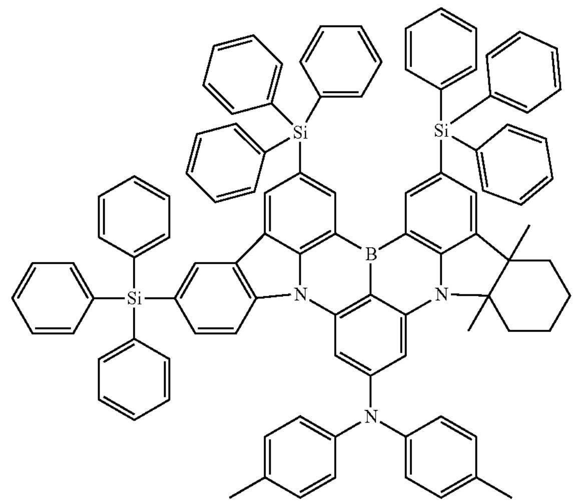
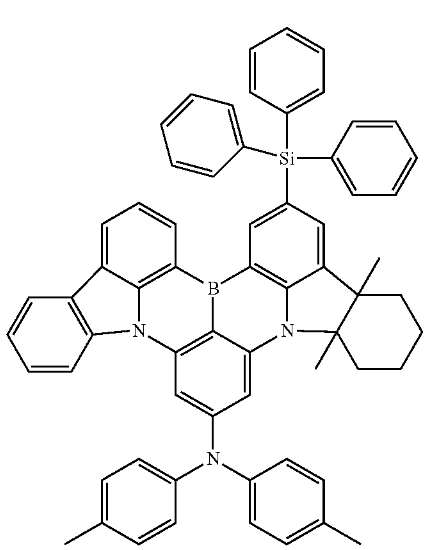
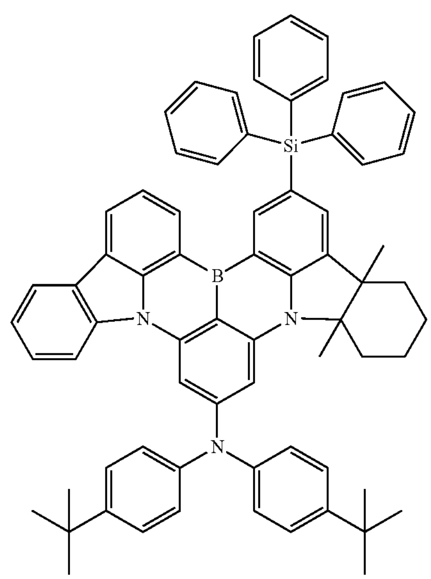

-continued
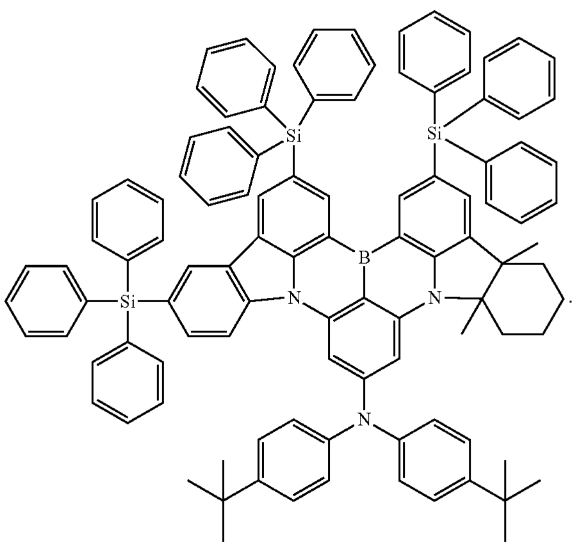
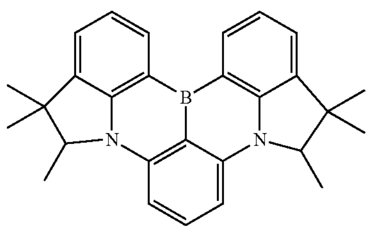
9. A compound that is any one of the following compounds:
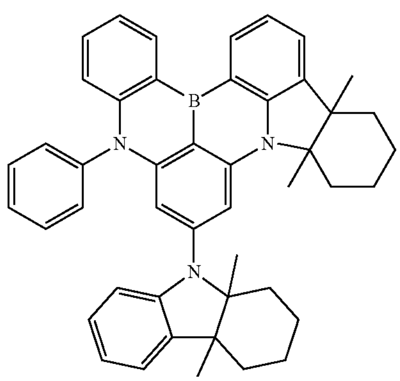
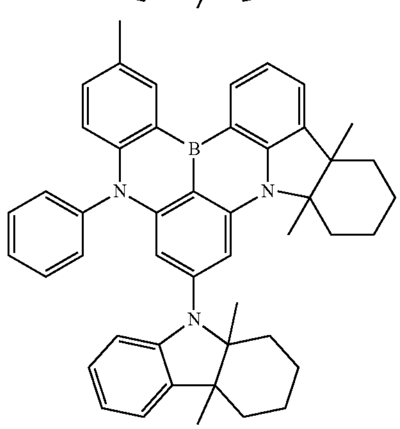
-continued
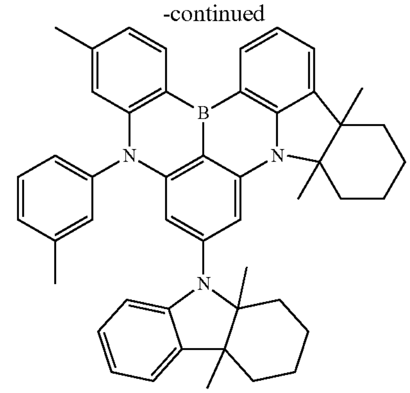
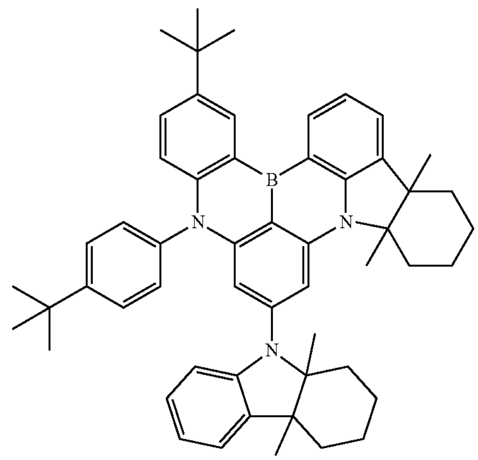
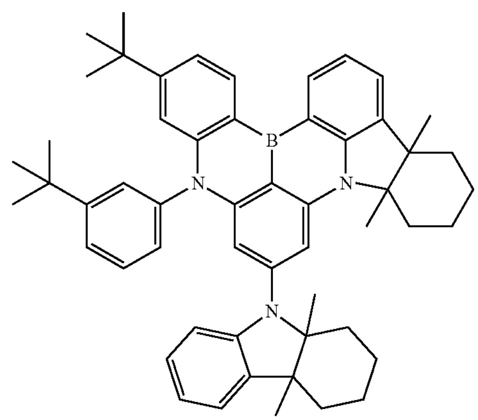
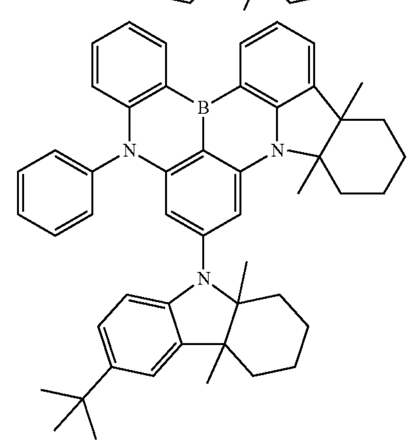

-continued
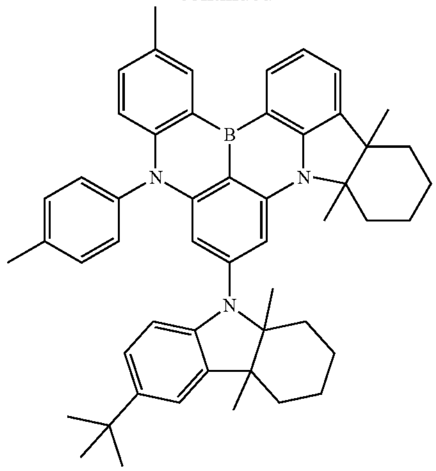
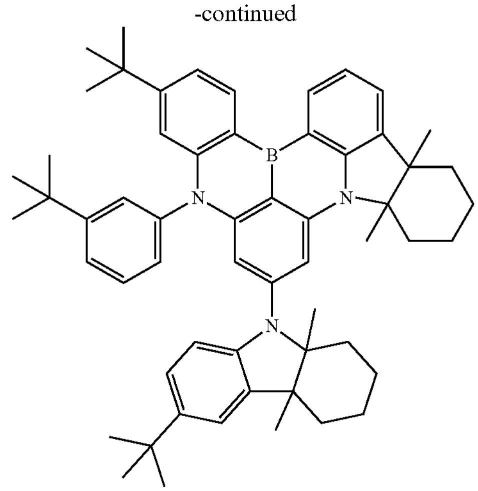
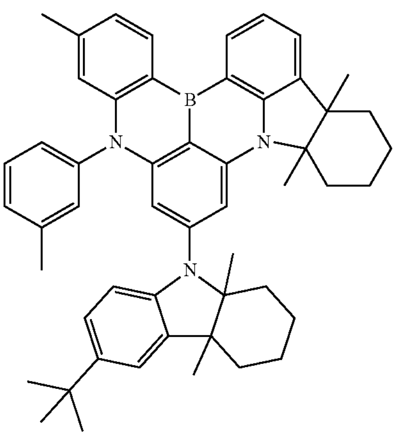
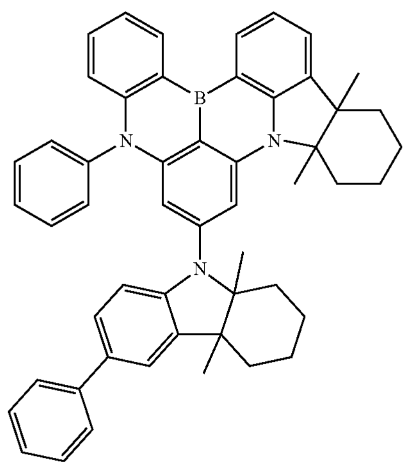
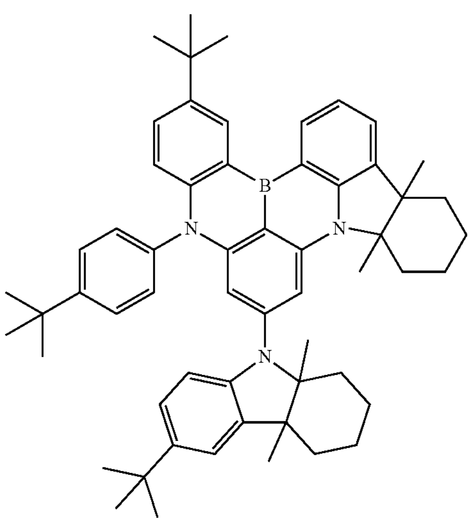
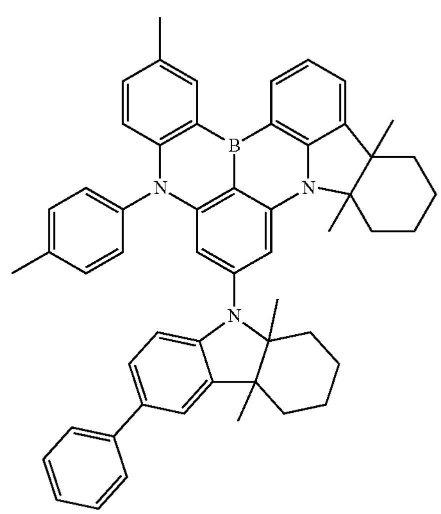
-continued -continued
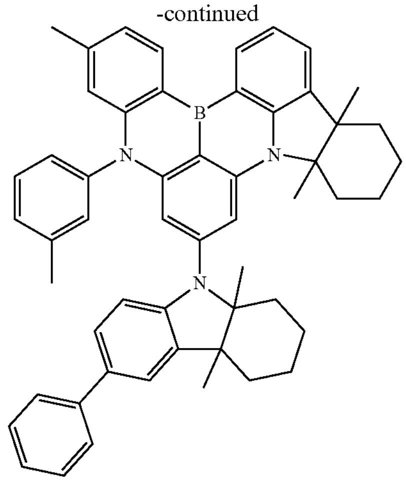
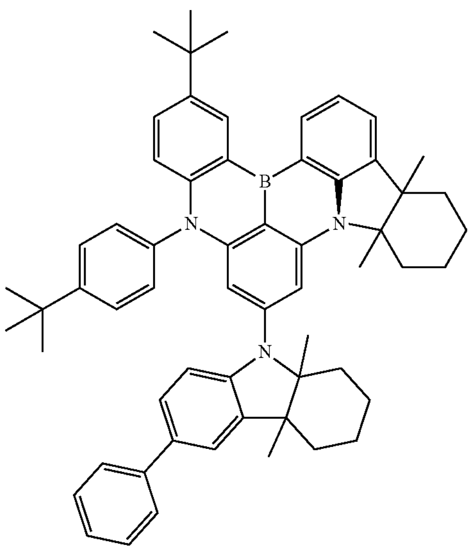
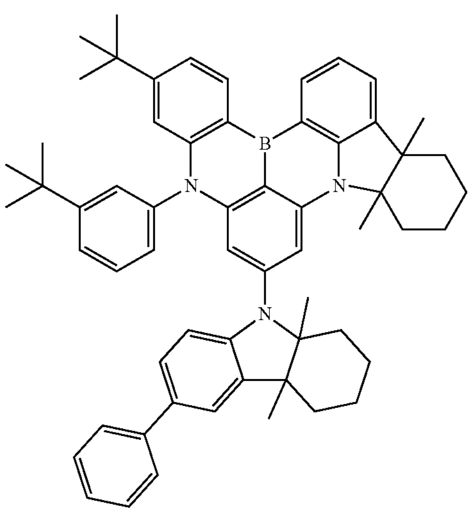
-continued
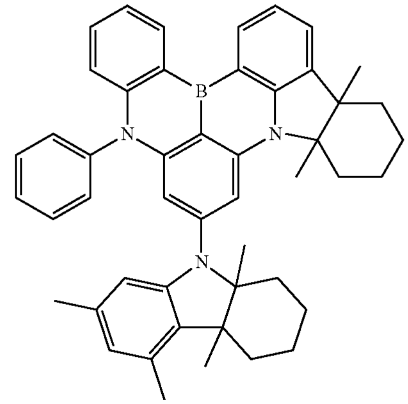
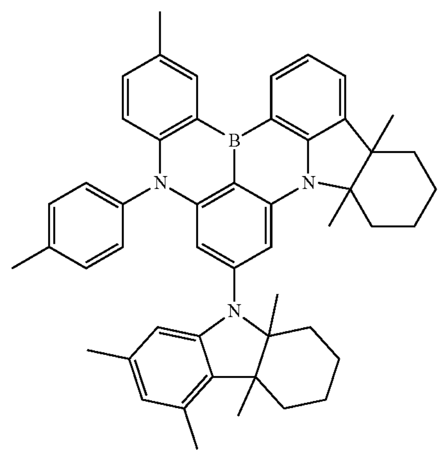
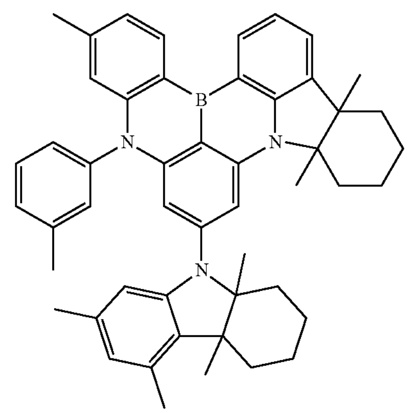

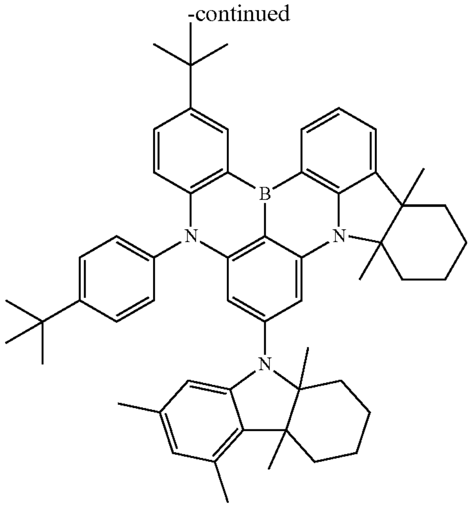
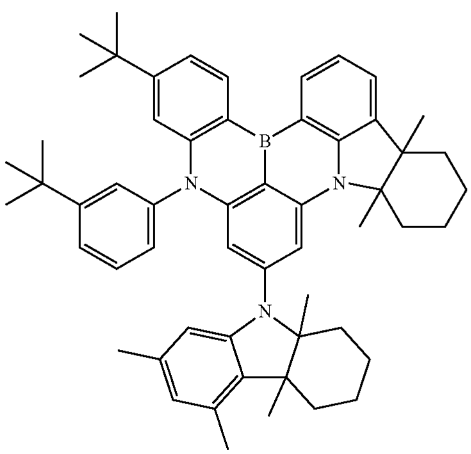
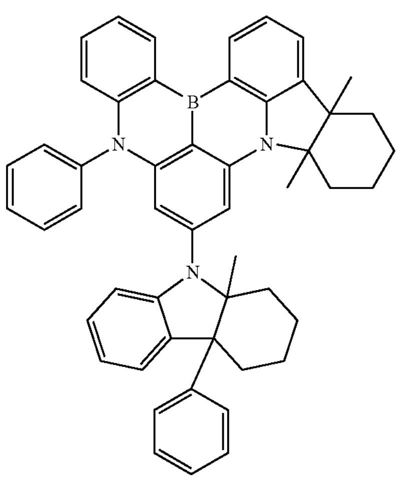
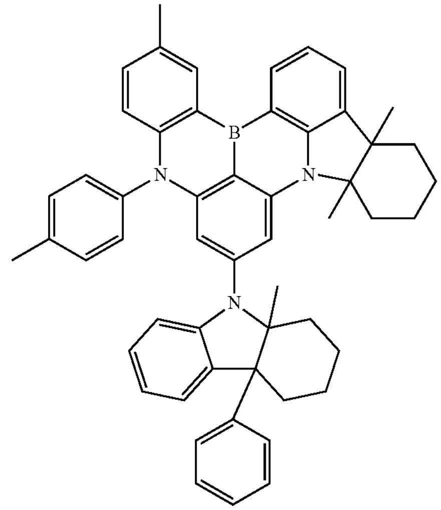
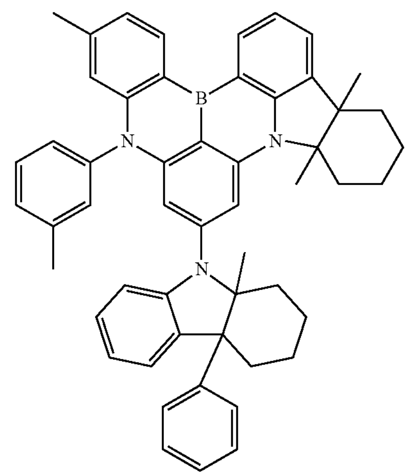
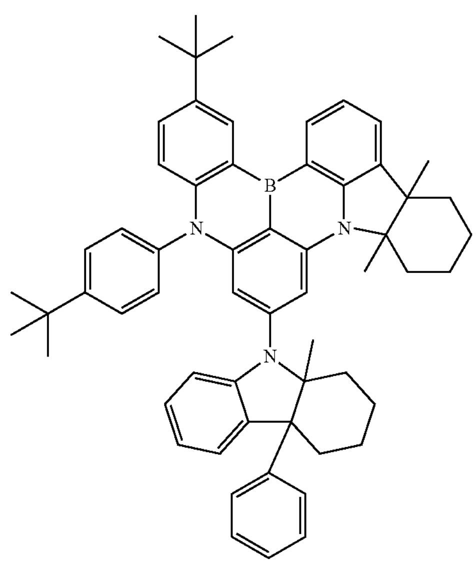

-continued
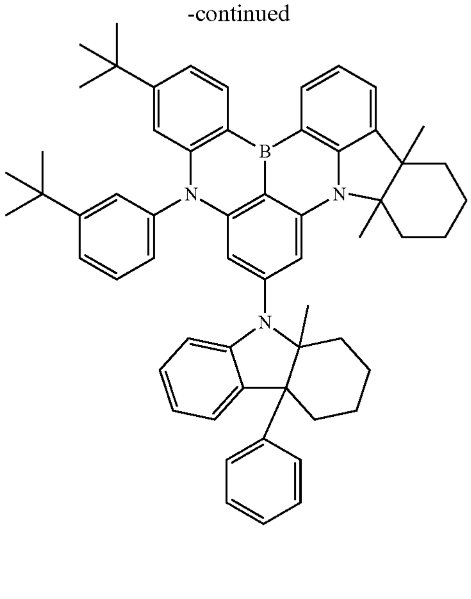
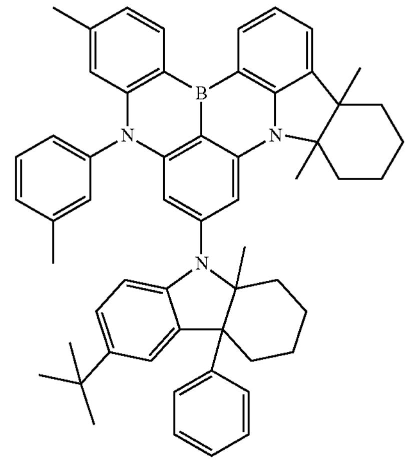
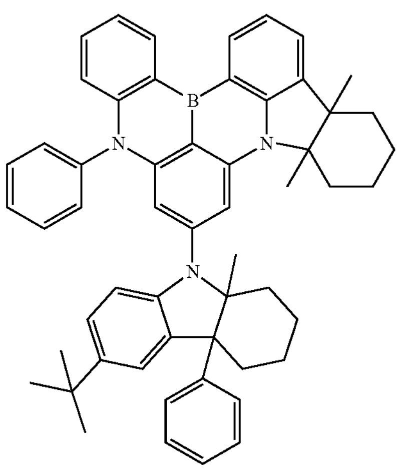
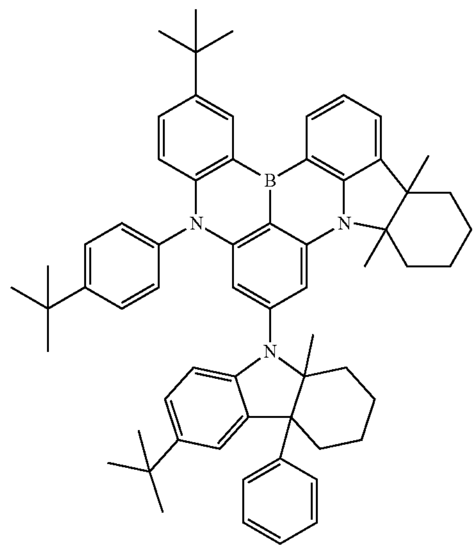
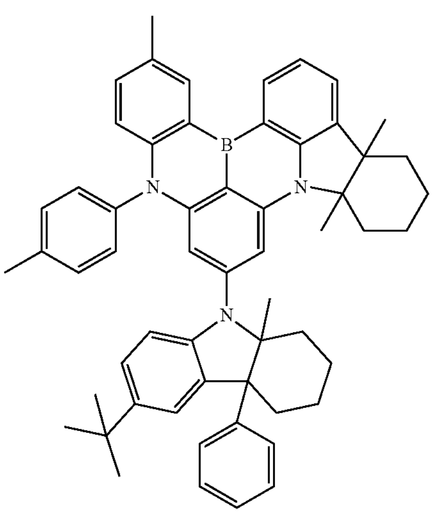
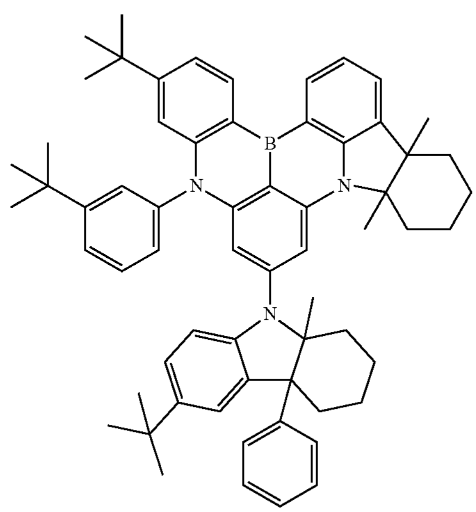
-continued -continued
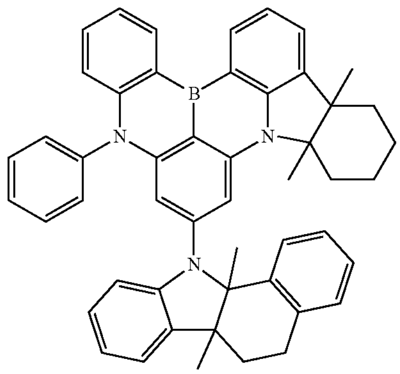
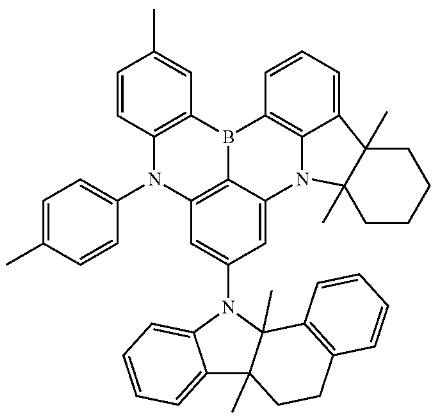
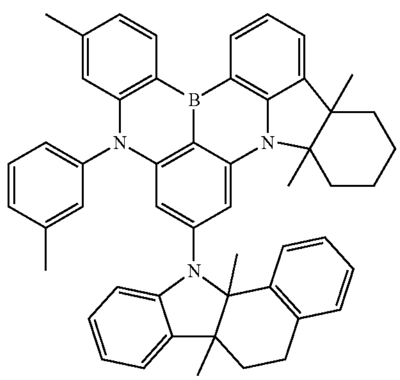
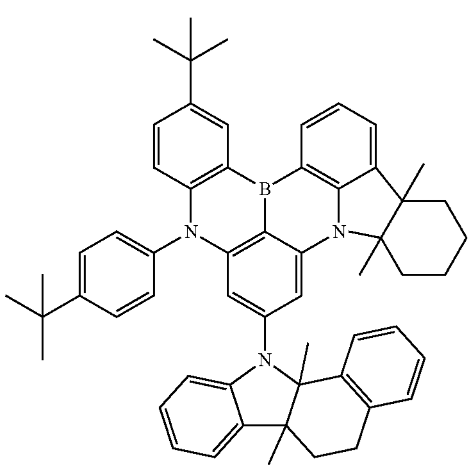
-continued
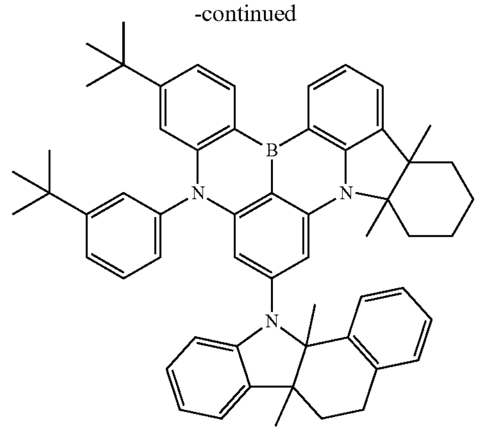
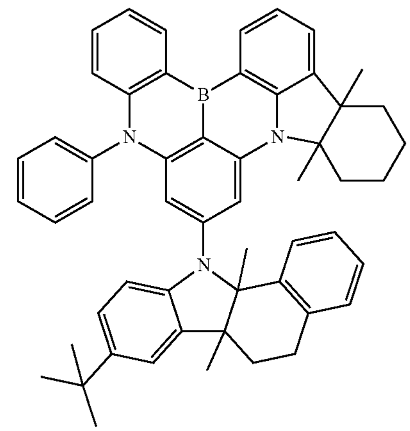
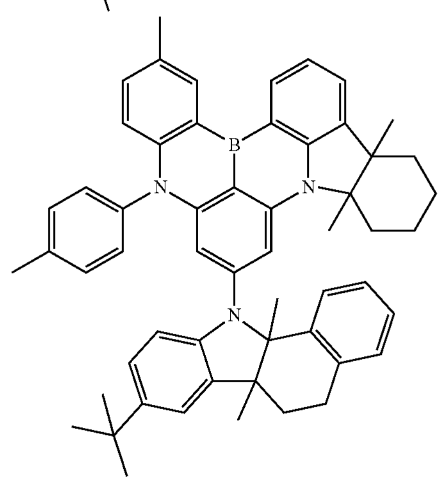
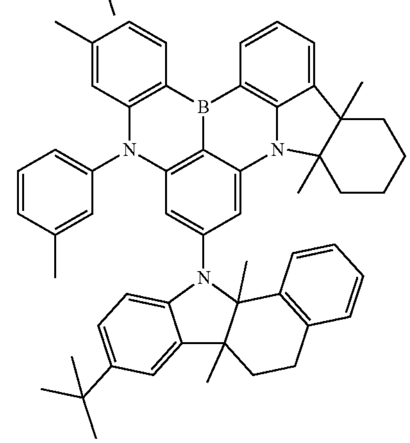

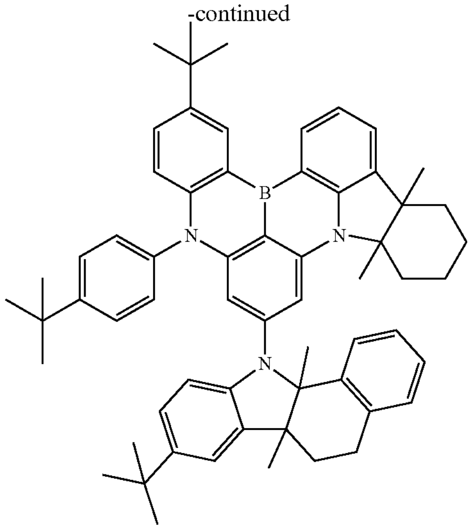
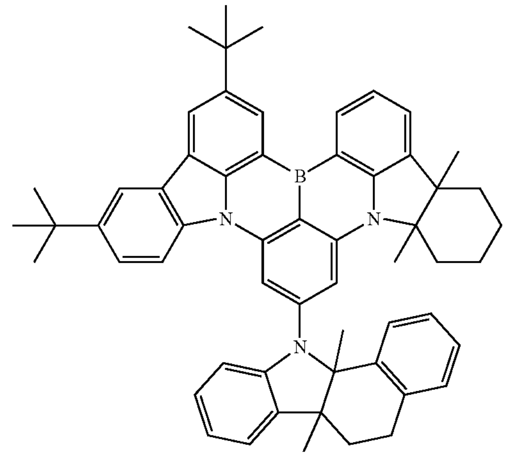
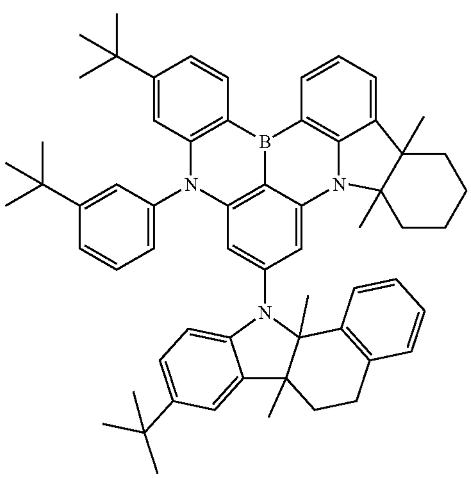
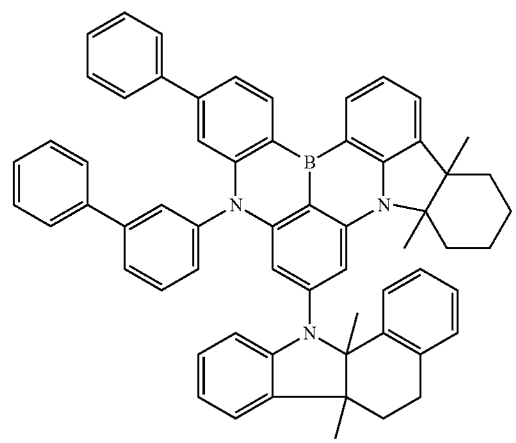
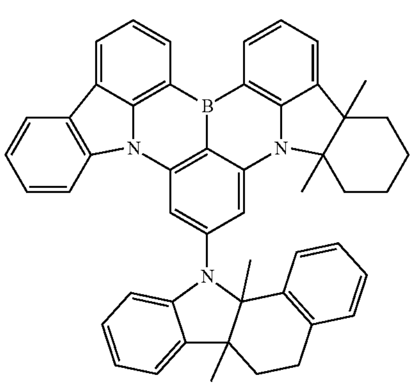
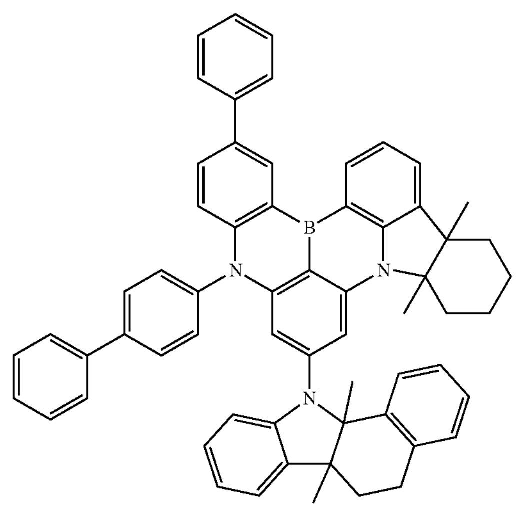

-continued
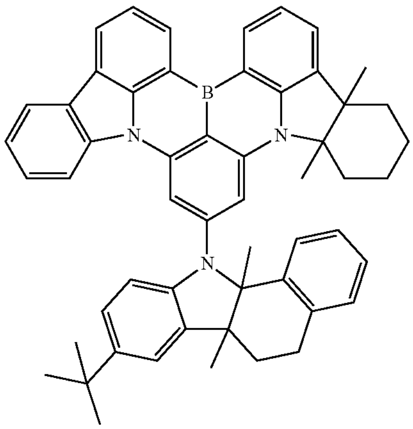
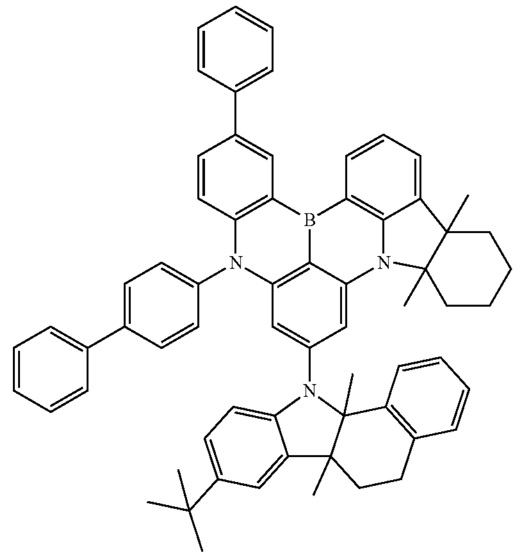
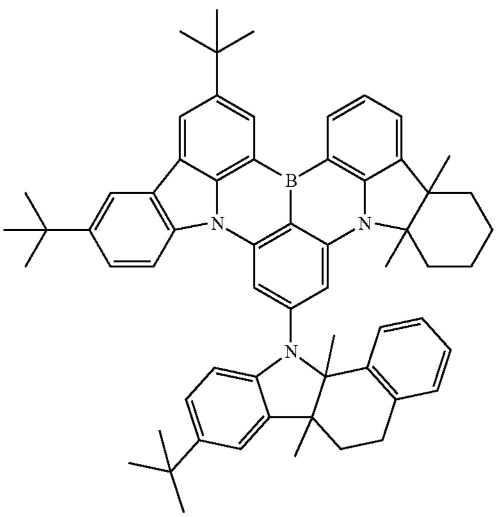
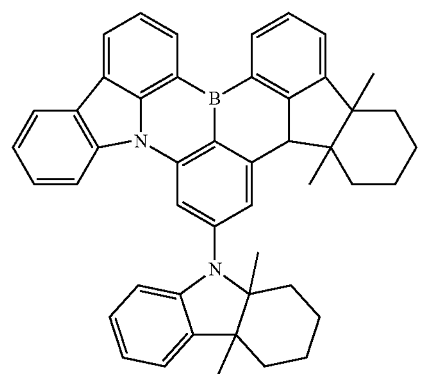
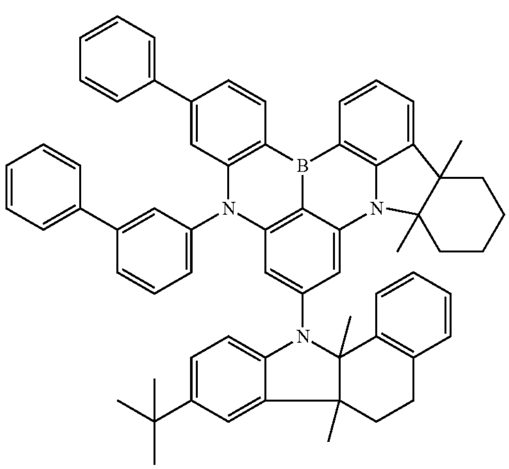
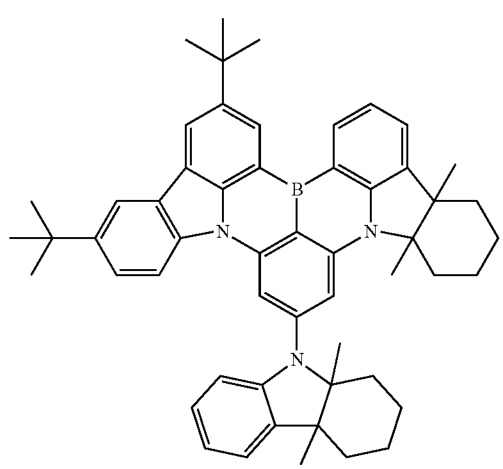
-continued -continued
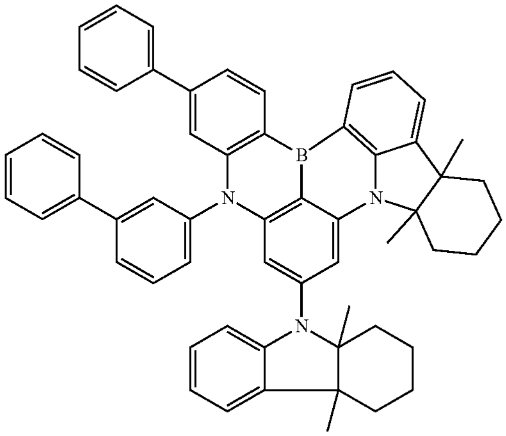
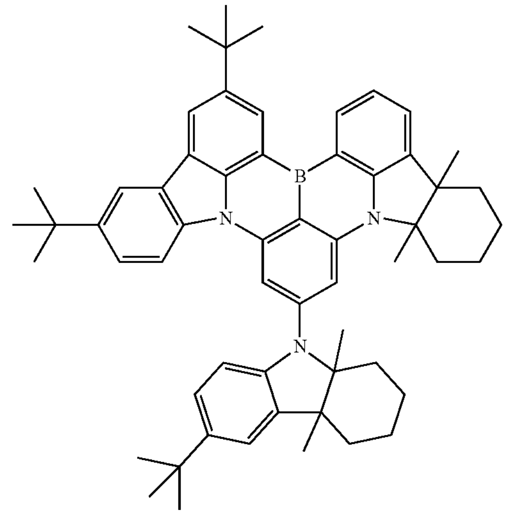
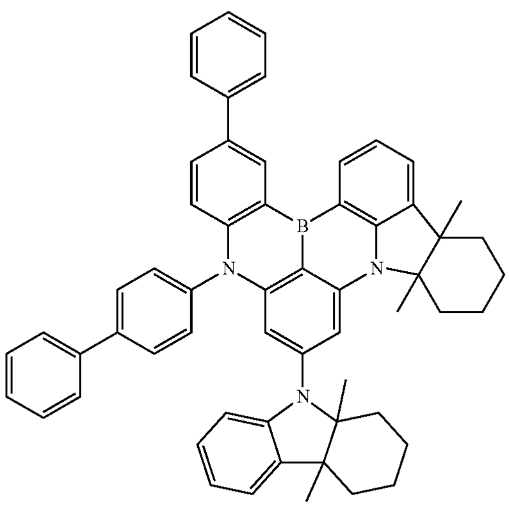
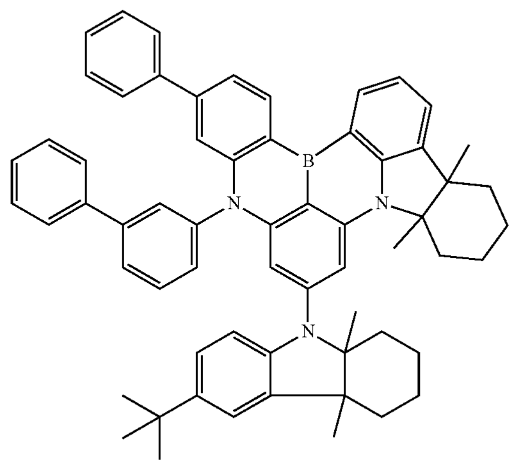
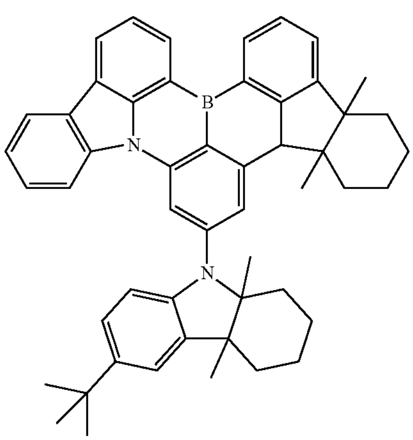
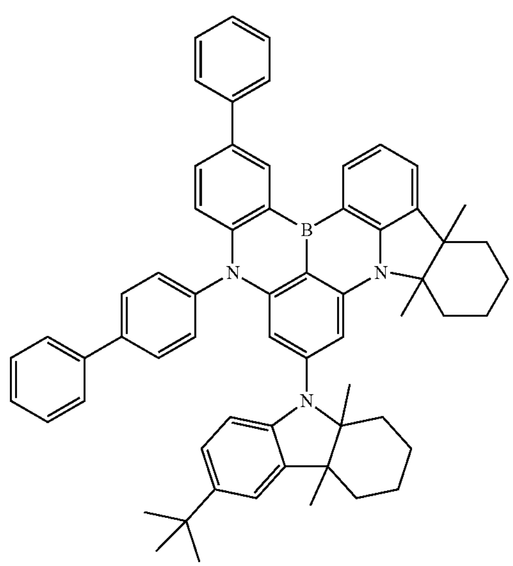

-continued
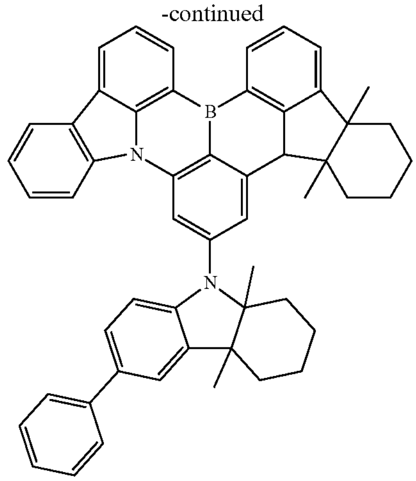
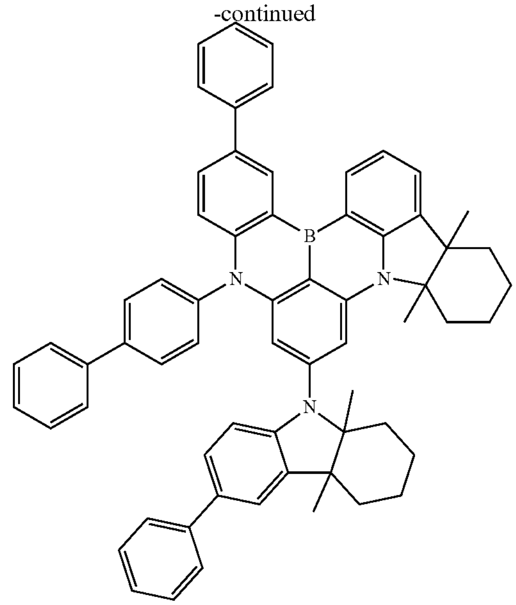
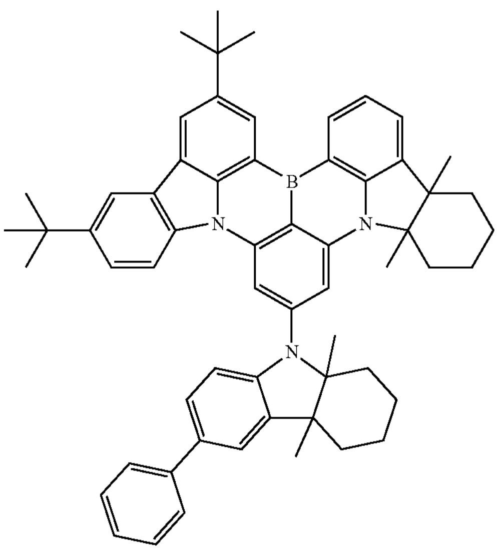
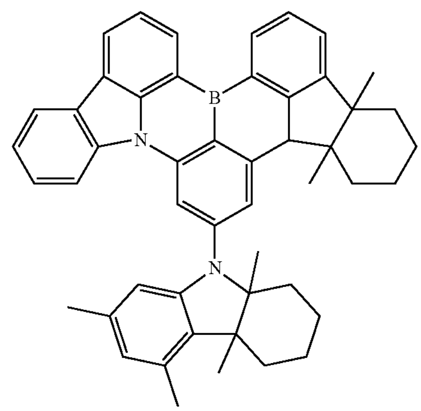
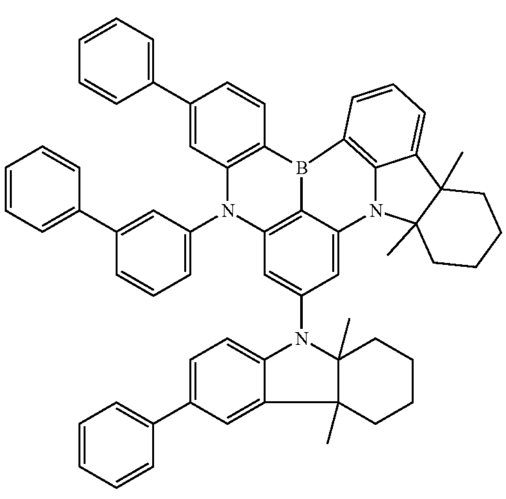
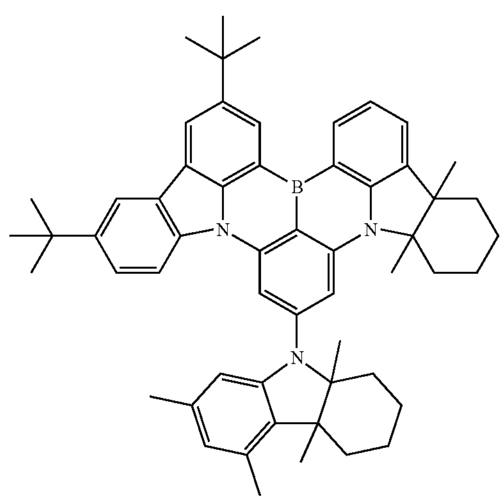
-continued -continued
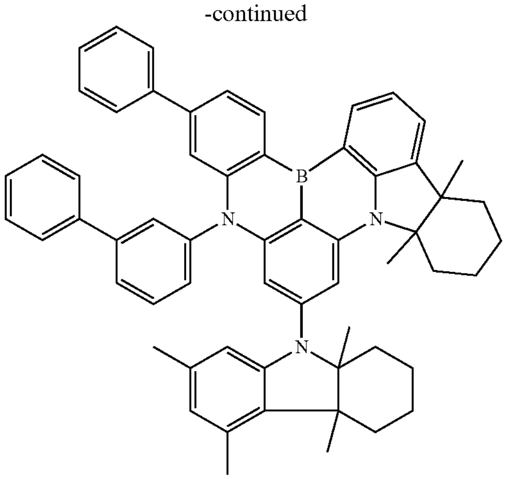
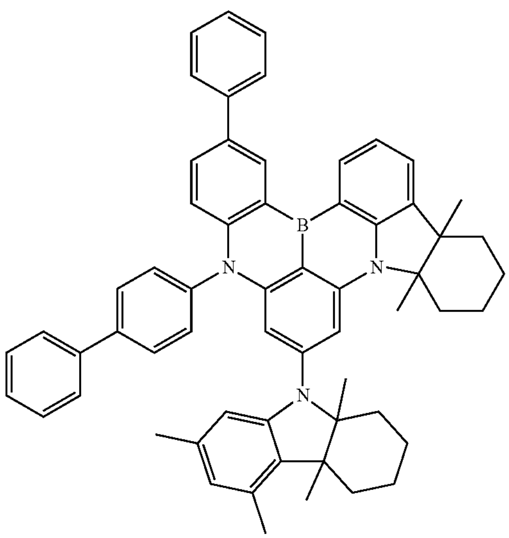
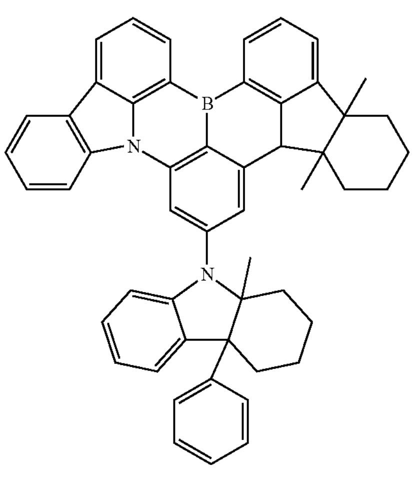
-continued
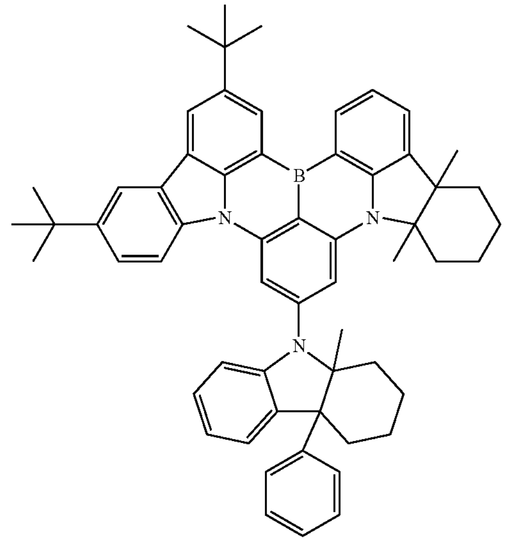
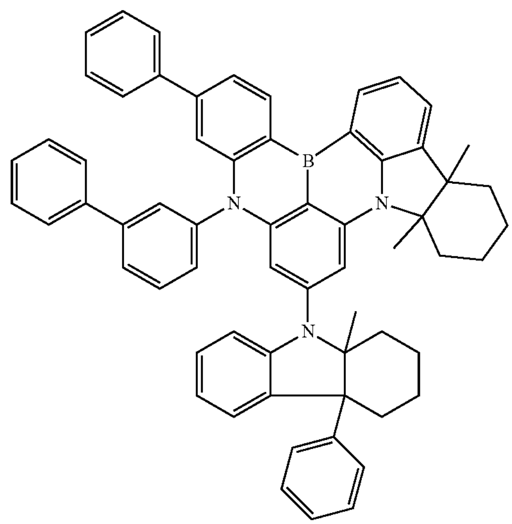
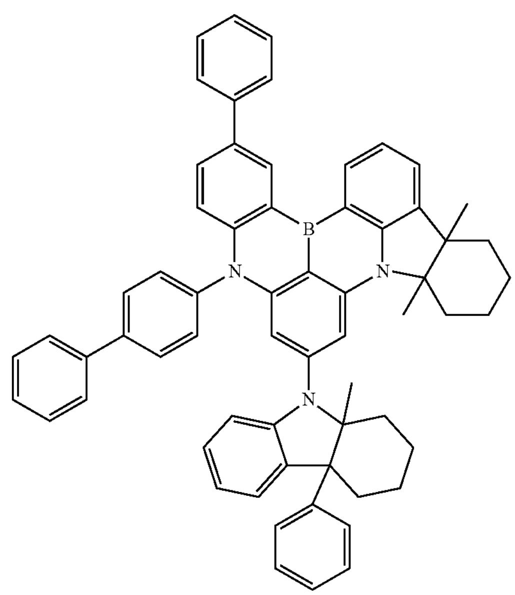

-continued
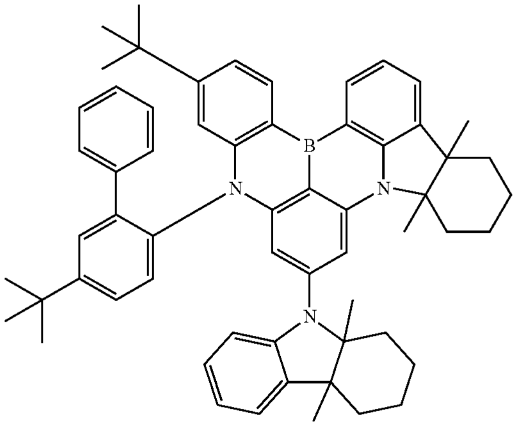
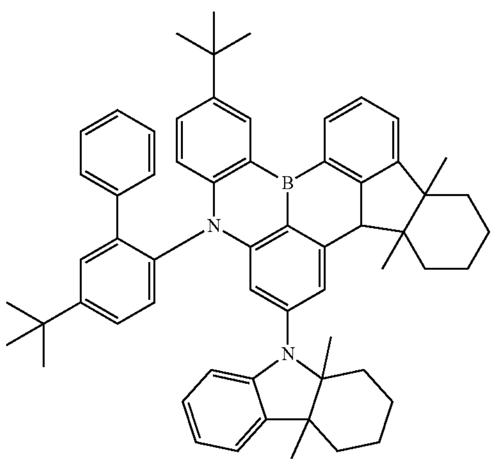
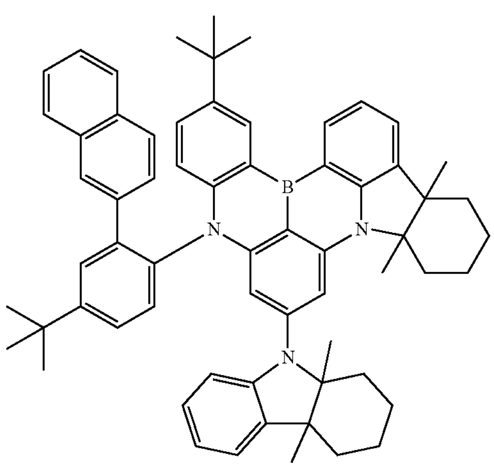
-continued
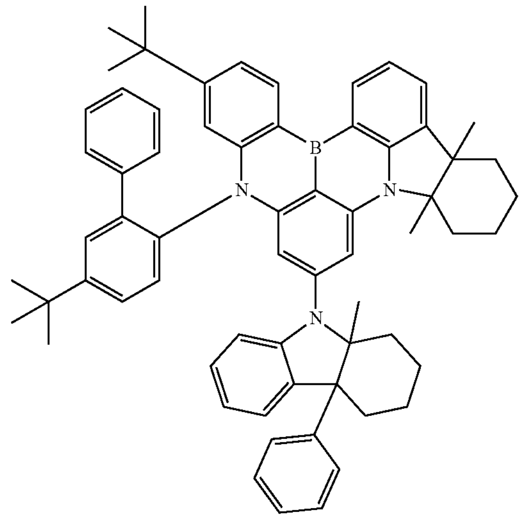
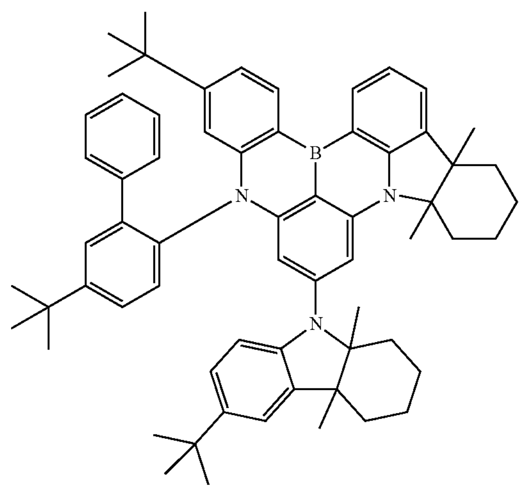
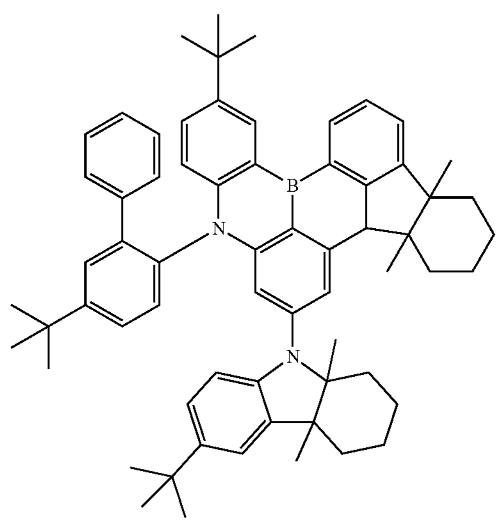

-continued
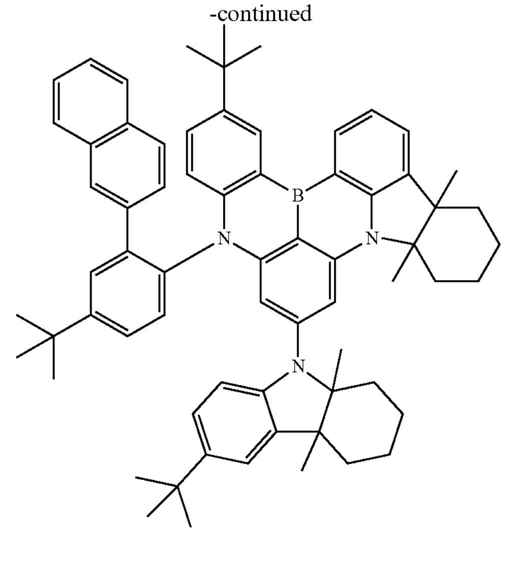
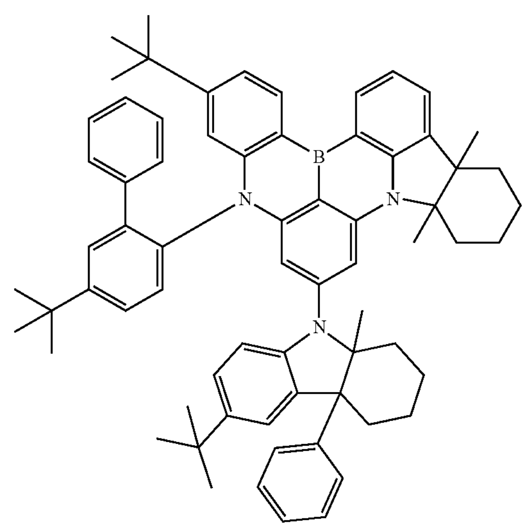
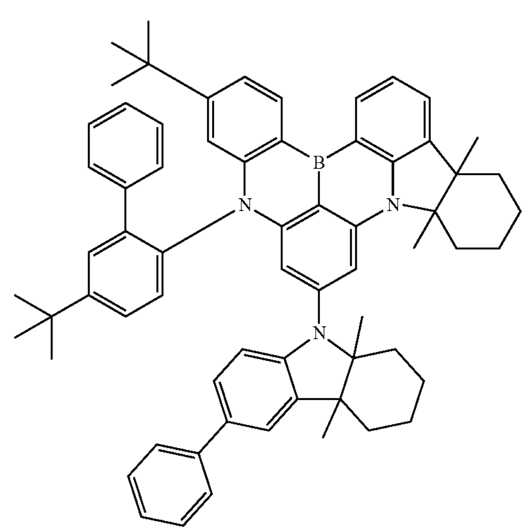
-continued
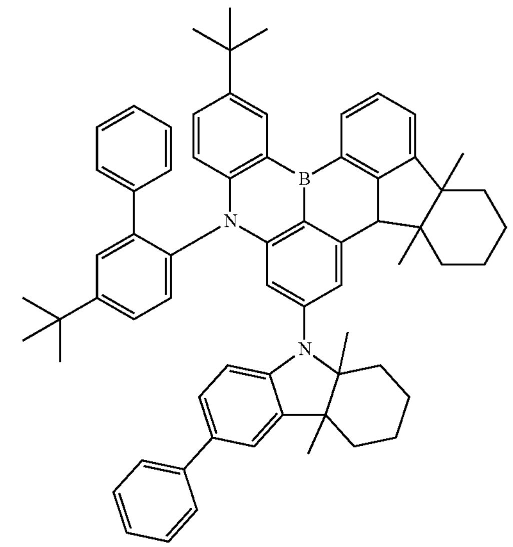
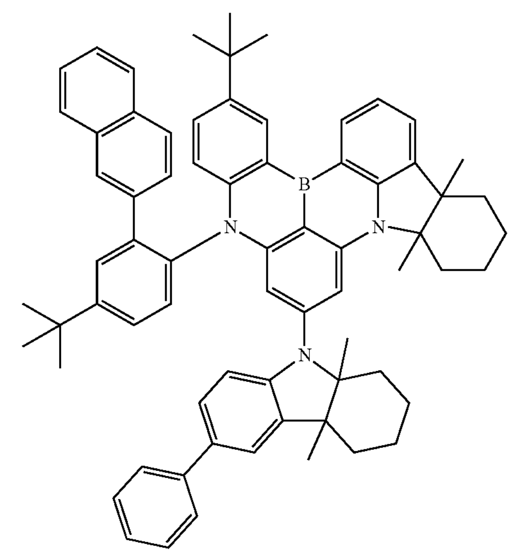
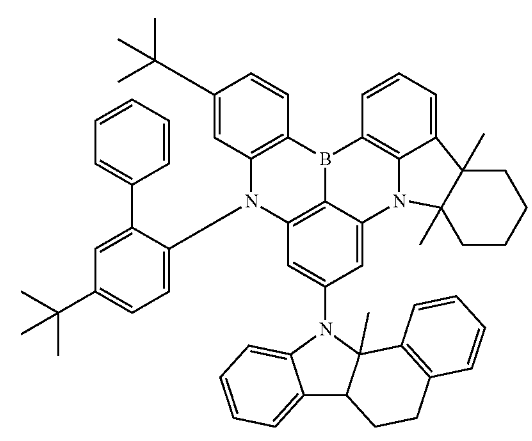

-continued
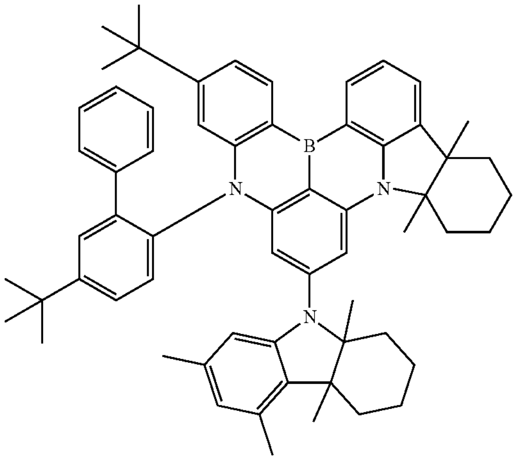
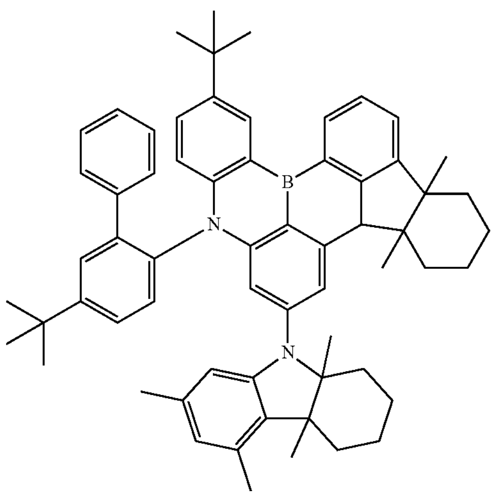
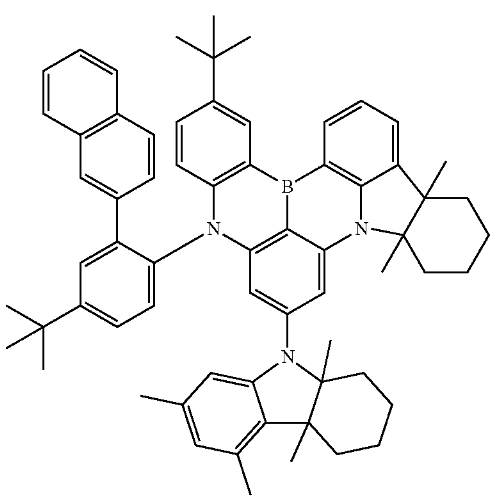
-continued
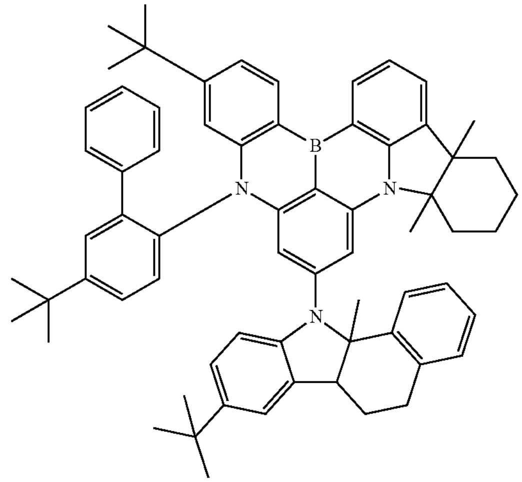
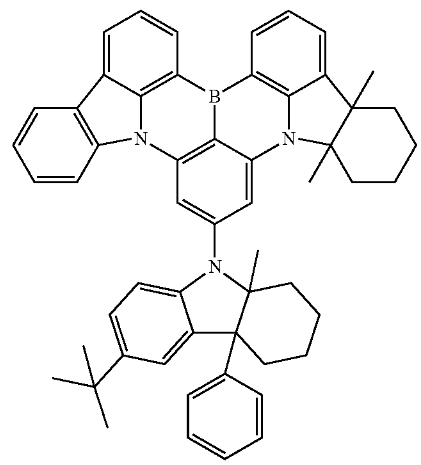
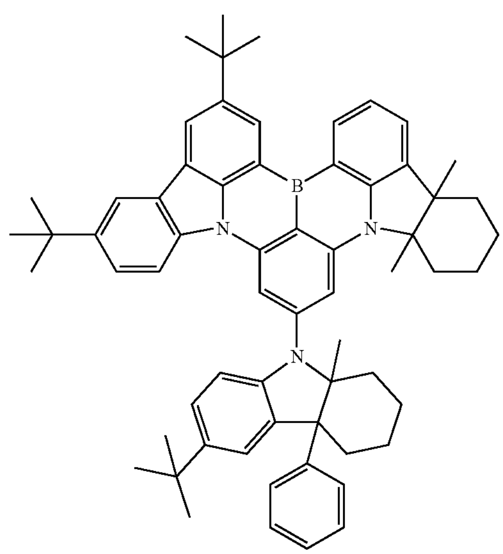

1069
-continued
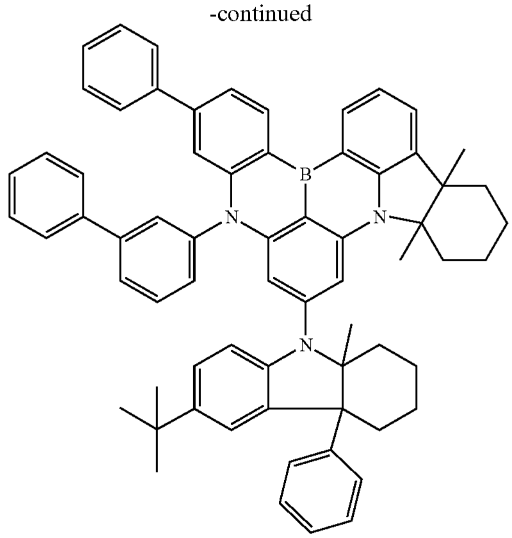
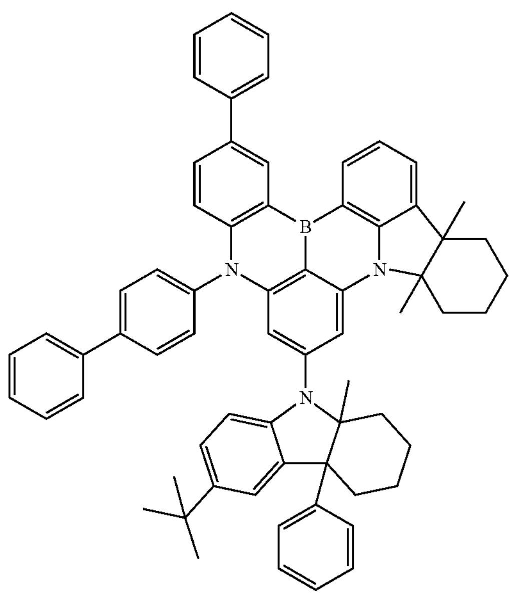
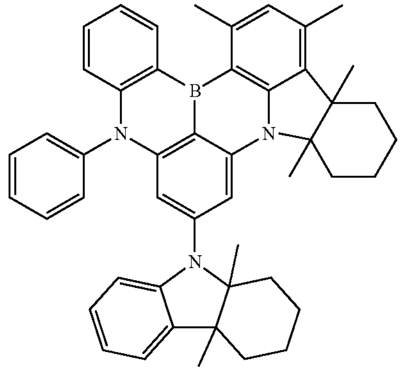
1070
-continued
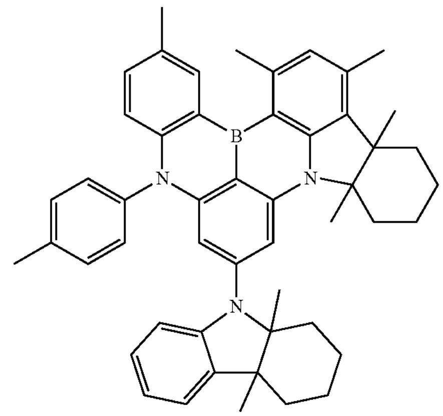
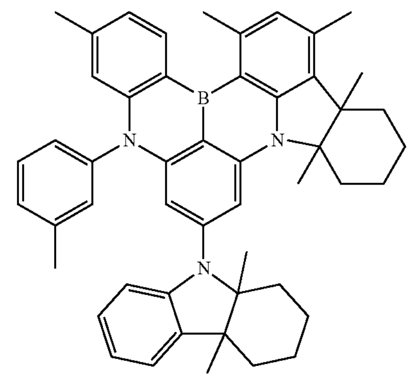
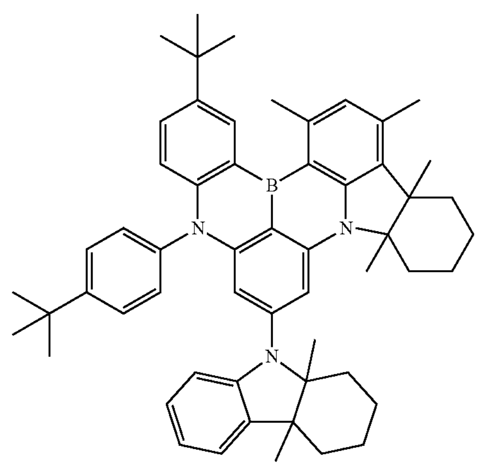
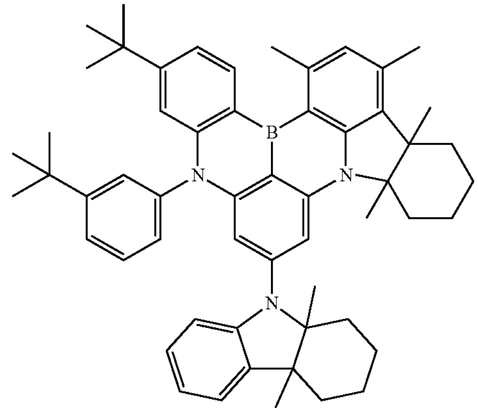

-continued
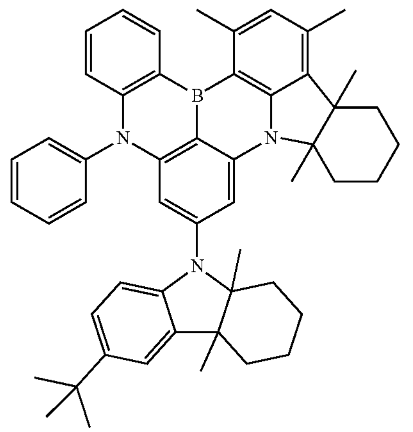
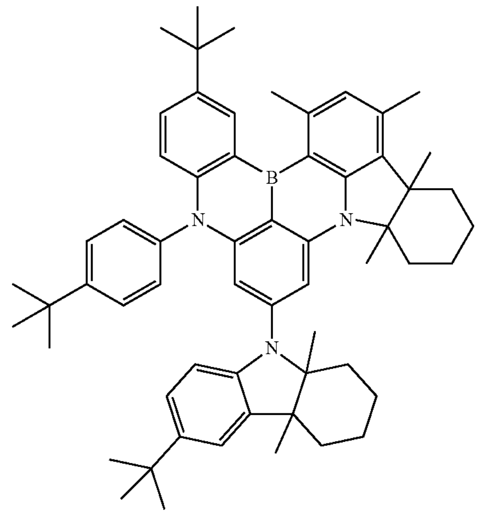
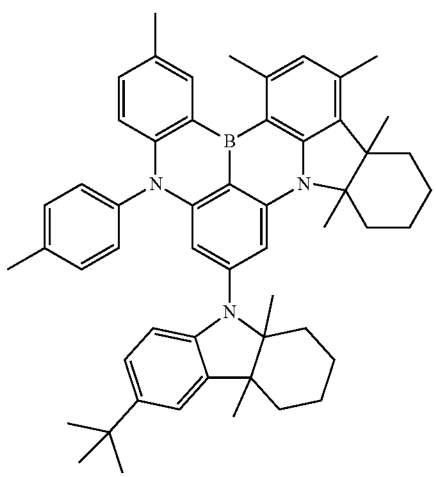
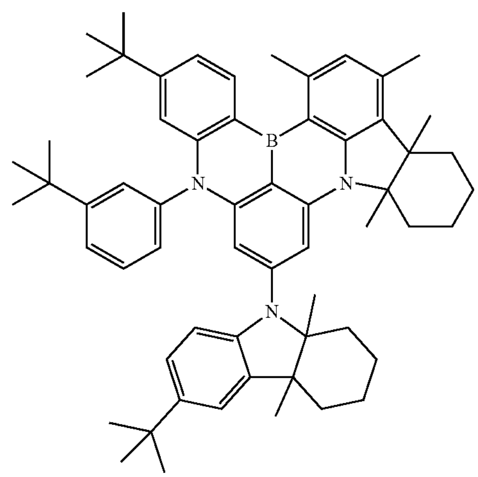
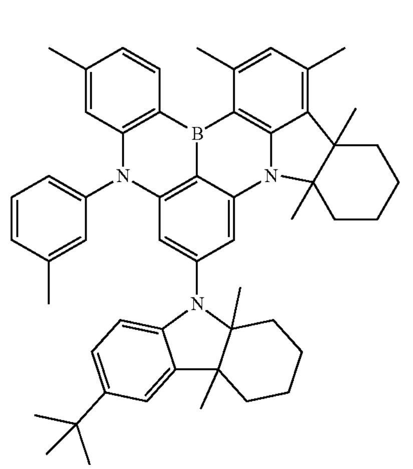
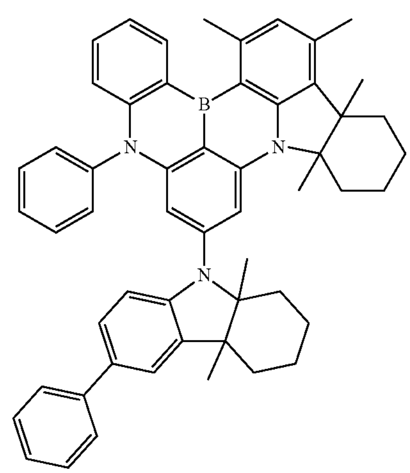

-continued
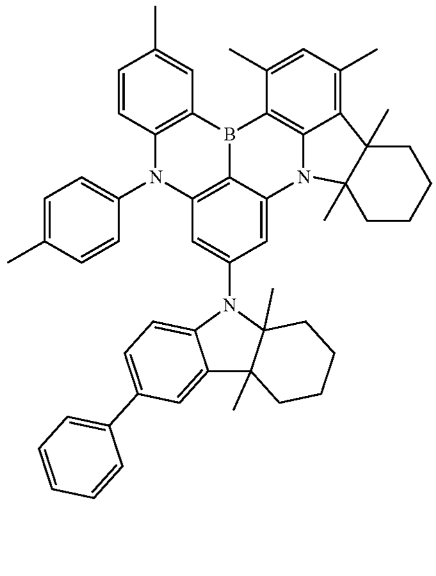
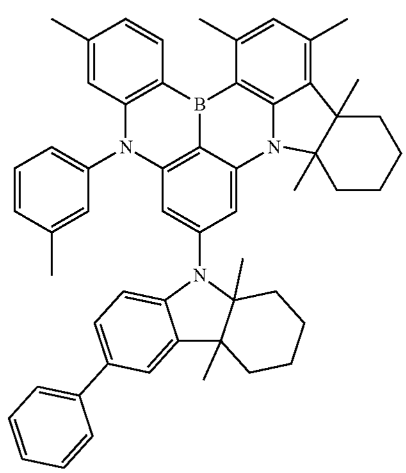
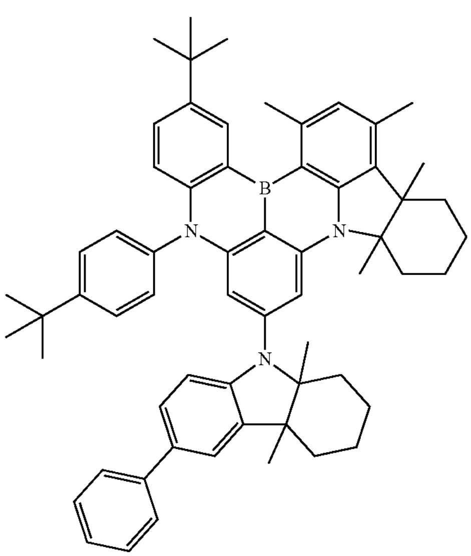
-continued
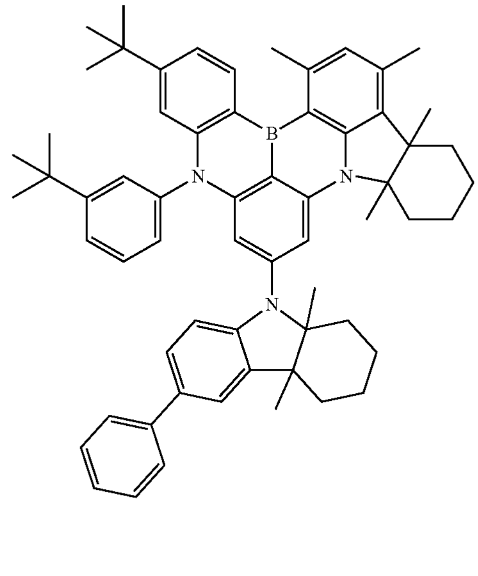
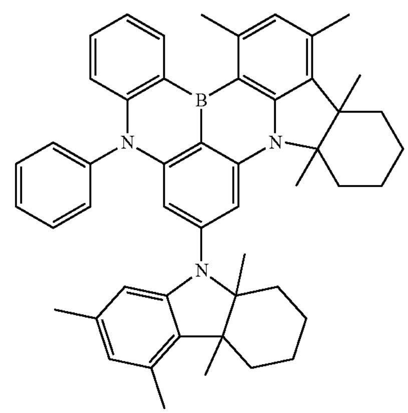
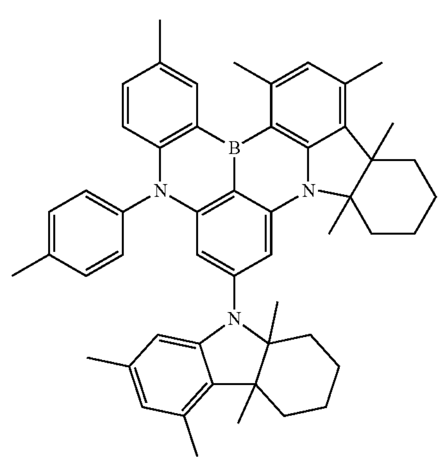

-continued
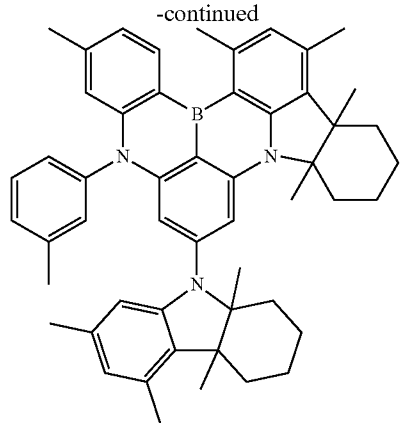
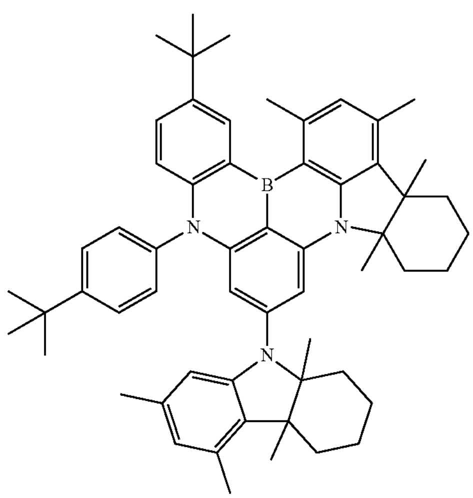
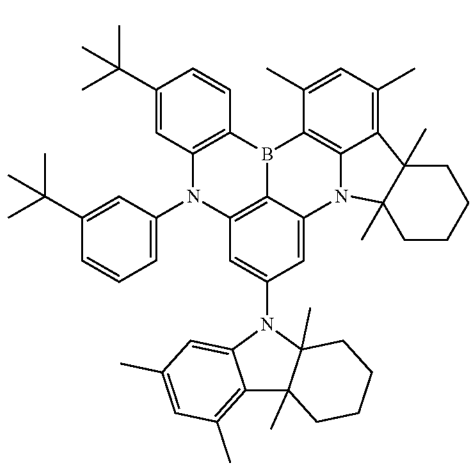
-continued
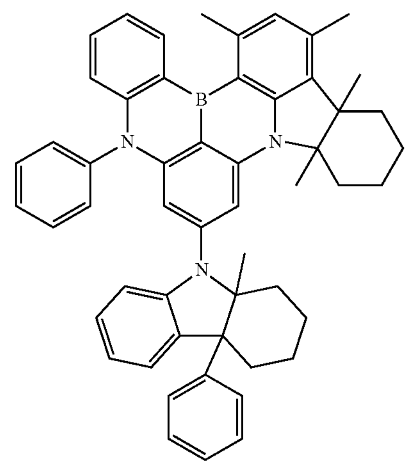
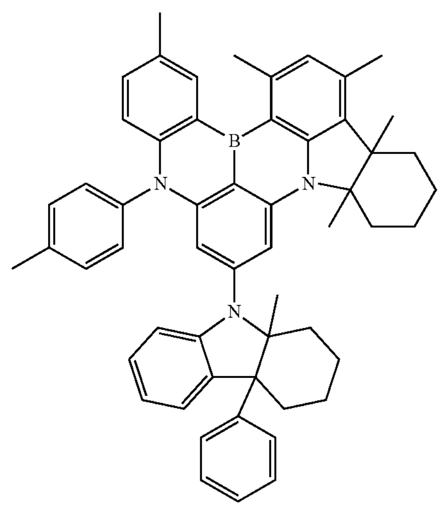
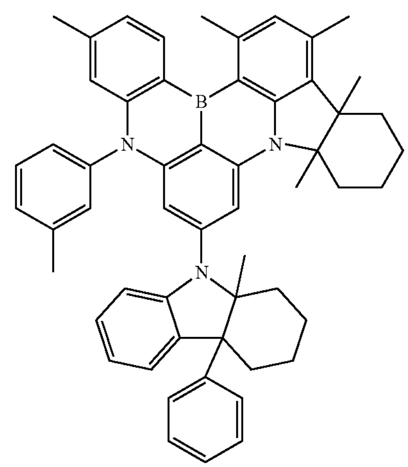

-continued
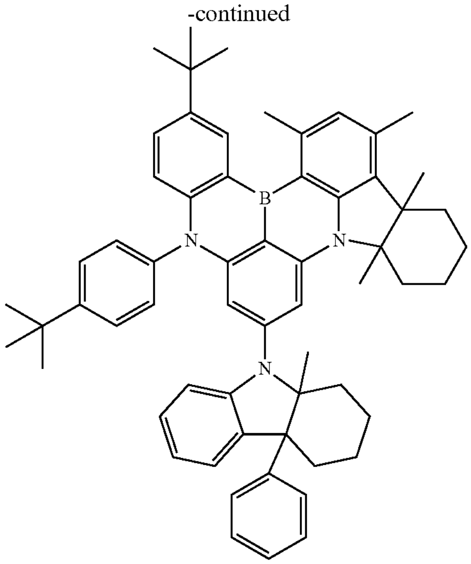
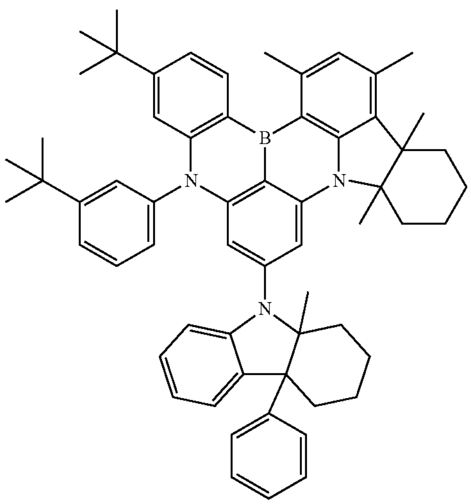
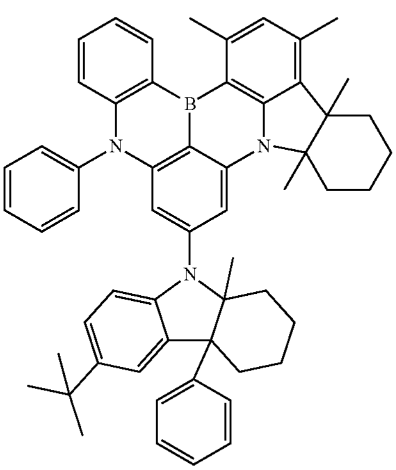
-continued
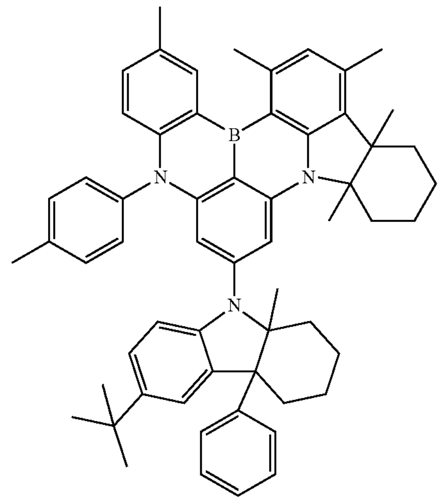
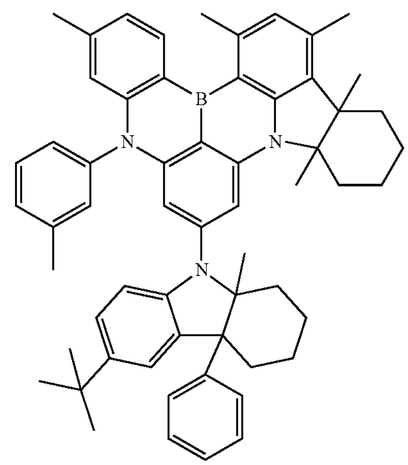
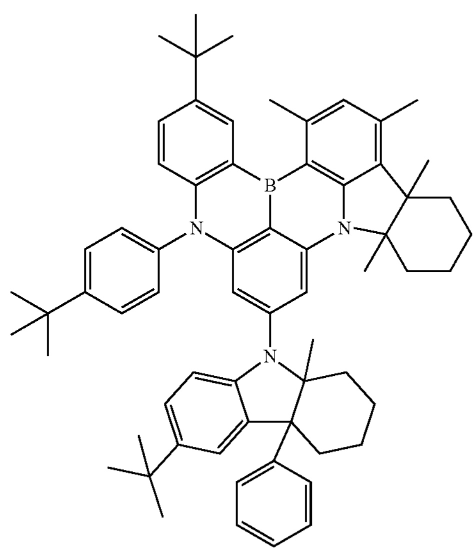

-continued
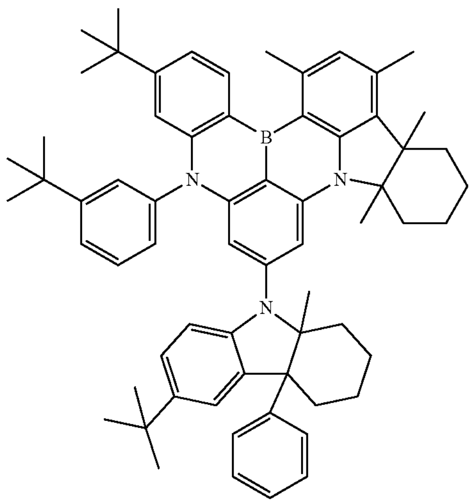
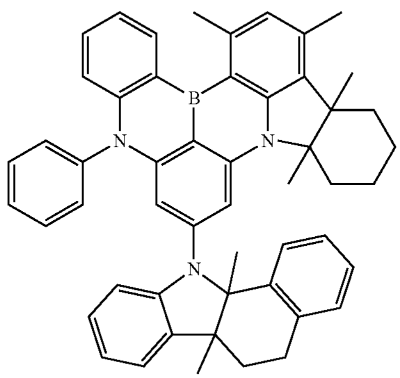
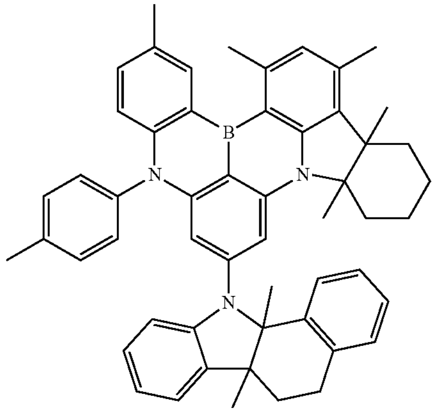
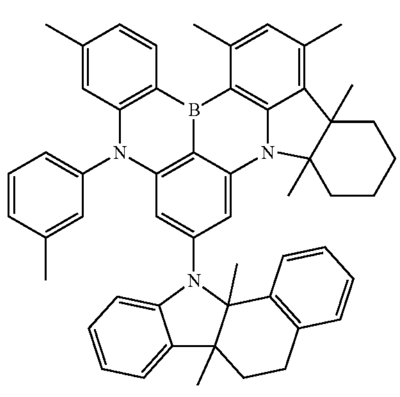
-continued
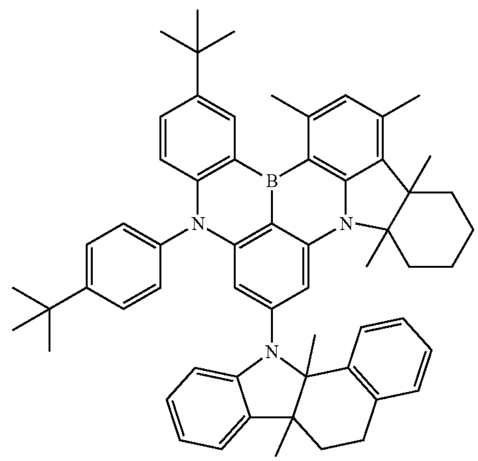
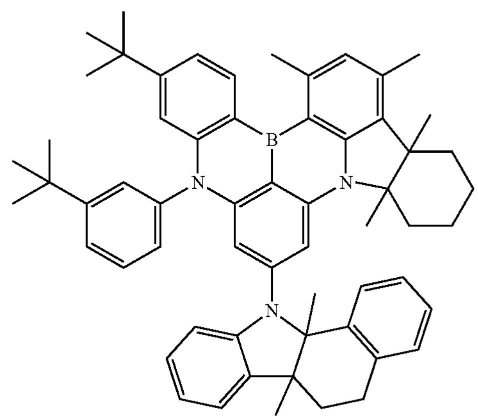
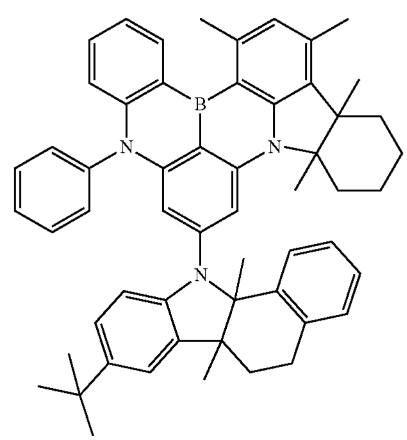

-continued
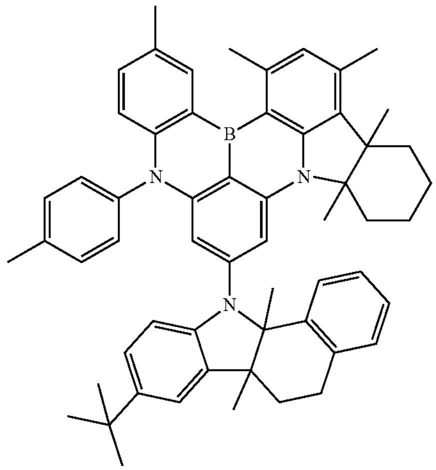
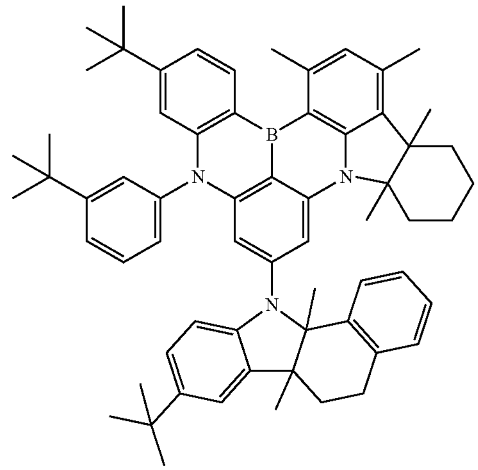
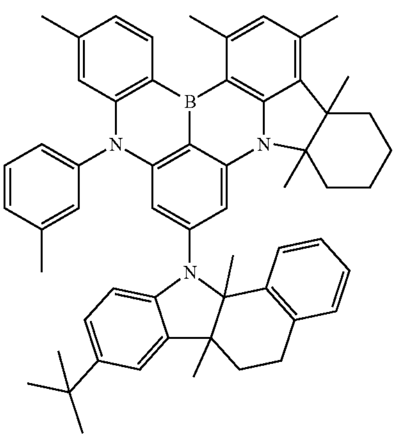
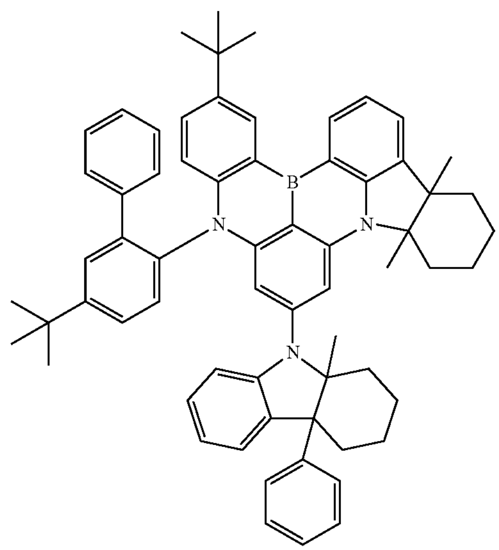
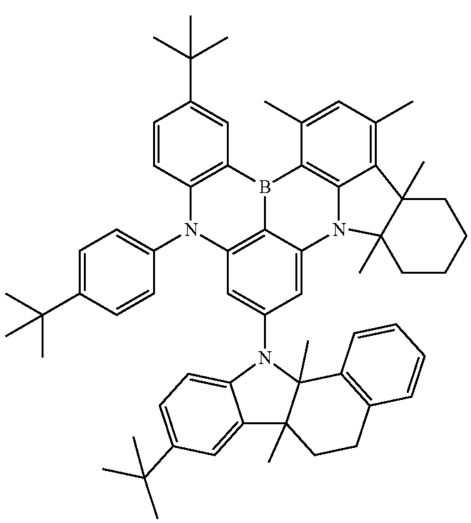
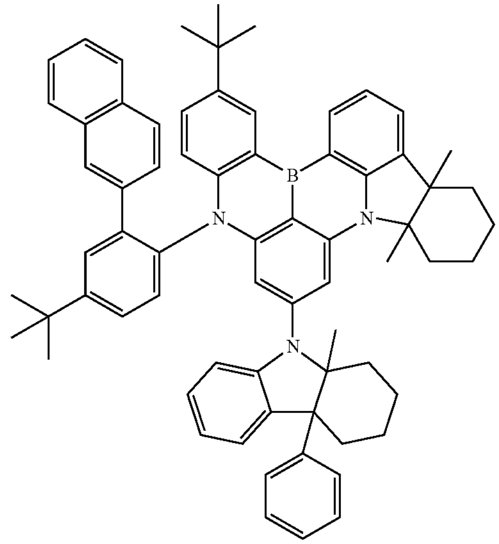

-continued
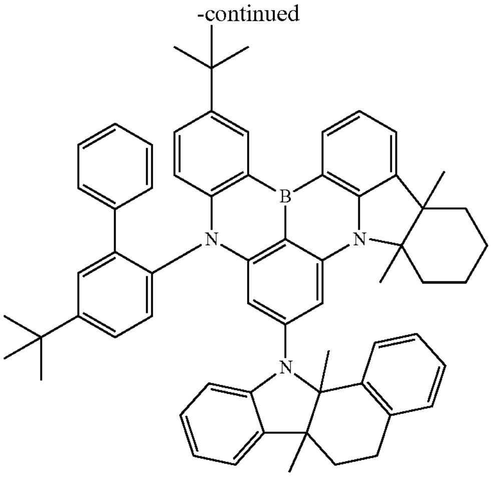
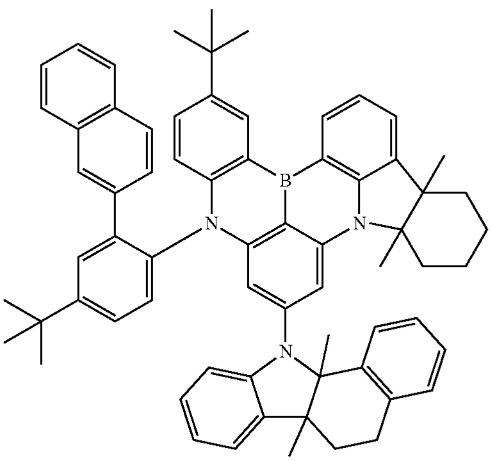
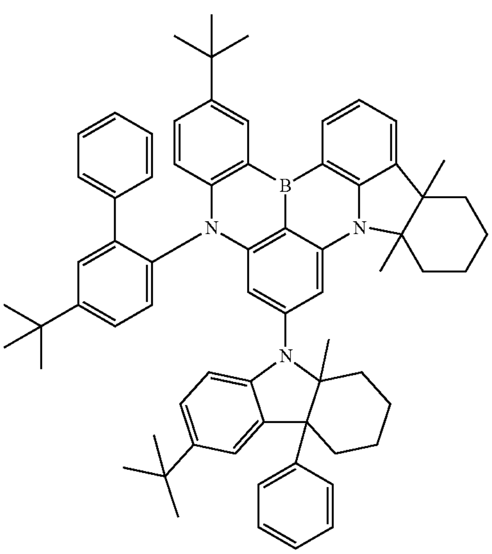
-continued
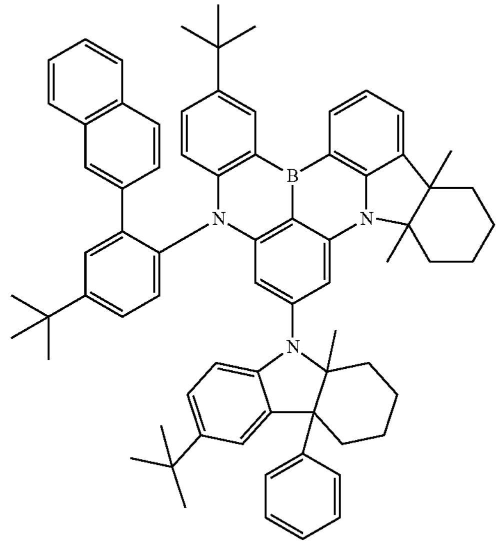
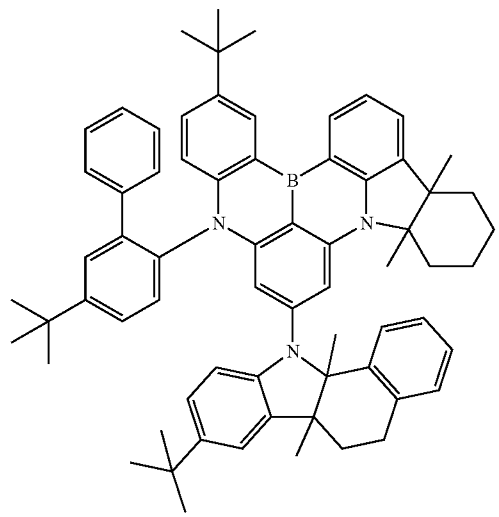
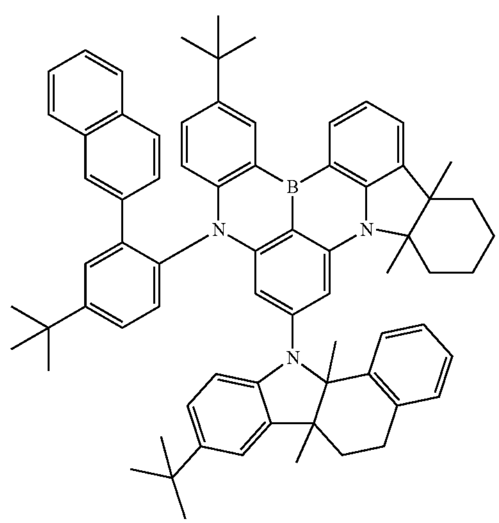

-continued
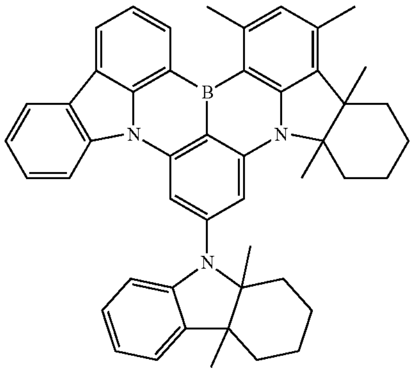
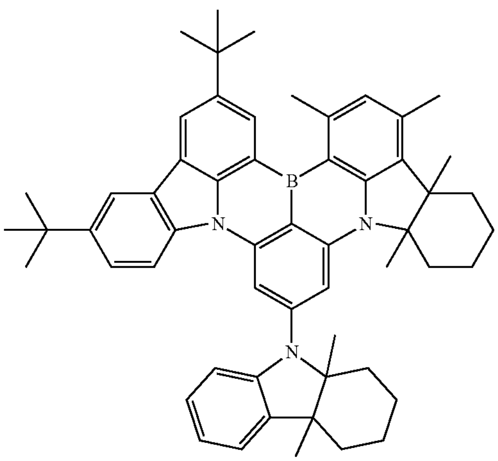
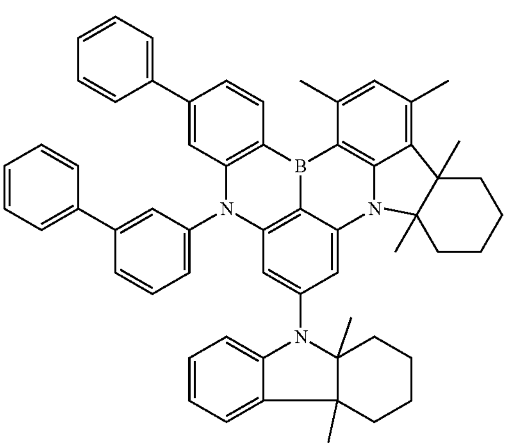
-continued
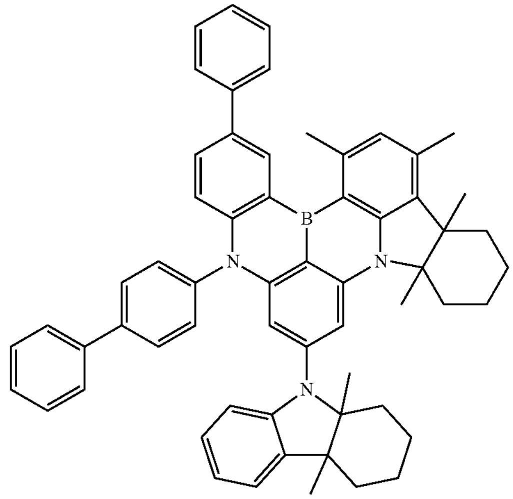
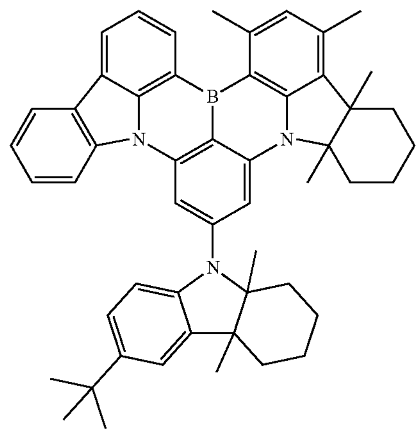
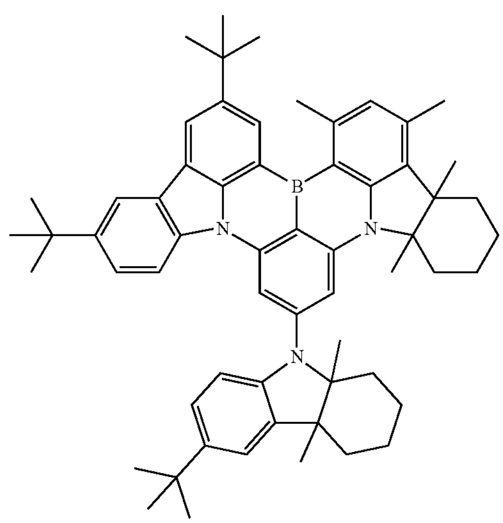

-continued
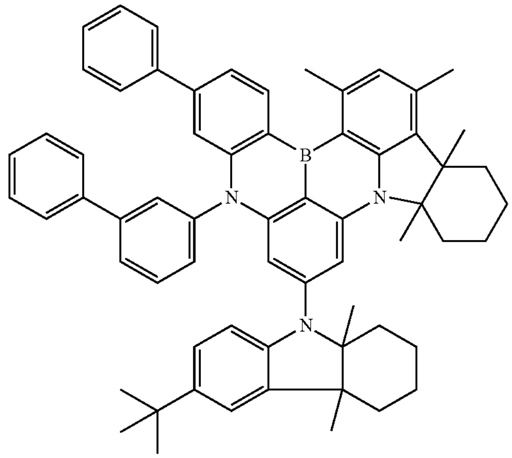
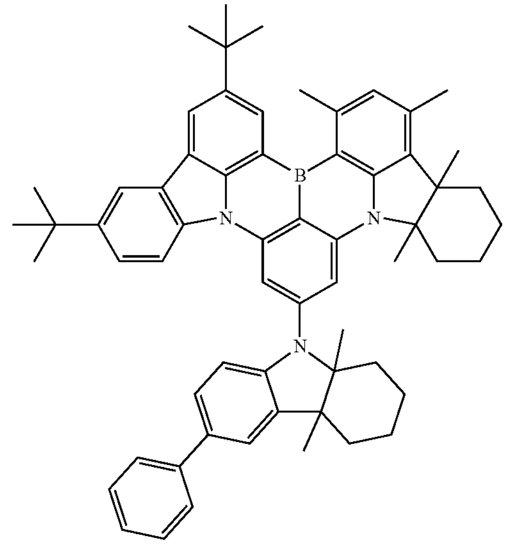
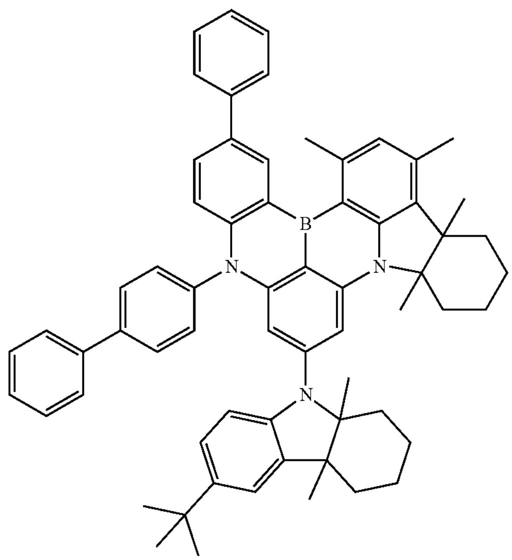
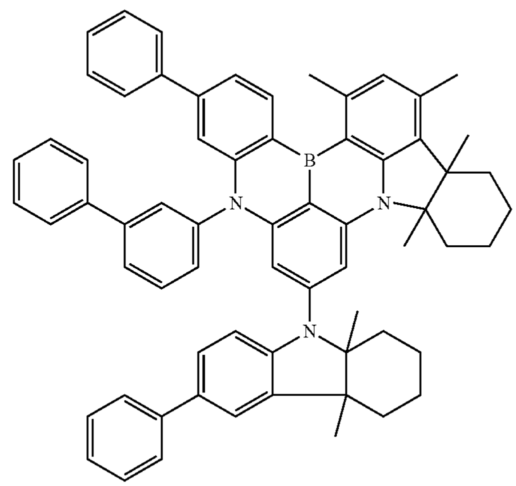
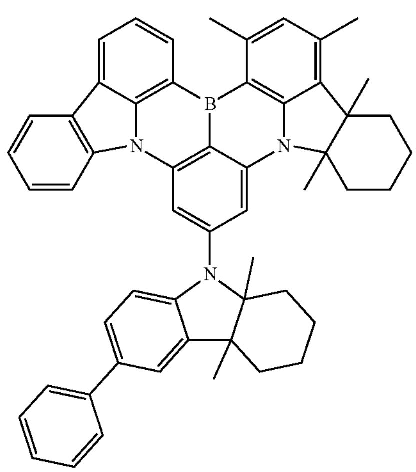
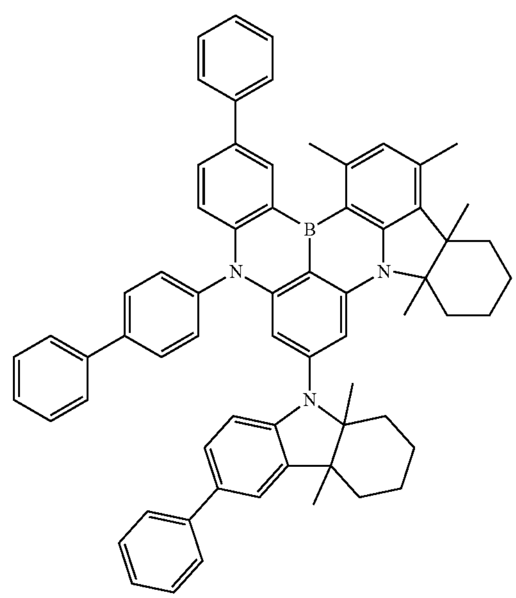
-continued -continued
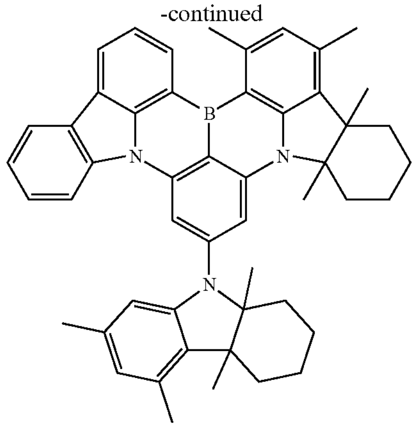
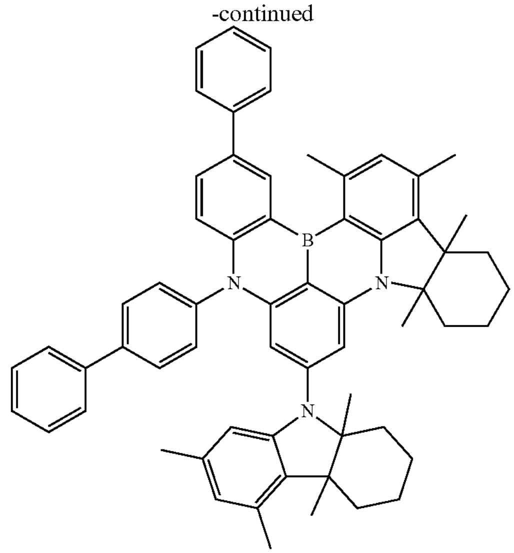
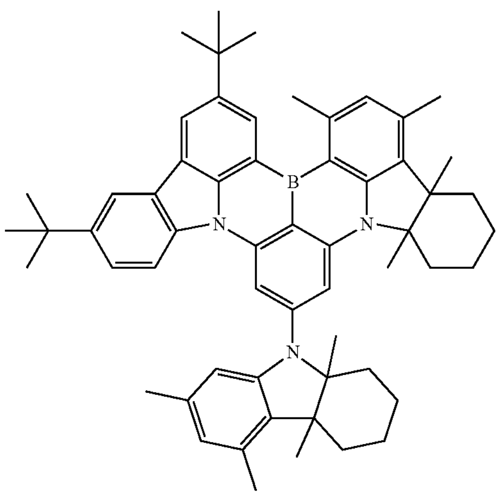
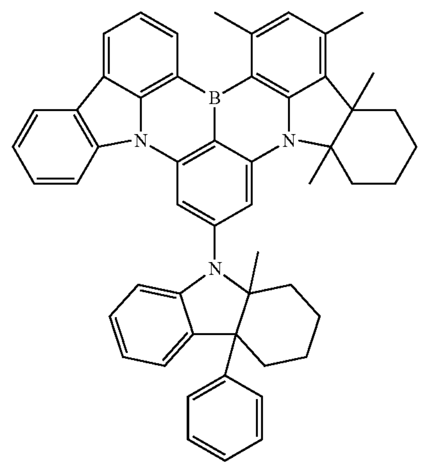
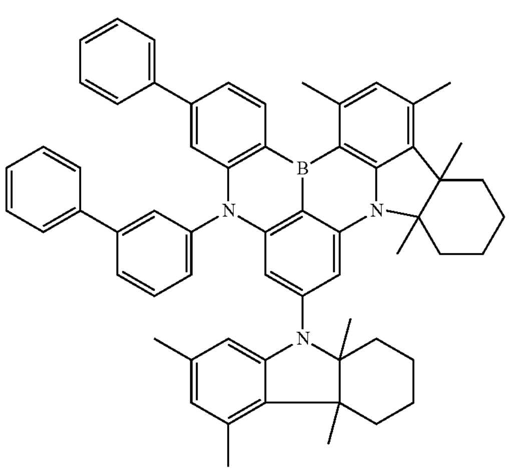
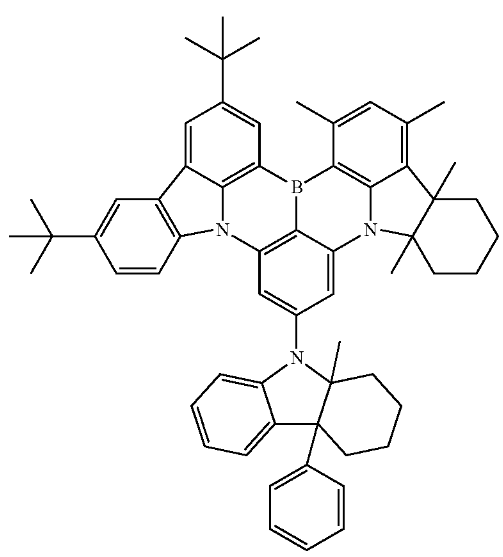

-continued
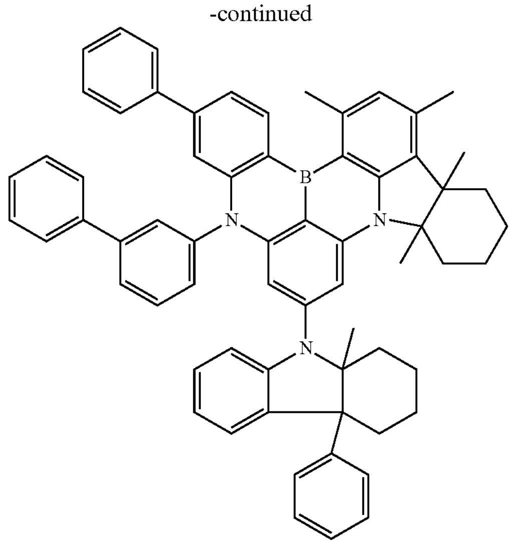
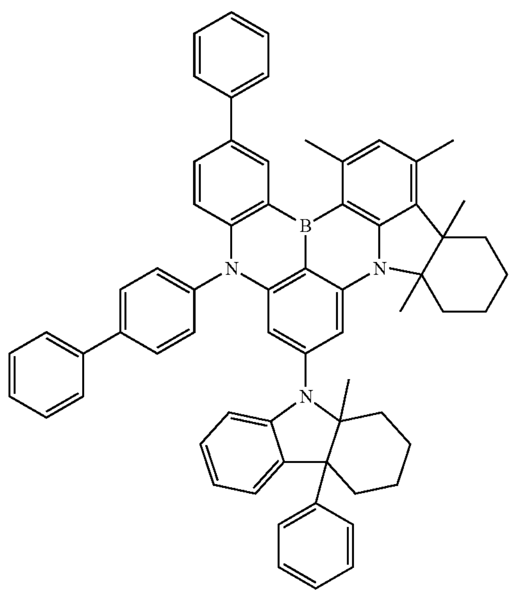
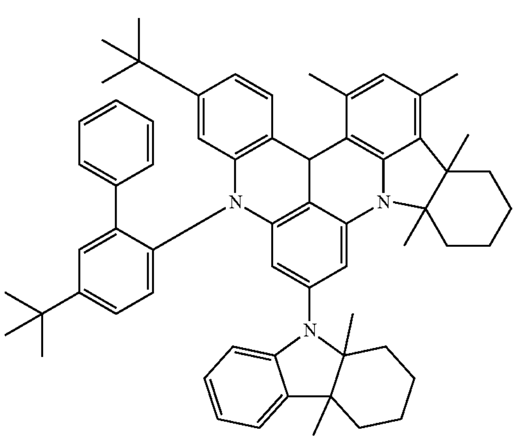
-continued
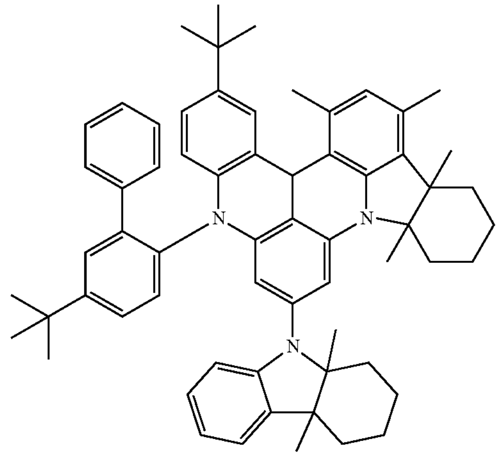
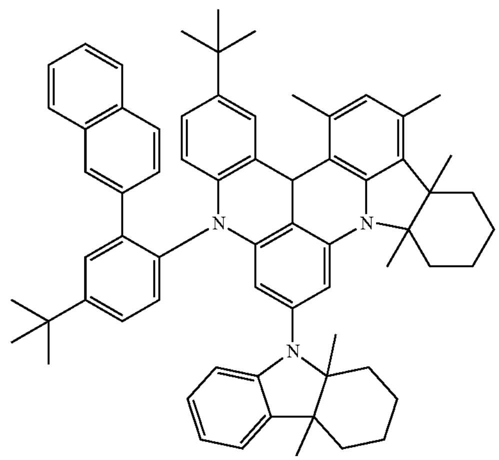
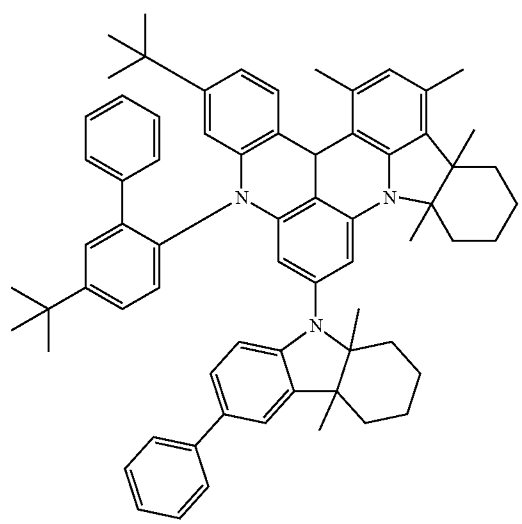

-continued
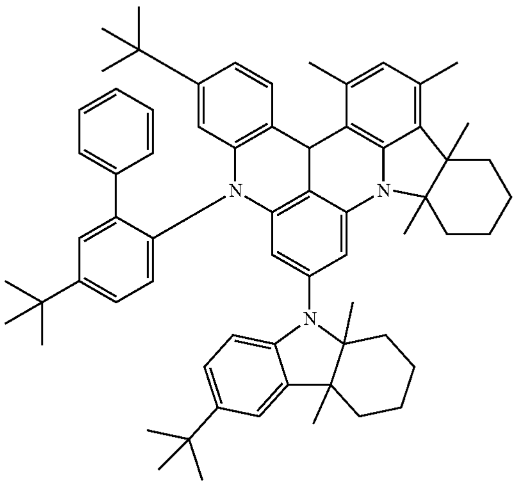
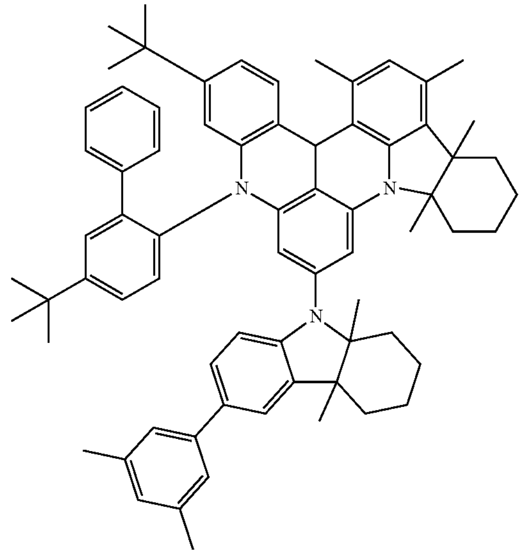
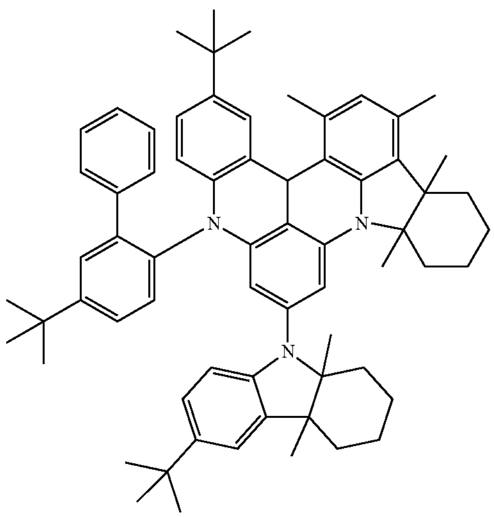
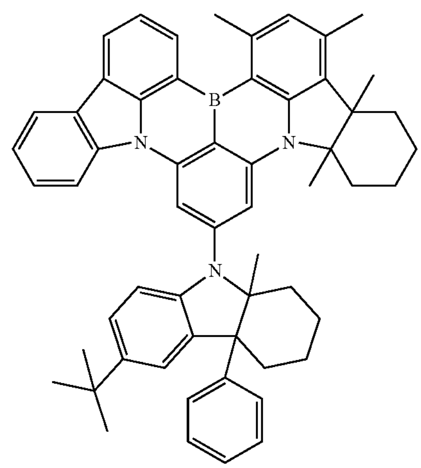
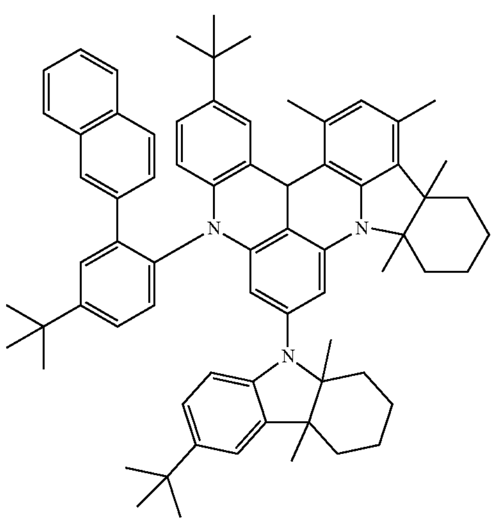
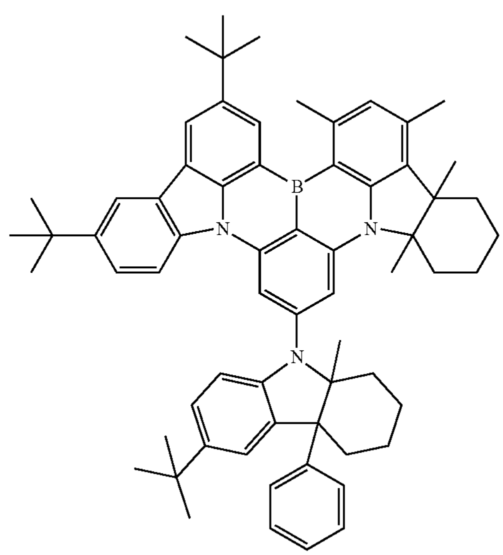
-continued -continued
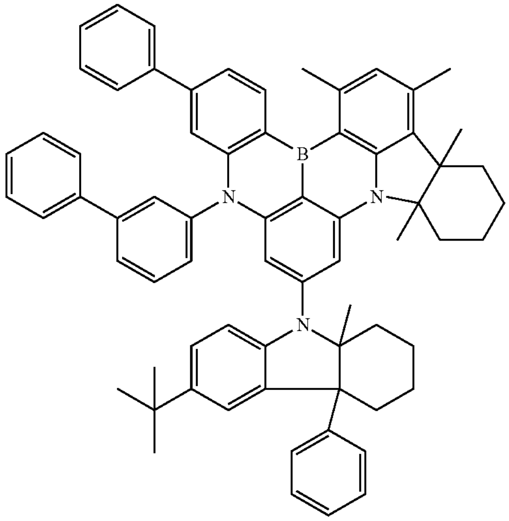
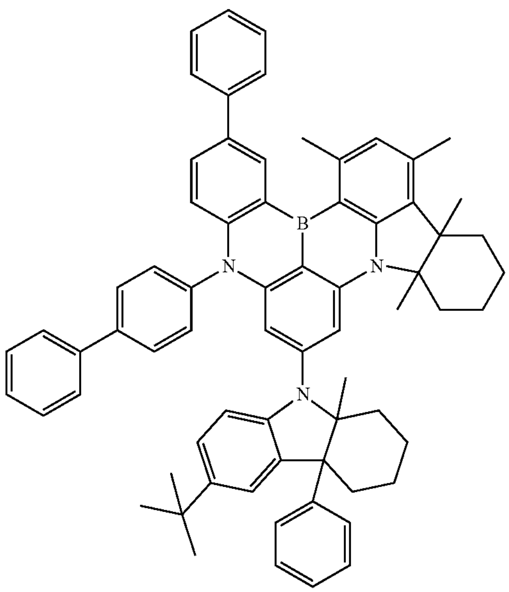
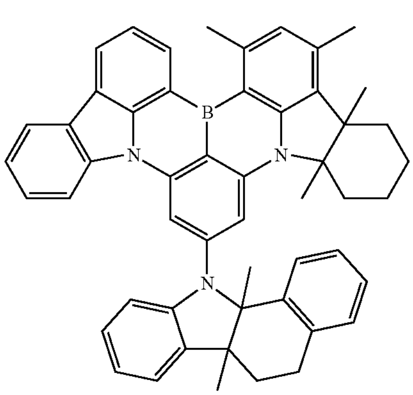
-continued
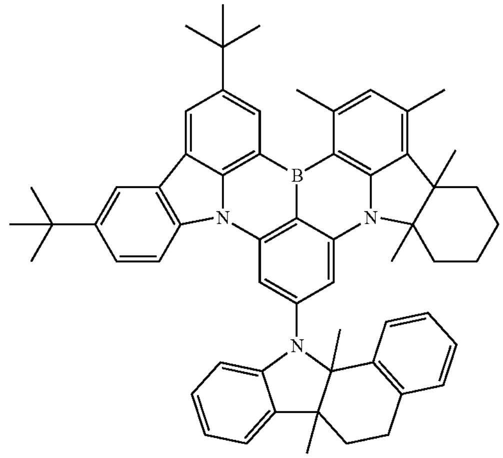
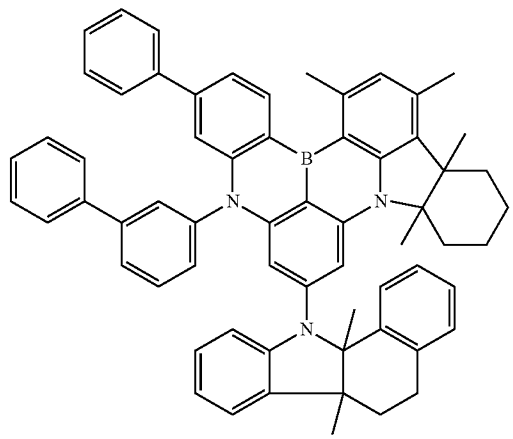
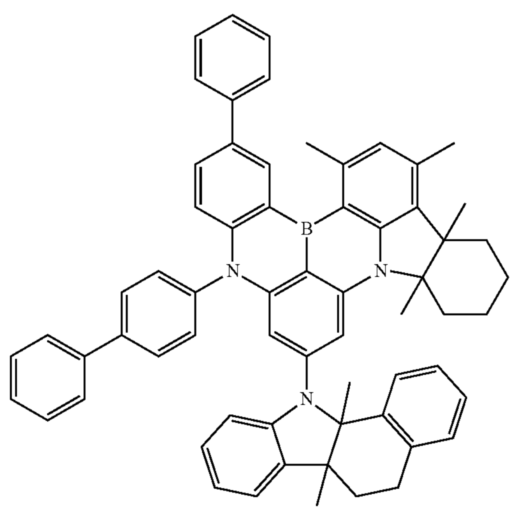

-continued
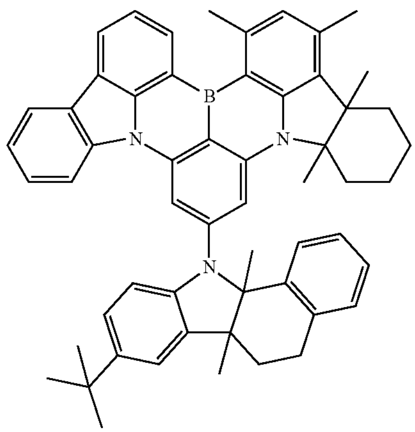
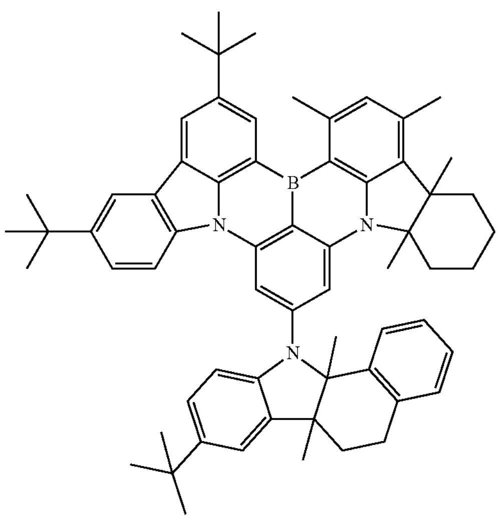
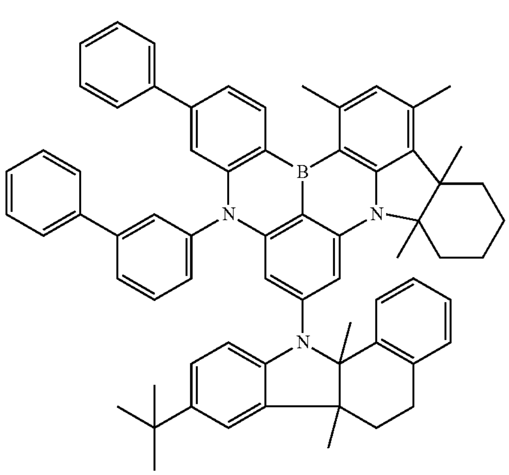
-continued
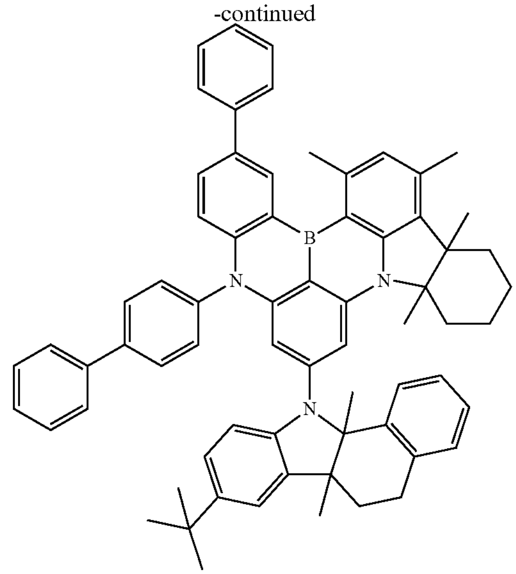
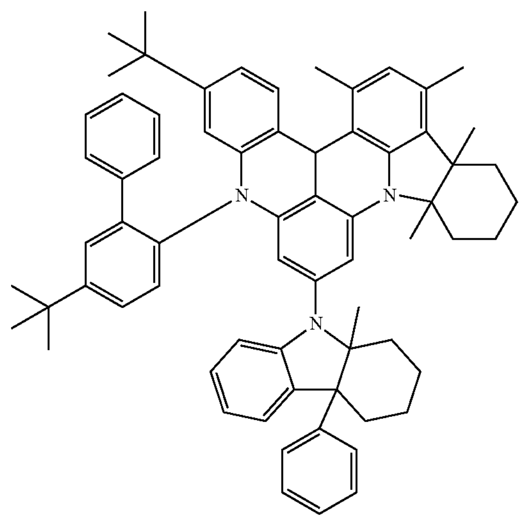
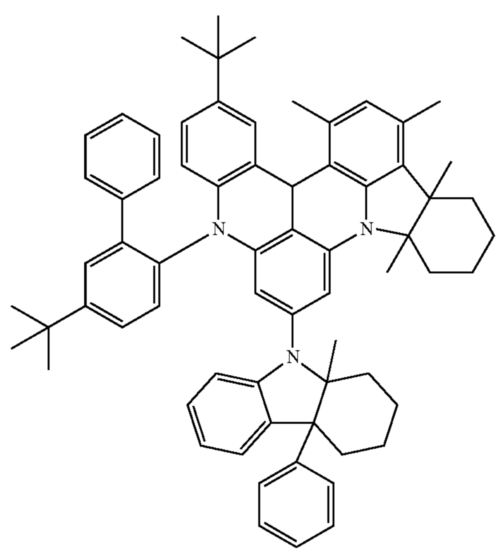

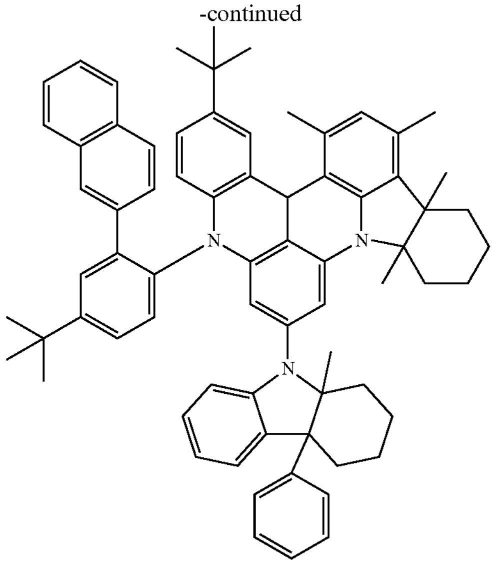
N
N
N
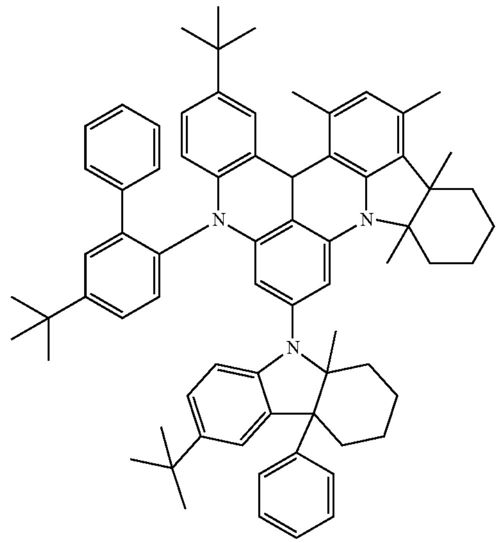
N
N
N
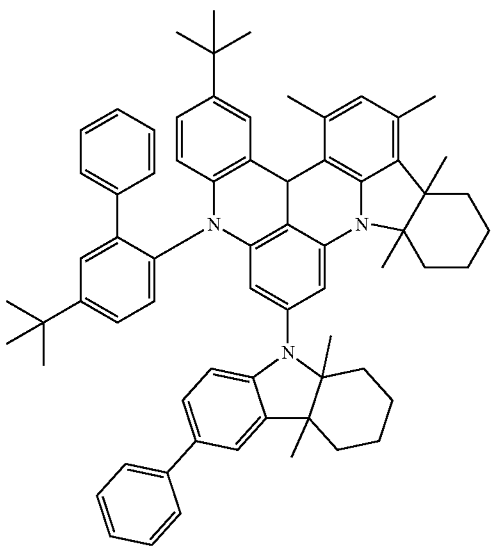
N
N
N
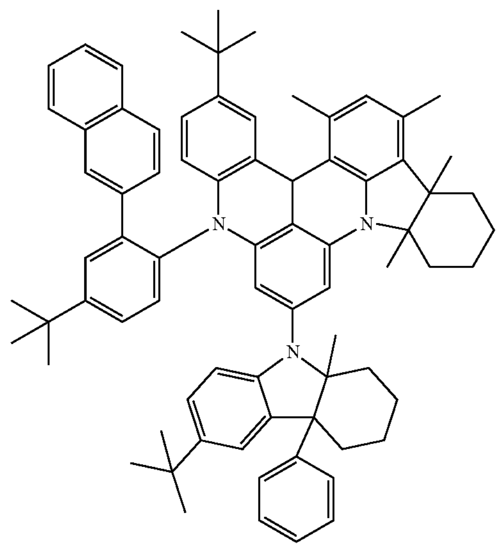
N
N
N
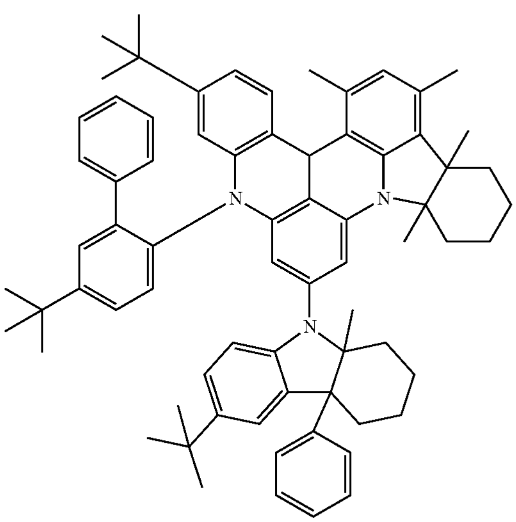
N
N
N
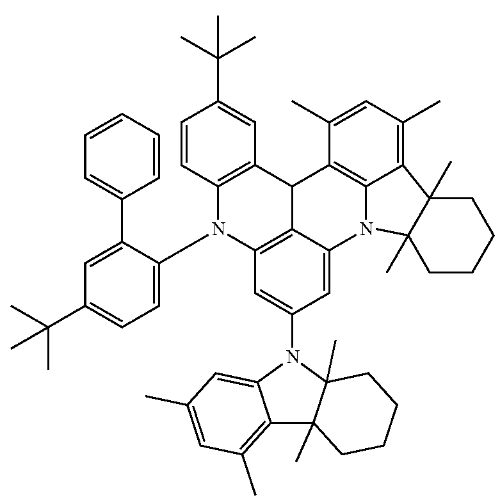
N
N
N -continued
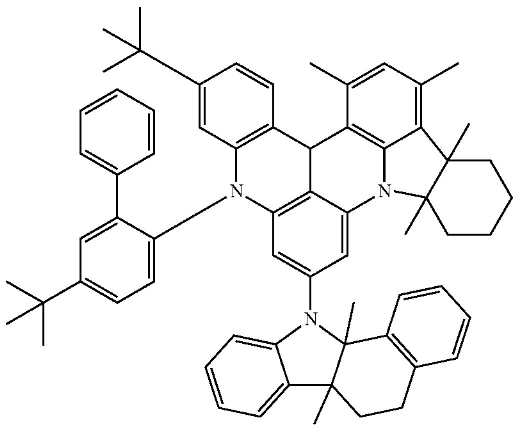
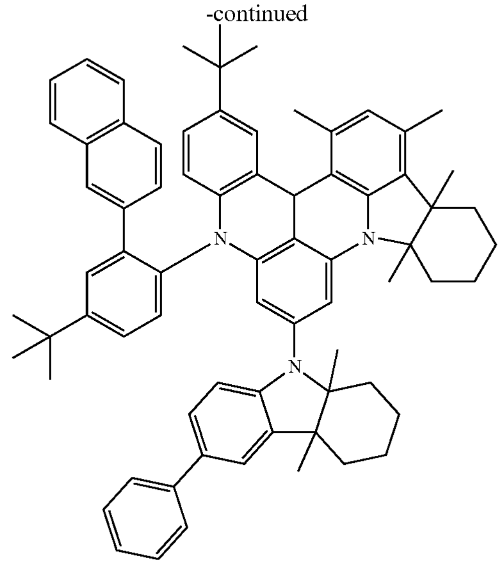
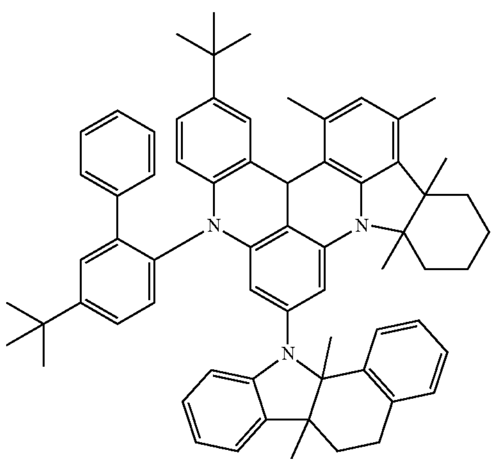
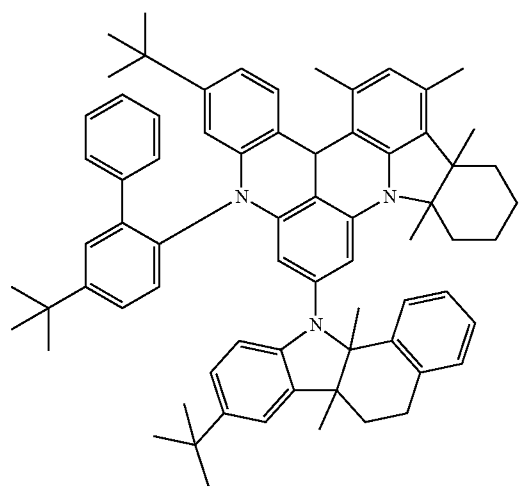
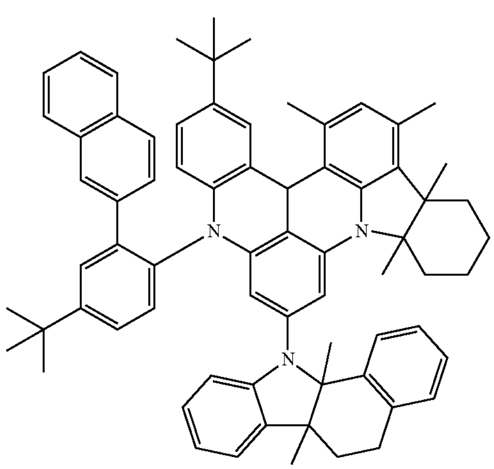
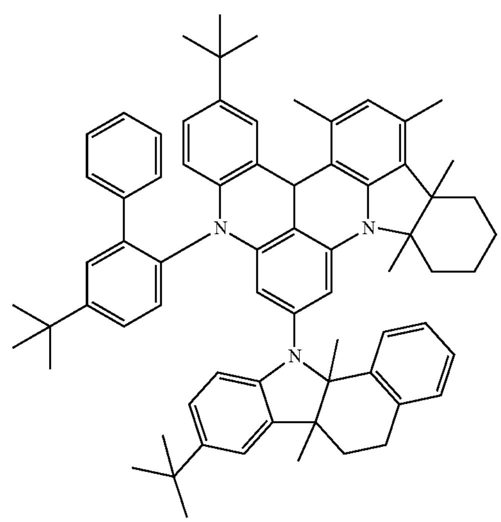
-continued

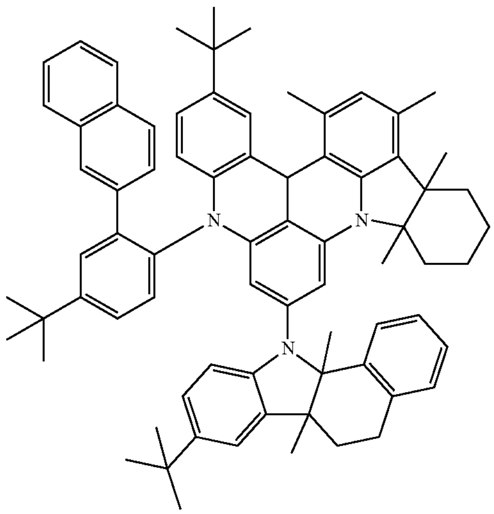
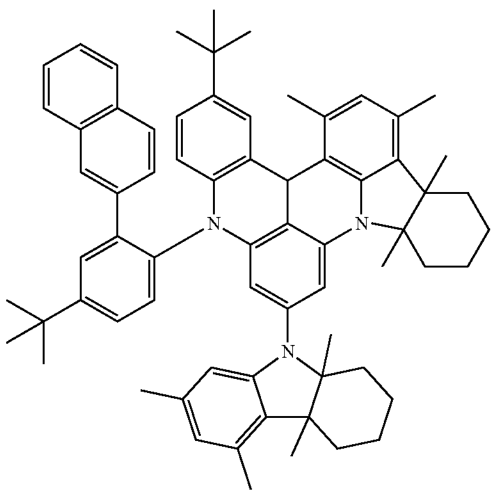
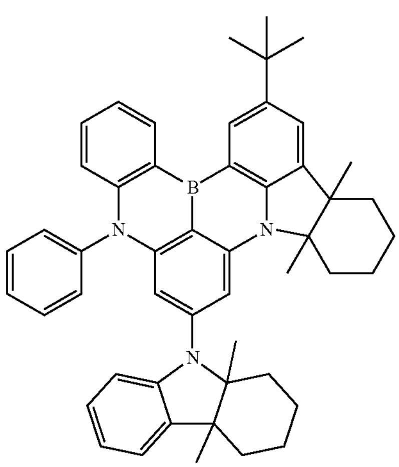
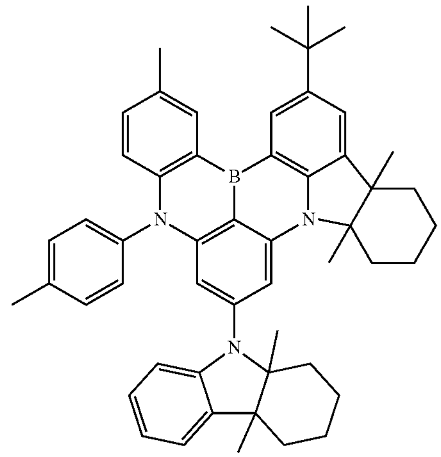
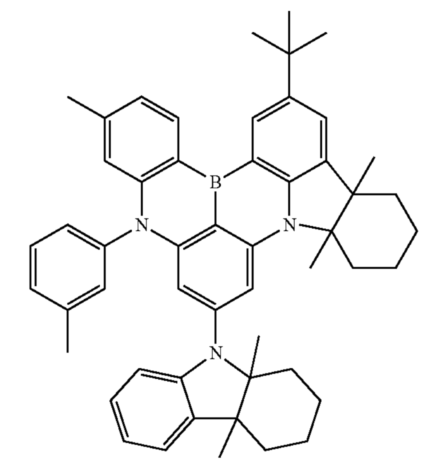
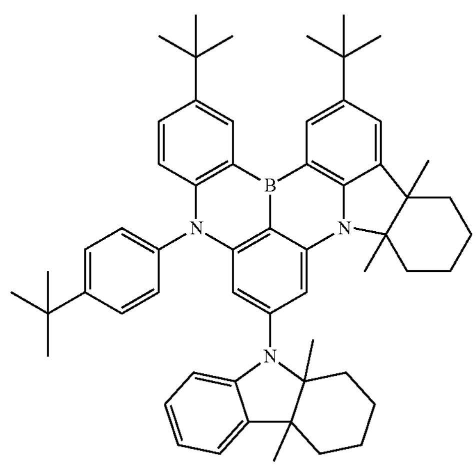

-continued
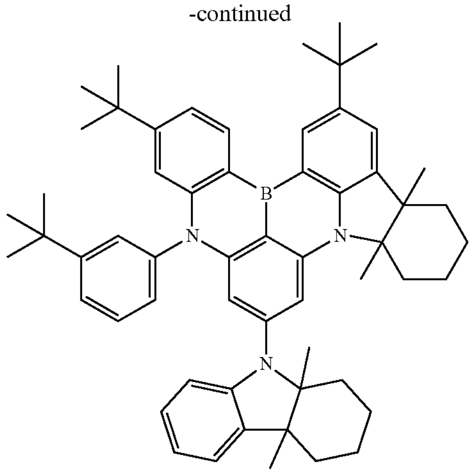
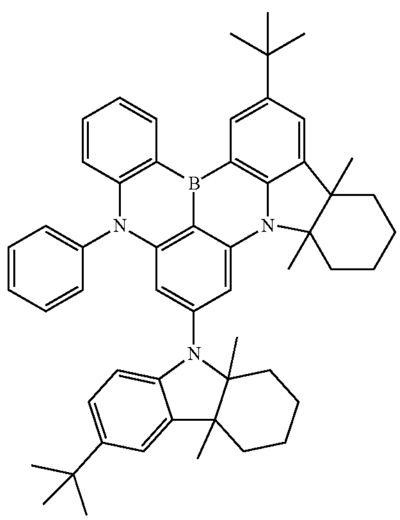
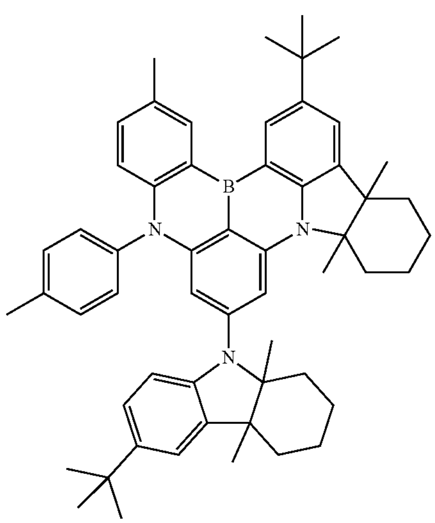
-continued
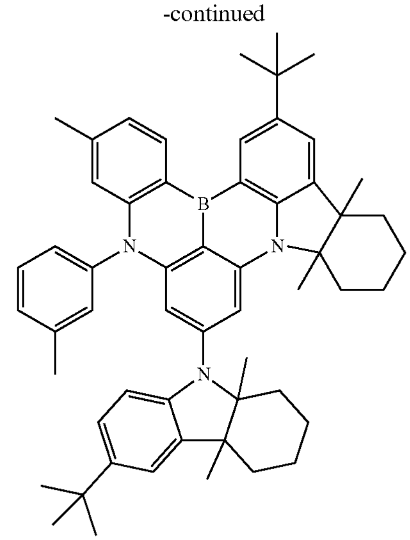
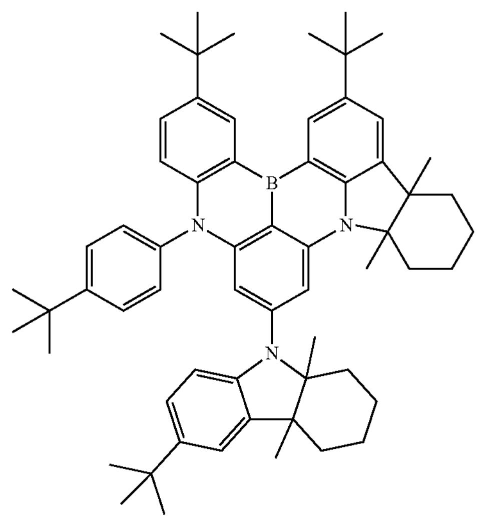
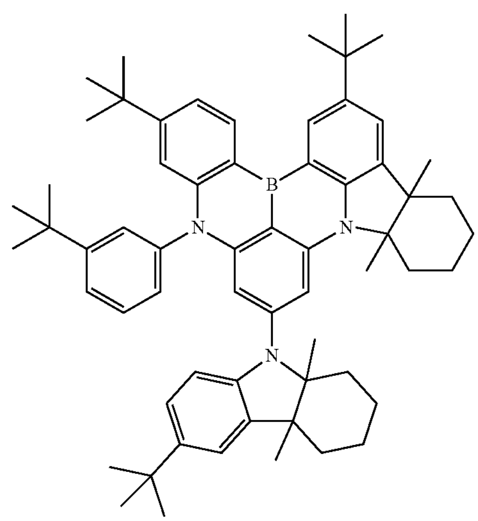

-continued
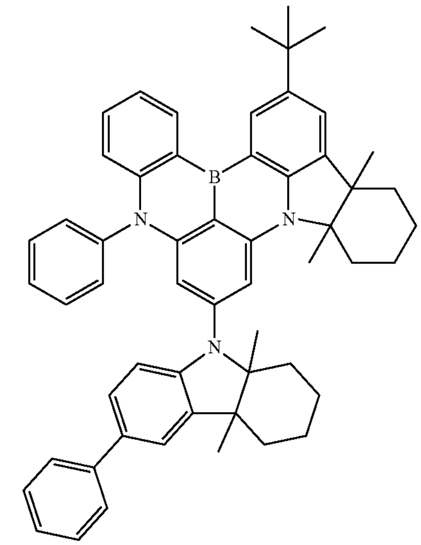
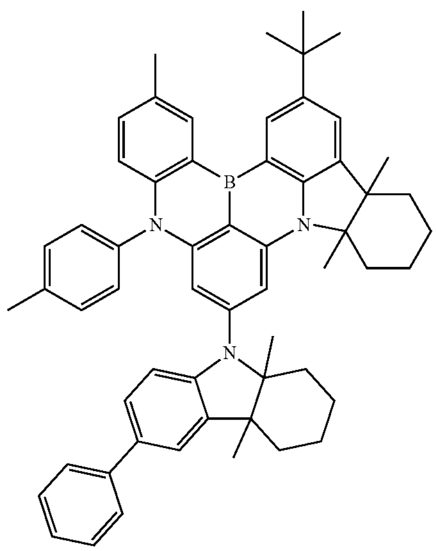
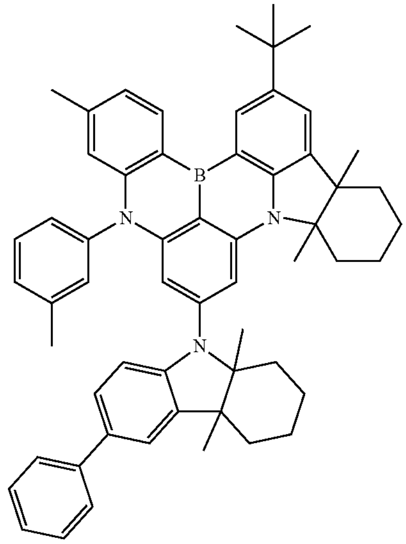
-continued
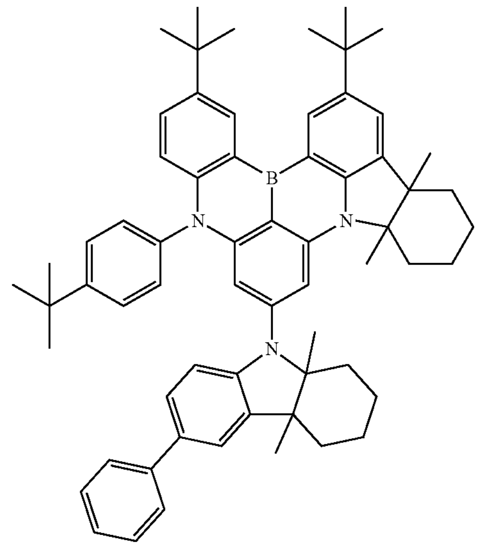
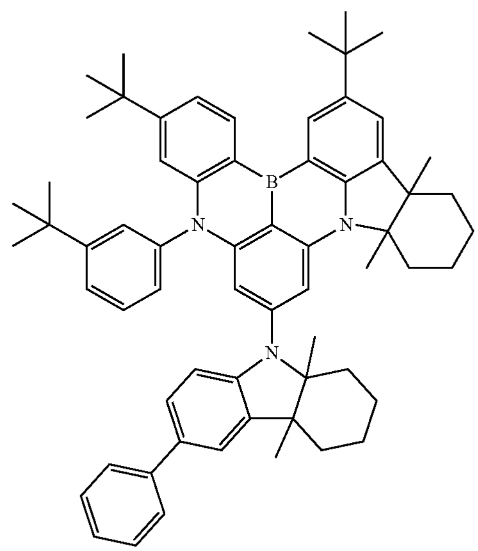
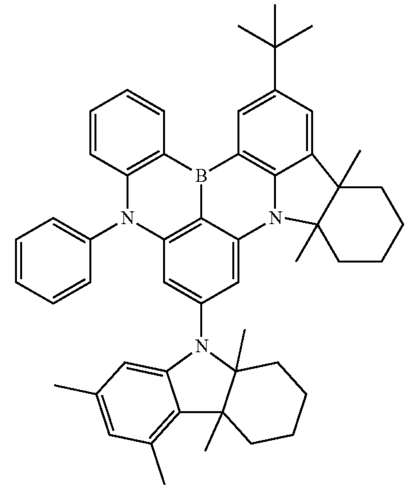

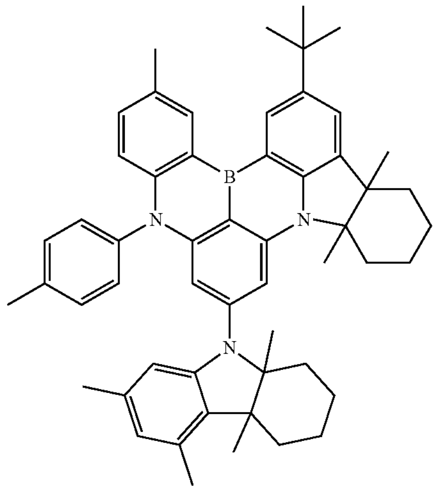
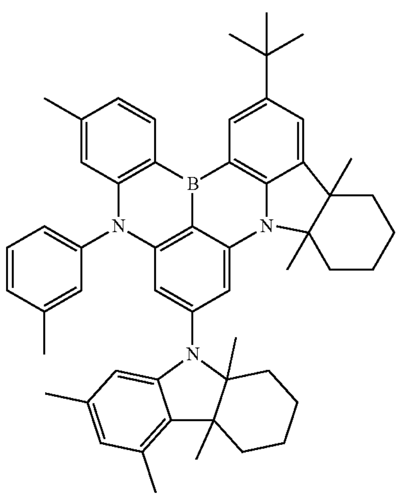
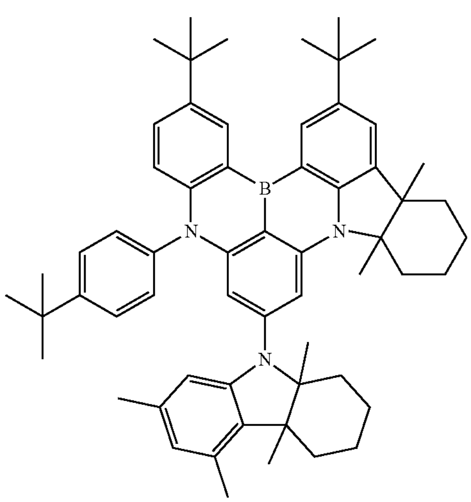
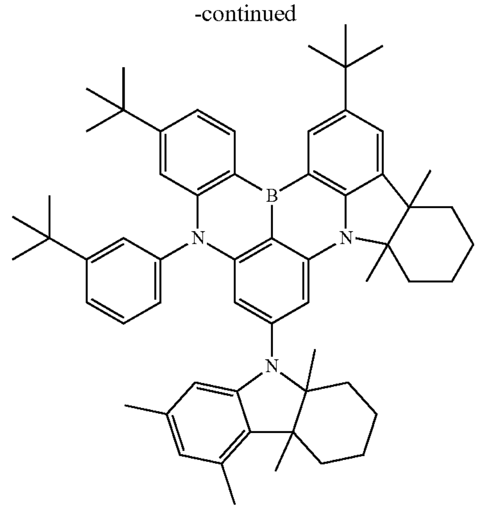
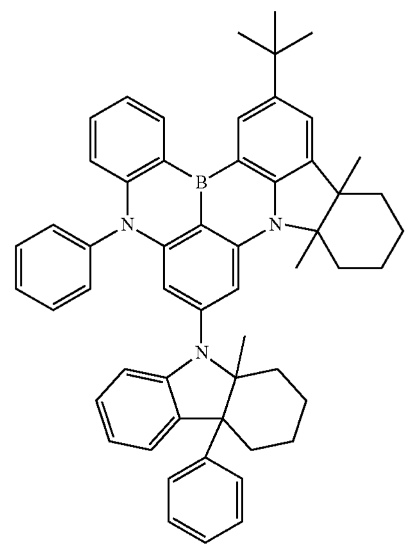
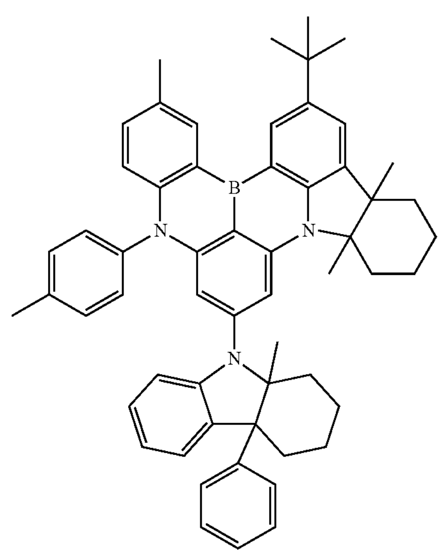

-continued
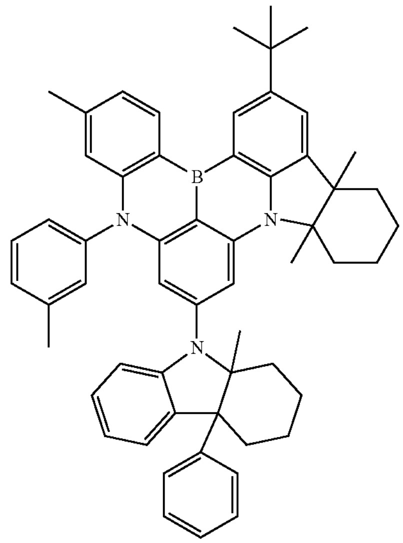
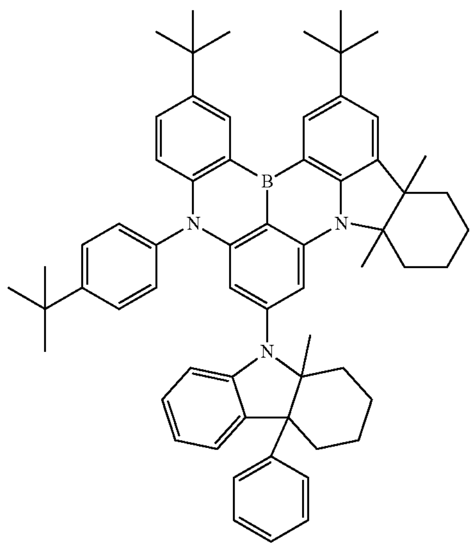
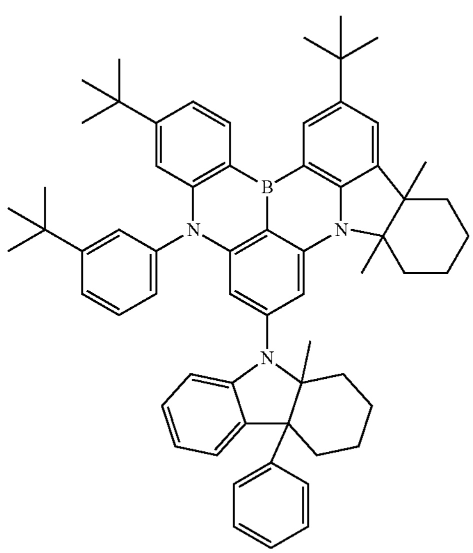
-continued
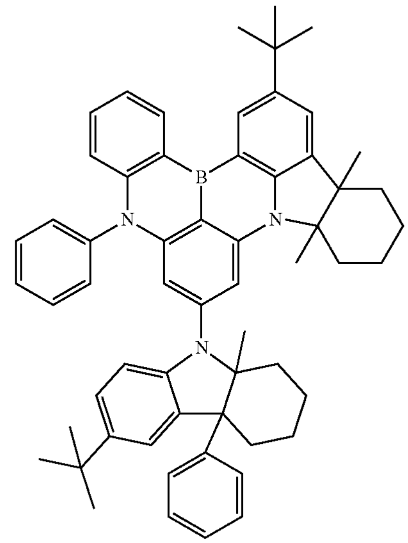
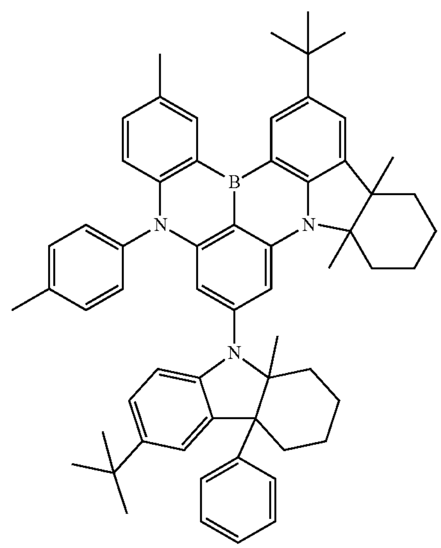
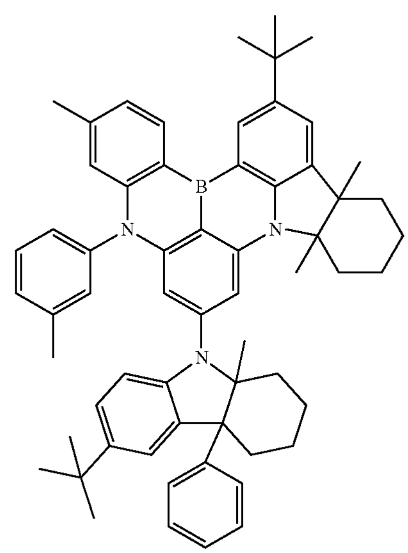

-continued
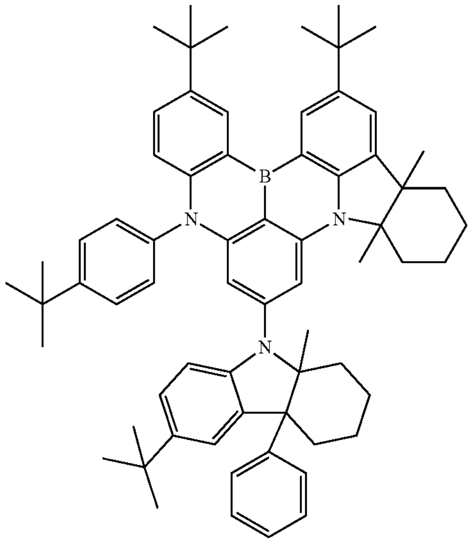
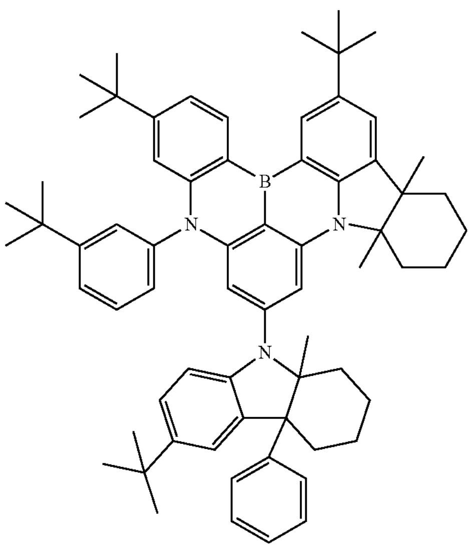
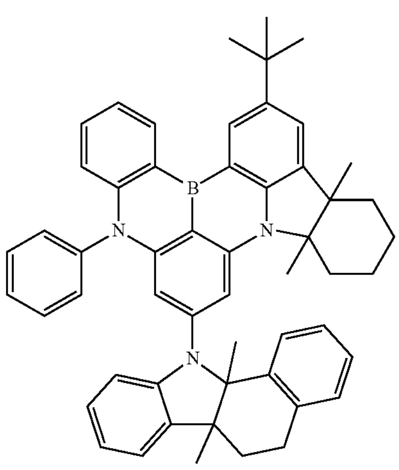
-continued
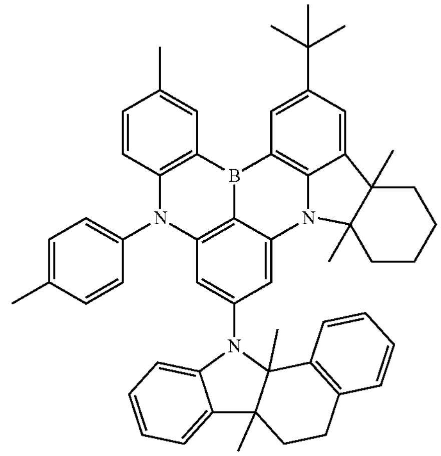
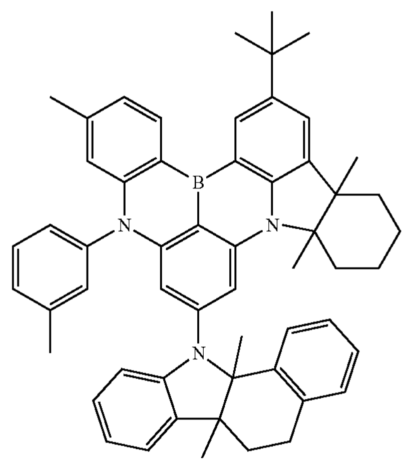
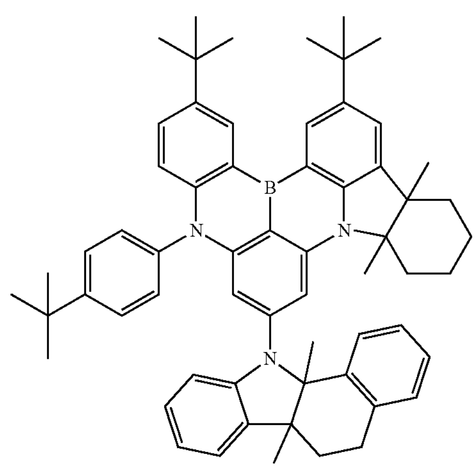

-continued
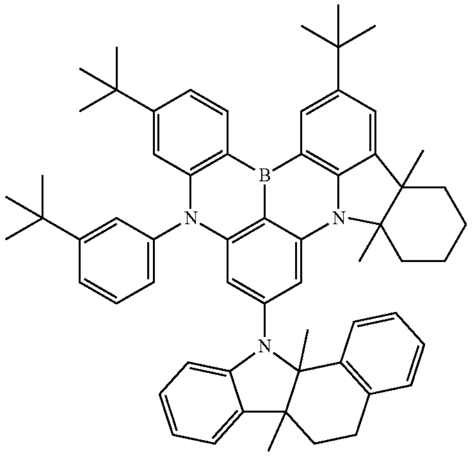
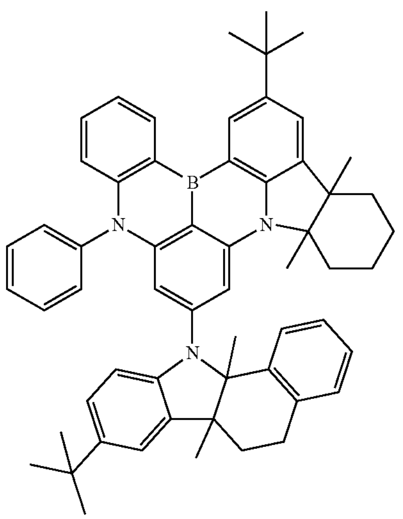
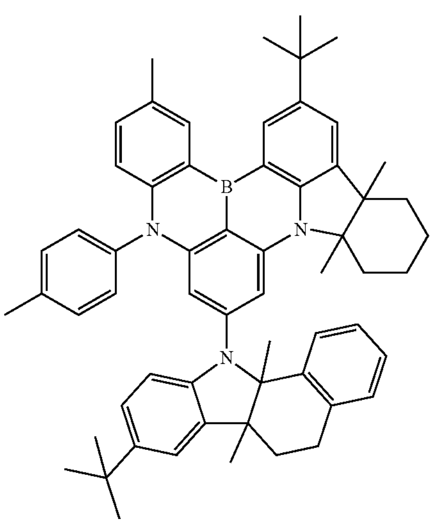
-continued
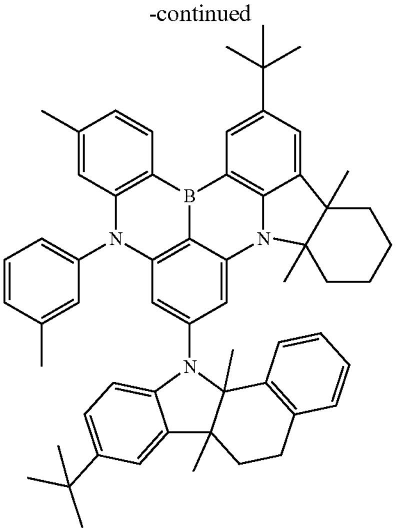
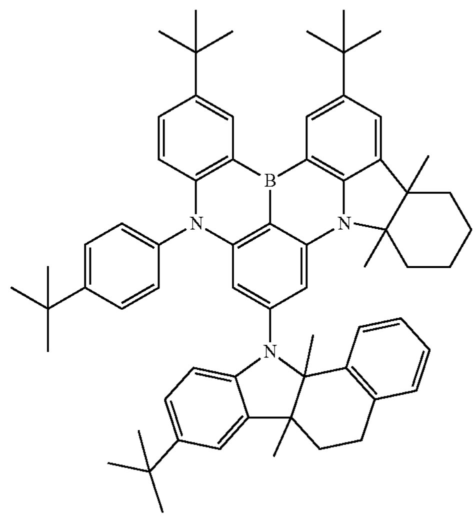
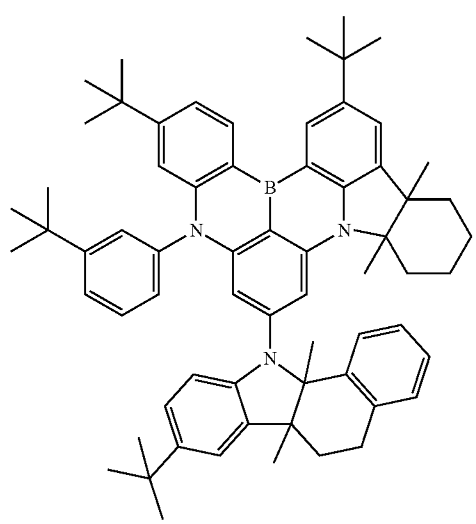

-continued
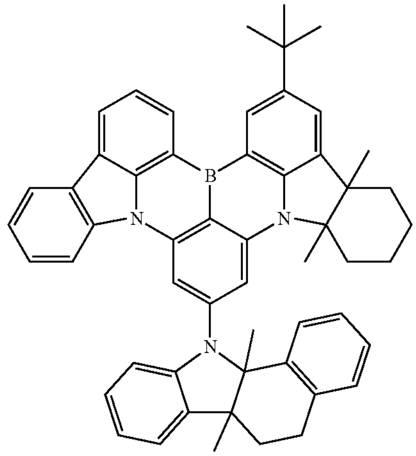
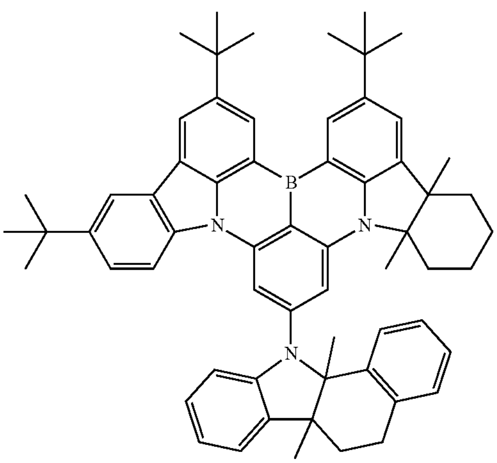
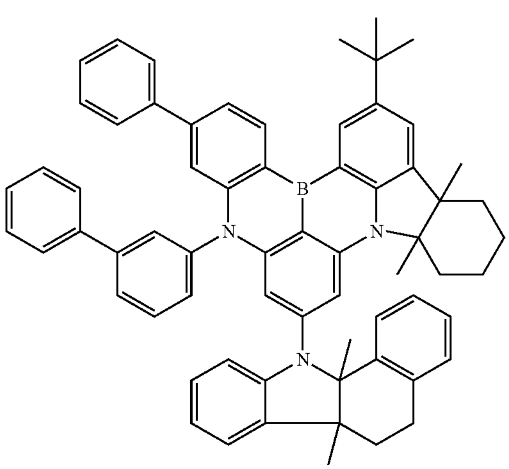
-continued
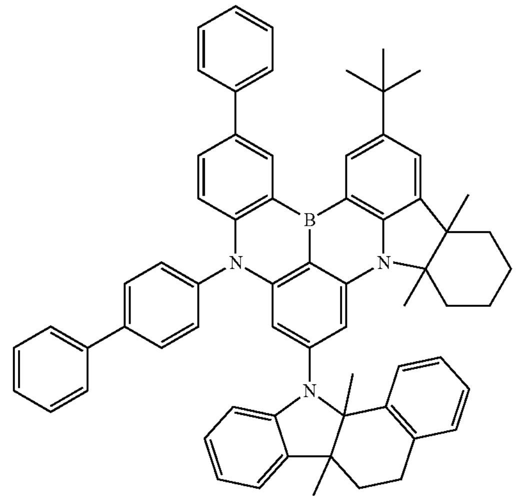
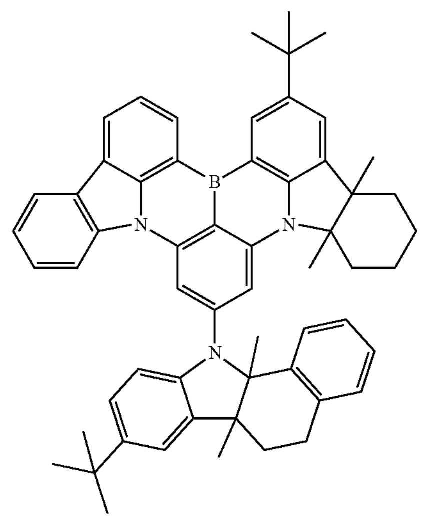
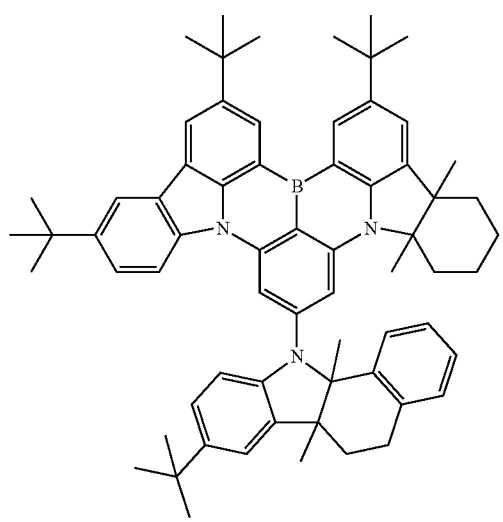

-continued
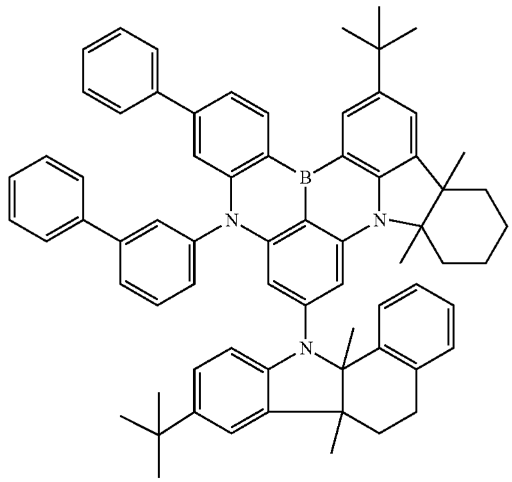
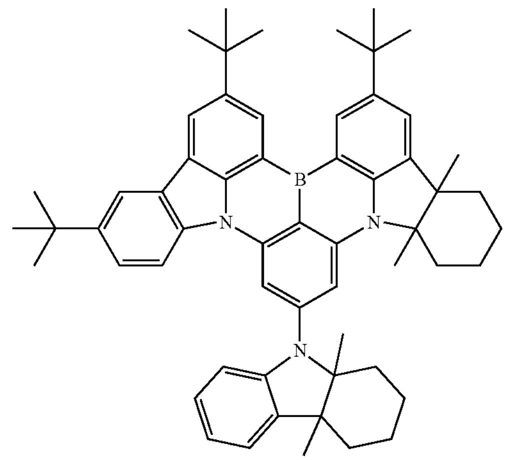
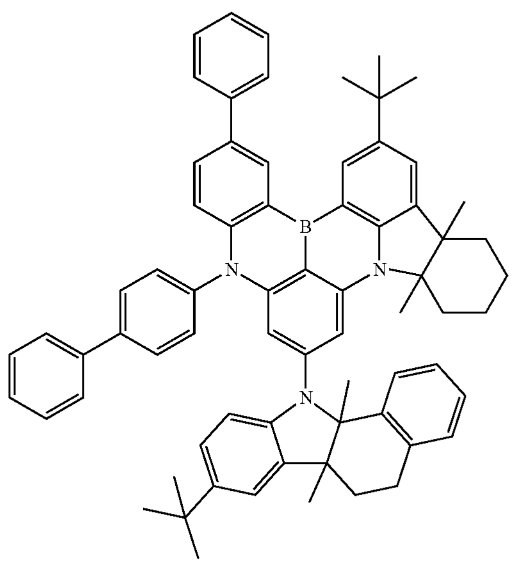
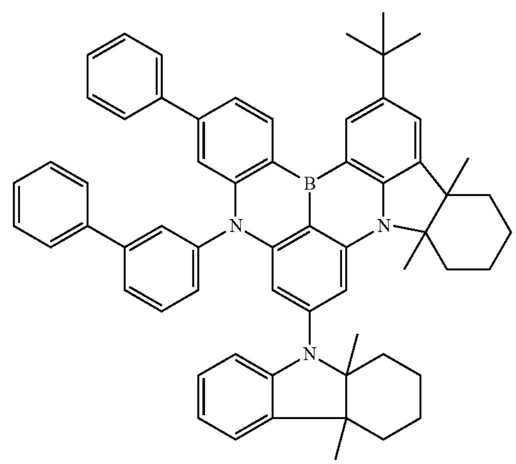
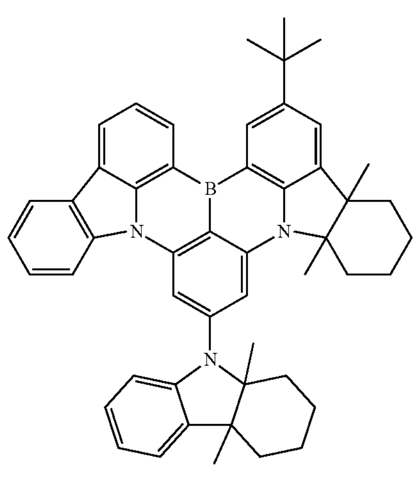
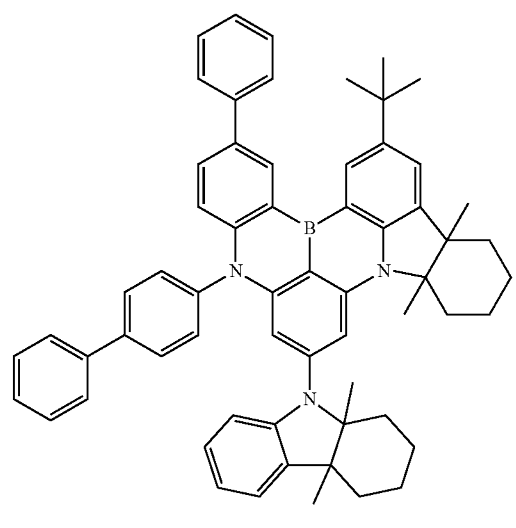

-continued
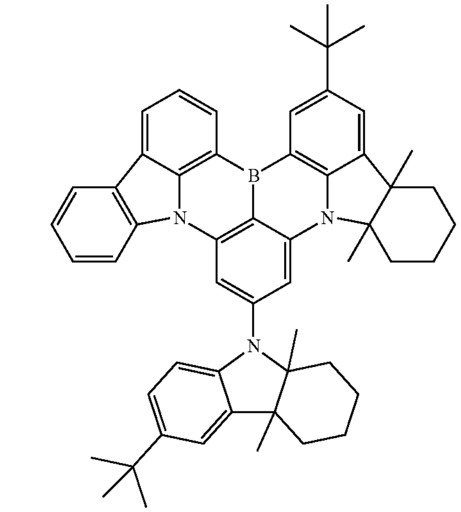
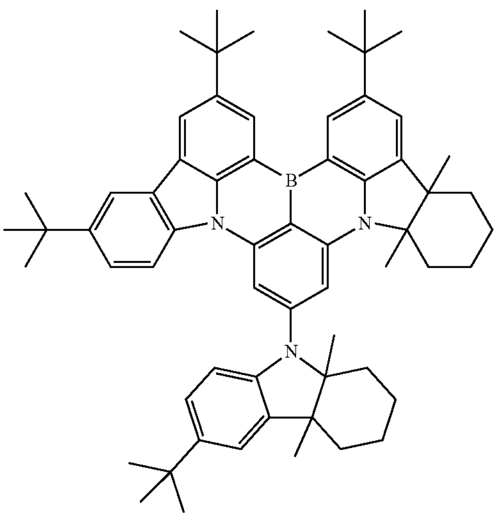
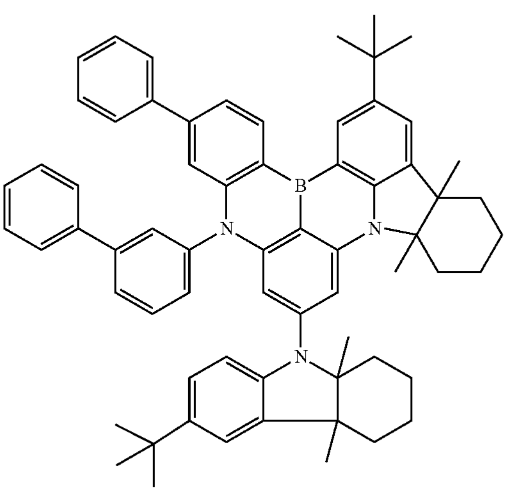
-continued
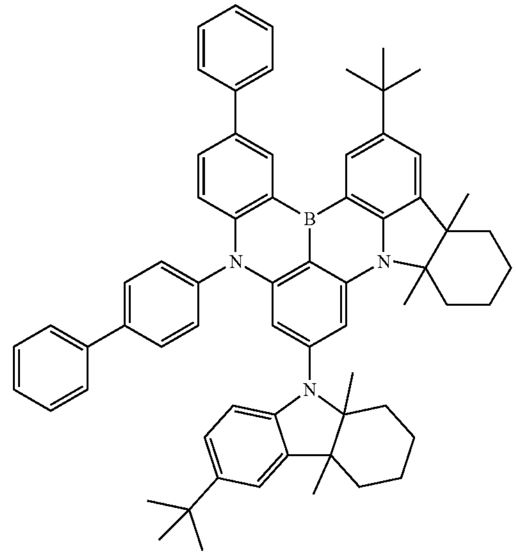
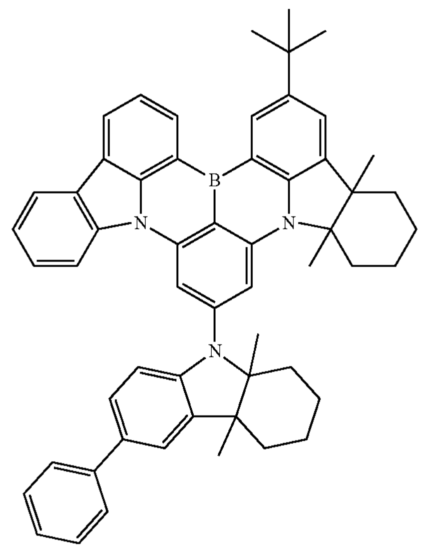
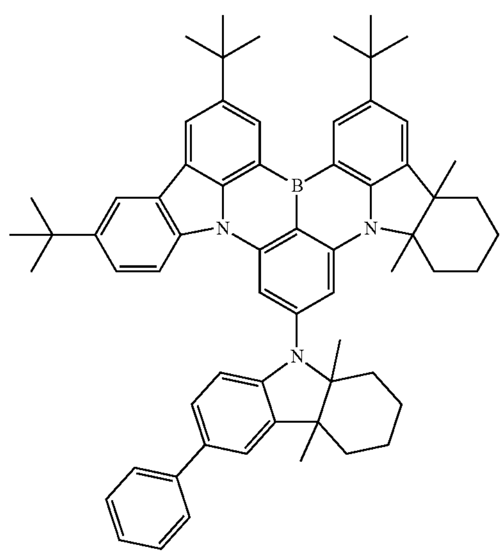

-continued
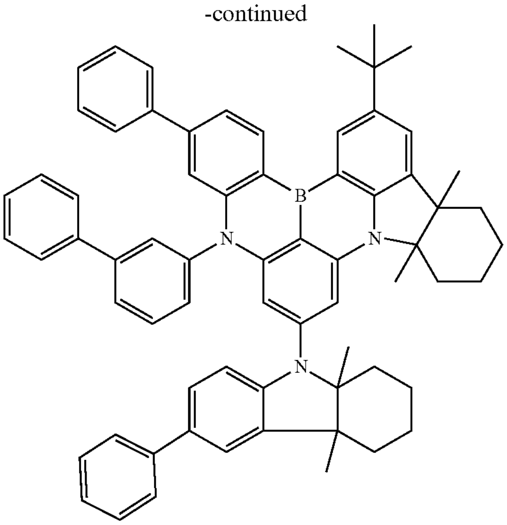
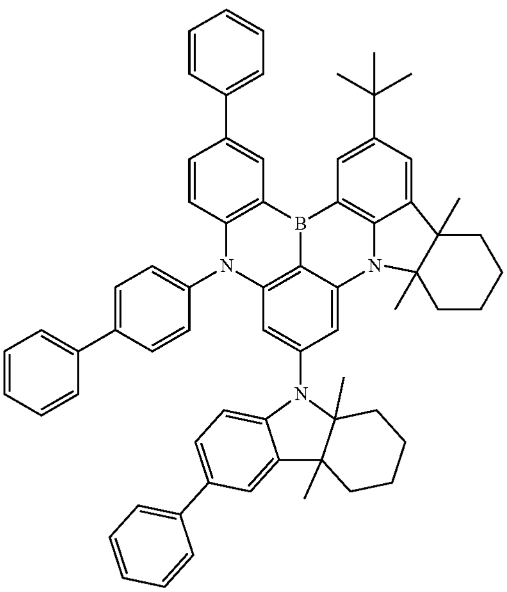
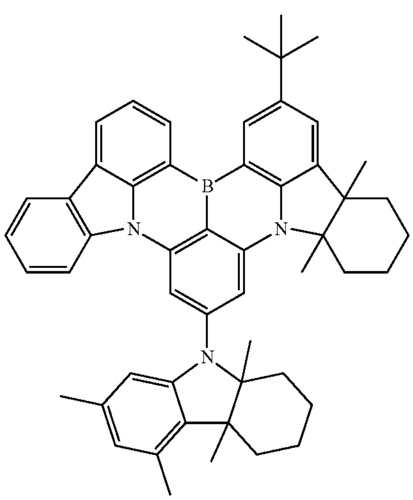
-continued
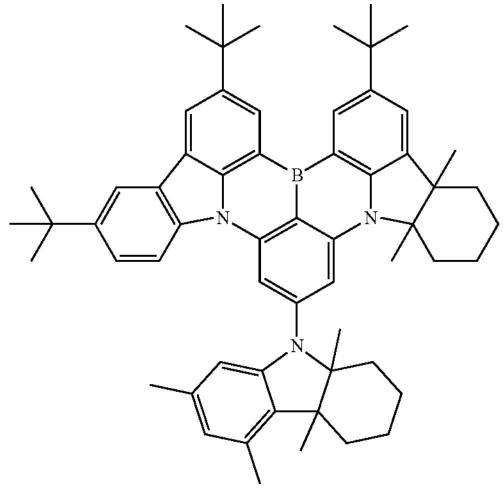
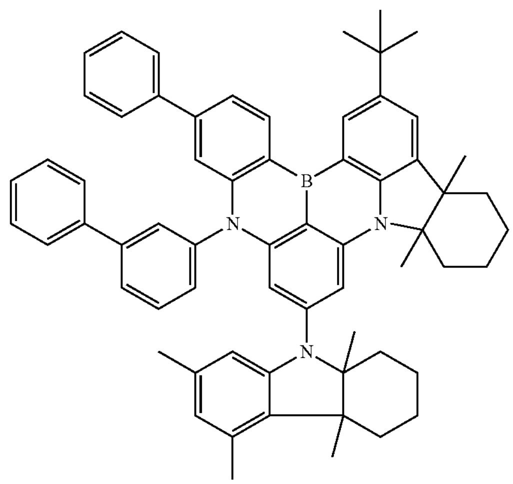
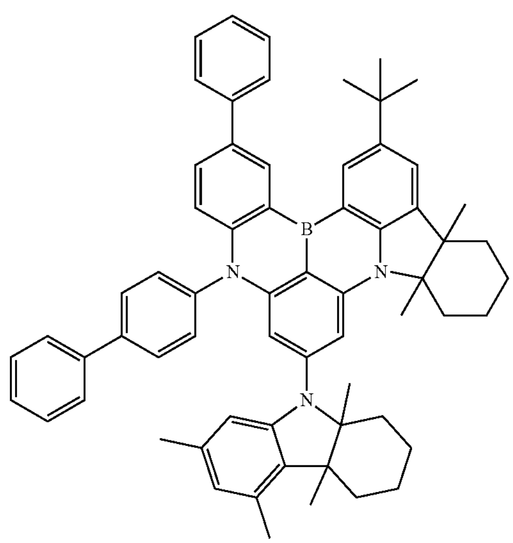

-continued
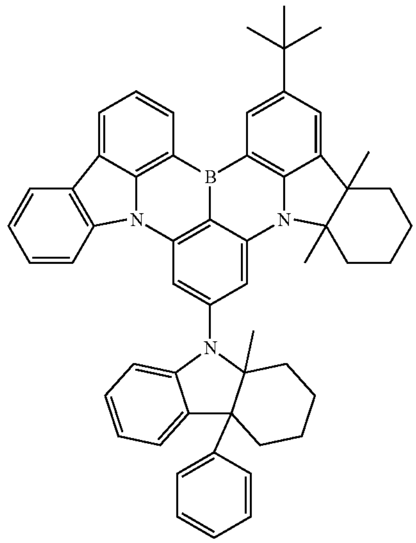
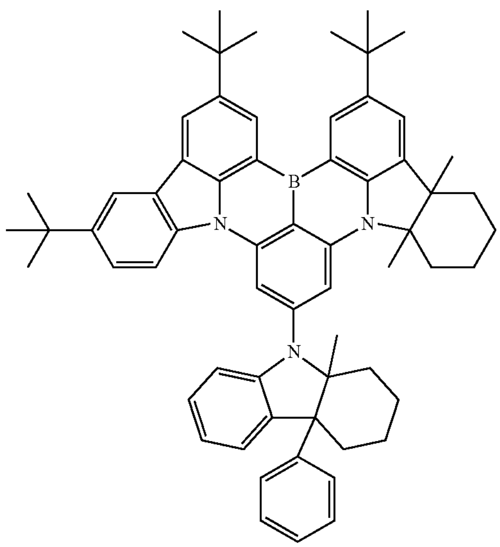
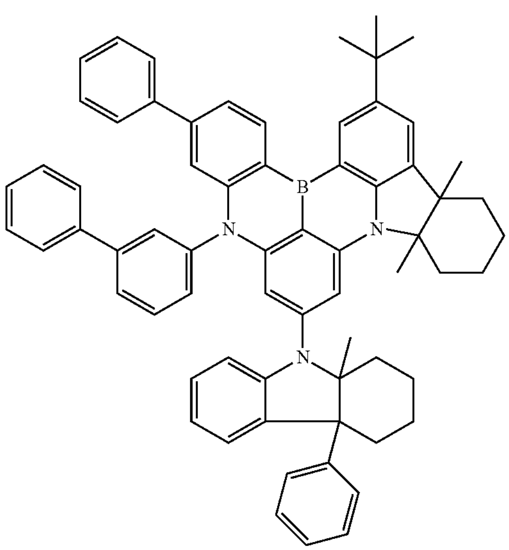
-continued
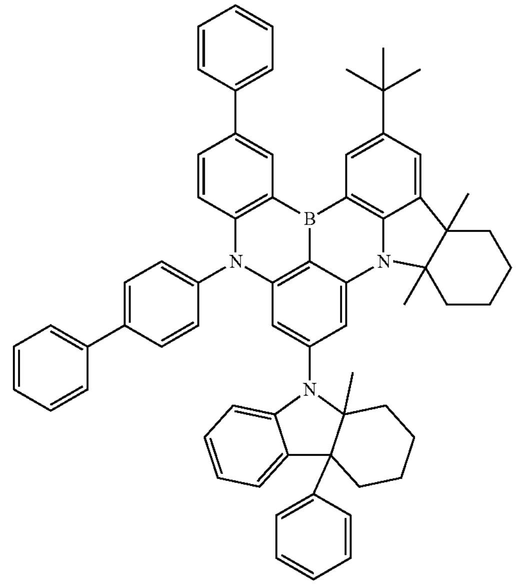
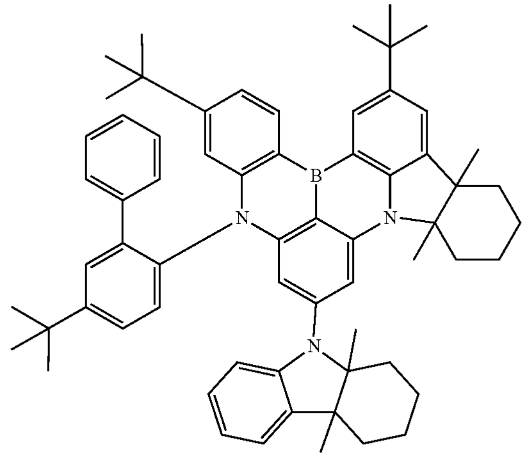
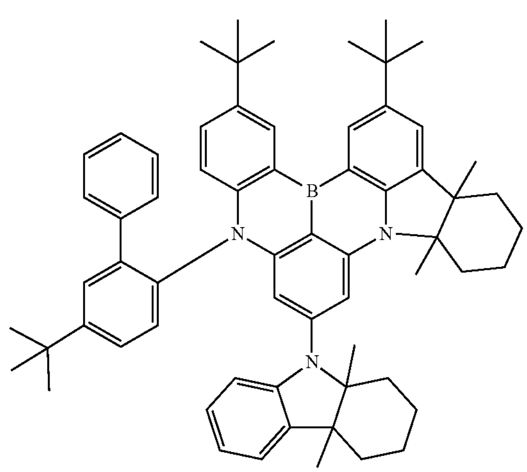

-continued
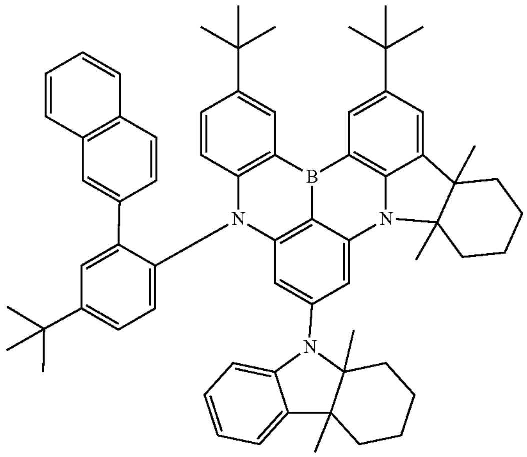
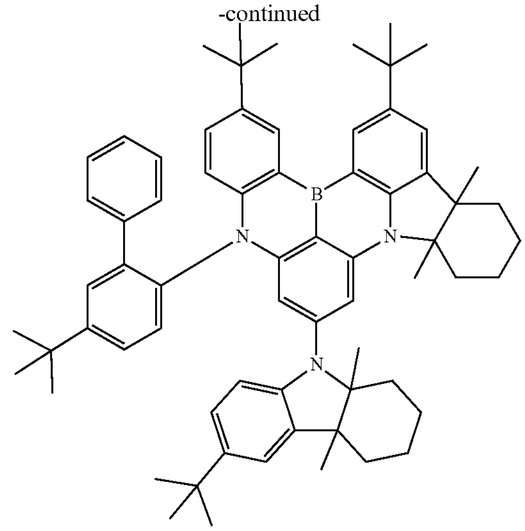
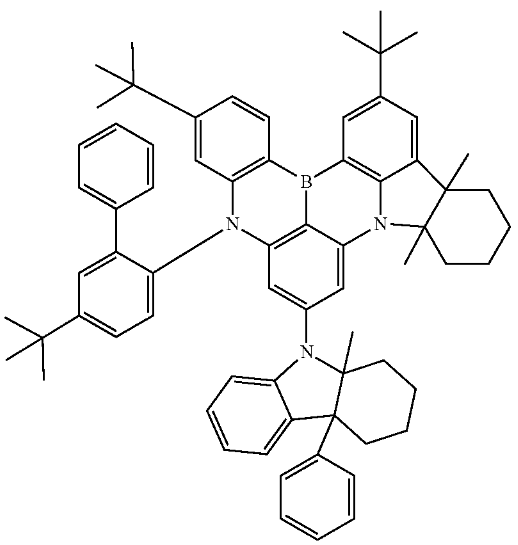
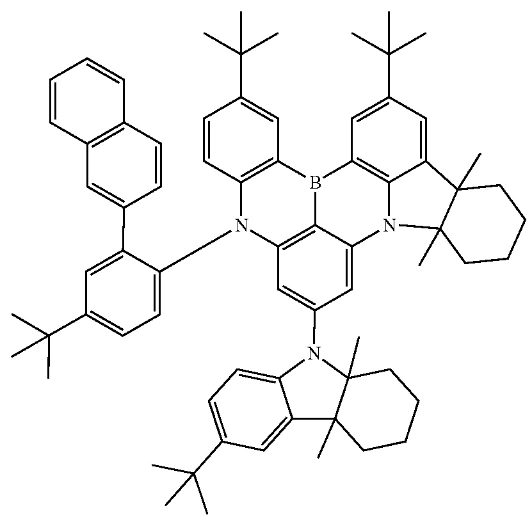
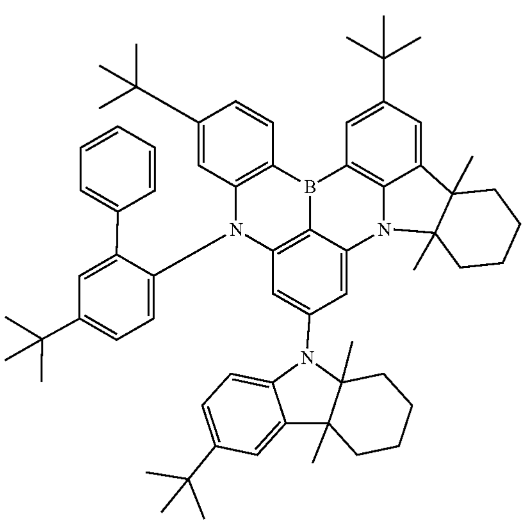
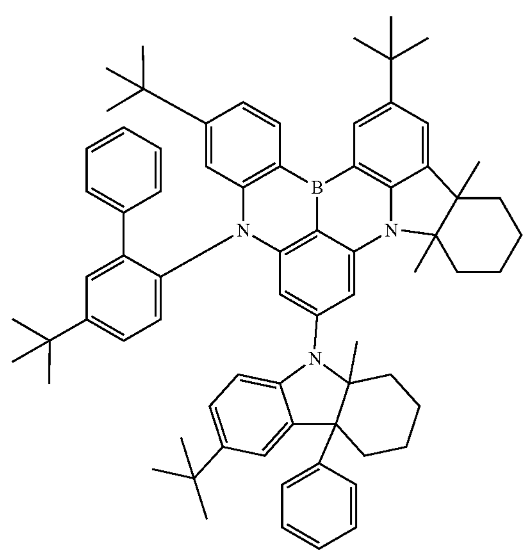

-continued
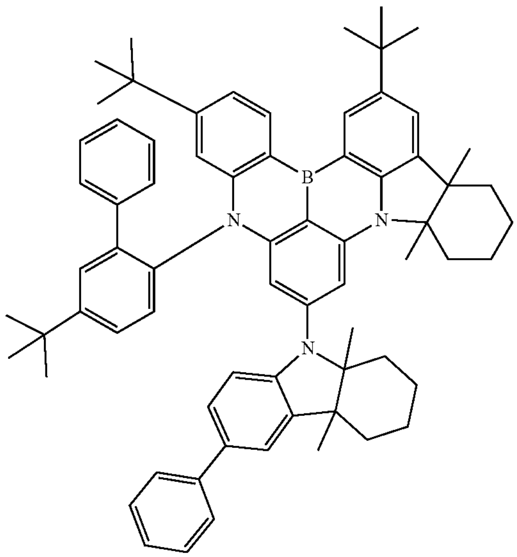
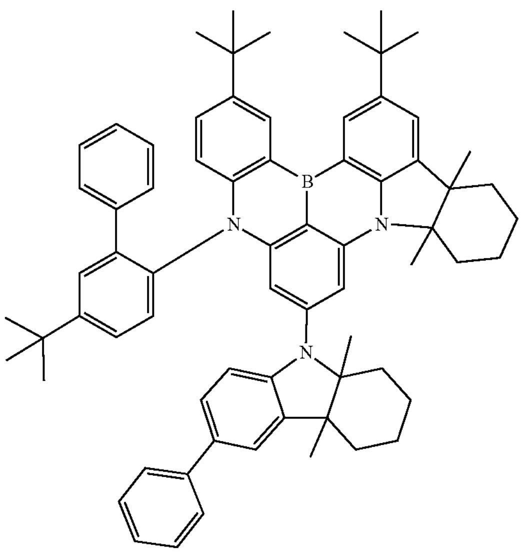
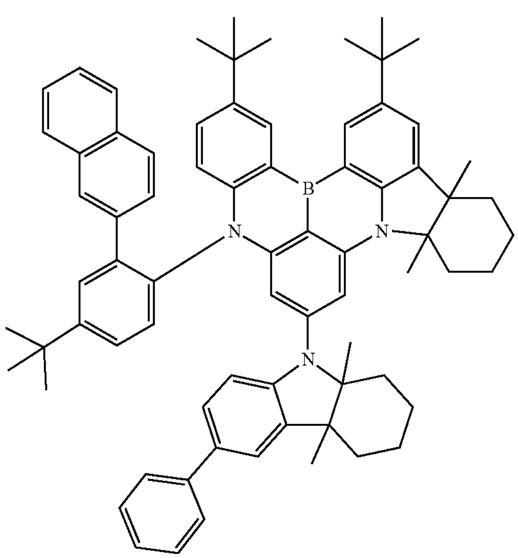
-continued
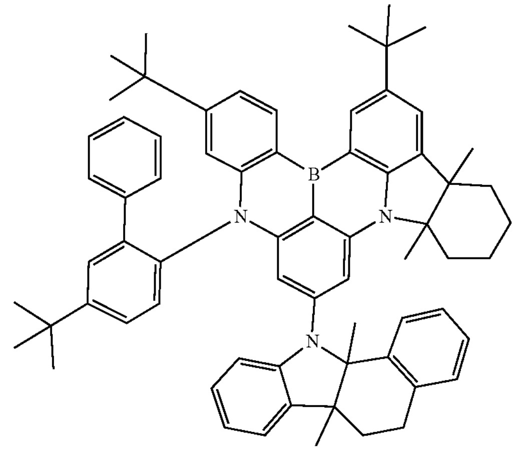
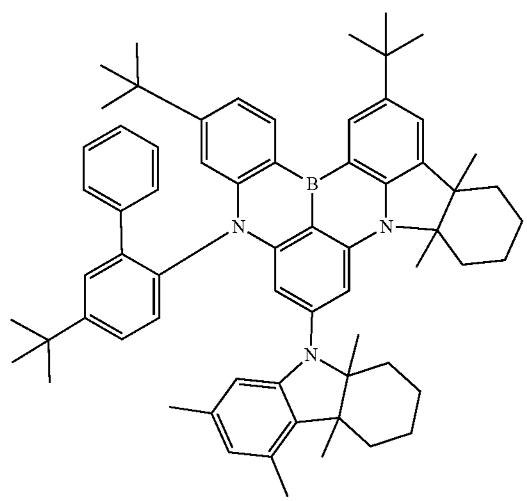
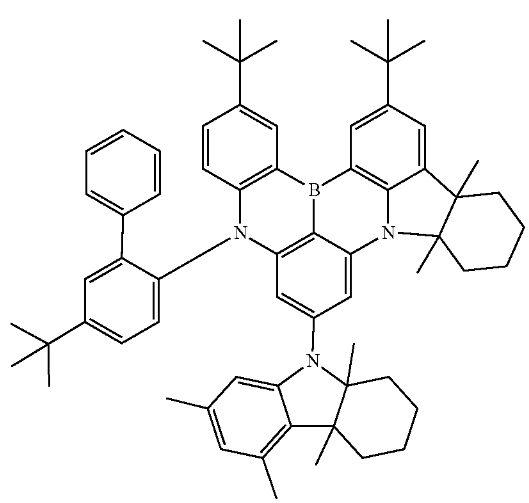

-continued
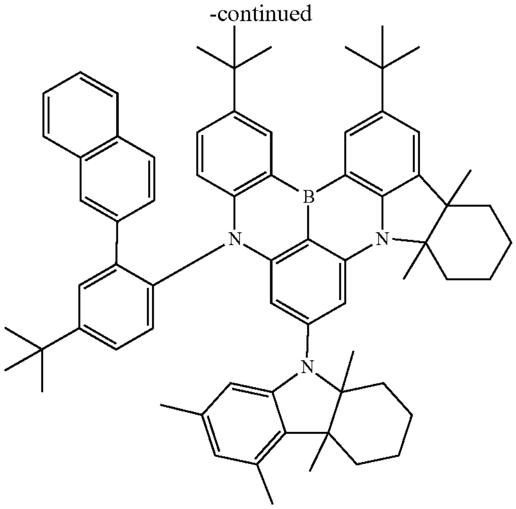
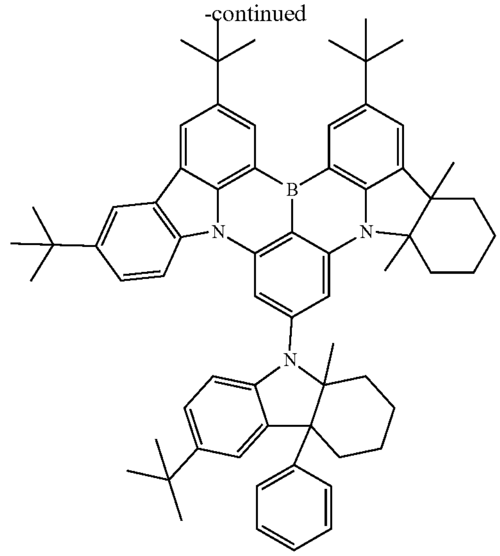
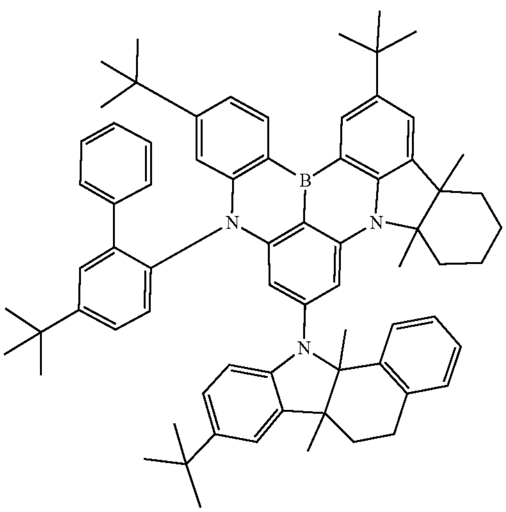
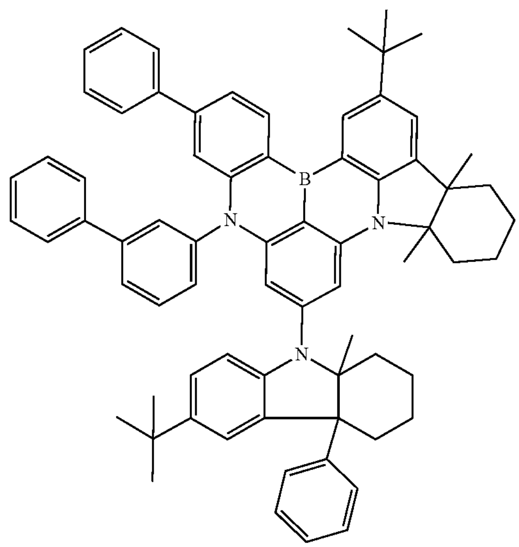
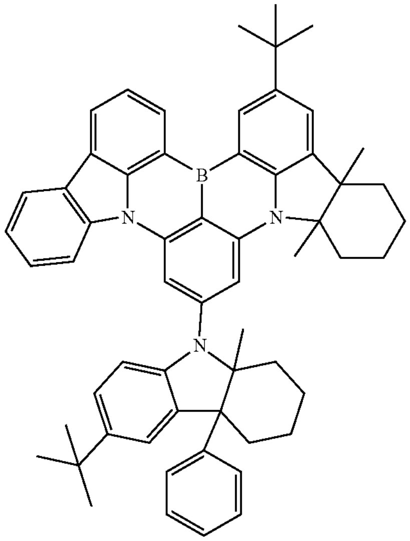
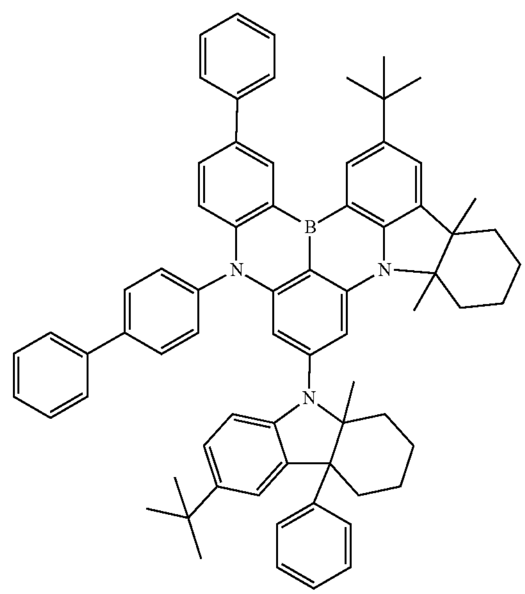

-continued
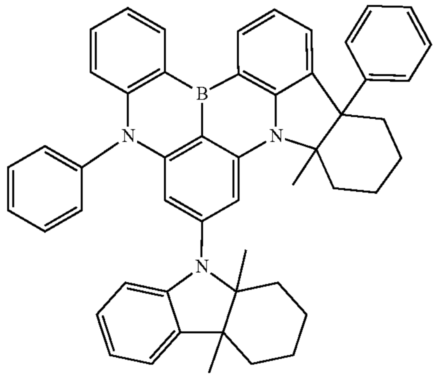
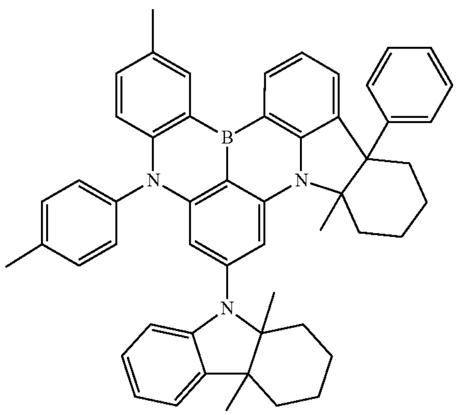
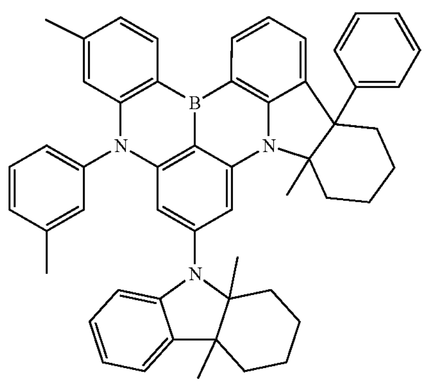
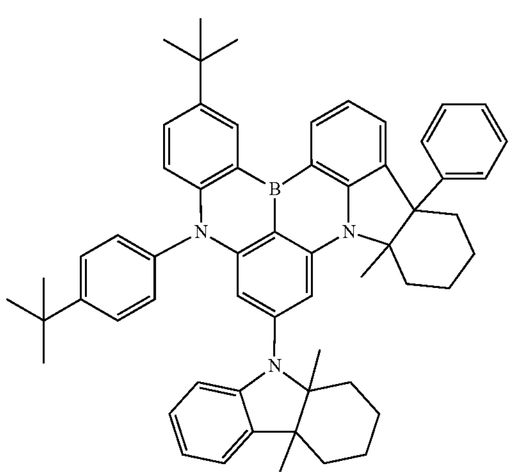
-continued
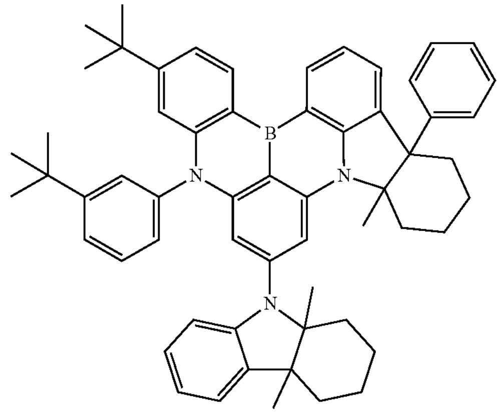
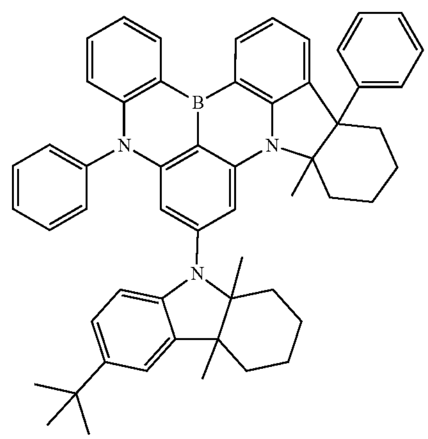
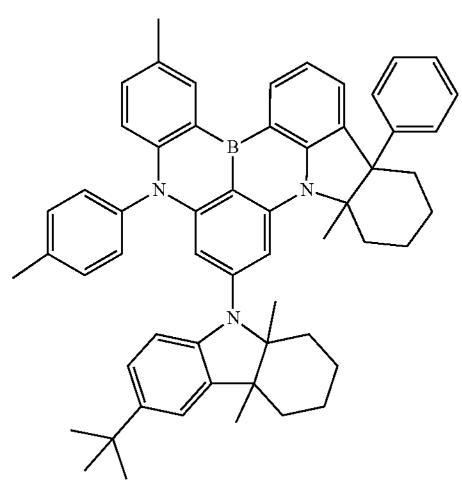

-continued
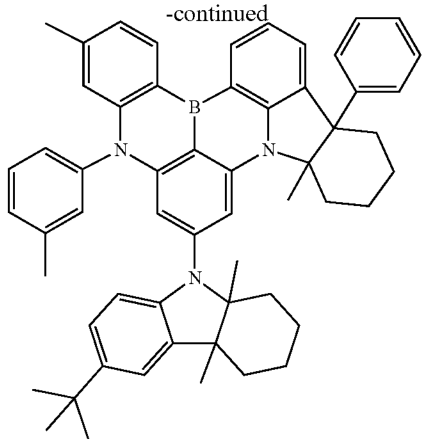
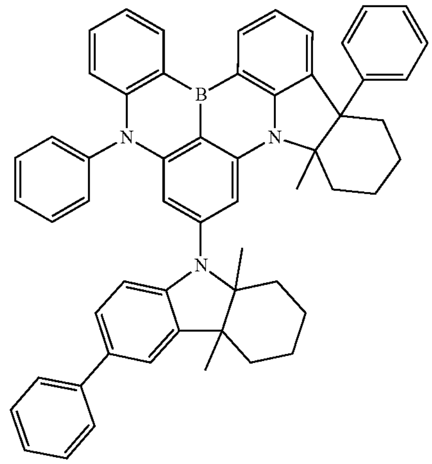
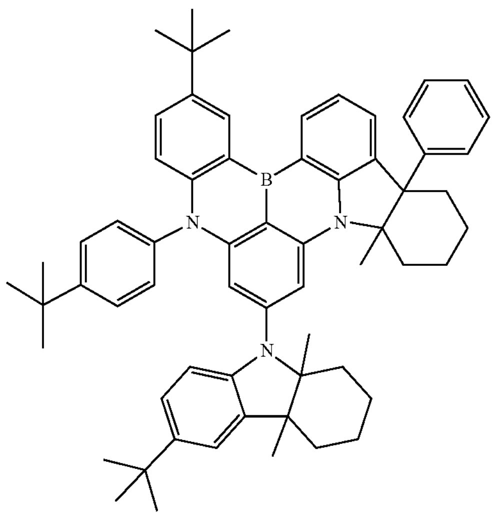
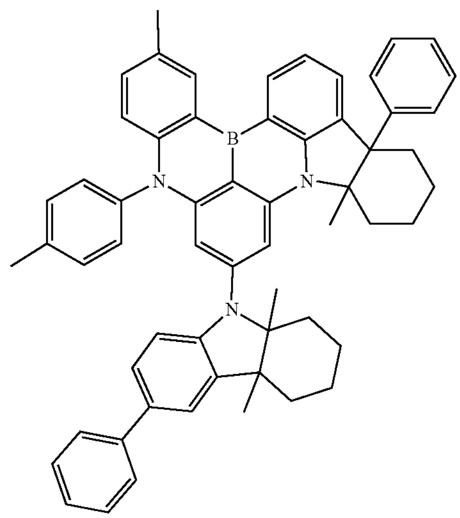
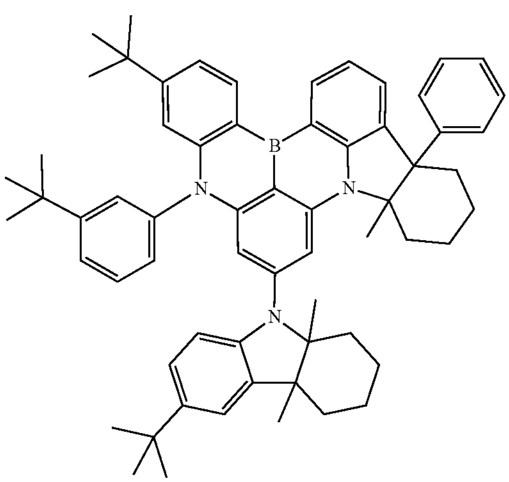
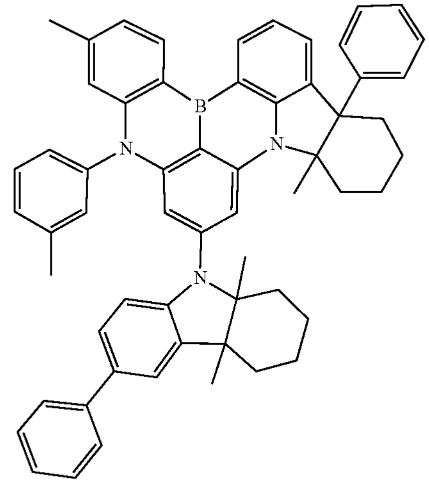
-continued -continued
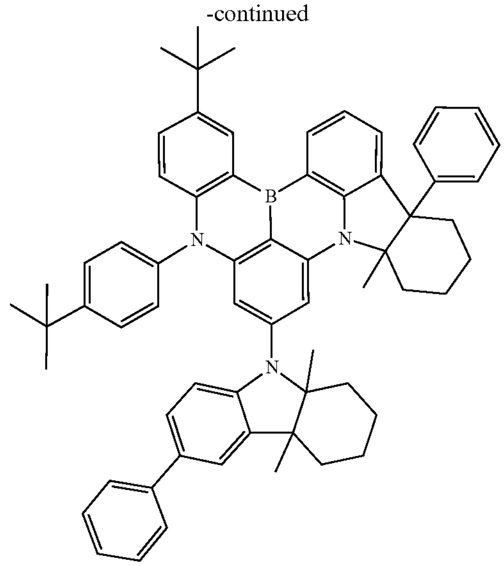
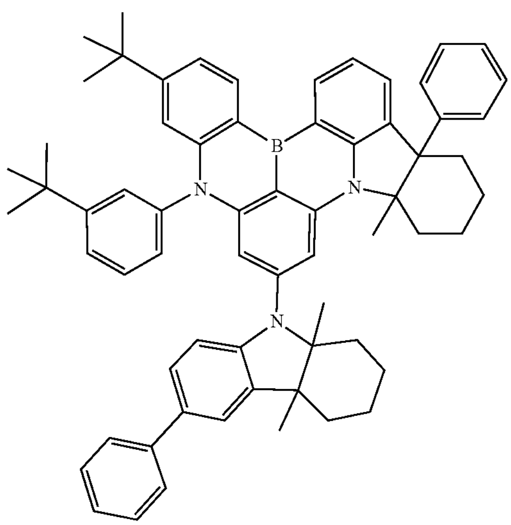
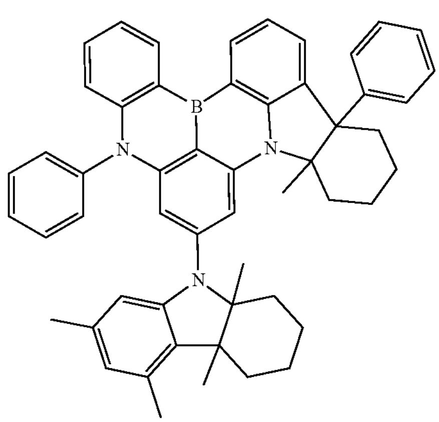
-continued
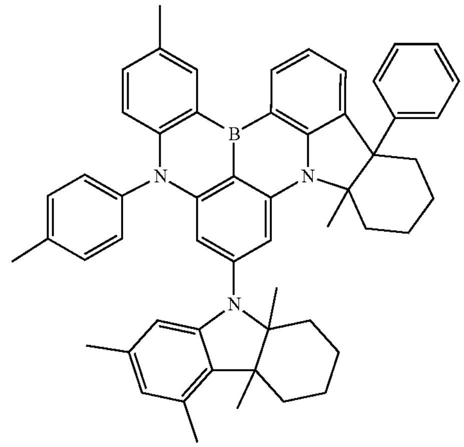
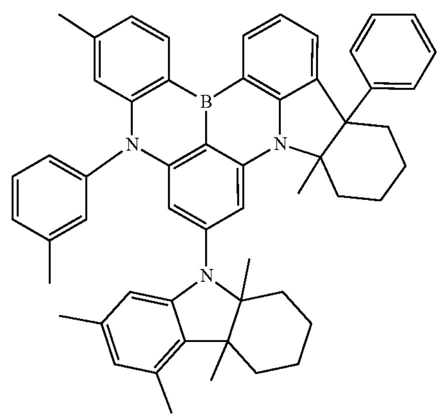
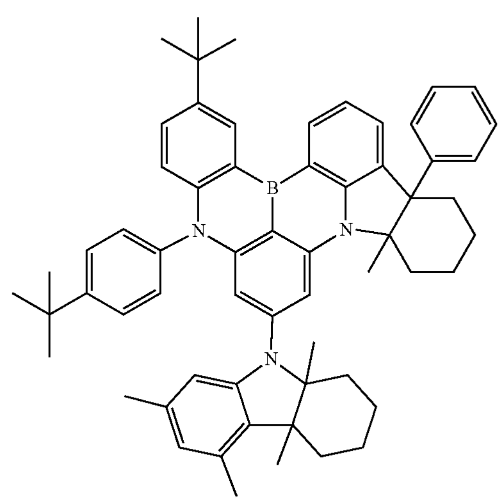

-continued
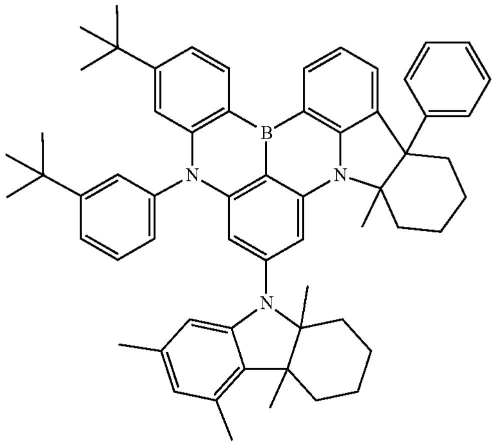
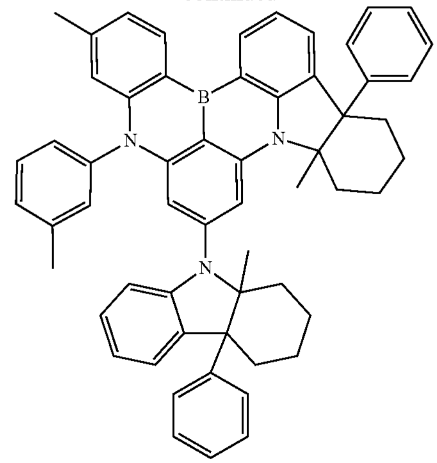
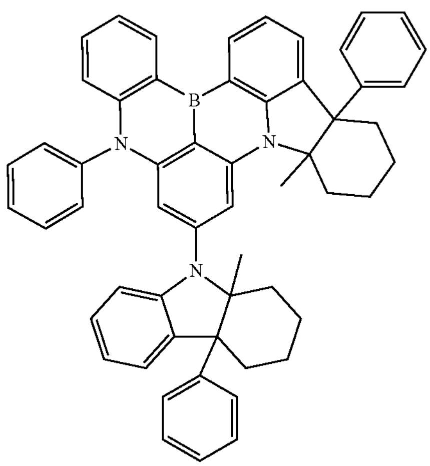
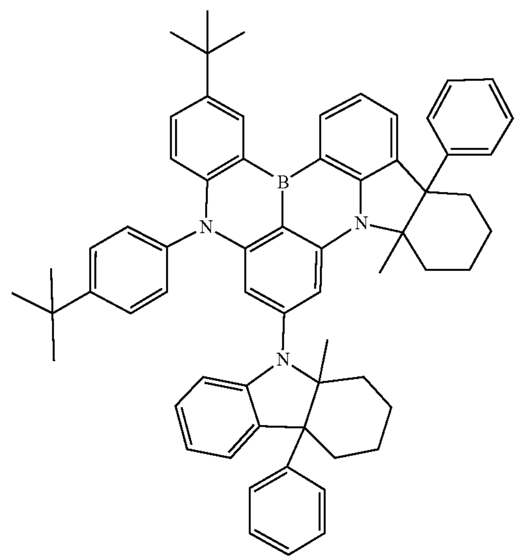
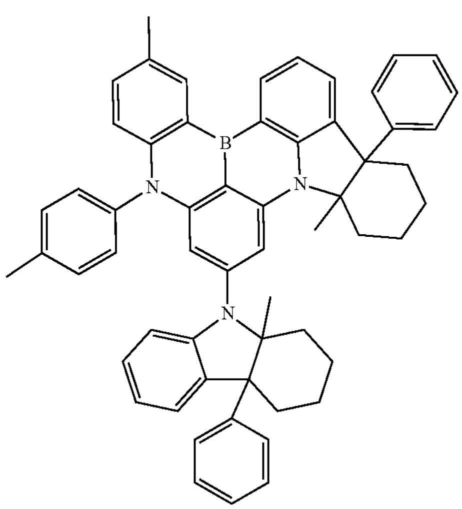
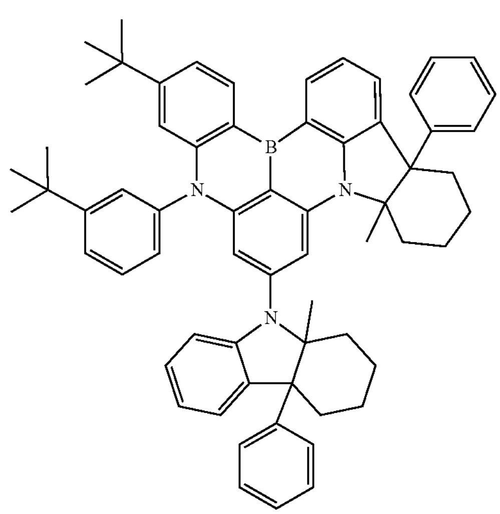

-continued
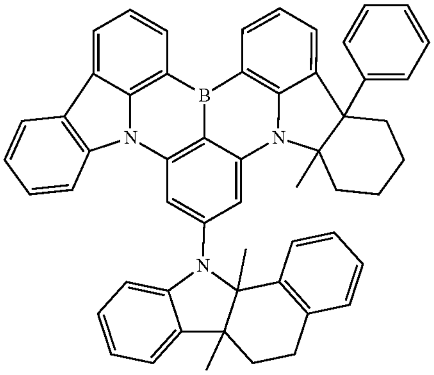
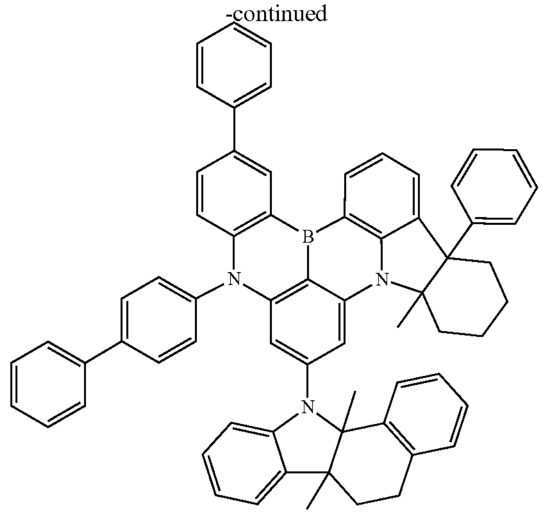
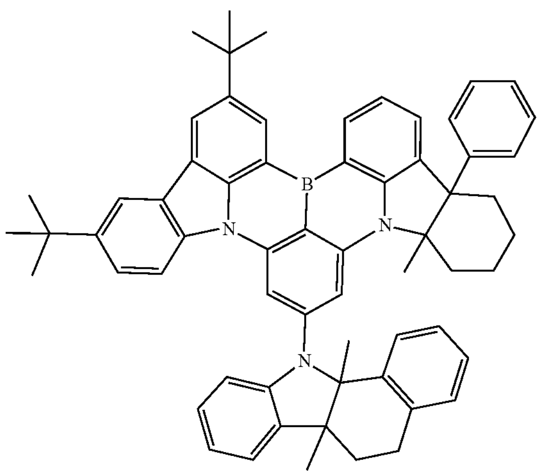
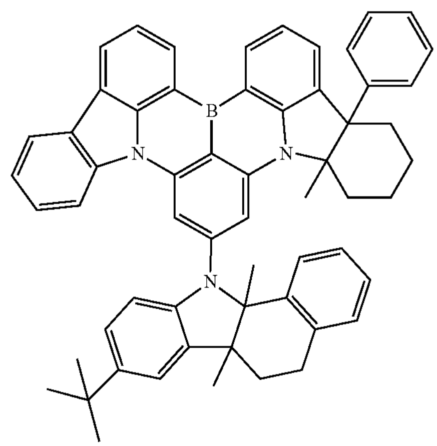
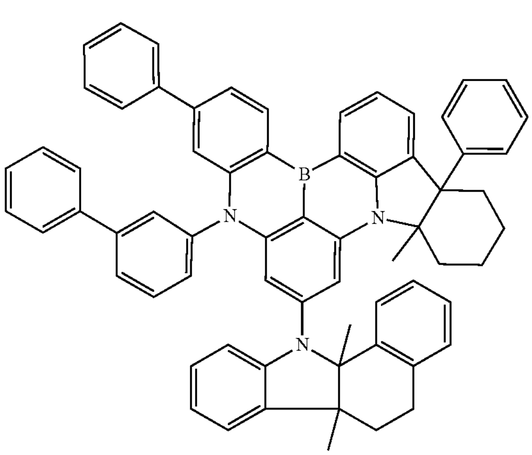
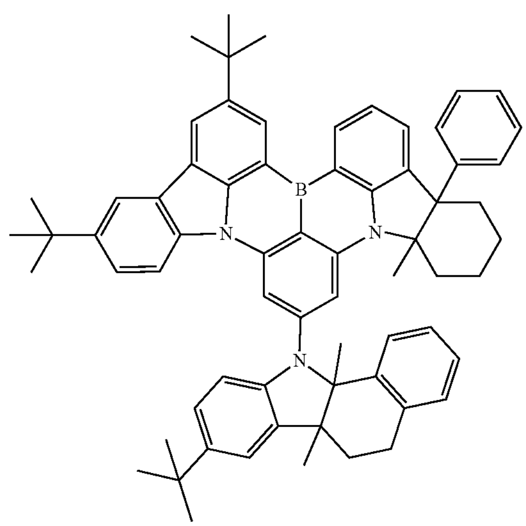

-continued
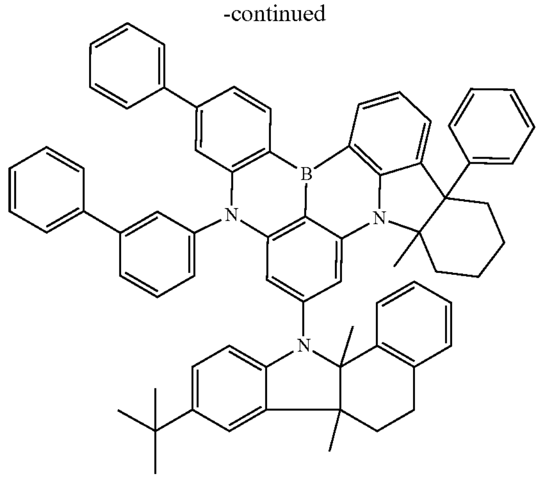
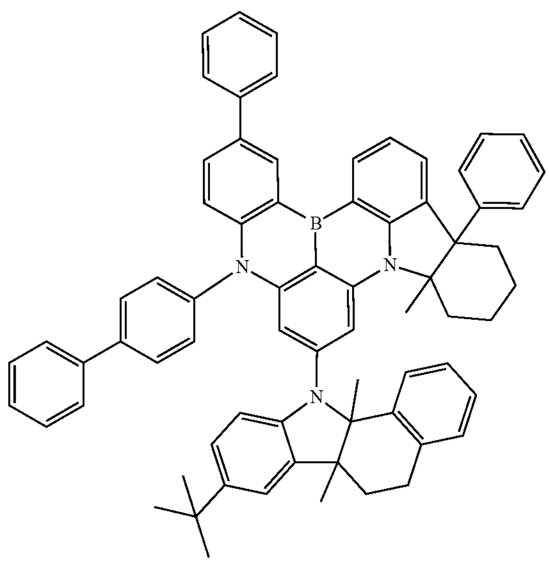
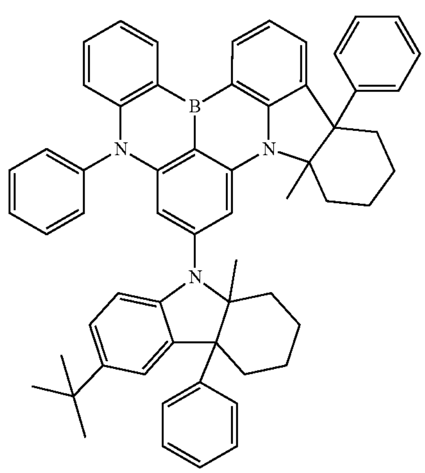
-continued
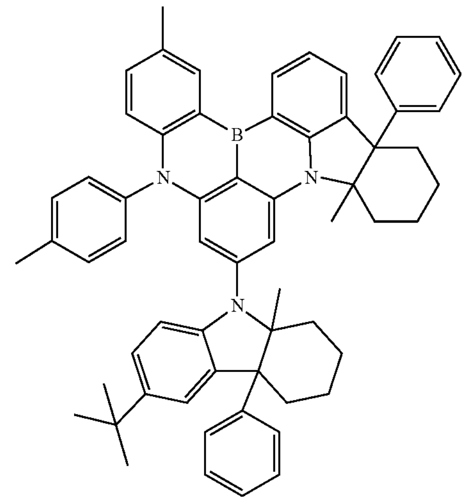
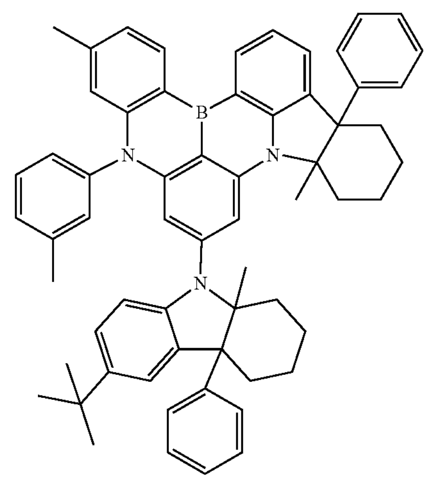
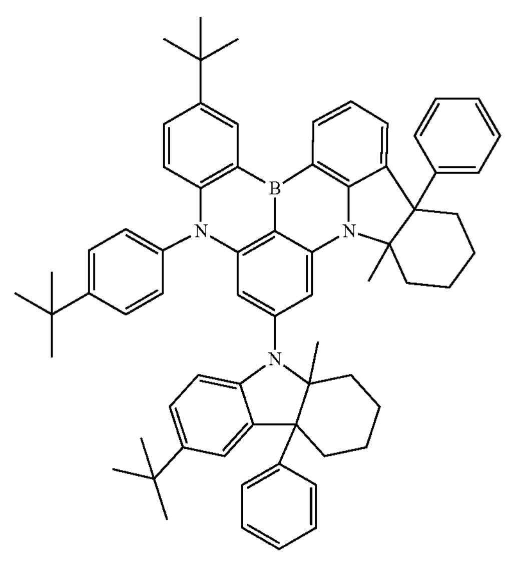

-continued
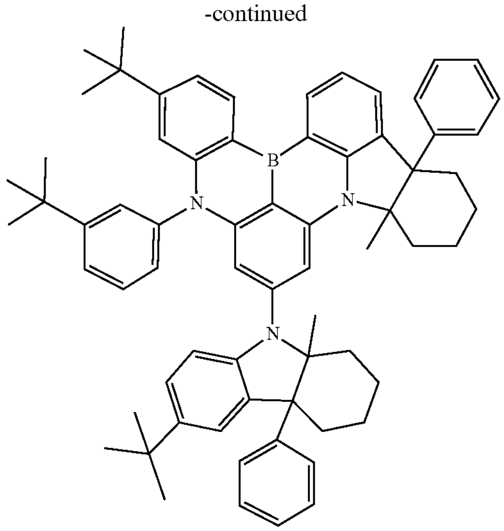
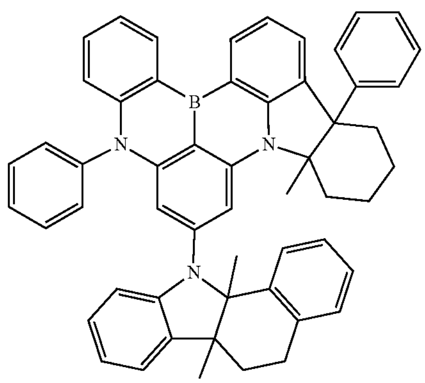
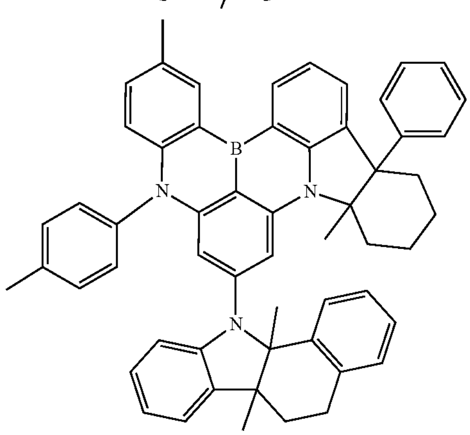
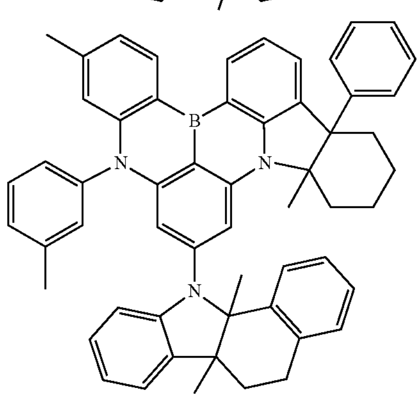
-continued
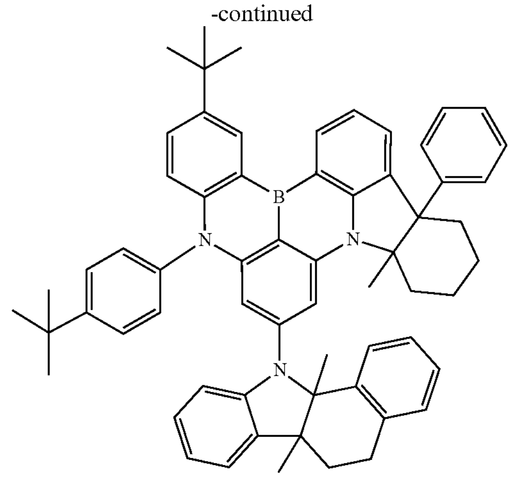
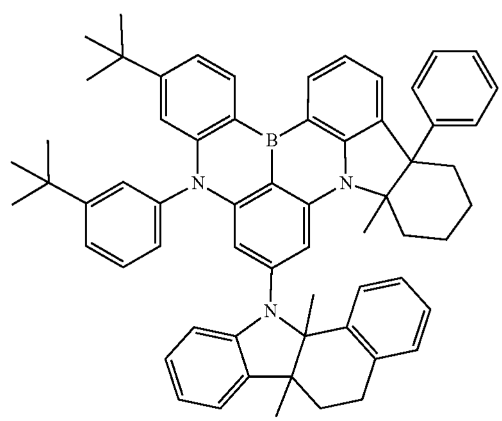
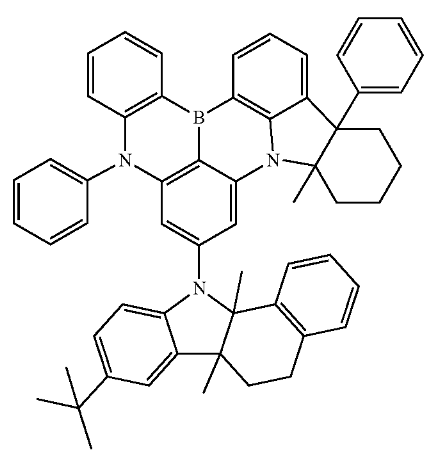

-continued
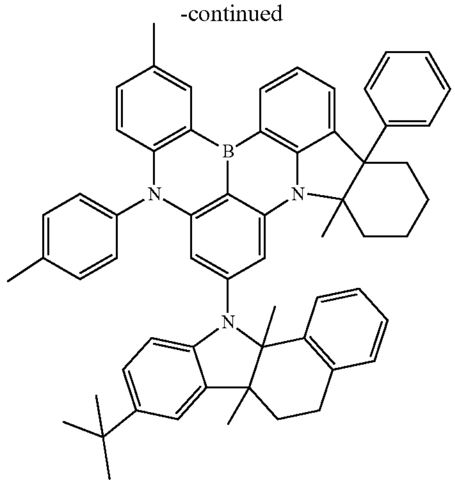
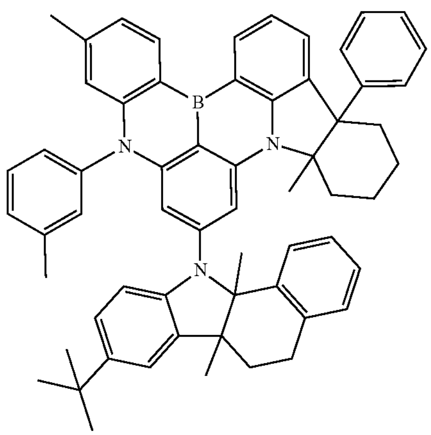
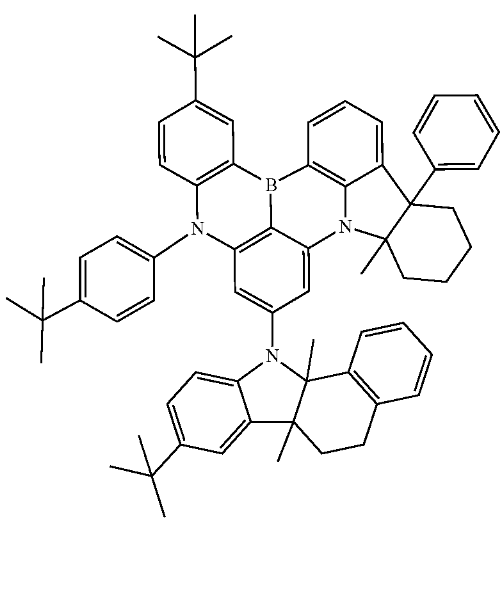
-continued
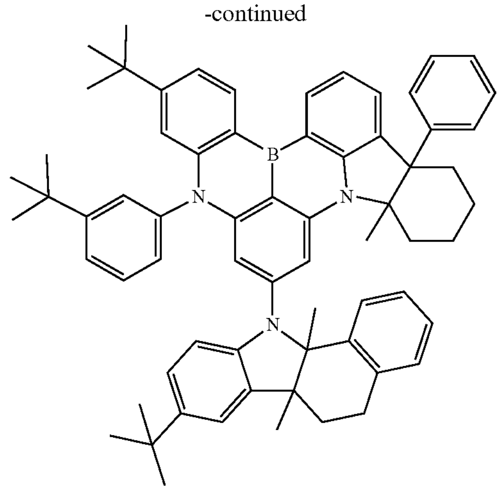
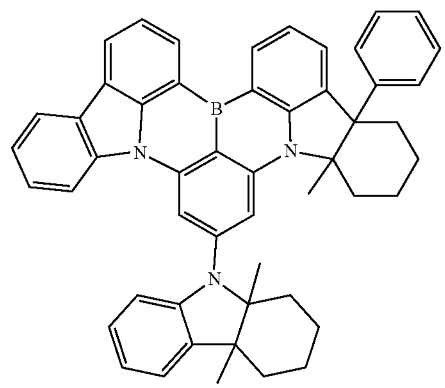
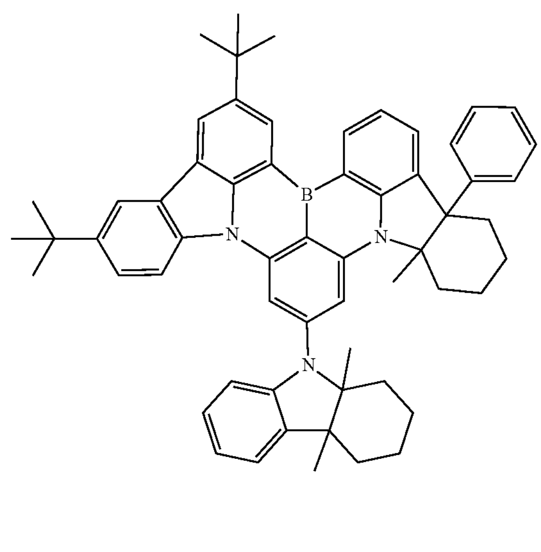

-continued
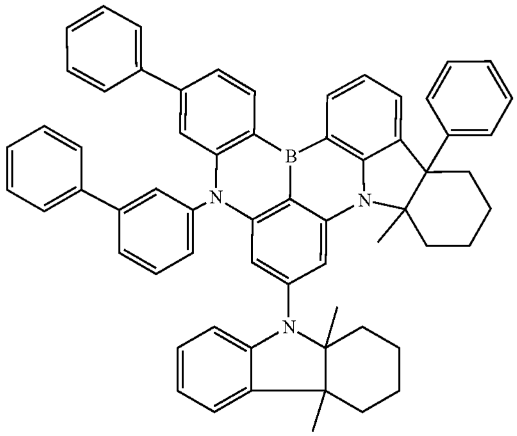
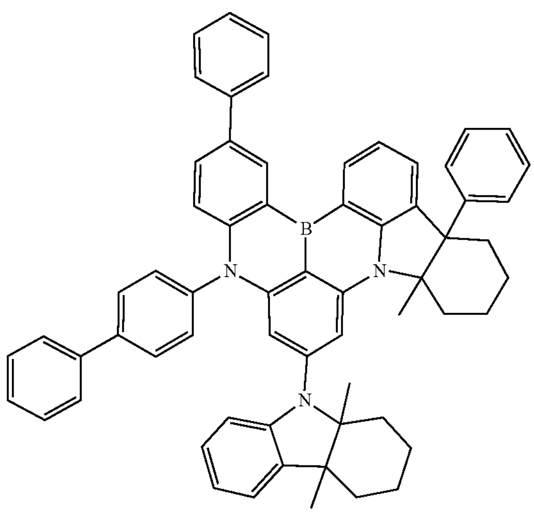
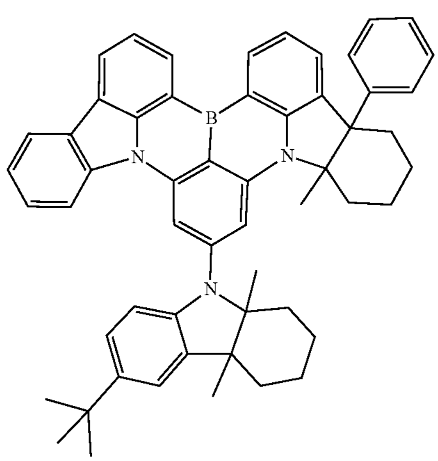
-continued
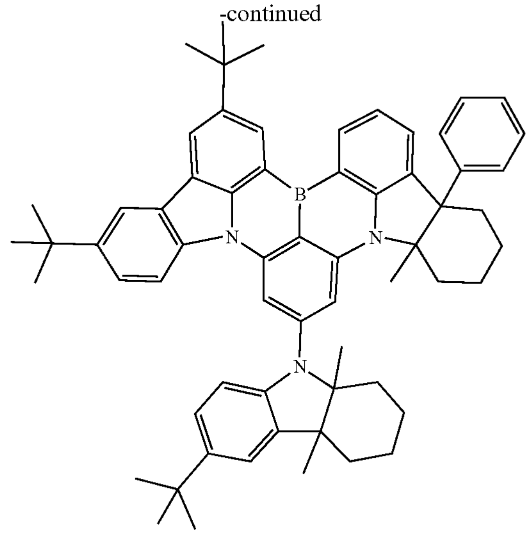
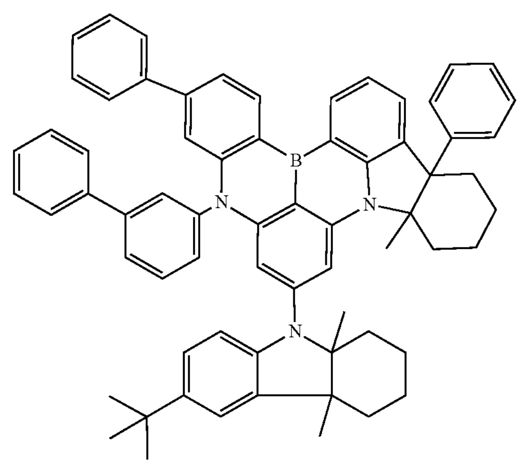
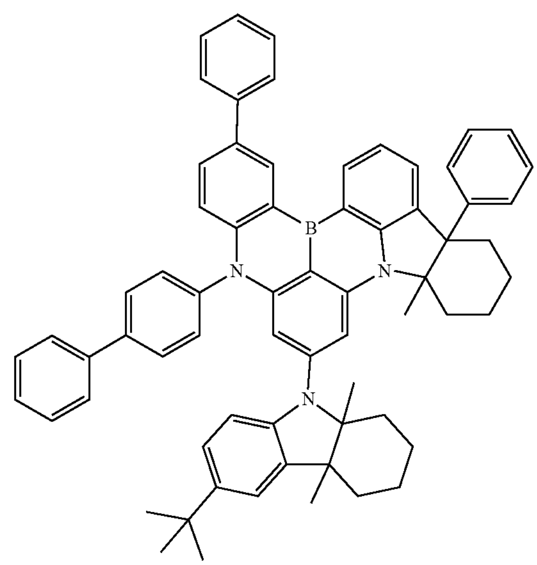

-continued
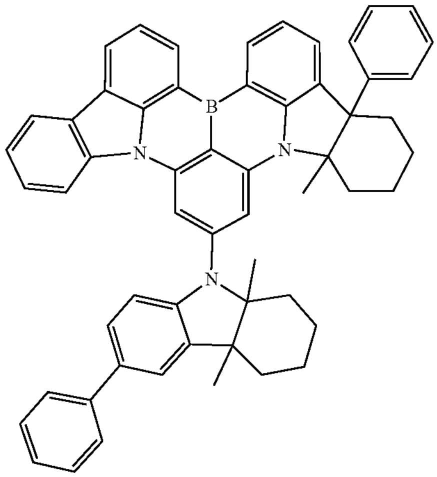
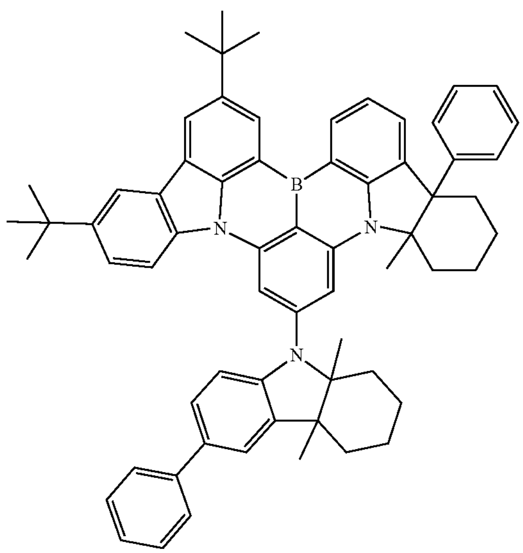
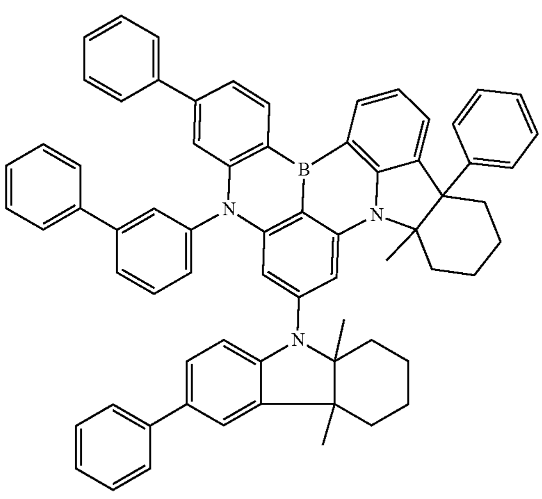
-continued
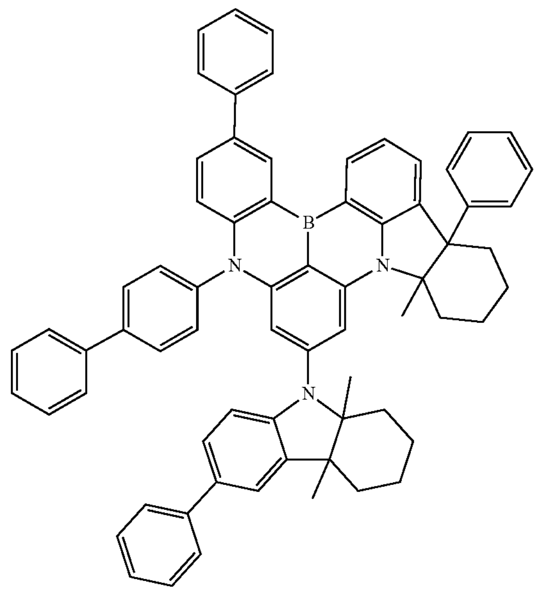
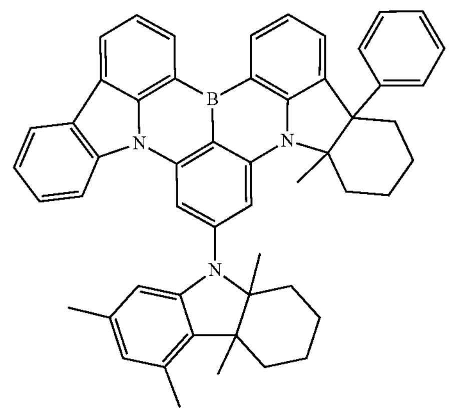
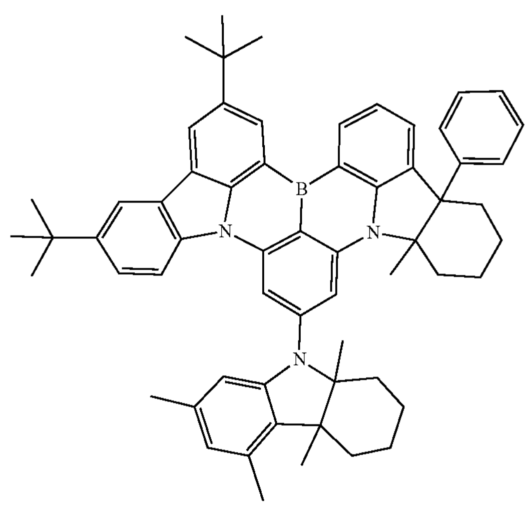

-continued
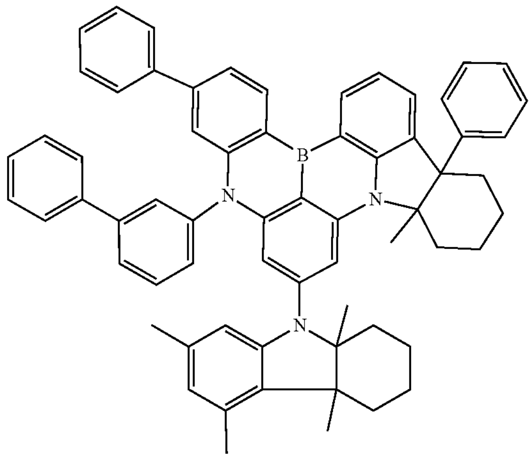
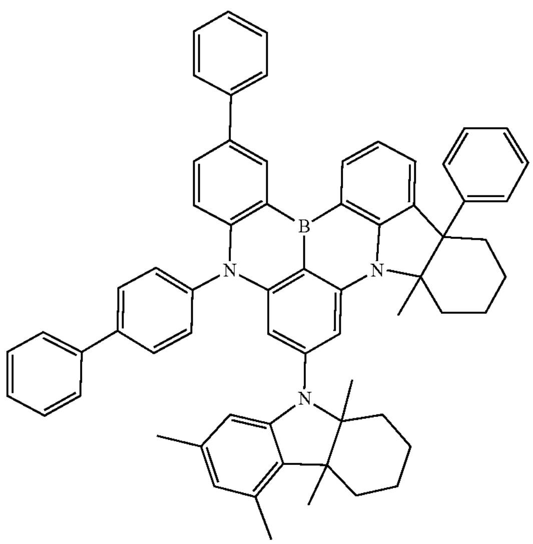
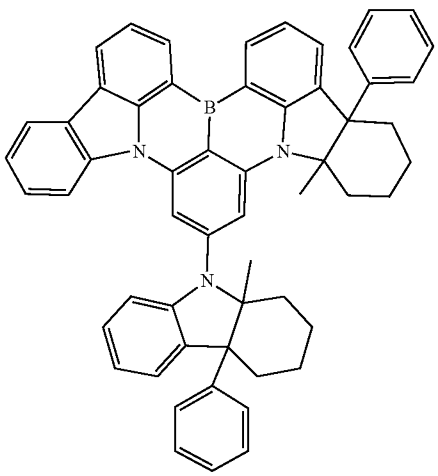
-continued
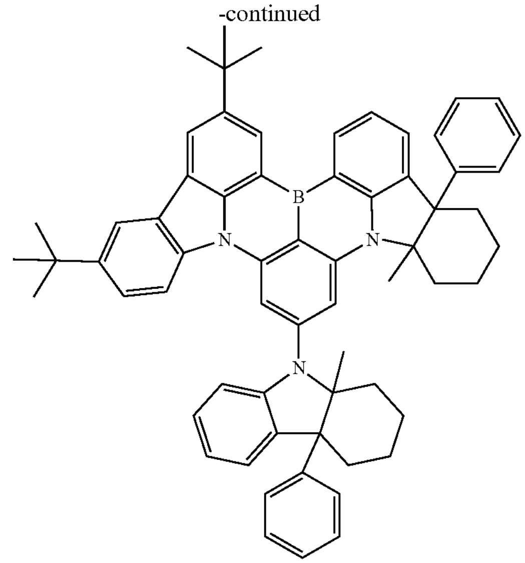
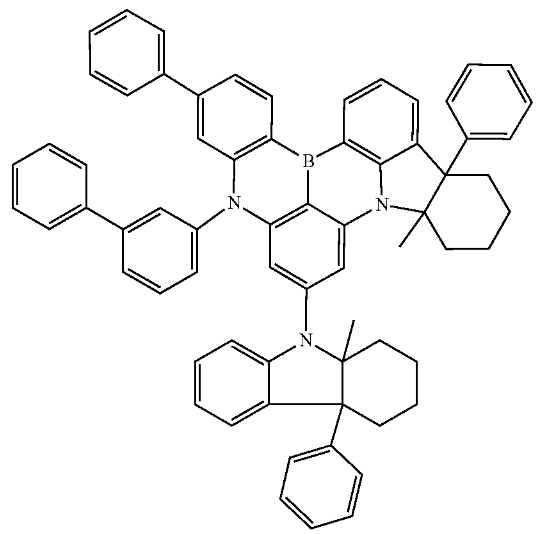
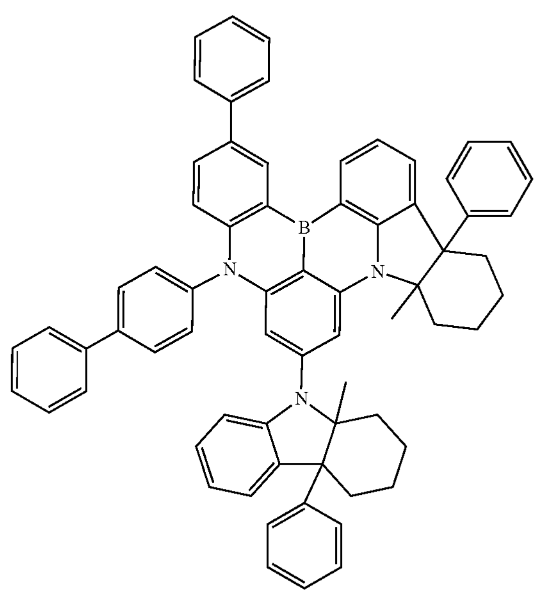

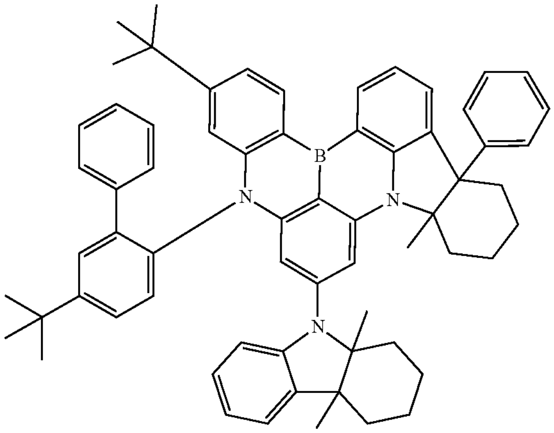
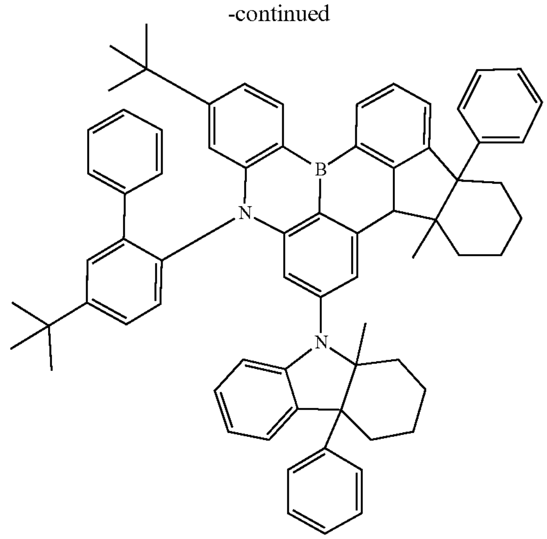
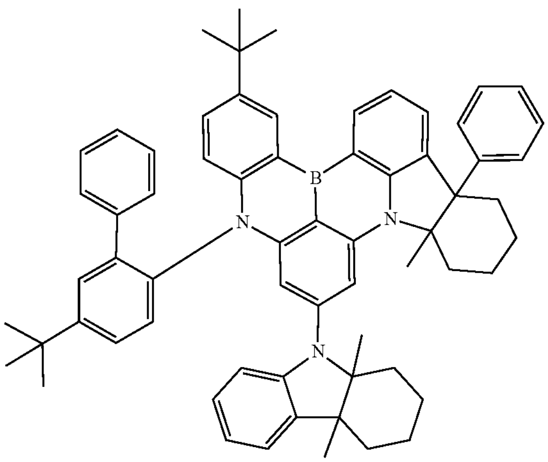
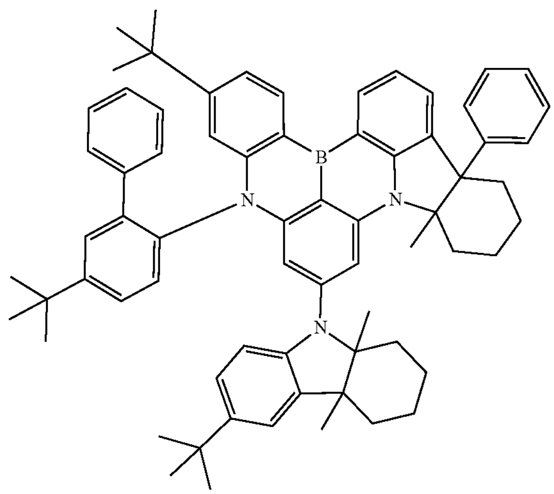
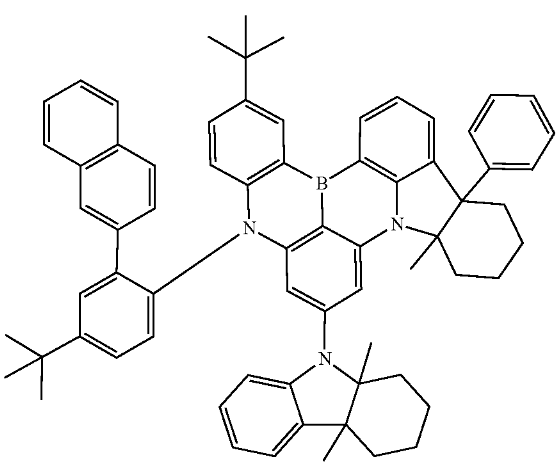
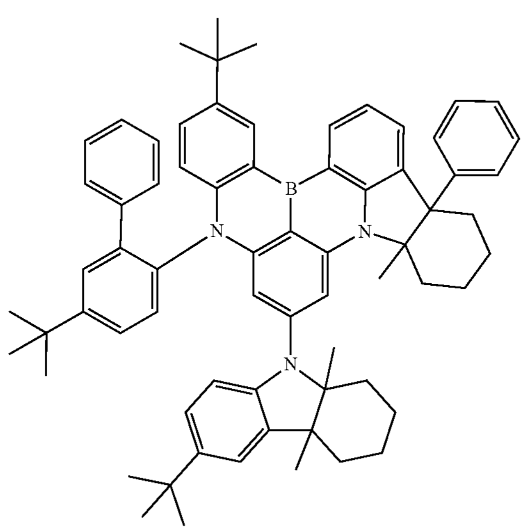

-continued
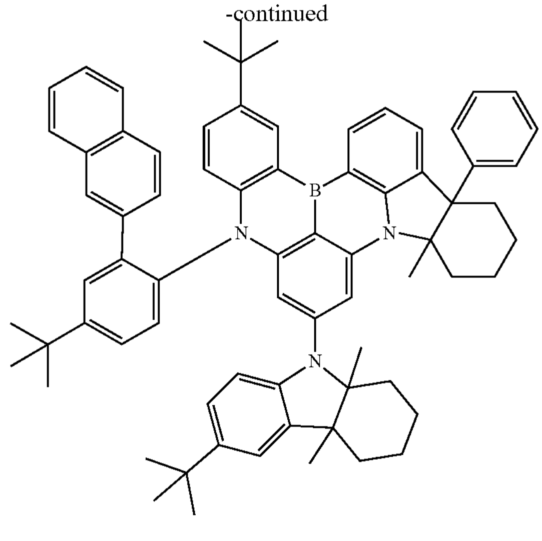
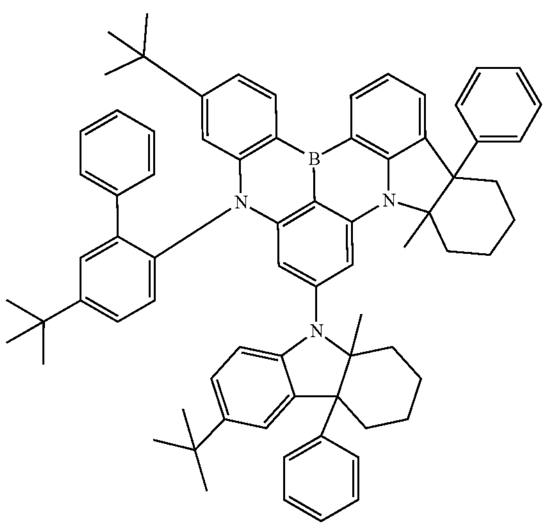
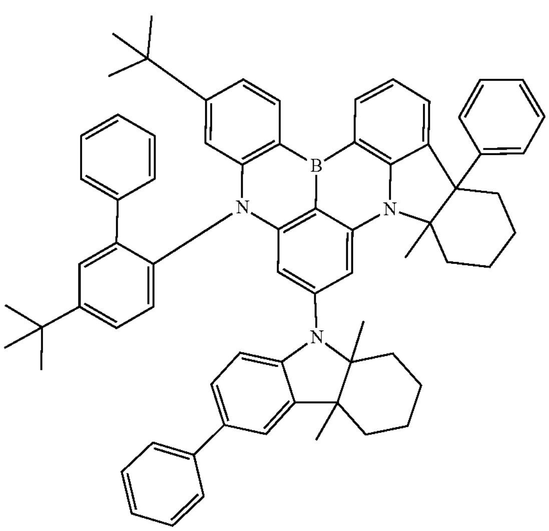
-continued
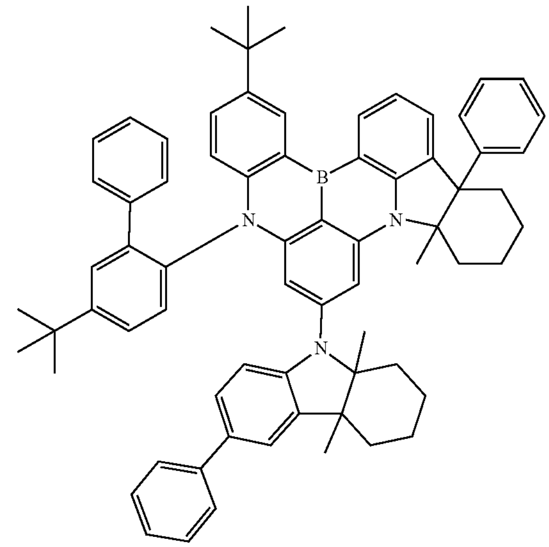
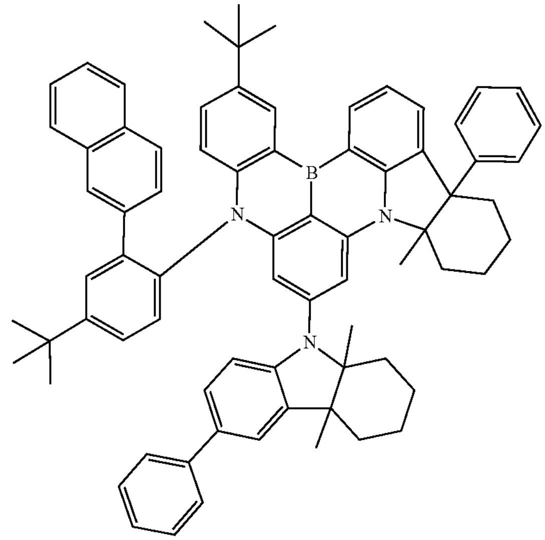
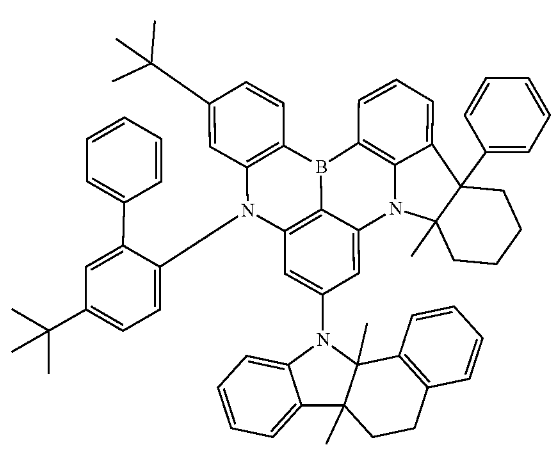

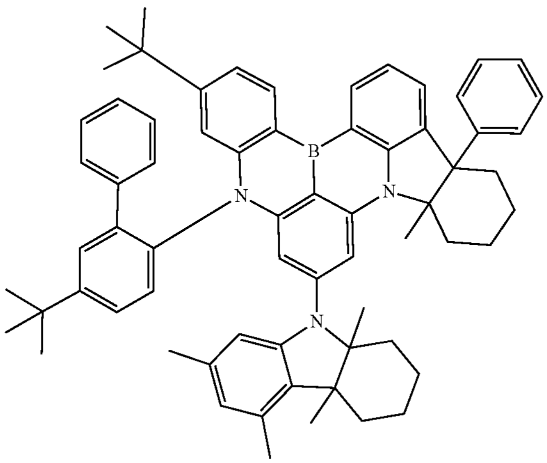
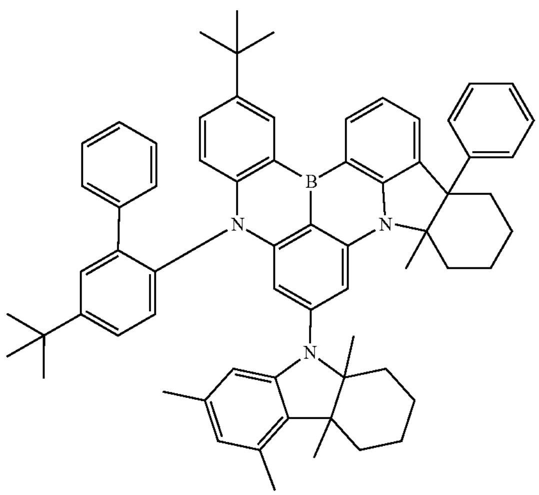
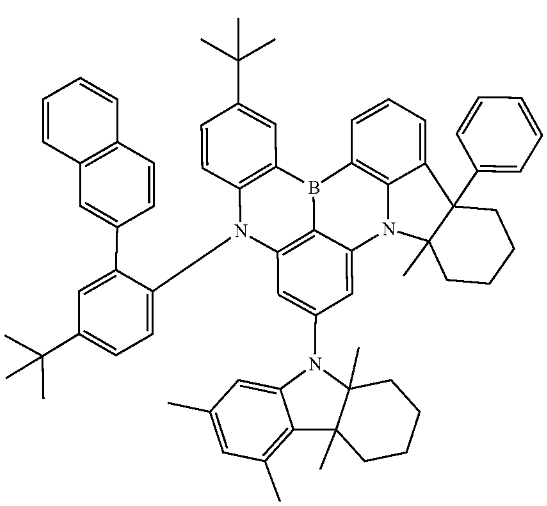
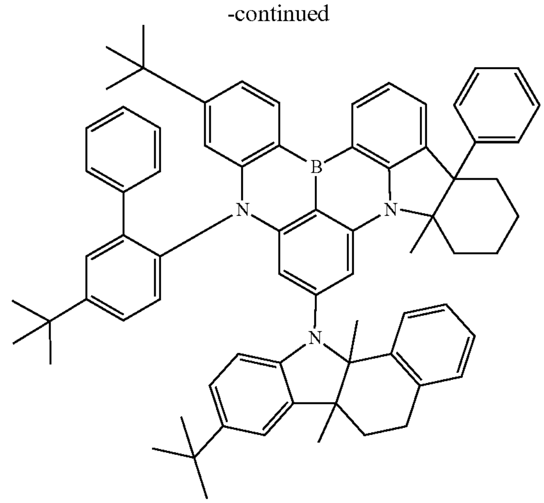
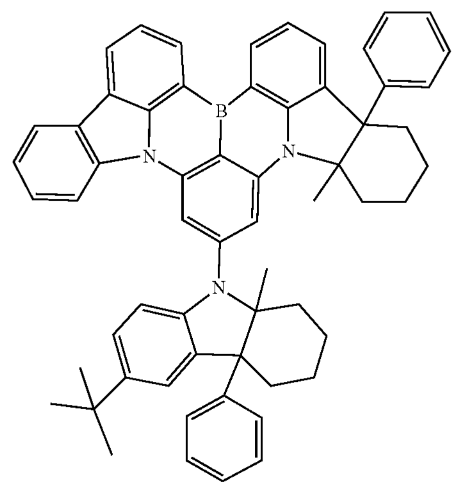
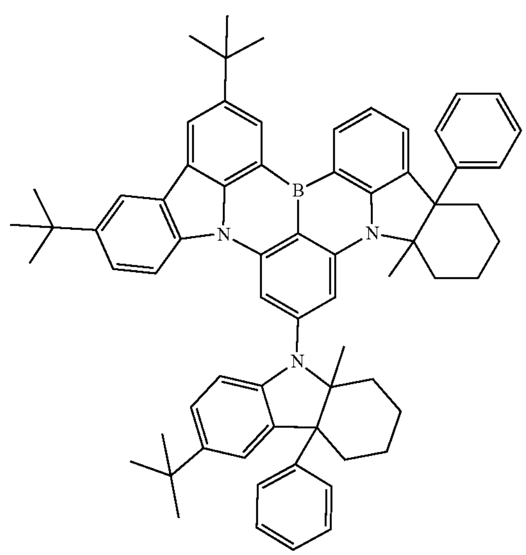

-continued
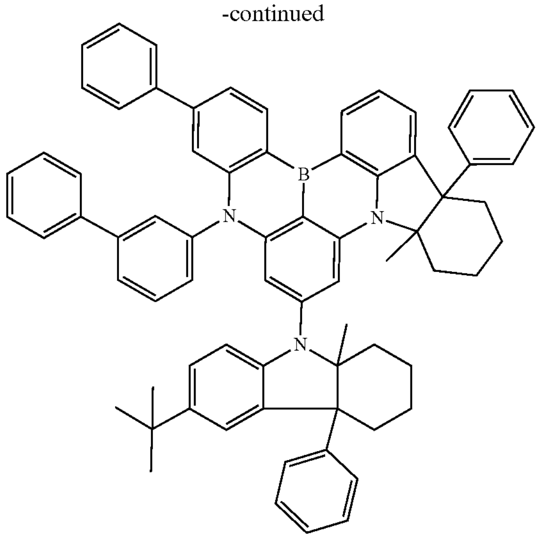
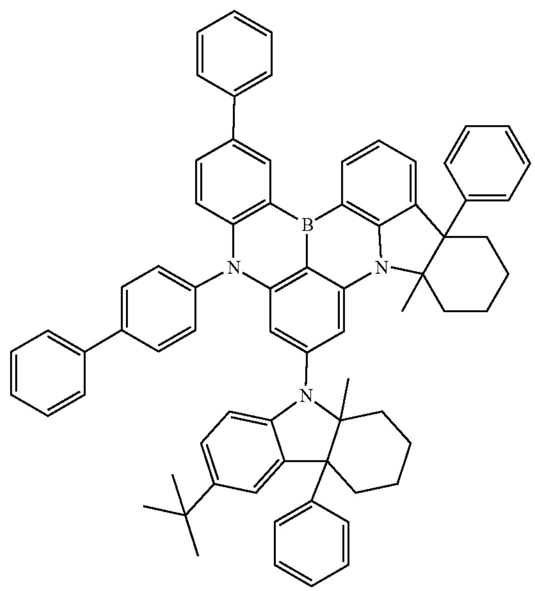
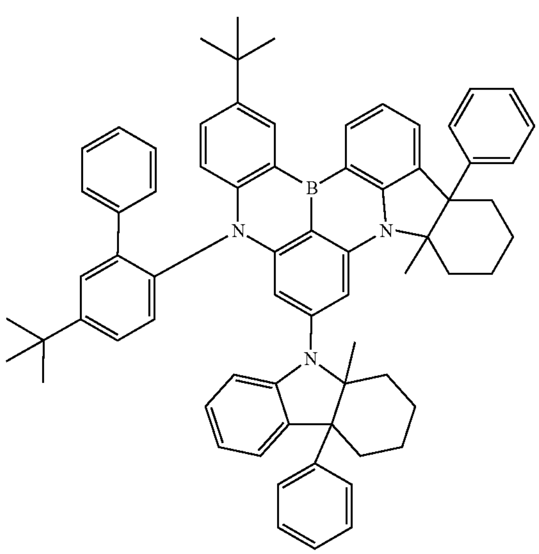
-continued
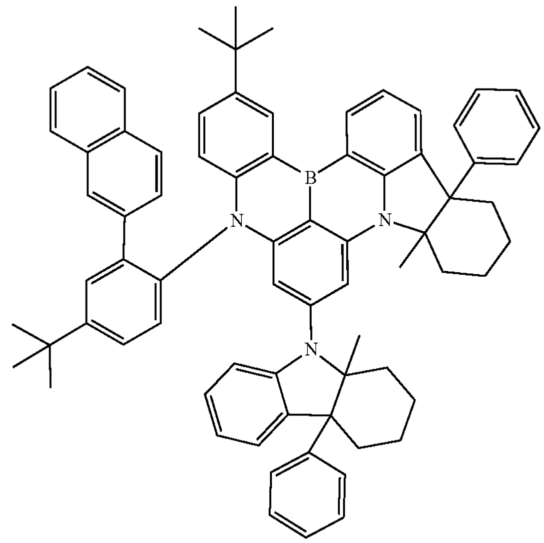
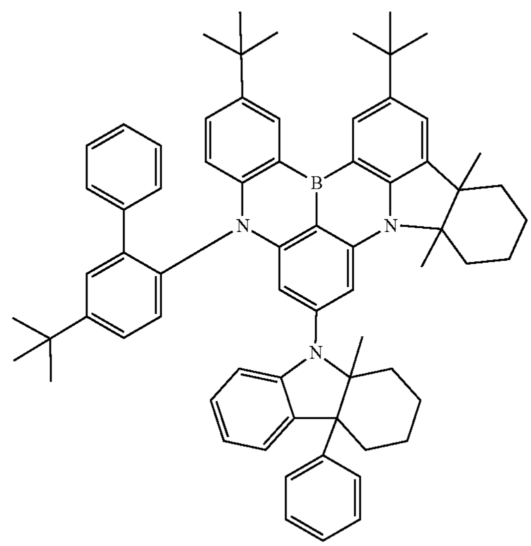
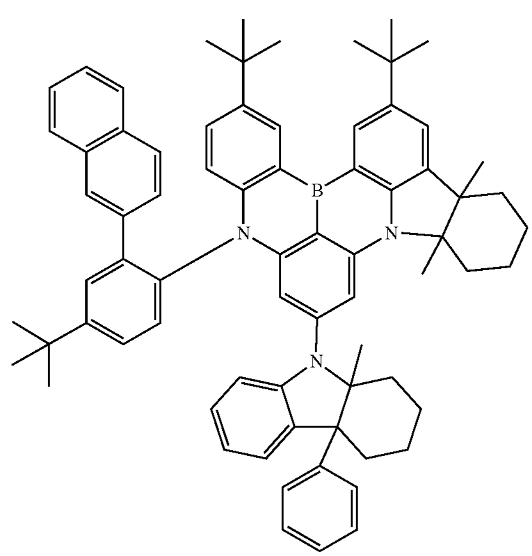

-continued
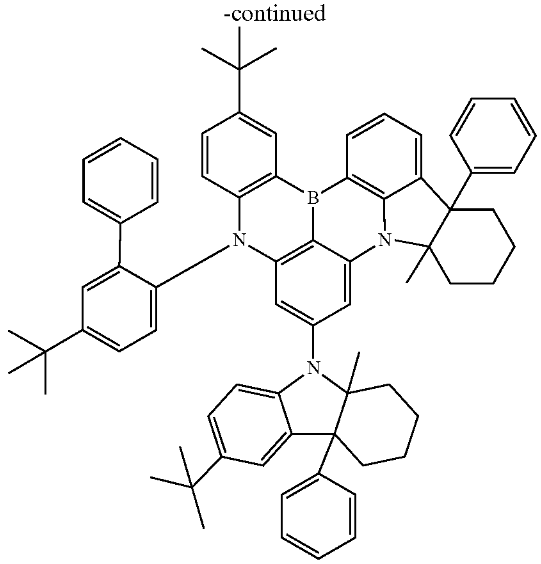
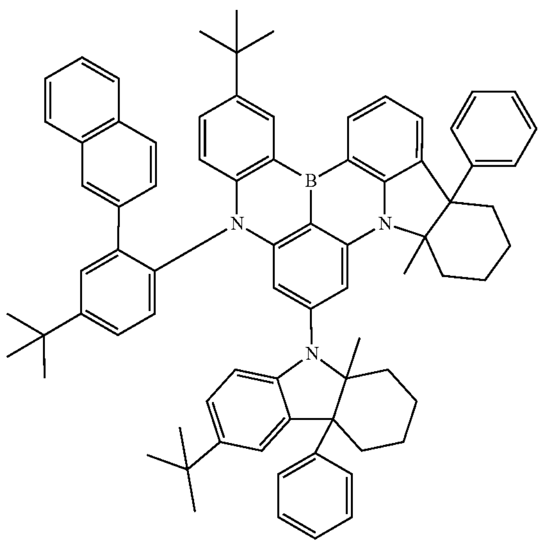
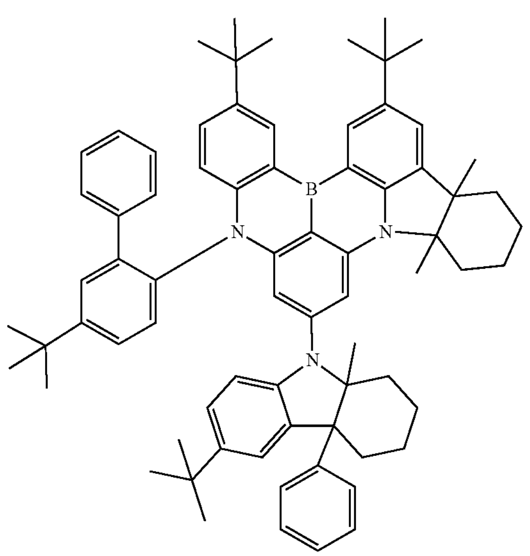
-continued
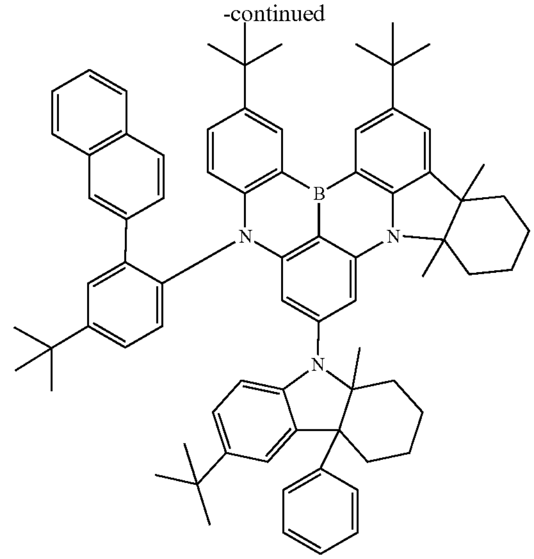
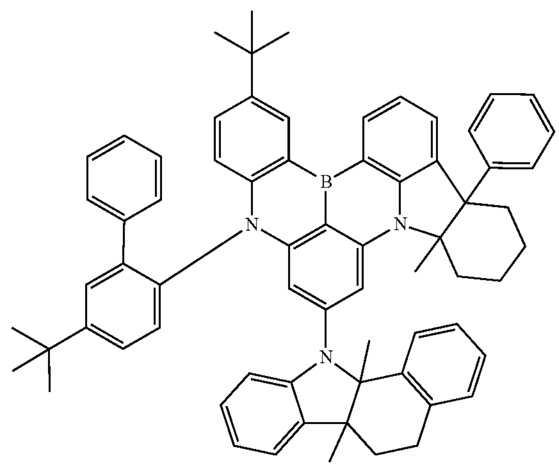
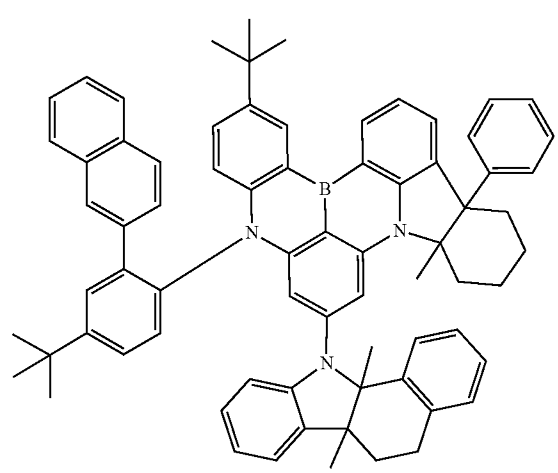

-continued
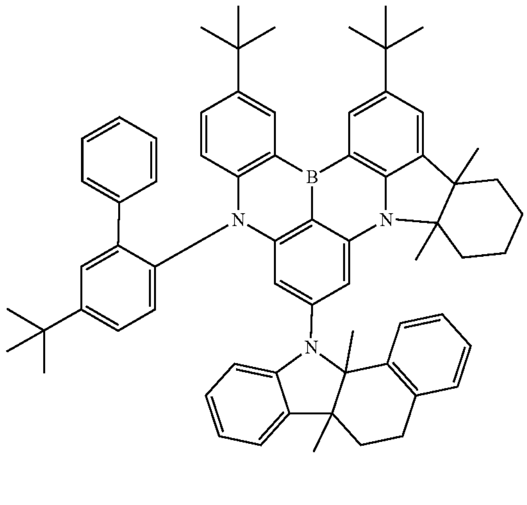
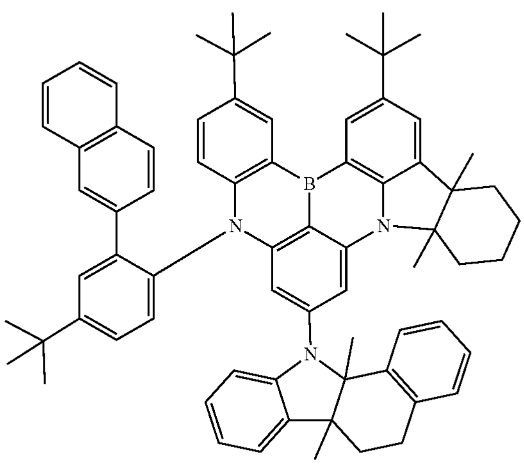
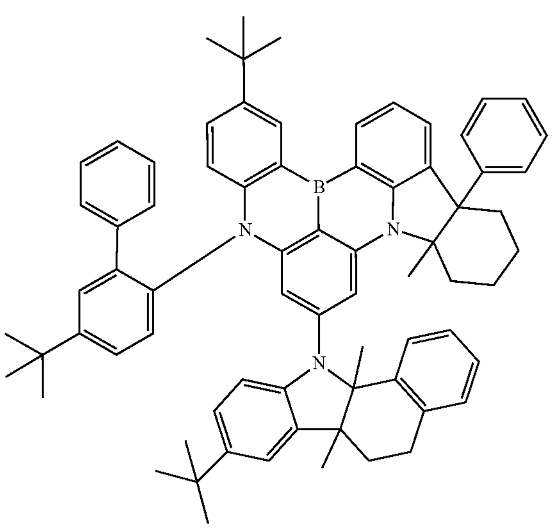
-continued
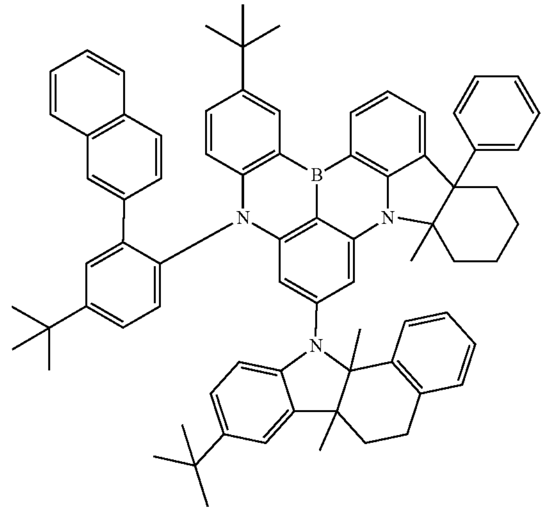
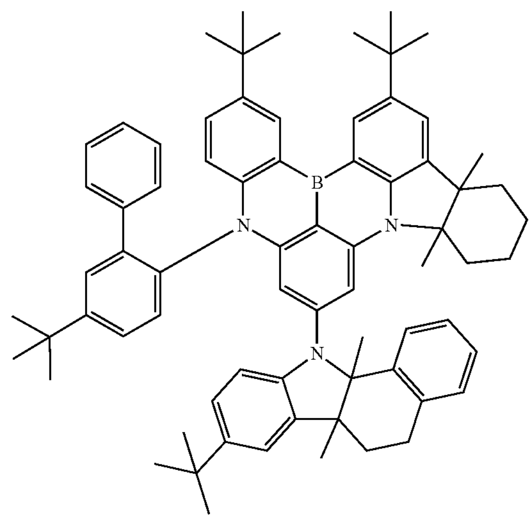
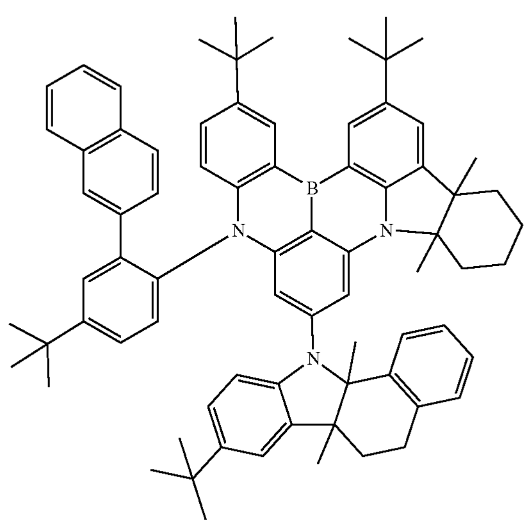

-continued
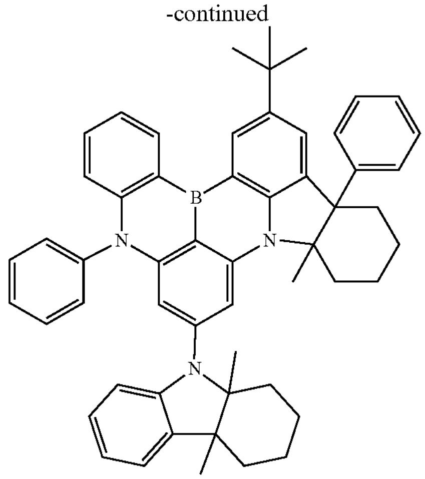
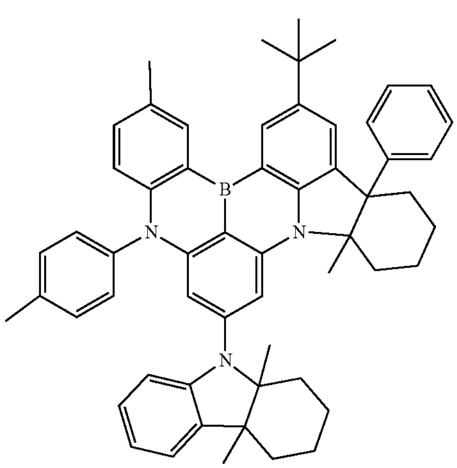
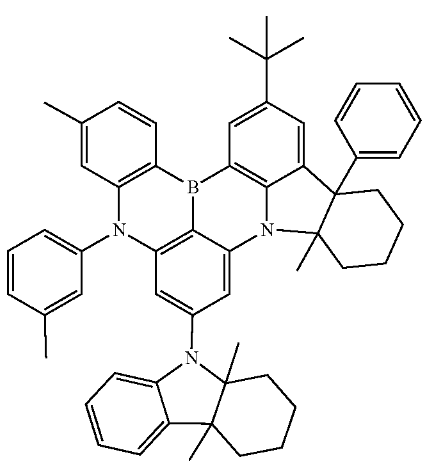
-continued
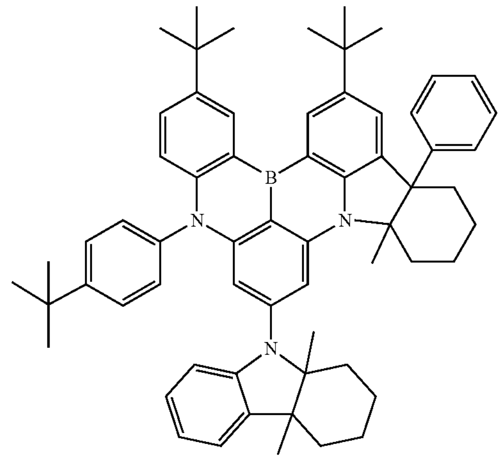
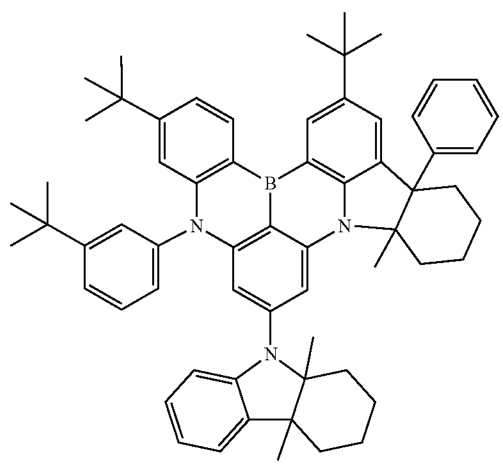
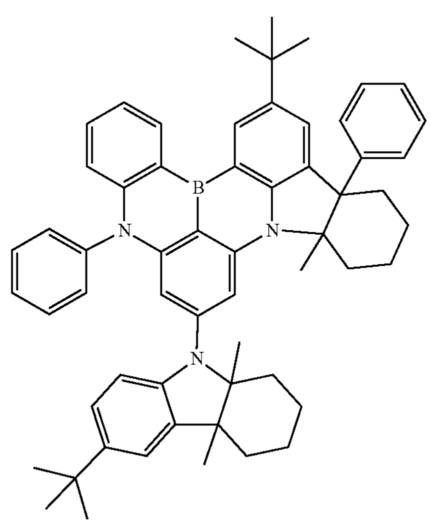

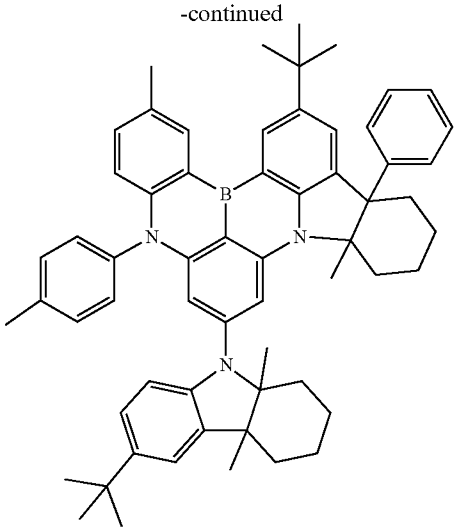
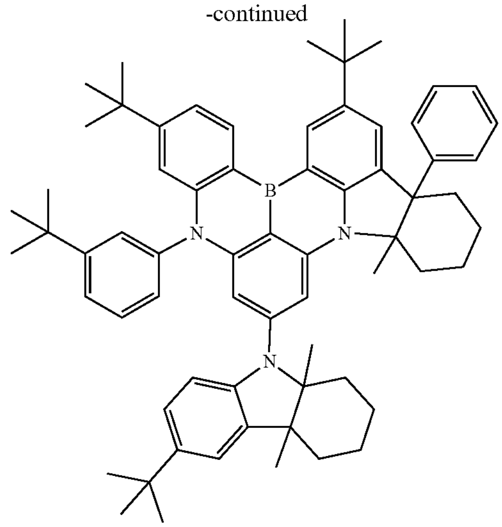
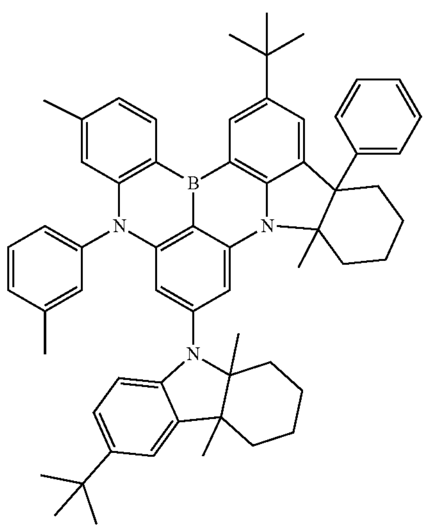
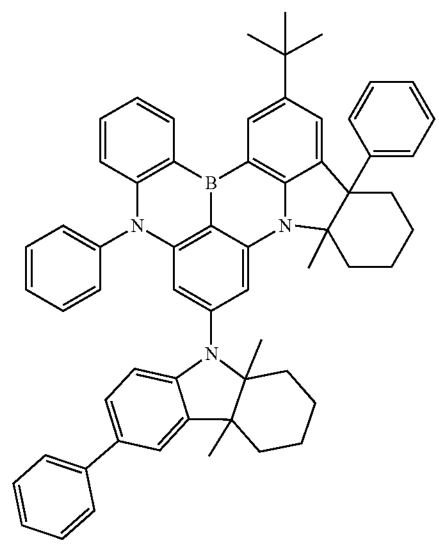
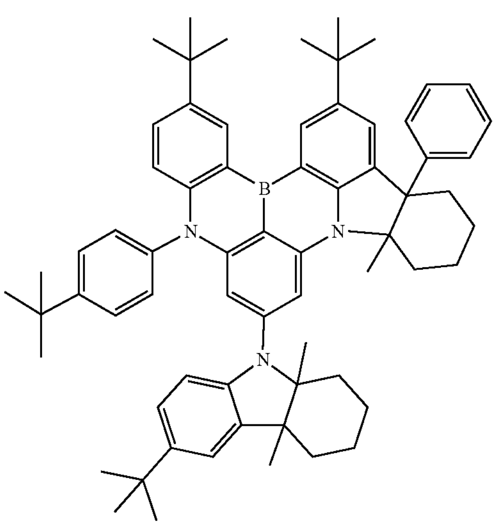
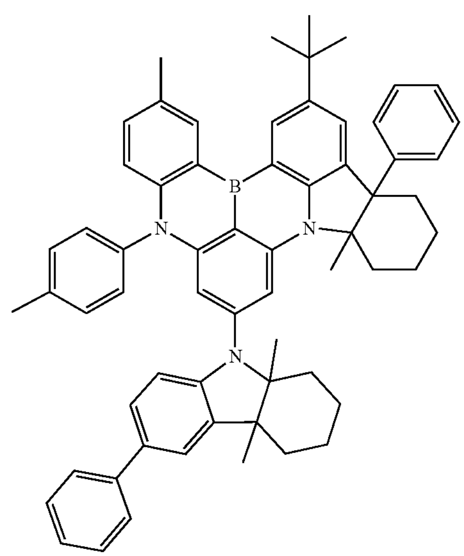
B
N
N
N -continued
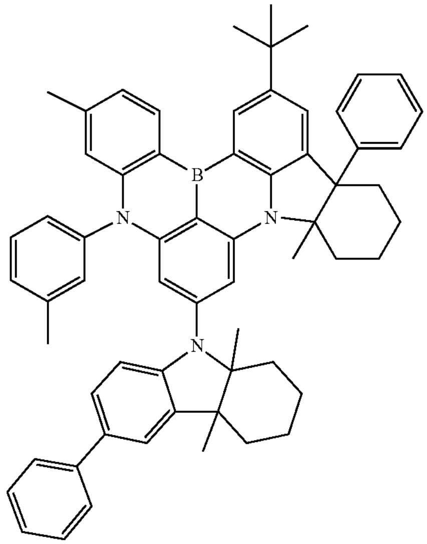
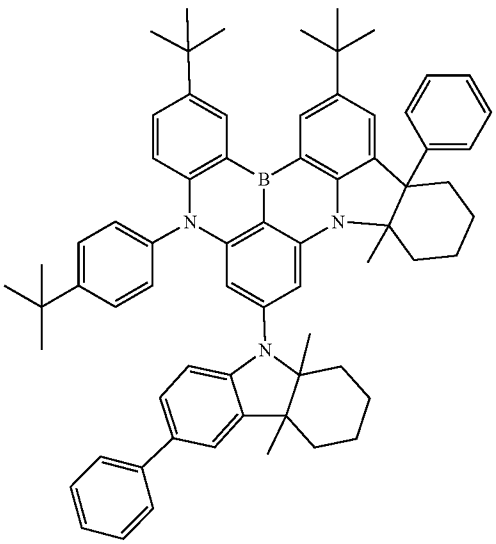
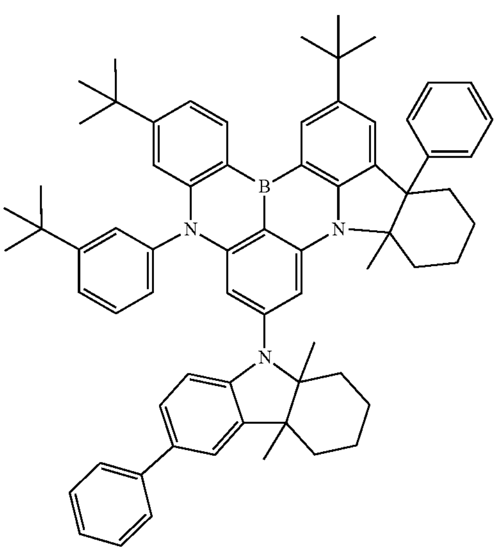
-continued
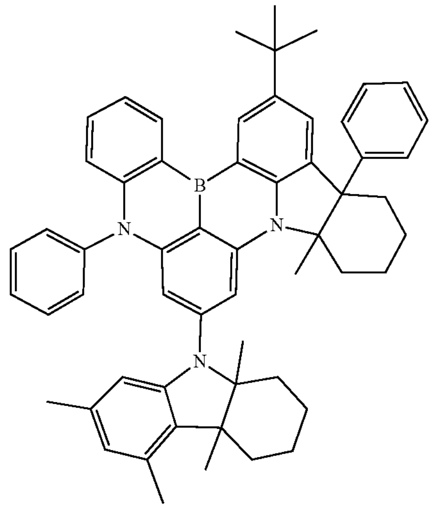
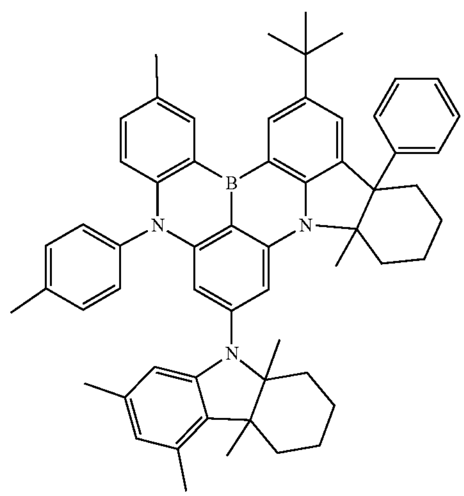
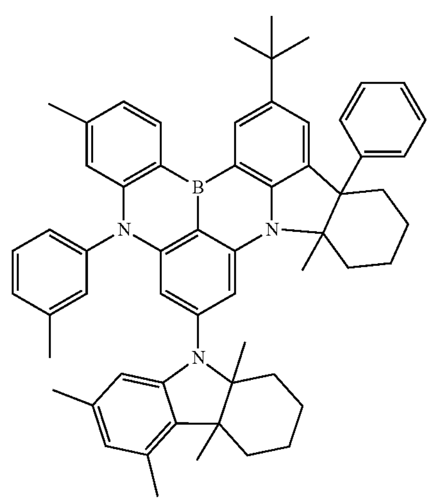

-continued
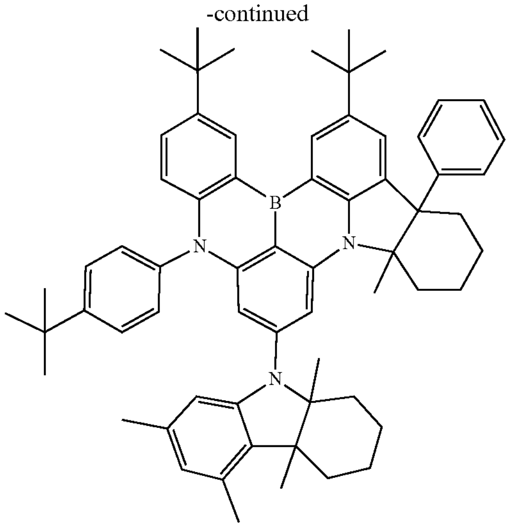
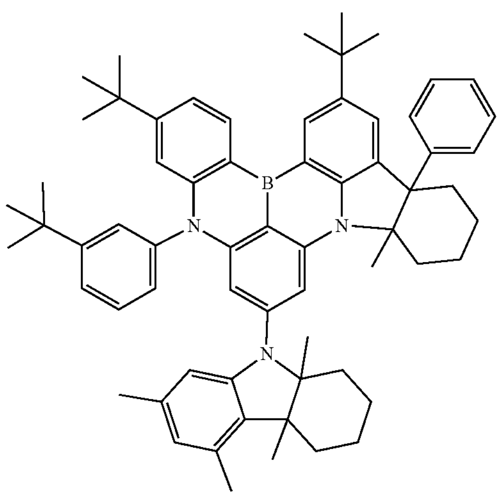
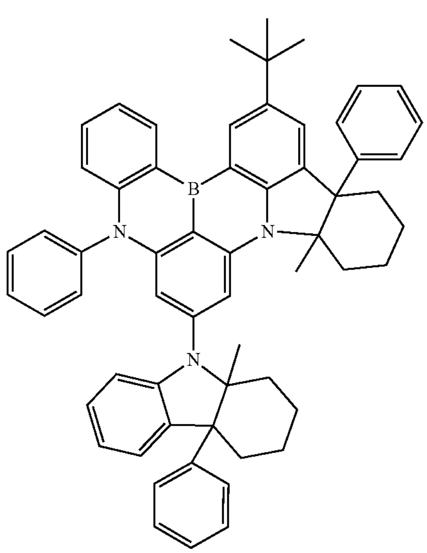
-continued
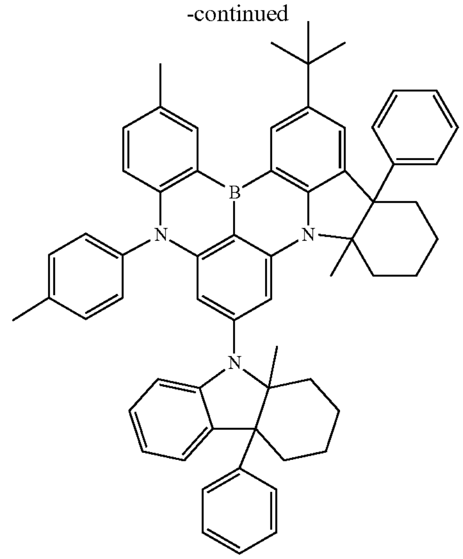
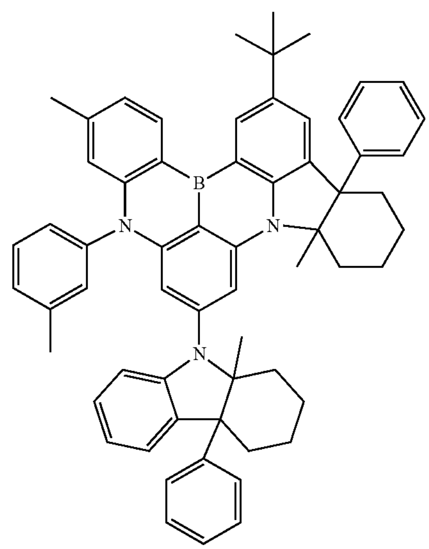
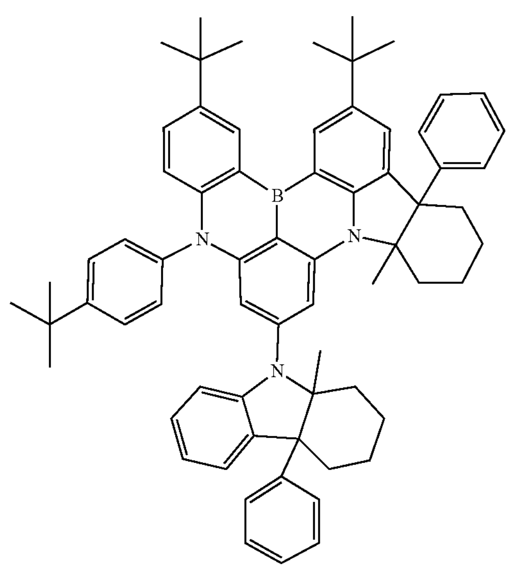

-continued
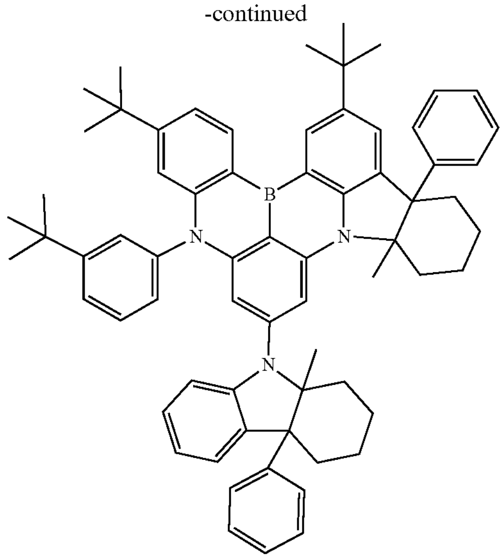
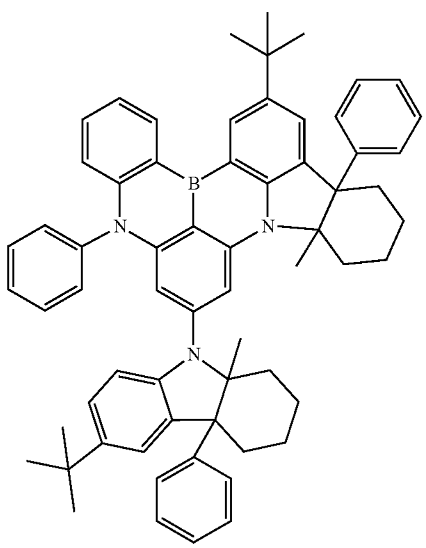
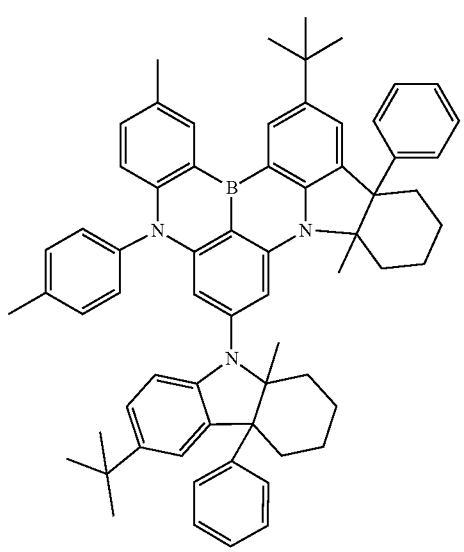
-continued
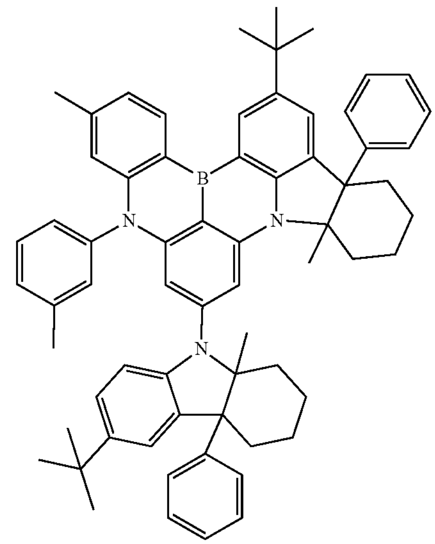
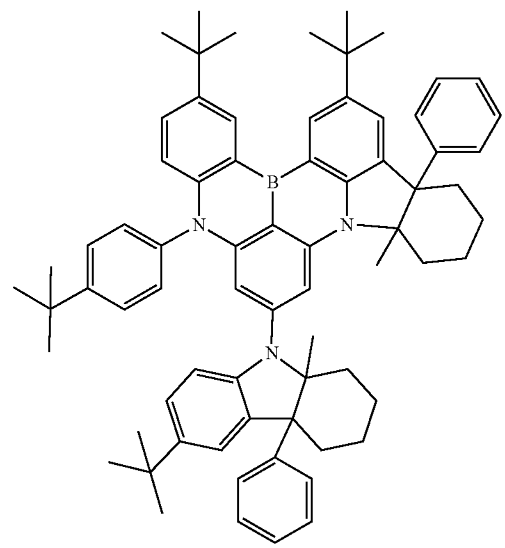
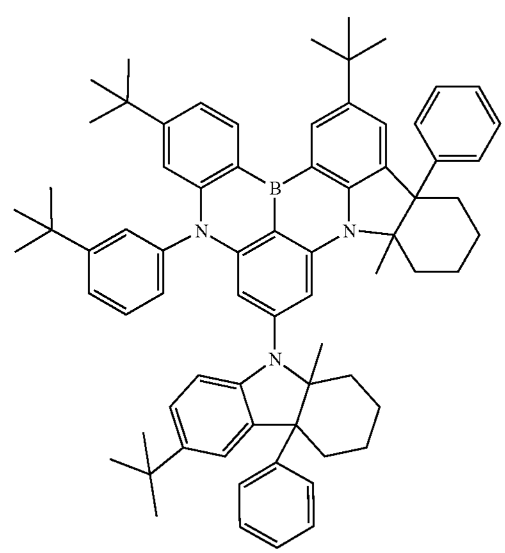

-continued
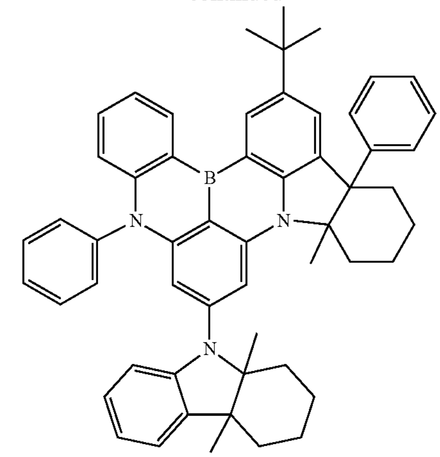
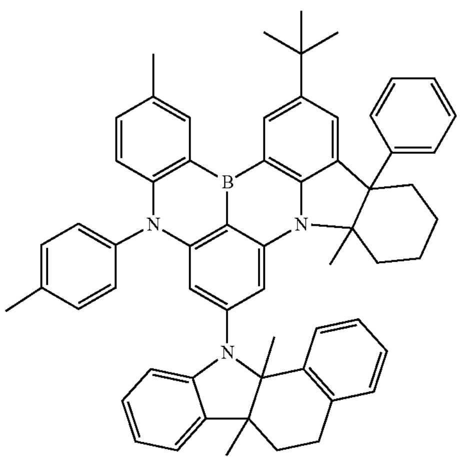
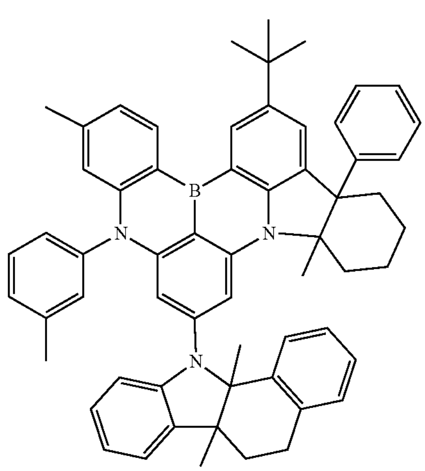
-continued
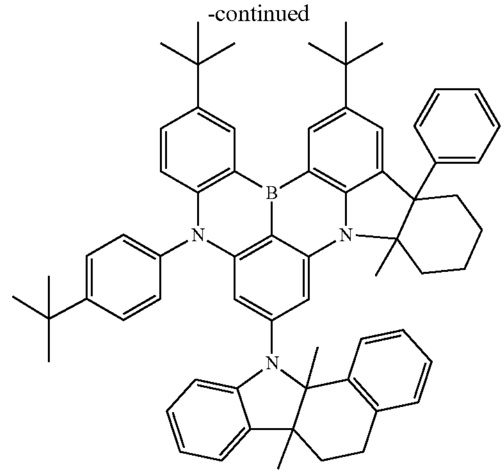
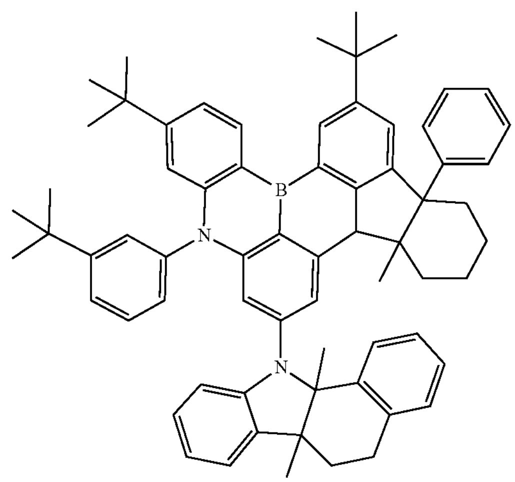
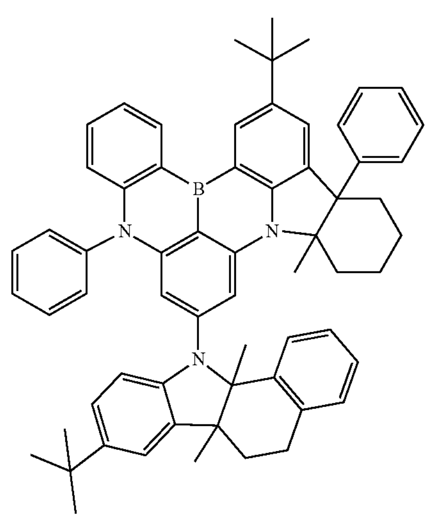

-continued
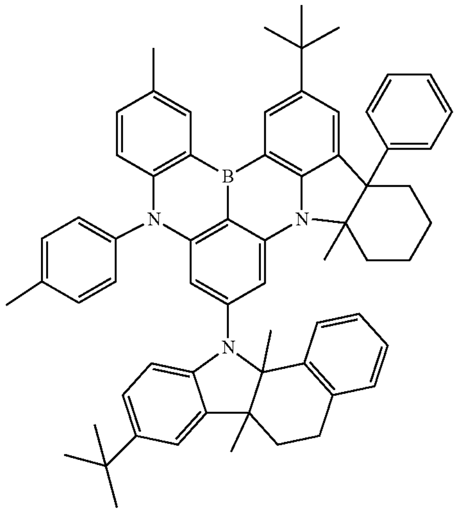
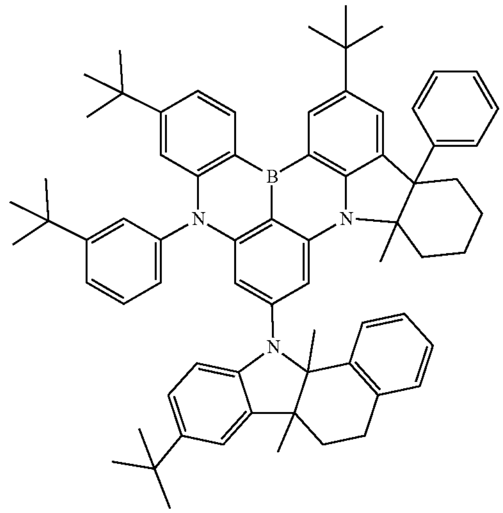
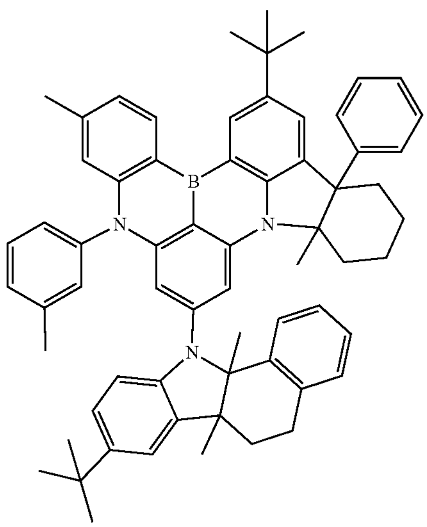
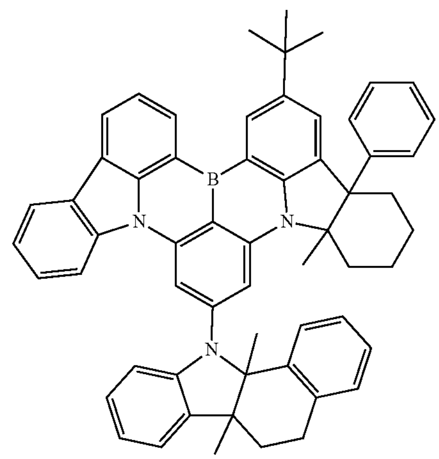
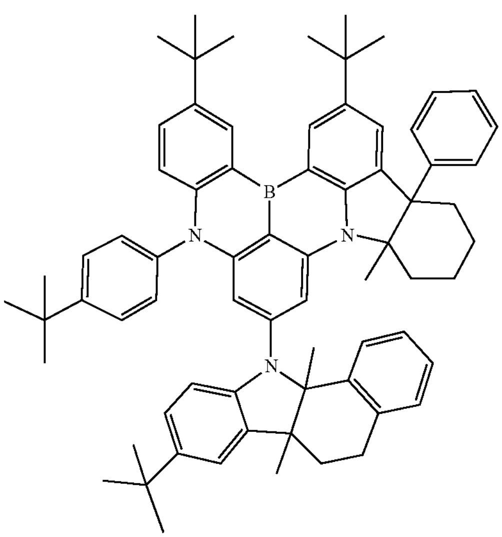
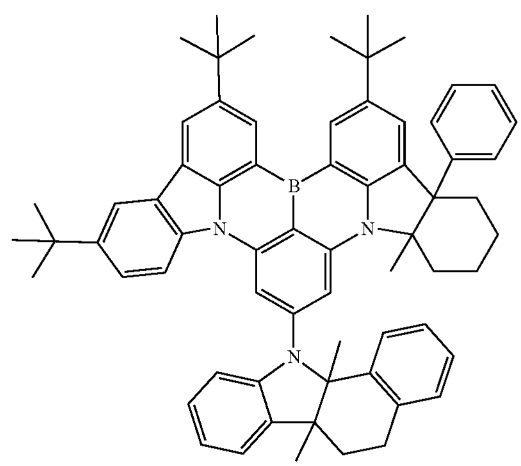
-continued

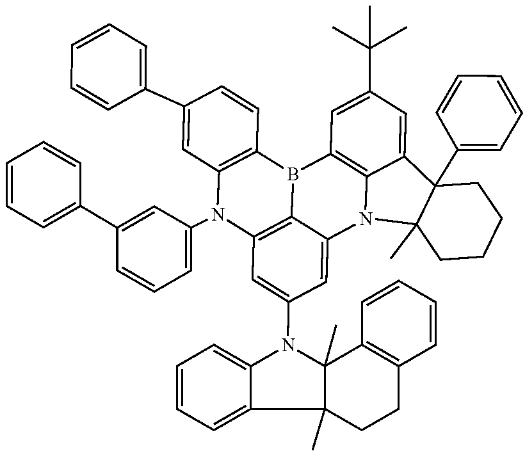
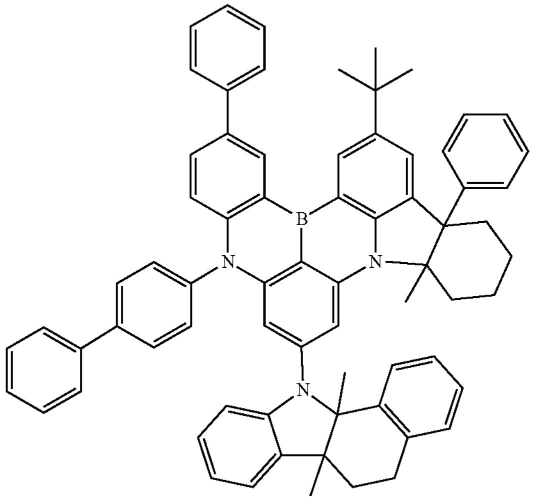
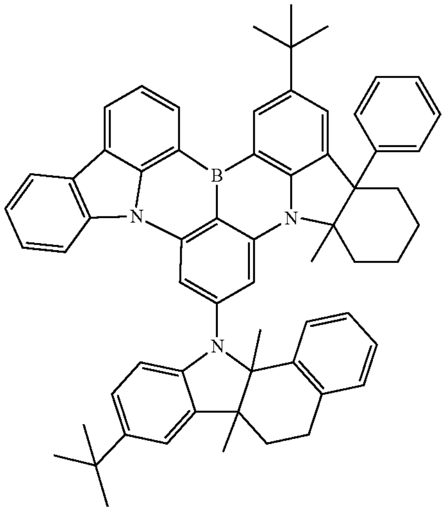
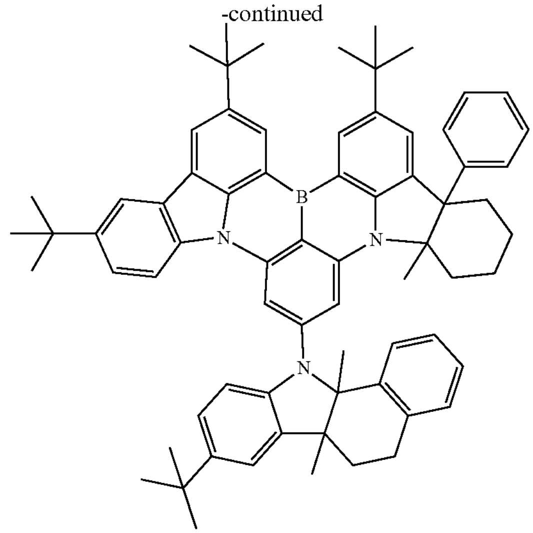
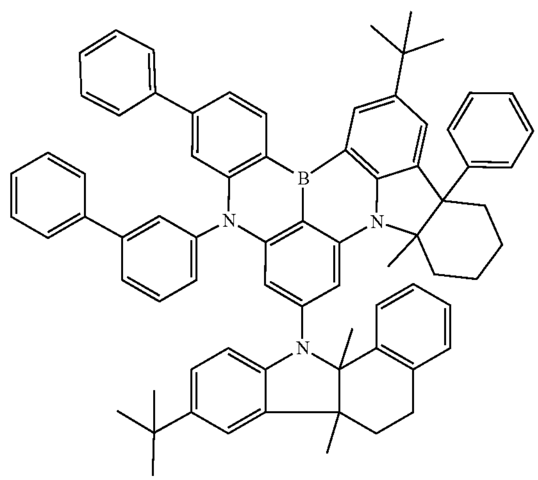
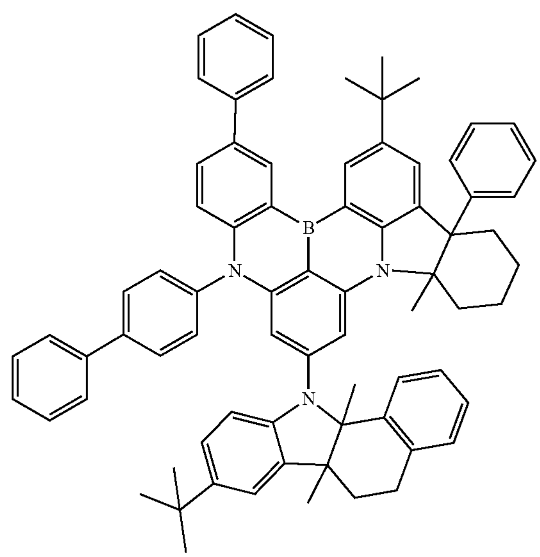

-continued
-continued
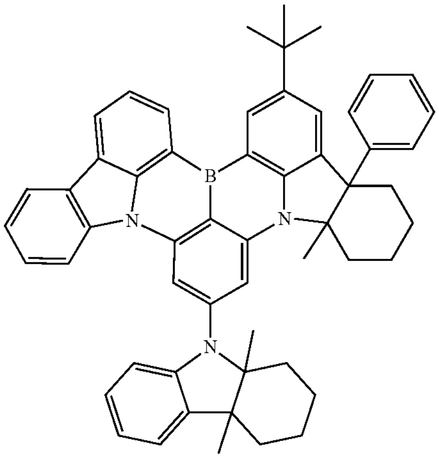
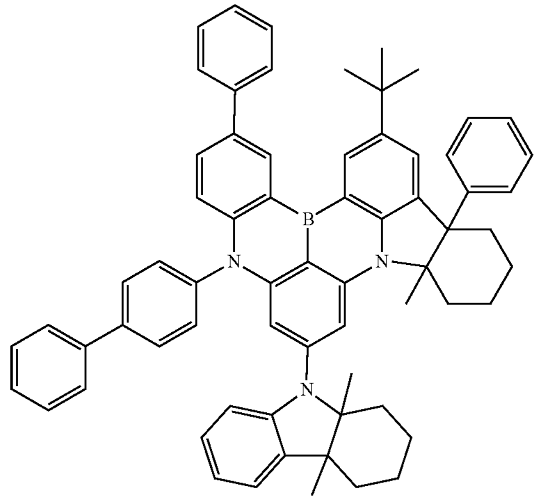
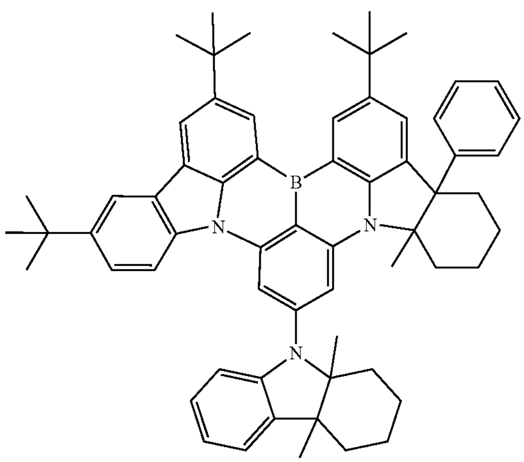
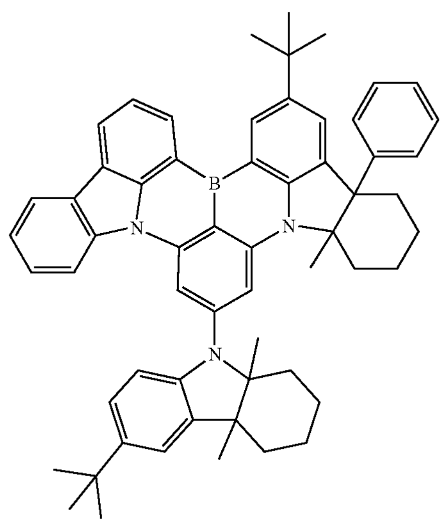
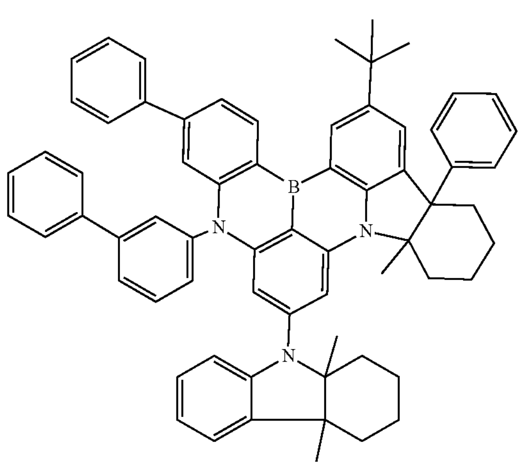
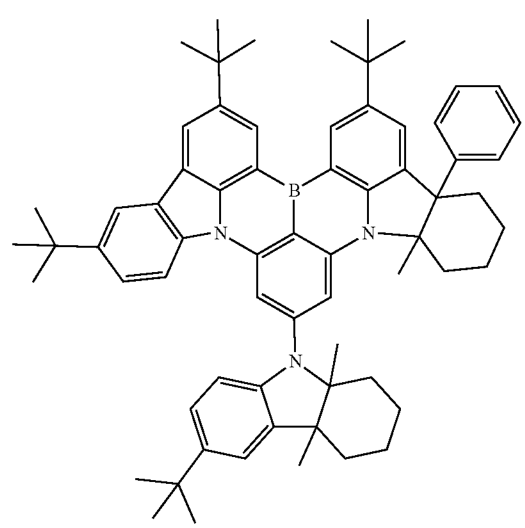

-continued
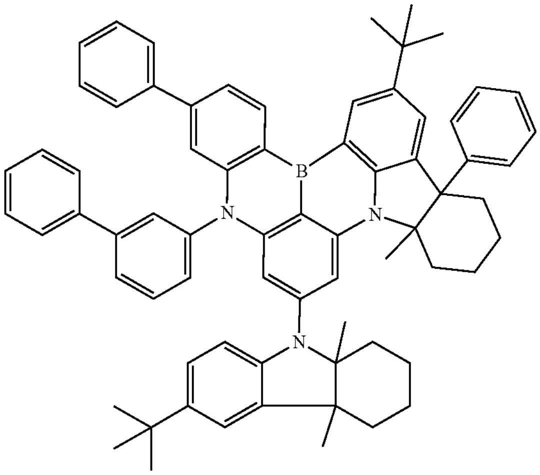
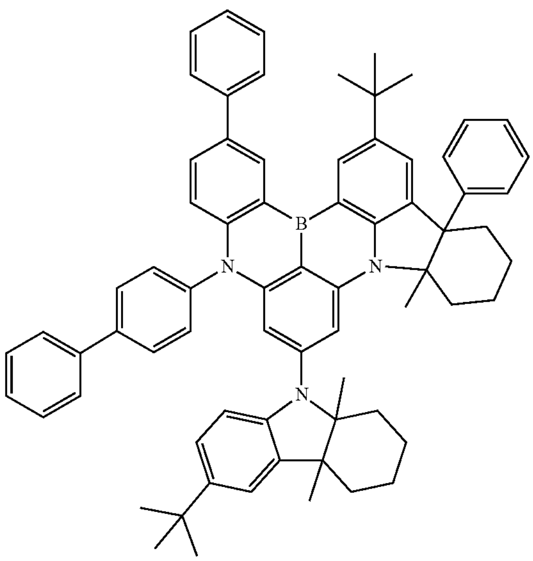
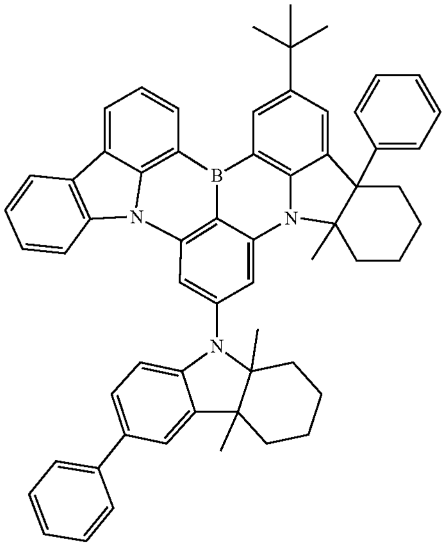
-continued
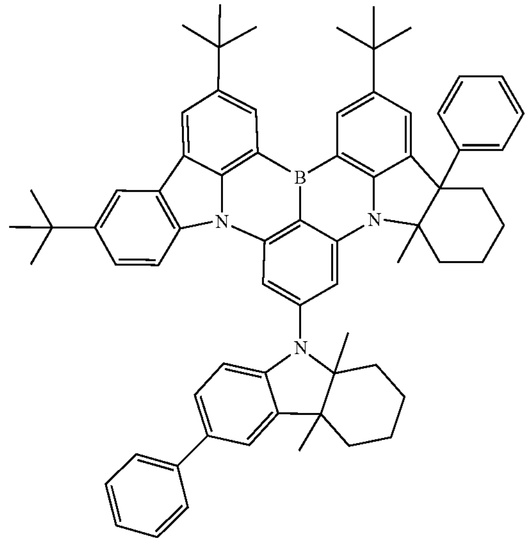
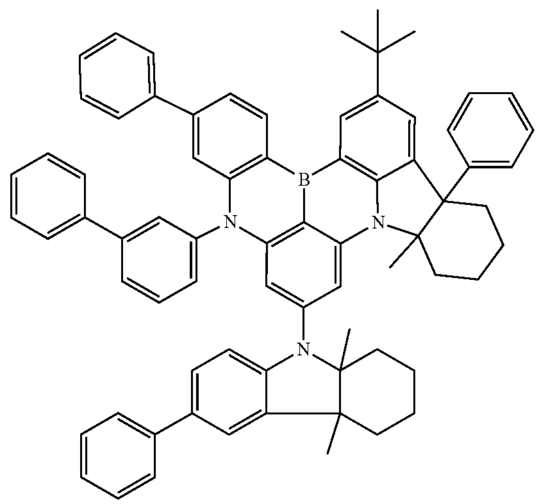
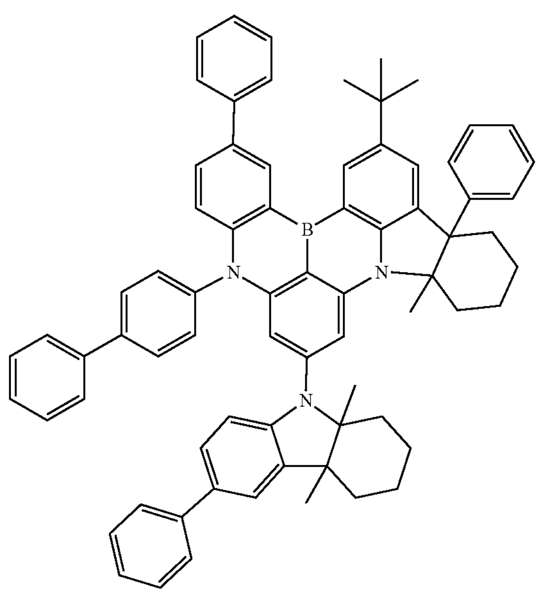

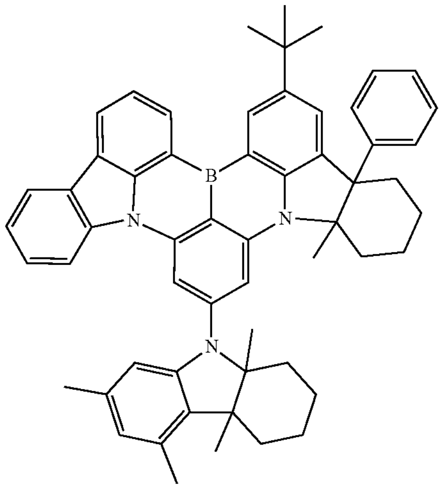
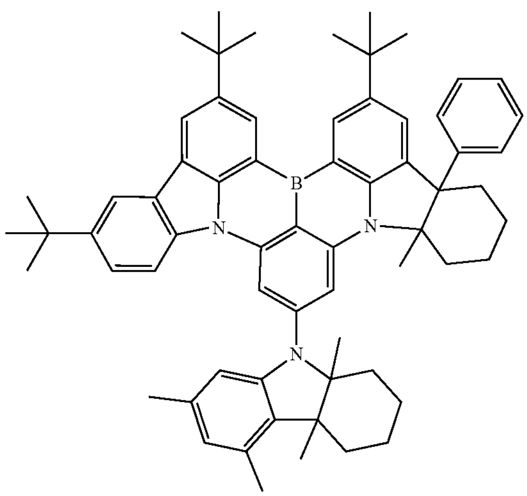
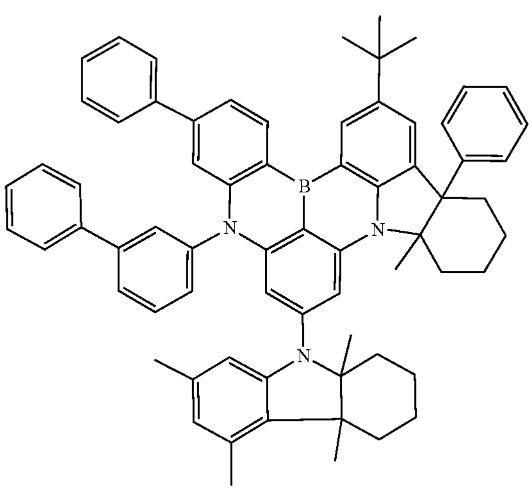
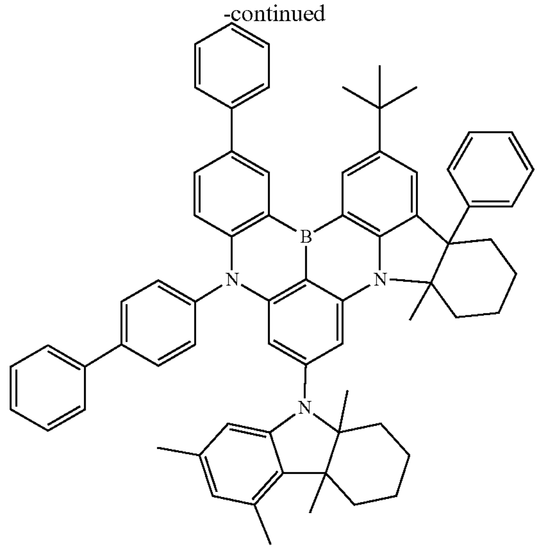
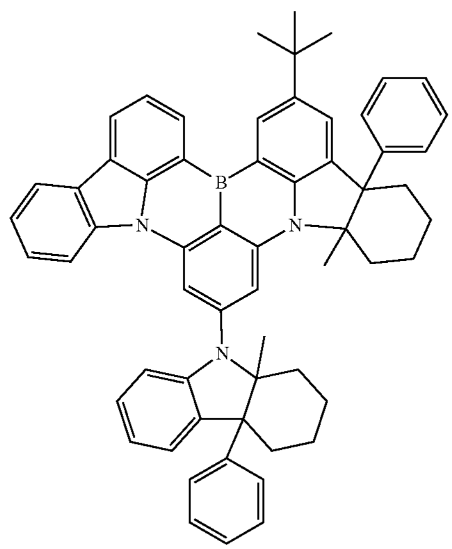
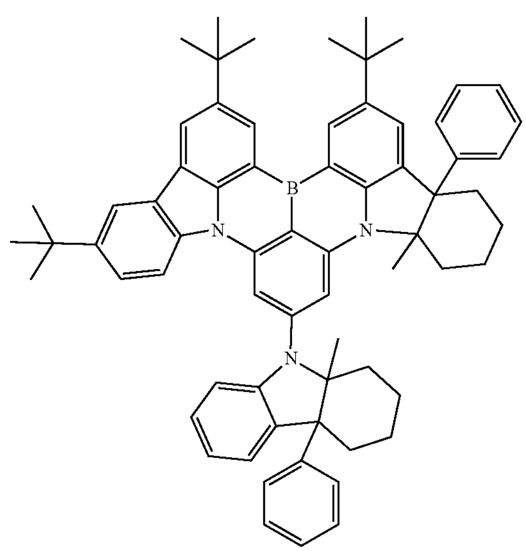

-continued
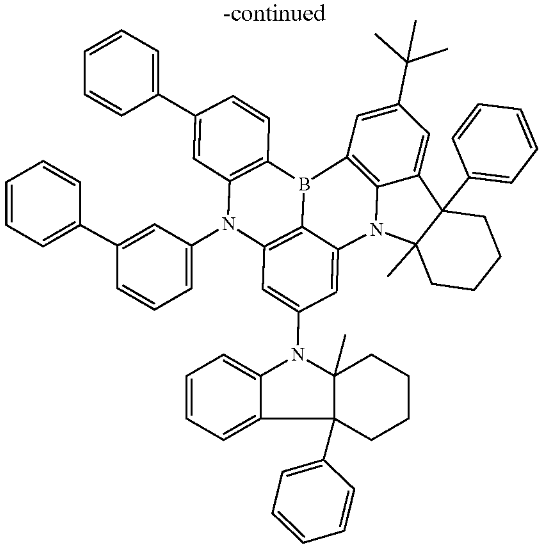
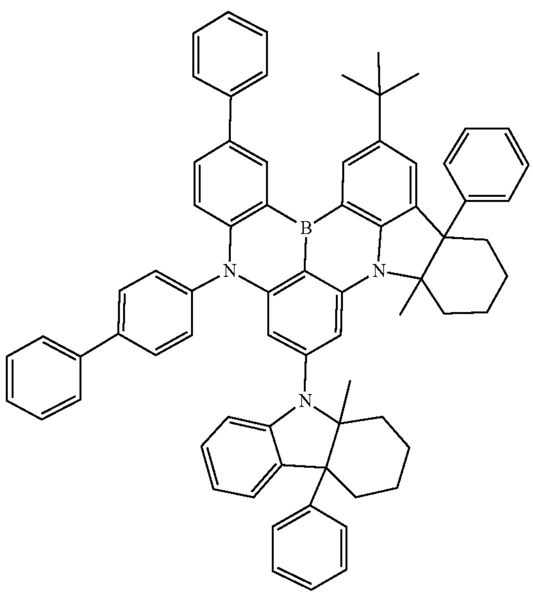
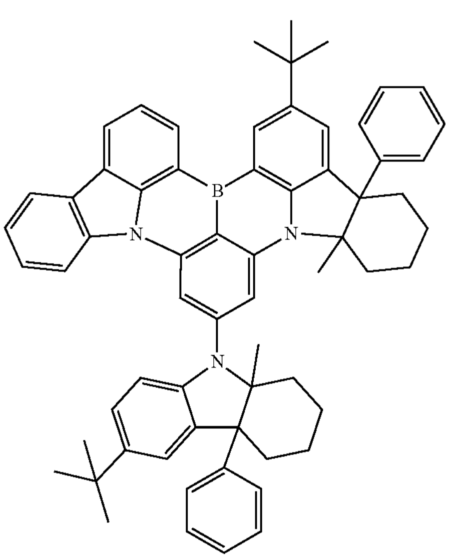
-continued
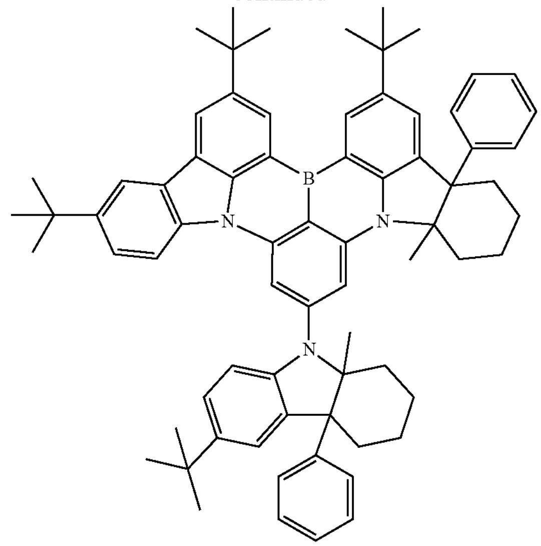
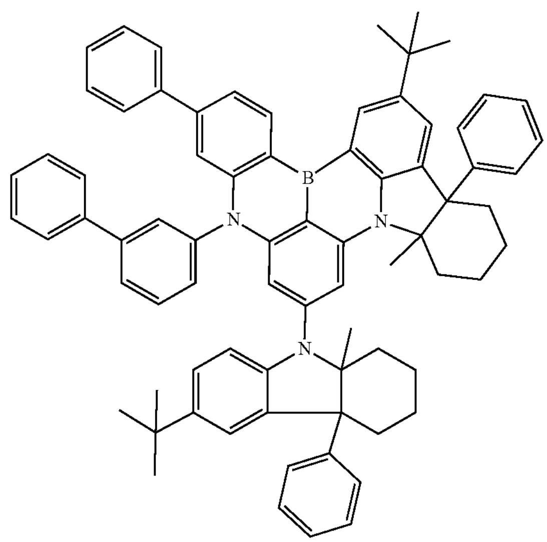
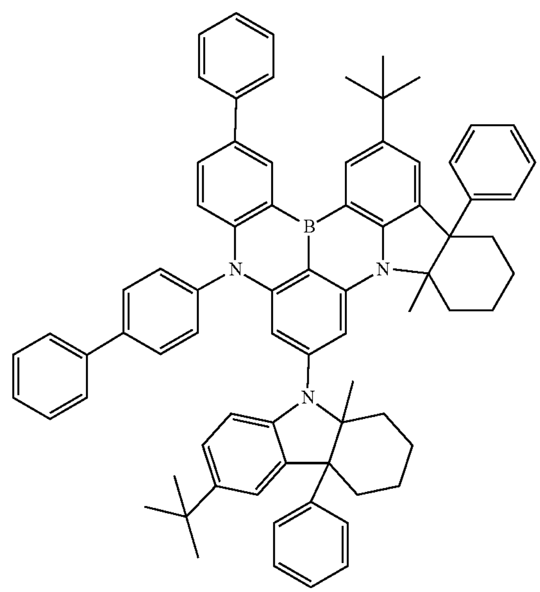

-continued
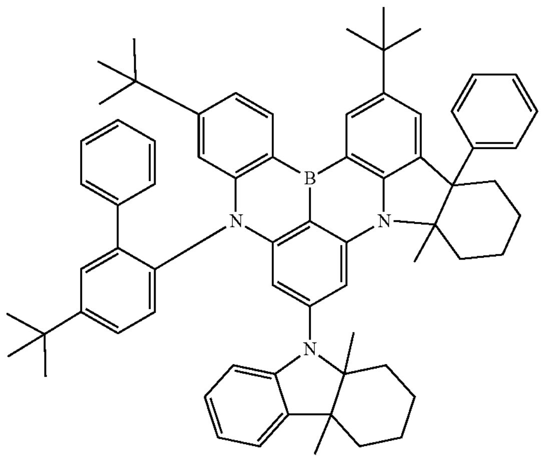
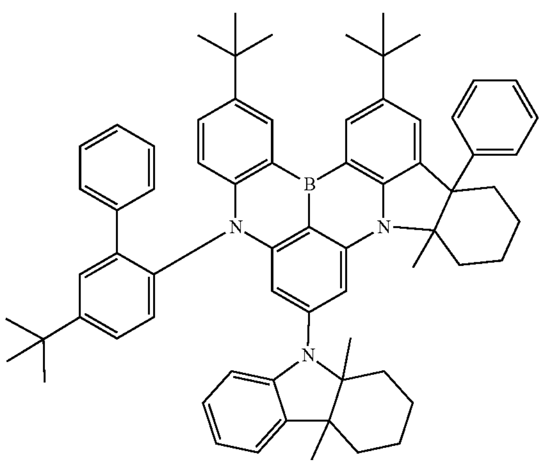
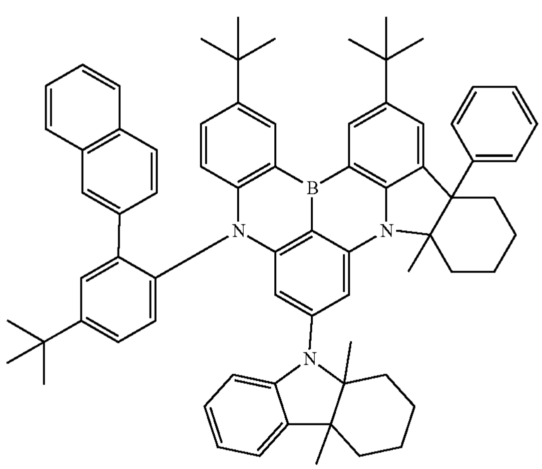
-continued
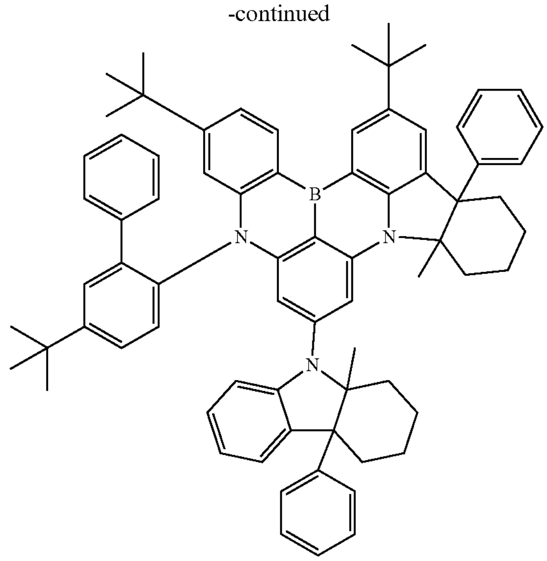
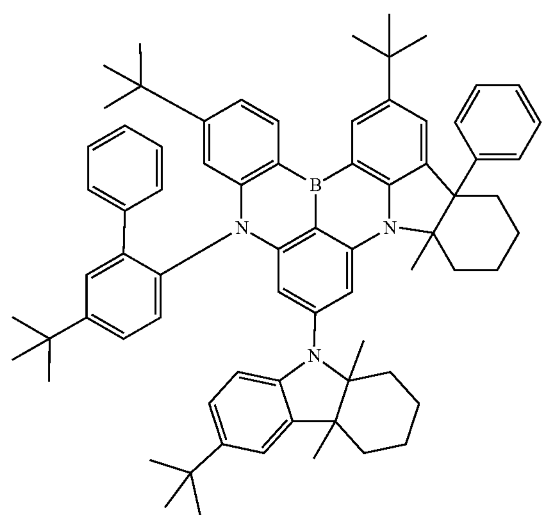
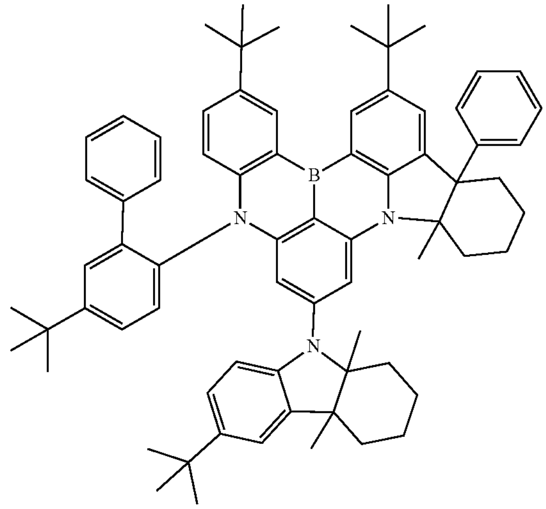

-continued
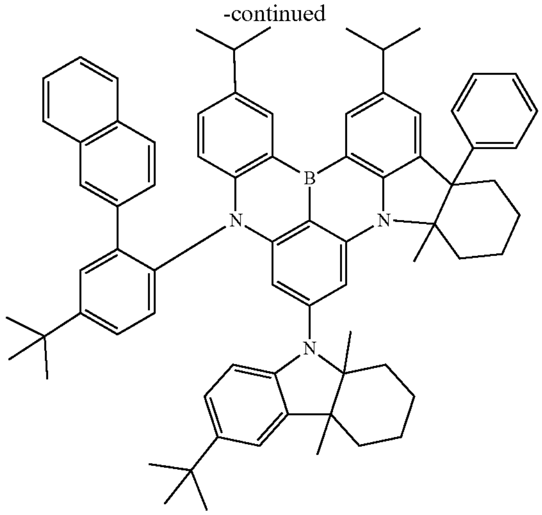
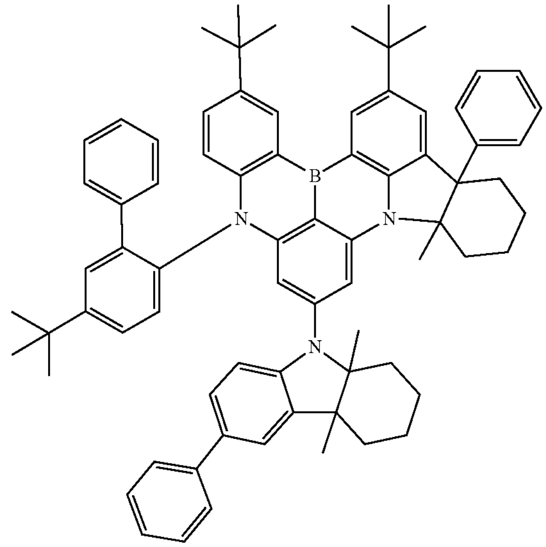
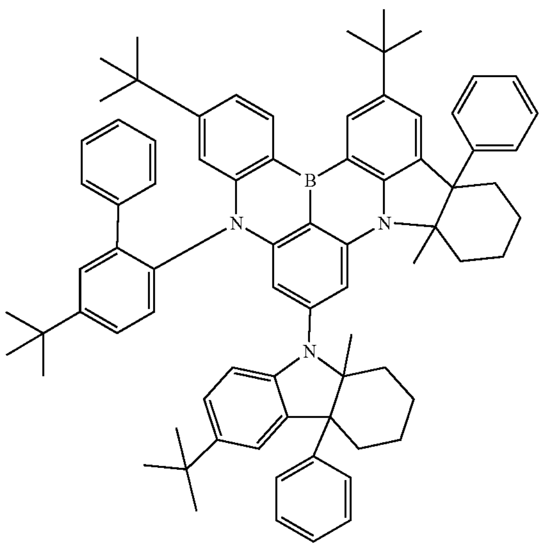
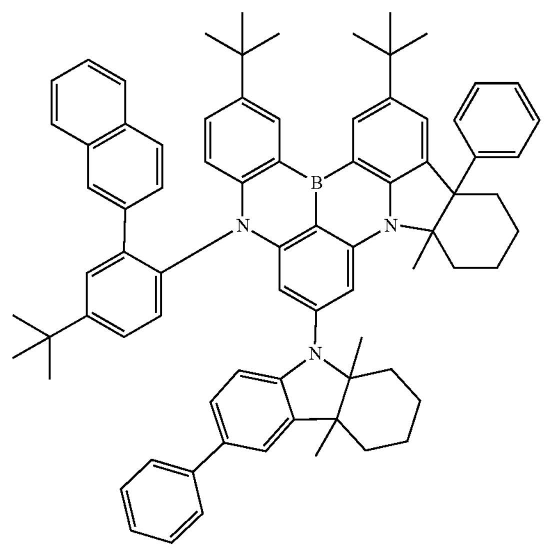
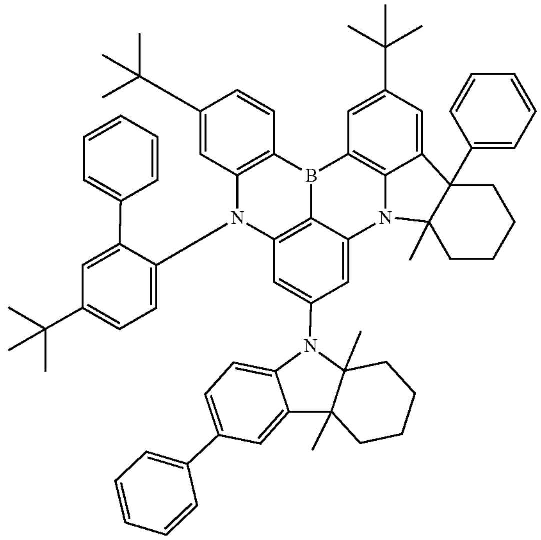
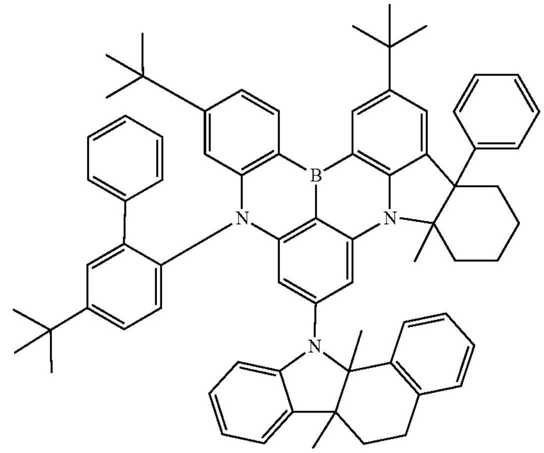
-continued -continued
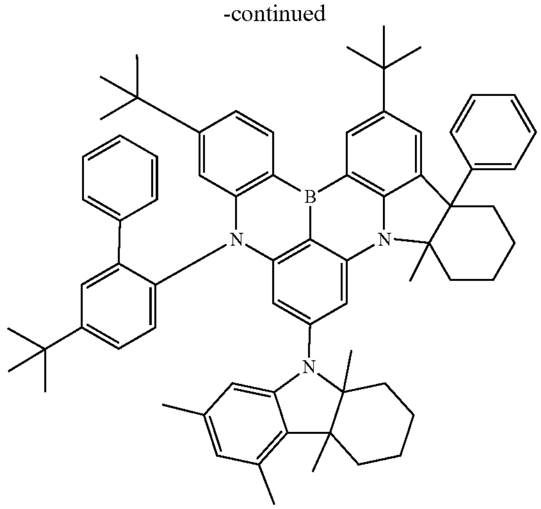
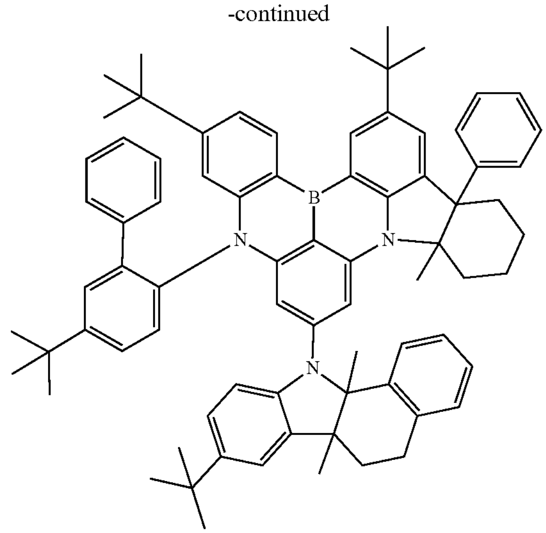
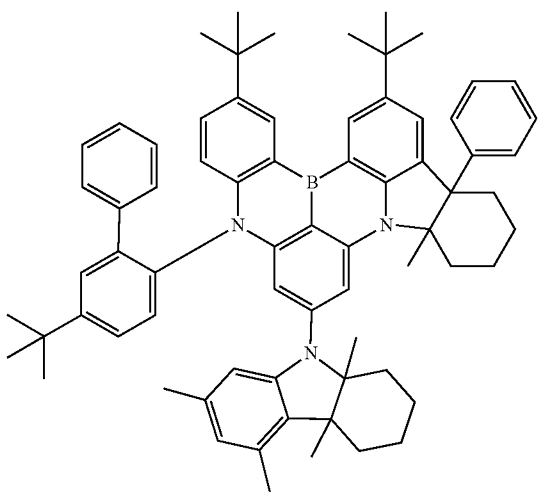
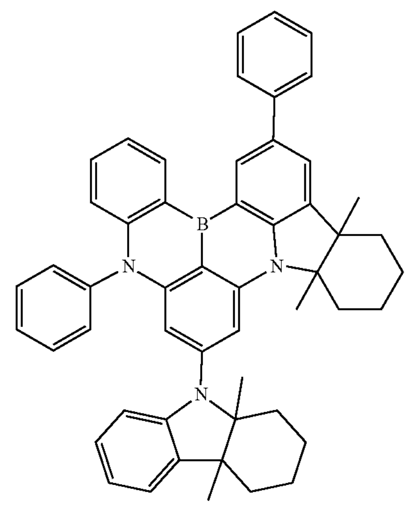
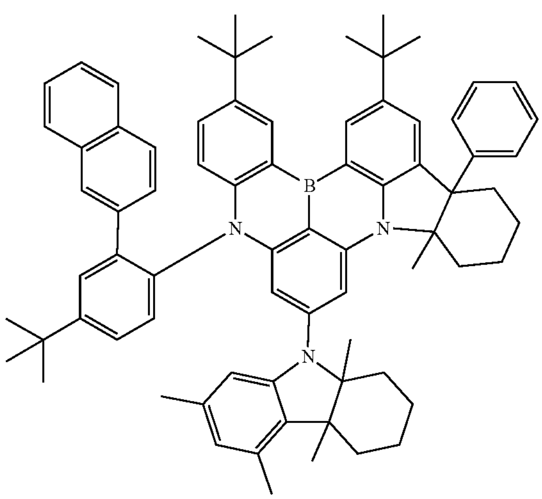
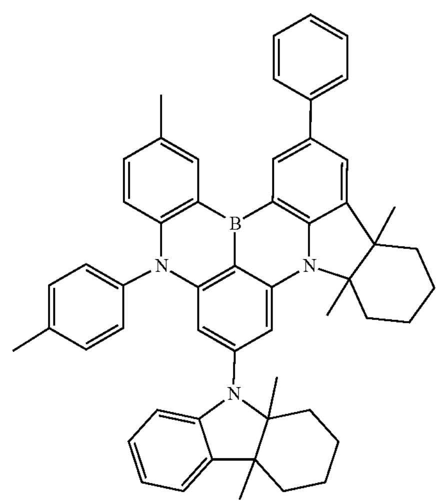
-continued -continued
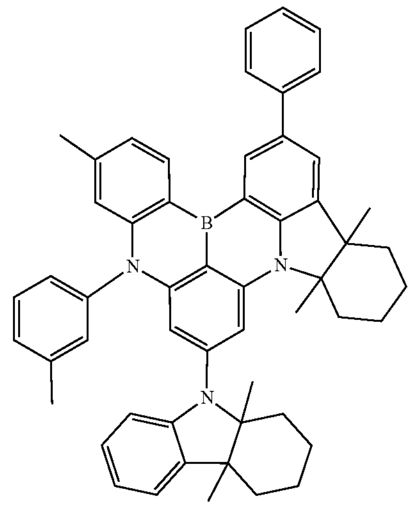
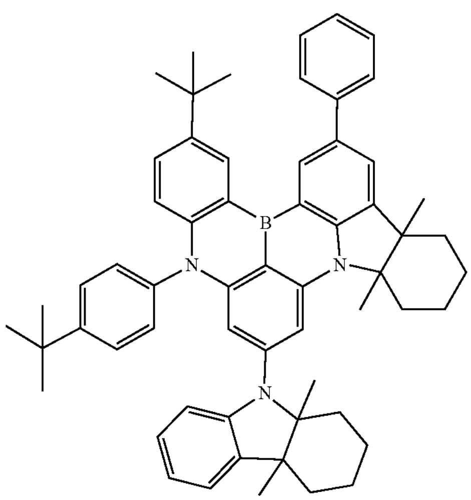
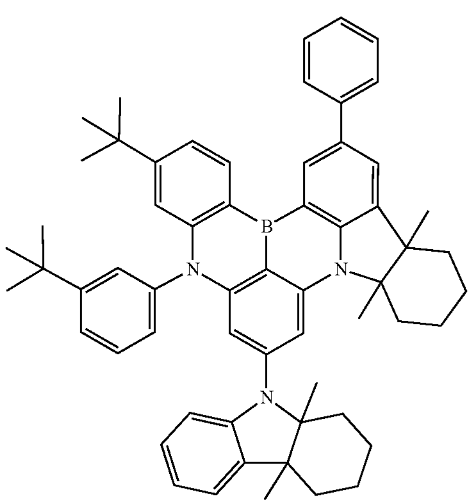
-continued
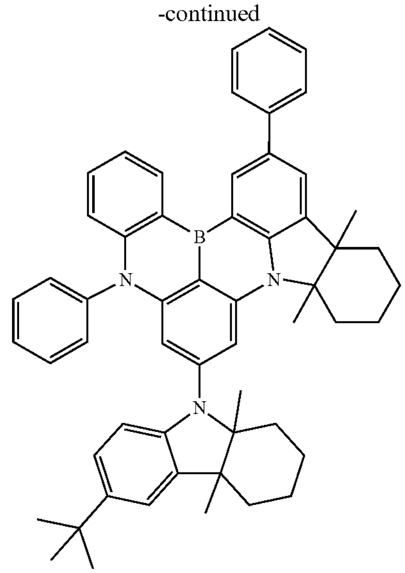
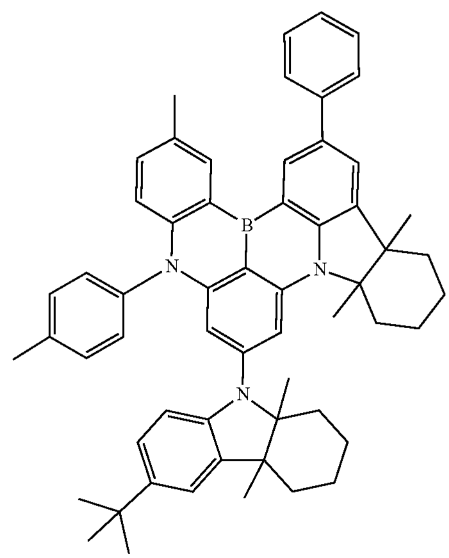
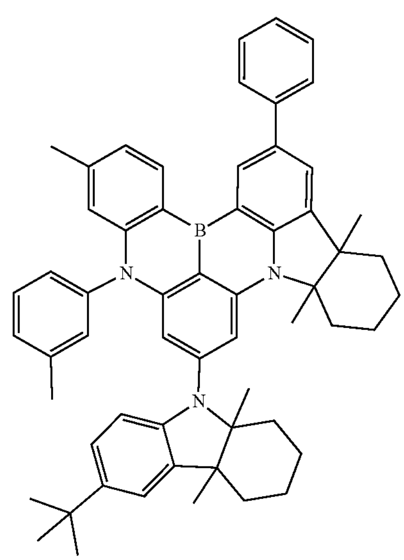

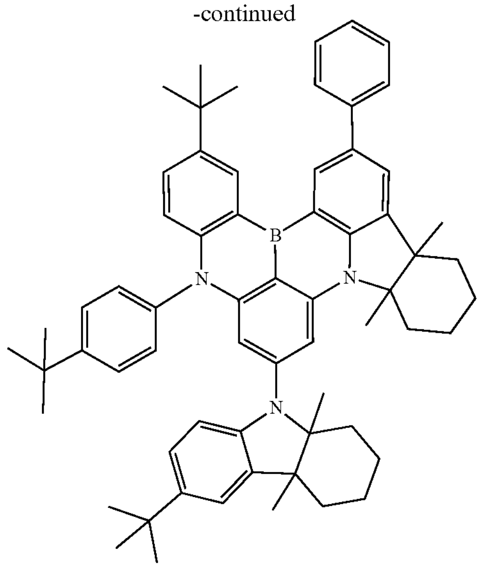
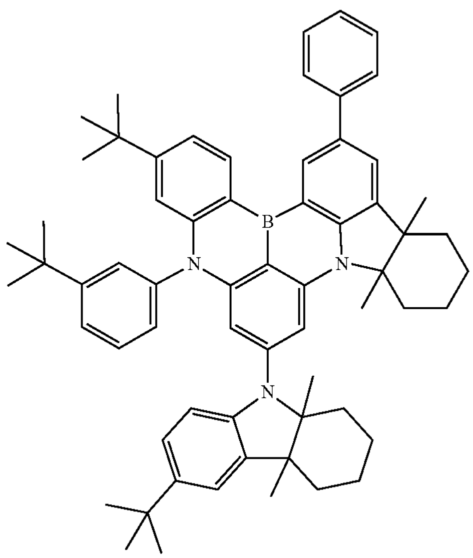
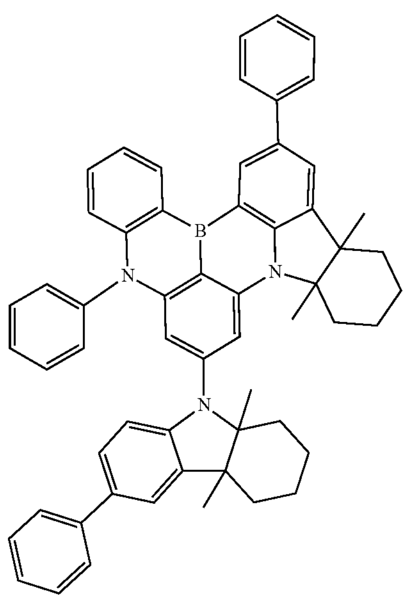
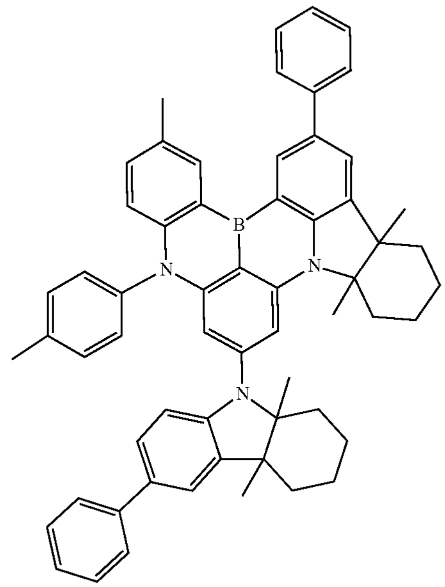
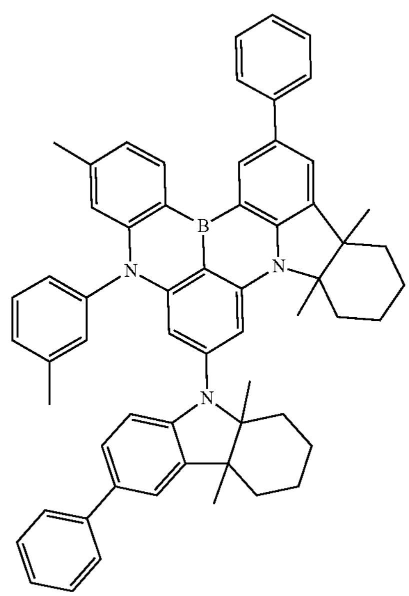

-continued
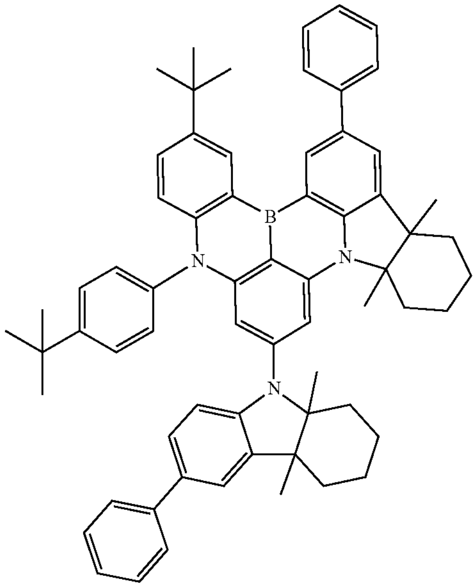
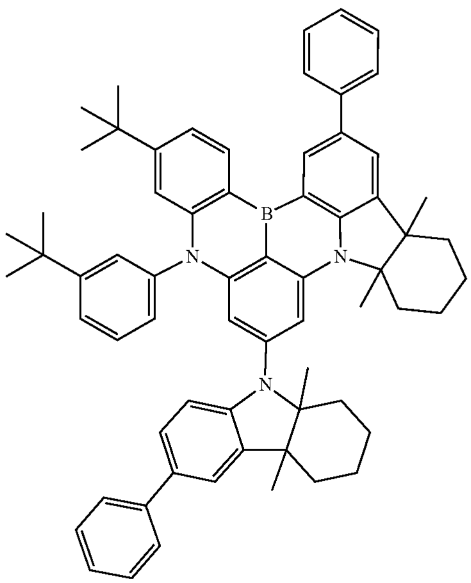
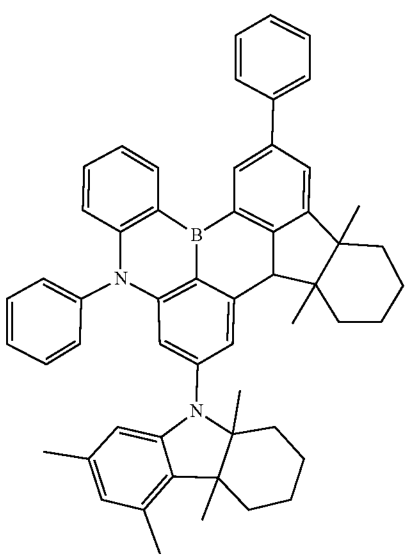
-continued
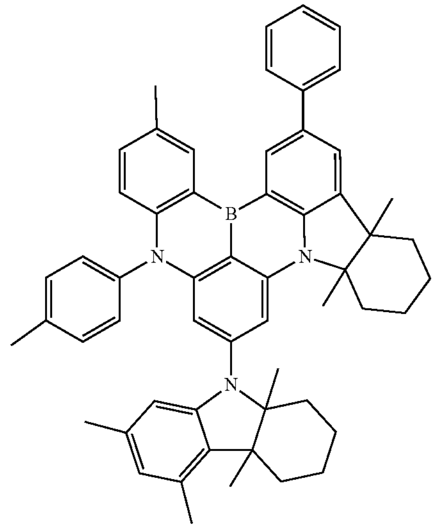
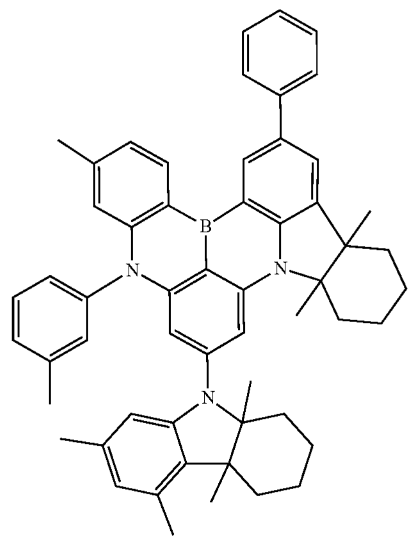
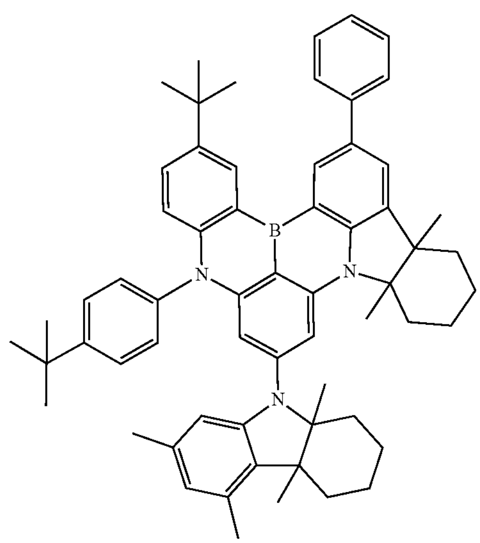

-continued
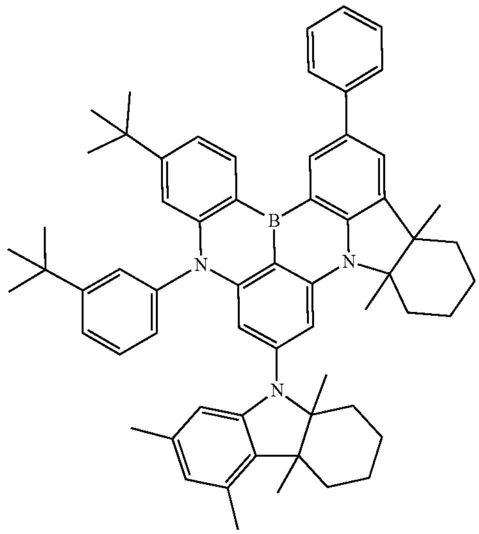
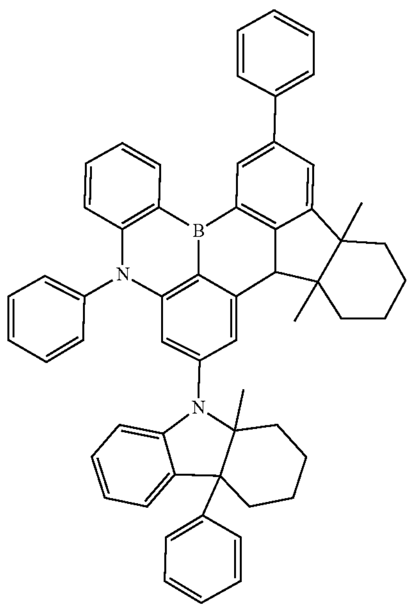
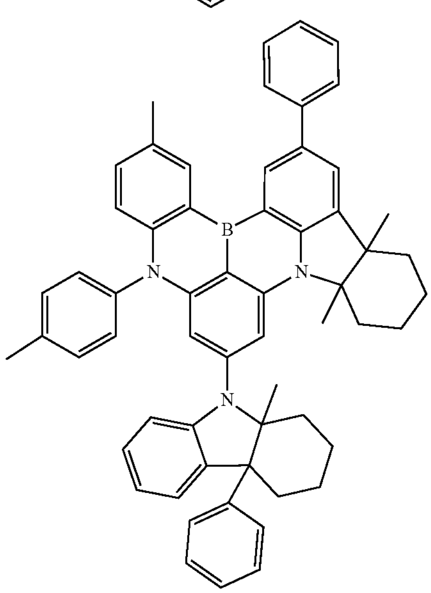
-continued
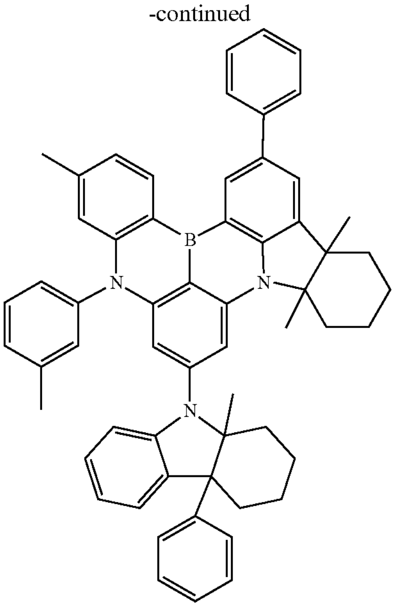
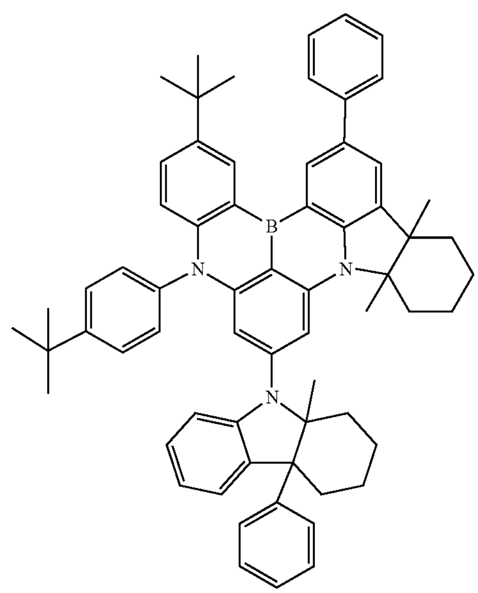

-continued
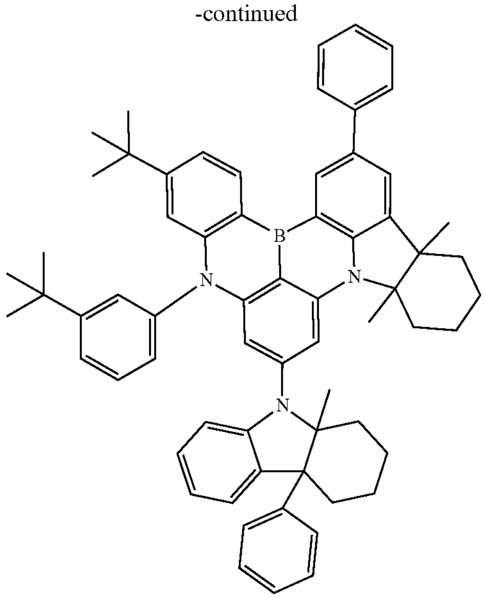
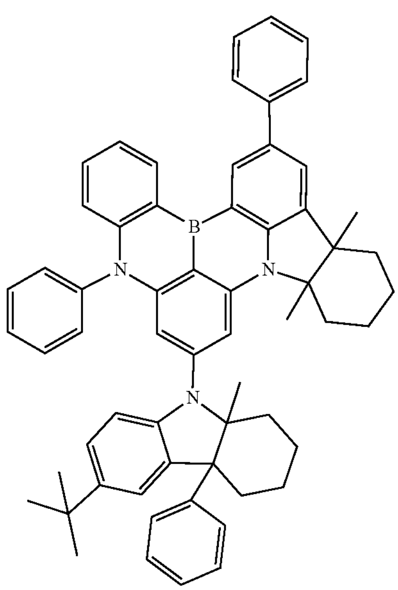
-continued
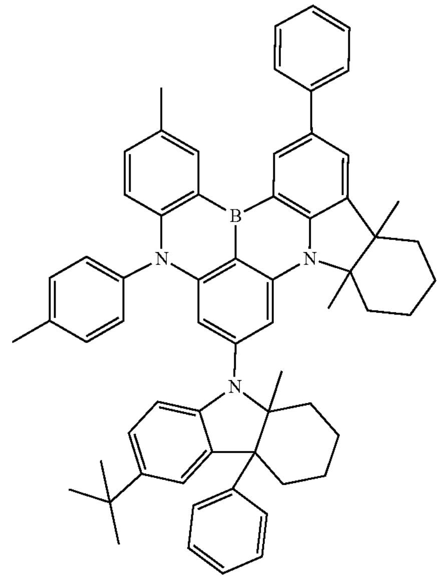
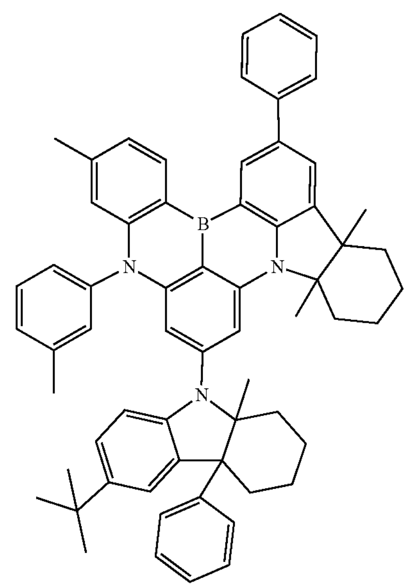

-continued
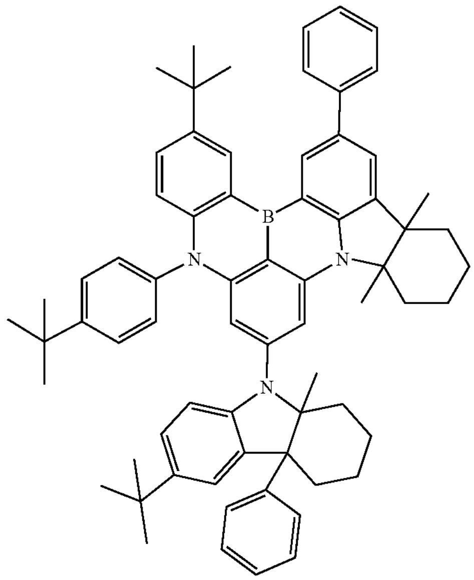
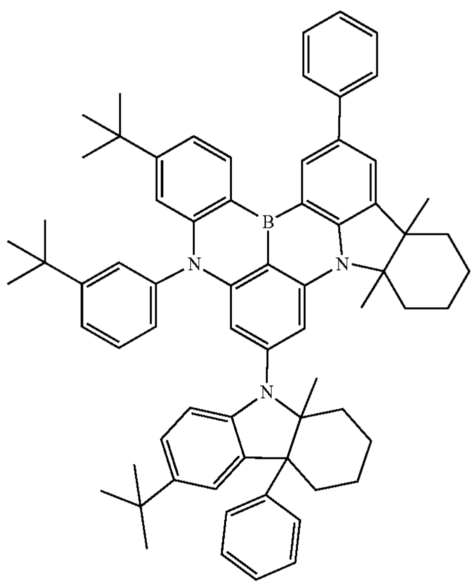
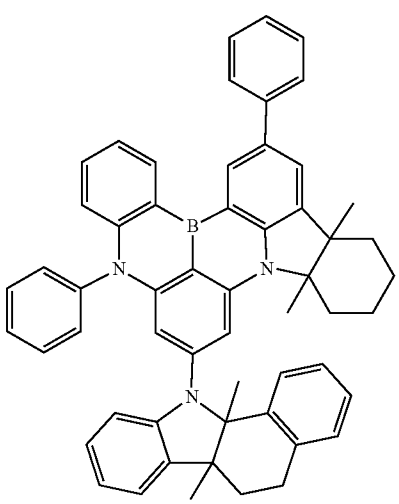
-continued
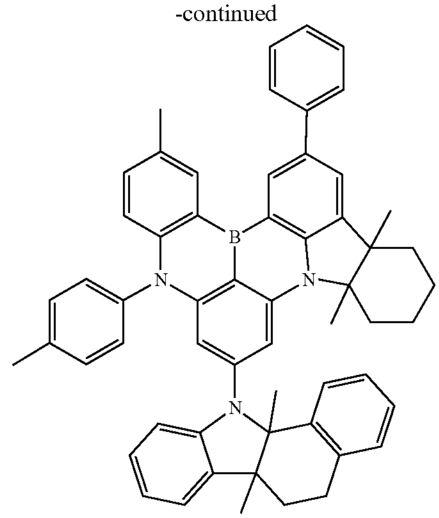
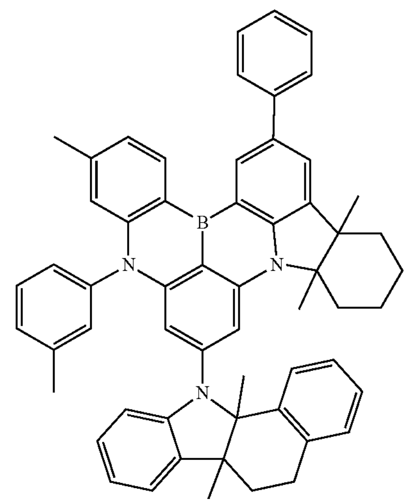
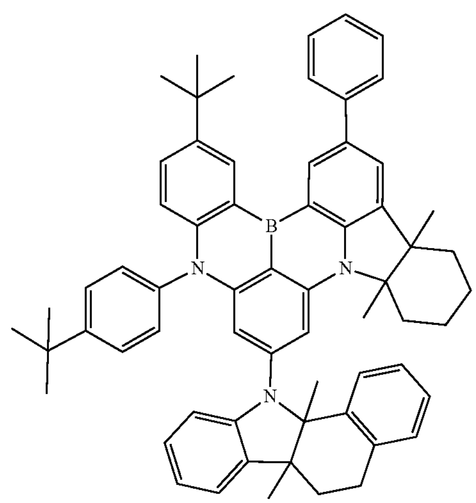

-continued
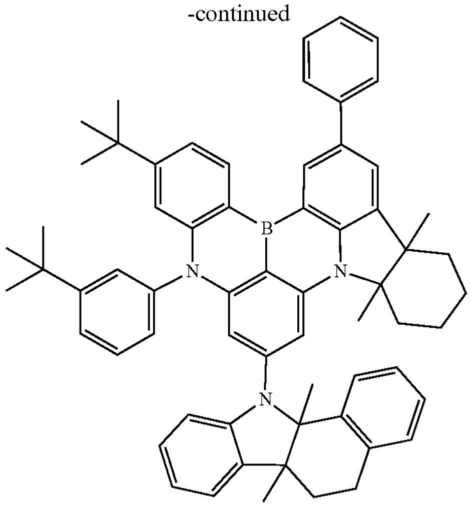
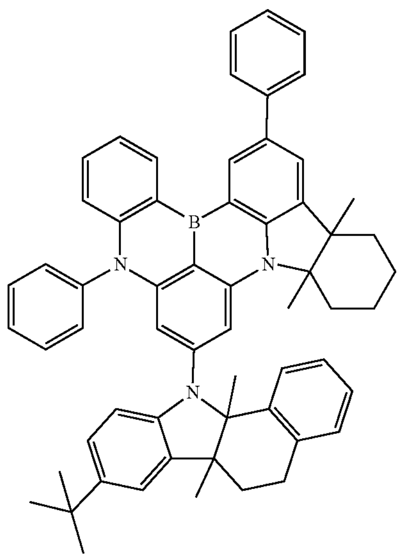
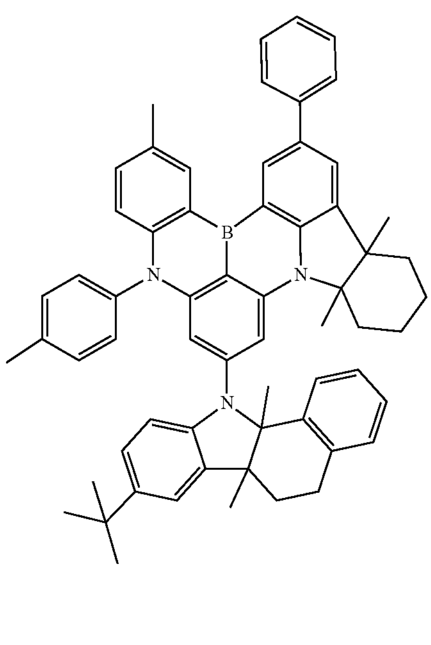
-continued
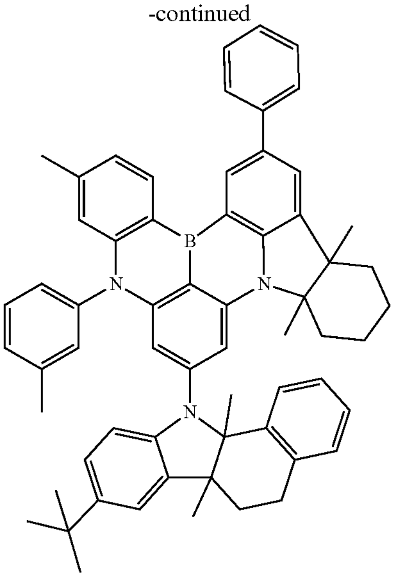
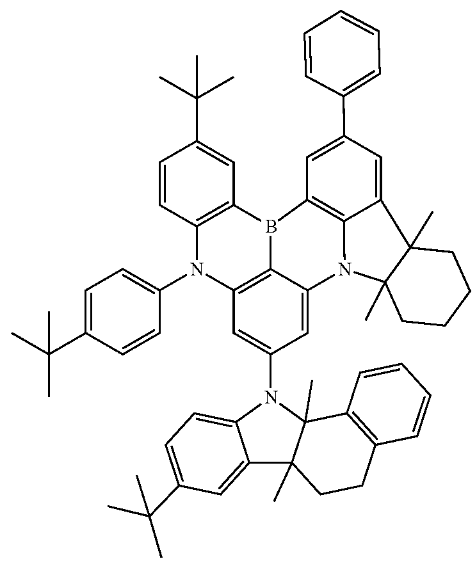
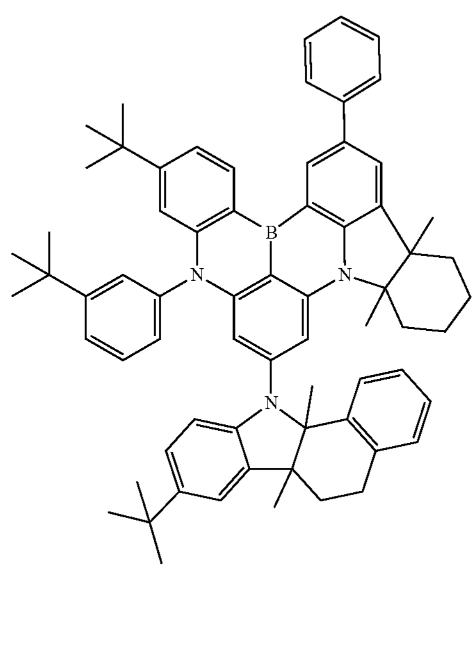

-continued
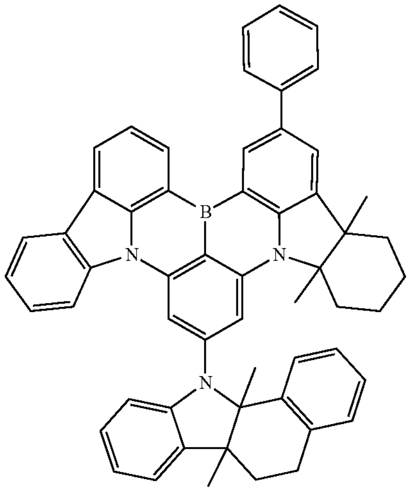
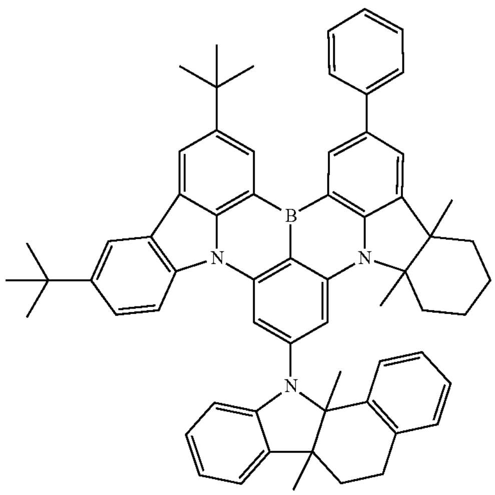
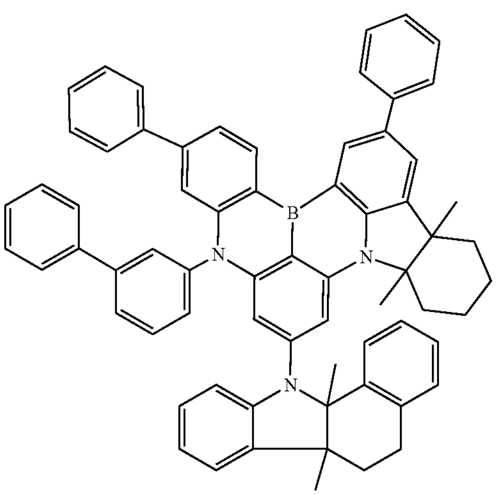
-continued
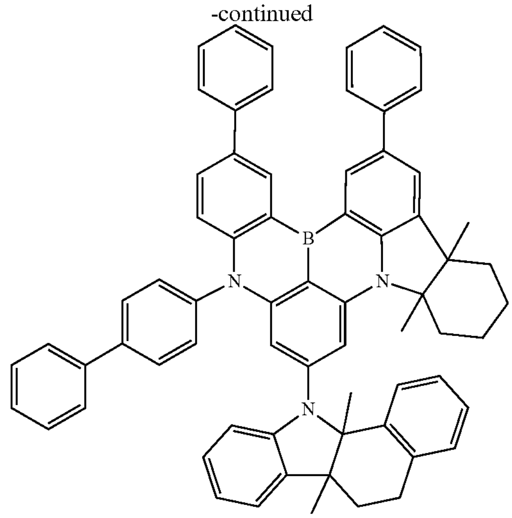
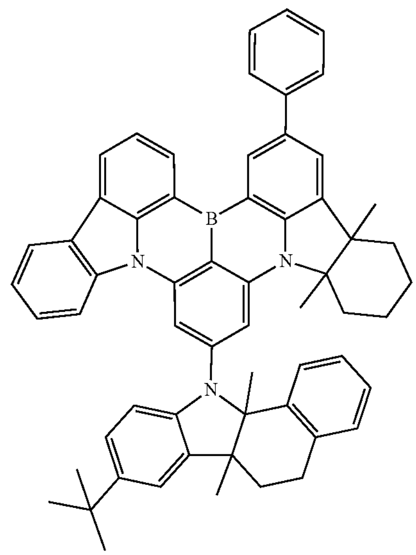
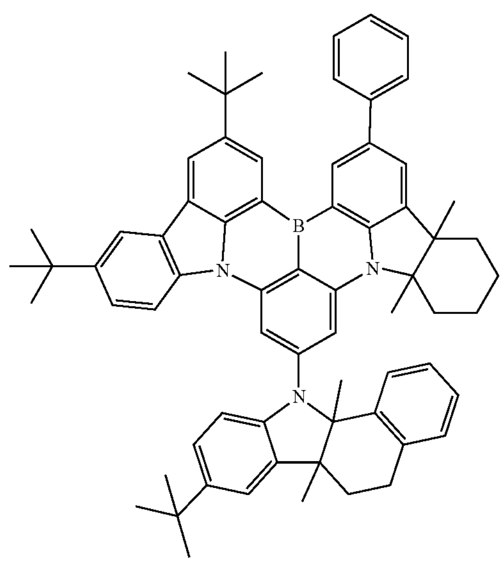

-continued
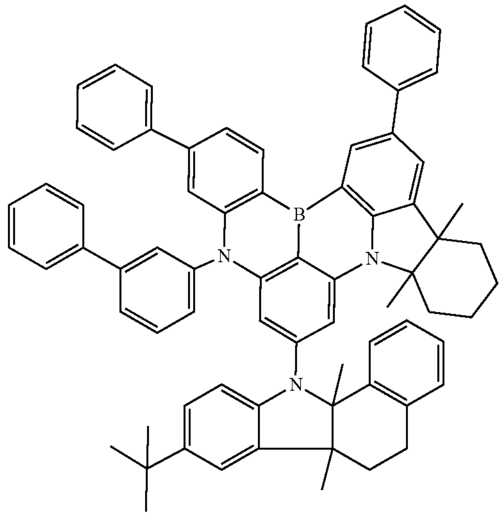
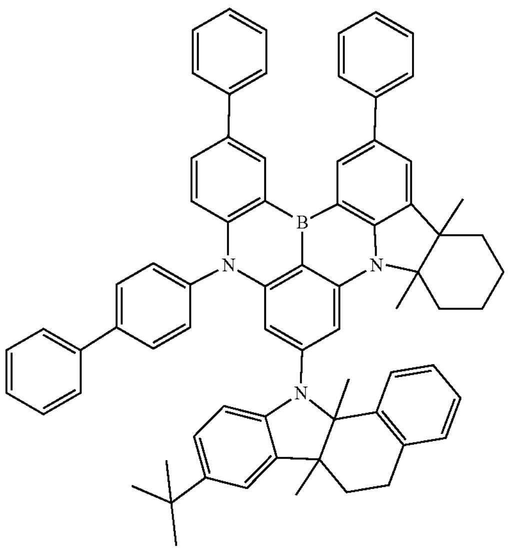
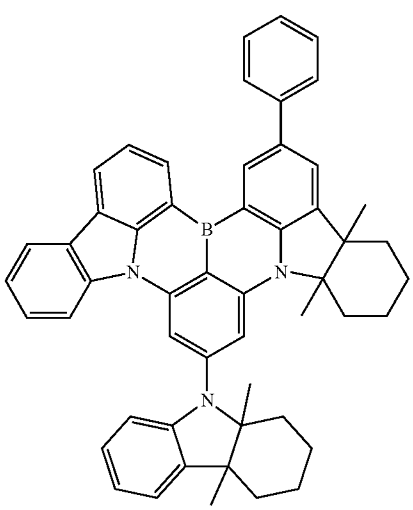
-continued
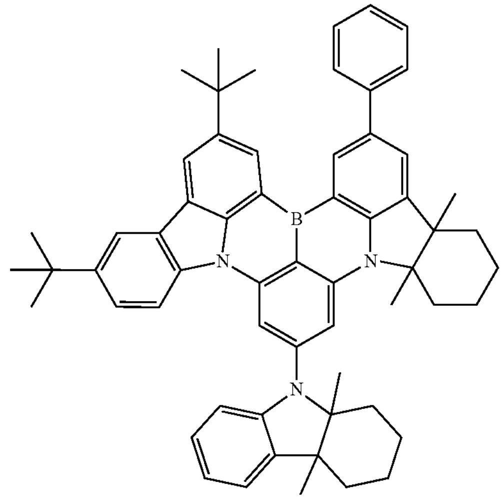
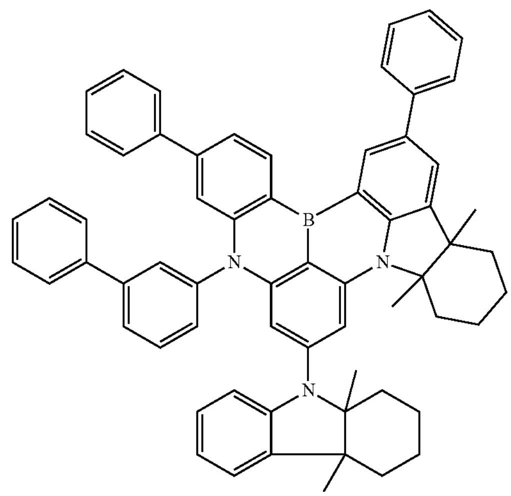
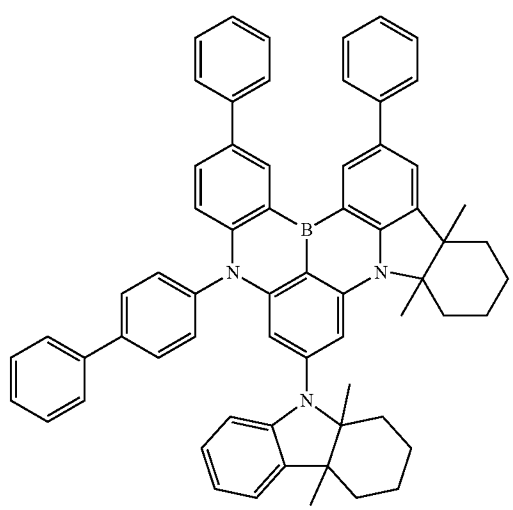

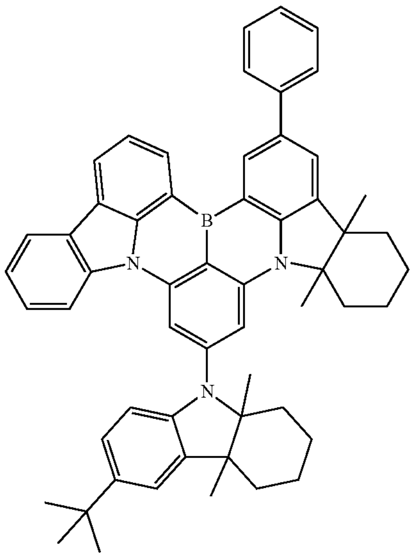
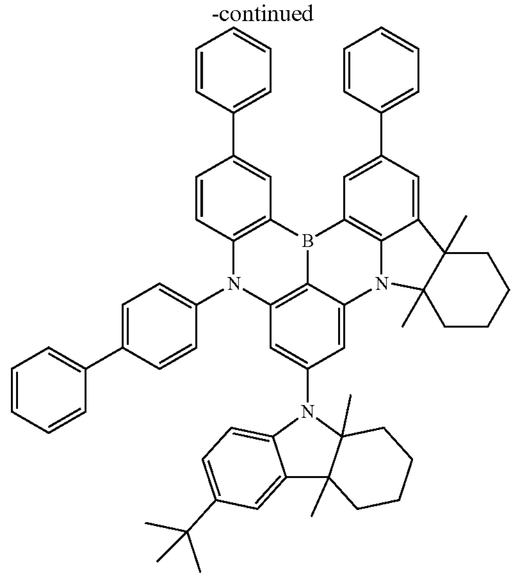
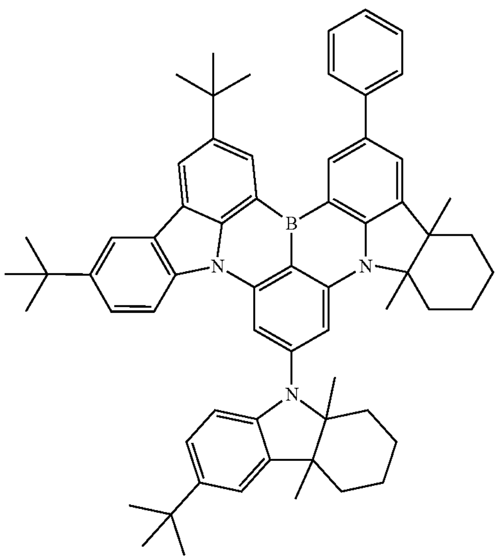
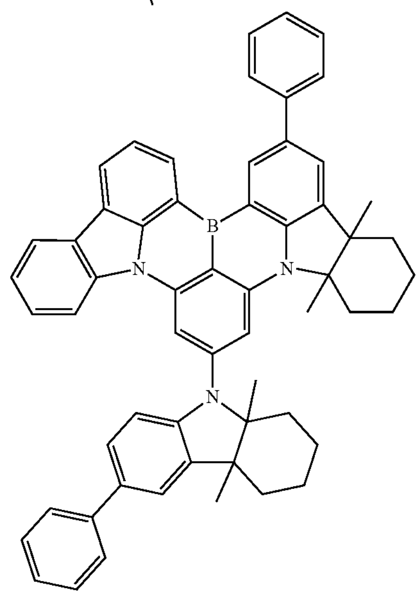
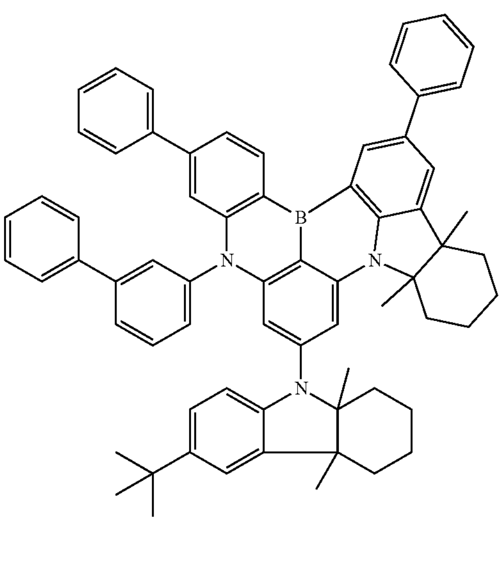
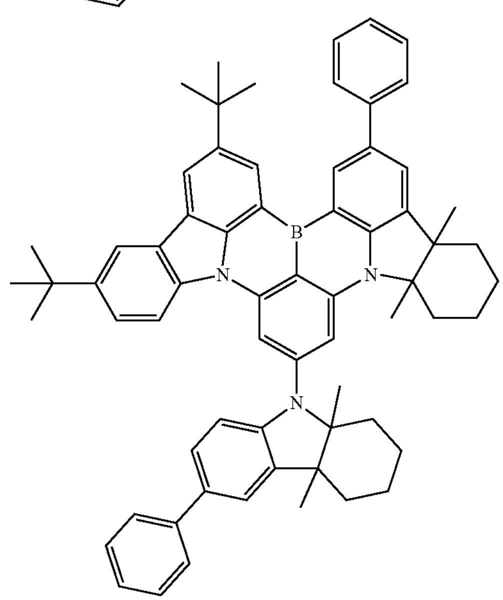
B
N
N -continued
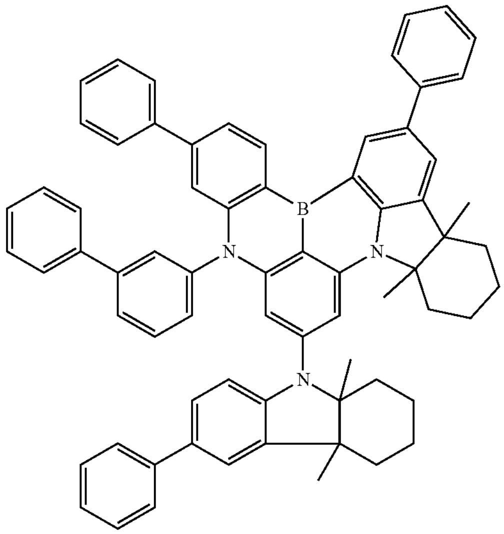
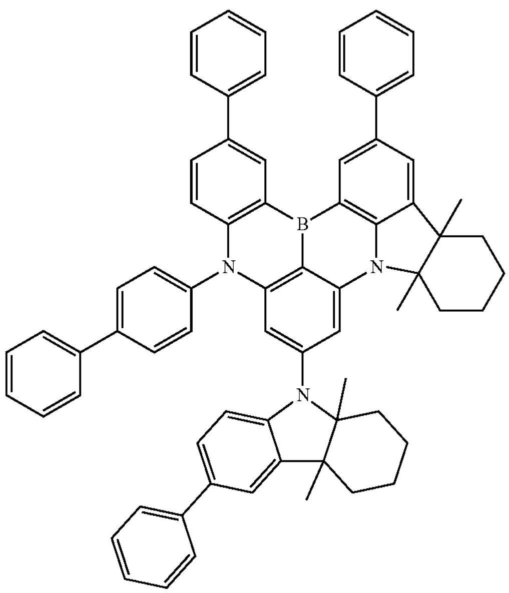
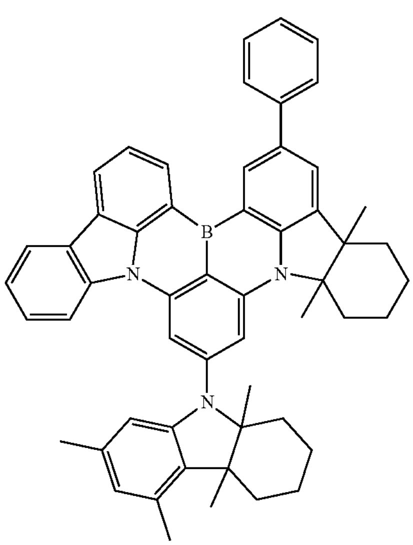
-continued
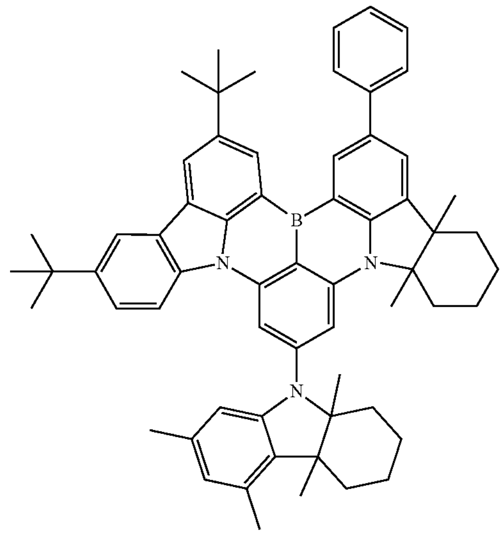
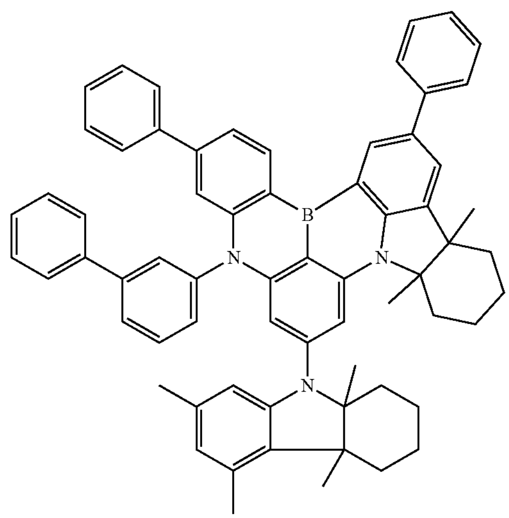
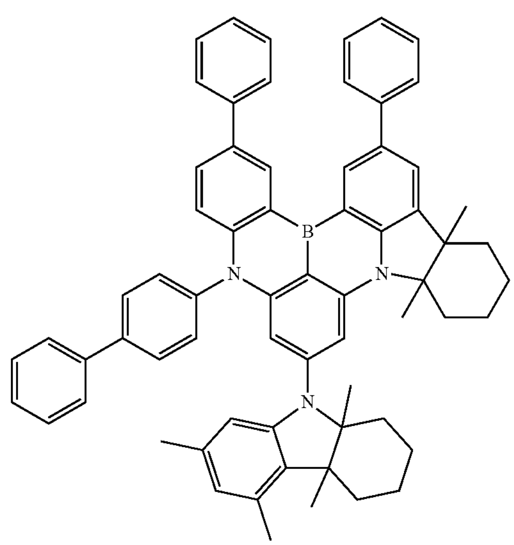

-continued
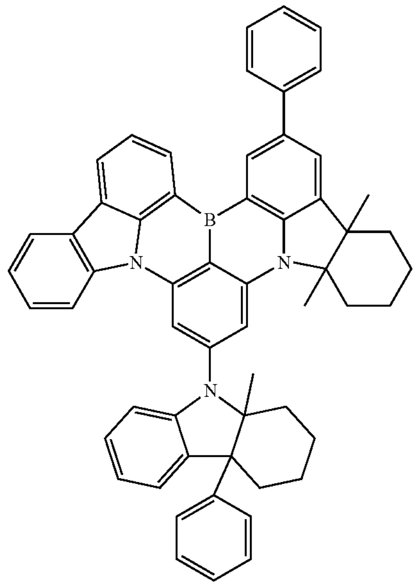
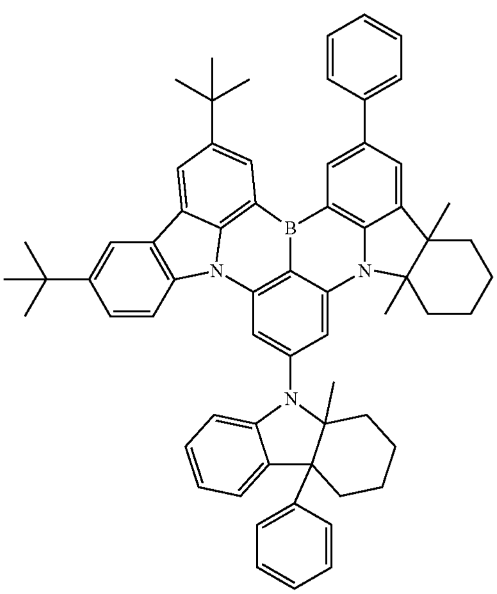
-continued
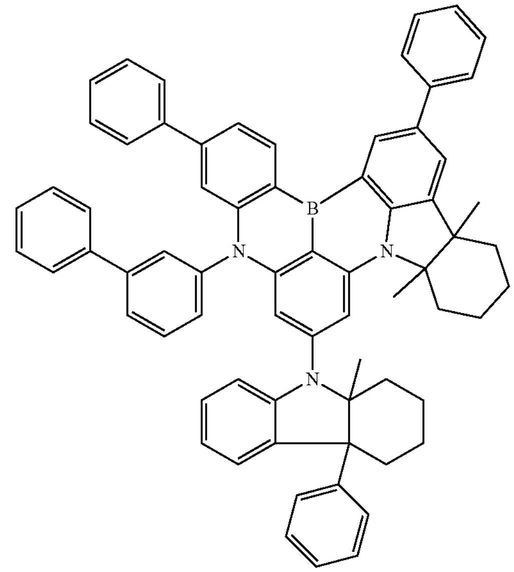
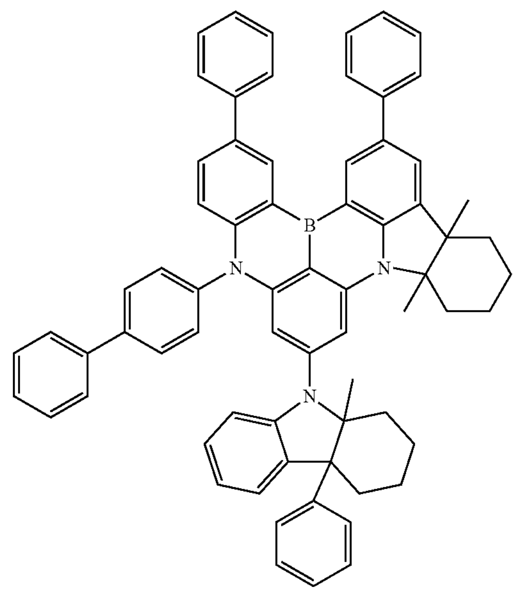
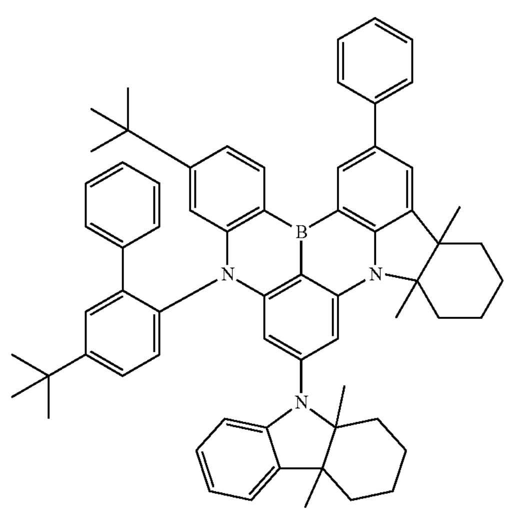

-continued
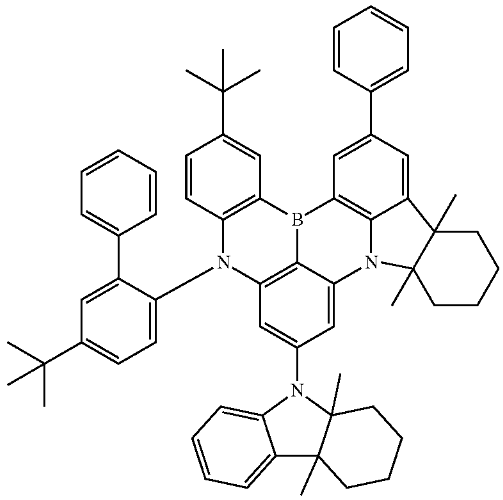
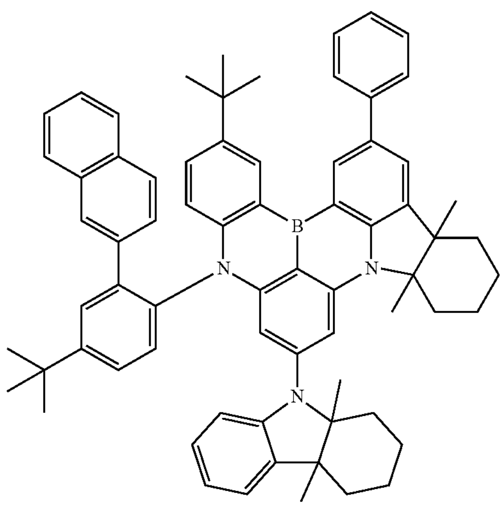
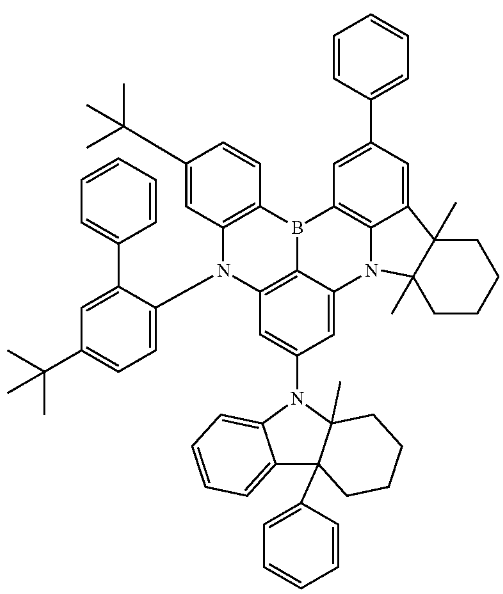
-continued
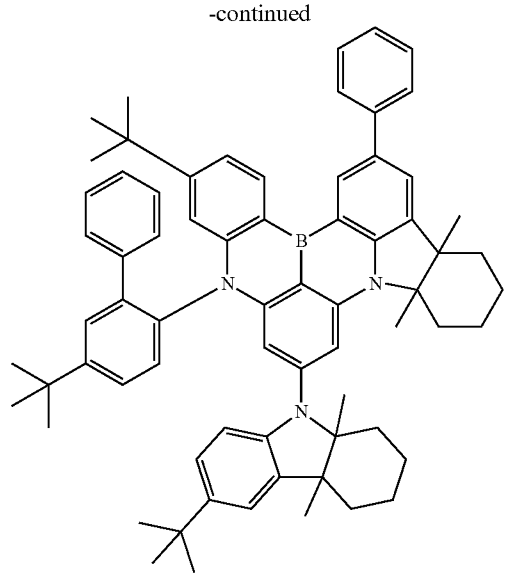
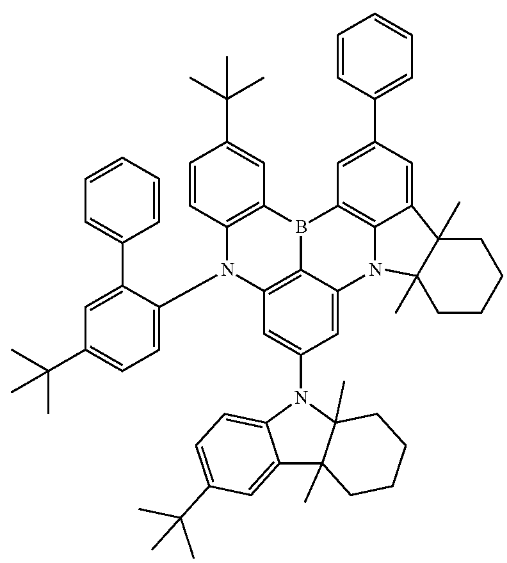
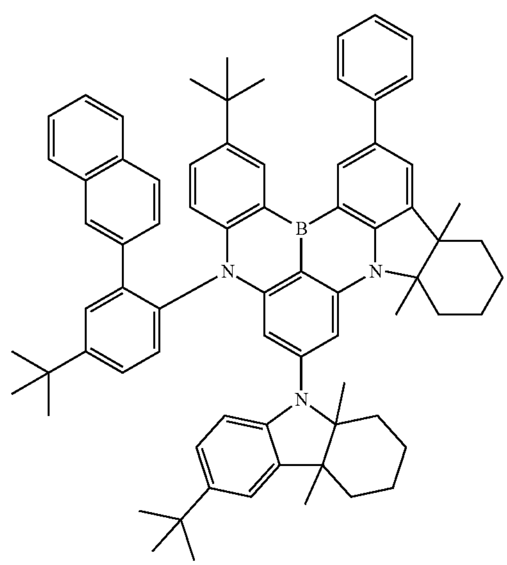

-continued
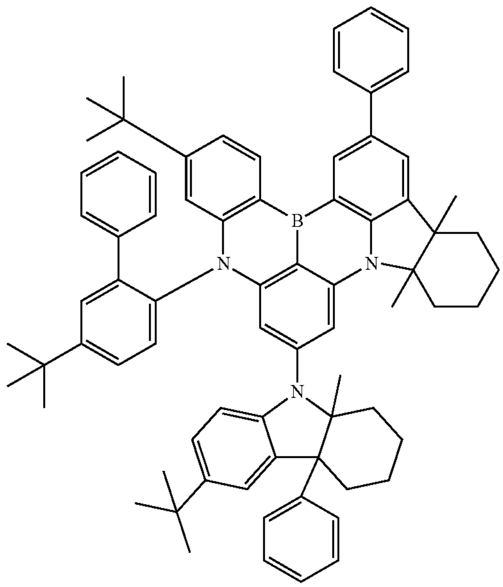
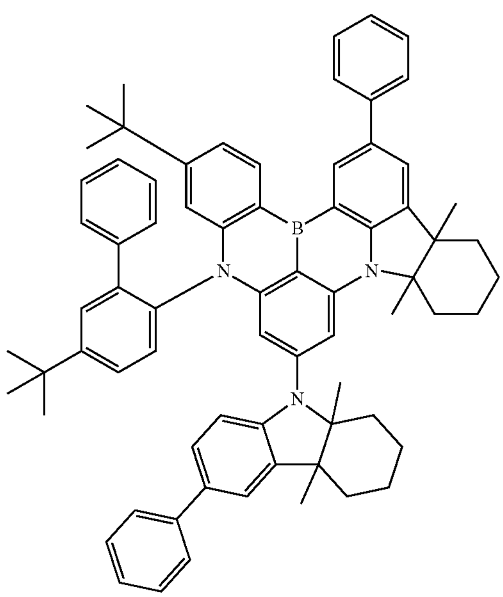
-continued
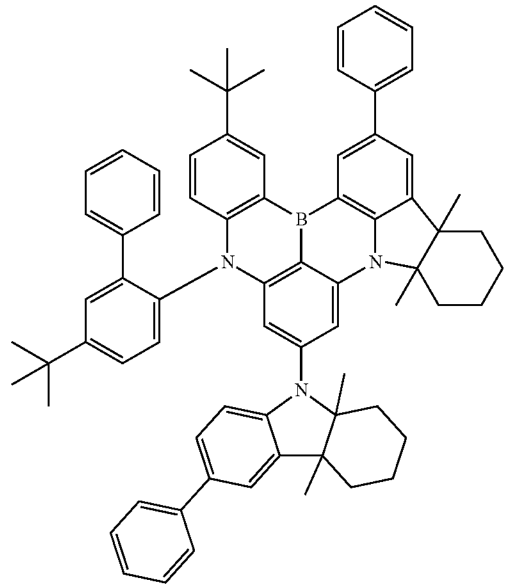
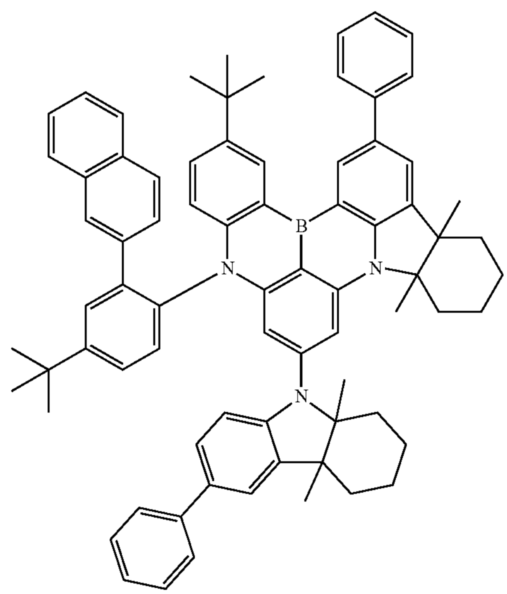
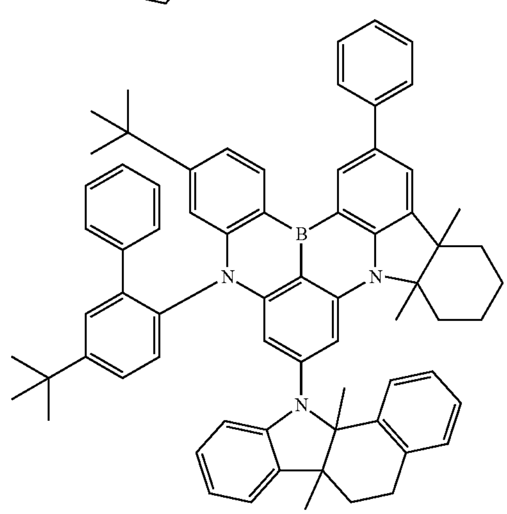

-continued
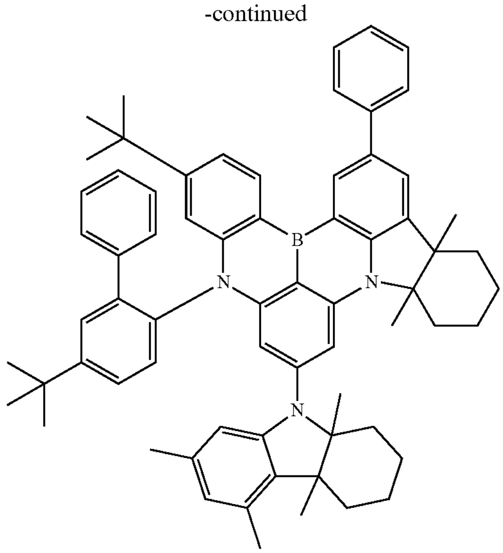
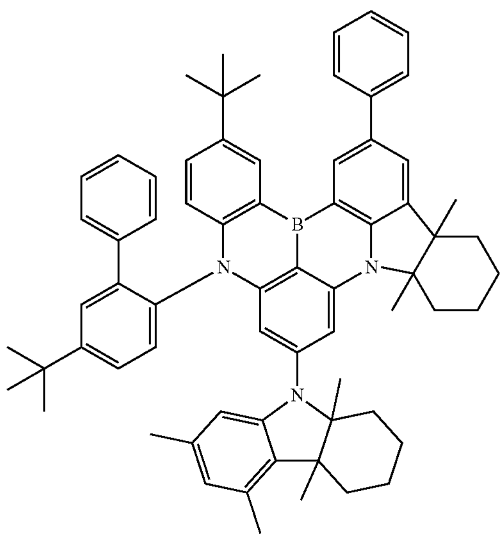
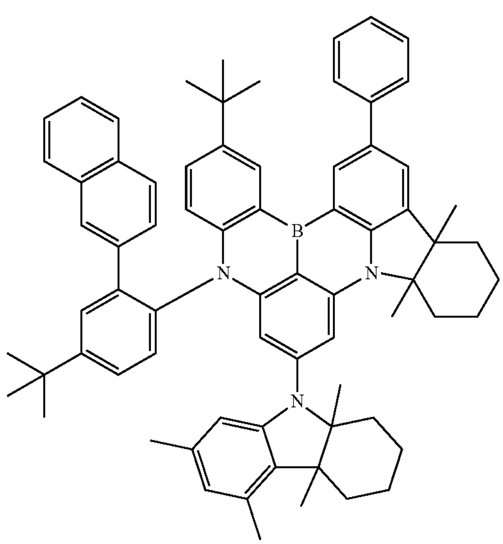
-continued
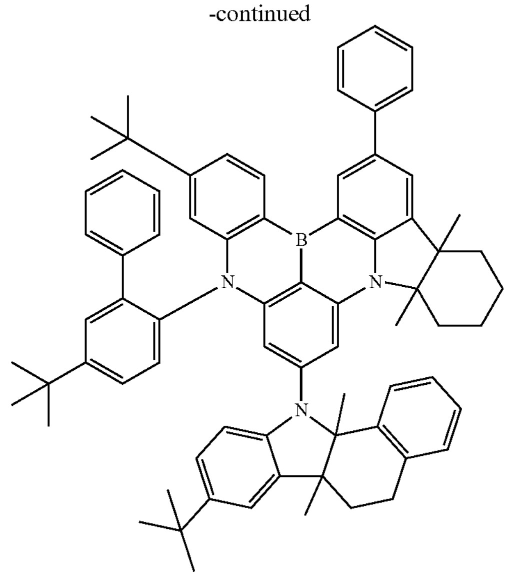
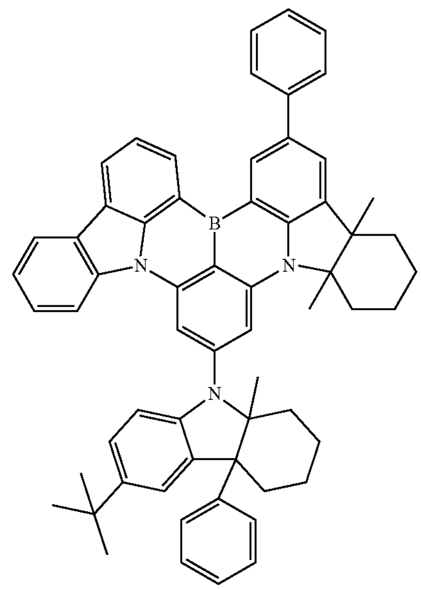
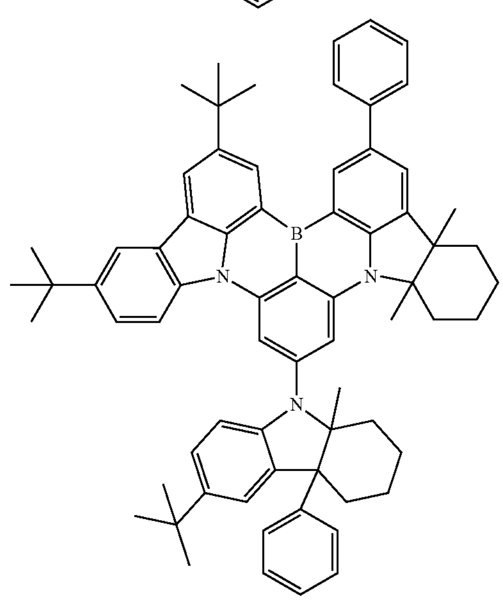

-continued
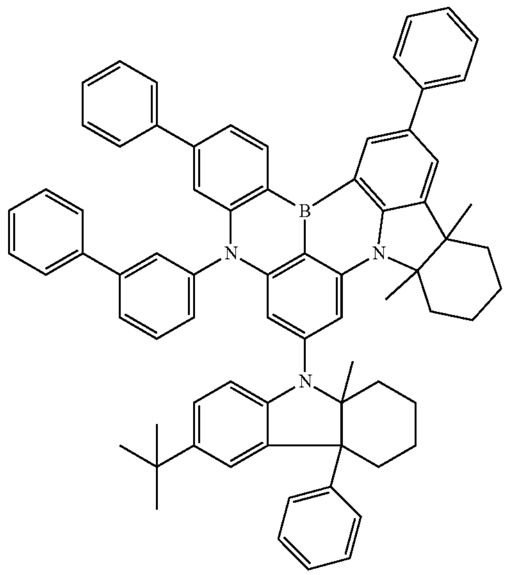
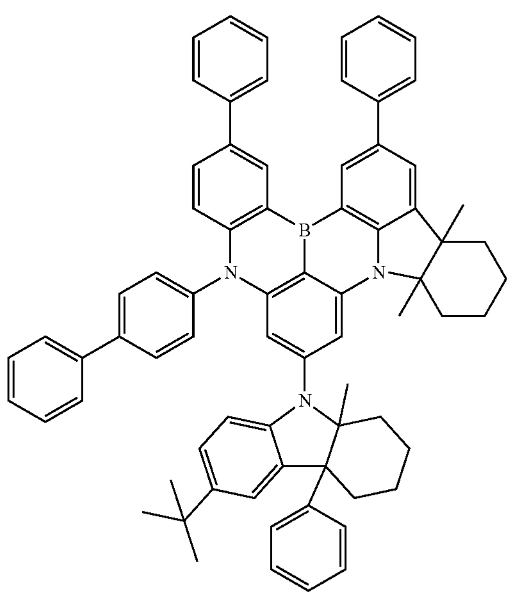
-continued
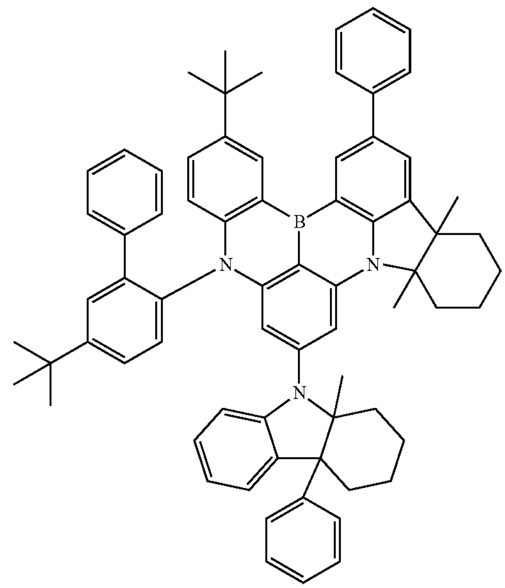
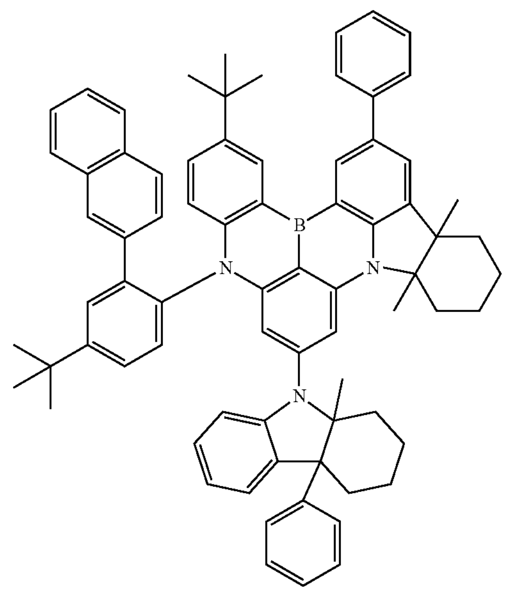
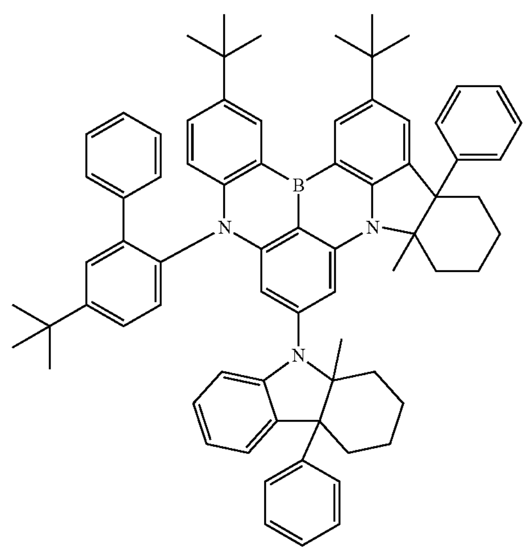

-continued
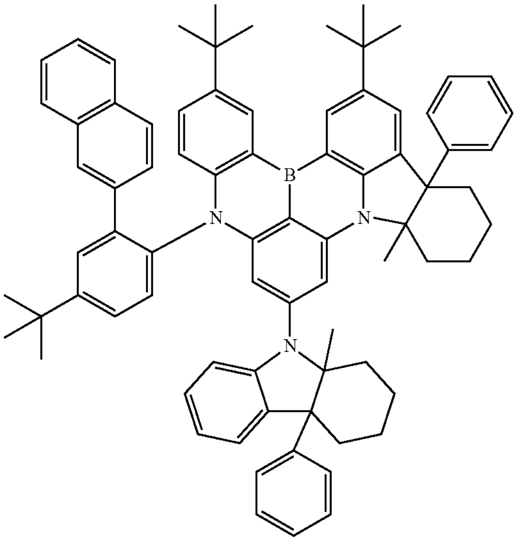
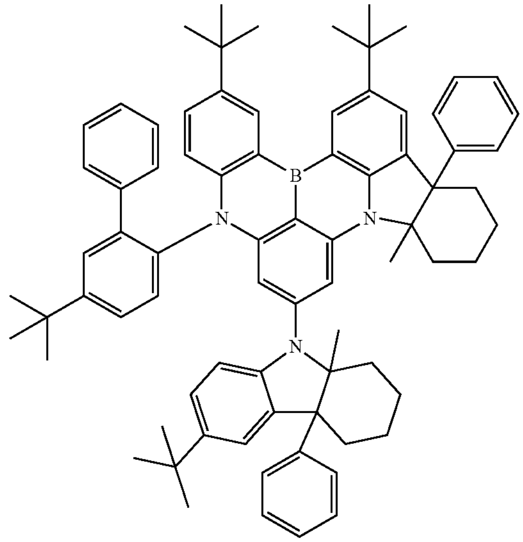
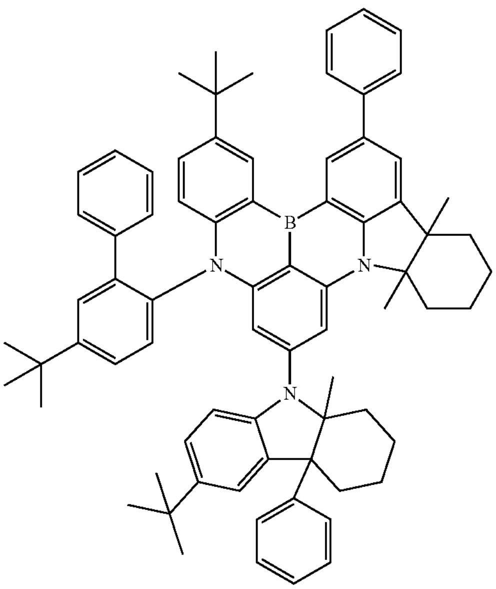
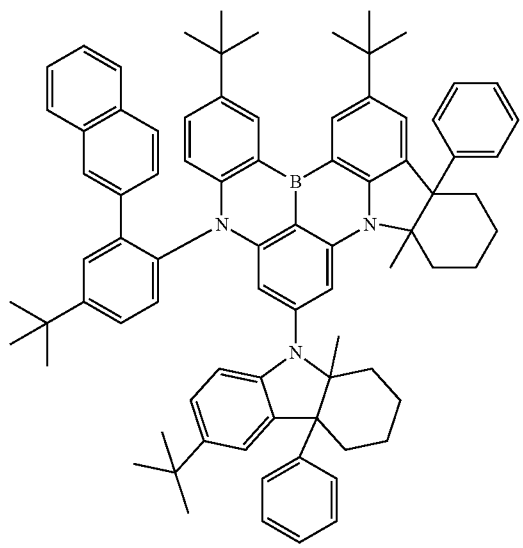
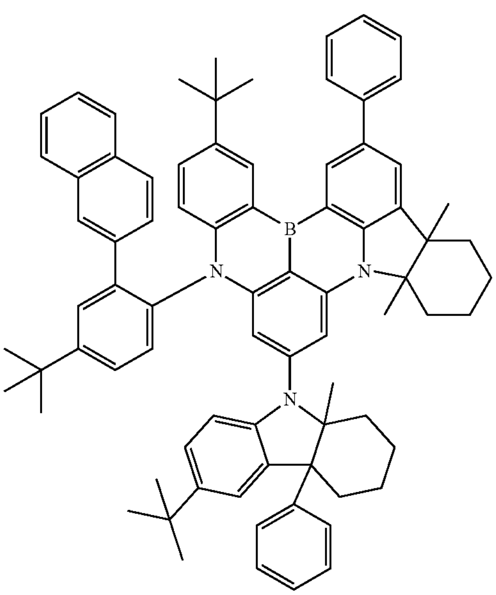
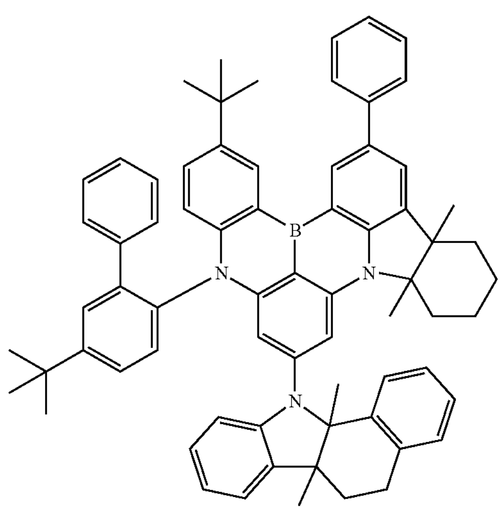
-continued -continued
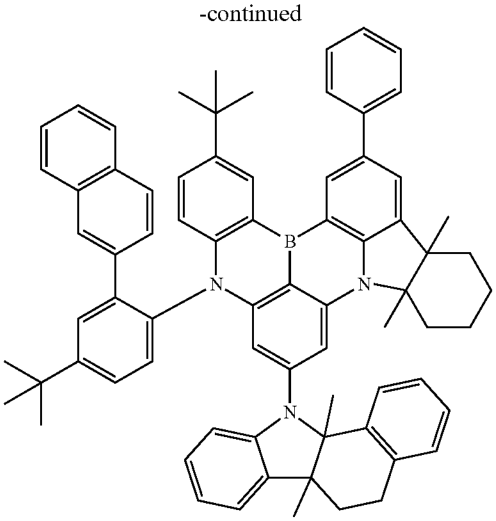
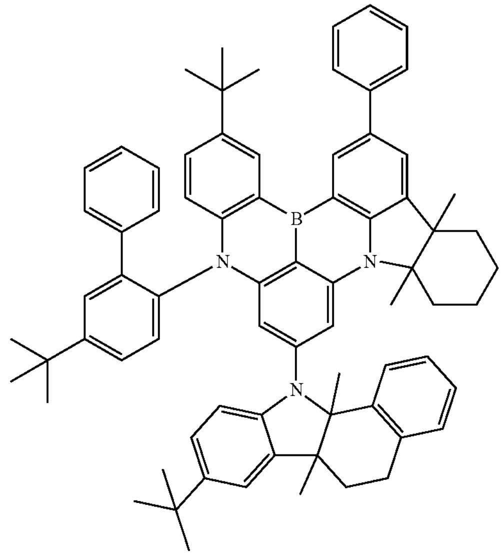
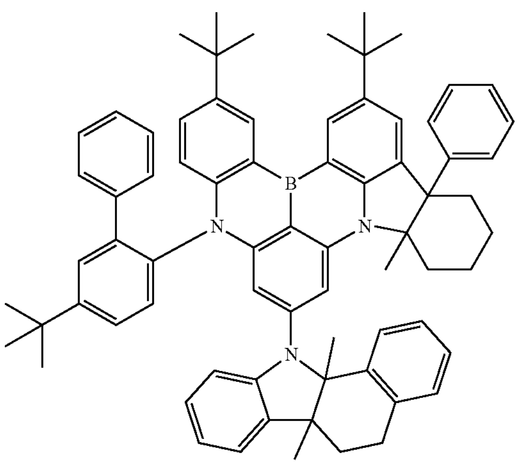
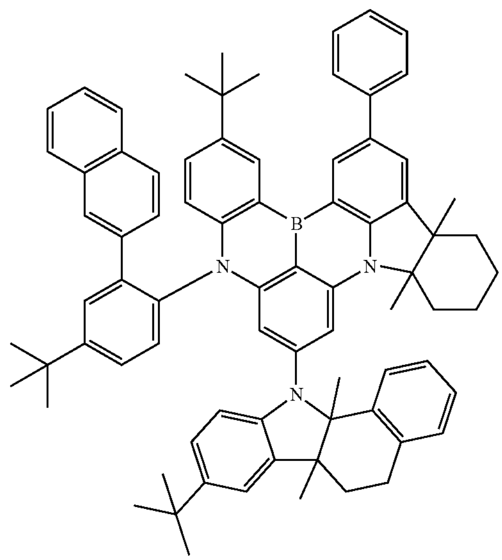
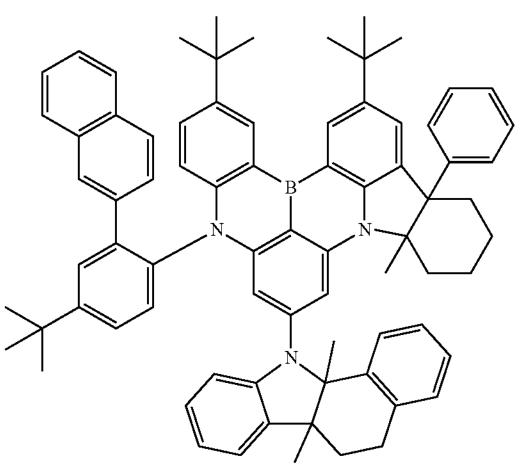
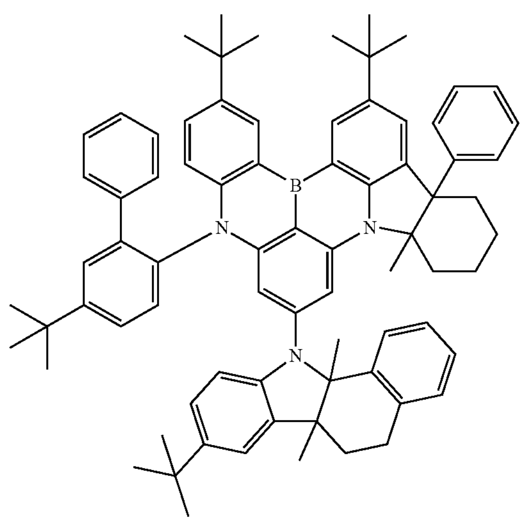
-continued -continued
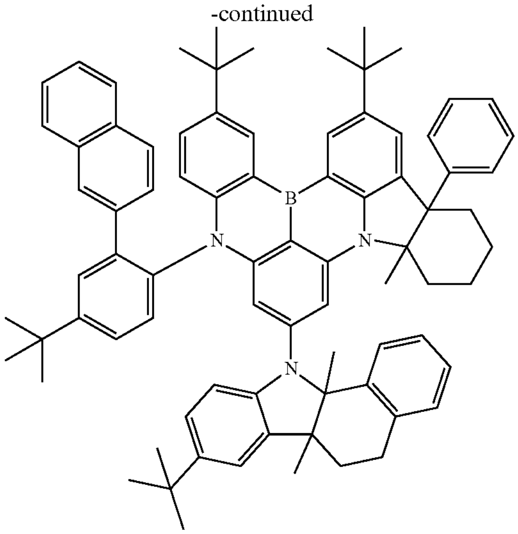
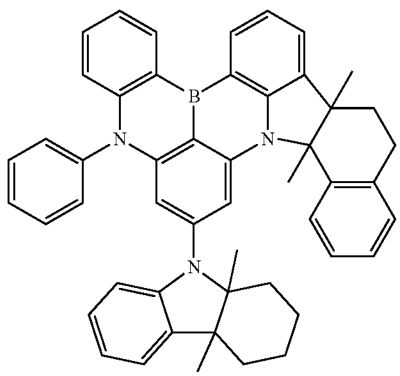
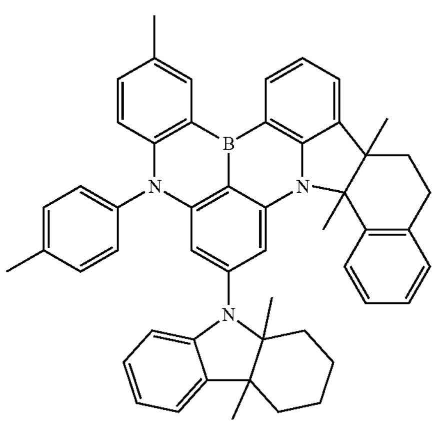
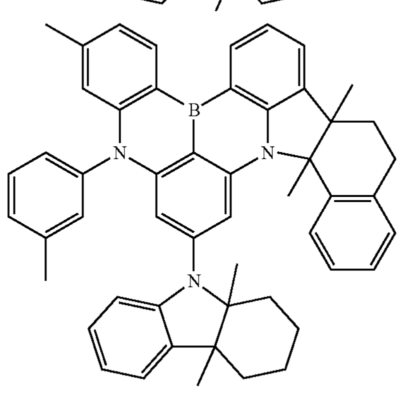
-continued
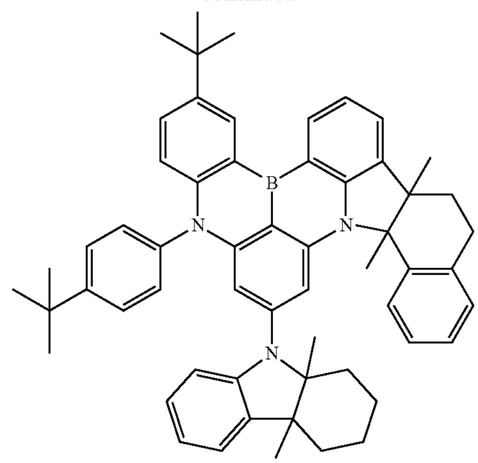
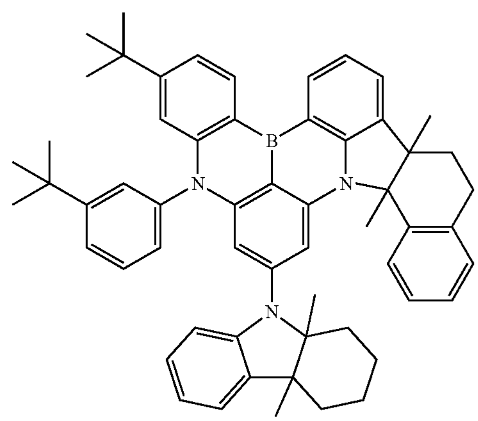
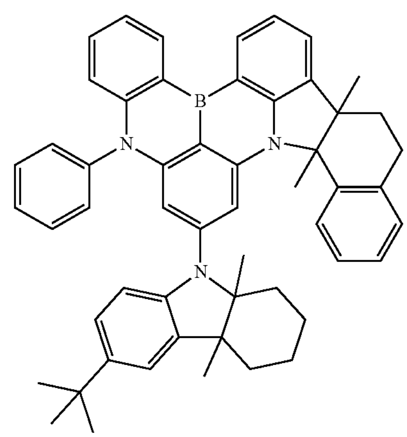

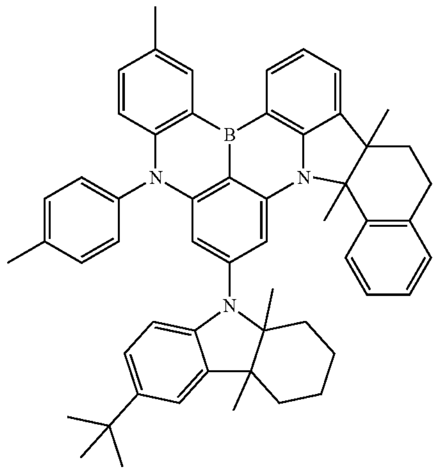
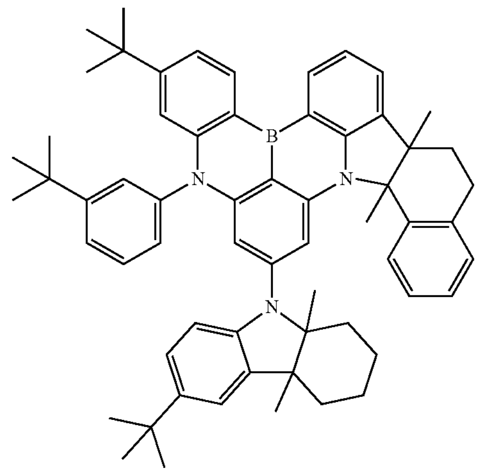
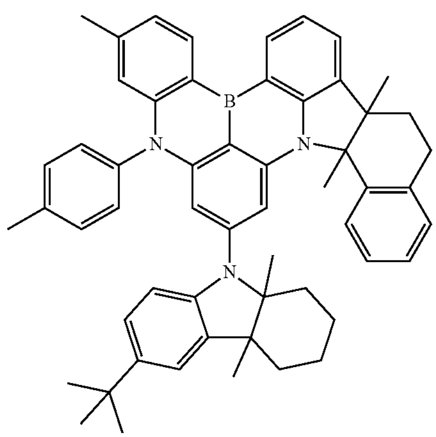
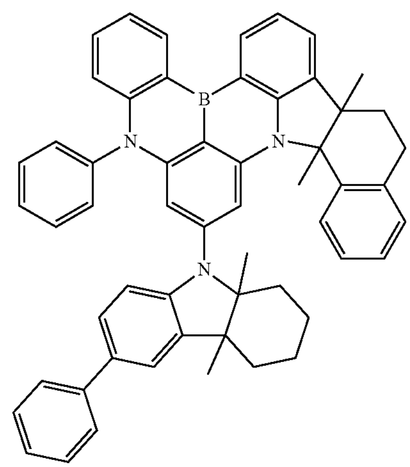
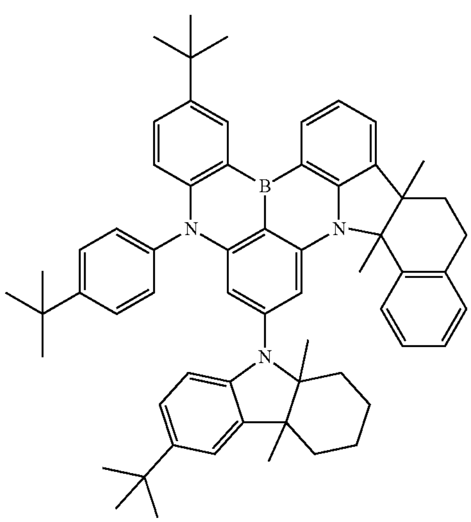
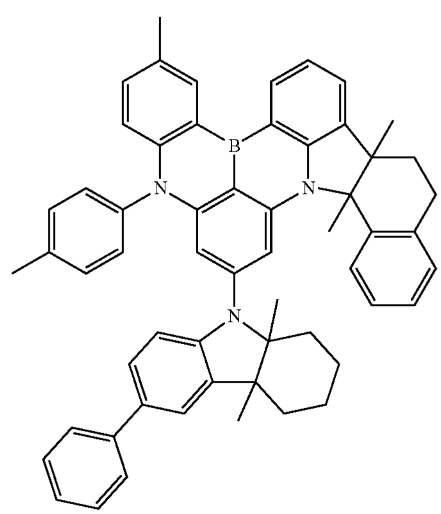
B
N
N
N -continued
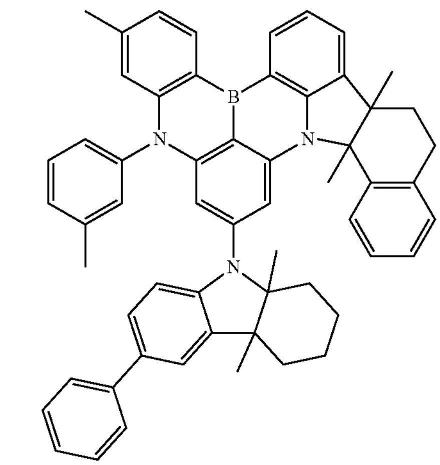
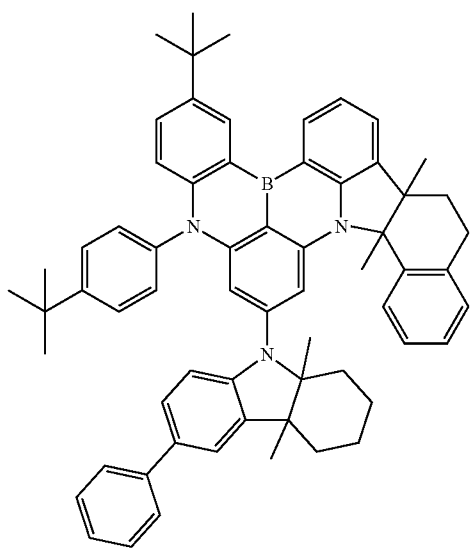
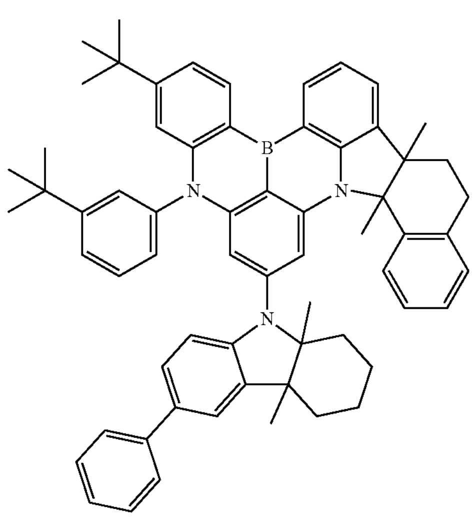
-continued
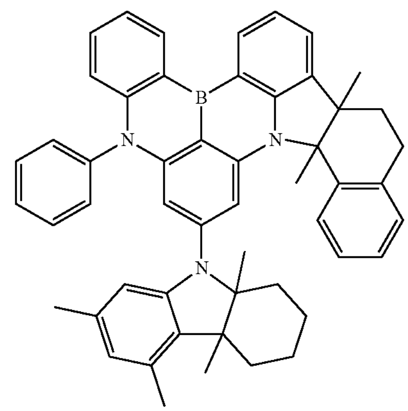
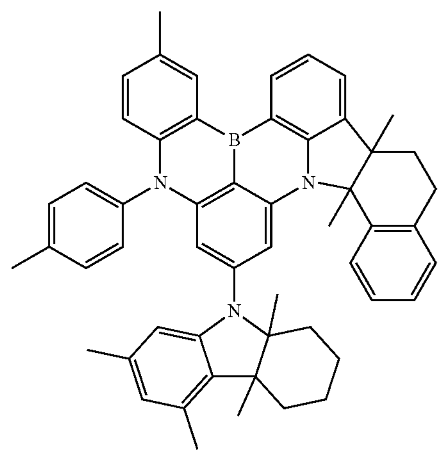
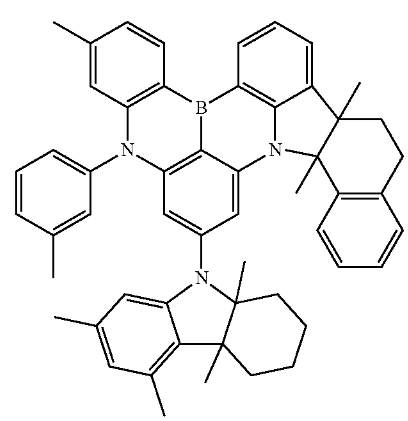

-continued
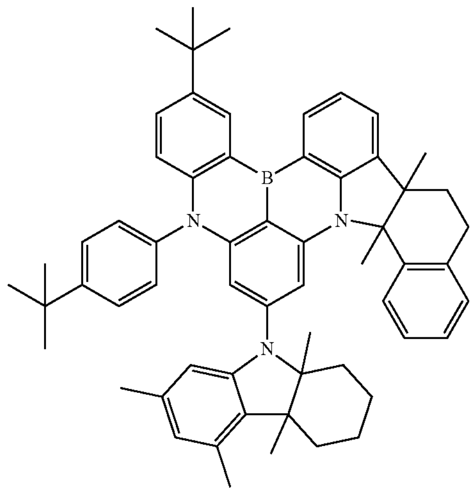
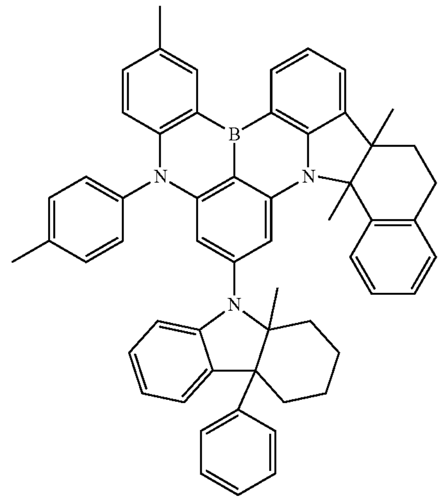
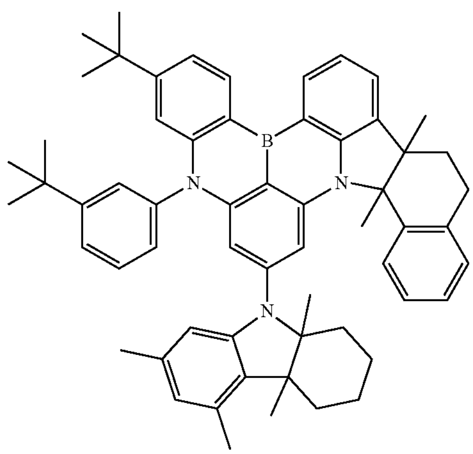
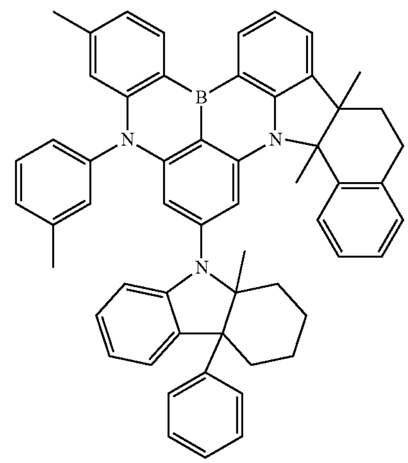
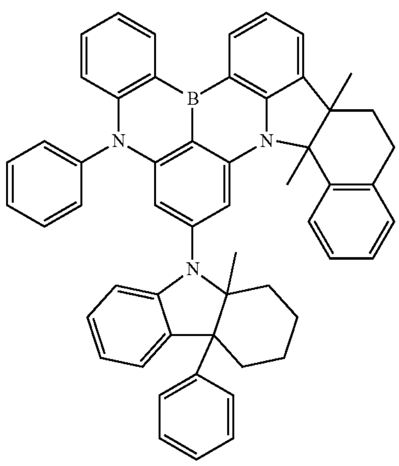
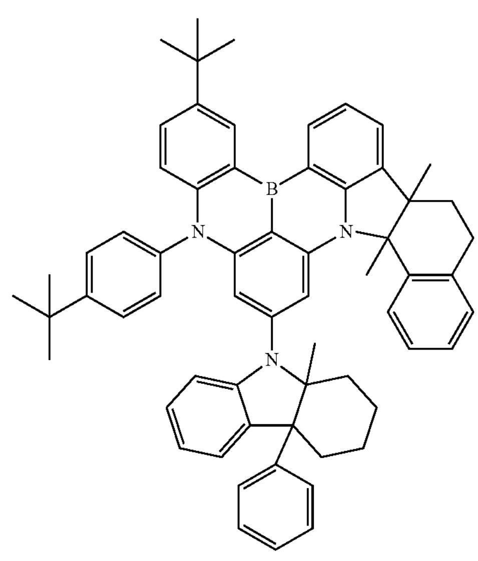

-continued
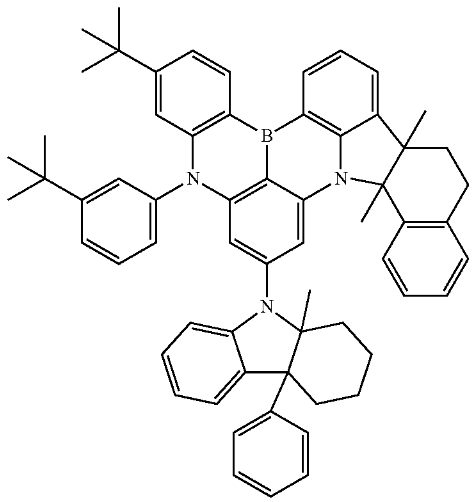
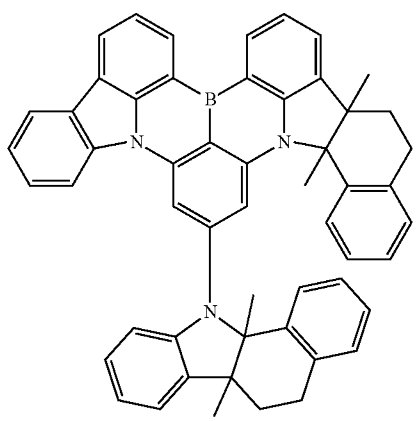
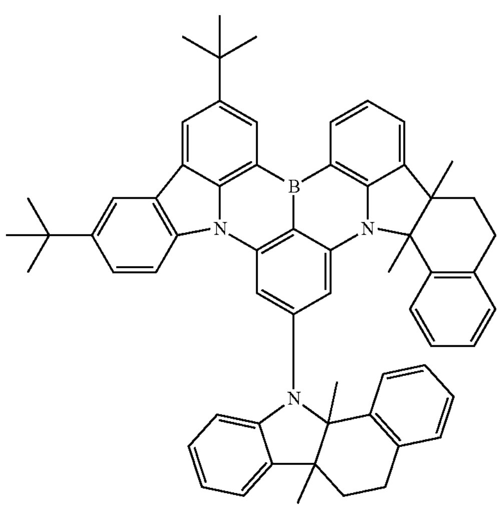
-continued
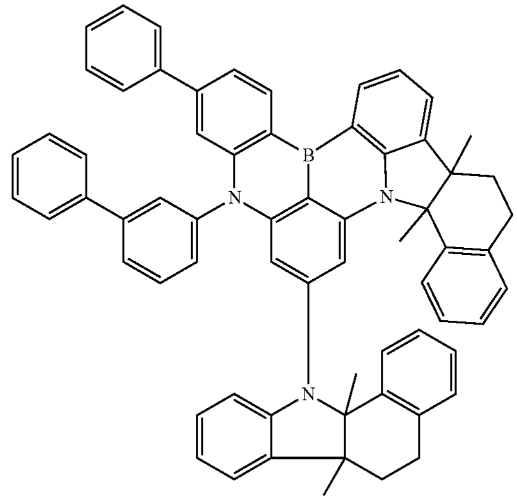
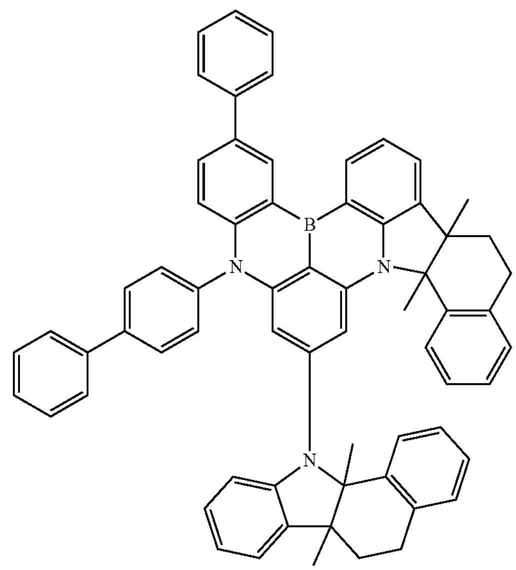
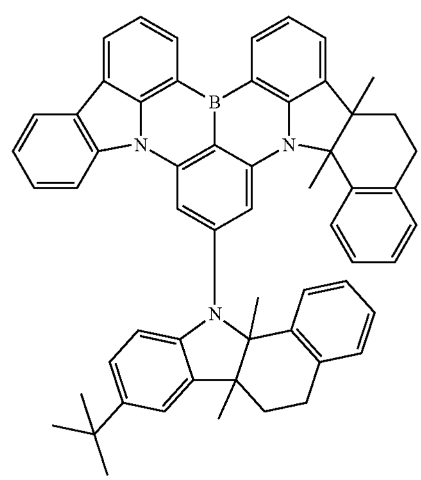

-continued
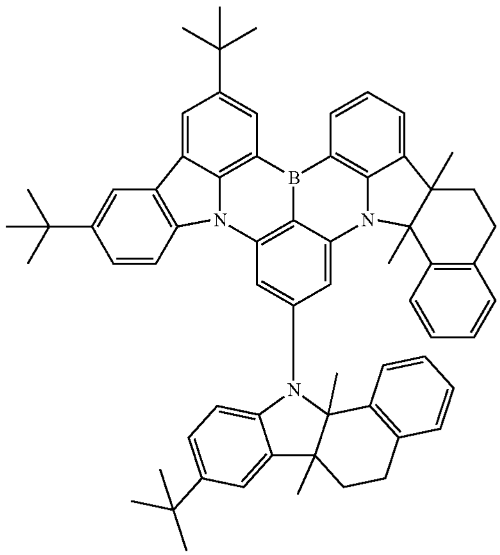
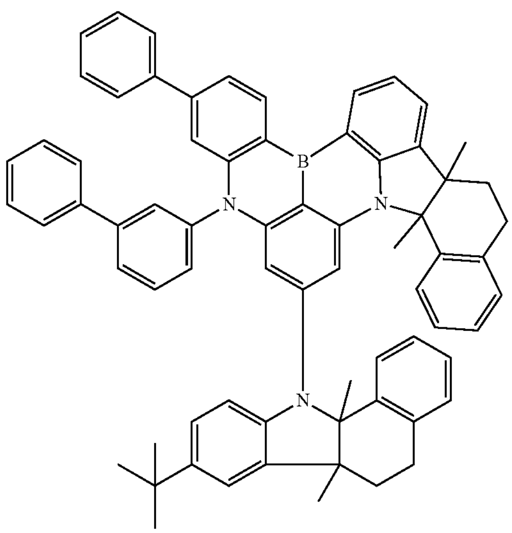
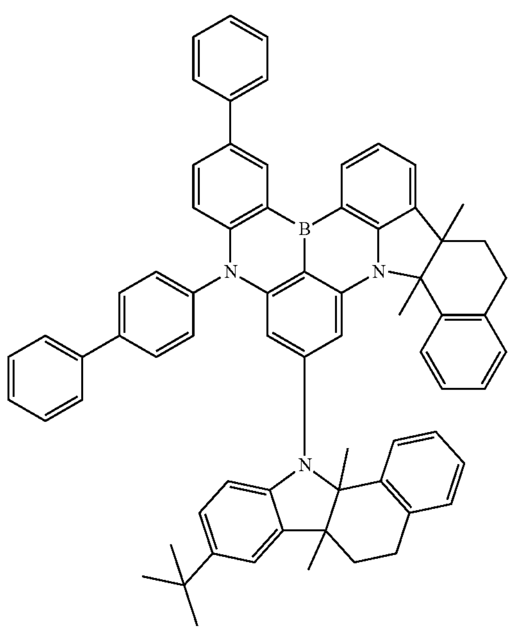
-continued
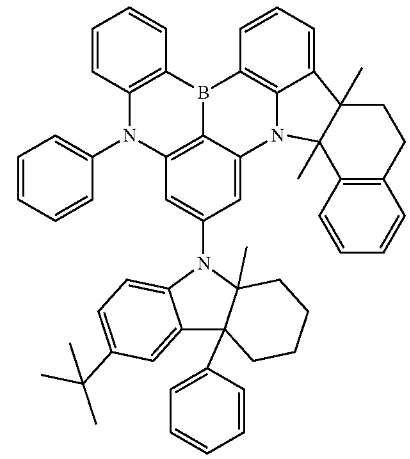
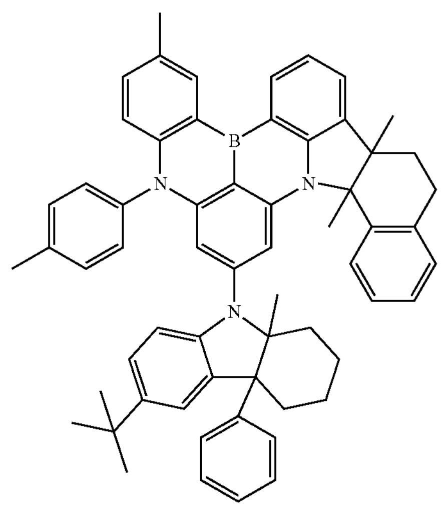
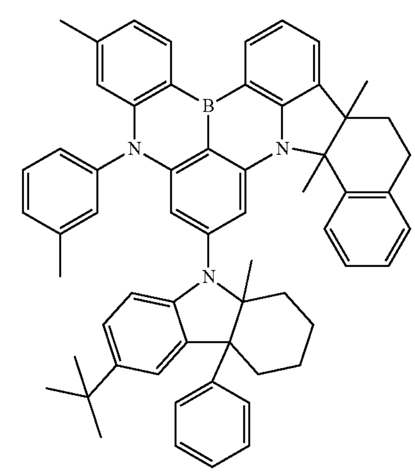

-continued
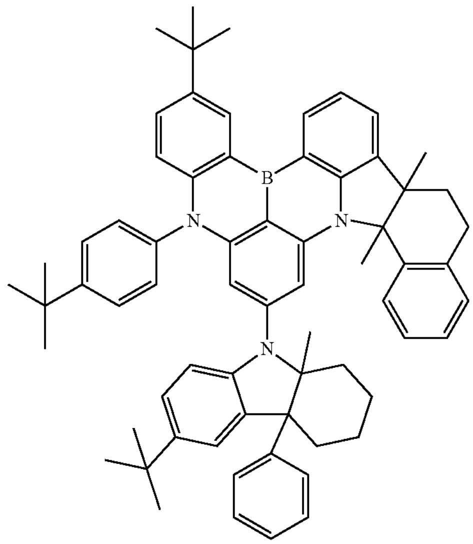
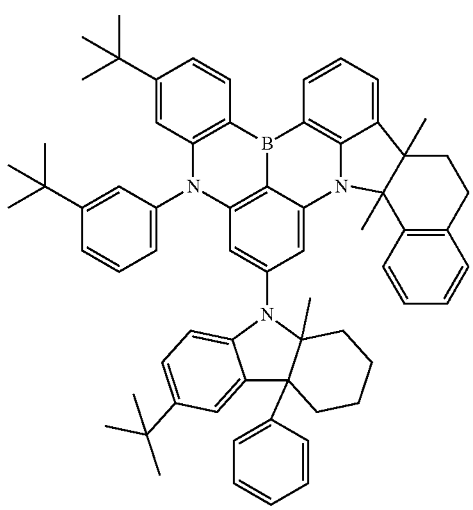
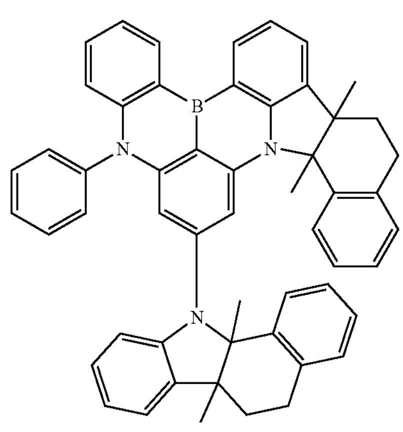
-continued
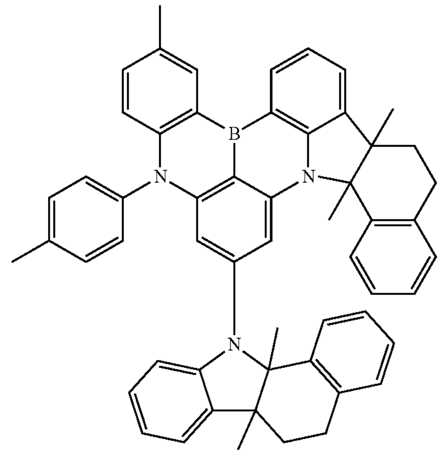
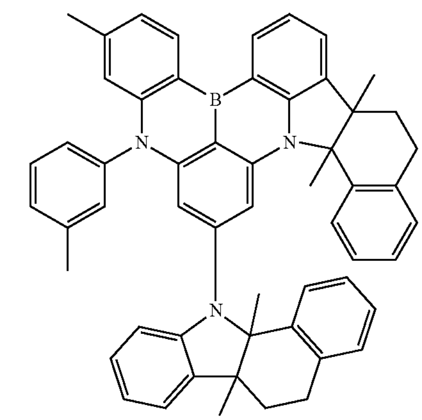
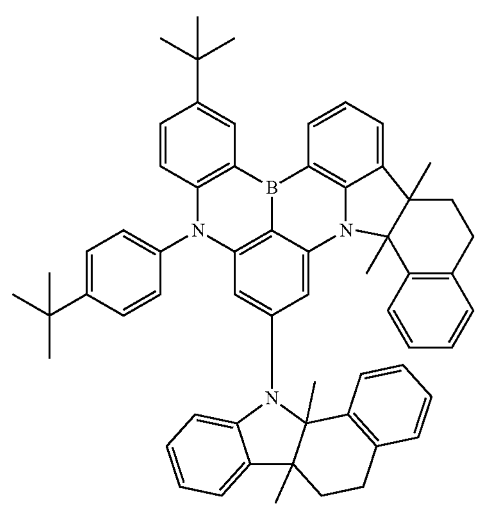

-continued
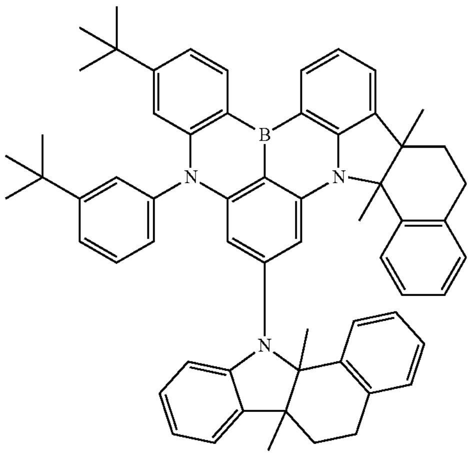
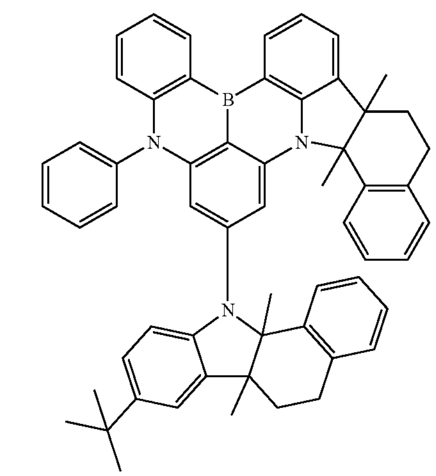
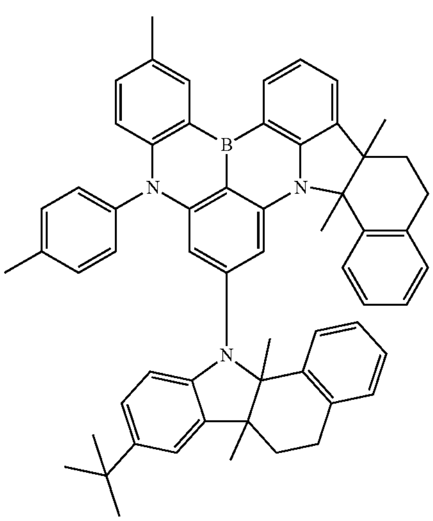
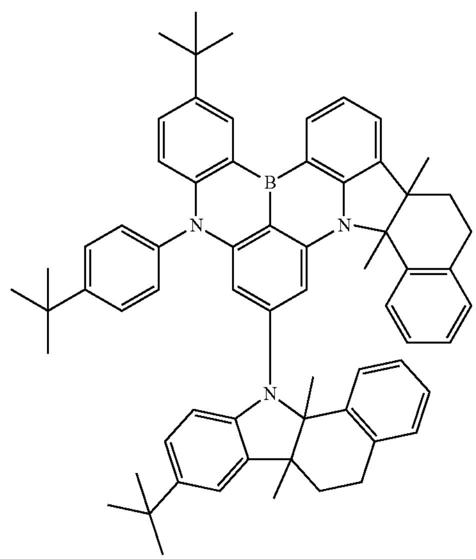
-continued
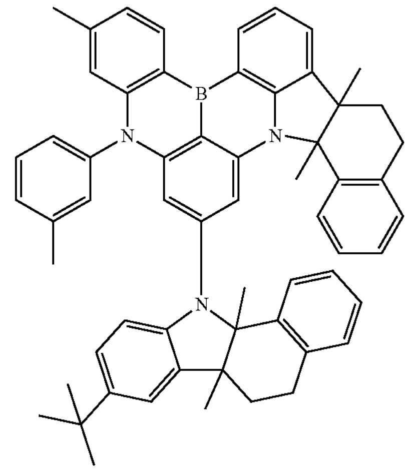
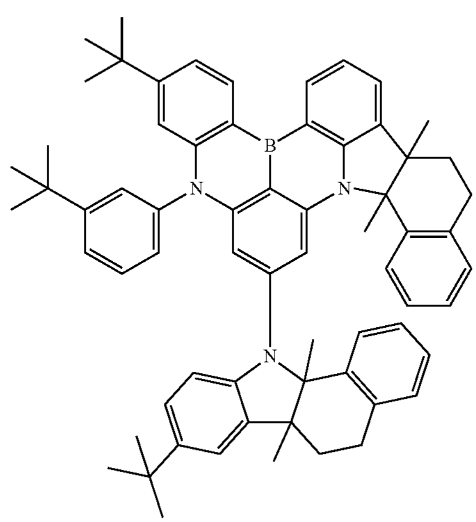

-continued
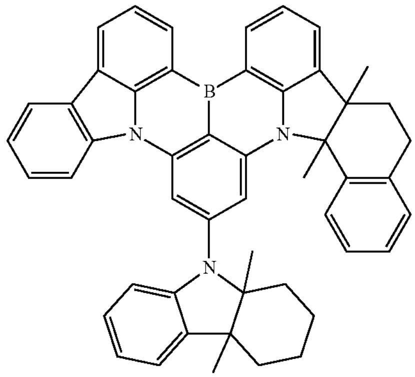
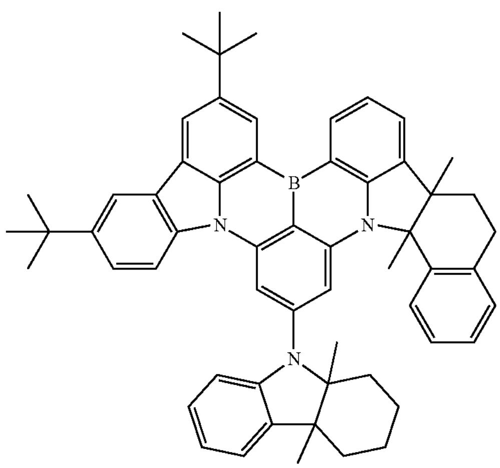
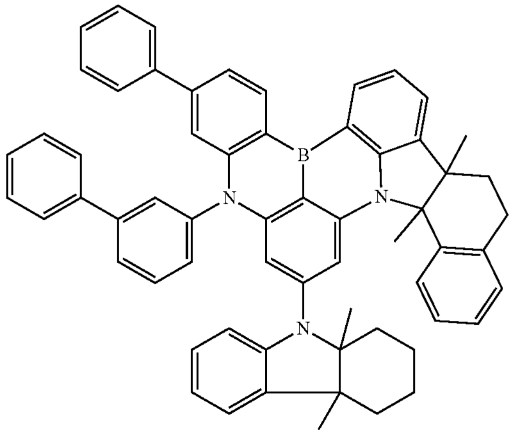
-continued
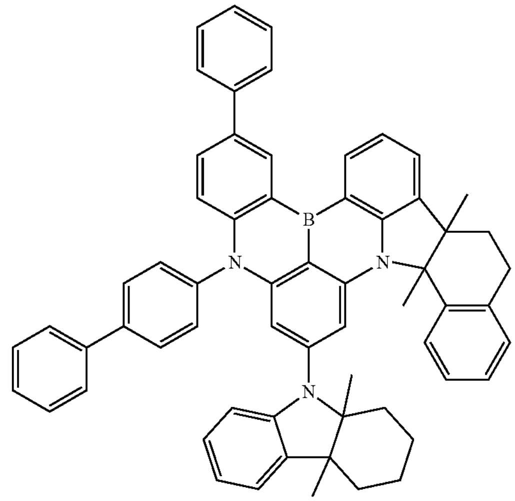
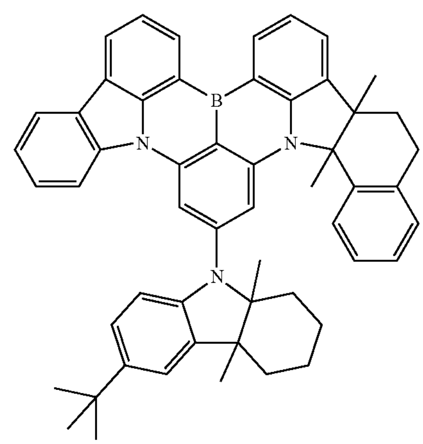
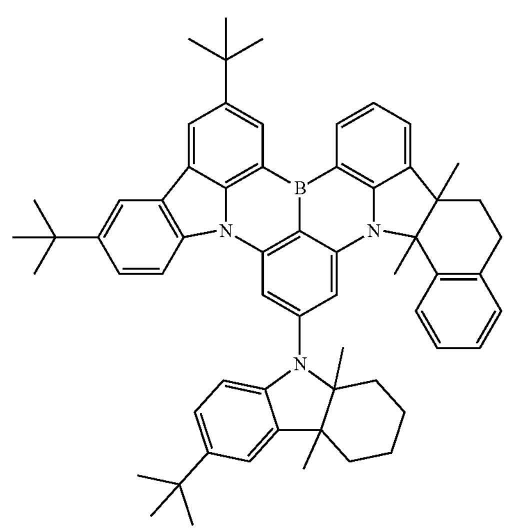

-continued
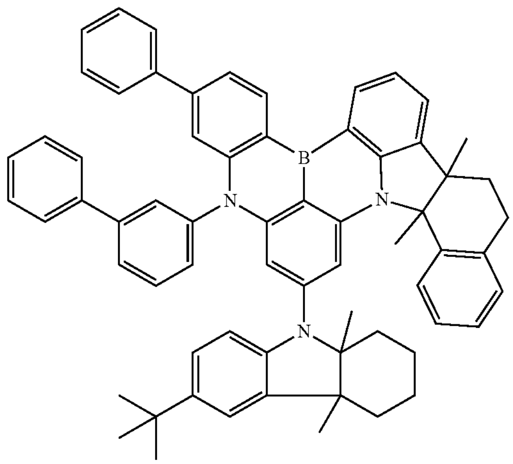
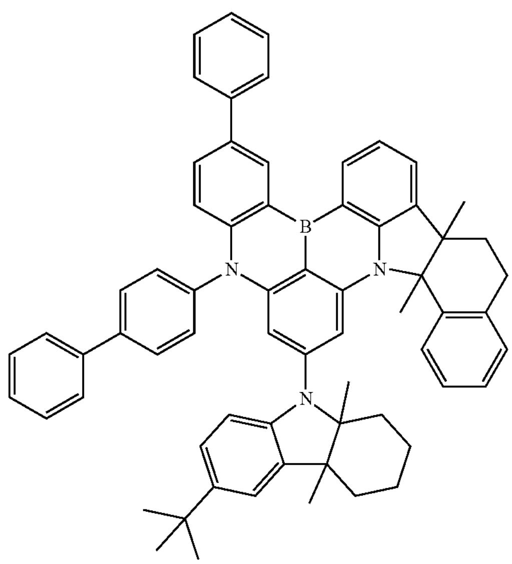
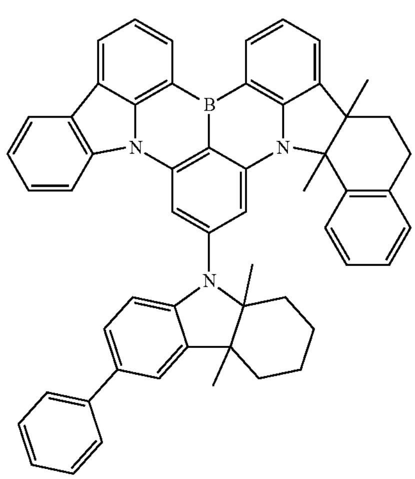
-continued
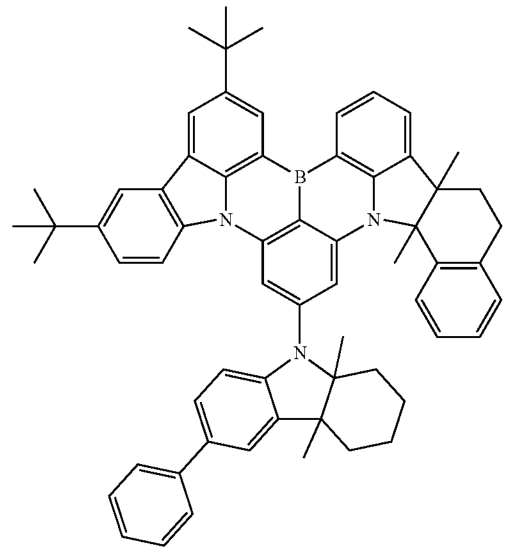
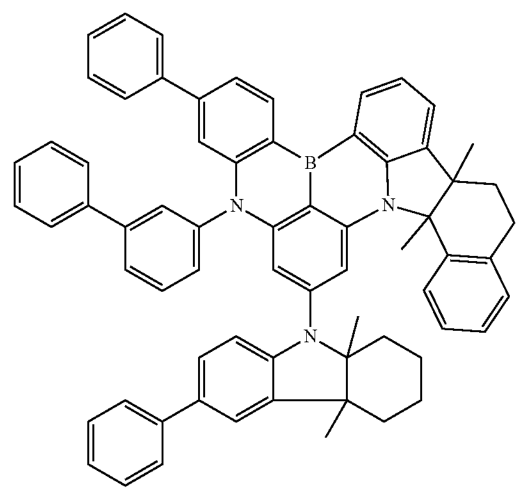
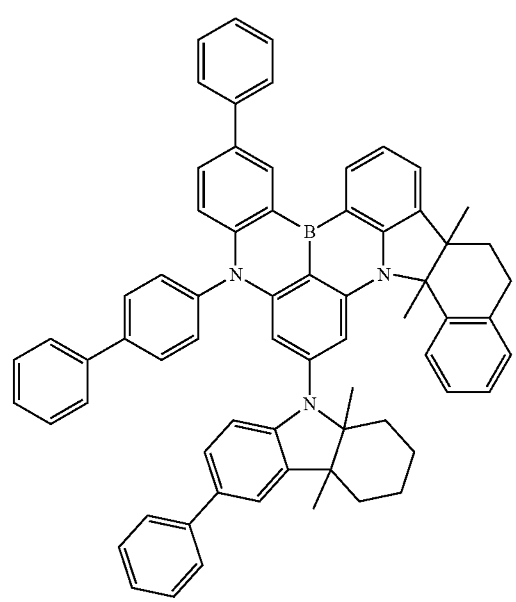

-continued
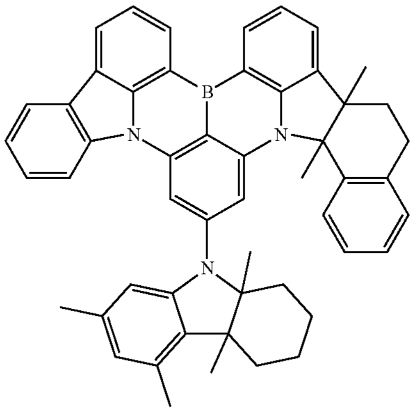
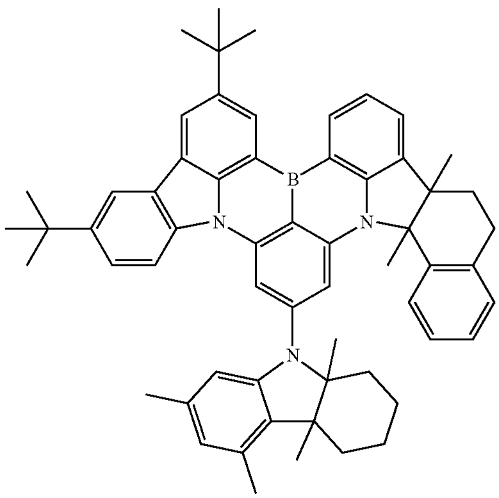
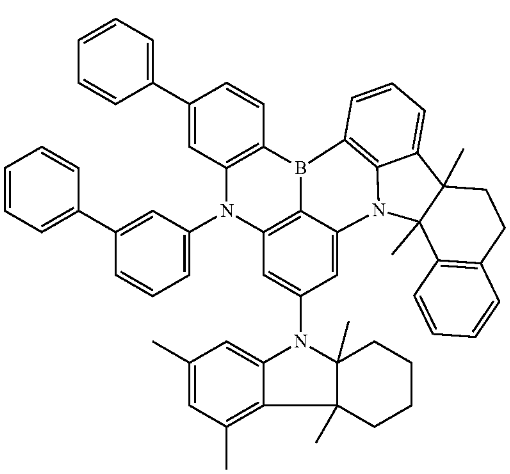
-continued
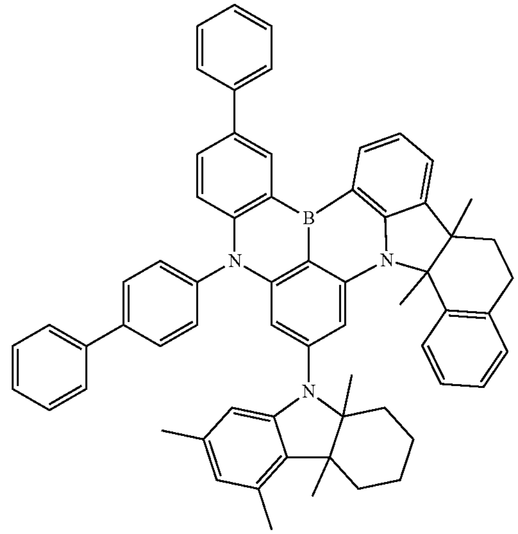
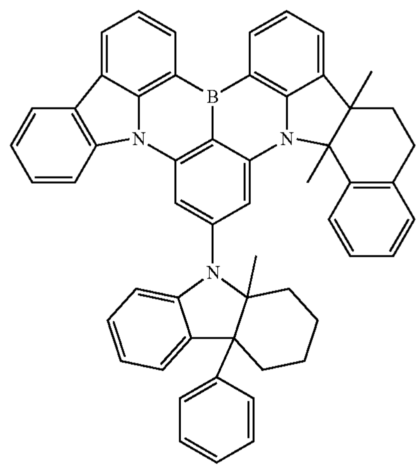
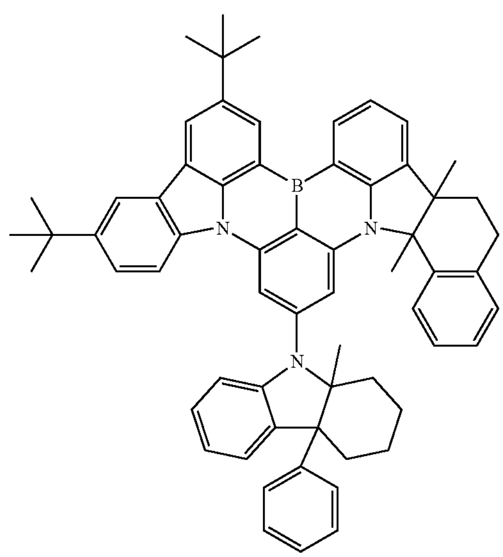

-continued
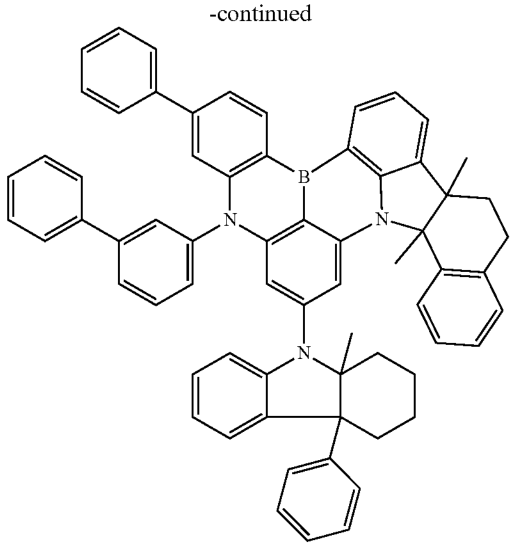
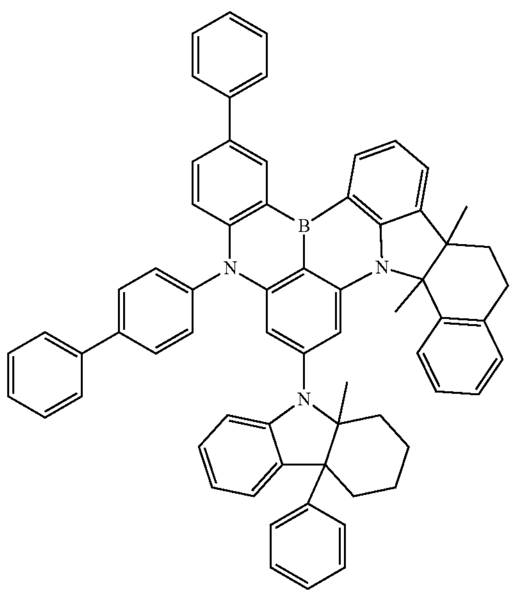
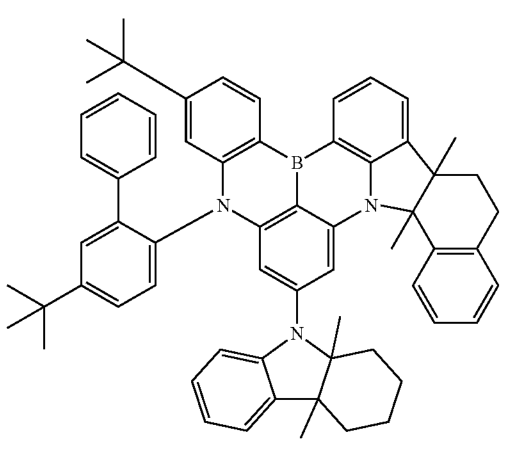
-continued
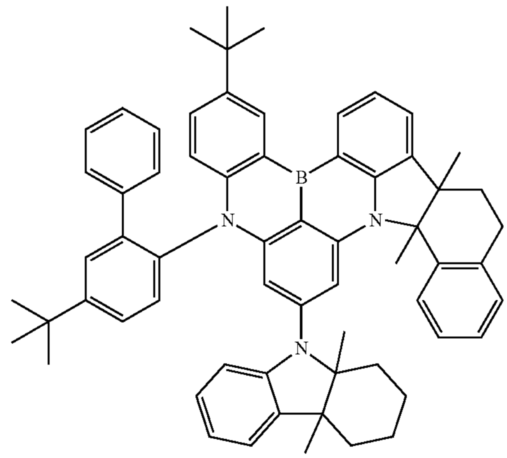
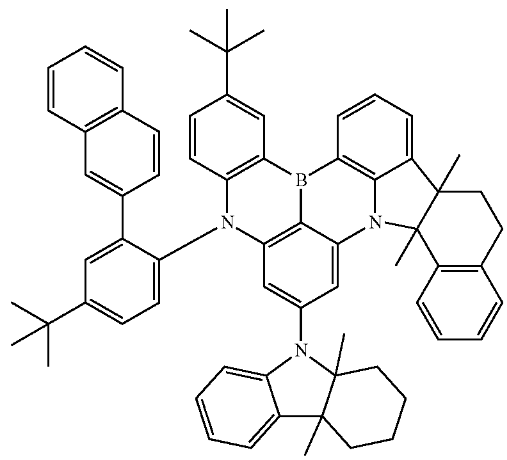
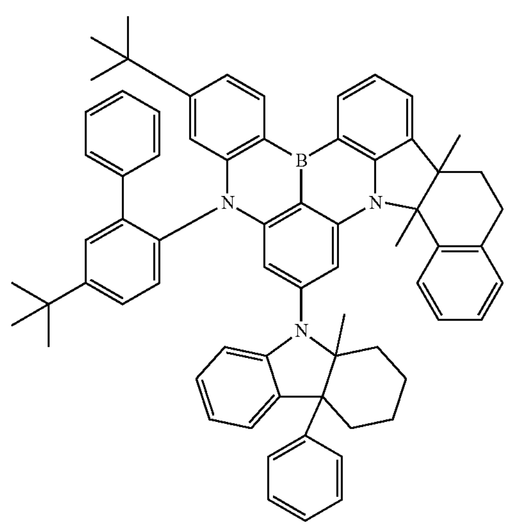

-continued
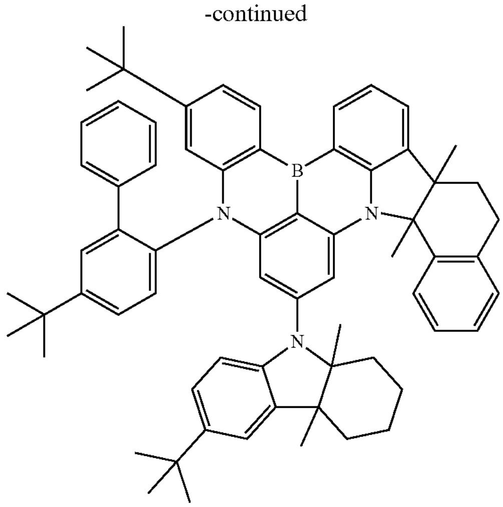
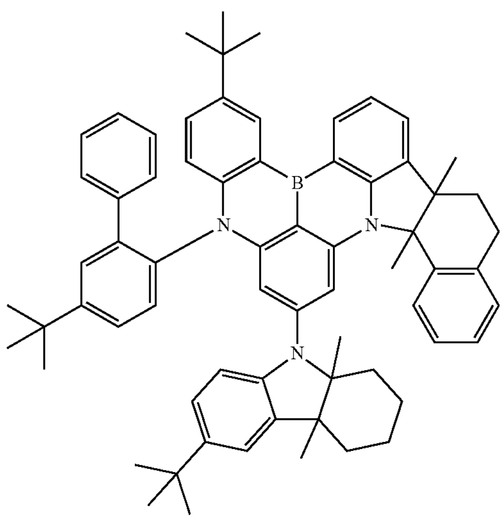
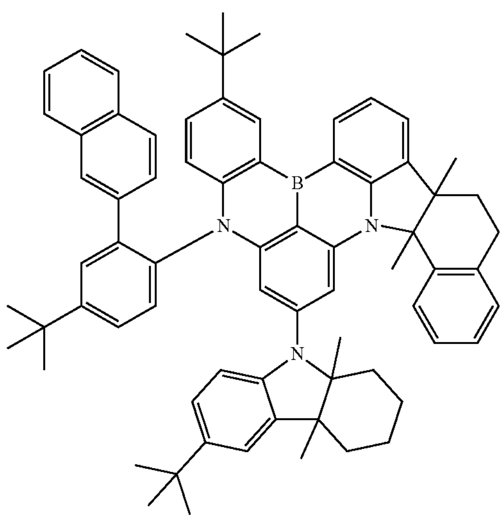
-continued
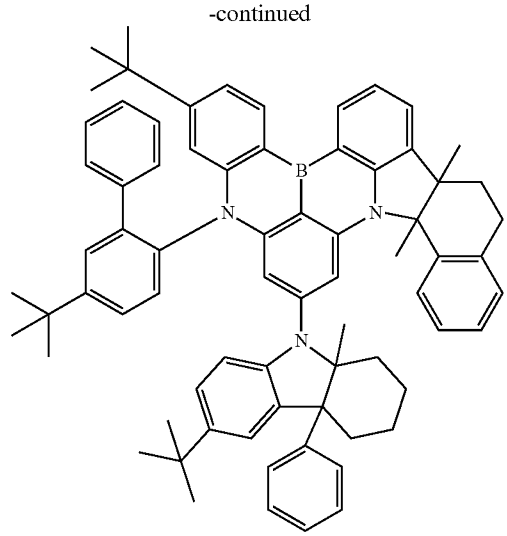
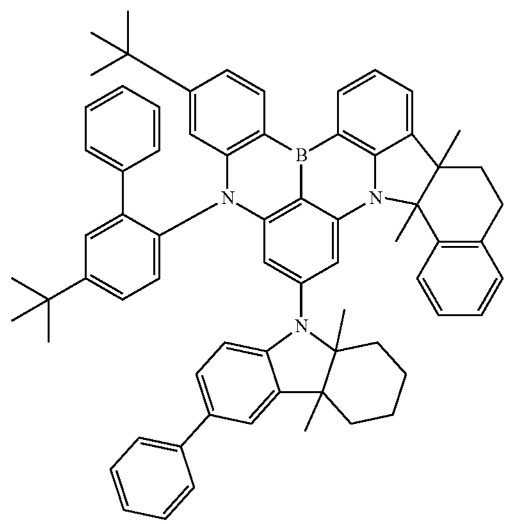
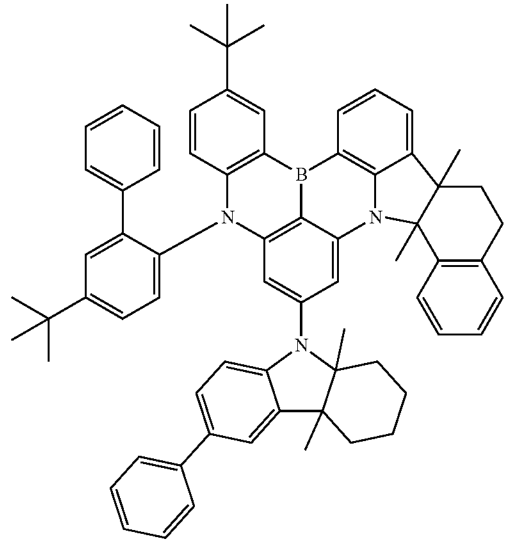

-continued
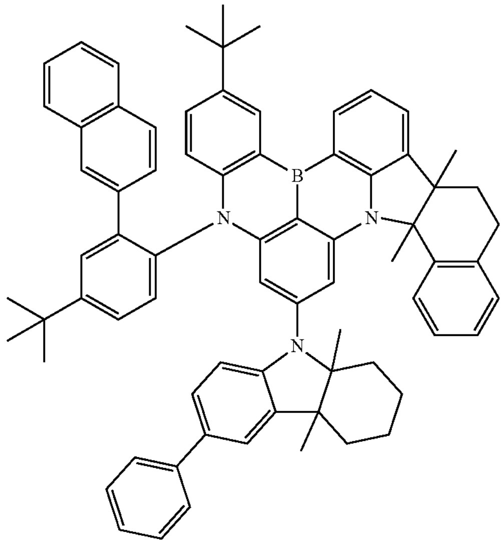
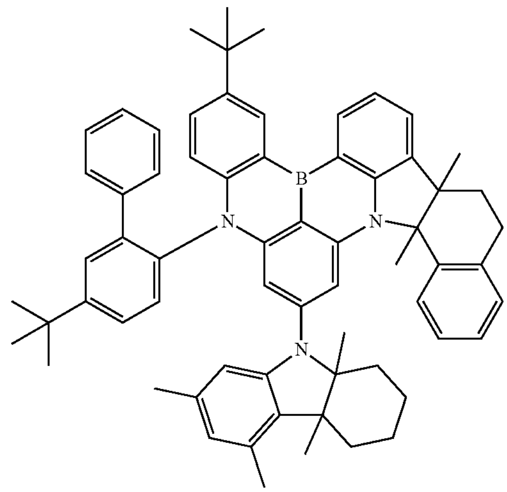
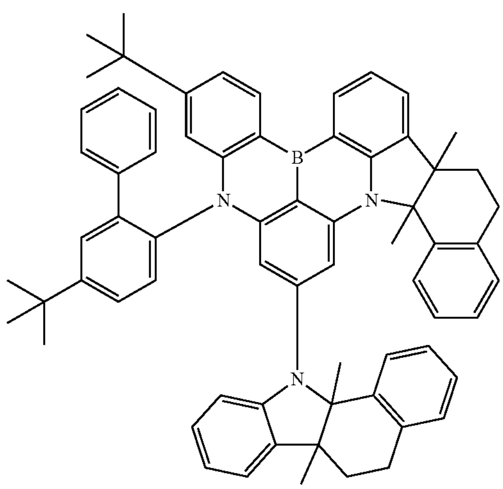
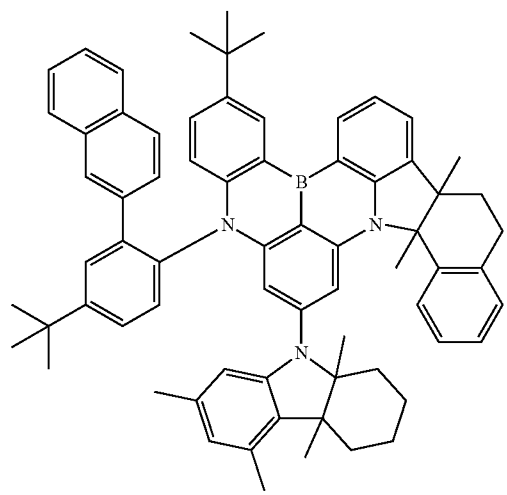
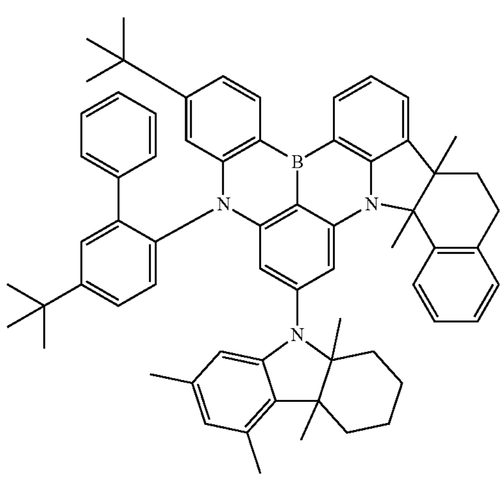
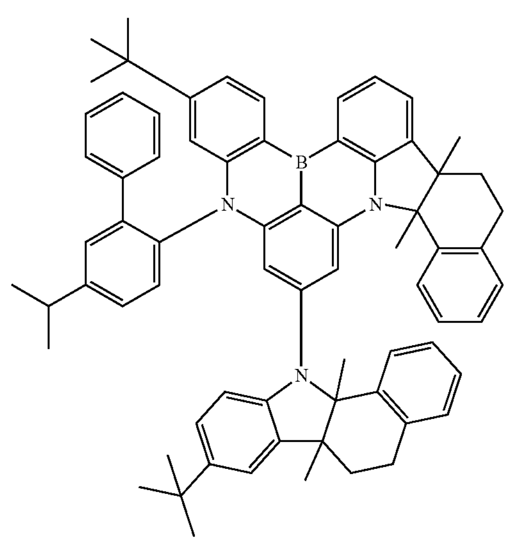

-continued
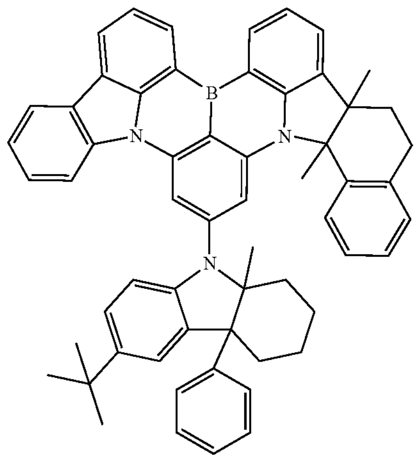
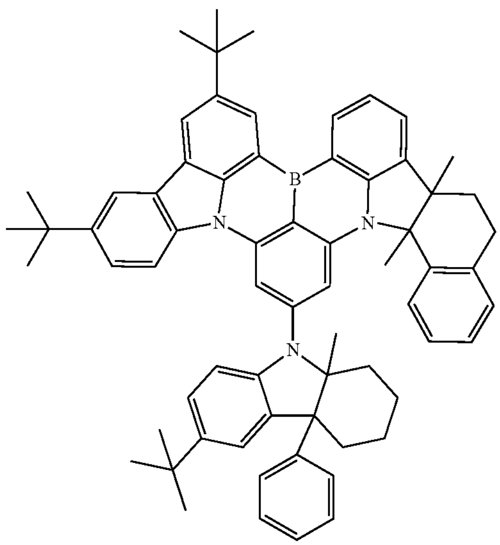
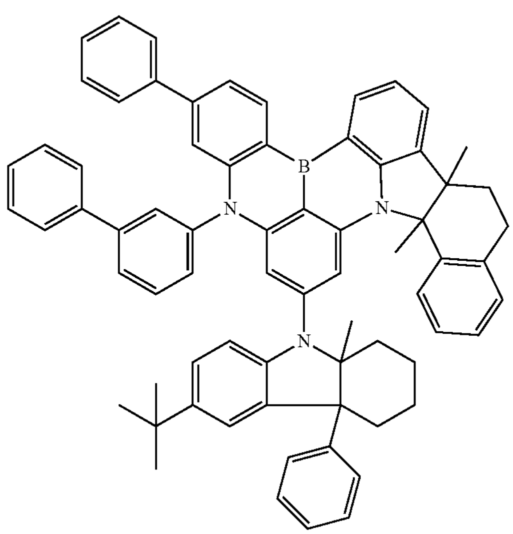
-continued
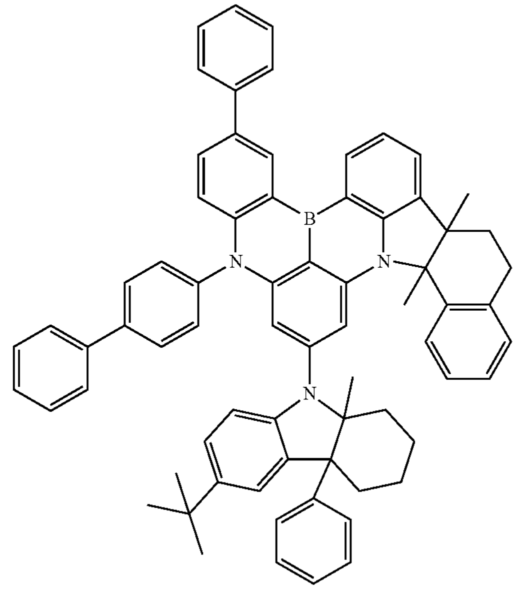
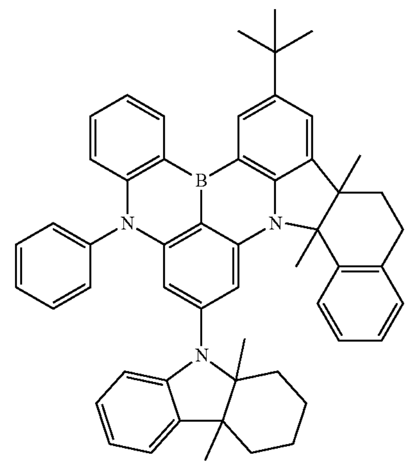
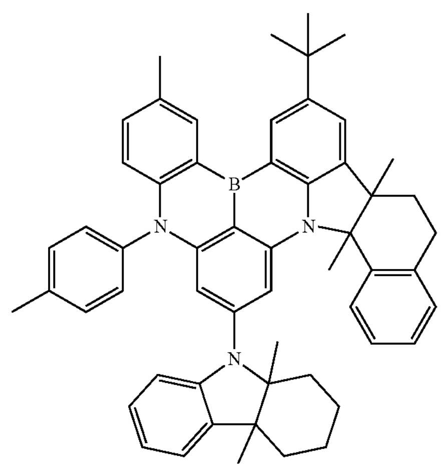

-continued
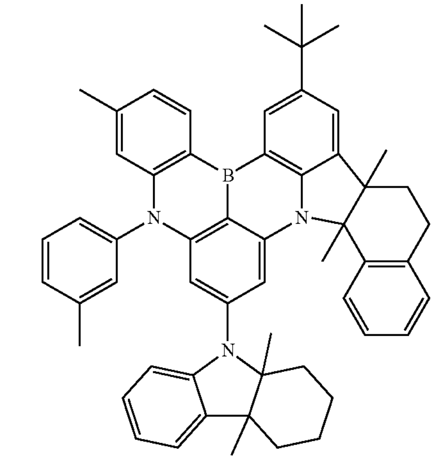
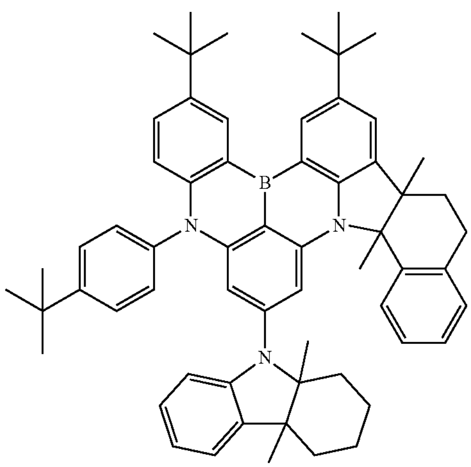
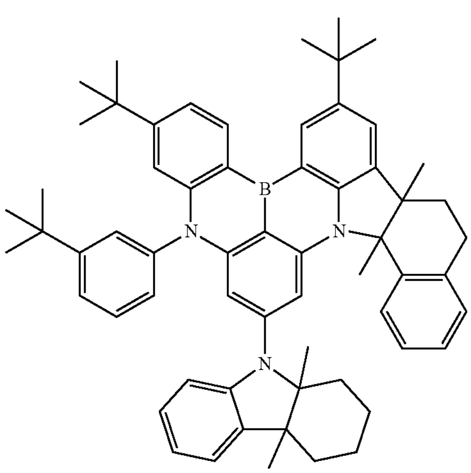
-continued
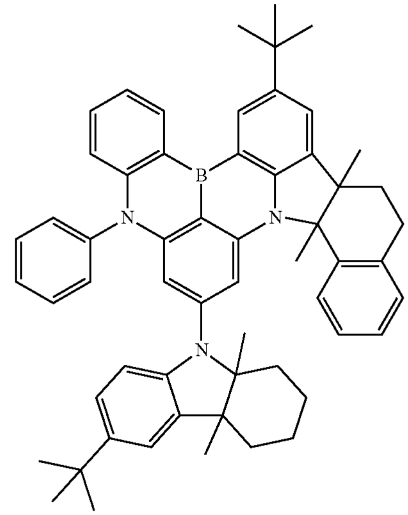
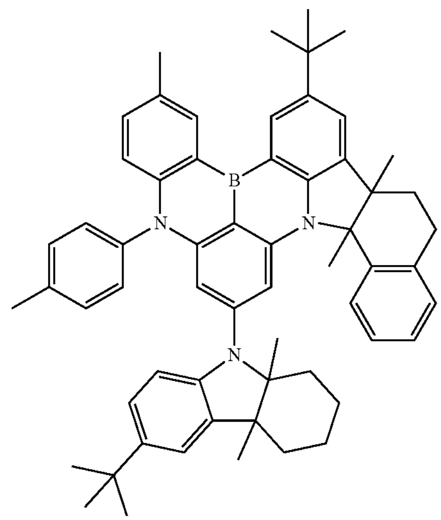
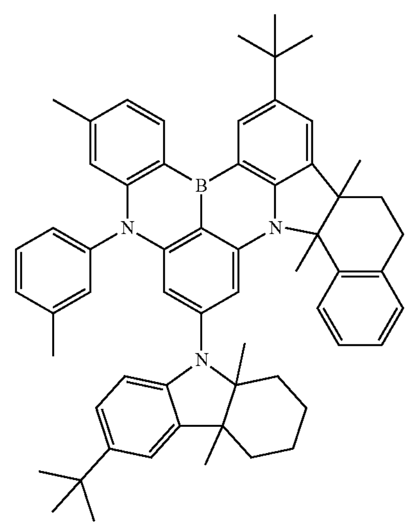

-continued
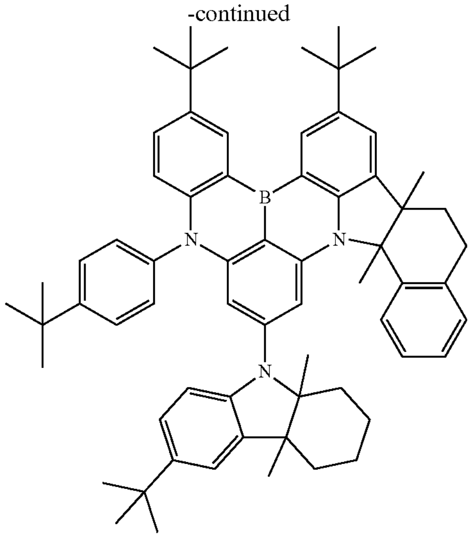
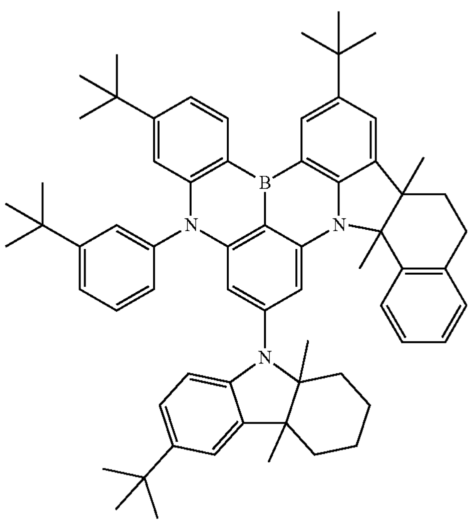
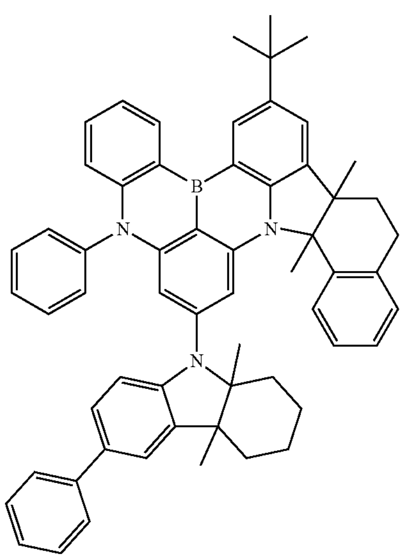
-continued
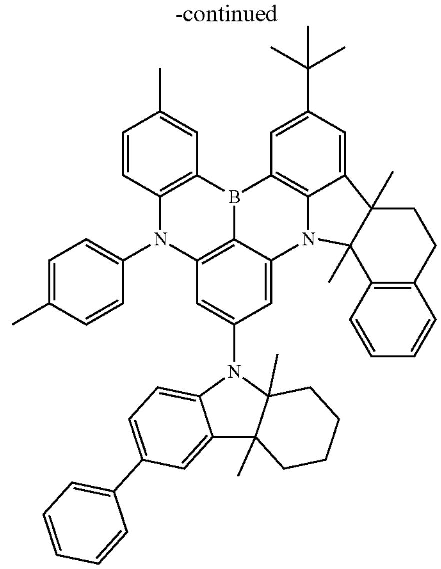
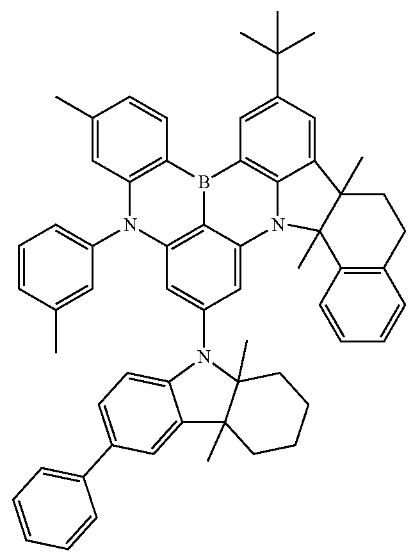
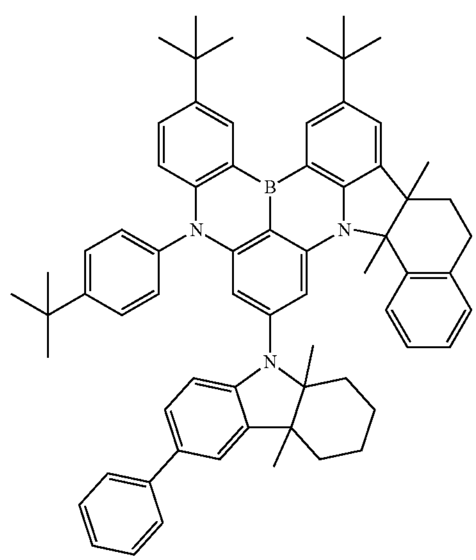

-continued
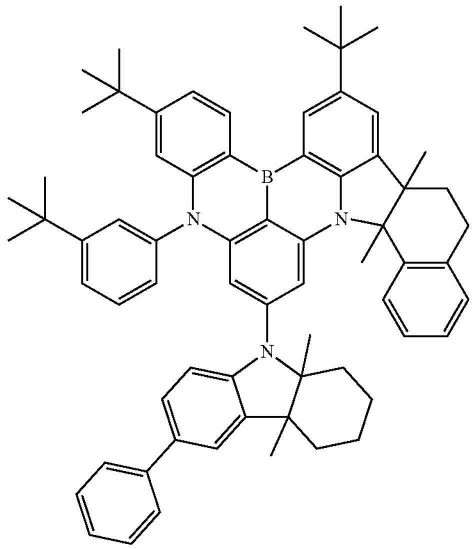
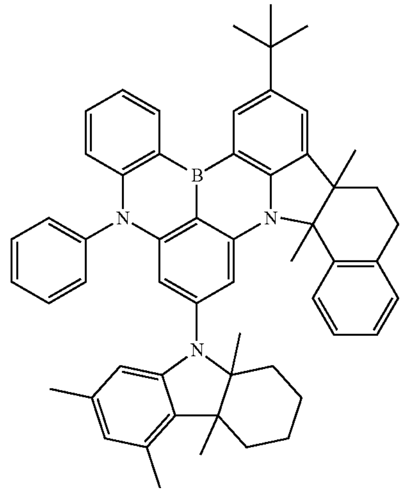
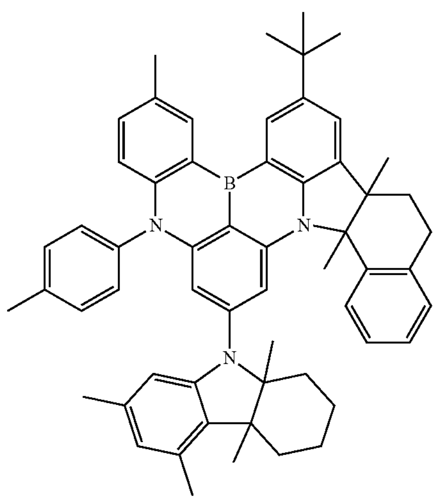
-continued
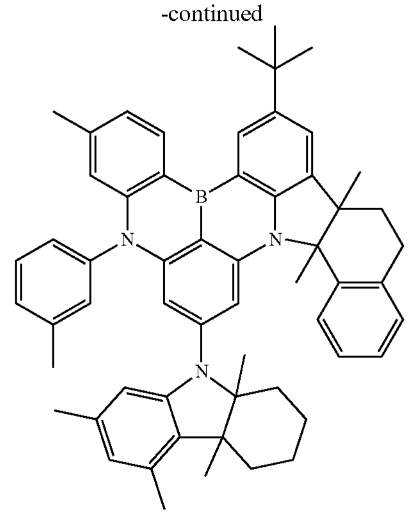
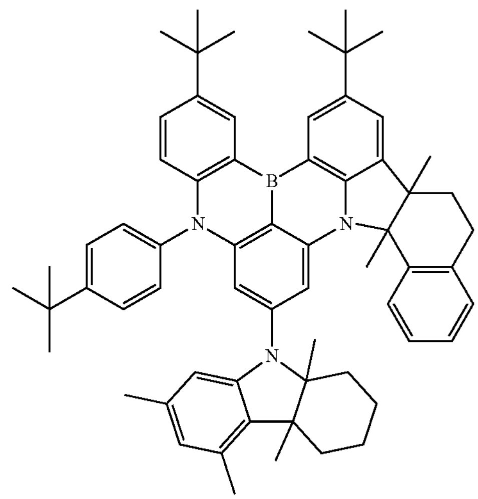
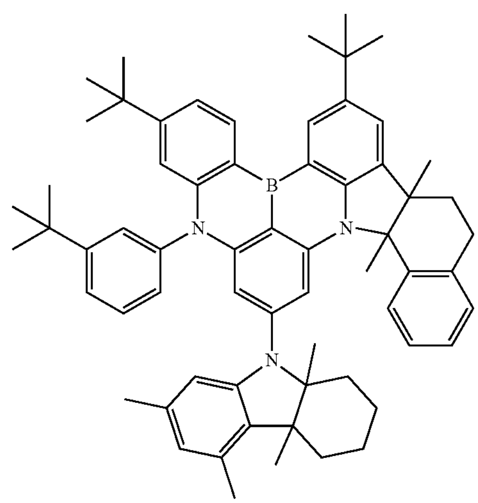

-continued
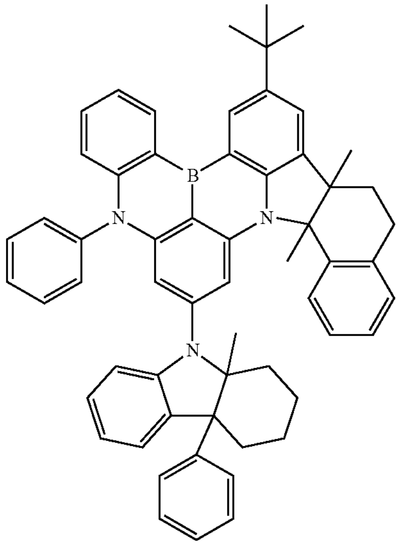
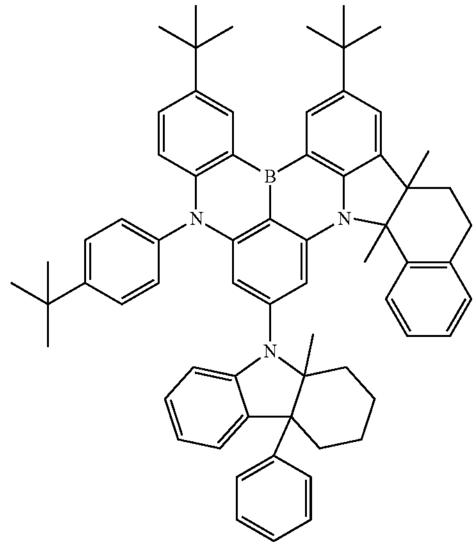
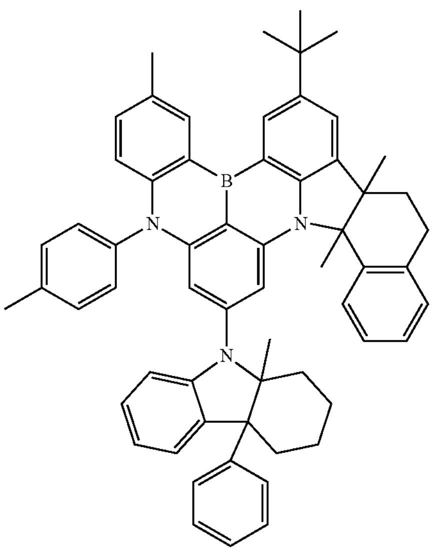
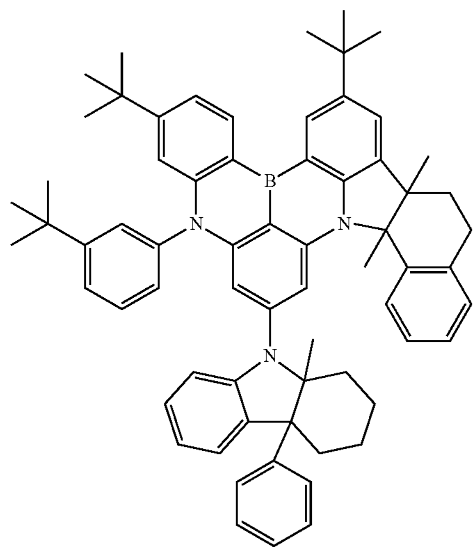
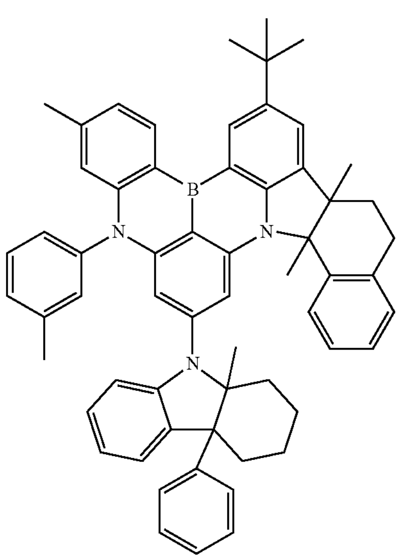
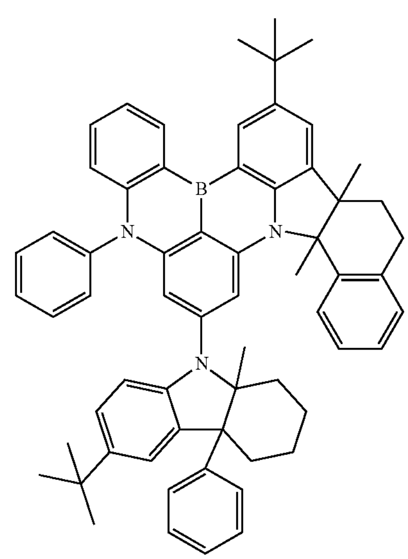
-continued -continued
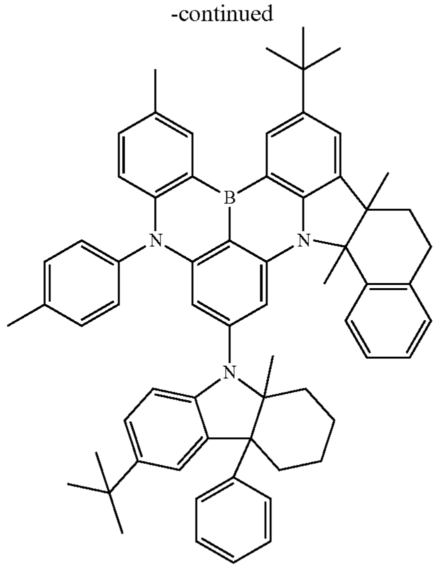
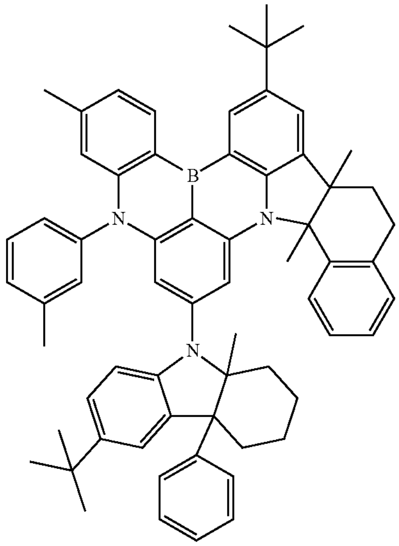
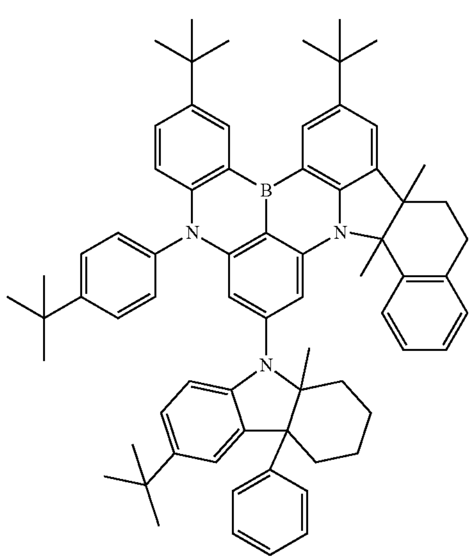
-continued
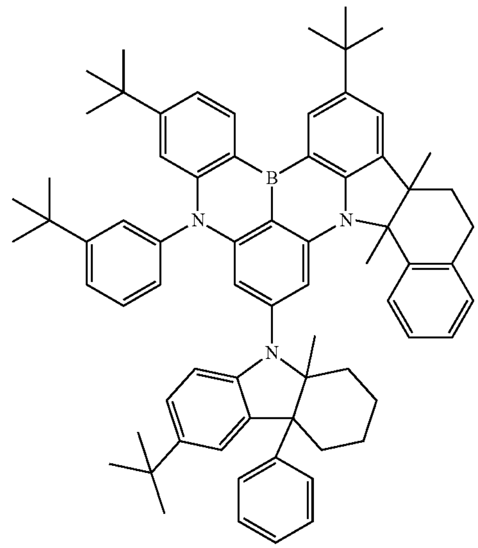
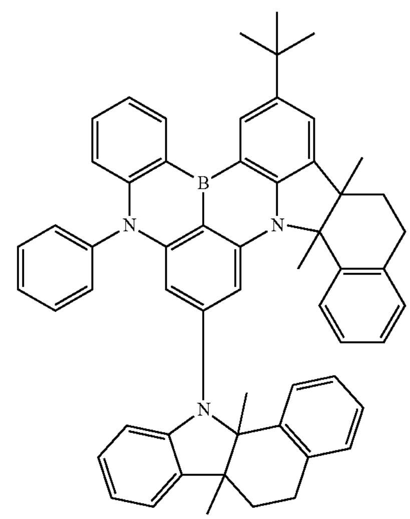
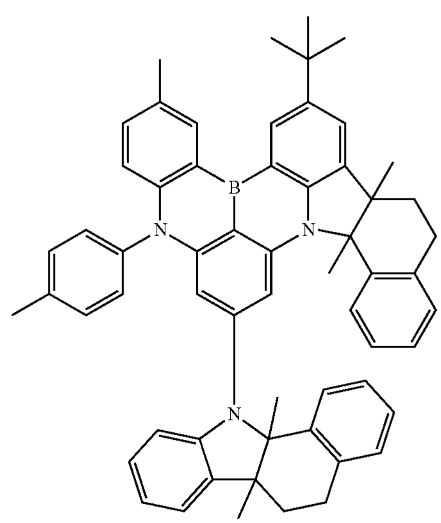

-continued
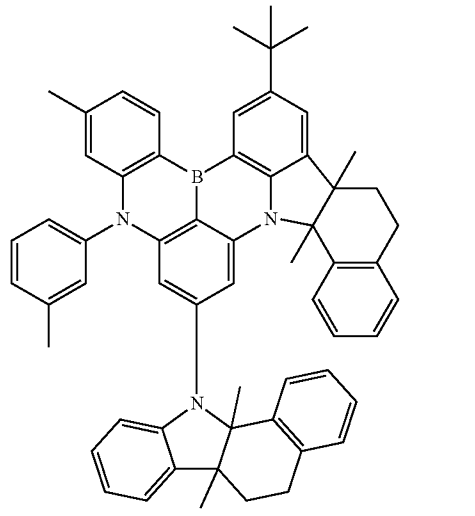
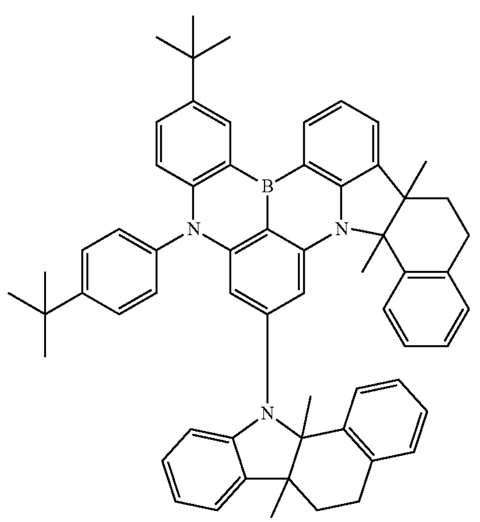
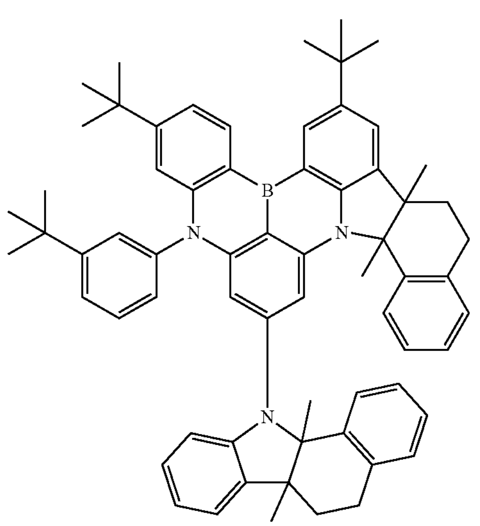
-continued
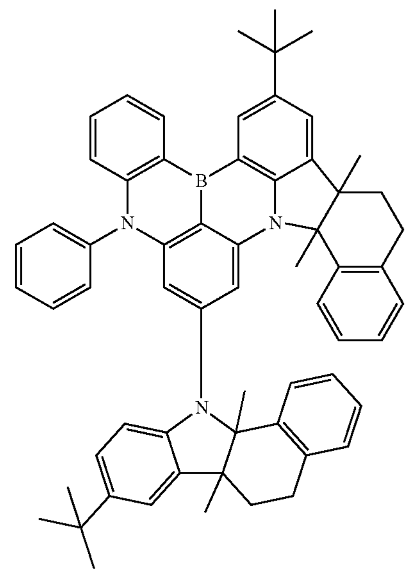
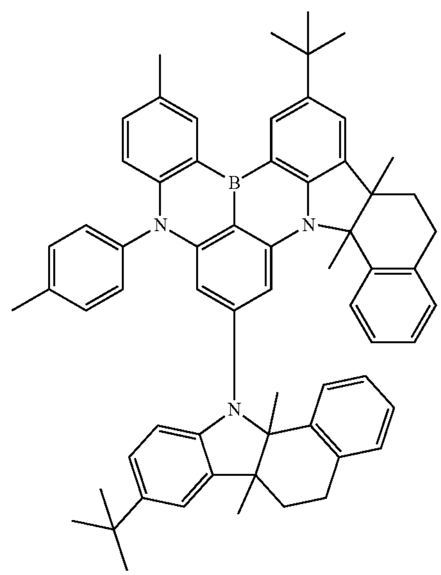
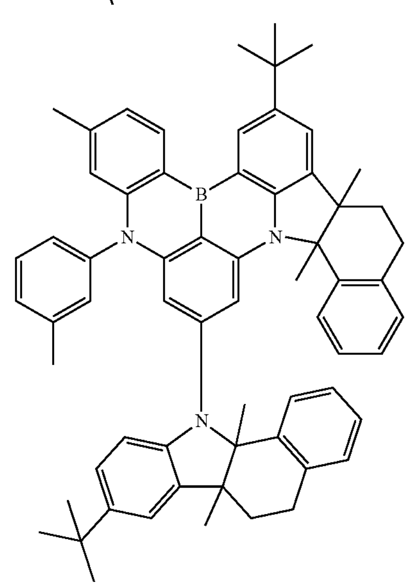

-continued
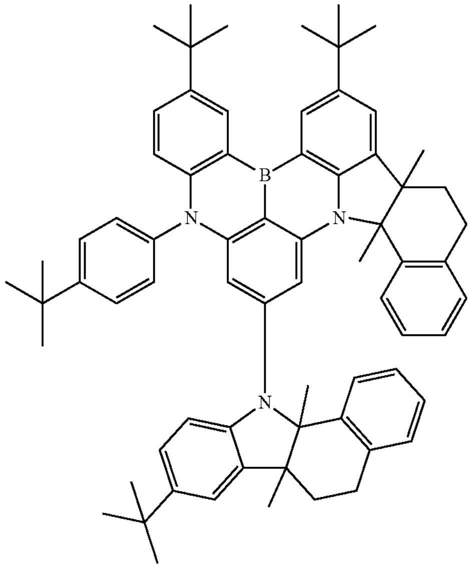
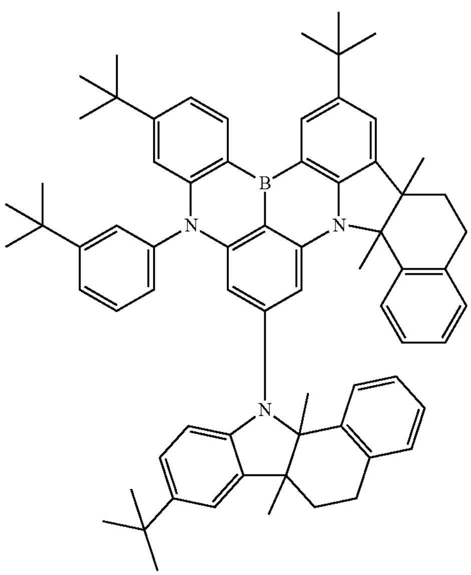
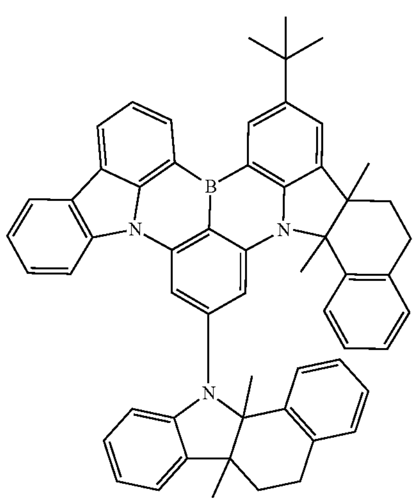
-continued
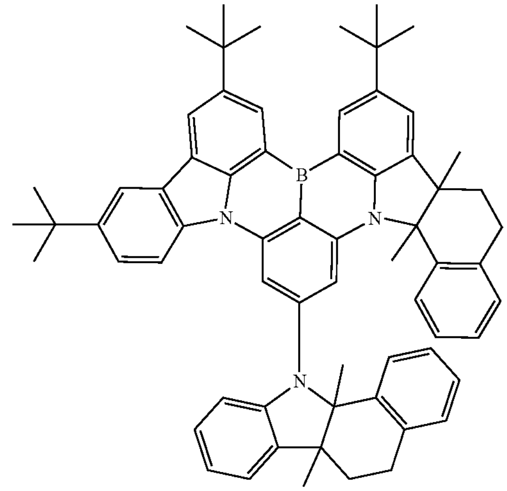
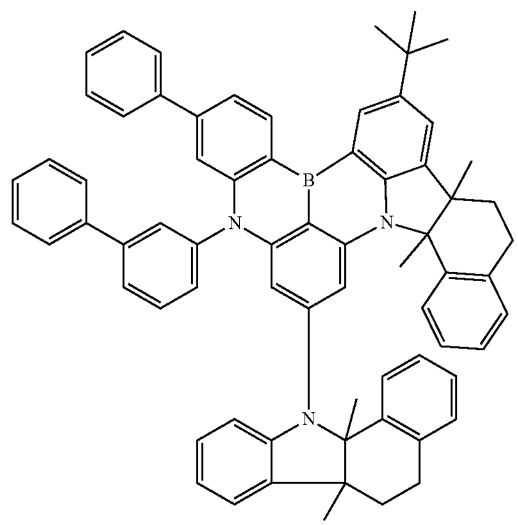
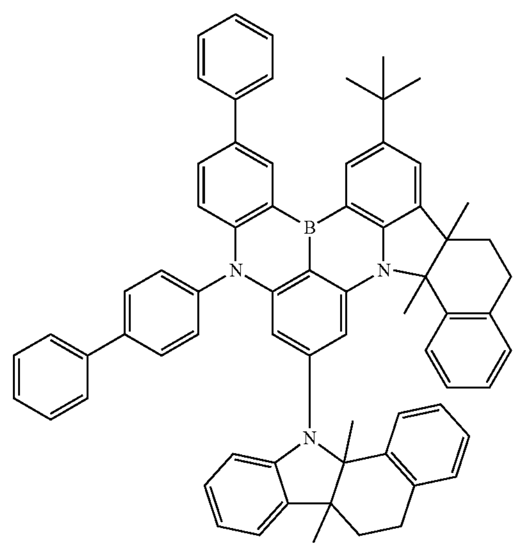

-continued
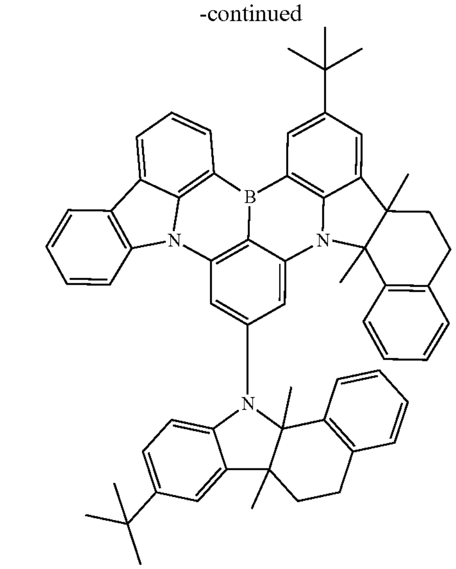
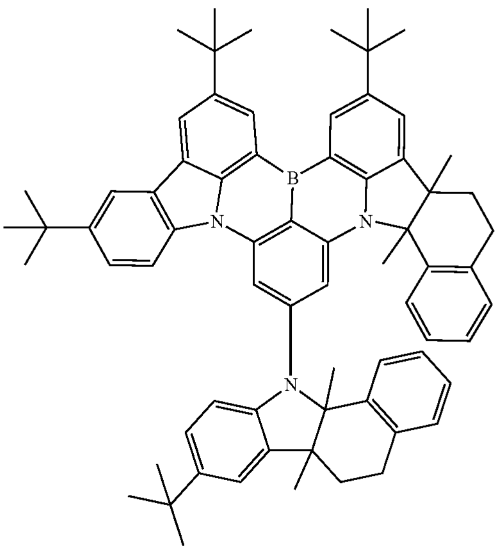
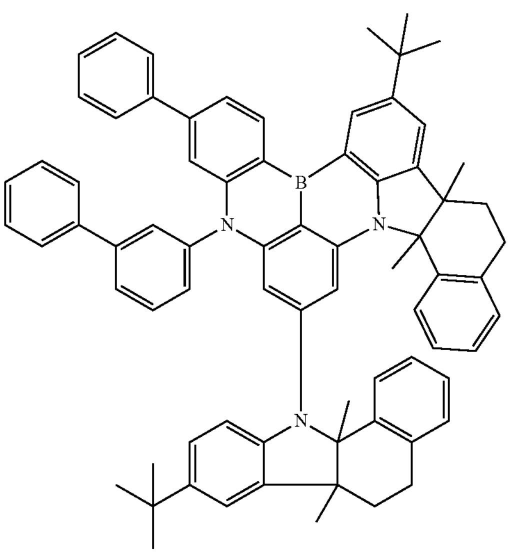
-continued
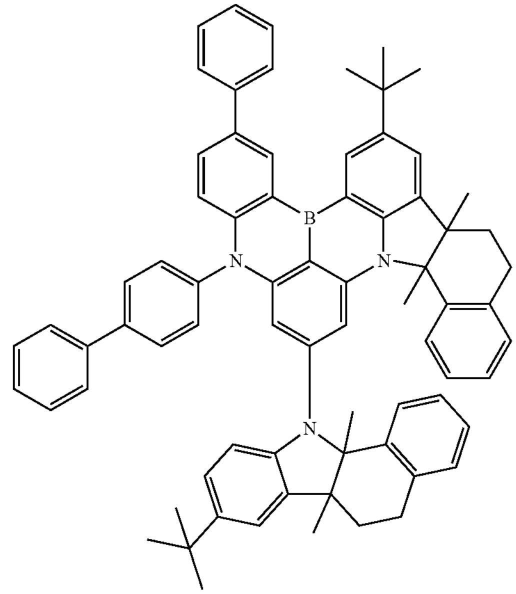
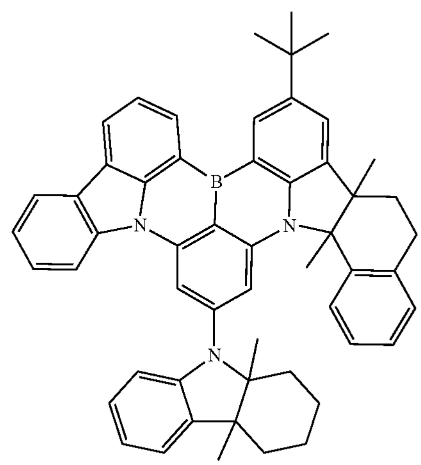
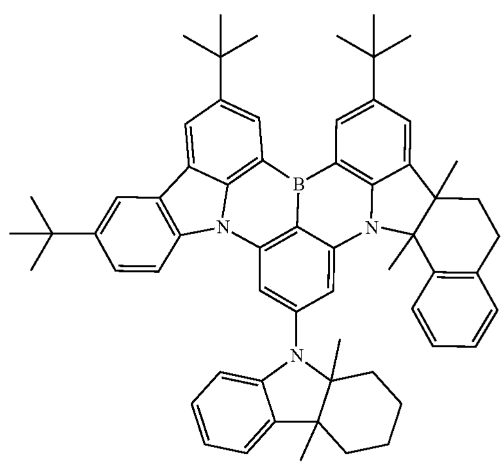

-continued
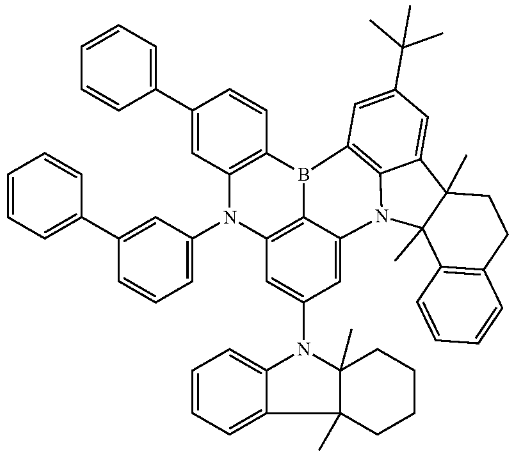
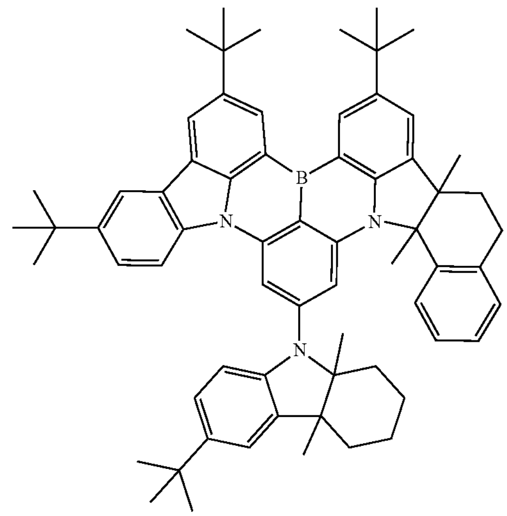
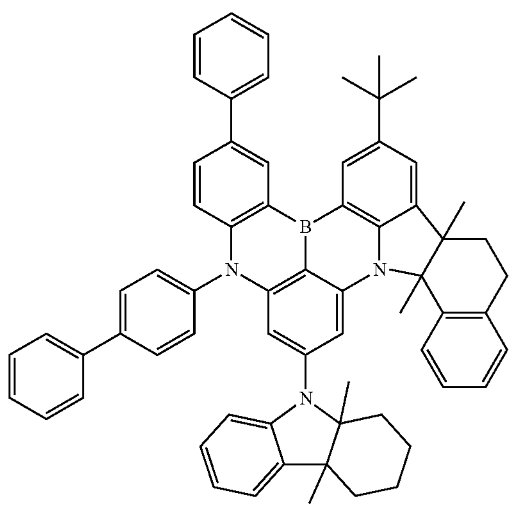
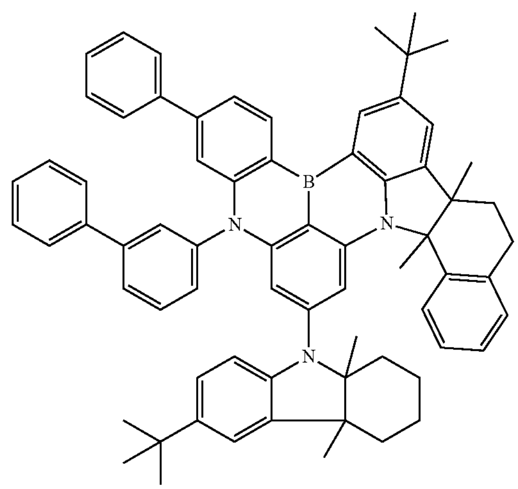
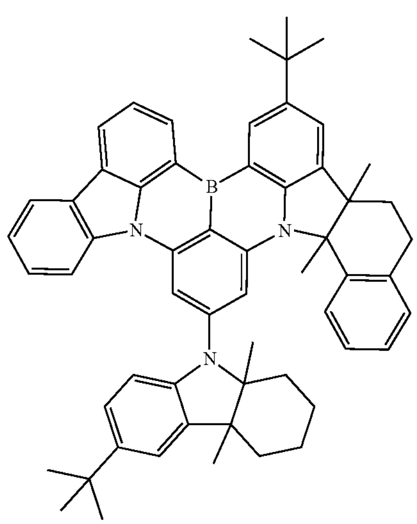
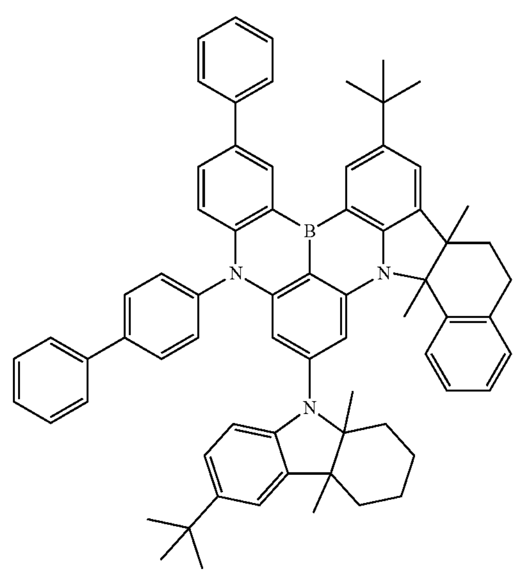
-continued -continued
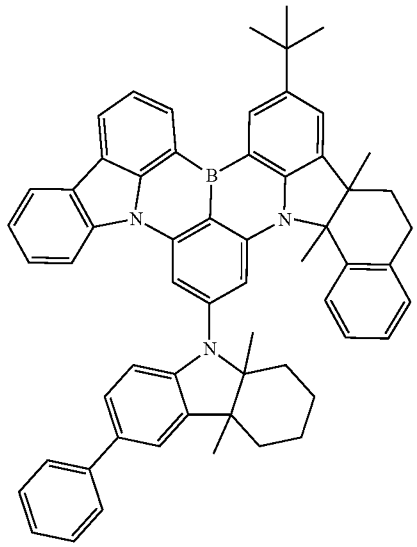
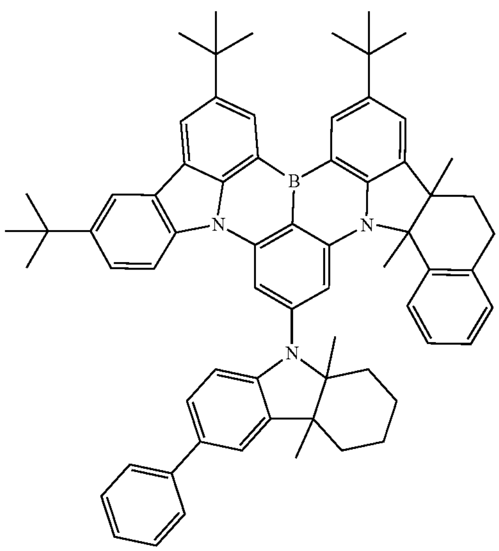
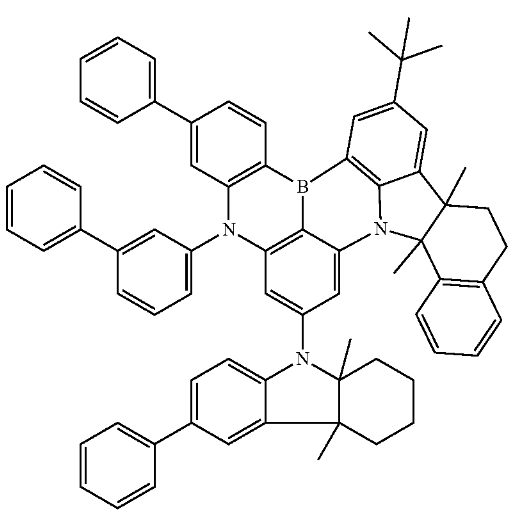
-continued
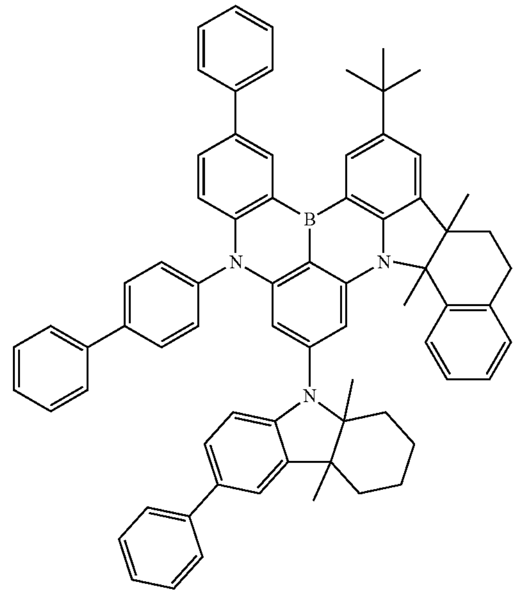
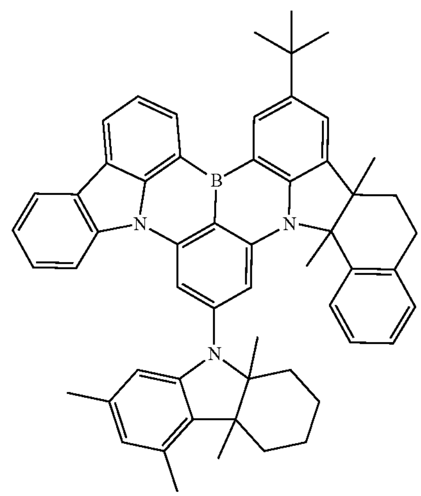
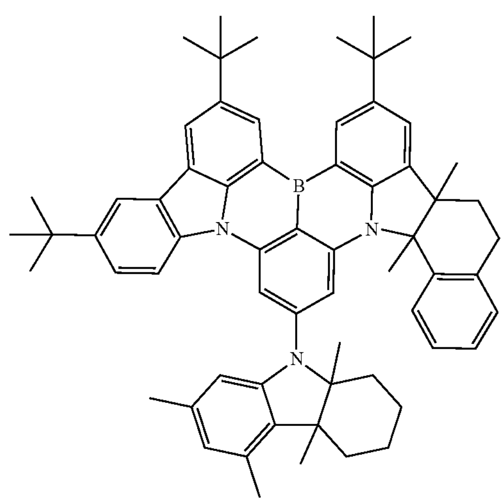

-continued
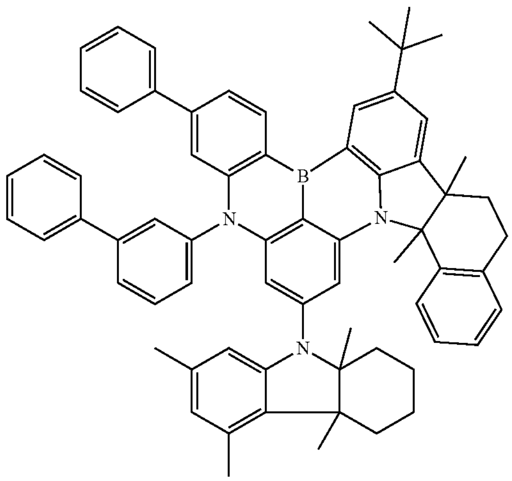
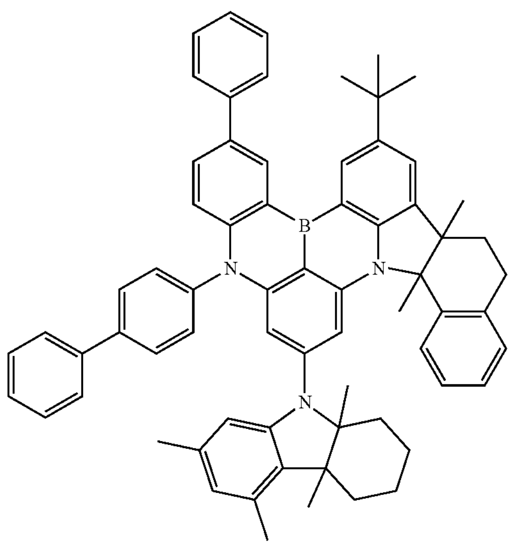
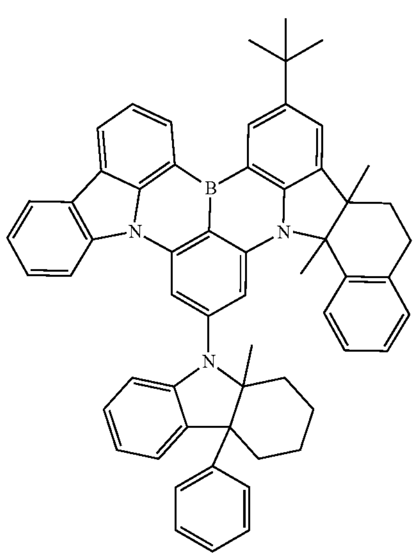
-continued
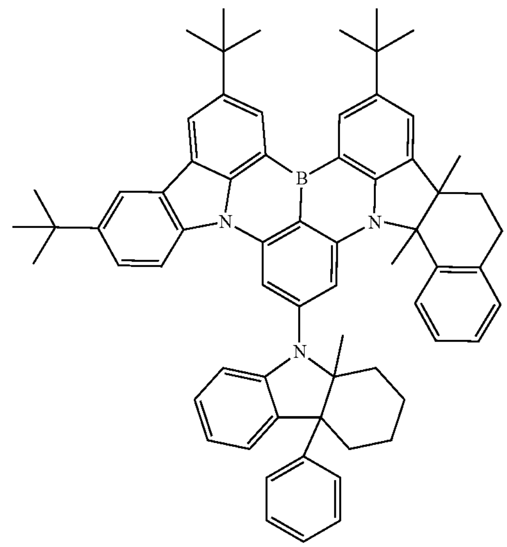
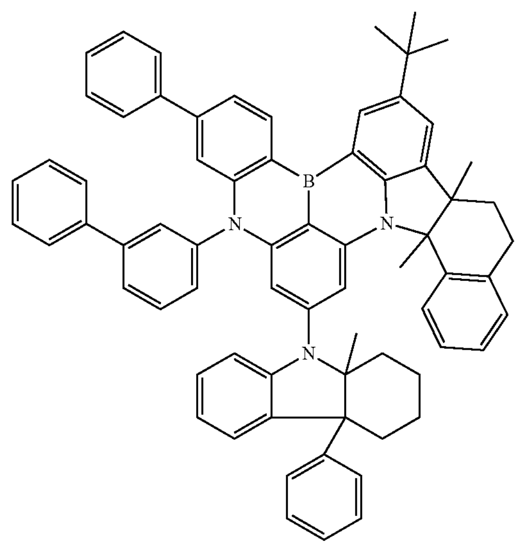
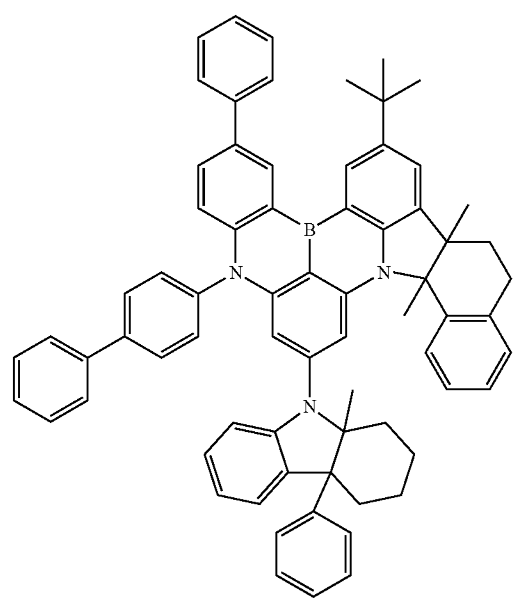

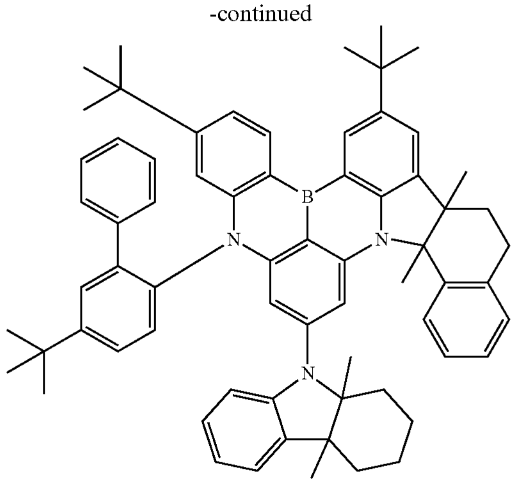
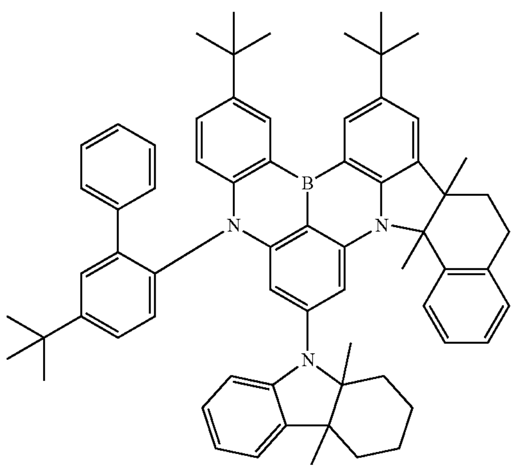
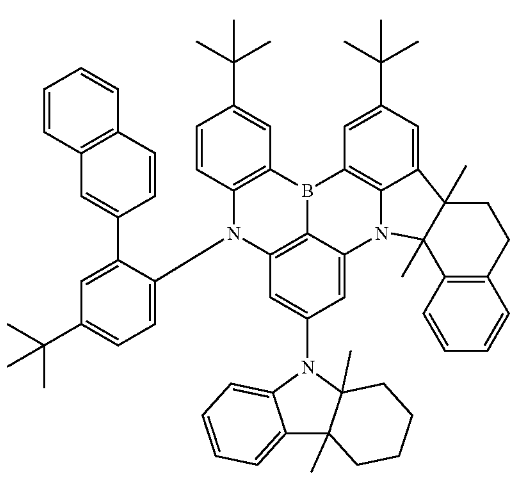
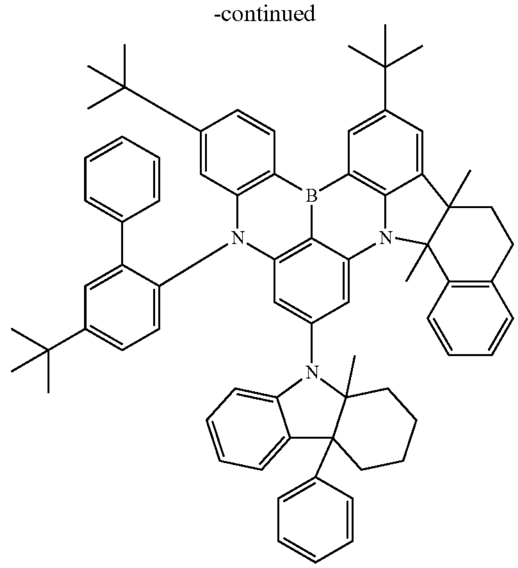
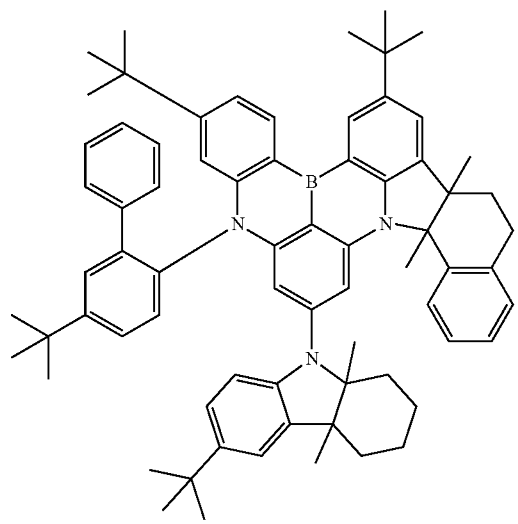
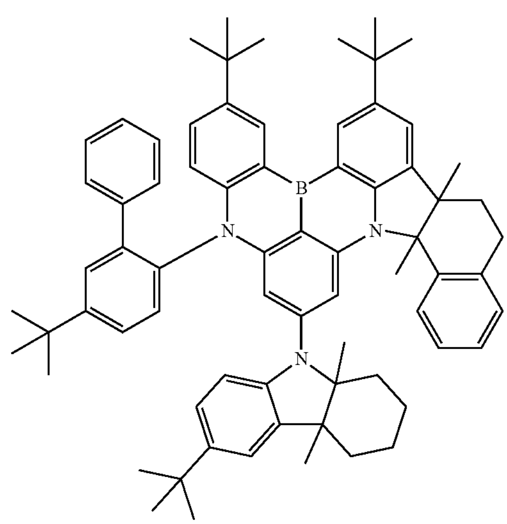

-continued
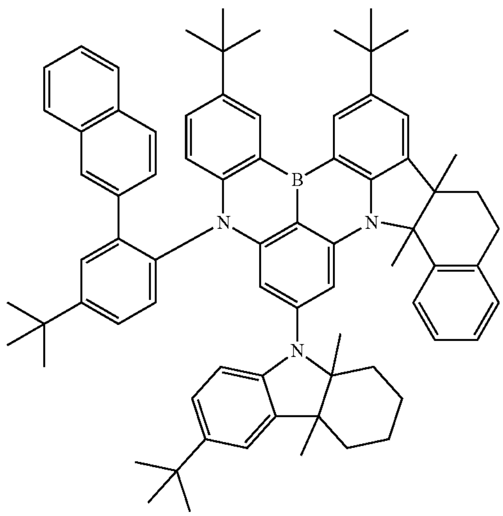
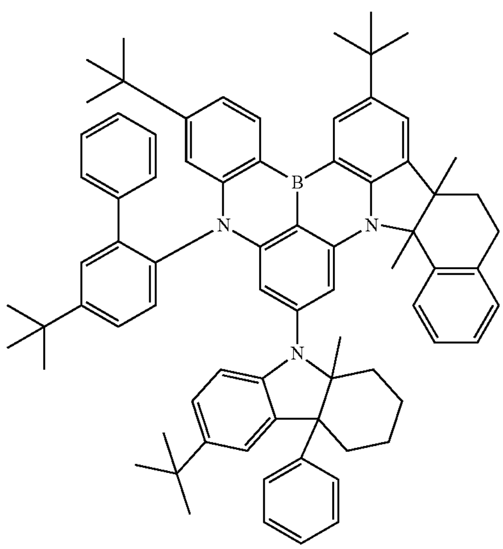
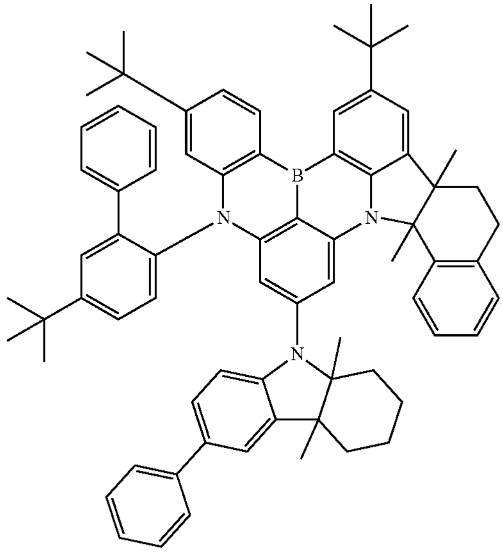
-continued
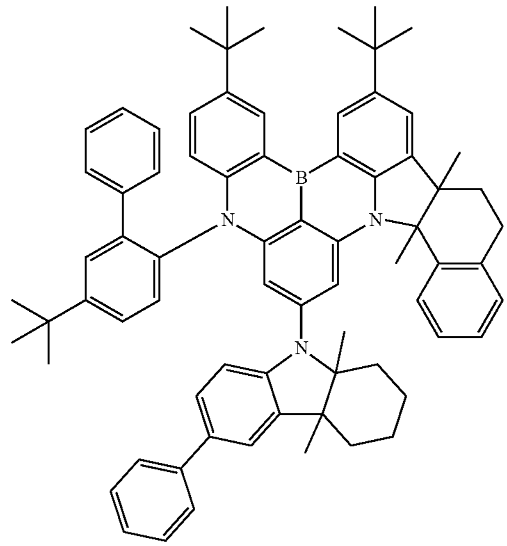
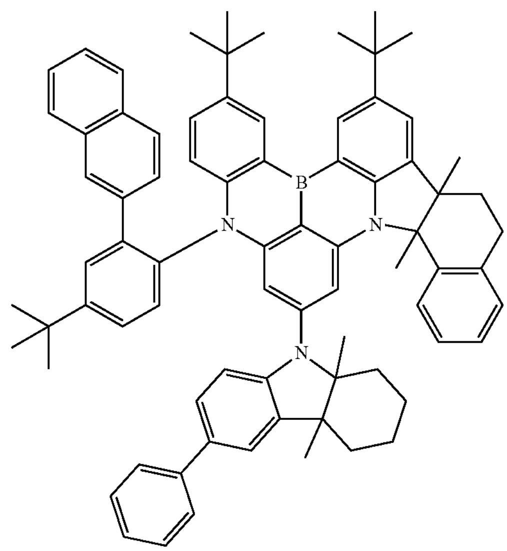
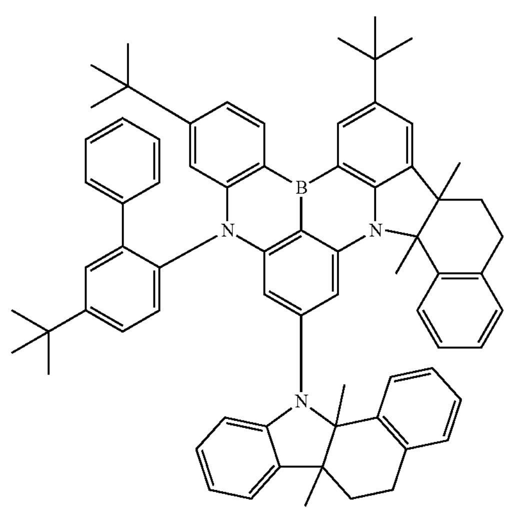

-continued
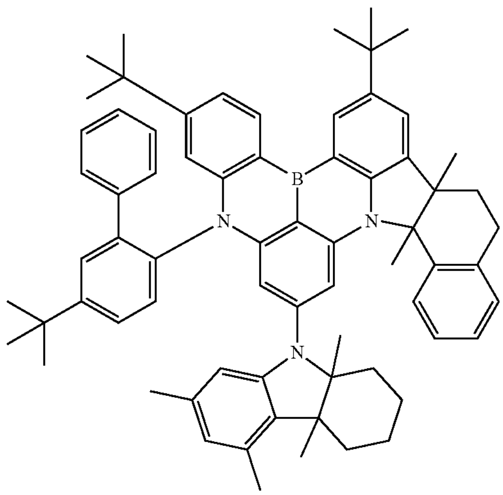
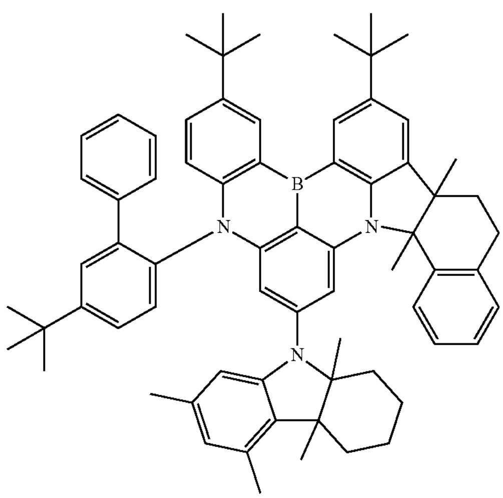
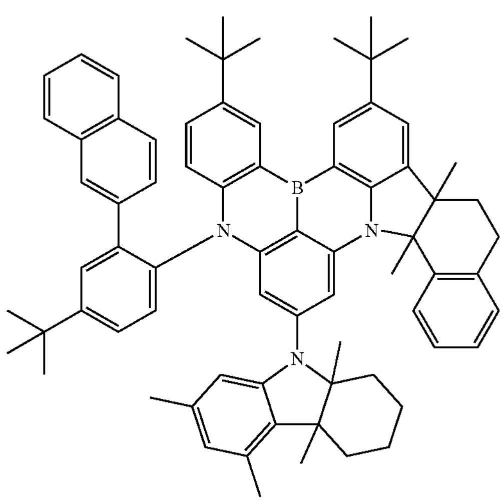 [SMILES: Cc1cc(C)c2c(c1)N(c1cc3c4c(c1)N1c5c(cc(C(C)(C)C)cc5C5(C)CCc6ccccc6C15C)B4c1cc(C(C)(C)C)ccc1N3c1ccc(C(C)(C)C)cc1-c1ccc3ccccc3c1)C1(C)CCCCC21C]
-continued
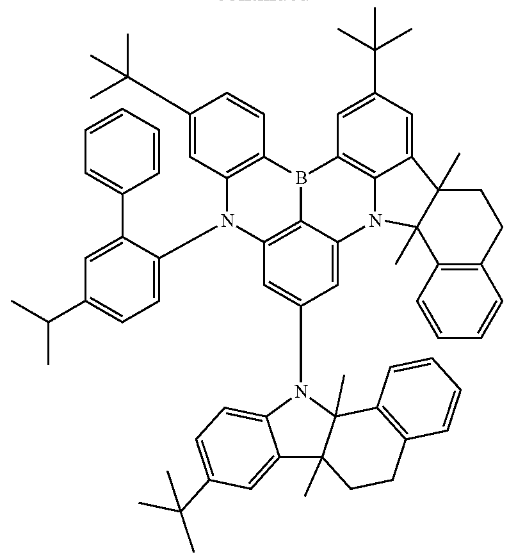
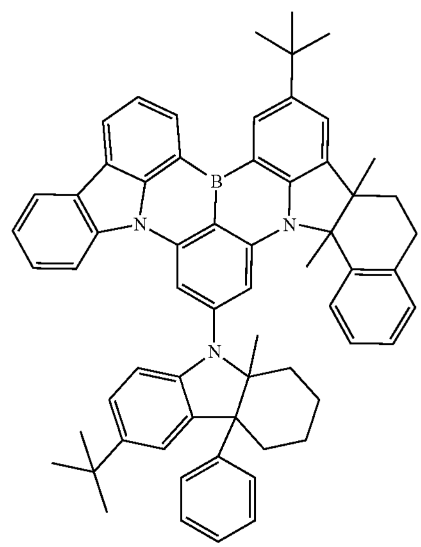
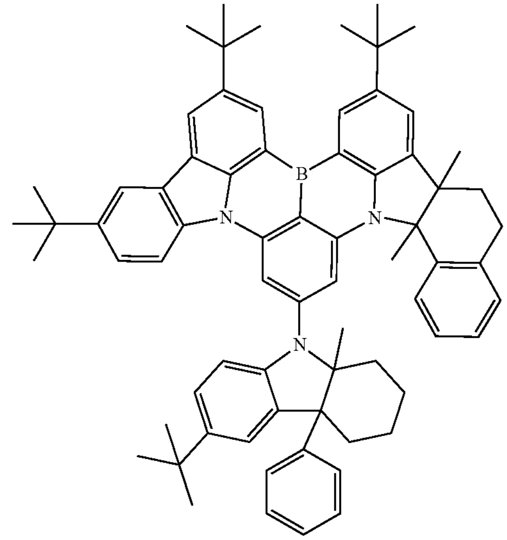

-continued
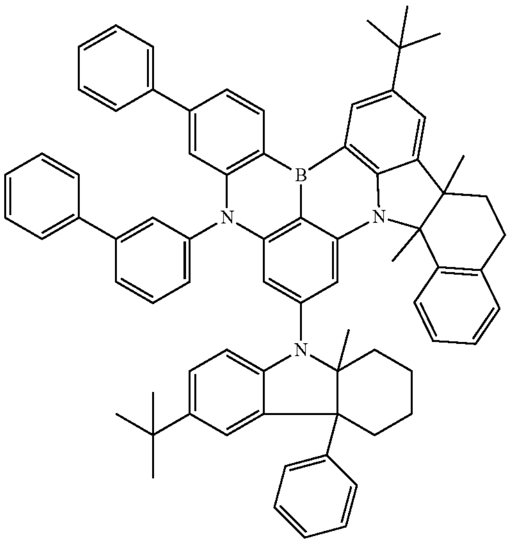
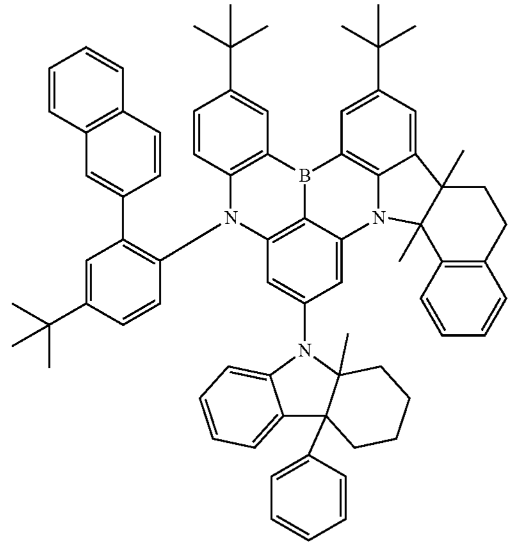
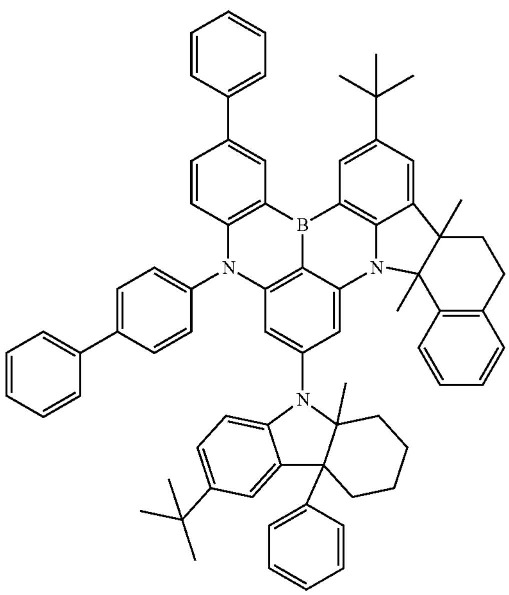
-continued
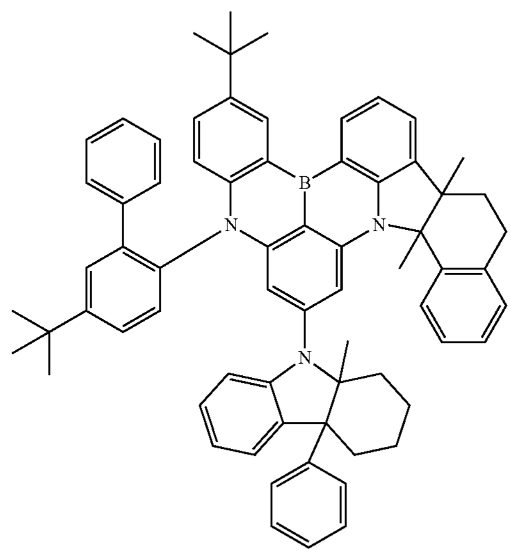
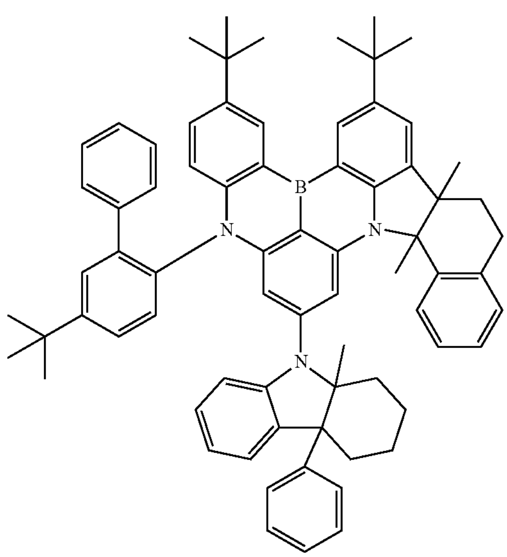
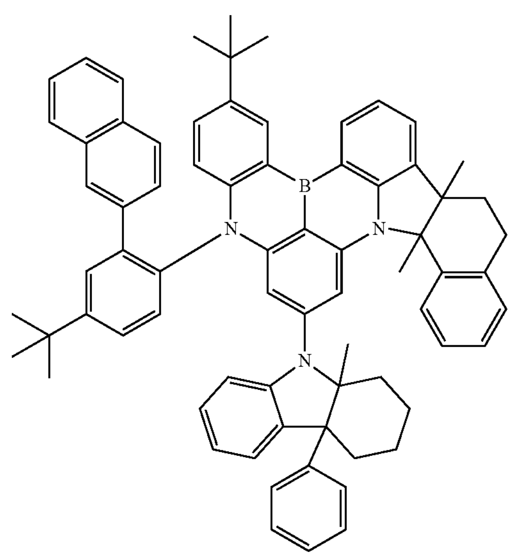

-continued
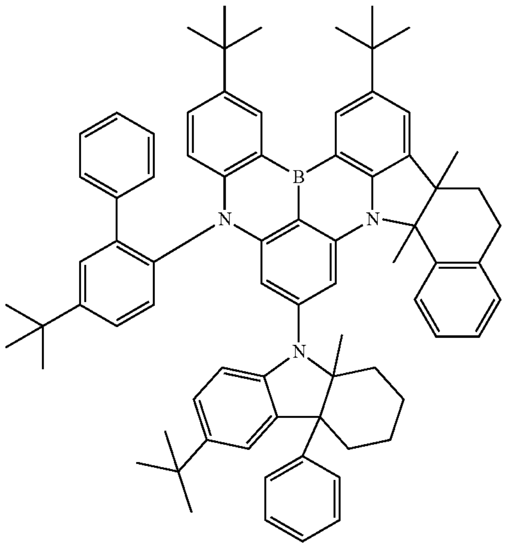
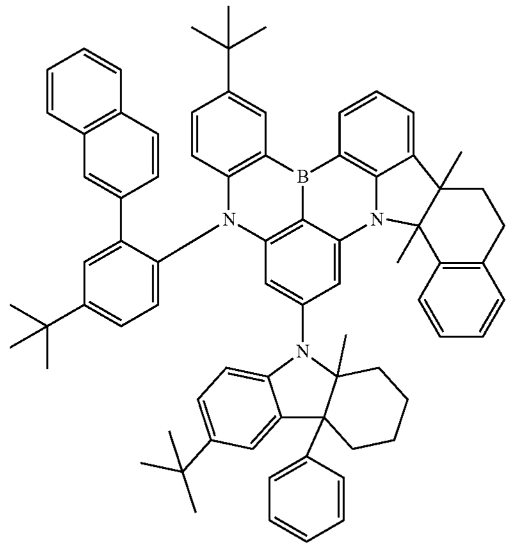
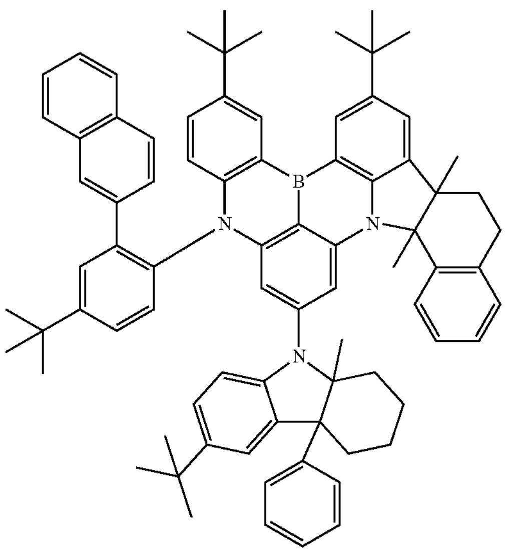
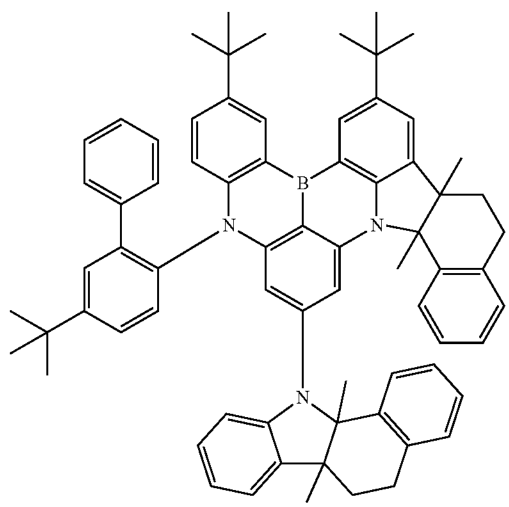
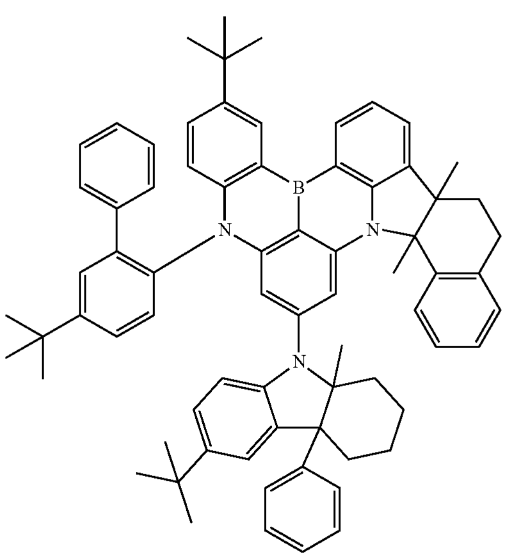
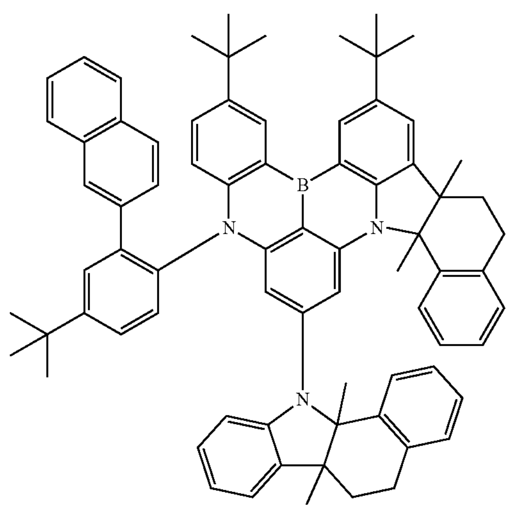

-continued
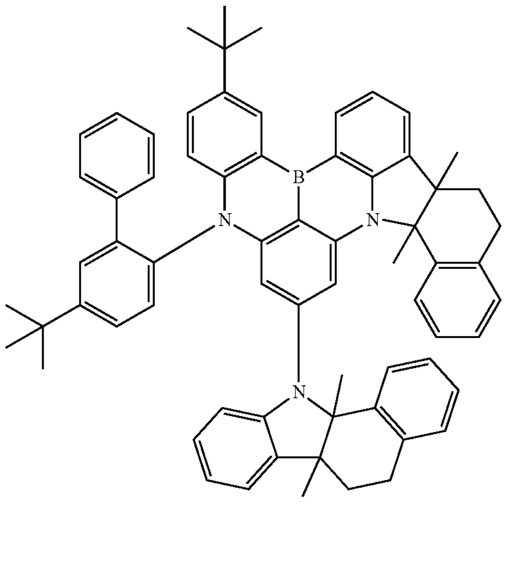
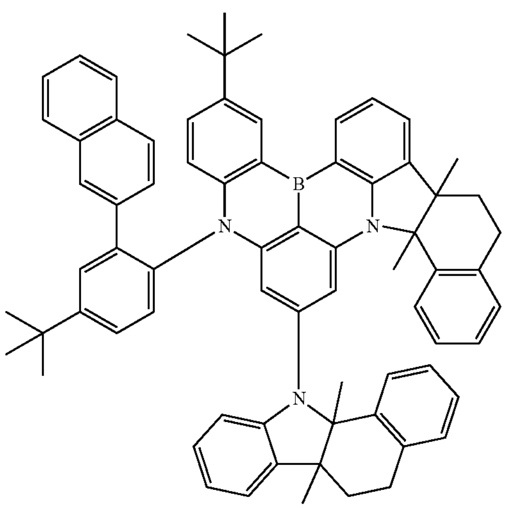
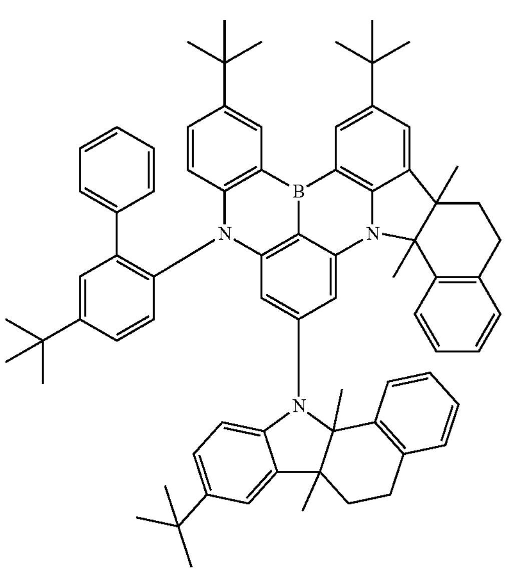
-continued
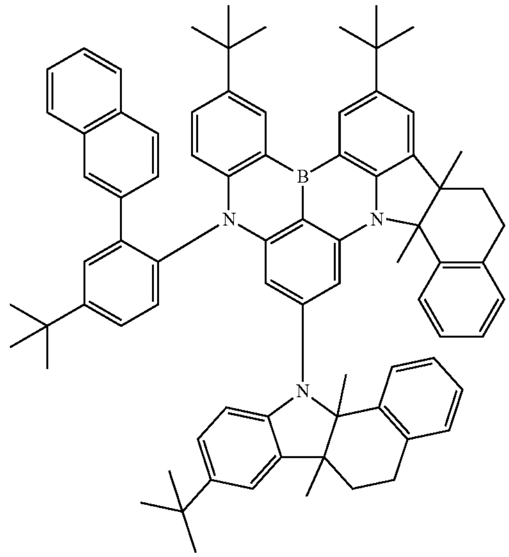
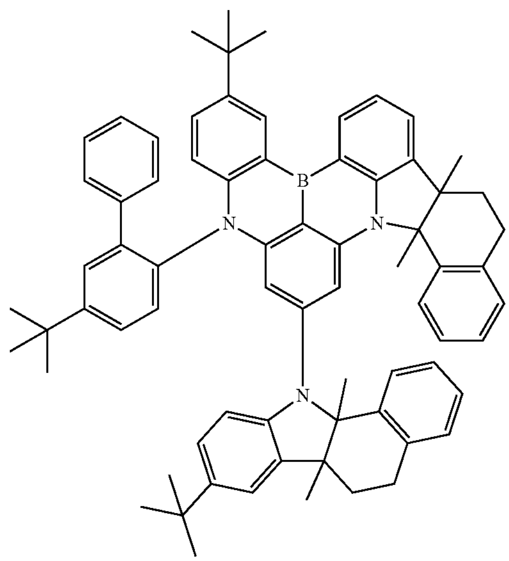
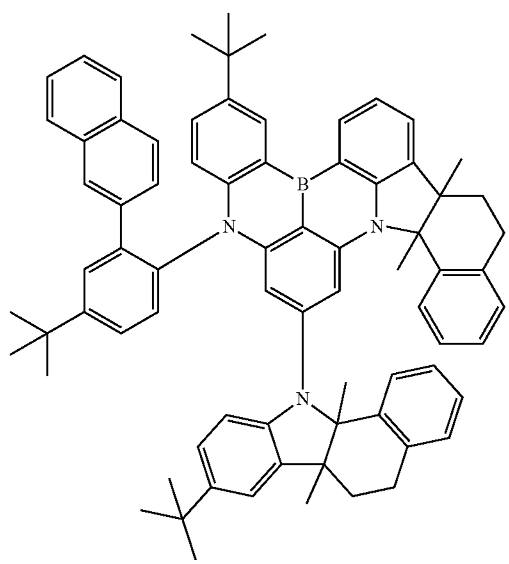

-continued
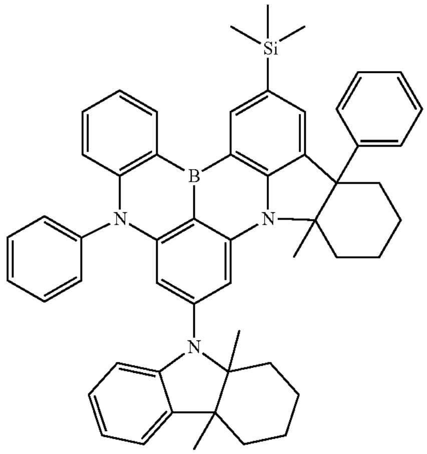
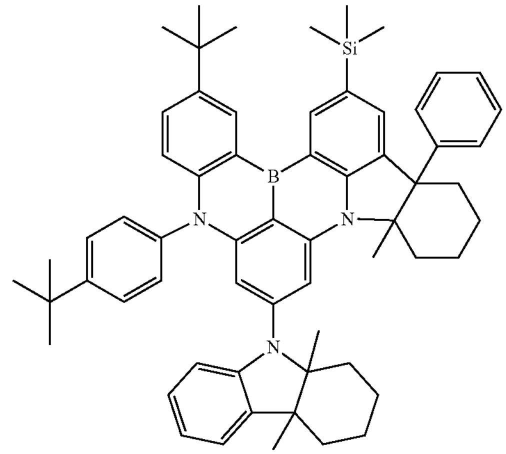
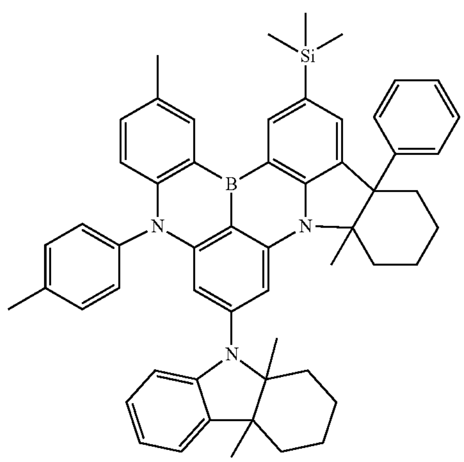
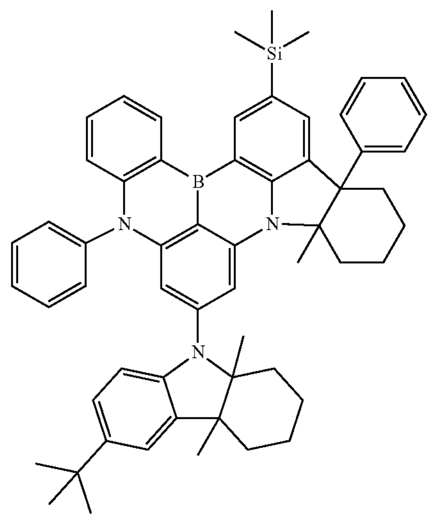
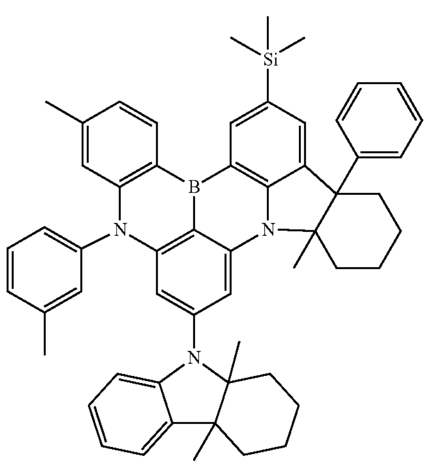
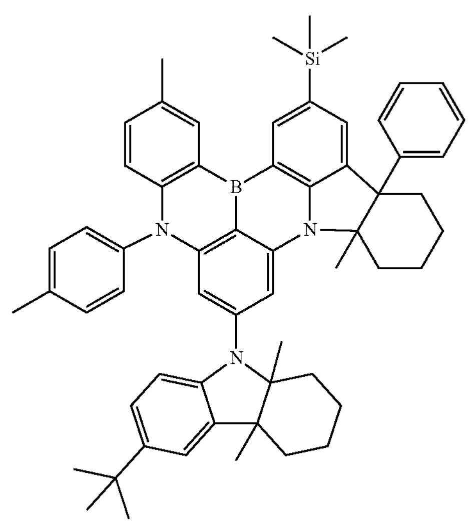

-continued
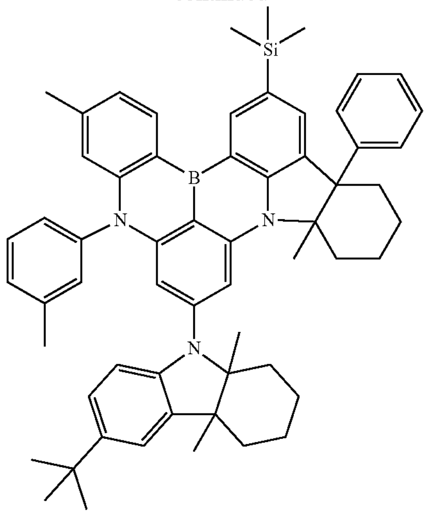
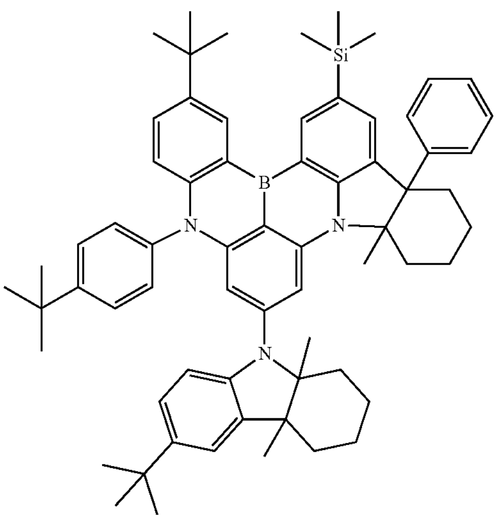 [SMILES: CC(C)(C)c1ccc(N2c3ccc(C(C)(C)C)cc3B3c4cc([Si](C)(C)C)cc5c4N(c4cc(N6c7ccc(C(C)(C)C)cc7C7(C)CCCCC67C)cc2c43)C2(C)CCCCC52c2ccccc2)cc1]
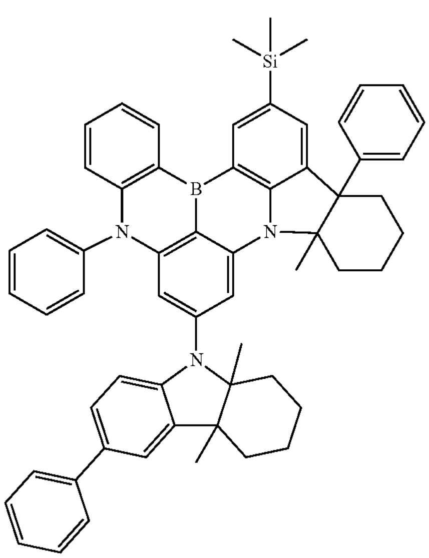
-continued
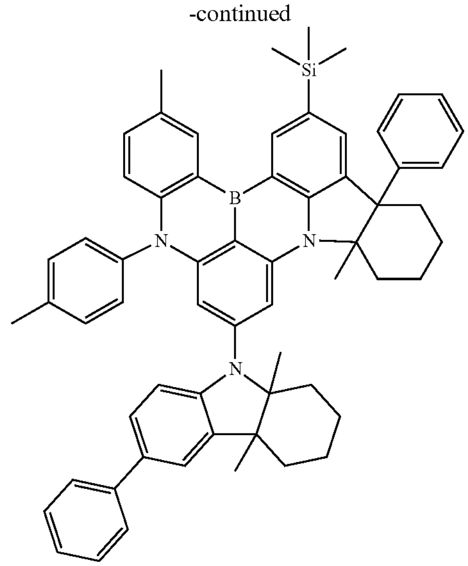
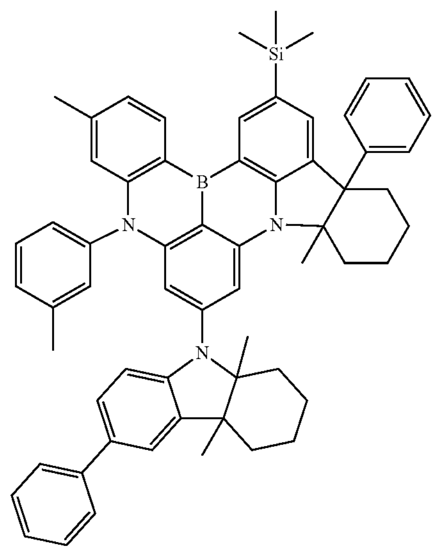
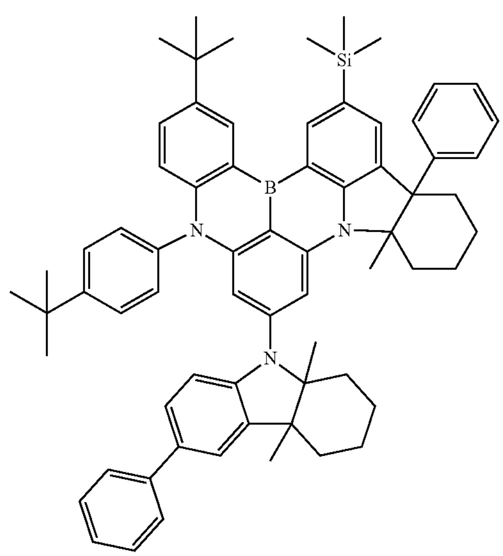 [SMILES: CC(C)(C)c1ccc(N2c3ccc(C(C)(C)C)cc3B3c4cc([Si](C)(C)C)cc5c4N(c4cc(N6c7ccc(-c8ccccc8)cc7C7(C)CCCCC67C)cc2c43)C2(C)CCCCC52c2ccccc2)cc1]

-continued
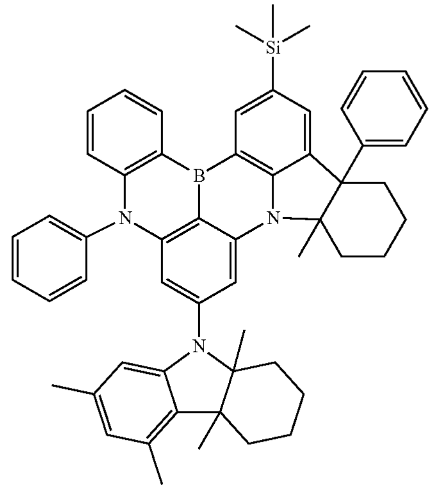
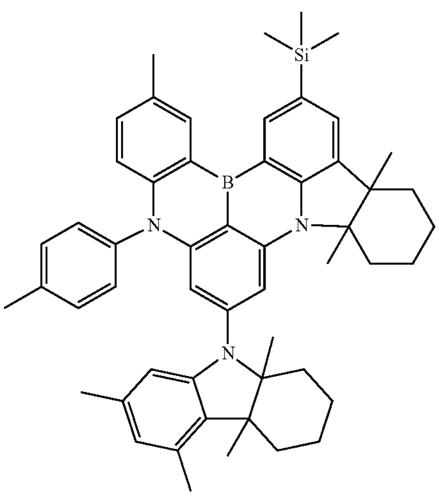
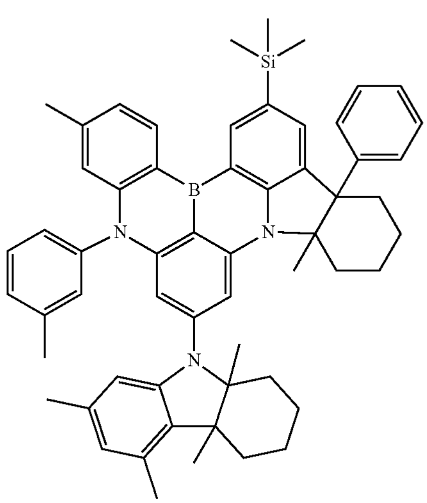
-continued
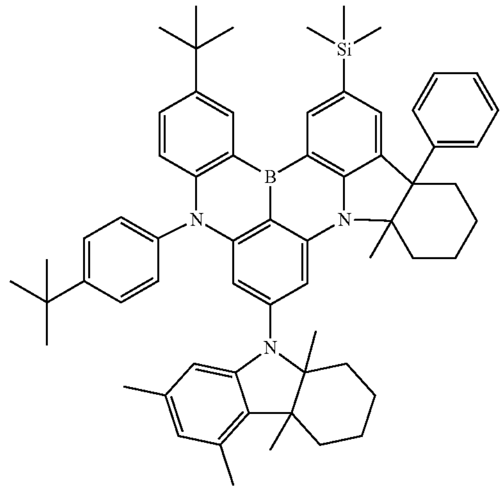 [SMILES: Cc1cc(C)c2c(c1)N(c1cc3c4c(c1)N1c5c(cc([Si](C)(C)C)cc5C5(c6ccccc6)CCCCC15C)B4c1cc(C(C)(C)C)ccc1N3c1ccc(C(C)(C)C)cc1)C1(C)CCCCC21C]
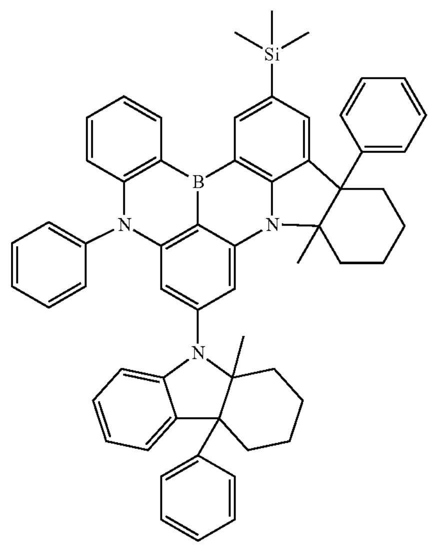
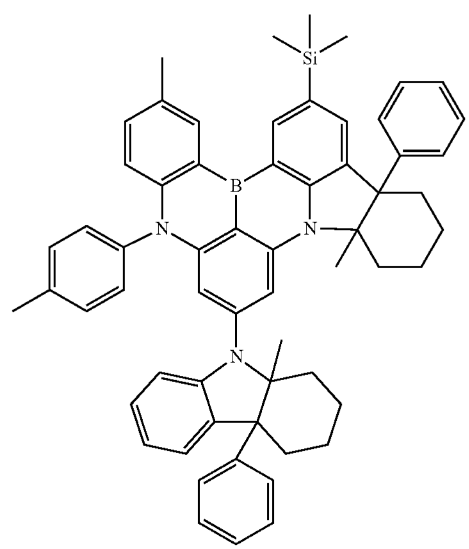

-continued
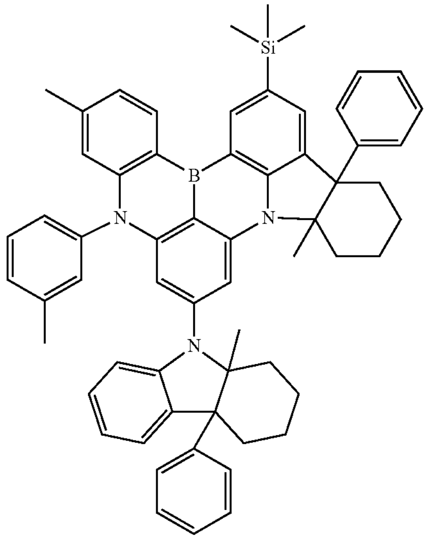
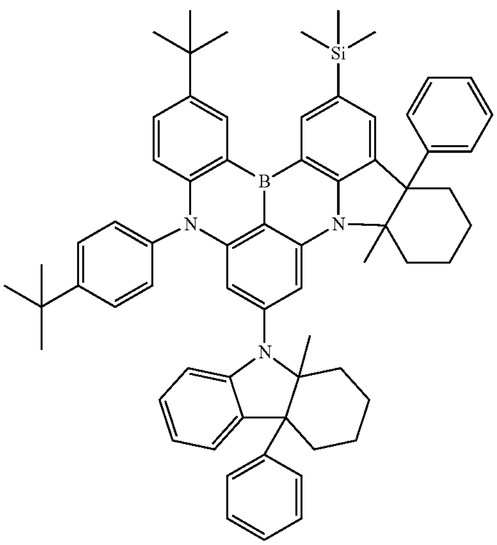 [SMILES: CC(C)(C)c1ccc(N2c3ccc(C(C)(C)C)cc3B3c4cc([Si](C)(C)C)cc5c4N(c4cc(N6c7ccccc7C7(c8ccccc8)CCCCC67C)cc2c43)C2(C)CCCCC52c2ccccc2)cc1]
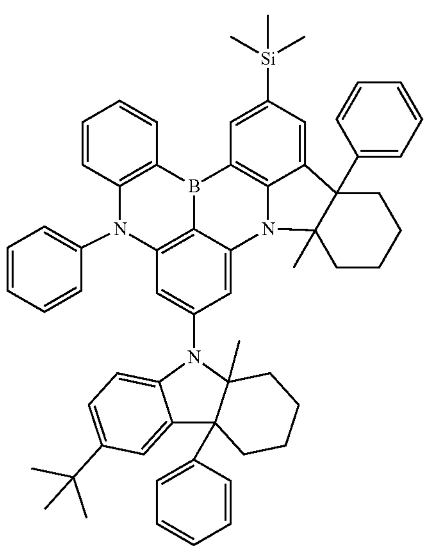
-continued
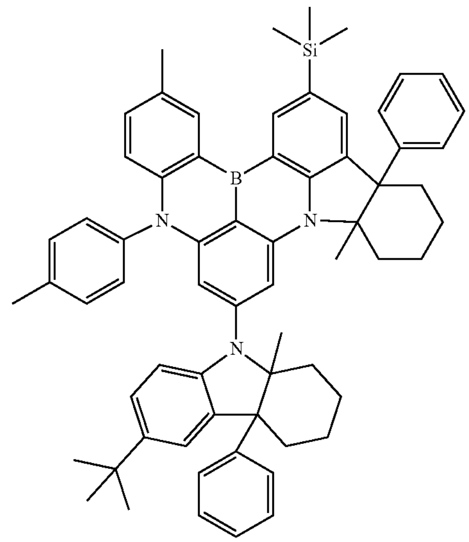
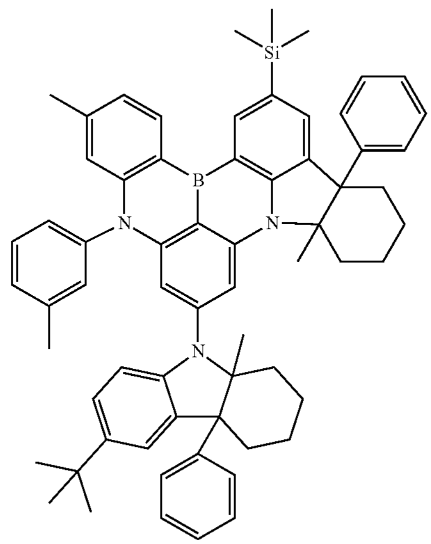
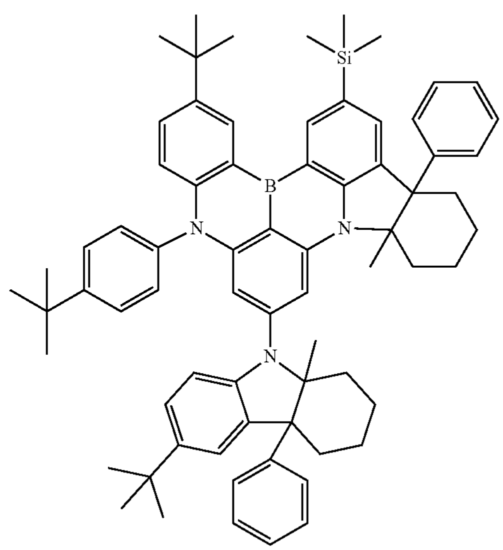 [SMILES: CC(C)(C)c1ccc(N2c3ccc(C(C)(C)C)cc3B3c4cc([Si](C)(C)C)cc5c4N(c4cc(N6c7ccc(C(C)(C)C)cc7C7(c8ccccc8)CCCCC67C)cc2c43)C2(C)CCCCC52c2ccccc2)cc1]

-continued
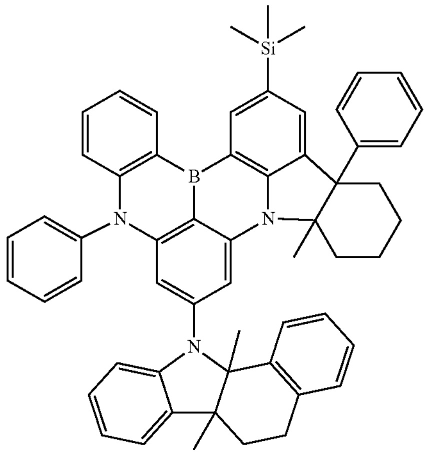
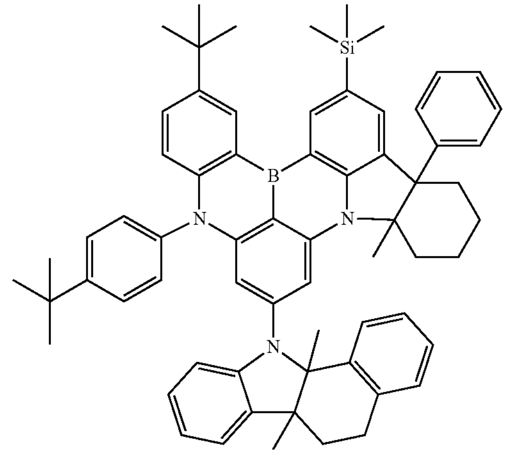
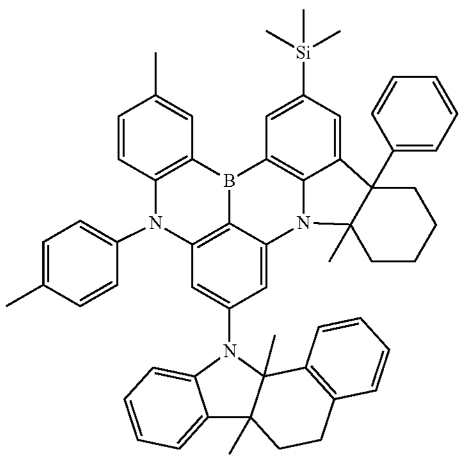
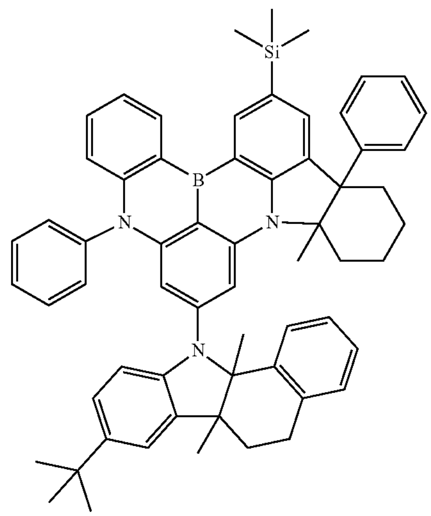
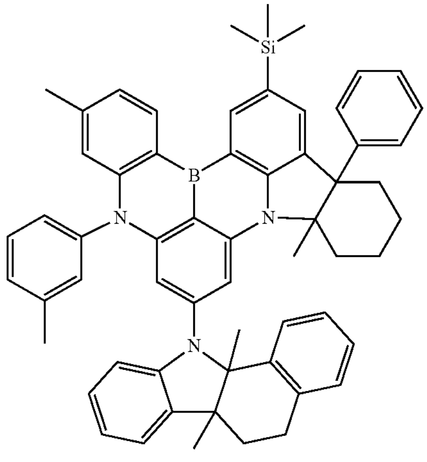
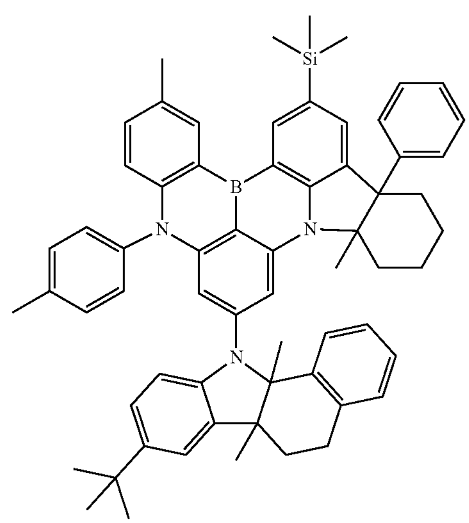
-continued -continued
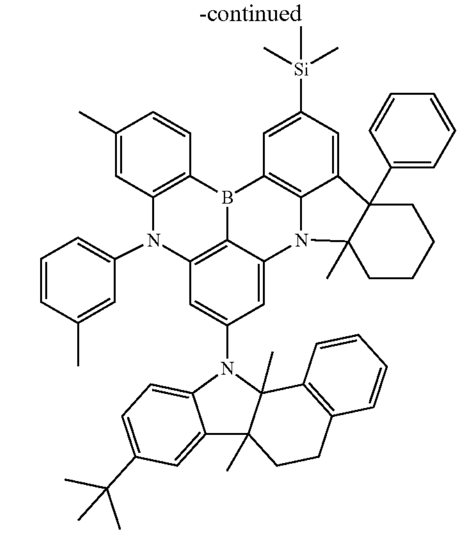
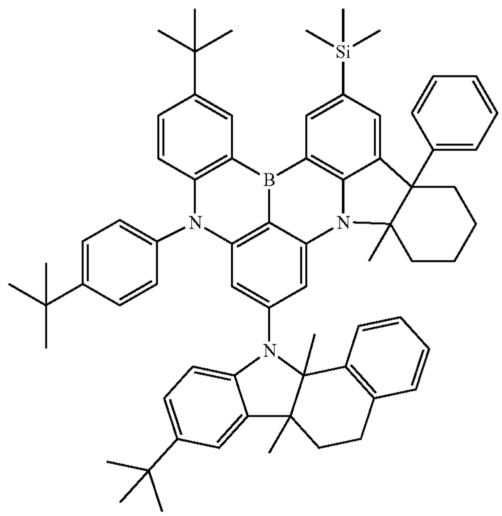 [SMILES: CC(C)(C)c1ccc(N2c3ccc(C(C)(C)C)cc3B3c4cc([Si](C)(C)C)cc5c4N(c4cc(N6c7ccc(C(C)(C)C)cc7C7(C)CCc8ccccc8C67C)cc2c43)C2(C)CCCCC52c2ccccc2)cc1]
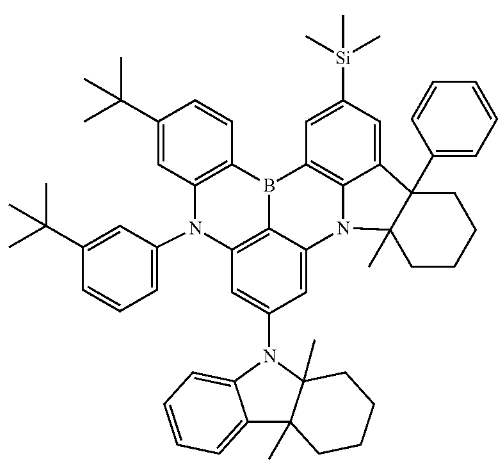
-continued
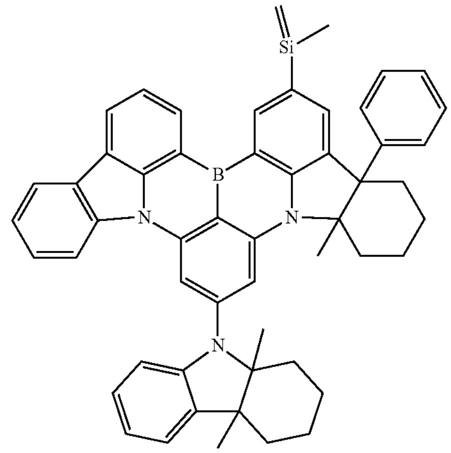
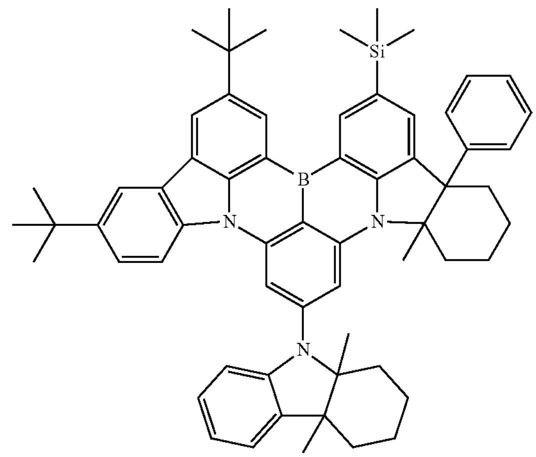
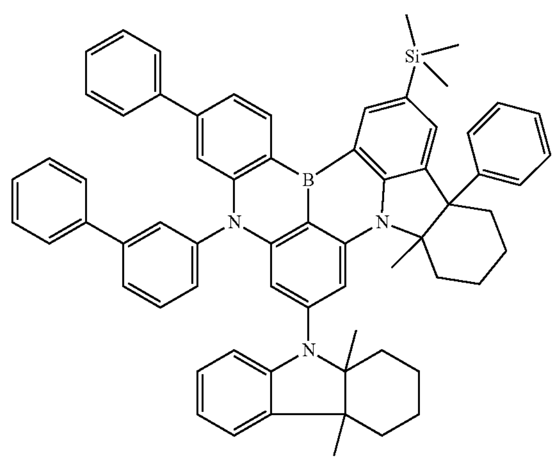

-continued
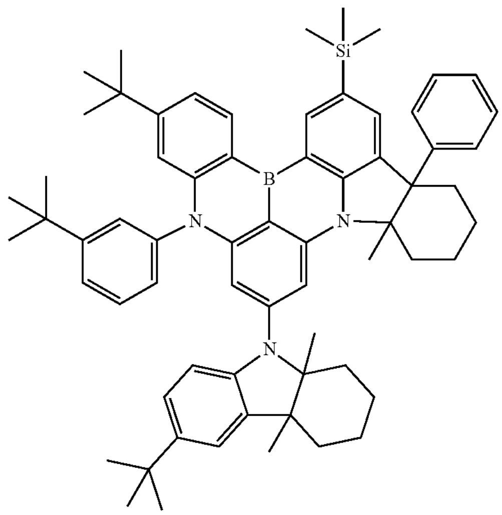
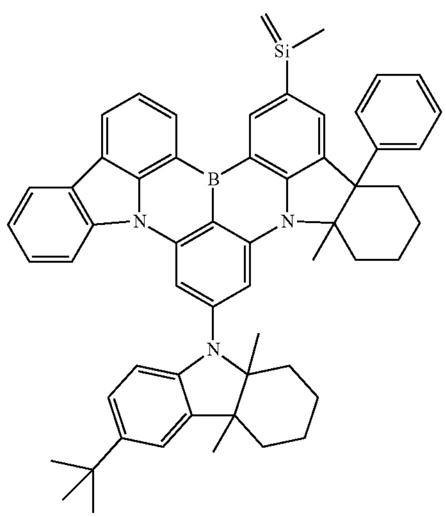
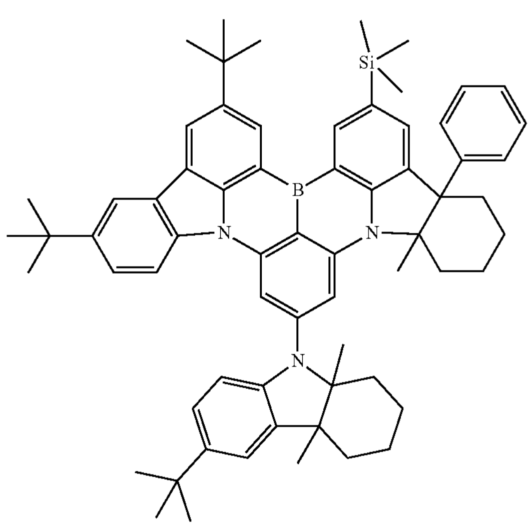
-continued
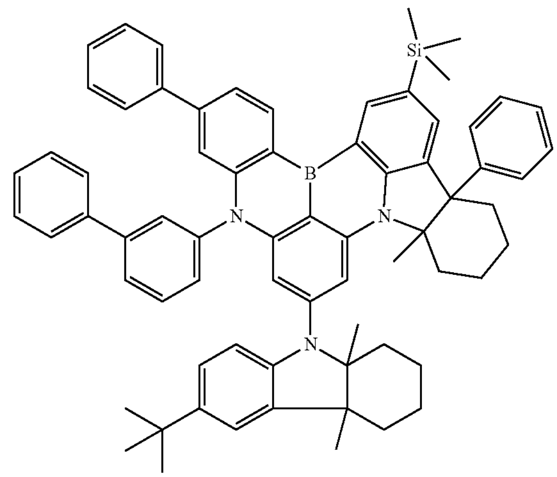 [SMILES: CC(C)(C)c1ccc2c(c1)C1(C)CCCCC1(C)N2c1cc2c3c(c1)N1c4c(cc([Si](C)(C)C)cc4C4(c5ccccc5)CCCCC14C)B3c1ccc(-c3ccccc3)cc1N2c1cccc(-c2ccccc2)c1]
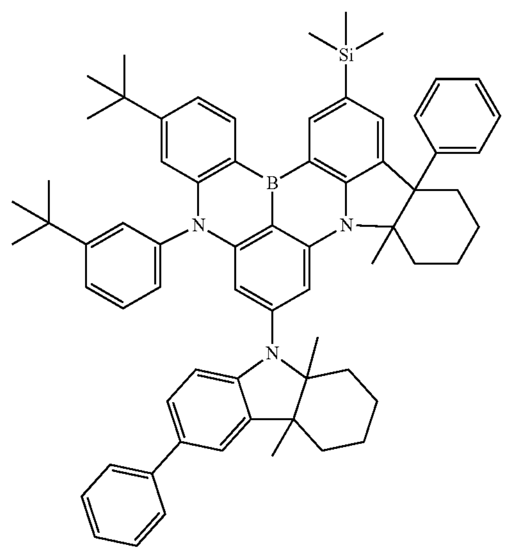
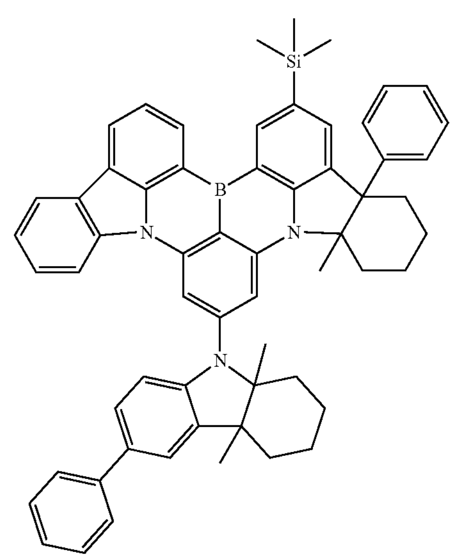

-continued
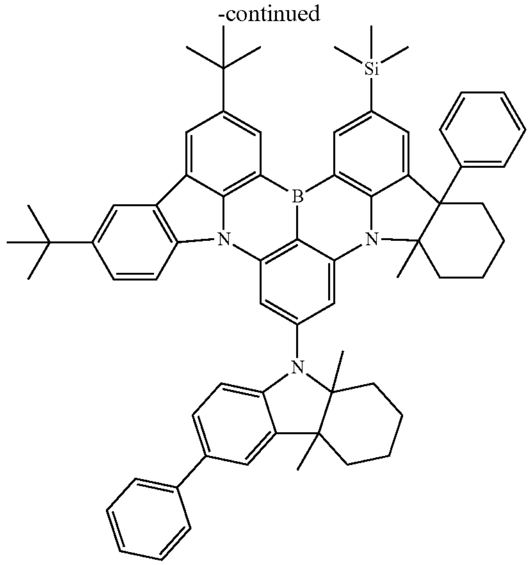
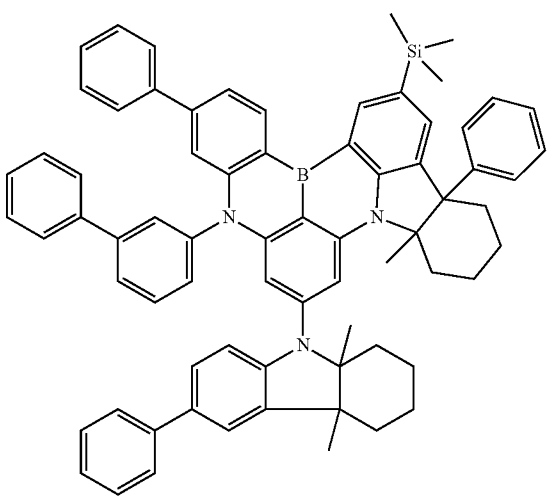 [SMILES: CC12CCCCC1(C)N(c1cc3c4c(c1)N1c5c(cc([Si](C)(C)C)cc5C5(c6ccccc6)CCCCC15C)B4c1ccc(-c4ccccc4)cc1N3c1cccc(-c3ccccc3)c1)c1ccc(-c3ccccc3)cc12]
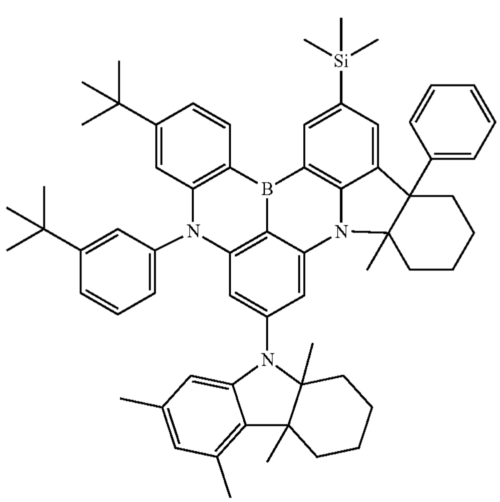
-continued
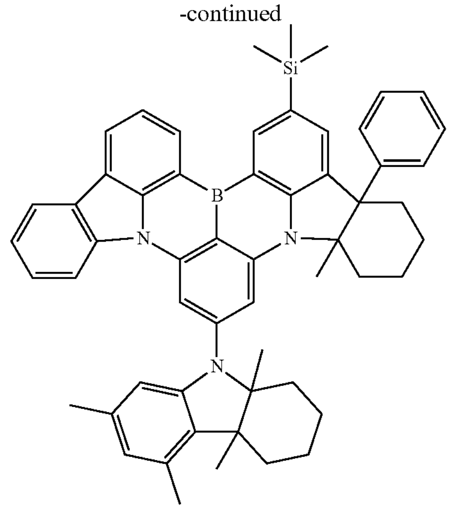
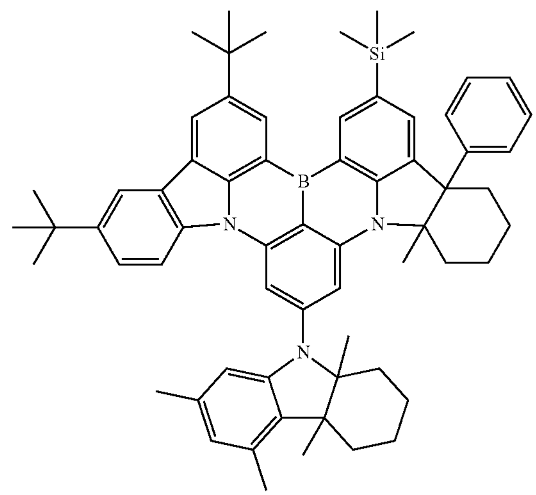
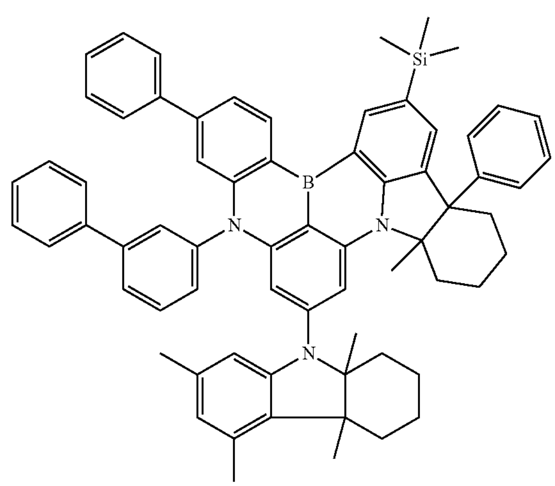 [SMILES: Cc1cc(C)c2c(c1)N(c1cc3c4c(c1)N1c5c(cc([Si](C)(C)C)cc5C5(c6ccccc6)CCCCC15C)B4c1ccc(-c4ccccc4)cc1N3c1cccc(-c3ccccc3)c1)C1(C)CCCCC21C]

-continued
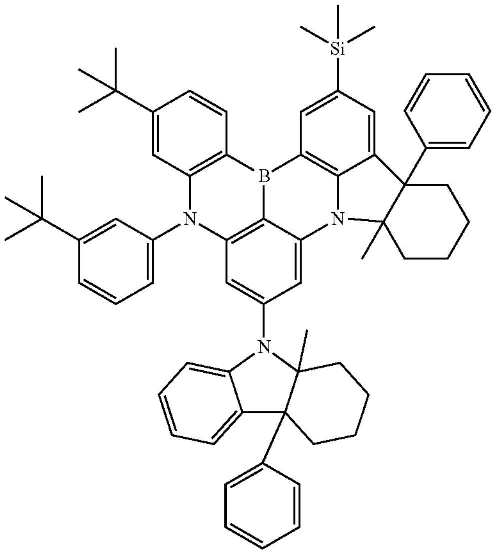
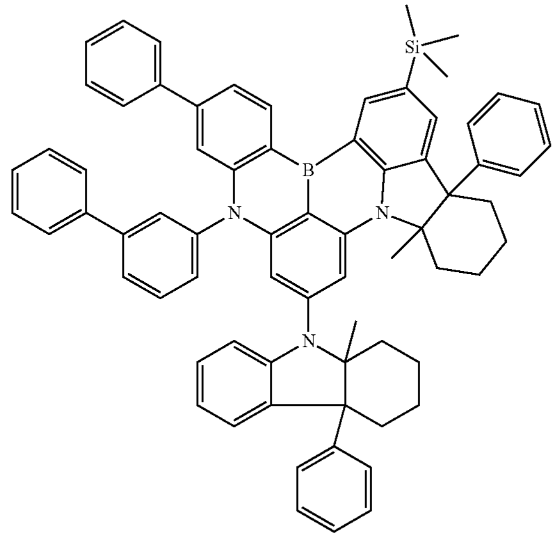 [SMILES: CC12CCCCC1(c1ccccc1)c1ccccc1N2c1cc2c3c(c1)N1c4c(cc([Si](C)(C)C)cc4C4(c5ccccc5)CCCCC14C)B3c1ccc(-c3ccccc3)cc1N2c1cccc(-c2ccccc2)c1]
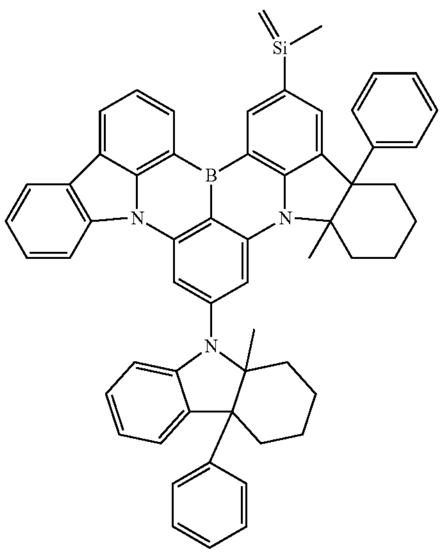
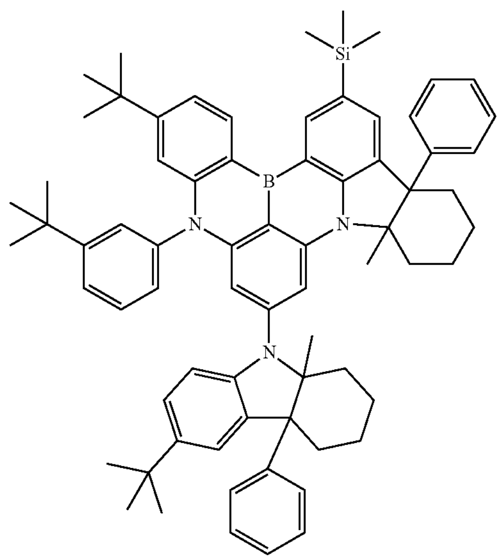
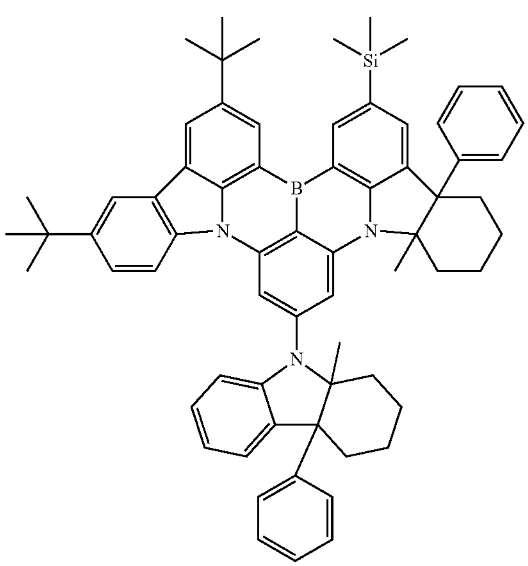
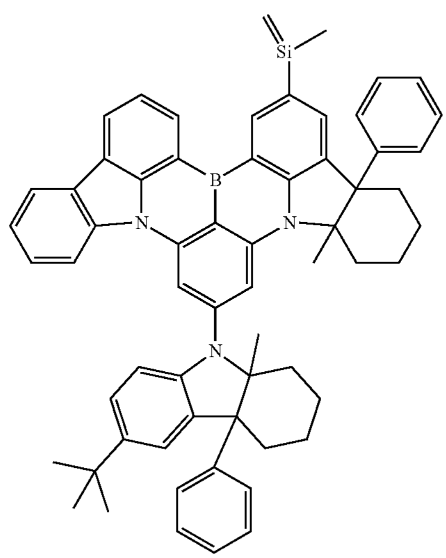
-continued -continued
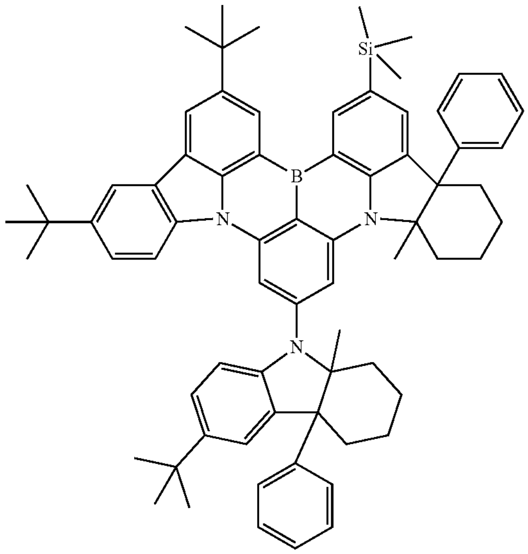
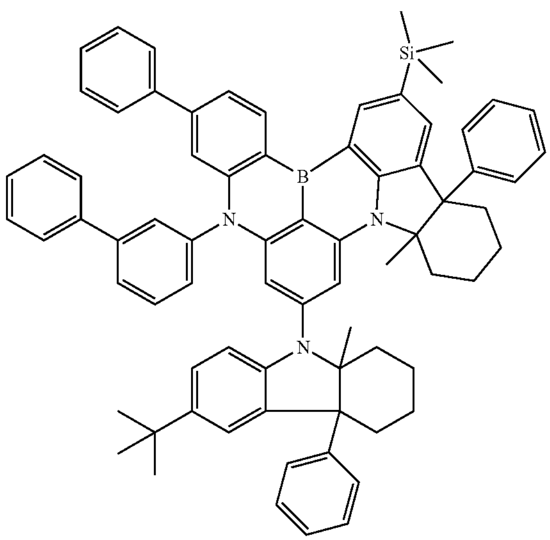 [SMILES: CC(C)(C)c1ccc2c(c1)C1(c3ccccc3)CCCCC1(C)N2c1cc2c3c(c1)N1c4c(cc([Si](C)(C)C)cc4C4(c5ccccc5)CCCCC14C)B3c1ccc(-c3ccccc3)cc1N2c1cccc(-c2ccccc2)c1]
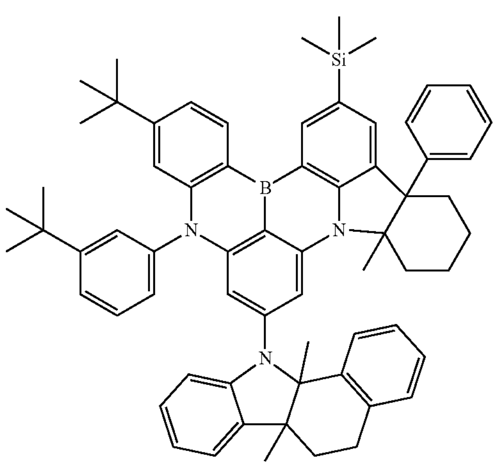
-continued
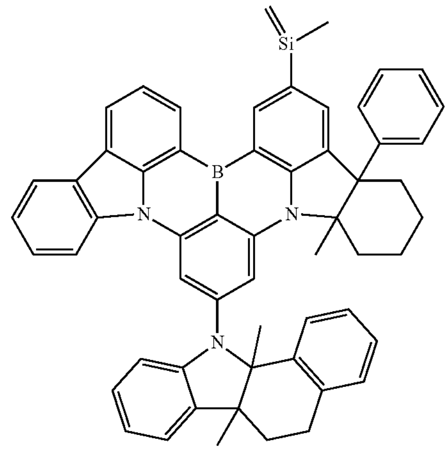
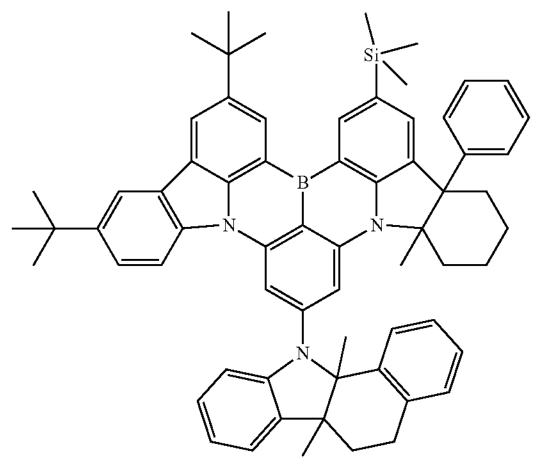
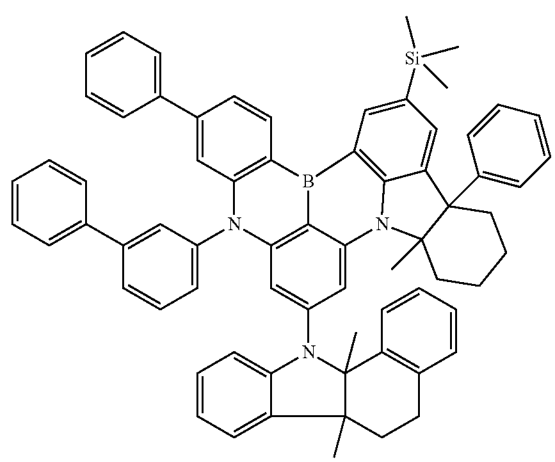

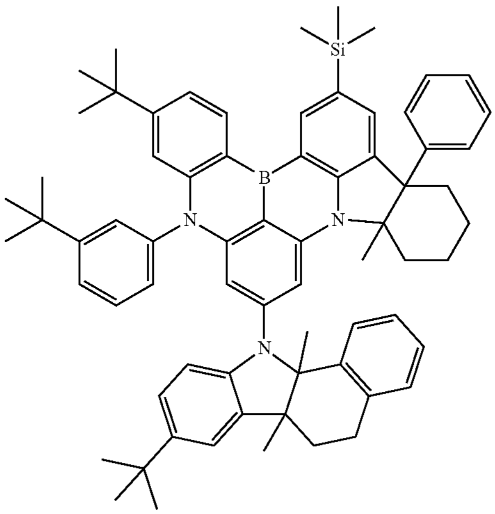
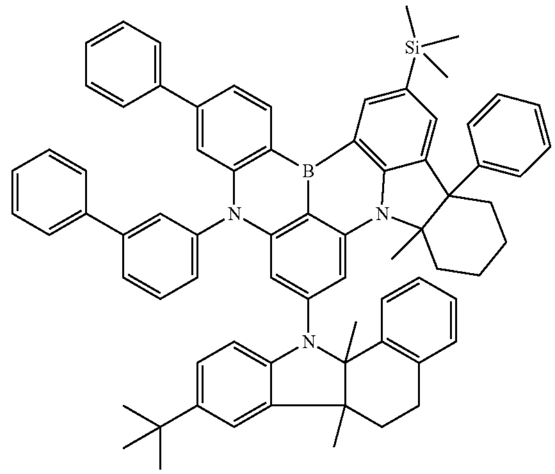 [SMILES: CC(C)(C)c1ccc2c(c1)C1(C)CCc3ccccc3C1(C)N2c1cc2c3c(c1)N1c4c(cc([Si](C)(C)C)cc4C4(c5ccccc5)CCCCC14C)B3c1ccc(-c3ccccc3)cc1N2c1cccc(-c2ccccc2)c1]
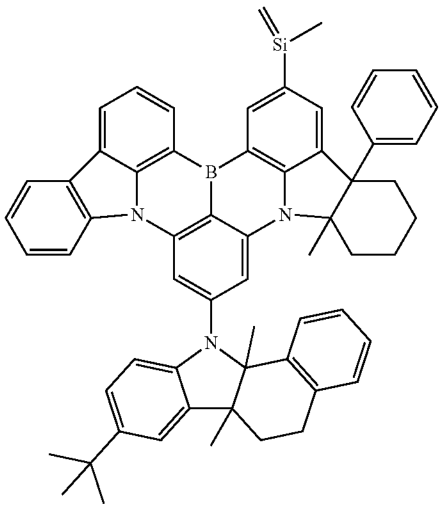
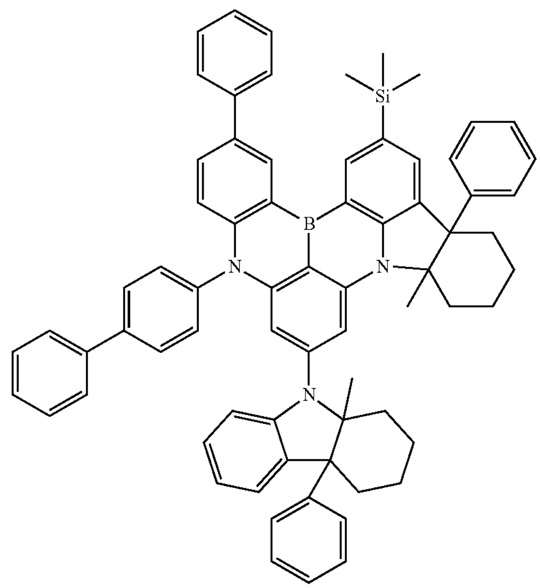
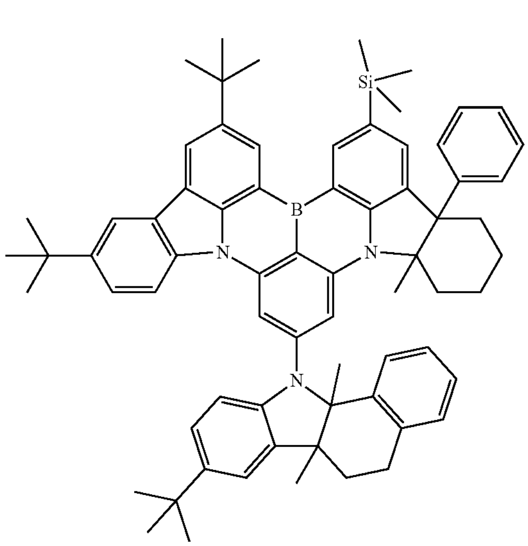
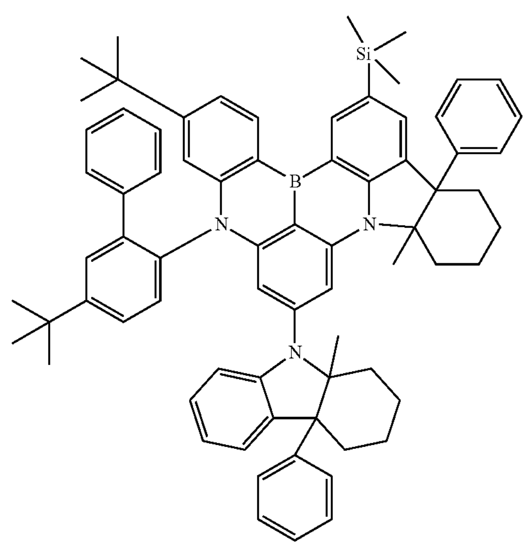

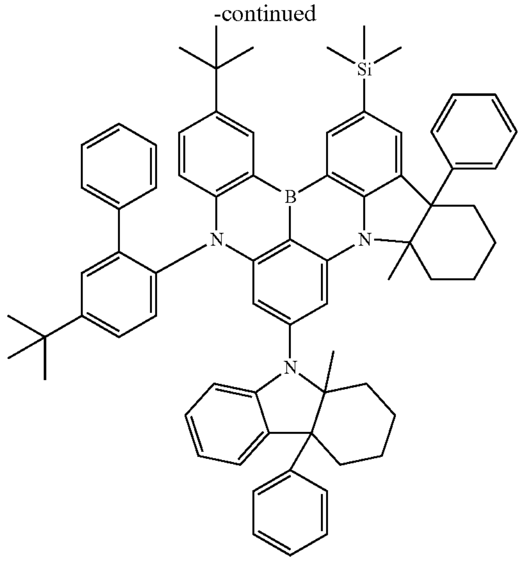
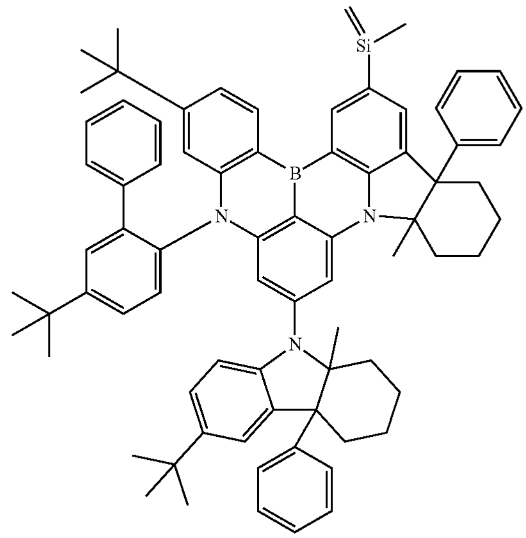
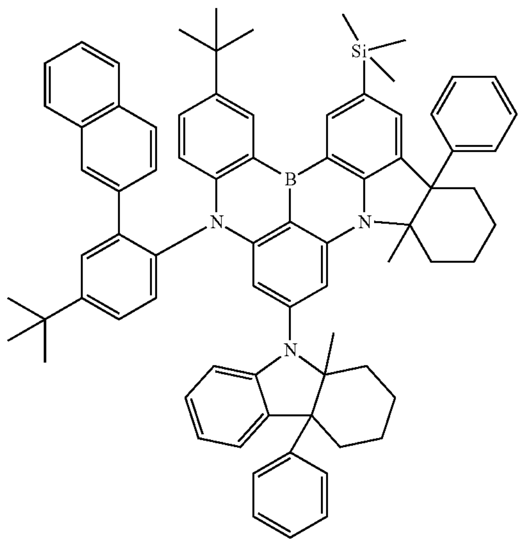 [SMILES: CC(C)(C)c1ccc2c(c1)B1c3cc([Si](C)(C)C)cc4c3N(c3cc(N5c6ccccc6C6(c7ccccc7)CCCCC56C)cc(c31)N2c1ccc(C(C)(C)C)cc1-c1ccc2ccccc2c1)C1(C)CCCCC41c1ccccc1]
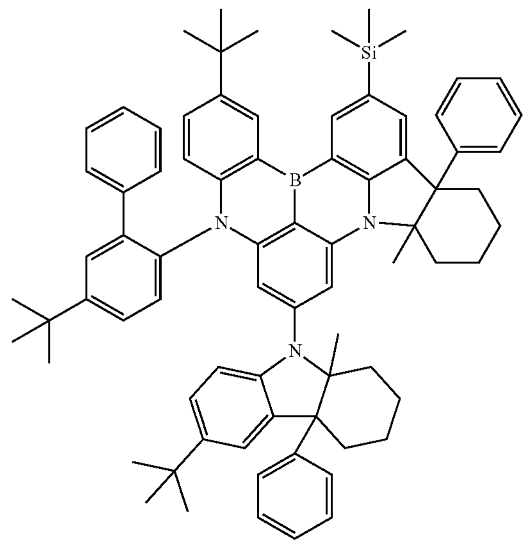
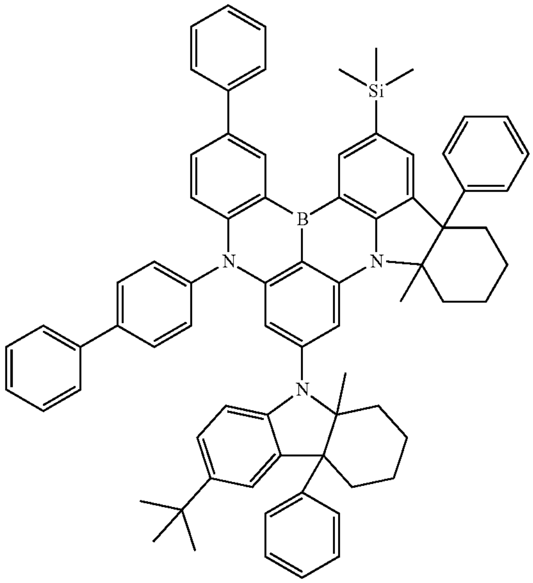
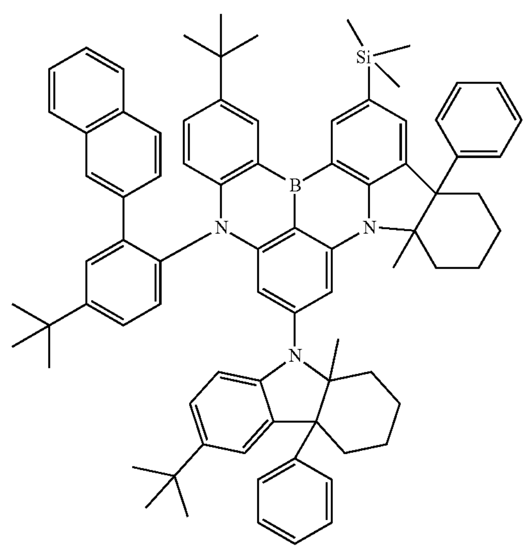 [SMILES: CC(C)(C)c1ccc2c(c1)B1c3cc([Si](C)(C)C)cc4c3N(c3cc(N5c6ccc(C(C)(C)C)cc6C6(c7ccccc7)CCCCC56C)cc(c31)N2c1ccc(C(C)(C)C)cc1-c1ccc2ccccc2c1)C1(C)CCCCC41c1ccccc1]

-continued
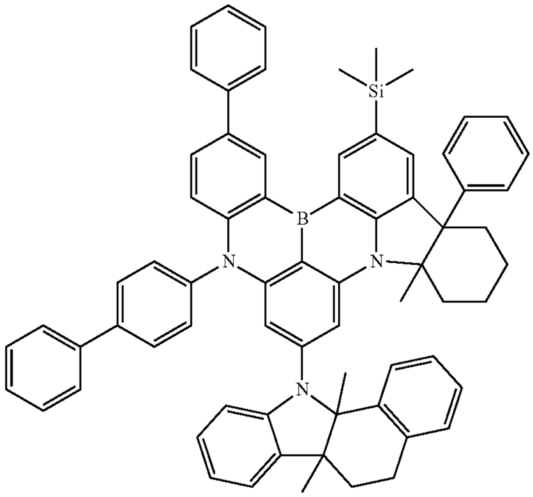
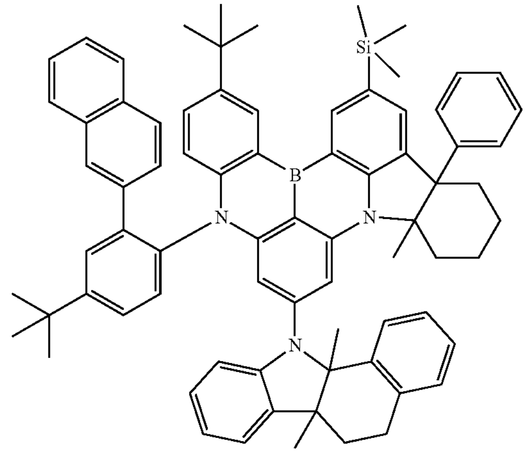 [SMILES: CC(C)(C)c1ccc2c(c1)B1c3cc([Si](C)(C)C)cc4c3N(c3cc(N5c6ccccc6C6(C)CCc7ccccc7C56C)cc(c31)N2c1ccc(C(C)(C)C)cc1-c1ccc2ccccc2c1)C1(C)CCCCC41c1ccccc1]
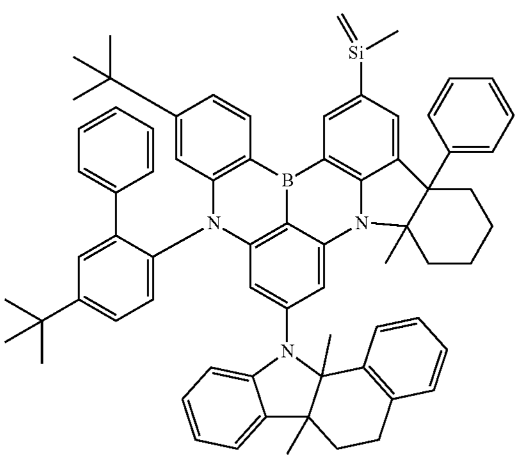
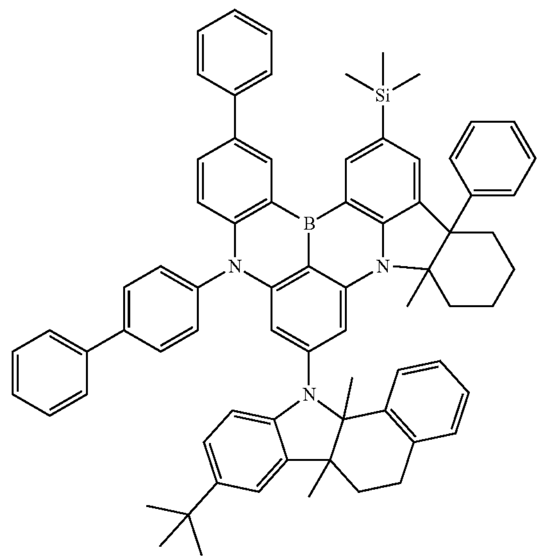
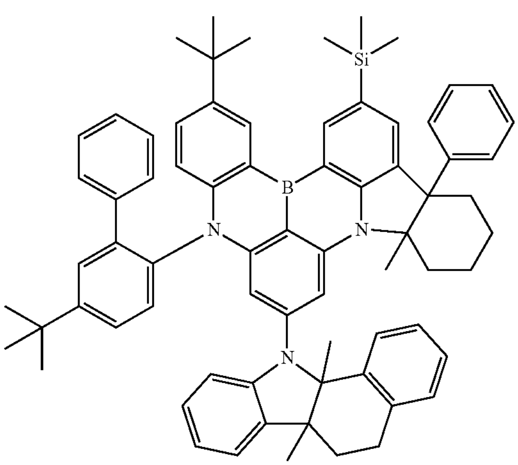
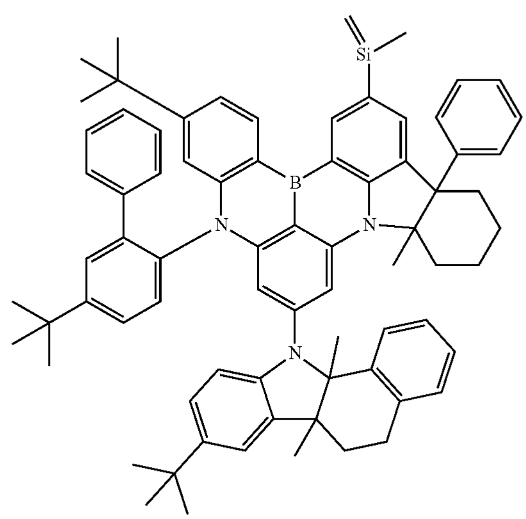
-continued -continued
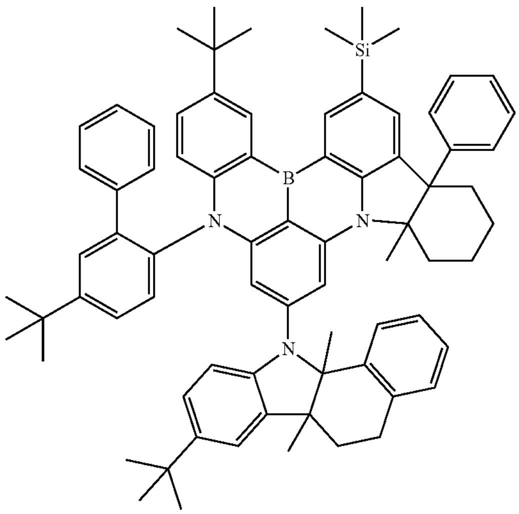
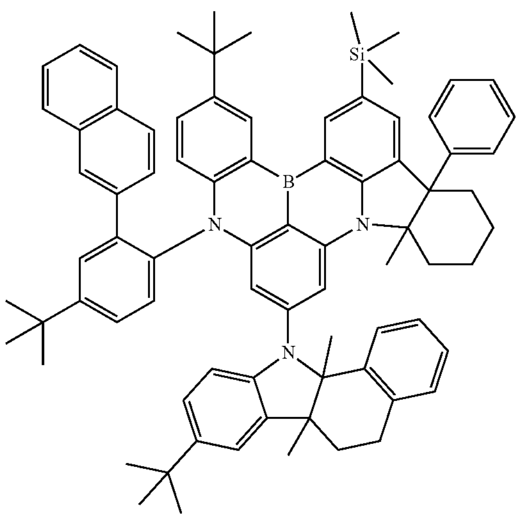 [SMILES: CC(C)(C)c1ccc2c(c1)B1c3cc([Si](C)(C)C)cc4c3N(c3cc(N5c6ccc(C(C)(C)C)cc6C6(C)CCc7ccccc7C56C)cc(c31)N2c1ccc(C(C)(C)C)cc1-c1ccc2ccccc2c1)C1(C)CCCCC41c1ccccc1]
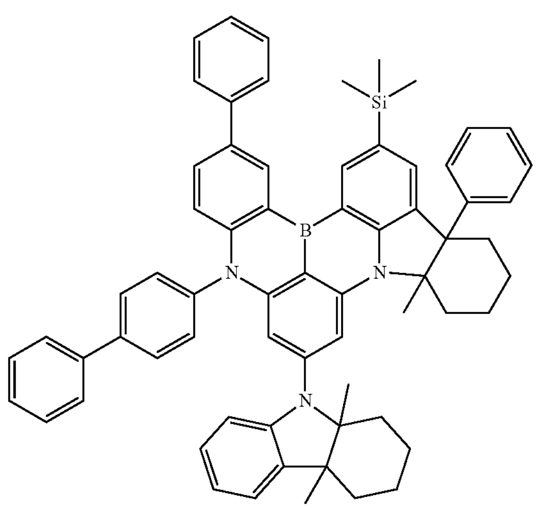
-continued
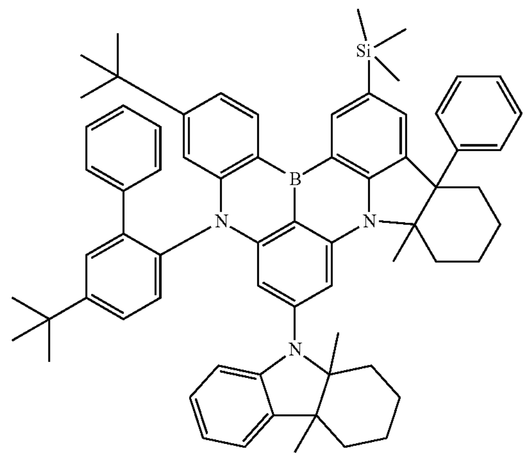
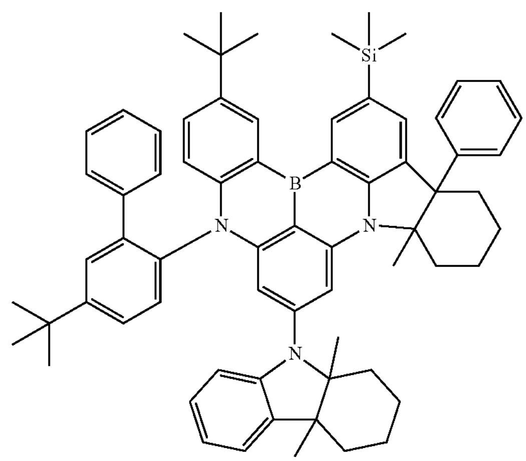
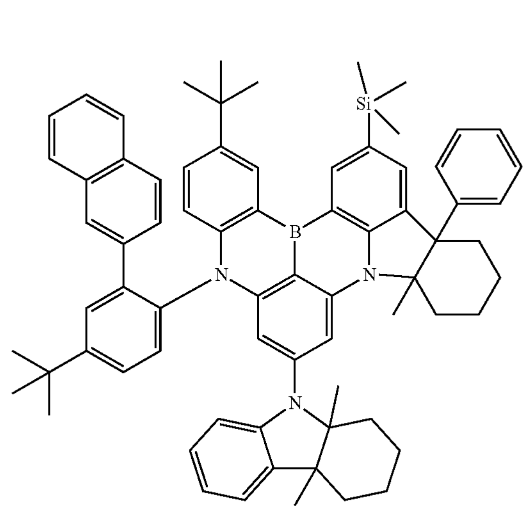 [SMILES: CC(C)(C)c1ccc2c(c1)B1c3cc([Si](C)(C)C)cc4c3N(c3cc(N5c6ccccc6C6(C)CCCCC56C)cc(c31)N2c1ccc(C(C)(C)C)cc1-c1ccc2ccccc2c1)C1(C)CCCCC41c1ccccc1]

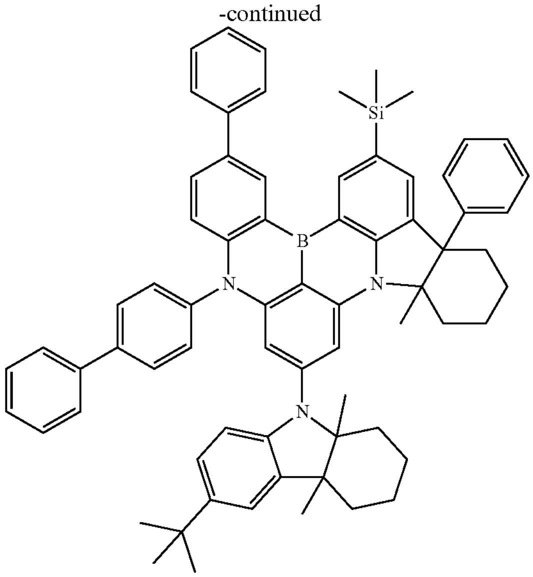
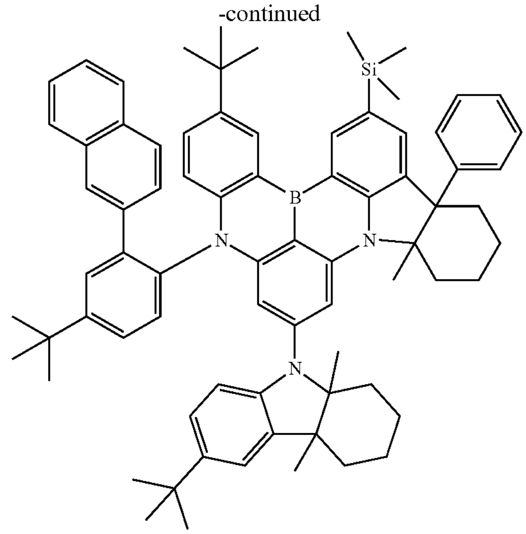
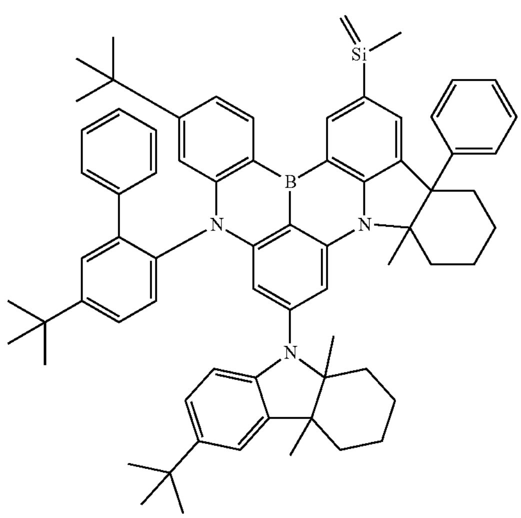
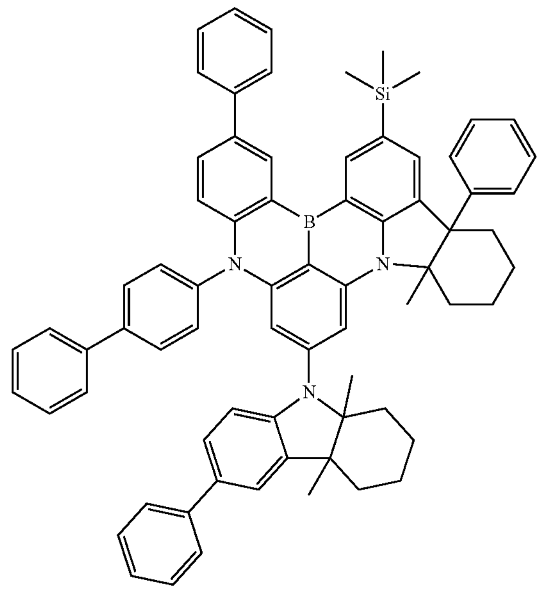
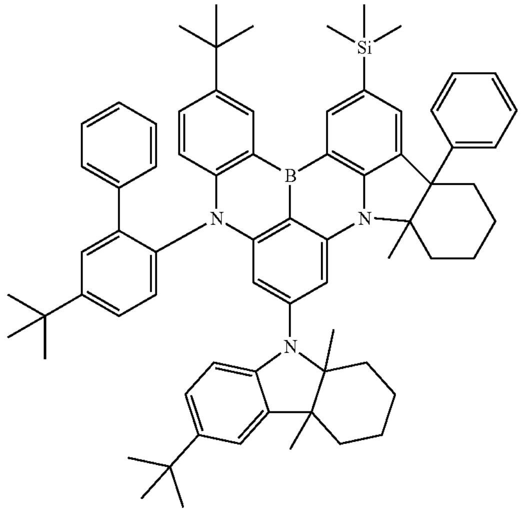 [SMILES: CC(C)(C)c1ccc2c(c1)B1c3cc([Si](C)(C)C)cc4c3N(c3cc(N5c6ccc(C(C)(C)C)cc6C6(C)CCCCC56C)cc(c31)N2c1ccc(C(C)(C)C)cc1-c1ccc2ccccc2c1)C1(C)CCCCC41c1ccccc1]
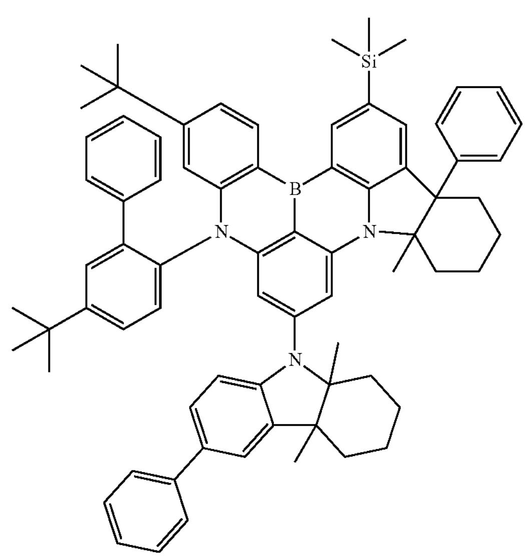
Si
B
N
N
N -continued
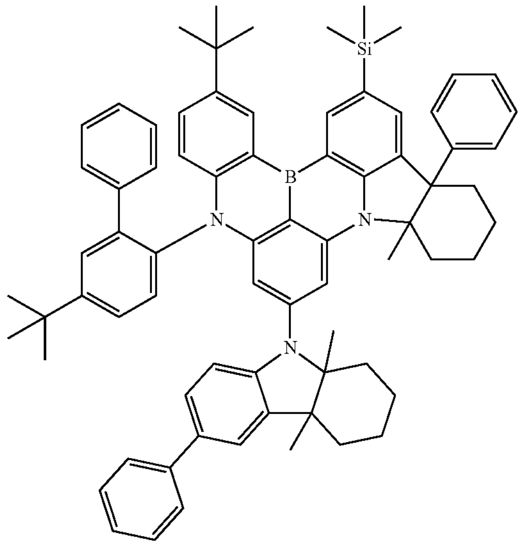
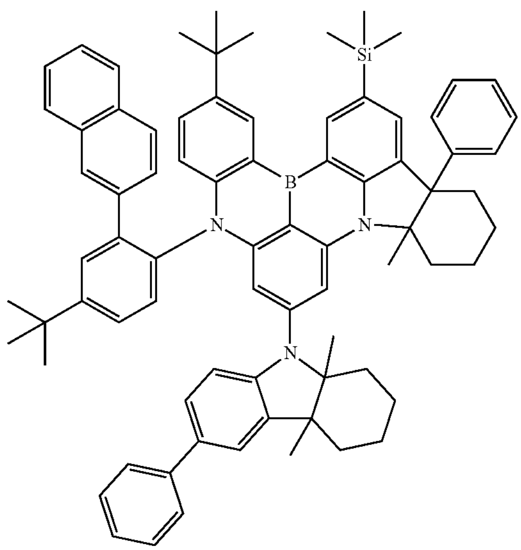 [SMILES: CC(C)(C)c1ccc2c(c1)B1c3cc([Si](C)(C)C)cc4c3N(c3cc(N5c6ccc(-c7ccccc7)cc6C6(C)CCCCC56C)cc(c31)N2c1ccc(C(C)(C)C)cc1-c1ccc2ccccc2c1)C1(C)CCCCC41c1ccccc1]
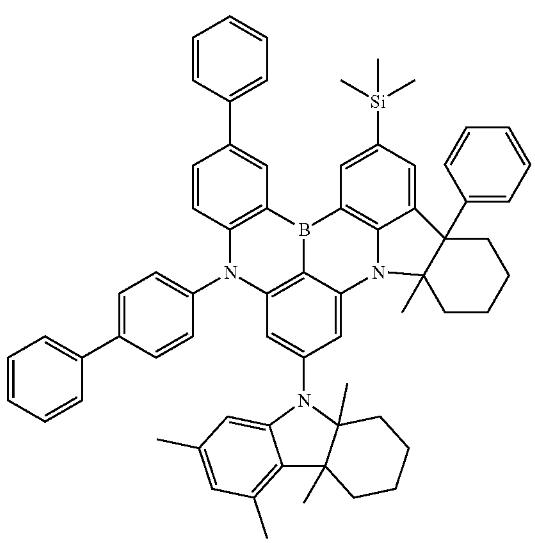
-continued
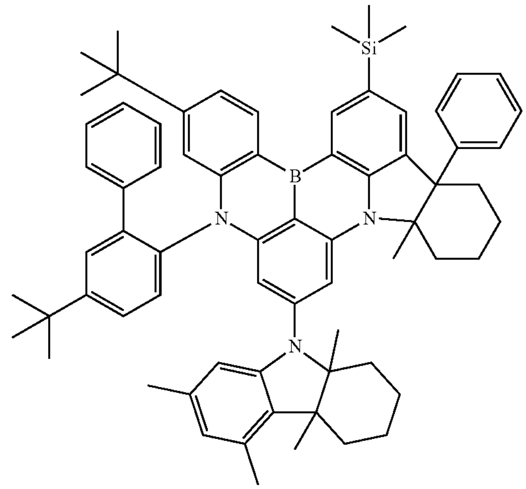
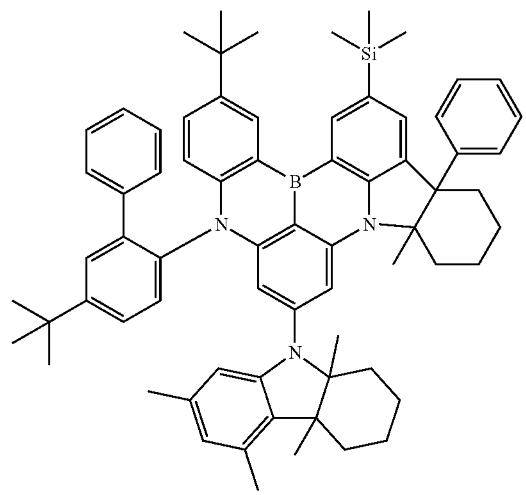
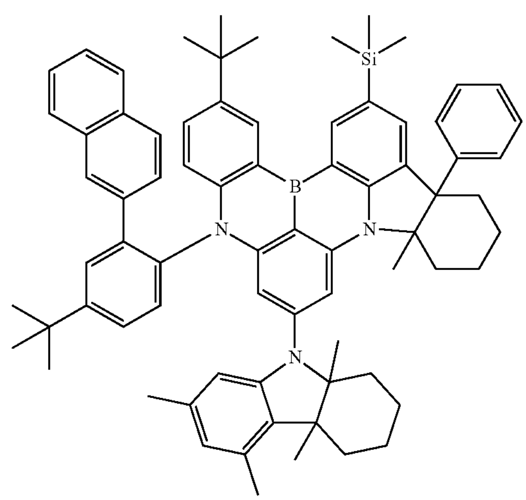 [SMILES: Cc1cc(C)c2c(c1)N(c1cc3c4c(c1)N1c5c(cc([Si](C)(C)C)cc5C5(c6ccccc6)CCCCC15C)B4c1cc(C(C)(C)C)ccc1N3c1ccc(C(C)(C)C)cc1-c1ccc3ccccc3c1)C1(C)CCCCC21C]

-continued
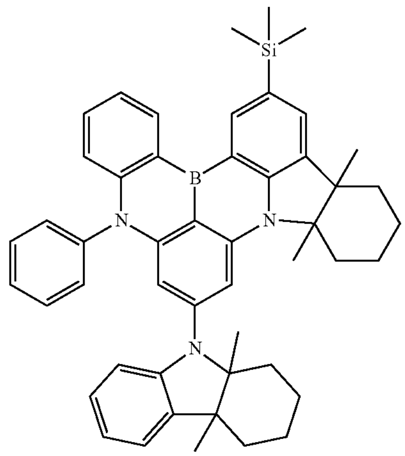
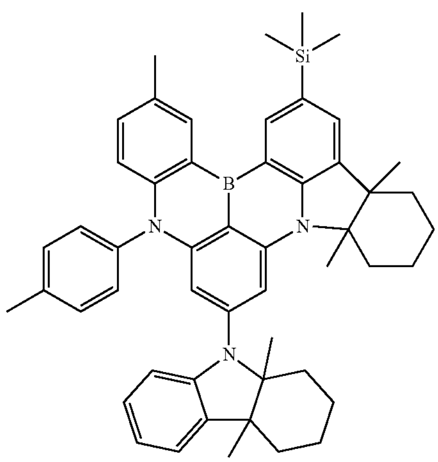
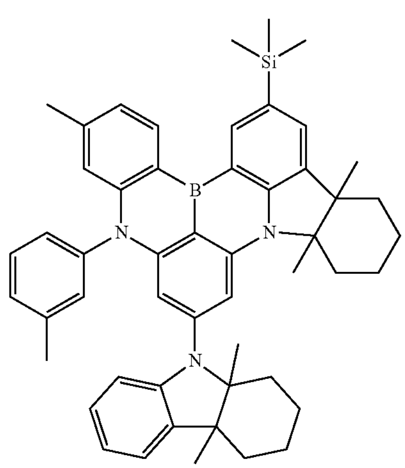
-continued
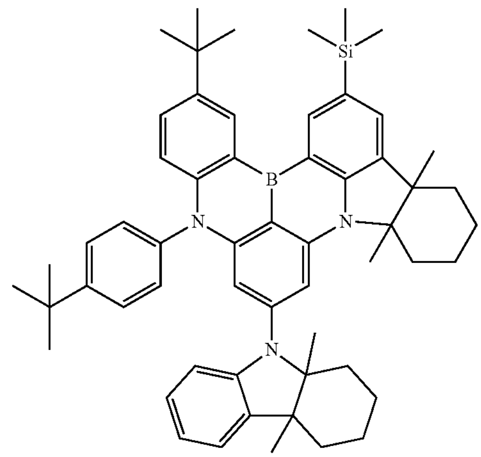
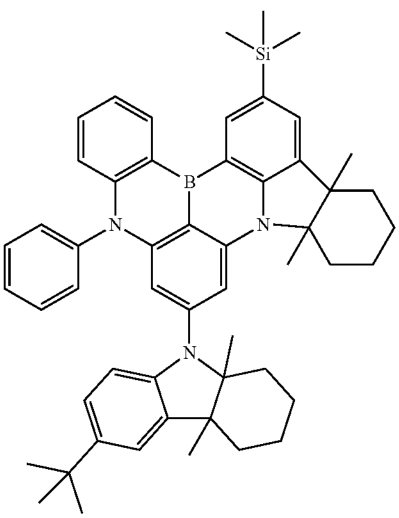
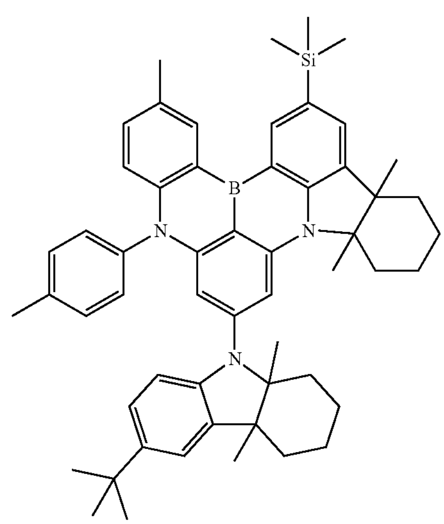

-continued
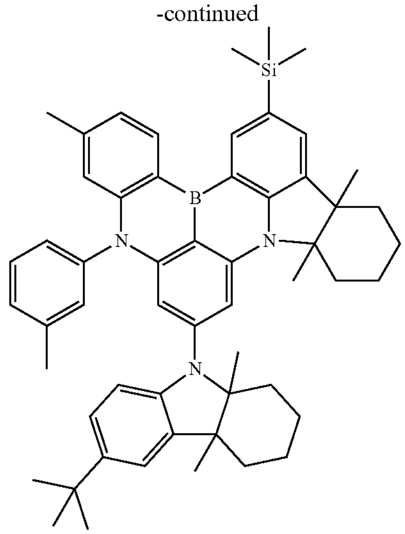
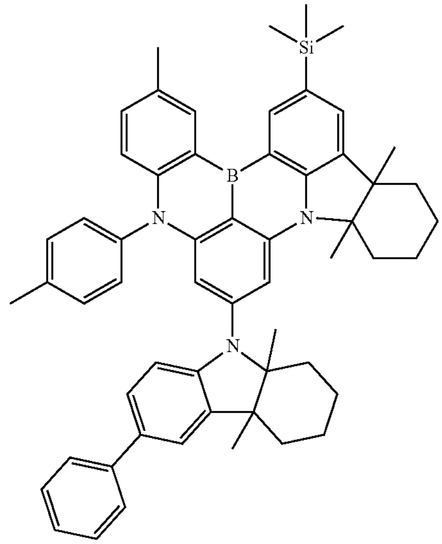
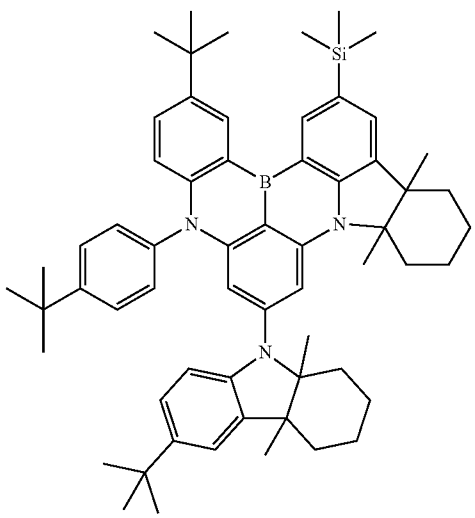 [SMILES: CC(C)(C)c1ccc(N2c3ccc(C(C)(C)C)cc3B3c4cc([Si](C)(C)C)cc5c4N(c4cc(N6c7ccc(C(C)(C)C)cc7C7(C)CCCCC67C)cc2c43)C2(C)CCCCC52C)cc1]
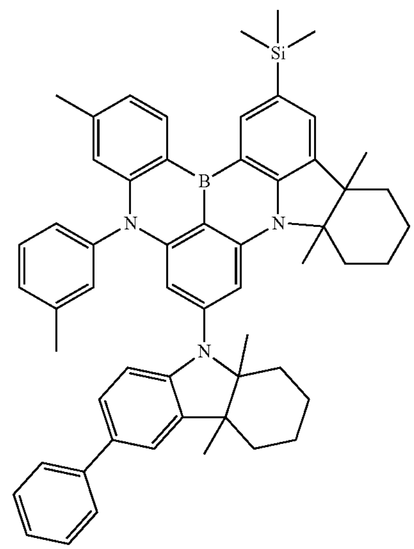
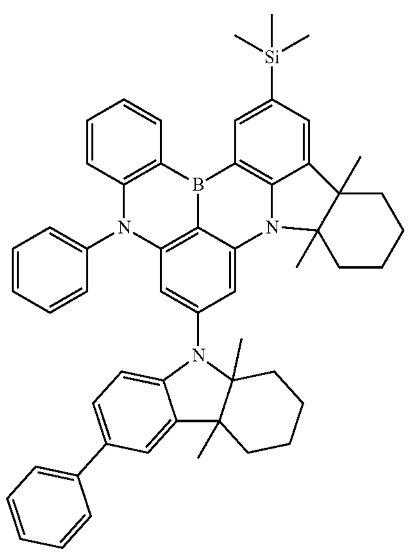
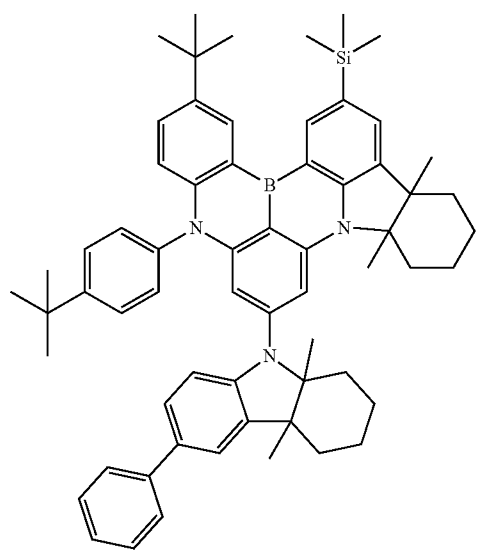 [SMILES: CC(C)(C)c1ccc(N2c3ccc(C(C)(C)C)cc3B3c4cc([Si](C)(C)C)cc5c4N(c4cc(N6c7ccc(-c8ccccc8)cc7C7(C)CCCCC67C)cc2c43)C2(C)CCCCC52C)cc1]
-continued -continued
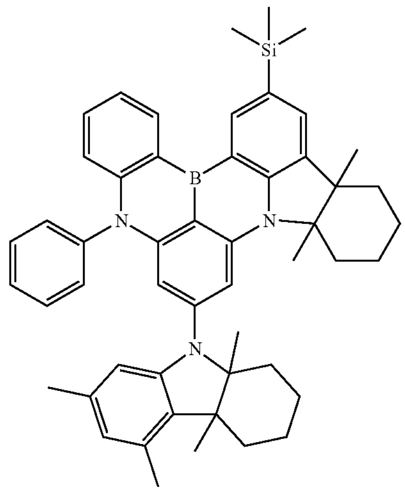
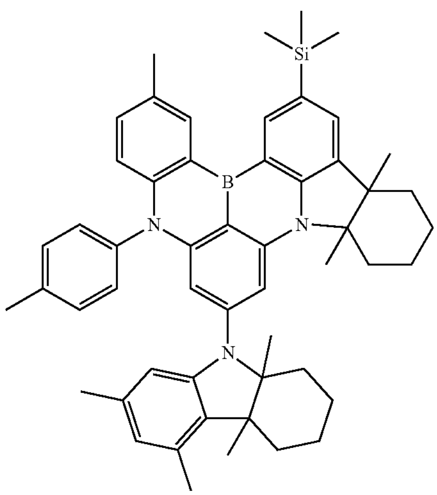
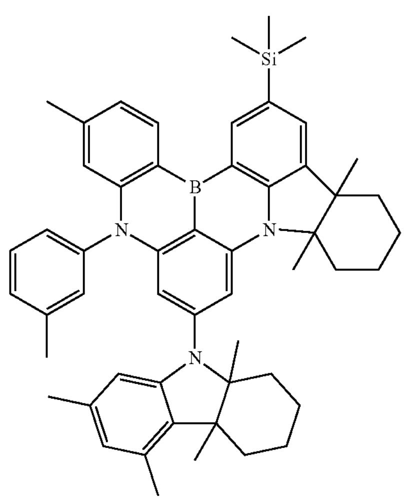
-continued
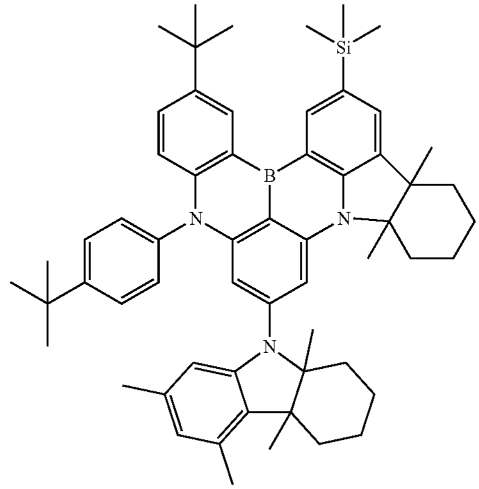 [SMILES: Cc1cc(C)c2c(c1)N(c1cc3c4c(c1)N1c5c(cc([Si](C)(C)C)cc5C5(C)CCCCC15C)B4c1cc(C(C)(C)C)ccc1N3c1ccc(C(C)(C)C)cc1)C1(C)CCCCC21C]
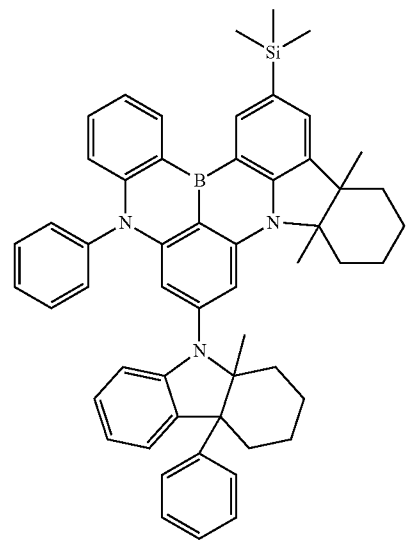
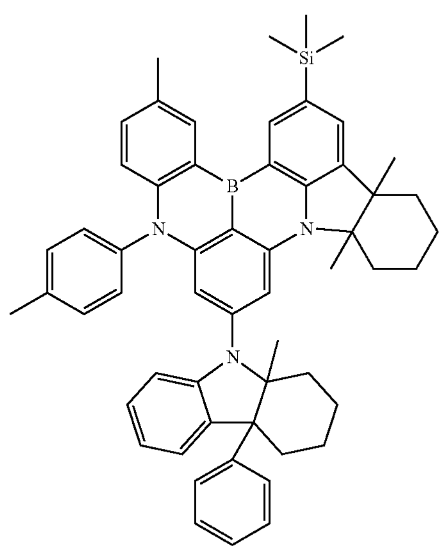

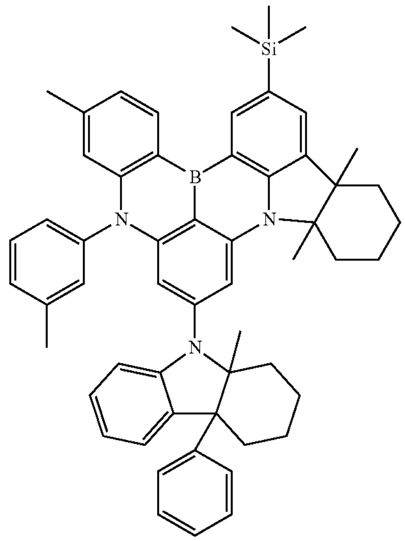
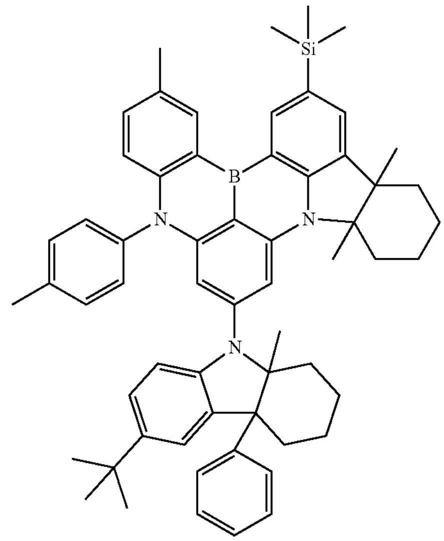
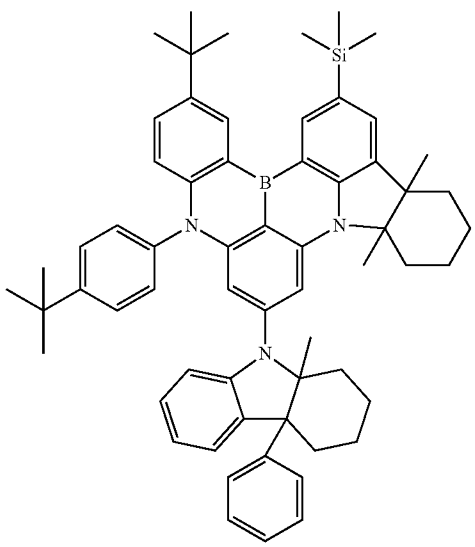 [SMILES: CC(C)(C)c1ccc(N2c3ccc(C(C)(C)C)cc3B3c4cc([Si](C)(C)C)cc5c4N(c4cc(N6c7ccccc7C7(c8ccccc8)CCCCC67C)cc2c43)C2(C)CCCCC52C)cc1]
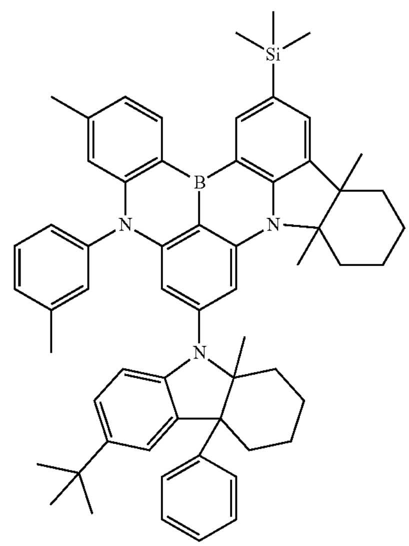
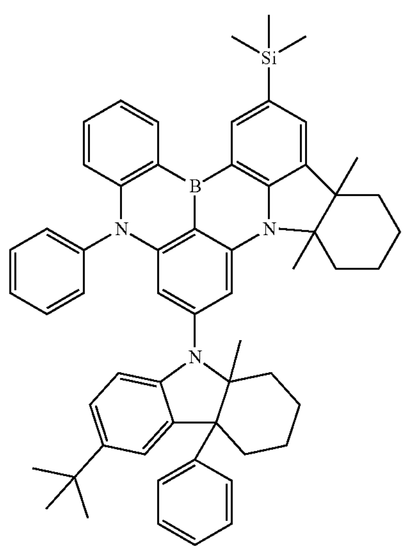
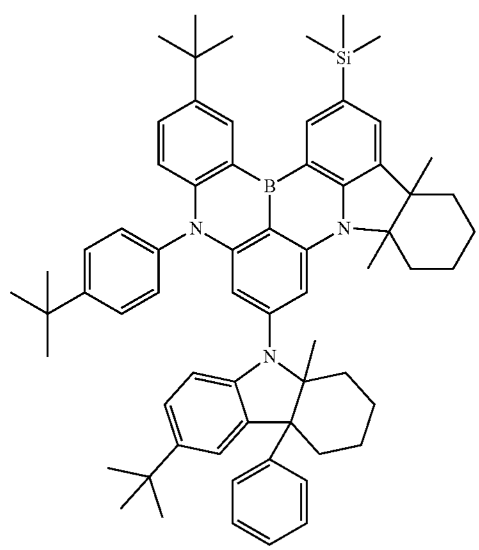 [SMILES: CC(C)(C)c1ccc(N2c3ccc(C(C)(C)C)cc3B3c4cc([Si](C)(C)C)cc5c4N(c4cc(N6c7ccc(C(C)(C)C)cc7C7(c8ccccc8)CCCCC67C)cc2c43)C2(C)CCCCC52C)cc1]
Si
B
N
N
N

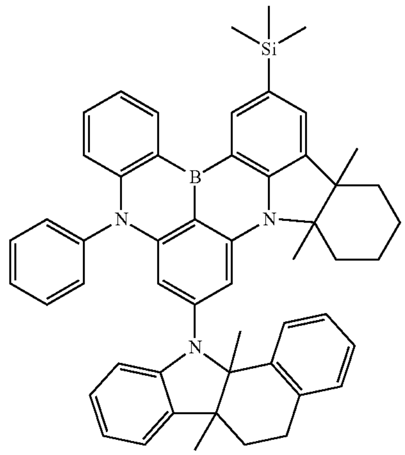
Si
B
N
N
N
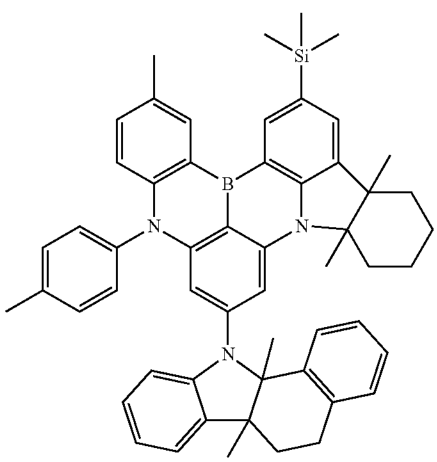
Si
B
N
N
N
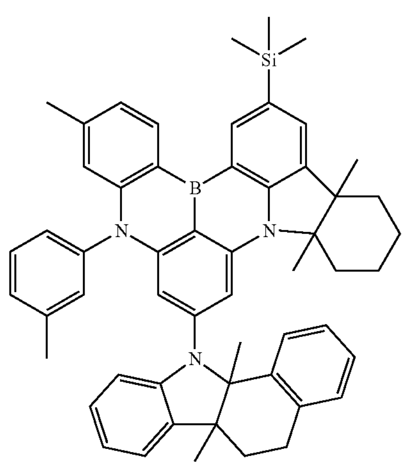
Si
B
N
N
N
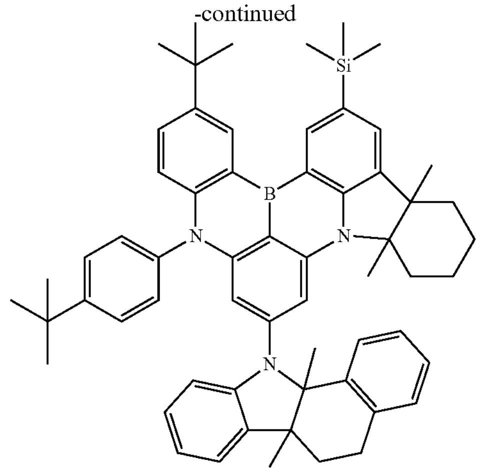
Si
B
N
N
N
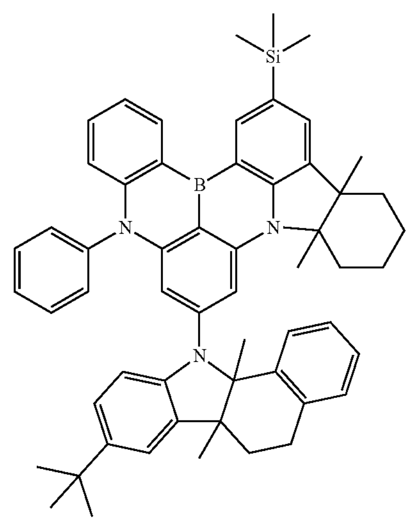
Si
B
N
N
N
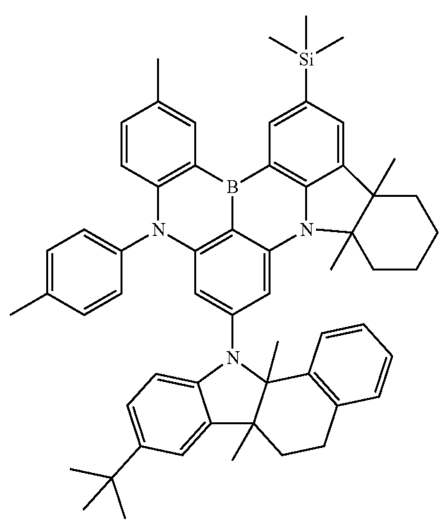
Si
B
N
N
N -continued
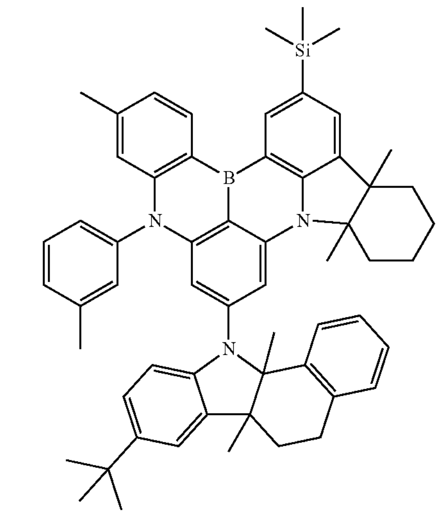
-continued
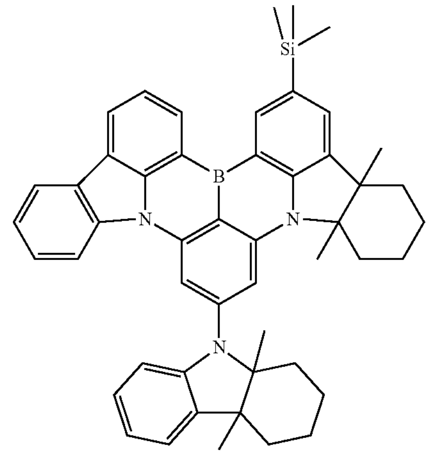
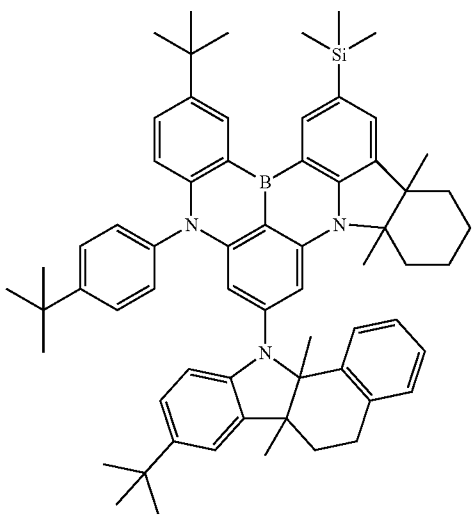 [SMILES: CC(C)(C)c1ccc(N2c3ccc(C(C)(C)C)cc3B3c4cc([Si](C)(C)C)cc5c4N(c4cc(N6c7ccc(C(C)(C)C)cc7C7(C)CCc8ccccc8C67C)cc2c43)C2(C)CCCCC52C)cc1]
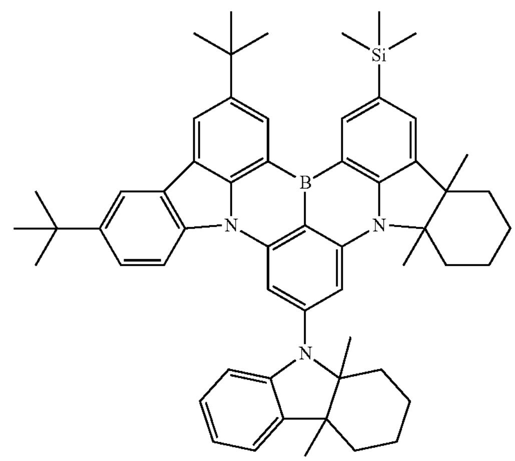
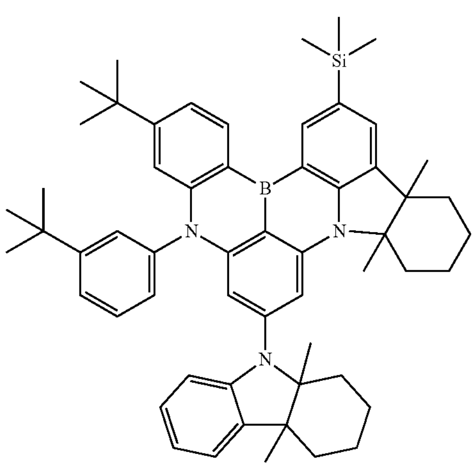
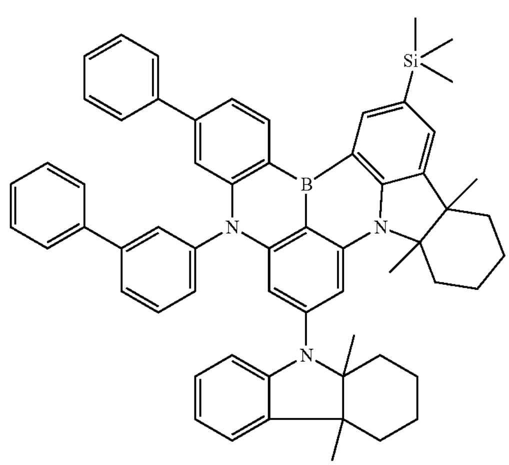

-continued
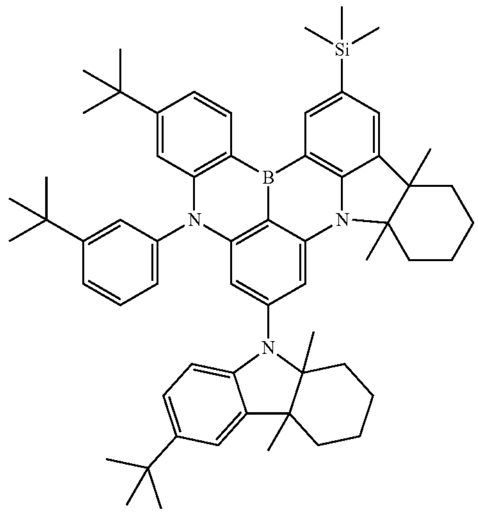
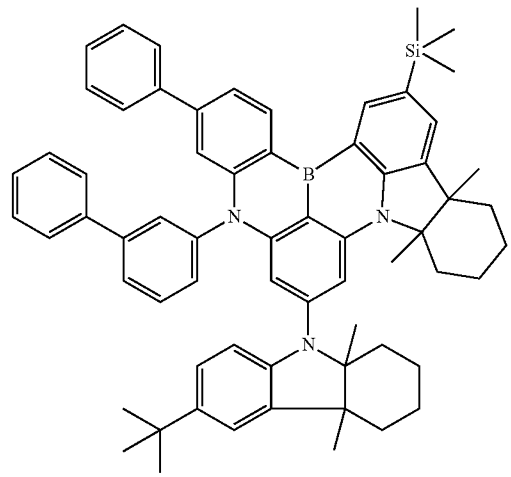 [SMILES: CC(C)(C)c1ccc2c(c1)C1(C)CCCCC1(C)N2c1cc2c3c(c1)N1c4c(cc([Si](C)(C)C)cc4C4(C)CCCCC14C)B3c1ccc(-c3ccccc3)cc1N2c1cccc(-c2ccccc2)c1]
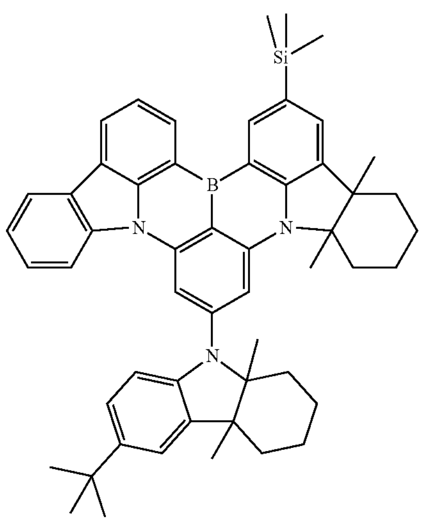
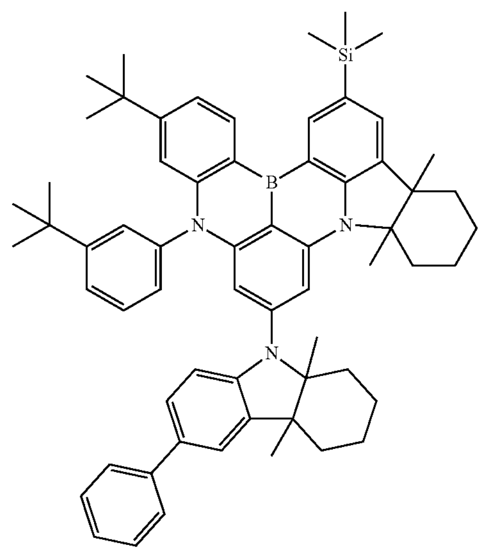
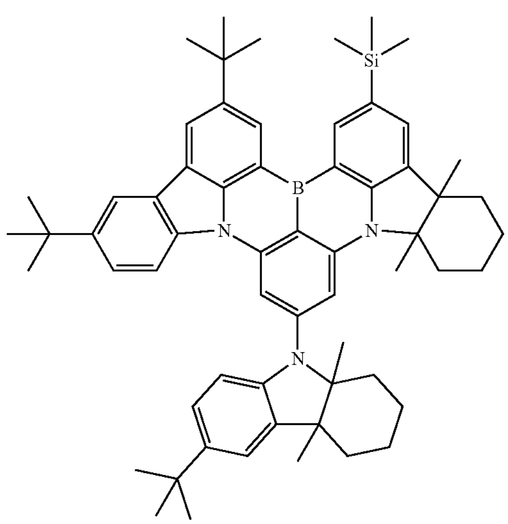
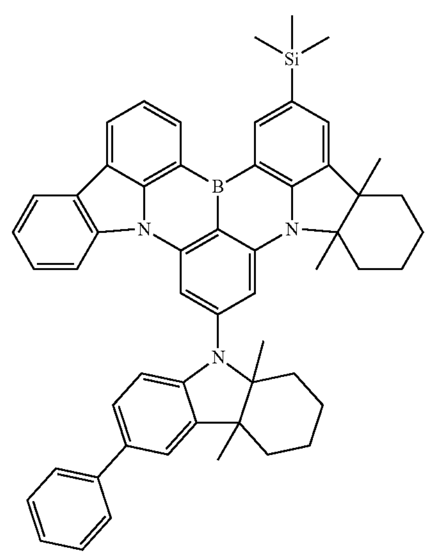
-continued -continued
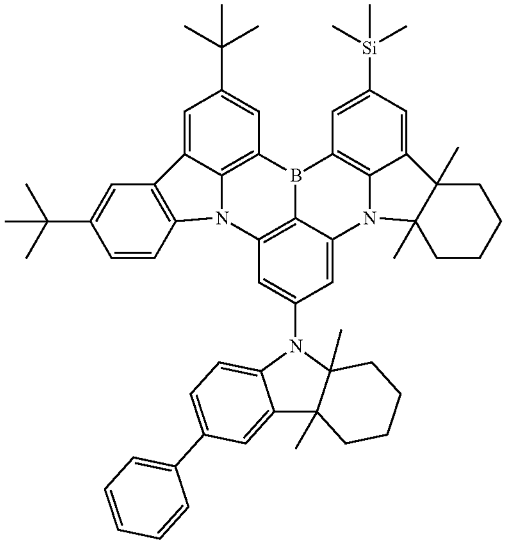
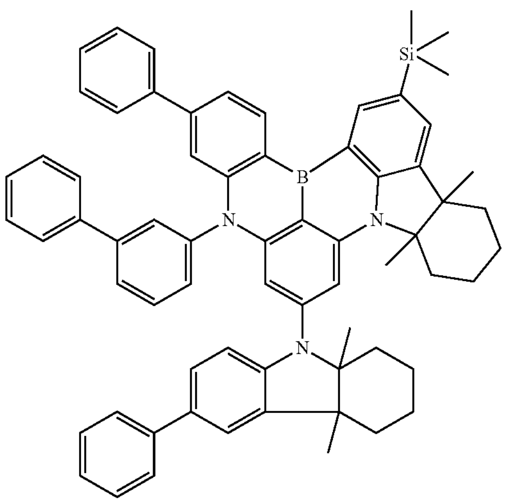 [SMILES: CC12CCCCC1(C)N(c1cc3c4c(c1)N1c5c(cc([Si](C)(C)C)cc5C5(C)CCCCC15C)B4c1ccc(-c4ccccc4)cc1N3c1cccc(-c3ccccc3)c1)c1ccc(-c3ccccc3)cc12]
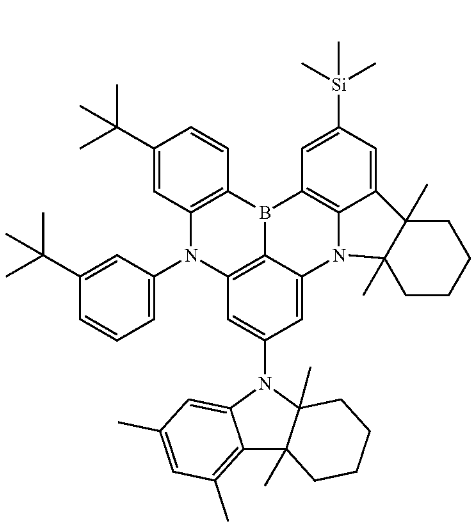
-continued
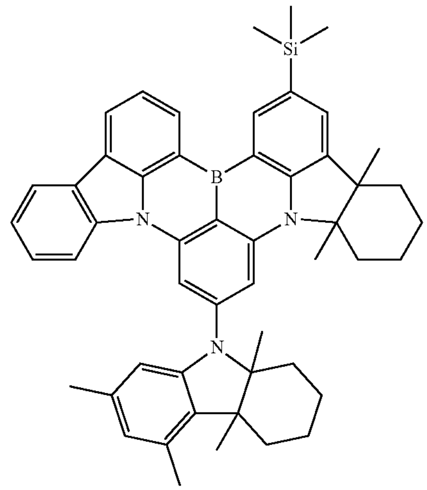
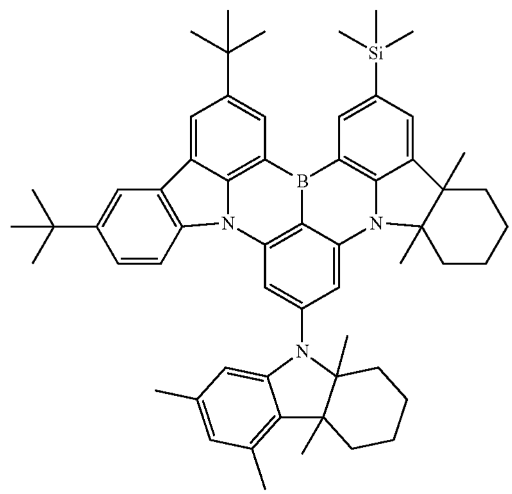
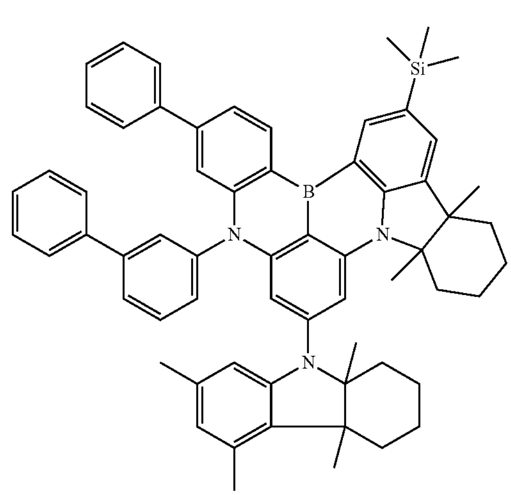 [SMILES: Cc1cc(C)c2c(c1)N(c1cc3c4c(c1)N1c5c(cc([Si](C)(C)C)cc5C5(C)CCCCC15C)B4c1ccc(-c4ccccc4)cc1N3c1cccc(-c3ccccc3)c1)C1(C)CCCCC21C]

-continued
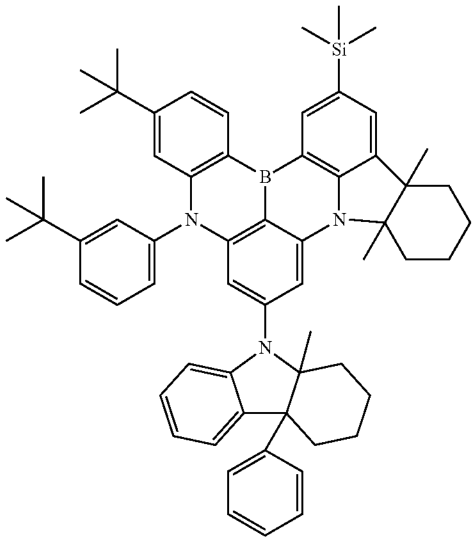
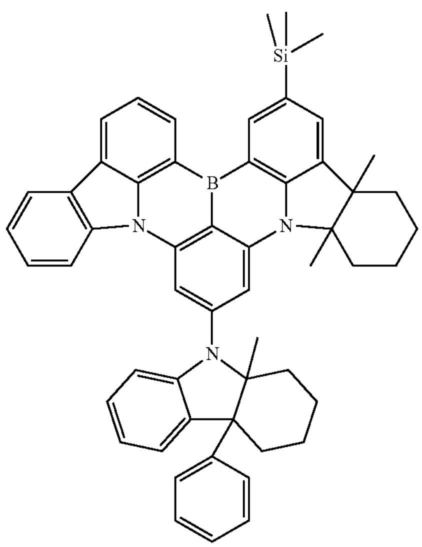
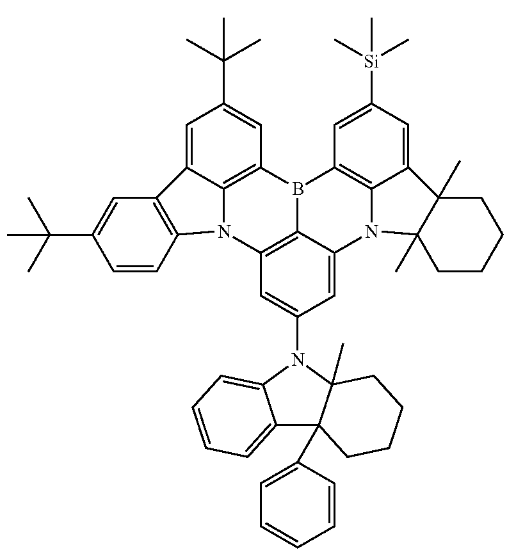
-continued
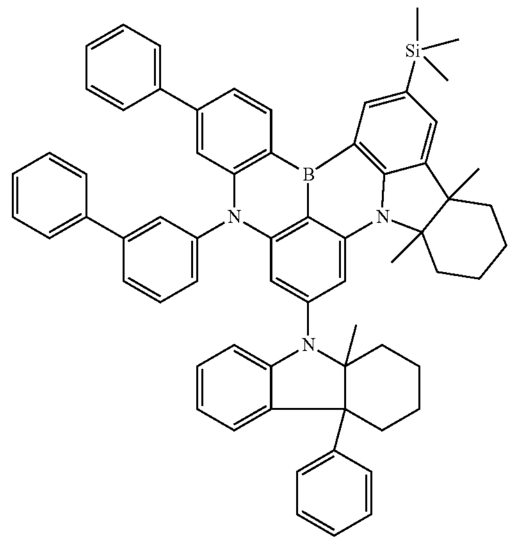 [SMILES: CC12CCCCC1(C)N1c3cc(N4c5ccccc5C5(c6ccccc6)CCCCC45C)cc4c3B(c3ccc(-c5ccccc5)cc3N4c3cccc(-c4ccccc4)c3)c3cc([Si](C)(C)C)cc2c31]
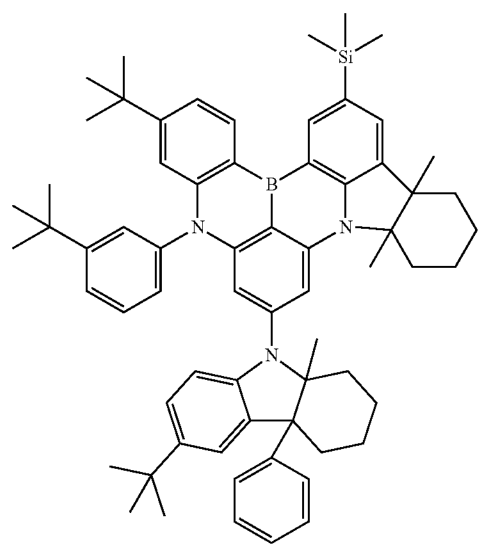
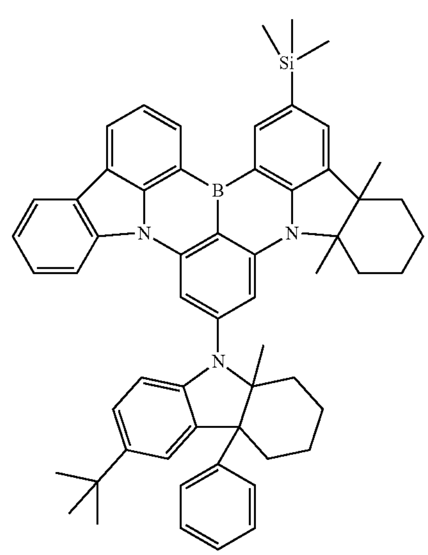

-continued
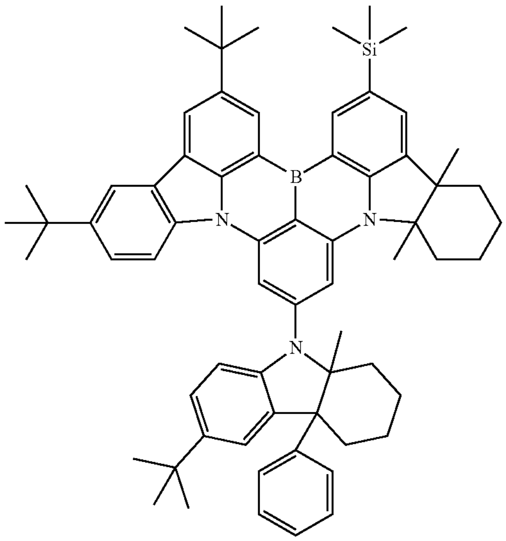
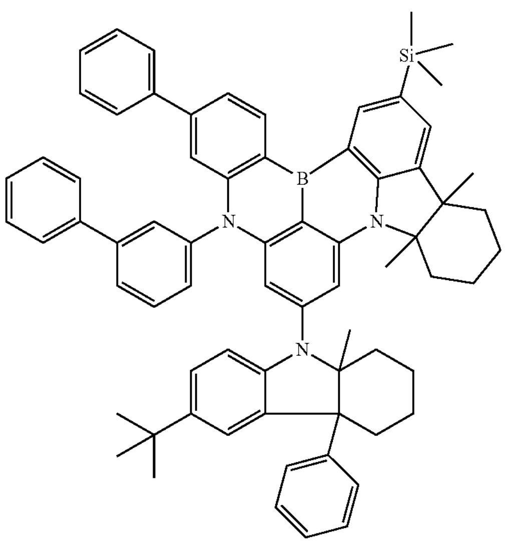 [SMILES: CC(C)(C)c1ccc2c(c1)C1(c3ccccc3)CCCCC1(C)N2c1cc2c3c(c1)N1c4c(cc([Si](C)(C)C)cc4C4(C)CCCCC14C)B3c1ccc(-c3ccccc3)cc1N2c1cccc(-c2ccccc2)c1]
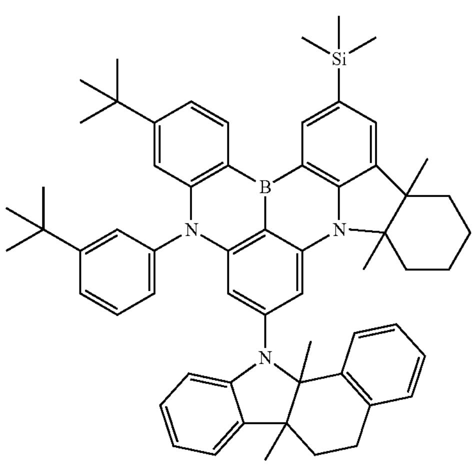
-continued
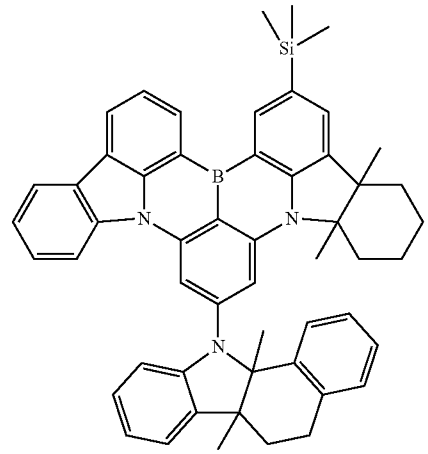
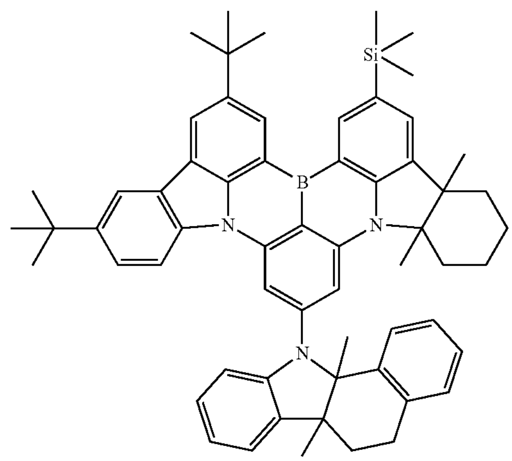
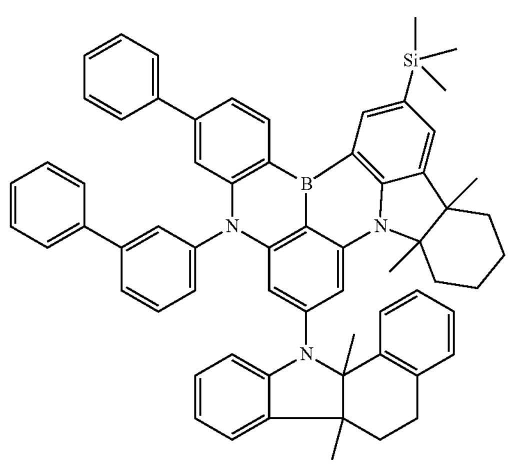 [SMILES: CC12CCCCC1(C)N1c3cc(N4c5ccccc5C5(C)CCc6ccccc6C45C)cc4c3B(c3ccc(-c5ccccc5)cc3N4c3cccc(-c4ccccc4)c3)c3cc([Si](C)(C)C)cc2c31]

-continued
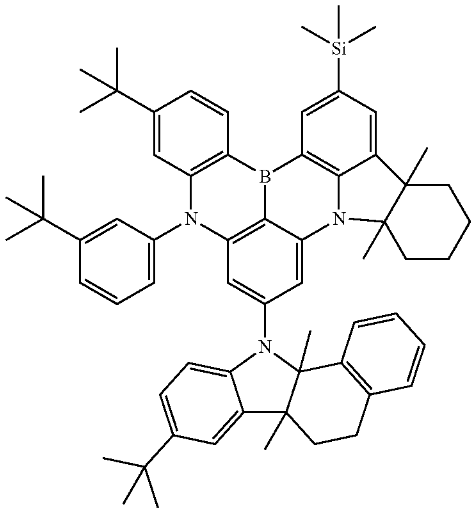
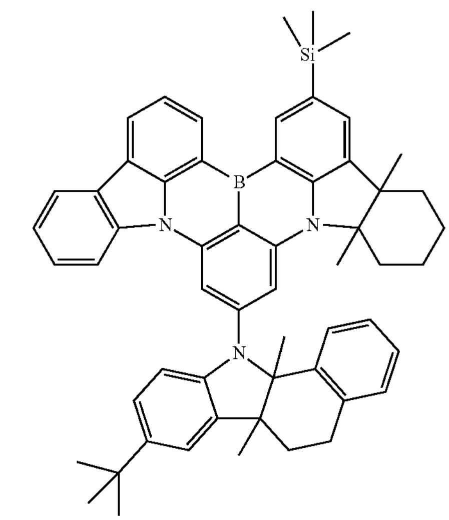
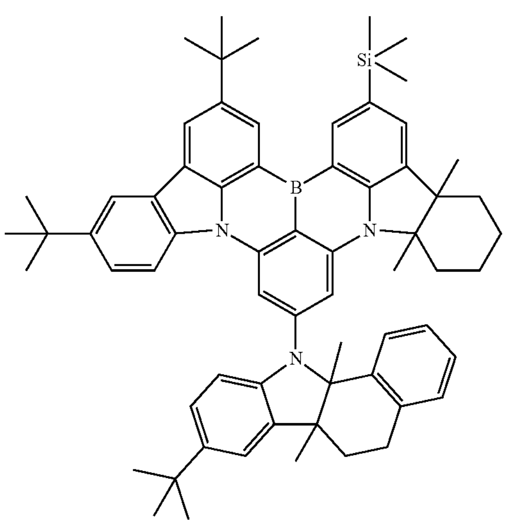
-continued
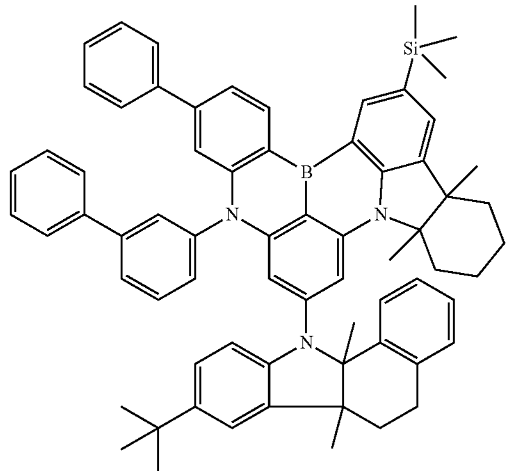 [SMILES: CC(C)(C)c1ccc2c(c1)C1(C)CCc3ccccc3C1(C)N2c1cc2c3c(c1)N1c4c(cc([Si](C)(C)C)cc4C4(C)CCCCC14C)B3c1ccc(-c3ccccc3)cc1N2c1cccc(-c2ccccc2)c1]
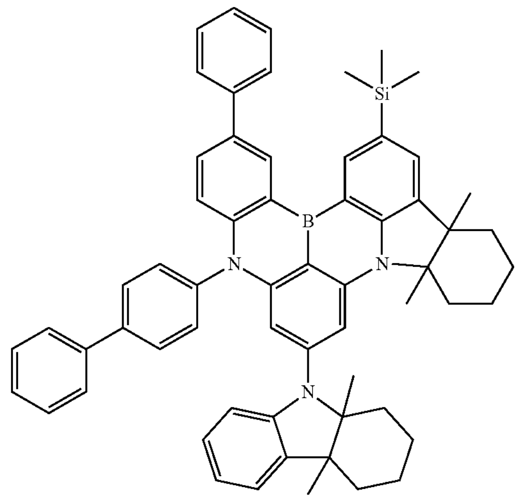
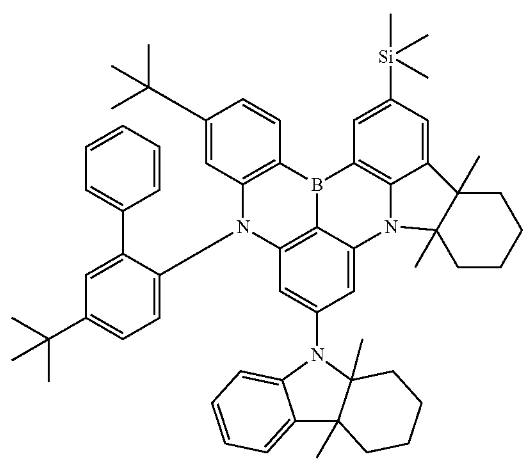

-continued
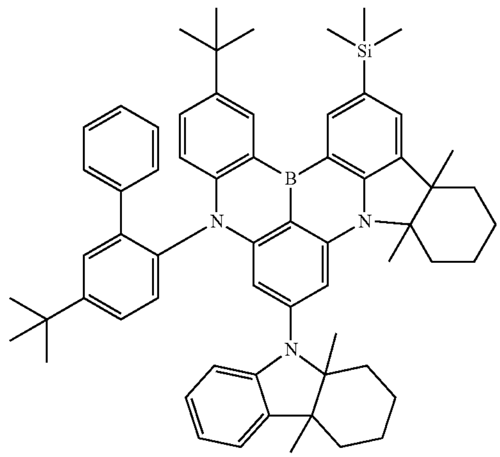
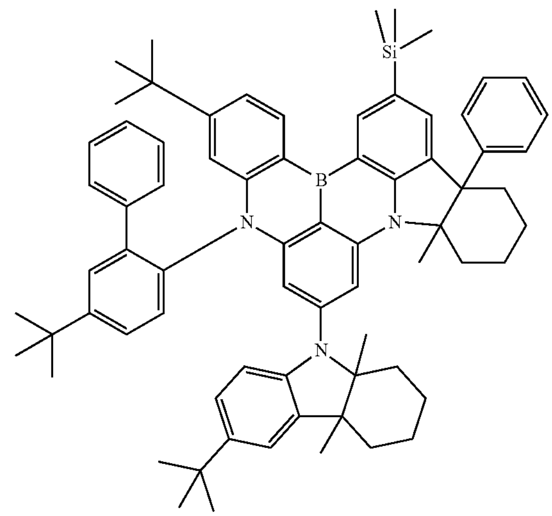
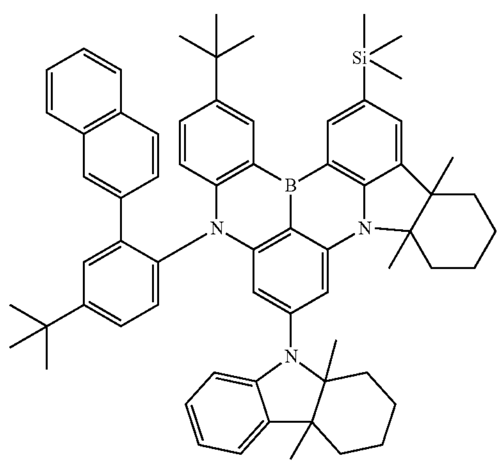 [SMILES: CC(C)(C)c1ccc2c(c1)B1c3cc([Si](C)(C)C)cc4c3N(c3cc(N5c6ccccc6C6(C)CCCCC56C)cc(c31)N2c1ccc(C(C)(C)C)cc1-c1ccc2ccccc2c1)C1(C)CCCCC41C]
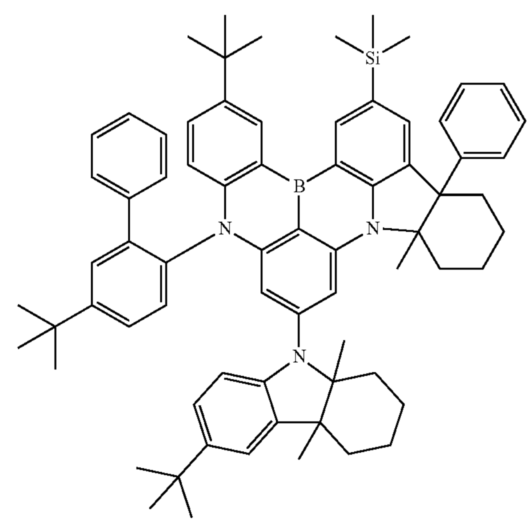
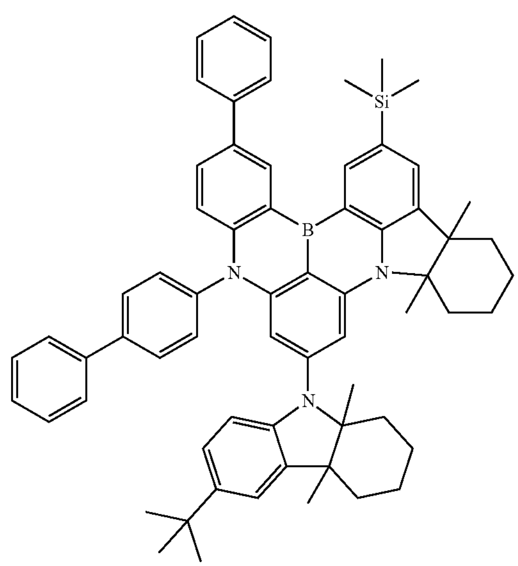
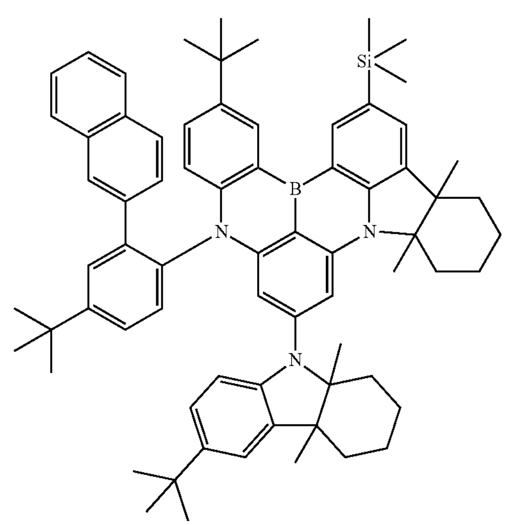 [SMILES: CC(C)(C)c1ccc2c(c1)B1c3cc([Si](C)(C)C)cc4c3N(c3cc(N5c6ccc(C(C)(C)C)cc6C6(C)CCCCC56C)cc(c31)N2c1ccc(C(C)(C)C)cc1-c1ccc2ccccc2c1)C1(C)CCCCC41C]

-continued
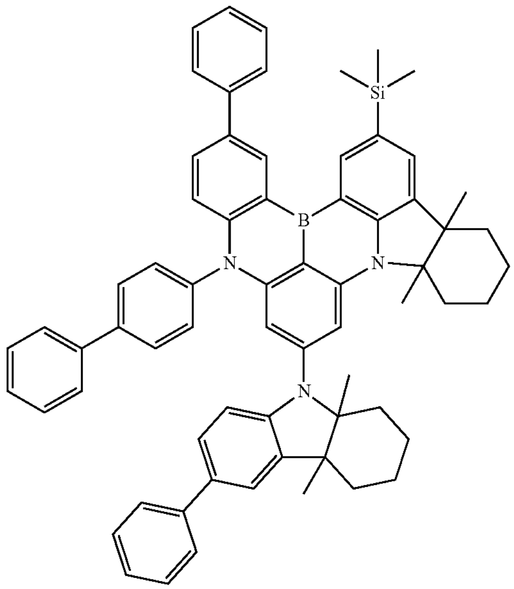
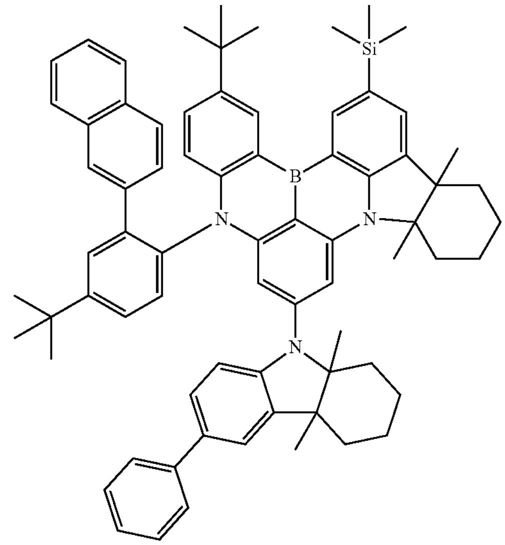 [SMILES: CC(C)(C)c1ccc2c(c1)B1c3cc([Si](C)(C)C)cc4c3N(c3cc(N5c6ccc(-c7ccccc7)cc6C6(C)CCCCC56C)cc(c31)N2c1ccc(C(C)(C)C)cc1-c1ccc2ccccc2c1)C1(C)CCCCC41C]
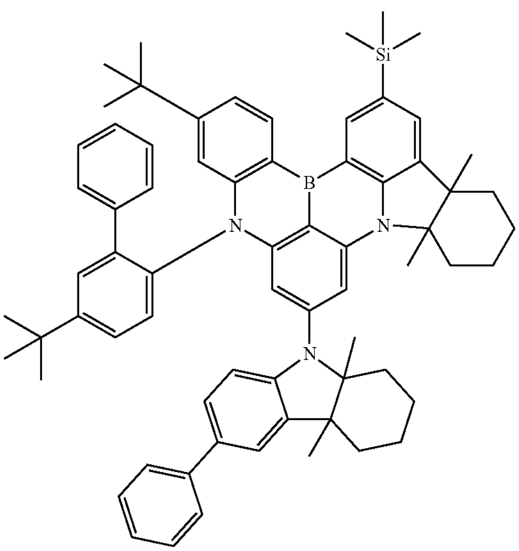
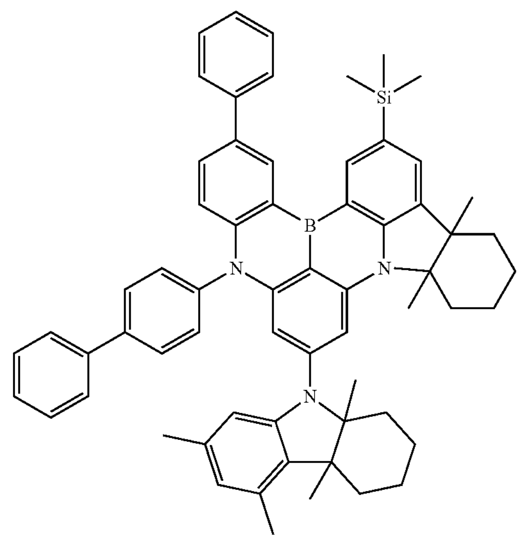
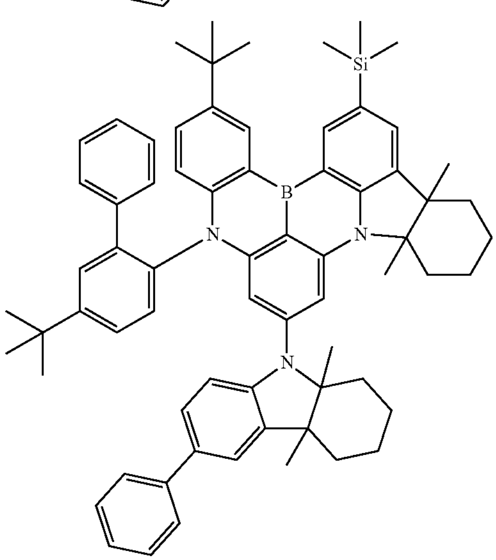
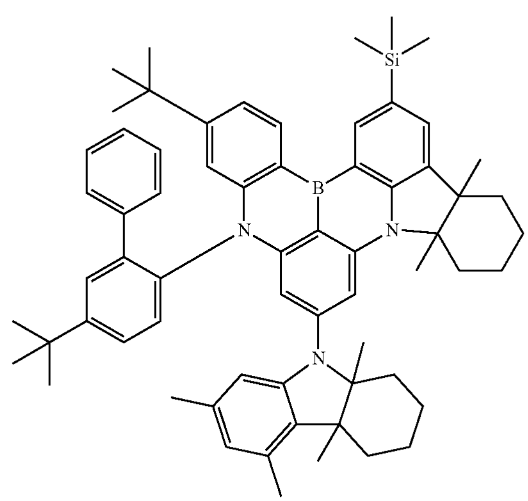

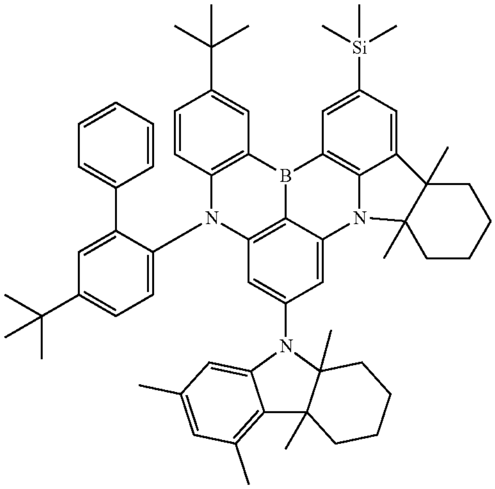
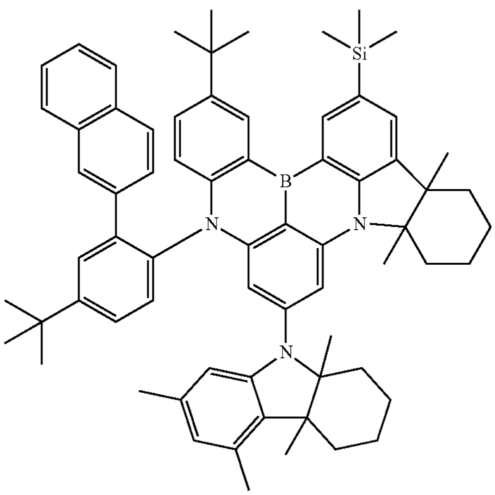 [SMILES: Cc1cc(C)c2c(c1)N(c1cc3c4c(c1)N1c5c(cc([Si](C)(C)C)cc5C5(C)CCCCC15C)B4c1cc(C(C)(C)C)ccc1N3c1ccc(C(C)(C)C)cc1-c1ccc3ccccc3c1)C1(C)CCCCC21C]
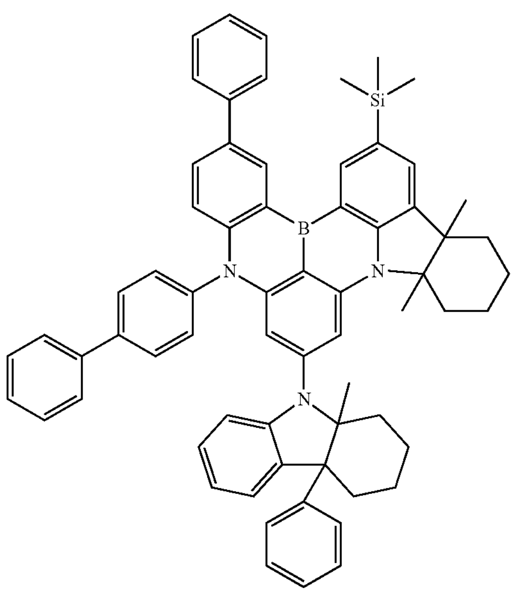
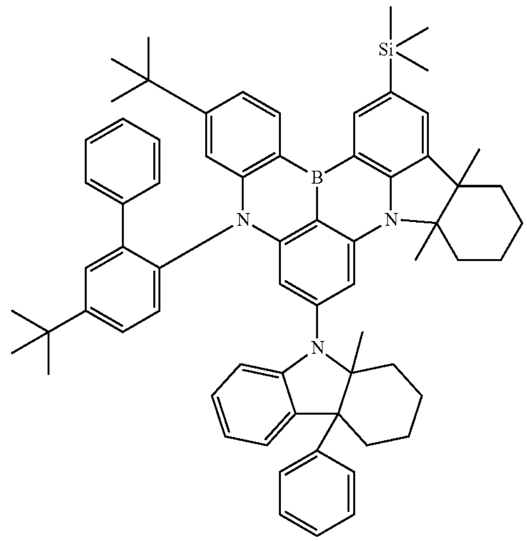
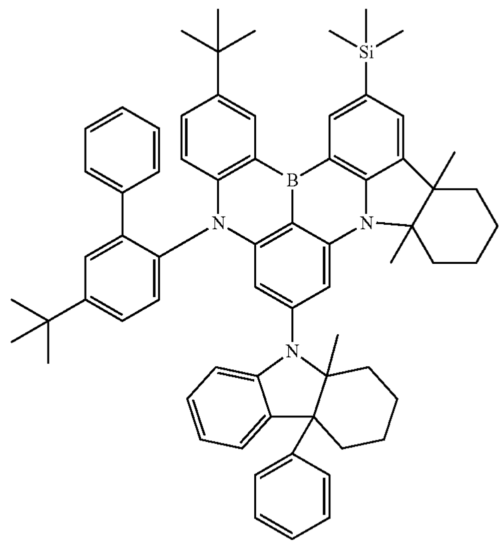
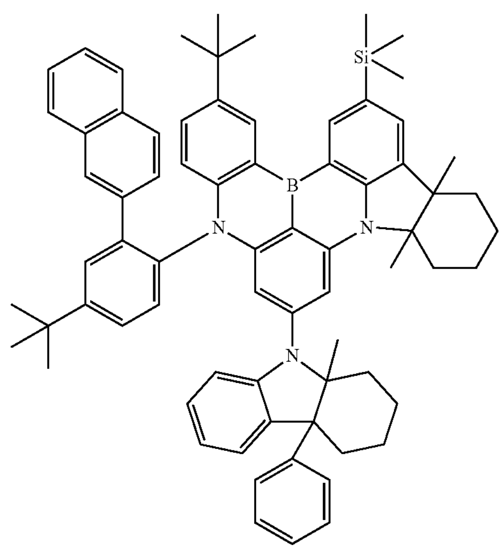 [SMILES: CC(C)(C)c1ccc2c(c1)B1c3cc([Si](C)(C)C)cc4c3N(c3cc(N5c6ccccc6C6(c7ccccc7)CCCCC56C)cc(c31)N2c1ccc(C(C)(C)C)cc1-c1ccc2ccccc2c1)C1(C)CCCCC41C]

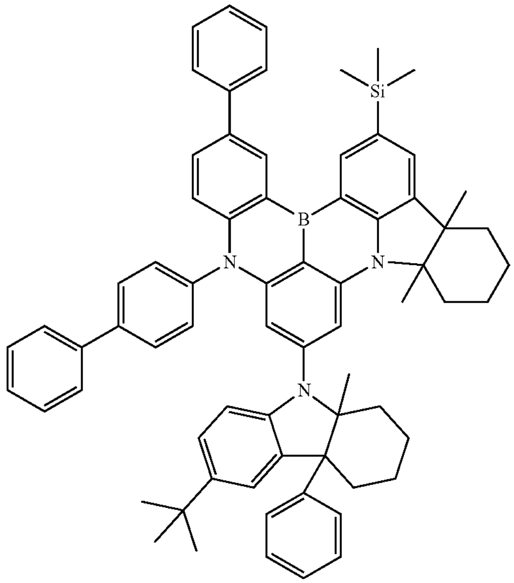
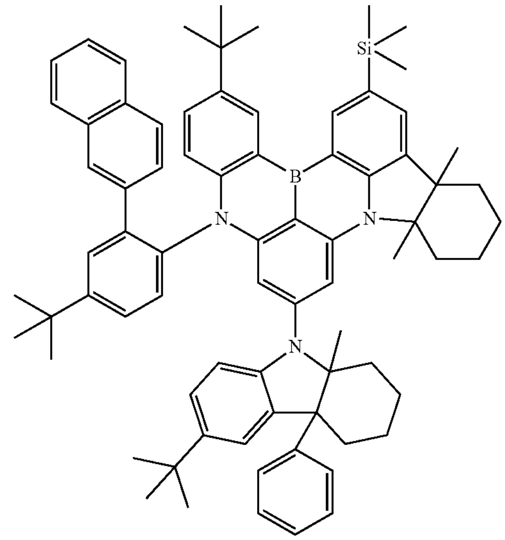 [SMILES: CC(C)(C)c1ccc2c(c1)B1c3cc([Si](C)(C)C)cc4c3N(c3cc(N5c6ccc(C(C)(C)C)cc6C6(c7ccccc7)CCCCC56C)cc(c31)N2c1ccc(C(C)(C)C)cc1-c1ccc2ccccc2c1)C1(C)CCCCC41C]
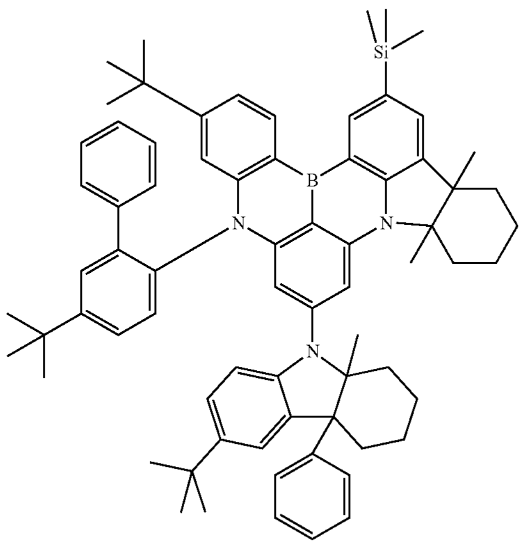
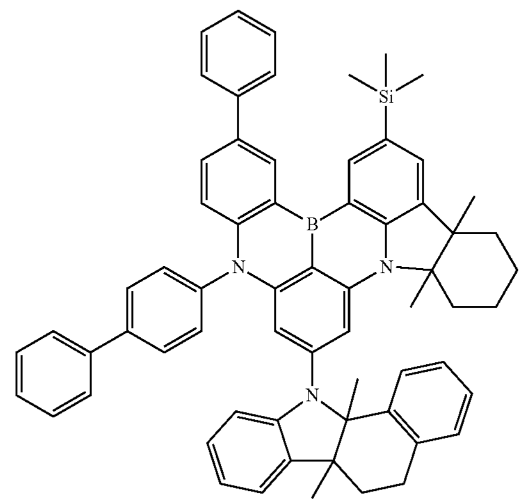
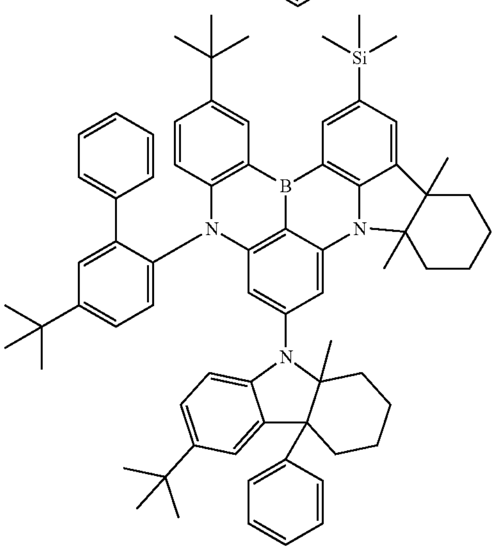
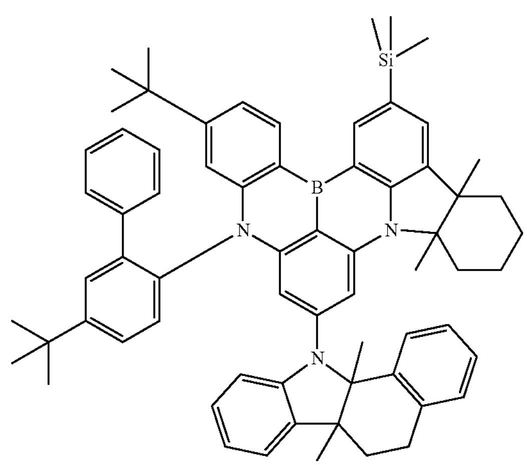
Si
B
N -continued
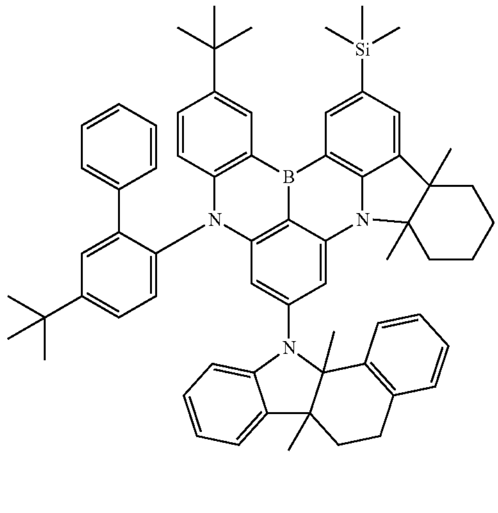
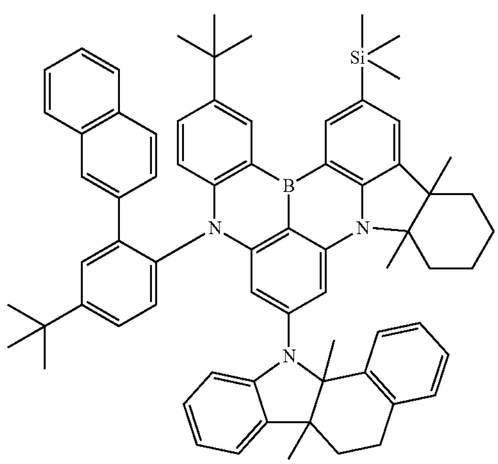 [SMILES: CC(C)(C)c1ccc2c(c1)B1c3cc([Si](C)(C)C)cc4c3N(c3cc(N5c6ccccc6C6(C)CCc7ccccc7C56C)cc(c31)N2c1ccc(C(C)(C)C)cc1-c1ccc2ccccc2c1)C1(C)CCCCC41C]
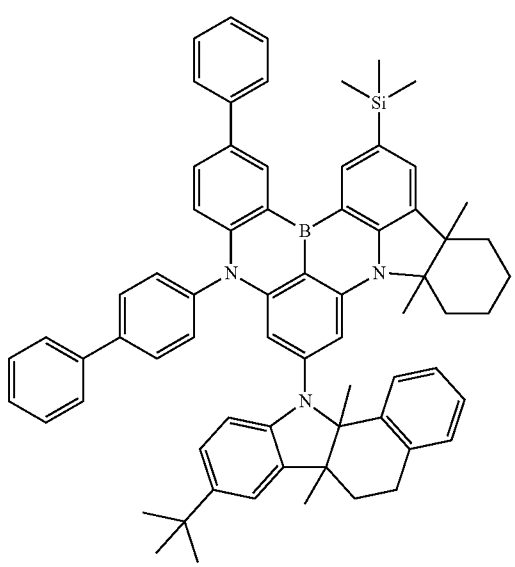
-continued
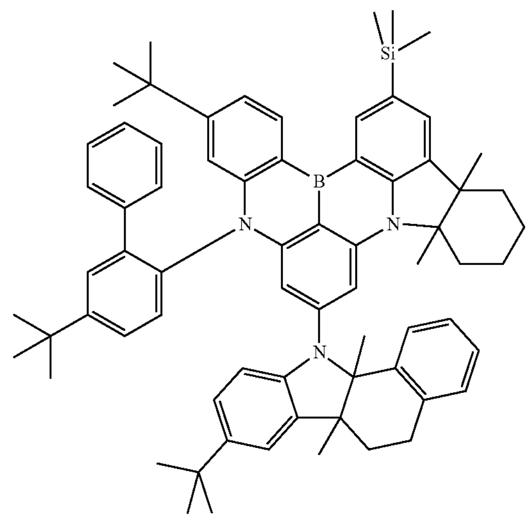
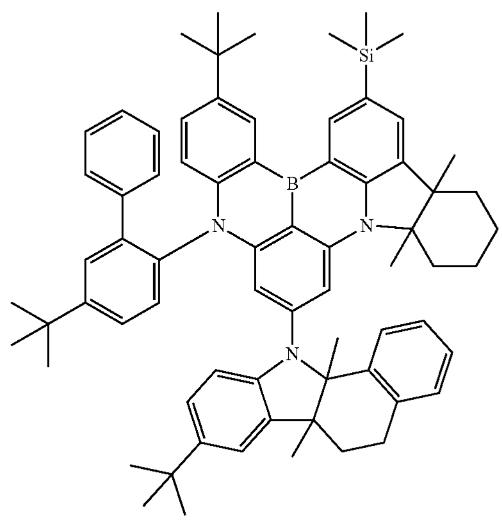
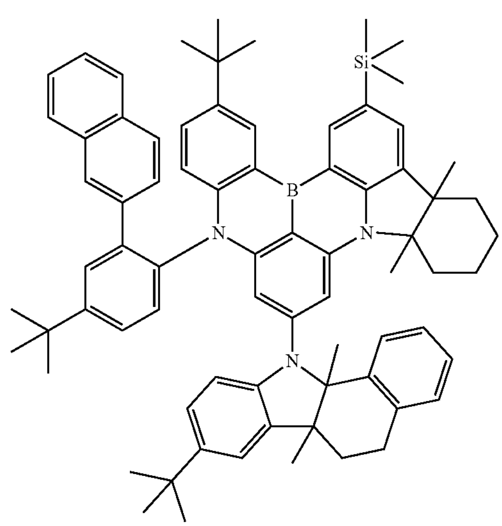 [SMILES: CC(C)(C)c1ccc2c(c1)B1c3cc([Si](C)(C)C)cc4c3N(c3cc(N5c6ccc(C(C)(C)C)cc6C6(C)CCc7ccccc7C56C)cc(c31)N2c1ccc(C(C)(C)C)cc1-c1ccc2ccccc2c1)C1(C)CCCCC41C]

-continued
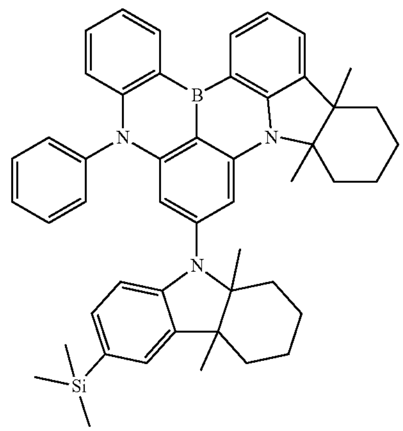
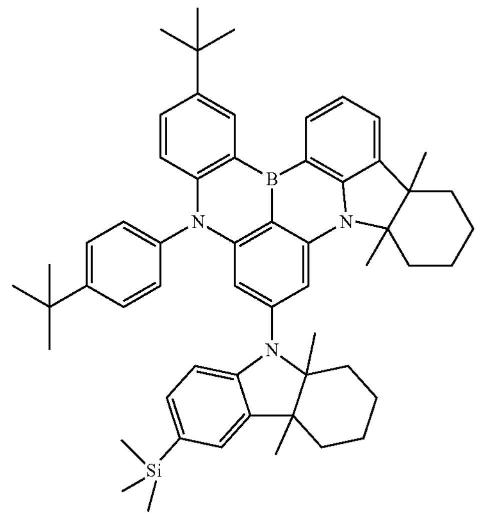
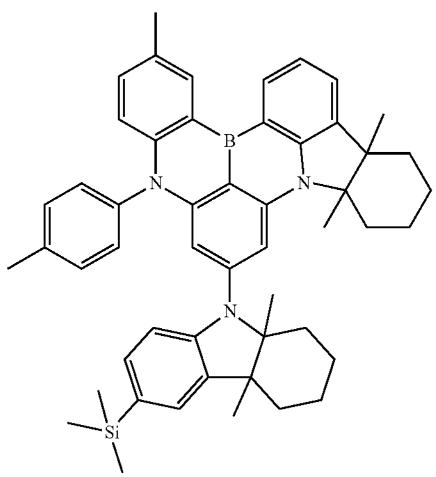
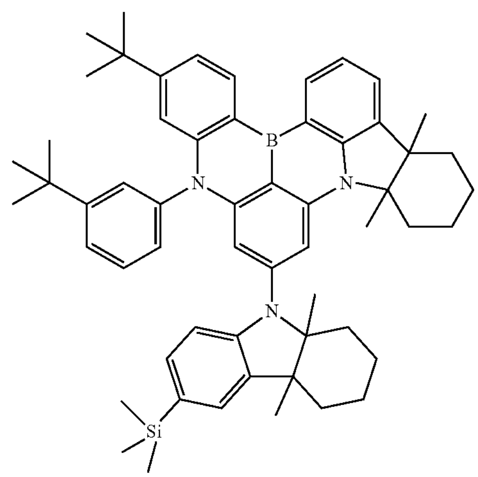
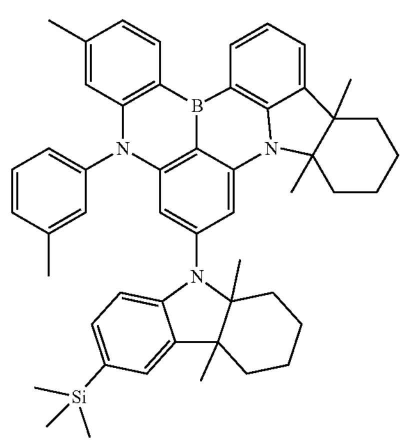
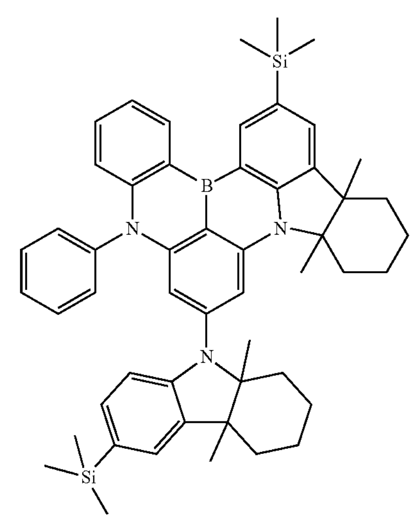

-continued
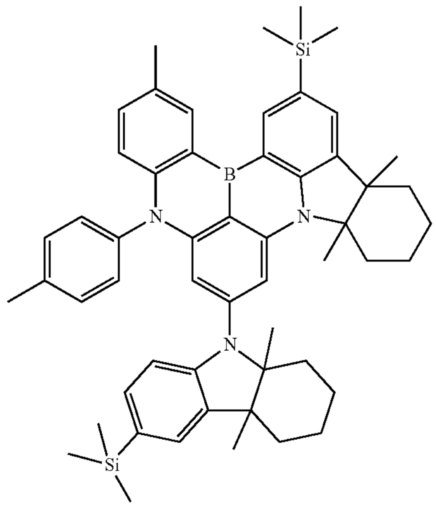
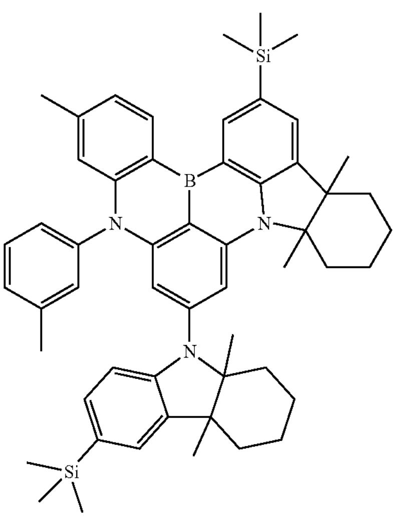
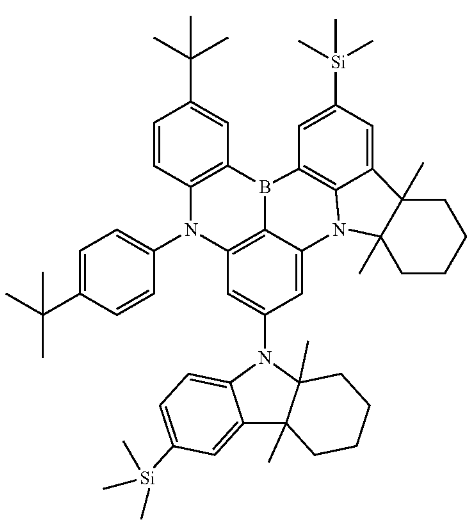
-continued
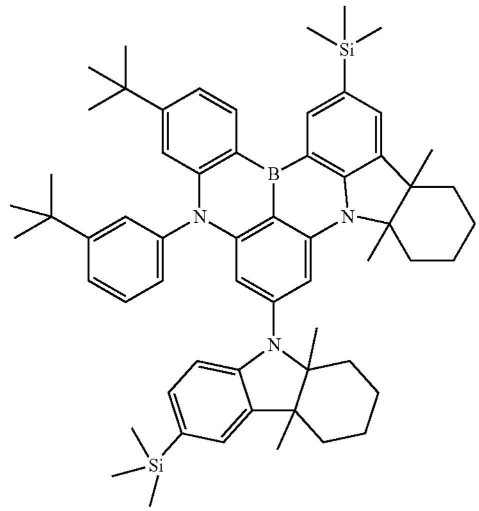
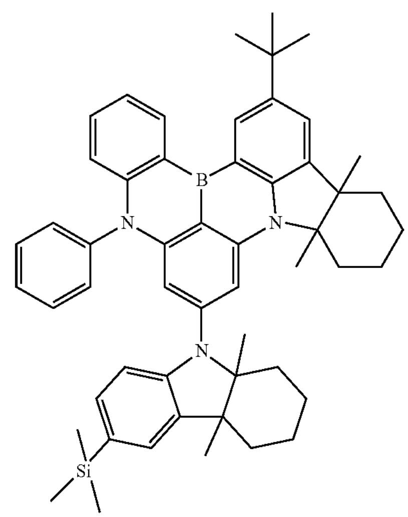
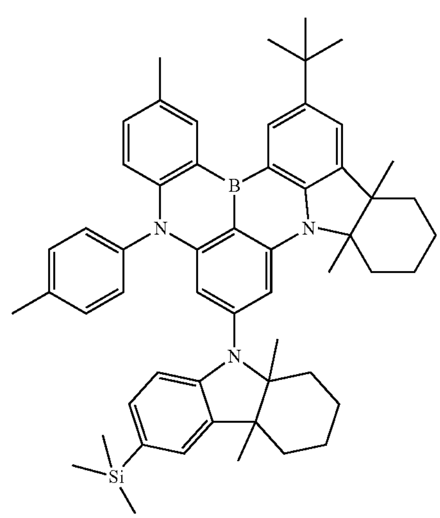

-continued
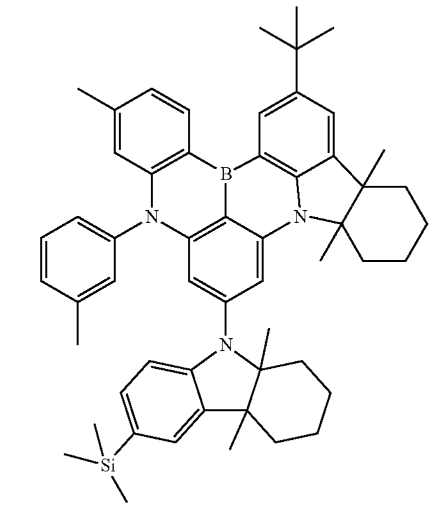
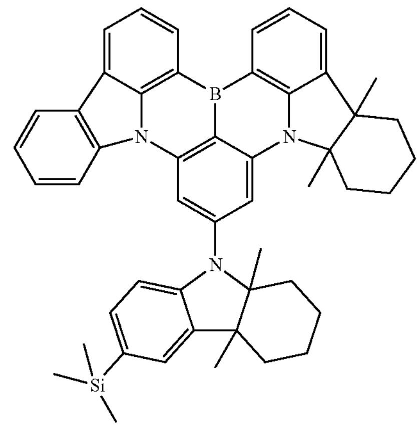
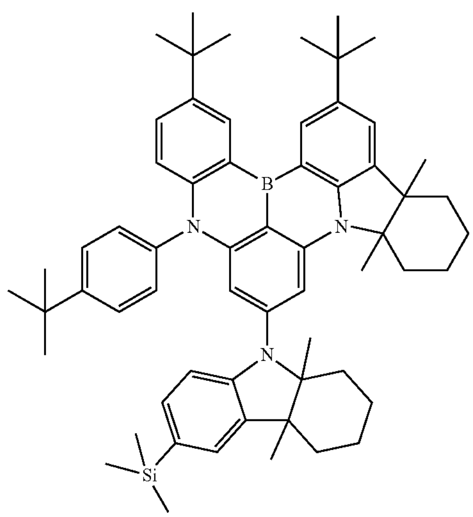
-continued
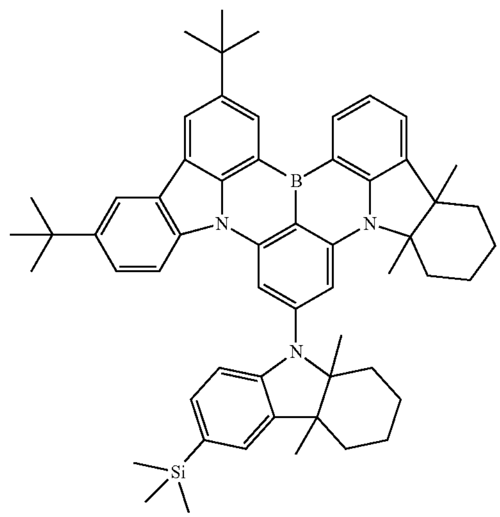
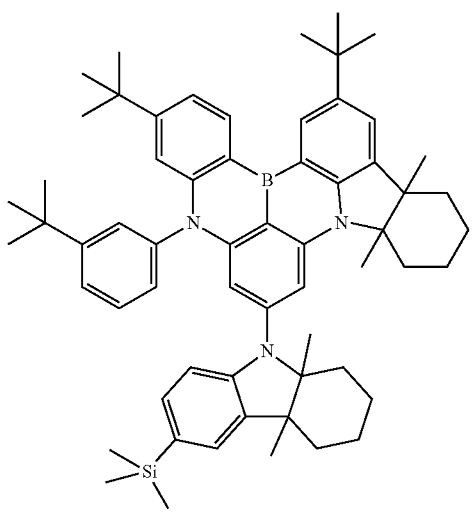
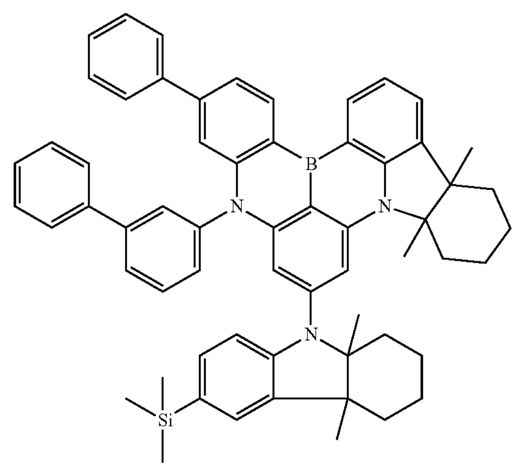

-continued
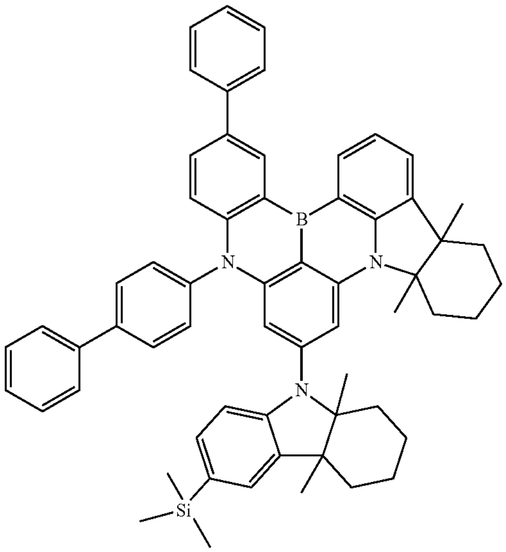
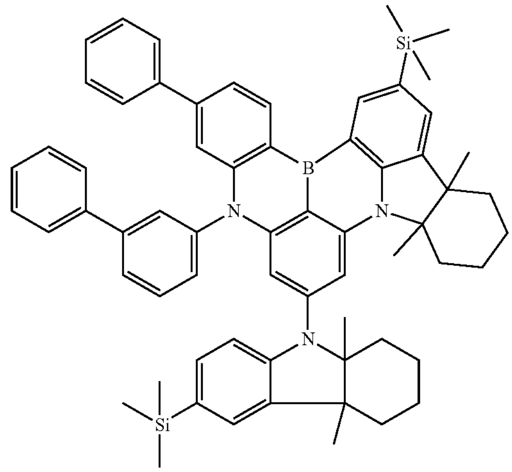
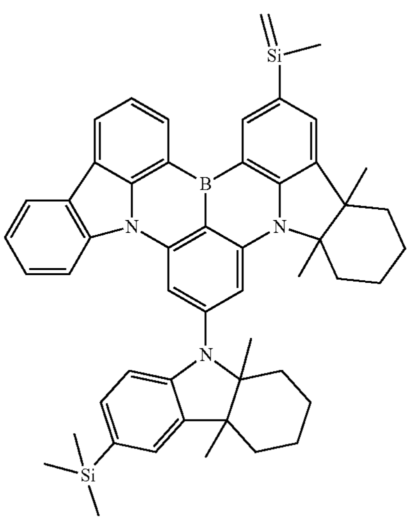
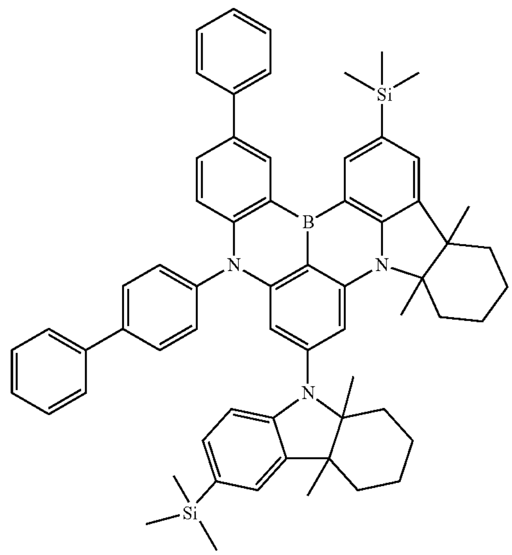
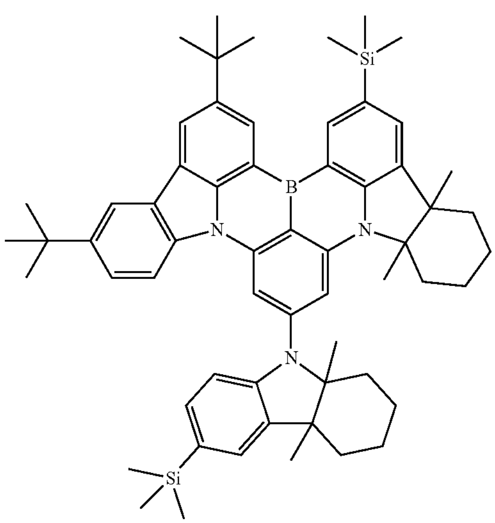
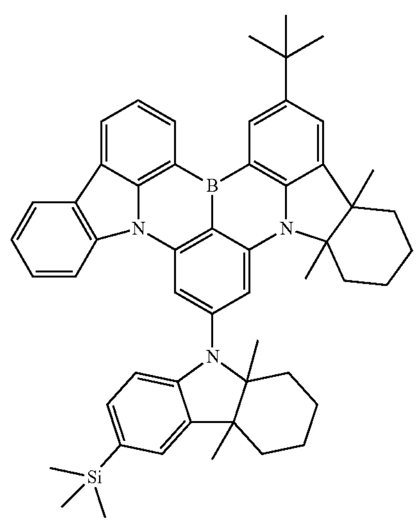

-continued
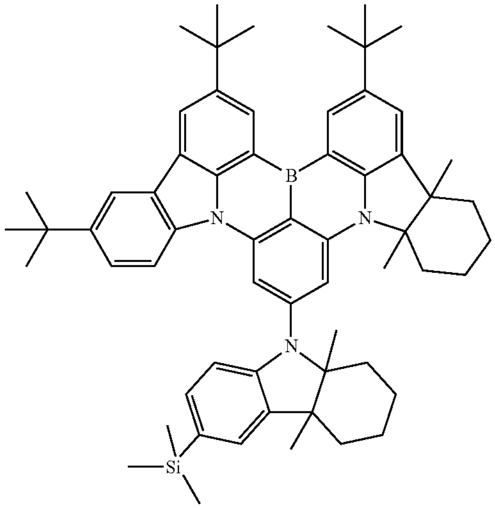
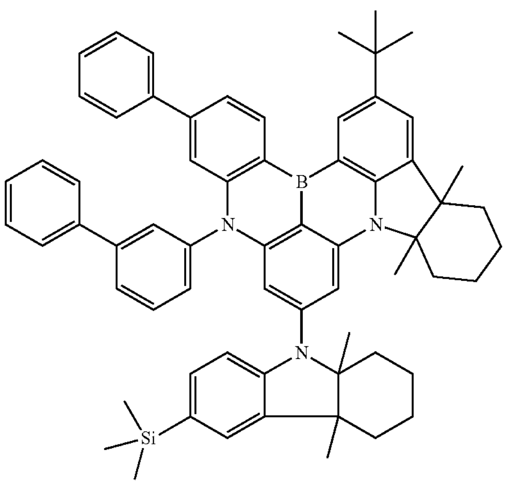
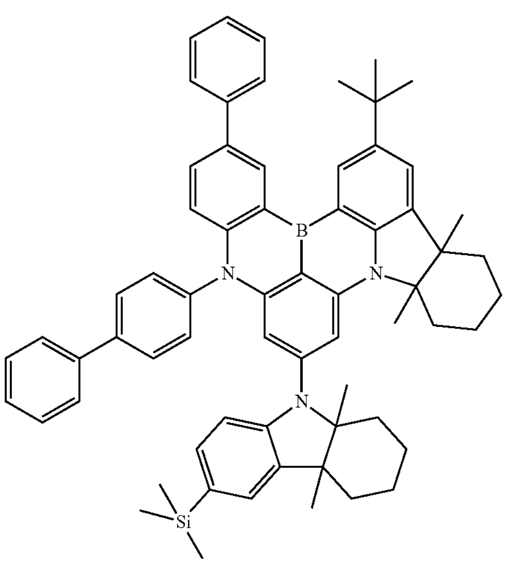
-continued
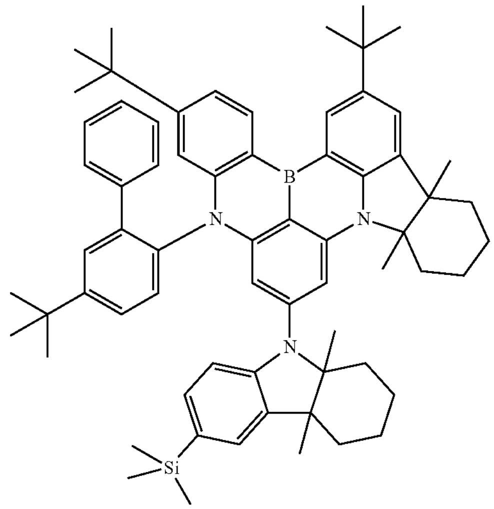
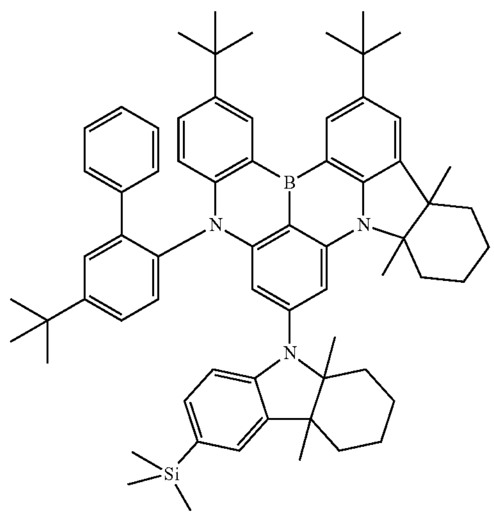
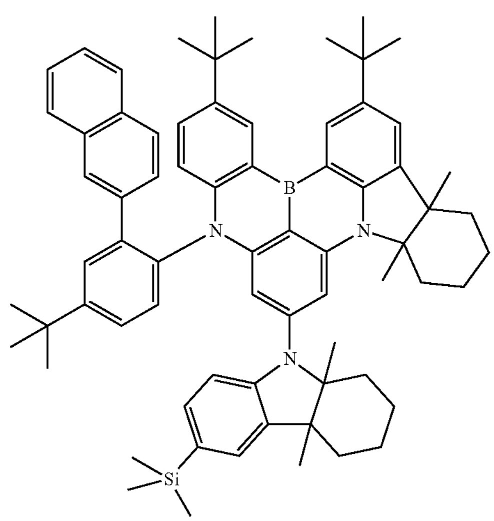

-continued
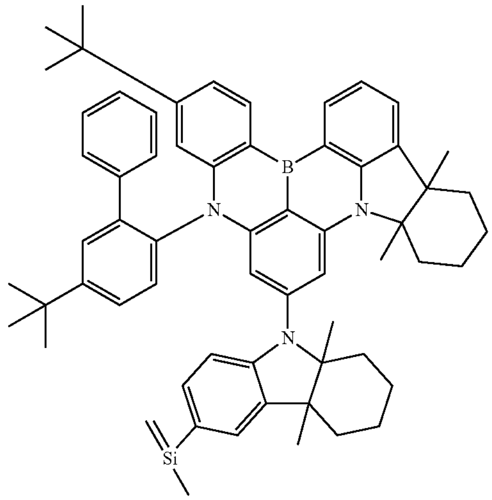
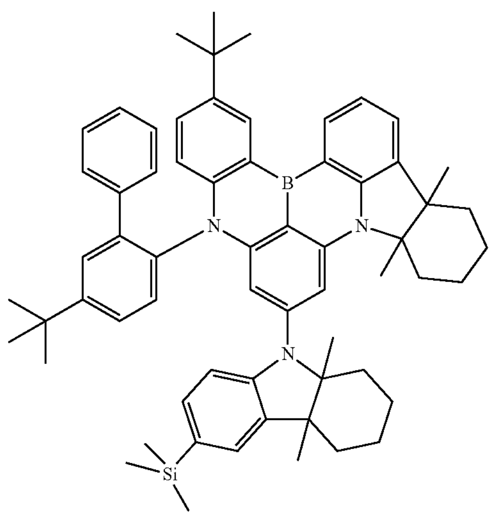
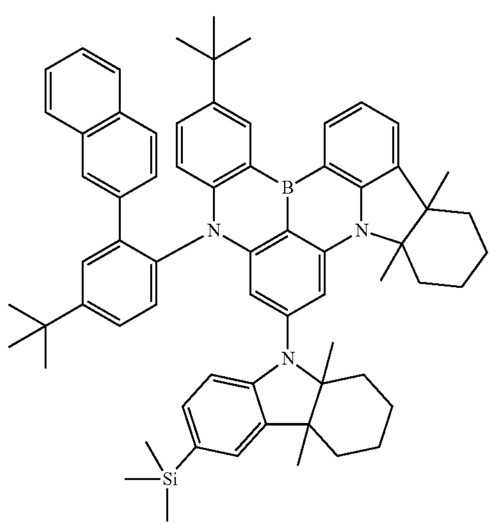
-continued
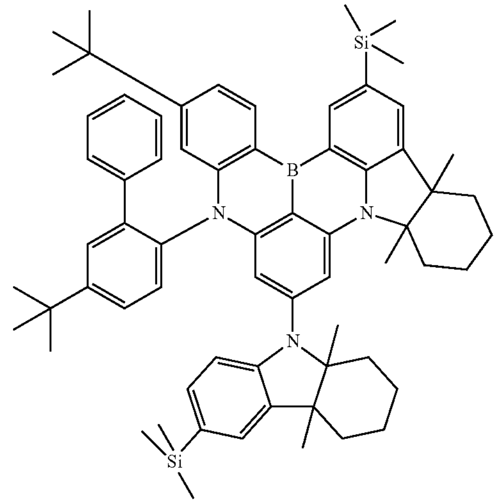
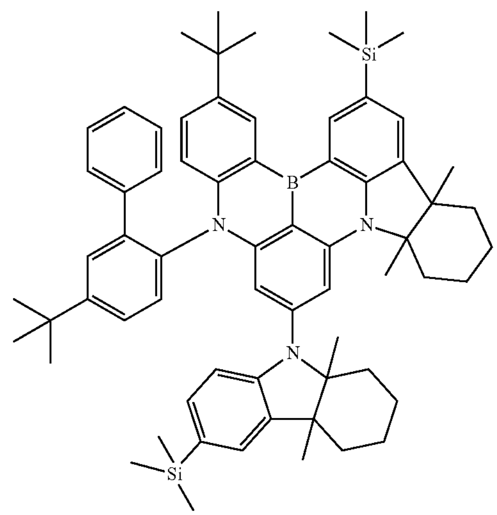
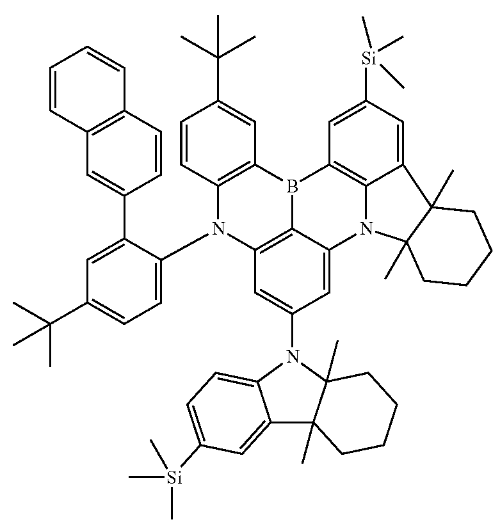

-continued
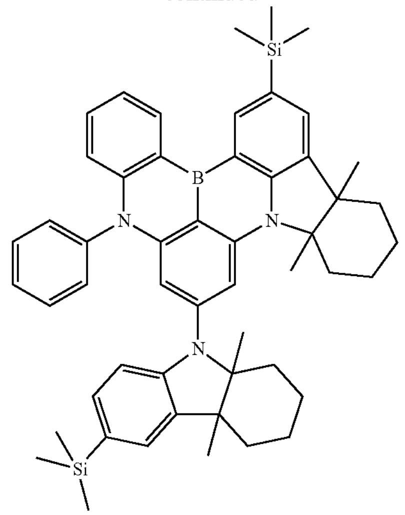
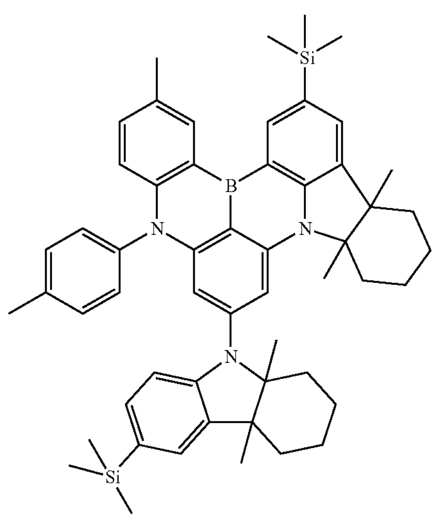
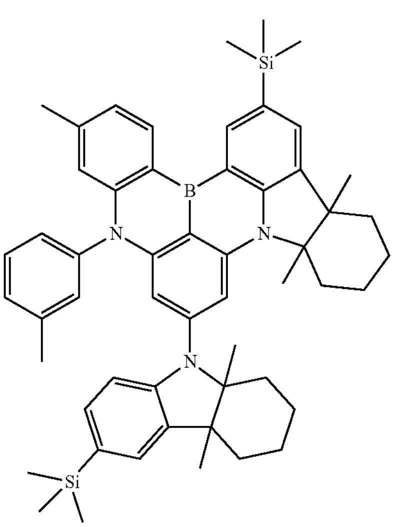
-continued
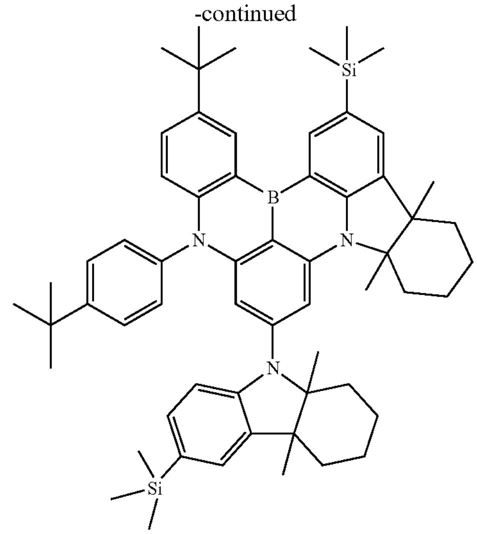
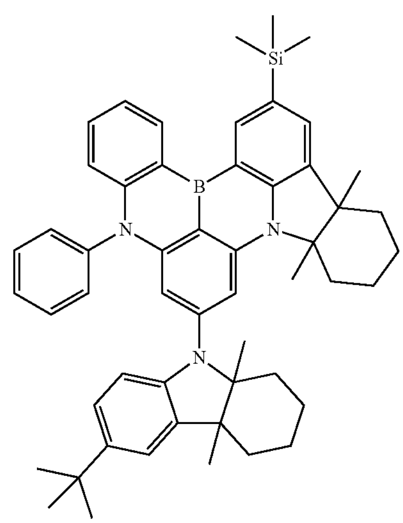
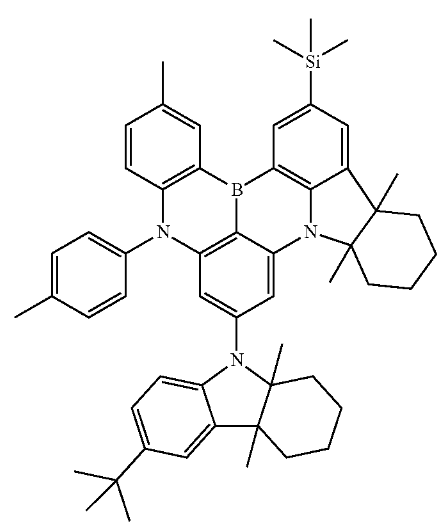

-continued
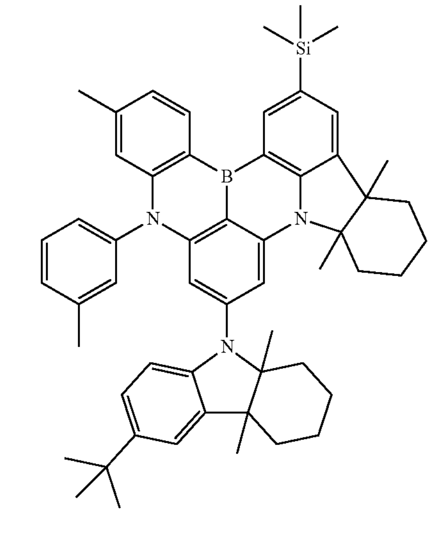
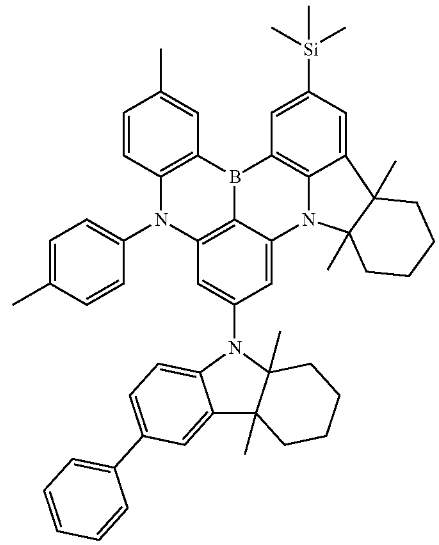
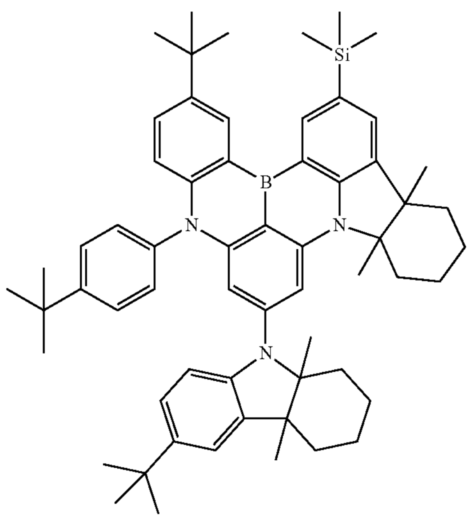
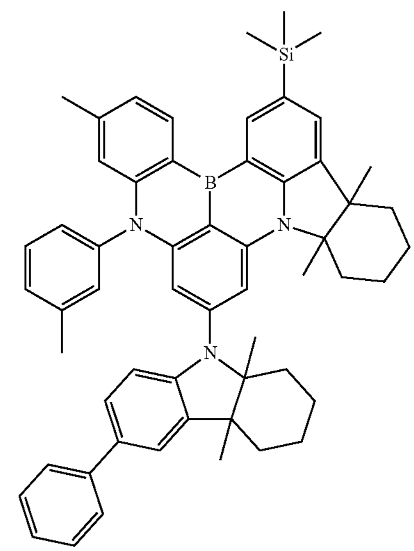
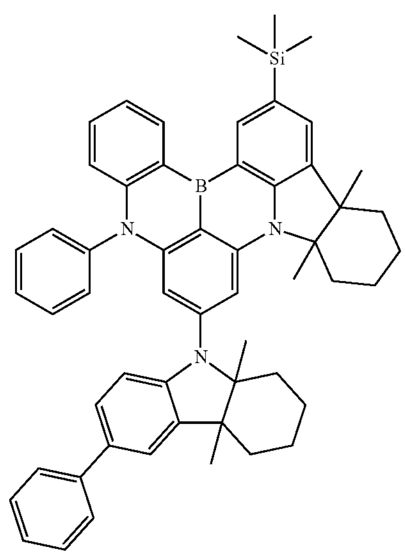
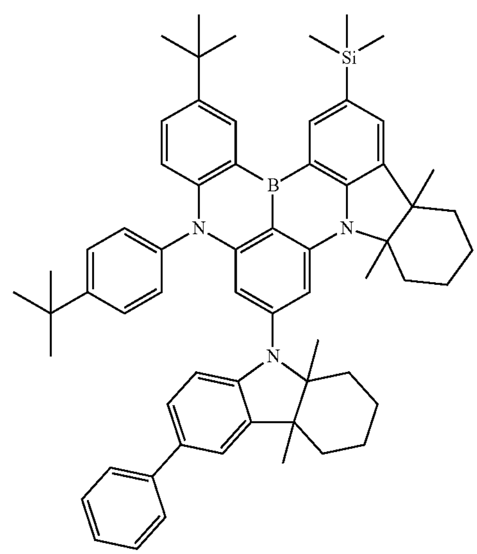

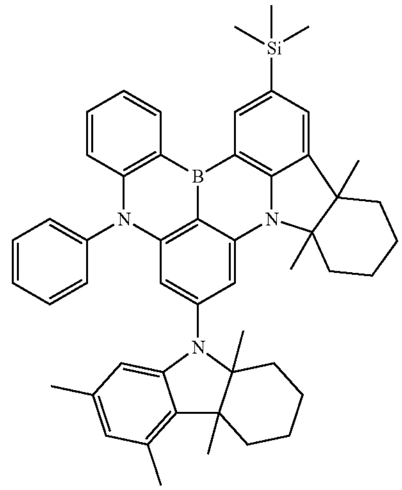
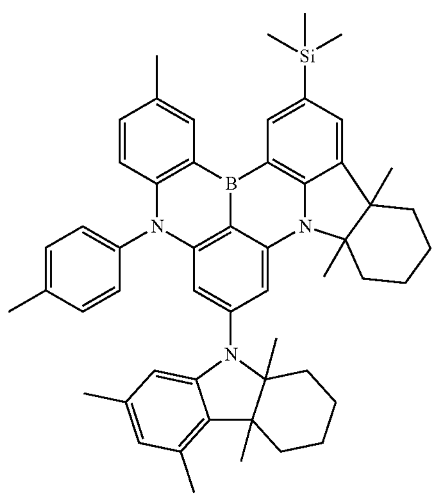
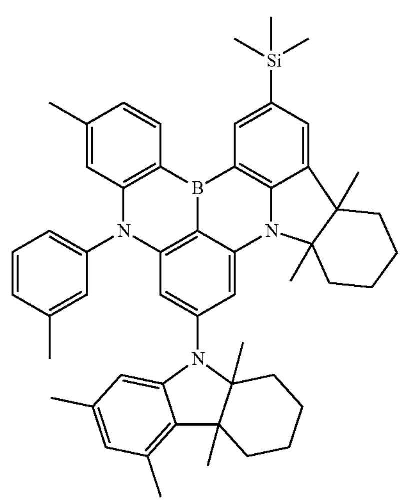
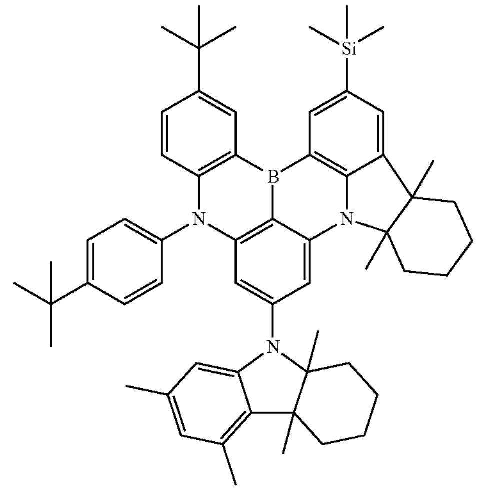
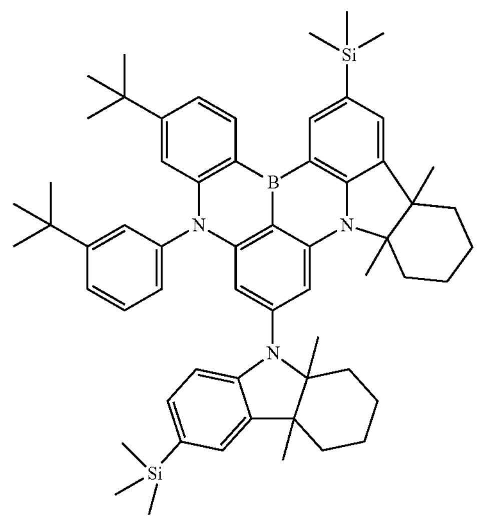
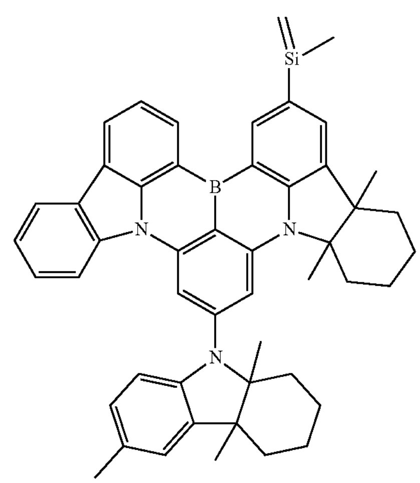

-continued
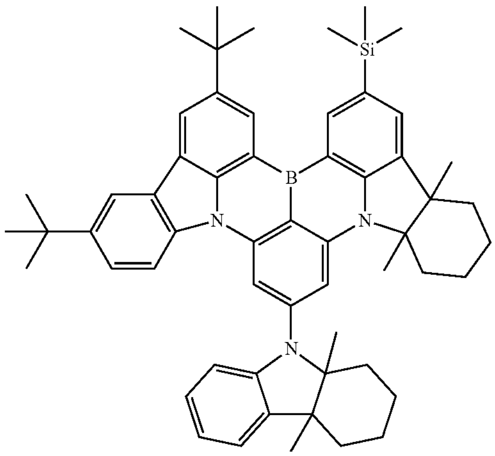
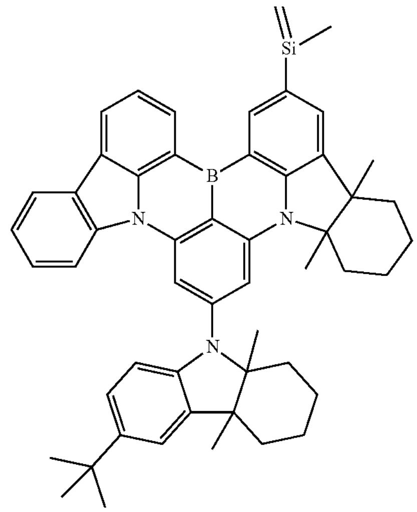
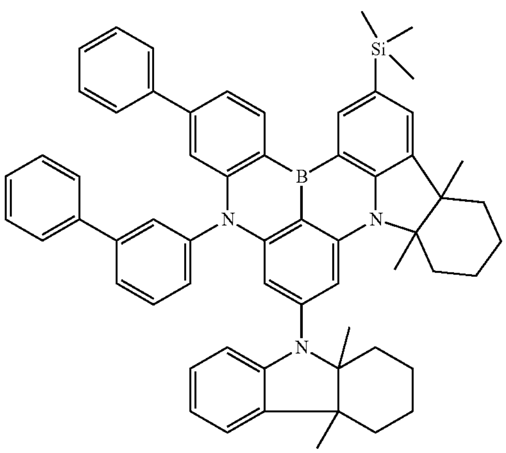
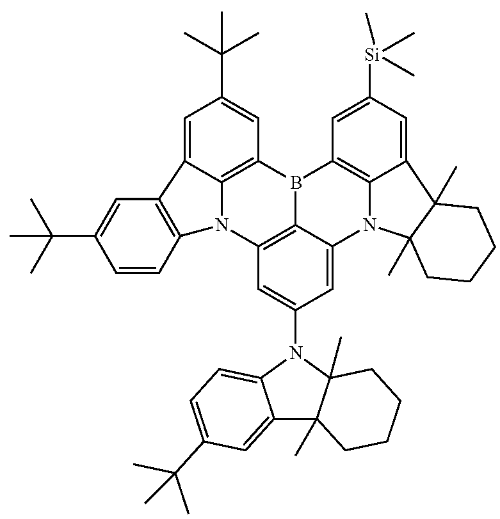
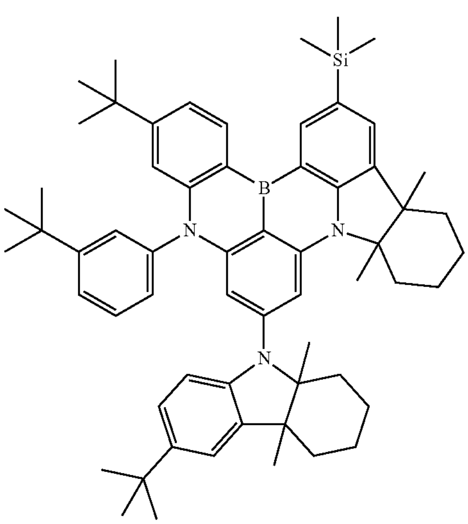
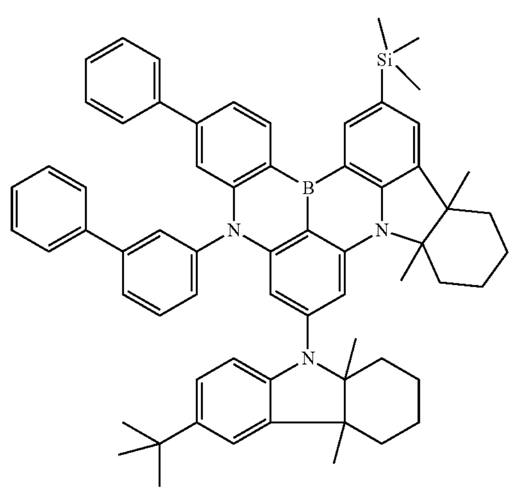

-continued
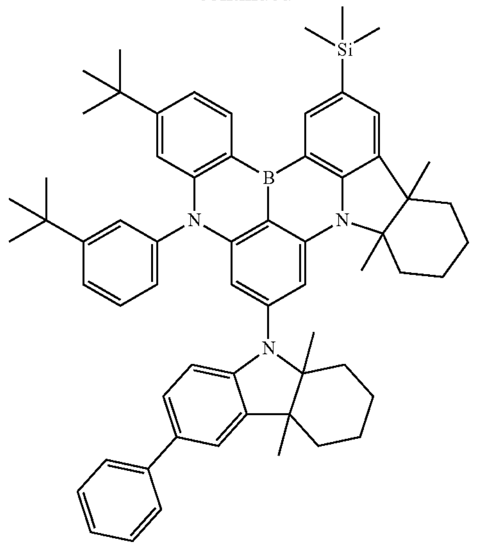
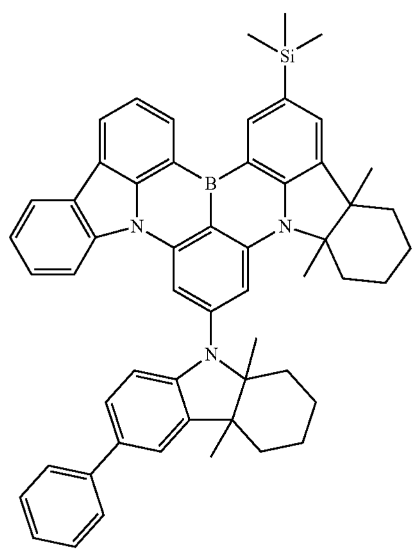
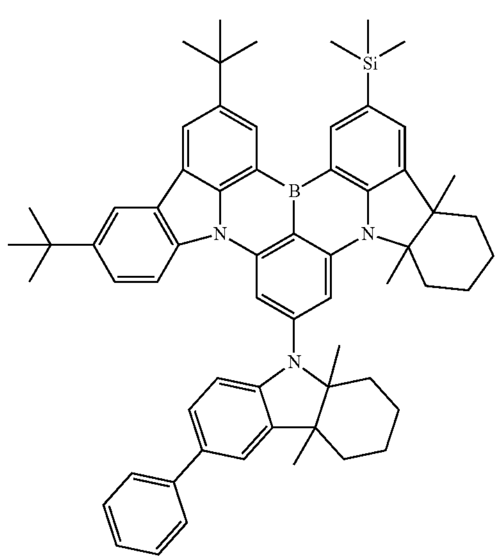
-continued
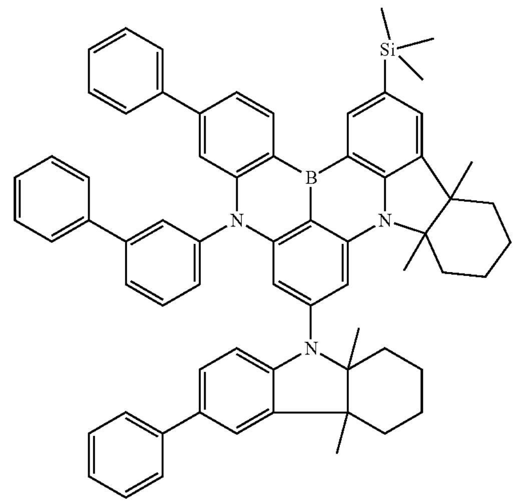
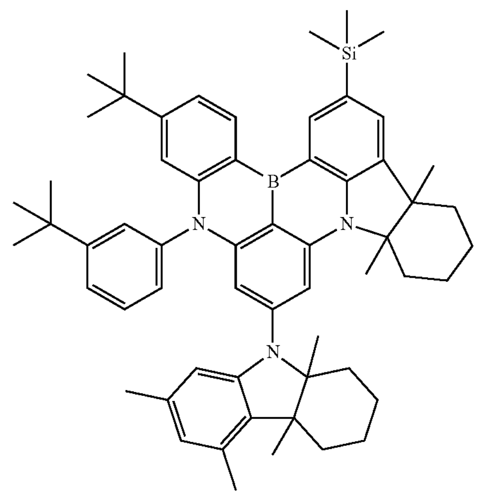
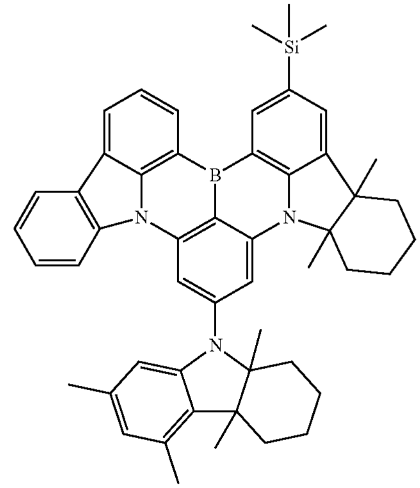

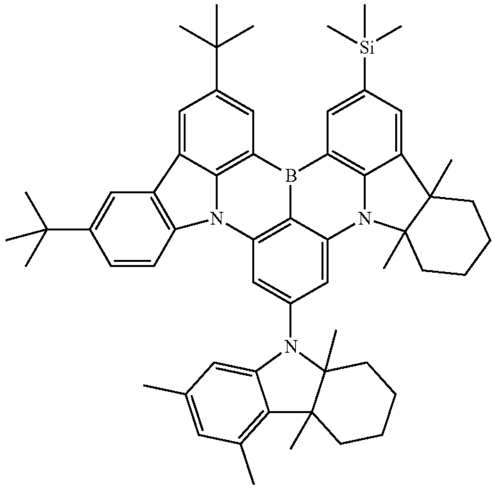
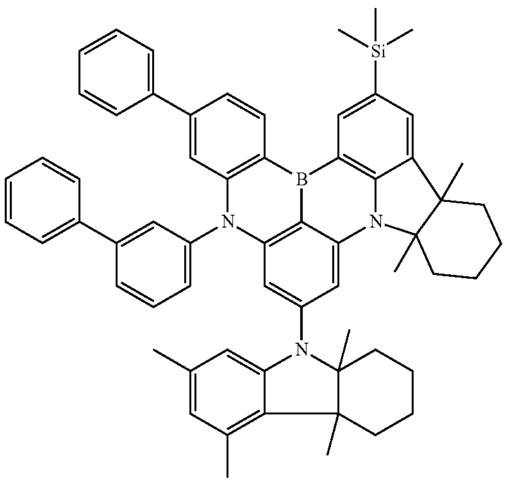
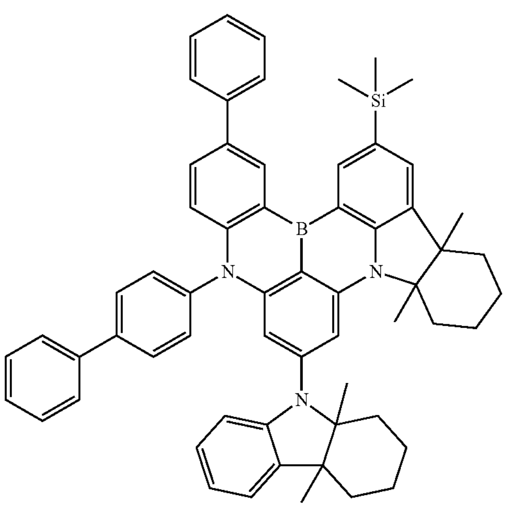
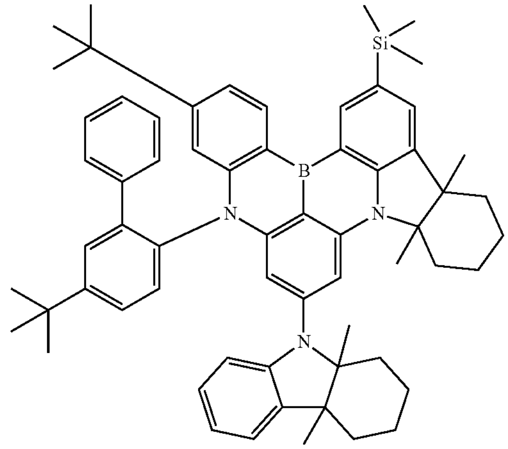
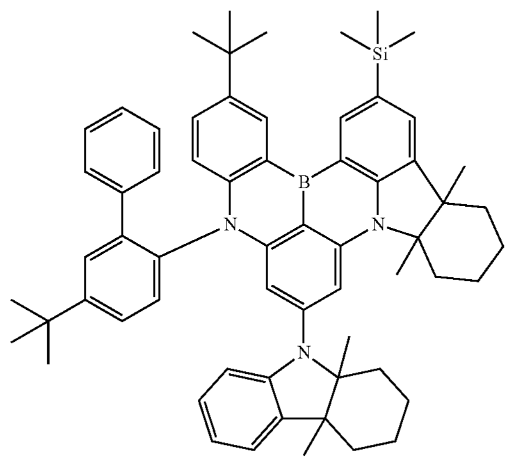
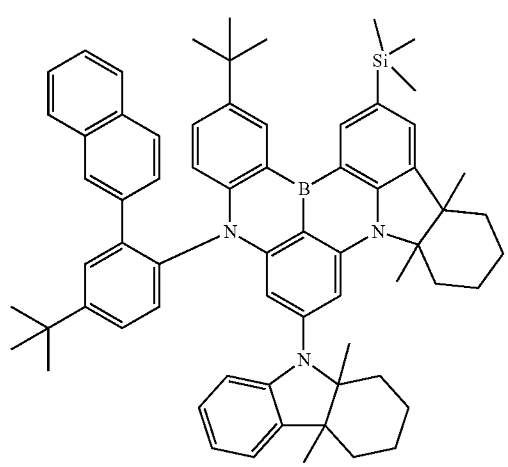

-continued
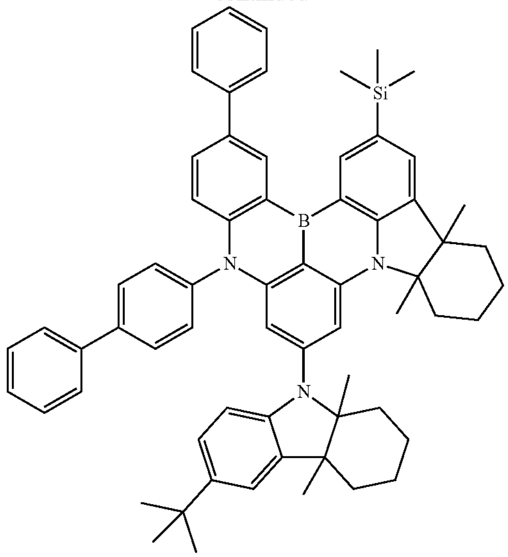
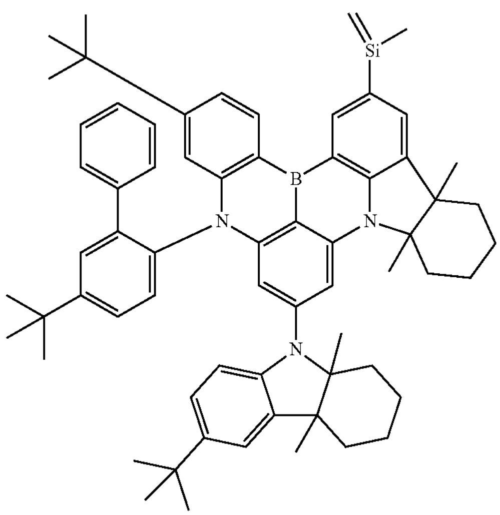
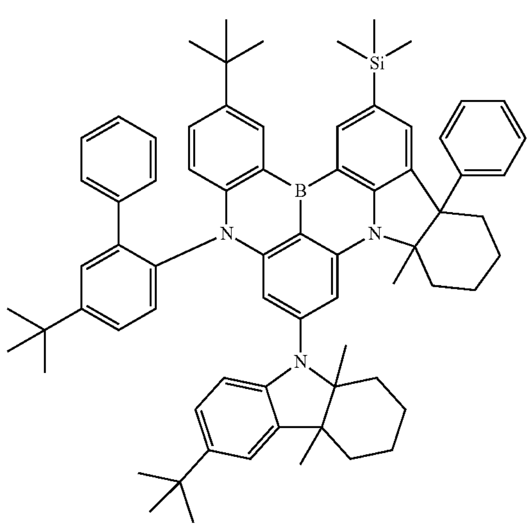
-continued
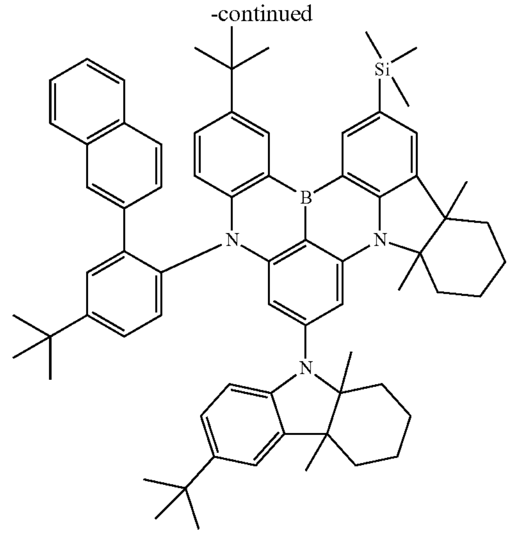
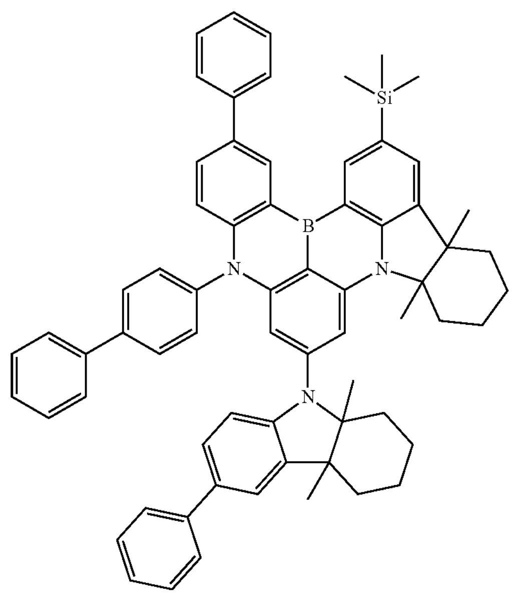
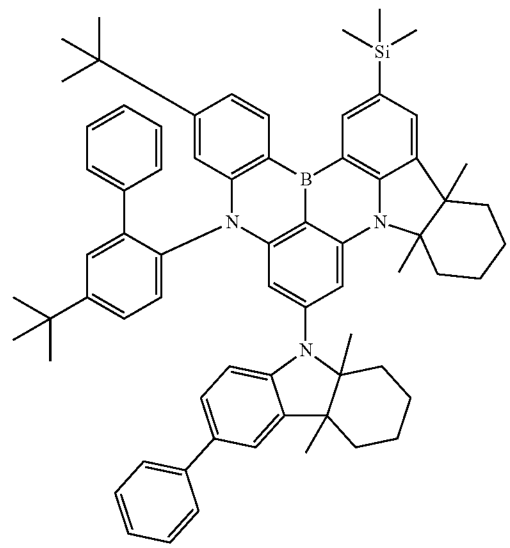

-continued
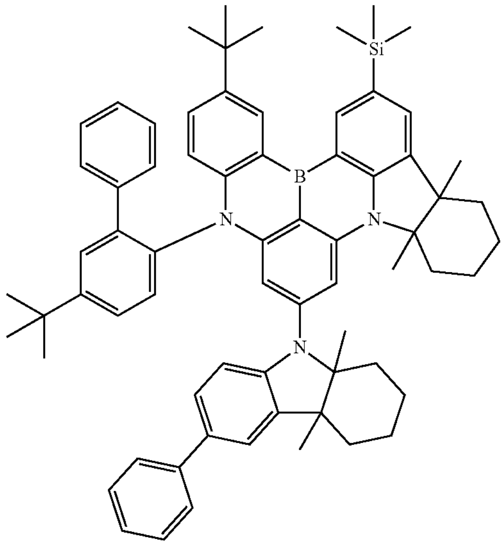
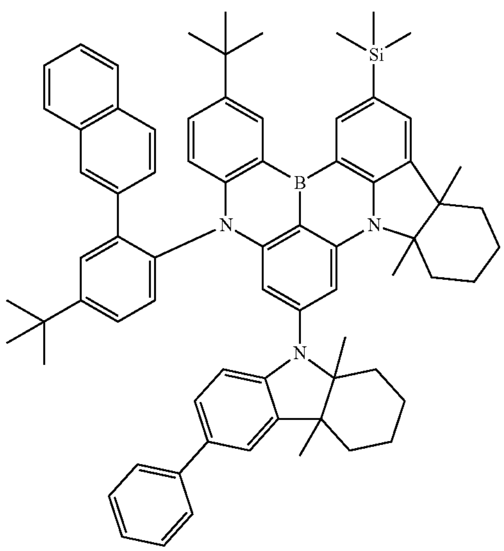
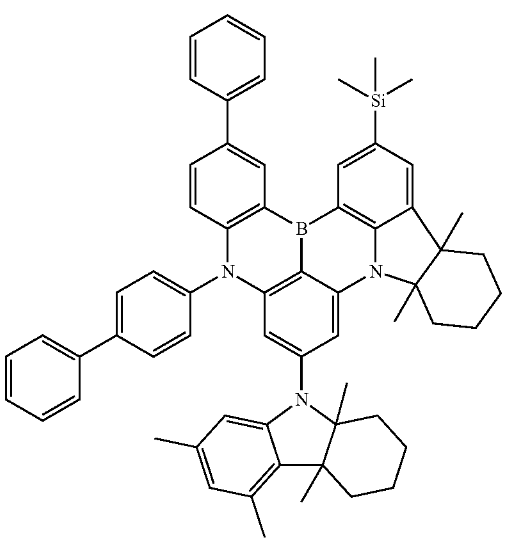
-continued
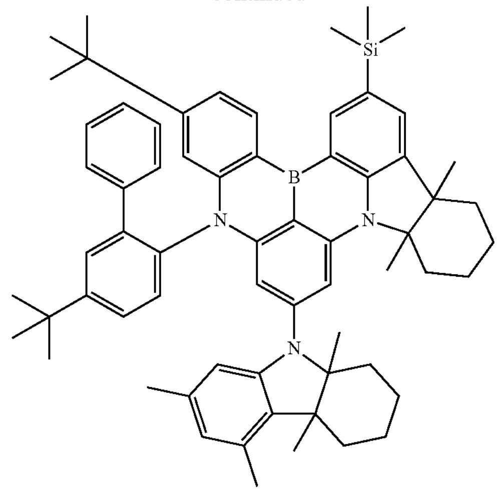
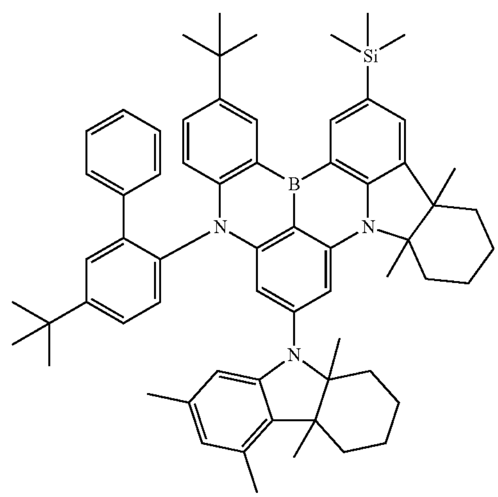
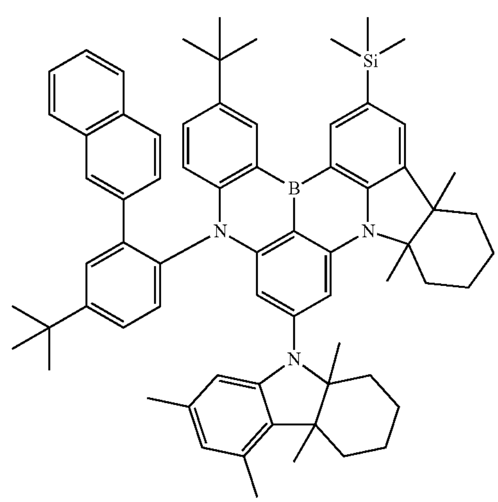

-continued
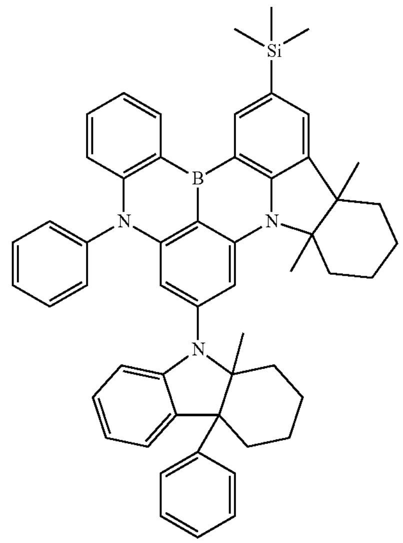
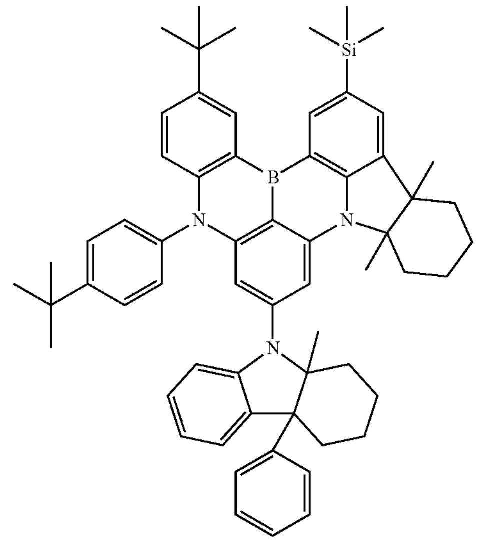
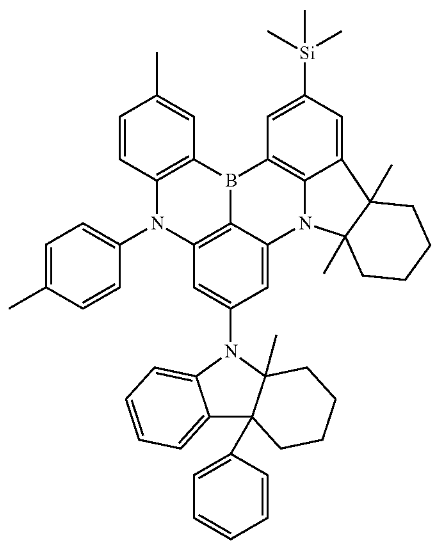
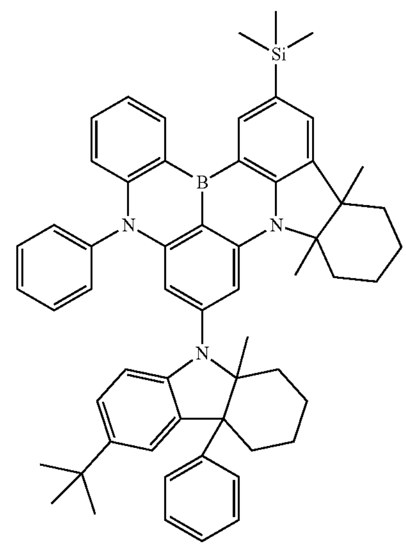
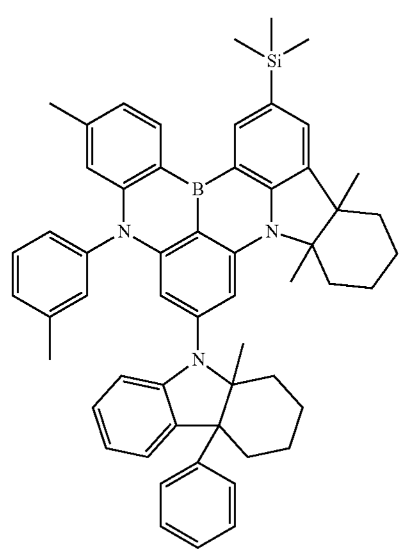
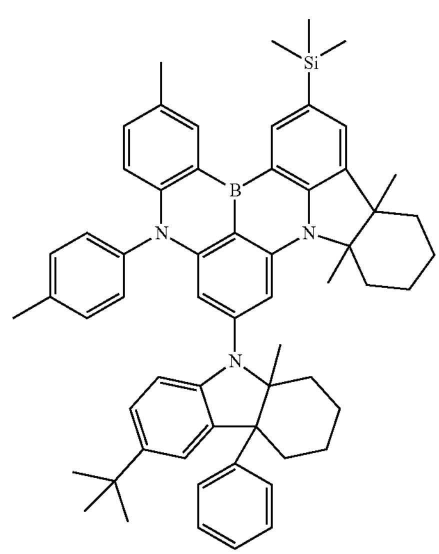
-continued

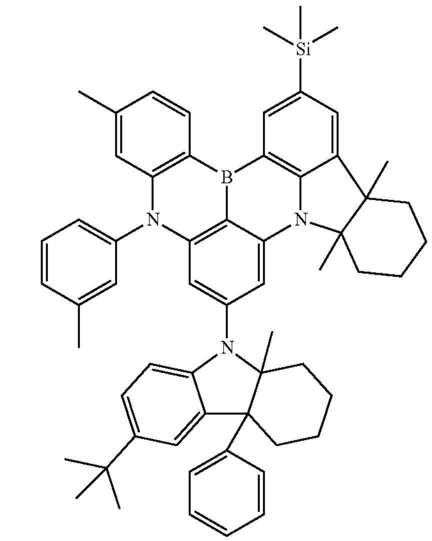
Si
B
N
N
N
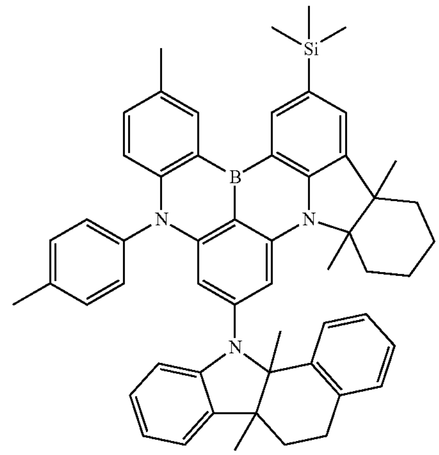
Si
B
N
N
N
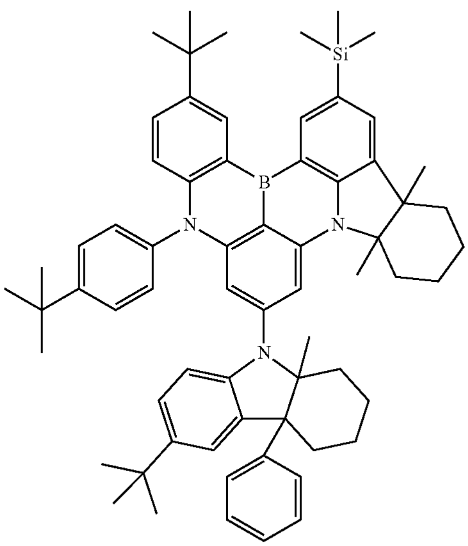
Si
B
N
N
N
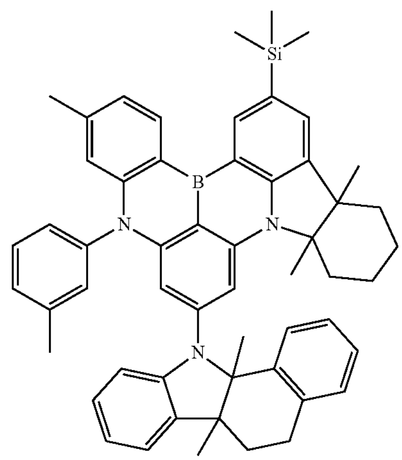
Si
B
N
N
N
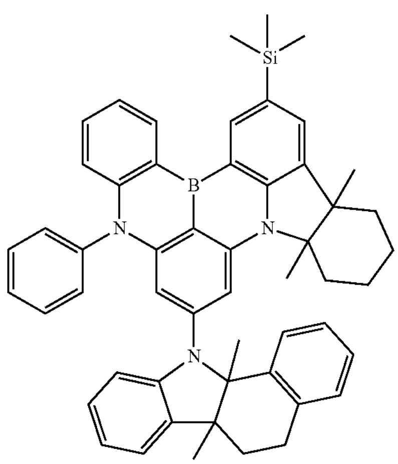
Si
B
N
N
N
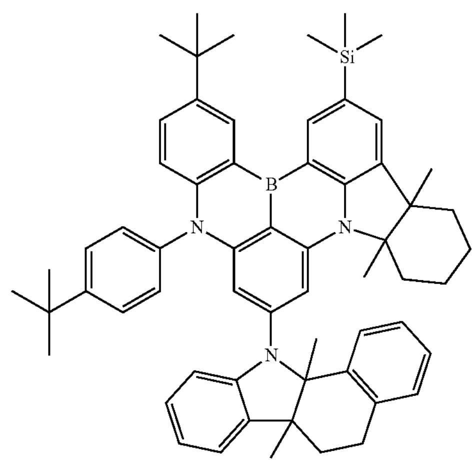
Si
B
N
N
N -continued
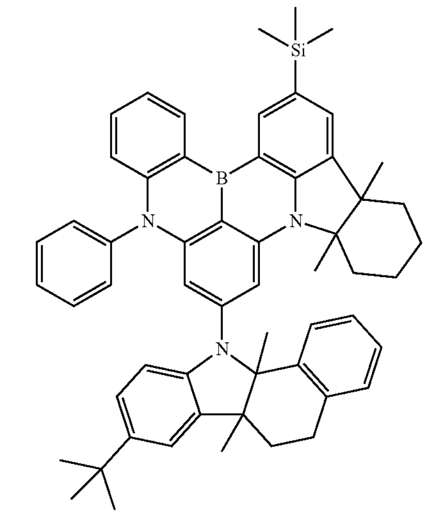
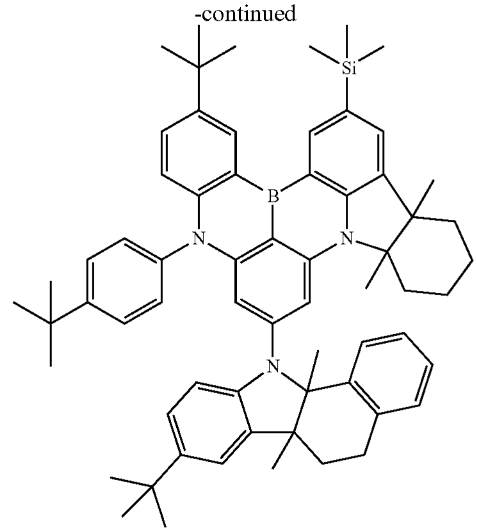
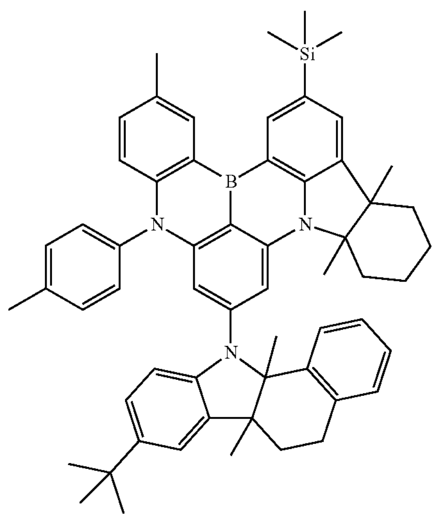
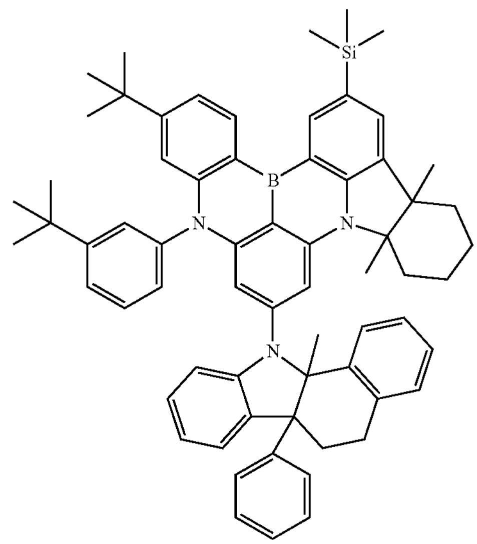
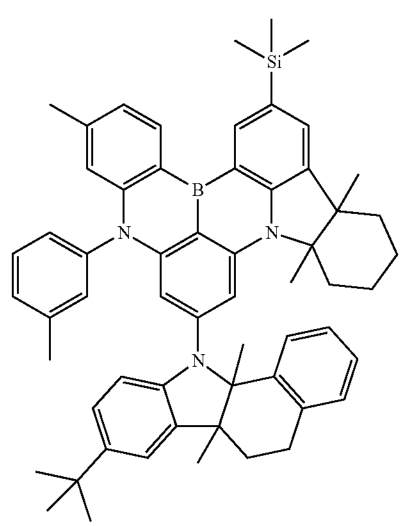
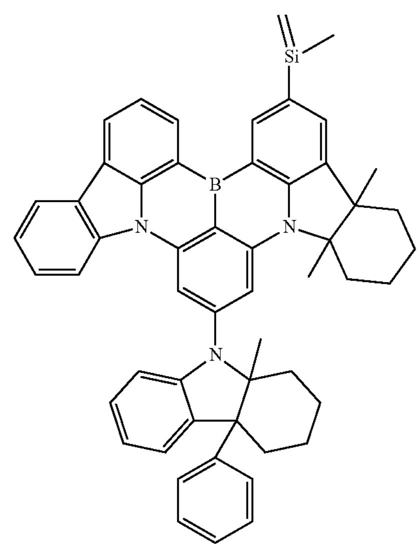

-continued
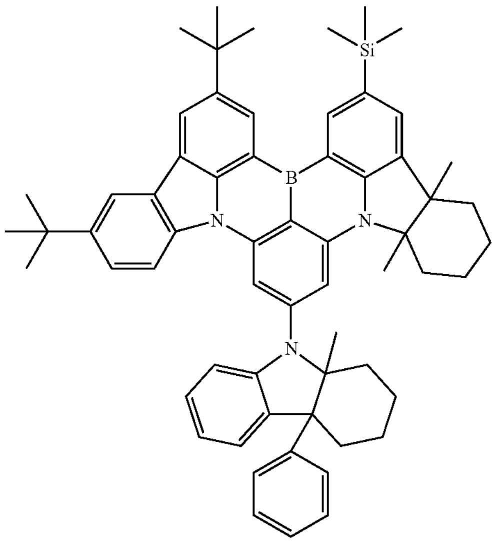
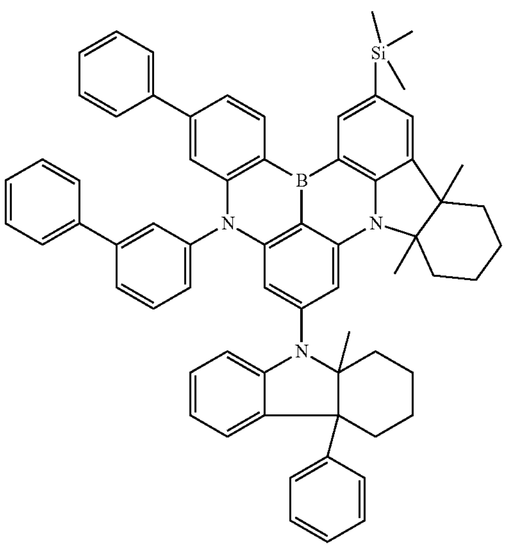
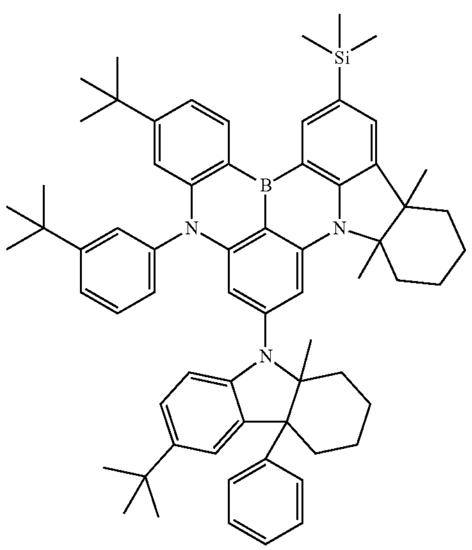
-continued
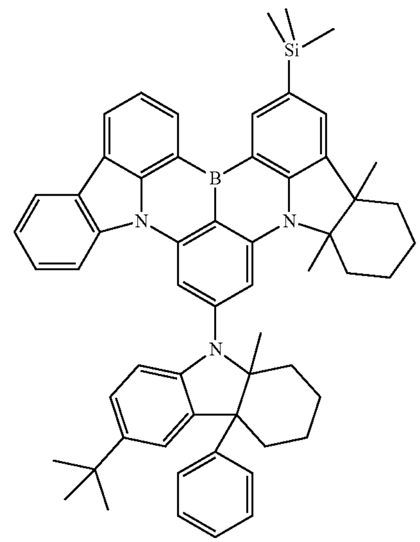
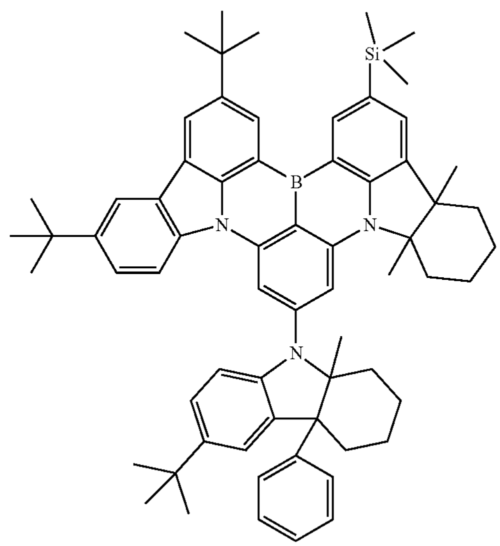
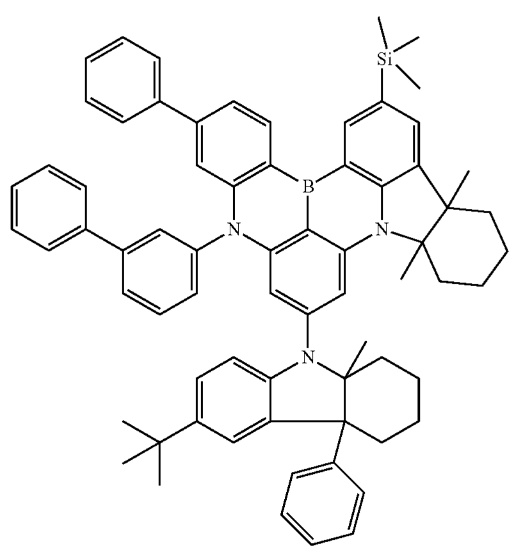

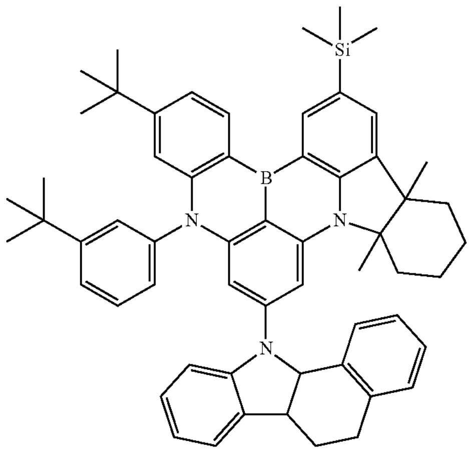
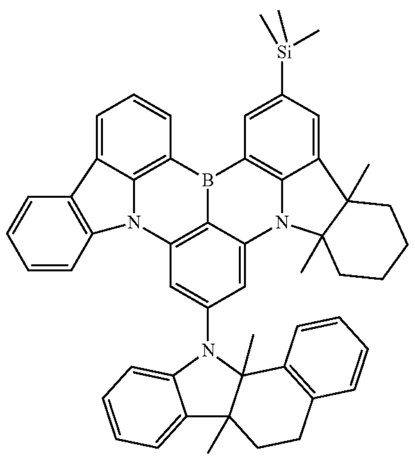
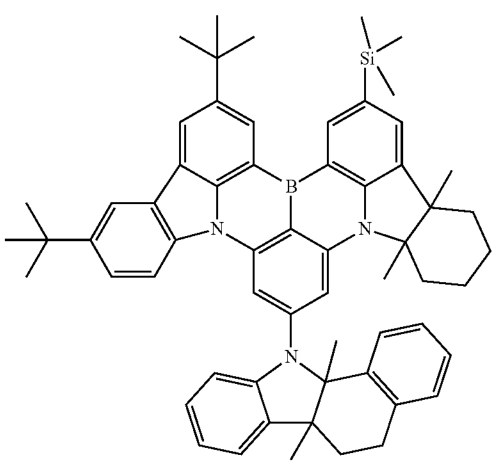
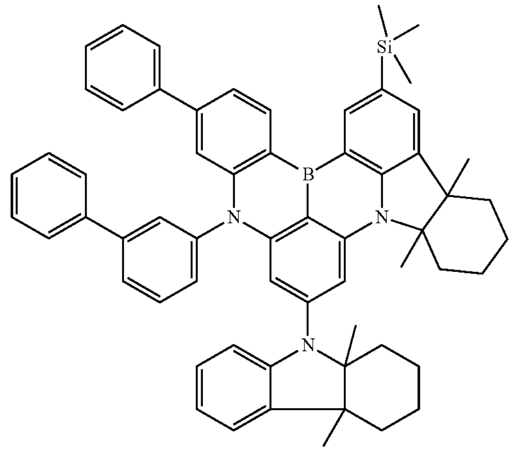
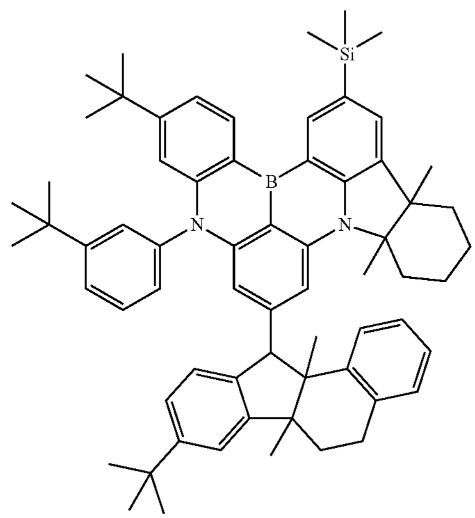
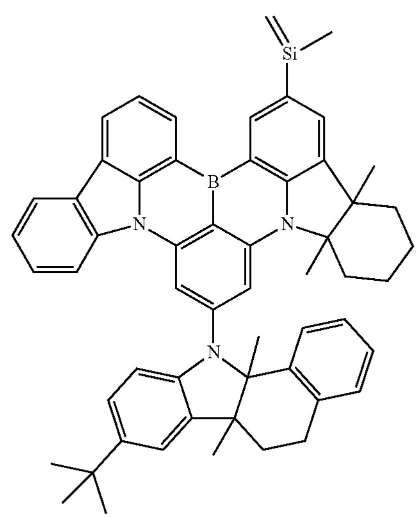

-continued
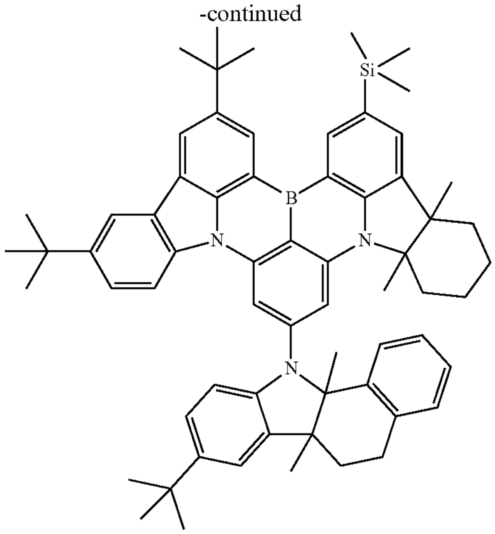
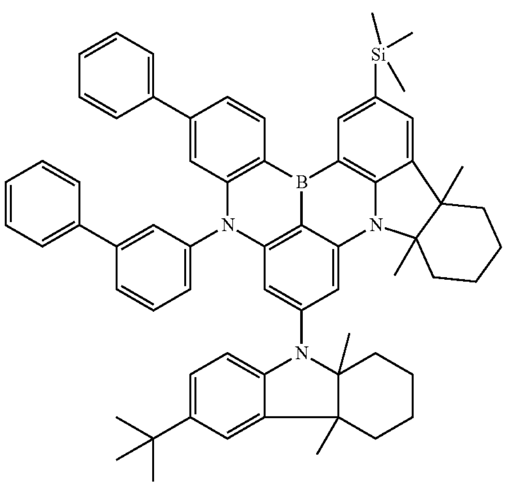
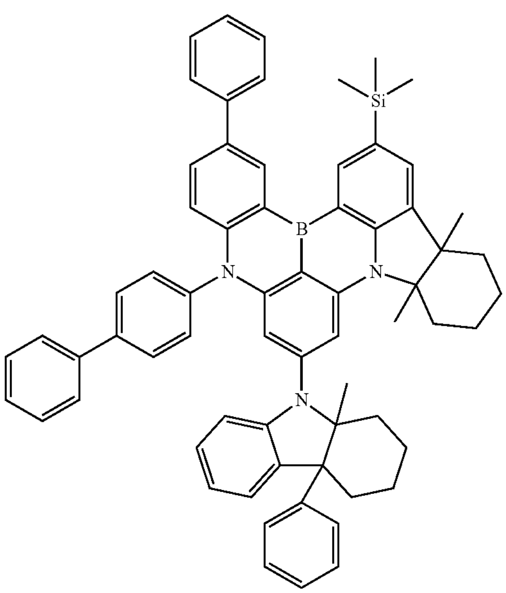
-continued
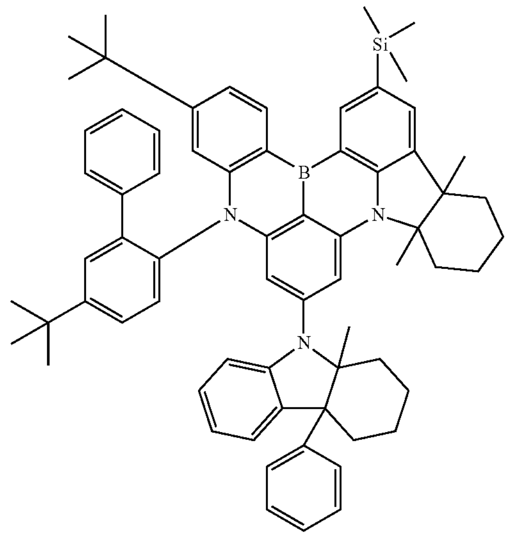
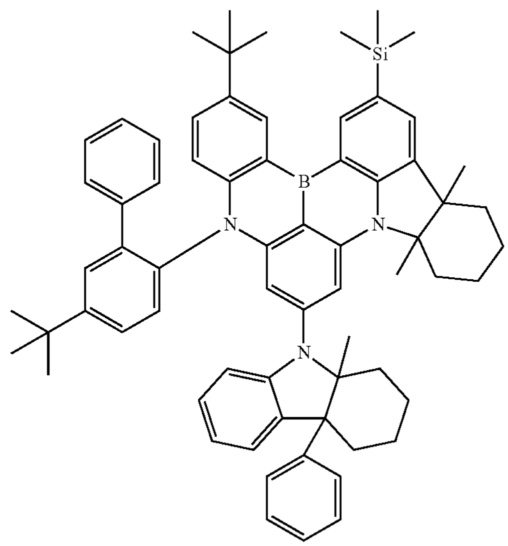
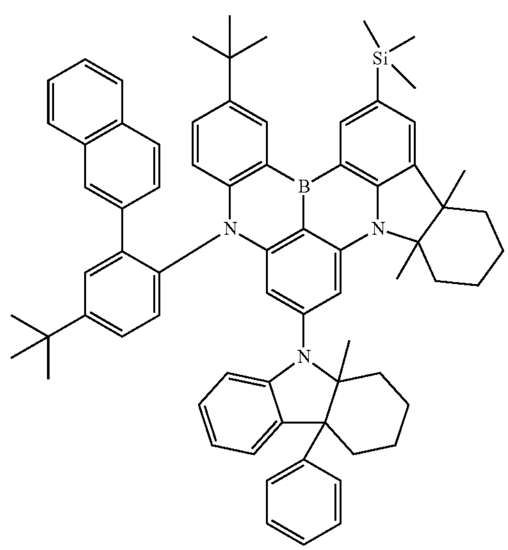

-continued
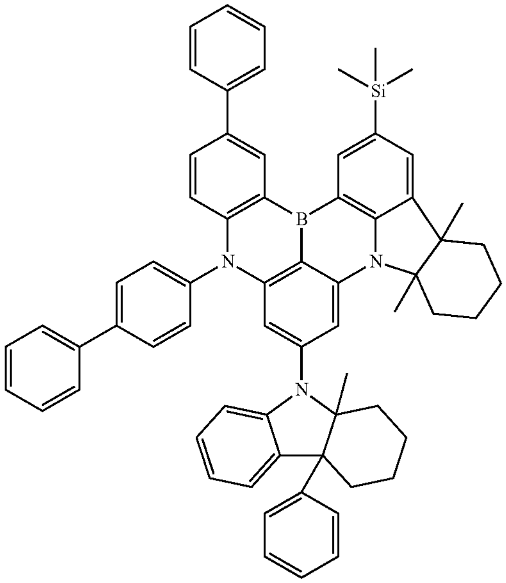
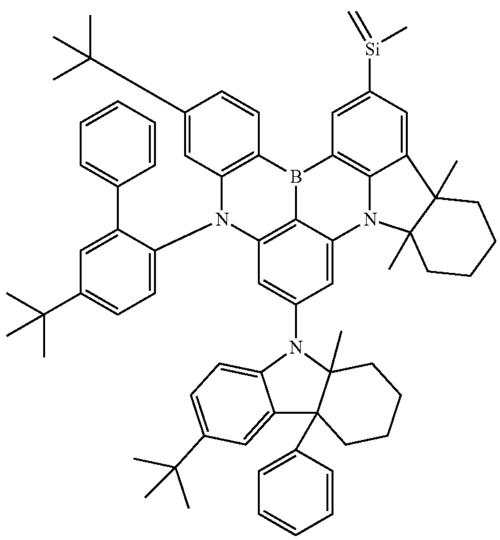
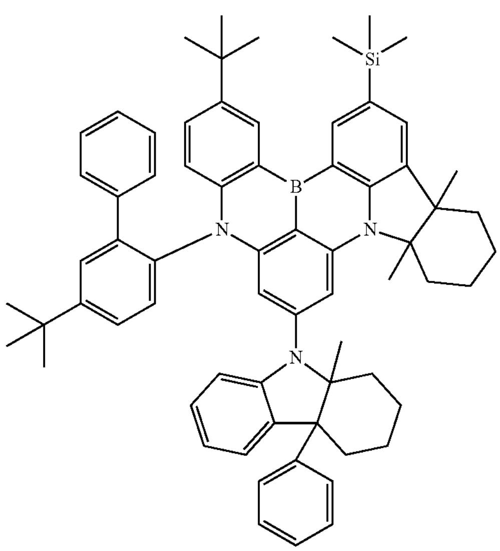
-continued
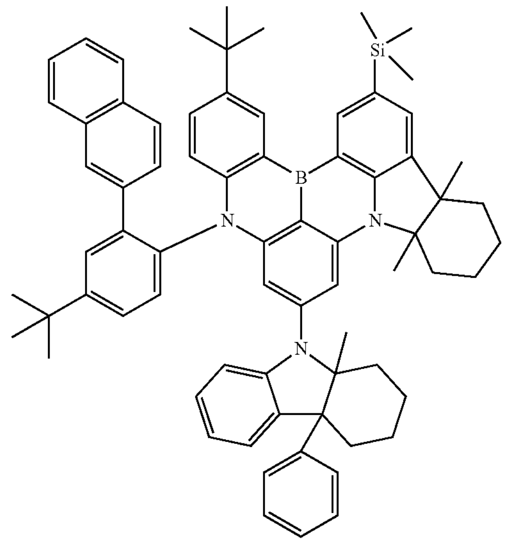
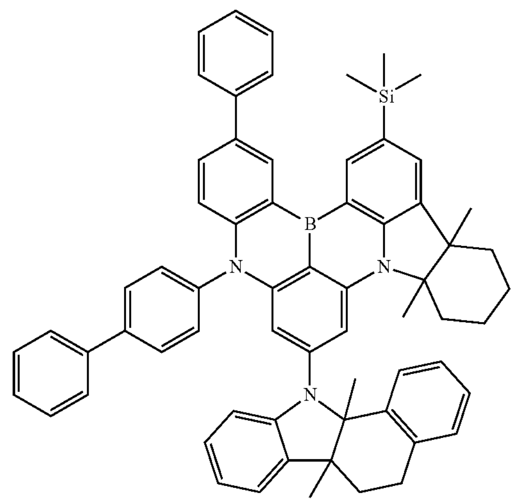
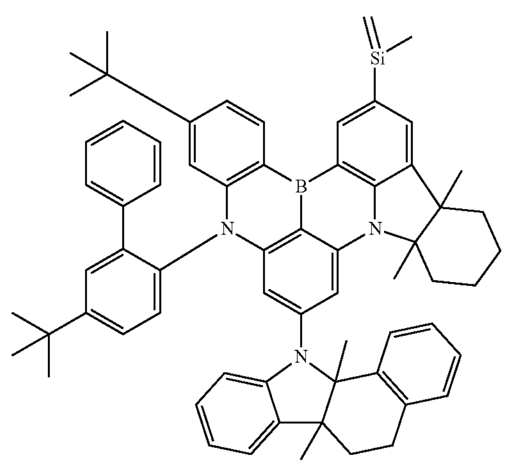

-continued
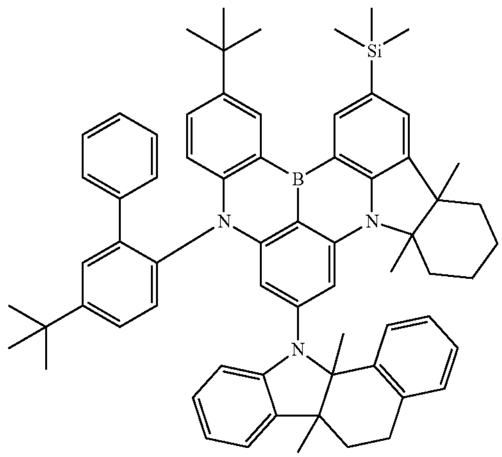
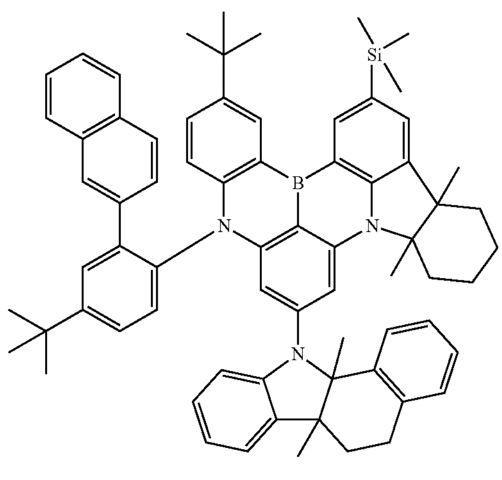
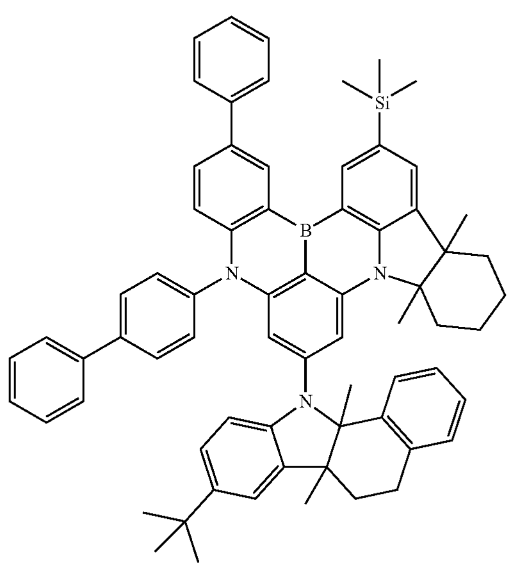
-continued
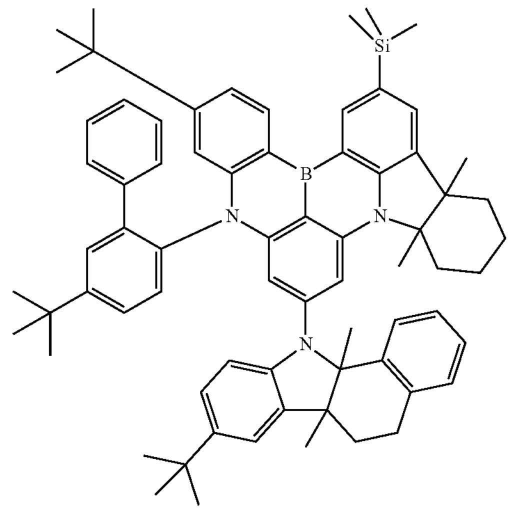
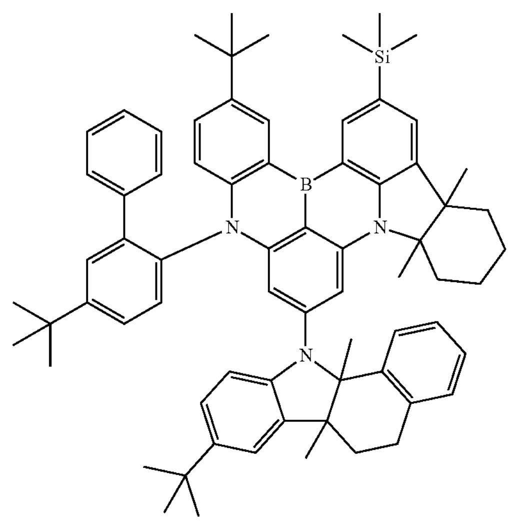
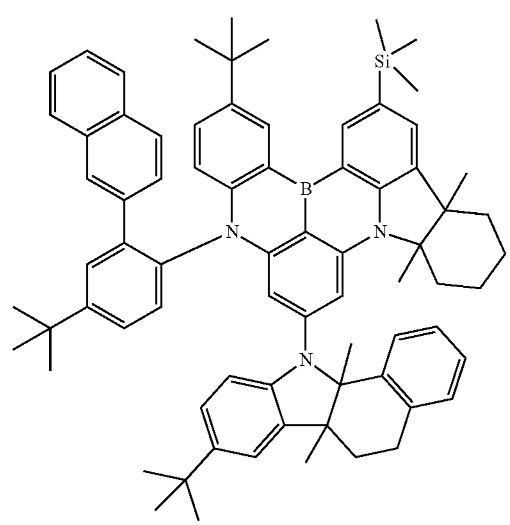

-continued
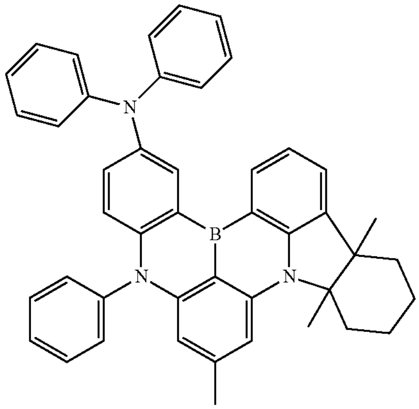
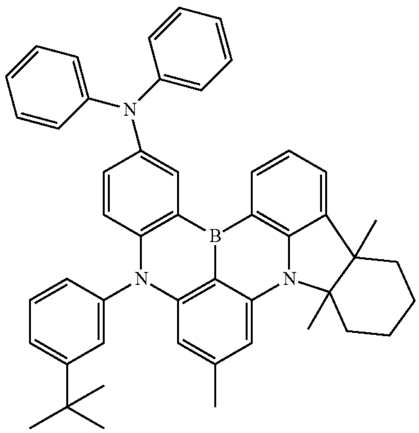
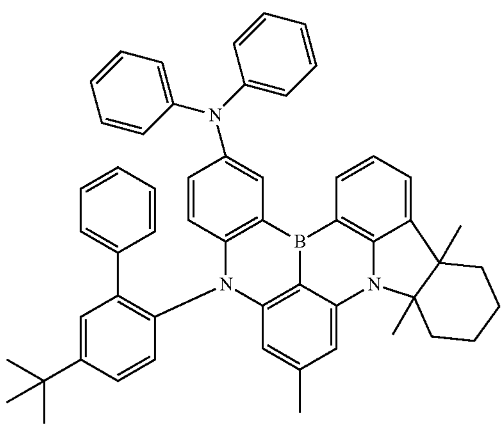
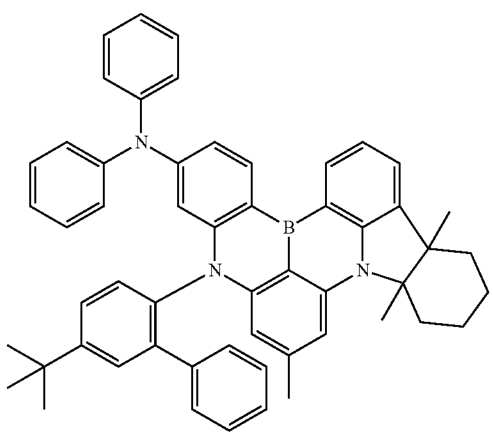
-continued
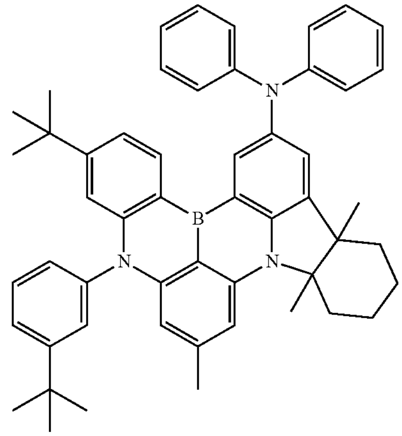
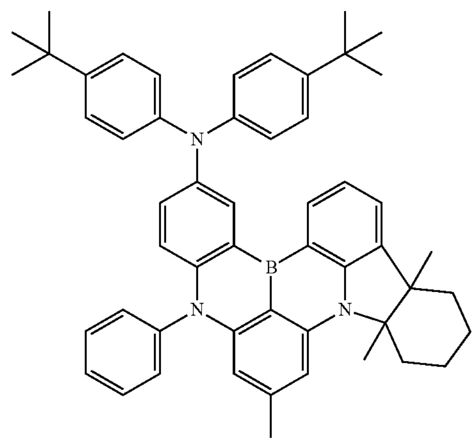
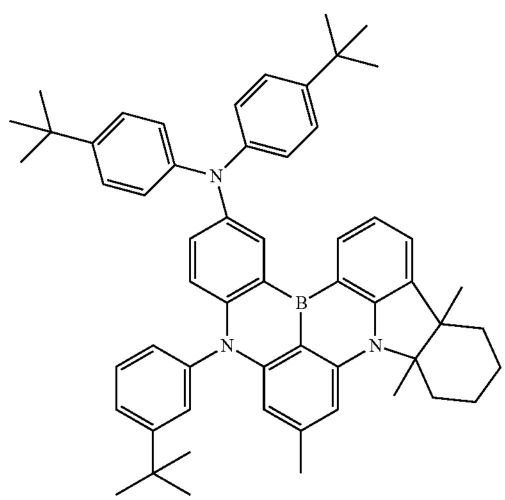

-continued
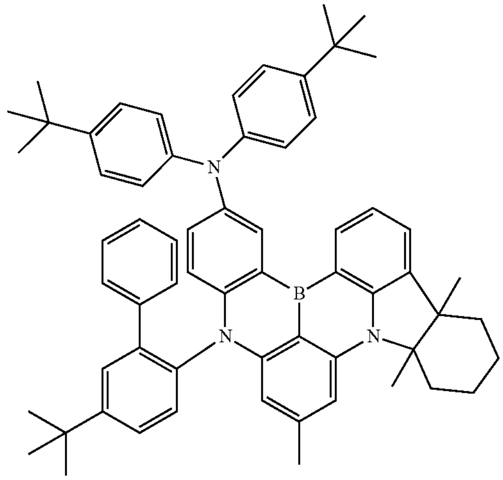
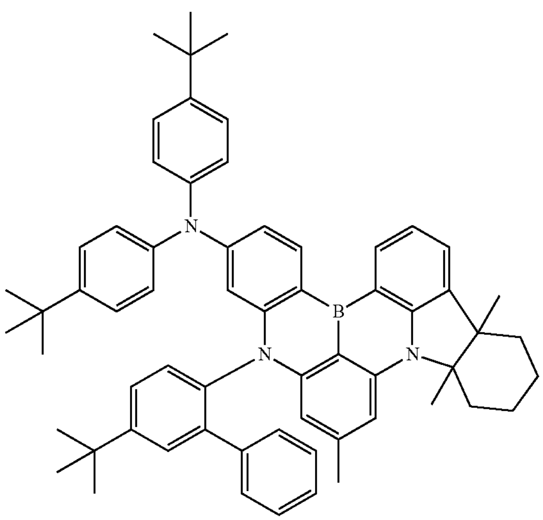
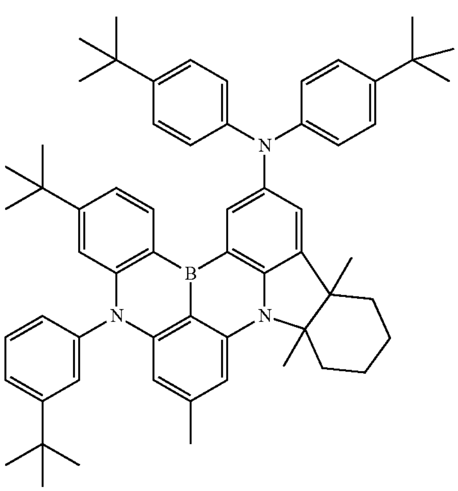
-continued
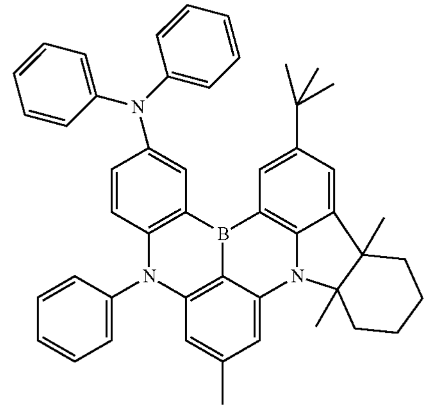
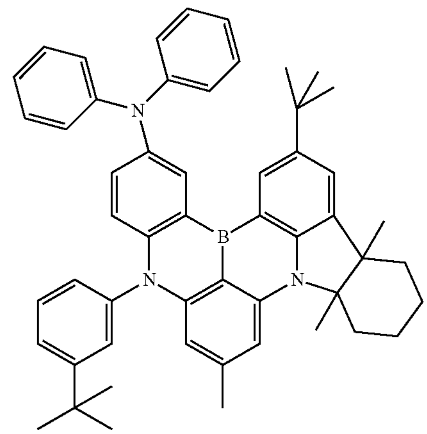
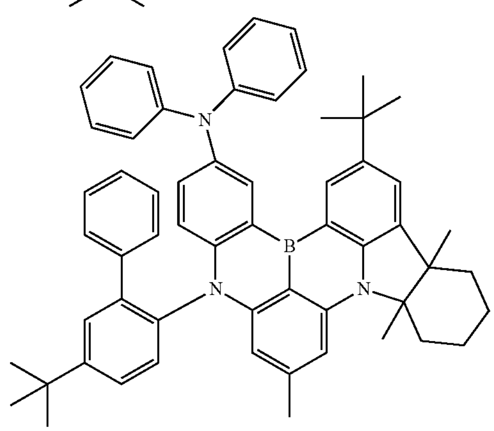
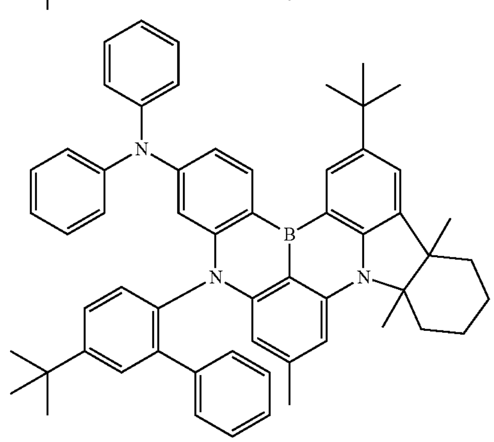

-continued
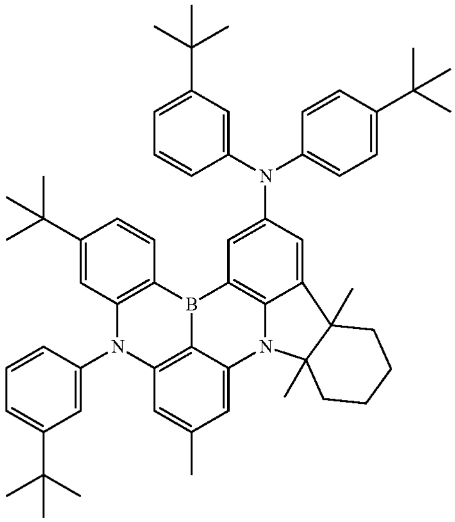
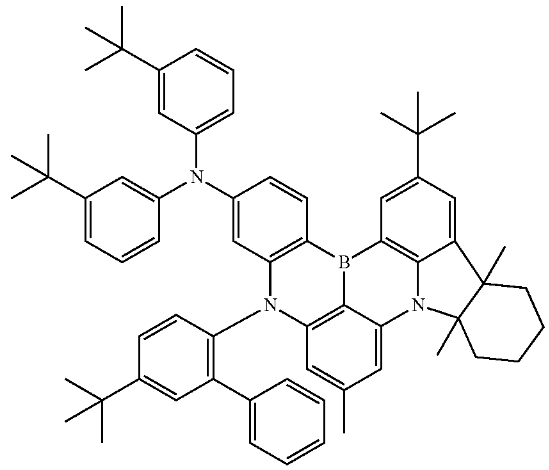
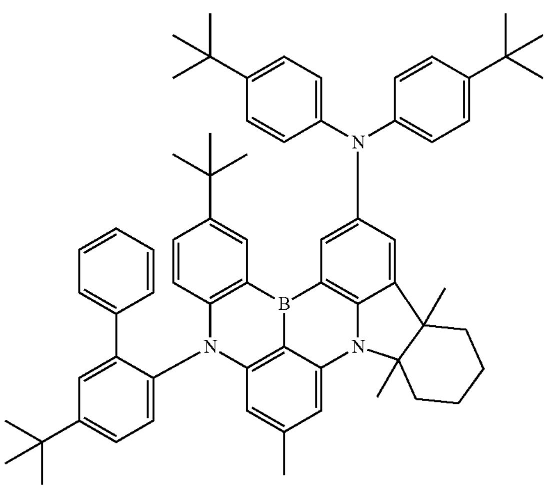
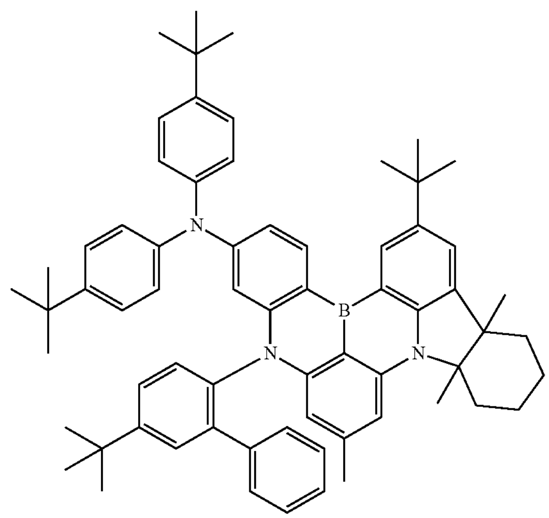
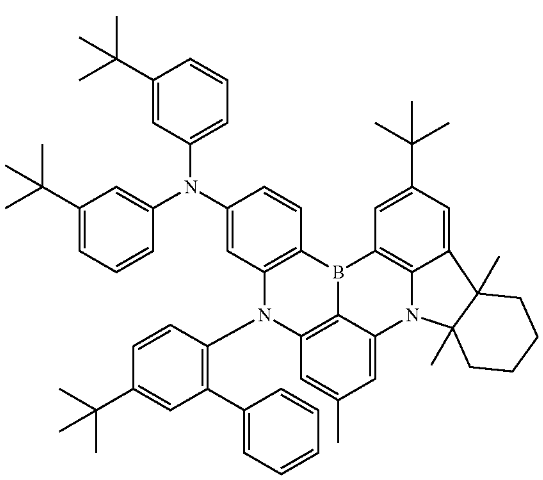
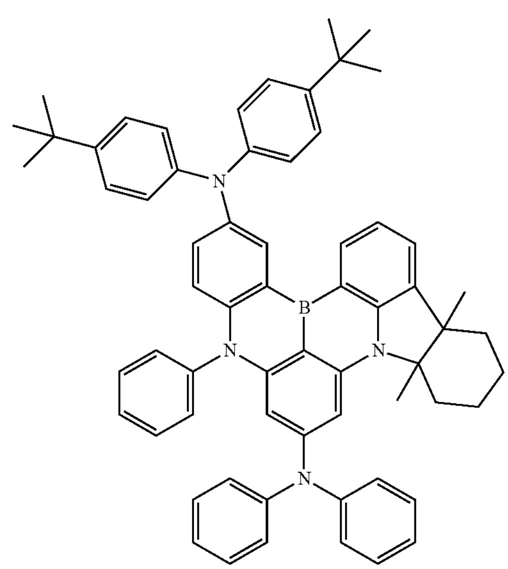
-continued -continued
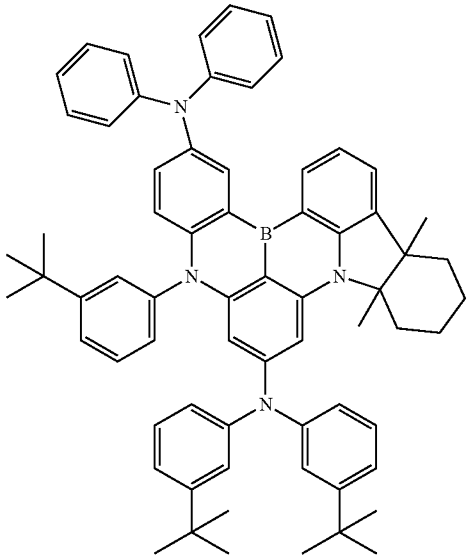
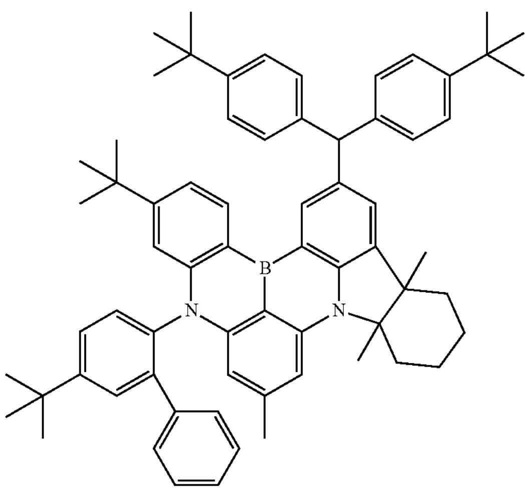
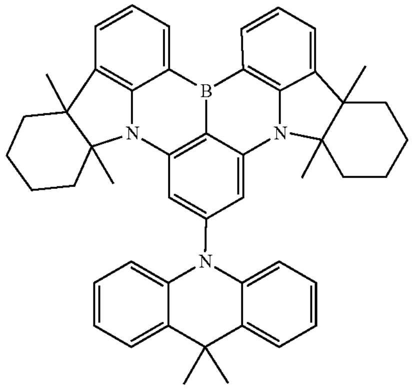
-continued
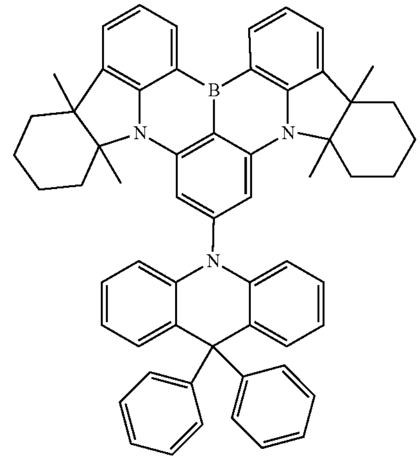
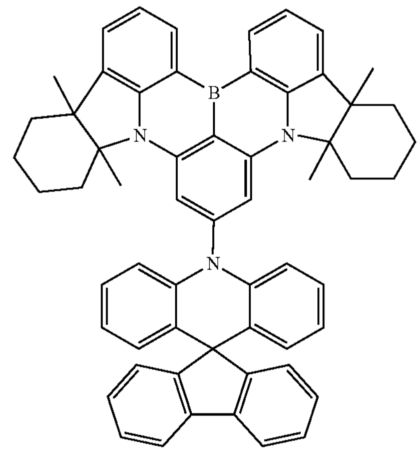
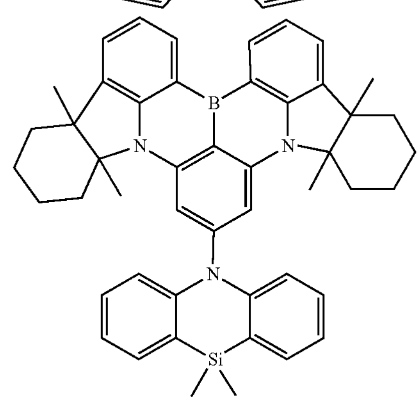
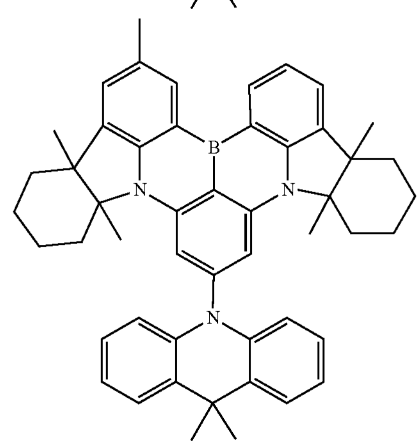

-continued
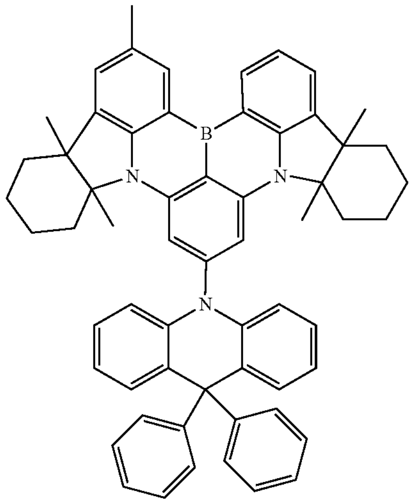
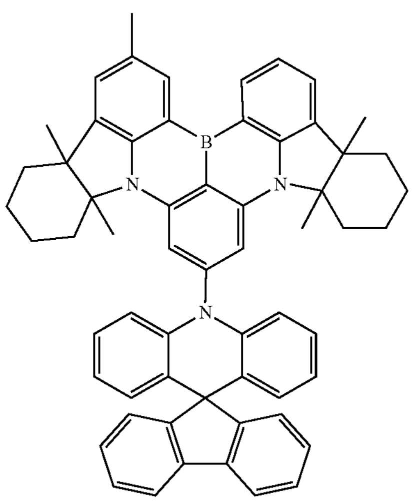
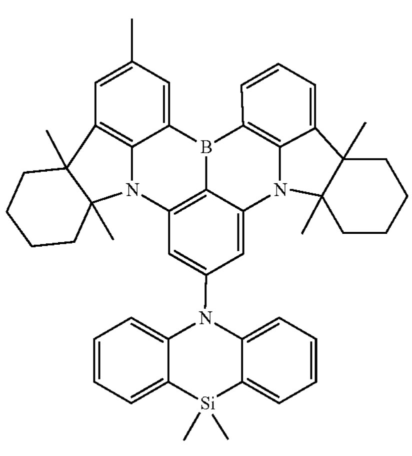
-continued
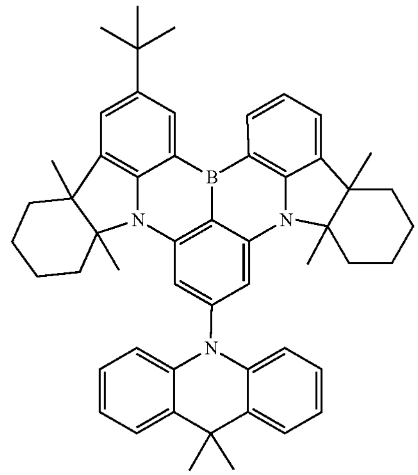
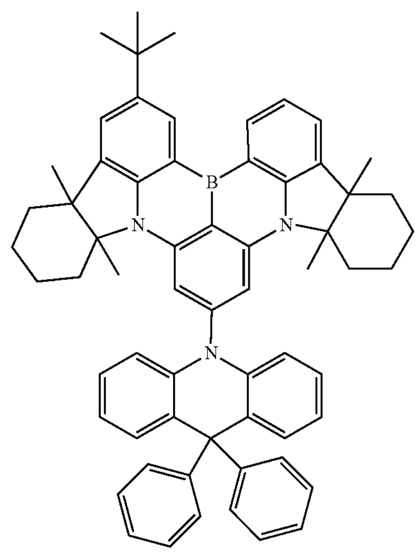
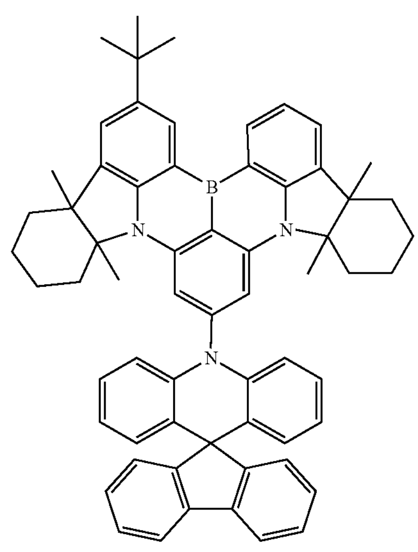

-continued
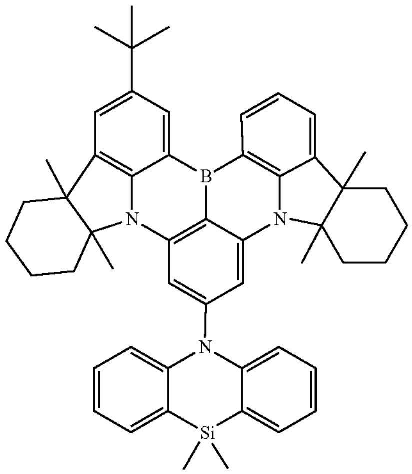
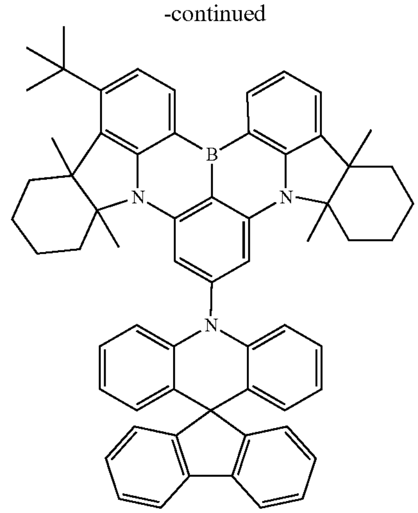
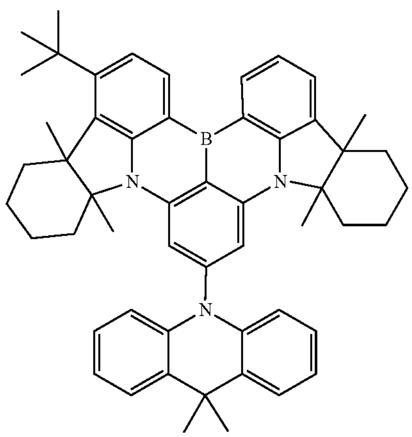
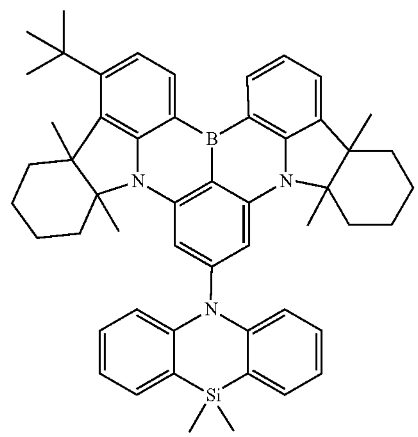
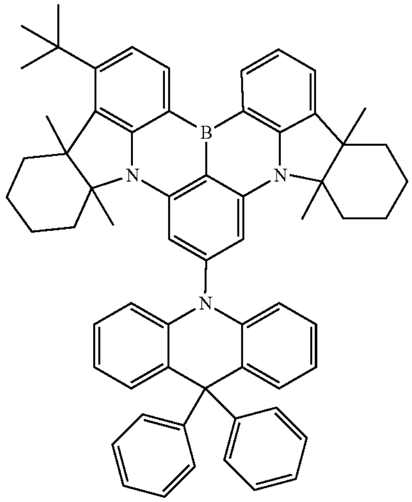
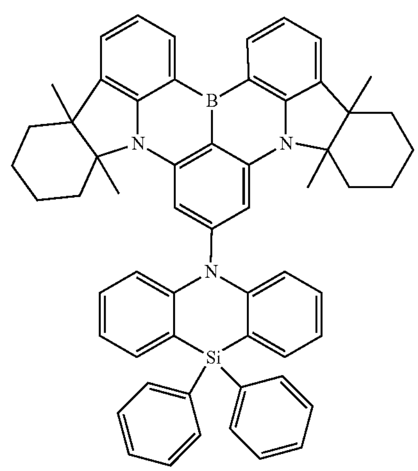
-continued -continued
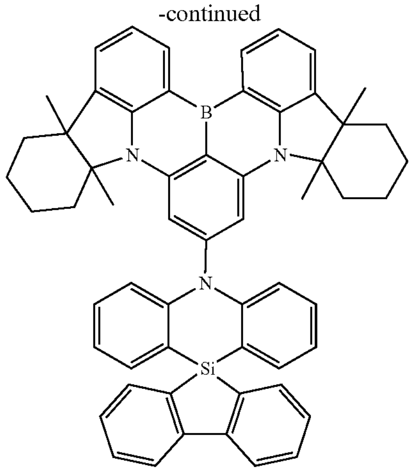
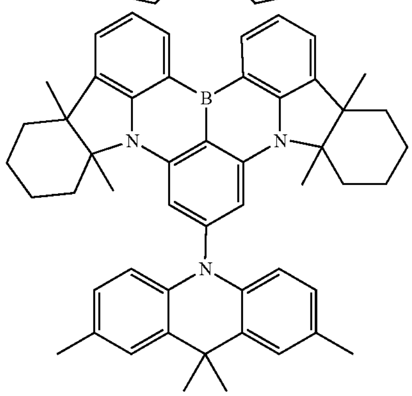
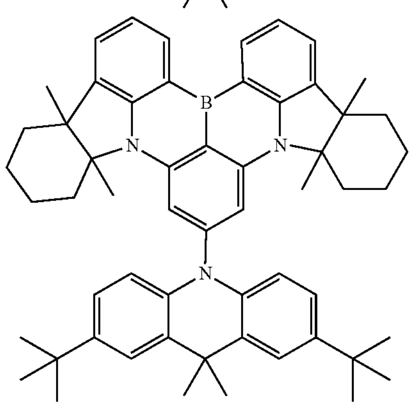
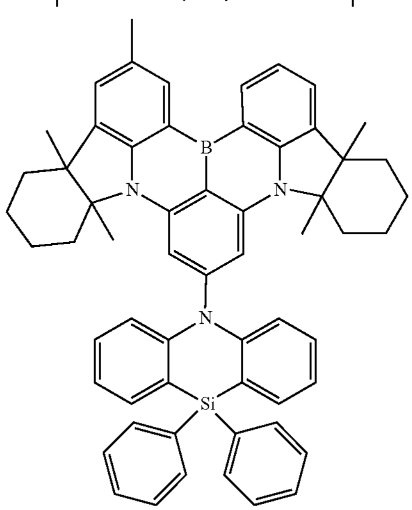
-continued
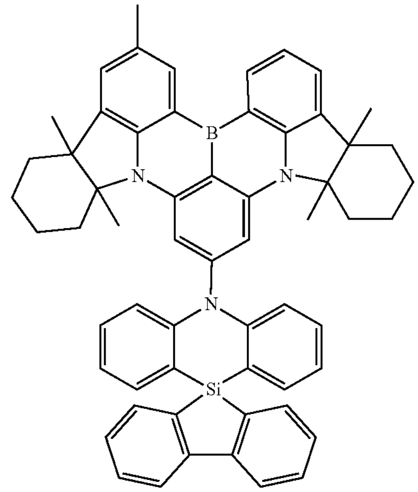
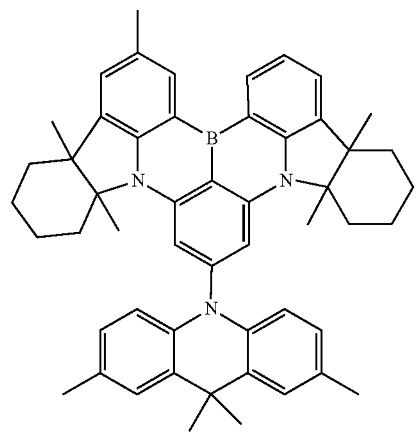
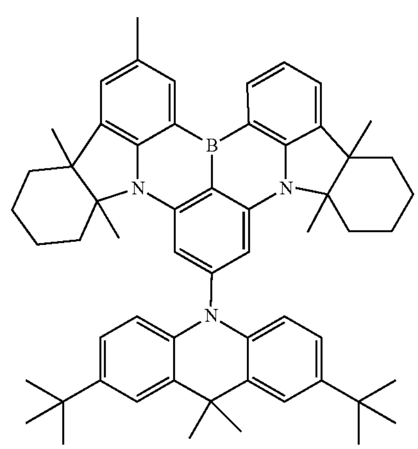

-continued
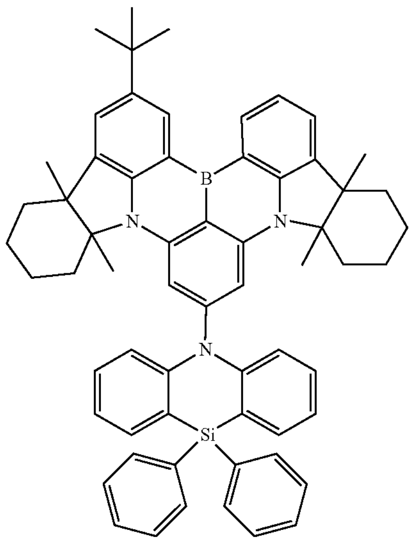
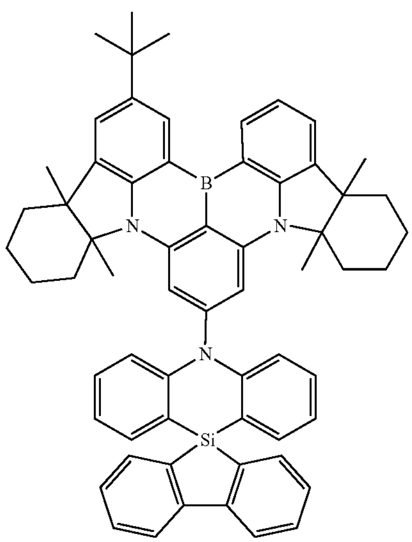
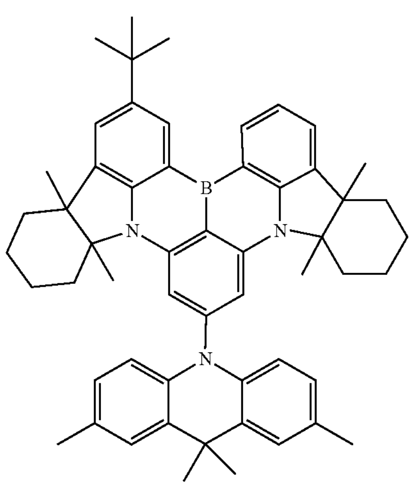
-continued
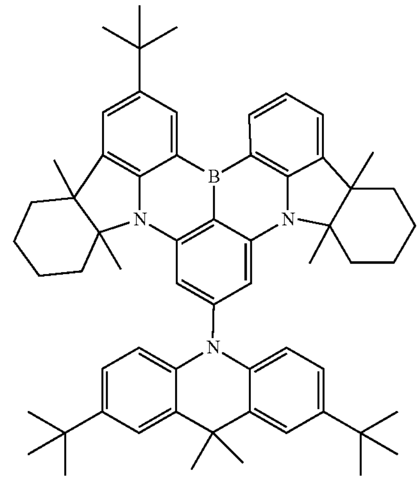
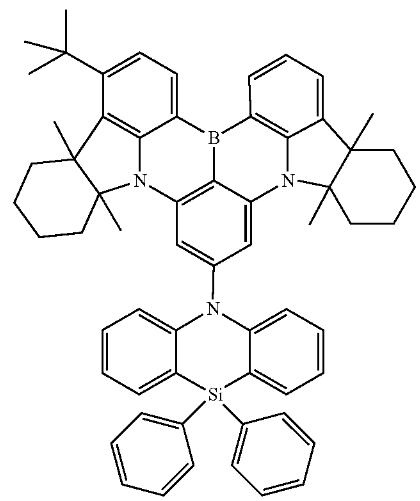
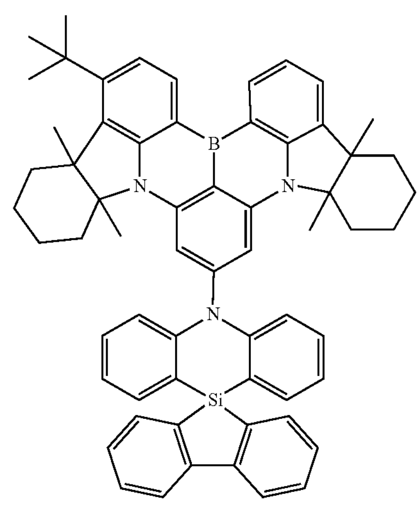

-continued
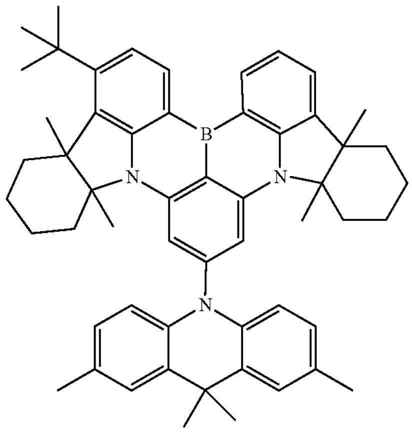
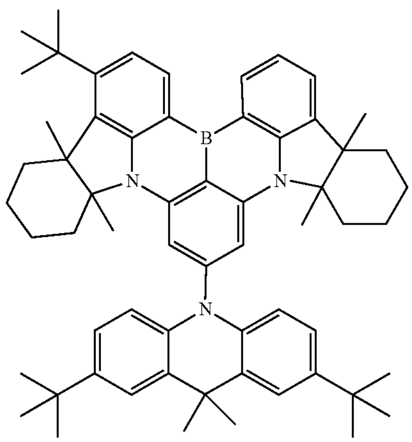
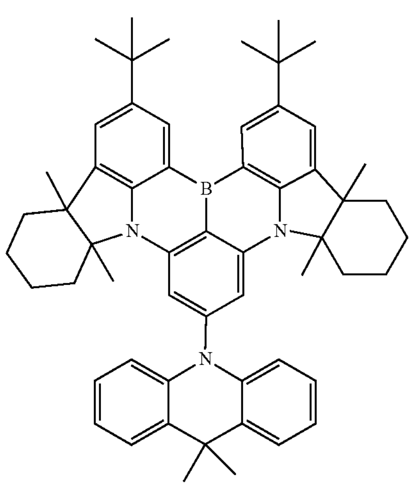
-continued
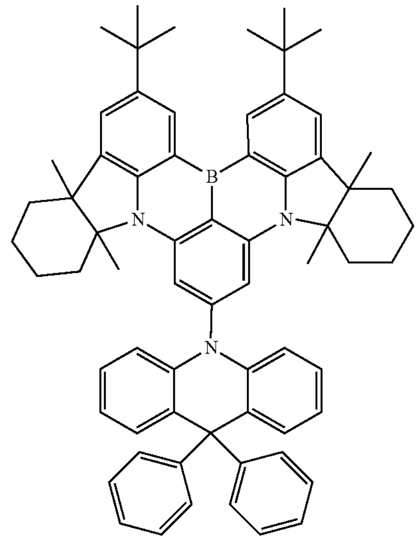
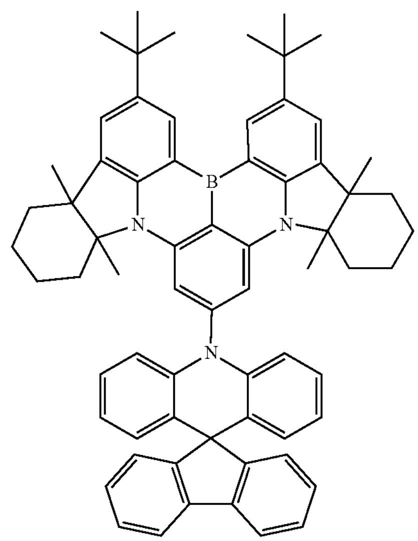
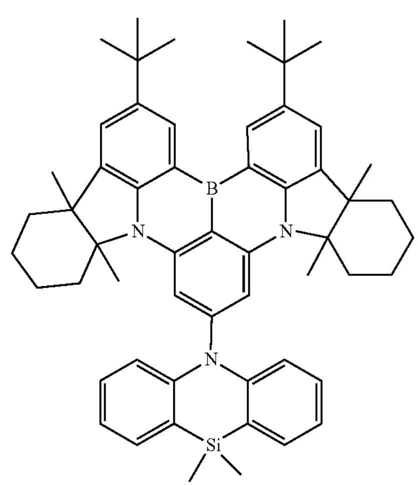

-continued
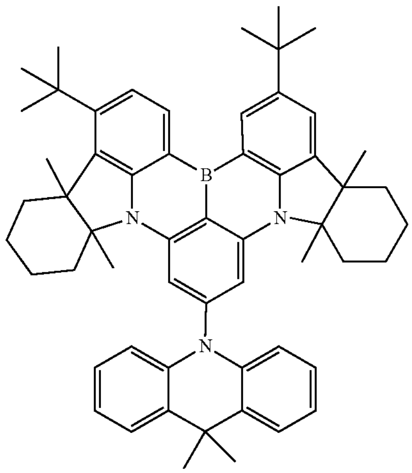
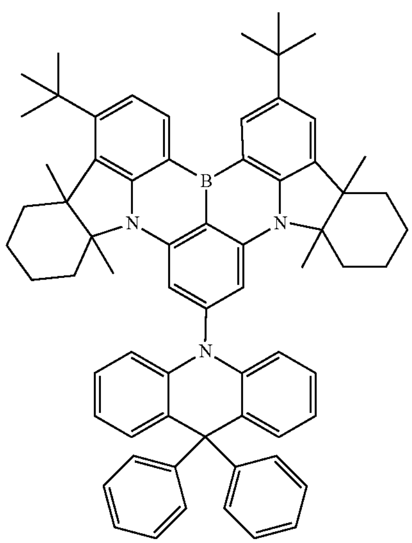
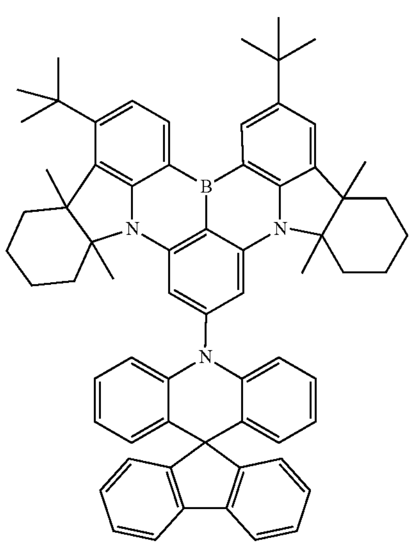
-continued
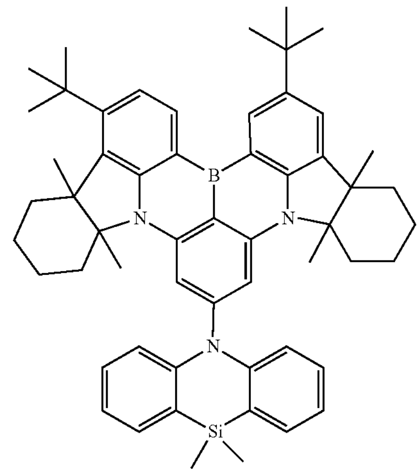
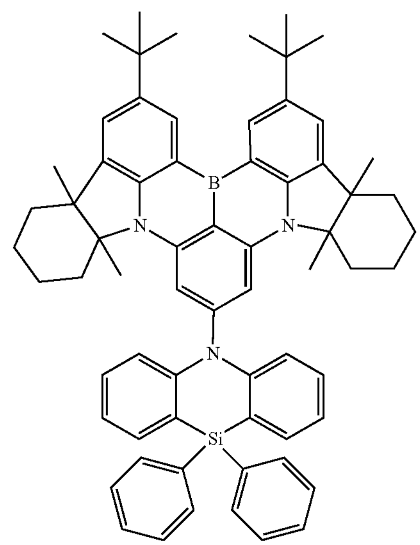
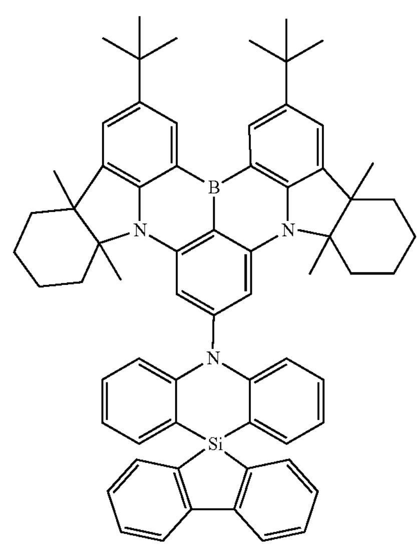

-continued
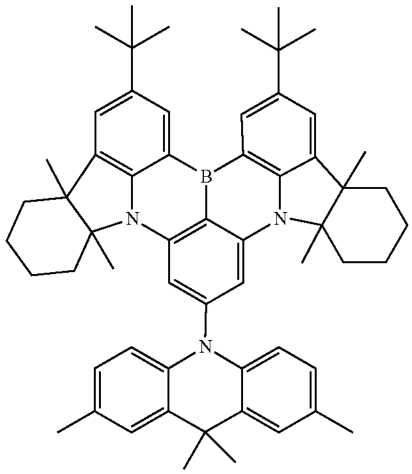
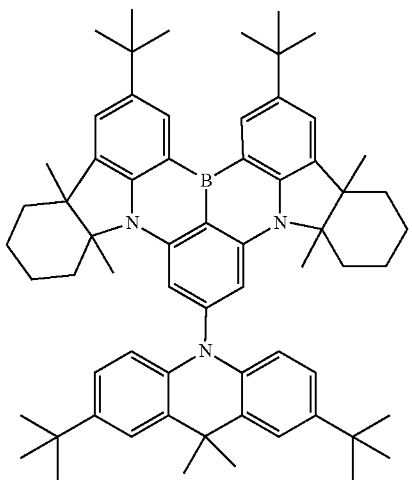
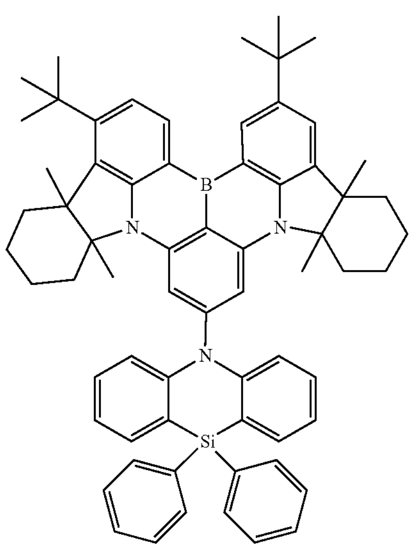
-continued
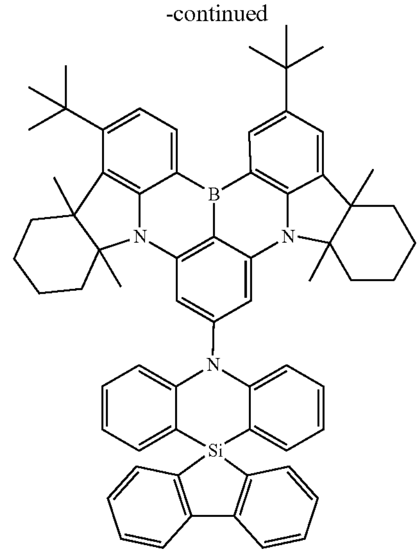
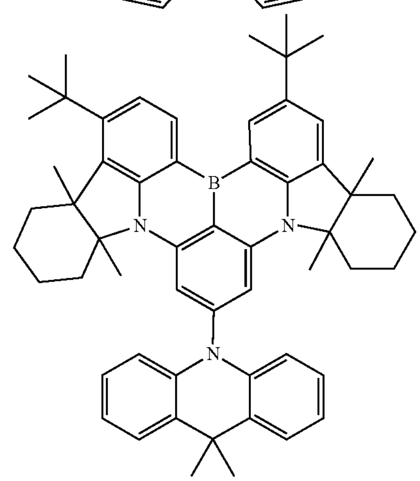
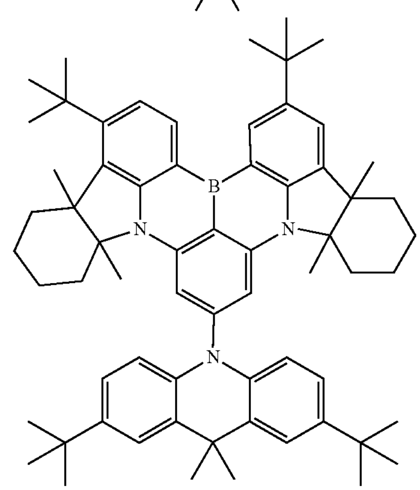
10. An organic light emitting device comprising:
a first electrode;
a second electrode provided to face the first electrode; and
an organic material layer having one or more layers provided between the first electrode and the second electrode,
wherein one or more layers of the organic material layer comprise the compound of claim 1.

11. The organic light emitting device of claim 10, wherein the organic material layer comprises a hole injection layer or a hole transport layer, and the hole injection layer or the hole transport layer comprises the compound.

12. The organic light emitting device of claim 10, wherein the organic material layer comprises an electron transport layer or an electron injection layer, and the electron transport layer or the electron injection layer comprises the compound.

13. The organic light emitting device of claim 10, wherein the organic material layer comprises a light emitting layer, and the light emitting layer comprises the compound.

14. The organic light emitting device of claim 10, wherein the organic material layer comprises a light emitting layer, and the light emitting layer comprises the compound as a dopant of the light emitting layer.

15. The compound of claim 1, wherein $Ar_2$ and $Ar_3$ are bonded to each other to form a substituted or unsubstituted cyclohexane, a substituted or unsubstituted tetradecahydrophenanthrene, a substituted or unsubstituted tetrahydronaphthalene, or a substituted or unsubstituted decahydronaphthalene.

16. An organic light emitting device comprising:

a first electrode;

a second electrode provided to face the first electrode; and an organic material layer having one or more layers provided between the first electrode and the second electrode, wherein one or more layers of the organic material layer comprise the compound of claim 7.

17. The organic light emitting device of claim 16, wherein:

a) the organic material layer comprises a hole injection layer or a hole transport layer, and the hole injection layer or the hole transport layer comprises the compound; or b) the organic material layer comprises an electron transport layer or an electron injection layer, and the electron transport layer or the electron injection layer comprises the compound; or c) the organic material layer comprises a light emitting layer, and the light emitting layer comprises the compound; or d) the organic material layer comprises a light emitting layer, and the light emitting layer comprises the compound as a dopant of the light emitting layer.

18. An organic light emitting device comprising:

a first electrode;

a second electrode provided to face the first electrode; and an organic material layer having one or more layers provided between the first electrode and the second electrode, wherein one or more layers of the organic material layer comprise the compound of claim 9.

19. The organic light emitting device of claim 18, wherein:

a) the organic material layer comprises a hole injection layer or a hole transport layer, and the hole injection layer or the hole transport layer comprises the compound; or b) the organic material layer comprises an electron transport layer or an electron injection layer, and the electron transport layer or the electron injection layer comprises the compound; or c) the organic material layer comprises a light emitting layer, and the light emitting layer comprises the compound; or d) the organic material layer comprises a light emitting layer, and the light emitting layer comprises the compound as a dopant of the light emitting layer.

* * * * *